US012772685B2

(12) United States Patent
Masuda et al.

(10) Patent No.: US 12,772,685 B2
(45) Date of Patent: Oct. 20, 2026

(54) ORGANIC ELECTROLUMINESCENT ELEMENT, ORGANIC ELECTROLUMINESCENT DISPLAY APPARATUS, AND ELECTRONIC DEVICE

(71) Applicant: IDEMITSU KOSAN CO., LTD., Tokyo (JP)

(72) Inventors: Tetsuya Masuda, Tokyo (JP); Satomi Tasaki, Tokyo (JP); Hiroaki Toyoshima, Tokyo (JP); Masato Nakamura, Tokyo (JP); Kazuki Nishimura, Tokyo (JP); Hiroaki Itoi, Tokyo (JP); Tasuku Haketa, Tokyo (JP); Emiko Kambe, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 518 days.

(21) Appl. No.: 18/288,143

(22) PCT Filed: Apr. 26, 2022

(86) PCT No.: PCT/JP2022/018804
§ 371 (c)(1),
(2) Date: Mar. 21, 2024

(87) PCT Pub. No.: WO2022/230844
PCT Pub. Date: Nov. 3, 2022

(65) Prior Publication Data

US 2025/0287774 A1 Sep. 11, 2025

(30) Foreign Application Priority Data

Apr. 26, 2021 (JP) ................................ 2021-074462

(51) Int. Cl.
*H10K 59/30* (2023.01)
*H10K 50/125* (2023.01)
(Continued)

(52) U.S. Cl.
CPC .......... *H10K 59/30* (2023.02); *H10K 50/125* (2023.02); *H10K 50/156* (2023.02); *H10K 59/35* (2023.02);
(Continued)

(58) Field of Classification Search
CPC .... H10K 59/30; H10K 50/125; H10K 50/156; H10K 59/35; H10K 2101/40;
(Continued)

(56) References Cited

U.S. PATENT DOCUMENTS

2010/0295444 A1 11/2010 Kuma et al.
2010/0301318 A1 12/2010 Kuma et al.
(Continued)

FOREIGN PATENT DOCUMENTS

JP 2007-294261 A 11/2007
JP 2015-053476 A 3/2015
(Continued)

OTHER PUBLICATIONS

PCT International Preliminary Report on Patentability, dated Oct. 24, 2023, which includes a Translation of International Searching Authority, "Written Opinion," issued in connection with International Patent Application No. PCT/JP2022/018804, dated Jul. 19, 2022.
(Continued)

*Primary Examiner* — Elias Ullah
(74) *Attorney, Agent, or Firm* — Foley & Lardner LLP

(57) ABSTRACT

An organic EL device includes: an emitting region including a first emitting layer containing a first host material and a first luminescent compound and a second emitting layer containing a second host material and a second luminescent compound; and a hole transporting zone including one or more organic layers, in which at least one organic layer is a
(Continued)

Figure 1:
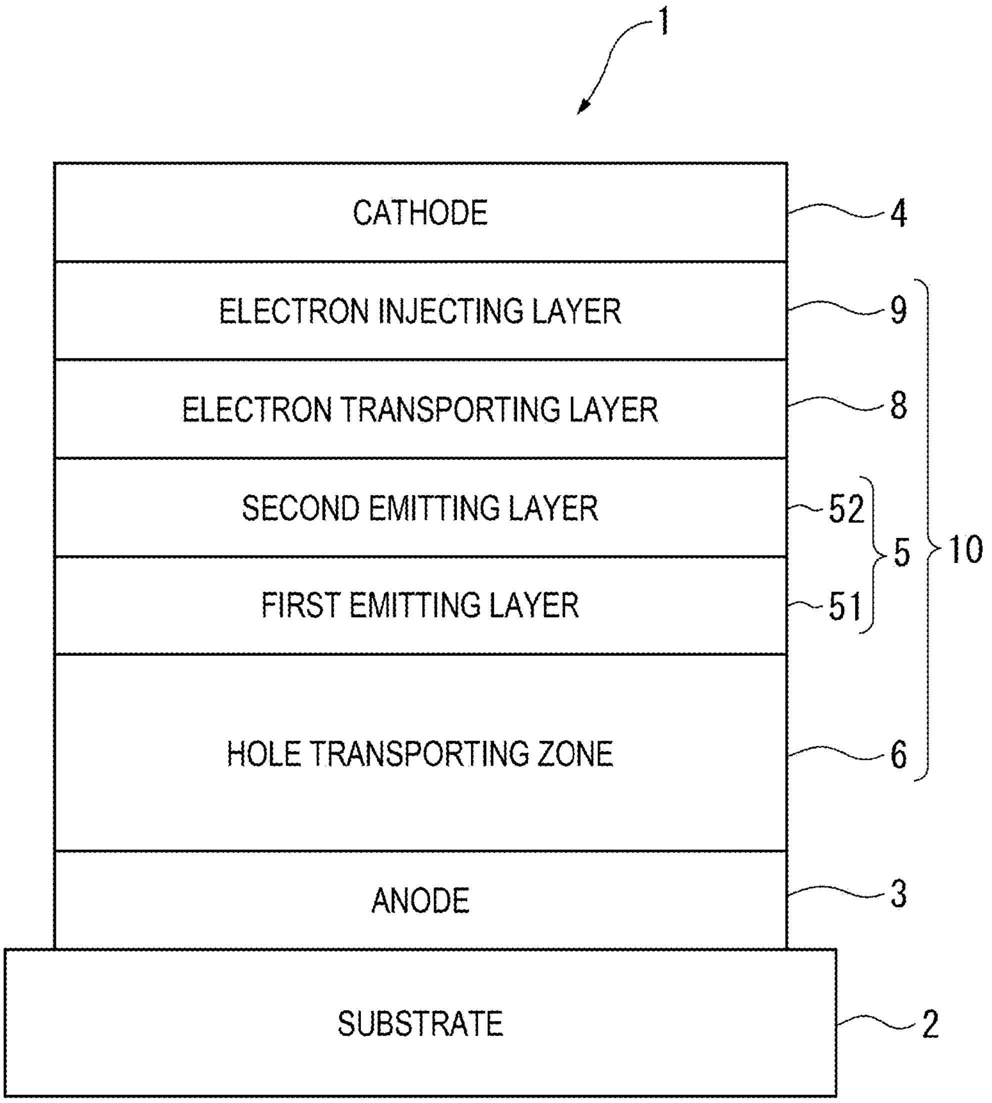

first organic layer in direct contact with the emitting region, the first organic layer contains a hole transporting zone material, the hole transporting zone is in direct contact with an anode and the emitting region, triplet energy of the first host material $T_1(H1)$ and the second host material $T_1(H2)$ satisfy Numerical Formula 1, and ionization potential of the hole transporting zone material Ip(HT) and the first luminescent compound Ip(D1) satisfy Numerical Formula 1X, $$T_1(H1) > T_1(H2) \quad \text{(Numerical Formula 1)}$$

$$Ip(D1) - Ip(HT) < -0.05\text{eV}. \quad \text{(Numerical Formula 1X)}$$

27 Claims, 7 Drawing Sheets

(51) Int. Cl.
*H10K 50/15* (2023.01)
*H10K 59/35* (2023.01)
*H10K 101/00* (2023.01)
*H10K 101/40* (2023.01)

(52) U.S. Cl.
CPC ..... *H10K 2101/40* (2023.02); *H10K 2101/90* (2023.02)

(58) Field of Classification Search
CPC ........... H10K 2101/90; H10K 2101/30; H10K 50/11; H10K 50/13; H10K 59/12; H10K 2102/351; G09F 9/30; H05B 33/12
See application file for complete search history.

(56) References Cited

U.S. PATENT DOCUMENTS

| | | | |
|---|---|---|---|
| 2013/0092913 | A1 | 4/2013 | Nishimura et al. |
| 2013/0270539 | A1 | 10/2013 | Kuma et al. |
| 2014/0027751 | A1 | 1/2014 | Furukawa et al. |
| 2014/0103321 | A1 | 4/2014 | Furukawa et al. |
| 2016/0365529 | A1 | 12/2016 | Kim et al. |
| 2019/0280209 | A1 | 9/2019 | Fujita |
| 2021/0083193 | A1 | 3/2021 | Tasaki et al. |
| 2021/0367177 | A1 | 11/2021 | Seo et al. |
| 2022/0348522 | A1 | 11/2022 | Tasaki et al. |
| 2022/0416208 | A1 | 12/2022 | Kambe et al. |

FOREIGN PATENT DOCUMENTS

| | | | |
|---|---|---|---|
| JP | 2020-096171 | A | 6/2020 |
| WO | WO-2010/134350 | A1 | 11/2010 |
| WO | WO-2011/155508 | A1 | 12/2011 |
| WO | WO-2012/137640 | A1 | 10/2012 |
| WO | WO-2012/153603 | A1 | 11/2012 |
| WO | WO-2014/050417 | A1 | 4/2014 |
| WO | WO-2020/256009 | A1 | 12/2020 |
| WO | WO-2021/049651 | A1 | 3/2021 |
| WO | WO-2021/049653 | A1 | 3/2021 |

OTHER PUBLICATIONS

International Searching Authority, "International Search Report," issued in connection with International Patent Application No. PCT/JP2022/018804, dated Jul. 19, 2022.

International Searching Authority, "Written Opinion," issued in connection with International Patent Application No. PCT/JP2022/018804, dated Jul. 19, 2022.

Adachi, Chihaya, "Device Physics of Organic Semiconductors," Kodansha Ltd., §10.9, Apr. 1, 2012, pp. 261-268.

Uoyama et al., "Highly efficient organic light-emitting diodes from delayed fluorescence," Nature, vol. 492, Dec. 13, 2012, pp. 234-238.

ORGANIC ELECTROLUMINESCENT ELEMENT, ORGANIC ELECTROLUMINESCENT DISPLAY APPARATUS, AND ELECTRONIC DEVICE

CROSS-REFERENCE TO RELATED APPLICATIONS

The present application claims priority under 35 U.S.C. § 371 to International Patent Application No. PCT/JP2022/018804, filed Apr. 26, 2022, which claims priority to and the benefit of Japanese Patent Application No. 2021-074462, filed on Apr. 26, 2021. The contents of these applications are hereby incorporated by reference in their entireties.

TECHNICAL FIELD

The present invention relates to an organic electroluminescence device, an organic electroluminescence display device, and an electronic device.

BACKGROUND ART

An organic electroluminescence device (hereinafter, occasionally referred to as "organic EL device") has found its application in a full-color display for mobile phones, televisions, and the like. When voltage is applied to an organic EL device, holes are injected from an anode and electrons are injected from a cathode into an emitting layer. The injected holes and electrons are recombined in the emitting layer to form excitons. Specifically, according to the electron spin statistics theory, singlet excitons and triplet excitons are generated at a ratio of 25%:75%.

For instance, in Patent Literatures 1 and 2, various studies have been made on layering a plurality of emitting layers of an organic EL device in order to enhance the performance of the organic EL device. In addition, in order to enhance the performance of the organic EL device, Patent Literature 3 describes a phenomenon in which a singlet exciton is generated by collision and fusion of two triplet excitons (hereinafter, occasionally referred to as a Triplet-Triplet Fusion (TTF) phenomenon).

The performance of the organic EL device is evaluable in terms of, for instance, luminance, emission wavelength, chromaticity, luminous efficiency, drive voltage, and lifetime.

CITATION LIST

Patent Literature(s)

Patent Literature 1 JP 2007-294261 A
Patent Literature 2 US Patent Application Publication No. 2019/280209
Patent Literature 3: International Publication No. WO 2010/134350

SUMMARY OF THE INVENTION

Problem(s) to be Solved by the Invention

An organic electroluminescence device described in Patent Literature 1 includes a plurality of emitting layers between an anode and a cathode, in which the emitting layers are each formed of a mixture of a plurality of materials and contain main components different from each other, a combination of adjacent ones of the emitting layers is such that a value obtained by dividing electron mobility of the emitting layer located close to the anode by hole mobility thereof is larger than a value obtained by dividing electron mobility of the emitting layer located close to the cathode by hole mobility thereof, and, in the adjacent ones of the emitting layers, the electron mobility of the emitting layer located close to the anode is larger than the electron mobility of the emitting layer located close to the cathode.

However, reducing the number of the organic layer (i.e., economizing the organic compound layer) forming the hole transporting zone provided between the anode and the emitting layer as shown in the organic electroluminescence device of Patent Literature 1 may deteriorate the luminous efficiency. Patent Literature 1, however, does not recognize a decrease in a hole supply amount.

An object of the invention is to provide an organic electroluminescence device capable of emitting light at enhanced luminous efficiency even with the reduced number of organic layers forming the hole transporting zone, an electronic device provided with the organic electroluminescence device, an organic electroluminescence display device, and an electronic device provided with the organic electroluminescence display device.

Means for Solving the Problem(s)

According to an aspect of the invention, there is provided an organic electroluminescence device including: an anode; a cathode; an emitting region provided between the anode and the cathode; and a hole transporting zone provided between the anode and the emitting region, in which the emitting region includes a first emitting layer and a second emitting layer, one of the first emitting layer and the second emitting layer is provided in a side of the emitting region close to the anode, the hole transporting zone is in direct contact with the anode and the emitting region, the hole transporting zone includes one or more organic layers, at least one of the organic layers in the hole transporting zone is a first organic layer in direct contact with the emitting region, the first organic layer includes a hole transporting zone material, the first emitting layer includes a first host material and a first luminescent compound that emits light having a maximum peak wavelength of 500 nm or less, the second emitting layer includes a second host material and a second luminescent compound that emits light having a maximum peak wavelength of 500 nm or less, the first host material and the second host material are mutually different, the first luminescent compound and the second luminescent compound are mutually the same or different, a triplet energy of the first host material T1(H1) and a triplet energy of the second host material T1(H2) satisfy a relationship of a numerical formula (Numerical Formula 1) below, and an ionization potential of the hole transporting zone material Ip(HT) contained in the first organic layer and an ionization potential of the first luminescent compound Ip(D1) contained in the first emitting layer satisfy a relationship of a numerical formula (Numerical Formula 1X) below.

$$T_1(H1) > T_1(H2) \quad \text{(Numerical Formula 1)}$$

$$Ip(D1) - Ip(HT) < -0.05 \text{ eV} \quad \text{(Numerical Formula 1X)}$$

According to another aspect of the invention, there is provided an electronic device including the organic electroluminescence device according to the above-described aspect of the invention.

According to still another aspect of the invention, there is provided an organic electroluminescence display device including an anode and a cathode arranged opposite each other; and a blue-emitting organic EL device as a blue pixel; a green-emitting organic EL device as a green pixel; and a red-emitting organic EL device as a red pixel, in which the blue-emitting organic EL device includes a blue emitting region including a first emitting layer and a second emitting layer provided between the anode and the cathode, one of the first emitting layer and the second emitting layer is provided in a side of the blue emitting region close to the anode, the green-emitting organic EL device includes a green emitting layer provided between the anode and the cathode, the red-emitting organic EL device includes a red emitting layer provided between the anode and the cathode, the blue-emitting organic EL device, the green-emitting organic EL device, and the red-emitting organic EL device include a hole transporting zone that is provided in a shared manner across the blue-emitting organic EL device, the green-emitting organic EL device, and the red-emitting organic EL device, between the anode and each of the blue emitting region of the blue-emitting organic EL device, the green emitting layer of the green-emitting organic EL device, and the red emitting layer of the red-emitting organic EL device, the hole transporting zone is in direct contact with the first emitting layer or the second emitting layer in the blue emitting region of the blue-emitting organic EL device, the hole transporting zone includes one or more organic layers, at least one organic layer of the organic layers in the hole transporting zone contains a hole transporting zone material, the first emitting layer contains a first host material and a first luminescent compound that emits light having a maximum peak wavelength of 500 nm or less, the second emitting layer contains a second host material and a second luminescent compound that emits light having a maximum peak wavelength of 500 nm or less, the first host material and the second host material are mutually different, the first luminescent compound and the second luminescent compound are mutually the same or different, a triplet energy of the first host material T1(H1) and a triplet energy of the second host material T1(H2) satisfy a relationship of a numerical formula (Numerical Formula 1) below, and in the blue emitting region of the blue-emitting organic EL device, an ionization potential of the hole transporting zone material Ip(HT) and an ionization potential of the first luminescent compound Ip(D1) included in the first emitting layer satisfy a relationship of a numerical formula (Numerical Formula 1X) below.

$$T_1(H1) > T_1(H2) \quad \text{(Numerical Formula 1)}$$

$$Ip(D1) - Ip(HT) < -0.05 \text{ eV} \quad \text{(Numerical Formula 1X)}$$

According to a further aspect of the invention, there is provided an electronic device provided with the organic electroluminescence display device according to the above-described aspect of the invention.

The aspects of the invention can provide an organic electroluminescence device capable of emitting light at enhanced luminous efficiency even with the reduced number of the organic layer forming the hole transporting zone, an electronic device provided with the organic electroluminescence device, an organic electroluminescence display device, and an electronic device provided with the organic electroluminescence display device.

BRIEF EXPLANATION OF DRAWING(S)

FIG. 1 schematically depicts an exemplary arrangement of an organic electroluminescence device according to a first exemplary embodiment.

Figure 2:
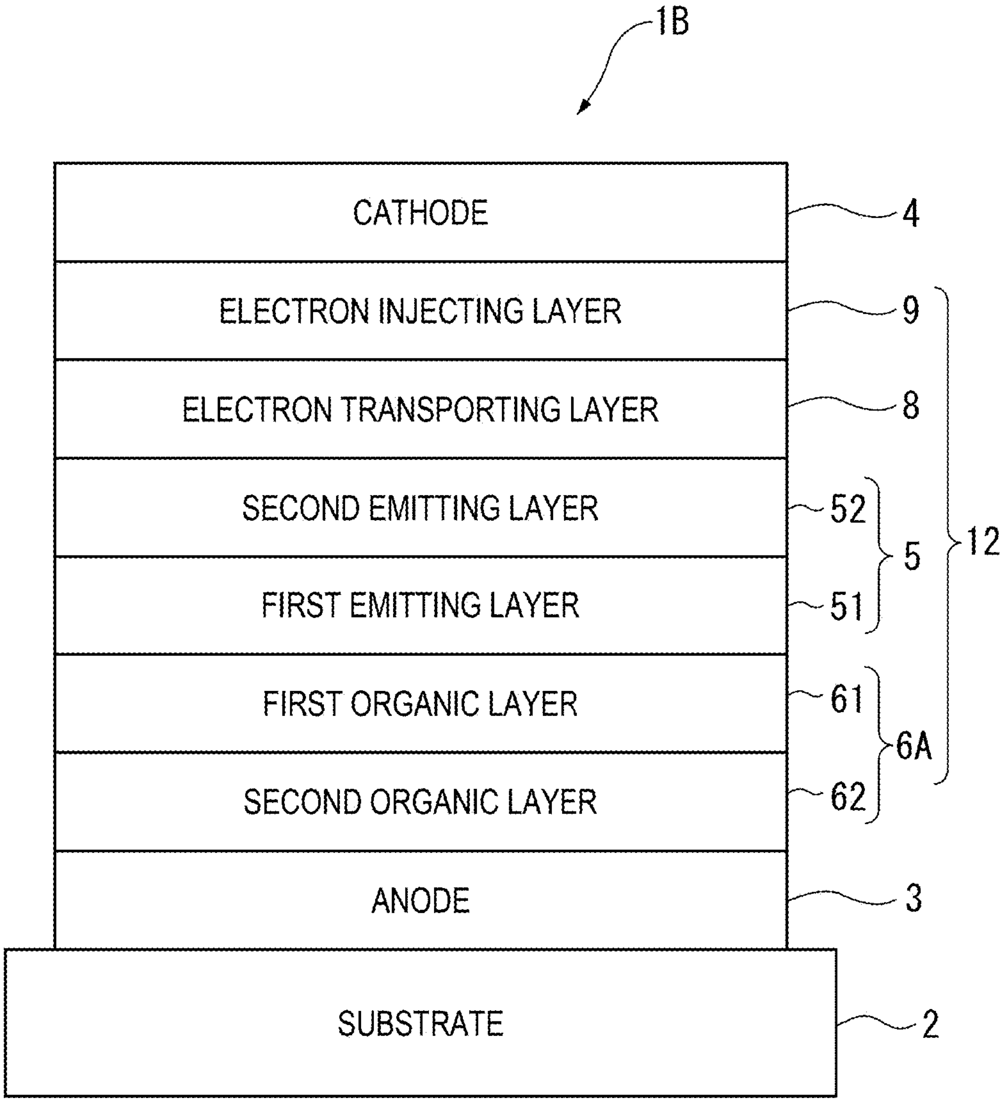

FIG. 2 schematically depicts another exemplary arrangement of the organic electroluminescence device according to the first exemplary embodiment.

Figure 3:
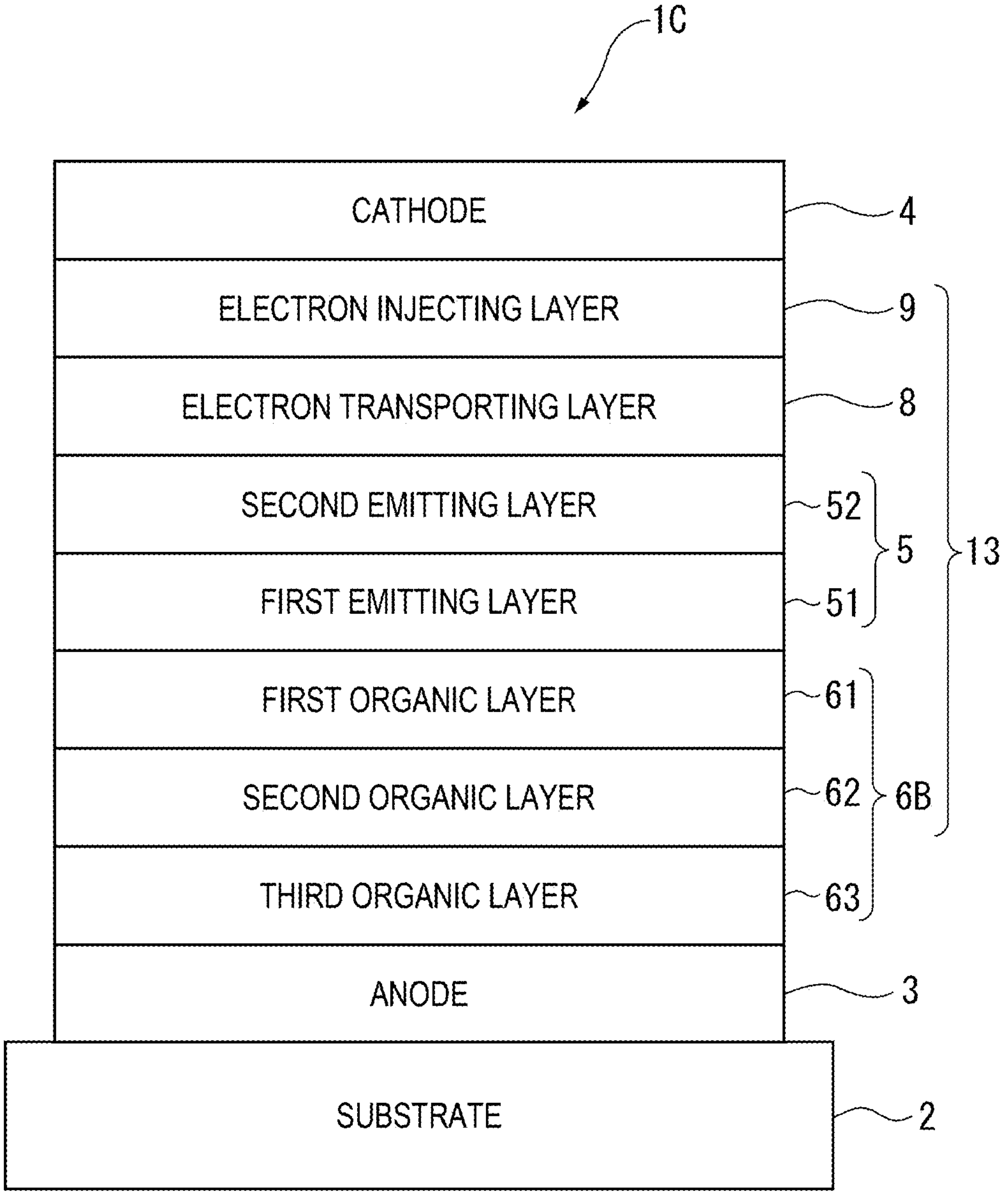

FIG. 3 schematically depicts still another exemplary arrangement of the organic electroluminescence device according to the first exemplary embodiment.

Figure 4:
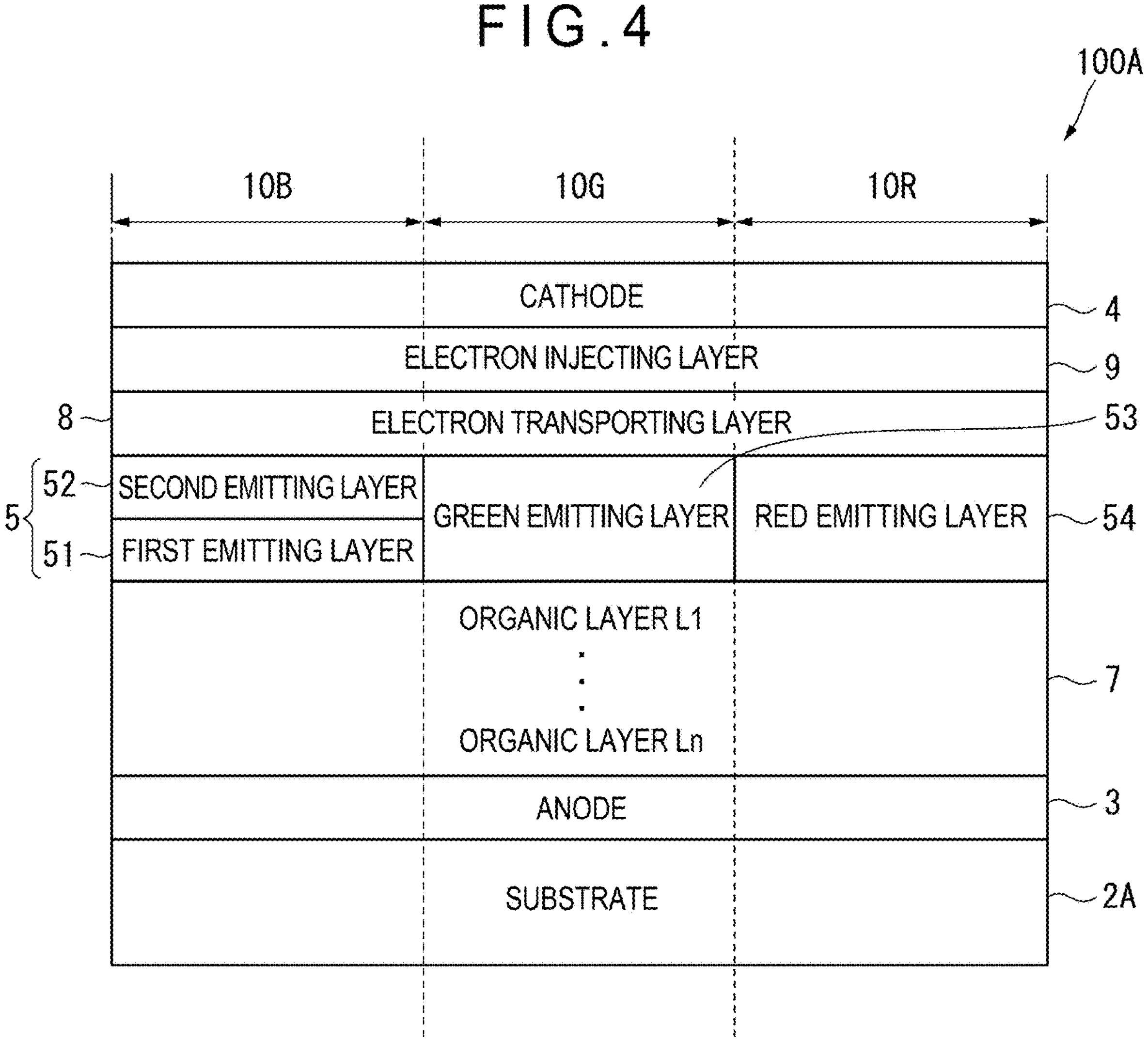

FIG. 4 schematically depicts an exemplary arrangement of an organic electroluminescence display device according to a second exemplary embodiment.

Figure 5:
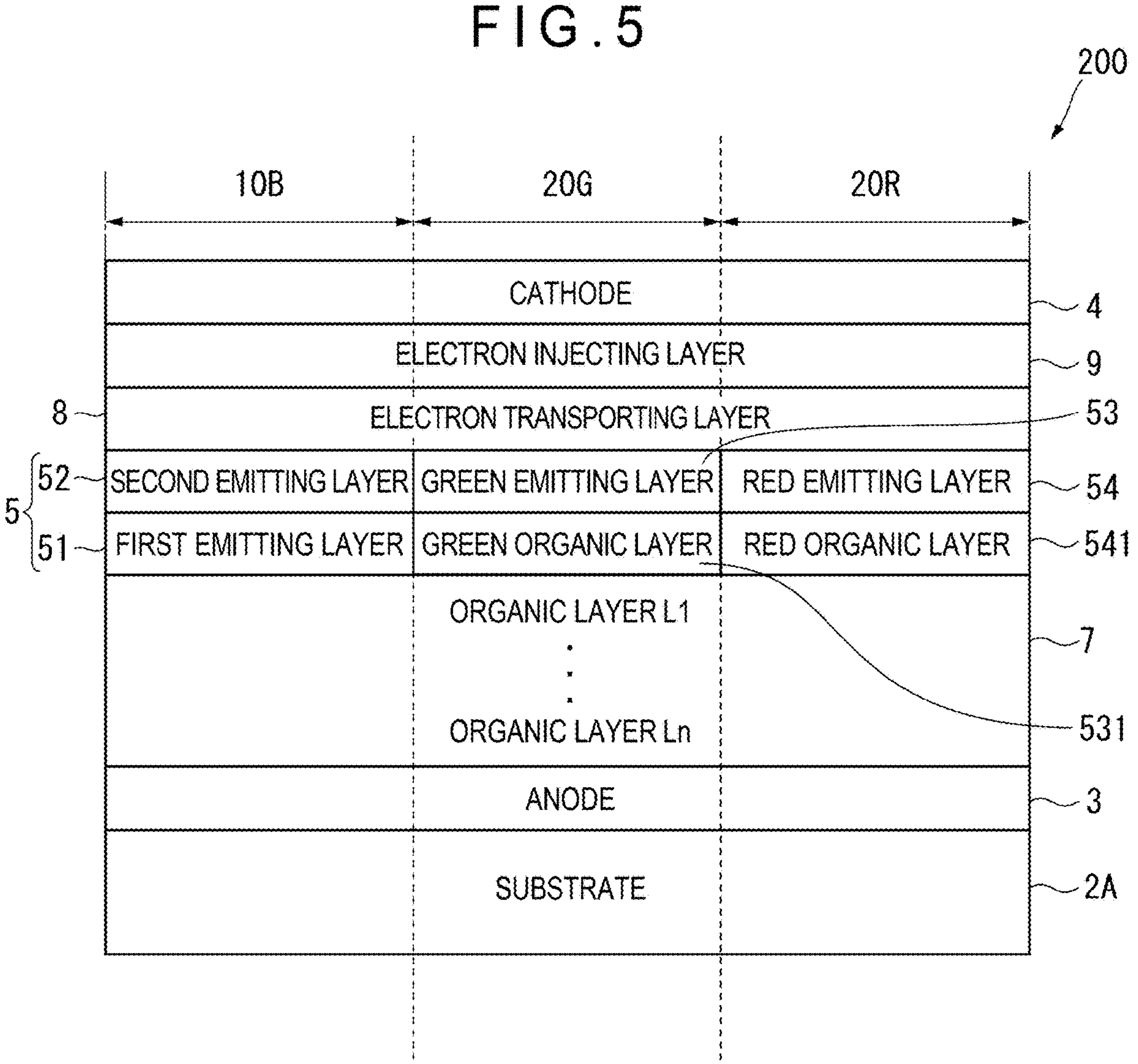

FIG. 5 schematically depicts another exemplary arrangement of the organic electroluminescence display device according to the second exemplary embodiment.

Figure 6:
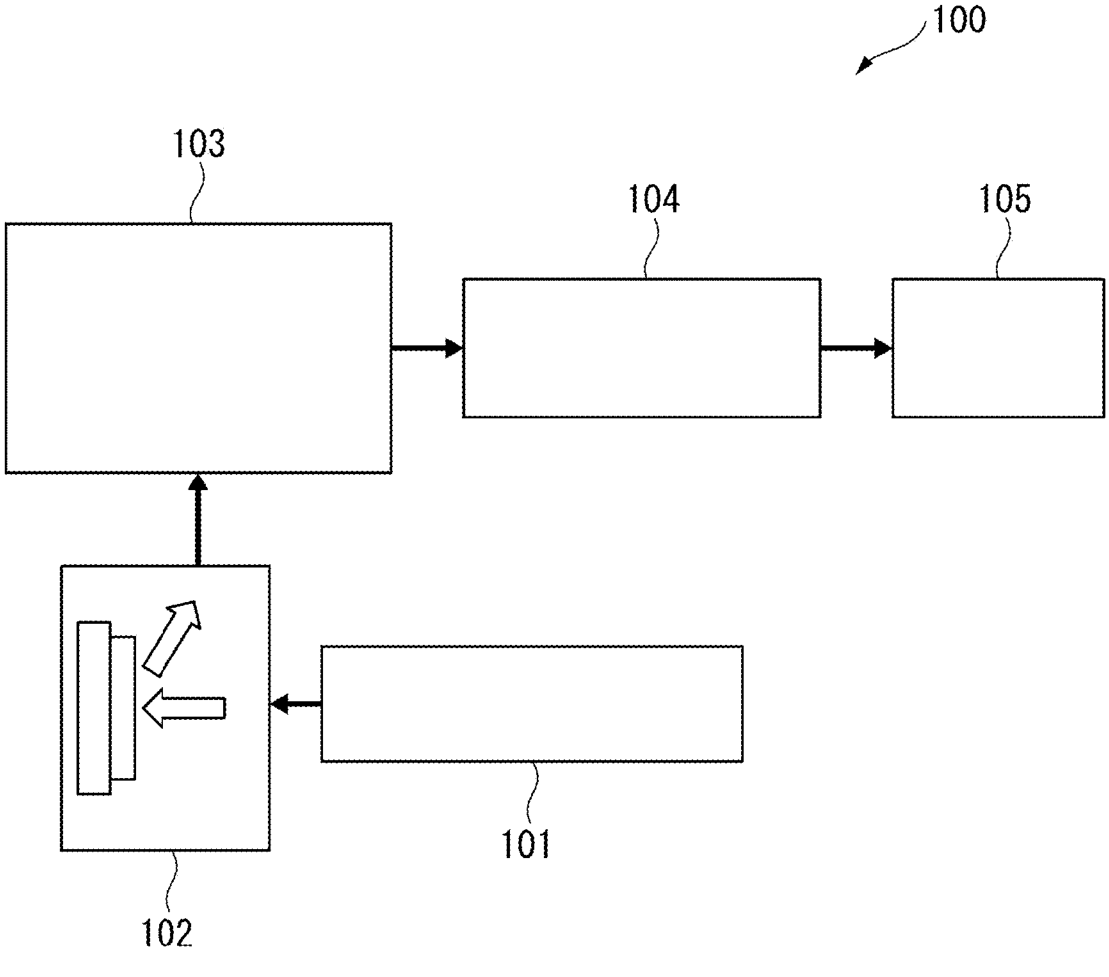

FIG. 6 schematically depicts an apparatus for measuring transient PL.

Figure 7:
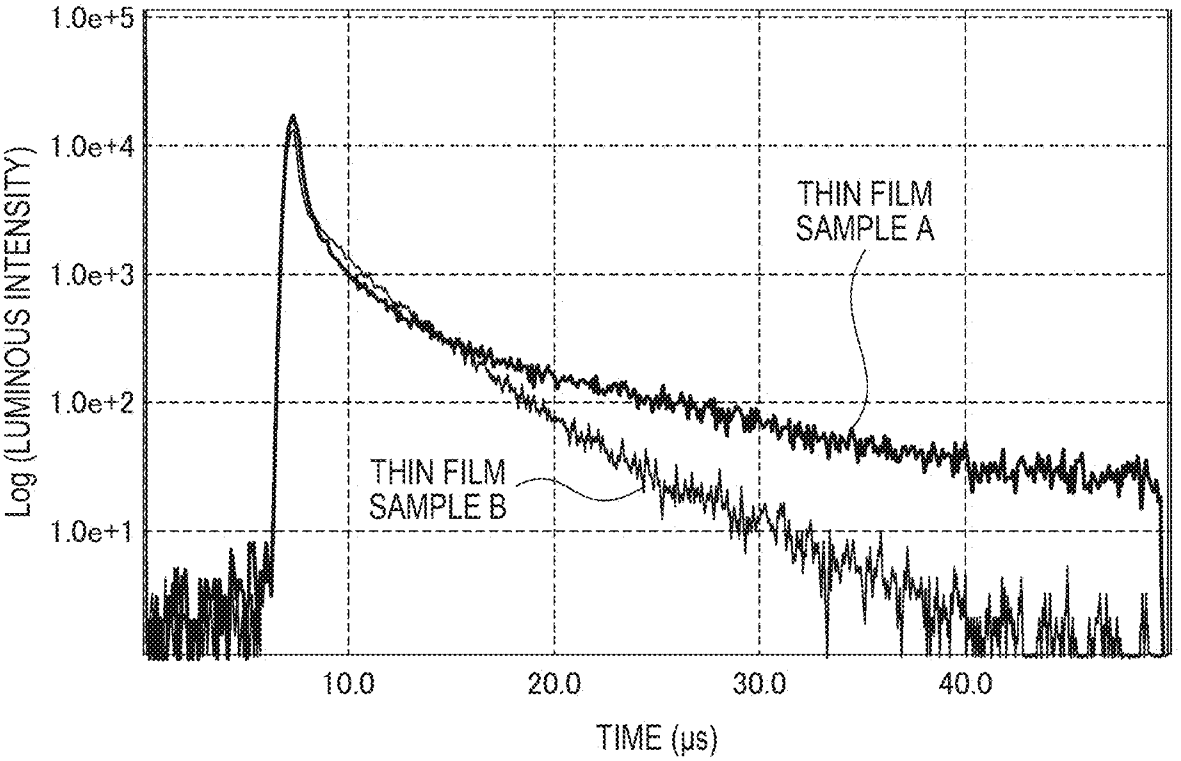

FIG. 7 illustrates an example of decay curves of the transient PL.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent (s), carbon atom(s) contained in the substituent(s) is not counted in the ring carbon atoms. Unless specifically described, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring 4 ring carbon atoms. For instance, a 9,9-diphenylfluorenyl group has 13 ring carbon atoms and 9,9'-spirobifluorenyl group has 25 ring carbon atoms.

When a benzene ring is substituted by a substituent (e.g., an alkyl group), the number of carbon atoms of the alkyl group is not counted in the number of the ring carbon atoms. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s)

not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent is not counted as ring atoms of the pyridine ring. Accordingly, a pyridine ring bonded to a hydrogen atom(s) or a substituent(s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituents Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group", and a substituted aryl group refers to a "substituted aryl group" in a "substituted or unsubstituted aryl group.") A simply termed "aryl group" herein includes both of an "unsubstituted aryl group" and a "substituted aryl group".

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and monovalent aryl group derived by removing one hydrogen atom from cyclic structures represented by formulae (TEMP-1) to (TEMP-15) below.

[Formula 1]

(TEMP-1)

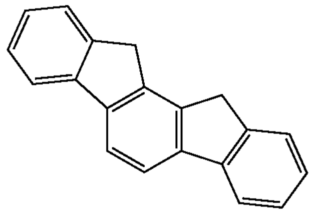

-continued (TEMP-2)

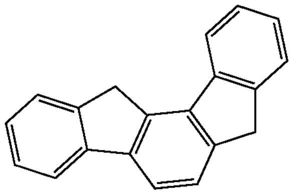

(TEMP-3)

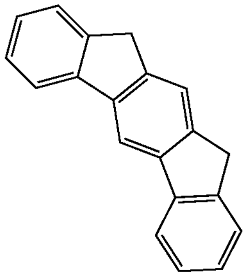

(TEMP-4)

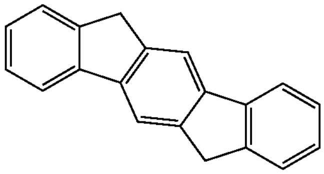

(TEMP-5)

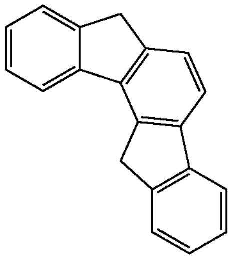

(TEMP-6)

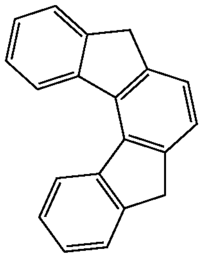

(TEMP-7)

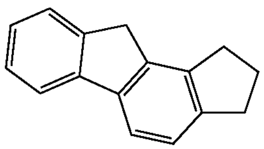

(TEMP-8)

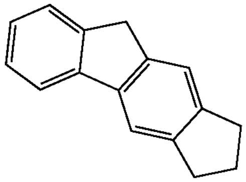

-continued (TEMP-9)

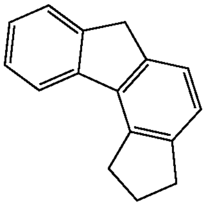

[Formula 2]

(TEMP-10)

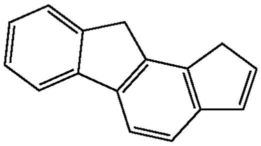

(TEMP-11)

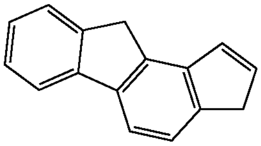

(TEMP-12)

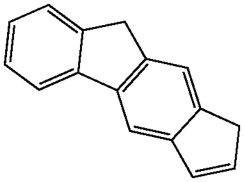

(TEMP-13)

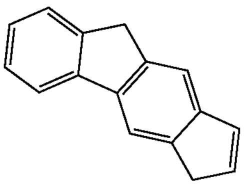

(TEMP-14)

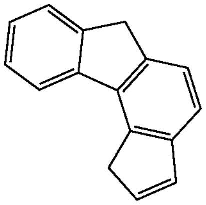

(TEMP-15)

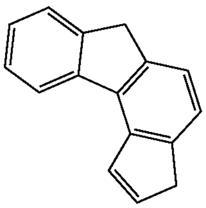

Substituted Aryl Group (Specific Example Group G1B):

an o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis (4-t-butylphenyl)fluorenyl group, cyanophenyl group, triphenylsilylphenyl group, trimethylsilylphenyl group, phenylnaphthyl group, naphthylphenyl group, and group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of an "unsubstituted heterocyclic group" and a "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

a pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazinyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2): a furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

a thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (naphthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

[Formula 3]

(TEMP-16)

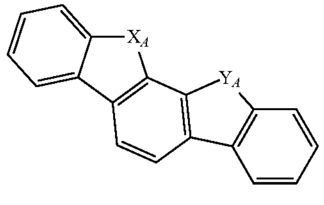

(TEMP-17)

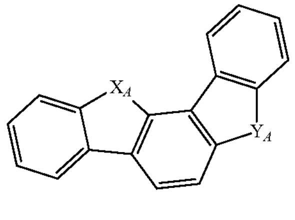

-continued
(TEMP-18)
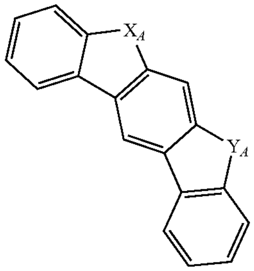
(TEMP-19)
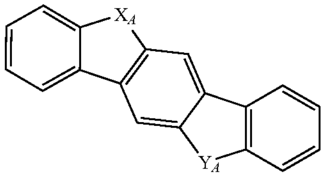
(TEMP-20)
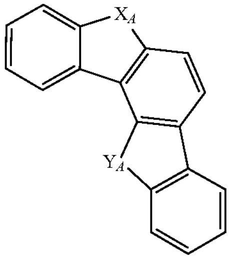
(TEMP-21)
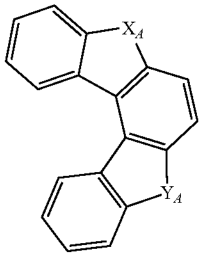
(TEMP-22)
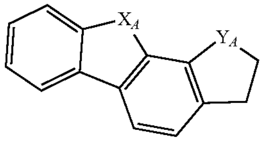
(TEMP-23)
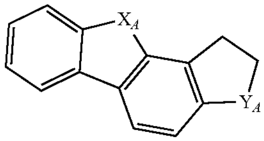
(TEMP-24)
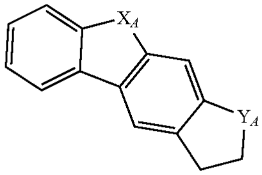
-continued
[Formula 4]
(TEMP-25)
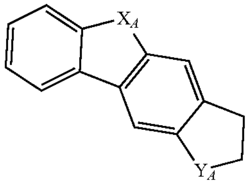
(TEMP-26)
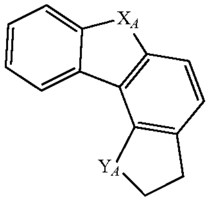
(TEMP-27)
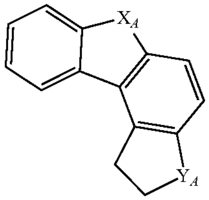
(TEMP-28)
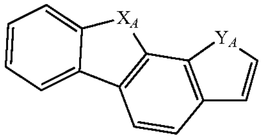
(TEMP-29)
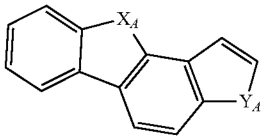
(TEMP-30)
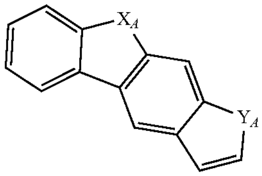
(TEMP-31)
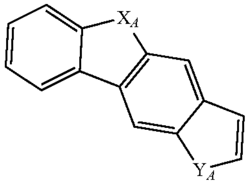
(TEMP-32)
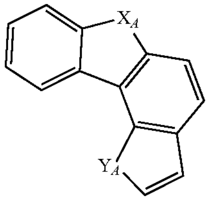

-continued (TEMP-33)

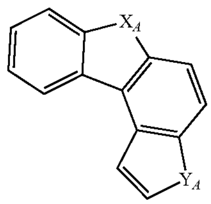

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

a phenyldibenzothiophenyl group, methyldibenzothiophenyl group, t-butyldibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below. (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of an "unsubstituted alkyl group" and a "substituted alkyl group".

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

a methyl group, ethyl group, n-propyl group, isopropyl group, n-butyl group, isobutyl group, s-butyl group, and t-butyl group.

Substituted Alkyl Group (Specific Example Group G3B):

a heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of an "unsubstituted alkenyl group" and a "substituted alkenyl group".

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

a vinyl group, allyl group, 1-butenyl group, 2-butenyl group, and 3-butenyl group.

Substituted Alkenyl Group (Specific Example Group G4B): a 1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group.") A simply termed "alkynyl group" herein includes both of "unsubstituted alkynyl group" and "substituted alkynyl group".

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A): an ethynyl group

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group".

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

a cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B): a 4-methylcyclohexyl group.

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6);

where:

- G1 represents a "substituted or unsubstituted aryl group" in the specific example group G1;
- G2 represents a "substituted or unsubstituted heterocyclic group" in the specific example group G2;
- G3 represents a "substituted or unsubstituted alkyl group" in the specific example group G3;
- G6 represents a "substituted or unsubstituted cycloalkyl group" in the specific example group G6;
- a plurality of G1 in —Si(G1)(G1)(G1) are mutually the same or different;
- a plurality of G2 in —Si(G1)(G2)(G2) are mutually the same or different;
- a plurality of G1 in —Si(G1)(G1)(G2) are mutually the same or different;
- a plurality of G2 in —Si(G2)(G2)(G2) are mutually the same or different;
- a plurality of G3 in —Si(G3)(G3)(G3) are mutually the same or different; and
- a plurality of G6 in —Si(G6)(G6)(G6) are mutually the same or different.

Group Represented by —O—($R_{904}$)

Specific examples (specific example group G8) of a group represented by —O—($R_{904}$) herein include: —O(G1); —O(G2); —O(G3); and —O(G6);

where:

- G1 represents a "substituted or unsubstituted aryl group" in the specific example group G1;
- G2 represents a "substituted or unsubstituted heterocyclic group" in the specific example group G2;
- G3 represents a "substituted or unsubstituted alkyl group" in the specific example group G3; and
- G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6), where:

- G1 represents a "substituted or unsubstituted aryl group" in the specific example group G1;
- G2 represents a "substituted or unsubstituted heterocyclic group" in the specific example group G2;
- G3 represents a "substituted or unsubstituted alkyl group" in the specific example group G3; and
- G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6), where:

- G1 represents a "substituted or unsubstituted aryl group" in the specific example group G1;
- G2 represents a "substituted or unsubstituted heterocyclic group" in the specific example group G2;
- G3 represents a "substituted or unsubstituted alkyl group" in the specific example group G3;
- G6 represents a "substituted or unsubstituted cycloalkyl group" in the specific example group G6;
- a plurality of G1 in —N(G1)(G1) are mutually the same or different;
- a plurality of G2 in —N(G2)(G2) are mutually the same or different;
- a plurality of G3 in —N(G3)(G3) are mutually the same or different; and
- A plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "unsubstituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, and more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "unsubstituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. A plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by -(G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, a-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-(phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 5]

(TEMP-Cz1)

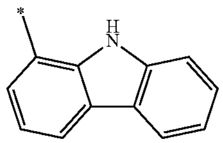

(TEMP-Cz2)

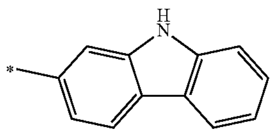

(TEMP-Cz3)

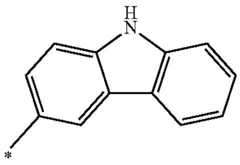

(TEMP-Cz4)

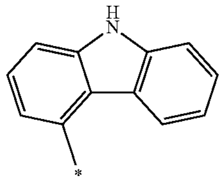

(TEMP-Cz5)

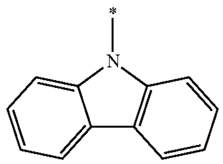

The (9-phenyl)carbazolyl group mentioned herein is, unless otherwise specified herein, specifically a group represented by one of formulae below.

[Formula 6]

(TEMP-Cz6)

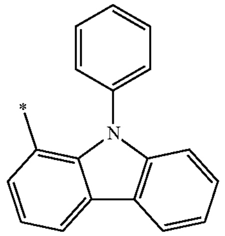

(TEMP-Cz7)

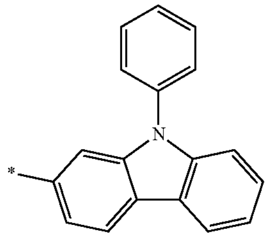

(TEMP-Cz8)

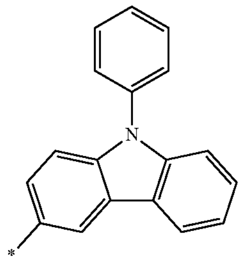

(TEMP-Cz9)

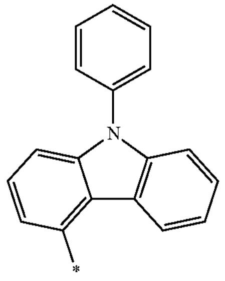

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 7]

(TEMP-34)

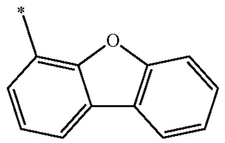

(TEMP-35)

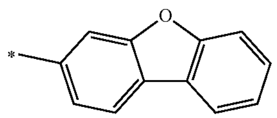

-continued (TEMP-36)

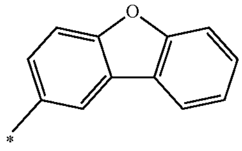

(TEMP-37)

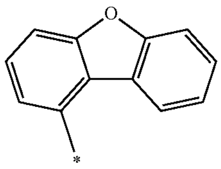

(TEMP-38)

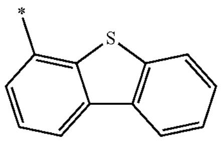

(TEMP-39)

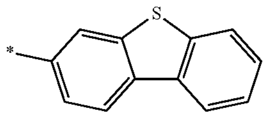

(TEMP-40)

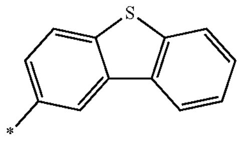

(TEMP-41)

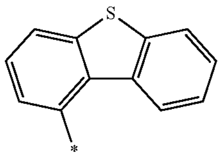

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocyclic ring of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

[Formula 8]

(TEMP-42)

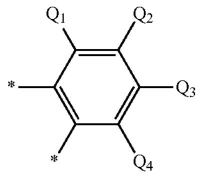

(TEMP-43)

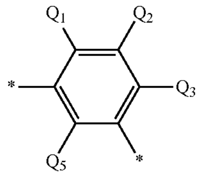

(TEMP-44)

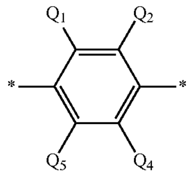

(TEMP-45)

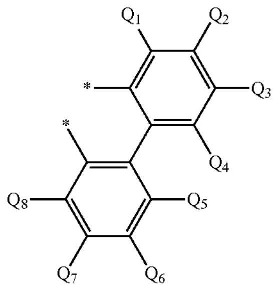

(TEMP-46)

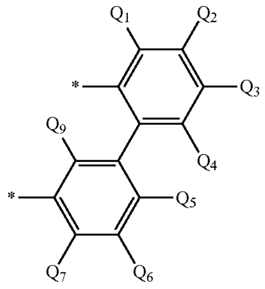

-continued
(TEMP-47)
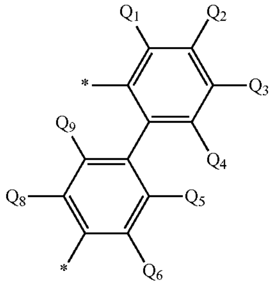
[Formula 9]
(TEMP-48)
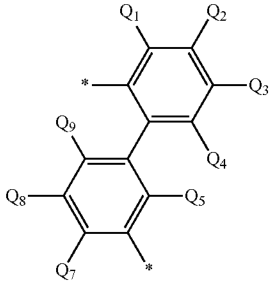
(TEMP-49)
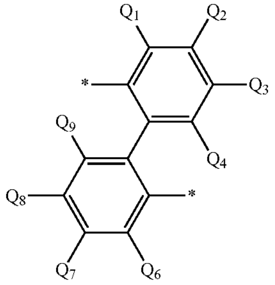
(TEMP-50)
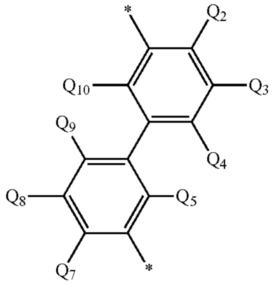
(TEMP-51)
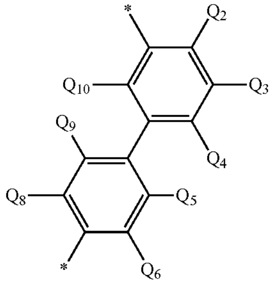
-continued
(TEMP-52)
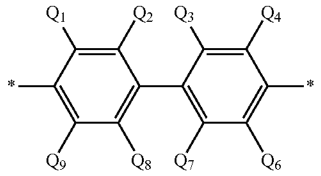
In the formulae (TEMP-42) to (TEMP-52), $Q_1$ to $Q_{10}$ are each independently a hydrogen atom or a substituent.
In the formulae (TEMP-42) to (TEMP-52), * represents a bonding position.
[Formula 10]
(TEMP-53)
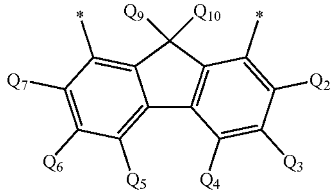
(TEMP-54)
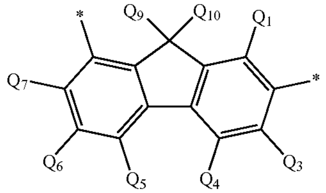
(TEMP-55)
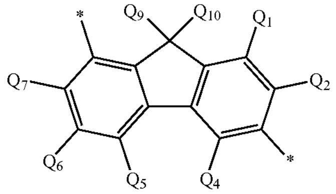
(TEMP-56)
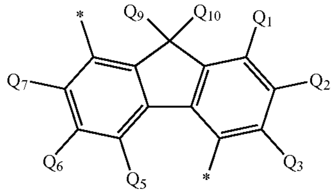
(TEMP-57)
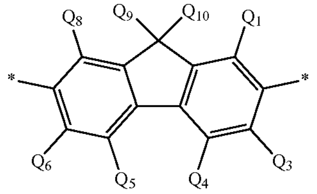
(TEMP-58)
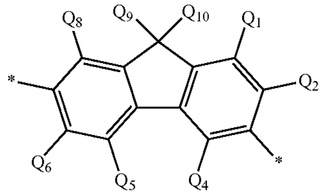

-continued (TEMP-59)

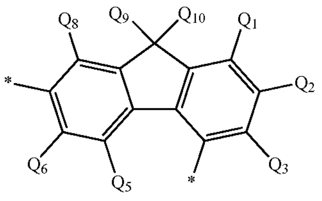

(TEMP-60)

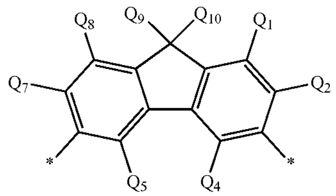

(TEMP-61)

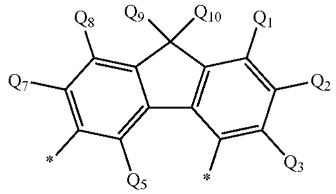

(TEMP-62)

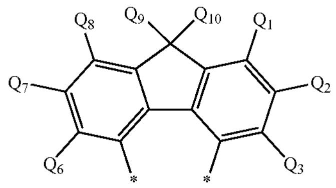

In the formulae (TEMP-53) to (TEMP-62), $Q_1$ to $Q_{10}$ are each independently a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

[Formula 11]

(TEMP-63)

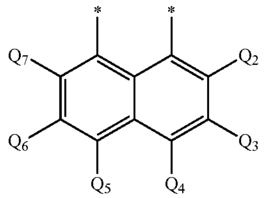

(TEMP-64)

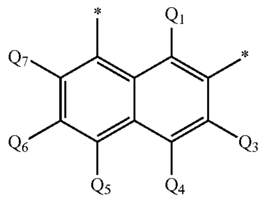

-continued (TEMP-65)

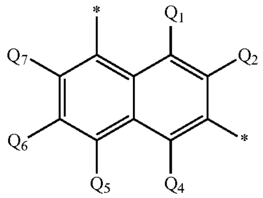

(TEMP-66)

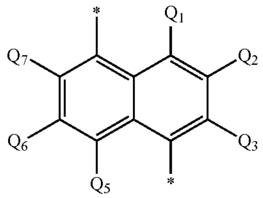

(TEMP-67)

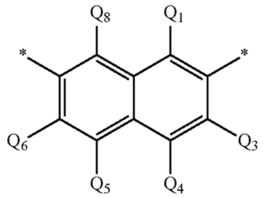

(TEMP-68)

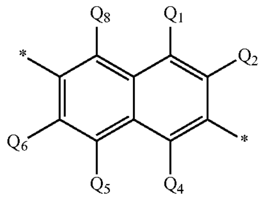

In the formulae (TEMP-63) to (TEMP-68), $Q_1$ to $Q_8$ are each independently a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 12]

(TEMP-69)

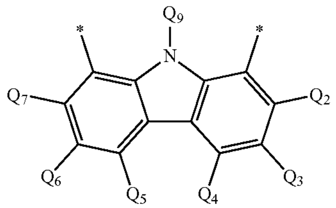

(TEMP-70)

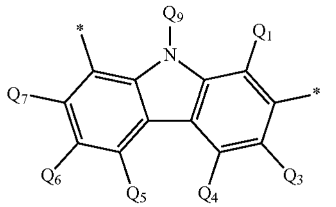

-continued
(TEMP-71)
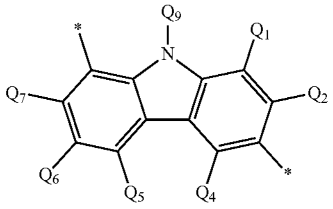
(TEMP-72)
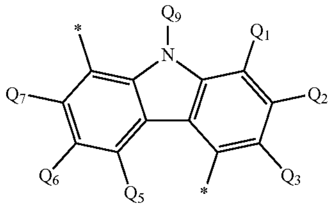
(TEMP-73)
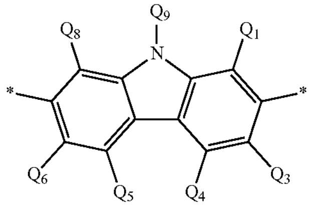
(TEMP-74)
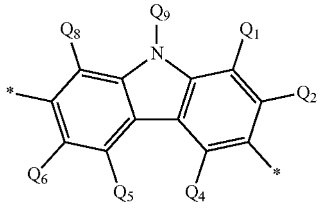
[Formula 13]
(TEMP-75)
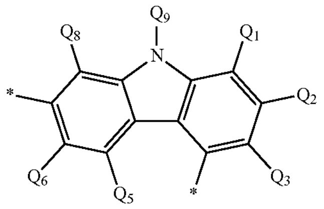
(TEMP-76)
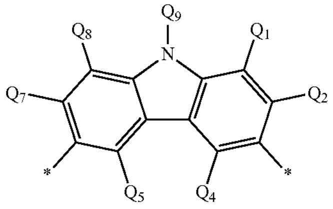
(TEMP-77)
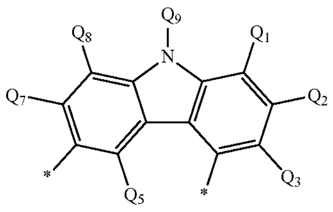
-continued
(TEMP-78)
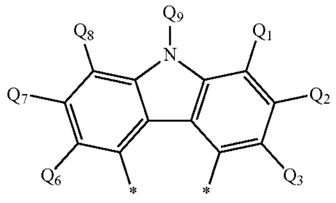
(TEMP-79)
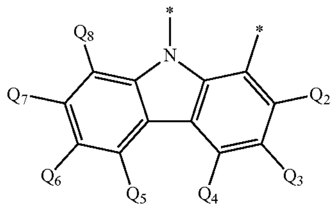
(TEMP-80)
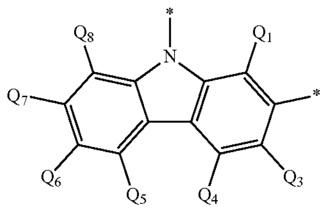
[Formula 14]
(TEMP-81)
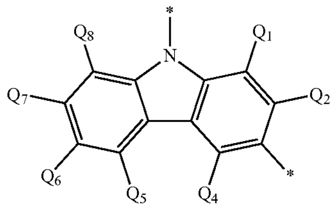
(TEMP-82)
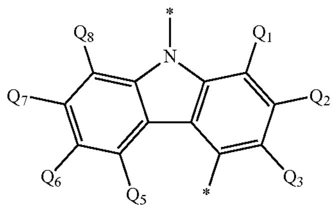
In the formulae (TEMP-69) to (TEMP-82), $Q_1$ to $Q_9$ are each independently a hydrogen atom or a substituent.
[Formula 15]
(TEMP-83)
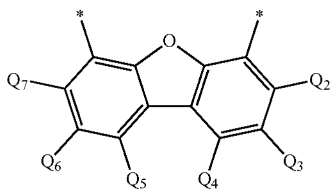

-continued
(TEMP-84)
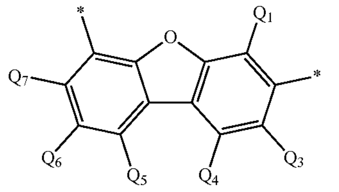
(TEMP-85)
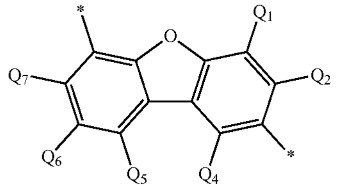
(TEMP-86)
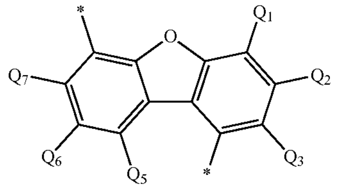
(TEMP-87)
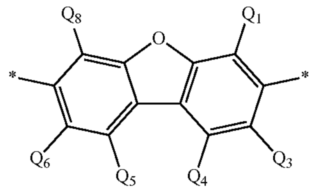
(TEMP-88)
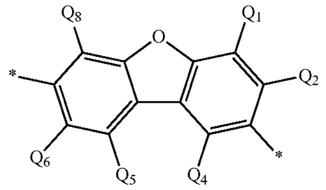
[Formula 16]
(TEMP-89)
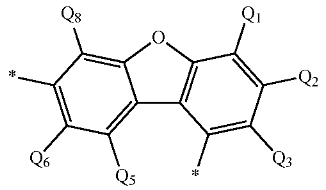
(TEMP-90)
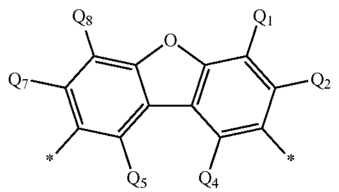
(TEMP-91)
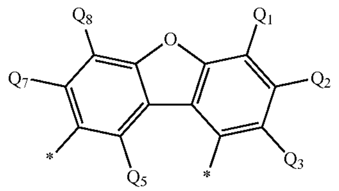
-continued
(TEMP-92)
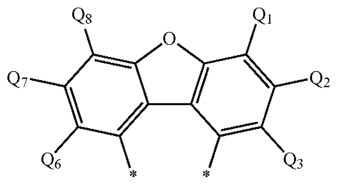
[Formula 17]
(TEMP-93)
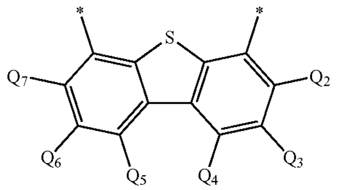
(TEMP-94)
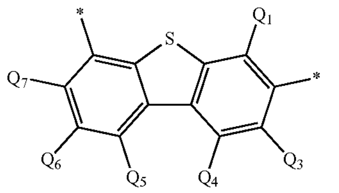
(TEMP-95)
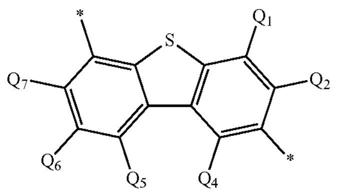
(TEMP-96)
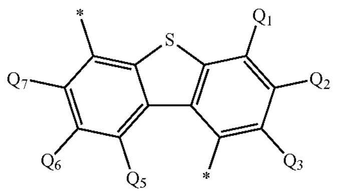
(TEMP-97)
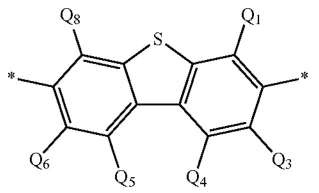
(TEMP-98)
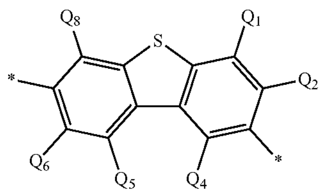

-continued

[Formula 18]

(TEMP-99)

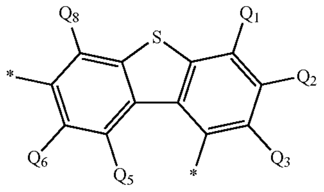

(TEMP-100)

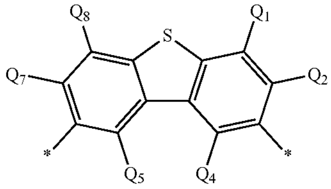

(TEMP-101)

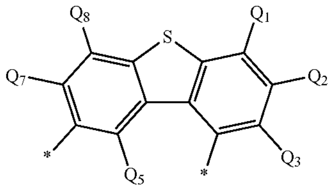

(TEMP-102)

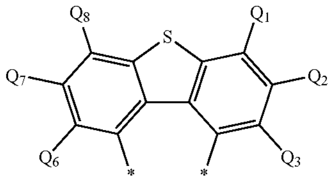

In the formulae (TEMP-83) to (TEMP-102), $Q_1$ to $Q_8$ are each independently a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

[Formula 19]

(TEMP-103)

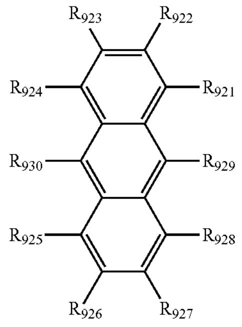

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 20]

(TEMP-104)

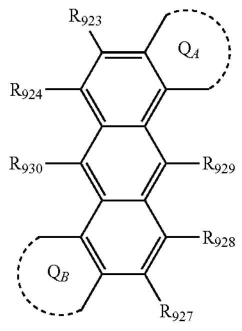

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

[Formula 21]

(TEMP-105)

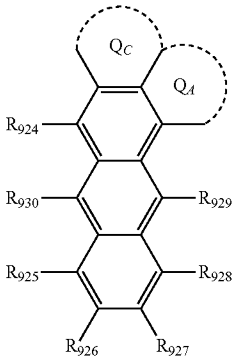

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific examples of the specific example group G1 with a hydrogen atom.

Specific examples of the aromatic heterocyclic ring include a ring formed by terminating a bond of an aromatic heterocyclic group in the specific examples of the specific example group G2 with a hydrogen atom.

Specific examples of the aliphatic hydrocarbon ring include a ring formed by terminating a bond of a group in the specific examples of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, the substituent for the substituted or unsubstituted group (sometimes referred to as an "optional substituent". hereinafter), is for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic ring having 5 to 50 ring atoms.

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, the substituent for the substituted or unsubstituted group is a group selected from the group consisting of an alkyl group having 1 to 50 carbon atoms, an aryl group having 6 to 50 ring carbon atoms, and a heterocyclic ring having 5 to 50 ring atoms.

In an exemplary embodiment, the substituent for the substituted or unsubstituted group is a group selected from the group consisting of an alkyl group having 1 to 18 carbon atoms, an aryl group having 6 to 18 ring carbon atoms, and a heterocyclic ring having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represent a range whose lower limit is the value (AA) recited before "to" and whose upper limit is the value (BB) recited after "to."

First Exemplary Embodiment

Organic Electroluminescence Device

An organic electroluminescence device according to a first exemplary embodiment includes: an anode; a cathode; an emitting region provided between the anode and the cathode; and a hole transporting zone provided between the anode and the emitting region, in which the emitting region includes a first emitting layer and a second emitting layer, one of the first emitting layer and the second emitting layer is provided in a side of the emitting region close to the anode, the hole transporting zone is in direct contact with the anode and the emitting region, the hole transporting zone includes one or more organic layers, at least one of the organic layers in the hole transporting zone is a first organic layer in direct contact with the emitting region, the first organic layer includes a hole transporting zone material, the first emitting layer includes a first host material and a first luminescent compound that emits light having a maximum peak wavelength of 500 nm or less, the second emitting layer includes a second host material and a second luminescent compound that emits light having a maximum peak wavelength of 500 nm or less, the first host material and the second host material are mutually different, the first luminescent compound and the second luminescent compound are mutually the same or different, a triplet energy of the first host material T1(H1) and a triplet energy of the second host material T1(H2) satisfy a relationship of a numerical formula (Numerical Formula 1) below, and an ionization potential of the hole transporting zone material Ip(HT) contained in the first organic layer and an ionization potential of the first luminescent compound Ip(D1) contained in the first emitting layer satisfy a relationship of a numerical formula (Numerical Formula 1X) below.

$$T_1(H1) > T_1(H2) \quad \text{(Numerical Formula 1)}$$

$$Ip(D1) - Ip(HT) < -0.05 \text{ eV} \quad \text{(Numerical Formula 1X)}$$

Typically, Triplet-Triplet-Annihilation (occasionally referred to as TTA) has been known as a technology for improving the luminous efficiency of the organic EL device. TTA is a mechanism in which triplet excitons collide with one another to generate singlet excitons. The TTA mechanism is also referred to as a TTF mechanism as described in Patent Literature 3.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of the conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in density thereof, whereby a reaction shown by the following formula occurs. In the formula, $^1A$ represents the ground state and $^1A^*$ represents the lowest singlet excitons.

$$^3A^* + {}^3A^* \rightarrow (4/9)\,{}^1A + (1/9)\,{}^1A^* + (13/9)\,{}^3A^*$$

In other words, $5\,{}^3A^* \rightarrow 4\,{}^1A + 1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

According to the organic EL device according to the first exemplary embodiment, it is considered that triplet excitons generated by recombination of holes and electrons in the first emitting layer and existing on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

The organic electroluminescence device according to the first exemplary embodiment includes at least two emitting layers (i.e., the first and second emitting layers) satisfying a predetermined relationship, in which the triplet energy of the first host material $T_1$(H1) in the first emitting layer and the triplet energy of the second host material $T_1$(H2) in the second emitting layer satisfy the relationship of the numerical formula (Numerical Formula 1).

By including the first emitting layer and the second emitting layer so as to satisfy the relationship of the numerical formula (Numerical Formula 1), triplet excitons generated in the first emitting layer can transfer to the second emitting layer without being quenched by excessive carriers and be inhibited from back-transferring from the second emitting layer to the first emitting layer. Consequently, the second emitting layer exhibits the TTF mechanism to effectively generate singlet excitons, thereby improving the luminous efficiency.

As described above, since the organic electroluminescence device includes, as different regions, the first emitting layer mainly generating triplet excitons and the second emitting layer mainly exhibiting the TTF mechanism using triplet excitons having transferred from the first emitting layer, and has a difference in triplet energy provided by using a compound having a smaller triplet energy than that of the first host material in the first emitting layer as the second host material in the second emitting layer, the luminous efficiency is improved.

Since the organic EL device according to the exemplary embodiment includes the first emitting layer and the second emitting layer satisfying the numerical formula (Numerical Formula 1), the luminous efficiency of the organic EL device is improvable.

The organic EL device according to the exemplary embodiment has a layer structure (layer-saving structure) in which the number of organic layers forming the hole transporting zone between the emitting region and the anode is reduced. Since the organic EL device with such a layer-saving structure is likely to lack the amount of holes supplied to the emitting region, the luminous efficiency may be decreased.

With the organic EL device according to the exemplary embodiment, since the ionization potential of the hole transporting zone material Ip(HT) contained in the first organic layer and the ionization potential of the first luminescent compound Ip(D1) contained in the first emitting layer satisfy the relationship of the numerical formula (Numerical Formula 1X), an energy barrier between the hole transporting zone material and the first luminescent compound is reducible. As a result, even with the reduced number of organic layers forming the hole transporting zone (e.g., even when the hole transporting zone is formed with two layers), hole injection into the emitting region can be promoted, leading to high efficiency of the organic EL device.

Moreover, with the organic EL device according to the exemplary embodiment, since high efficiency of the organic EL device can be ensured by selecting the hole transporting zone material and the first luminescent compound that satisfy the relationship of the numerical formula (Numerical Formula 1X), for instance, a range of choices of the first host material that is a component used together with the first luminescent compound for the first emitting layer is expandable.

In the organic EL device according to the exemplary embodiment, in order to further reduce the energy barrier between the hole transporting zone material and the first luminescent compound to further promote hole injection to the emitting region, the ionization potential of the hole transporting zone material Ip(HT) contained in the first organic layer and the ionization potential of the first luminescent compound Ip(D1) contained in the first emitting layer more preferably satisfy a relationship of a numerical formula (Numerical Formula 1Y) below, still more preferably a relationship of a numerical formula (Numerical Formula 1Z) below.

$$Ip(D1) - Ip(HT) < -0.07 \text{ eV} \quad \text{(Numerical Formula 1Y)}$$

$$Ip(D1) - Ip(HT) < -0.10 \text{ eV} \quad \text{(Numerical Formula 1Z)}$$

In the organic EL device of the exemplary embodiment, the ionization potential of the hole transporting zone material Ip(HT) contained in the first organic layer is preferably larger than 5.4 eV.

In the organic EL device according to the exemplary embodiment, in a case where the hole transporting zone material contained in the first organic layer is a common hole transporting zone material, an ionization potential of the common hole transporting zone material Ip(HTX) is preferably in a range from 5.4 eV to 5.6 eV.

In the organic EL device according to the exemplary embodiment, the ionization potential of the first luminescent compound Ip(D1) contained in the first emitting layer is preferably smaller than 5.45 eV.

In the organic EL device according to the exemplary embodiment, a triplet energy of the first luminescent compound $T_1$(D1) contained in the first emitting layer is preferably 2.1 eV or more, more preferably 2.2 eV or more. The upper limit of the triplet energy of the first luminescent compound $T_1$(D1) is preferably 2.8 eV or less in terms of stability of the compounds.

When the triplet energy of the first luminescent compound $T_1$(D1) contained in the first emitting layer is 2.1 eV or more, the triplet energy $T_1$(D1) excited in the first host material can be efficiently transferred to the second host material.

When the triplet energy of the first luminescent compound $T_1$(D1) contained in the first emitting layer is 2.1 eV or more, and the triplet energy of the first host material $T_1$(H1) and the triplet energy of the first luminescent compound $T_1(D1)$ satisfy a relationship of a numerical formula (Numerical Formula 20A) ($T_1(D1)>T_1(H1)$) described below, the triplet energy $T_1(D1)$ excited in the first host material can be more efficiently transferred to the second host material.

In the organic EL device according to the exemplary embodiment, it is preferable that the first emitting layer is provided between the hole transporting zone and the cathode and the second emitting layer is provided between the first emitting layer and the cathode. In this arrangement, the hole transporting zone is in direct contact with the first emitting layer.

The organic EL device according to the exemplary embodiment may include the first emitting layer and the second emitting layer in this order from a side close to the anode, or may include the second emitting layer and the first emitting layer in this order from the side close to the anode. Regardless of the order of the first emitting layer and the second emitting layer, the effect obtained by layering the first and second emitting layers can be expected by selecting a combination of materials satisfying the relationship of the numerical formula (Numerical Formula 1).

In an exemplary embodiment, the number of layers provided between the anode and the emitting region is one.

In an exemplary embodiment, the number of layers provided between the anode and the emitting region is two.

In an exemplary embodiment, the number of layers provided between the anode and the emitting region is three.

In an exemplary embodiment, the hole transporting zone provided between the anode and the emitting region includes at least one organic layer of the hole injecting layer, hole transporting layer, or electron blocking layer.

The electron blocking layer is, for instance, a layer for transporting holes and blocking electrons from reaching a layer close to the anode (e.g., the hole transporting layer or the hole injecting layer) beyond the electron blocking layer. Alternatively, the electron blocking layer may be a layer for blocking excitation energy from leaking out from the emitting region toward neighboring layer(s). In this case, the electron blocking layer blocks excitons generated in the emitting layer from being transferred to a layer(s) (e.g., the hole transporting layer or the hole injecting layer) closer to the anode beyond the electron blocking layer.

In the organic EL device according to the exemplary embodiment, the hole transporting zone may also include no material different from the hole transporting zone material.

In the organic EL device according to the exemplary embodiment, the hole transporting zone may also consist of the first organic layer.

In the organic EL device of the exemplary embodiment, the first organic layer may also include no material different from the hole transporting zone material.

In the organic EL device according to the exemplary embodiment, it is preferable that each of the organic layers in the hole transporting zone contains the hole transporting zone material as a common hole transporting zone material.

In the organic EL device according to the exemplary embodiment, it is preferable that all the organic layers in the hole transporting zone contain the hole transporting zone material in common.

Herein, in a case where all the organic layers in the hole transporting zone contain the hole transporting zone material in common, the hole transporting zone material contained in common to the organic layers is occasionally referred to as a "common hole transporting zone material."

In a case where the hole transporting zone consists of a single organic layer, the single organic layer (first organic layer) contains the hole transporting zone material. In a case where the hole transporting zone consists of two organic layers, the two organic layers preferably contain the same compound as the common hole transporting zone material. In a case where the hole transporting zone consists of three organic layers, at least two of the three organic layers preferably contain the same compound as the common hole transporting zone material, more preferably the three organic layers contain the same compound as the common hole transporting zone material.

The hole transporting zone material contained in the organic layers in the hole transporting zone may be one type of compound or may be a mixture of two or more types of compounds.

In a case where all the organic layers in the hole transporting zone contain the hole transporting zone material, the hole transporting zone material may be one type of compound or may be a mixture of two or more types of compounds.

In the organic EL device according to the exemplary embodiment, an ionization potential of the common hole transporting zone material Ip(HTX) and the ionization potential of the first luminescent compound Ip(D1) contained in the first emitting layer preferably satisfy a relationship of a numerical formula (Numerical Formula 2X) below, more preferably a relationship of a numerical formula (Numerical Formula 2Y) below, and still more preferably a relationship of a numerical formula (Numerical Formula 2Z) below.

$$Ip(D1)-Ip(HTX)<-0.05\ \text{eV} \quad \text{(Numerical Formula 2X)}$$

$$Ip(D1)-Ip(HTX)<-0.07\ \text{eV} \quad \text{(Numerical Formula 2Y)}$$

$$Ip(D1)-Ip(HTX)<-0.10\ \text{eV} \quad \text{(Numerical Formula 2Z)}$$

In the organic EL device according to the exemplary embodiment, the hole transporting zone also preferably includes the first organic layer and the second organic layer provided between the first organic layer and the anode. The second organic layer may be in direct contact with the anode. The first organic layer and the second organic layer may be in direct contact with each other.

In the organic EL device according to the exemplary embodiment, it is also preferable that the first organic layer contains the hole transporting zone material and further a first hole transporting zone material different from the hole transporting zone material. The first hole transporting zone material is a compound different in molecular structure from the hole transporting zone material.

In the organic EL device according to the exemplary embodiment, in a case where the hole transporting zone includes the first organic layer and the second organic layer, the second organic layer also preferably contains the hole transporting zone material and further a second hole transporting zone material different from the hole transporting zone material.

In the organic EL device according to the exemplary embodiment, in a case where the hole transporting zone includes the first organic layer and the second organic layer, it is also preferable that the first organic layer contains the hole transporting zone material and further the first hole transporting zone material different from the hole transporting zone material, and the second organic layer contains the hole transporting zone material and the second hole transporting zone material different from the hole transporting zone material.

In the organic EL device according to the exemplary embodiment, the second hole transporting zone material is also preferably a doped compound (compound different in molecular structure from the hole transporting zone material).

In the organic EL device according to the exemplary embodiment, in a case where the hole transporting zone includes the first organic layer and the second organic layer, a film thickness of the first organic layer may be larger than a film thickness of the second organic layer.

The film thickness of the second organic layer is preferably in a range from 5 nm to 15 nm.

In the organic EL device according to the exemplary embodiment, in a case where the organic layers in the hole transporting zone contain the common hole transporting zone material, the content of the common hole transporting zone material in each organic layer is preferably 40 mass % or more, more preferably 45 mass % or more, and still more preferably 50 mass % or more. The upper limit of the content of the common hole transporting zone material in each organic layer is 100 mass %.

In a case where the common hole transporting zone material contained in each organic layer is a mixture of two or more types of compounds, the upper limit of the content of the common hole transporting zone material (mixture) in each organic layer is 100 mass %.

In the organic EL device of the exemplary embodiment, in a case where the hole transporting zone includes the first organic layer and the second organic layer, and the second organic layer contains the common hole transporting zone material and the doped compound serving as the second hole transporting zone material, the content of the doped compound in the second organic layer is preferably in a range from 0.5 mass % to 5 mass %, and more preferably in a range from 1.0 mass % to 3 mass %.

The content of the common hole transporting zone material in the second organic layer is preferably 40 mass % or more, more preferably 45 mass % or more, and still more preferably 50 mass % or more. The content of the common hole transporting zone material in the second organic layer is preferably 99.5 mass % or less. The total of the content of the common hole transporting zone material and the content of the doped compound in the second organic layer is 100 mass % or less.

In the organic EL device according to the exemplary embodiment, the hole transporting zone may include the first organic layer, the second organic layer, and a third organic layer provided between the second organic layer and the anode. The third organic layer may be in direct contact with the anode. The first organic layer, the second organic layer, and the third organic layer may be in direct contact with each other.

In the organic EL device according to the exemplary embodiment, in a case where the hole transporting zone includes the first organic layer, the second organic layer, and the third organic layer, the third organic layer also preferably contains the hole transporting zone material and further a third hole transporting zone material different from the hole transporting zone material. The second organic layer also preferably contains the hole transporting zone material and further the second hole transporting zone material different from the hole transporting zone material. The first organic layer also preferably contains the hole transporting zone material and further the first hole transporting zone material different from the hole transporting zone material.

The first hole transporting zone material, the second hole transporting zone material, and the third hole transporting zone material are mutually the same or different.

In the organic EL device according to the exemplary embodiment, in a case where the hole transporting zone includes the first organic layer, the second organic layer, and the third organic layer, and the third organic layer contains the third hole transporting zone material, the third hole transporting zone material is also preferably a doped compound.

In the organic EL device according to the exemplary embodiment, in a case where the hole transporting zone includes the first organic layer, the second organic layer, and the third organic layer, it is also preferable that the first organic layer contains the hole transporting zone material and the first hole transporting zone material different from the hole transporting zone material, and the third organic layer contains the hole transporting zone material and the third hole transporting zone material different from the hole transporting zone material. In this arrangement, the first hole transporting zone material and the third hole transporting zone material are mutually the same or different, In the organic EL device according to the exemplary embodiment, in a case where the hole transporting zone includes the first organic layer, the second organic layer, and the third organic layer, a film thickness of the first organic layer is also preferably larger than a film thickness of the second organic layer and a film thickness of the third organic layer.

Moreover, in the organic EL device according to the exemplary embodiment, in a case where the hole transporting zone includes the first organic layer, the second organic layer, and the third organic layer, the film thickness of the second organic layer is also preferably larger than the film thickness of the first organic layer and the film thickness of the third organic layer.

Further, in the organic EL device according to the exemplary embodiment, in a case where the hole transporting zone includes the first organic layer, the second organic layer, and the third organic layer, the film thickness of the third organic layer is also preferably smaller than the film thickness of the first organic layer and the film thickness of the second organic layer.

The film thickness of the third organic layer is preferably in a range from 5 nm to 15 nm.

In the organic EL device according to the exemplary embodiment, in a case where the hole transporting zone includes the first organic layer, the second organic layer, and the third organic layer, and the third organic layer contains the common hole transporting zone material and the doped compound as the third hole transporting zone material, the content of the doped compound in the third organic layer and the content of the common hole transporting zone material in the third organic layer are preferably in the same or similar range to the content of the doped compound in the second organic layer and the content of the common hole transporting zone material in the second organic layer.

In the organic EL device according to the exemplary embodiment, in a case where the hole transporting zone includes the first organic layer and the second organic layer, the first organic layer is also preferably a layer containing the hole transporting zone material and the first hole transporting zone material different from the hole transporting zone material (hereinafter, also referred to as a co-deposited layer). Since the first organic layer being the co-deposited layer enables both high hole transportability and hole injectability to the emitting layer, the luminous efficiency can be more improved while promoting reduction in the number of layers.

In the organic EL device according to the exemplary embodiment, in a case where the hole transporting zone includes the first organic layer, the second organic layer, and the third organic layer, the first organic layer is also preferably the co-deposited layer. Since the first organic layer being the co-deposited layer enables both high hole transportability and hole injectability to the emitting layer, the luminous efficiency can be improved.

In some cases, the organic EL display device including the blue-emitting organic EL device, the green-emitting organic EL device, and the red-emitting organic EL device, the hole transporting zone of the blue-emitting organic EL device has a four-layer structure including the hole injecting layer, the first hole transporting layer, and the second hole transporting layer which are the common layers, and the electron blocking layer as a non-common layer for the blue-emitting organic EL device. Applying the organic EL device according to the exemplary embodiment to such an organic EL display device can eliminate the electron blocking layer for the blue-emitting organic EL device from the above-described four layers.

In a case where the organic layers in the hole transporting zone are organic layers containing a plurality of types of compounds, the organic layers can be formed, for instance, by co-deposition using the plurality of types of compounds, by vapor-deposition using a mixture of the plurality of types of compounds prepared in advance, or by coating using a mixture of the plurality of types of compounds prepared in advance.

In the organic EL device according to the exemplary embodiment, the second organic layer also preferably contains, for instance, a compound having at least one of a first cyclic structure represented by a formula (P11) below or a second cyclic structure represented by a formula (P12) below, as a doped compound (i.e., an exemplary embodiment of the second hole transporting zone material). The second organic layer also preferably contains, for instance, a compound represented by a formula (21) or (22) described below as the second hole transporting zone material.

In the organic EL device according to the exemplary embodiment, the third organic layer also preferably contains, for instance, a compound including at least one of the first cyclic structure represented by the formula (P11) or the second cyclic structure represented by the formula (P12), as a doped compound (i.e., an exemplary embodiment of the third hole transporting zone material). The third organic layer also preferably contains, for instance, a compound represented by the formula (21) or (22) described below as the third hole transporting zone material.

In the organic EL device according to the exemplary embodiment, in a case where the hole transporting zone includes the first organic layer and the second organic layer and the second organic layer is in direct contact with the anode, the second organic layer preferably contains the doped compound.

In the organic EL device according to the exemplary embodiment, in a case where the hole transporting zone includes the first organic layer, the second organic layer, and the third organic layer, and the third organic layer is in direct contact with the anode, the third organic layer preferably contains the doped compound. In a case where the third organic layer contains the doped compound as the third hole transporting zone material, the second organic layer may not contain the second hole transporting zone material or may contain a different compound from the doped compound (e.g., at least one of the compound represented by the formula (21) or the compound represented by the formula (22) described below) as the second hole transporting zone material.

[Formula 22]

(P11)

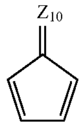

(P12)

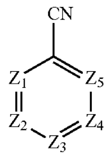

The first cyclic structure represented by the formula (P11) is fused to at least one cyclic structure of a substituted or unsubstituted aromatic hydrocarbon ring having 6 to 50 ring carbon atoms or a substituted or unsubstituted heterocycle having 5 to 50 ring atoms in a molecule of the doped compound.

A structure represented by $=Z_{10}$ is represented by a formula (11a), (11b), (11c), (11d), (11e), (11f), (11g), (11h), (11i), (11j), (11k), or (11m).

[Formula 23]

(11a)

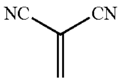

(11b)

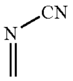

(11c)

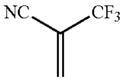

(11d)

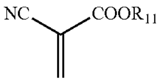

(11e)

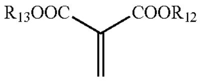

(11f)

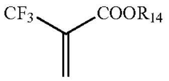

[Formula 24]

(11g)

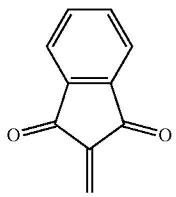

-continued (11h)

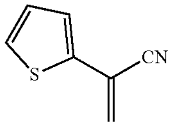

(11i)

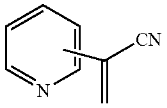

(11j)

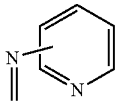

(11k)

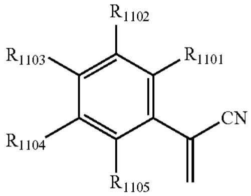

(11m)

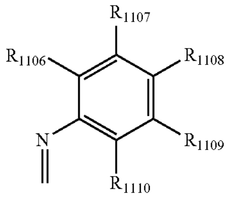

In the formulae (11a), (11b), (11c), (11d), (11e), (11f), (11g), (11h), (11i), (11j), (11k), or (11m): $R_{11}$ to $R_{14}$ and $R_{1101}$ to $R_{1110}$ are each independently a hydrogen atom, a halogen atom, a hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms. In the formula (P12): $Z_1$ to $Z_5$ are each independently a nitrogen atom, a carbon atom bonded to $R_{15}$, or a carbon atom bonded to another atom in a molecule of the doped compound;

at least one of $Z_1$ to $Z_5$ is a carbon atom bonded to another atom in a molecule of the doped compound;

$R_{15}$ is selected from a hydrogen atom, a halogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted alkenyl group having 2 to 50 carbon atoms, a substituted or unsubstituted aralkyl group having 7 to 50 carbon atoms, a carboxy group, a substituted or unsubstituted ester group, a substituted or unsubstituted carbamoyl group, a nitro group, and a substituted or unsubstituted siloxanyl group; and when a plurality of $R_{15}$ are present, the plurality of $R_{15}$ are mutually the same or different.

In the doped compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

An ester group herein is at least one group selected from the group consisting of an alkyl ester group and an aryl ester group.

An alkyl ester group herein is represented, for instance, by —C(=O)OR$^E$. $R^E$ is exemplified by a substituted or unsubstituted alkyl group having 1 to 50 carbon atoms (preferably 1 to 10 carbon atoms).

An aryl ester group herein is represented, for instance, by —C(=O)OR$^{Ar}$. $R^{Ar}$ is exemplified by a substituted or unsubstituted aryl group having 6 to 30 ring carbon atoms.

A siloxanyl group herein, which is a silicon compound group through an ether bond, is exemplified by a trimethylsiloxanyl group.

A carbamoyl group herein is represented by —$CONH_2$.

A substituted carbamoyl group herein is represented, for instance, by —CONH—Ar$^C$ or —CONH—R$^C$. $Ar^C$ is, for instance, at least one group selected from the group consisting of a substituted or unsubstituted aryl group having 6 to 50 ring carbon atoms (preferably 6 to 10 ring carbon atoms) and a heterocyclic group having 5 to 50 ring atoms (preferably 5 to 14 ring atoms). $Ar^C$ may be a group in which a substituted or unsubstituted aryl group having 6 to 50 ring carbon atoms is bonded to a substituted or unsubstituted heterocyclic group having 5 to 50 ring atoms.

$R^C$ is exemplified by a substituted or unsubstituted alkyl group having 1 to 50 carbon atoms (preferably 1 to 6 carbon atoms).

In the doped compound, all groups specified as "substituted or unsubstituted" groups are preferably "unsubstituted" groups.

Specific examples of the doped compound (an exemplary embodiment of the second hole transporting zone material or the third hole transporting zone material) include the following compounds. It should however be noted that the invention is not limited to the specific examples of the doped compound.

[Formula 25]
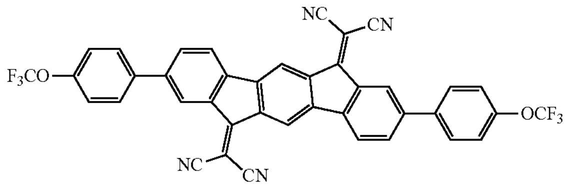
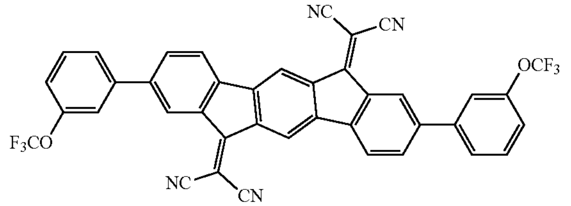
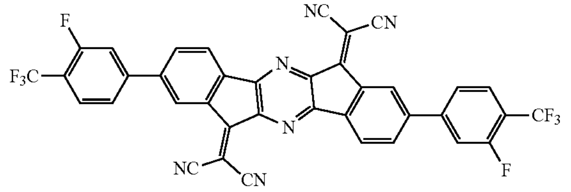
[Formula 26]
(A-1)
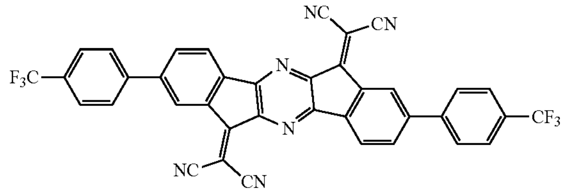
(A-2)
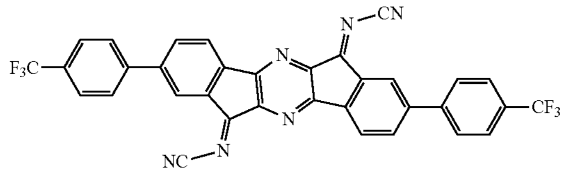
(A-3)
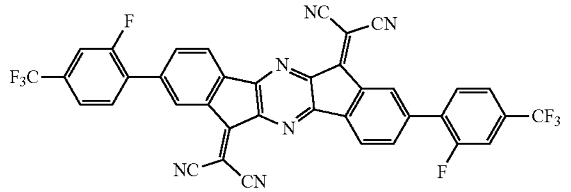
(A-4)
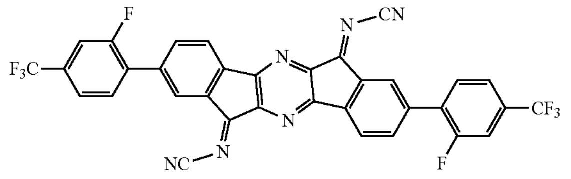
-continued
[Formula 27]
(A-5)
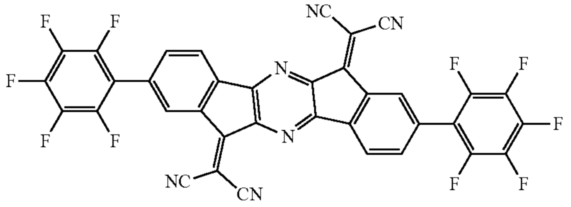
(A-6)
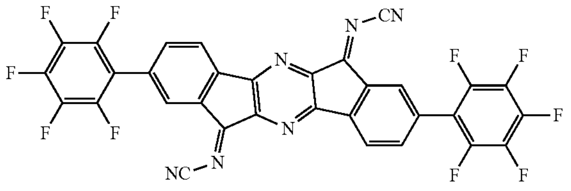
(A-7)
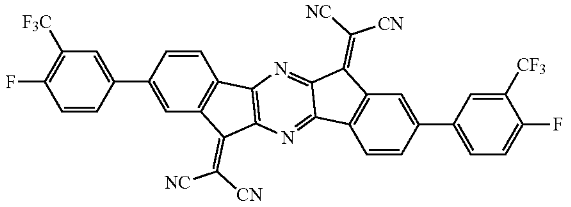
(A-8)
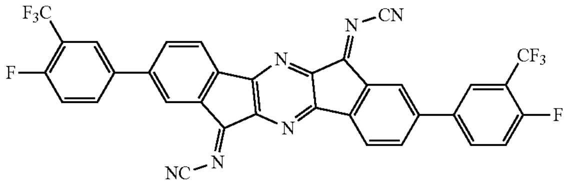
[Formula 28]
(A-9)
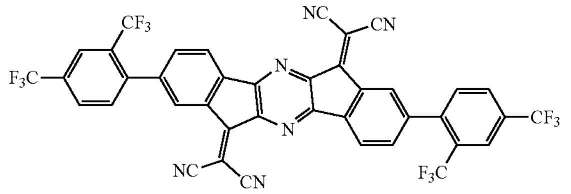
(A-10)
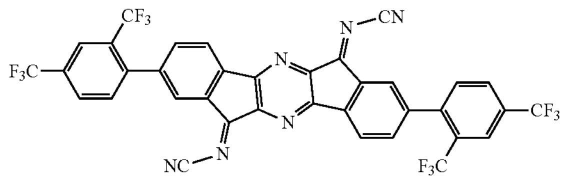
(A-11)
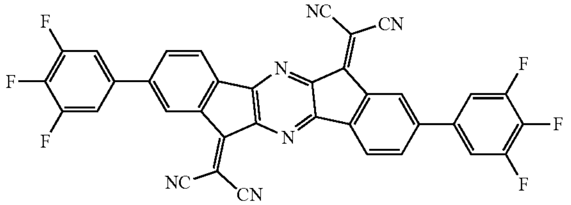

-continued
(A-12)
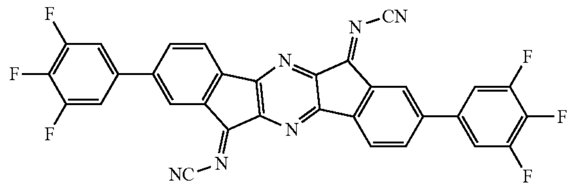
[Formula 29]
(A-13)
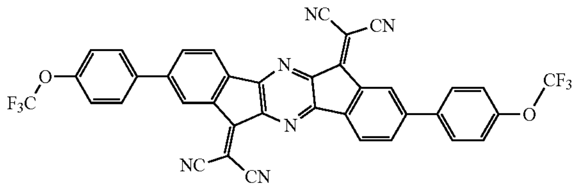
(A-14)
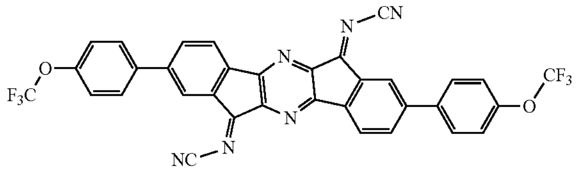
(A-15)
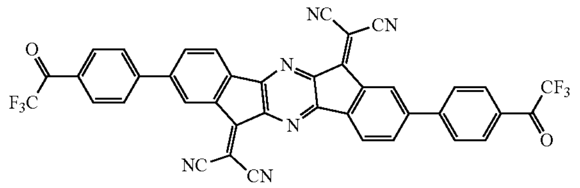
(A-16)
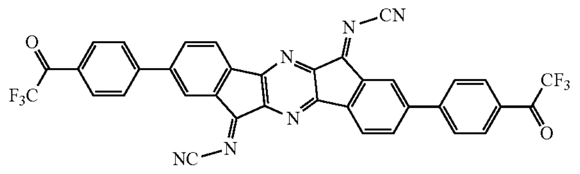
[Formula 30]
(A-17)
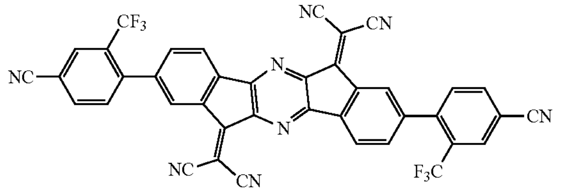
(A-18)
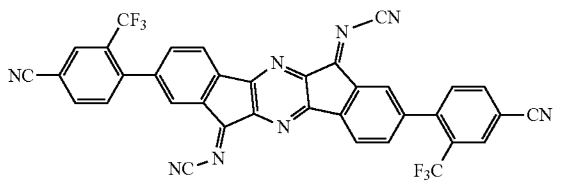
-continued
(A-19)
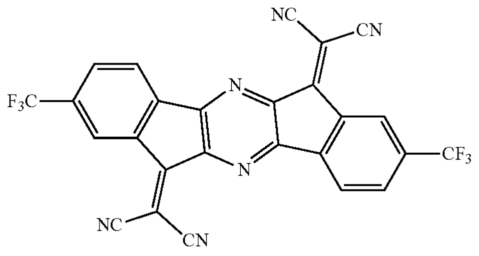
(A-20)
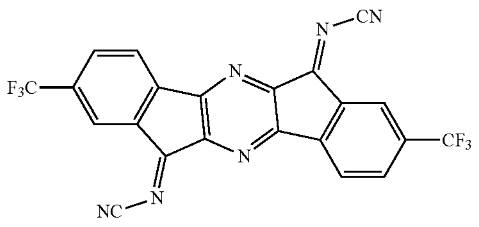
[Formula 31]
(A-21)
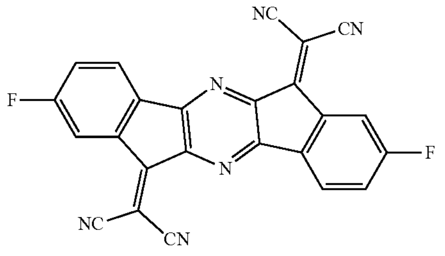
(A-22)
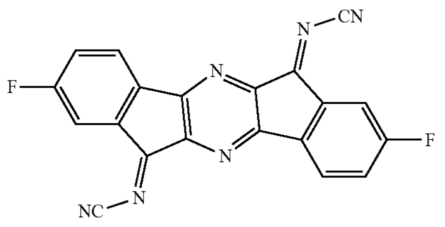
(A-23)
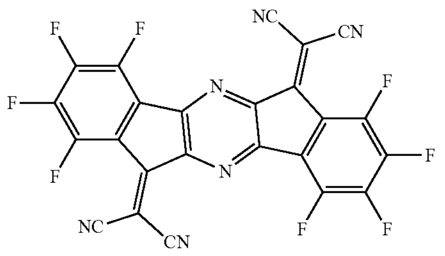
(A-24)
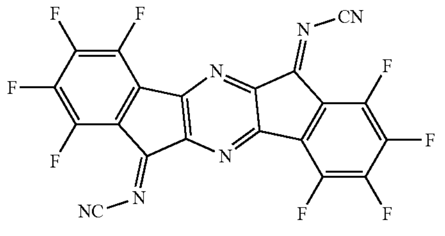

-continued
(A-25)
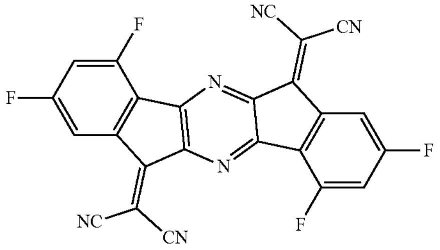
(A-26)
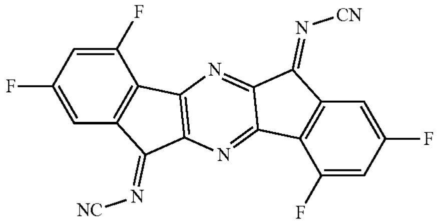
[Formula 32]
(A-27)
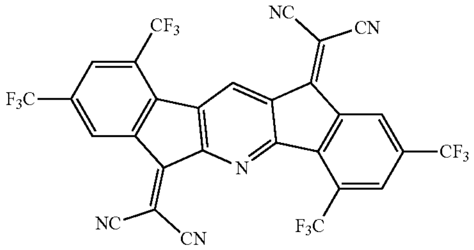
(A-28)
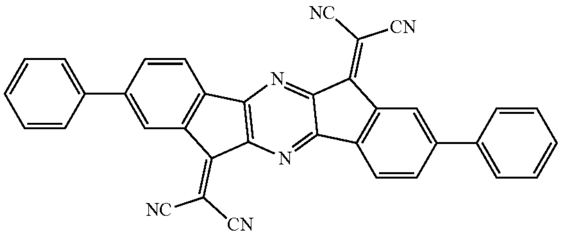
(A-29)
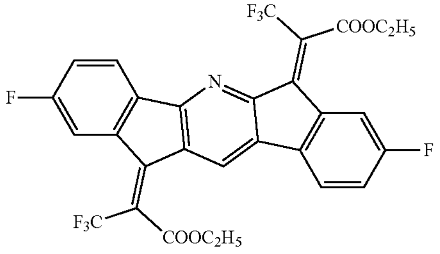
-continued
(A-30)
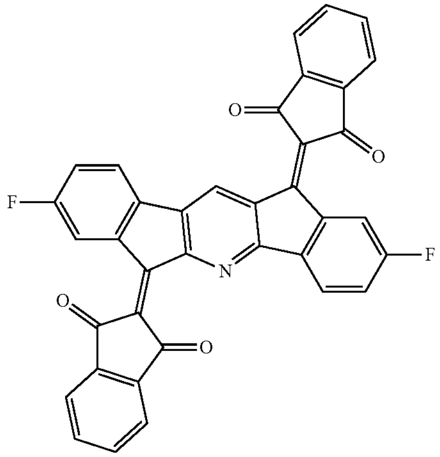
[Formula 33]
(A-31)
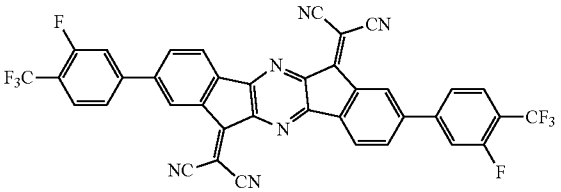
(A-32)
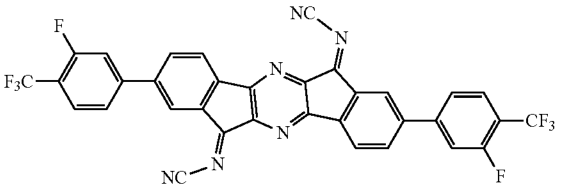
(A-33)
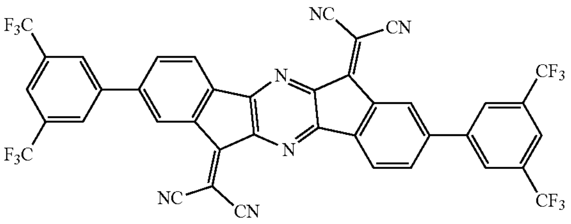
(A-34)
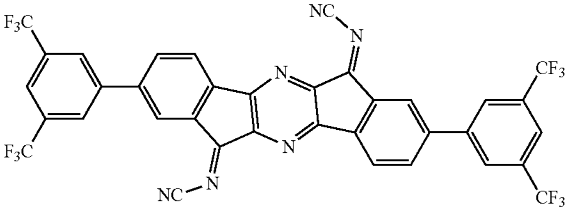

-continued
[Formula 34]
(A-35)
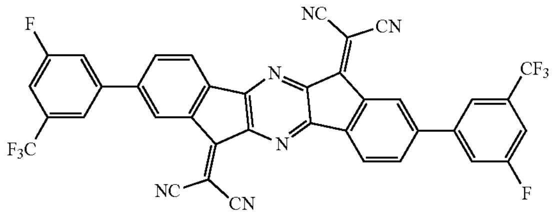
(A-36)
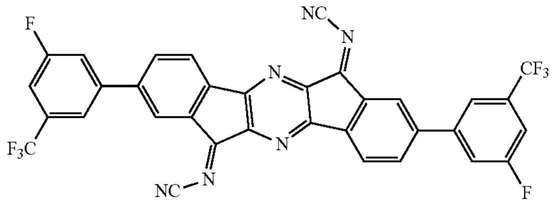
(A-37)
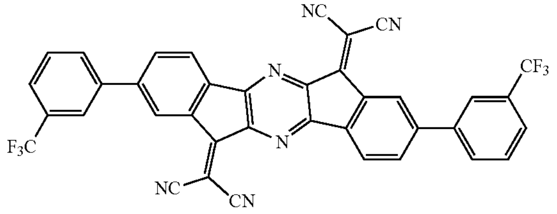
(A-38)
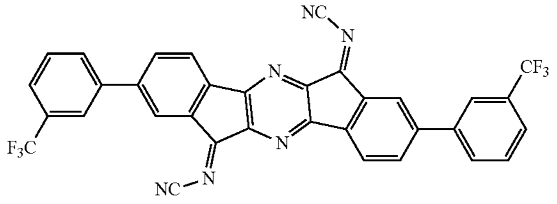
[Formula 35]
(A-39)
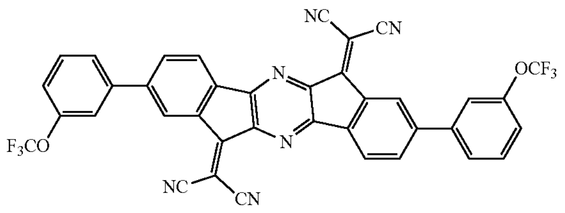
(A-40)
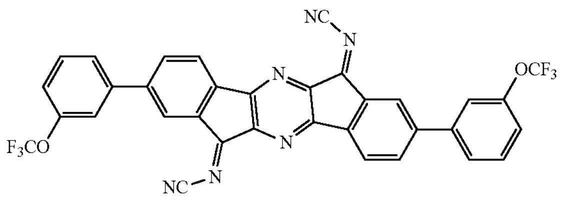
-continued
(A-41)
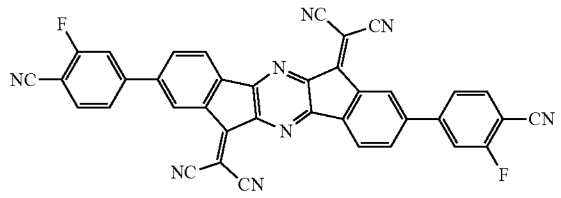
(A-42)
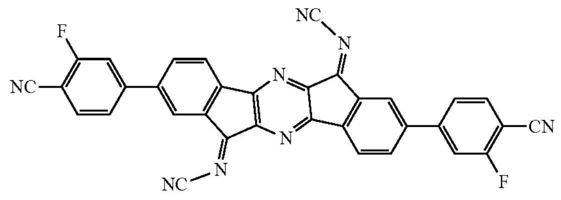
[Formula 36]
(A-43)
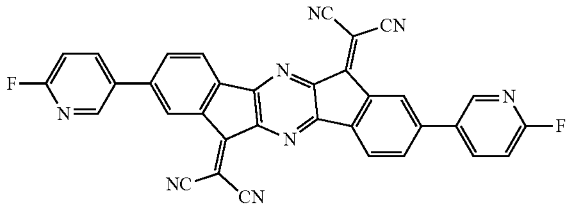
(A-44)
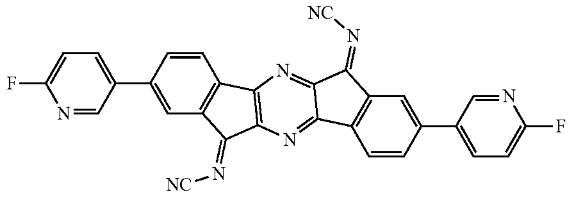
(A-45)
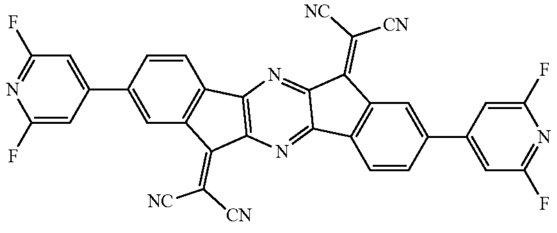
(A-46)
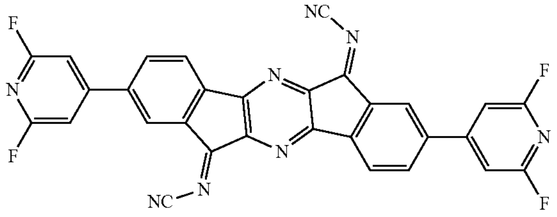

-continued
[Formula 37]
(A-47)
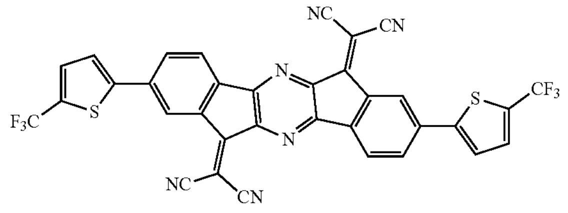
(A-48)
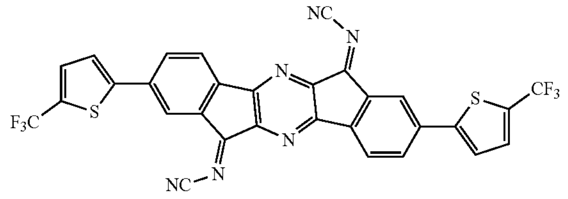
(A-49)
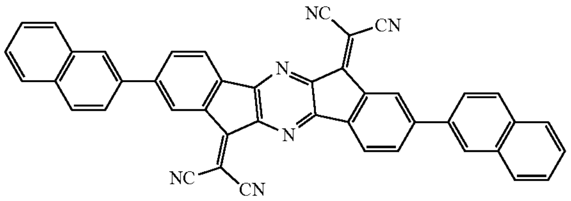
(A-50)
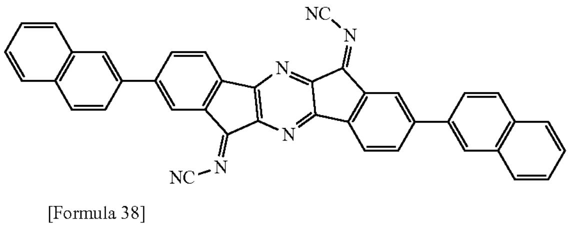
[Formula 38]
(A-51)
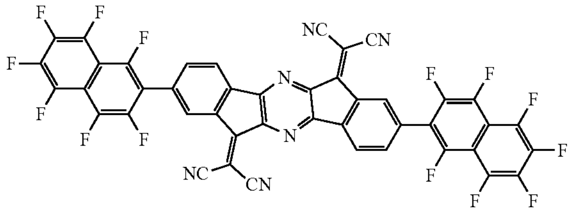
(A-52)
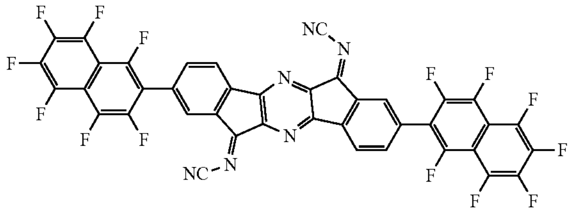
-continued
(A-53)
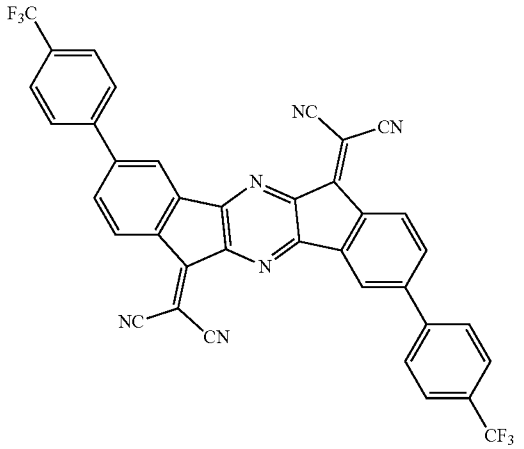
(A-54)
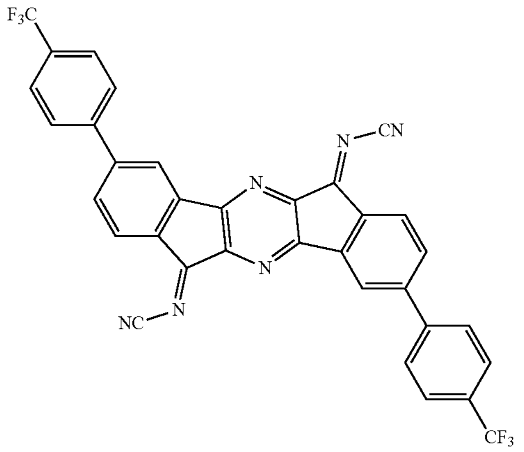
[Formula 39]
(A-55)
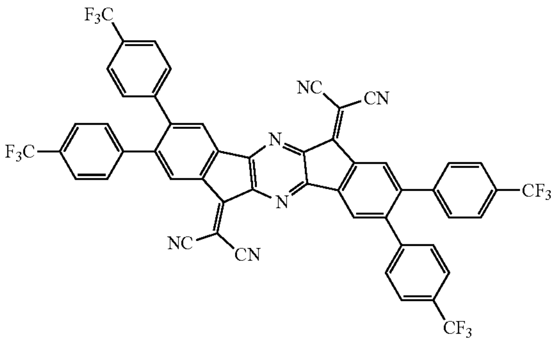

-continued
(A-56)
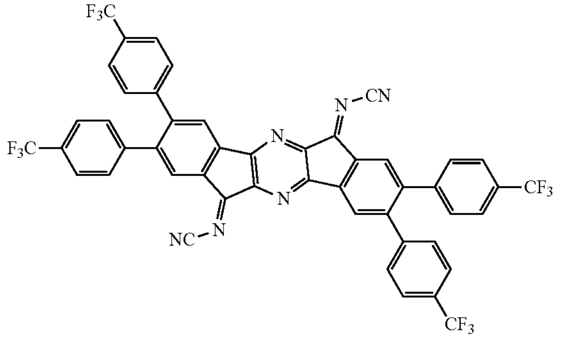
(A-57)
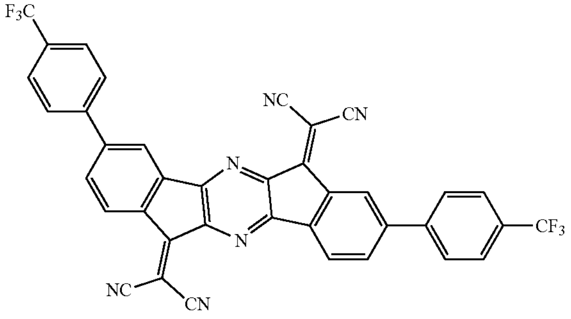
(A-58)
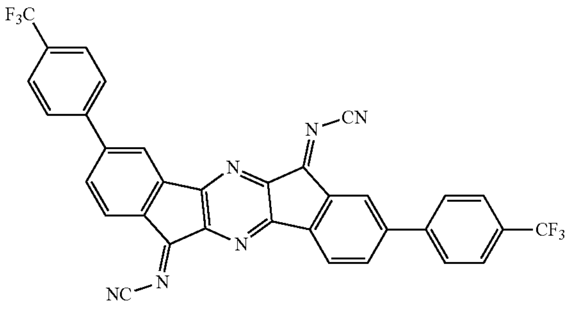
(A-59)
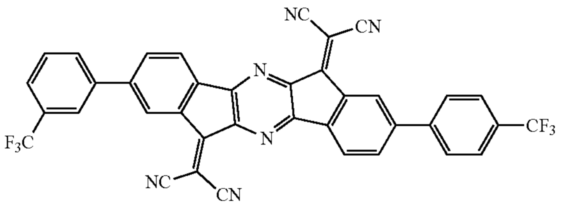
(A-60)
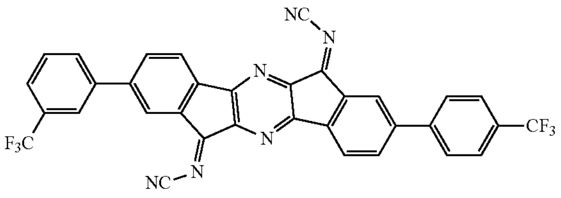
-continued
[Formula 40]
(A-61)
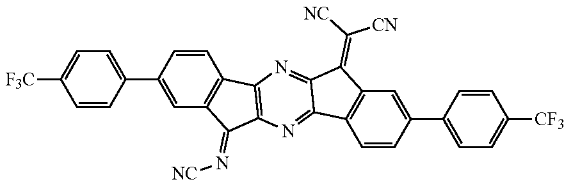
[Formula 41]
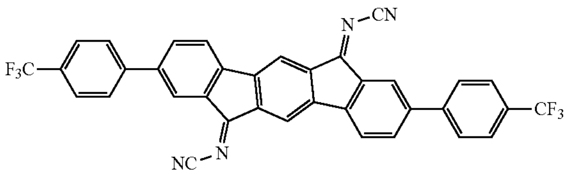
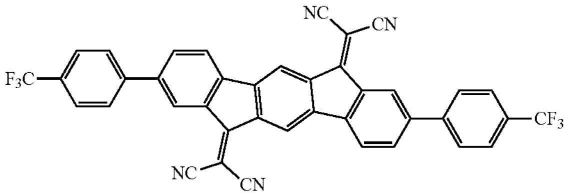
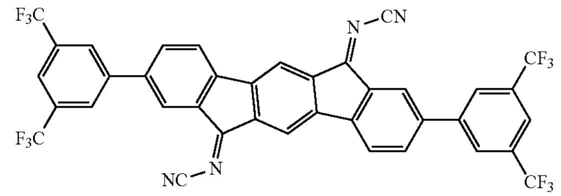
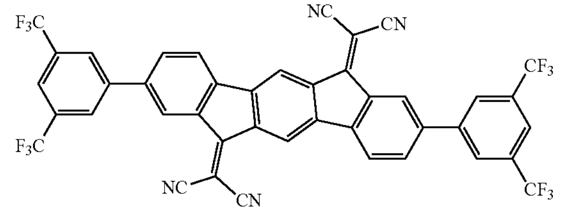
[Formula 42]
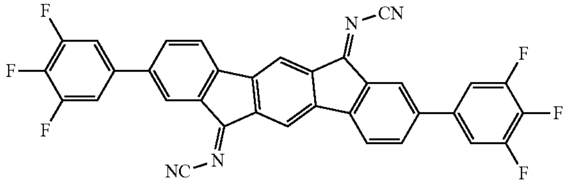
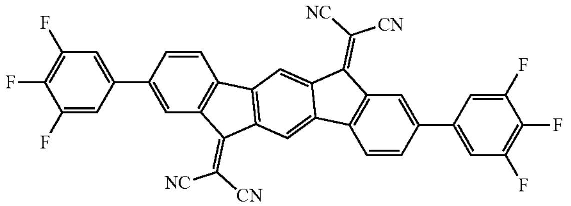
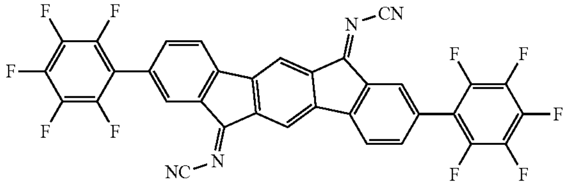

-continued
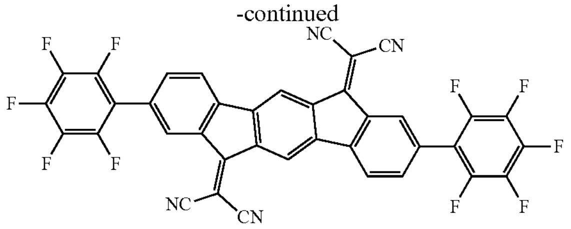
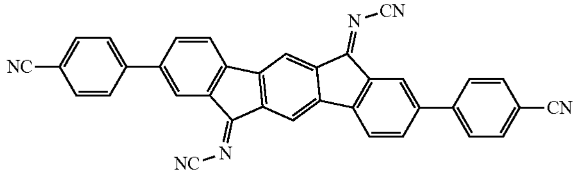
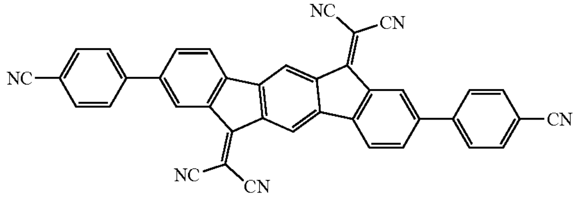
[Formula 43]
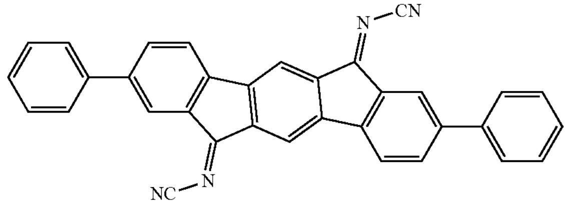
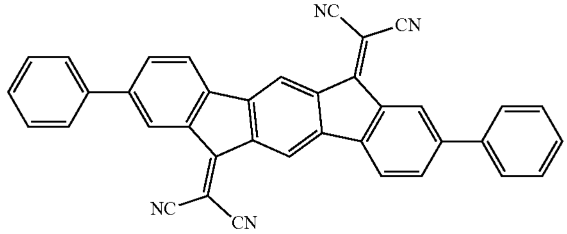
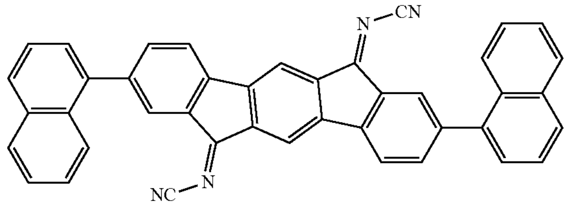
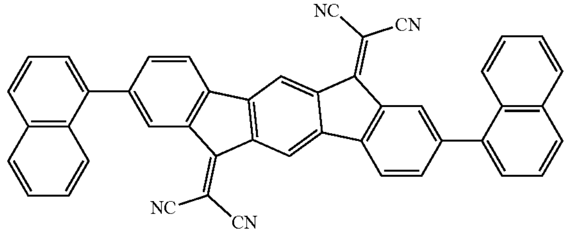
-continued
[Formula 44]
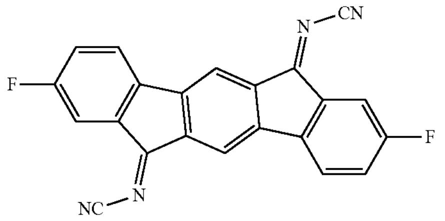
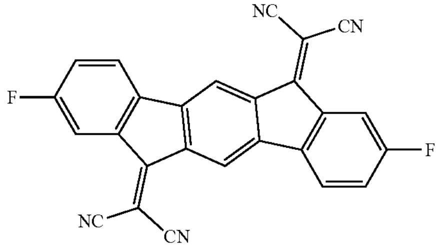
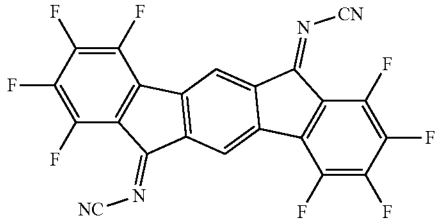
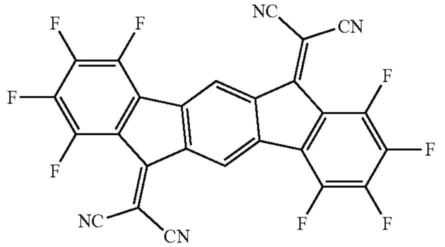
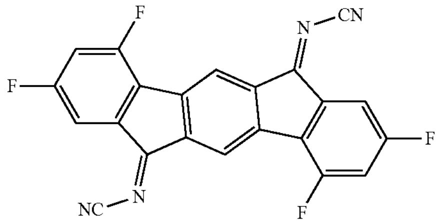
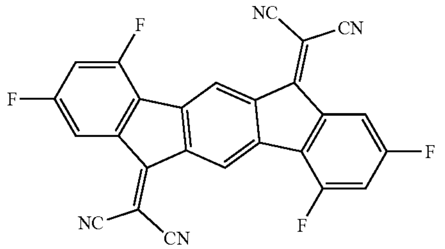
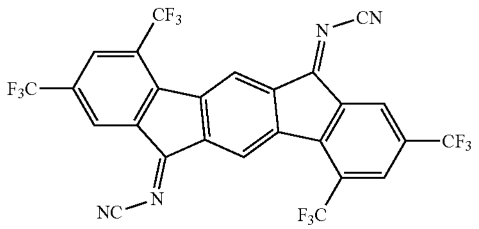

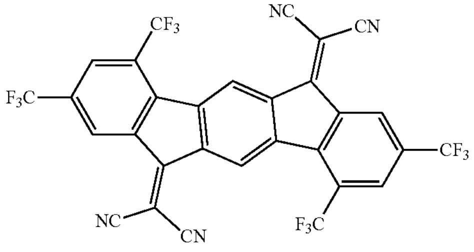
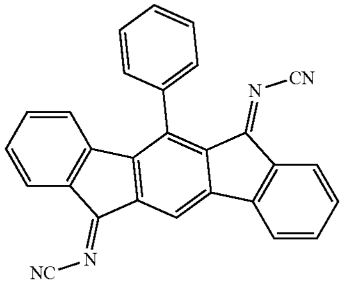
[Formula 45]
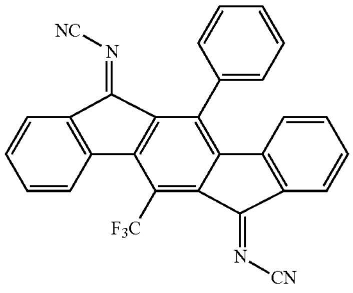
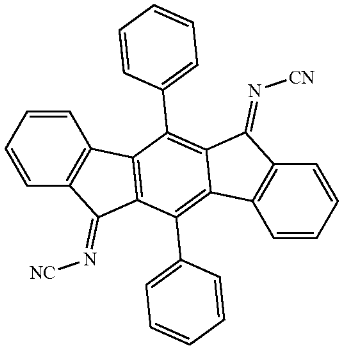
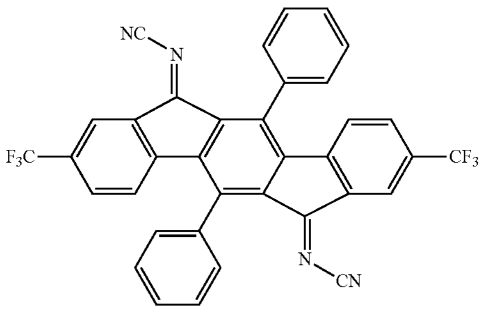
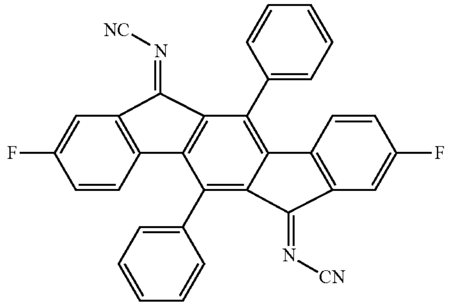
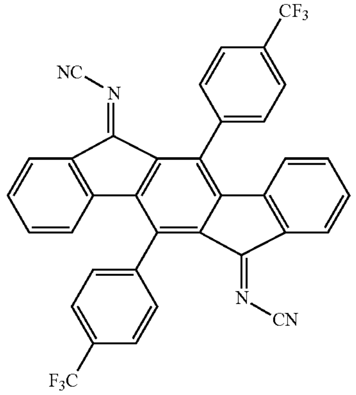
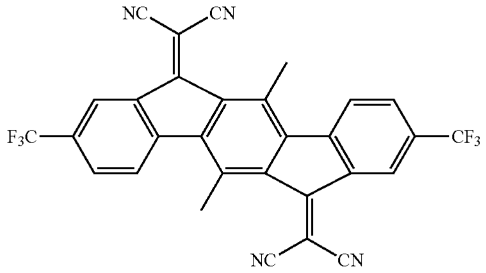
[Formula 46]
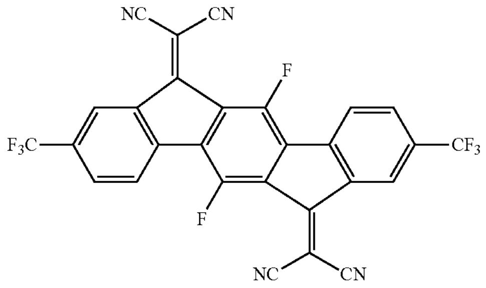
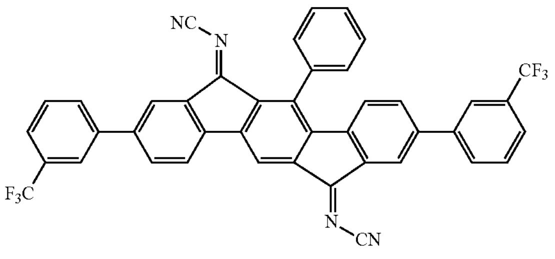

-continued
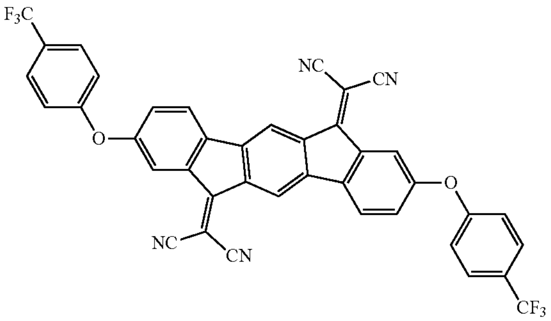
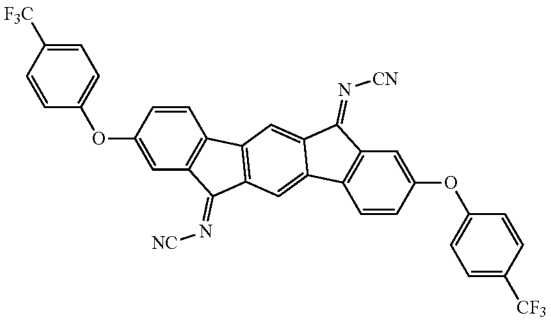
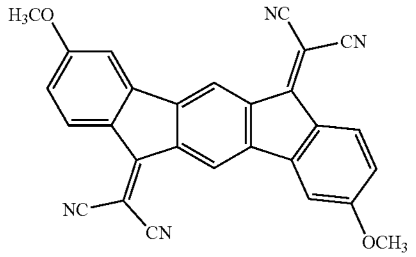
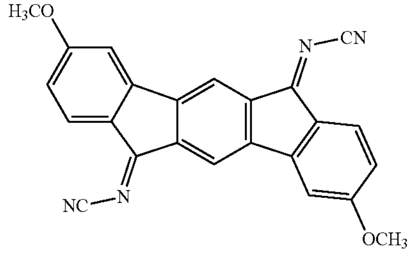
[Formula 47]
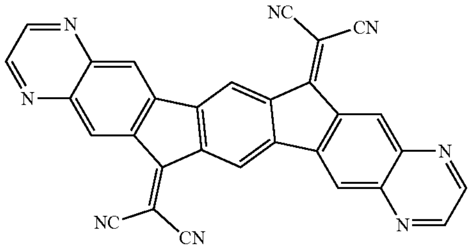
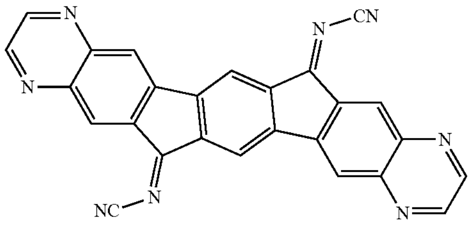
-continued
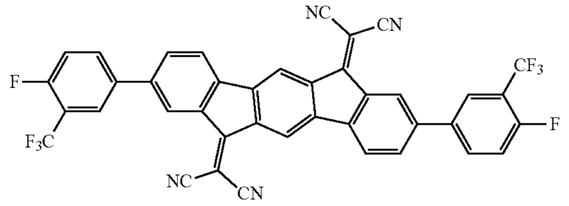
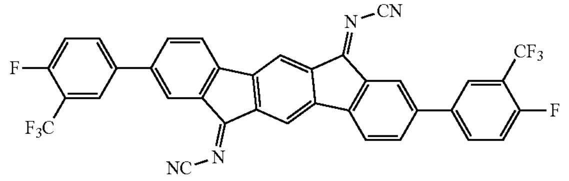
[Formula 48]
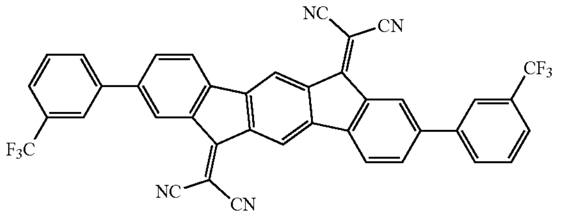
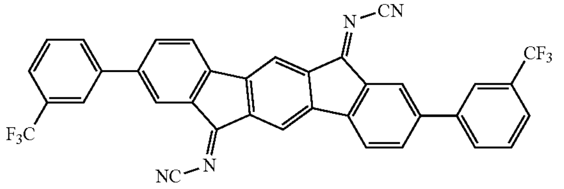
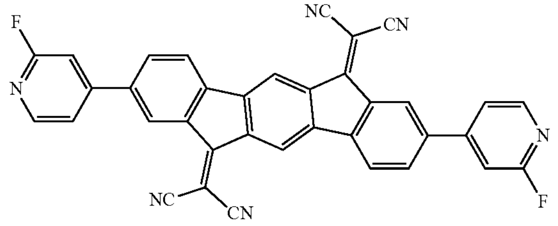
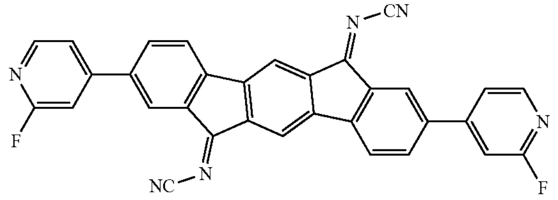
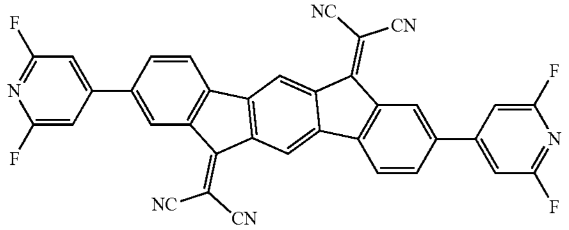
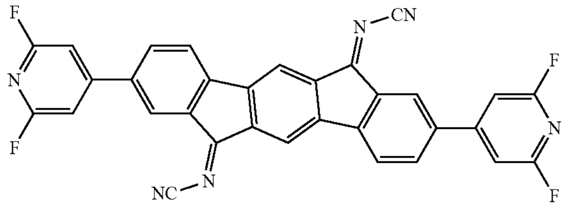

-continued
[Formula 49]
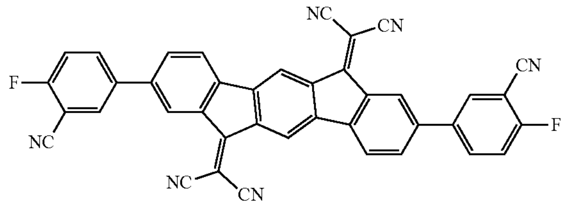
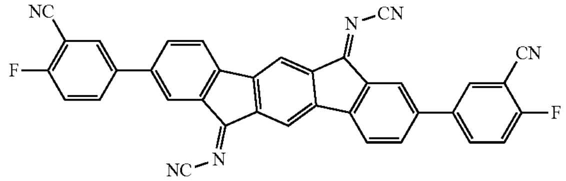
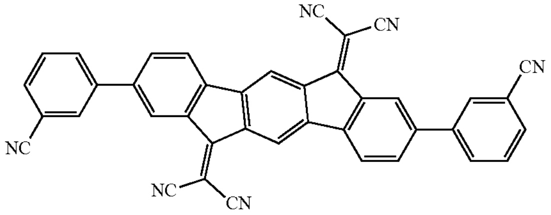
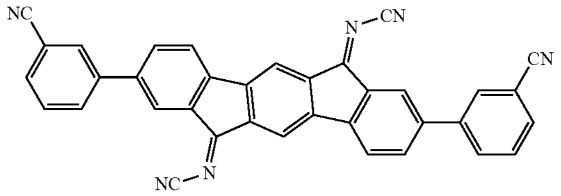
[Formula 50]
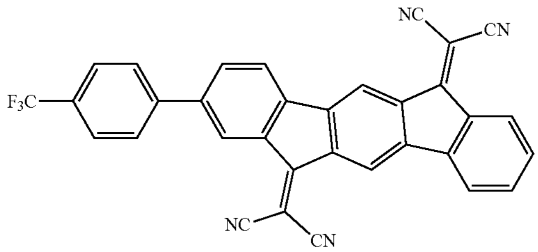
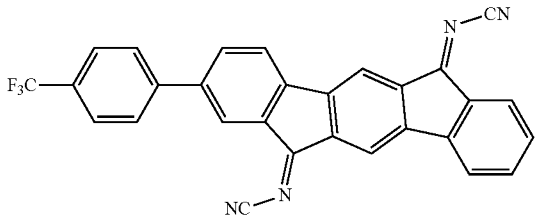
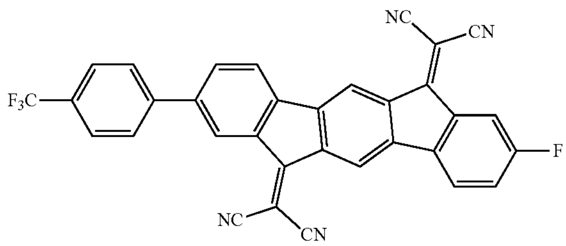
-continued
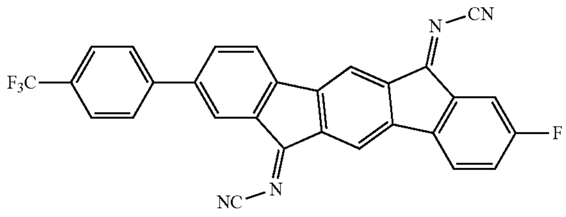
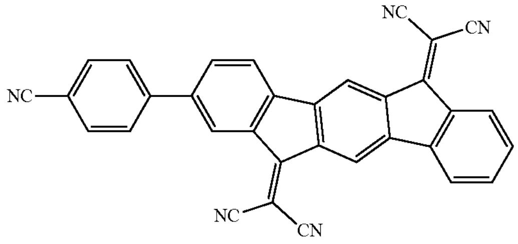
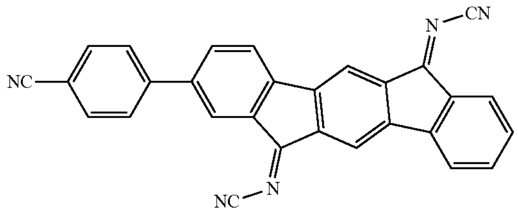
[Formula 51]
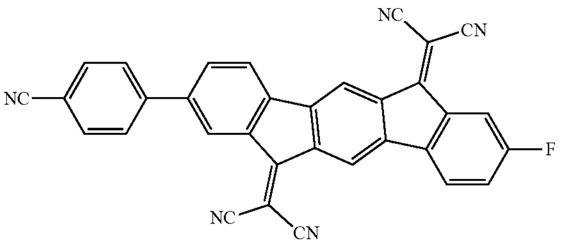
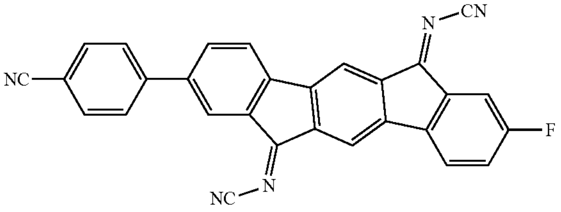
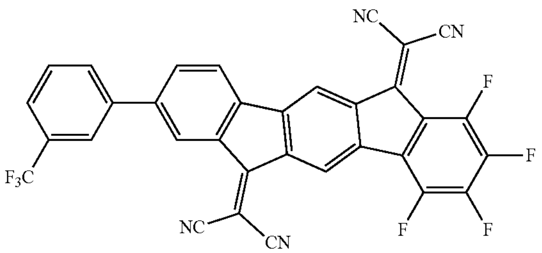
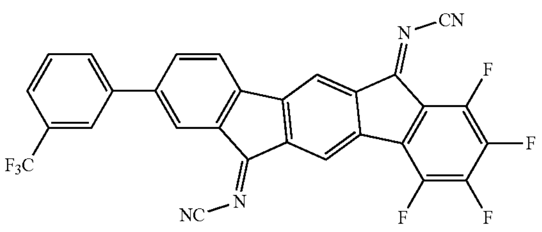

-continued
[Formula 52]
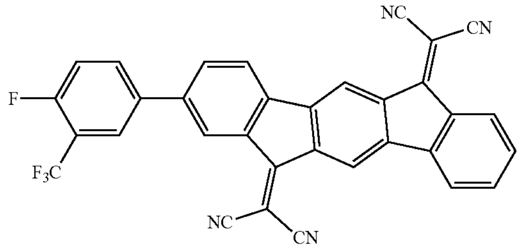
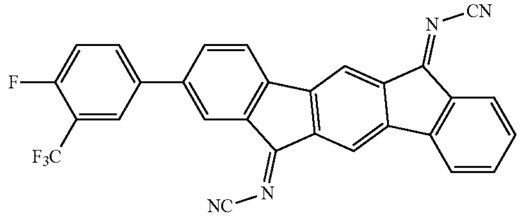
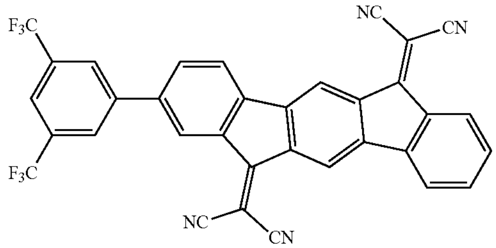
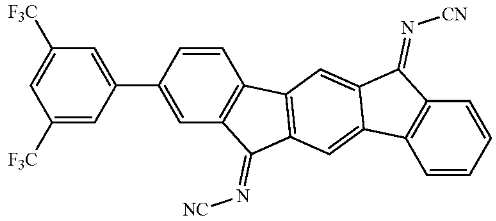
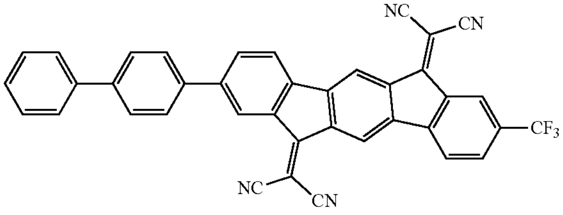
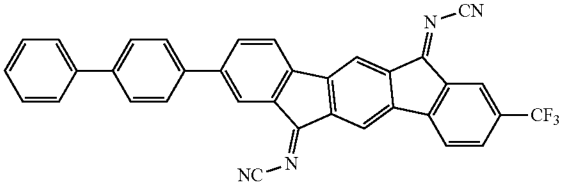
[Formula 53]
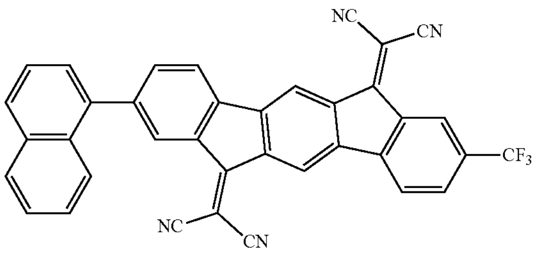
-continued
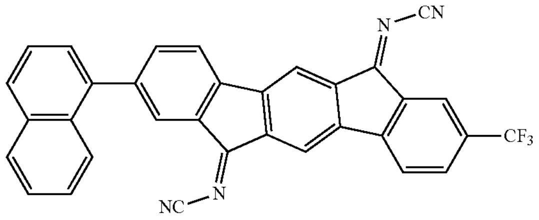
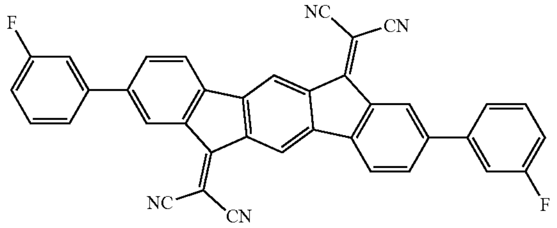
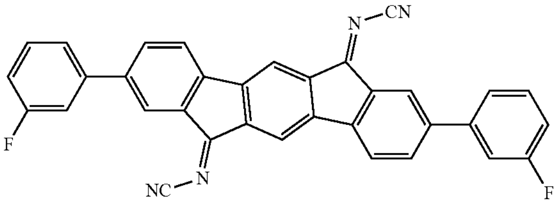
[Formula 54]
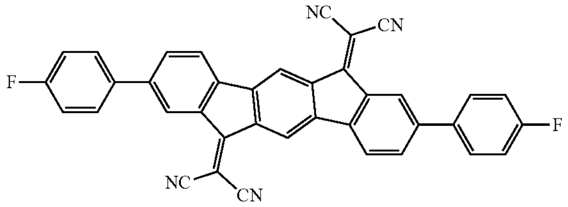
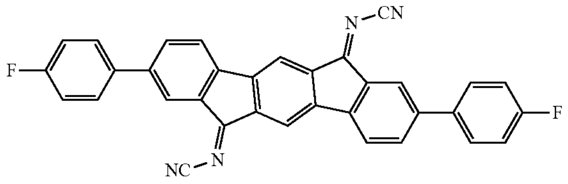
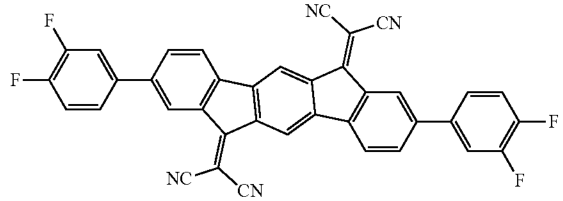
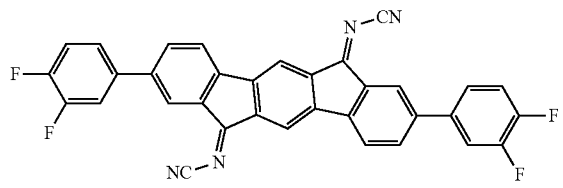
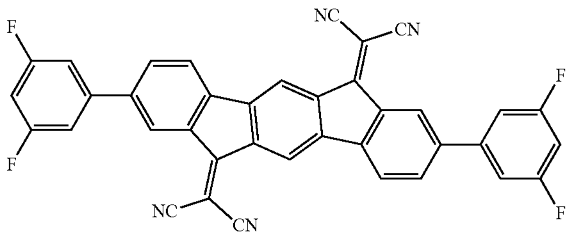

-continued
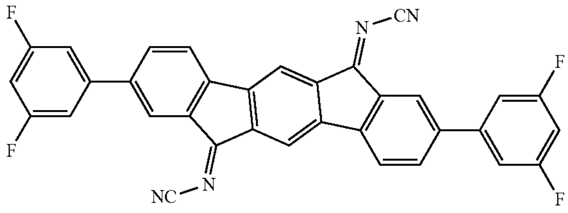
[Formula 55]
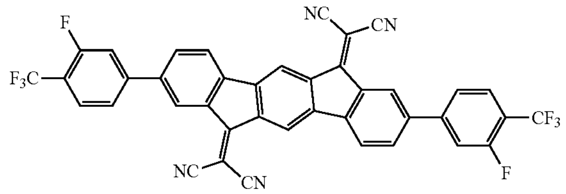
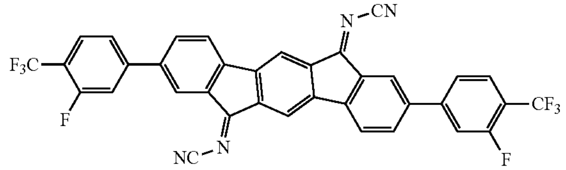
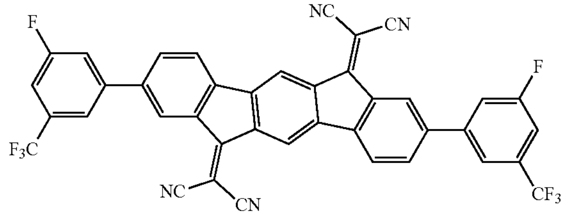
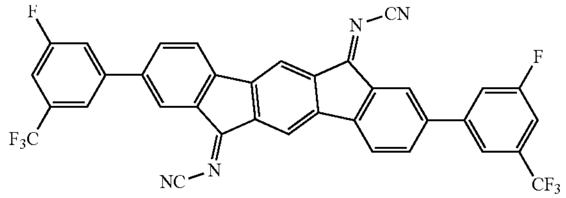
[Formula 56]
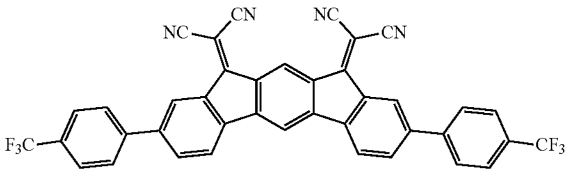
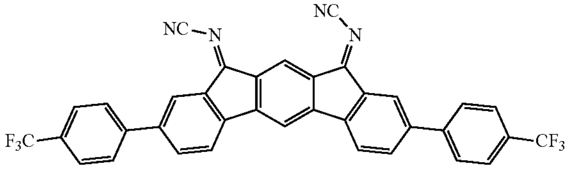
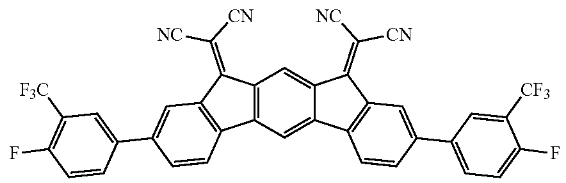
-continued
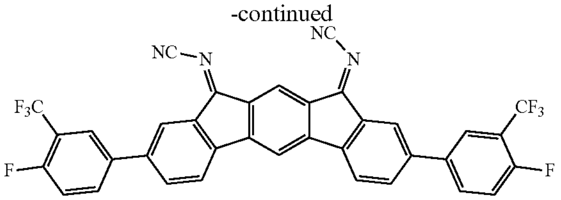
[Formula 57]
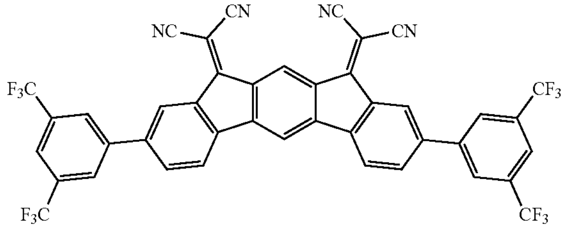
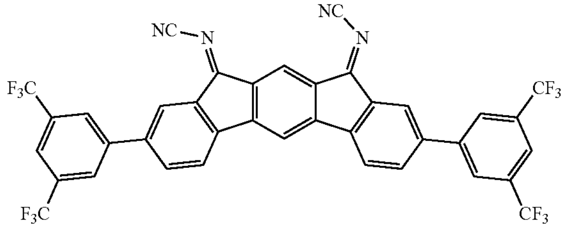
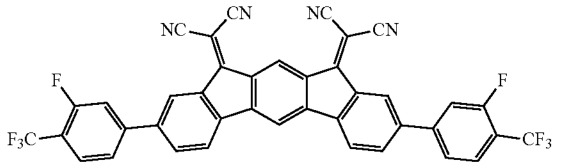
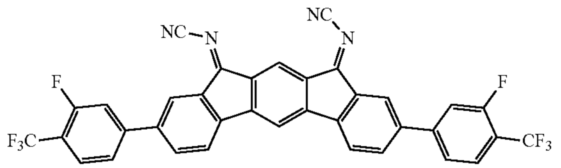
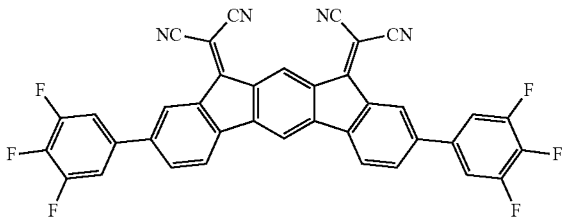
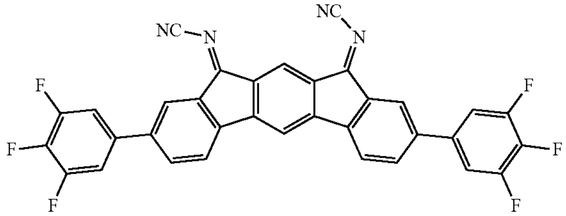

[Formula 58]
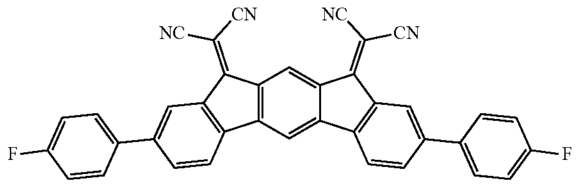
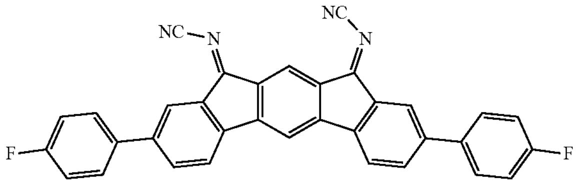
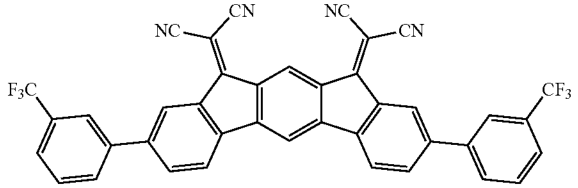
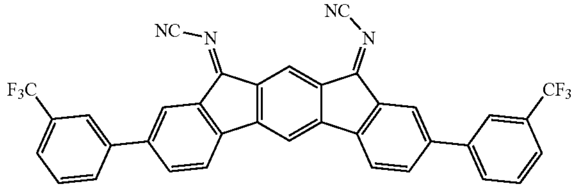
[Formula 59]
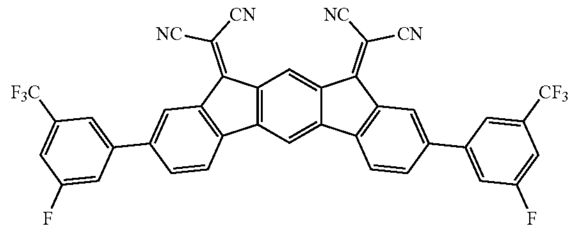
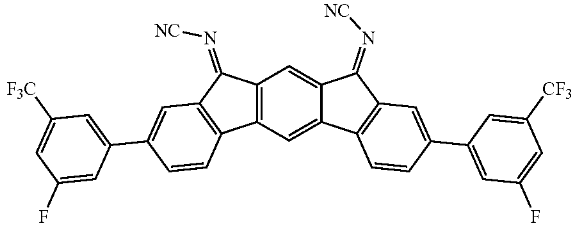
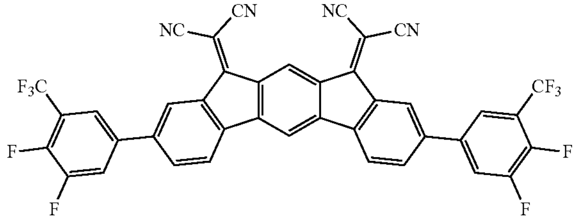
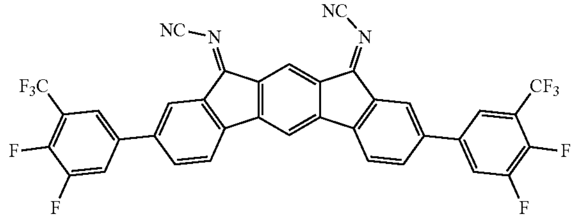
-continued
[Formula 60]
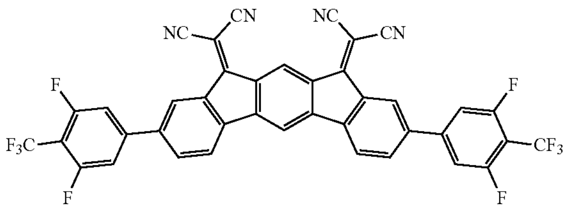
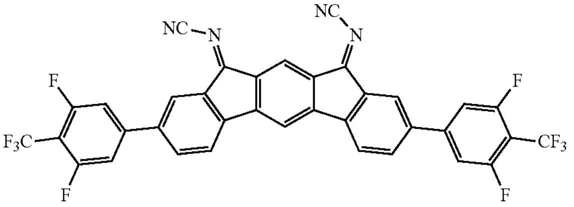
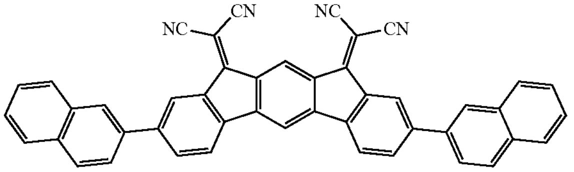
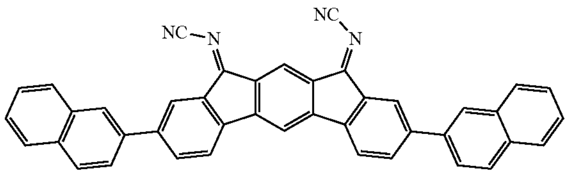
[Formula 61]
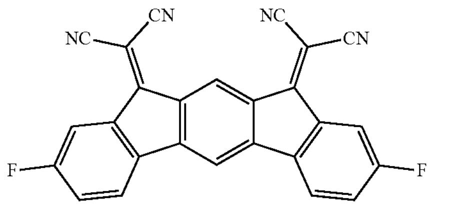
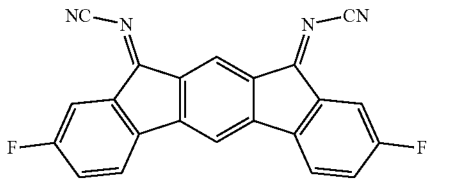
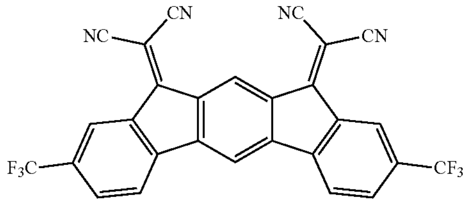
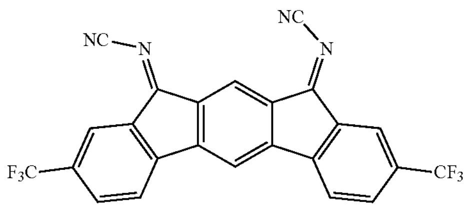

-continued
[Formula 62]
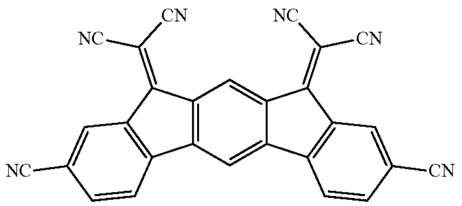
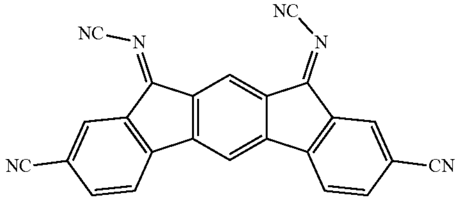
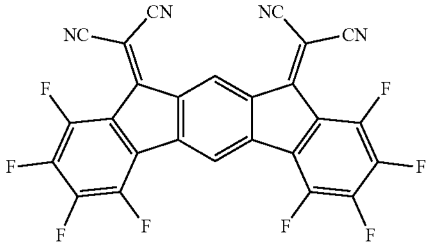
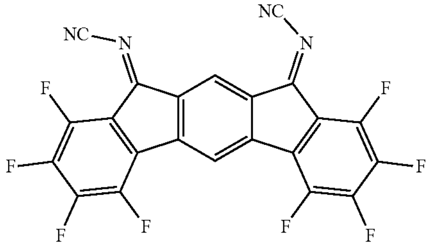
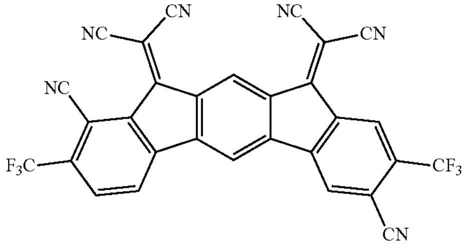
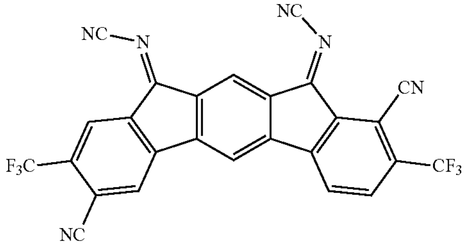
[Formula 63]
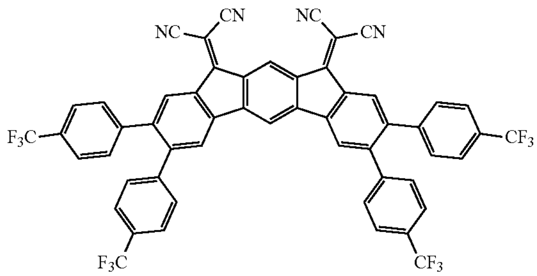
-continued
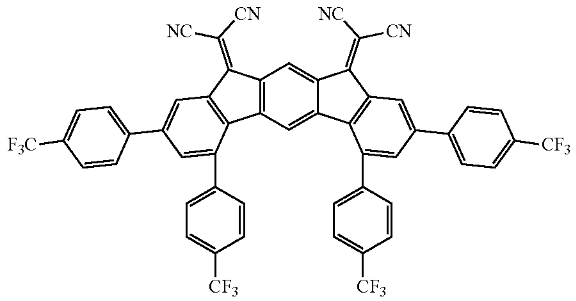
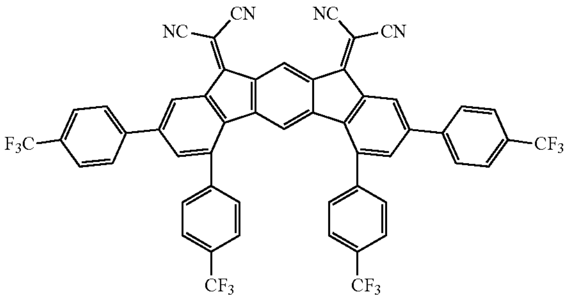
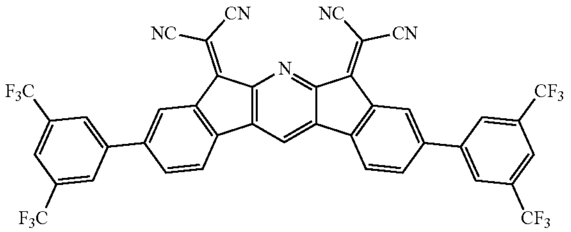
[Formula 64]
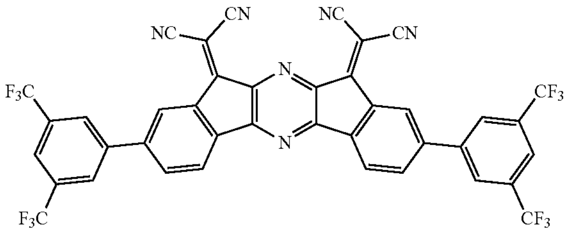
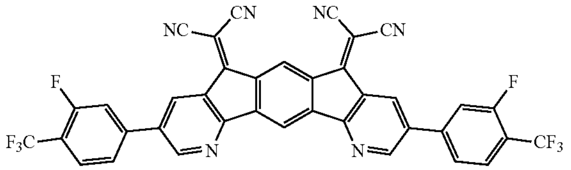
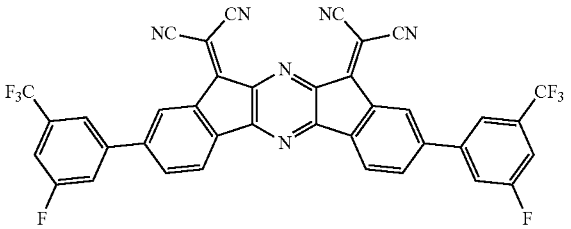

-continued
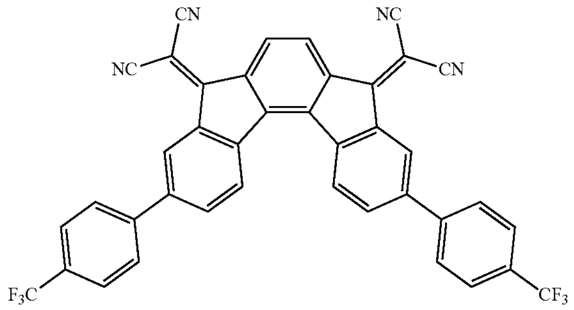
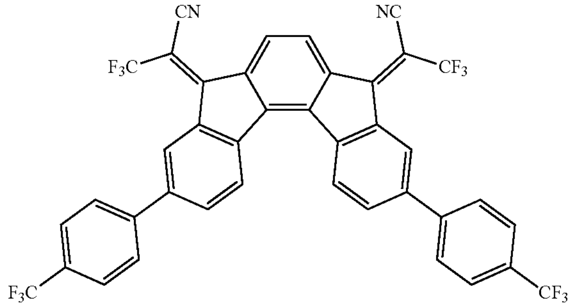
[Formula 65]
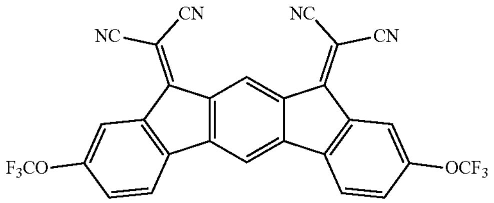
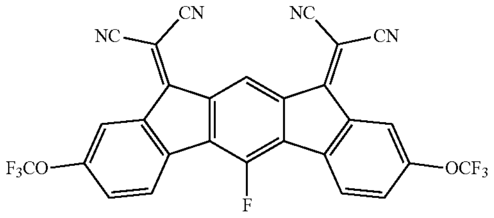
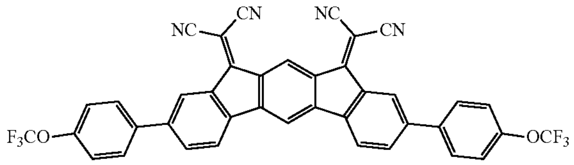
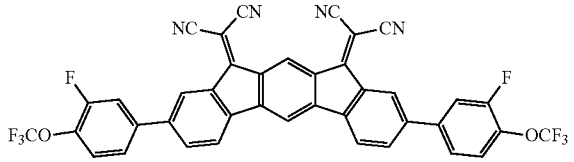
[Formula 66]
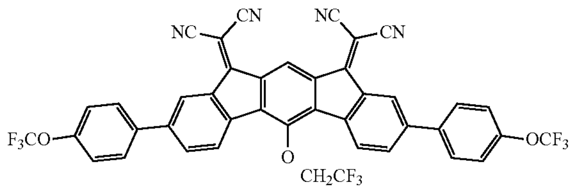
-continued
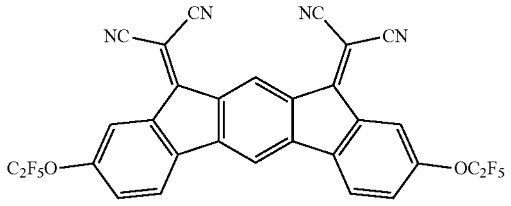
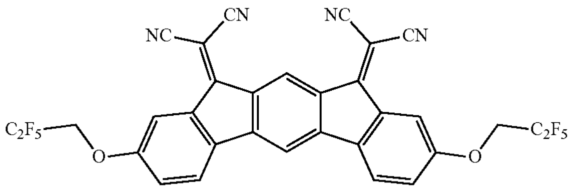
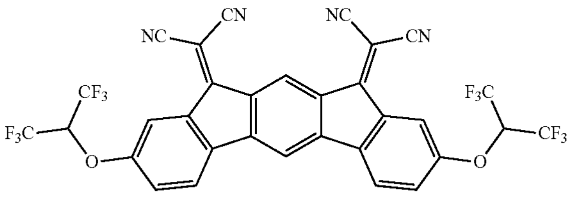
[Formula 67]
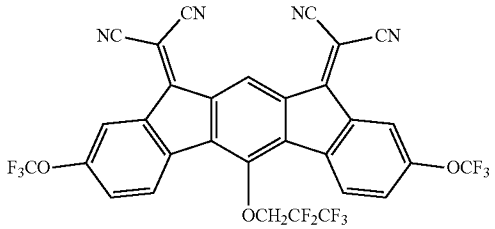
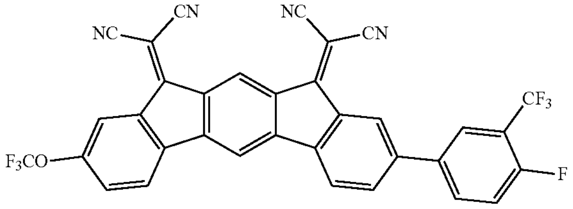
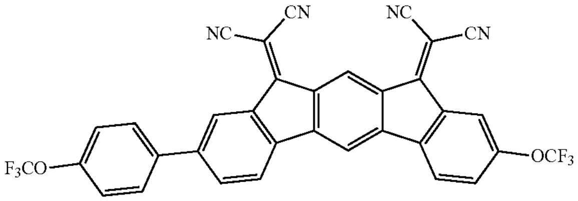
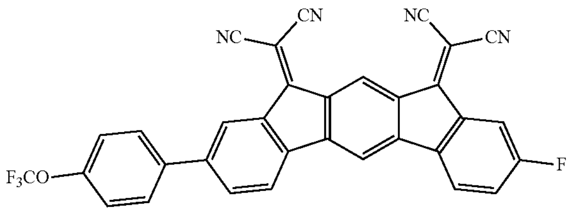

-continued
[Formula 68]
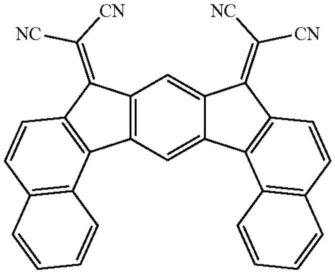
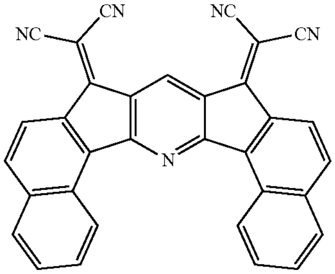
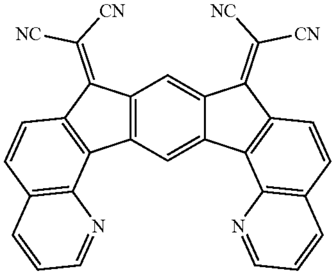
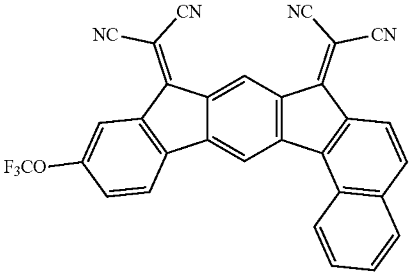
[Formula 69]
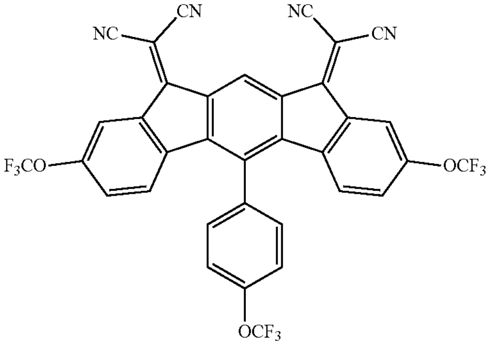
-continued
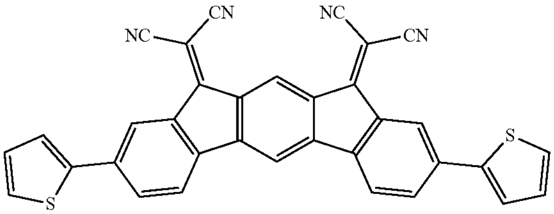
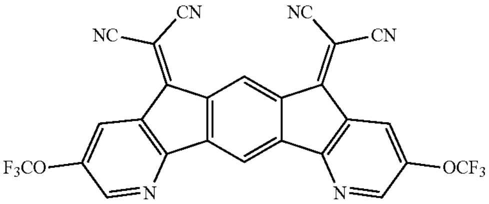
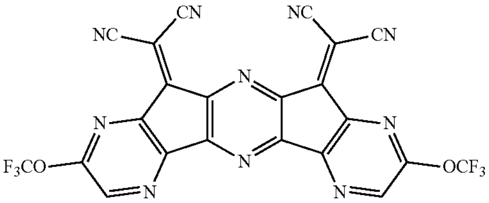
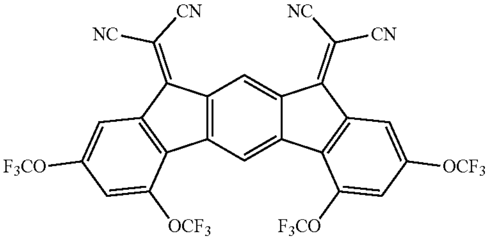
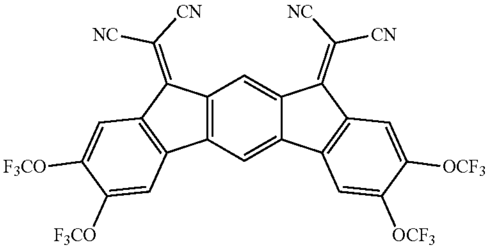
[Formula 70]
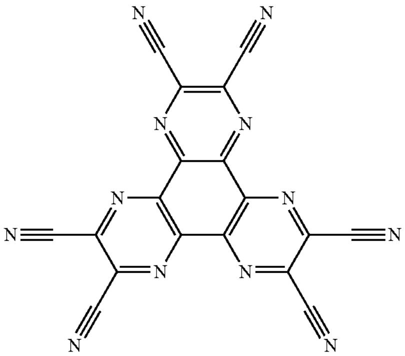

-continued

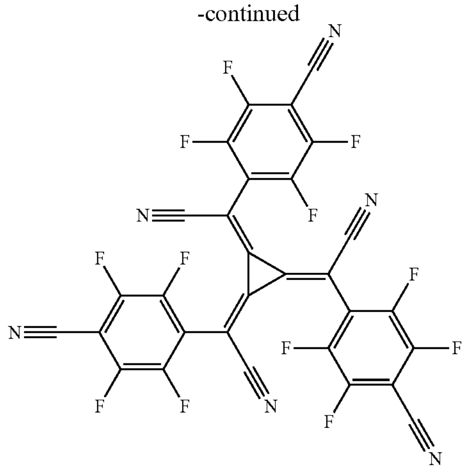

In the organic EL device according to the exemplary embodiment, the hole transporting zone material is preferably a monoamine compound having one substituted or unsubstituted amino group in a molecule, a diamine compound having two substituted or unsubstituted amino groups in a molecule, or a triamine compound having three substituted or unsubstituted amino groups in a molecule, more preferably, a monoamine compound having one substituted or unsubstituted amino group in a molecule, or a diamine compound having two substituted or unsubstituted amino groups in a molecule.

In the organic EL device according to the exemplary embodiment, the hole transporting zone material is preferably a compound represented by the formula (21) or (22) below.

Compound Represented by Formula (21) or (22)

[Formula 71]

(21)

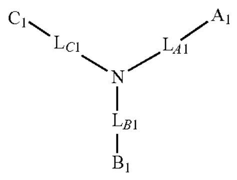

(22)

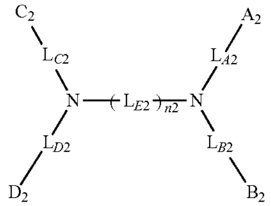

In the formulae (21) and (22):

$L_{A1}$, $L_{B1}$, $L_{C1}$, $L_{A2}$, $L_{B2}$, $L_{C2}$, and $L_{D2}$ are each independently a single bond, a substituted or unsubstituted arylene group having 6 to 50 ring carbon atoms, or a substituted or unsubstituted divalent heterocyclic group having 5 to 50 ring atoms;

when $L_{A1}$ and $L_{B1}$ are each a single bond, $A_1$ and $B_1$ are mutually bonded to form a substituted or unsubstituted monocyclic ring, mutually bonded to form a substituted or unsubstituted fused ring, or not mutually bonded;

when $L_{A1}$ and $L_{C1}$ are each a single bond, $A_1$ and $C_1$ are mutually bonded to form a substituted or unsubstituted monocyclic ring, mutually bonded to form a substituted or unsubstituted fused ring, or not mutually bonded;

when $L_{B1}$ and $L_{C1}$ are each a single bond, $B_1$ and $C_1$ are mutually bonded to form a substituted or unsubstituted monocyclic ring, mutually bonded to form a substituted or unsubstituted fused ring, or not mutually bonded;

n2 is 1, 2, 3, or 4;

when n2 is 1, $L_{E2}$ is a substituted or unsubstituted arylene group having 6 to 50 ring carbon atoms, or a substituted or unsubstituted divalent heterocyclic group having 5 to 50 ring atoms;

when n2 is 2, 3, or 4, a plurality of $L_{E2}$ are mutually the same or different;

when n2 is 2, 3, or 4, a plurality of $L_{E2}$ are mutually bonded to form a substituted or unsubstituted monocyclic ring, mutually bonded to form a substituted or unsubstituted fused ring, or not mutually bonded;

$L_{E2}$ forming neither the monocyclic ring nor the fused ring is a substituted or unsubstituted arylene group having 6 to 50 ring carbon atoms, or a substituted or unsubstituted divalent heterocyclic group having 5 to 50 ring atoms;

$A_1$, $B_1$, $C_1$, $A_2$, $B_2$, $C_2$, and $D_2$ are each independently a substituted or unsubstituted aryl group having 6 to 50 ring carbon atoms, a substituted or unsubstituted heterocyclic group having 5 to 50 ring atoms, a group represented by $-Si(R_{921})(R_{922})(R_{923})$, or a group represented by $-N(R_{906})(R_{907})$;

$R_{921}$, $R_{922}$, and $R_{923}$ are each independently a substituted or unsubstituted aryl group having 6 to 50 ring carbon atoms;

$R_{906}$ and $R_{907}$ are each independently a substituted or unsubstituted aryl group having 6 to 50 ring carbon atoms, a substituted or unsubstituted heterocyclic group having 5 to 50 ring atoms, or a substituted or unsubstituted alkyl group having 1 to 30 carbon atoms;

when a plurality of $R_{921}$ are present, the plurality of $R_{921}$ are mutually the same or different;

when a plurality of $R_{922}$ are present, the plurality of $R_{922}$ are mutually the same or different;

when a plurality of $R_{923}$ are present, the plurality of $R_{923}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the formula (21):

when $L_{A1}$ and $L_{B1}$ are each a single bond, $A_1$ and $B_1$ may be mutually bonded to form a substituted or unsubstituted monocyclic ring, mutually bonded to form a substituted or unsubstituted fused ring, or not bonded;

when $L_{A1}$ and $L_{C1}$ are each a single bond, $A_1$ and $B_1$ may be mutually bonded to form a substituted or unsubstituted monocyclic ring, mutually bonded to form a substituted or unsubstituted fused ring, or not bonded; and when $L_{B1}$ and $L_{C1}$ are each a single bond, $A_1$ and $B_1$ may be mutually bonded to form a substituted or unsubstituted monocyclic ring, mutually bonded to form a substituted or unsubstituted fused ring, or not bonded.

In the formula (22):

when $L_{A2}$ and $L_{B2}$ are each a single bond, $A_2$ and $B_2$ may be mutually bonded to form a substituted or unsubstituted monocyclic ring, mutually bonded to form a substituted or unsubstituted fused ring, or not bonded; and when $L_{C2}$ and $L_{D2}$ are each a single bond, C2 and D2 may be mutually bonded to form a substituted or unsubstituted monocyclic ring, mutually bonded to form a substituted or unsubstituted fused ring, or not bonded.

A compound represented by the formula (21) is also preferably a compound represented by a formula (212) below.

[Formula 72]

(212)

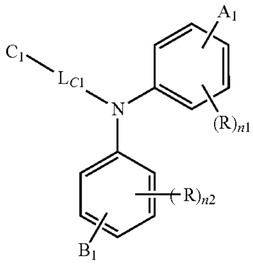

In the formula (212):

$L_{C1}$, $A_1$, $B_1$, and $C_1$ are as defined in the formula (21);

n1 and n2 are each independently 0, 1, 2, 3 or 4;

when a plurality of R are present, the plurality of R are mutually the same or different;

when a plurality of R are present, at least one combination of adjacent two or more of the plurality of R are mutually bonded to form a substituted or unsubstituted monocyclic ring, mutually bonded to form a substituted or unsubstituted fused ring, or not mutually bonded; and R forming neither the substituted or unsubstituted monocyclic ring nor the substituted or unsubstituted fused ring is a cyano group, a substituted or unsubstituted alkyl group having 1 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a substituted or unsubstituted aryl group having 6 to 50 ring carbon atoms, or a substituted or unsubstituted heterocyclic group having 5 to 50 ring atoms.

In a compound represented by the formula (21), at least one of $A_1$, $B_1$, or $C_1$ is preferably a group selected from the group consisting of groups represented by formulae (21a), (21b), (21c), (21d), and (21e) below.

[Formula 73]

(21a)

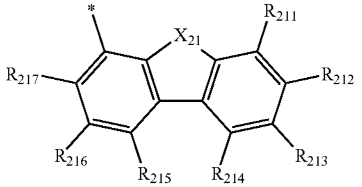

-continued (21b)

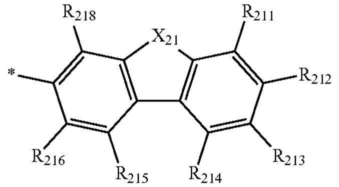

(21c)

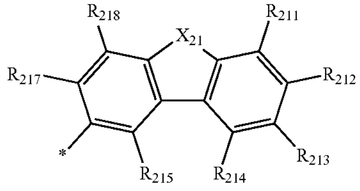

(21d)

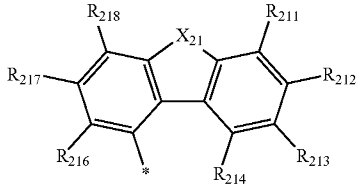

(21e)

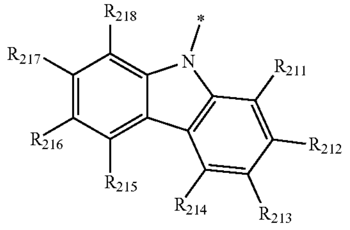

In the formulae (21a), (21b), (21c), (21d), and (21e):

$X_{21}$ is $NR_{21}$, $CR_{22}R_{23}$, an oxygen atom, or a sulfur atom;

when a plurality of $X_{21}$ are present, the plurality of $X_{21}$ are mutually the same or different;

when $X_{21}$ is $CR_{22}R_{23}$, a combination of $R_{22}$ and $R_{23}$ are mutually bonded to form a substituted or unsubstituted monocyclic ring, mutually bonded to form a substituted or unsubstituted fused ring, or not mutually bonded;

$R_{21}$, and $R_{22}$ and $R_{23}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a substituted or unsubstituted aryl group having 6 to 50 ring carbon atoms, or a substituted or unsubstituted heterocyclic group having 5 to 50 ring atoms;

at least one combination of adjacent two or more of $R_{211}$ to $R_{218}$ are mutually bonded to form a substituted or unsubstituted monocyclic ring, mutually bonded to form a substituted or unsubstituted fused ring, or not mutually bonded;

$R_{211}$ to $R_{218}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms; and each * in the formulae (21a), (21b), (21c), (21d), and (21e) is independently a bonding position to $L_{A1}$, $L_{B1}$, or $L_{C1}$.

$A_1$, $B_1$, and $C_1$ not being a group selected from the group consisting of groups represented by the formulae (21a), (21b), (21c), (21d), and (21e) are each independently preferably a substituted or unsubstituted aryl group having 6 to 30 ring carbon atoms.

The compound represented by the formula (22) is also preferably a compound represented by a formula (A221) below.

[Formula 74]

(A221)

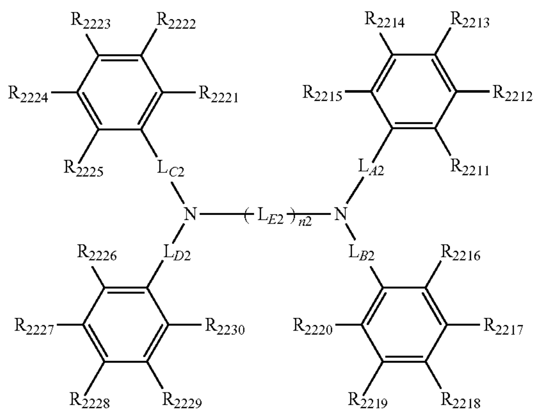

In the formula (A221):

$L_{A2}$, $L_{B2}$, $L_{C2}$, $L_{D2}$, and $L_{E2}$ are each independently a single bond, a substituted or unsubstituted arylene group having 6 to 50 ring carbon atoms, or a substituted or unsubstituted divalent heterocyclic group having 5 to 50 ring atoms;

n2 is 1, 2, 3, or 4;

when n2 is 2, 3, or 4, a plurality of $L_{E2}$ are mutually the same or different;

at least one combination of adjacent two or more of $R_{2211}$ to $R_{2230}$ are mutually bonded to form a substituted or unsubstituted monocyclic ring, mutually bonded to form a substituted or unsubstituted fused ring, or not mutually bonded; and $R_{2211}$ to $R_{2230}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms.

In the hole transporting zone material of the organic EL device according to the exemplary embodiment, $R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the hole transporting zone material of the exemplary embodiment, all groups specified as "substituted or unsubstituted" groups are preferably "unsubstituted" groups.

In the organic EL device according to the exemplary embodiment, the hole transporting zone material may be a compound that contains a substituted or unsubstituted 3-carbazolyl group in a molecule. In the organic EL device according to the exemplary embodiment, the hole transporting zone material may be a compound that does not contain a substituted or unsubstituted 3-carbazolyl group in a molecule.

In the organic EL device according to the exemplary embodiment, in a case where the hole transporting zone includes the hole transporting layer, the compound represented by the formula (21) or (22) is usable for the hole transporting layer. For instance, an aromatic amine derivative, carbazole derivative, and anthracene derivative are also usable for the hole transporting layer. Specifically, an aromatic amine derivative such as 4-phenyl-4'-(9-phenylfluorene-9-yl)triphenylamine (abbreviation: BAFLP) is usable.

A highly hole-transportable substance used for the hole transporting layer is, for instance, a substance having a hole mobility of $10^{-6}$ $cm^2/(V \cdot s)$ or more. However, in addition to the above substances, any substance exhibiting a higher hole transportability than an electron transportability may be used as the substance for the hole transporting layer.

It should be noted that the layer including the highly hole-transportable substance may be not only a single layer but also a laminate of two or more layers formed of the above substance.

For instance, a blocking layer may be provided adjacent to at least one of a side of the emitting region close to the anode or a side of the emitting region close to the cathode. The blocking layer is preferably provided in contact with the emitting region to block at least any of holes, electrons, or excitons.

For instance, when the blocking layer is provided in contact with the side of the emitting region close to the cathode, the blocking layer permits transport of electrons, and blocks holes from reaching a layer provided closer to the cathode (e.g., the electron transporting layer) beyond the blocking layer. When the organic EL device includes the electron transporting layer, the blocking layer is preferably interposed between the emitting region and the electron transporting layer.

Method of Producing Hole Transporting Zone Material

The hole transporting zone material is producible by a known method. The hole transporting zone material is also producible based on a known method through a known alternative reaction using a known material(s) tailored for the target compound.

Specific Examples of Hole Transporting Zone Material

Specific examples of the hole transporting zone material include the following compounds. However, the invention is by no means limited to the specific examples of the hole transporting zone material.

[Formula 75]

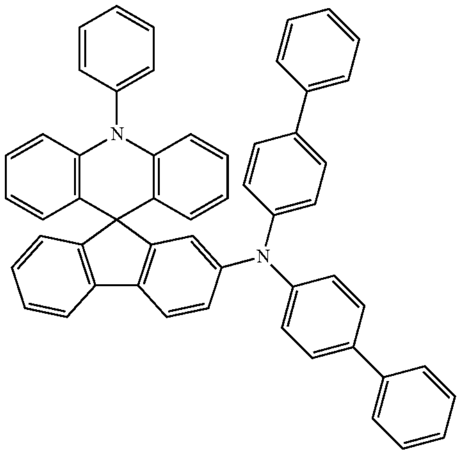

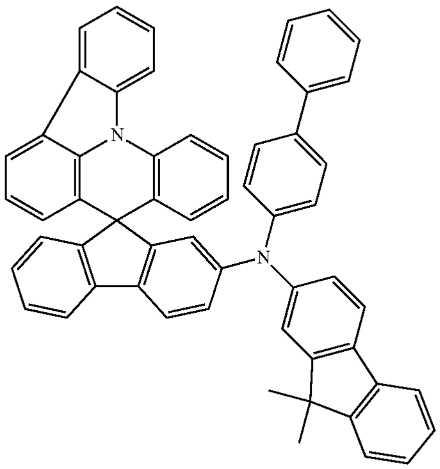

-continued

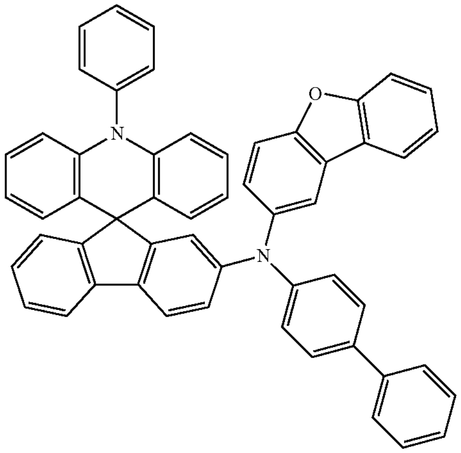

[Formula 76]

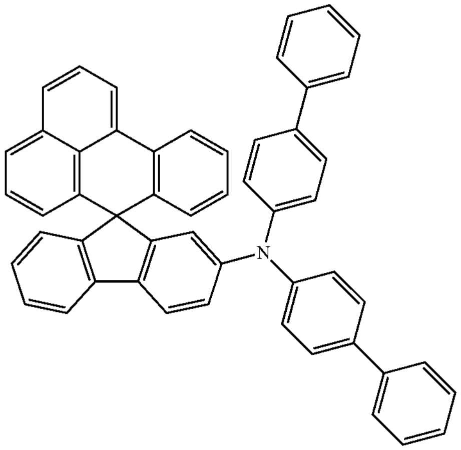

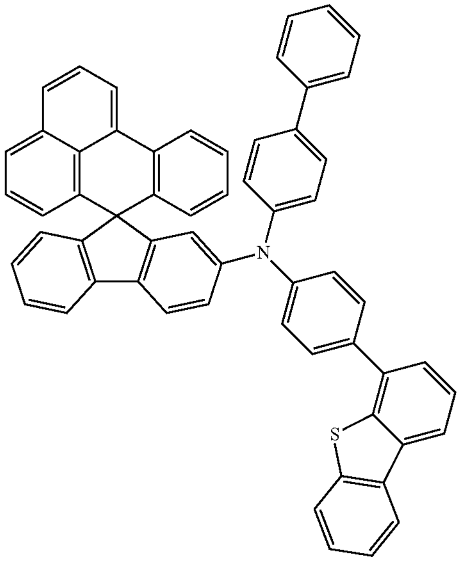

-continued
[Formula 77]
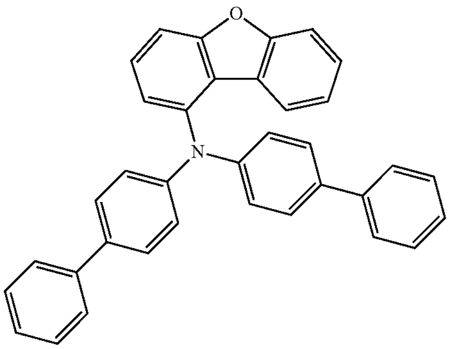
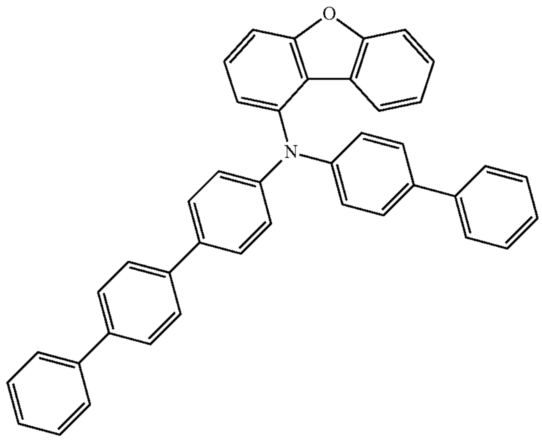
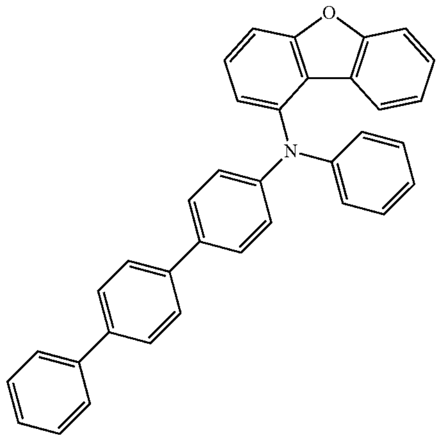
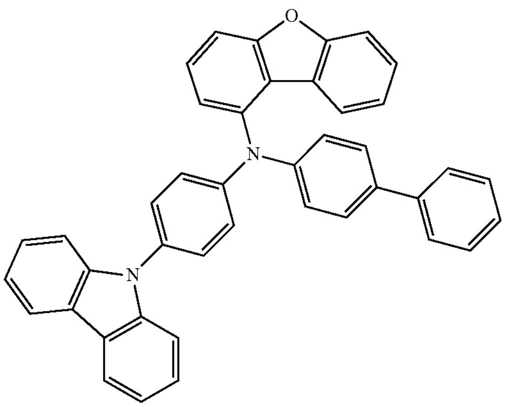
-continued
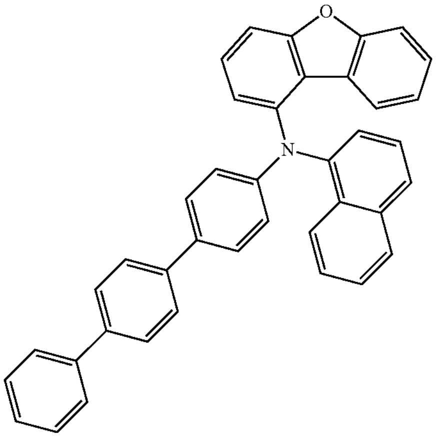
[Formula 78]
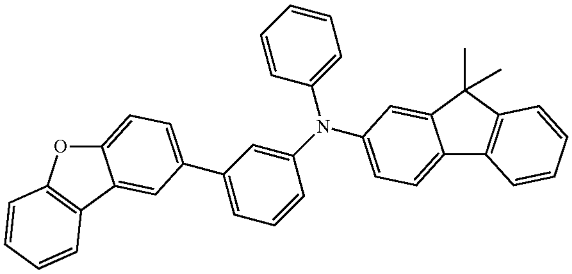
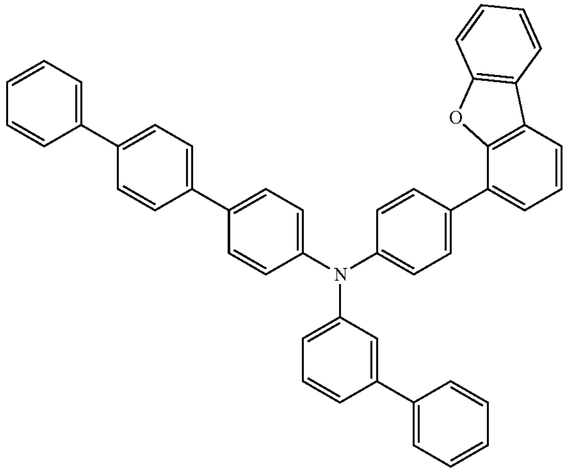
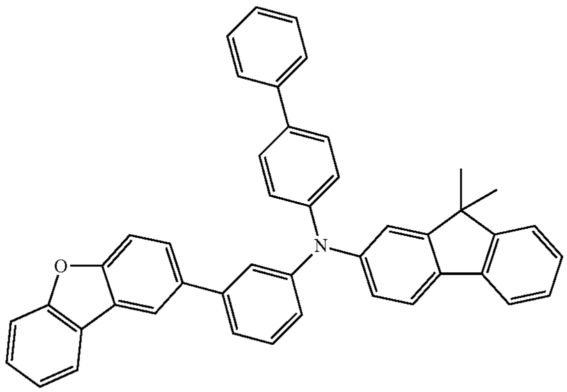

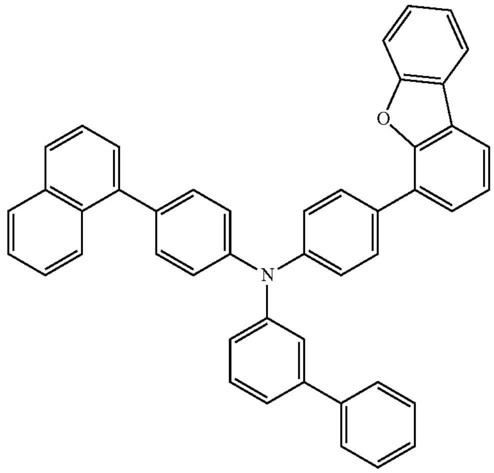
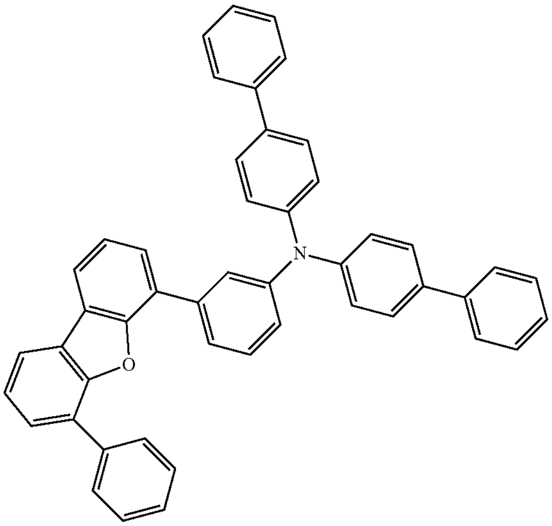
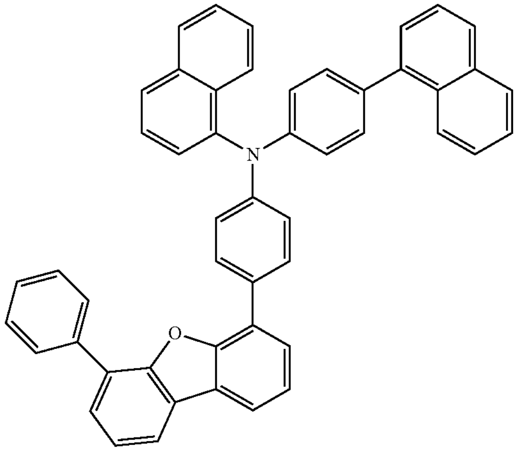
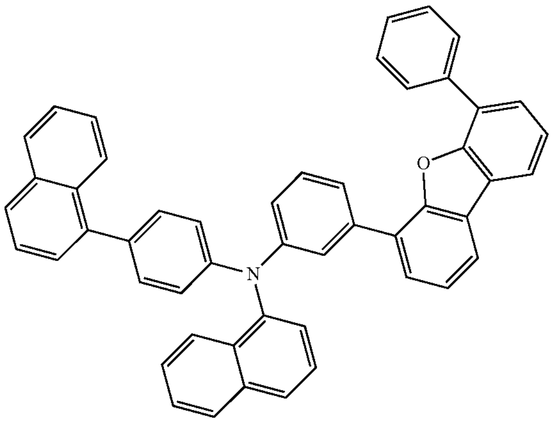
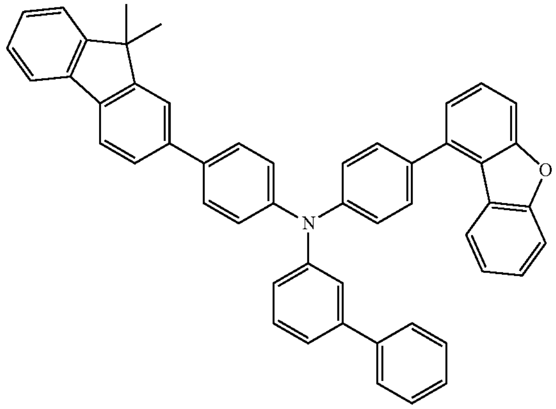 [SMILES: CC1(C)c2ccccc2-c2ccc(-c3ccc(N(c4ccc(-c5cccc6oc7ccccc7c56)cc4)c4cccc(-c5ccccc5)c4)cc3)cc21]
[Formula 79]
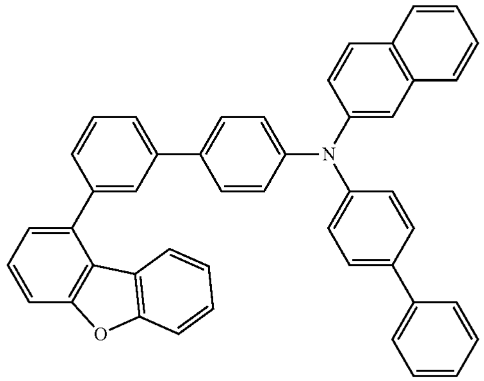
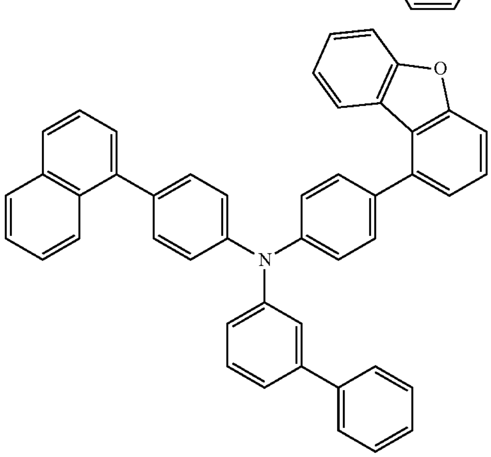

-continued
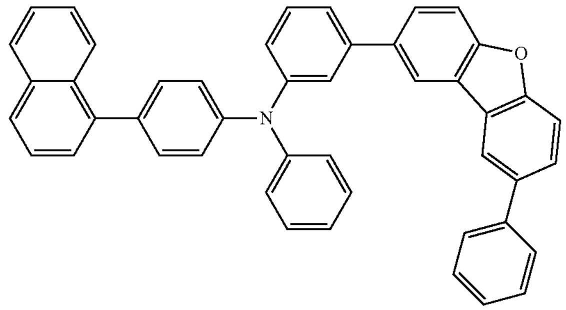
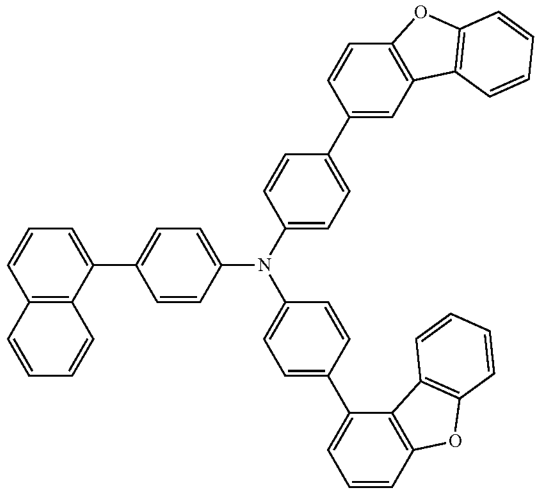
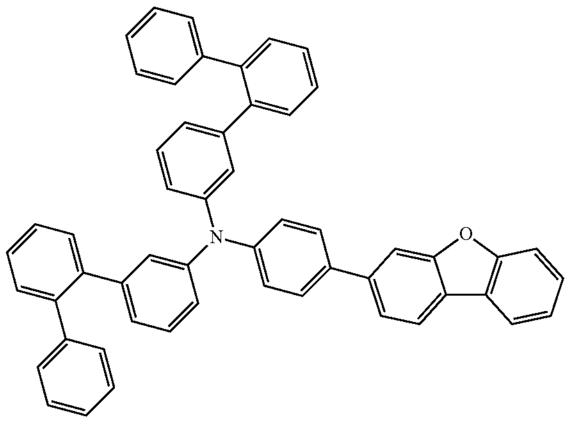
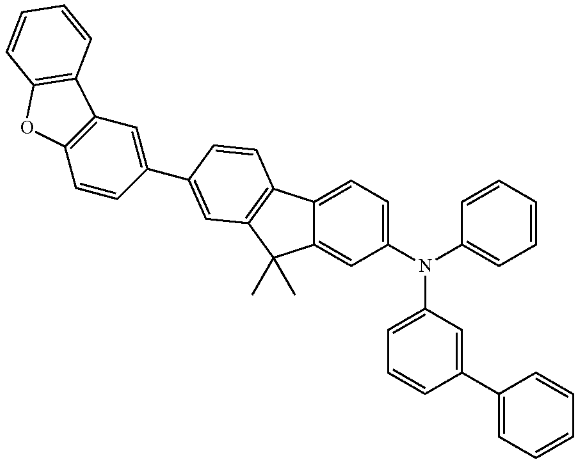
-continued
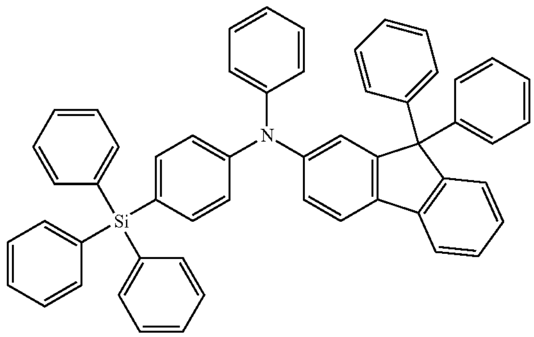
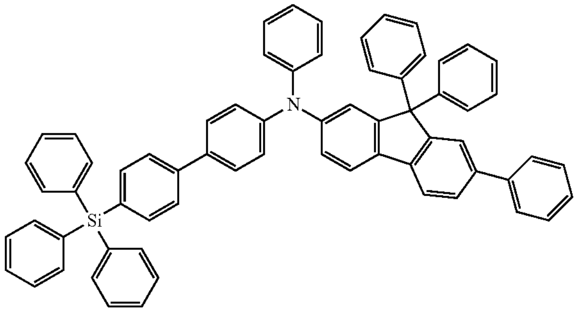
[Formula 80]
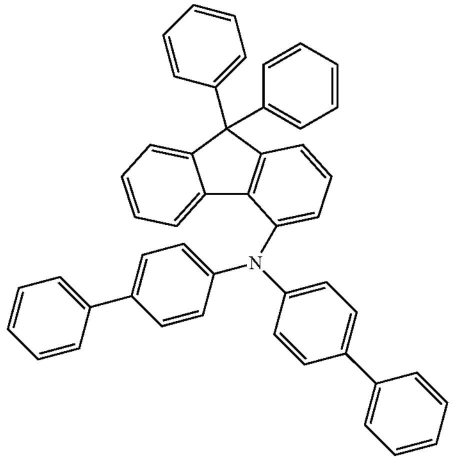
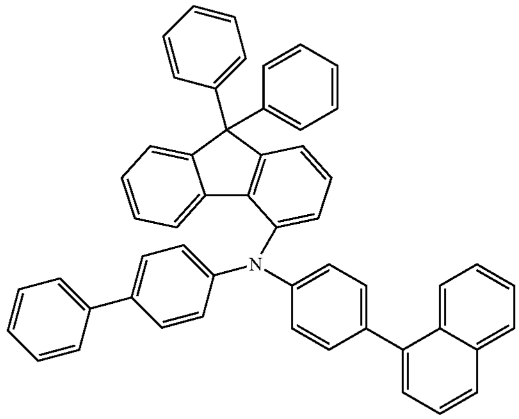

-continued
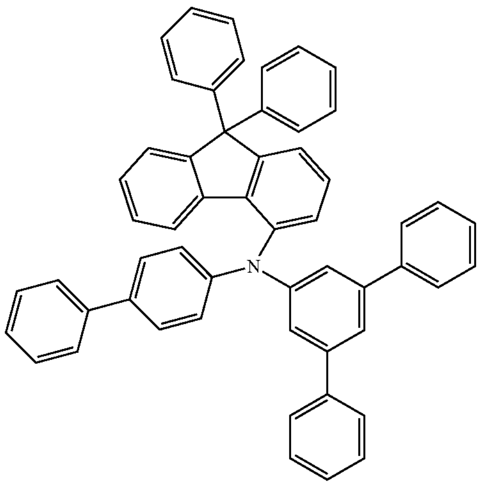
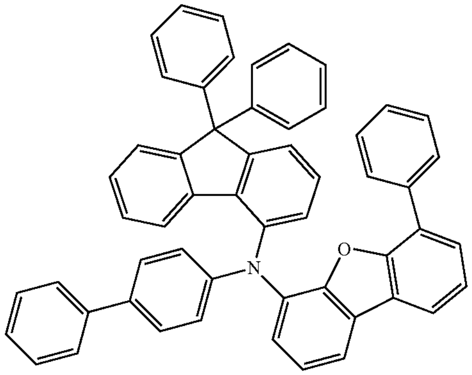
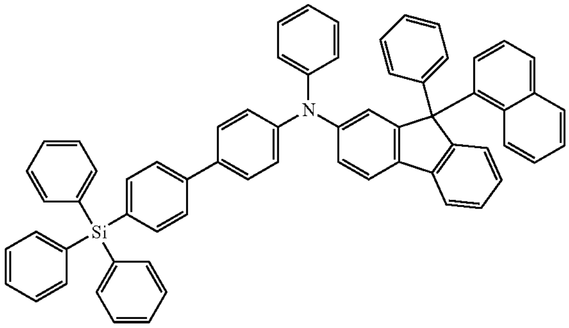
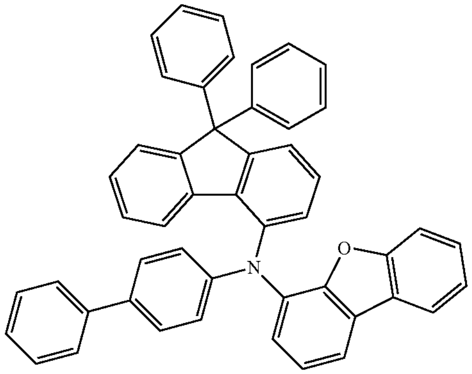
-continued
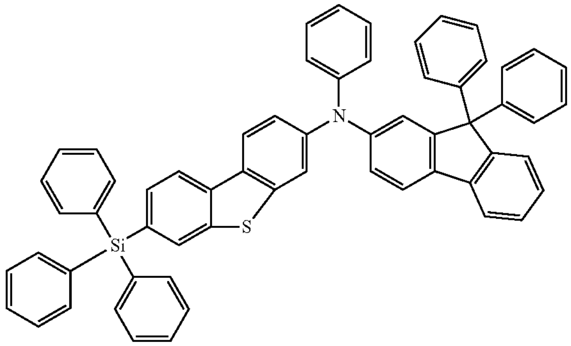
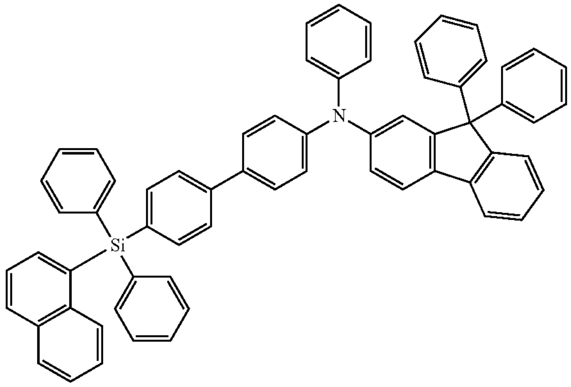
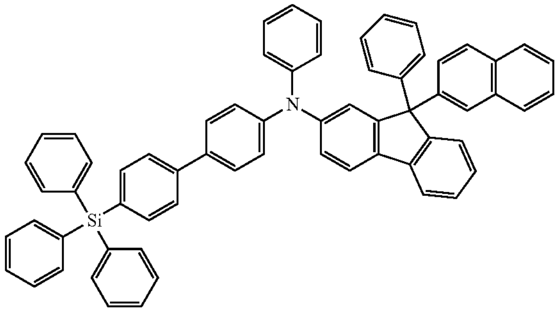
[Formula 81]
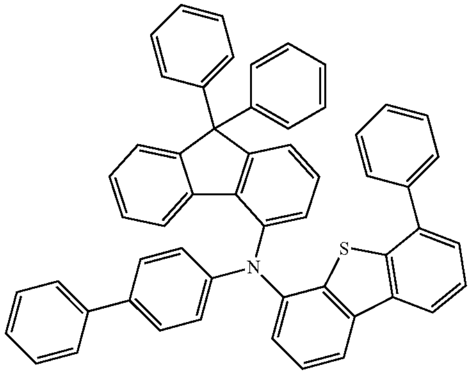

-continued
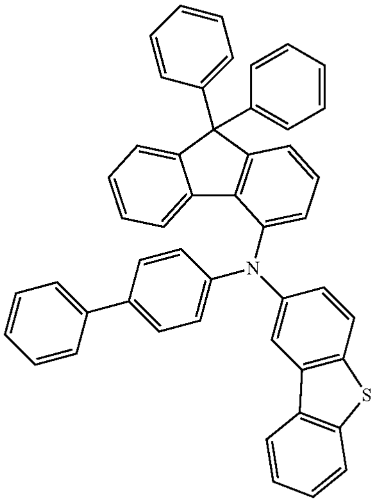
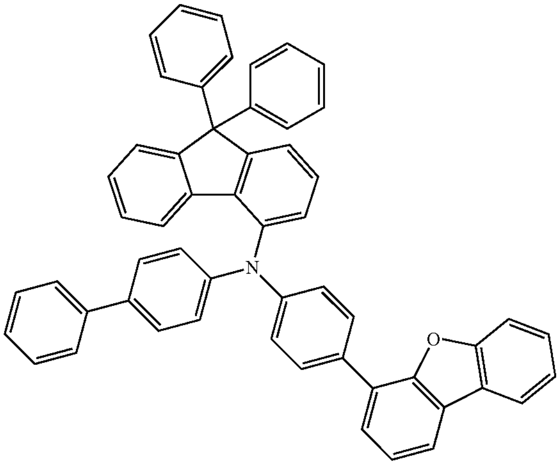
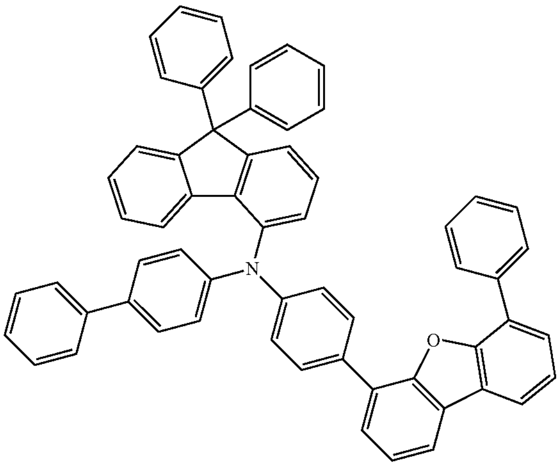
-continued
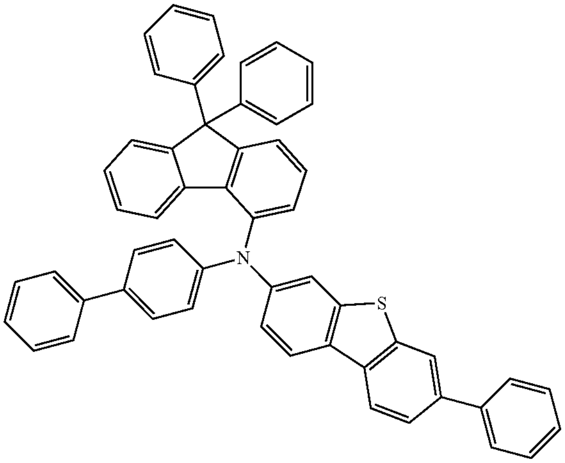
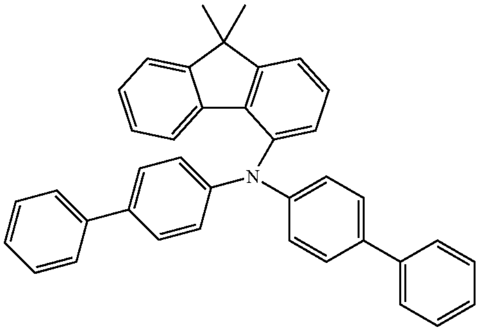
[Formula 82]
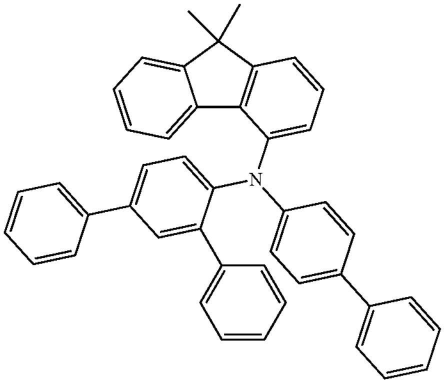
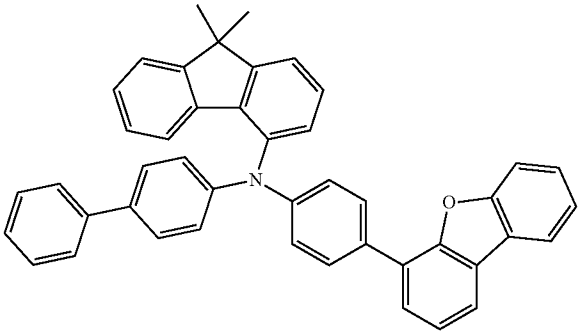

-continued
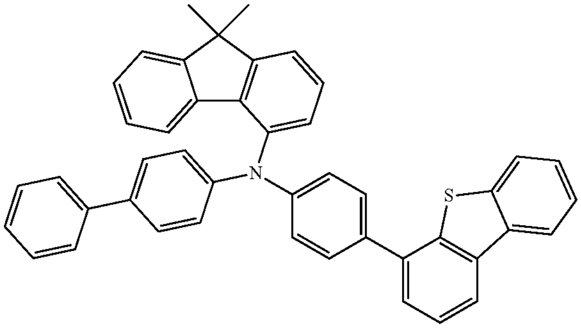
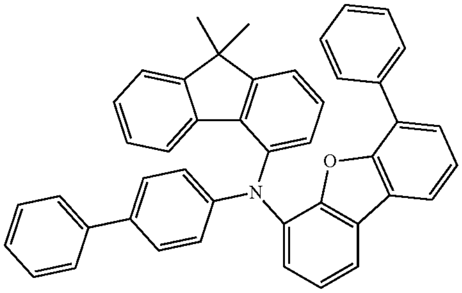
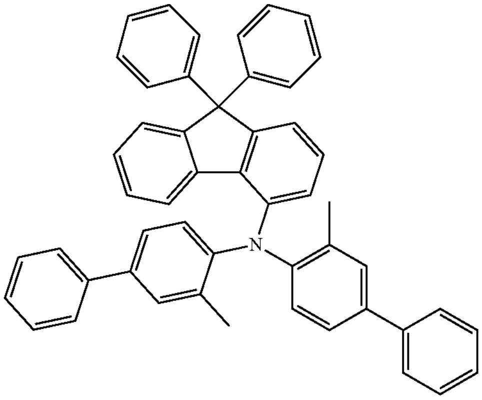
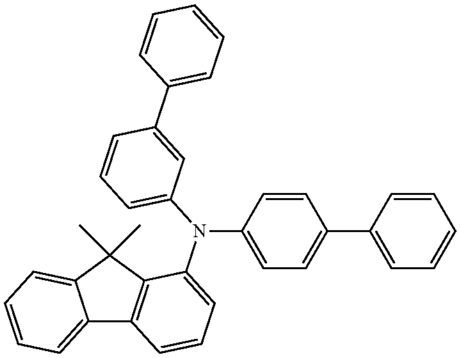
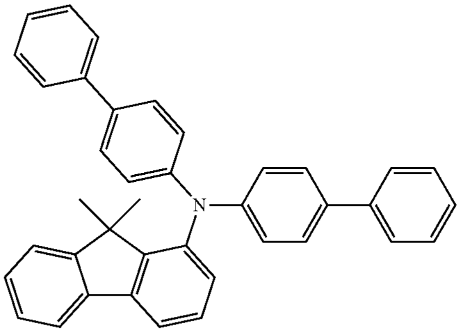
-continued
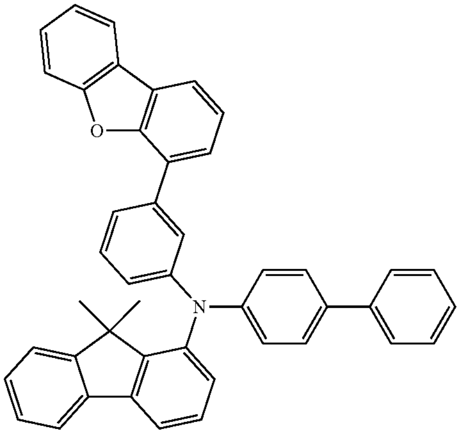
[Formula 83]
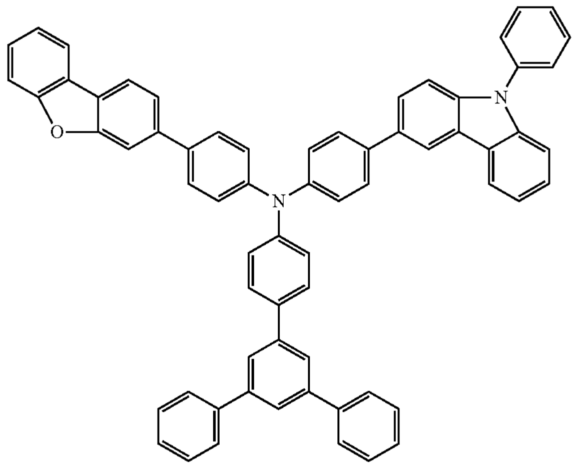
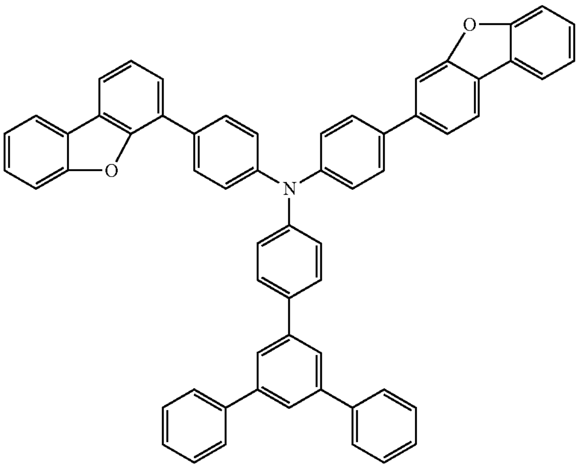

-continued
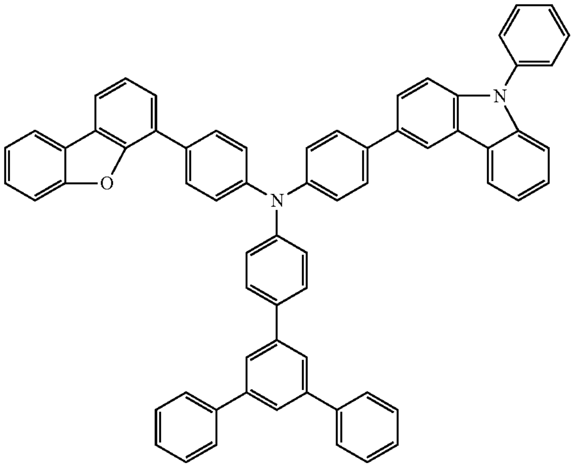
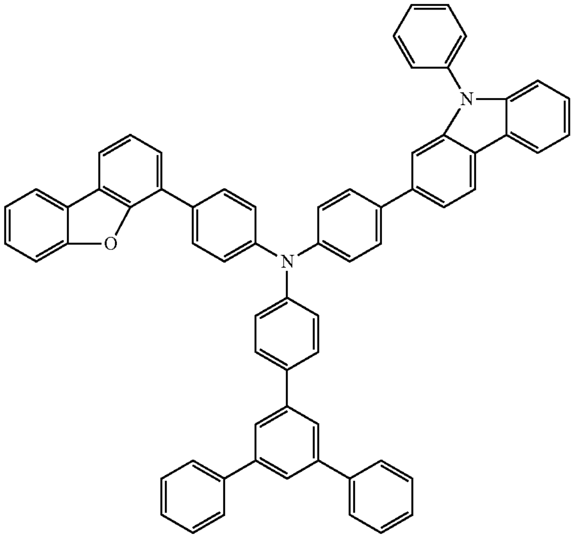
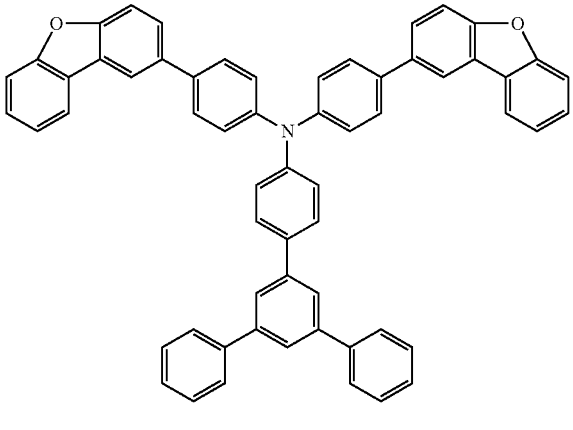
-continued
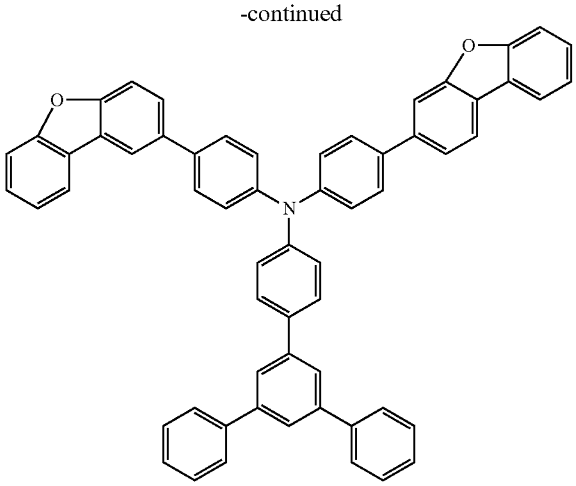
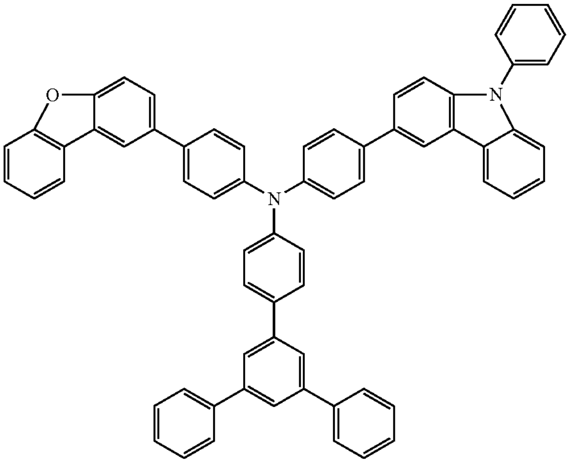
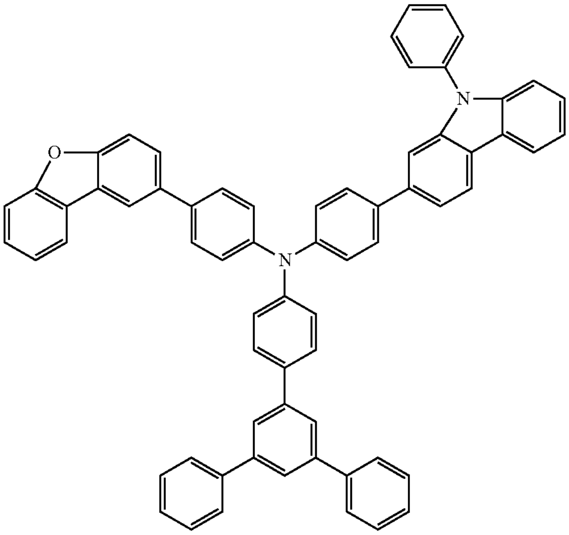

-continued
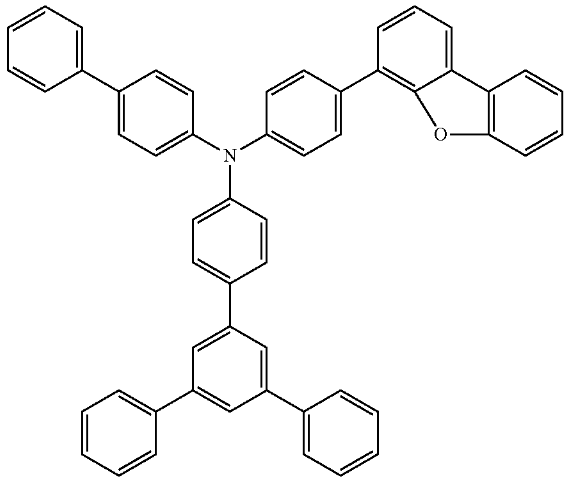
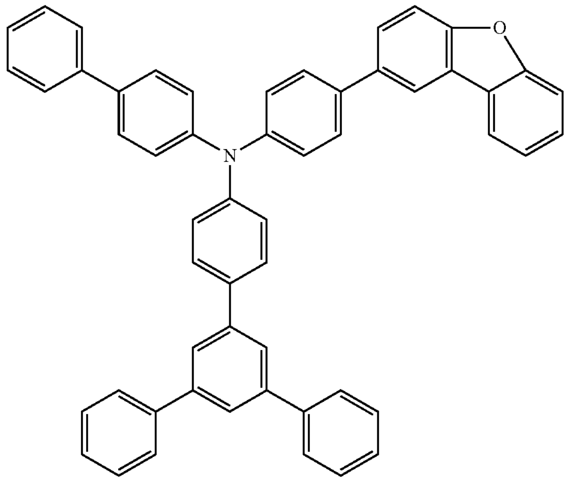
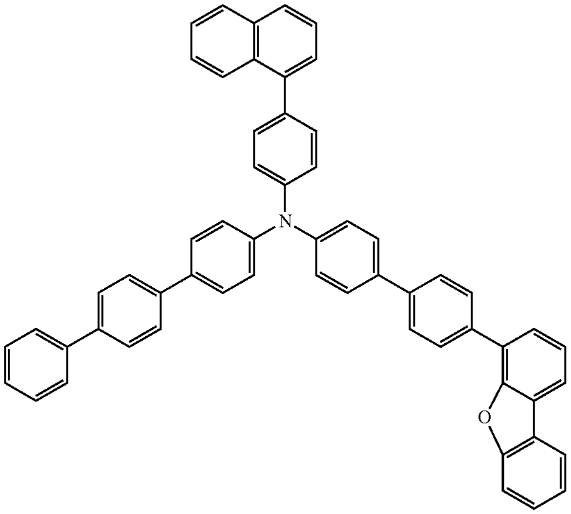
-continued
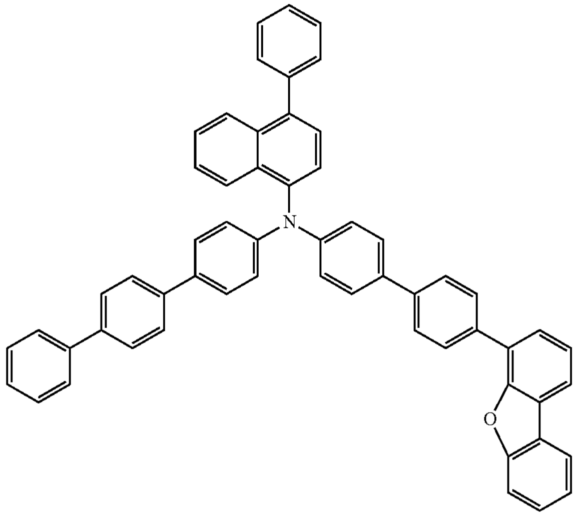
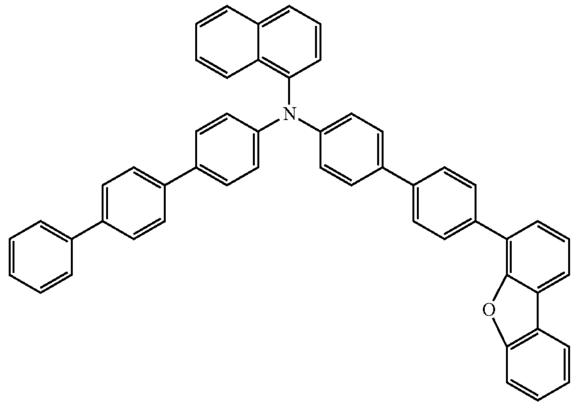
[Formula 84]
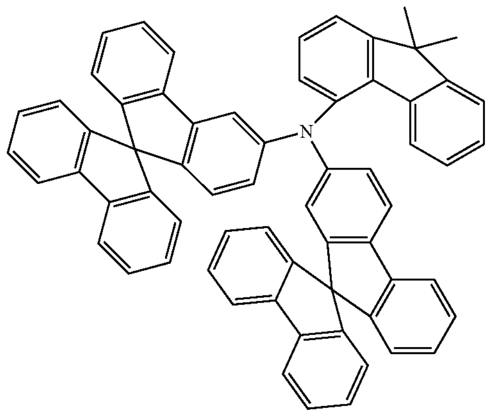

-continued
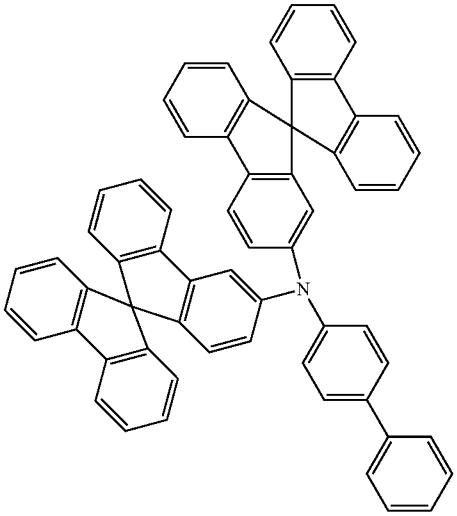
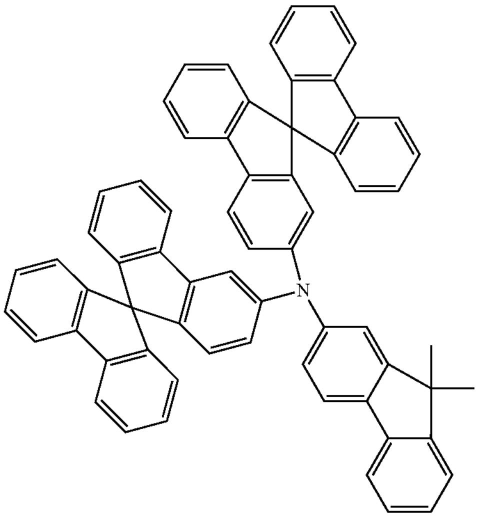
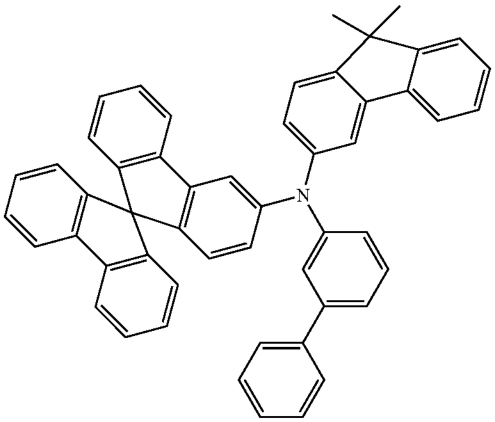
-continued
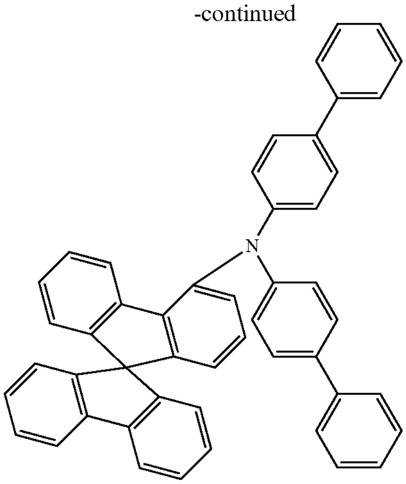
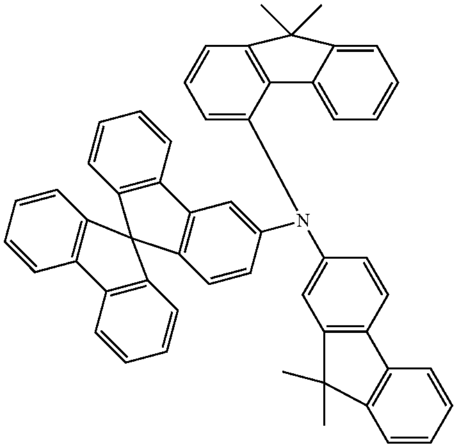
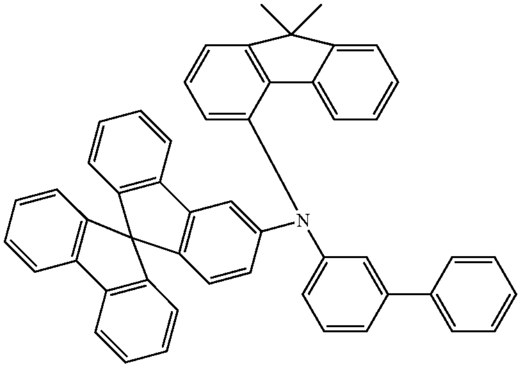
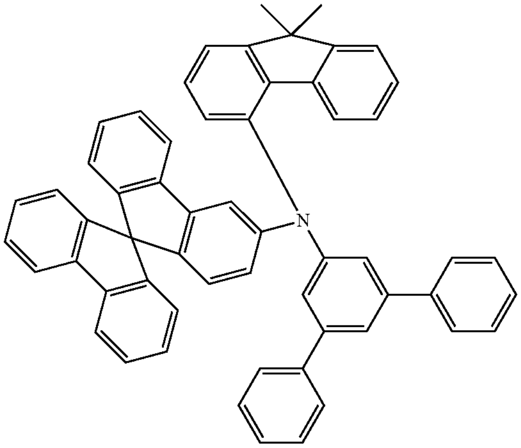

-continued
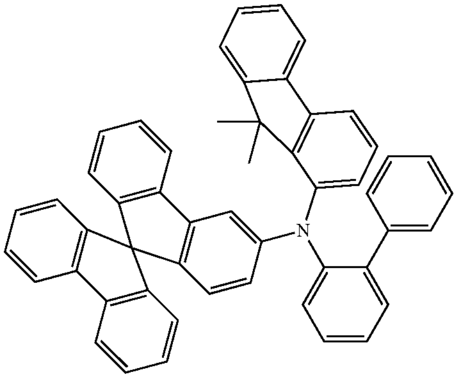
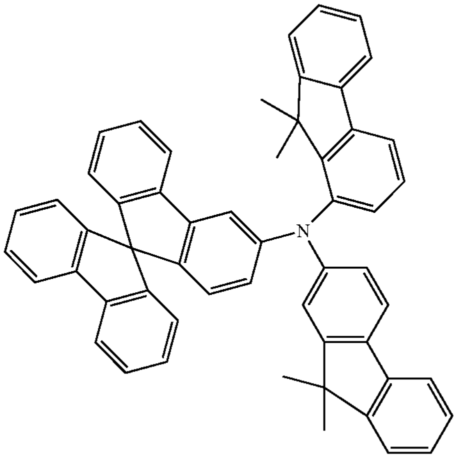
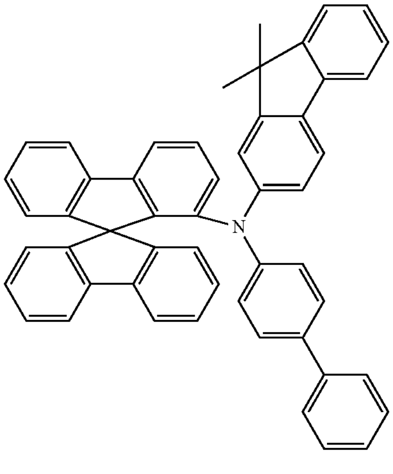
-continued
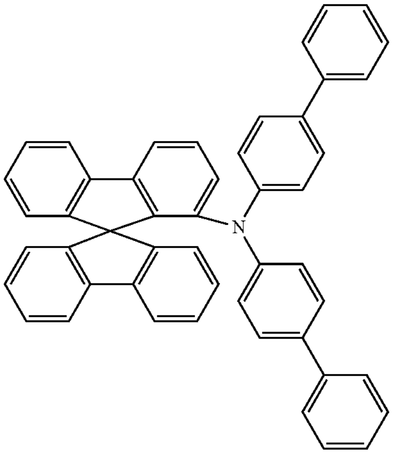
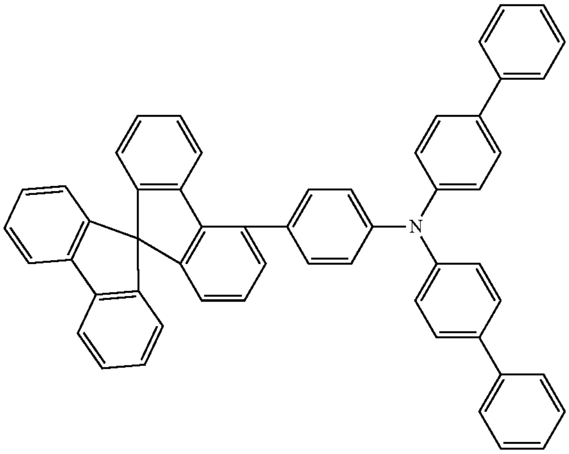
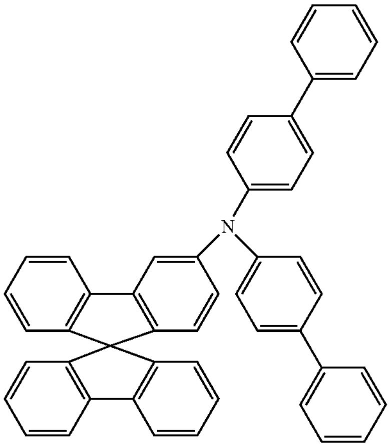

-continued
[Formula 85]
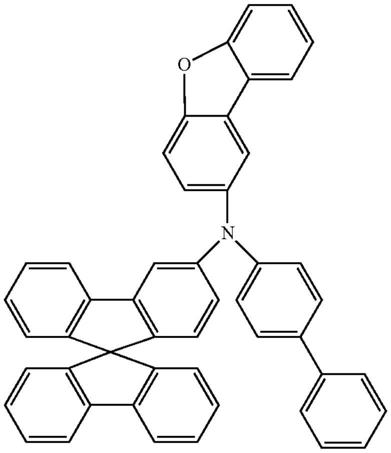
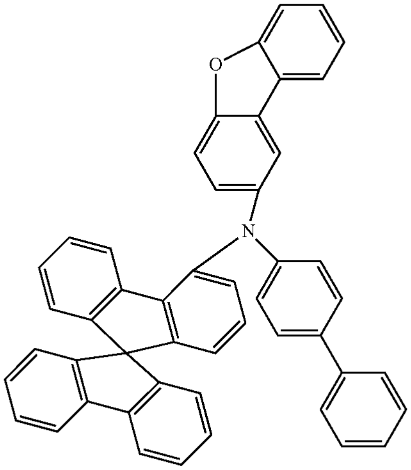
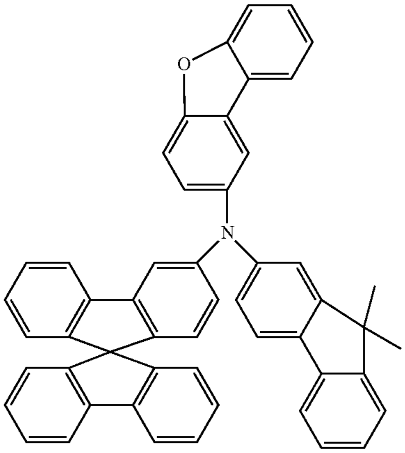
-continued
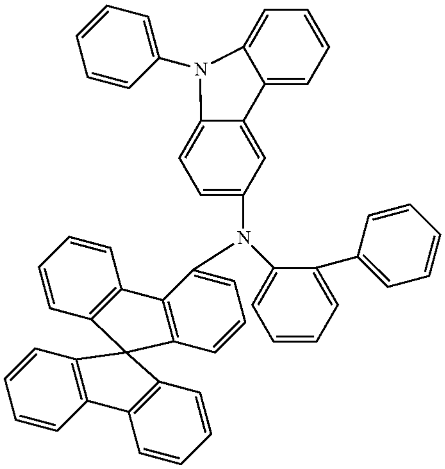
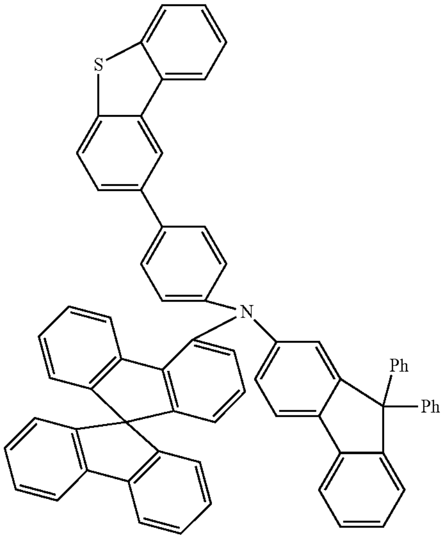
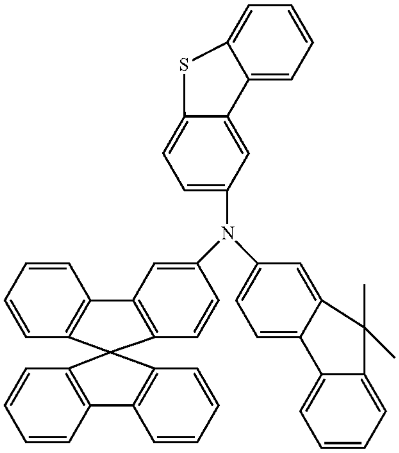

-continued
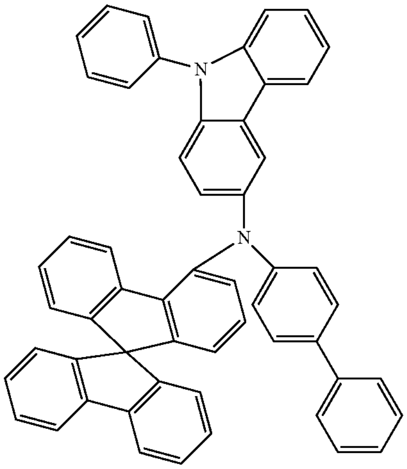
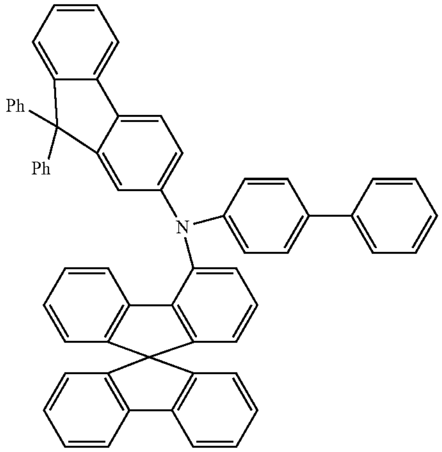
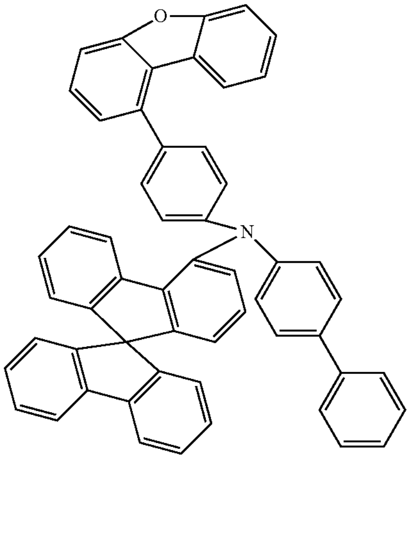
-continued
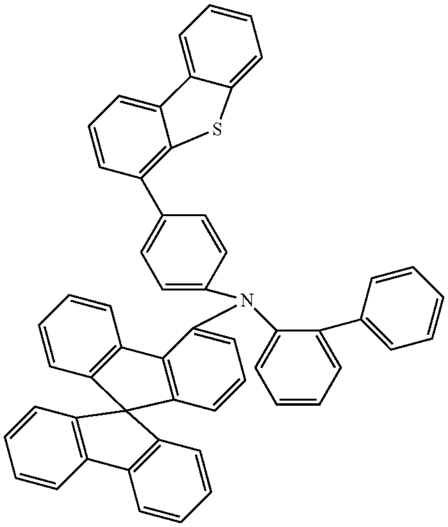
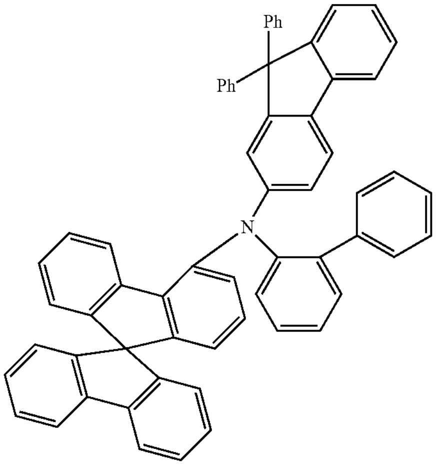
[Formula 86]
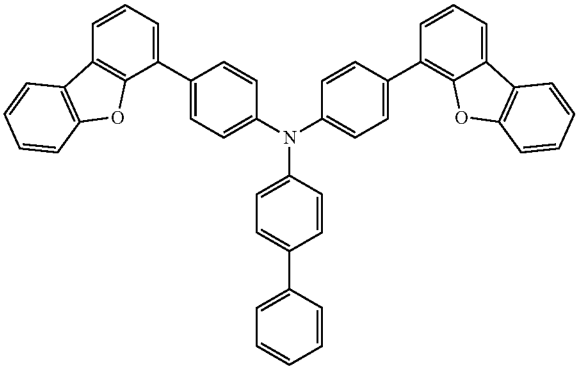

-continued
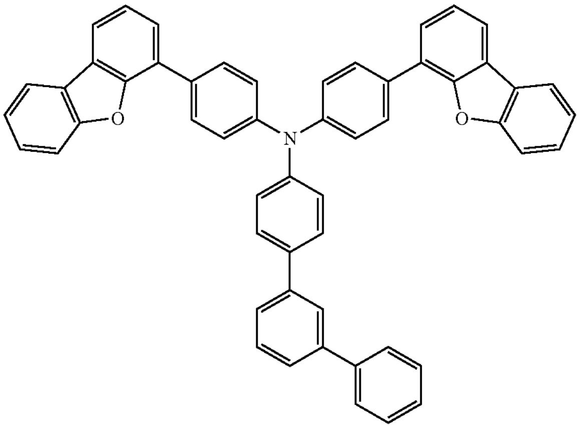
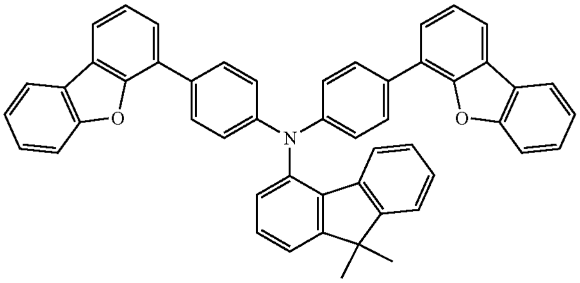
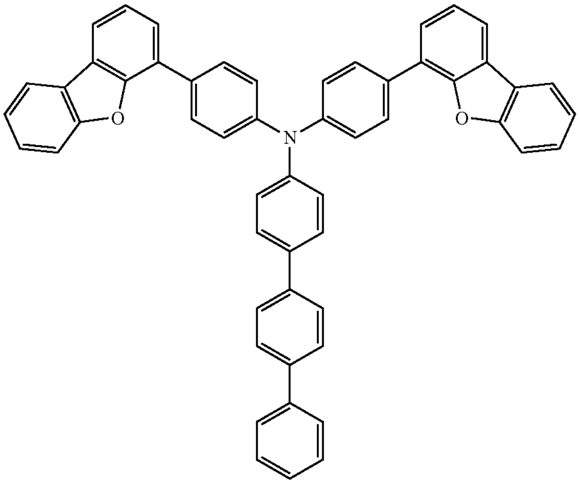
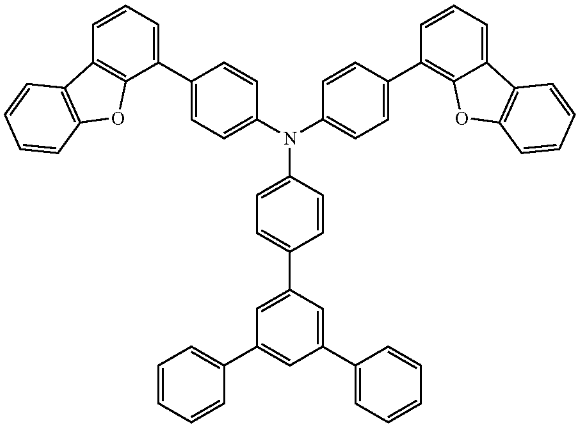
-continued
[Formula 87]
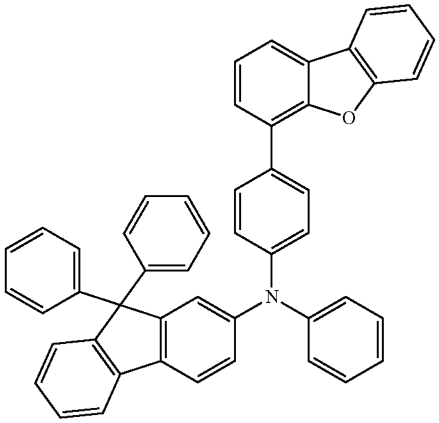
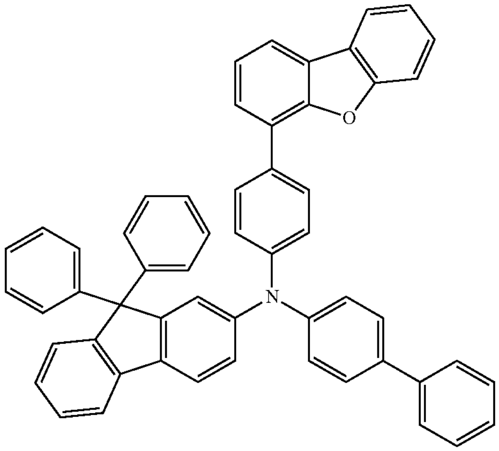
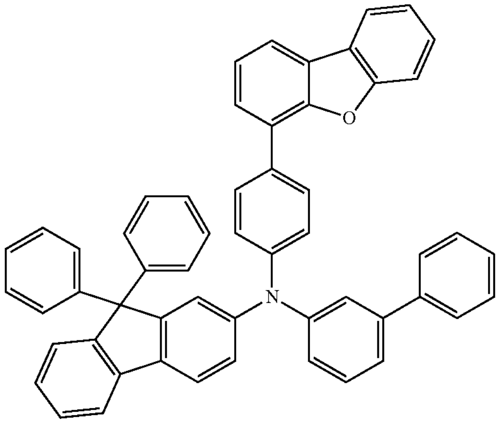

-continued
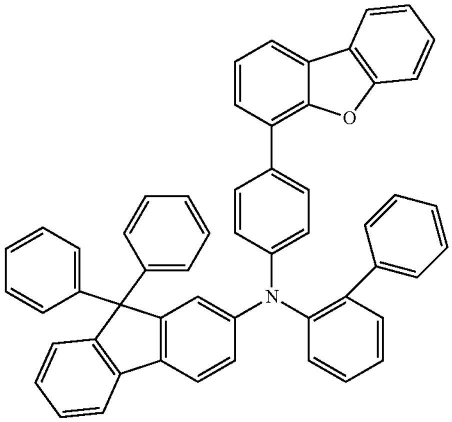
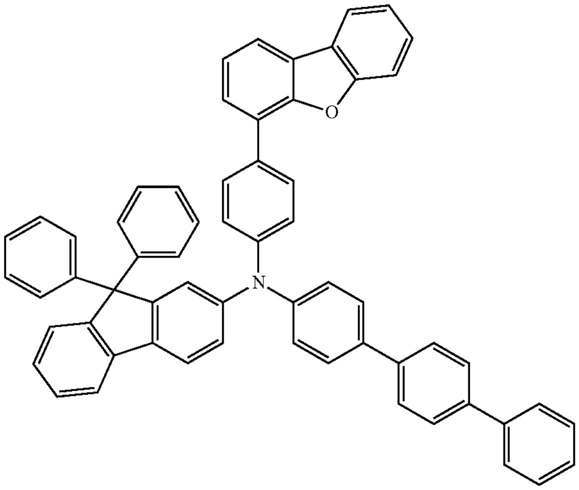
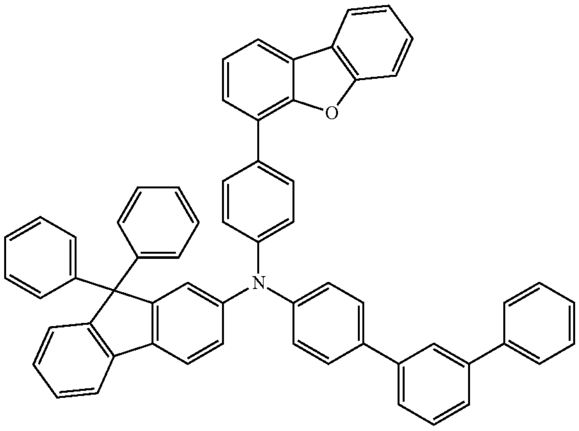
-continued
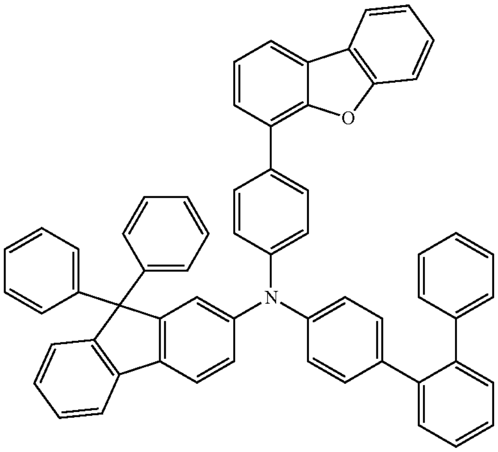
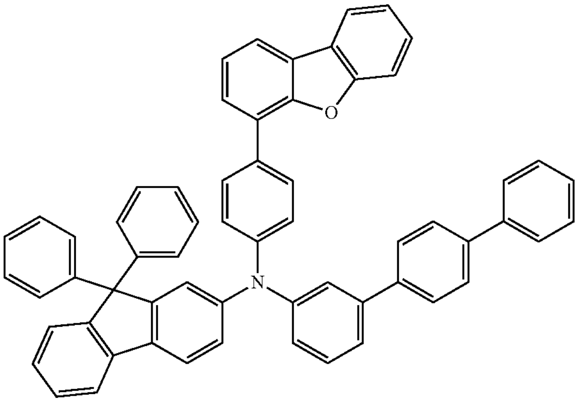
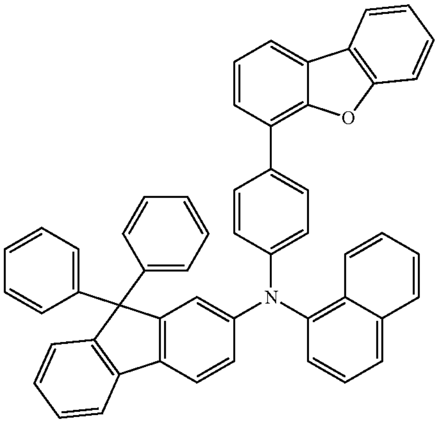
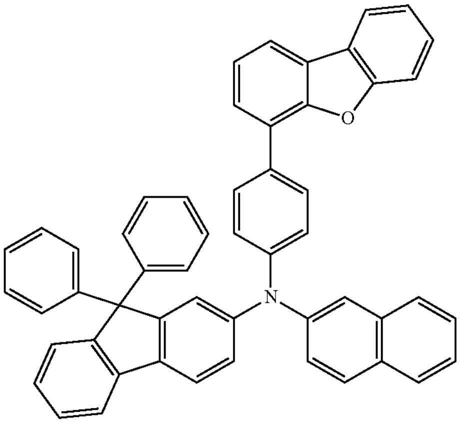

-continued
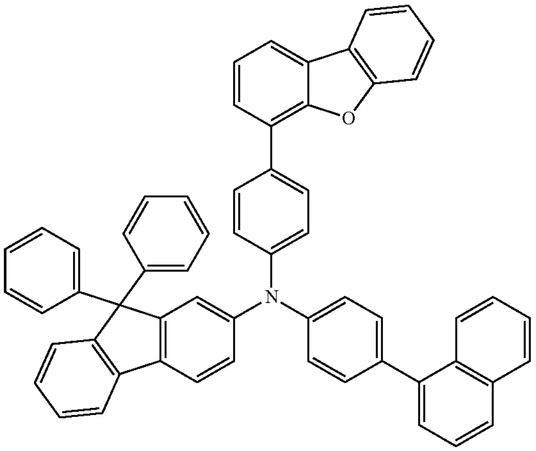
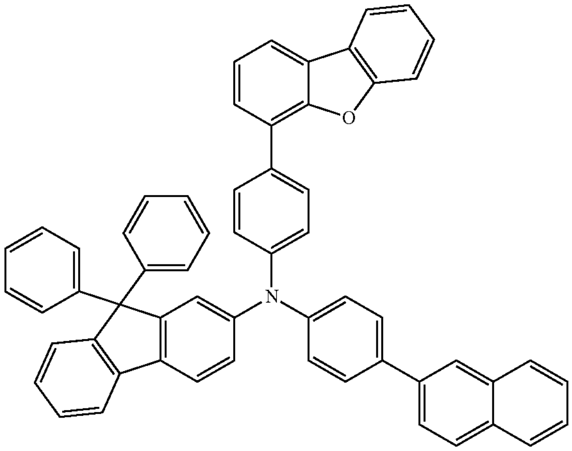
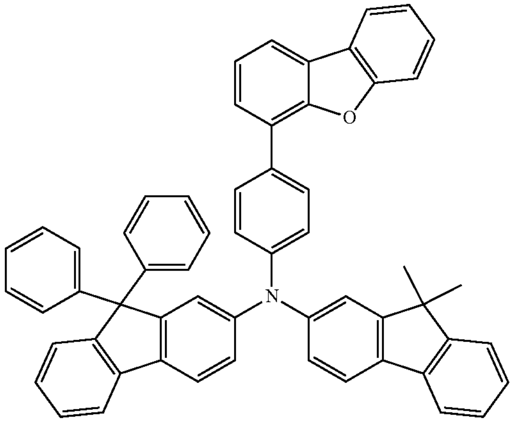
-continued
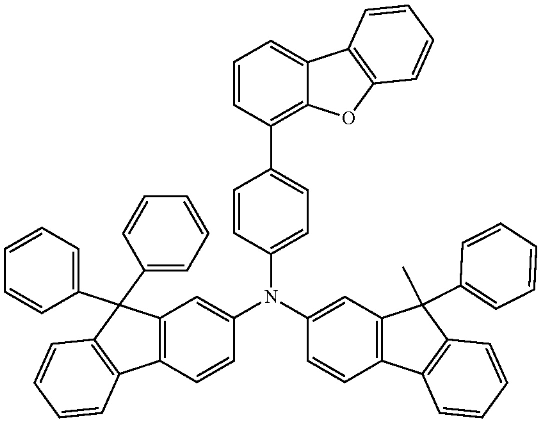
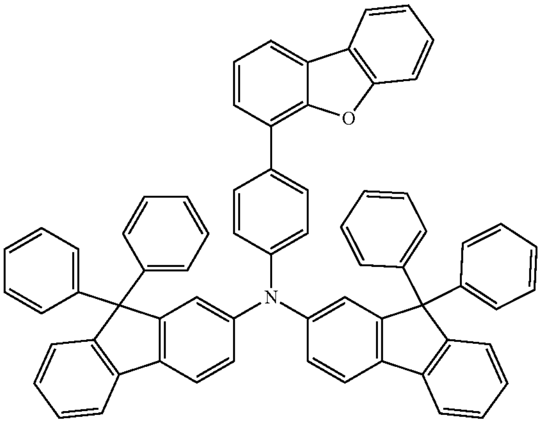
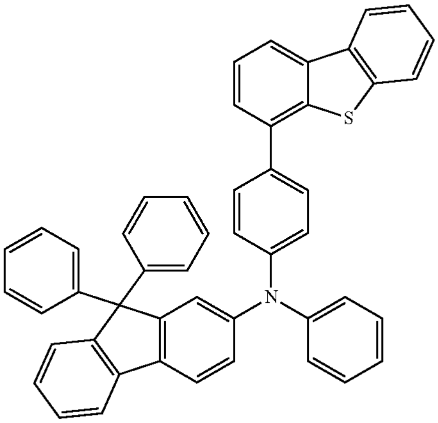
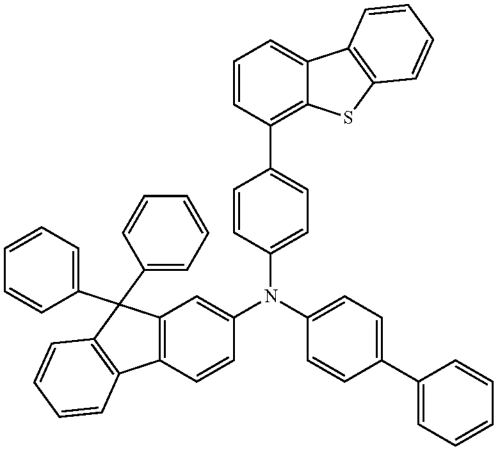

-continued
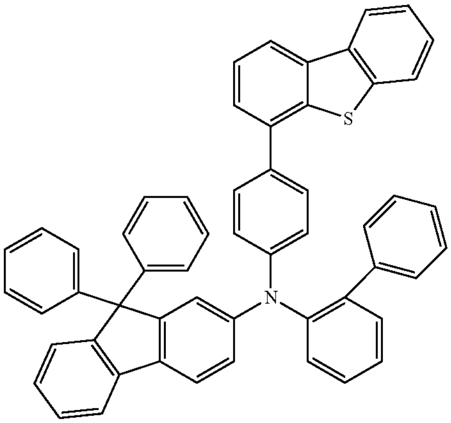
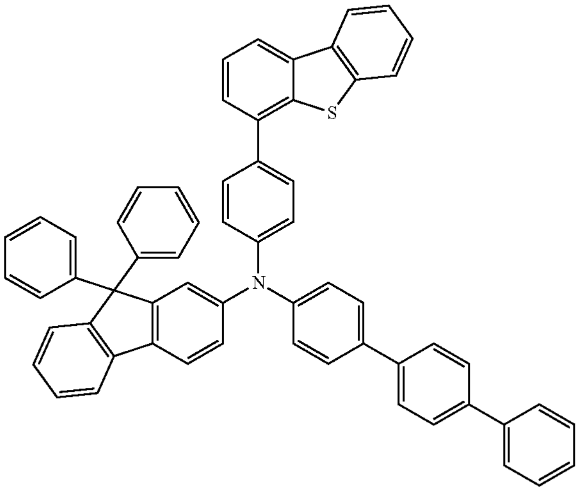
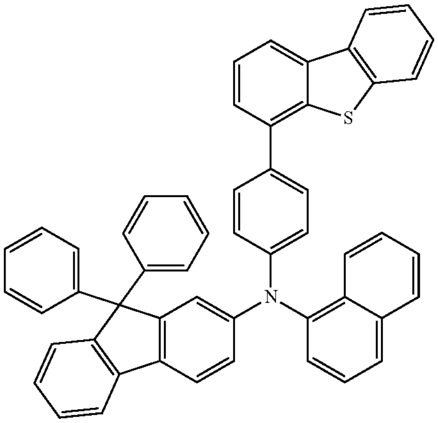
-continued
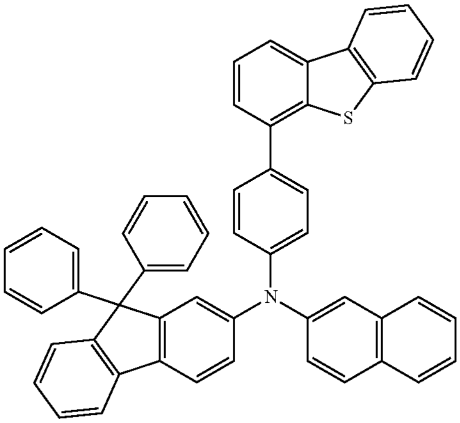
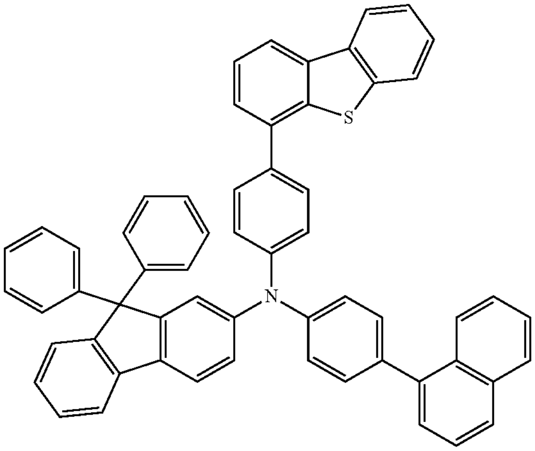
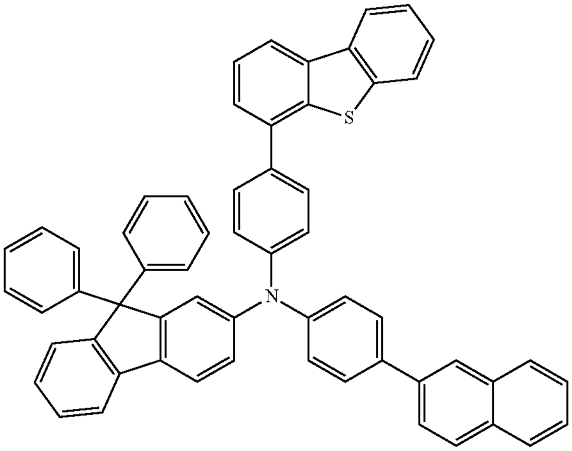

[Formula 88]
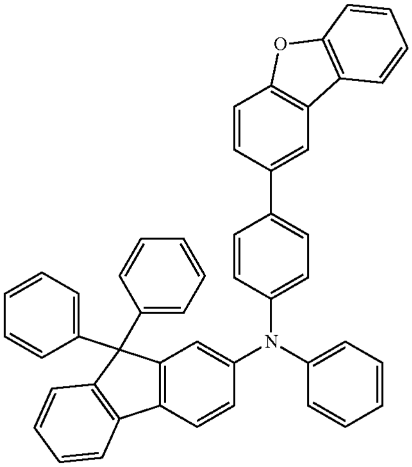
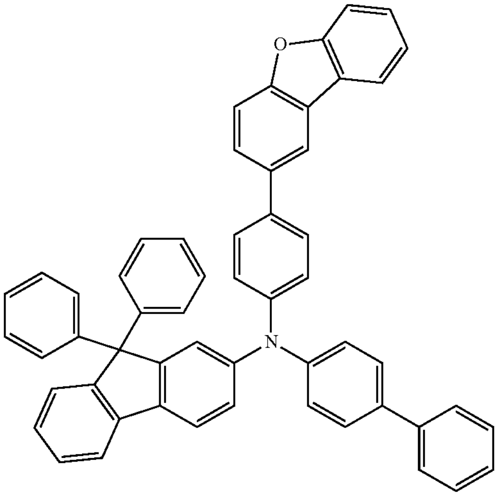
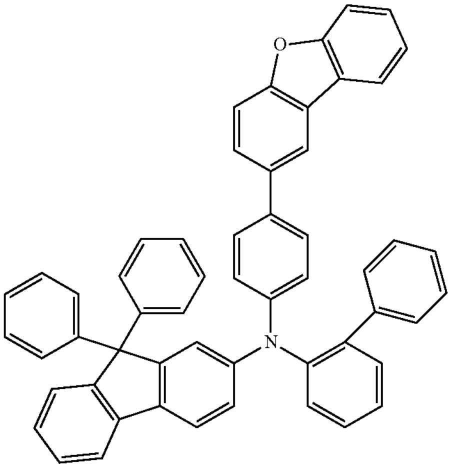
-continued
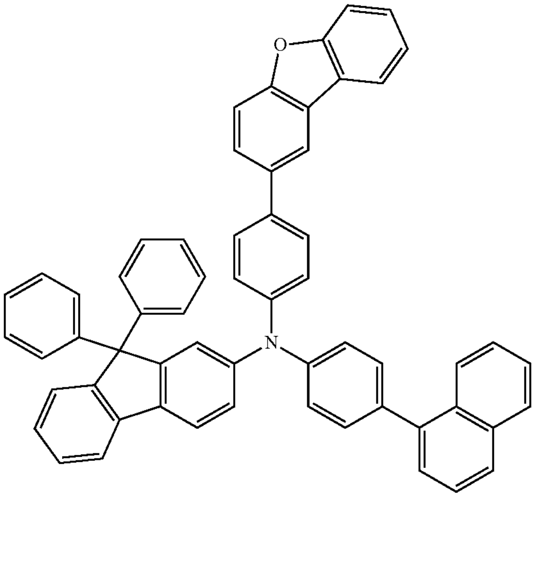
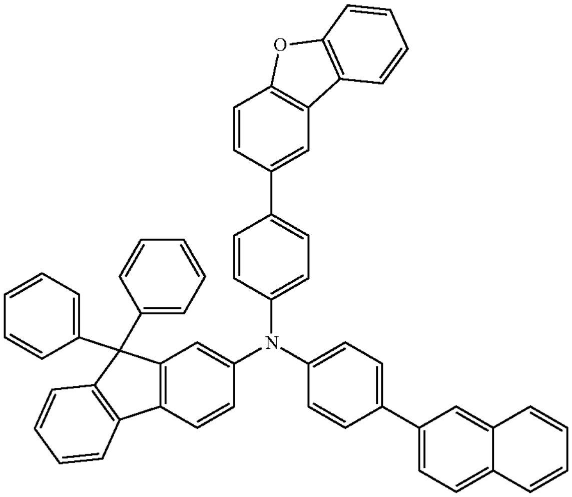
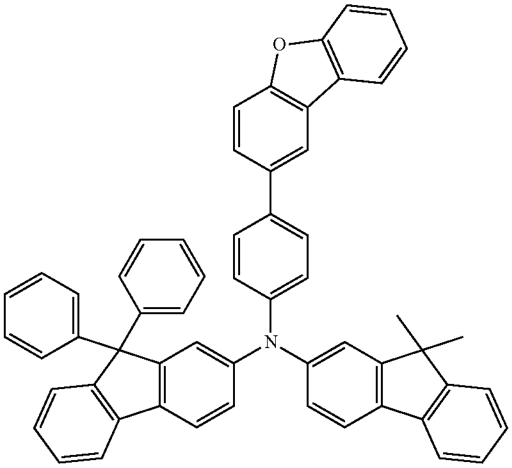

-continued
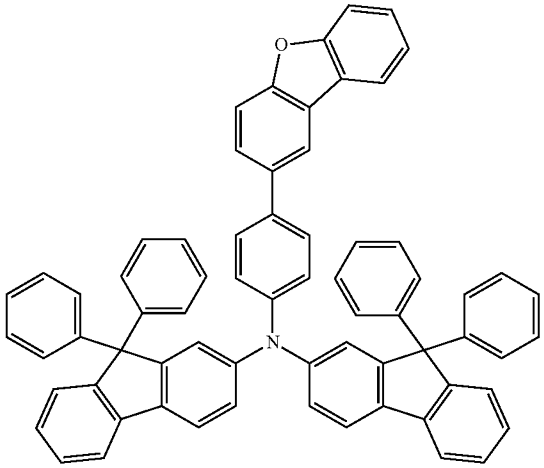
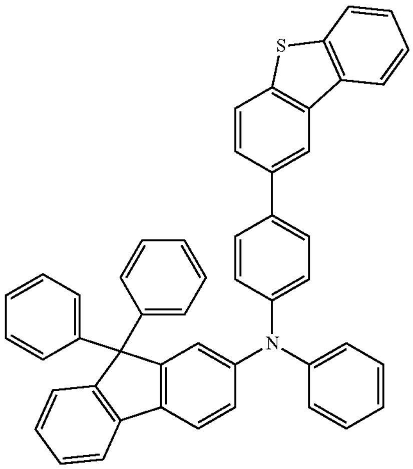
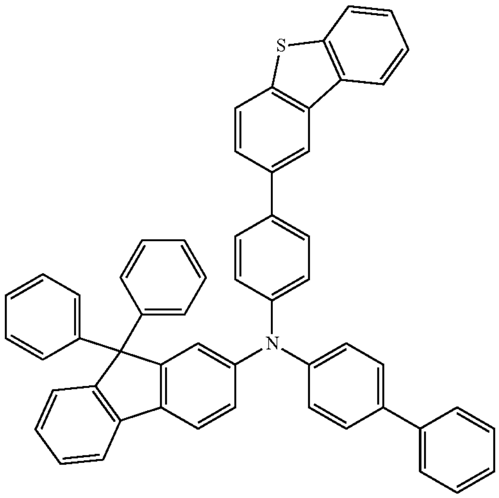
-continued
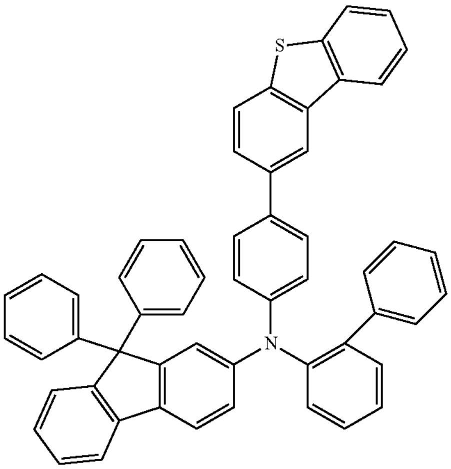
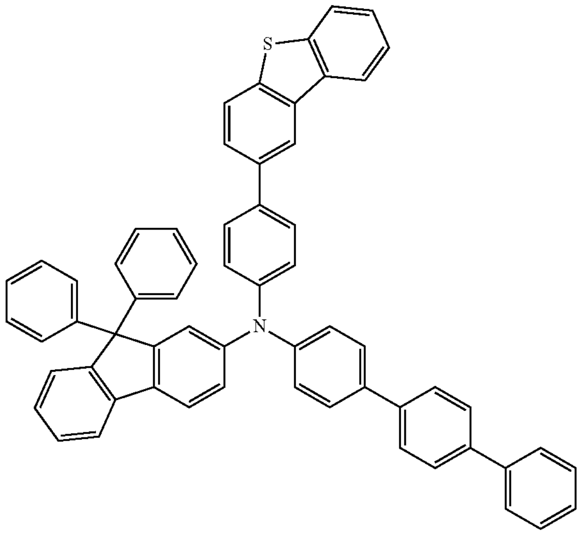
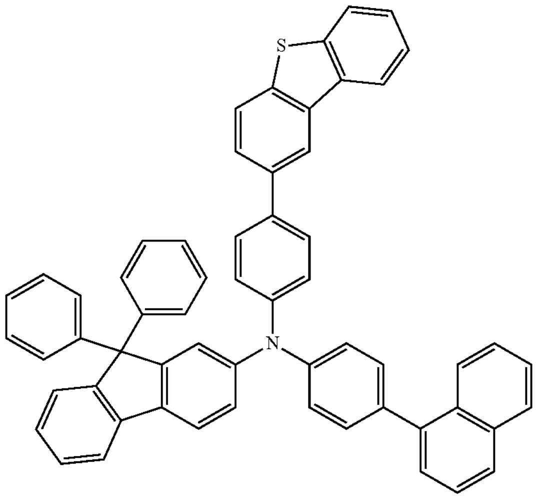

-continued
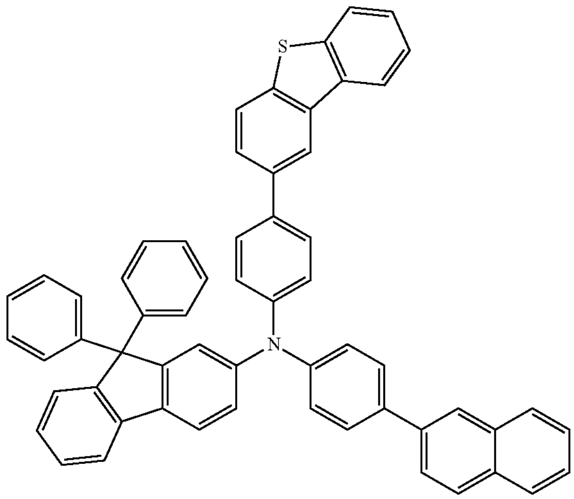
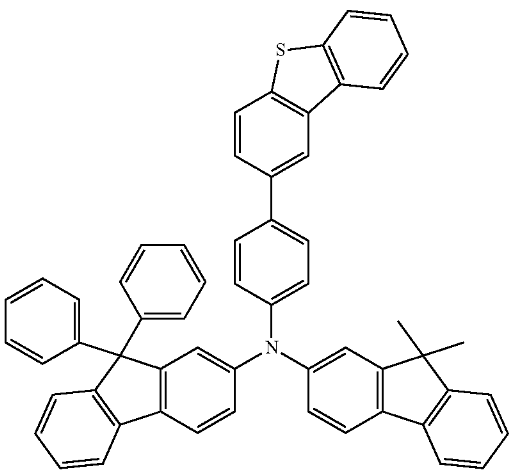
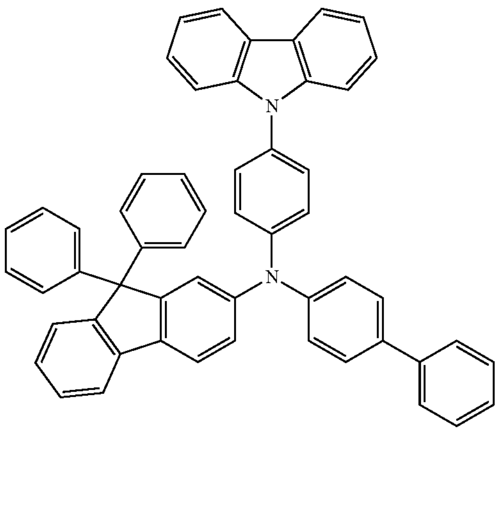
-continued
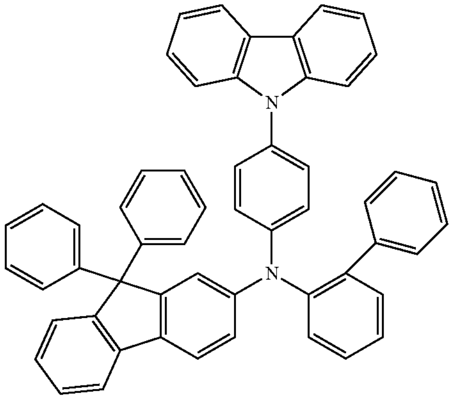
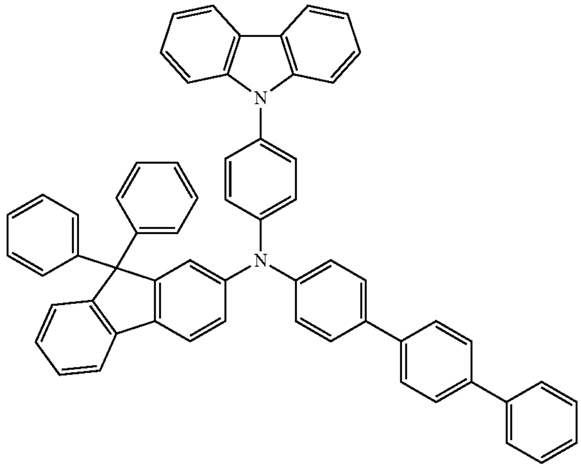
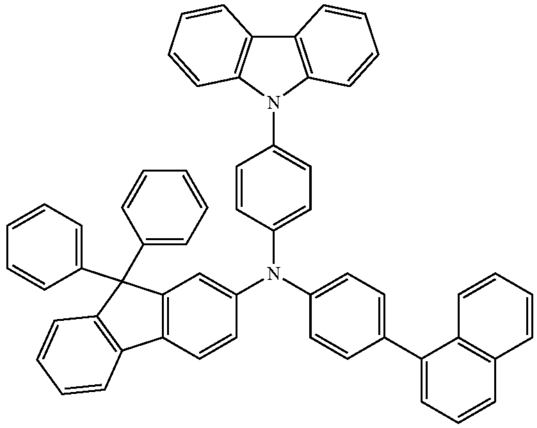
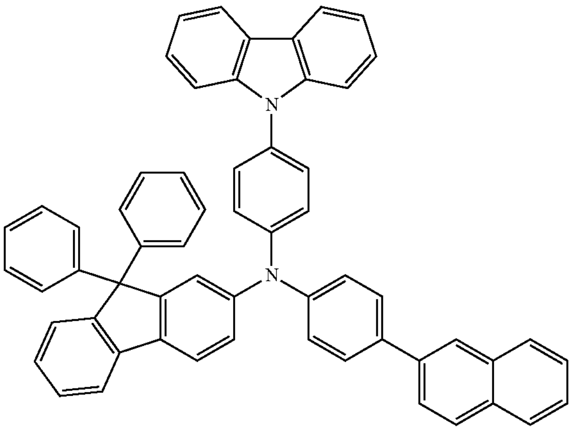

-continued
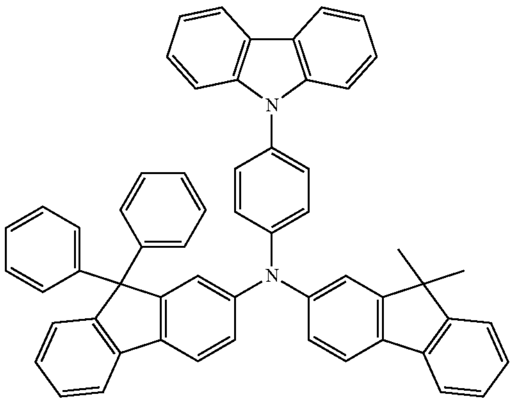
[Formula 89]
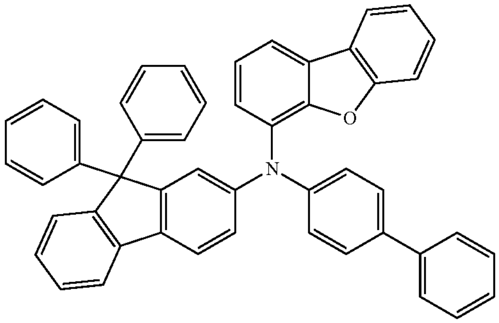
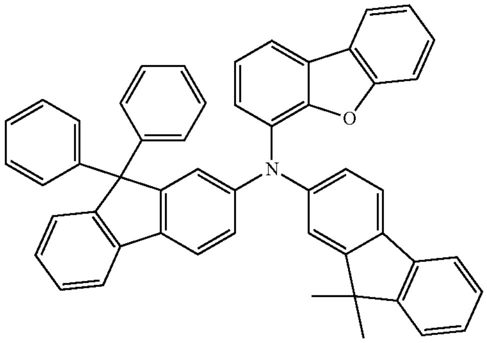
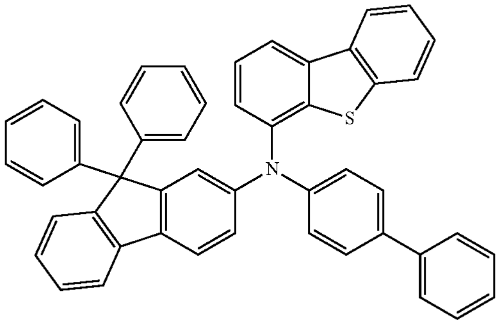
-continued
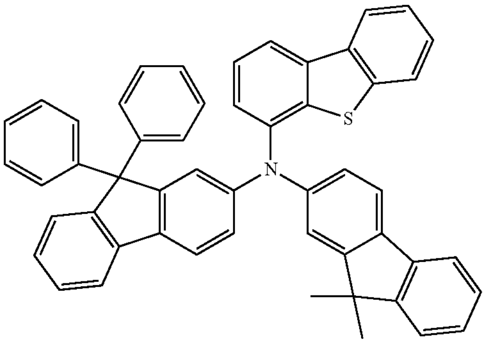
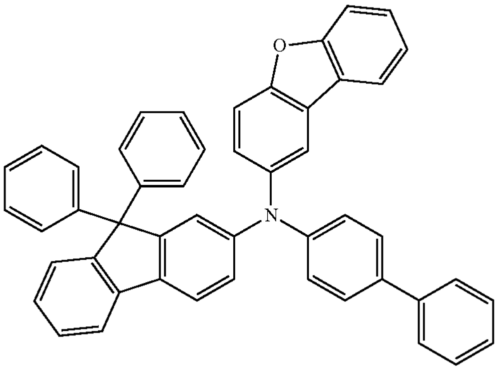
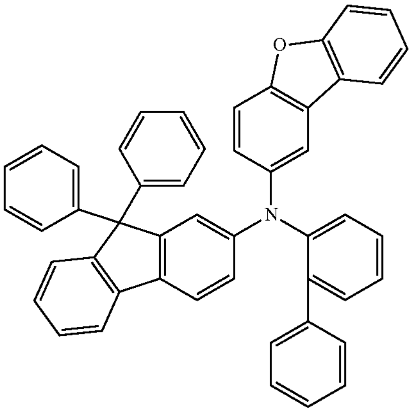
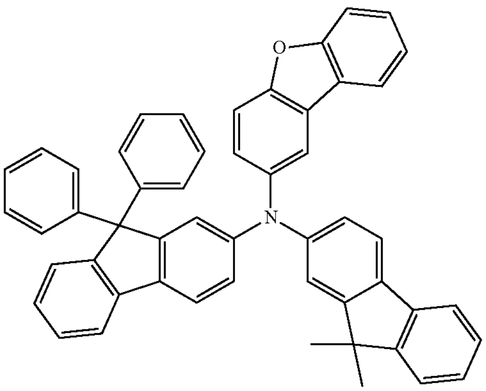 [SMILES: CC1(C)c2ccccc2-c2ccc(N(c3ccc4c(c3)C(c3ccccc3)(c3ccccc3)c3ccccc3-4)c3ccc4sc5ccccc5c4c3)cc21]

-continued
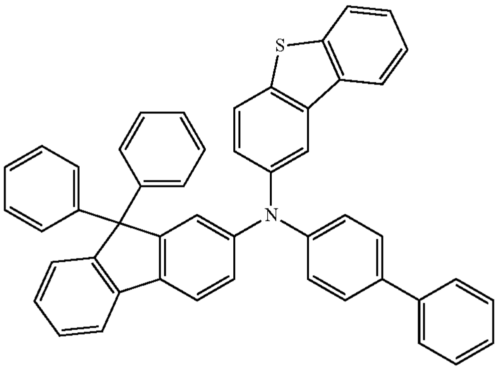
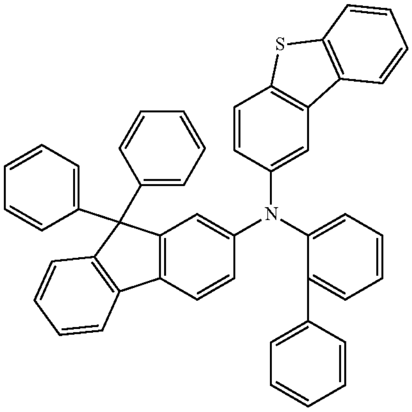
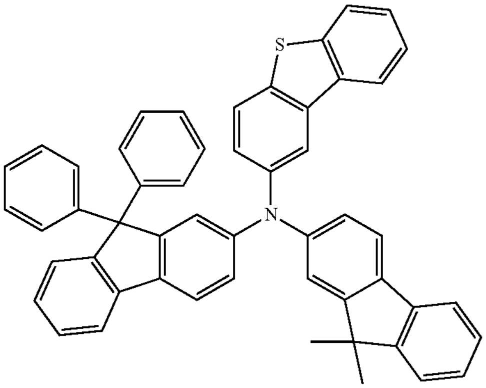
[Formula 90]
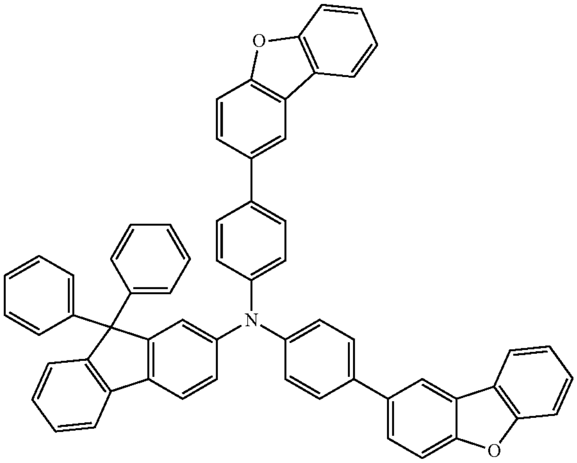
-continued
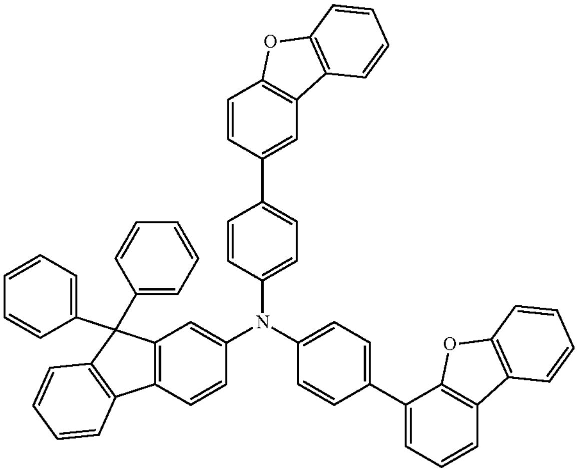
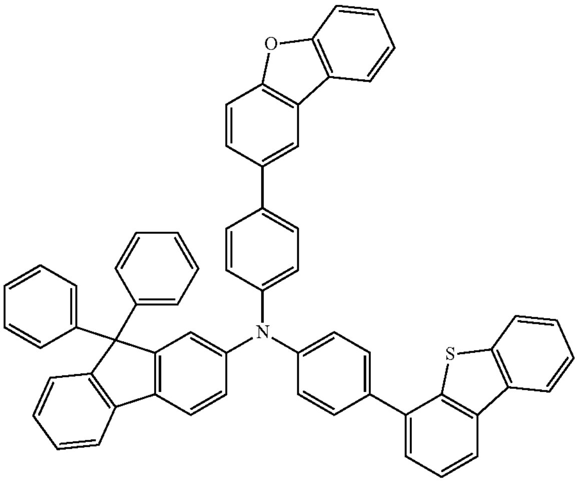
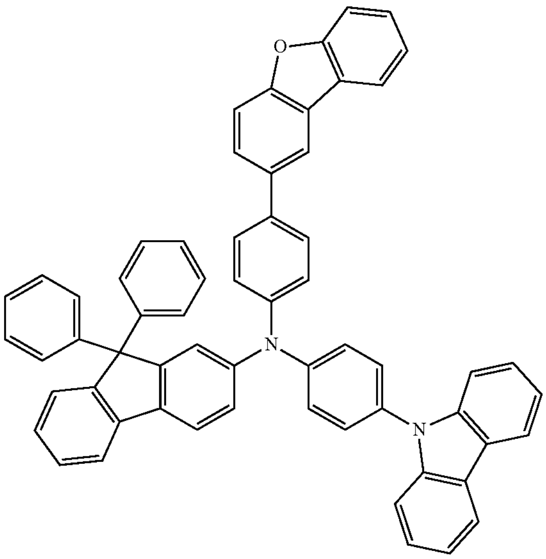

-continued
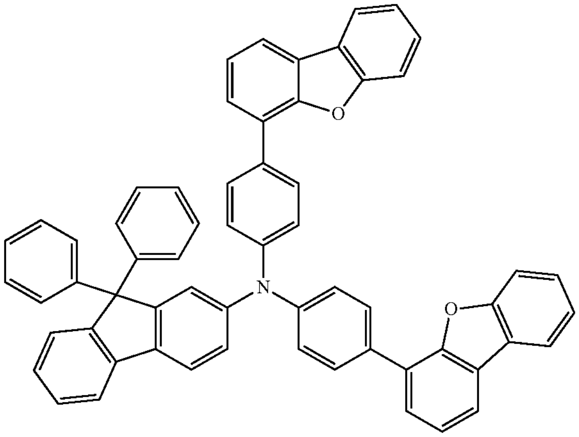
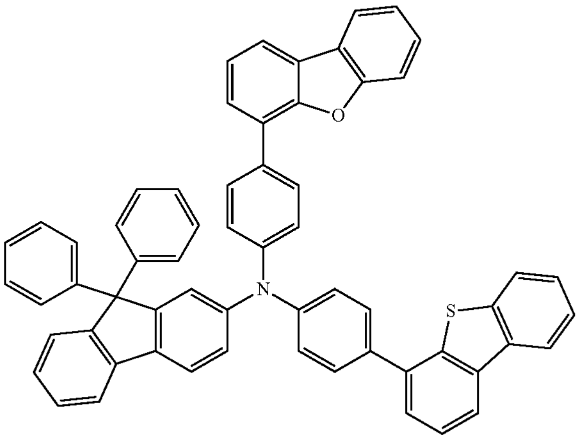
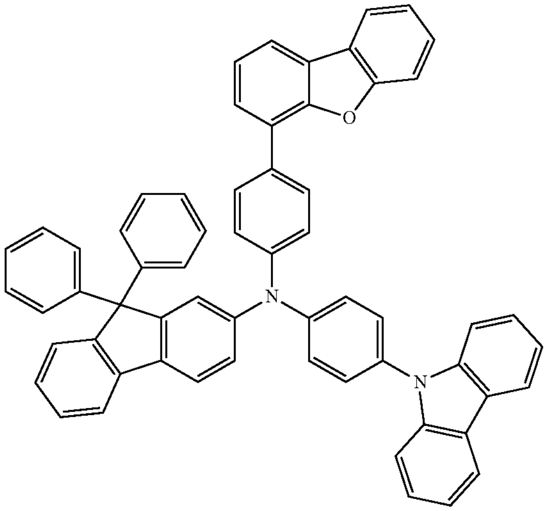
-continued
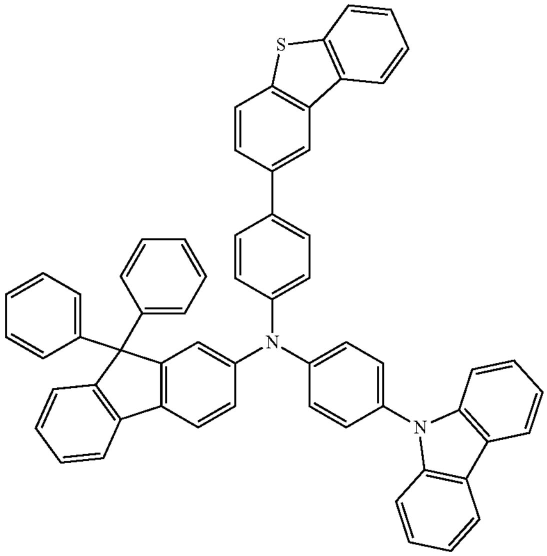 [SMILES: c1ccc(C2(c3ccccc3)c3ccccc3-c3ccc(N(c4ccc(-c5ccc6sc7ccccc7c6c5)cc4)c4ccc(-n5c6ccccc6c6ccccc65)cc4)cc32)cc1]
[Formula 91]
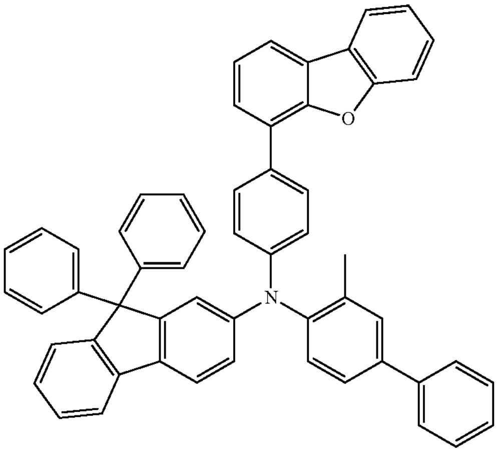
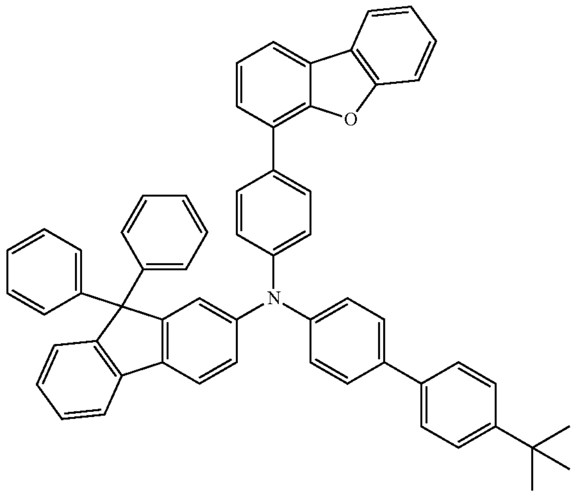

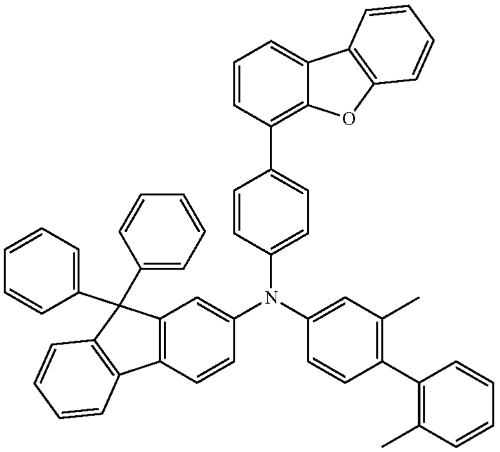
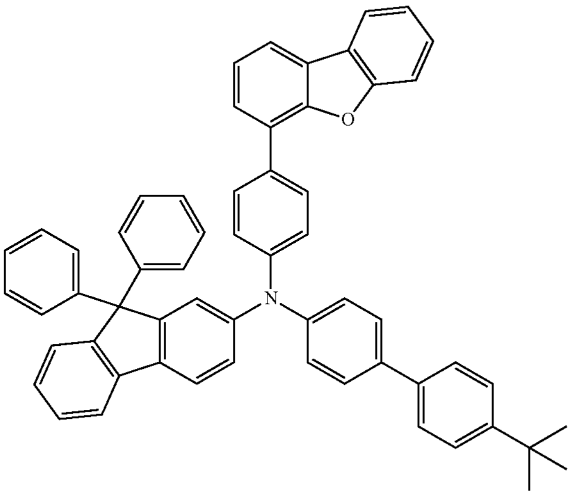
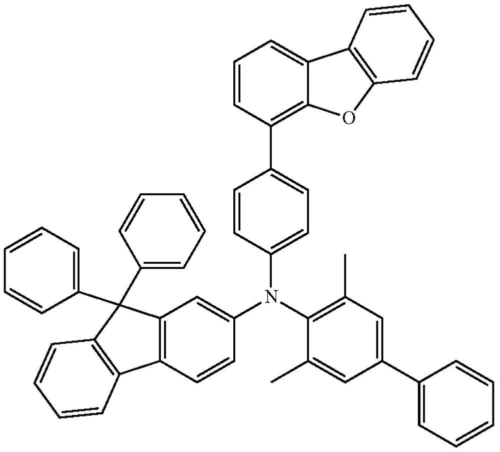
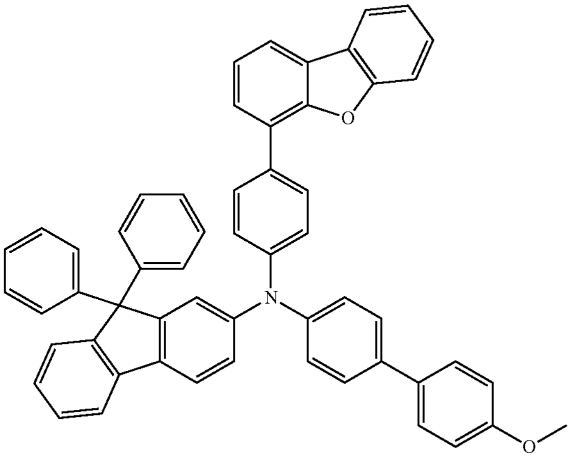
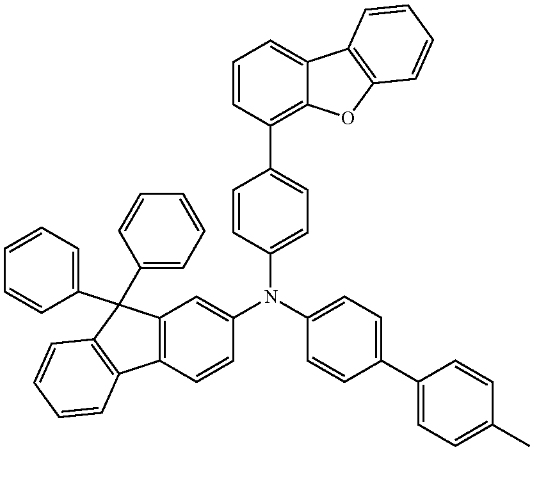
[Formula 92]
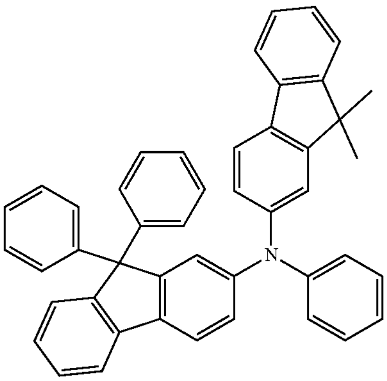

-continued
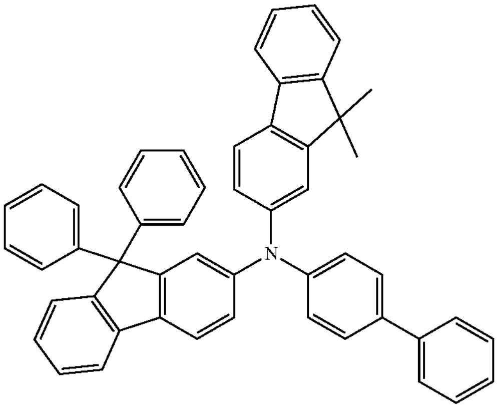
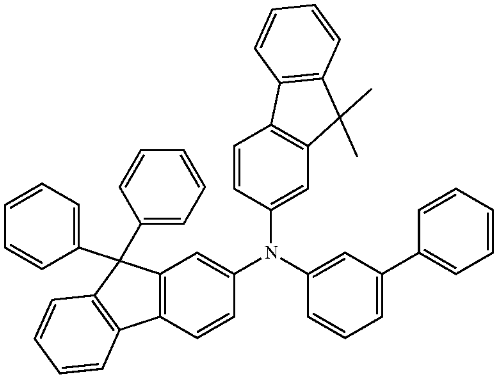
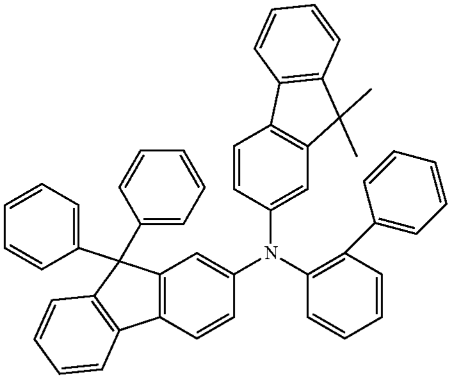
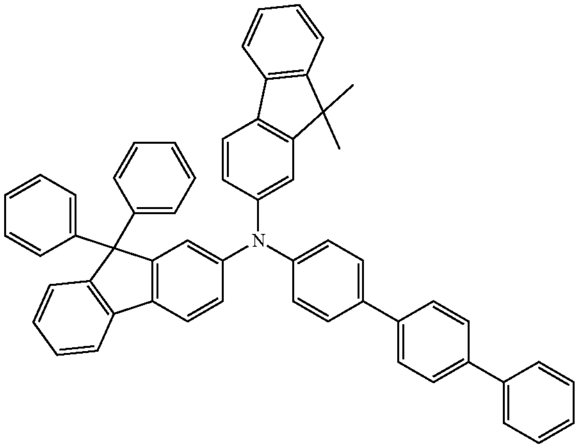
-continued
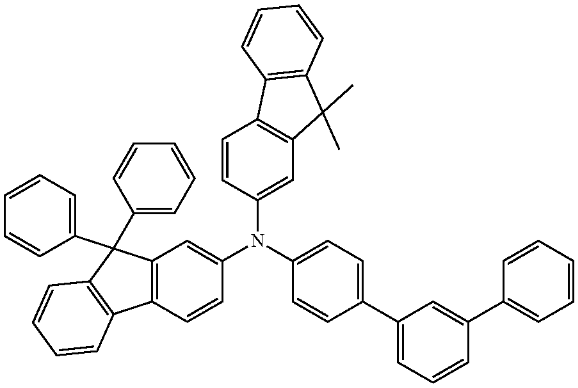
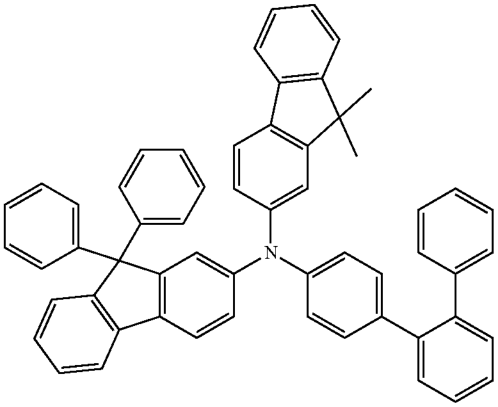
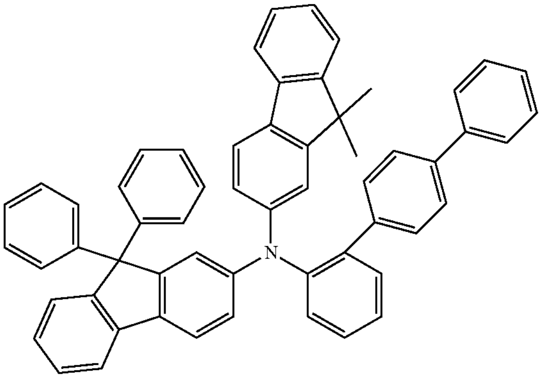
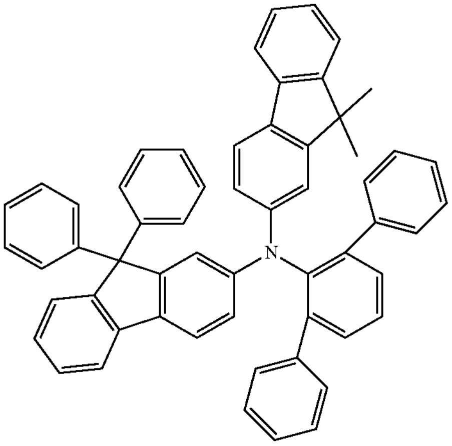

-continued
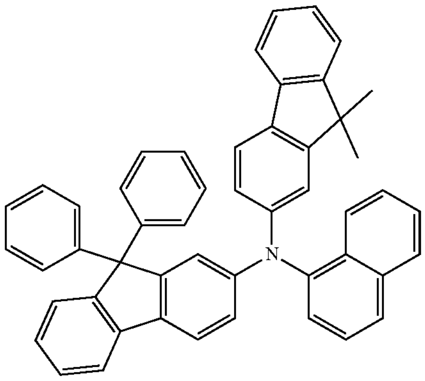
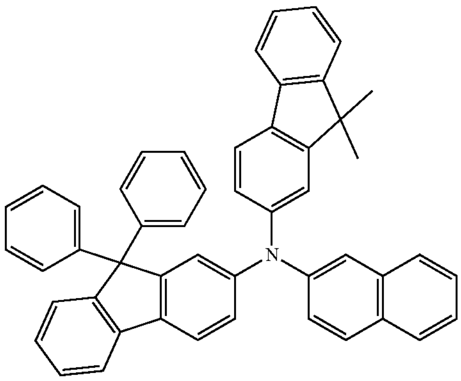
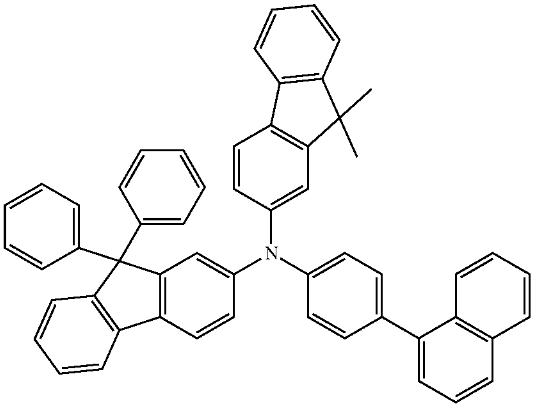
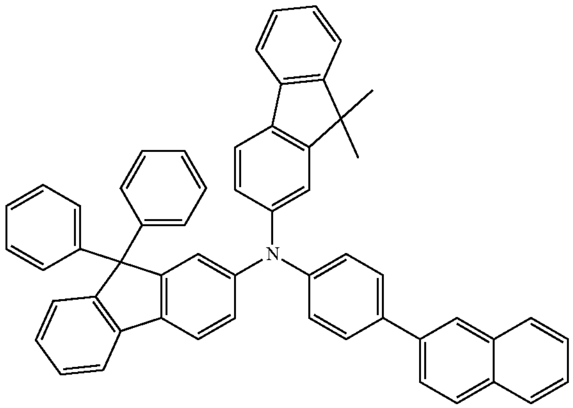
-continued
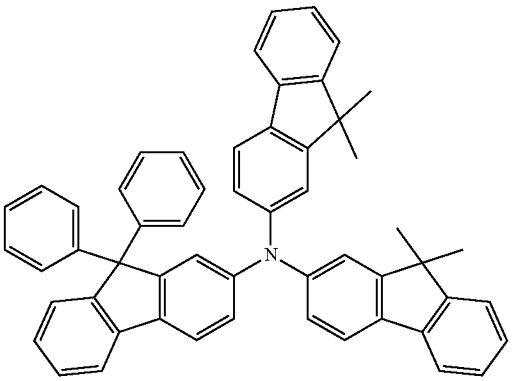
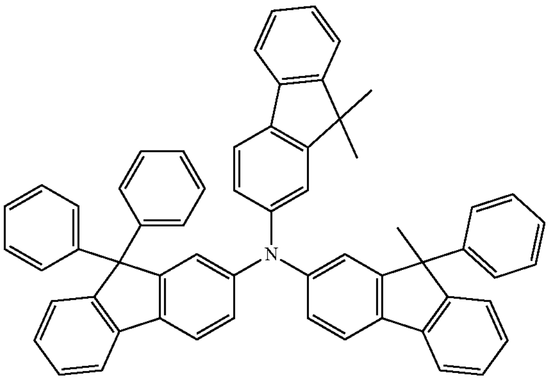
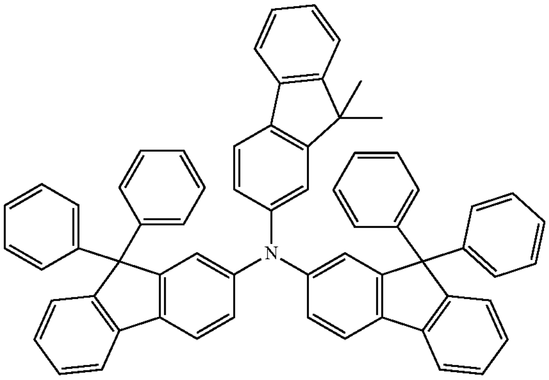
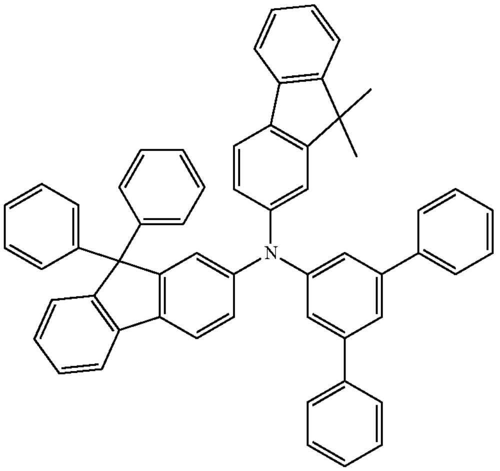

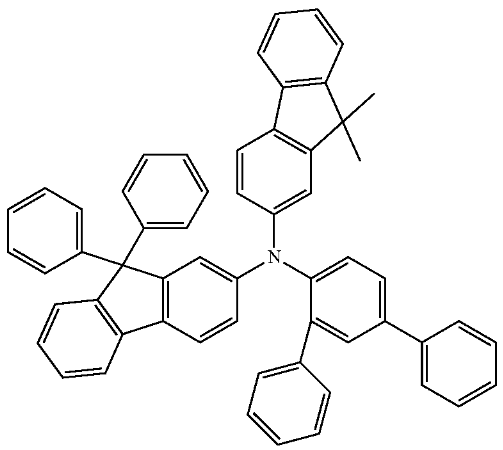
[Formula 93]
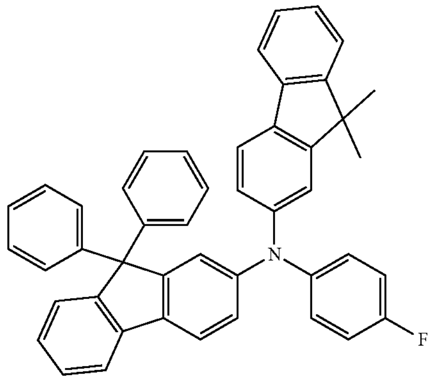
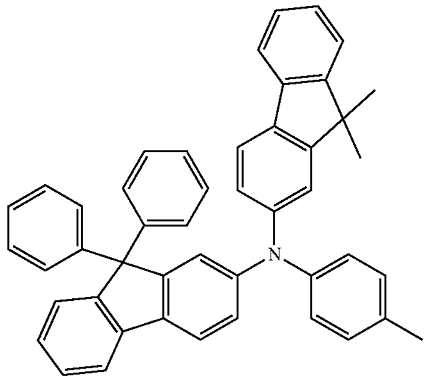
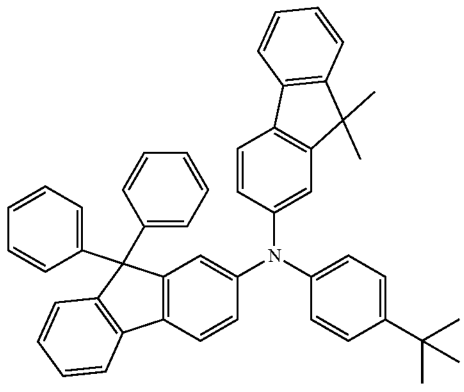
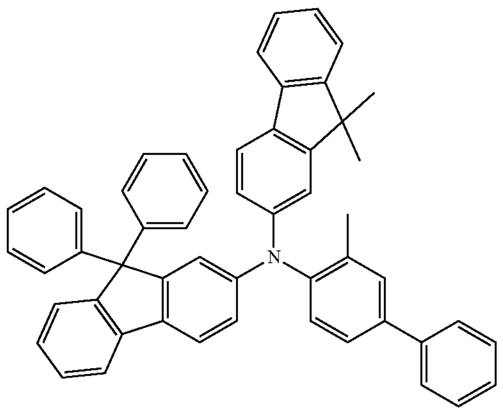
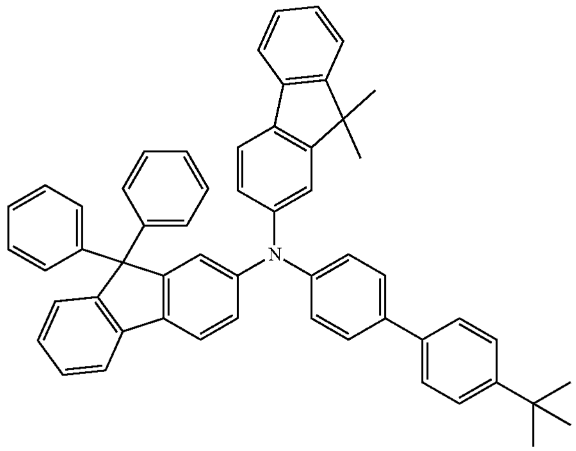
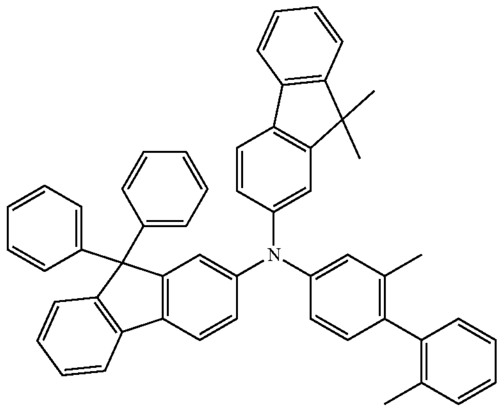
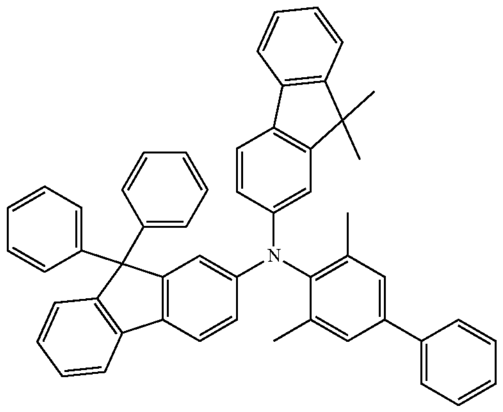

-continued
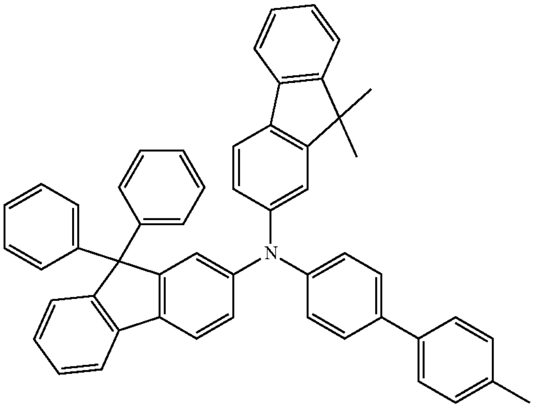
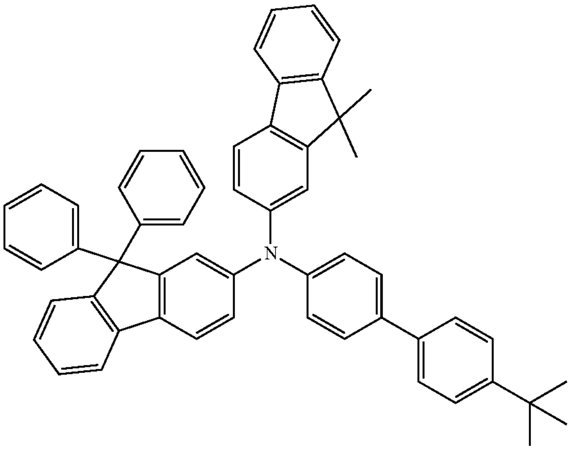
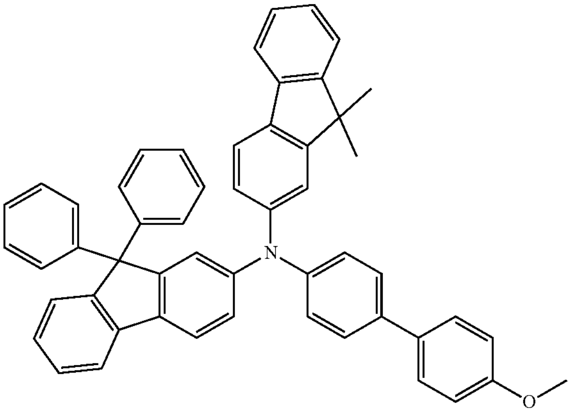
[Formula 94]
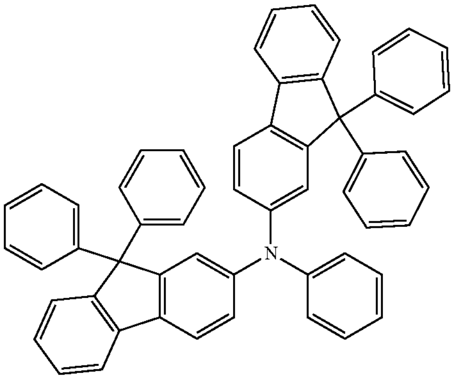
-continued
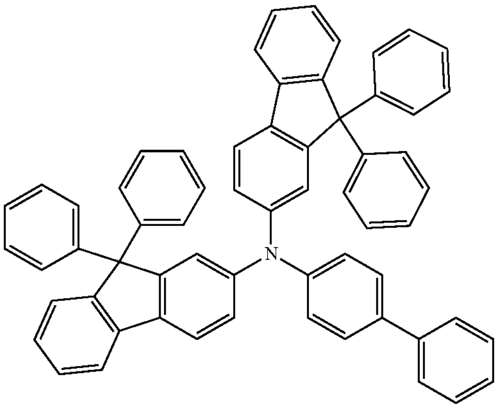
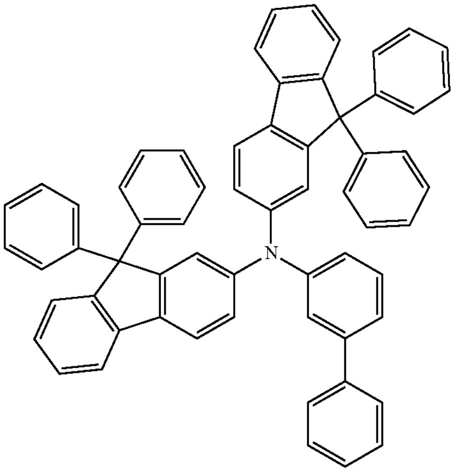
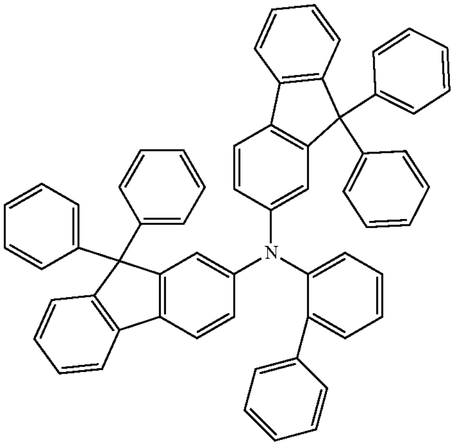

-continued
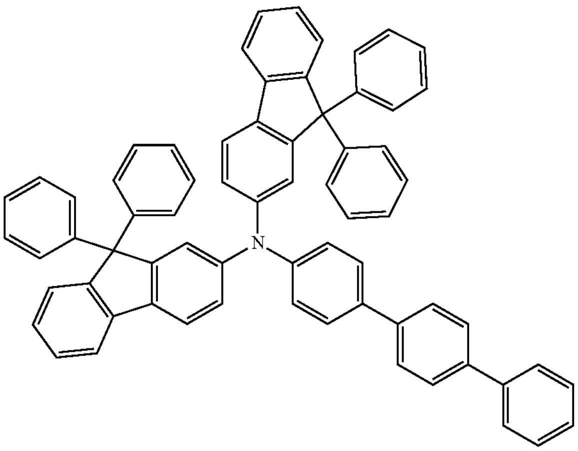
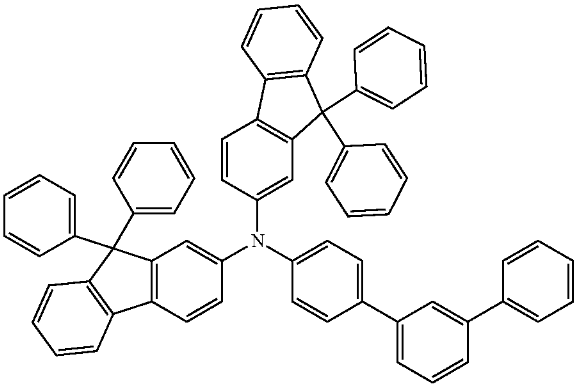
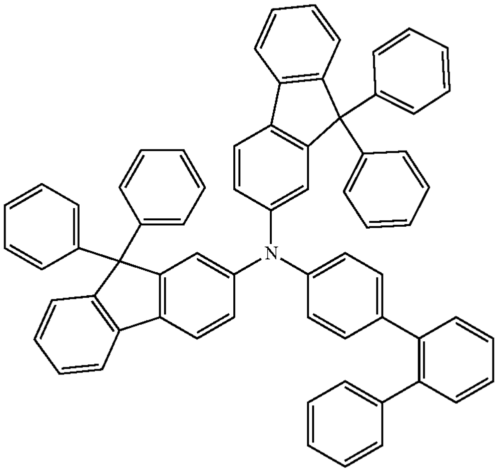
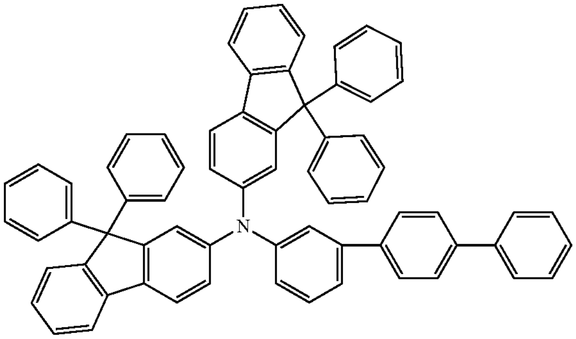
-continued
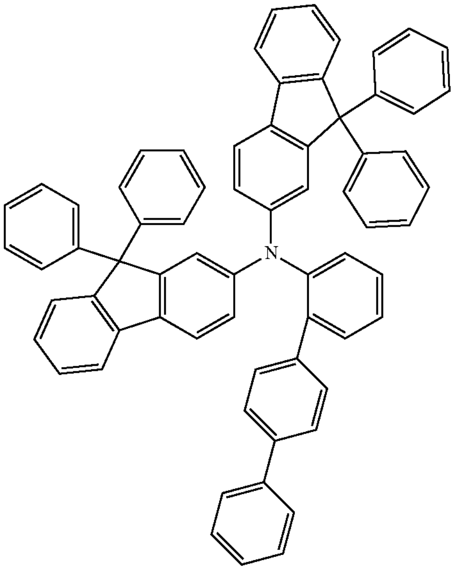
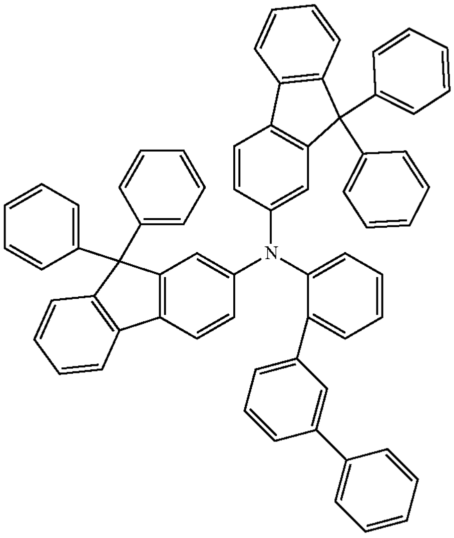
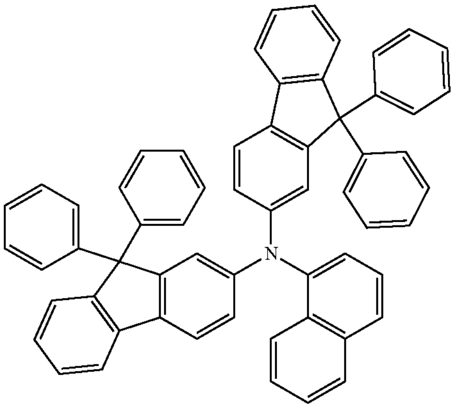

-continued
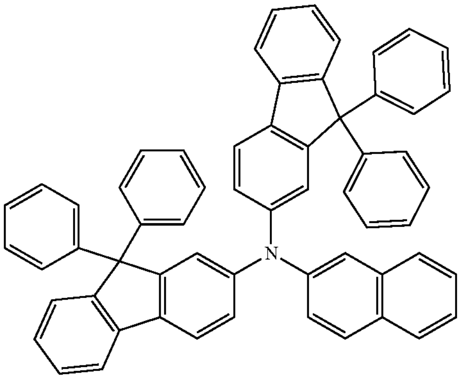
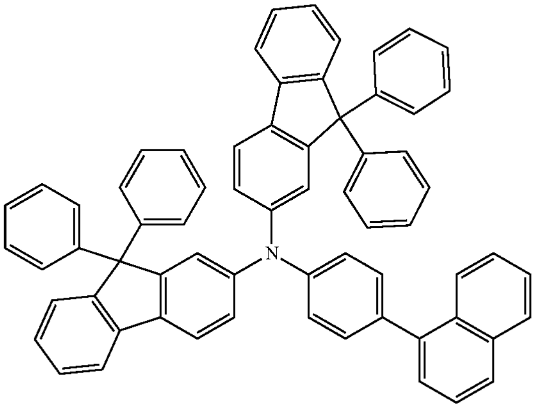
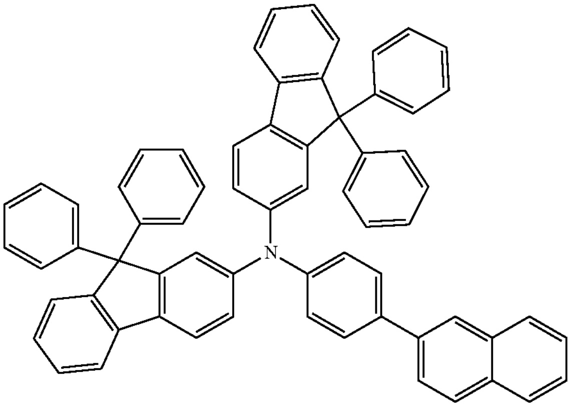
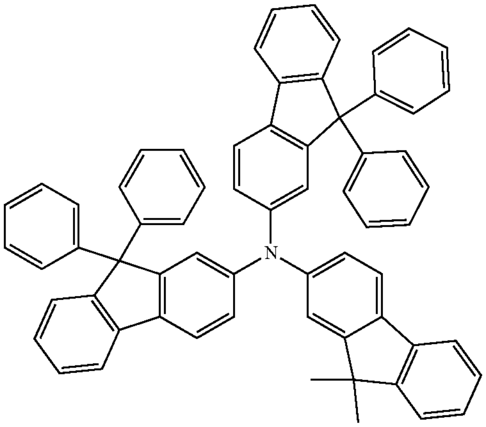
-continued
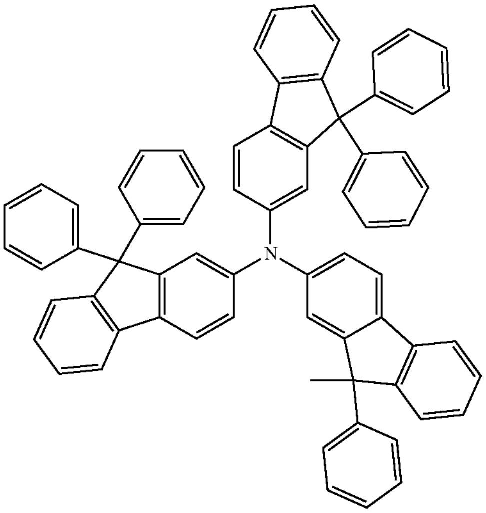
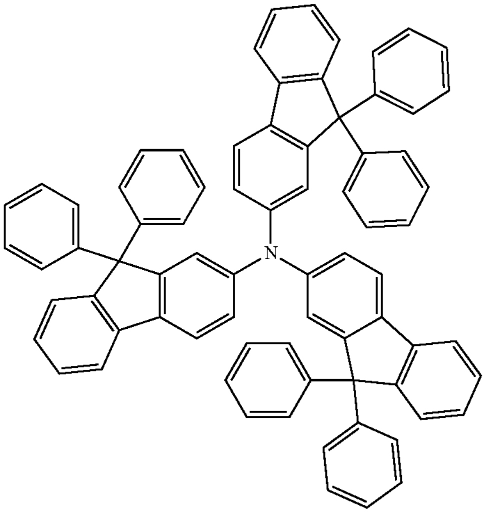
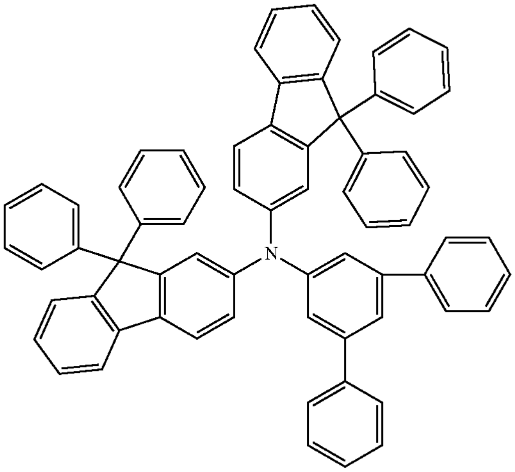

-continued
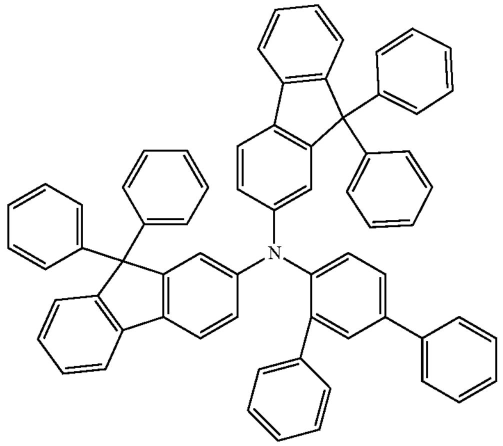 [SMILES: c1ccc(-c2ccc(N(c3ccc4c(c3)C(c3ccccc3)(c3ccccc3)c3ccccc3-4)c3ccc4c(c3)C(c3ccccc3)(c3ccccc3)c3ccccc3-4)c(-c3ccccc3)c2)cc1]
[Formula 95]
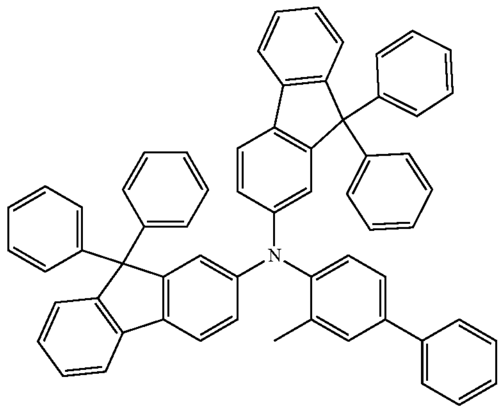
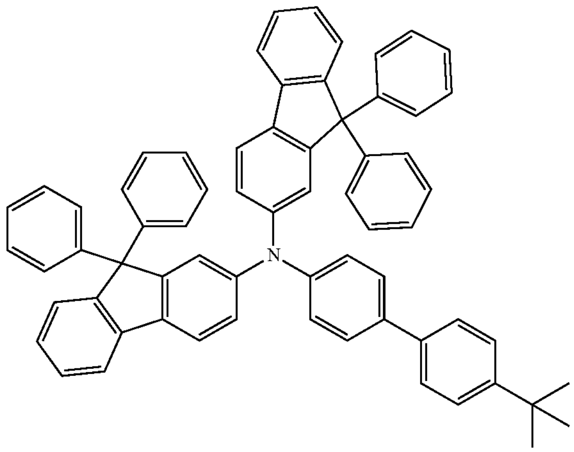
-continued
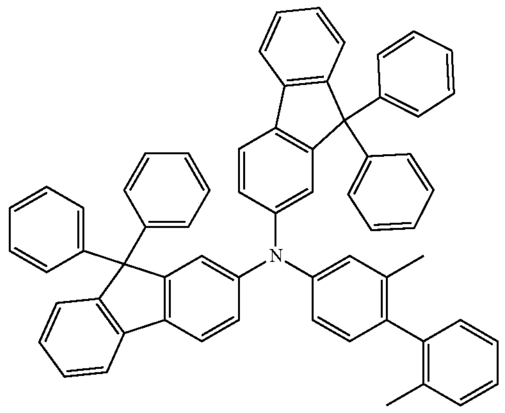
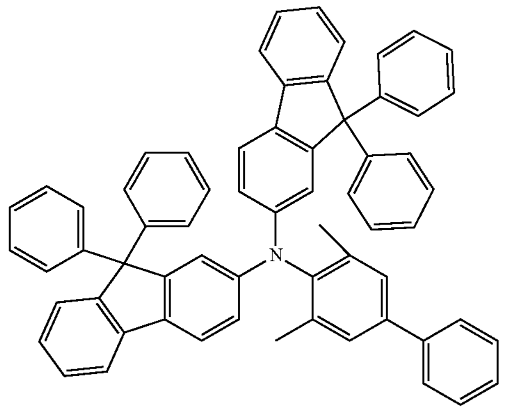
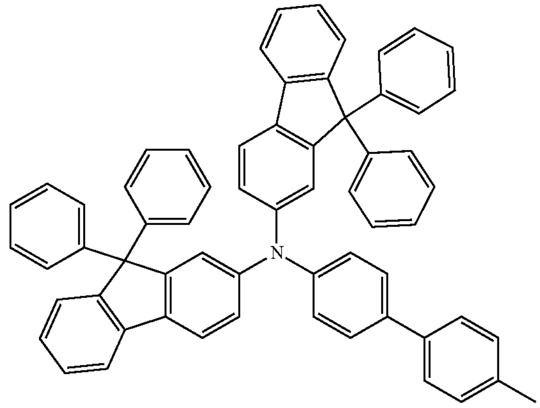
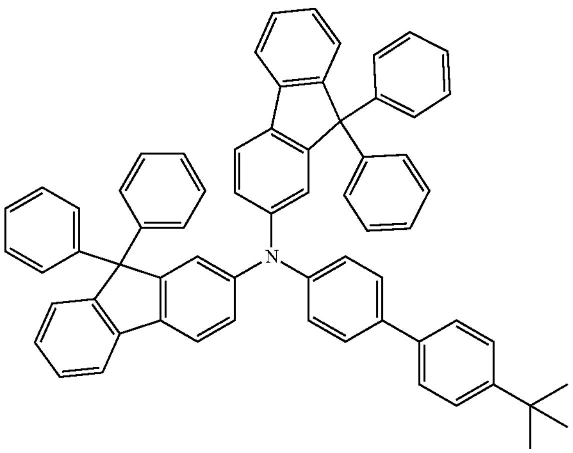

-continued
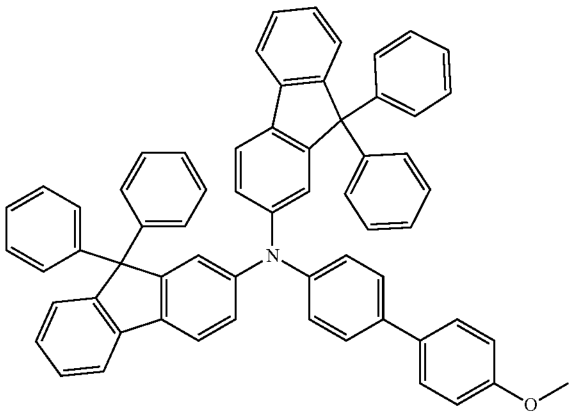
[Formula 96]
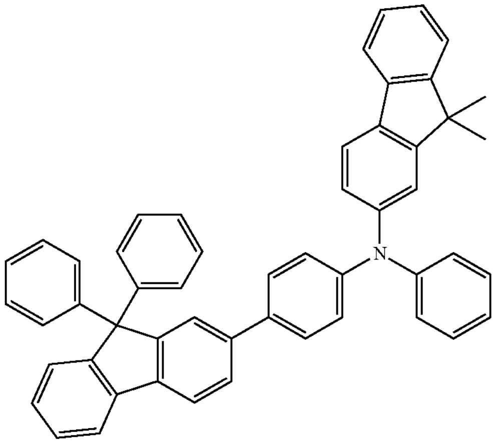
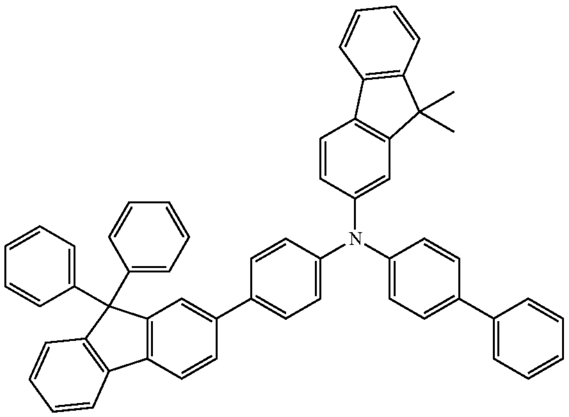
-continued
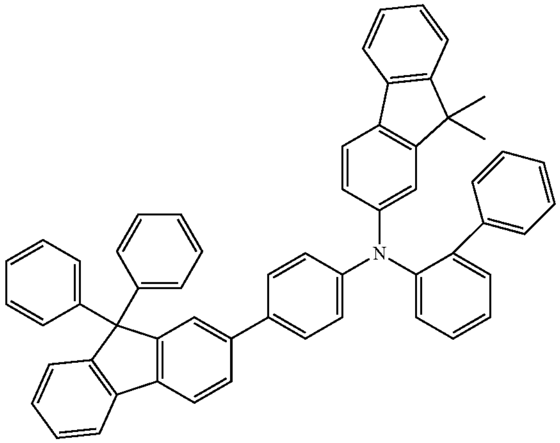
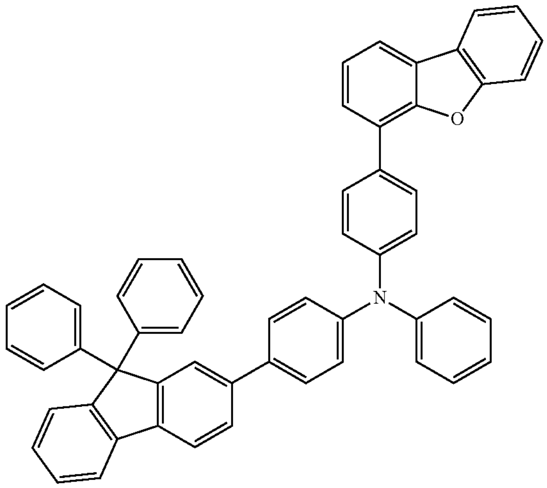
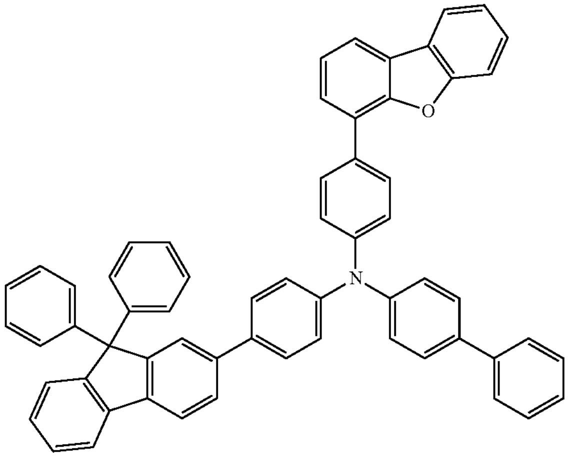

-continued
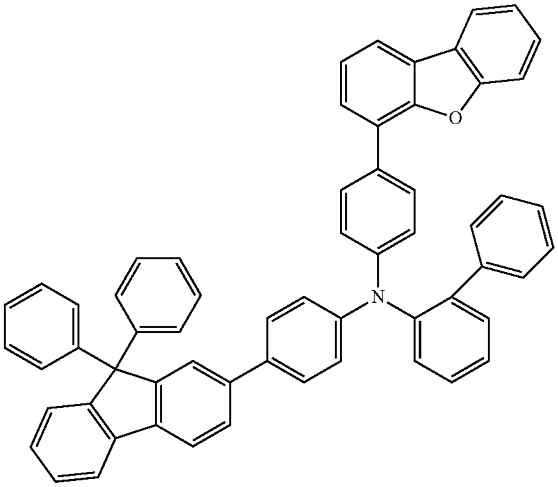
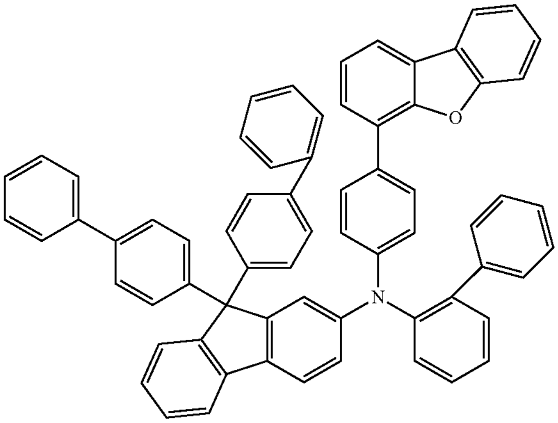
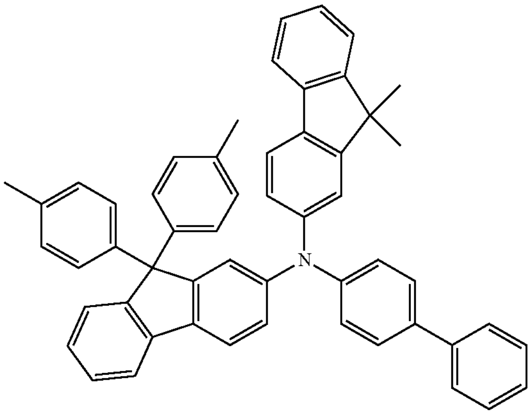
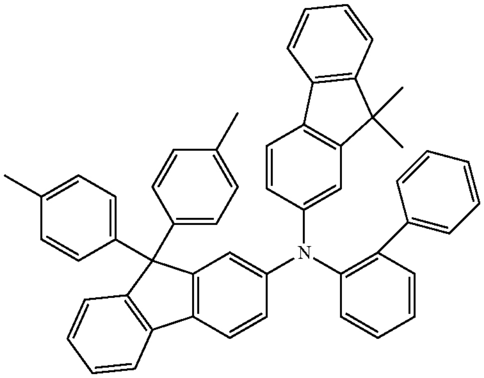
-continued
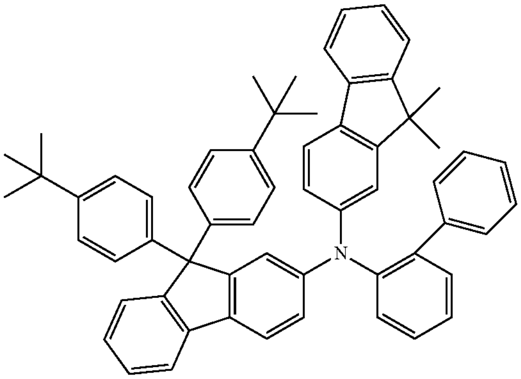
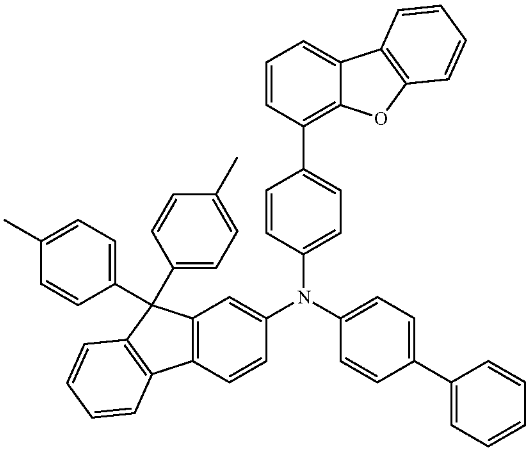
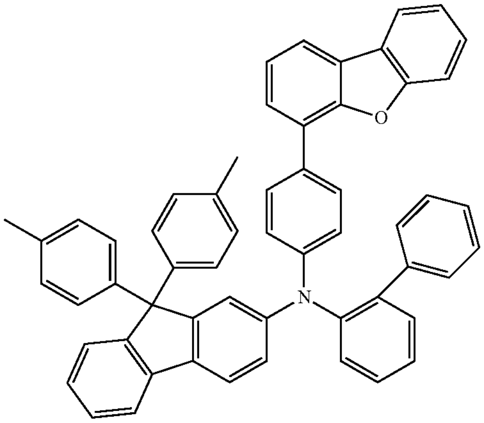
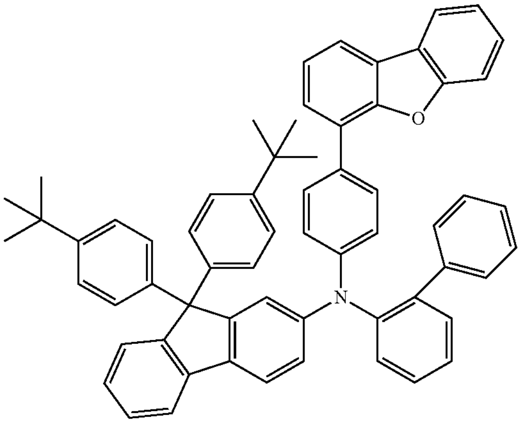

-continued
[Formula 97]
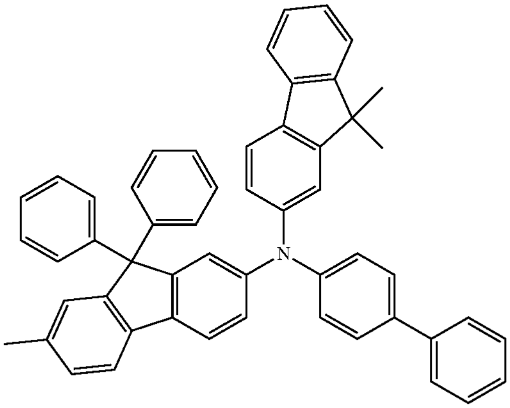
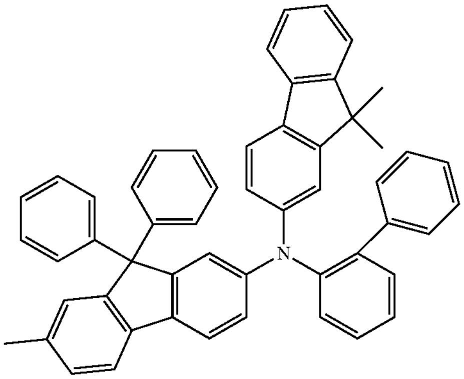
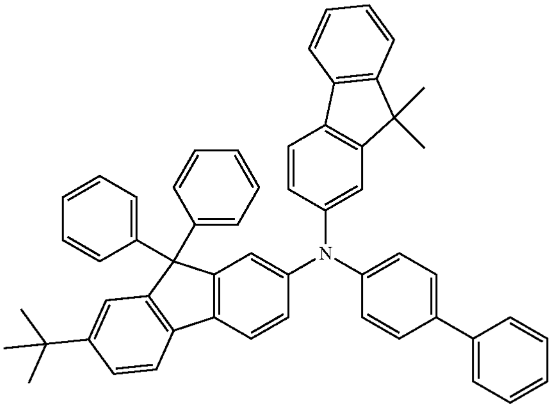
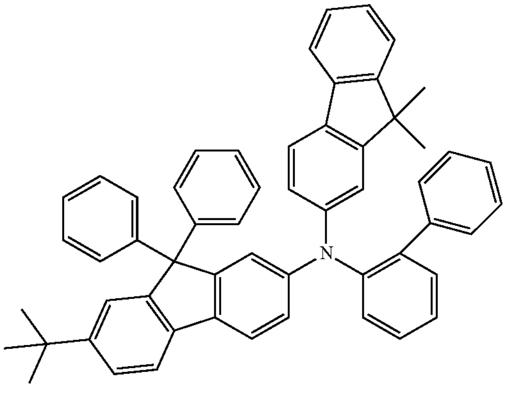
-continued
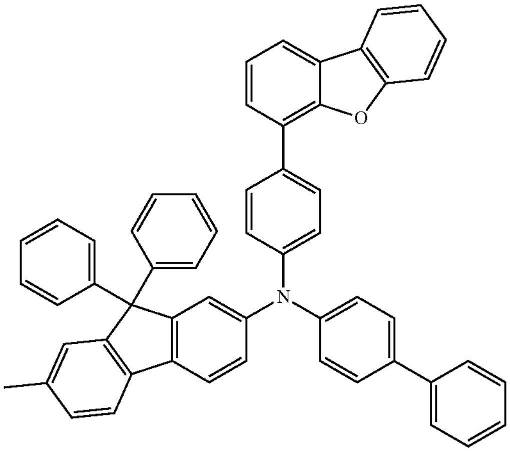
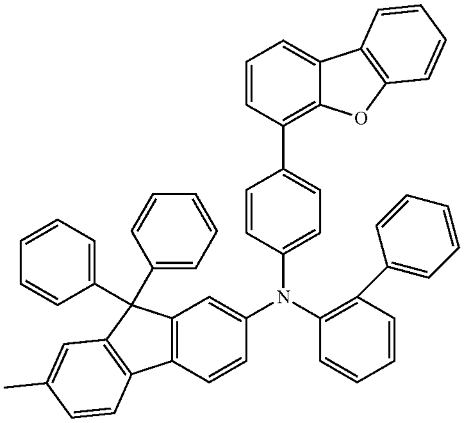
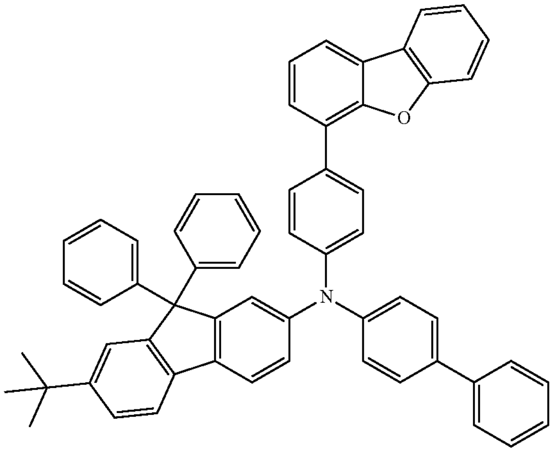

-continued
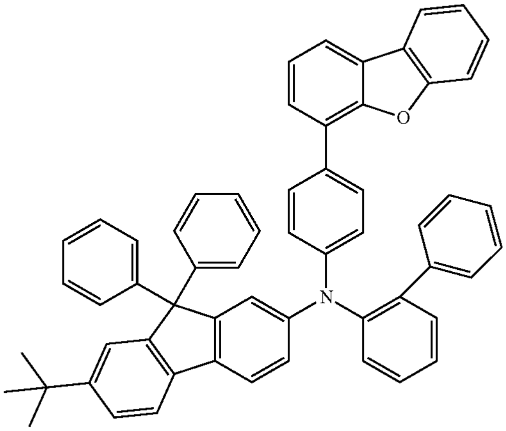
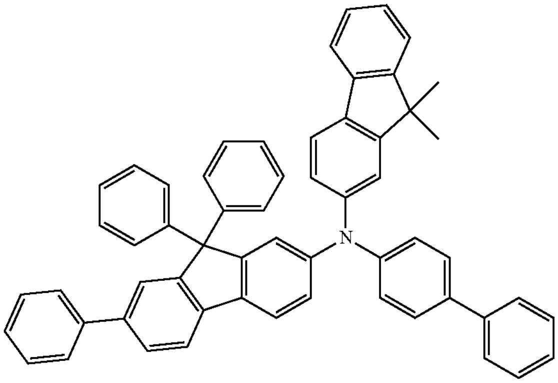
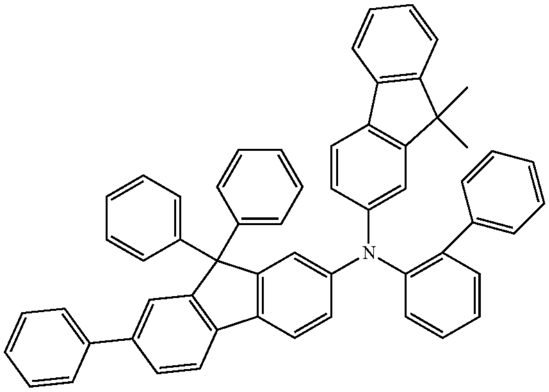
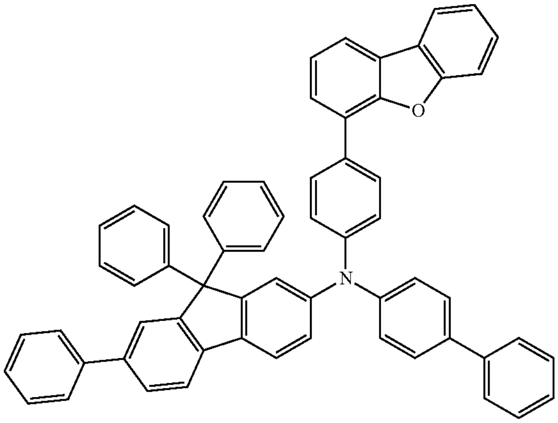
-continued
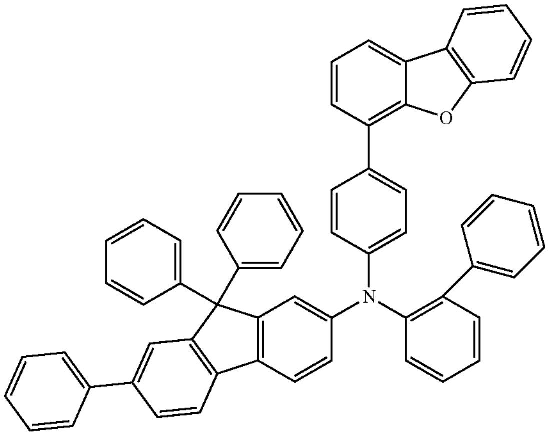
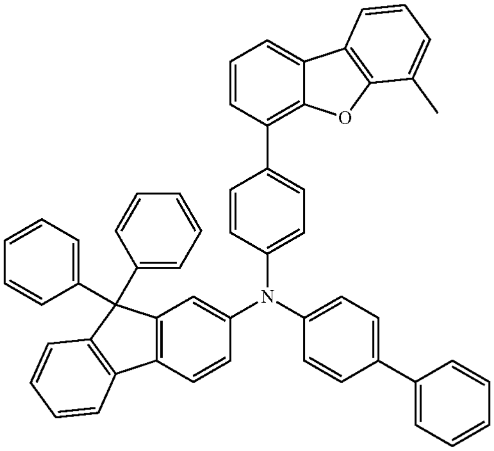
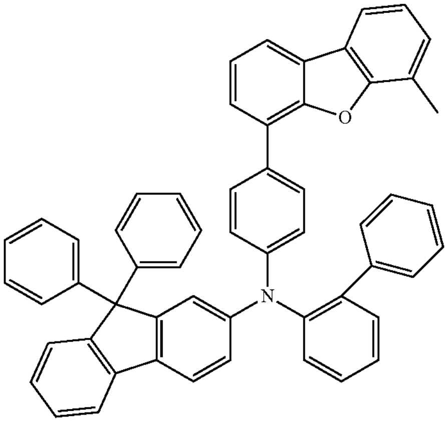

-continued
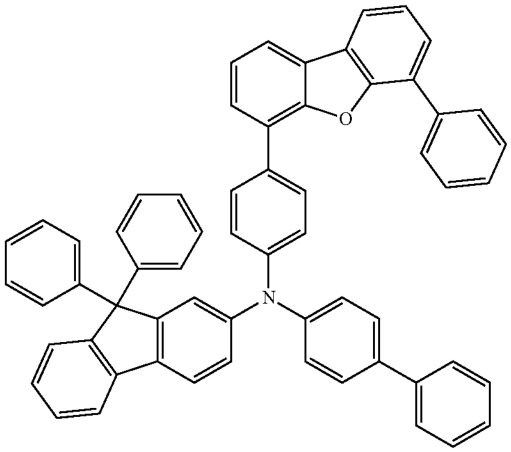
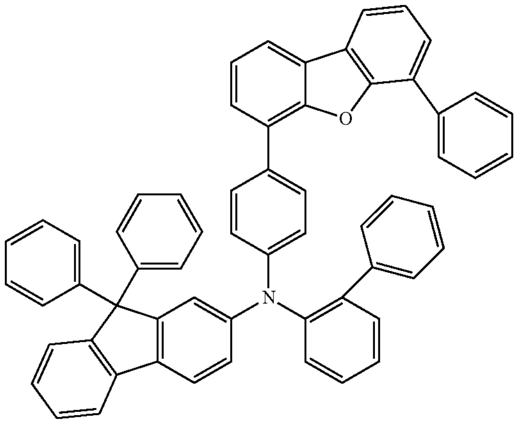
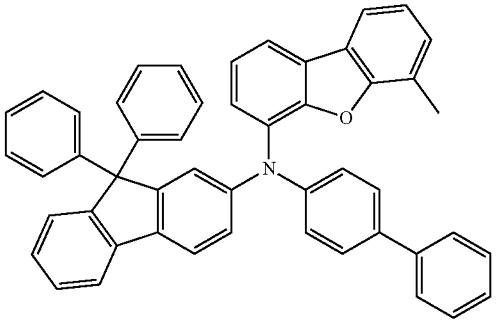
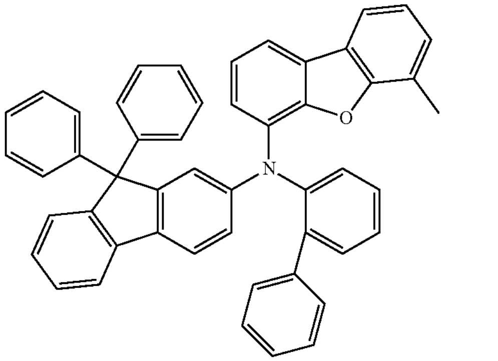
-continued
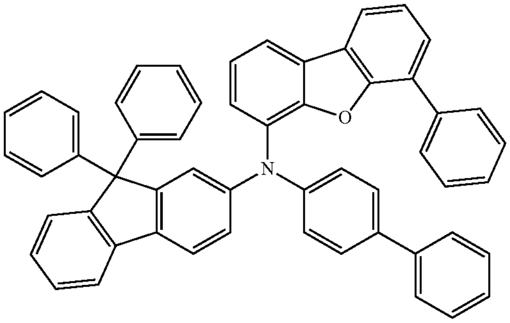
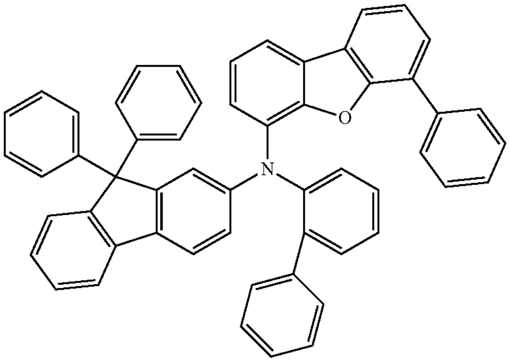
[Formula 98]
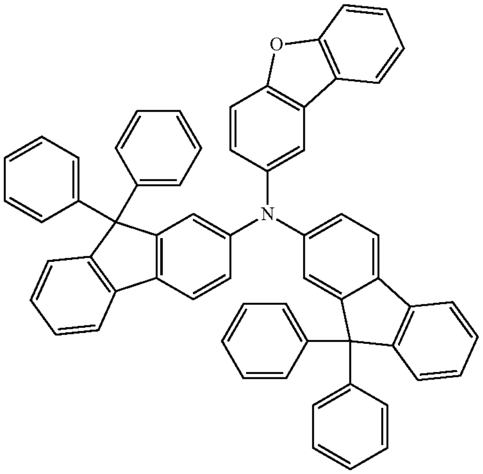
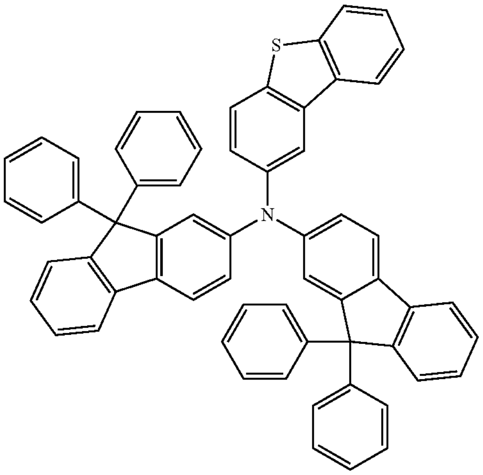

-continued
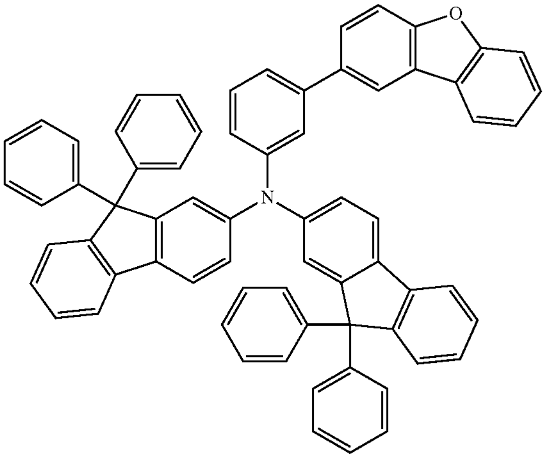
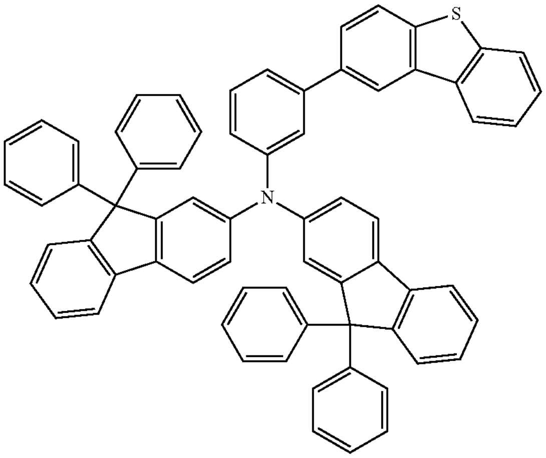
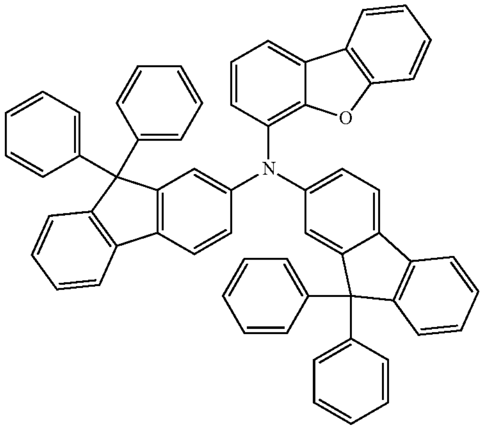
-continued
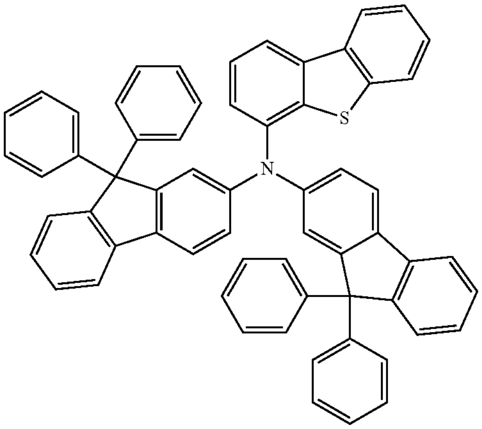
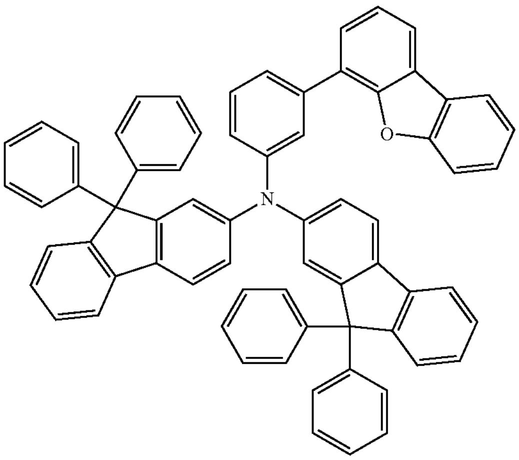
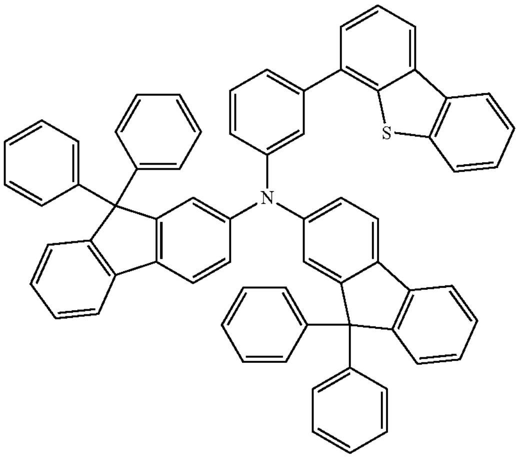

-continued
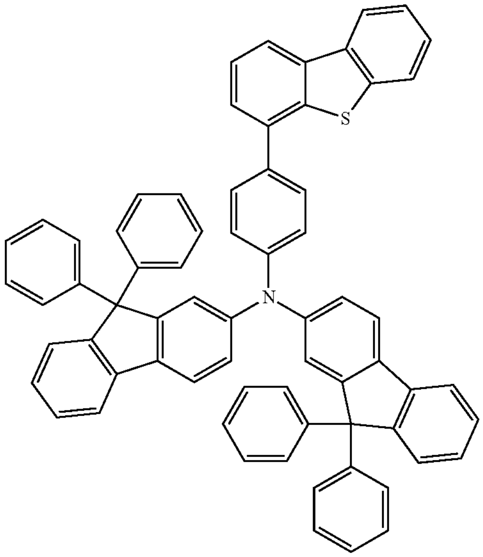
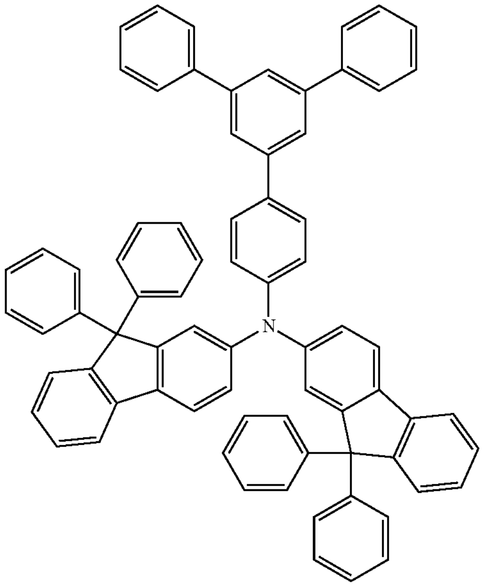
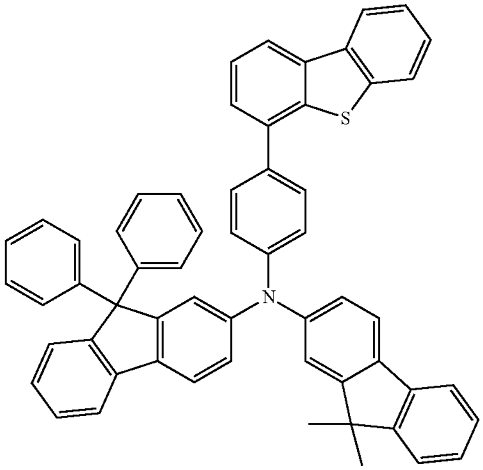
-continued
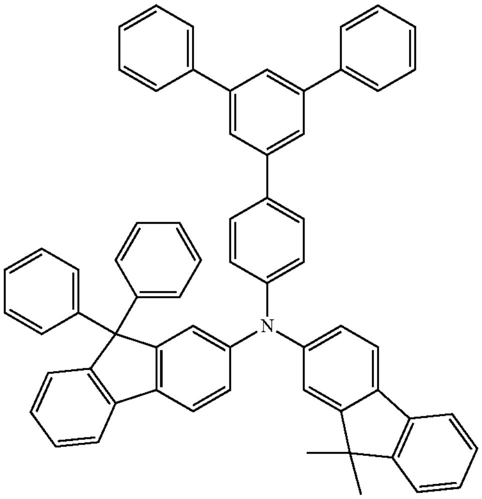
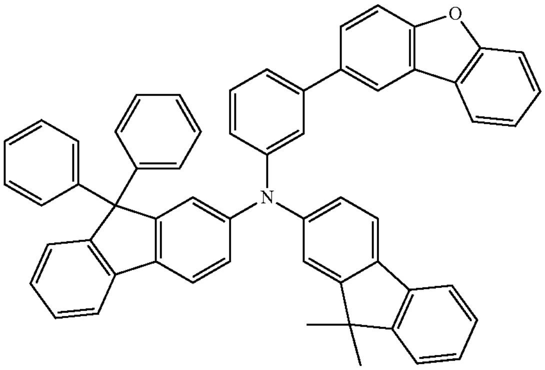
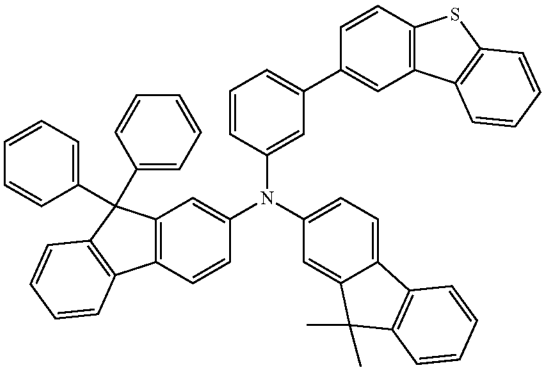
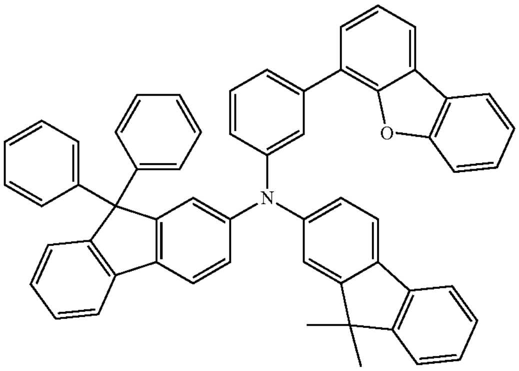

-continued
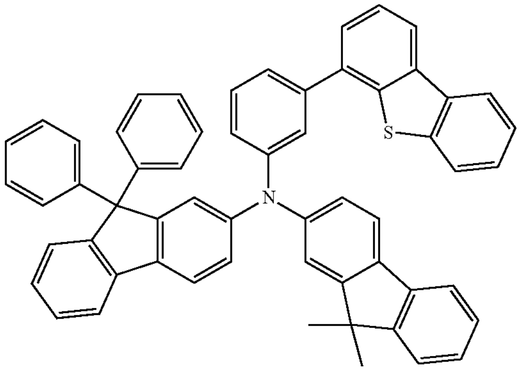
[Formula 99]
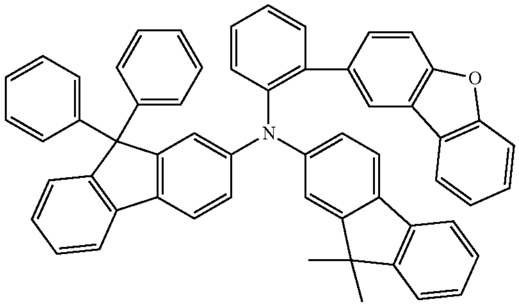
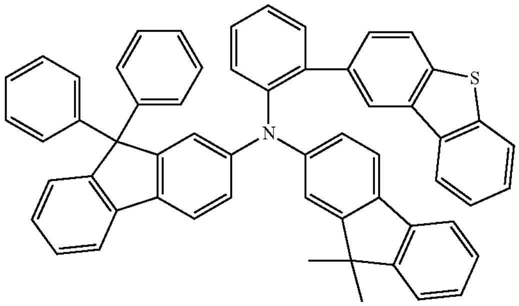
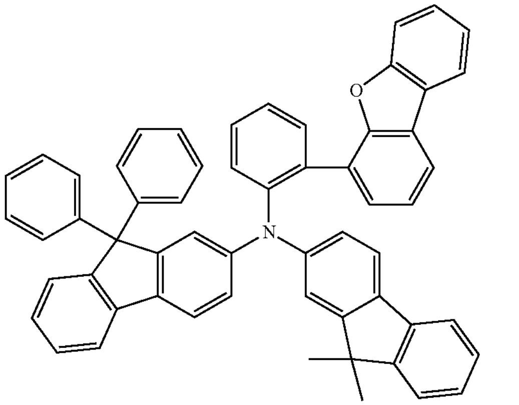
-continued
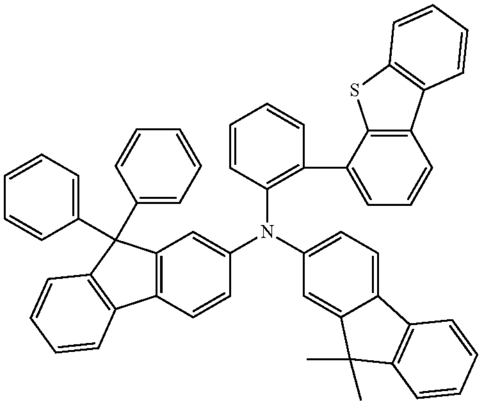
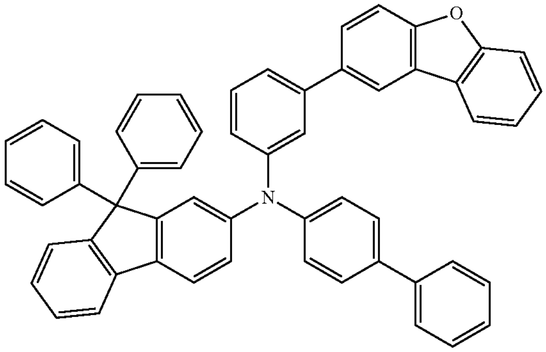
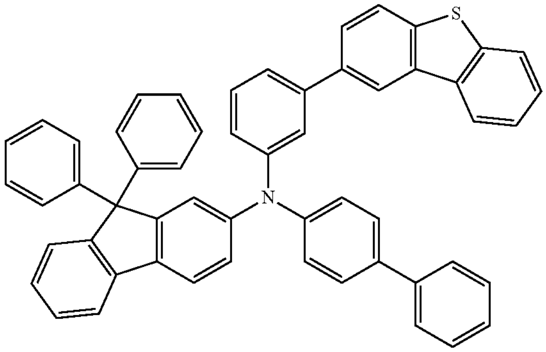
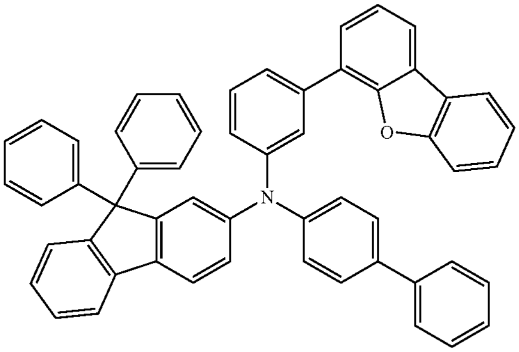

-continued
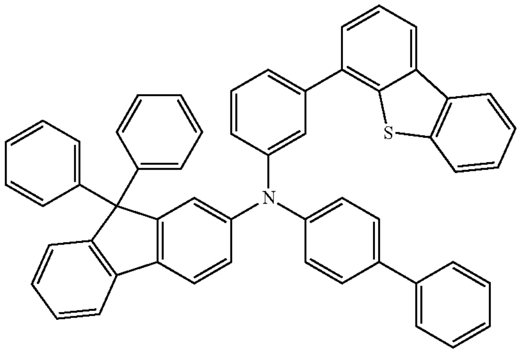
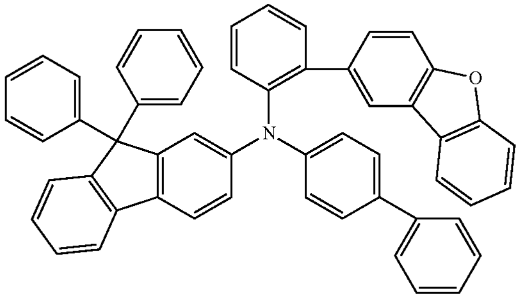
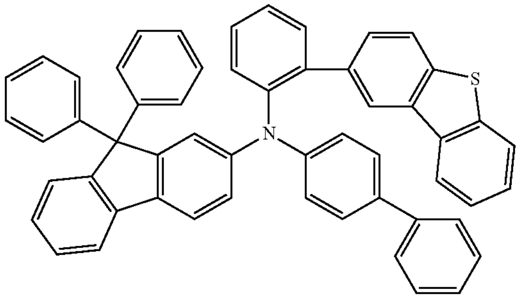
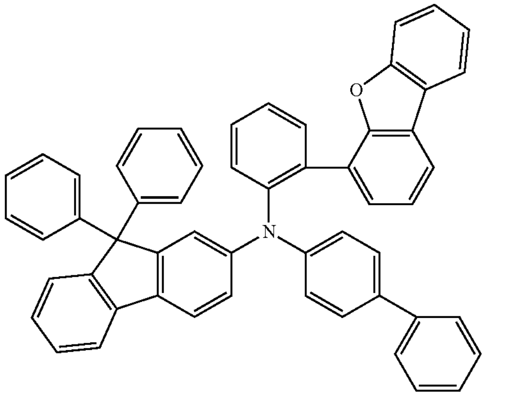
-continued
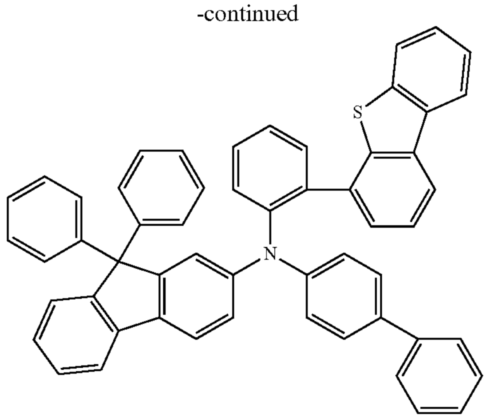
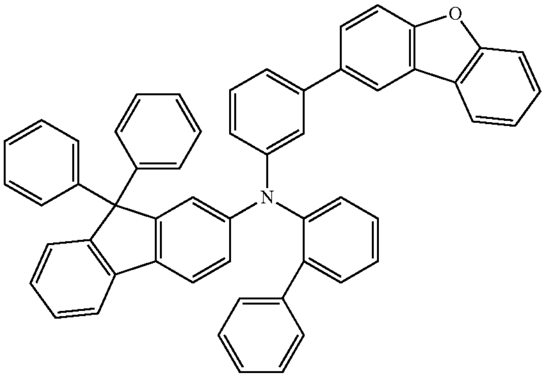
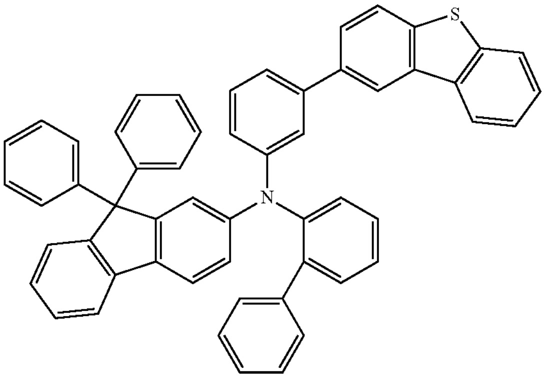
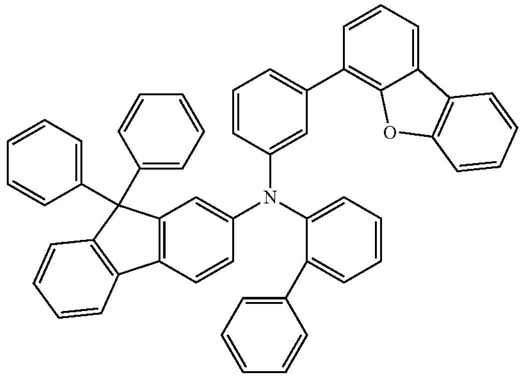

-continued
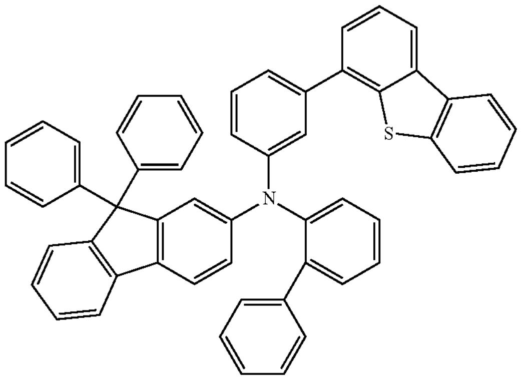
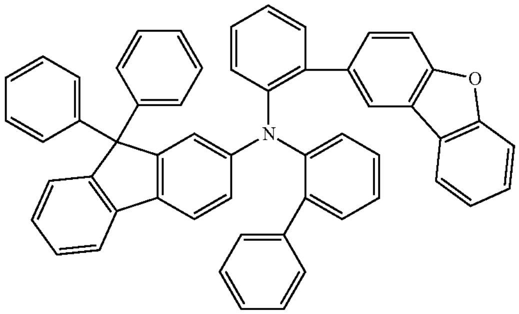
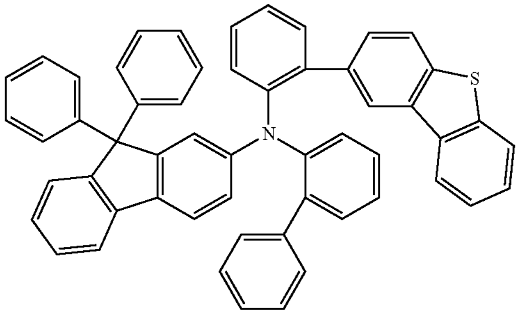
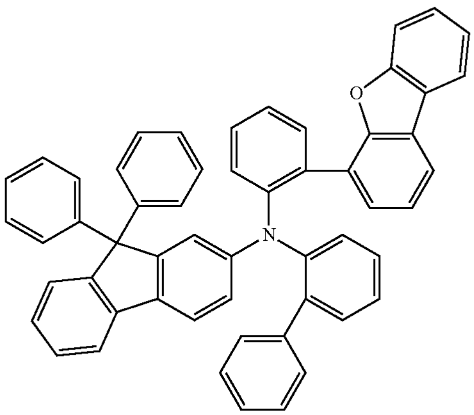
-continued
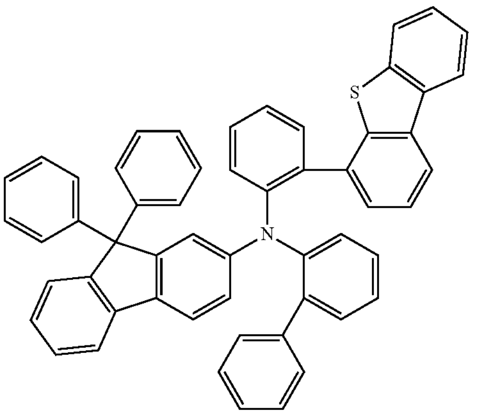
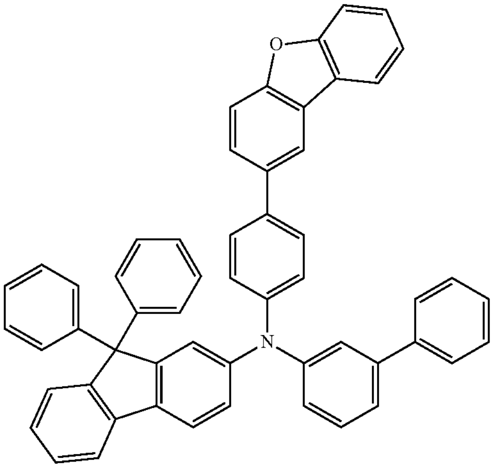
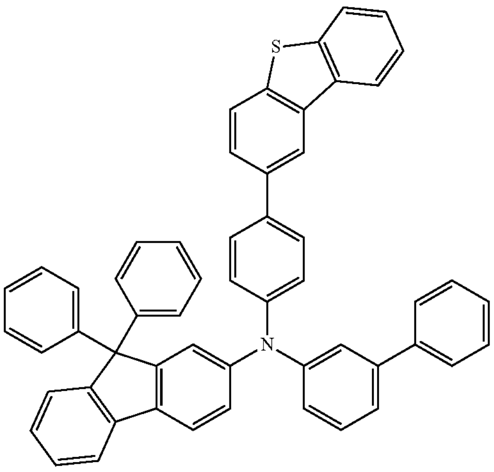

-continued
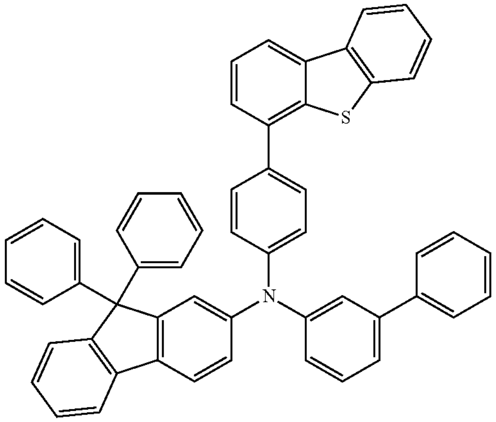
[Formula 100]
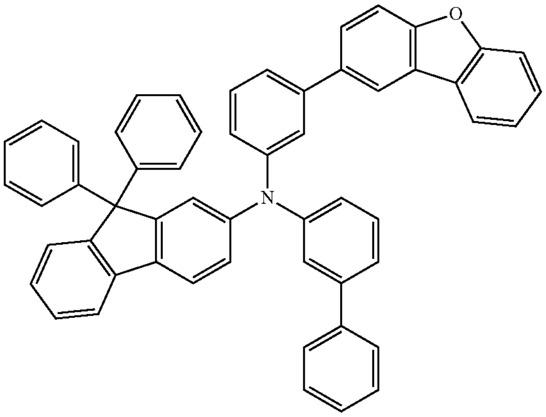
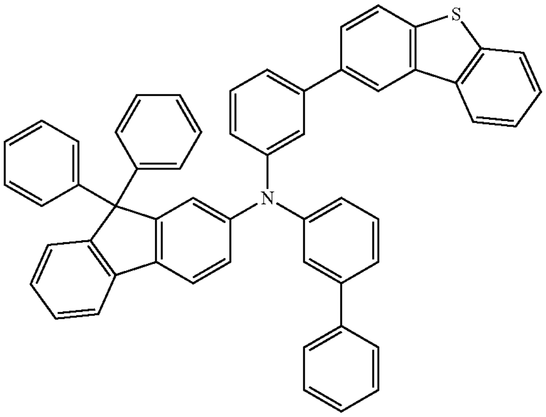
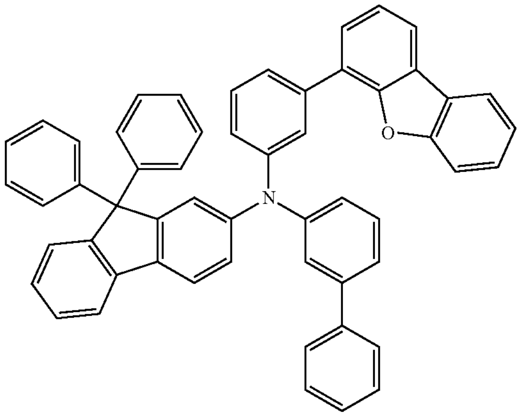
-continued
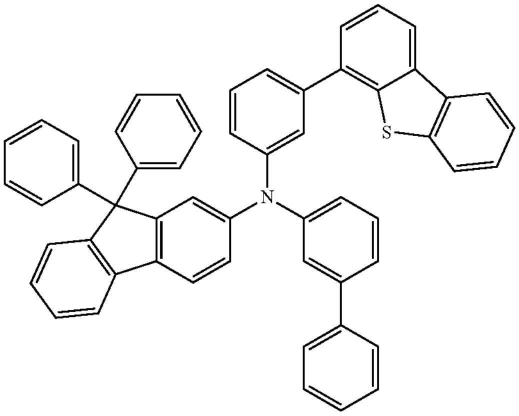
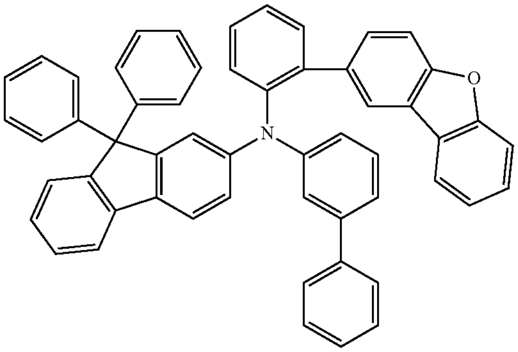
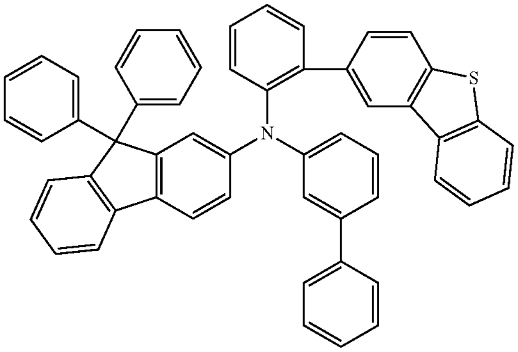
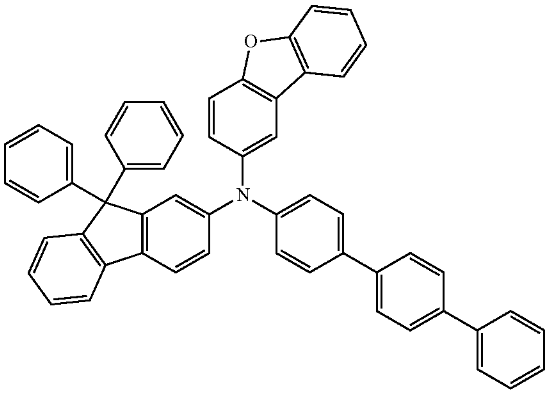

-continued
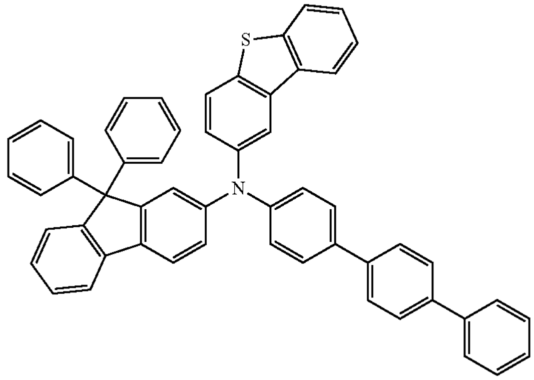
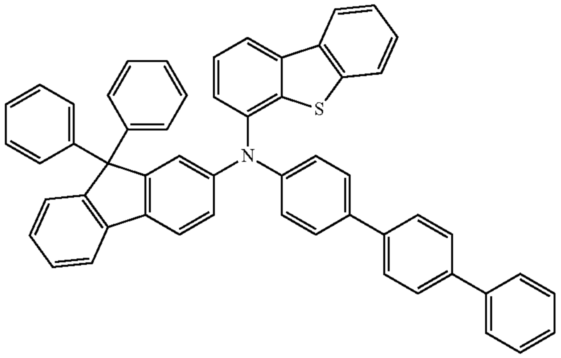
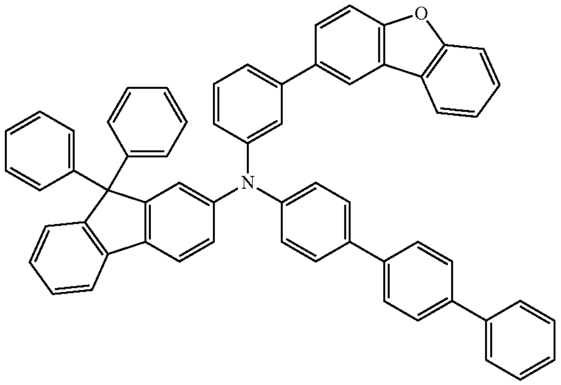
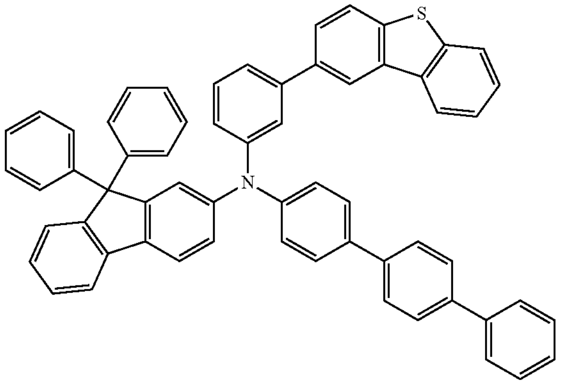
-continued
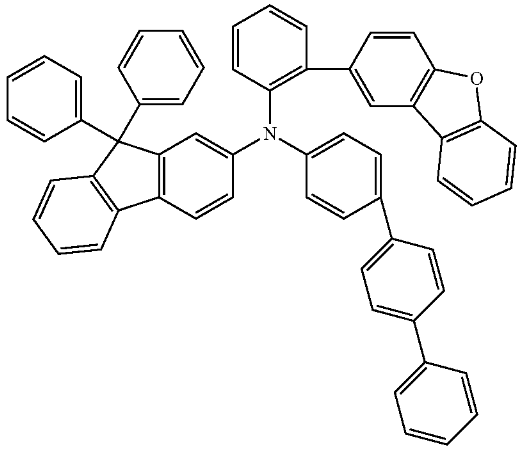
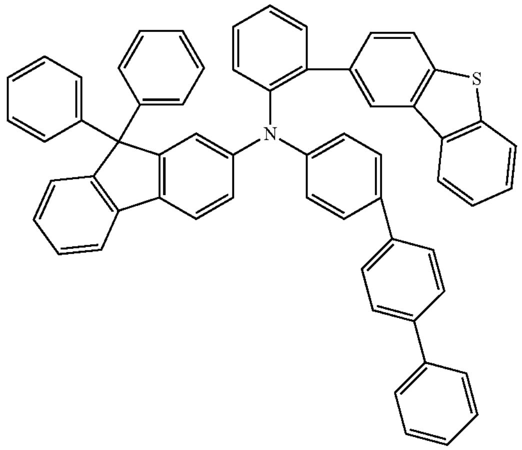
[Formula 101]
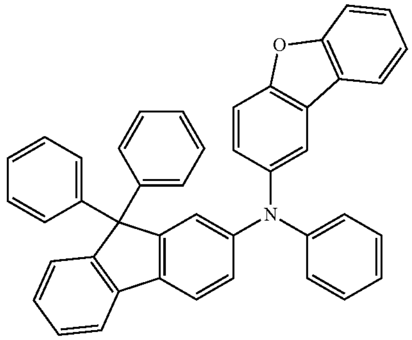
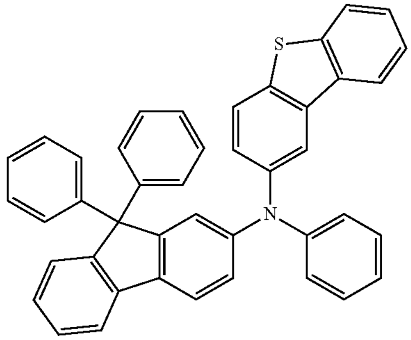

-continued
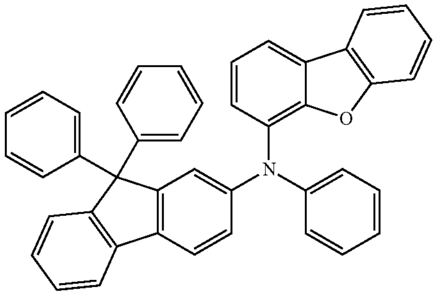
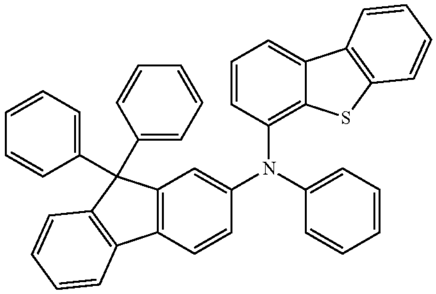
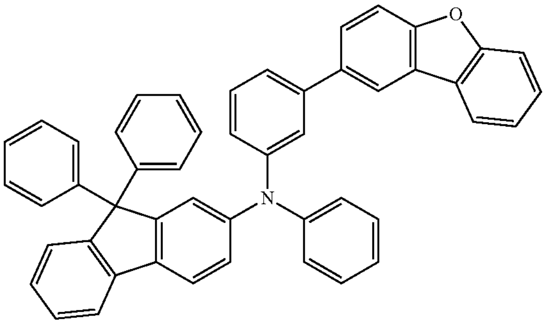
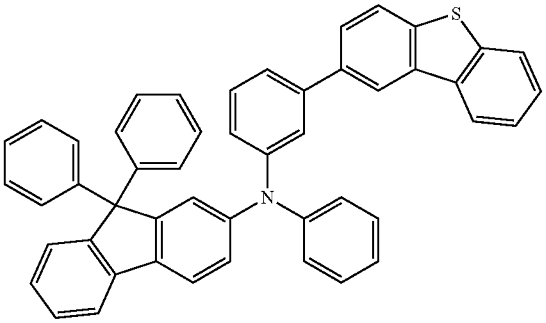
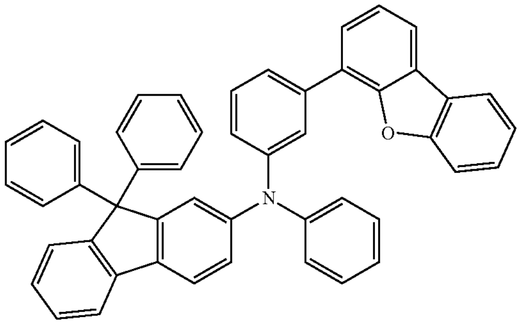
-continued
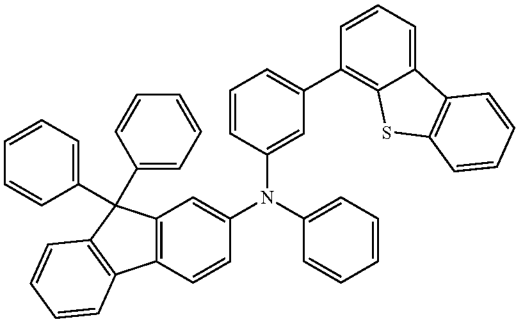
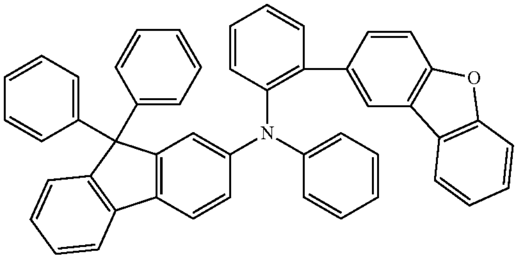
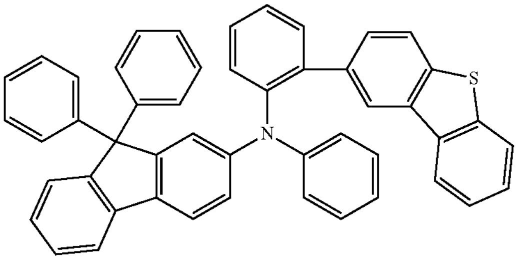
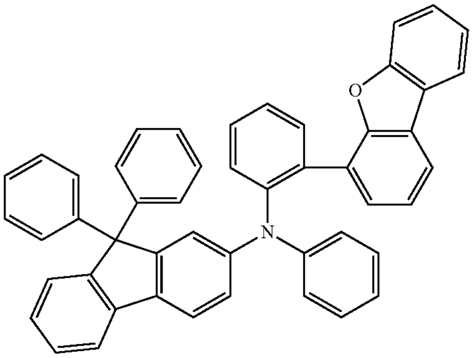
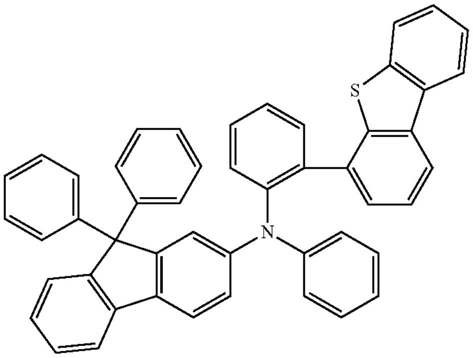

-continued
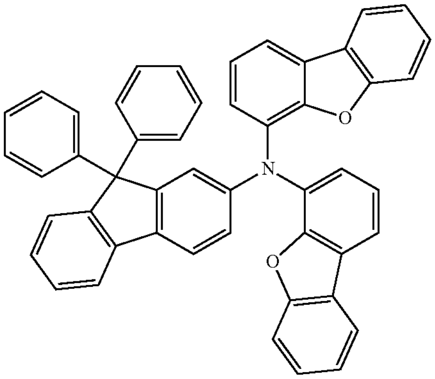
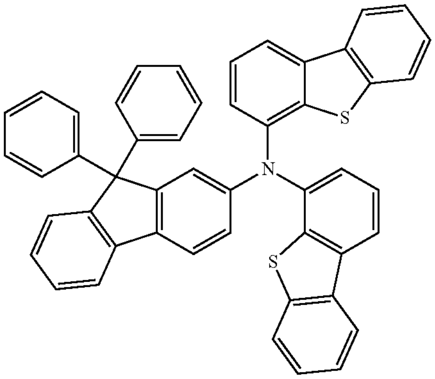
[Formula 102]
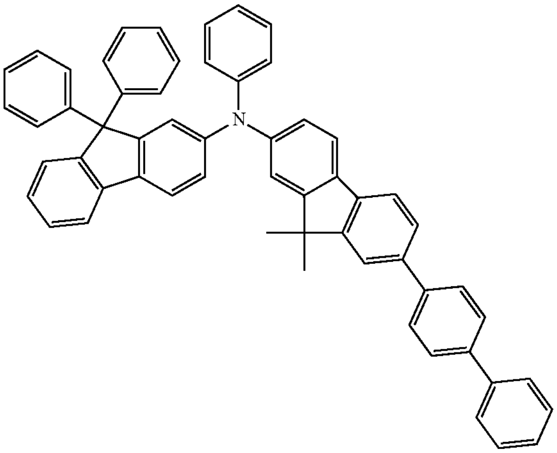
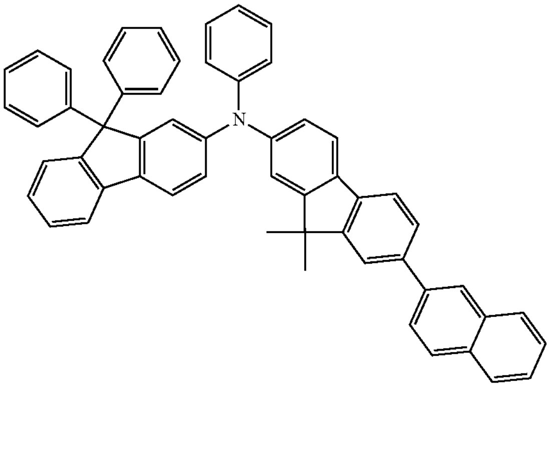
-continued
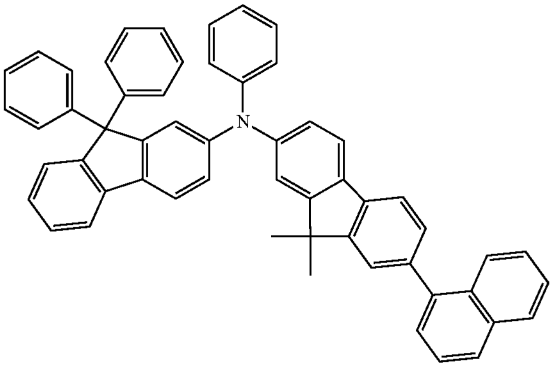
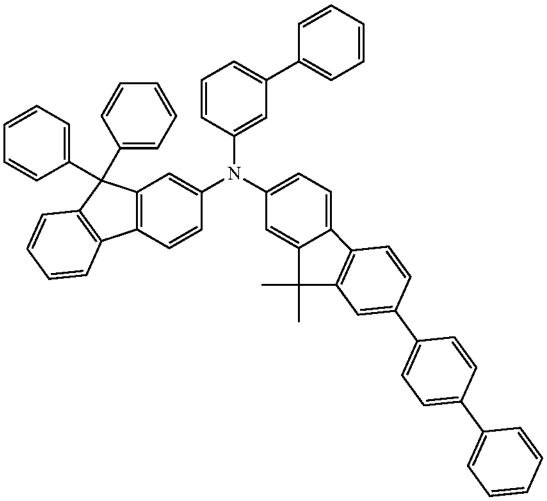
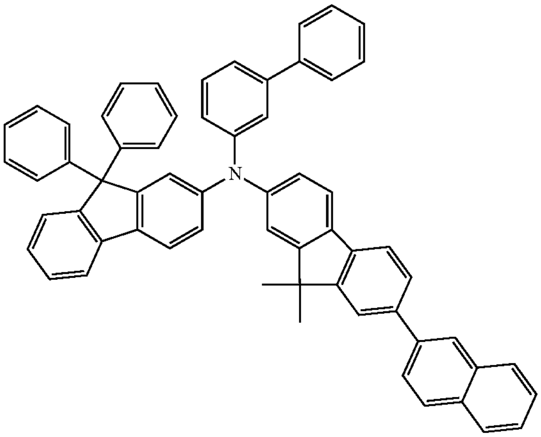
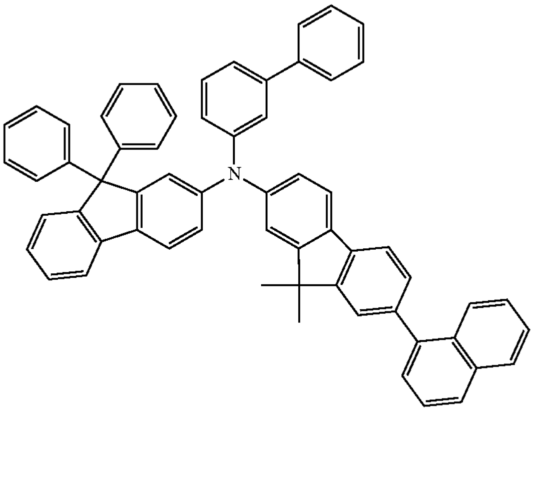

-continued
-continued
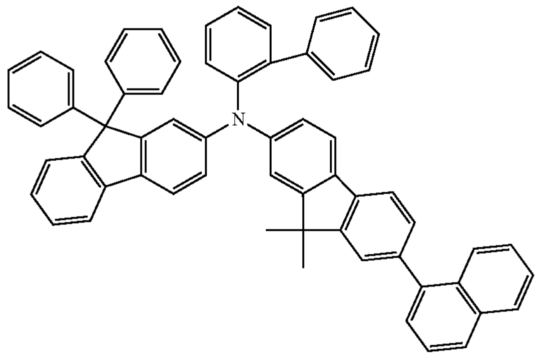
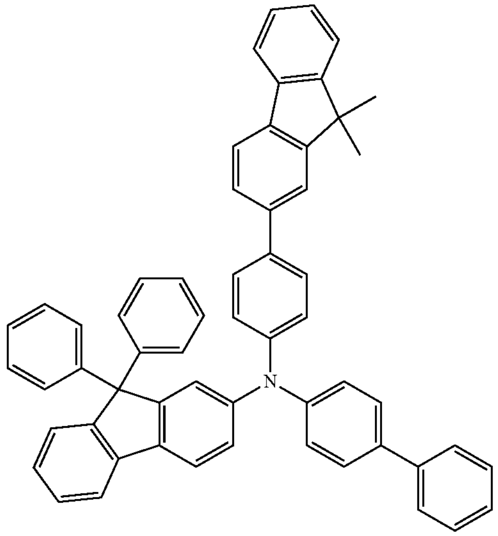
[Formula 103]
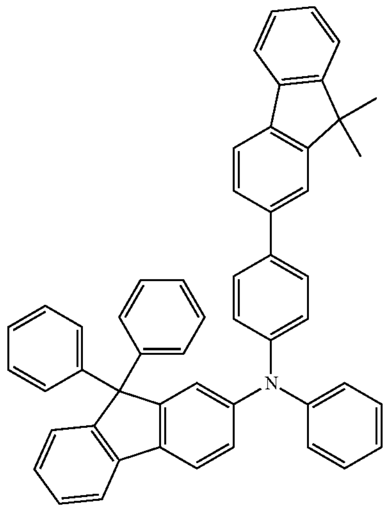
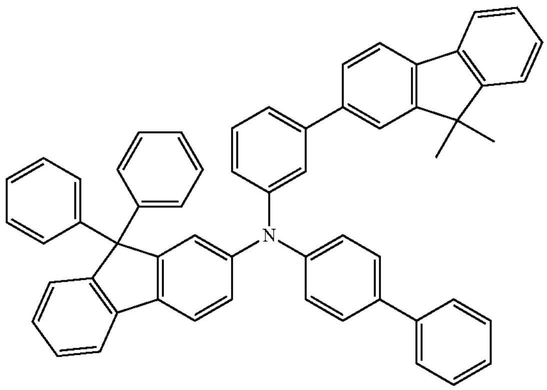
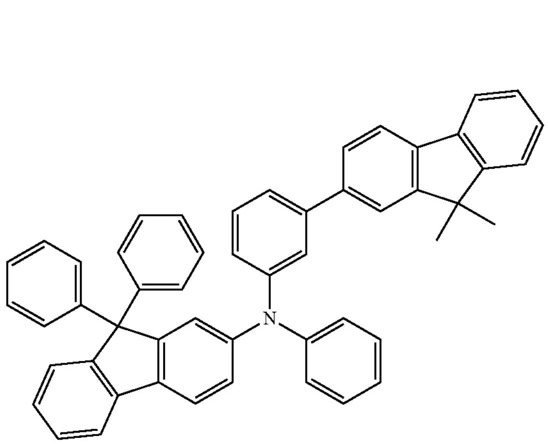
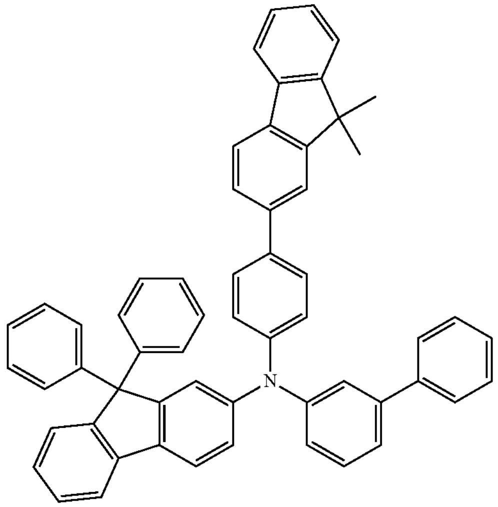

-continued
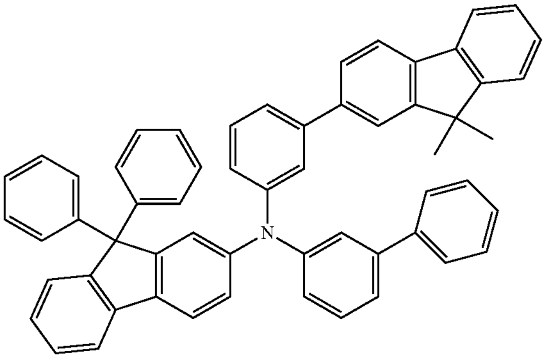
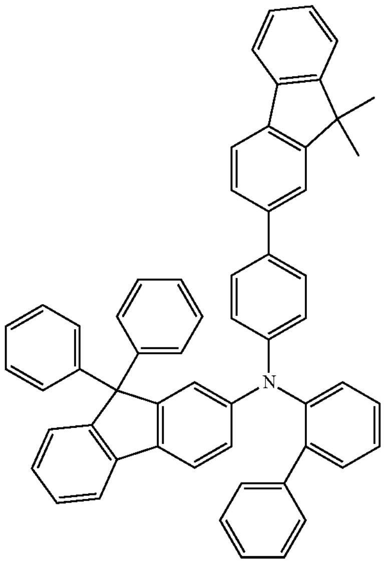
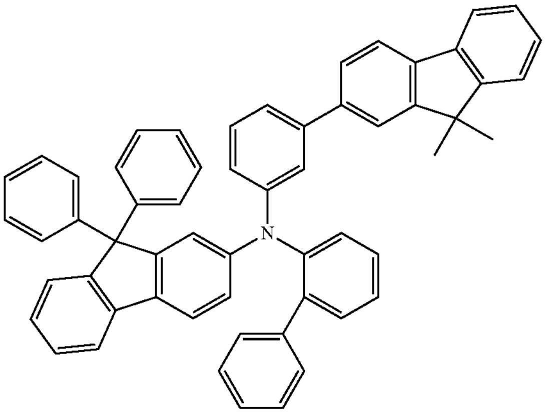
-continued
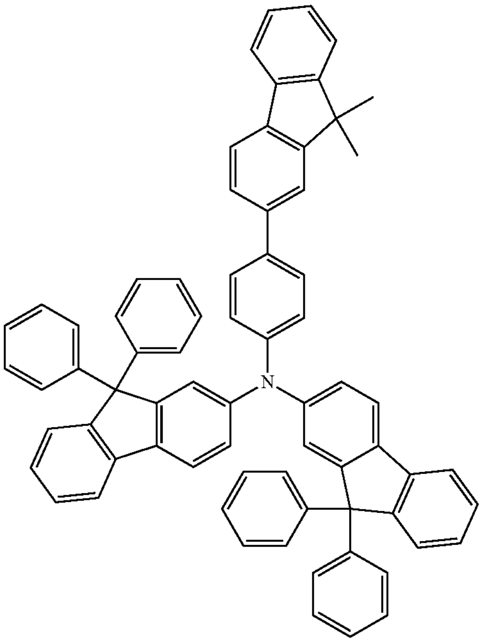
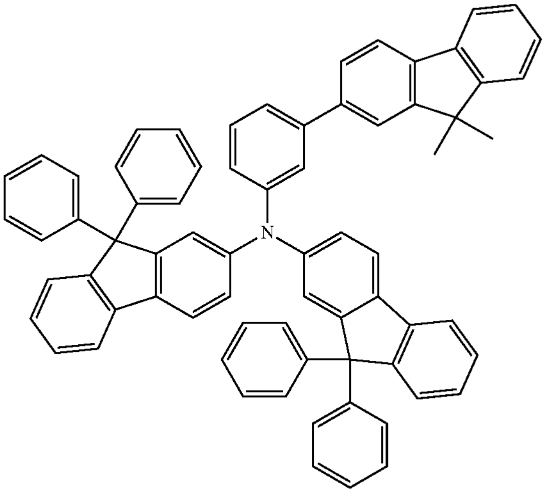
[Formula 104]
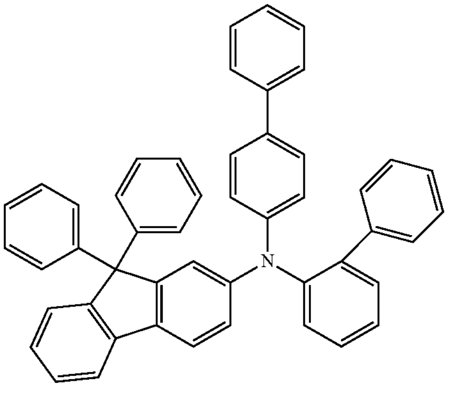

-continued
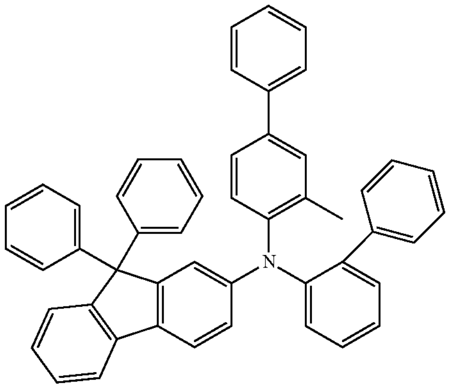
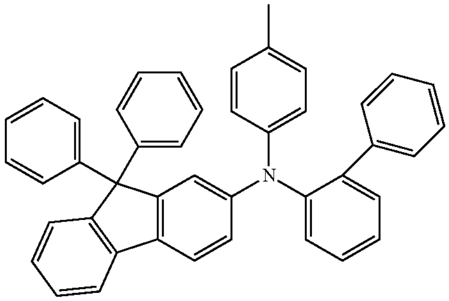
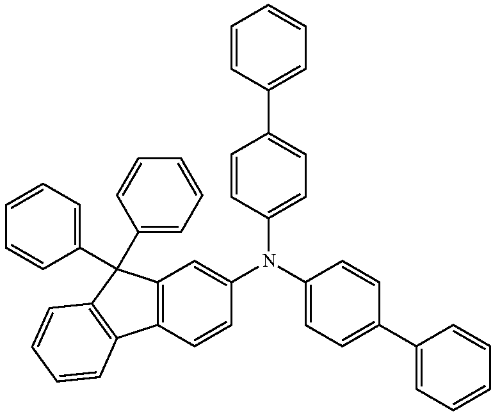
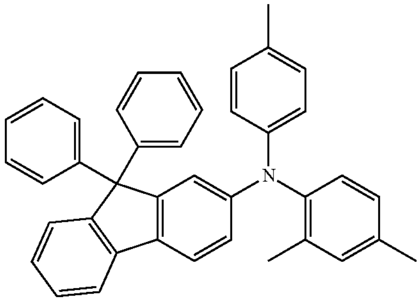
-continued
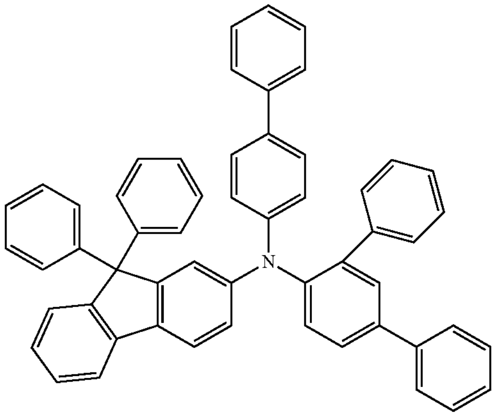
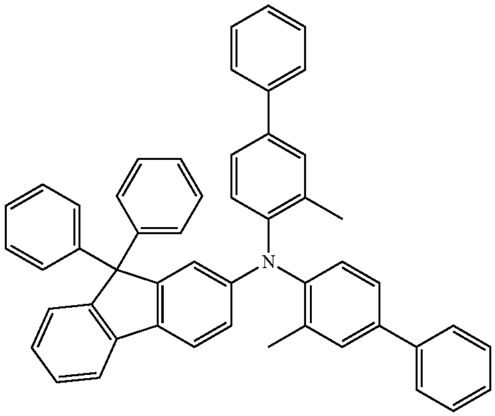
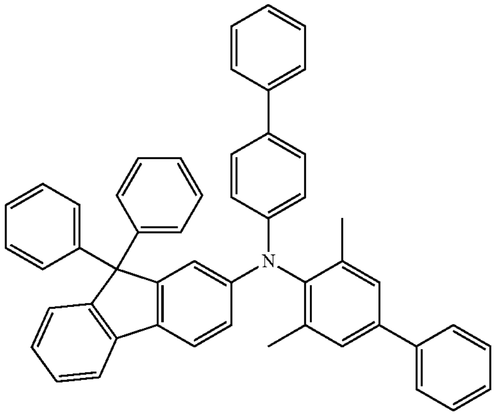
[Formula 105]
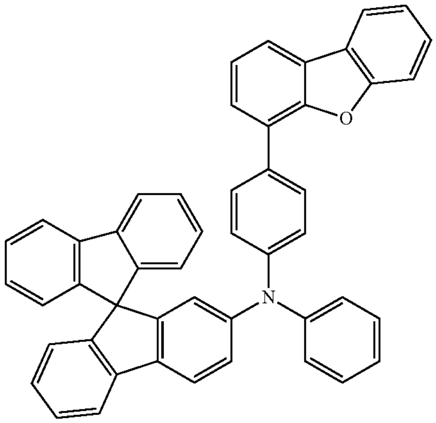

-continued
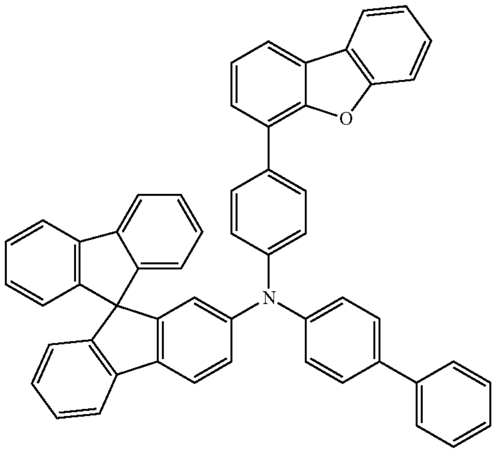
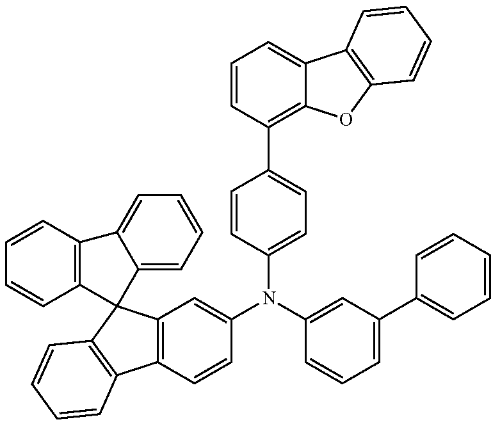
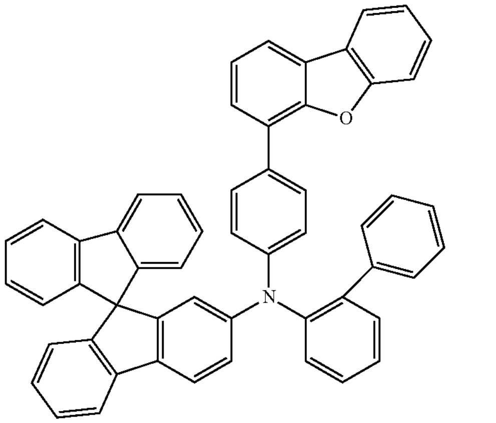
-continued
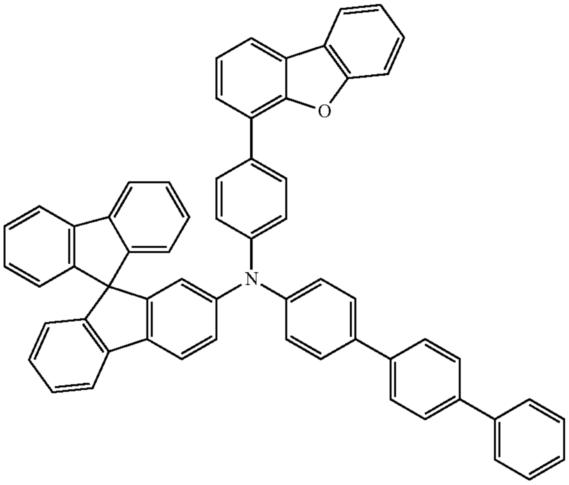
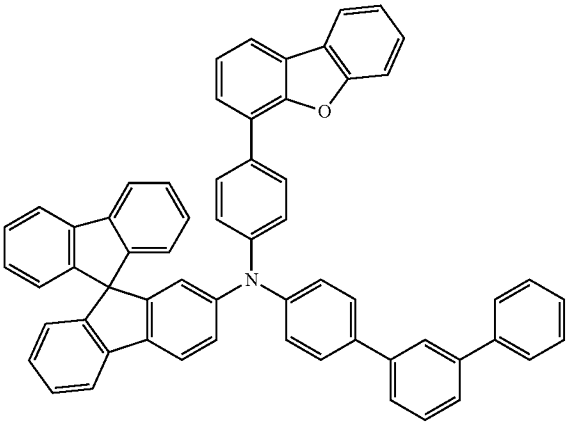
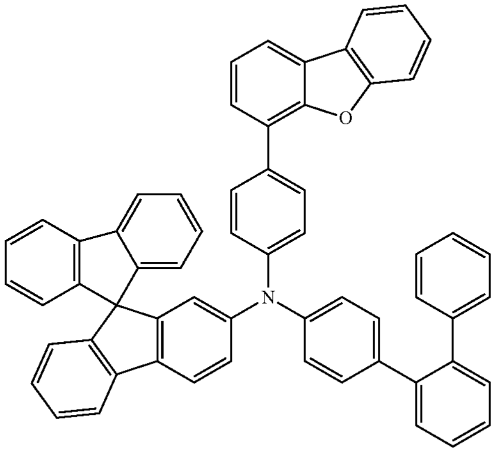

-continued
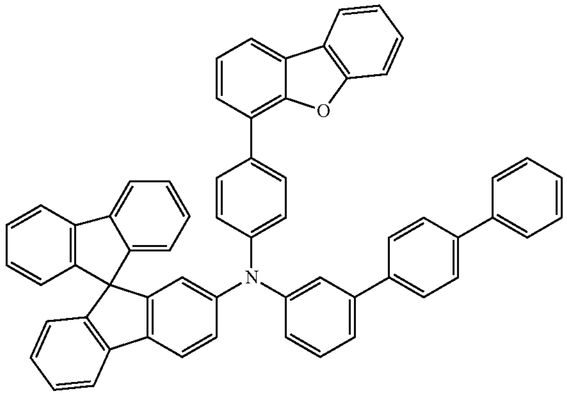
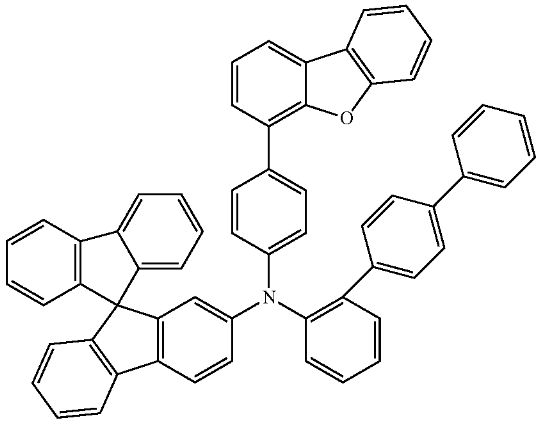
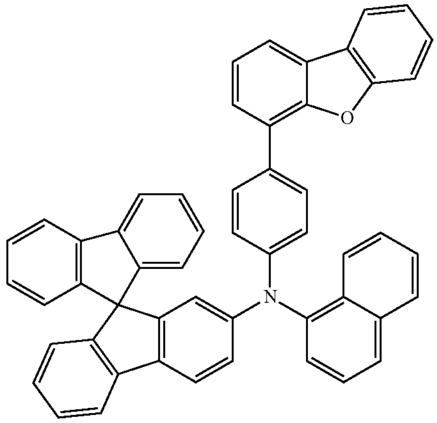
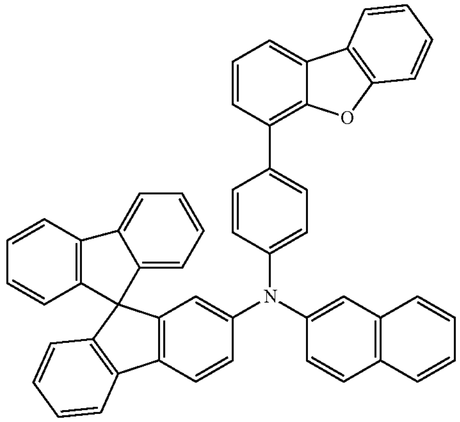
-continued
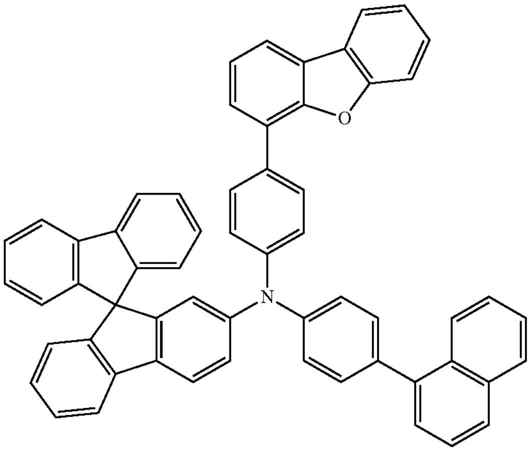
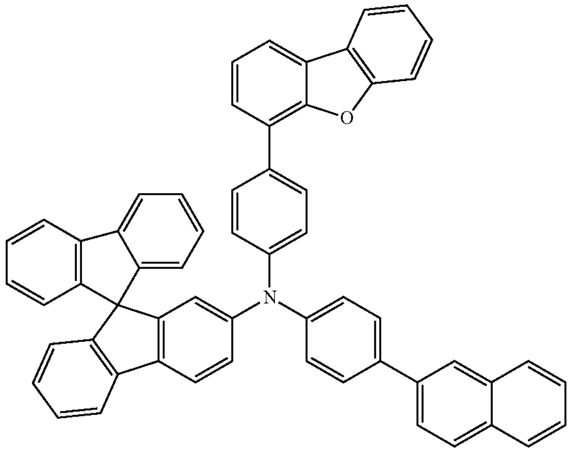
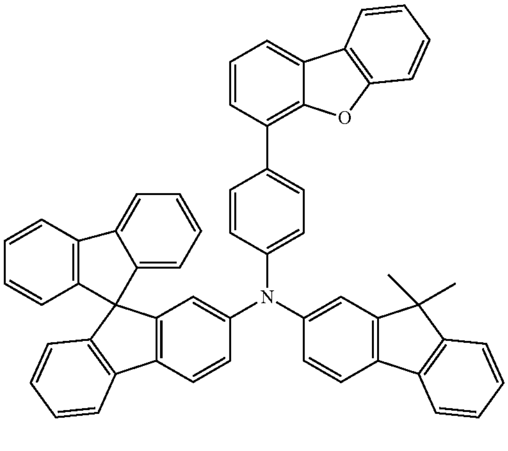

-continued
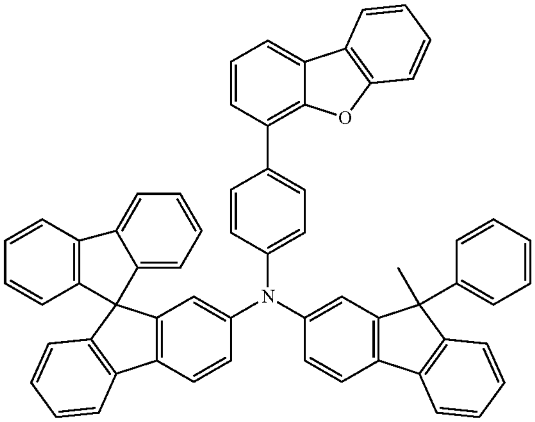
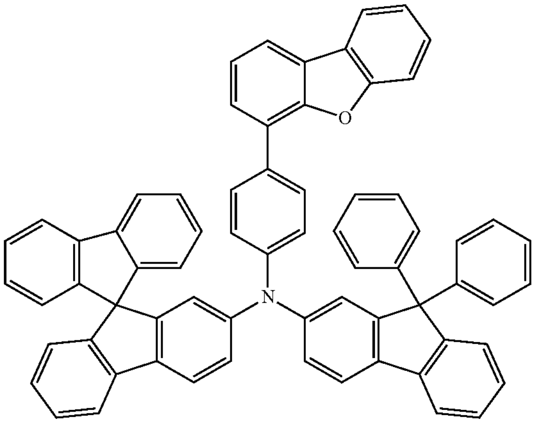 [SMILES: c1ccc(C2(c3ccccc3)c3ccccc3-c3ccc(N(c4ccc(-c5cccc6c5oc5ccccc56)cc4)c4ccc5c(c4)C4(c6ccccc6-c6ccccc64)c4ccccc4-5)cc32)cc1]
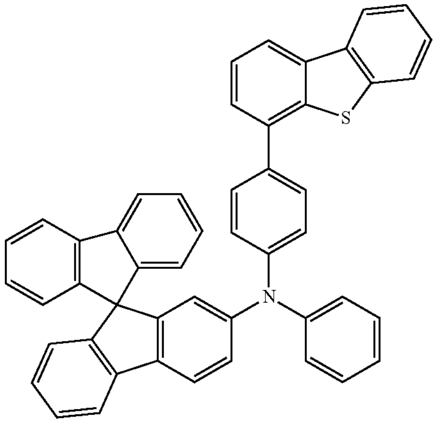
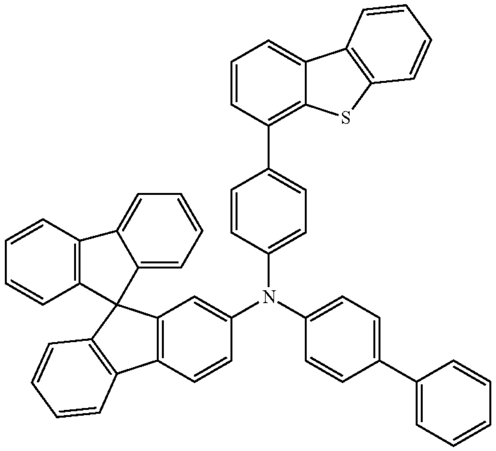
-continued
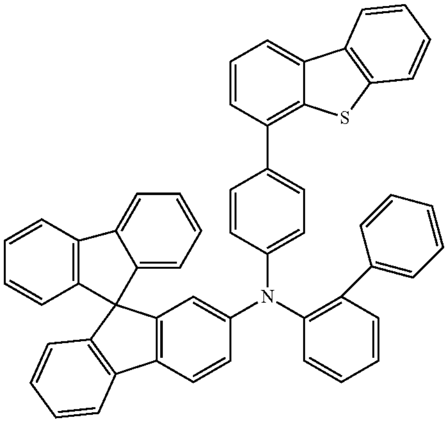
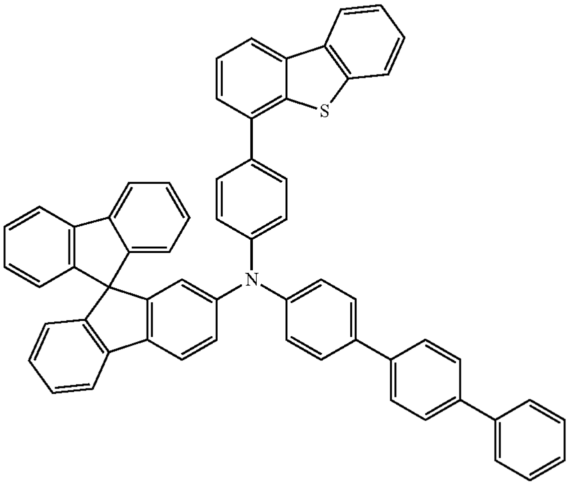
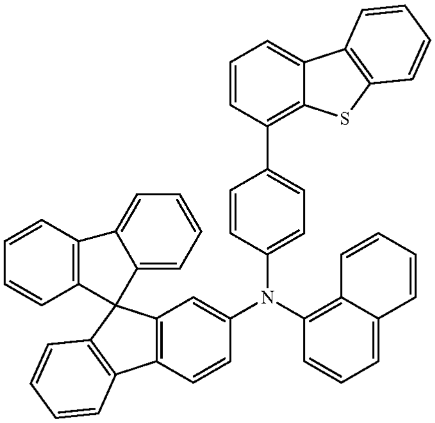

-continued
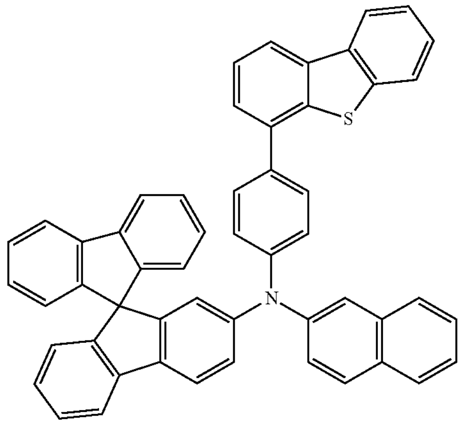
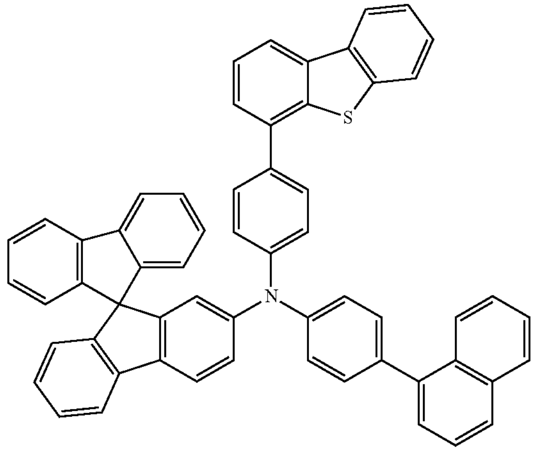
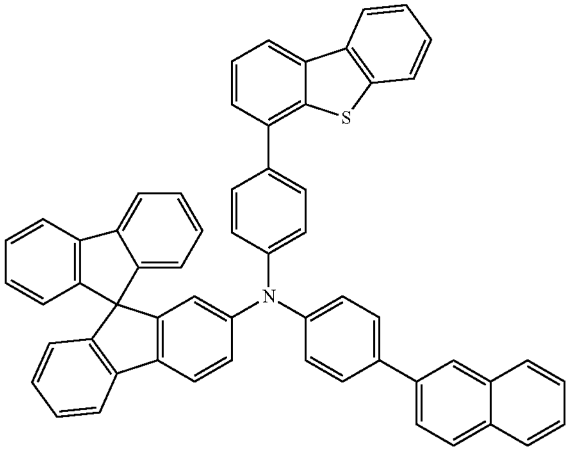
-continued
[Formula 106]
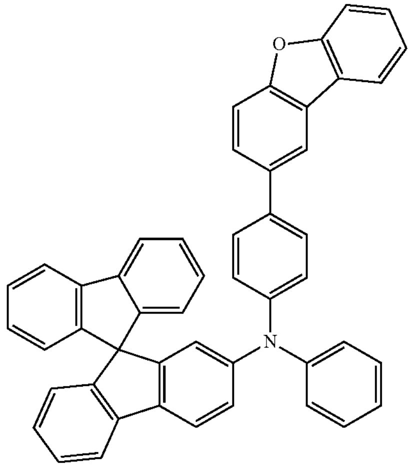
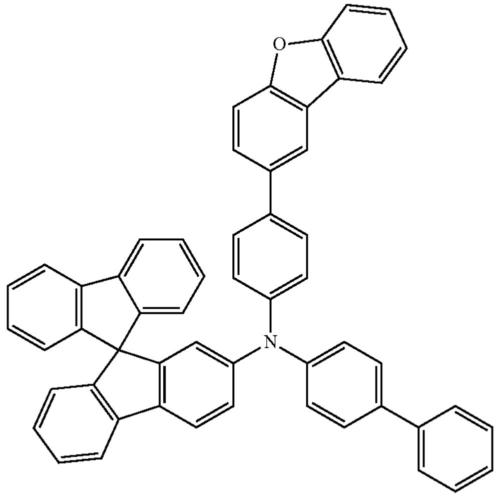
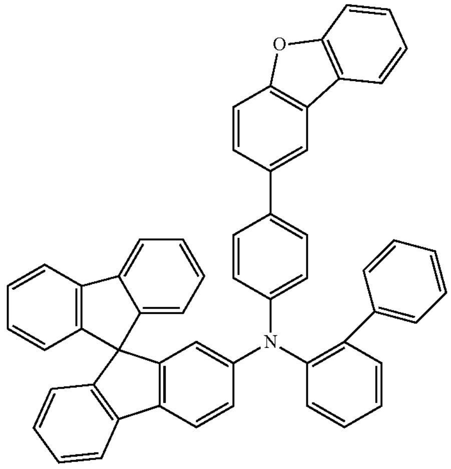

-continued
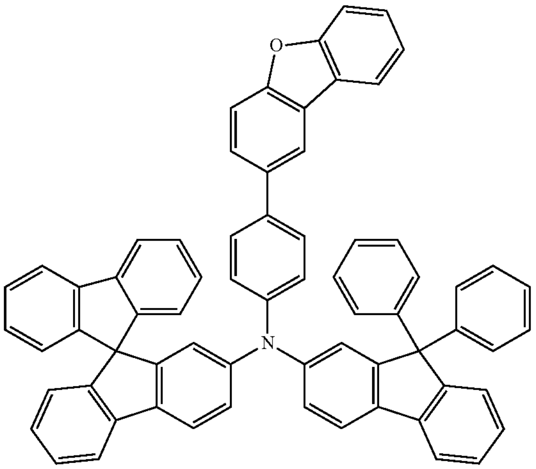
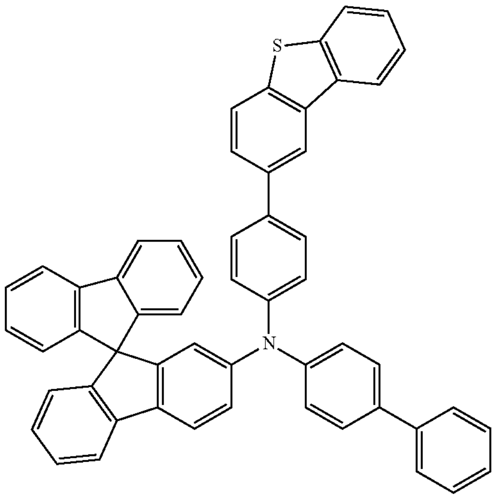
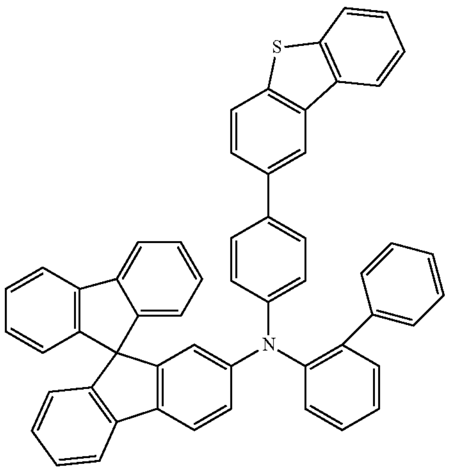
-continued
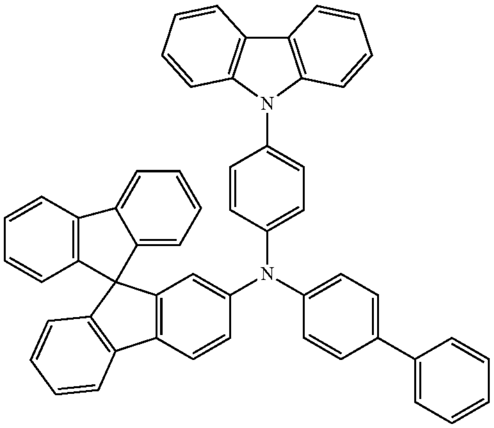
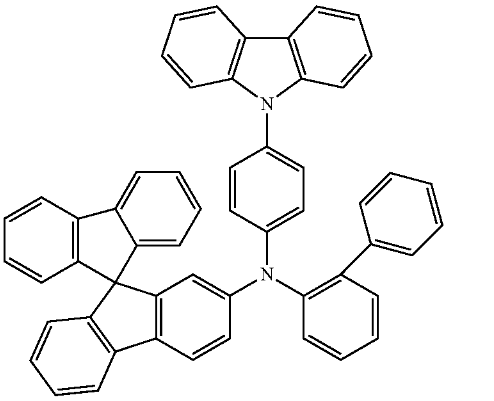
[Formula 107]
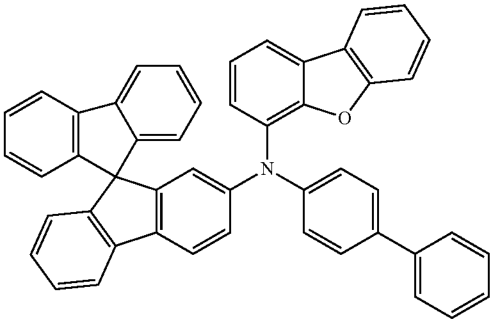
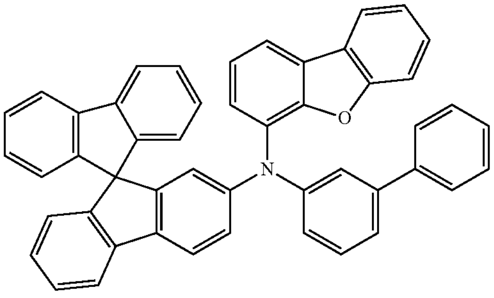

-continued
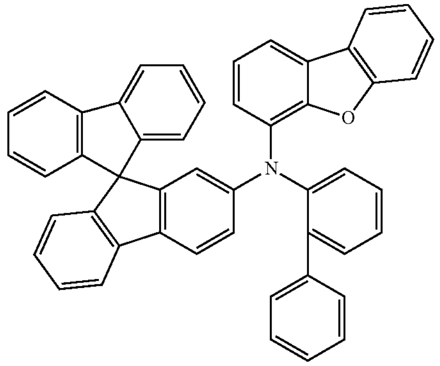
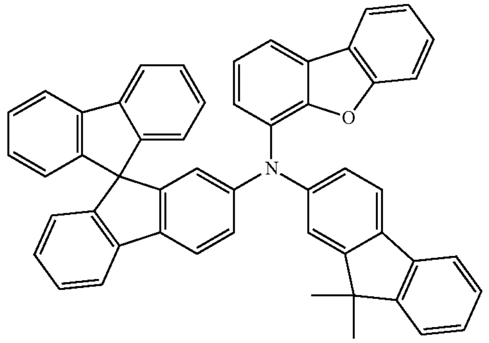
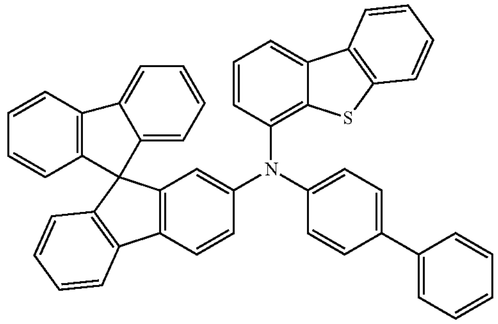
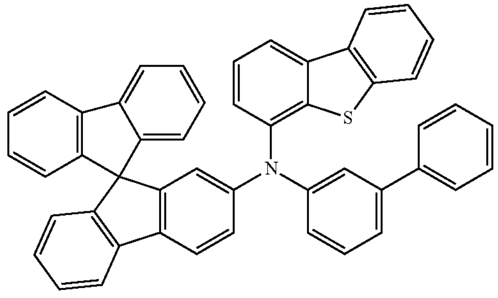
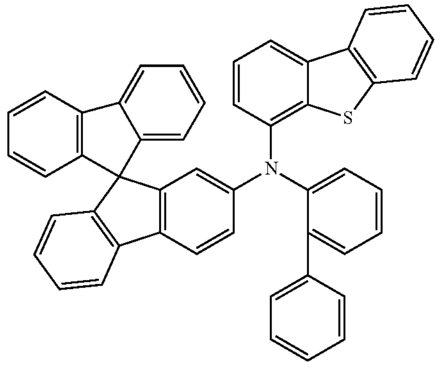
-continued
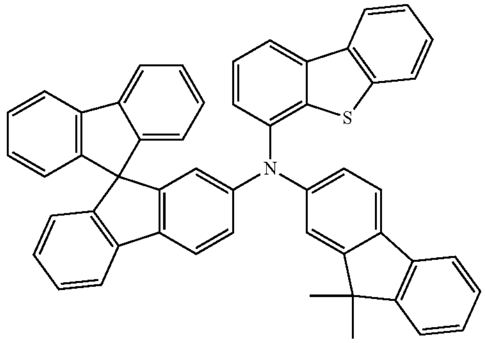
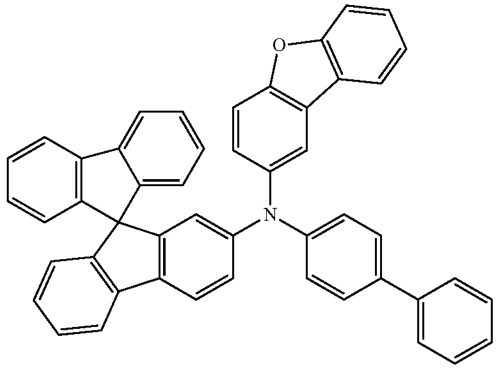
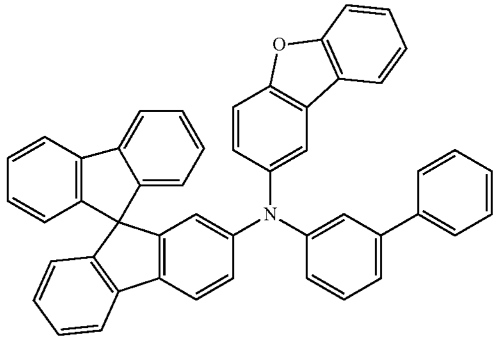
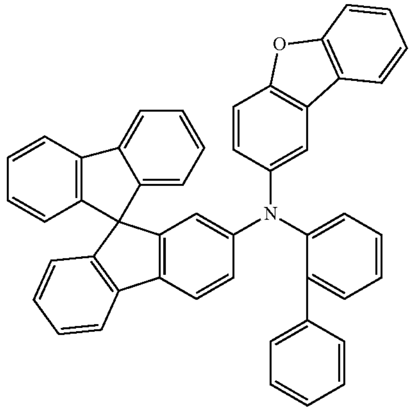

-continued
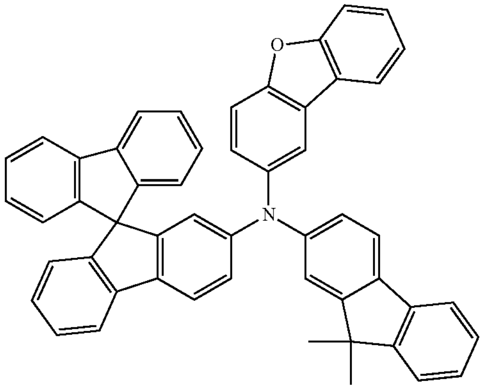
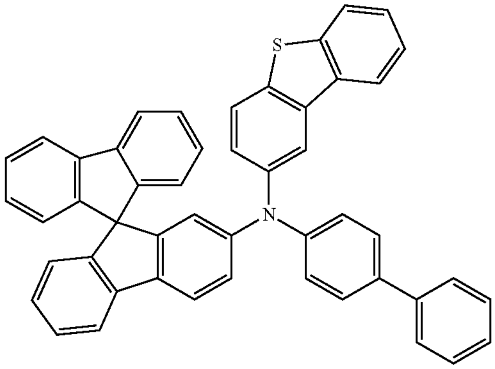
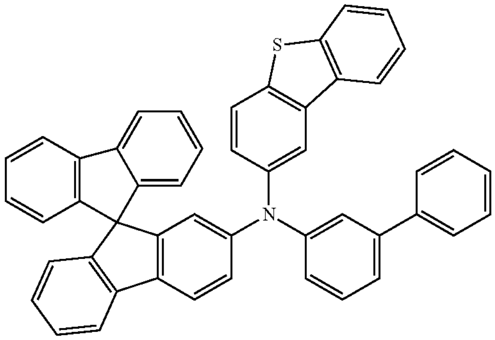
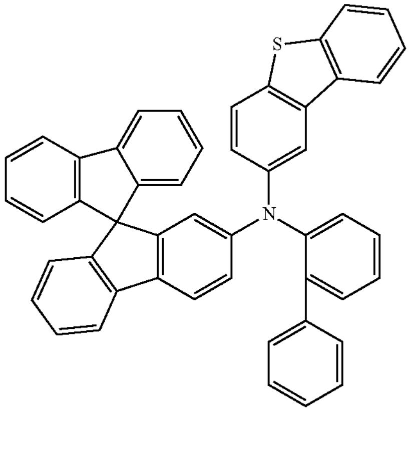
-continued
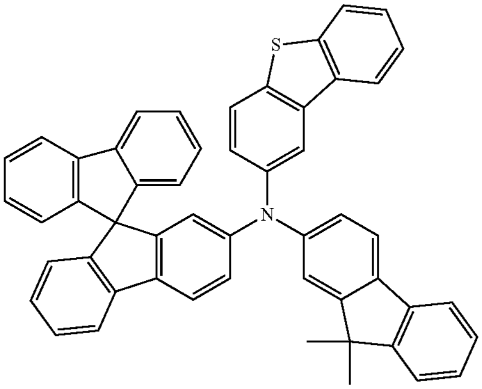
[Formula 108]
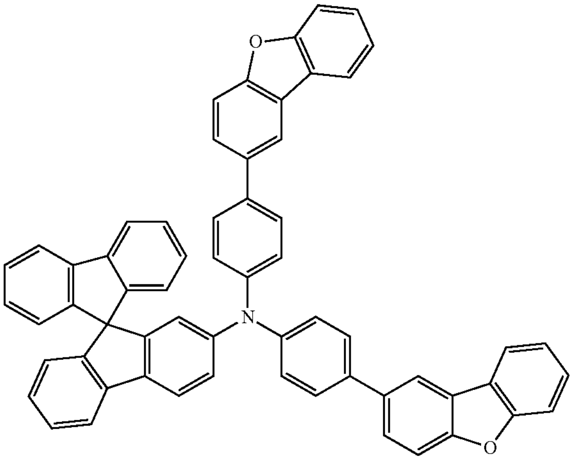
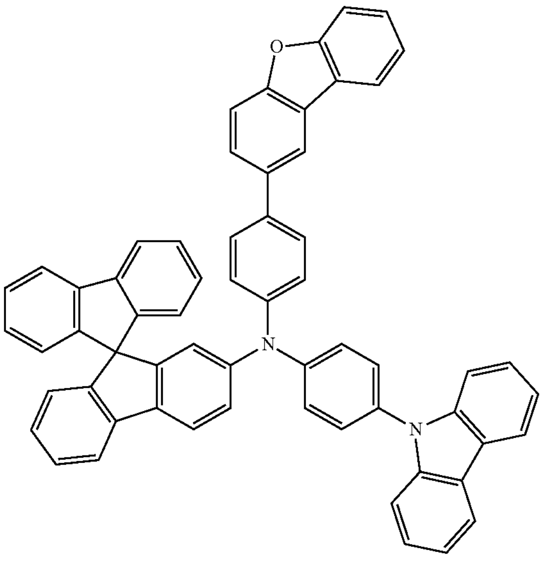

-continued
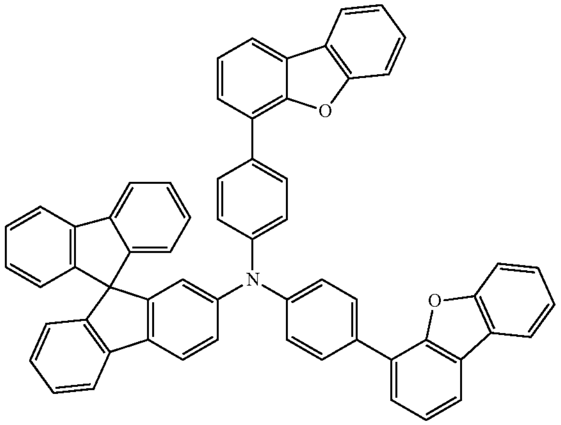
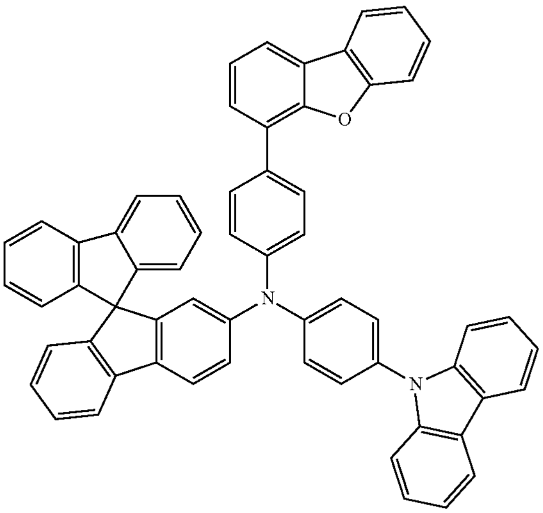 [SMILES: c1ccc2c(c1)-c1ccccc1C21c2ccccc2-c2ccc(N(c3ccc(-c4cccc5c4oc4ccccc45)cc3)c3ccc(-n4c5ccccc5c5ccccc54)cc3)cc21]
[Formula 109]
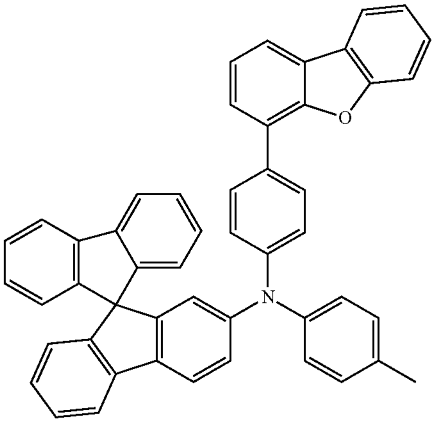
-continued
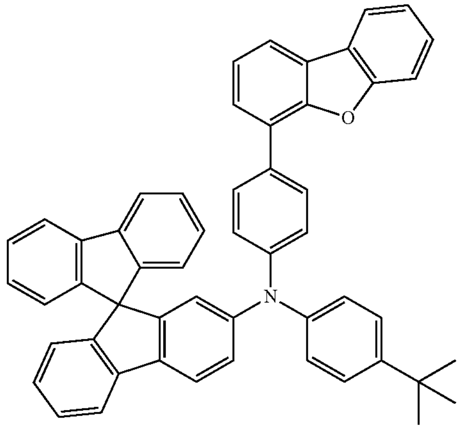
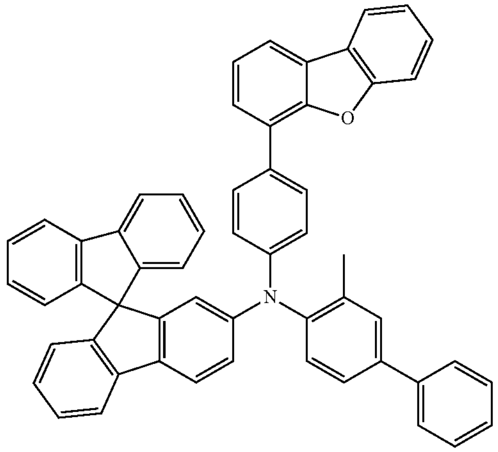
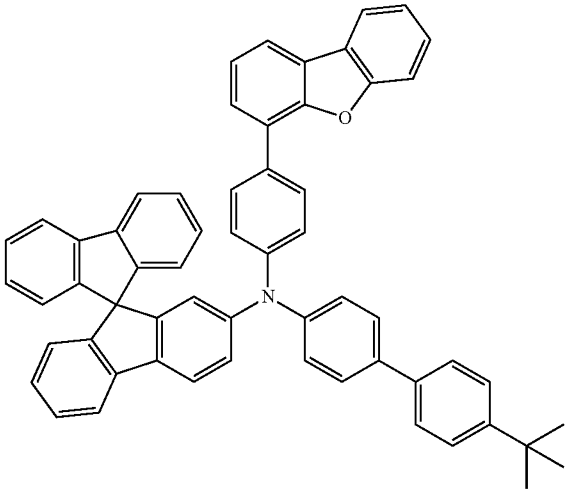

-continued
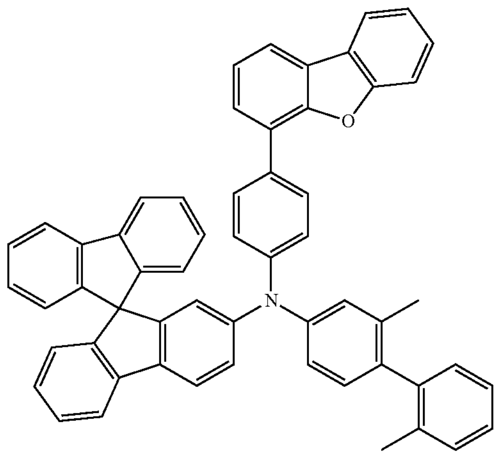
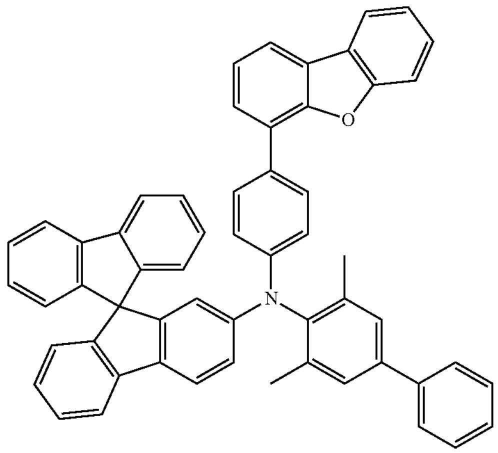
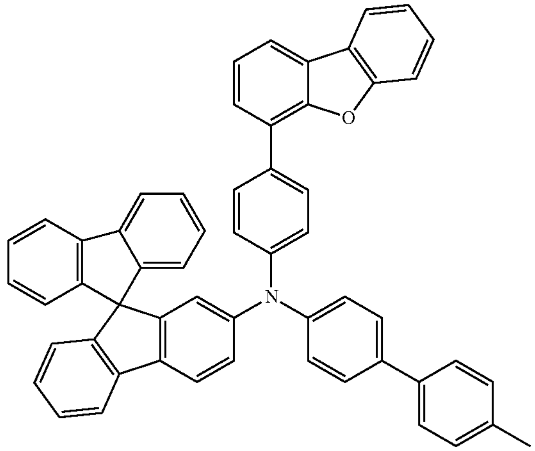
-continued
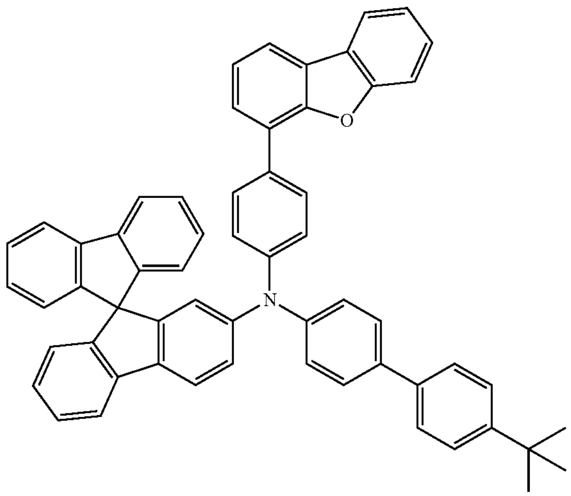
[Formula 110]
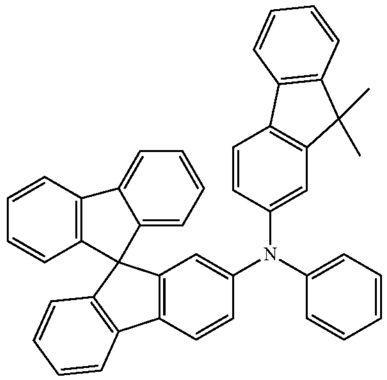
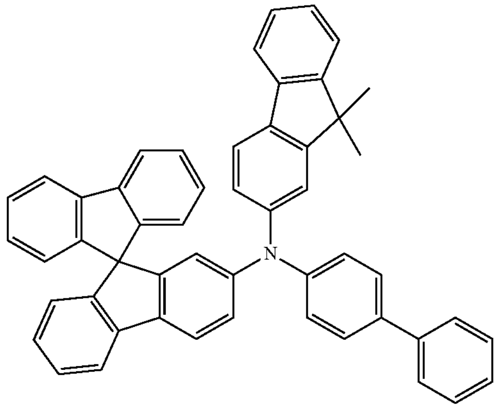
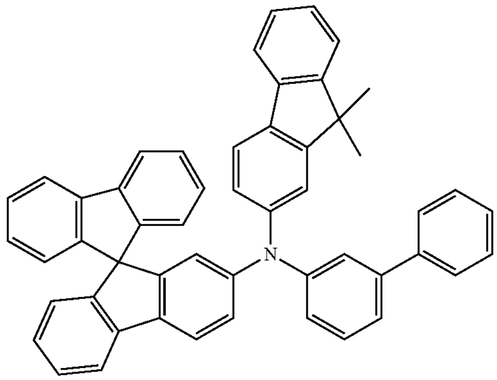

-continued
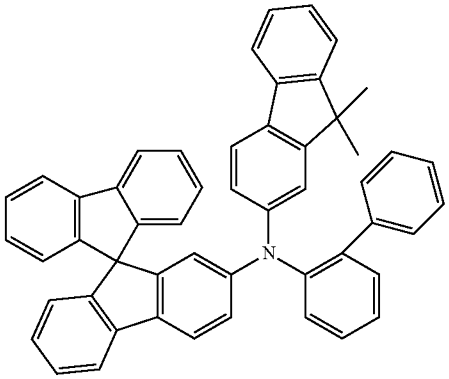
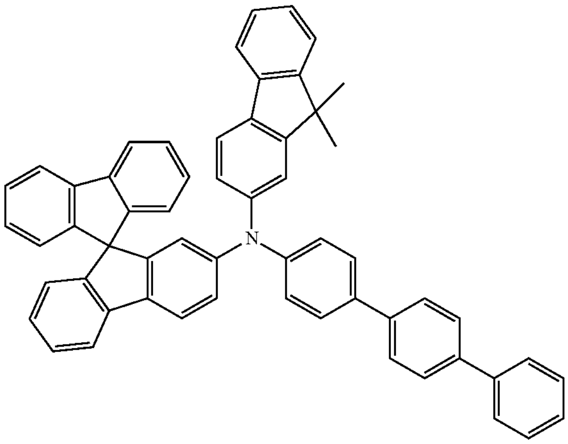
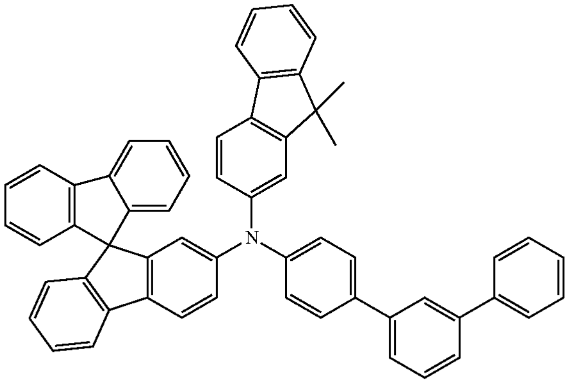
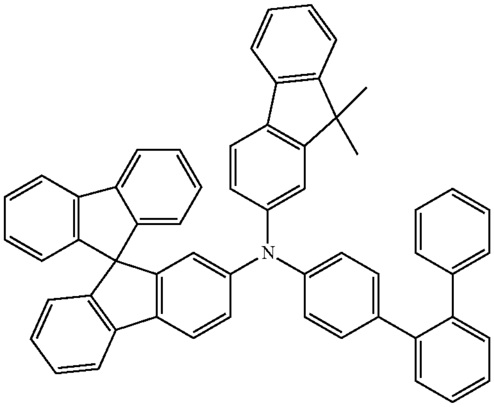
-continued
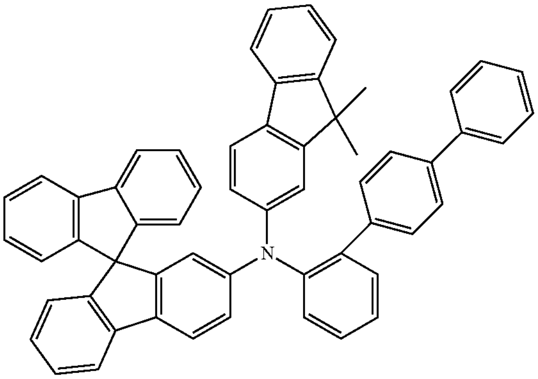
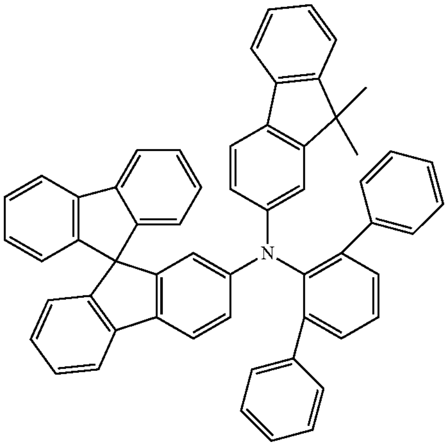
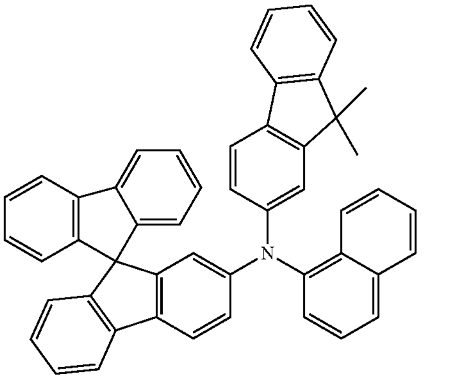
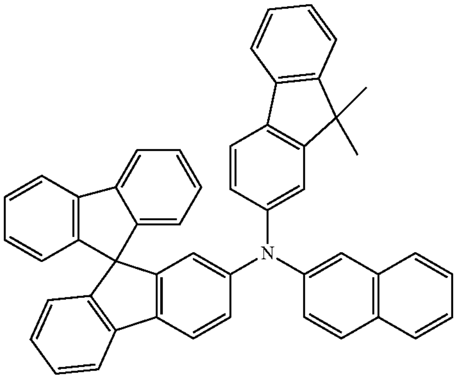

-continued
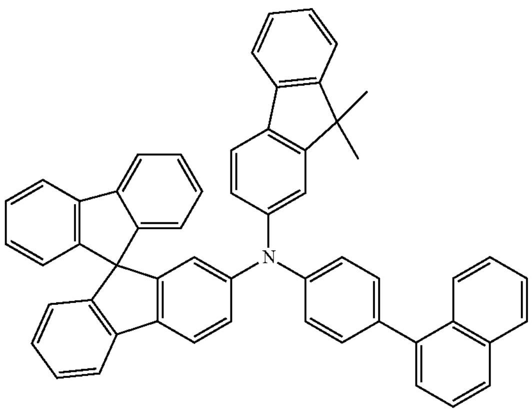
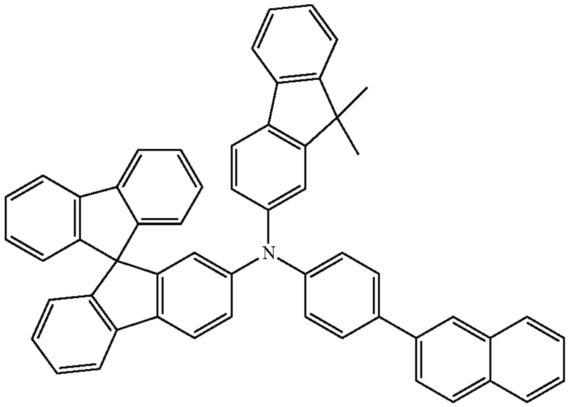
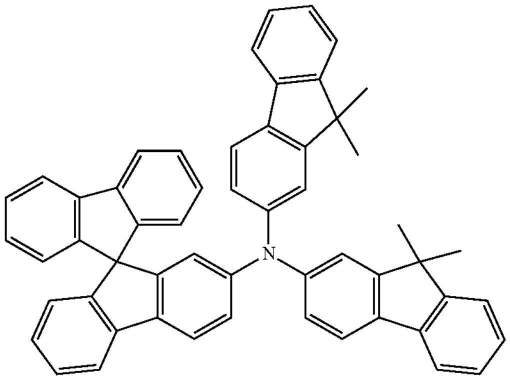
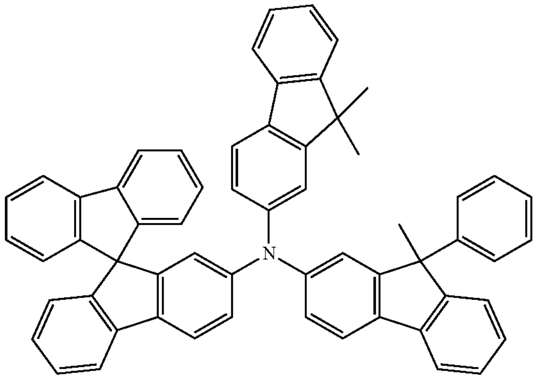
-continued
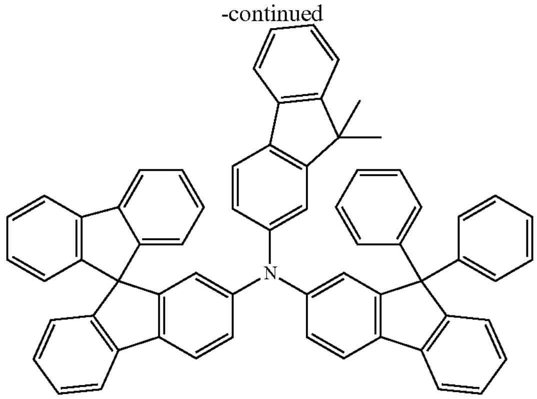
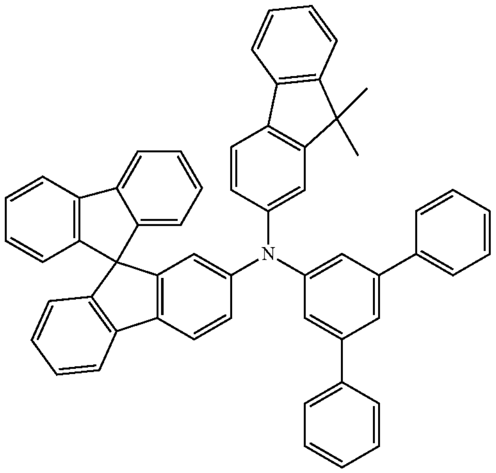
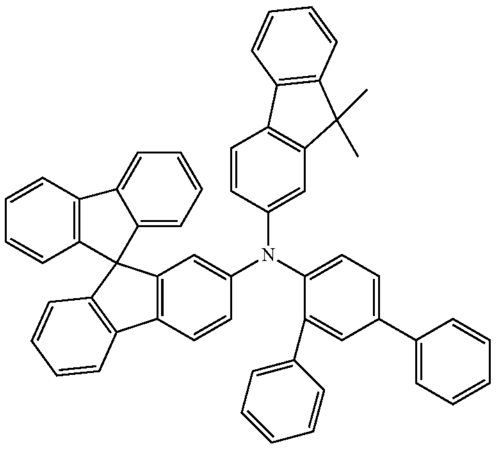

[Formula 111]
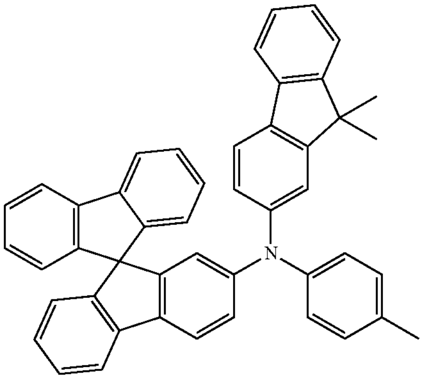
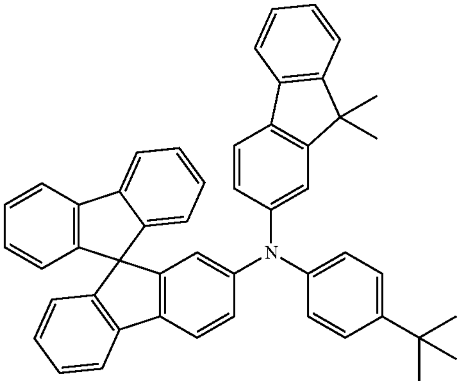
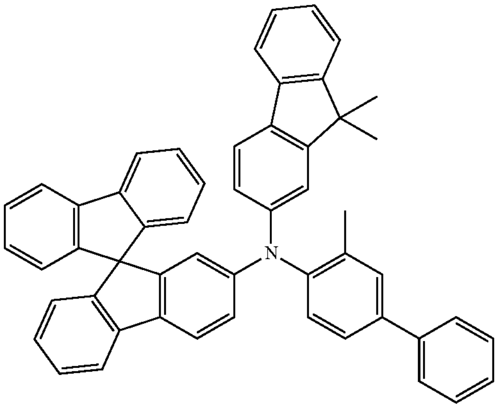
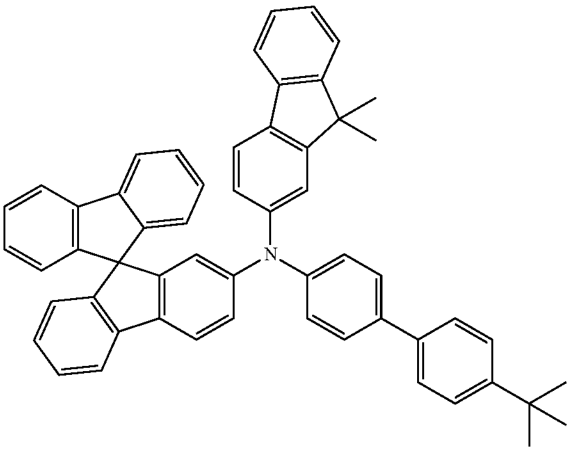
-continued
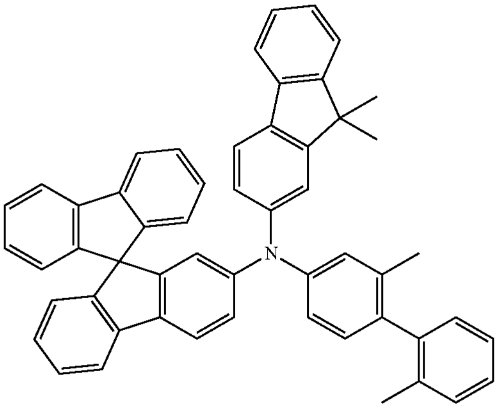
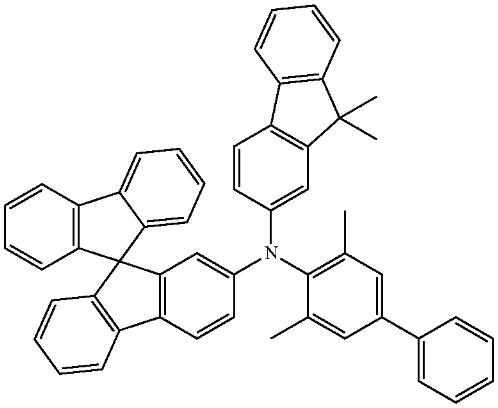
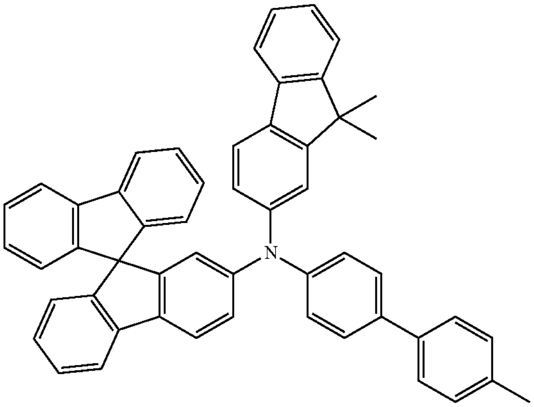
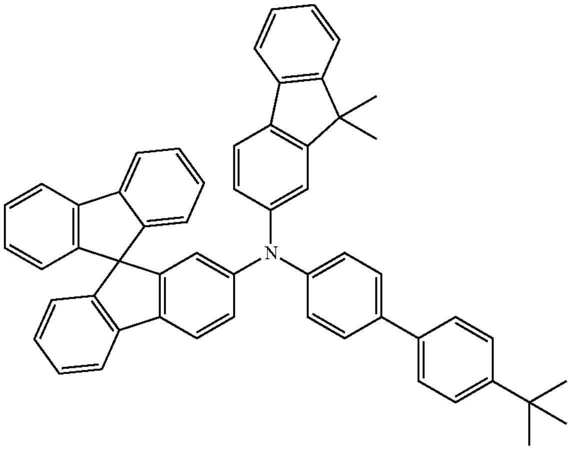

-continued
-continued
[Formula 112]
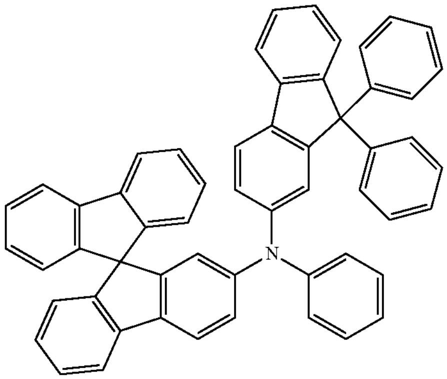
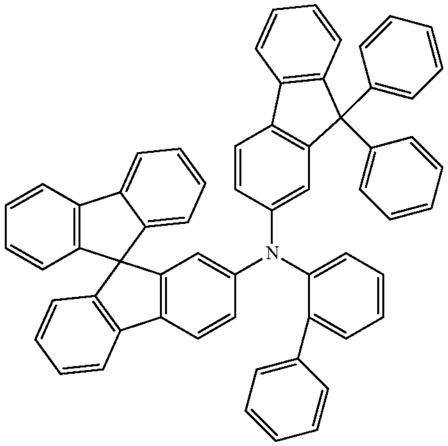
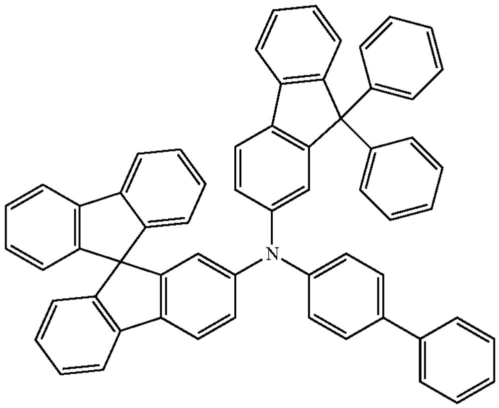
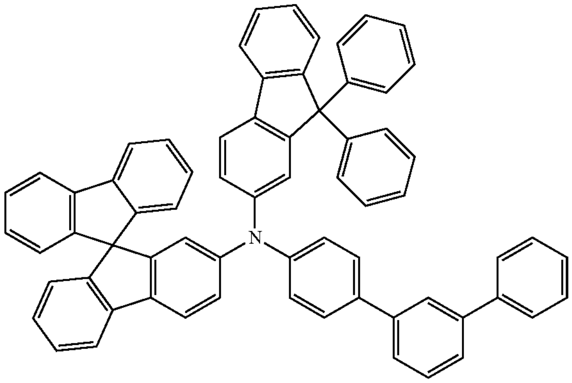
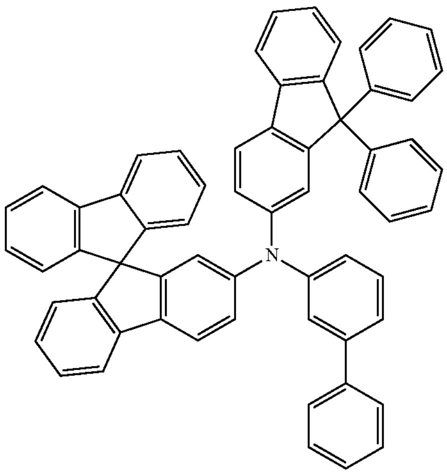
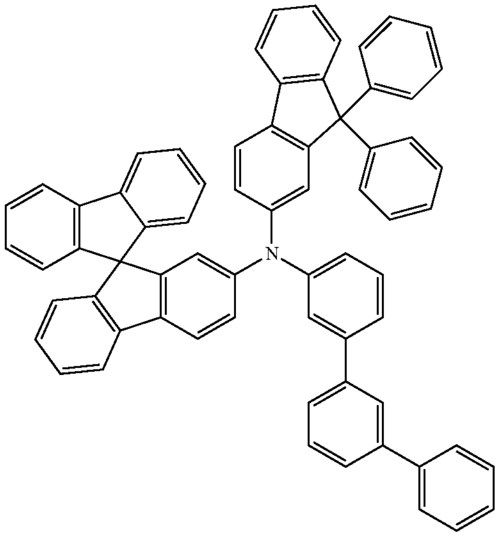

-continued
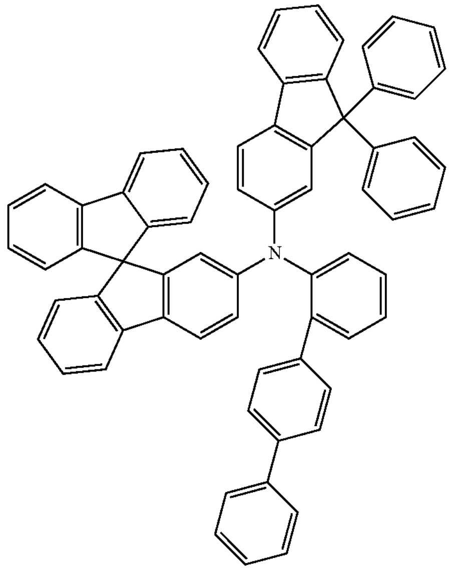
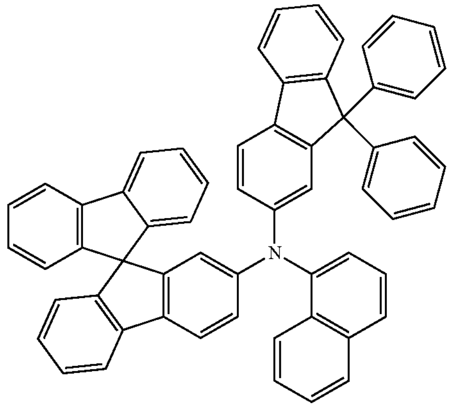
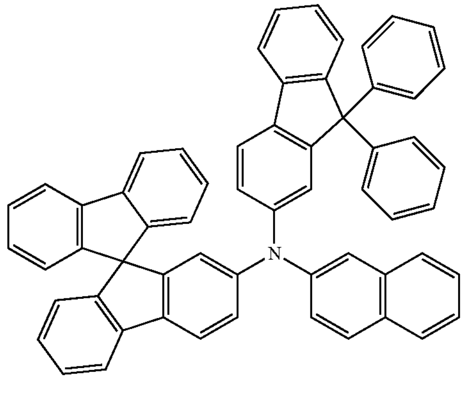
-continued
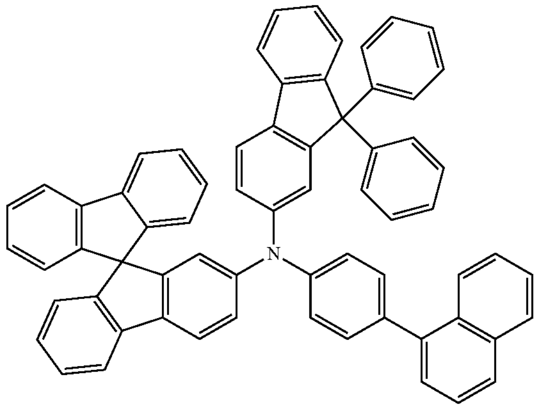
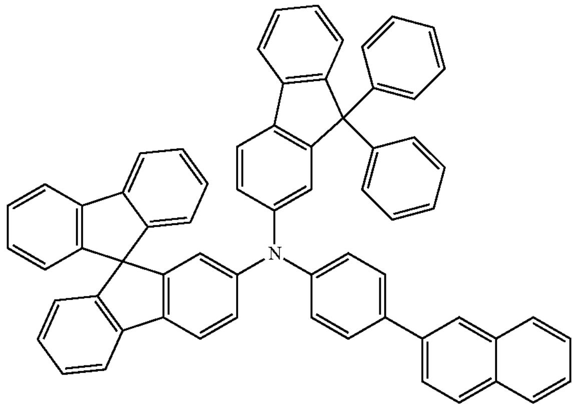
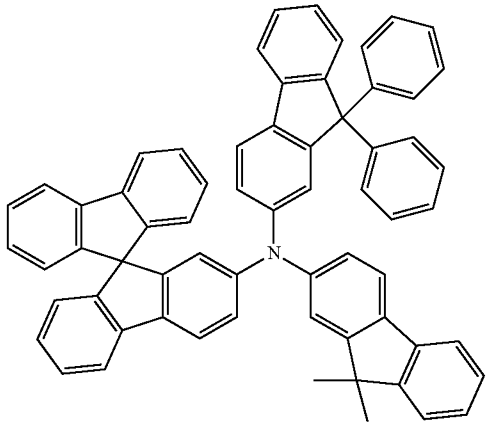

-continued
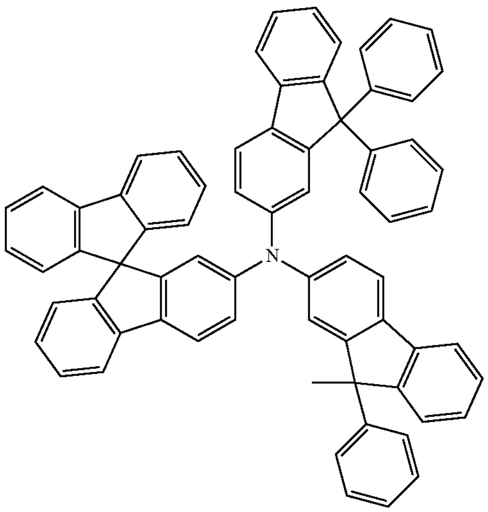
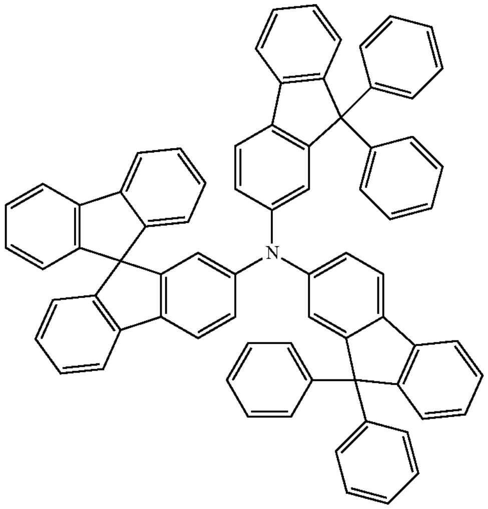
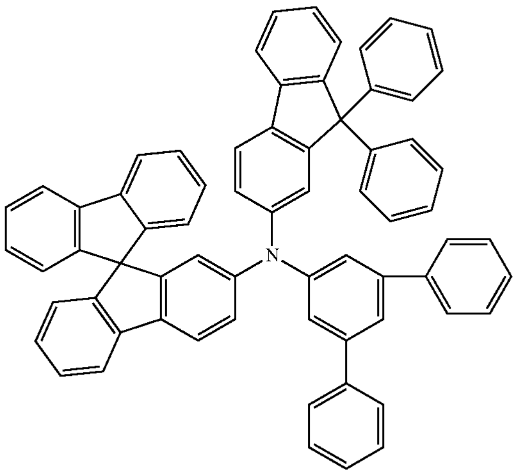
-continued
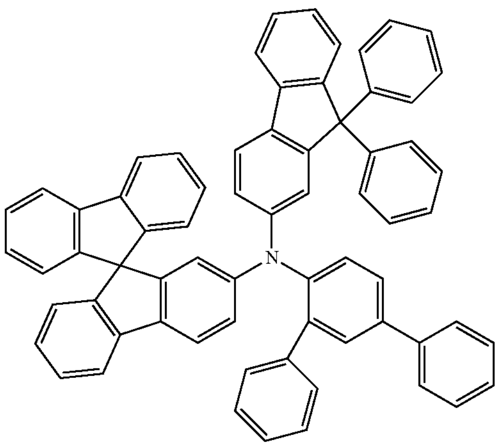
[Formula 113]
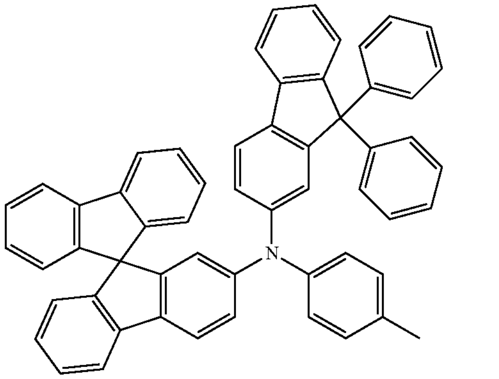
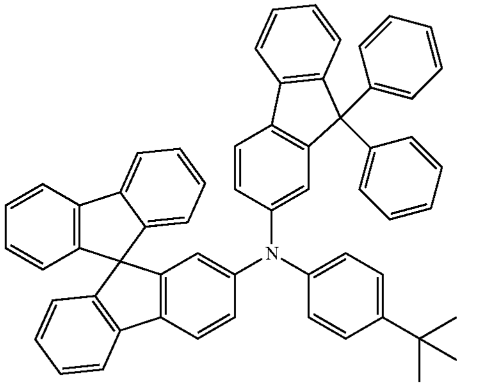
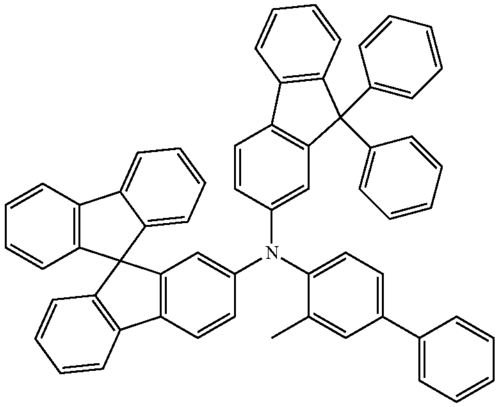

-continued
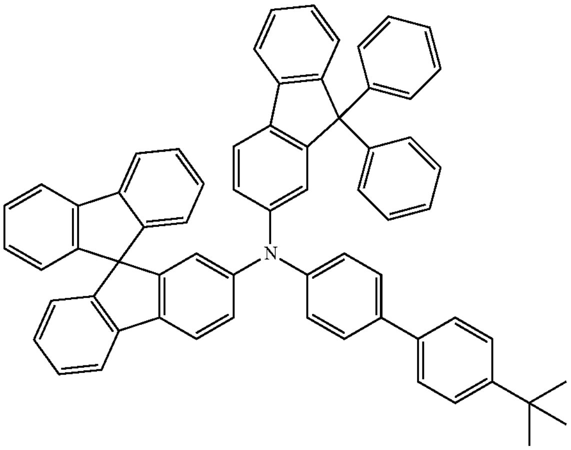
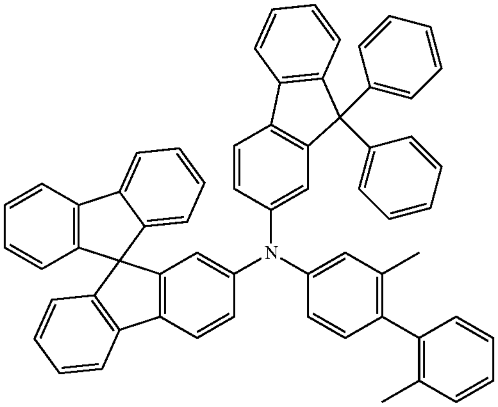
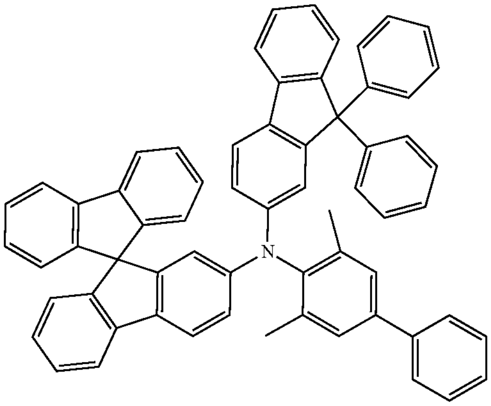
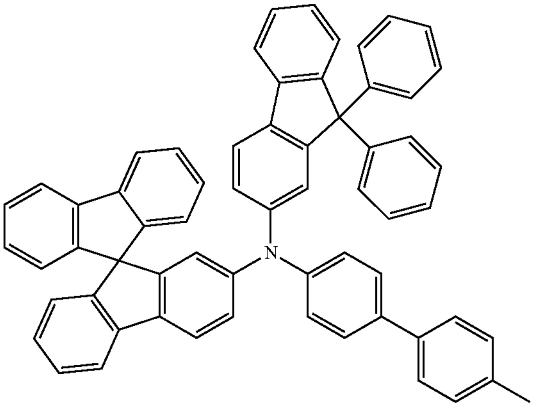
-continued
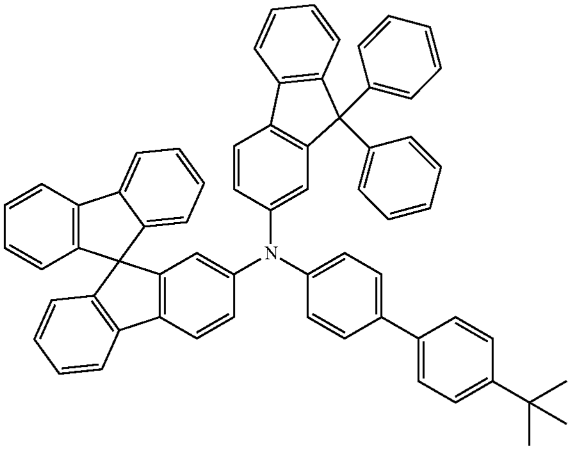
[Formula 114]
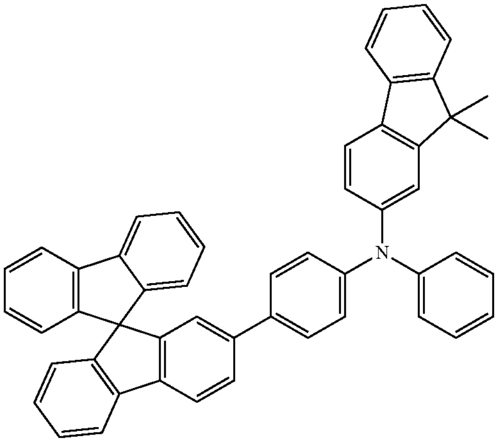
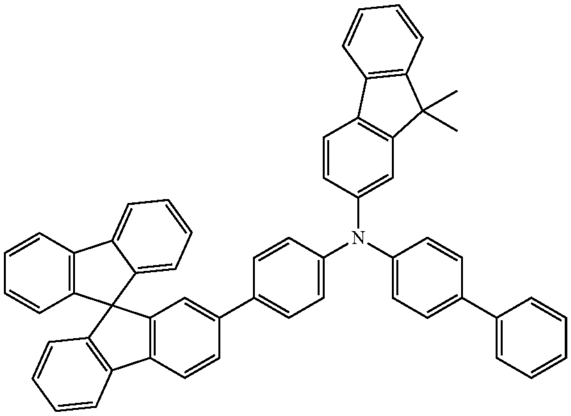

-continued
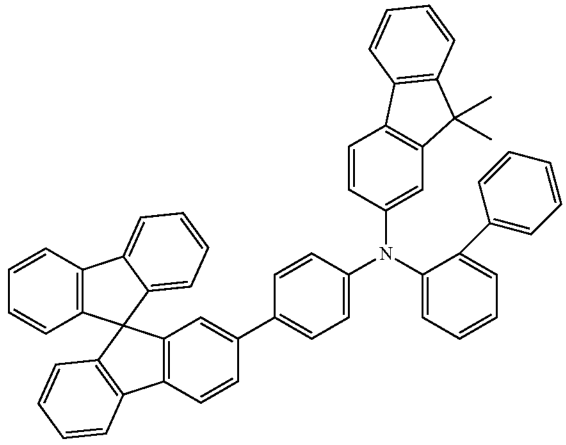
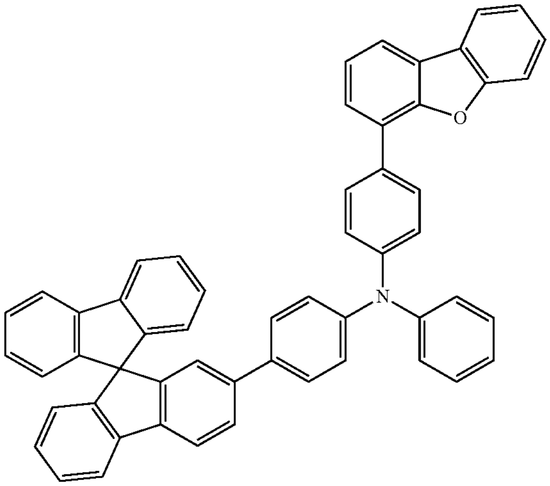
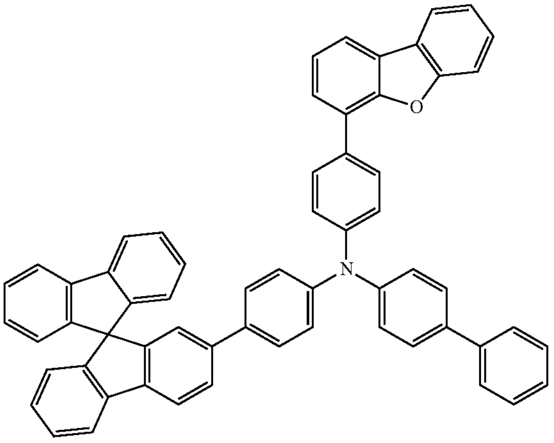
-continued
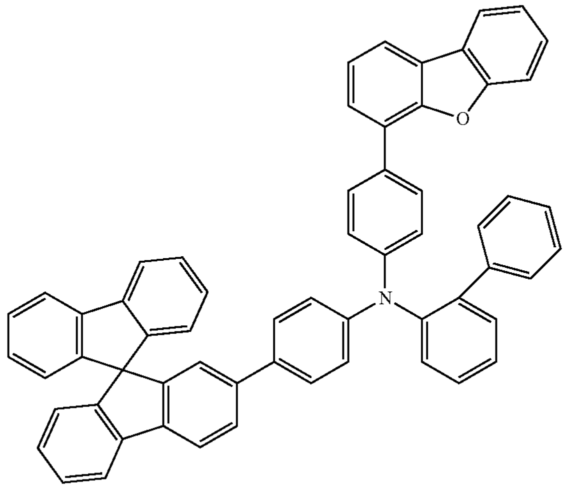
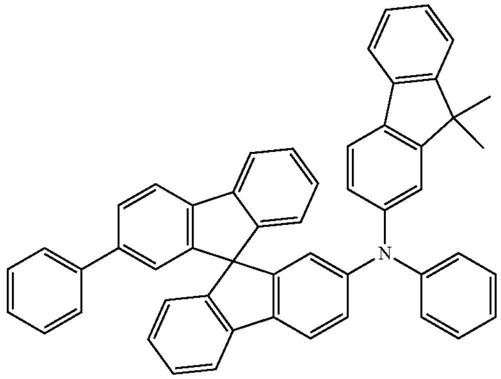
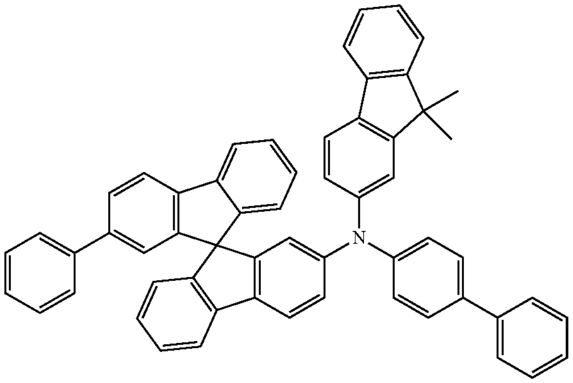
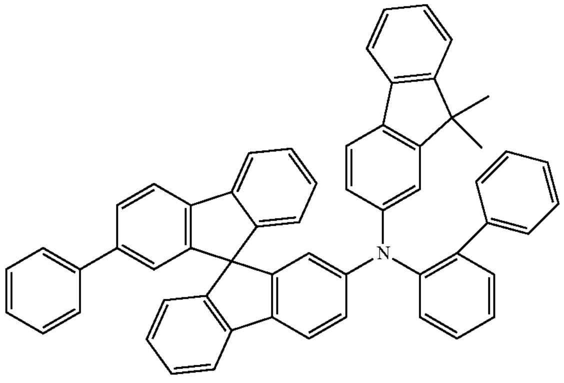

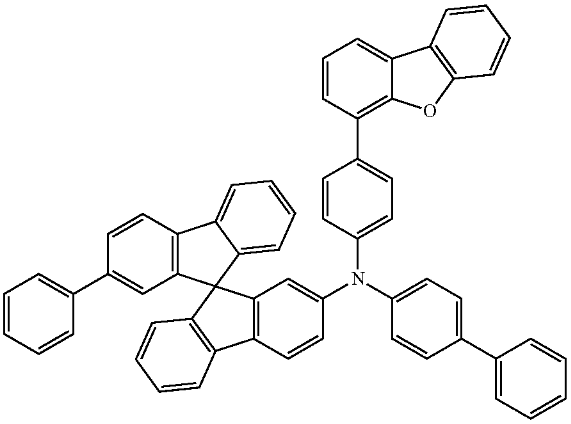
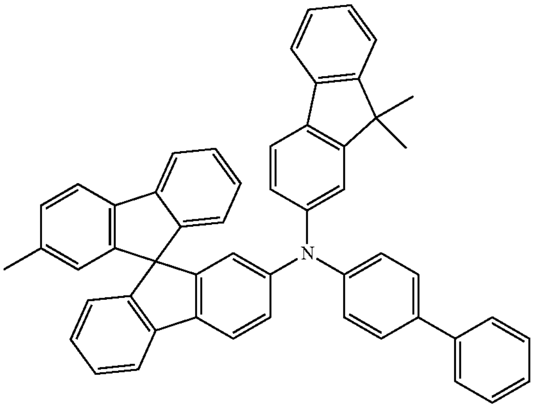
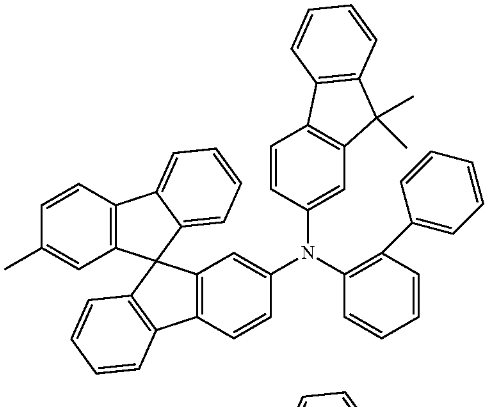
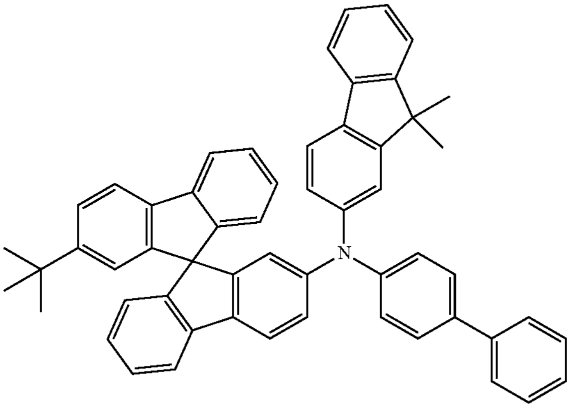
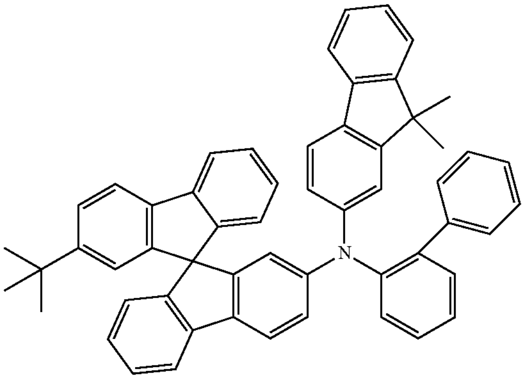
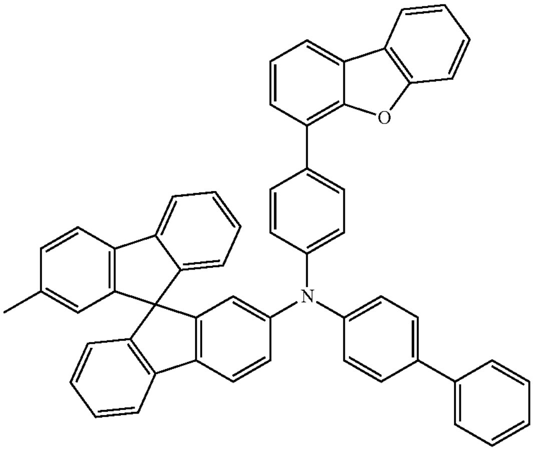
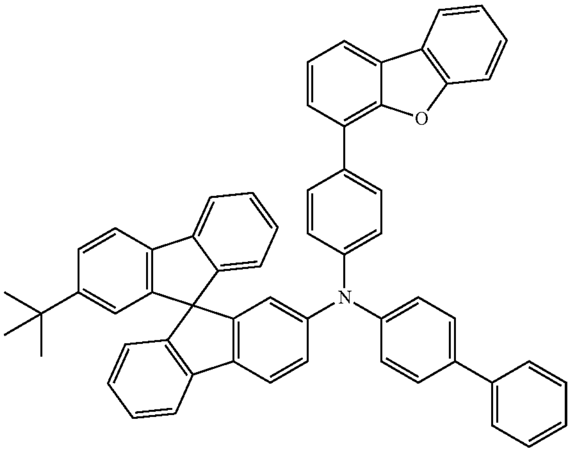
[Formula 115]
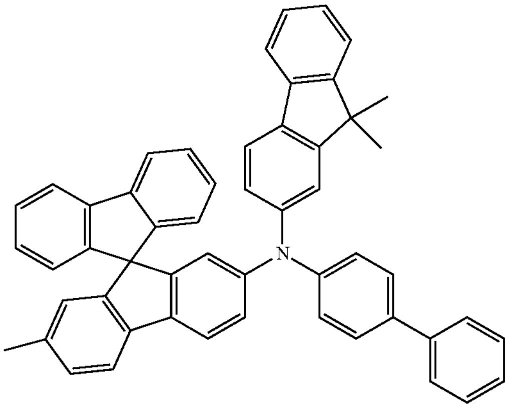

-continued
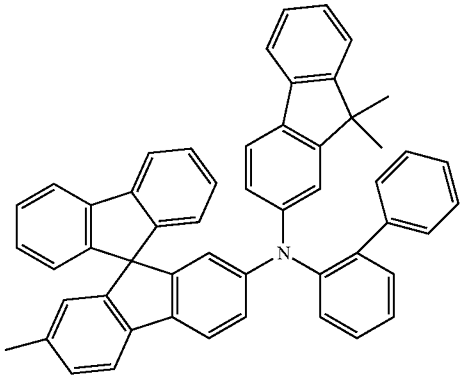
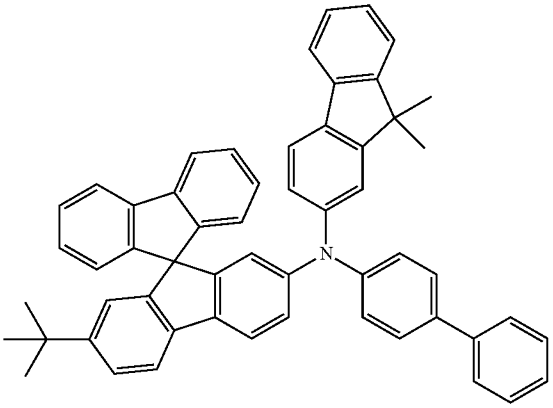
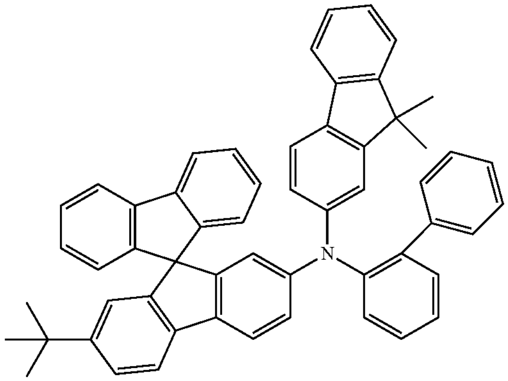
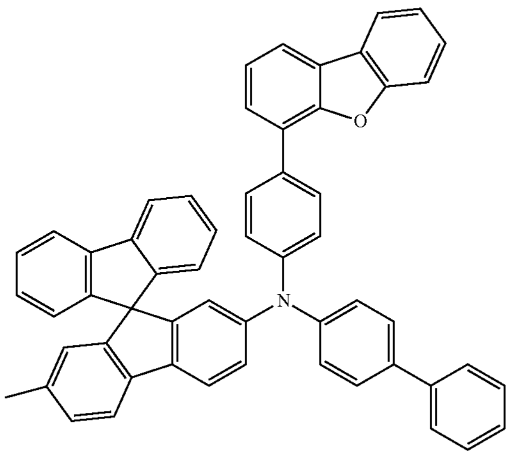
-continued
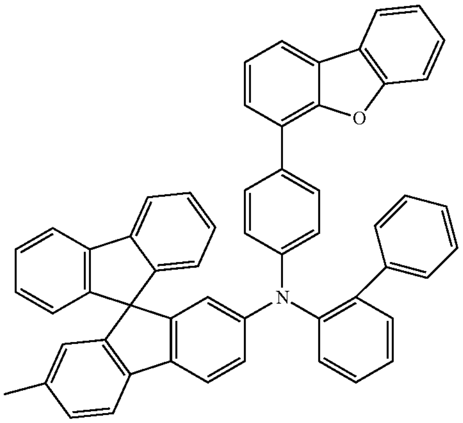
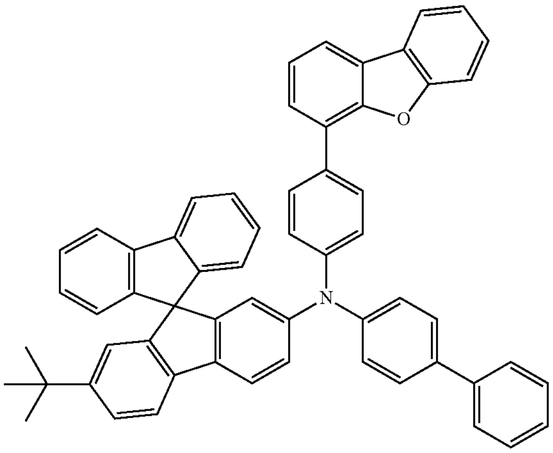
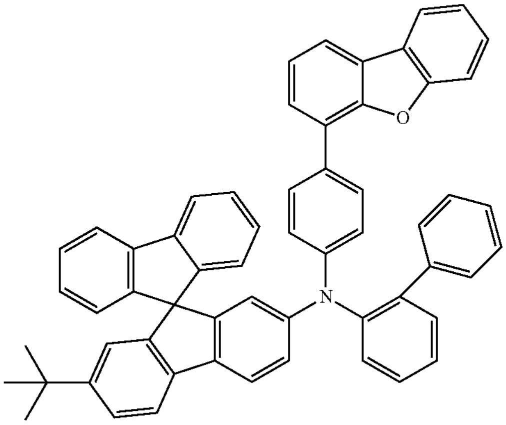
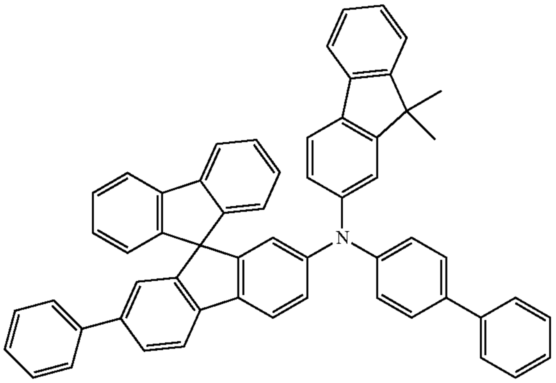

-continued
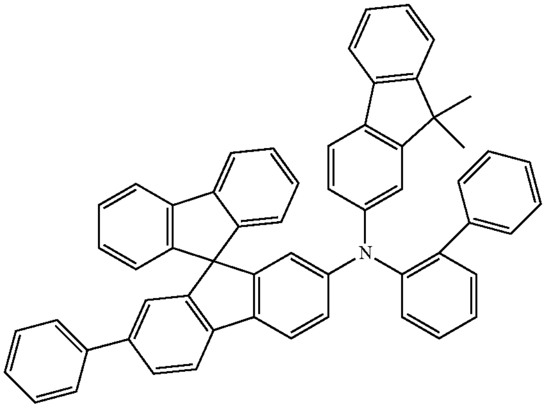
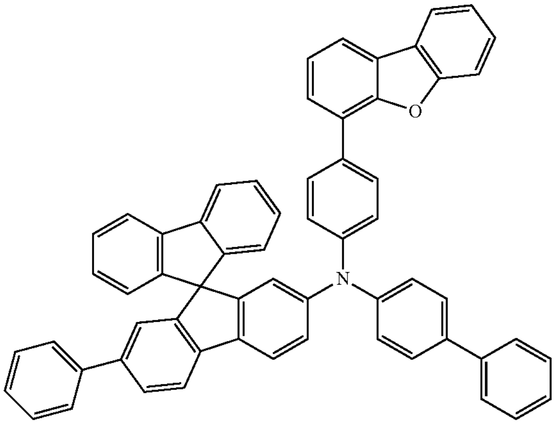
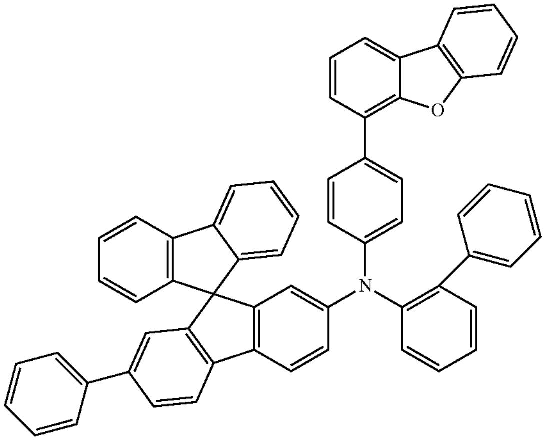
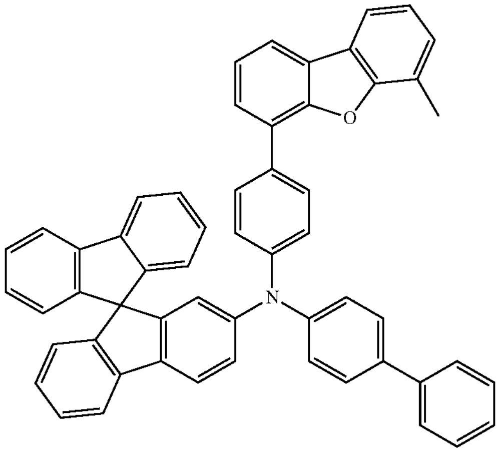
-continued
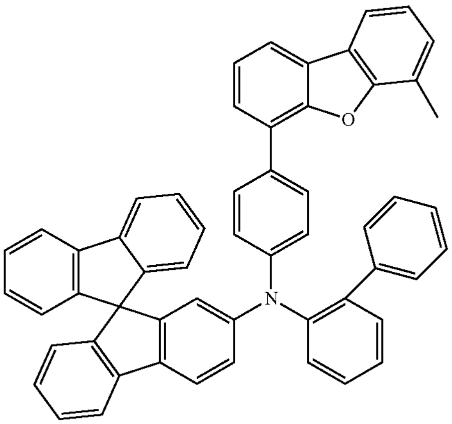
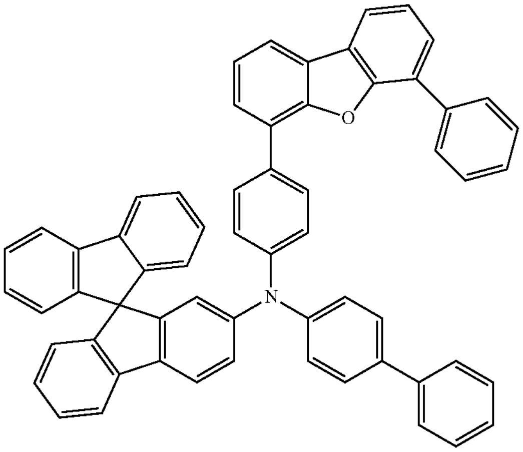
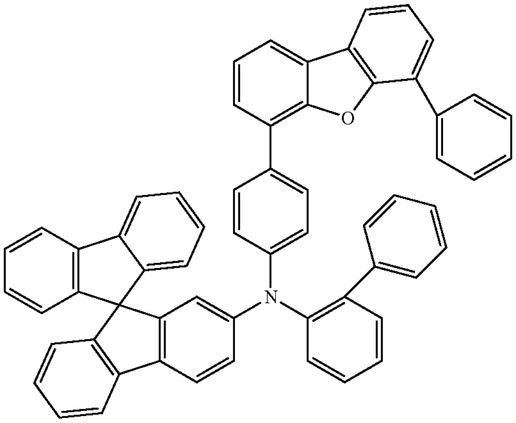
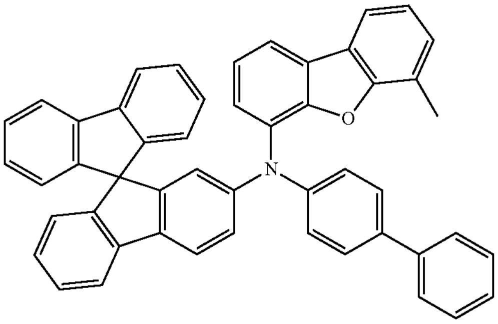

-continued
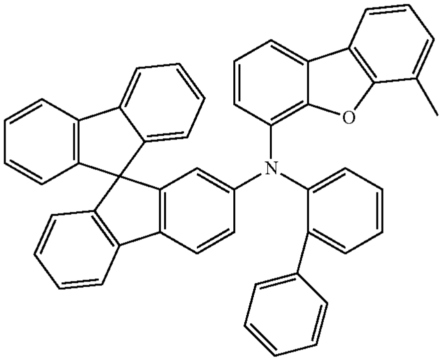
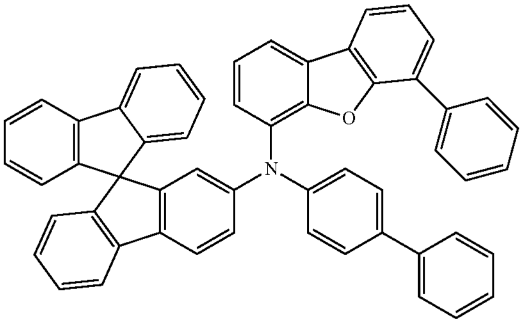
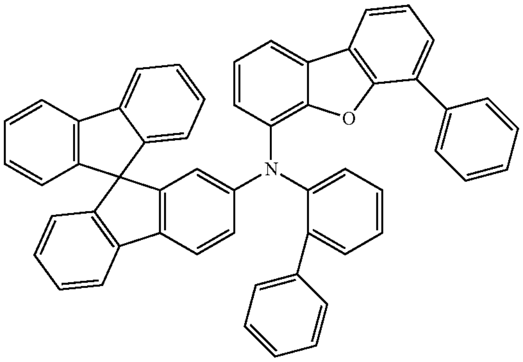
[Formula 116]
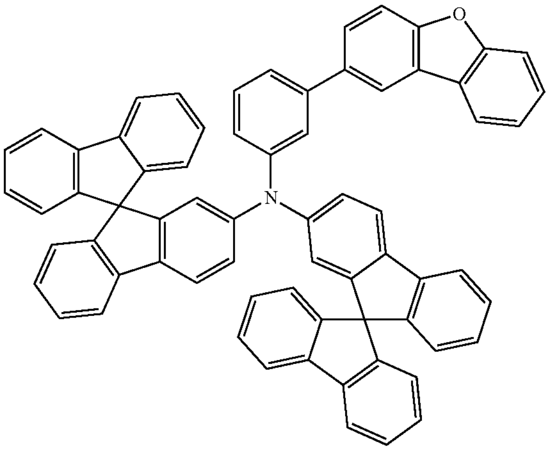
-continued
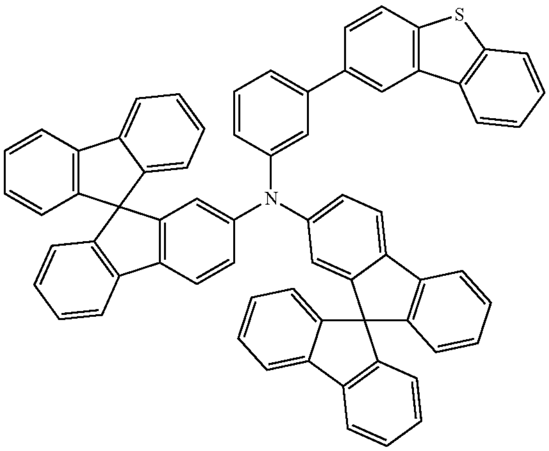
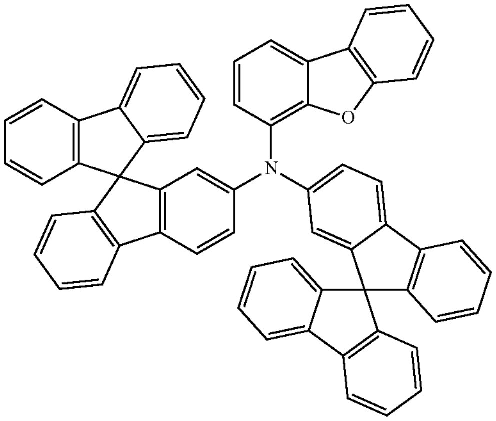
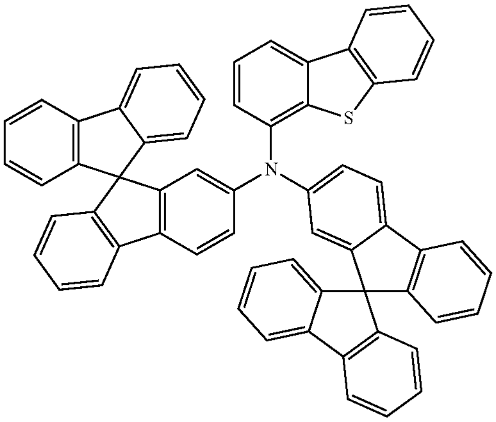

-continued
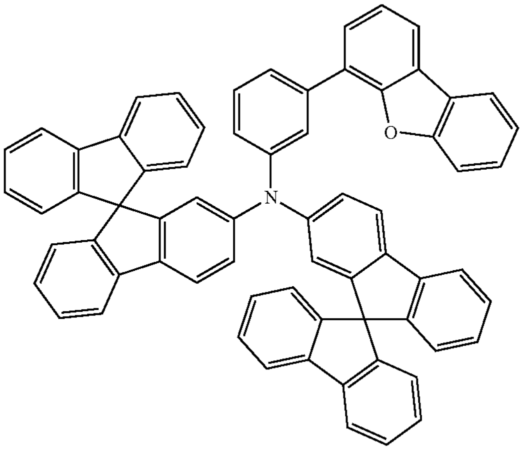
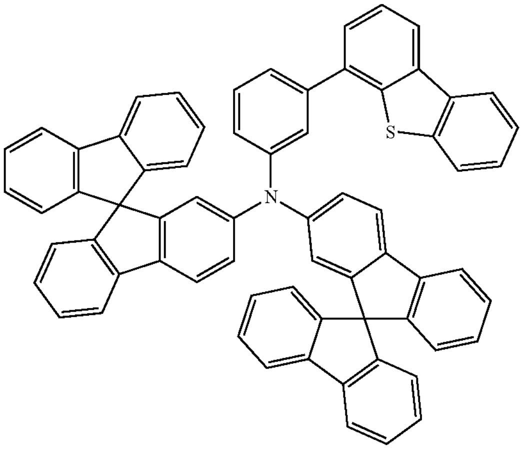
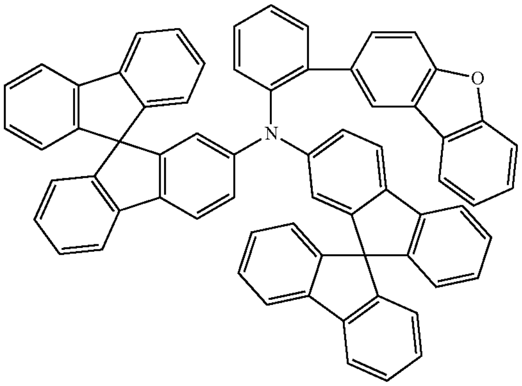
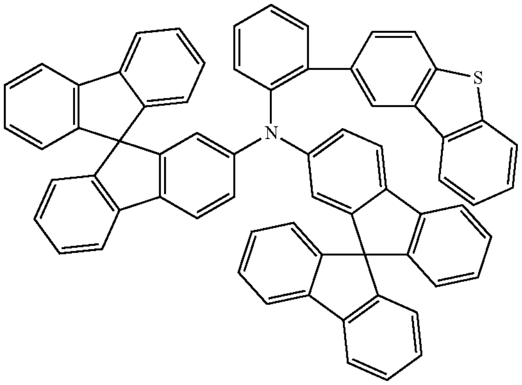
-continued
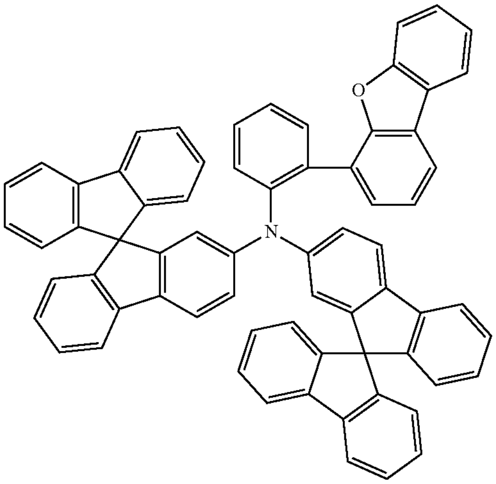
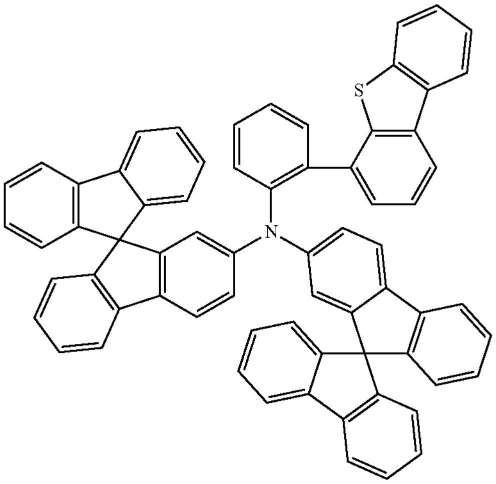
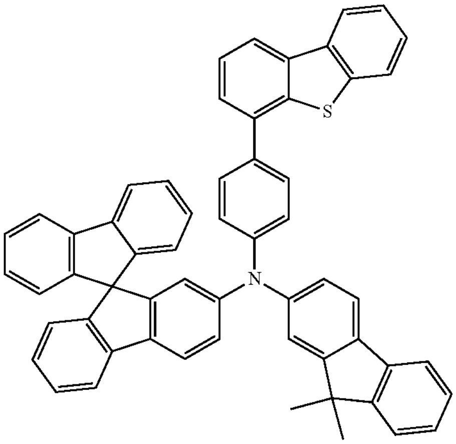

-continued
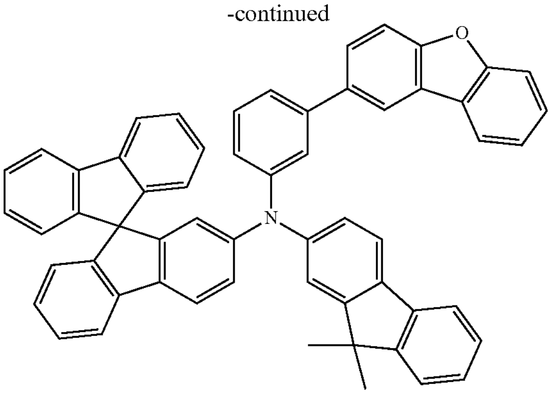
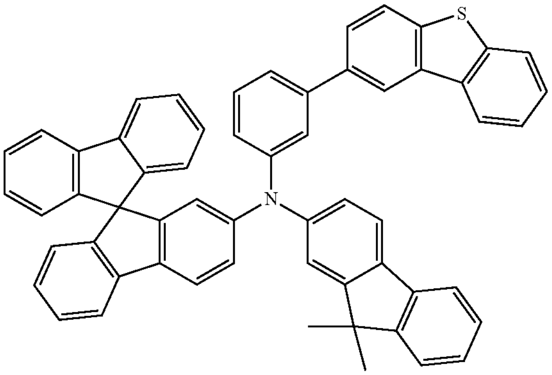
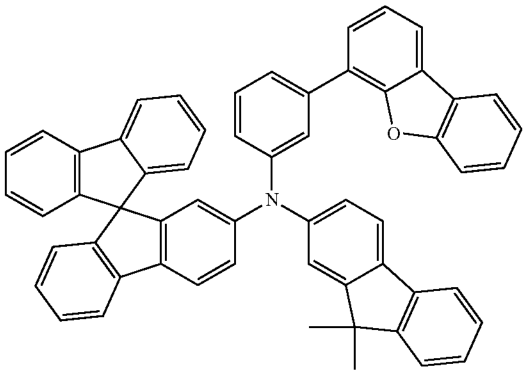
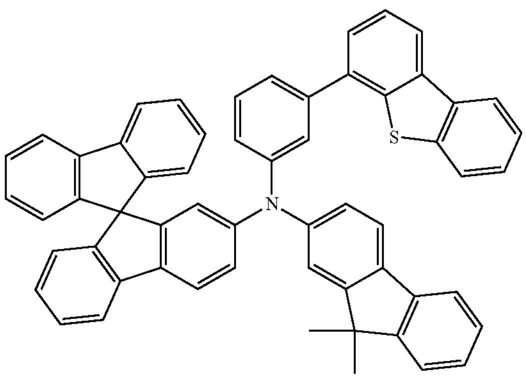
[Formula 117]
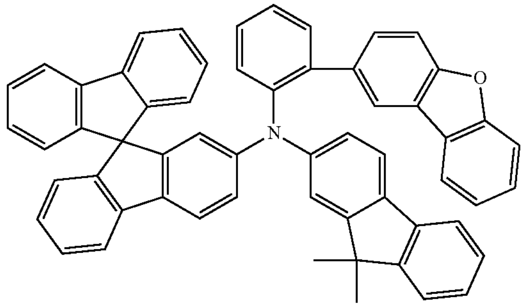
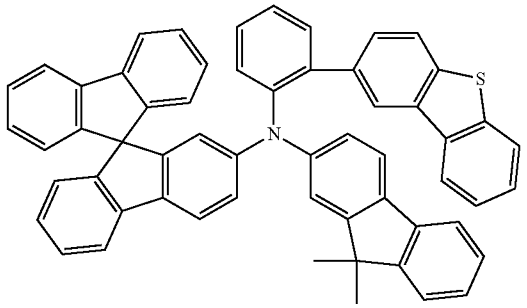
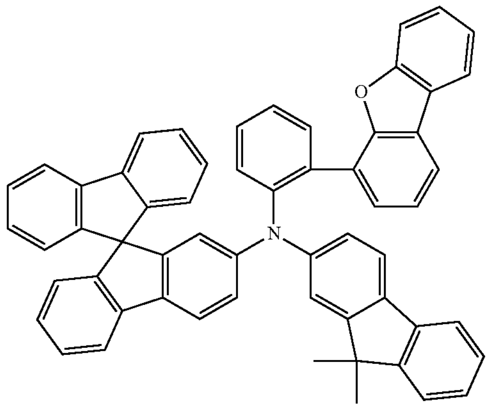
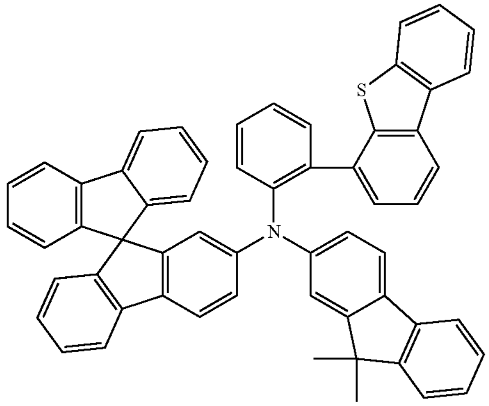

-continued
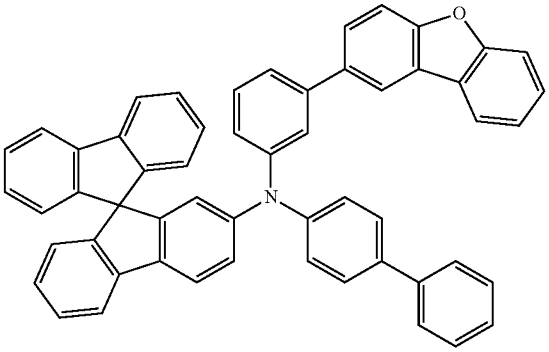
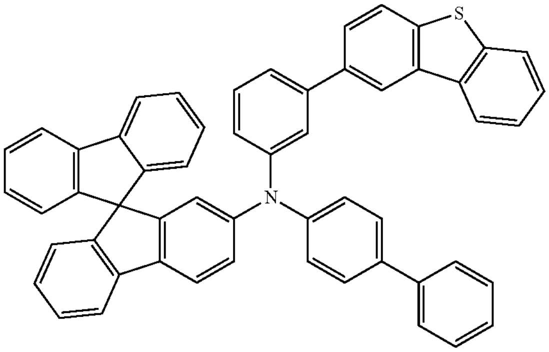
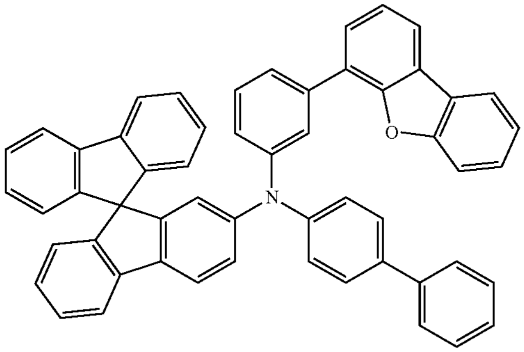
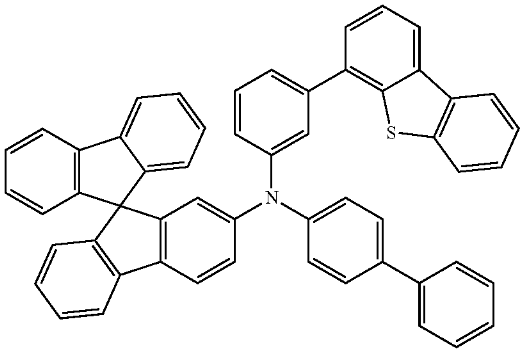
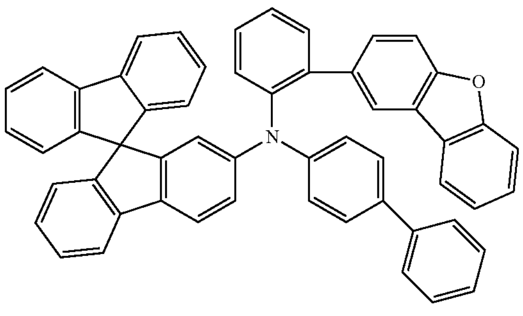
-continued
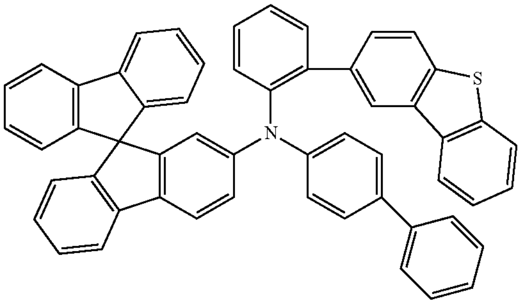
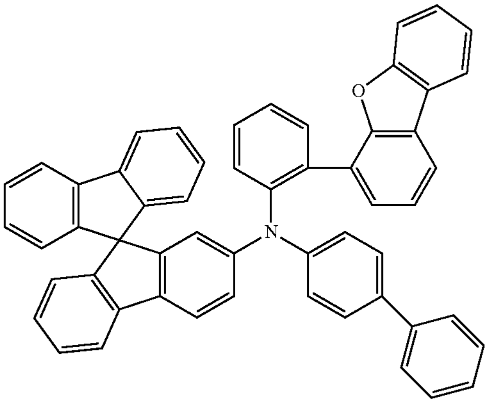
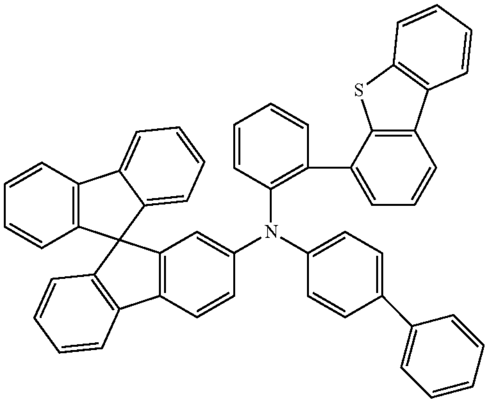
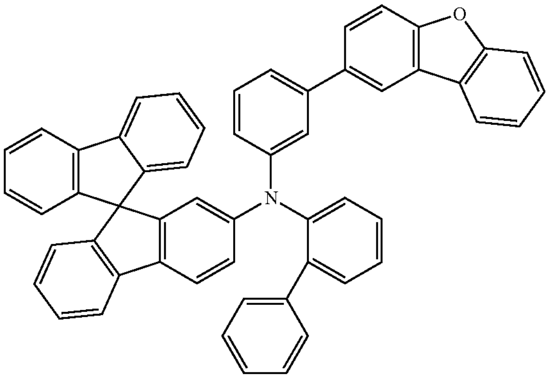

-continued
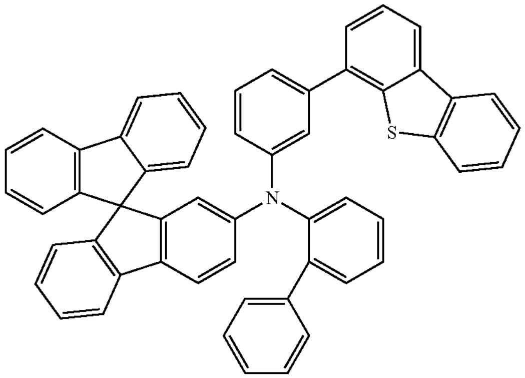
[Formula 118]
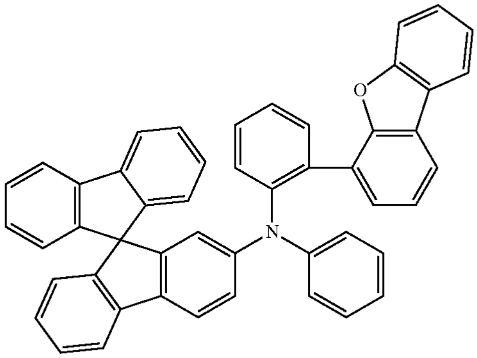
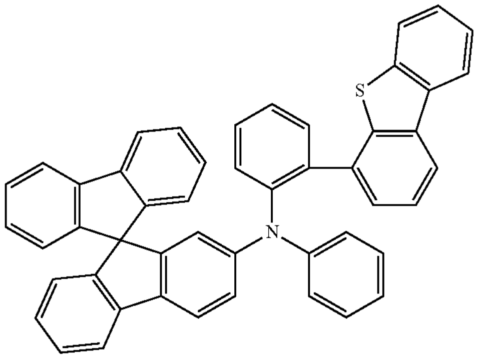
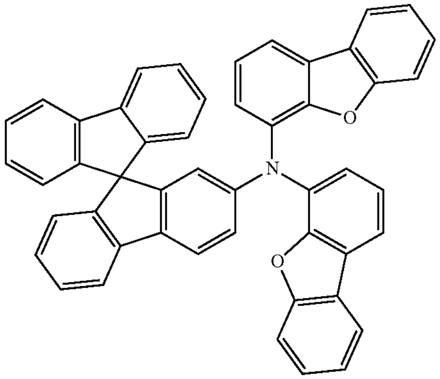
-continued
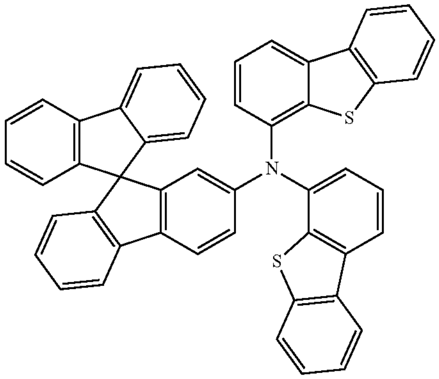
[Formula 119]
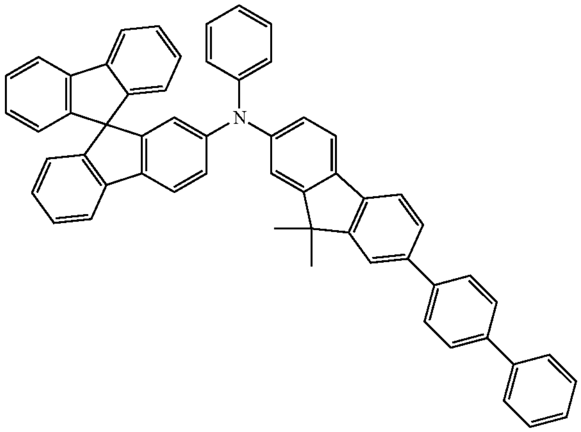
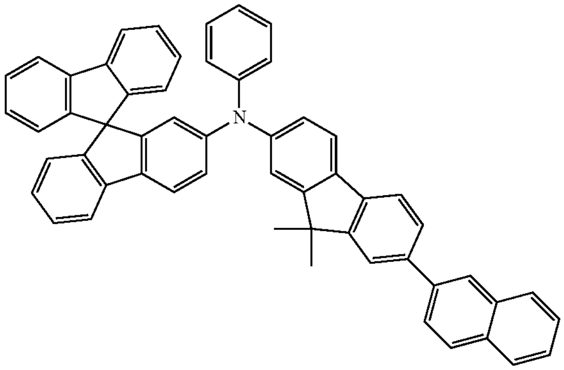
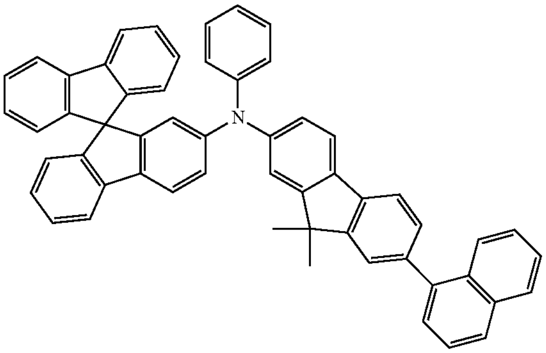

-continued
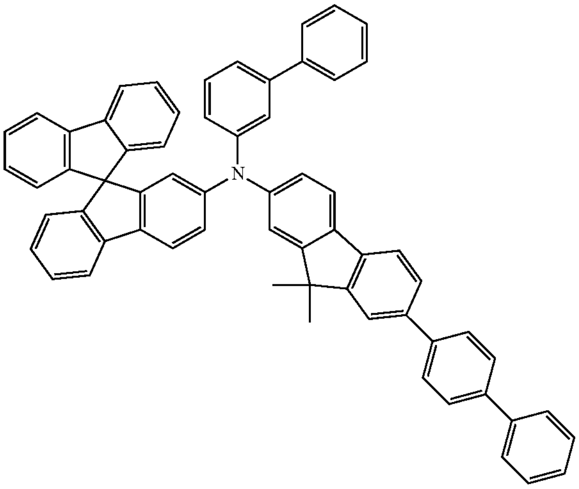
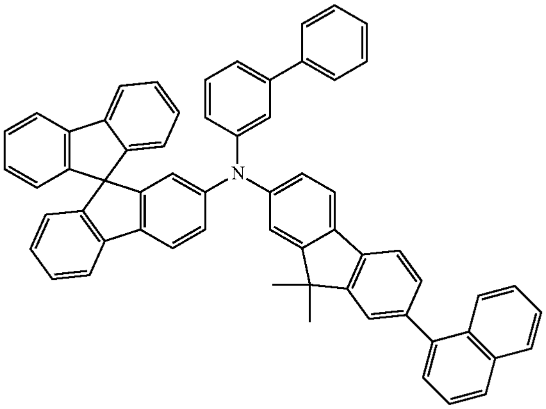
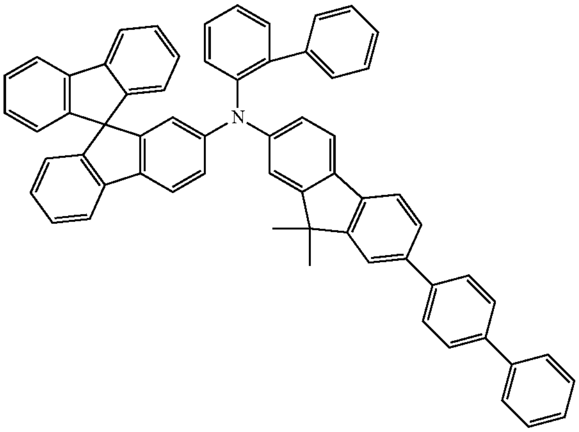
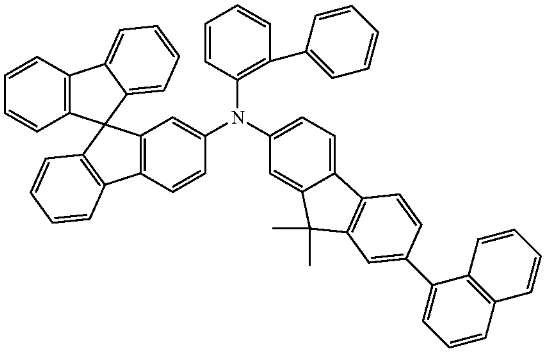
-continued
[Formula 120]
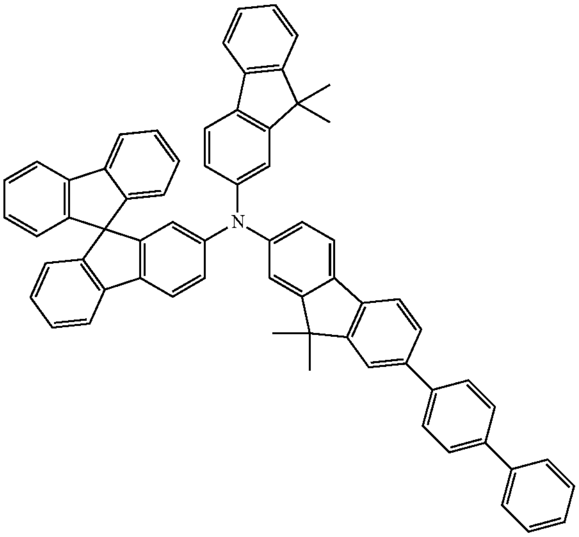
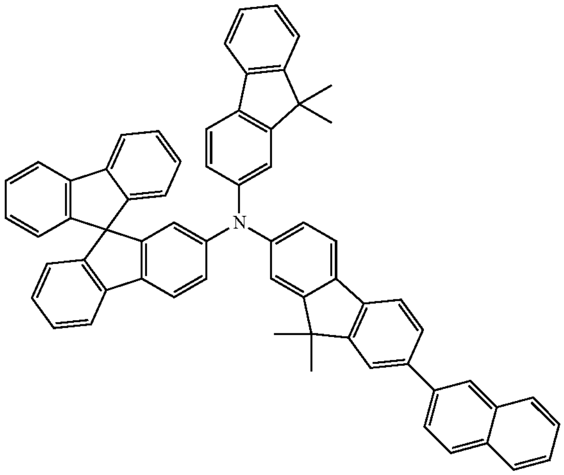
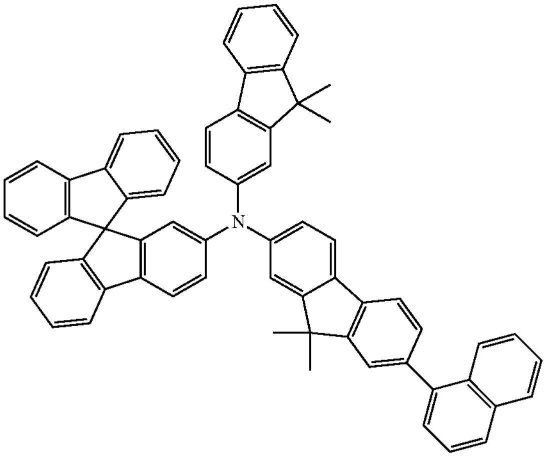

-continued
[Formula 121]
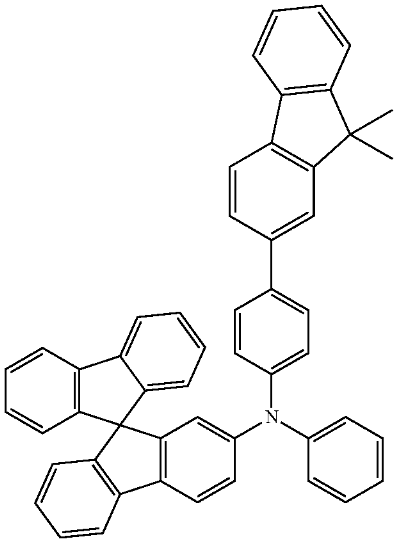
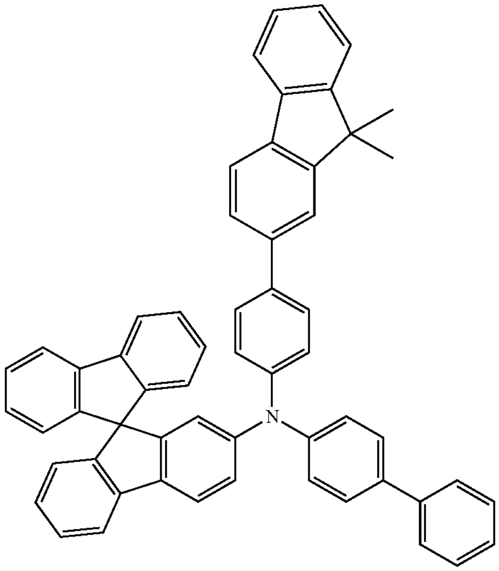
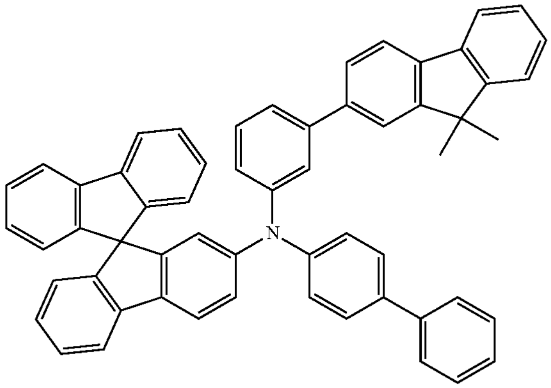
-continued
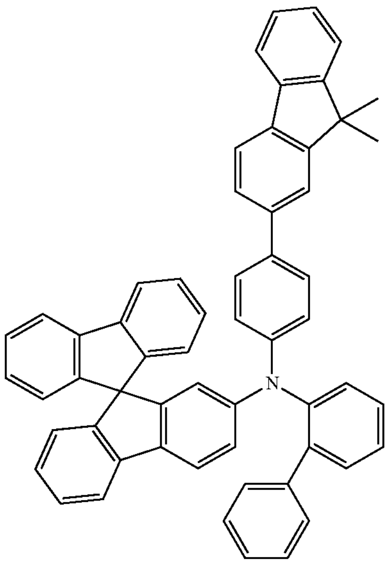
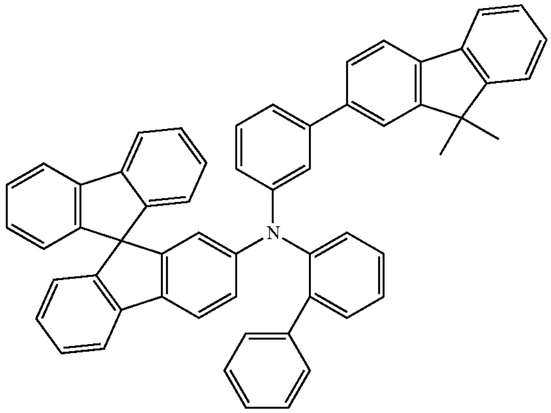
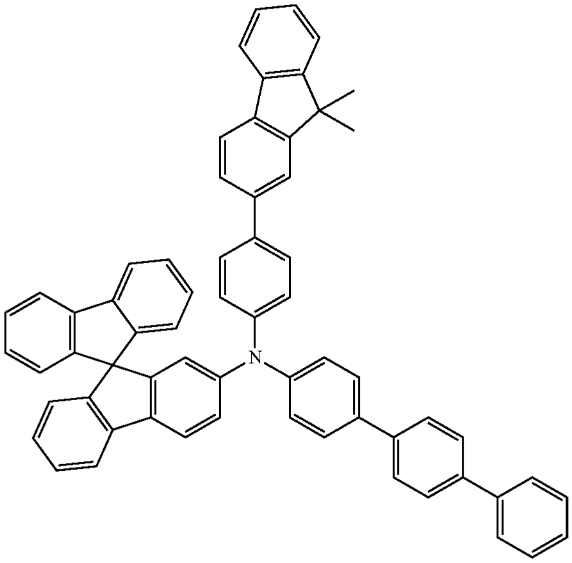

-continued
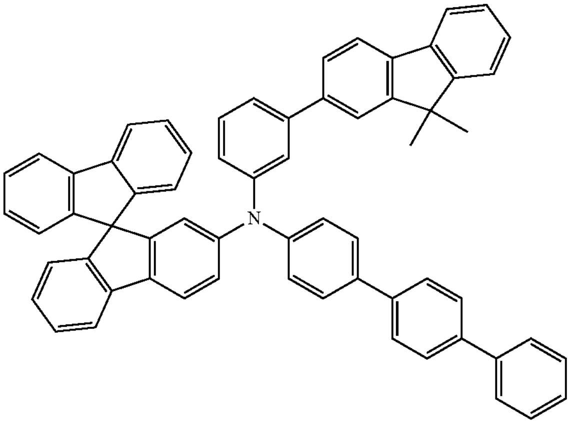
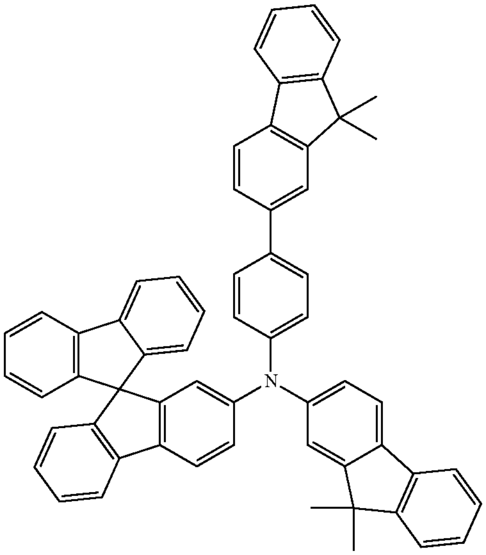
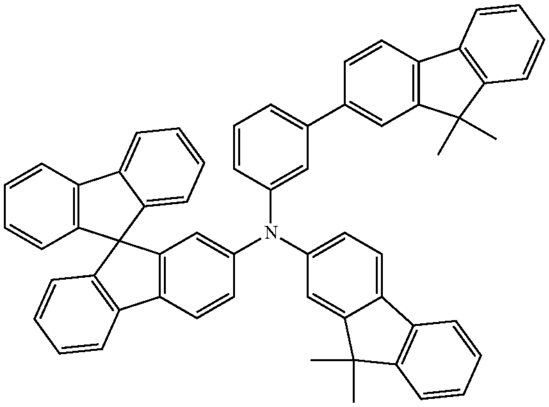
-continued
[Formula 122]
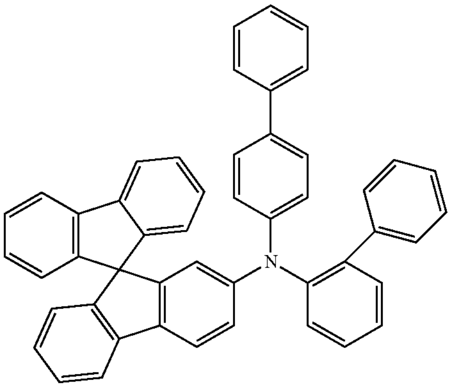
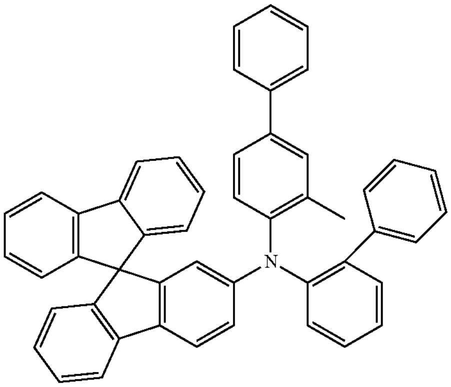
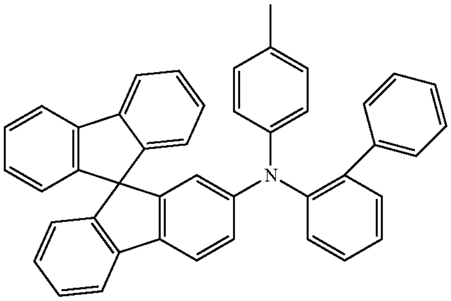
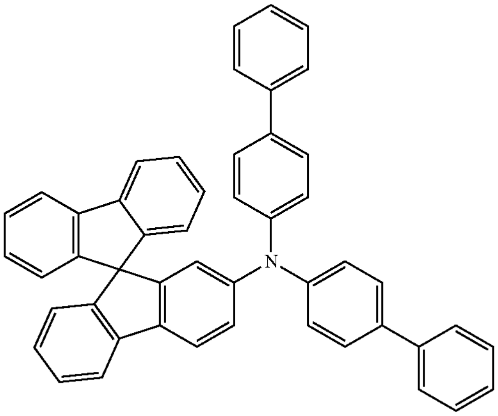

-continued
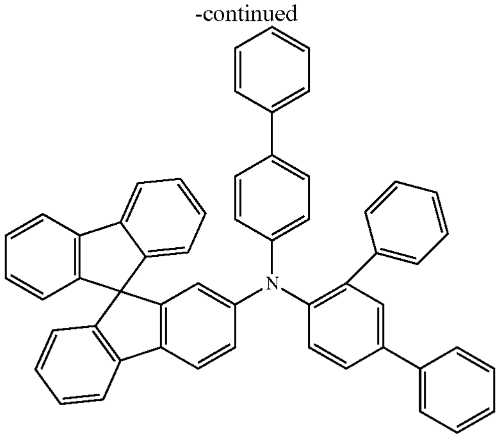
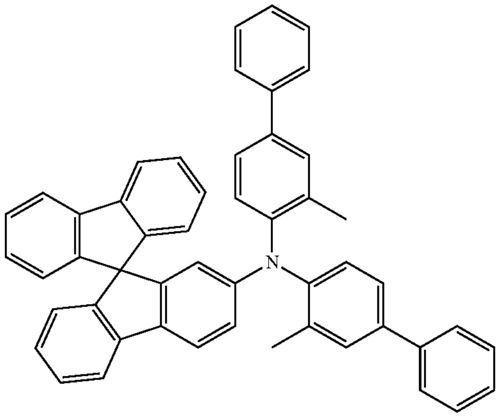
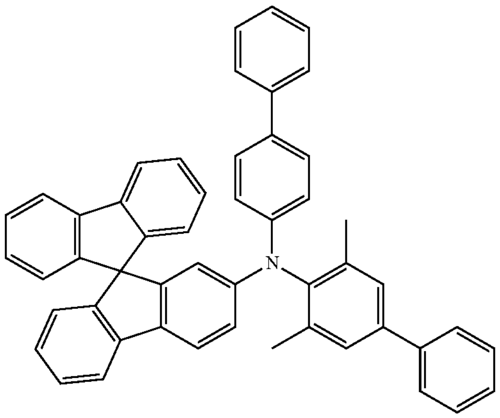
[Formula 123]
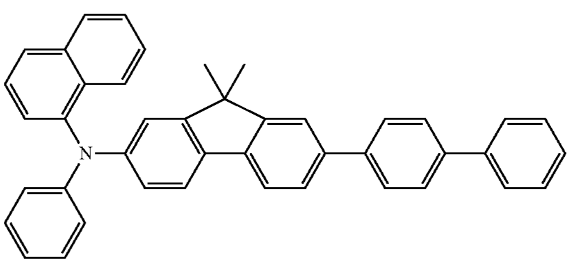
-continued
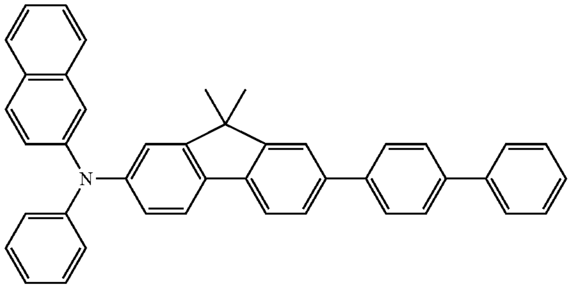
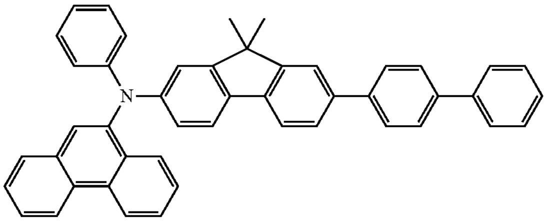
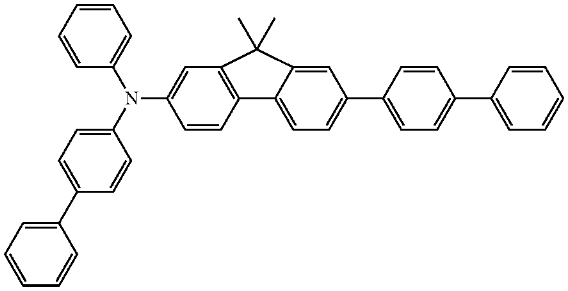
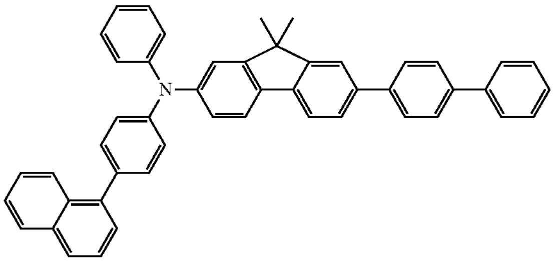
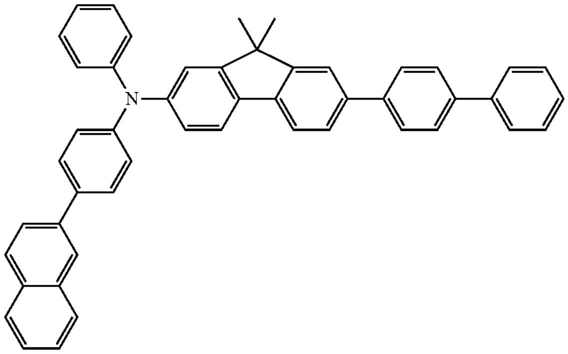

-continued
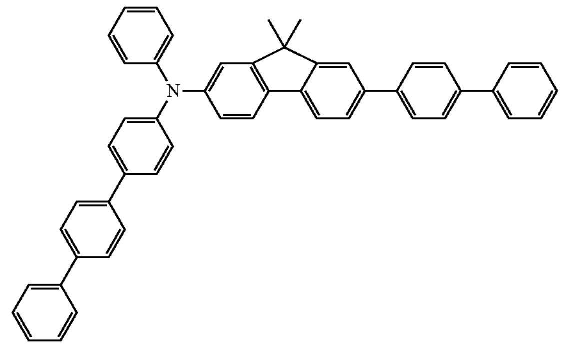
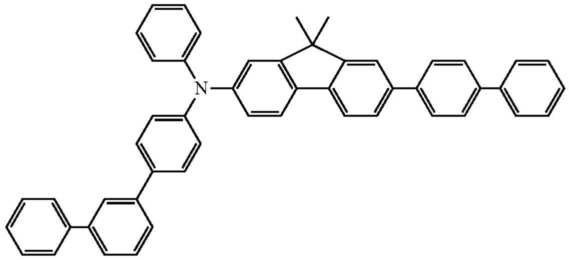
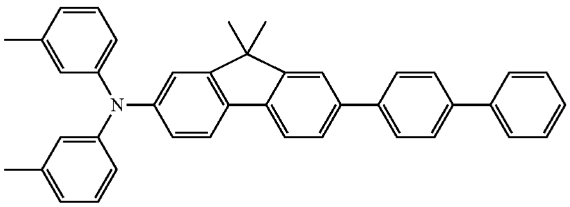
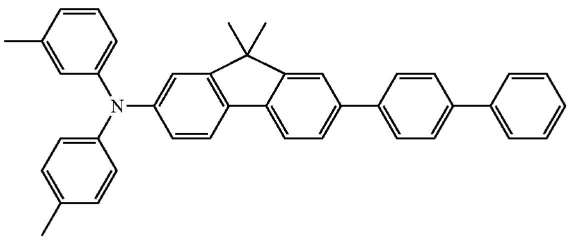
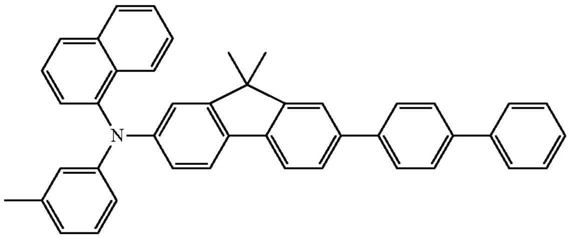
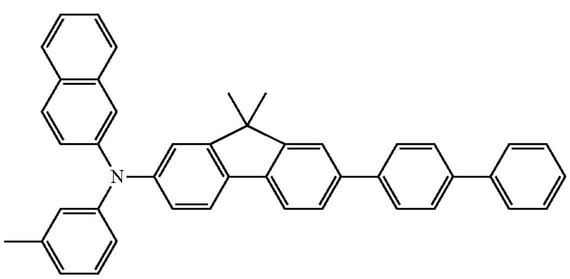
-continued
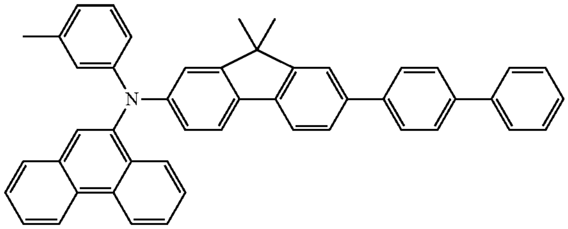
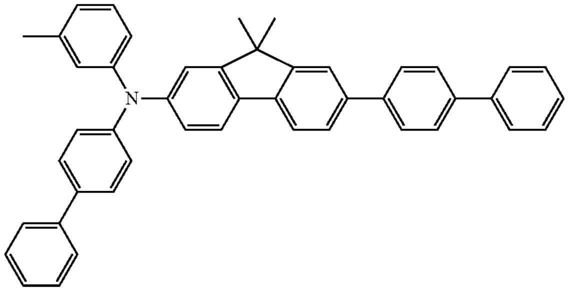
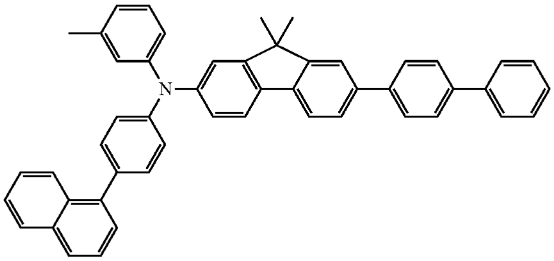
[Formula 124]
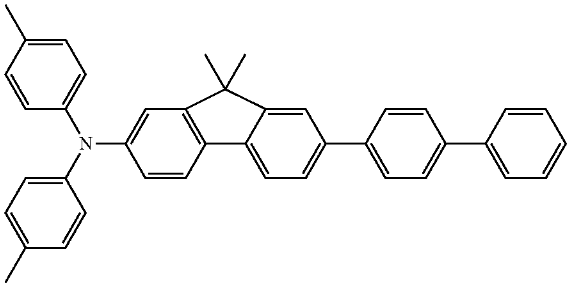
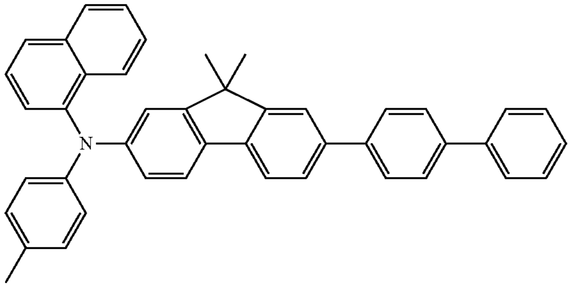
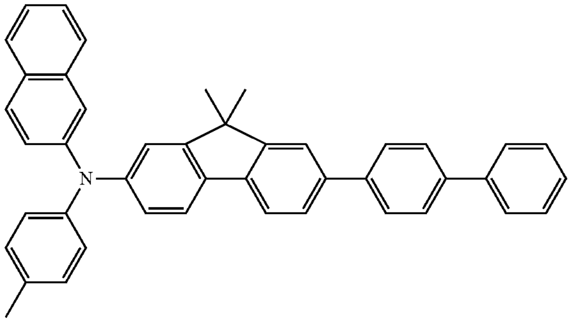

-continued
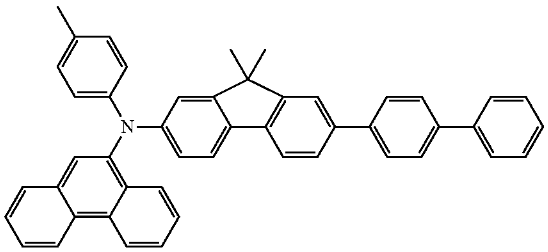
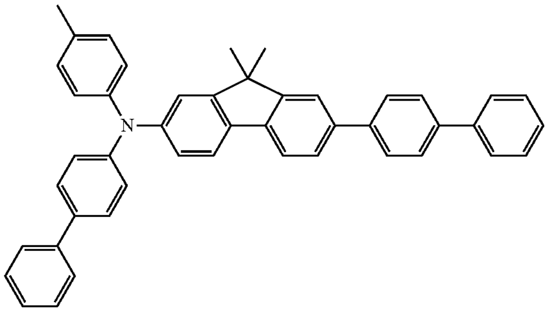
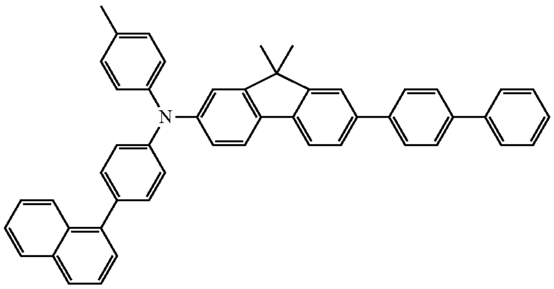
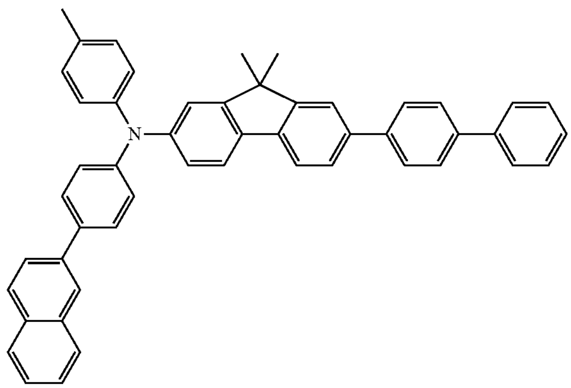
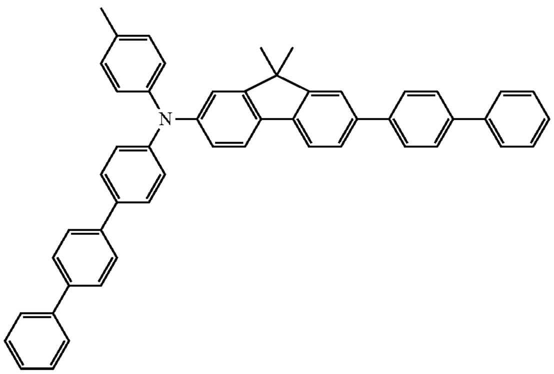
-continued
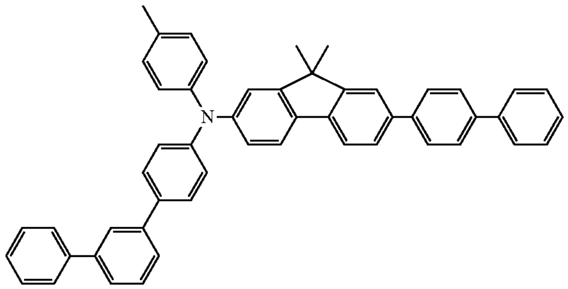
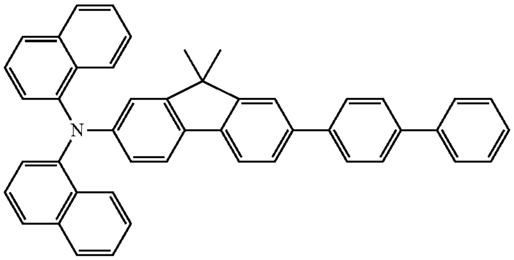
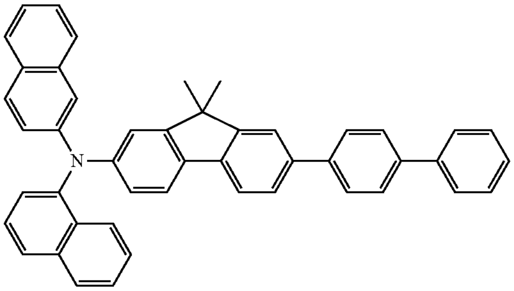
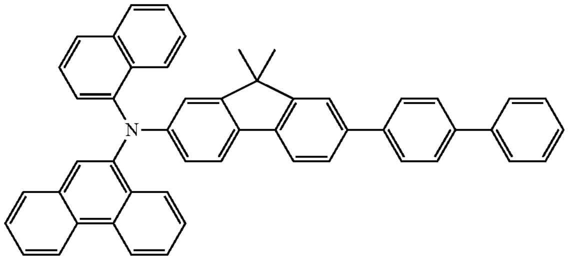
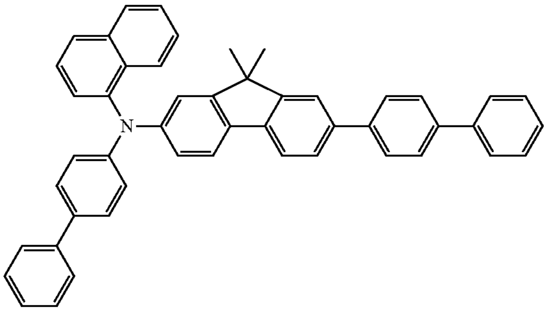
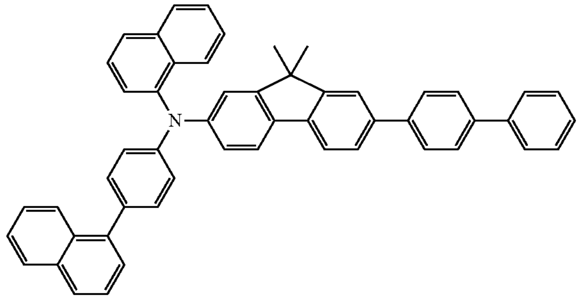

-continued
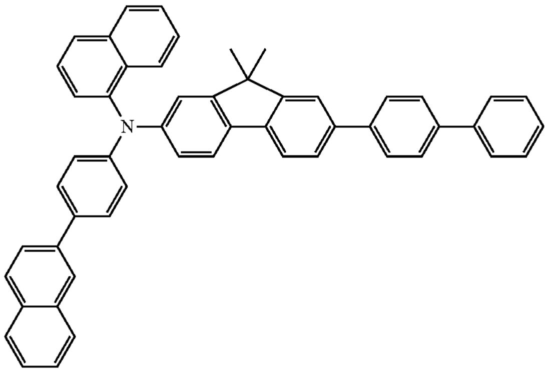
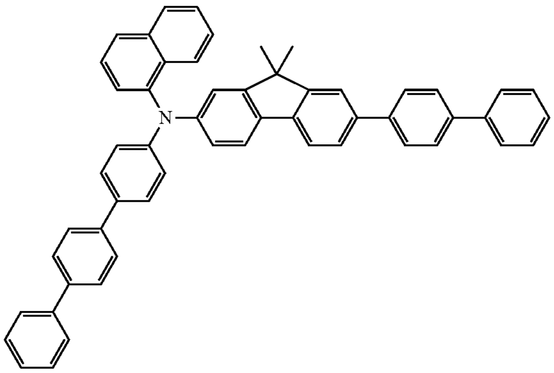
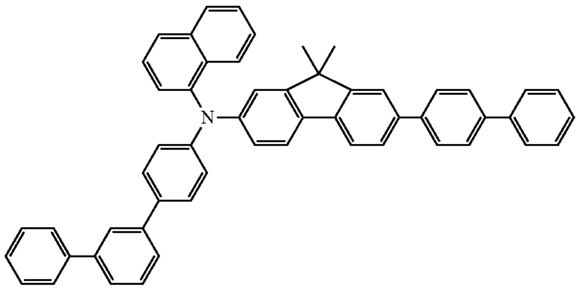
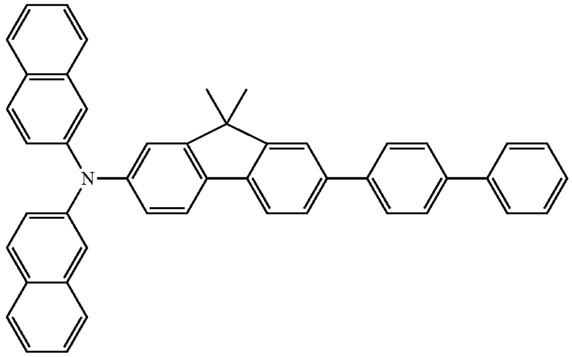
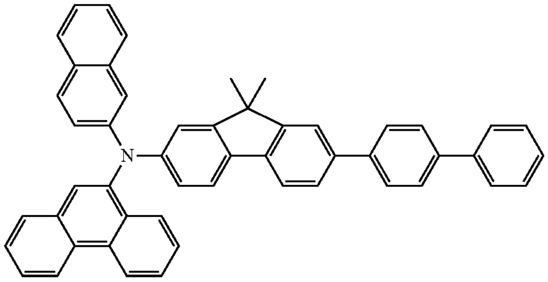
-continued
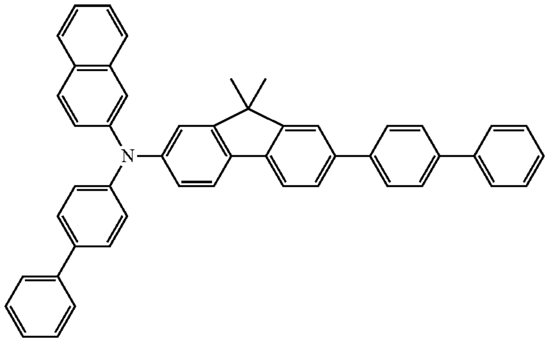
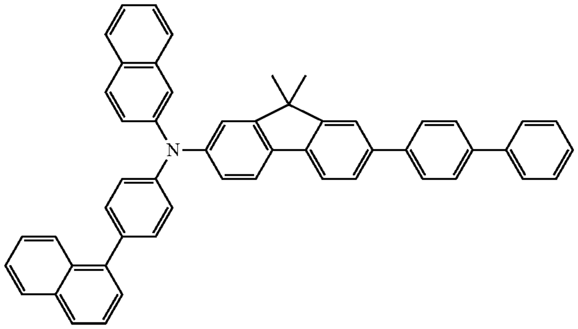
[Formula 125]
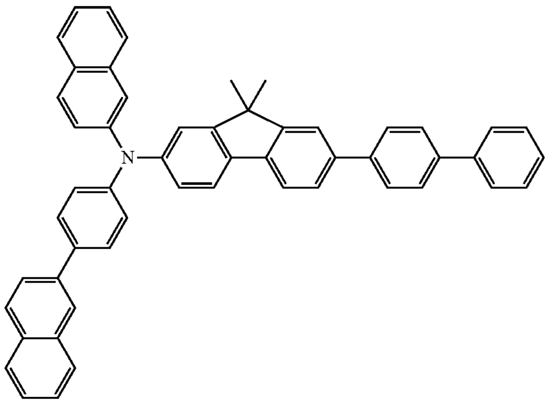
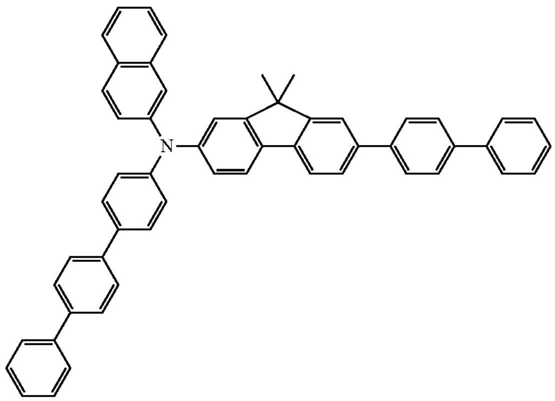

-continued
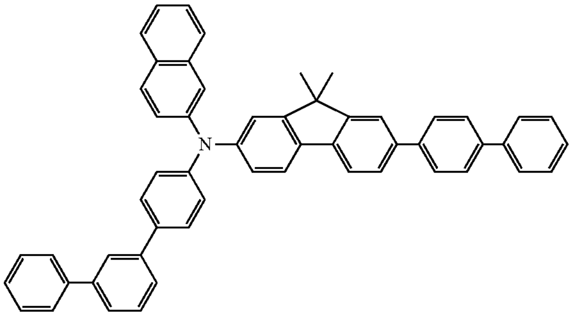
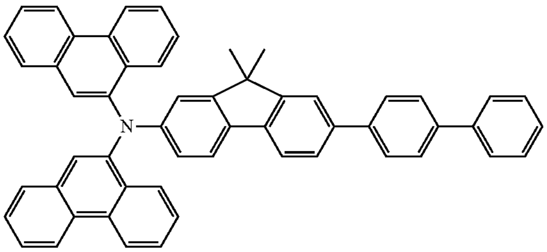
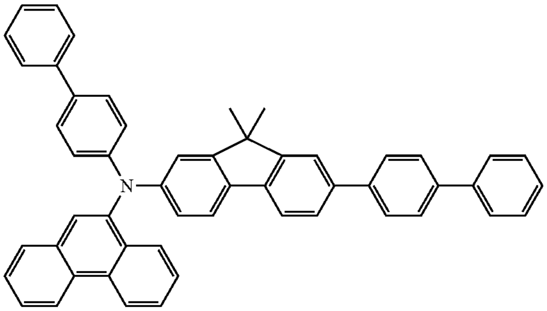
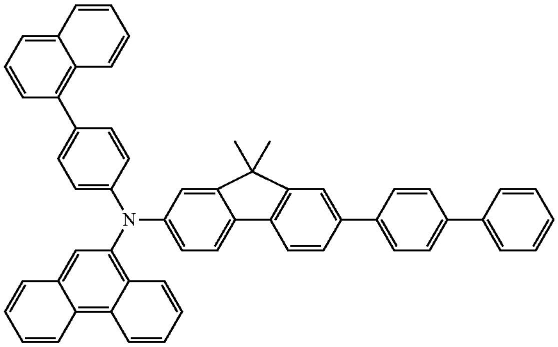
-continued
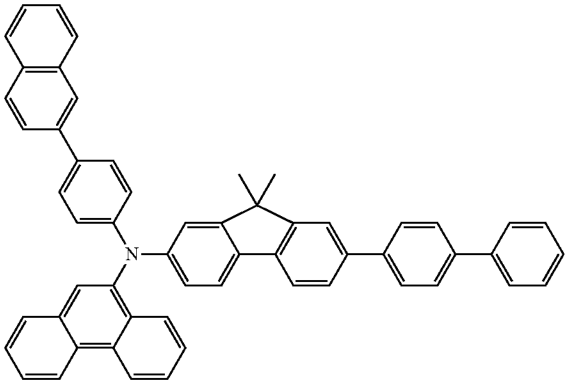
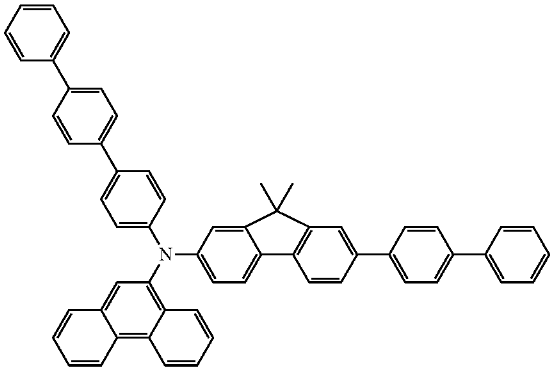
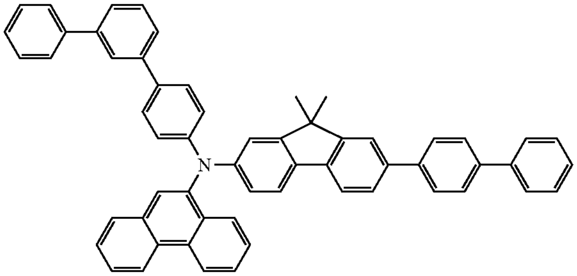
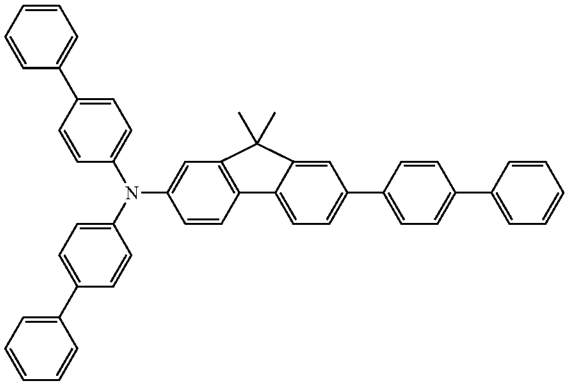

[Formula 126]
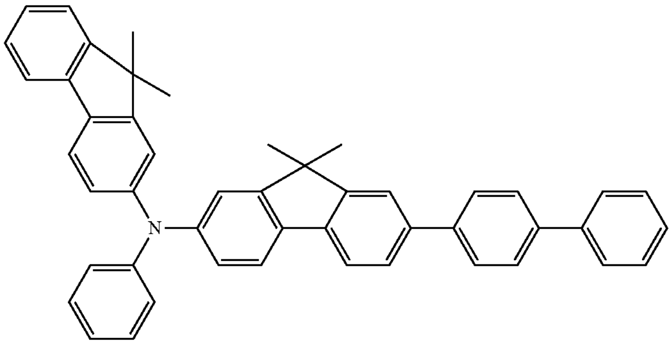
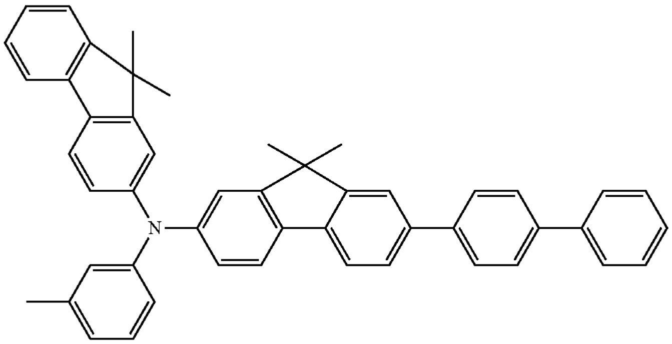
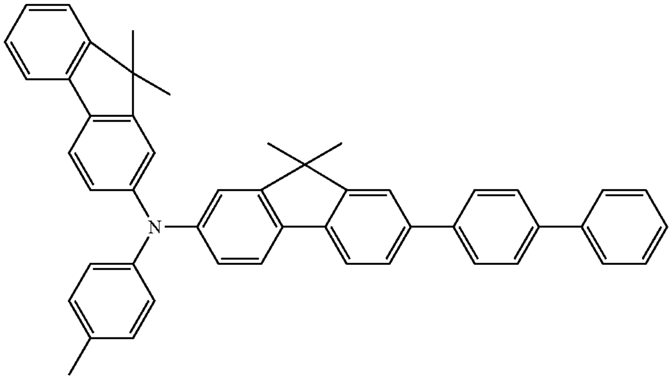
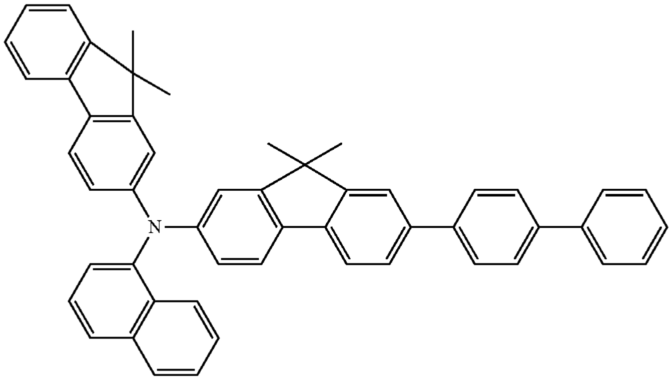

-continued
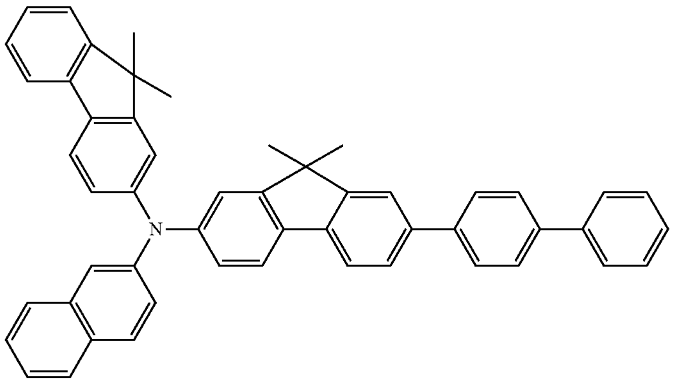
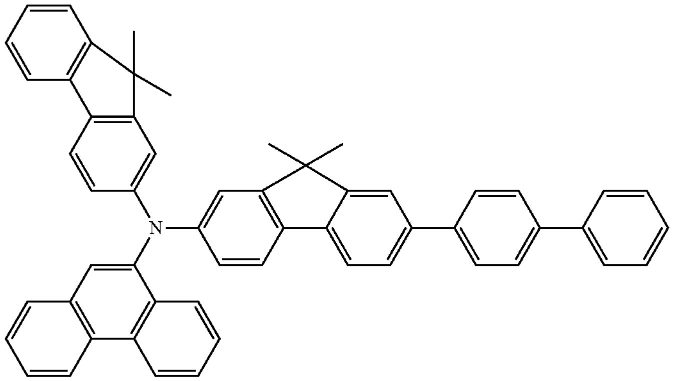
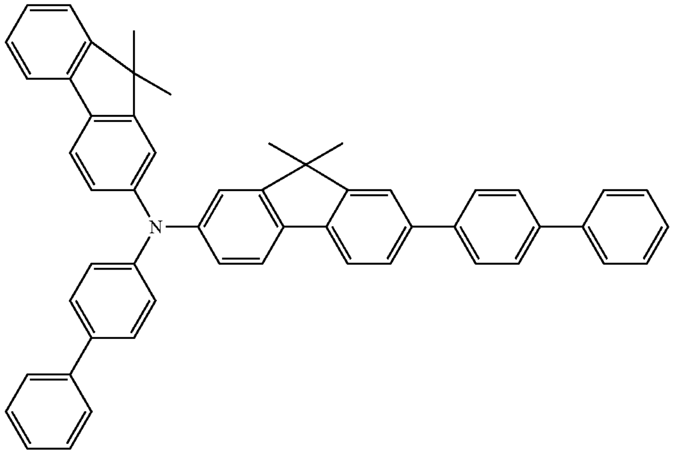
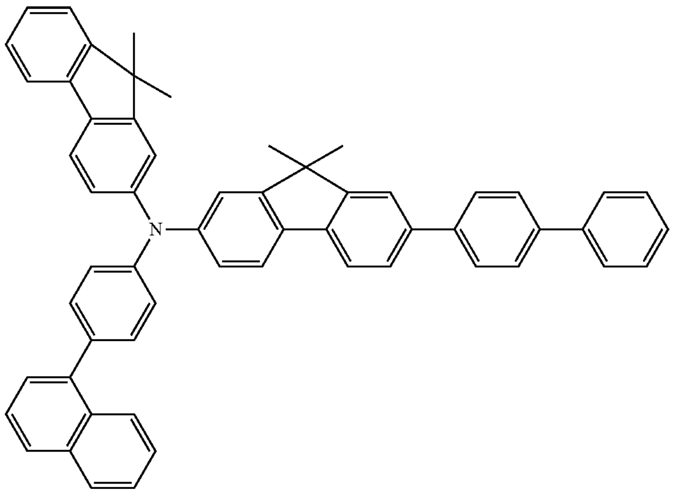

-continued
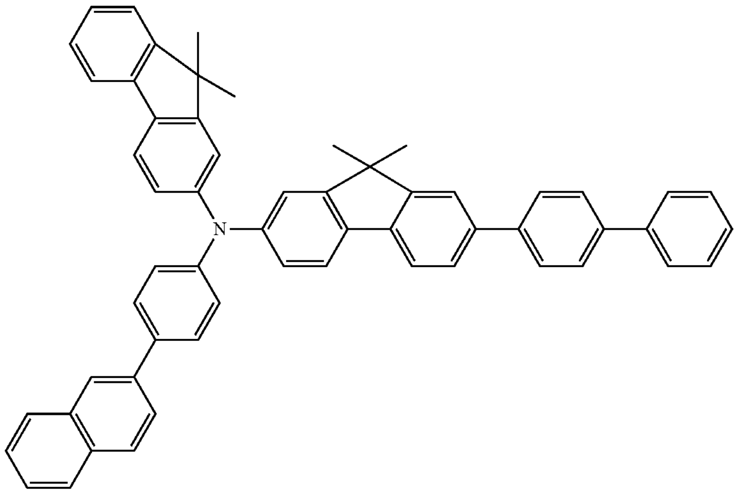
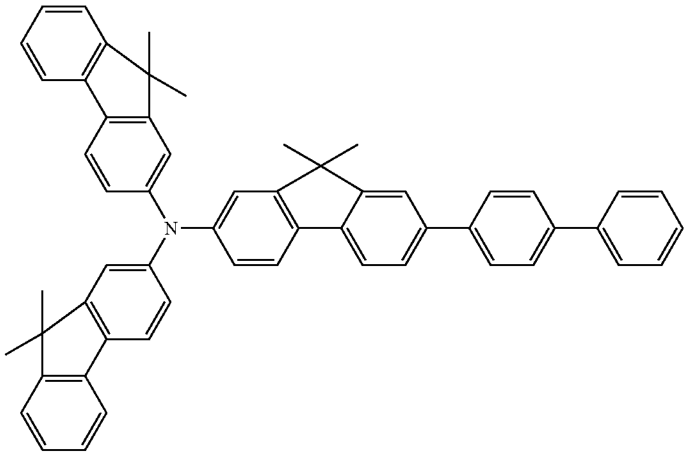
[Formula 127]
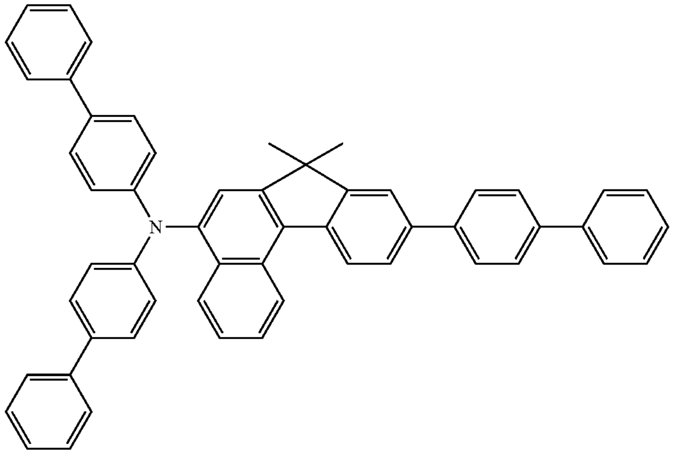

-continued
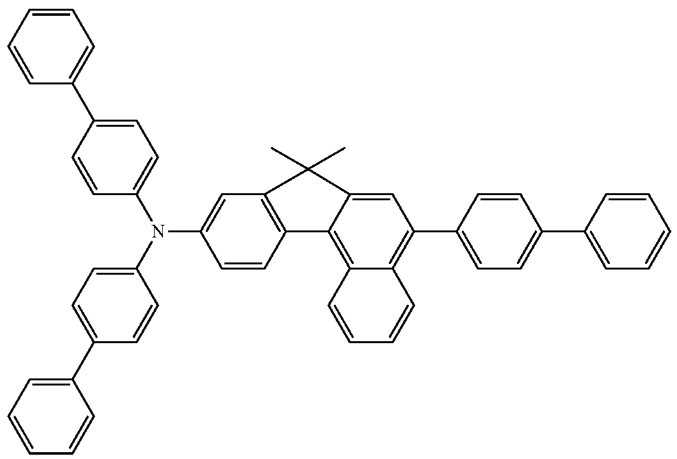
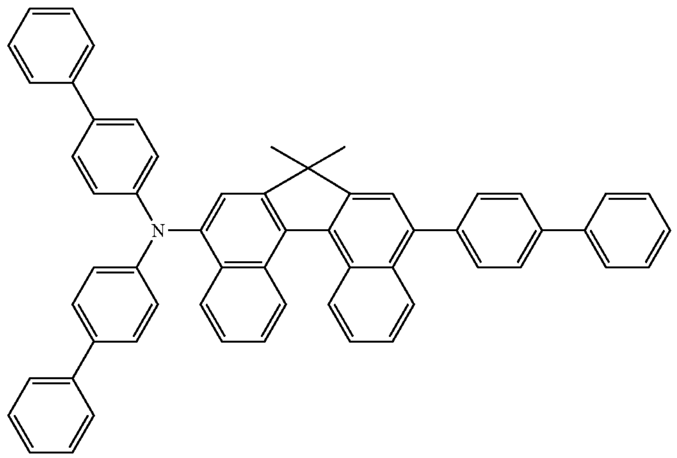
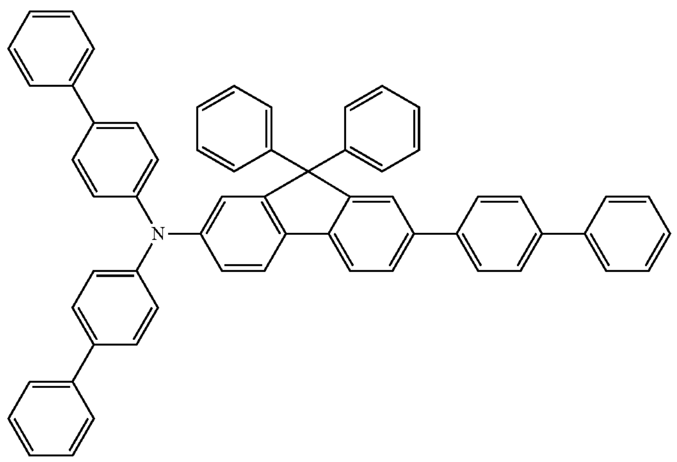

-continued
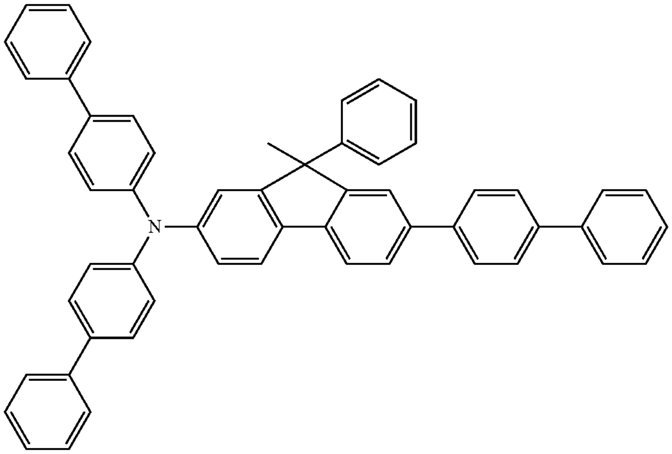
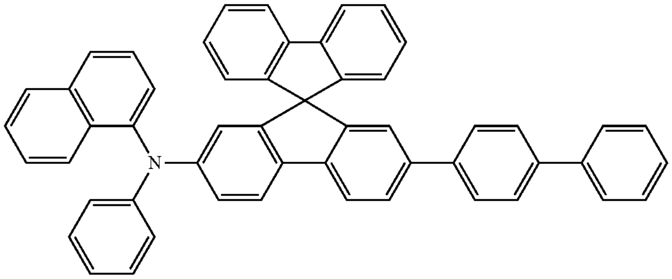
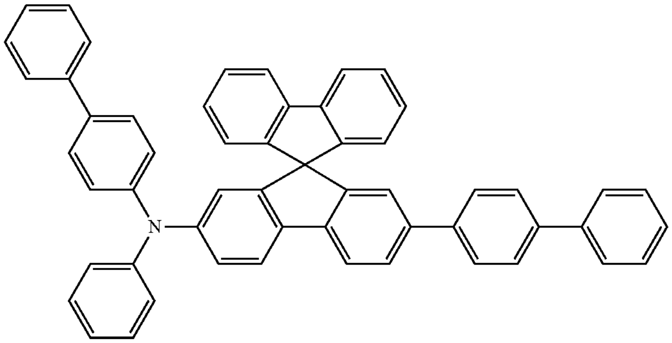
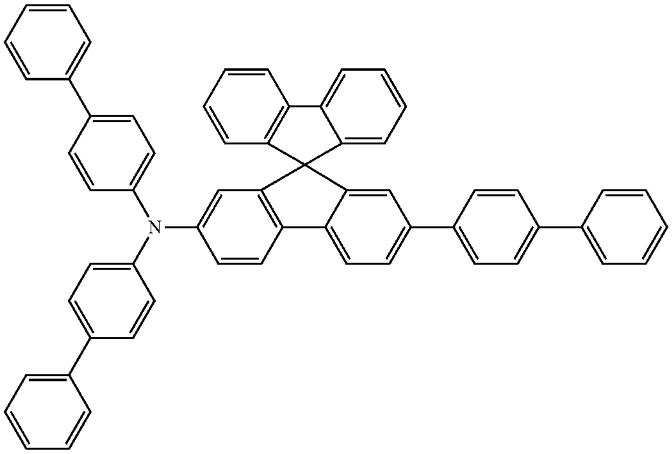

-continued
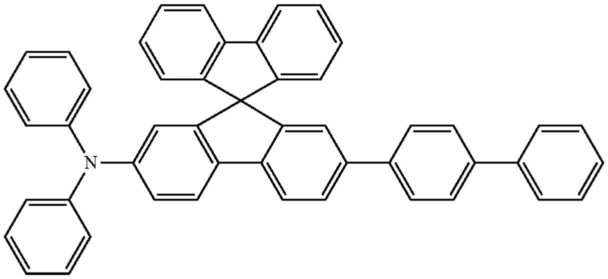
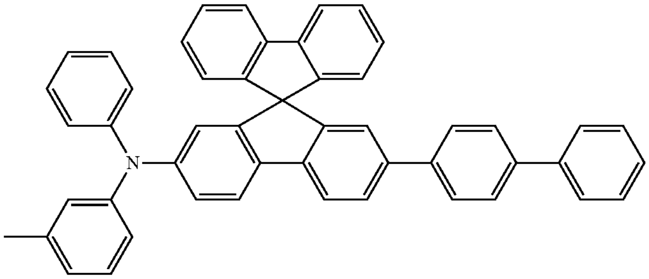
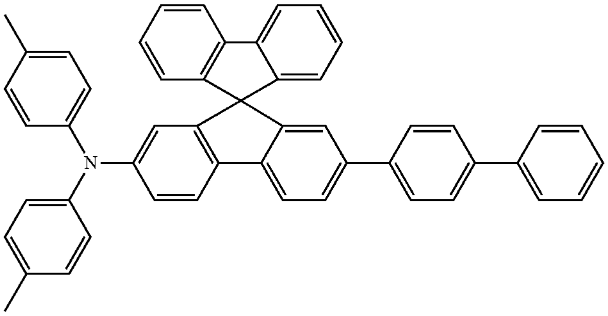
[Formula 128]
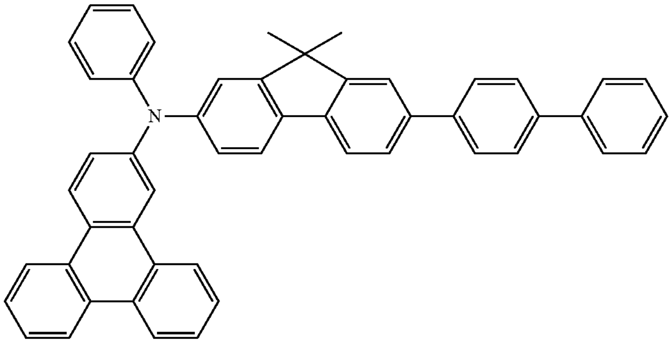
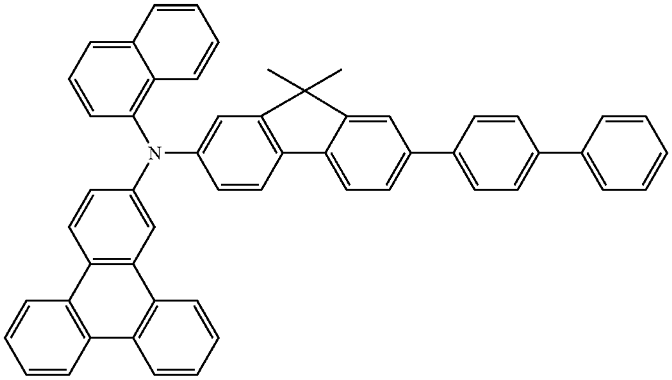

-continued
[Formula 129]
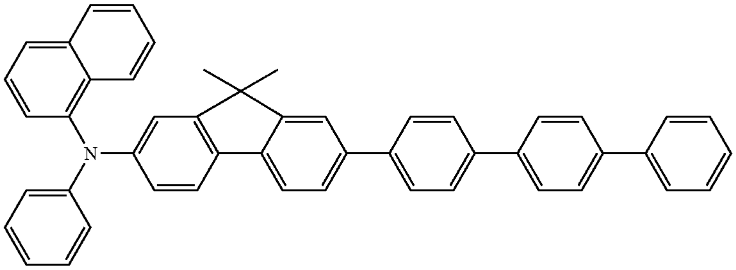
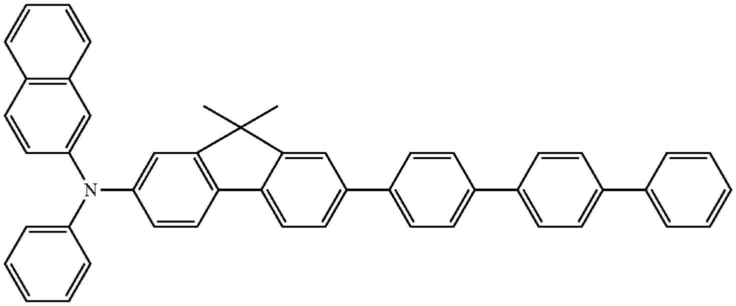
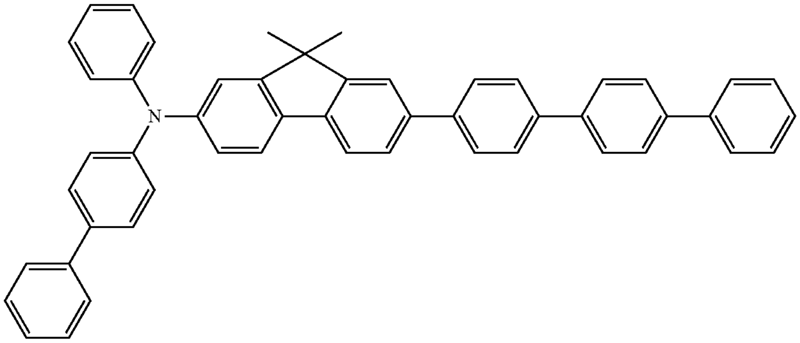
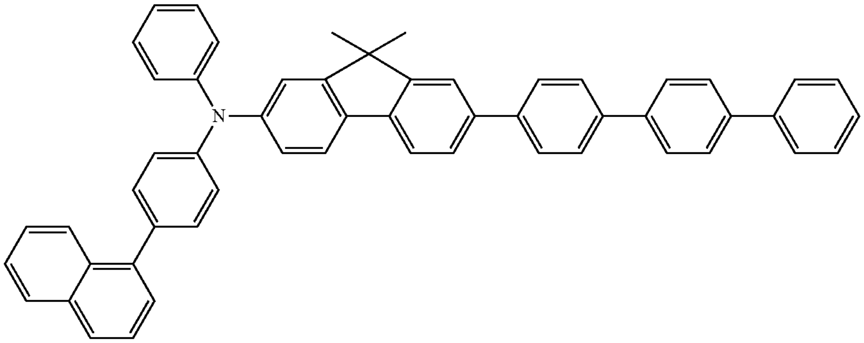
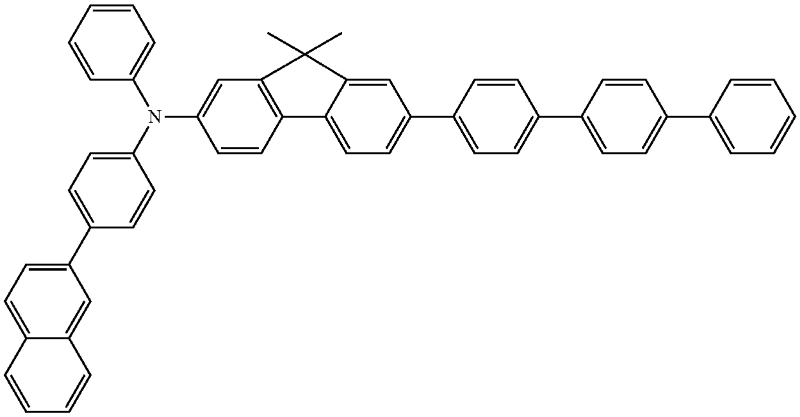

-continued
[Formula 130]
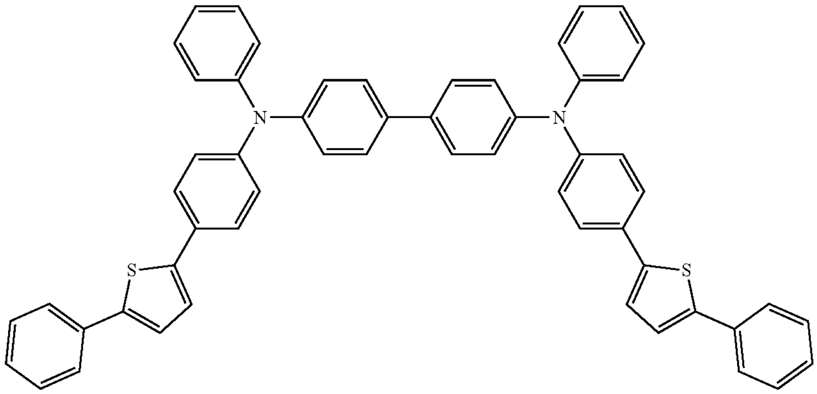
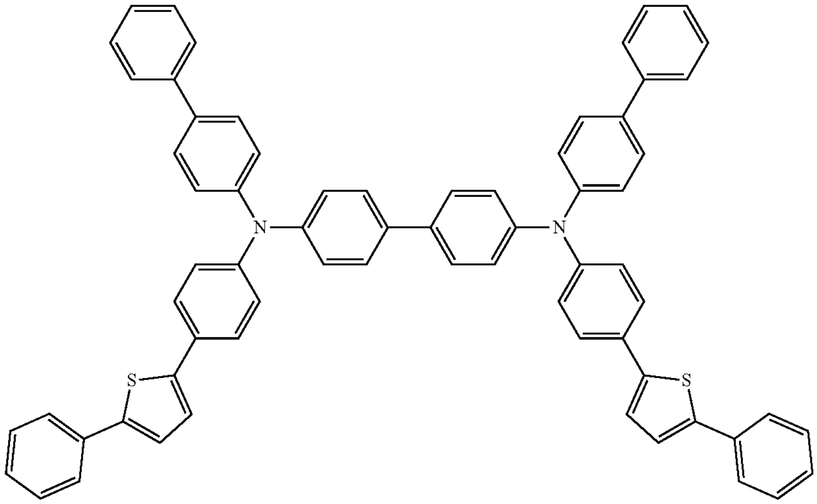
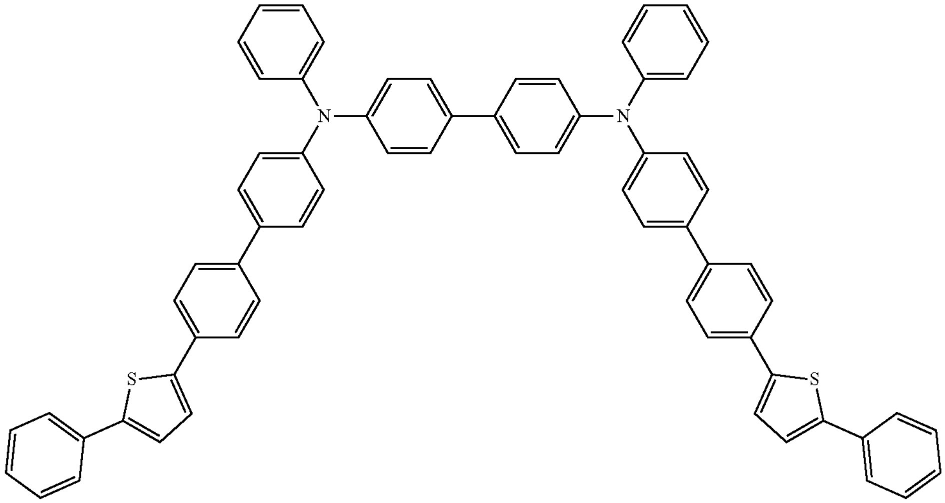

-continued
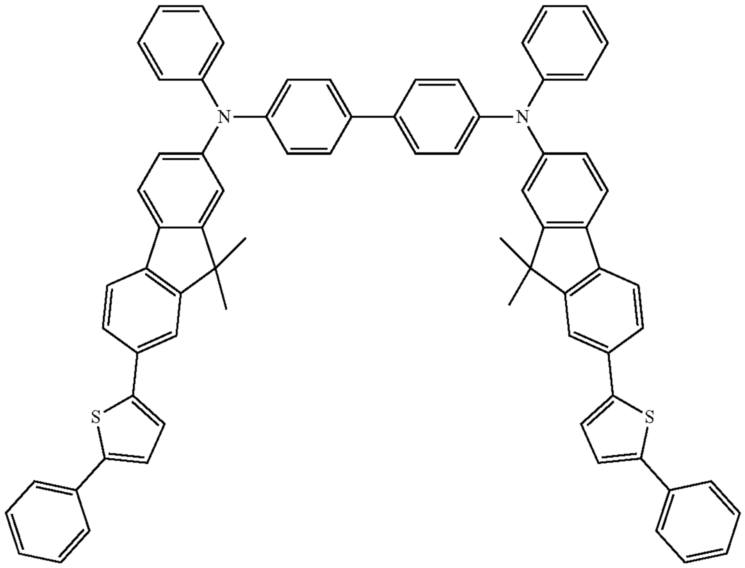 [SMILES: CC1(C)c2cc(-c3ccc(-c4ccccc4)s3)ccc2-c2ccc(N(c3ccccc3)c3ccc(-c4ccc(N(c5ccccc5)c5ccc6c(c5)C(C)(C)c5cc(-c7ccc(-c8ccccc8)s7)ccc5-6)cc4)cc3)cc21]
[Formula 131]
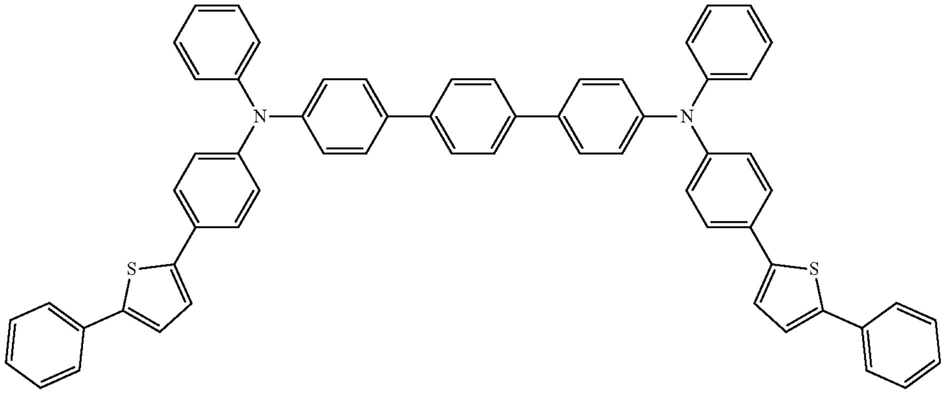
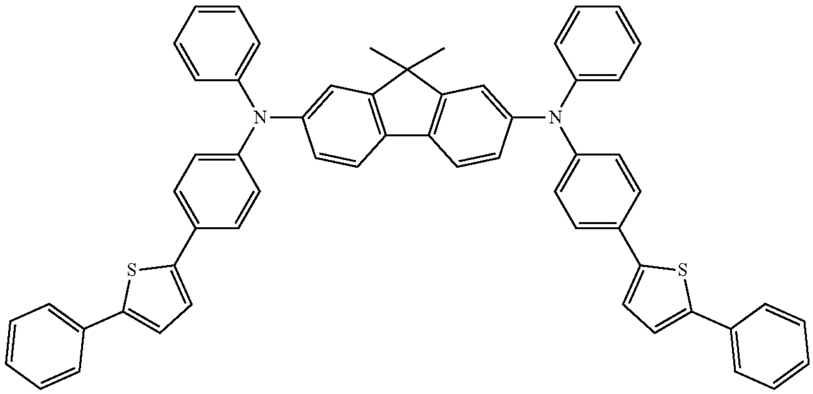

-continued
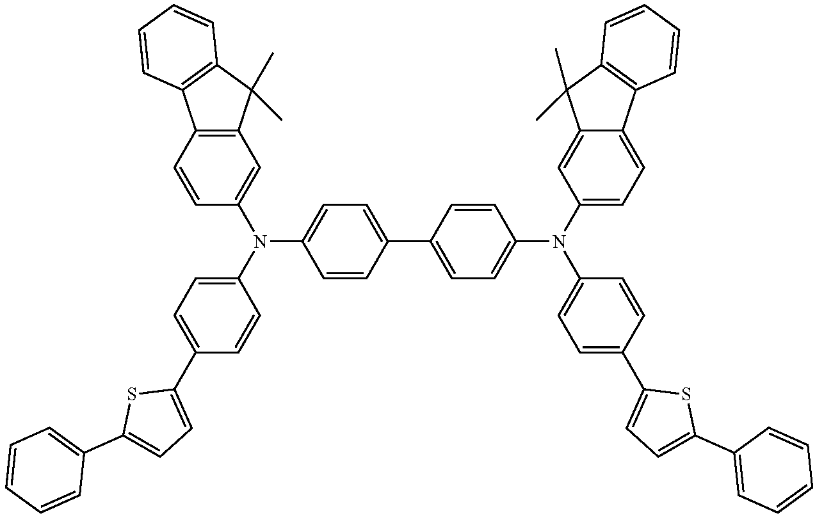
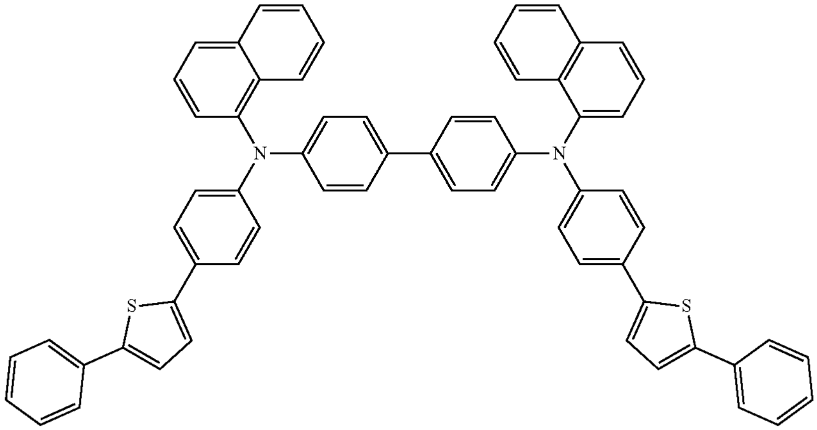
[Formula 132]
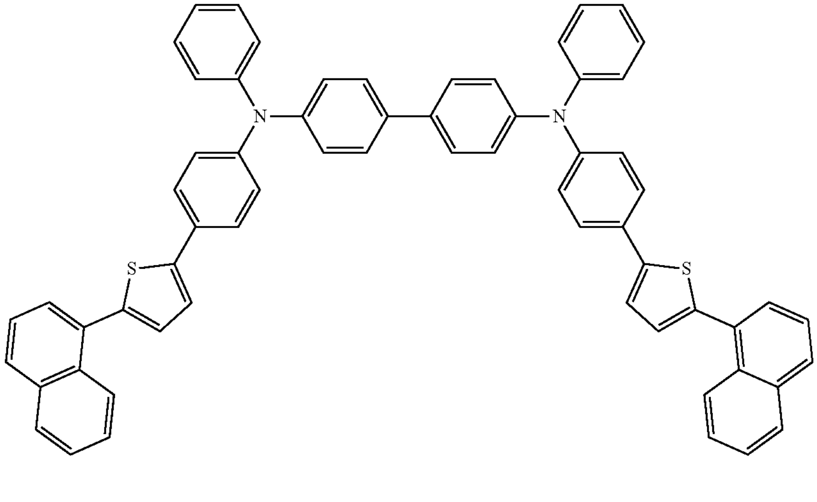

-continued
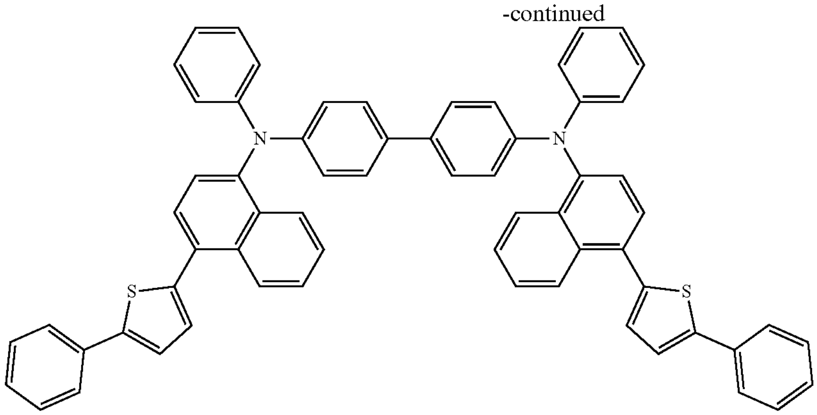
[Formula 133]
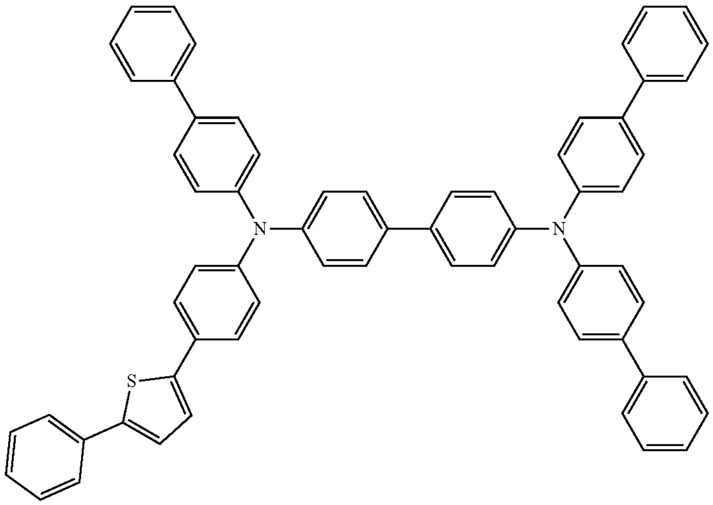
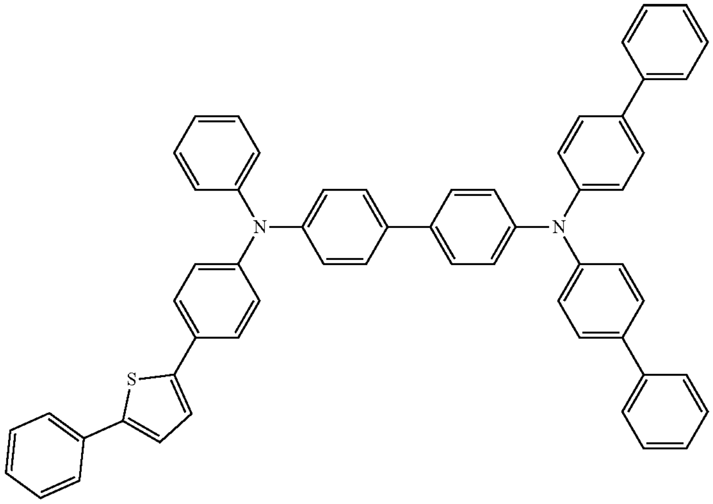

-continued
[Formula 134]
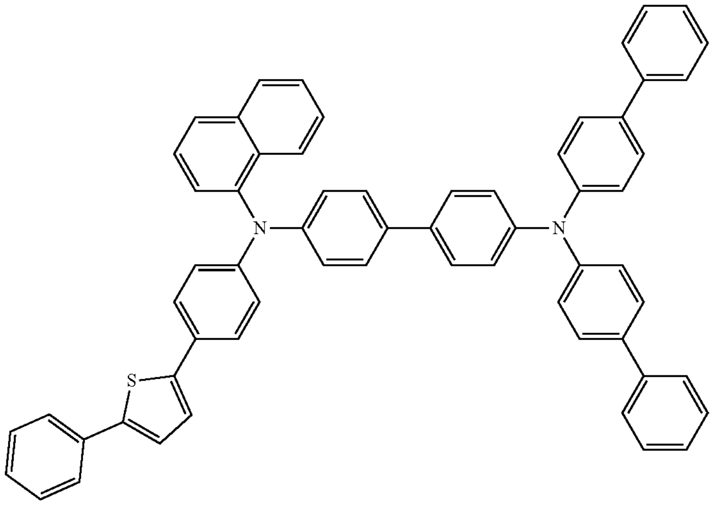
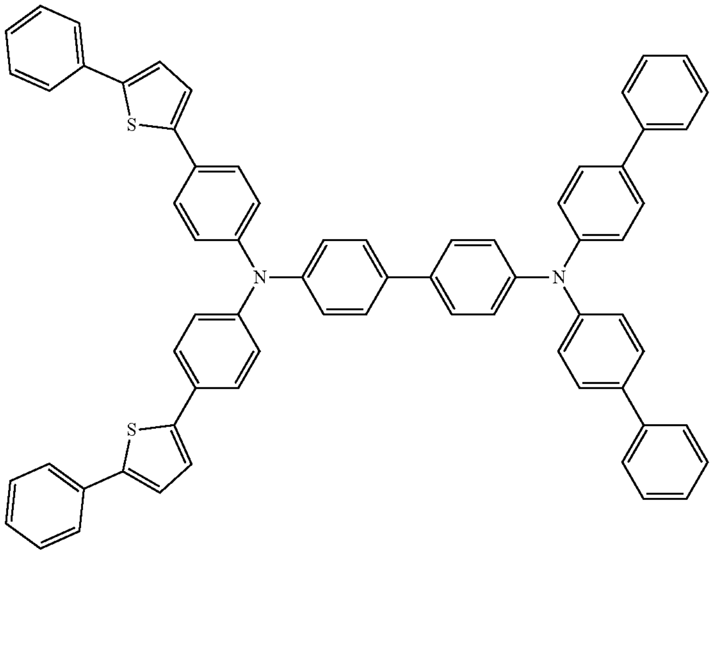

-continued
[Formula 135]
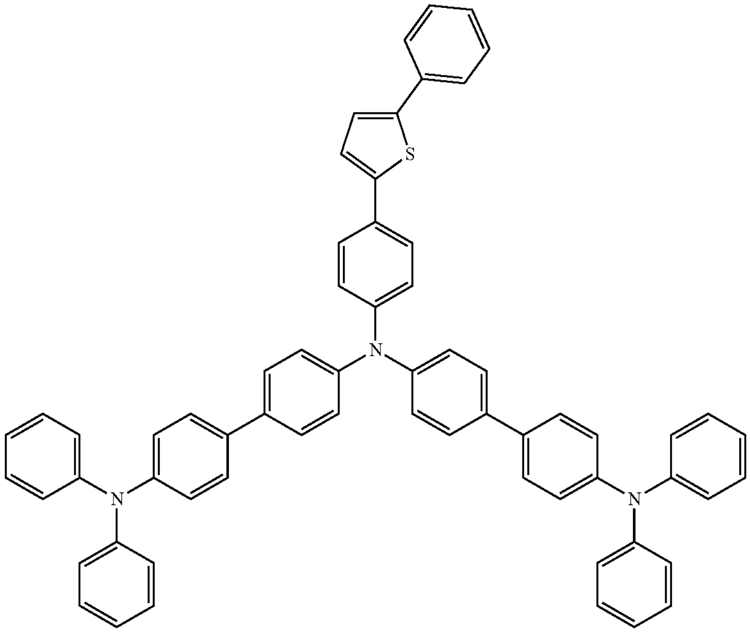
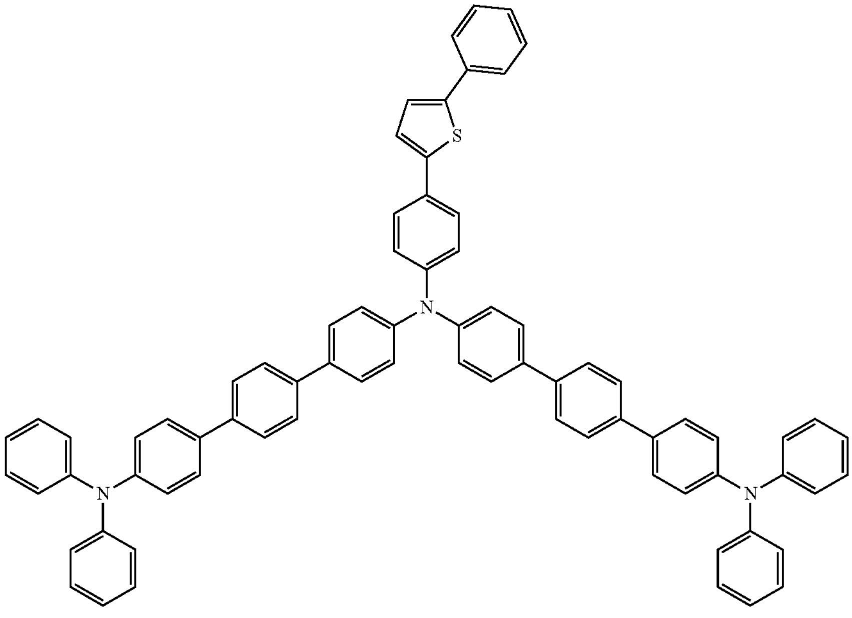

-continued
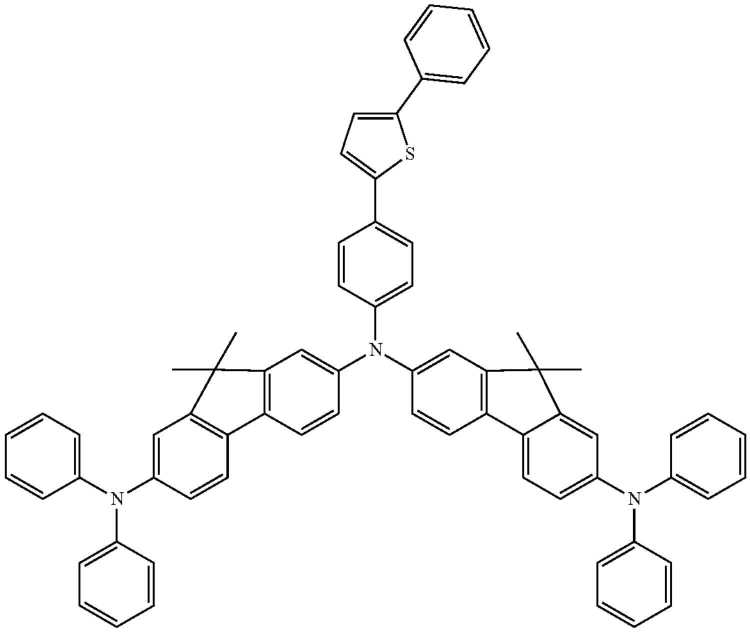
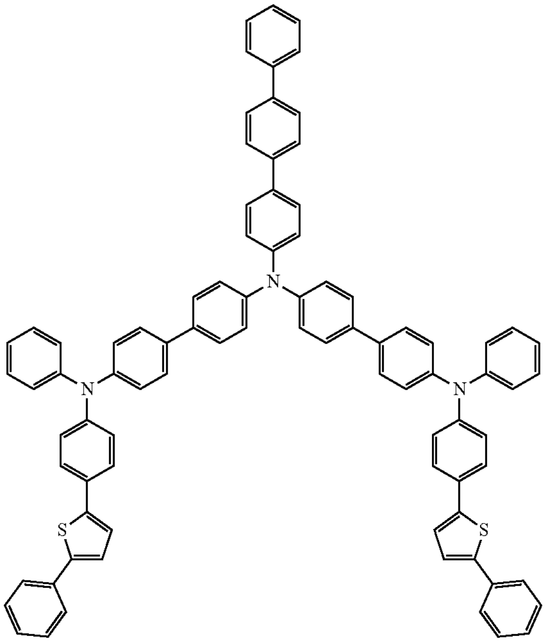

-continued
[Formula 136]
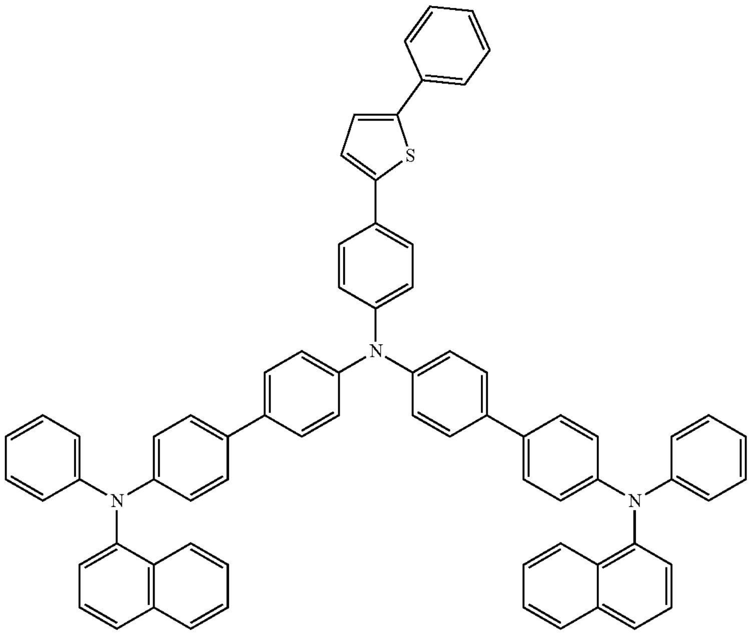
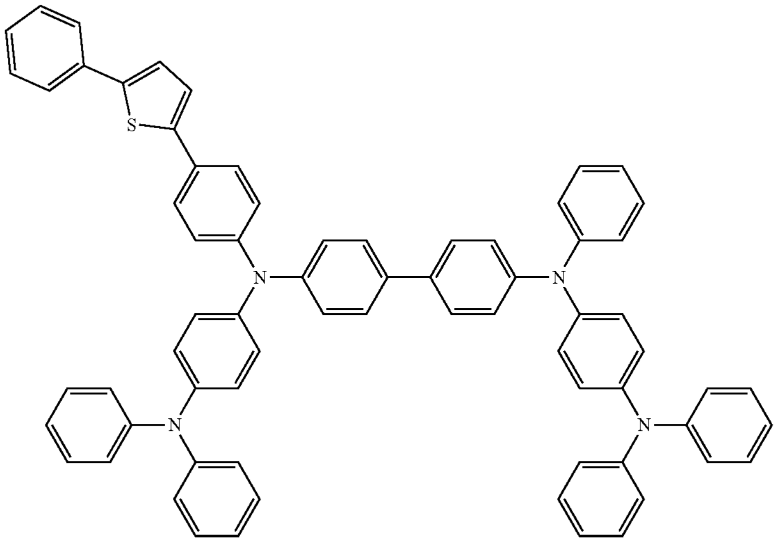

-continued
[Formula 137]
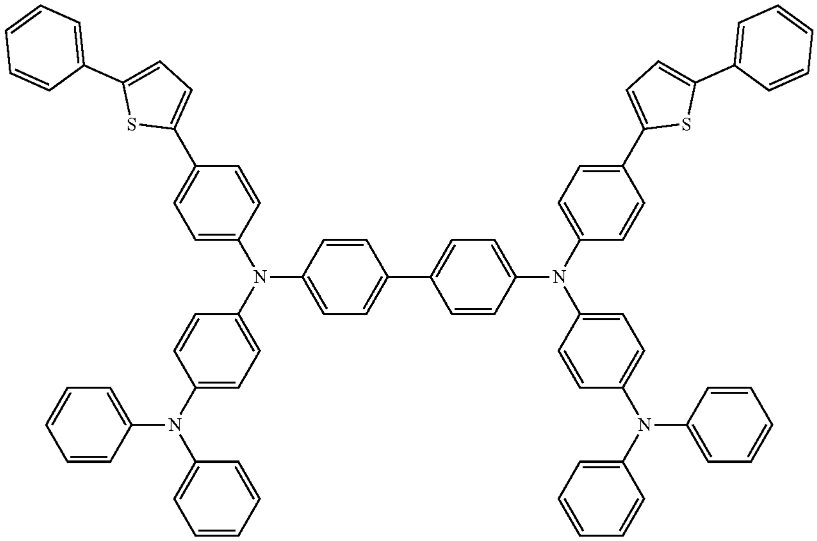
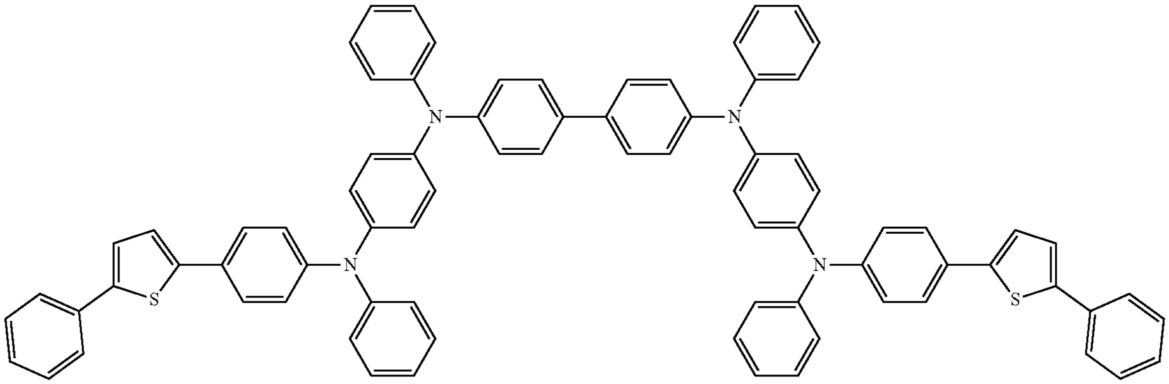
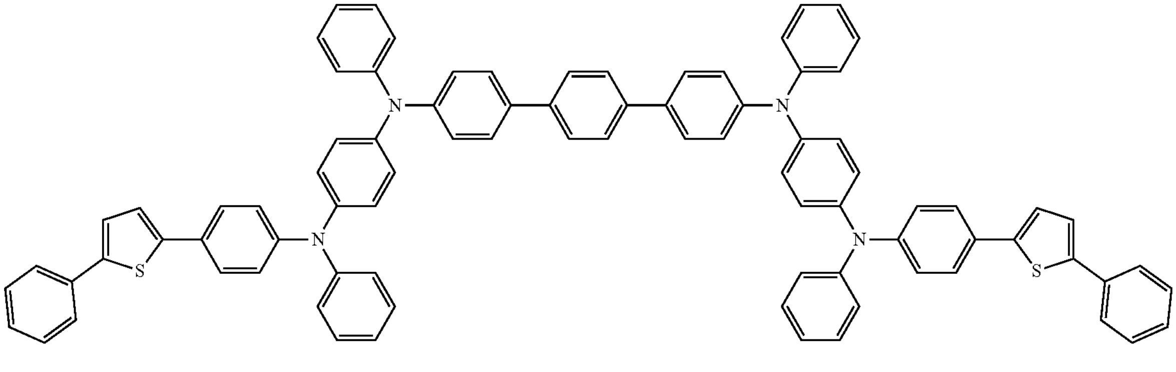

[Formula 138]
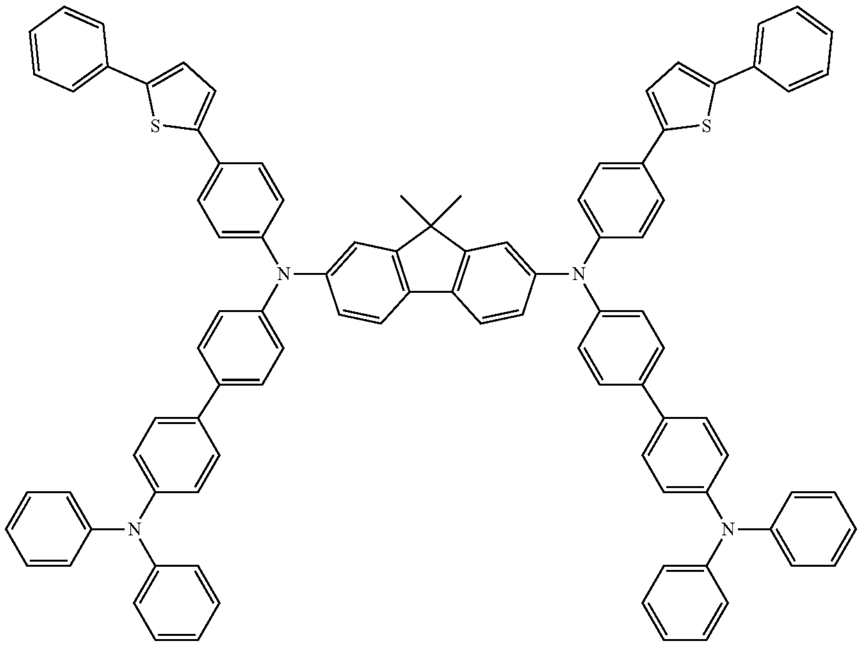
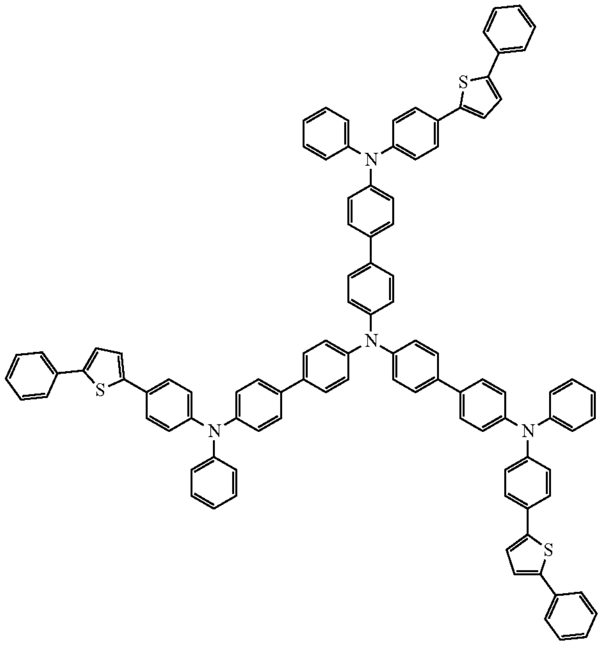

-continued
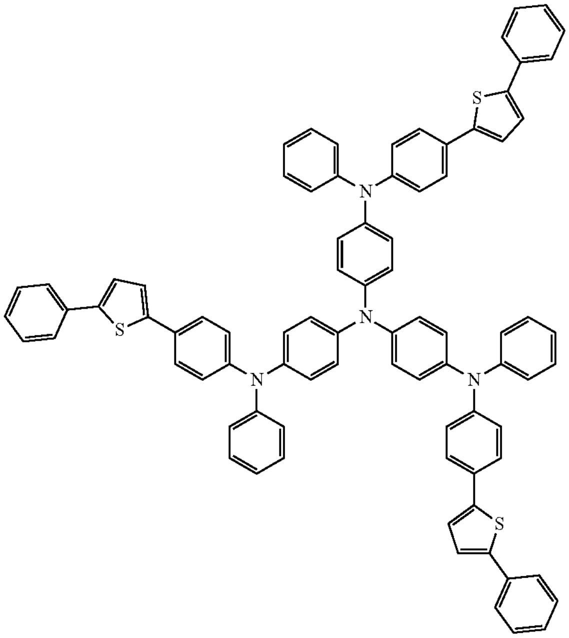
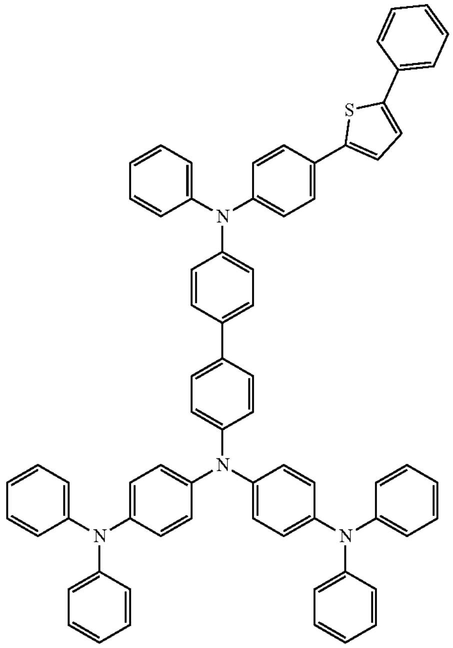
[Formula 139]
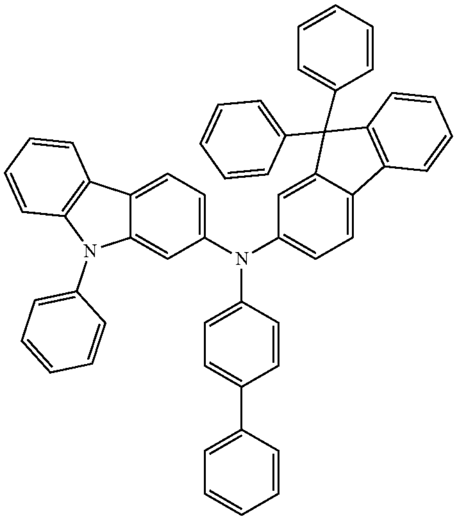
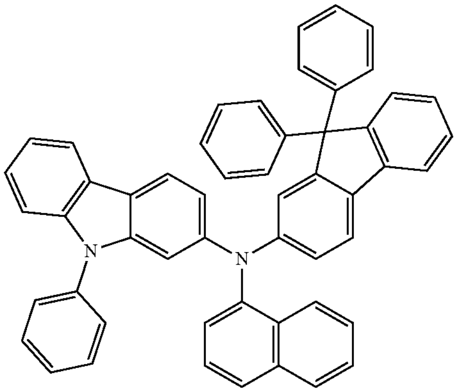
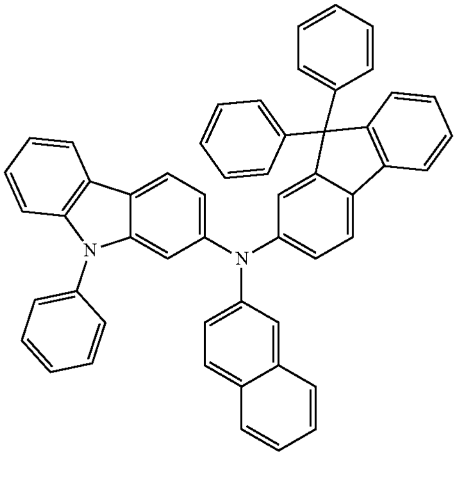
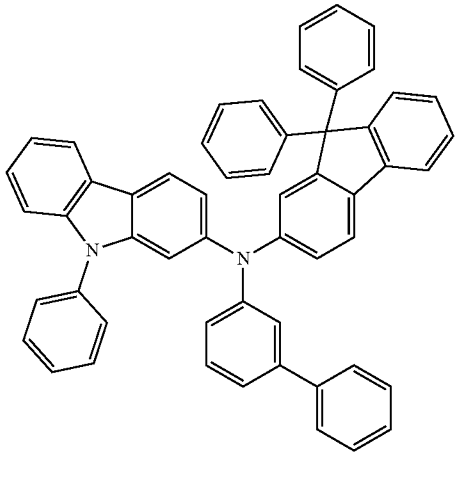

-continued
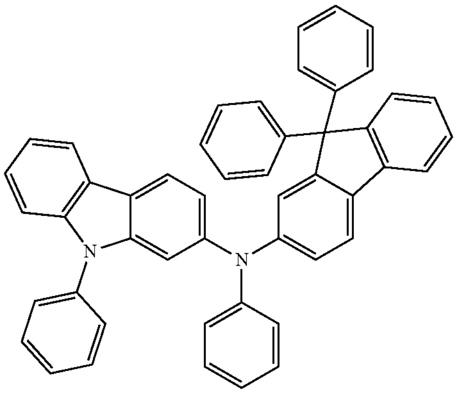
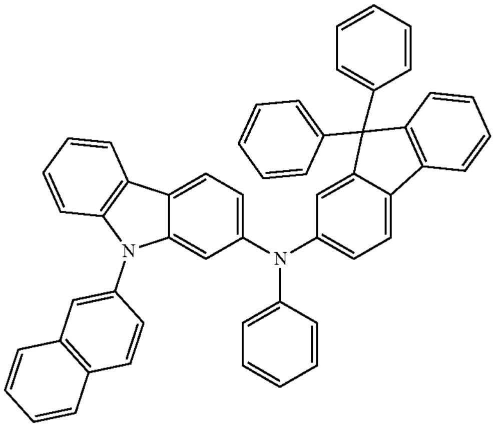
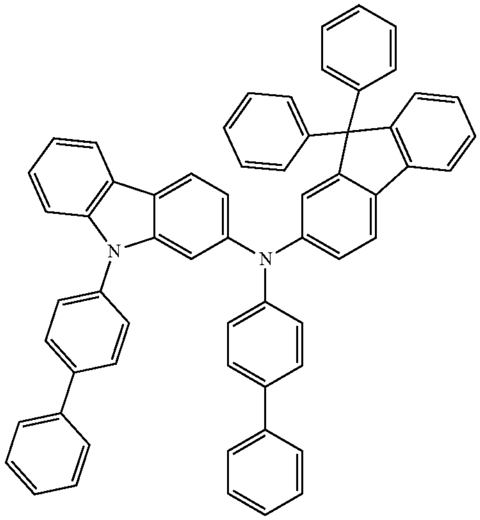
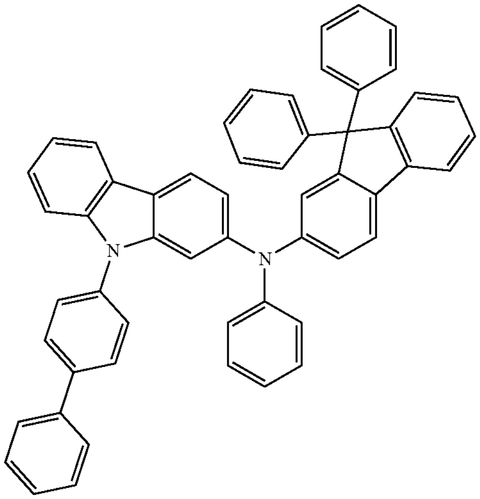
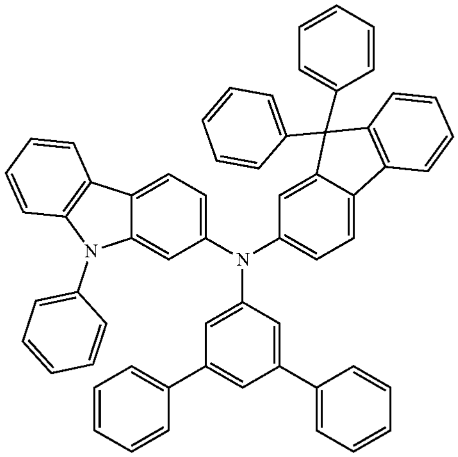
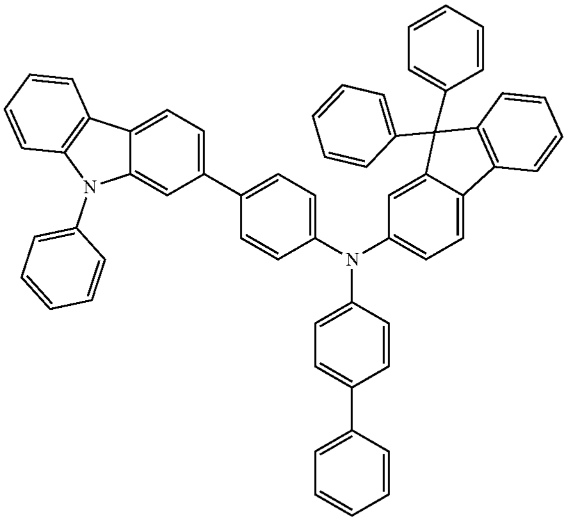

-continued
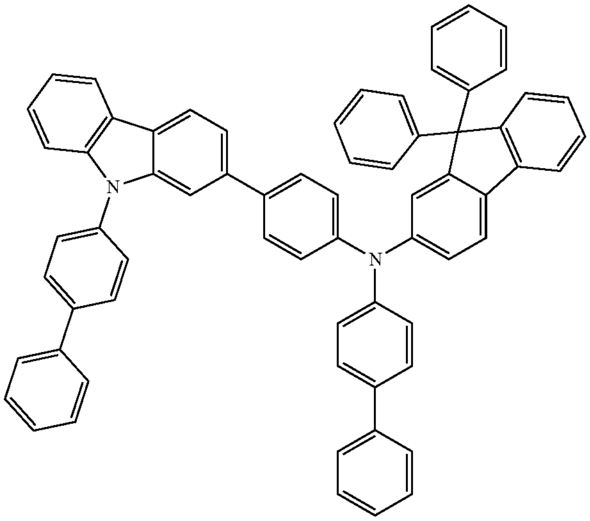
[Formula 140]
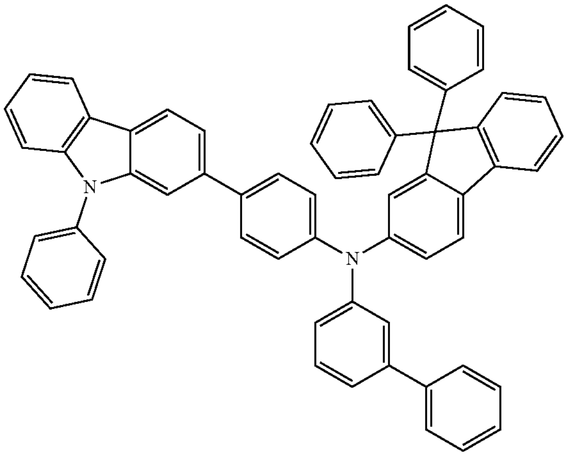
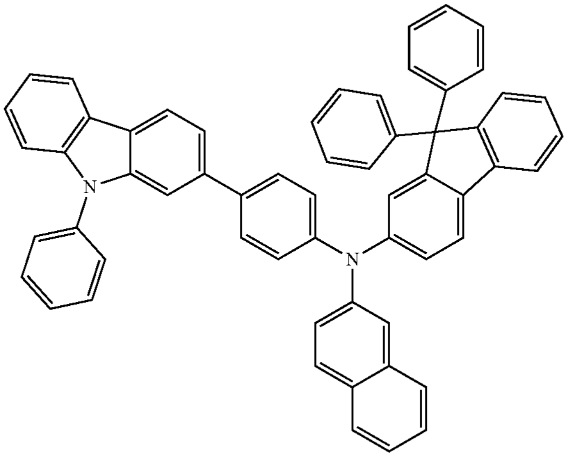
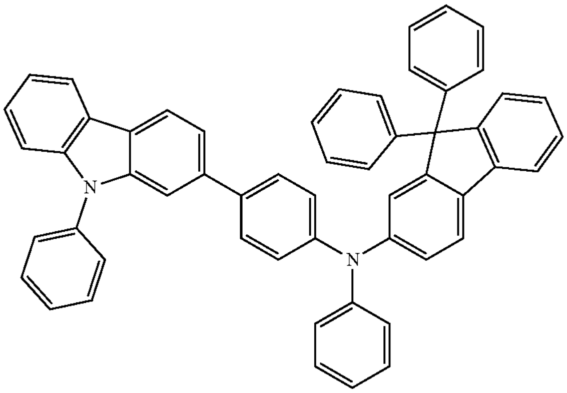

-continued
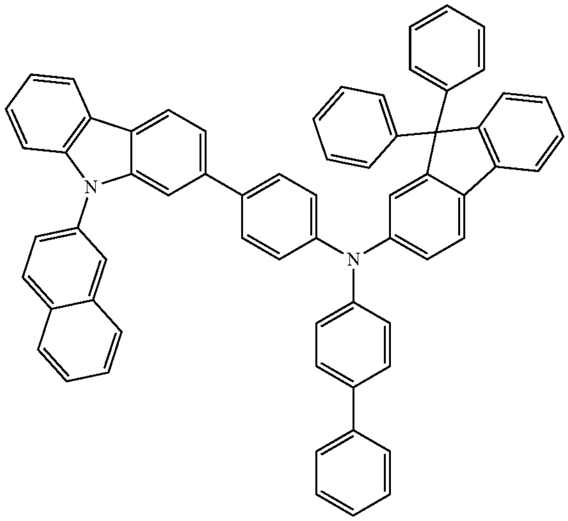
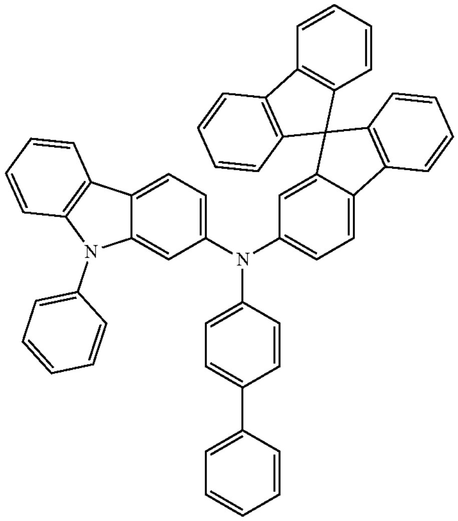
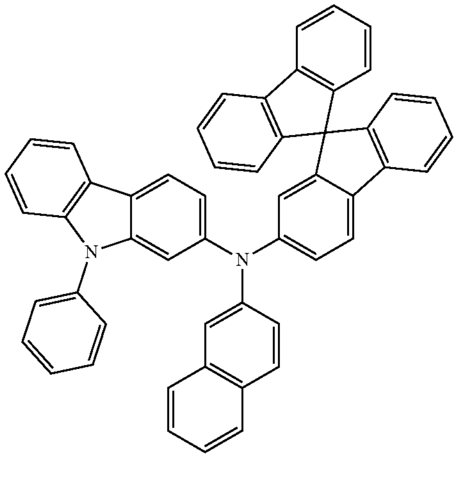
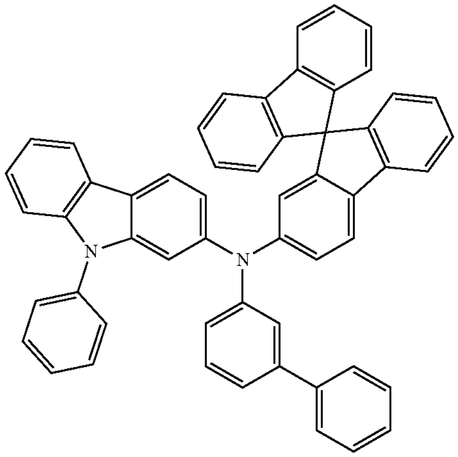
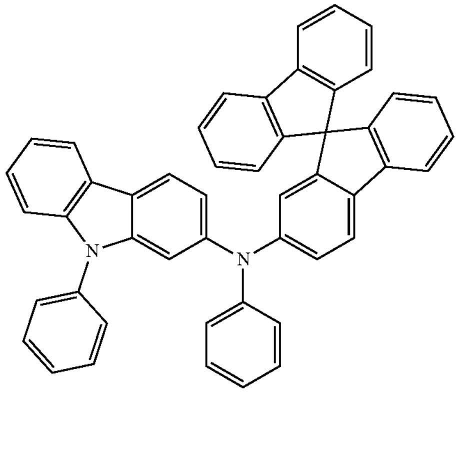

-continued
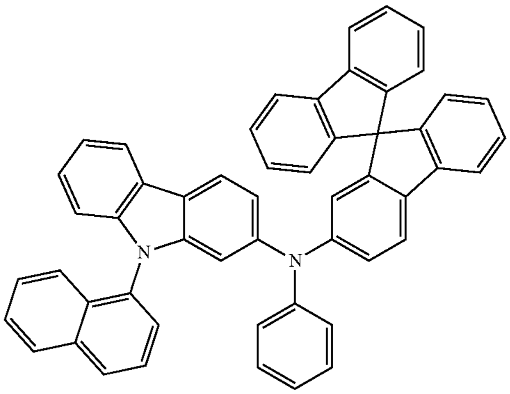
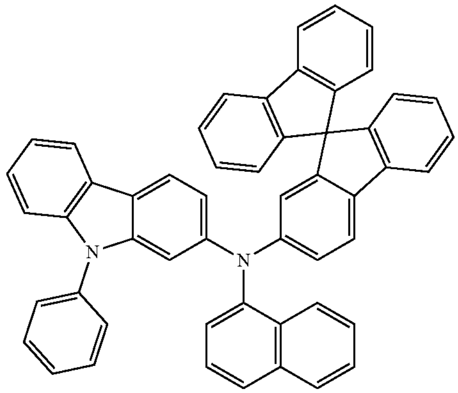
[Formula 141]
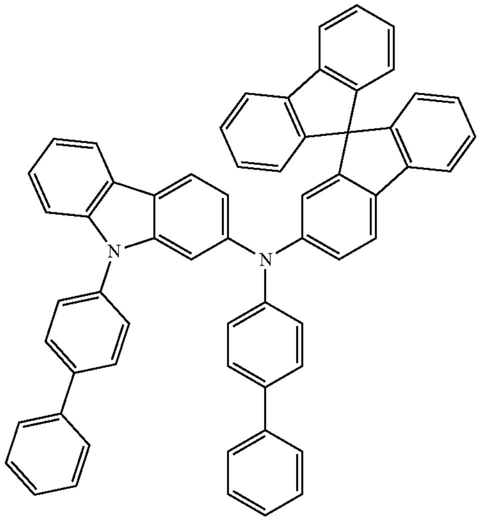
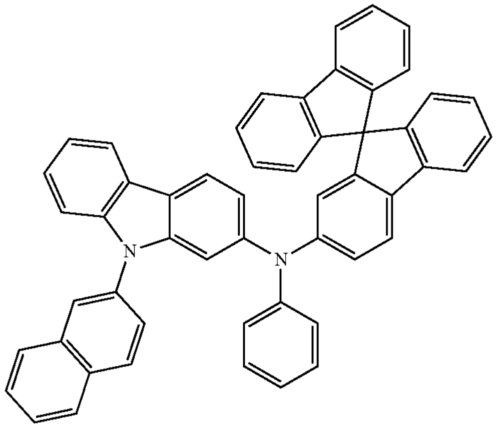
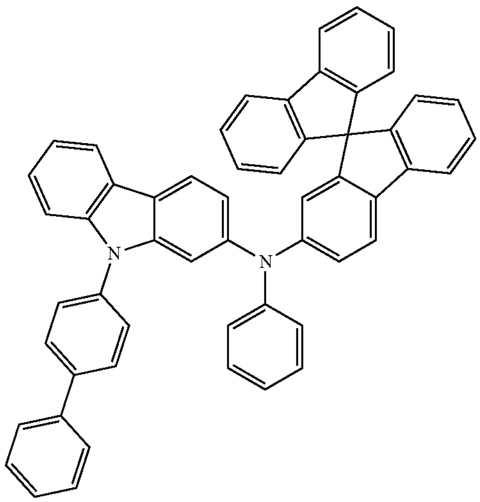
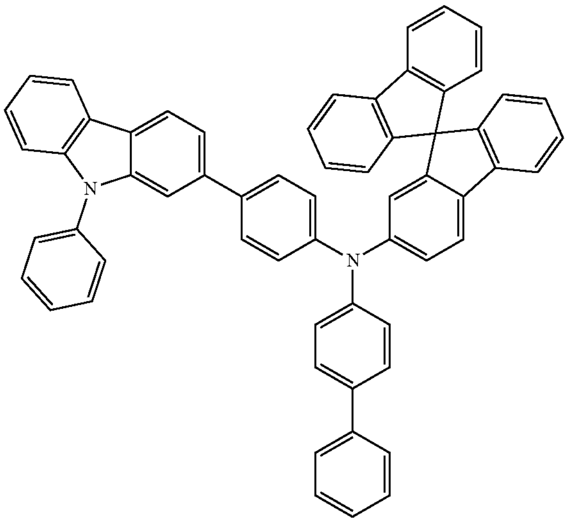

-continued
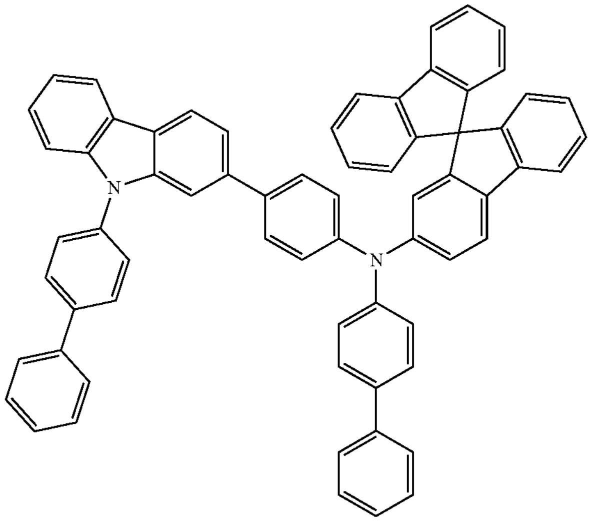
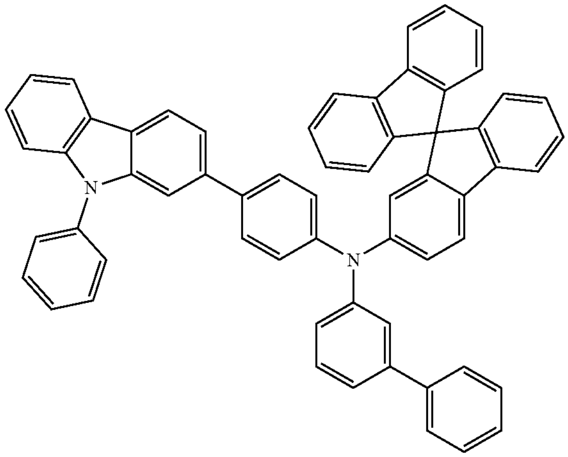
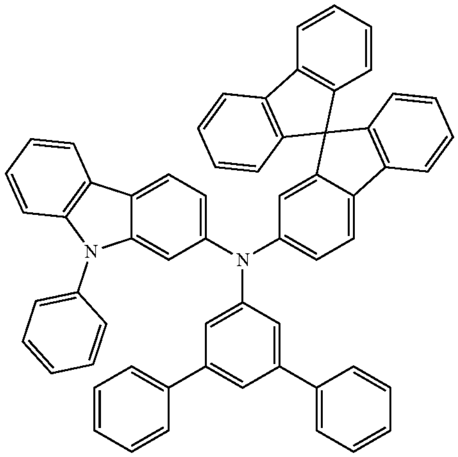
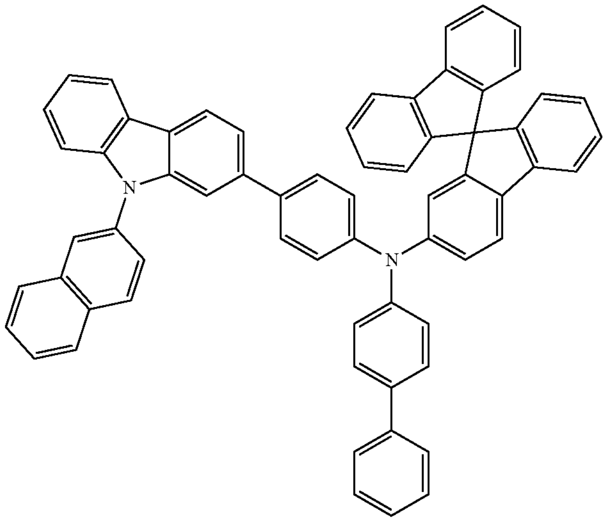

-continued
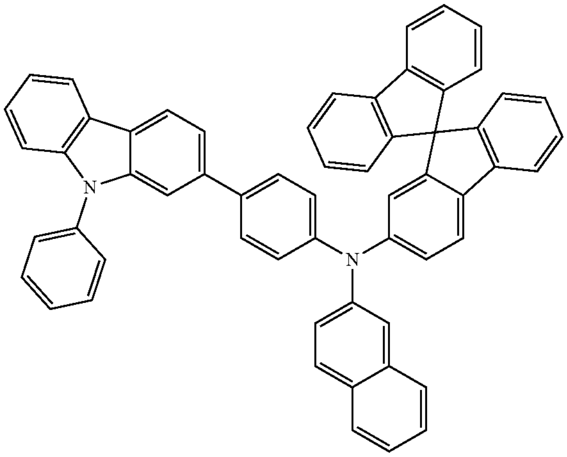
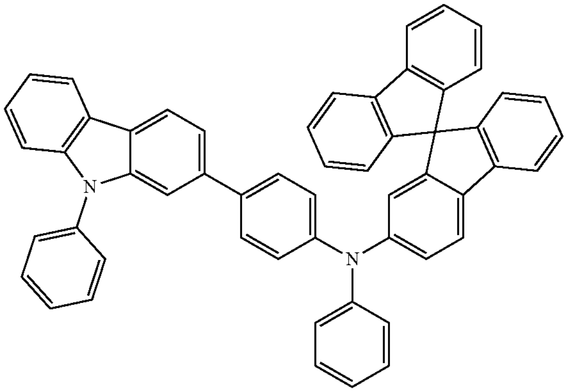
[Formula 142]
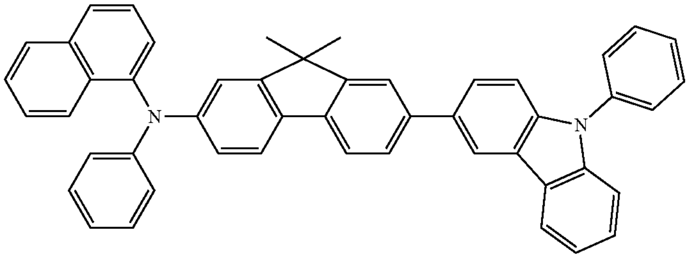
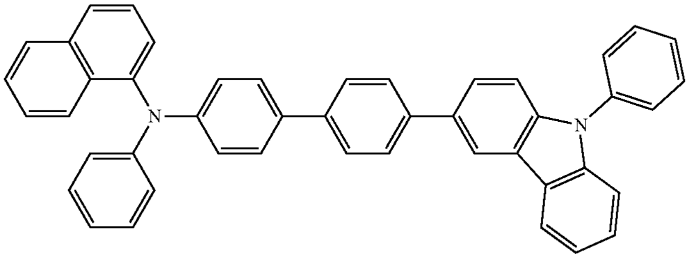
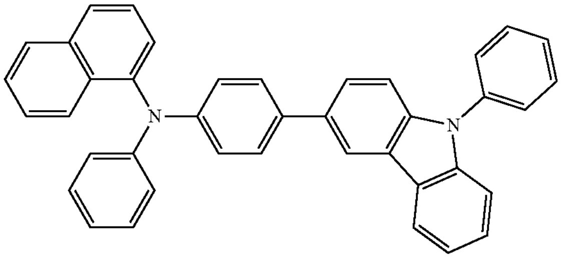

-continued
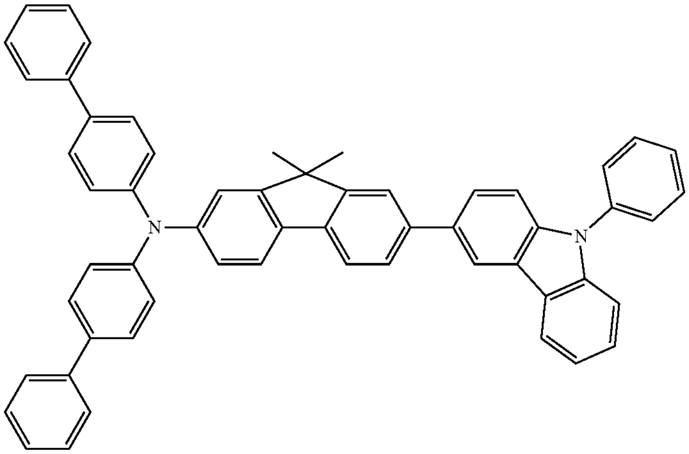
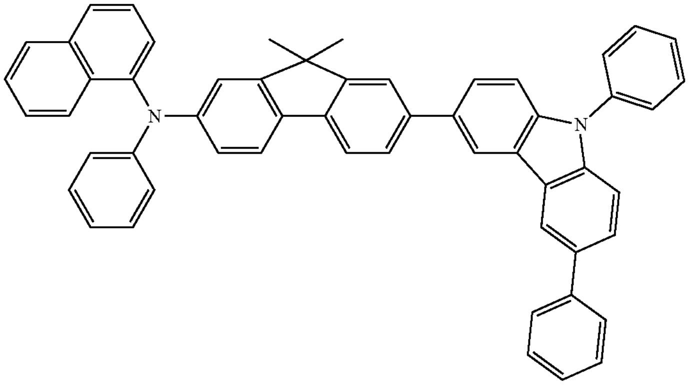
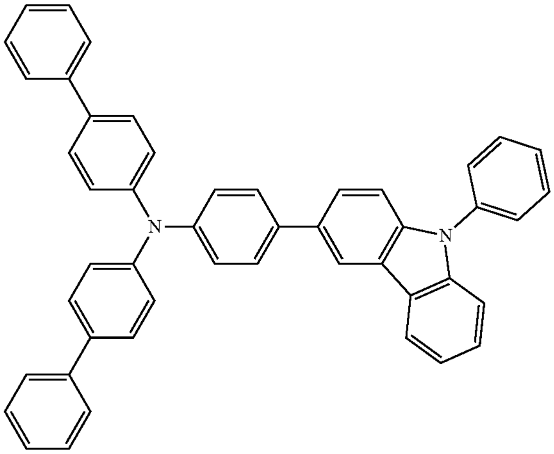

-continued
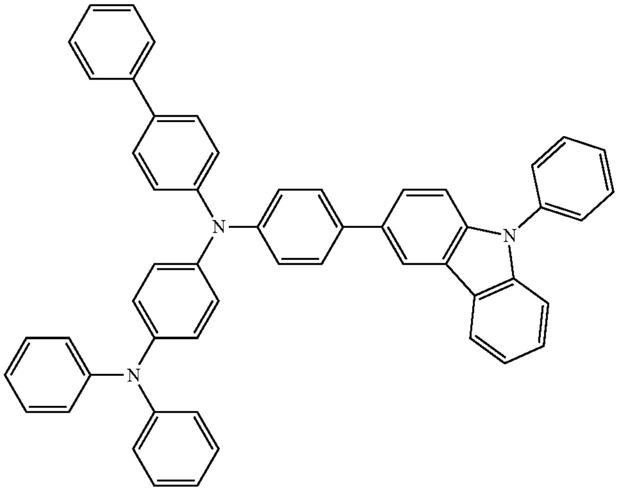
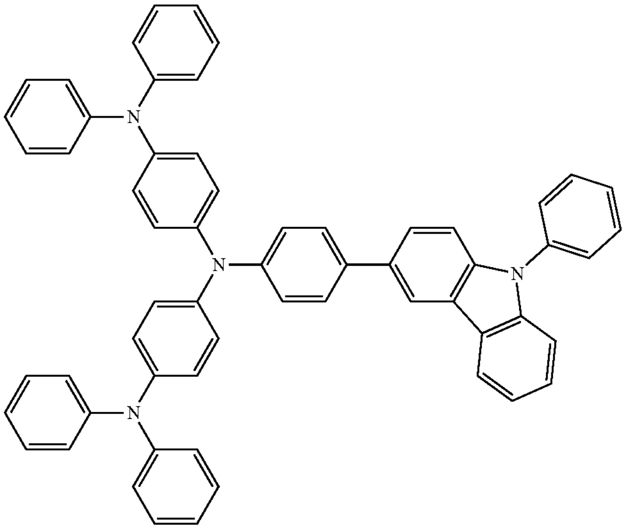
[Formula 143]
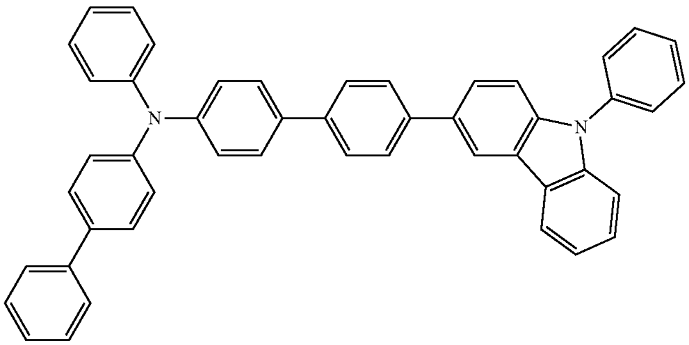
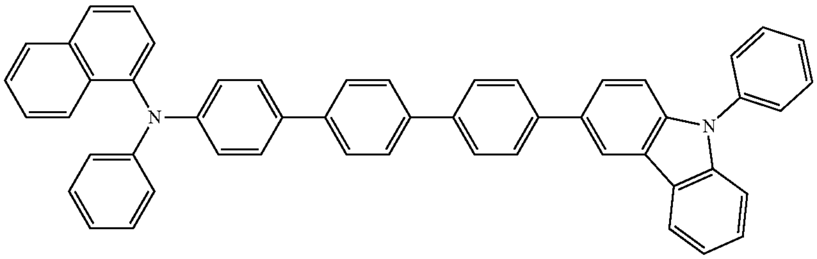

-continued
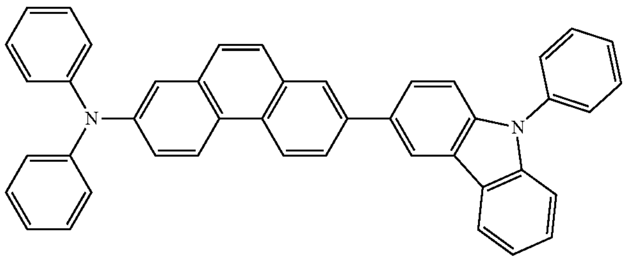
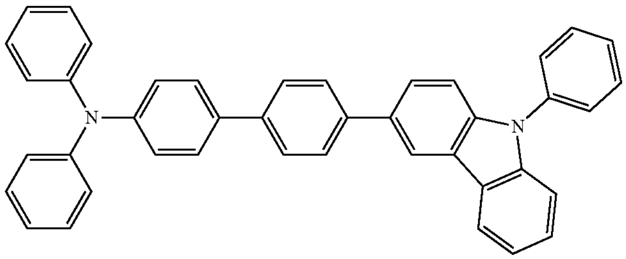
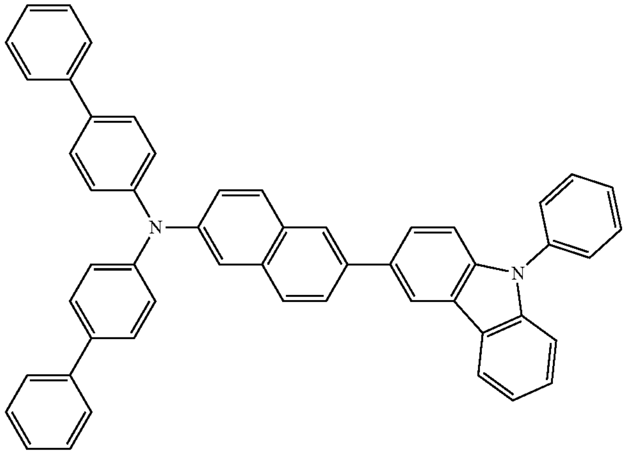
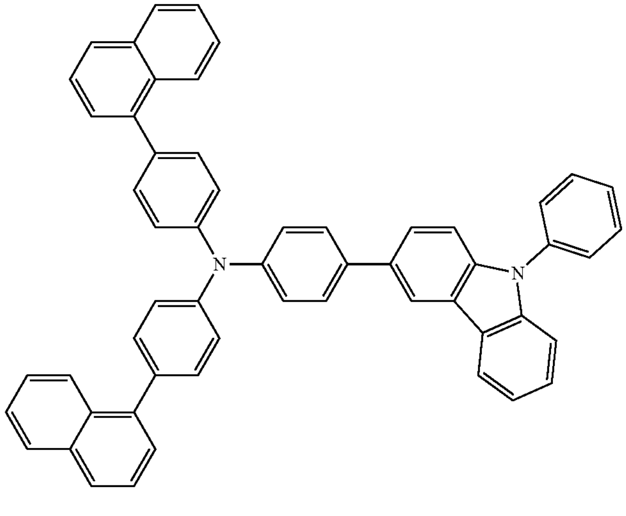

-continued
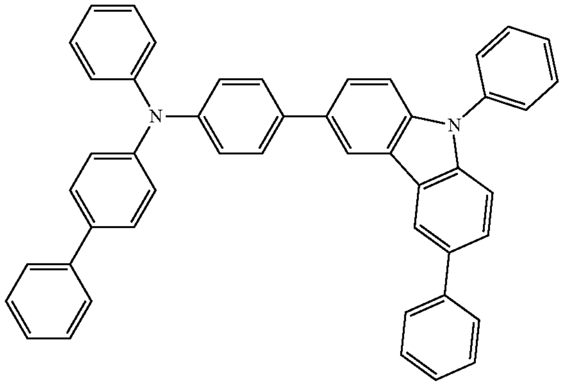
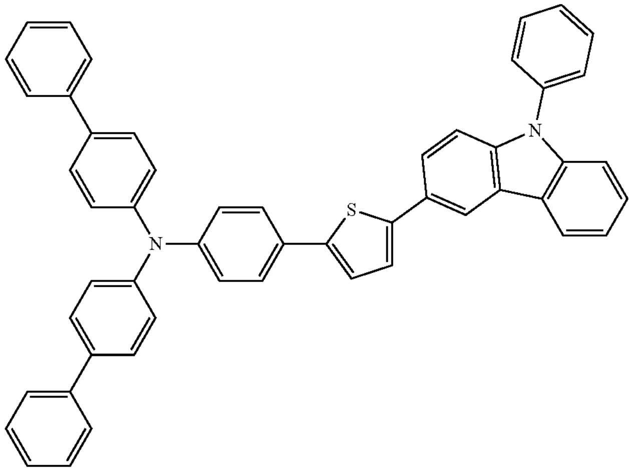
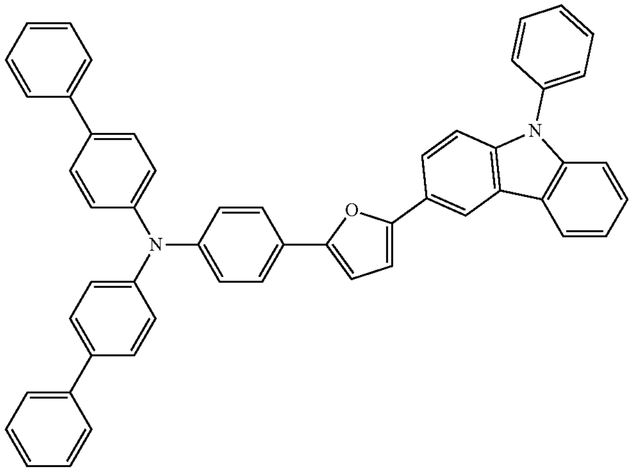
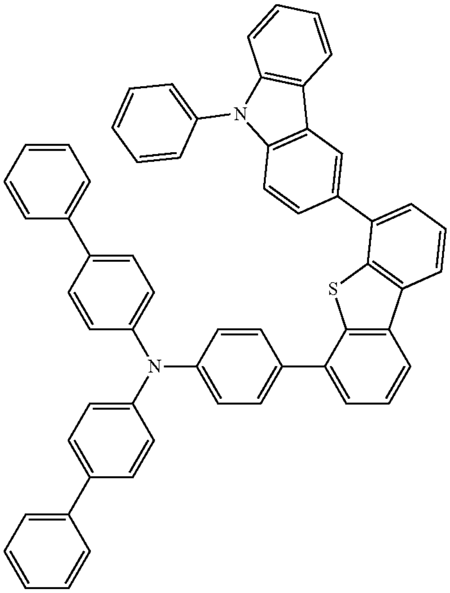

[Formula 144]
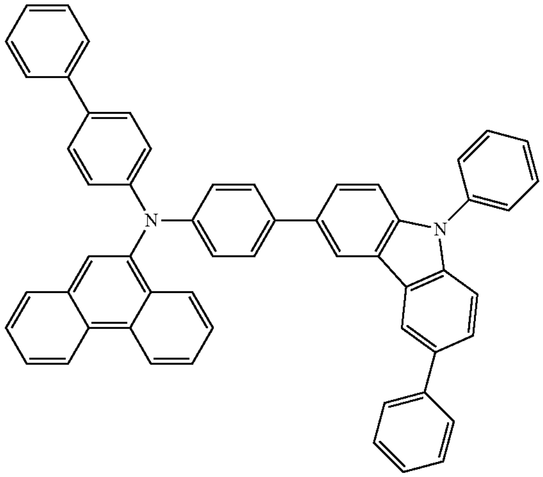
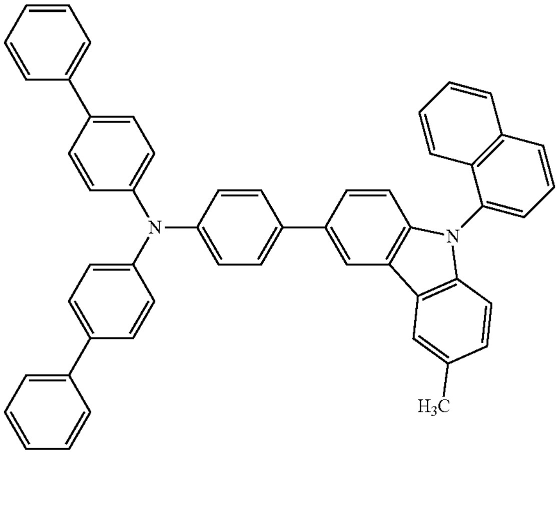
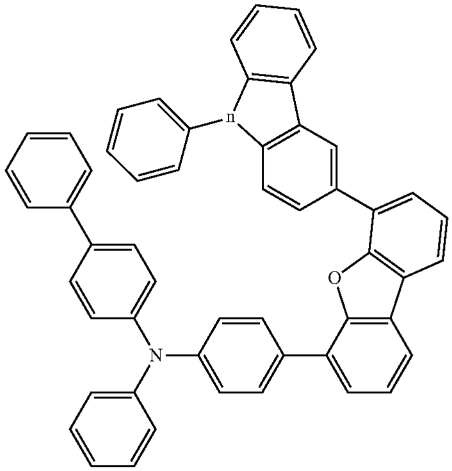
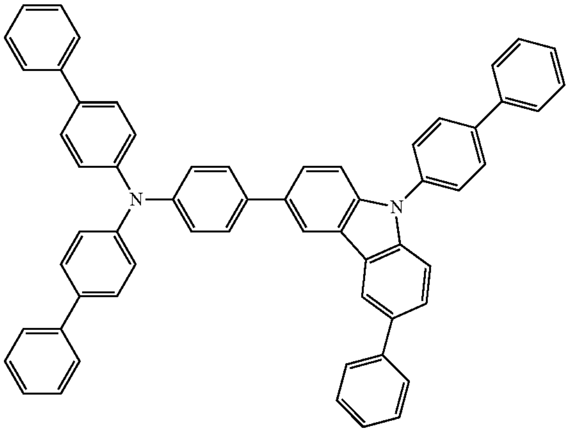
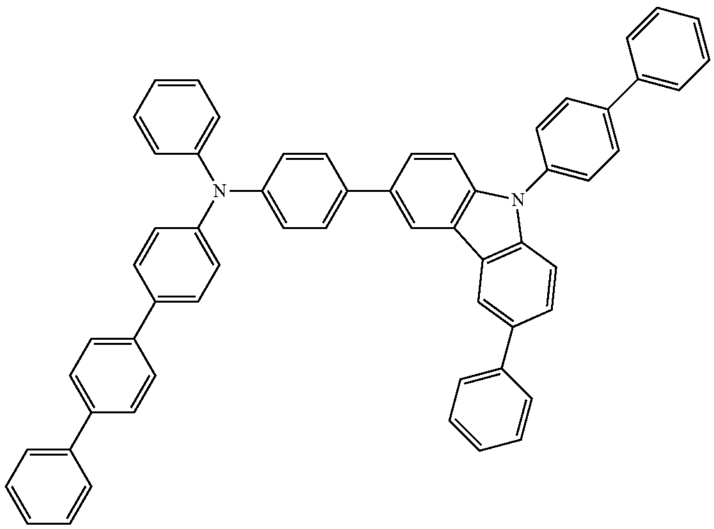

-continued
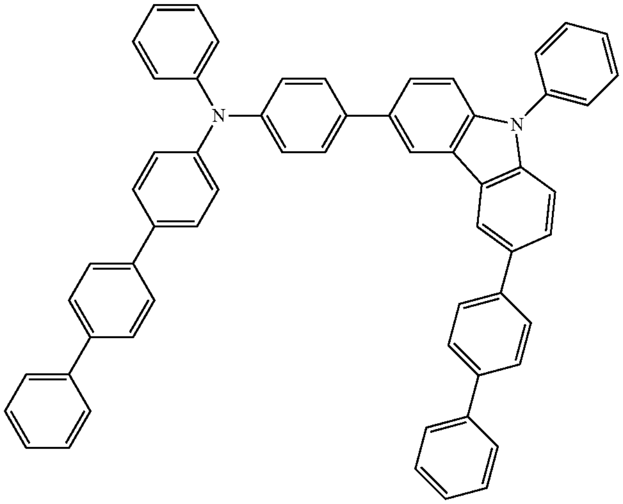
[Formula 145]
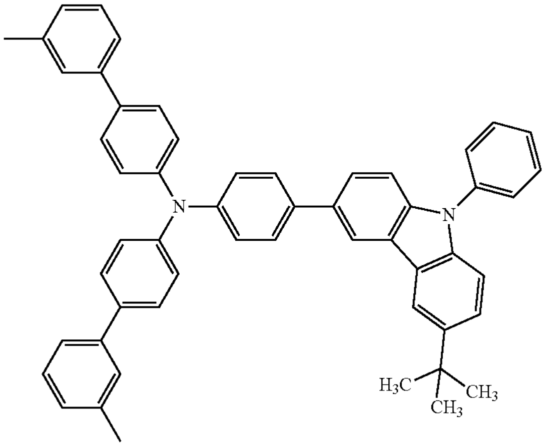
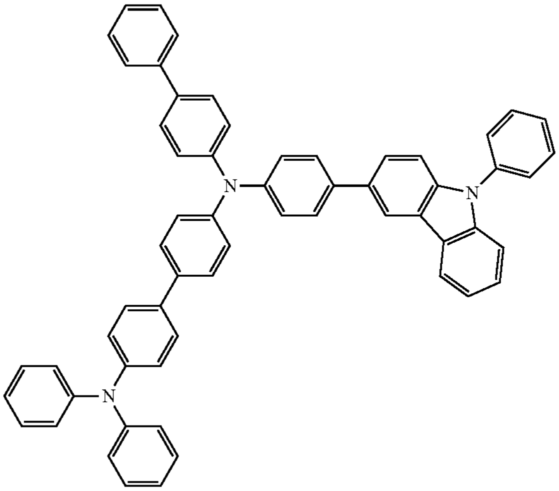
[Formula 146]
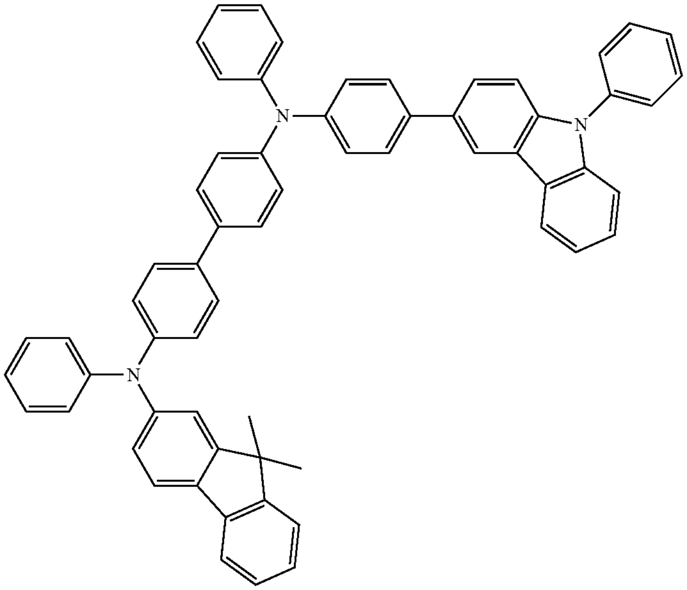

-continued
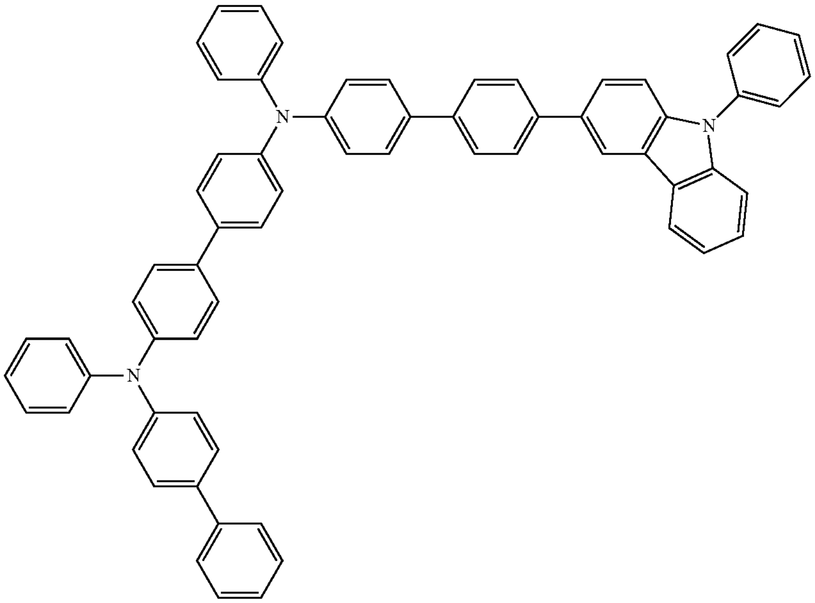
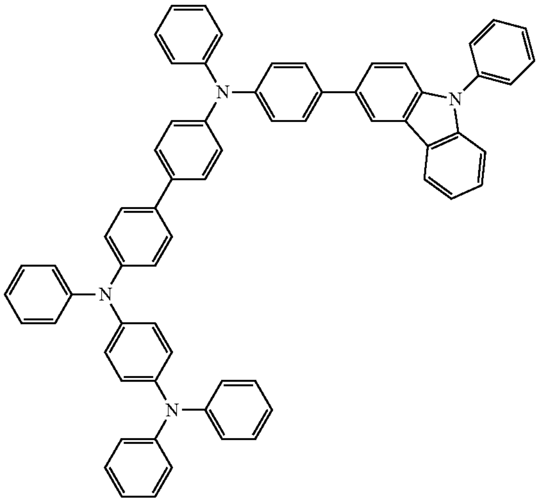
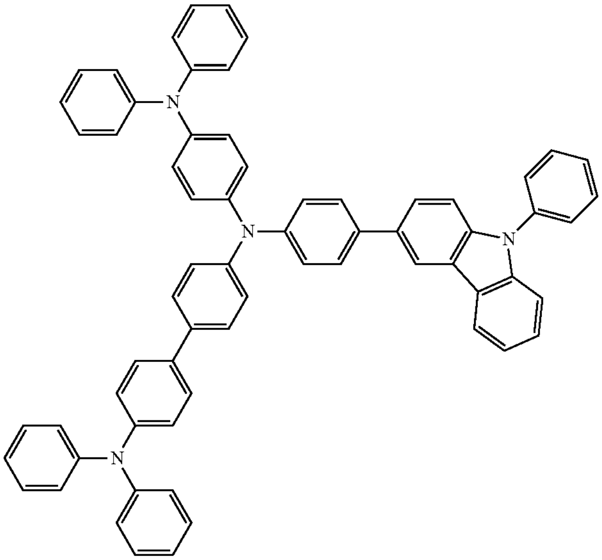
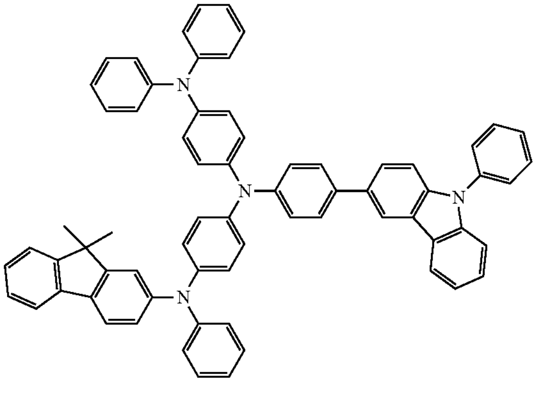
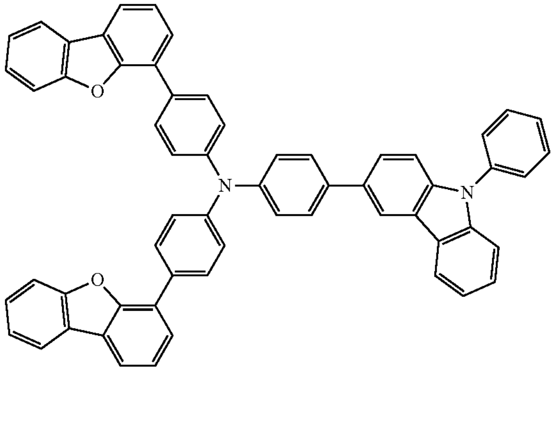

-continued
[Formula 147]
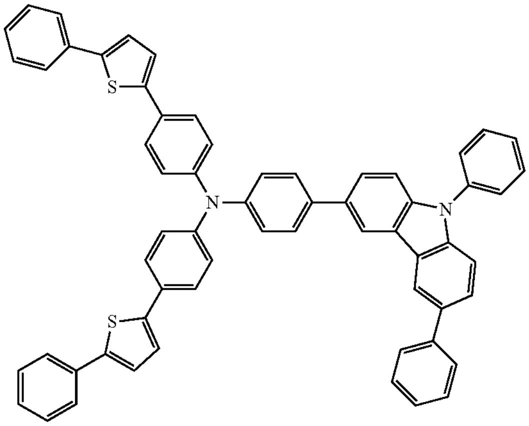
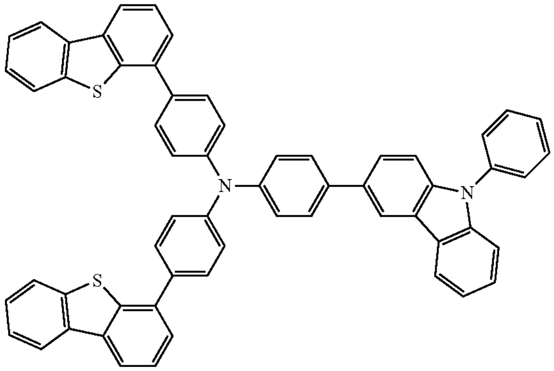
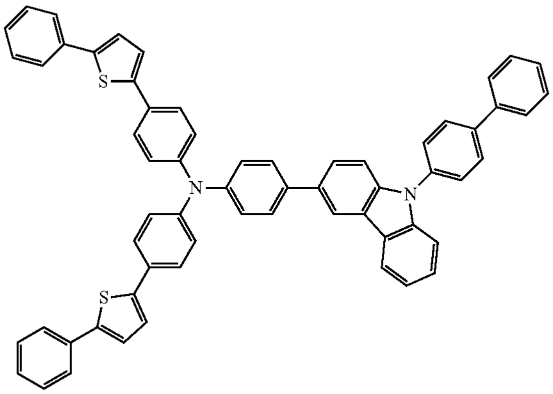
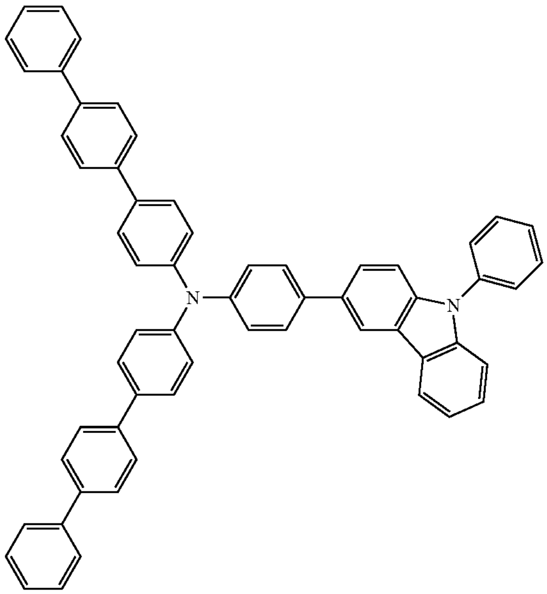
[Formula 148]
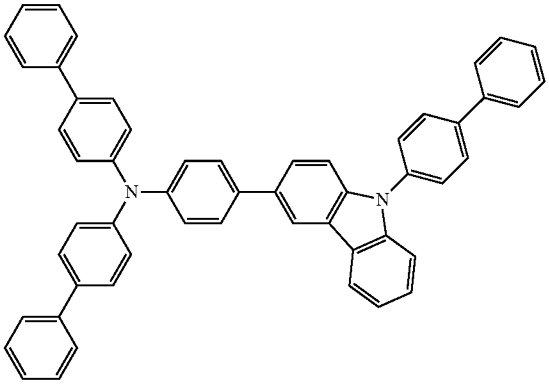
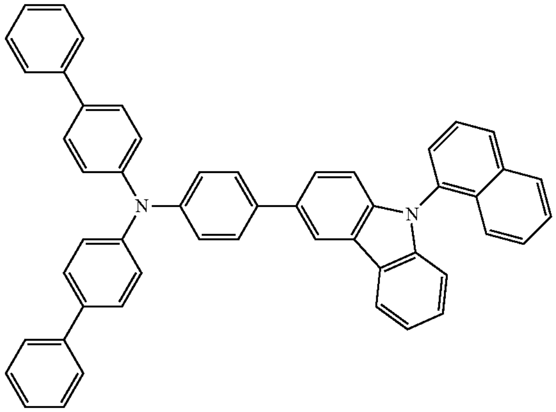

-continued
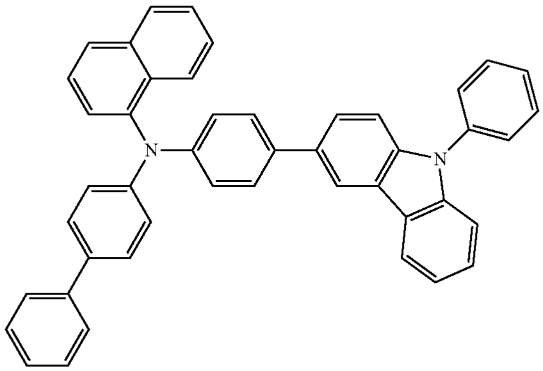
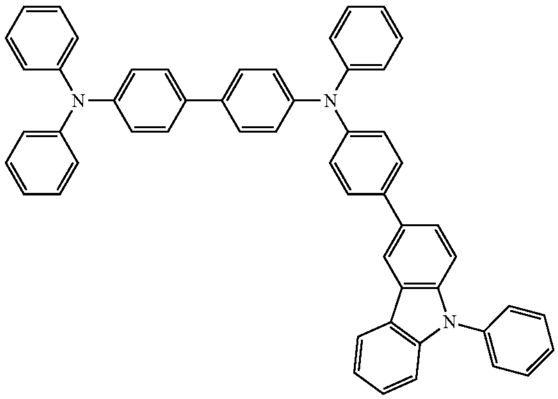
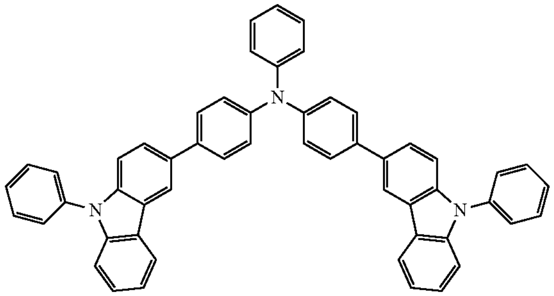
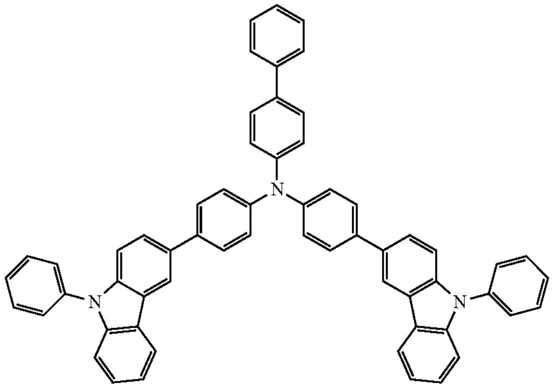
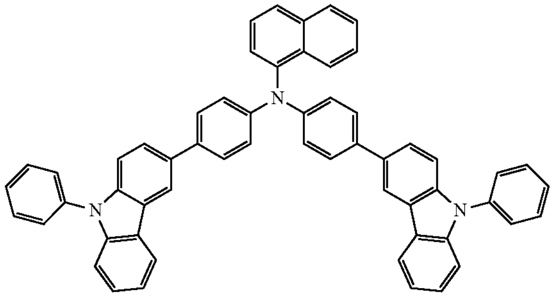
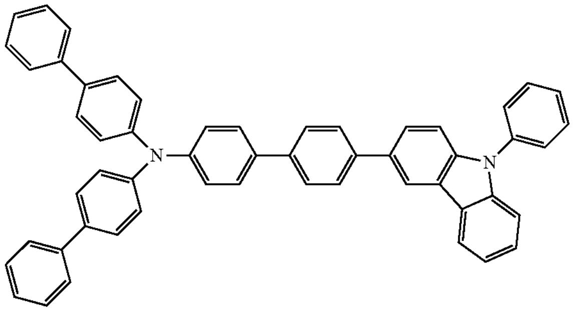
[Formula 149]
A-1
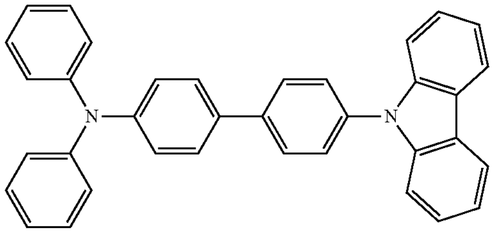
A-2
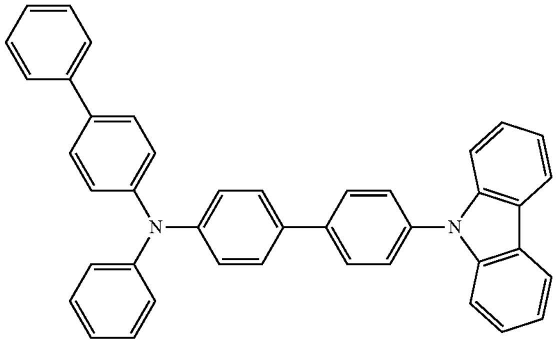

-continued
A-3
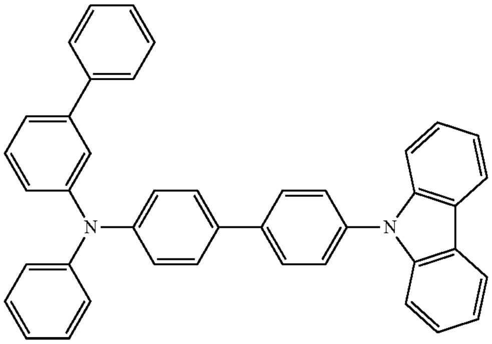
A-4
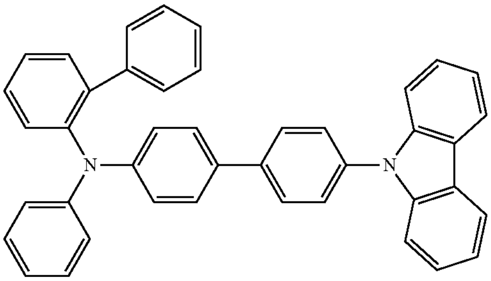
A-5
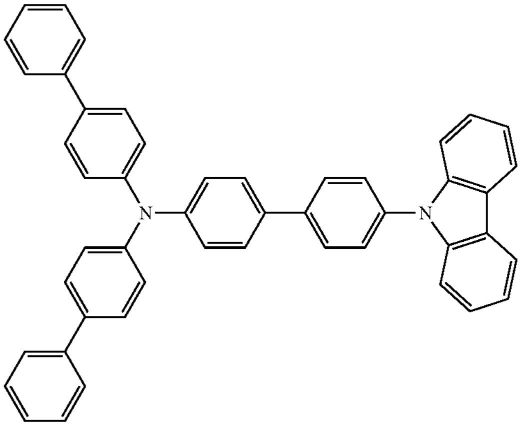
A-6
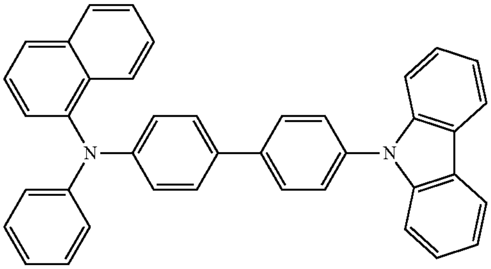
A-7
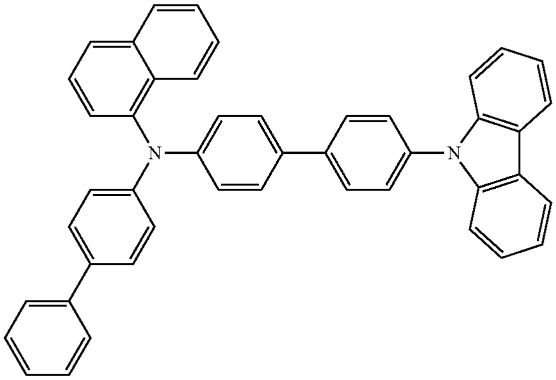
A-8
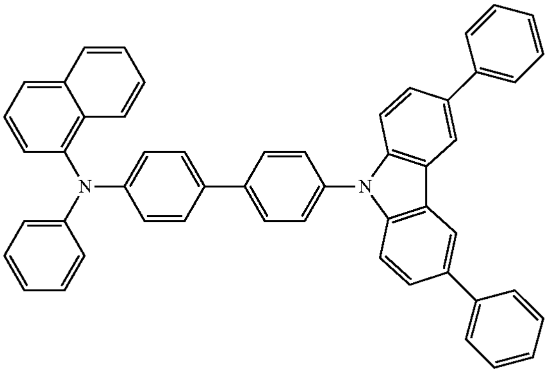
A-9
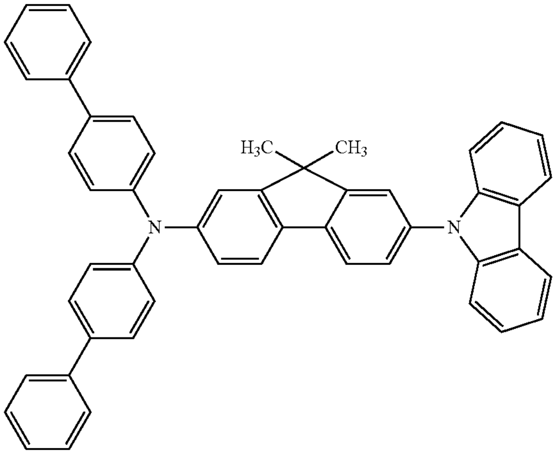
A-10
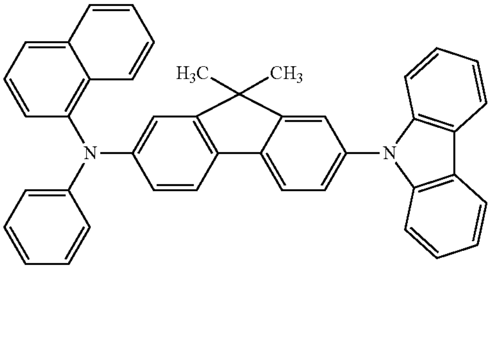

-continued
A-11
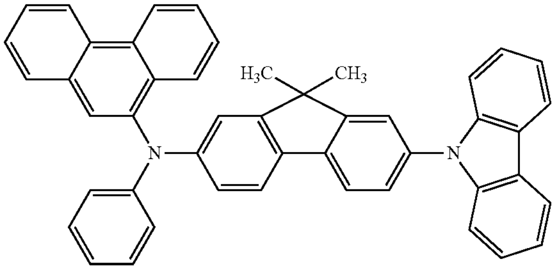
A-12
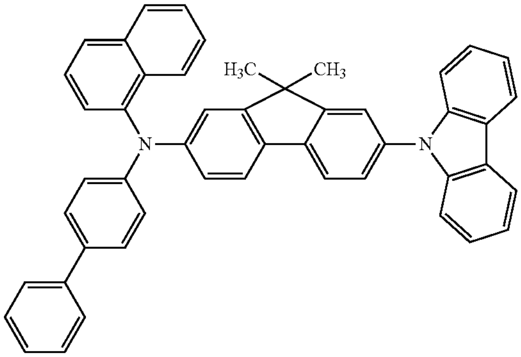
A-13
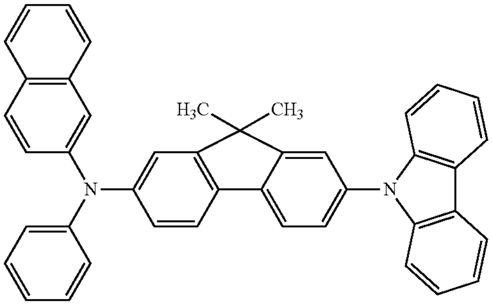
A-14
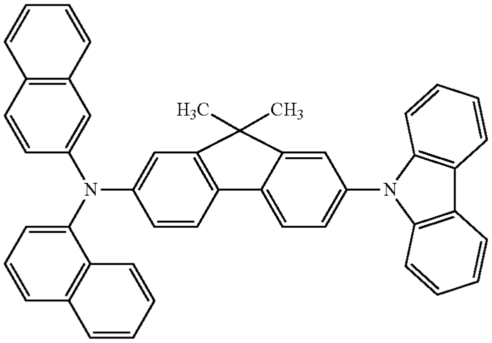
A-15
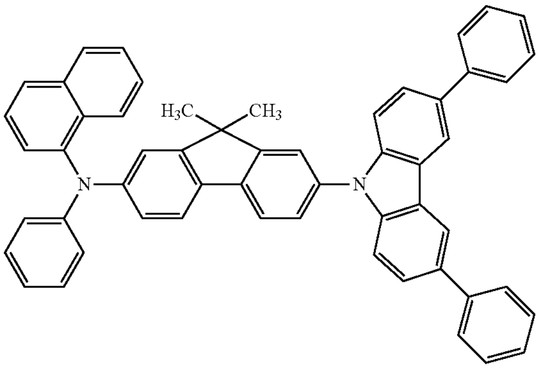
A-16
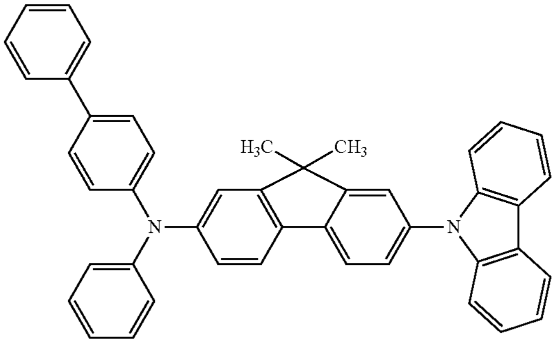
[Formula 150]
A-17
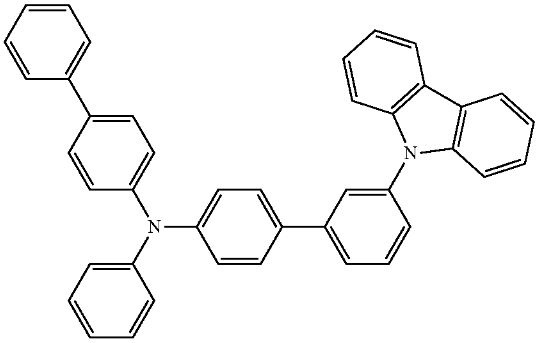
A-18
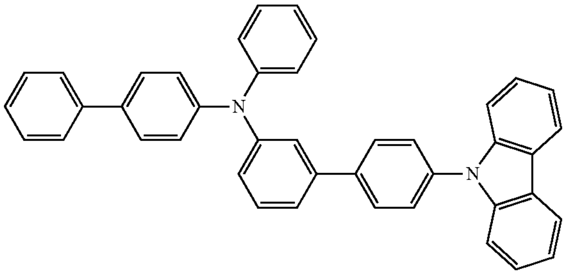

-continued
A-19
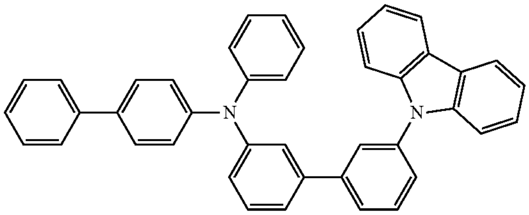
A-20
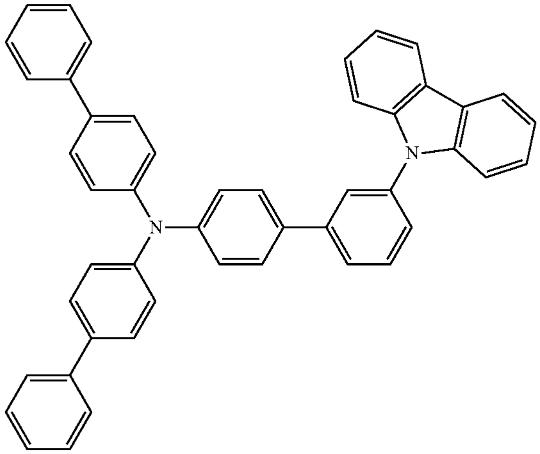
A-21
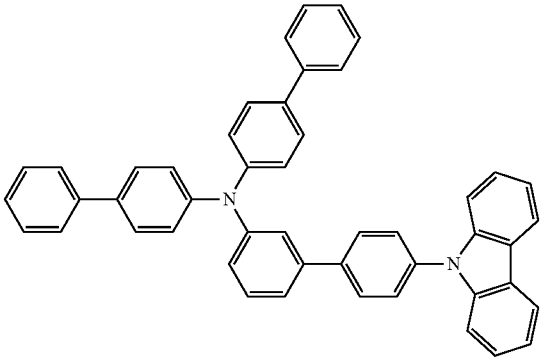
A-22
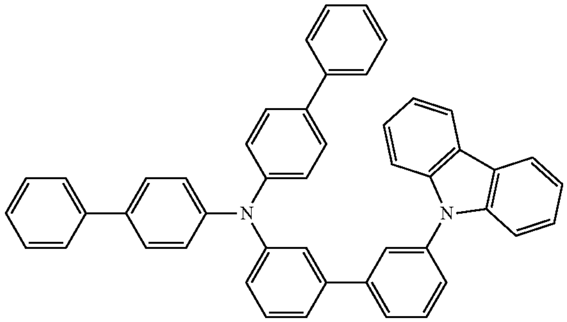
A-25
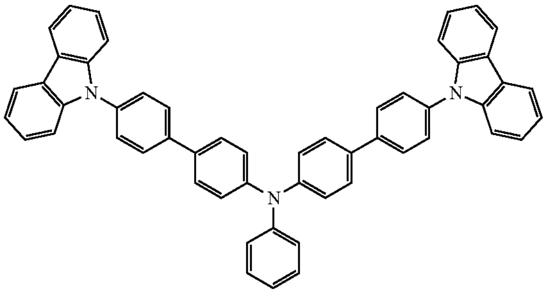
A-26
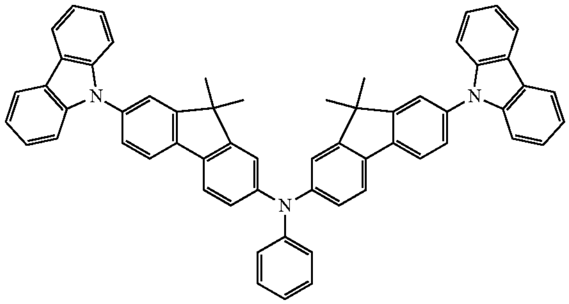
A-27
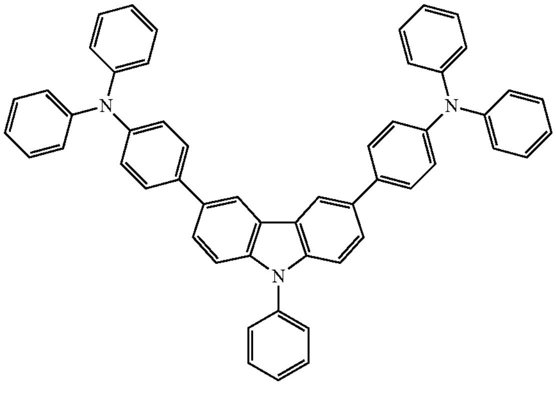
A-28
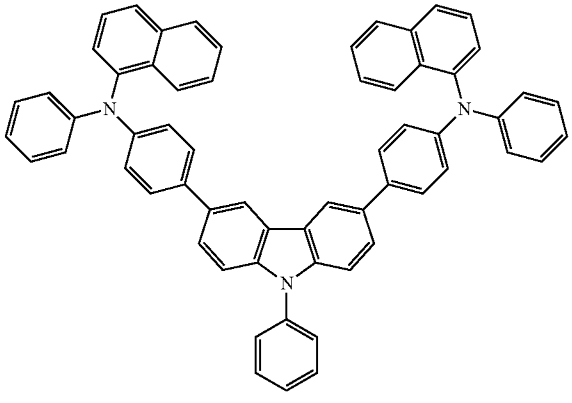

[Formula 151]
A-35
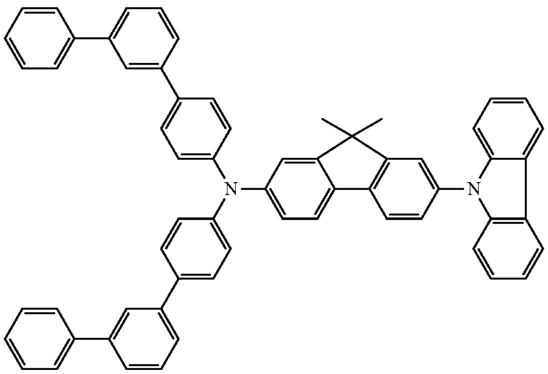
A-36
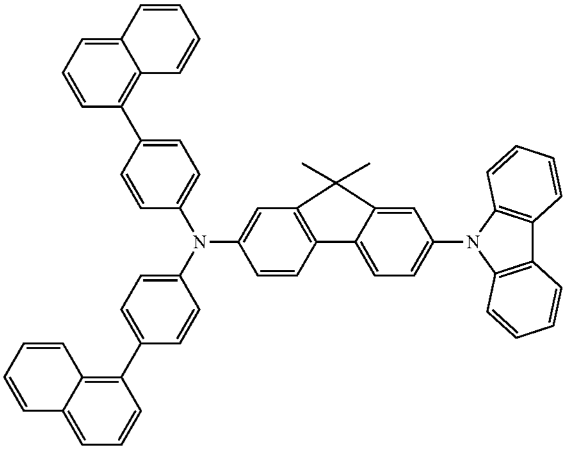
A-37
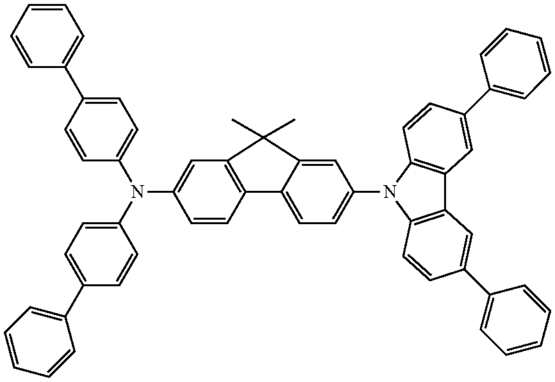
A-38
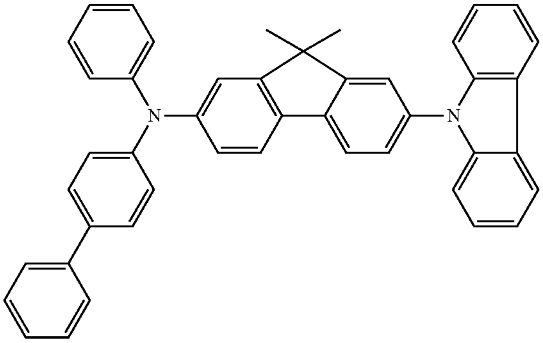
A-39
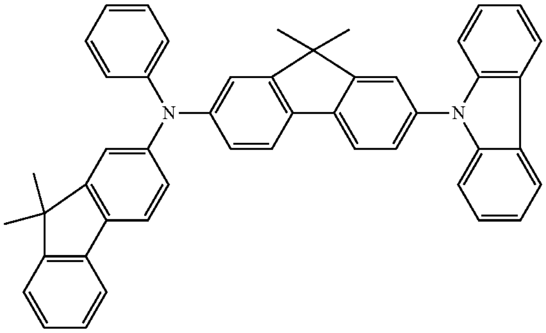
A-40
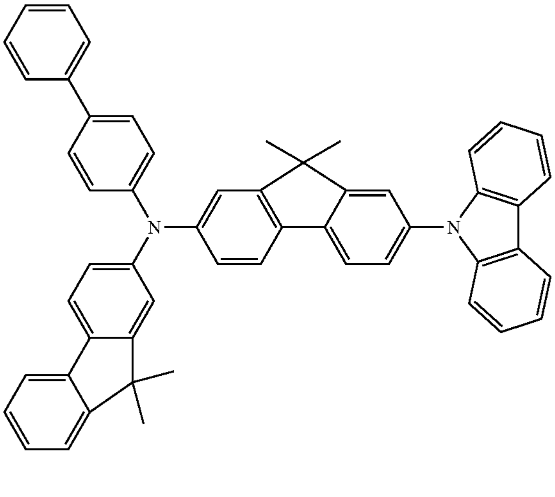

-continued
A-41
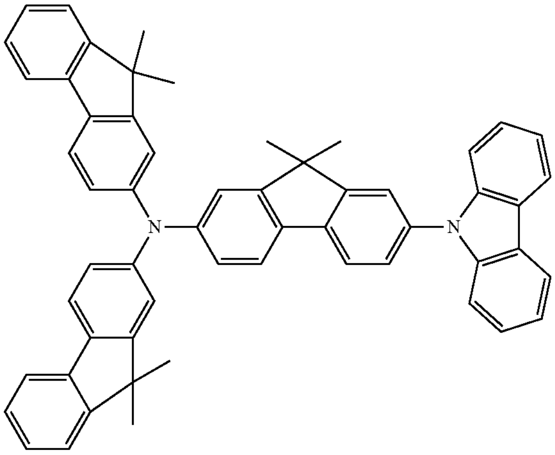
A-42
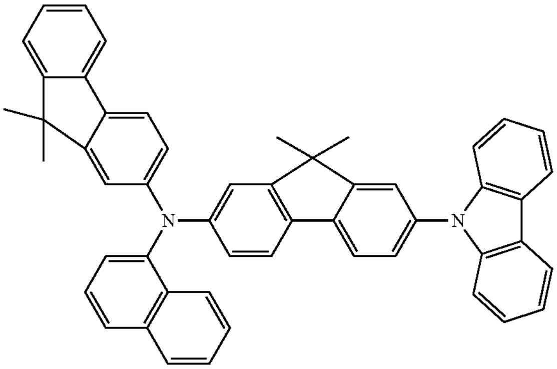
[Formula 152]
A-45
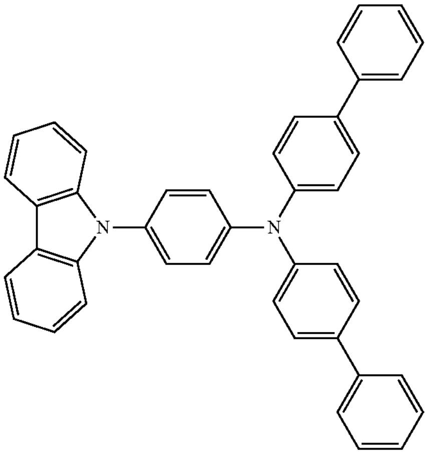
A-47
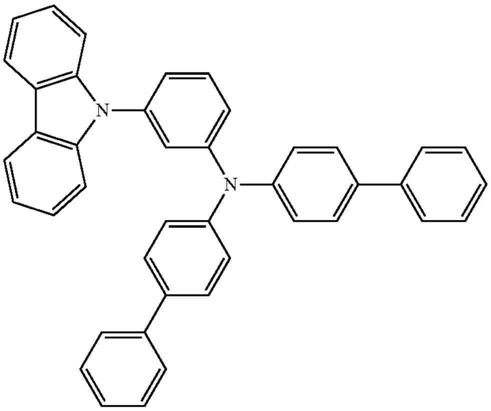
A-48
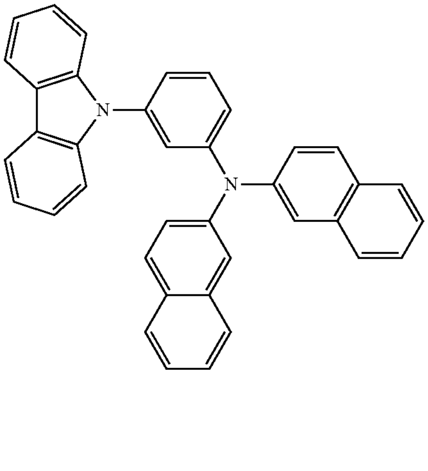
A-50
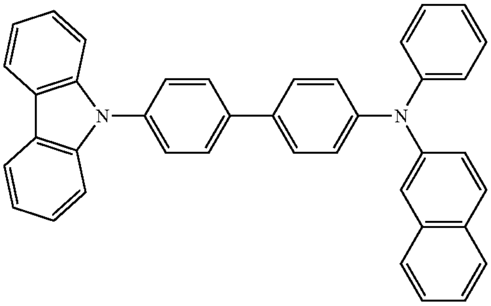

-continued
A-51
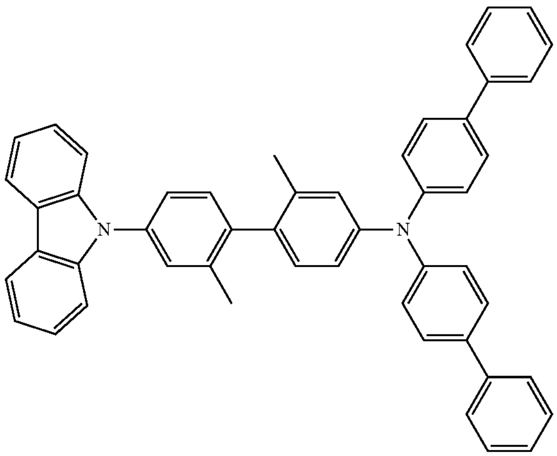
A-53
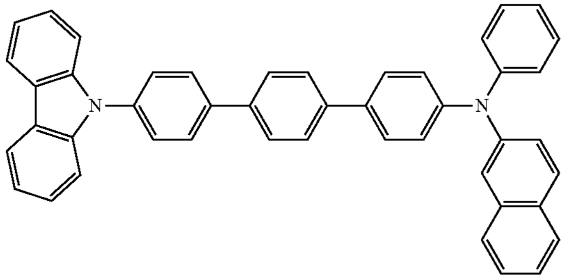
A-54
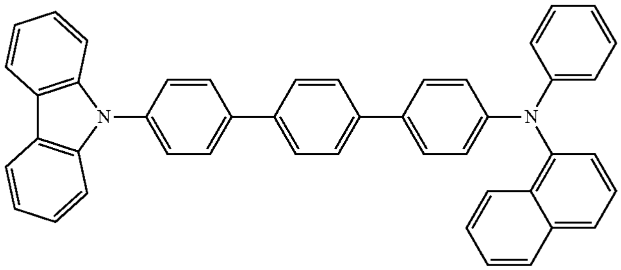
[Formula 153]
B-1
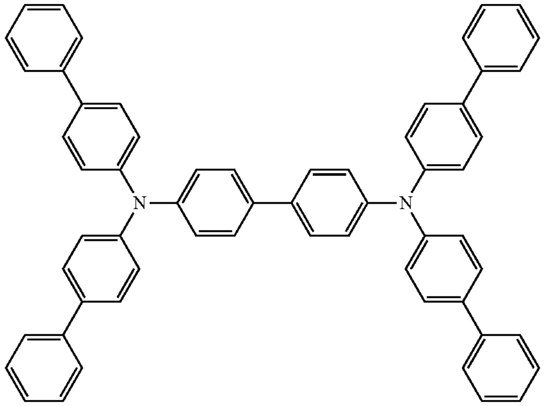
B-2
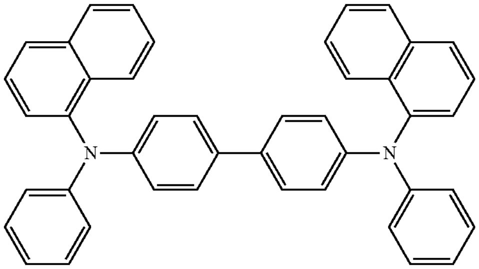
B-3
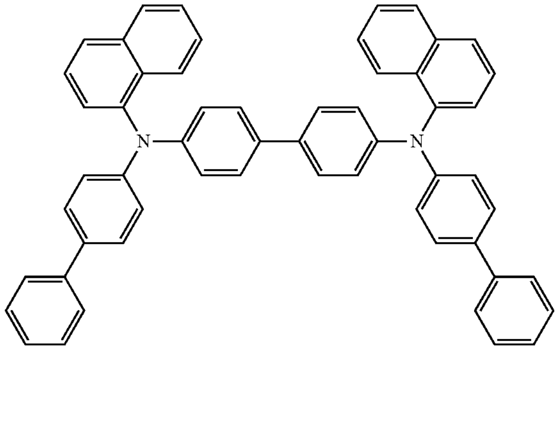
B-4
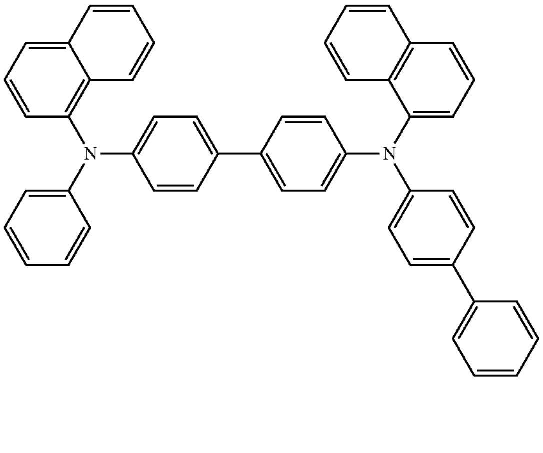

-continued
B-5
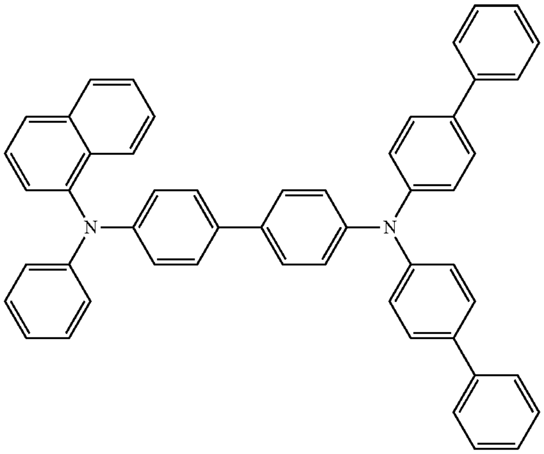
B-6
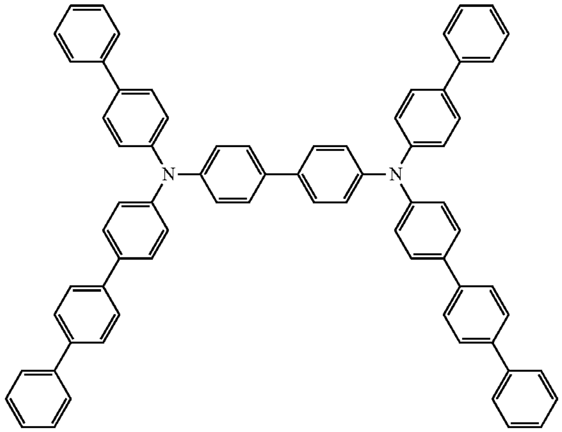
B-7
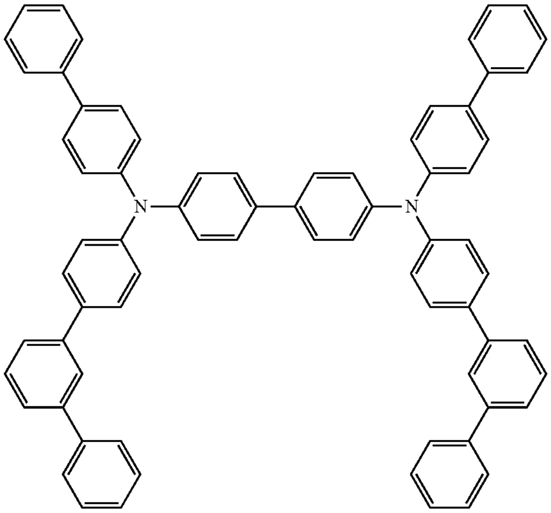
B-8
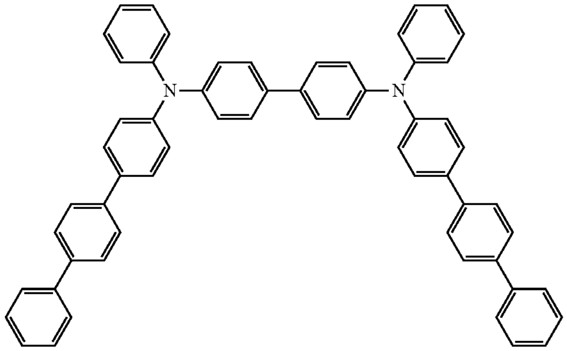
B-9
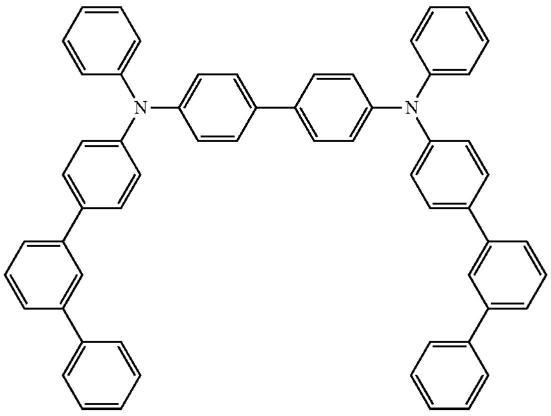
B-10
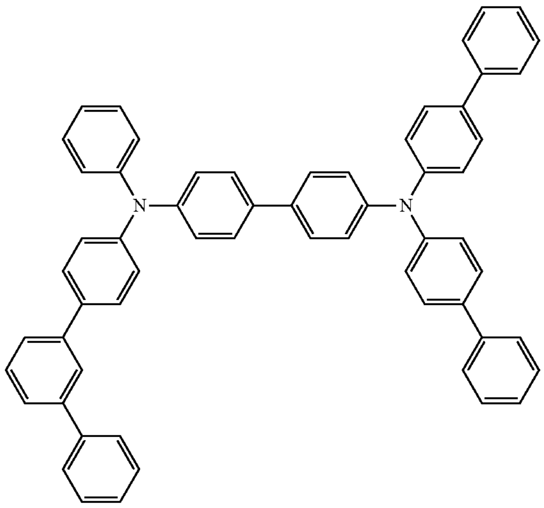

-continued
B-11
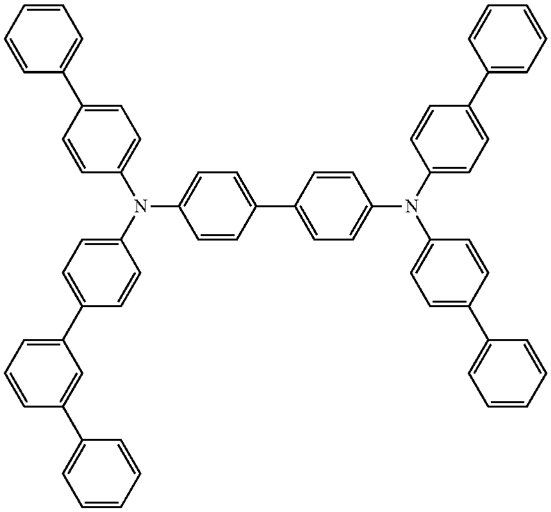
B-12
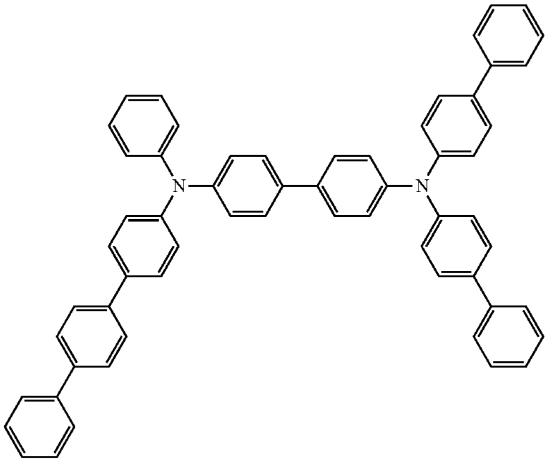
[Formula 154]
B-13
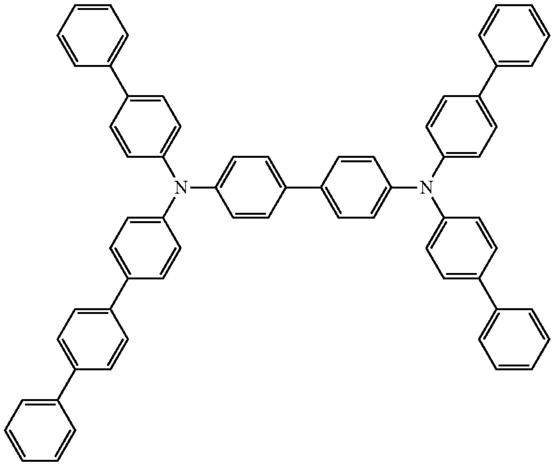
B-14
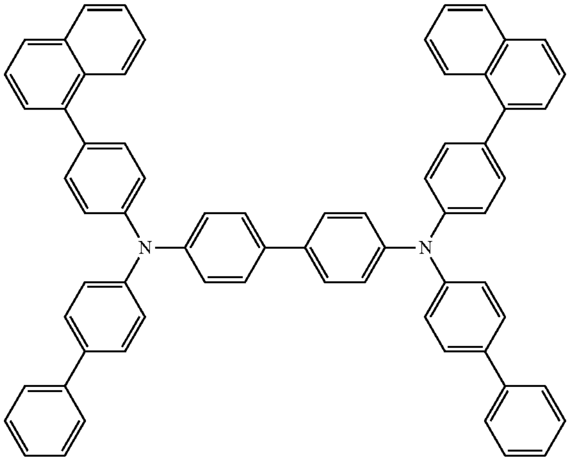
B-15
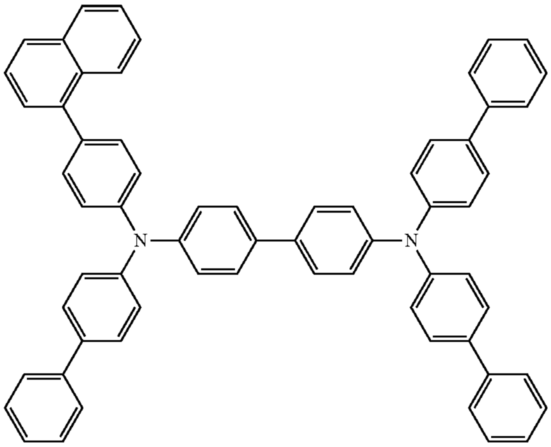
B-16
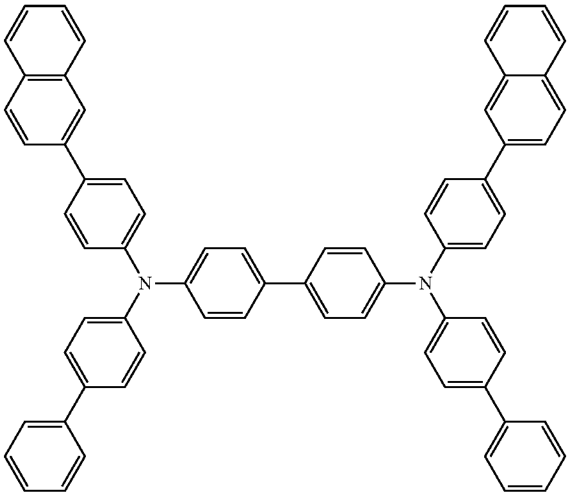

-continued
B-17
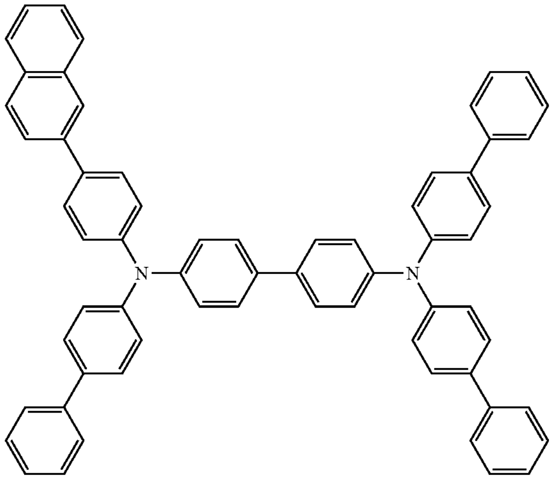
B-18
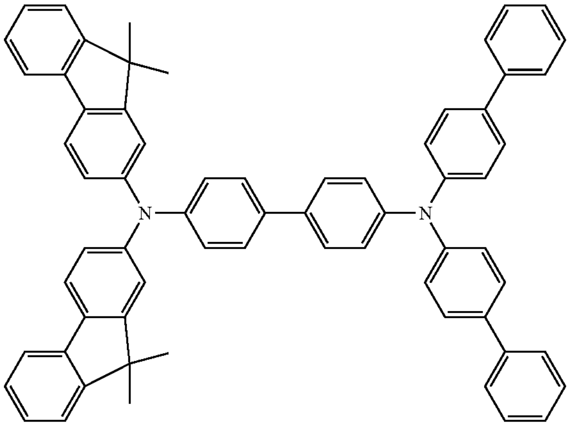
B-19
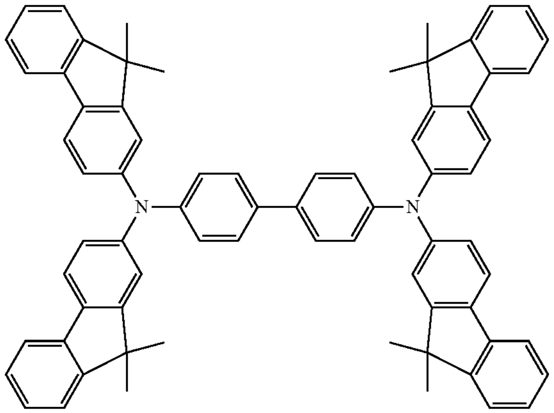
B-20
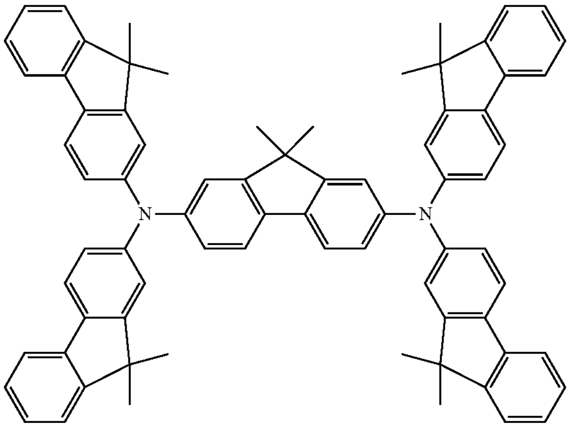
B-21
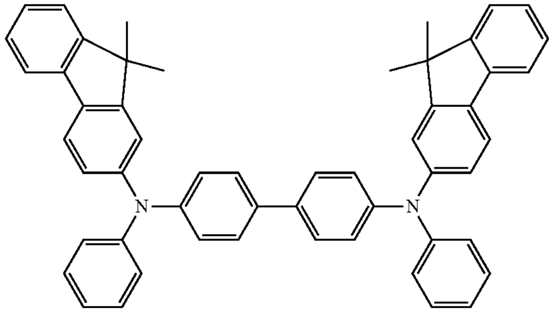
B-22
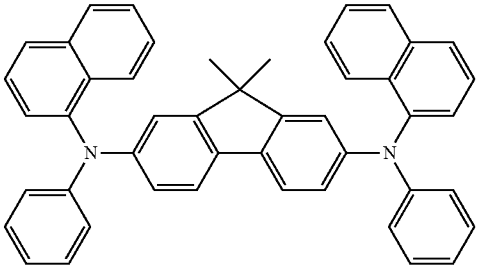

-continued
[Formula 155]
B-23
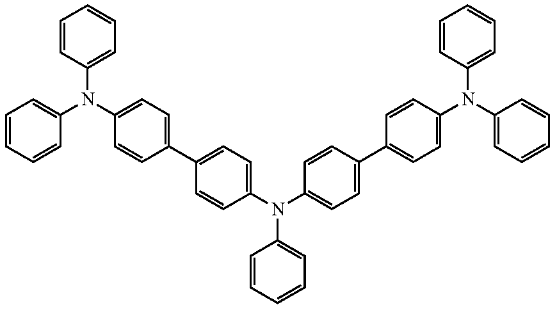
B-24
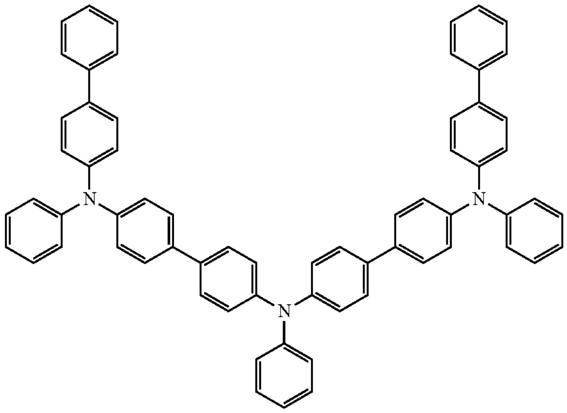
B-25
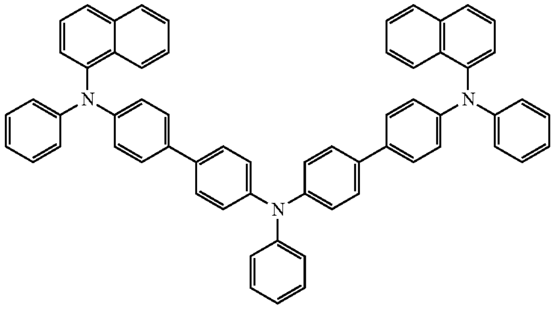
B-26
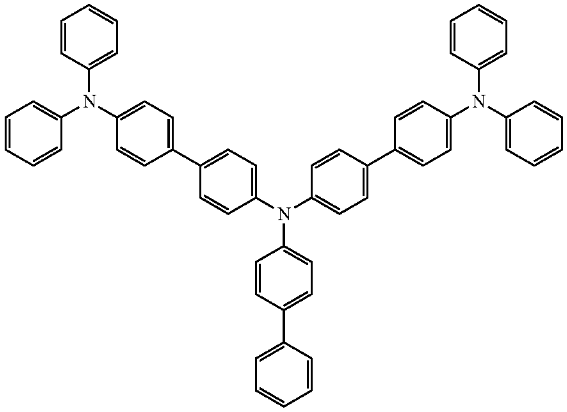
B-27
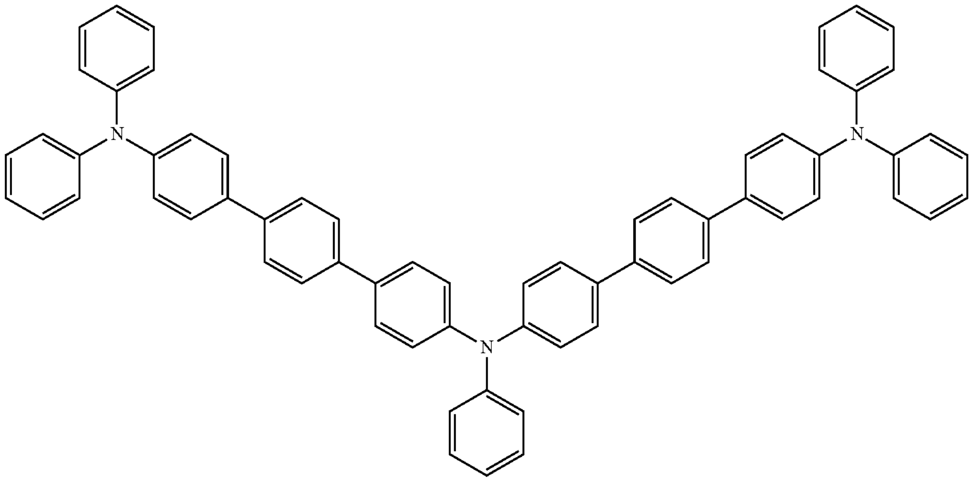

-continued
[Formula 156]
B-33
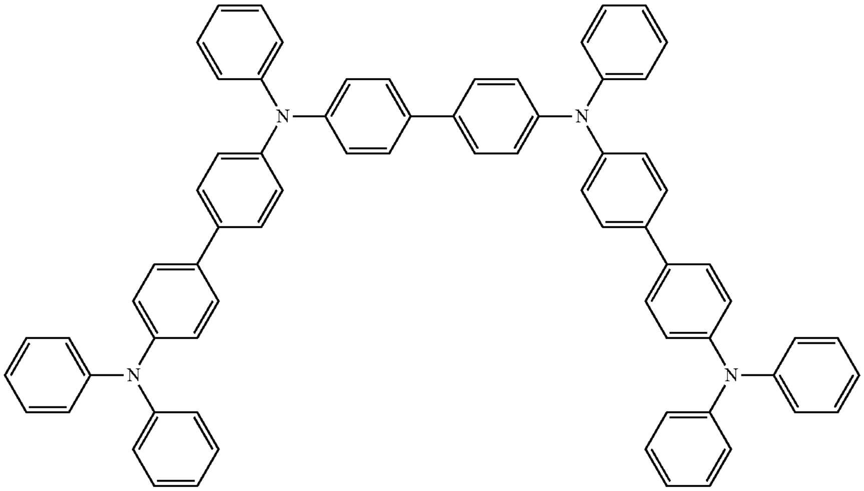
B-34
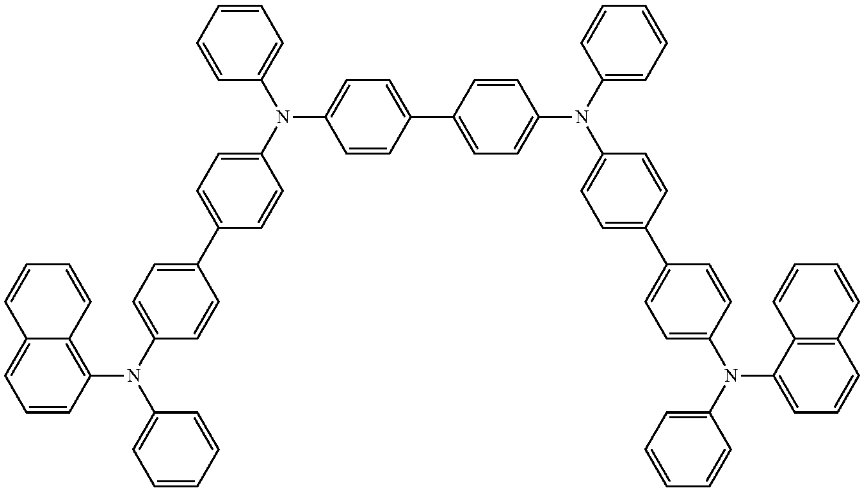
B-35
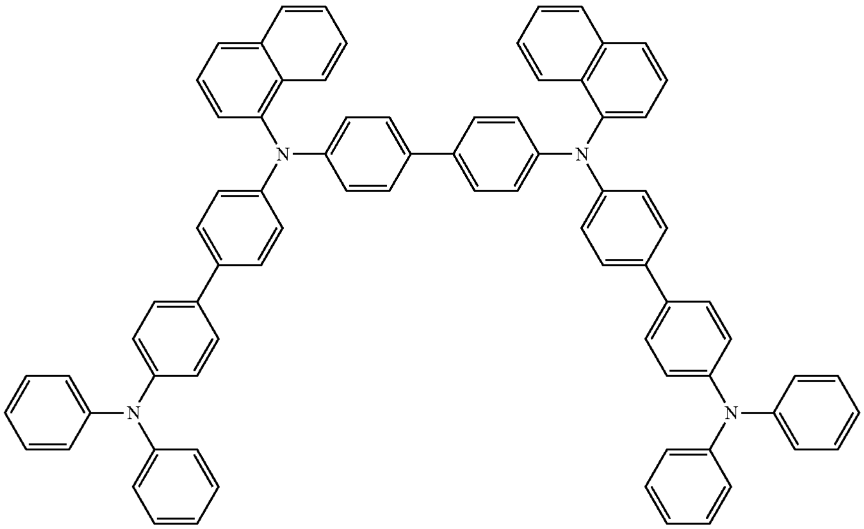

[Formula 157]
B-39
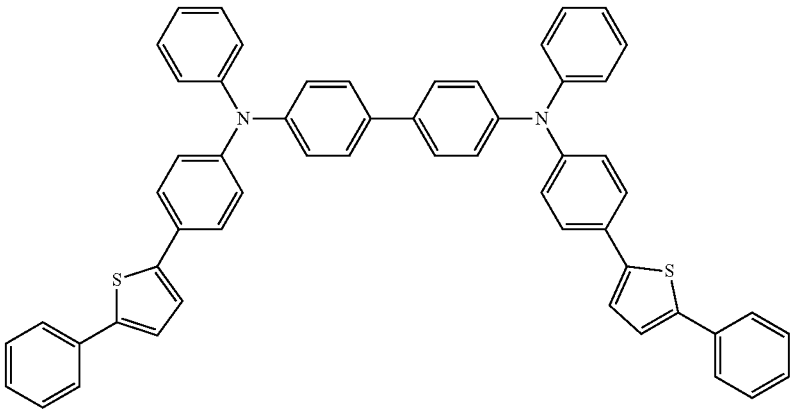
[Formula 158]
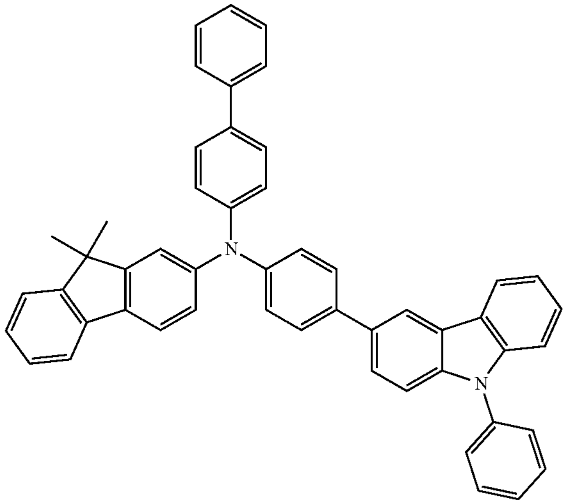
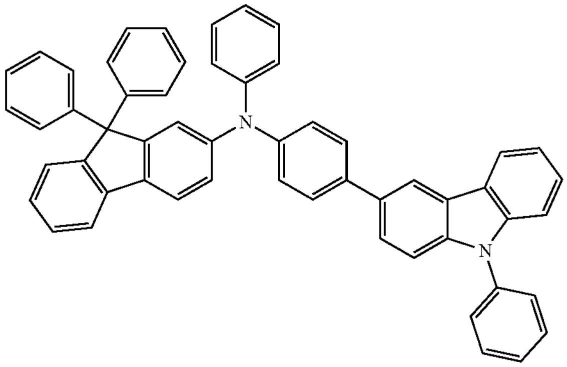
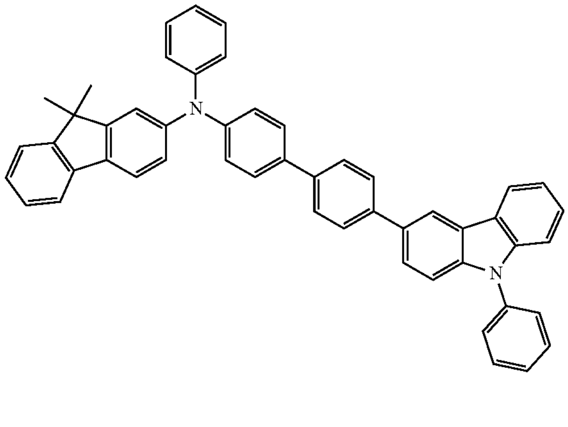
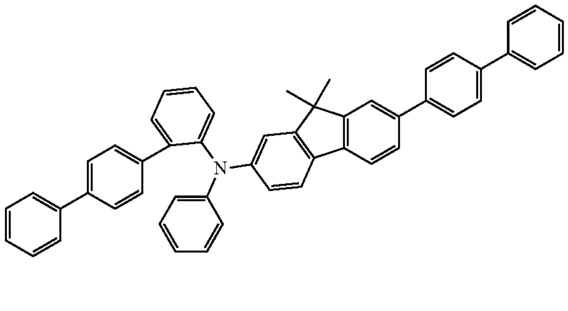

-continued
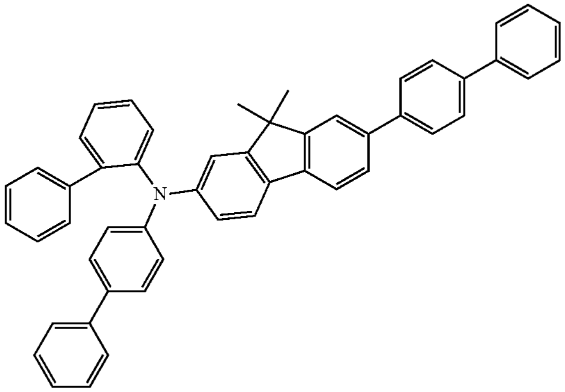
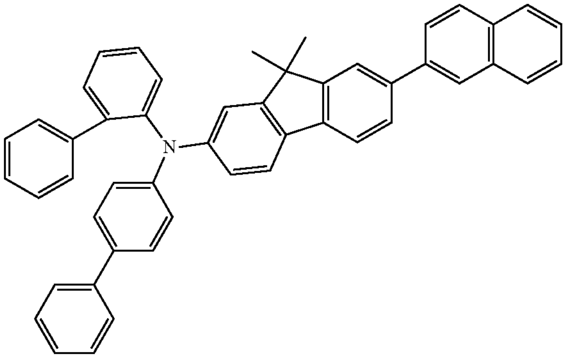
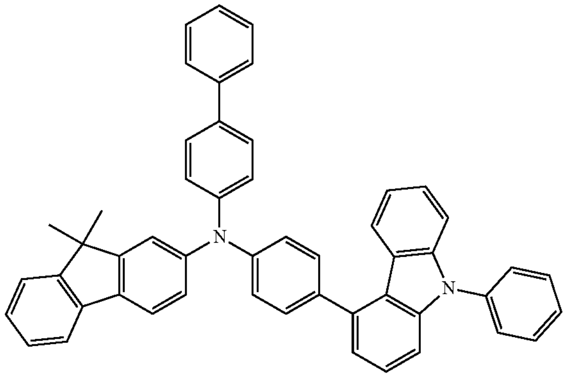
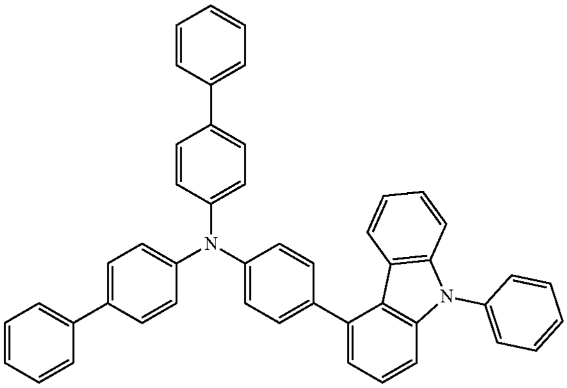
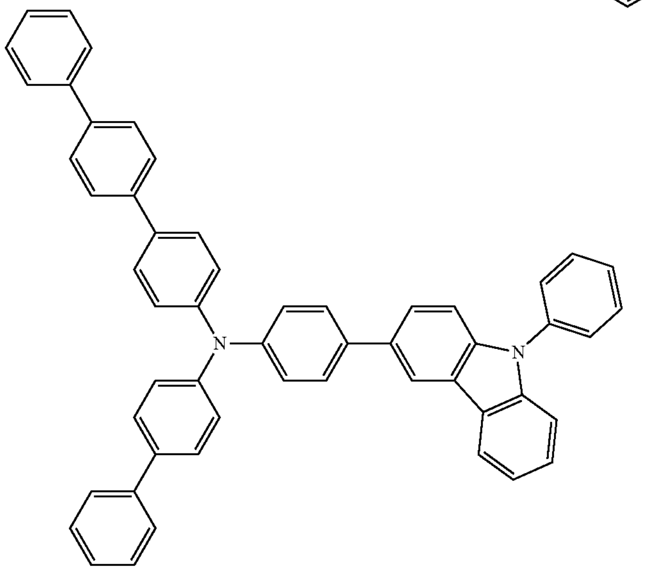
[Formula 159]
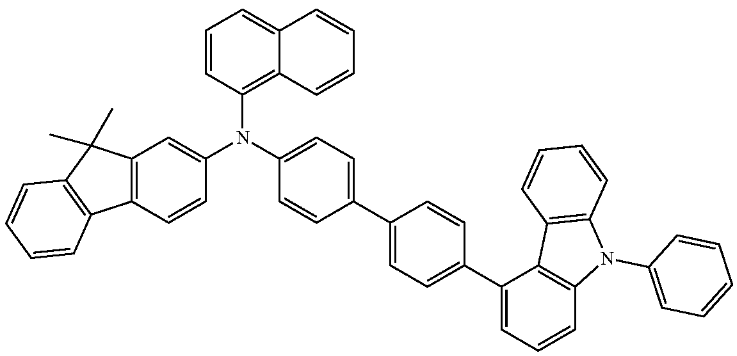

-continued
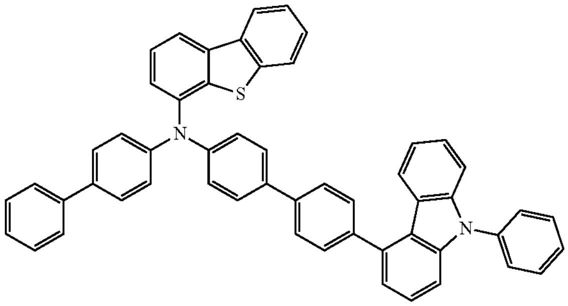
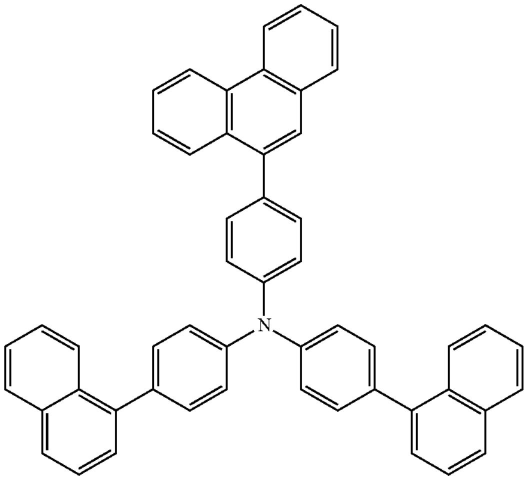
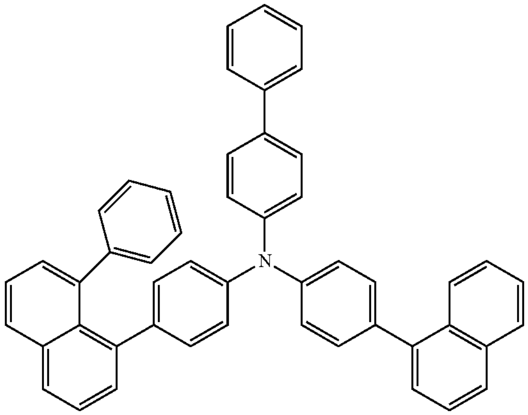
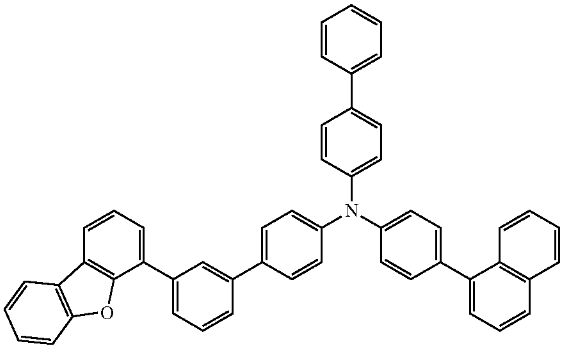
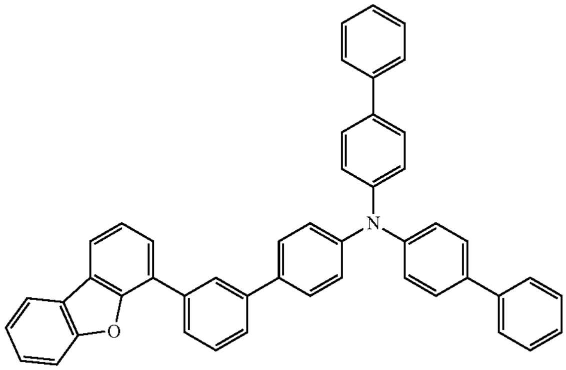
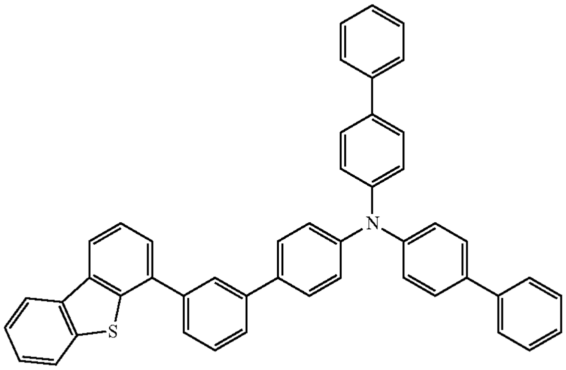

-continued
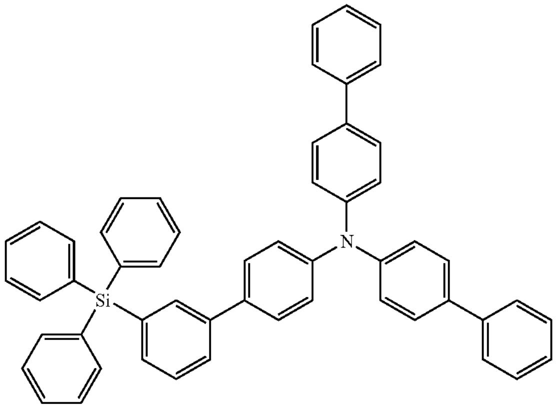
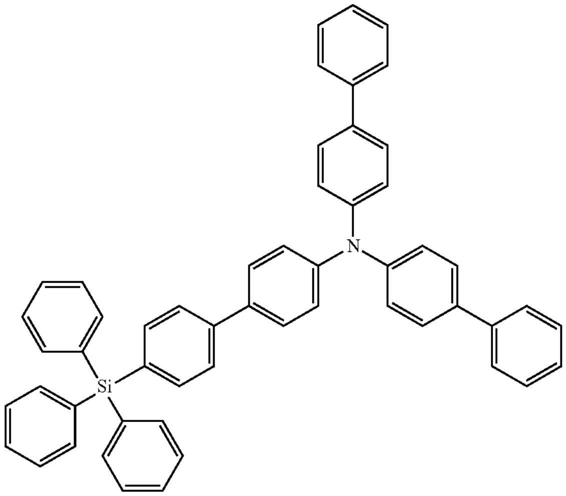
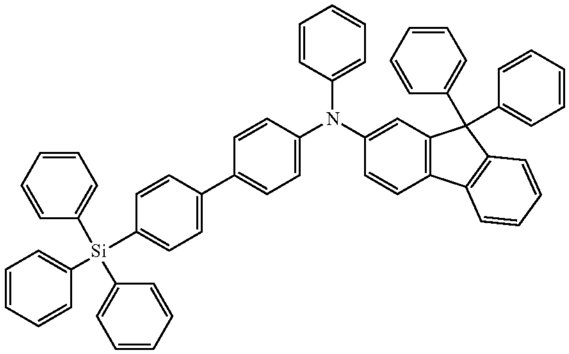
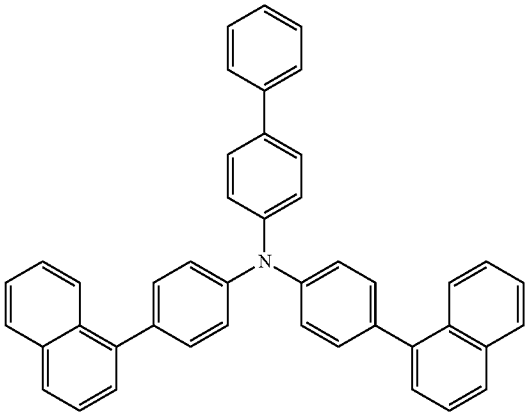
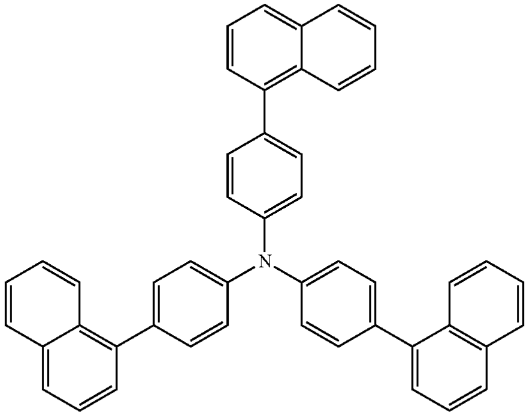

-continued
[Formula 160]
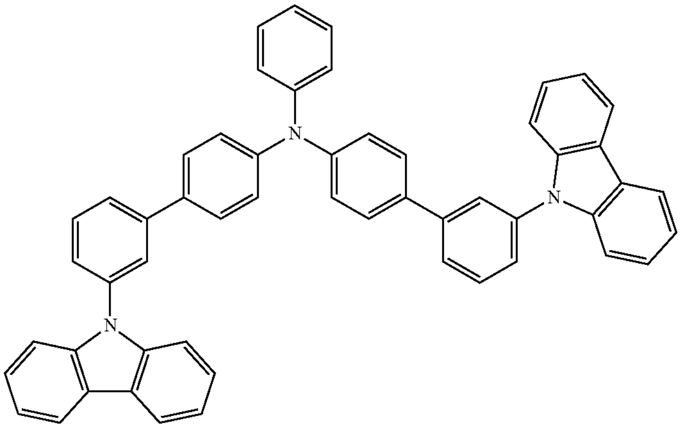
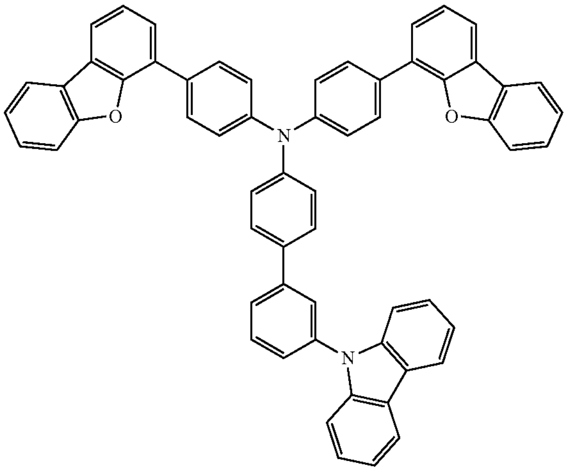
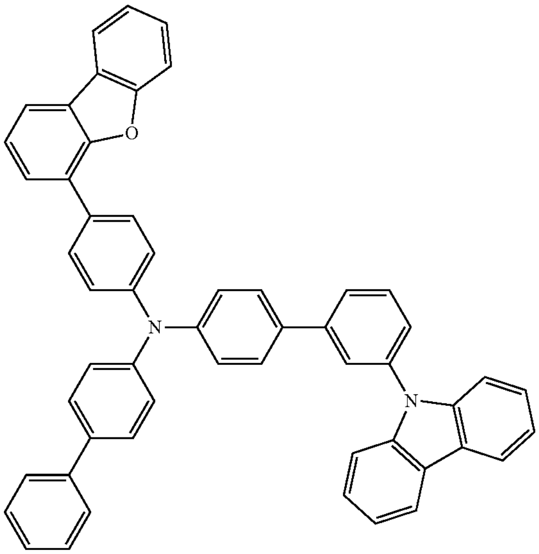
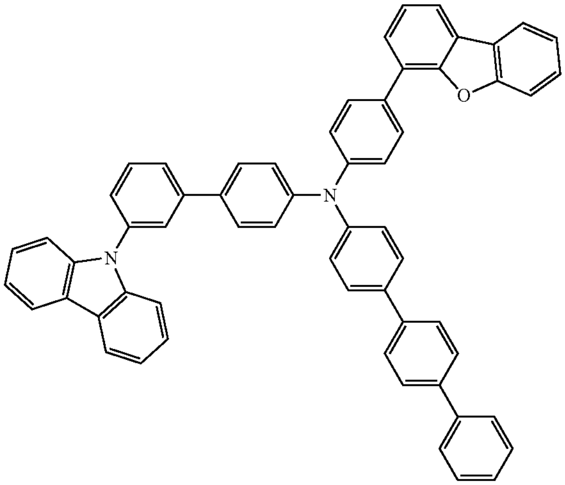
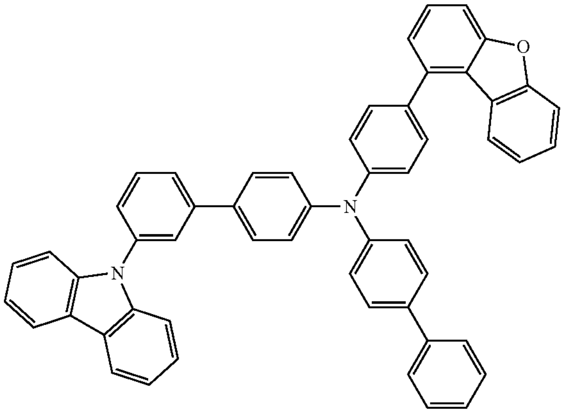

-continued

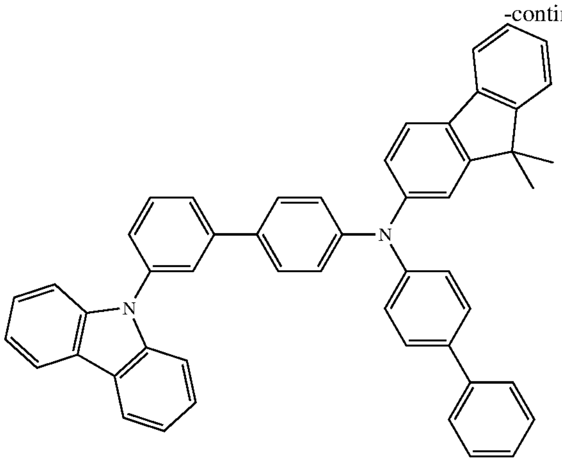

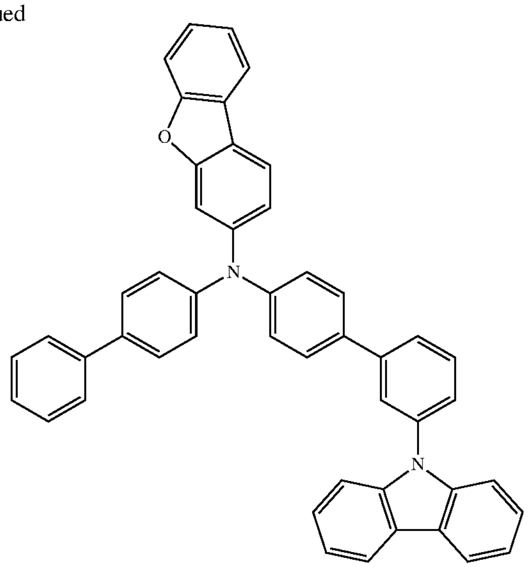

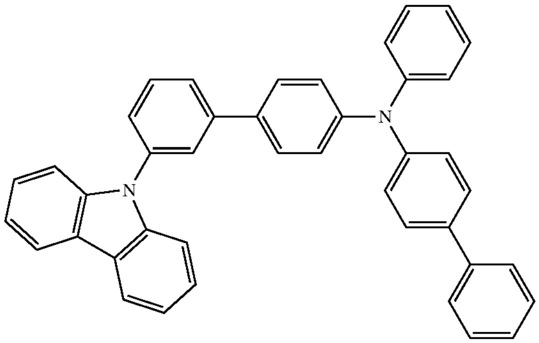 [SMILES: c1ccc(-c2ccc(N(c3ccccc3)c3ccc(-c4cccc(-n5c6ccccc6c6ccccc65)c4)cc3)cc2)cc1]

In the organic EL device according to the exemplary embodiment, the triplet energy of the first host material $T_1(H1)$ and the triplet energy of the second host material $T_1(H2)$ preferably satisfy a relationship of a numerical formula (Numerical Formula 5) below.

$$T_1(H1) - T_1(H2) > 0.03\ \text{eV}. \quad \text{(Numerical Formula 5)}$$

Herein, the "host material" refers to, for instance, a material that accounts for "50 mass % or more of the layer". That is, for instance, the first emitting layer contains 50 mass % or more of the first host material with respect to the total mass of the first emitting layer. For instance, the second emitting layer contains 50 mass % or more of the second host material with respect to the total mass of the second emitting layer.

Emission Wavelength of Organic EL Device

The organic electroluminescence device according to the exemplary embodiment preferably emits, when being driven, light whose maximum peak wavelength is 500 nm or less.

The organic electroluminescence device according to the exemplary embodiment more preferably emits, when being driven, light whose maximum peak wavelength is in a range from 430 nm to 480 nm.

The maximum peak wavelength of the light emitted from the organic EL device when being driven is measured as follows. Voltage is applied on the organic EL device such that a current density becomes 10 $mA/cm^2$, where spectral radiance spectrum is measured by a spectroradiometer CS-2000 (produced by Konica Minolta, Inc.). A peak wavelength of an emission spectrum, at which the luminous intensity of the resultant spectral radiance spectrum is at the maximum, is measured and defined as a maximum peak wavelength (unit: nm).

First Emitting Layer

The first emitting layer includes a first host material and a first luminescent compound that emits light having a maximum peak wavelength of 500 nm or less. The ionization potential Ip(D1) of the first luminescent compound satisfies the relationship of the numerical formula (Numerical Formula 1X).

The first host material is a compound different from the second host material contained in the second emitting layer.

The first luminescent compound preferably emits light having the maximum peak wavelength of 480 nm or less. The first luminescent compound preferably emits light having the maximum peak wavelength of 430 nm or more.

The first emitting compound contained in the first emitting layer is preferably a compound that emits fluorescence having a maximum peak wavelength of 500 nm or less. The first luminescent compound preferably emits light having the maximum peak wavelength of 480 nm or less. The first luminescent compound preferably emits light having the maximum peak wavelength of 430 nm or more.

In the organic EL device according to the exemplary embodiment, the first luminescent compound is preferably a compound containing no azine ring structure in a molecule.

In the organic EL device according to the exemplary embodiment, the first luminescent compound is preferably not a boron-containing complex, more preferably not a complex.

In the organic EL device according to the exemplary embodiment, the first emitting layer preferably does not contain a metal complex. In the organic EL device according to the exemplary embodiment, the first emitting layer also preferably does not contain a boron-containing complex.

In the organic EL device according to the exemplary embodiment, the first emitting layer preferably does not contain a phosphorescent material (dopant material).

Further, the first emitting layer preferably does not contain a heavy-metal complex and a phosphorescent rare earth metal complex. Examples of the heavy-metal complex herein include iridium complex, osmium complex, and platinum complex.

A method of measuring the maximum peak wavelength of the compound is as follows. A toluene solution of a measurement target compound at a concentration of 5 μmol/L was prepared and put in a quartz cell. An emission spectrum (ordinate axis: luminous intensity, abscissa axis: wavelength) of the thus-obtained sample was measured at a normal temperature (300K). The emission spectrum can be measured using a spectrophotometer (machine name: F-7000) produced by Hitachi High-Tech Science Corporation. It should be noted that the apparatus for measuring the emission spectrum is not limited to the apparatus used herein.

A peak wavelength of the emission spectrum exhibiting the maximum luminous intensity is defined as the maximum peak wavelength. Herein, the maximum peak wavelength of fluorescence is occasionally referred to as a maximum fluorescence peak wavelength (FL-peak).

In an emission spectrum of the first luminescent compound, where a peak exhibiting a maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximum values.

Moreover, in the emission spectrum of the first luminescent compound, the number of peaks is preferably less than three.

In the organic EL device according to the exemplary embodiment, the first emitting layer preferably emits light whose maximum peak wavelength is 500 nm or less when the device is driven.

The maximum peak wavelength of the light emitted from the emitting layer when the device is driven is measured as follows.

Maximum Peak Wavelength λp of Light Emitted from Emitting Layer when Organic EL Device is Driven For a maximum peak wavelength $\lambda p_1$ of light emitted from the first emitting layer when the organic EL device is driven, the organic EL device is produced by using the material of the first emitting layer for the first emitting layer and the second emitting layer, and voltage is applied to the organic EL device so that a current density becomes 10 $mA/cm^2$, where spectral radiance spectrum is measured by a spectroradiometer CS-2000 (produced by Konica Minolta, Inc.). The maximum peak wavelength $\lambda p_1$ (unit: nm) is calculated from the obtained spectral radiance spectrum.

For a maximum peak wavelength $\lambda p_2$ of light emitted from the second emitting layer when the organic EL device is driven, the organic EL device is produced by using the material of the second emitting layer for the first emitting layer and the second emitting layer, and voltage is applied to the organic EL device so that a current density becomes 10 $mA/cm^2$, where spectral radiance spectrum is measured by a spectroradiometer CS-2000 (produced by Konica Minolta, Inc.). The maximum peak wavelength $\lambda p_2$ (unit: nm) is calculated from the obtained spectral radiance spectrum.

In the organic EL device according to the exemplary embodiment, a singlet energy of the first host material $S_1$(H1) and a singlet energy of the first luminescent compound $S_1$(D1) preferably satisfy a relationship of a numerical formula (Numerical Formula 20) below.

$$S_1(H1) > S_1(D1) \quad \text{(Numerical Formula 20)}$$

The singlet energy $S_1$ means an energy difference between the lowest singlet state and the ground state.

When the first host material and the first emitting compound satisfy a relationship of the numerical formula (Numerical Formula 20), singlet excitons generated on the first host material easily transfer from the first host material to the first emitting compound, thereby contributing to emission (preferably fluorescence) of the first emitting compound.

In the organic EL device according to the exemplary embodiment, the triplet energy of the first host material $T_1$(H1) and the triplet energy of the first luminescent compound $T_1$(D1) preferably satisfy a relationship of a numerical formula (Numerical Formula 20A) below.

$$T_1(D1) > T_1(H1) \quad \text{(Numerical Formula 20A)}$$

When the first host material and the first luminescent compound satisfy the relationship of the numerical formula (Numerical Formula 20A), triplet excitons generated in the first emitting layer transfer not onto the first luminescent compound having higher triplet energy but onto the first host material, thereby easily transferring to the second emitting layer.

The organic EL device according to the exemplary embodiment preferably satisfies a numerical formula (Numerical Formula 20B) below.

$$T_1(D1) > T_1(H1) > T_1(H2) \quad \text{(Numerical Formula 20B)}$$

Triplet Energy $T_1$

A method of measuring a triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescence spectrum (ordinate axis: phosphorescent luminous intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $T_1$.

$$T_1[eV] = 1239.85/\lambda_{edge} \quad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring a singlet energy $S_1$ with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value $\lambda_{edge}$ (nm) at an intersection of the tangent and the abscissa axis is assigned to a conversion equation (F2) below to calculate singlet energy.

$$S_1[eV] = 1239.85/\lambda_{edge} \quad \text{Conversion Equation (F2)}$$

Any apparatus for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the organic EL device according to the exemplary embodiment, the first luminescent compound is preferably contained at 1.0 mass % or more in the first emitting layer. That is, the first emitting layer contains the first luminescent compound preferably at 1.0 mass % or more, more preferably at more than 1.1 mass %, still more preferably at 1.2 mass % or more, and still further more preferably at 1.5 mass % or more with respect to the total mass of the first emitting layer.

The first emitting layer contains the first luminescent compound preferably at 10 mass % or less, more preferably at 7 mass % or less, and still more preferably at 5 mass % or less with respect to the total mass of the first emitting layer.

In the organic EL device according to the exemplary embodiment, the first emitting layer contains a first compound as the first host material preferably at 60 mass % or more, more preferably at 70 mass % or more, still more preferably at 80 mass % or more, still further more preferably at 90 mass % or more, and yet still further more preferably at 95 mass % or more, with respect to the total mass of the first emitting layer.

The first emitting layer preferably contains the first host material at 99 mass % or less with respect to the total mass of the first emitting layer.

When the first emitting layer contains the first host material and the first luminescent compound, the upper limit of a total of the content ratios of the first host material and the first luminescent compound is 100 mass %.

In the exemplary embodiment, the first emitting layer may further contain any other material than the first host material and the first luminescent compound.

The first emitting layer may contain a single type of the first host material alone or may contain two or more types of the first host material. The first emitting layer may contain a single type of the first luminescent compound alone or may contain two or more types of the first luminescent compound.

In the organic EL device of the exemplary embodiment, a film thickness of the first emitting layer is preferably 3 nm or more, more preferably 5 nm or more. The film thickness of the first emitting layer of 3 nm or more is sufficient for causing recombination of holes and electrons in the first emitting layer.

In the organic EL device according to the exemplary embodiment, the film thickness of the first organic compound layer is preferably 15 nm or less, more preferably 10 nm or less. The film thickness of the first emitting layer of 15 nm or less is thin enough for transfer of triplet excitons to the second emitting layer.

In the organic EL device of the exemplary embodiment, the film thickness of the first emitting layer is more preferably in a range from 3 nm to 15 nm.

In the organic EL device according to the exemplary embodiment, the first emitting layer may contain a compound represented by a formula (HT100) below.

[Formula 161]

(HT100)

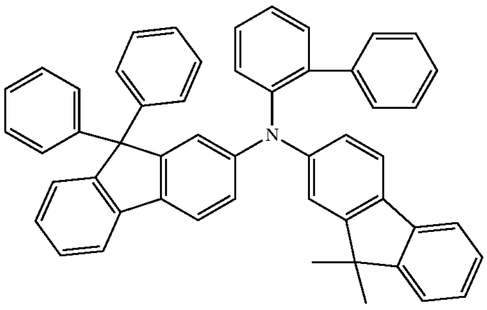

In the organic EL device according to the exemplary embodiment, the first emitting layer may contain the hole transporting zone material according to the exemplary embodiment.

Second Emitting Layer

The second emitting layer includes a second host material and a second luminescent compound that emits light having a maximum peak wavelength of 500 nm or less. The second host material is a compound different from the first host material contained in the first emitting layer. The second luminescent compound preferably emits light having the maximum peak wavelength of 480 nm or less. The second luminescent compound preferably emits light having the maximum peak wavelength of 430 nm or more.

The second emitting compound contained in the second emitting layer is preferably a compound that emits fluorescence having a maximum peak wavelength of 500 nm or less. The second luminescent compound preferably emits fluorescence having the maximum peak wavelength of 480 nm or less. The second luminescent compound preferably emits fluorescence having the maximum peak wavelength of 430 nm or more.

A method of measuring the maximum peak wavelength of the compound is as follows.

In the organic EL device according to the exemplary embodiment, the second emitting layer preferably emits light whose maximum peak wavelength is 500 nm or less when the device is driven.

In the organic EL device of the exemplary embodiment, the second luminescent compound preferably has a full width at half maximum in a range from 1 nm to 20 nm at a maximum peak.

In the organic EL device according to the exemplary embodiment, a Stokes shift of the second luminescent compound preferably exceeds 7 nm.

When the Stokes shift of the second luminescent compound exceeds 7 nm, a decrease in the luminous efficiency due to self-absorption is easily inhibited.

The self-absorption is a phenomenon in which emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by a method described below.

A measurement target compound is dissolved in toluene at a concentration of $2.0\times10^{-5}$ mol/L to prepare a measurement sample. The measurement sample is put into a quartz cell and is irradiated with continuous light falling within an ultraviolet-to-visible region at a room temperature (300K) to measure an absorption spectrum (ordinate axis: absorbance, abscissa axis: wavelength). A spectrophotometer U-3900/3900H manufactured by Hitachi High-Tech Science Corporation is usable for the absorption spectrum measurement. A measurement target compound is dissolved in toluene at a concentration of $4.9\times10^{-6}$ mol/L to prepare a measurement sample. The measurement sample was put into a quartz cell and was irradiated with excited light at a room temperature (300K) to measure fluorescence spectrum (ordinate axis: fluorescence intensity, abscissa axis: wavelength). A spectrophotofluorometer F-7000 manufactured by Hitachi High-Tech Science Corporation is usable for the fluorescence spectrum measurement.

A difference between an absorption local-maximum wavelength and a fluorescence local-maximum wavelength is calculated from the absorption spectrum and the fluorescence spectrum to obtain a Stokes shift (SS). A unit of the Stokes shift (SS) is denoted by nm.

In the organic EL device according to the exemplary embodiment, a triplet energy of the second luminescent compound $T_1(D2)$ and the triplet energy of the second host material T1(H2) preferably satisfy a relationship of a numerical formula (Numerical Formula 3A) below.

$$T_1(D2) > T_1(H2) \quad \text{(Numerical Formula 3A)}$$

In the organic EL device according to the exemplary embodiment, when the second luminescent compound and the second host material satisfy the relationship of the numerical formula (Numerical Formula 3A), in transfer of triplet excitons generated in the first emitting layer to the second emitting layer, the triplet excitons energy-transfer not onto the second luminescent compound having higher triplet energy but onto molecules of the second host material. In addition, triplet excitons generated by recombination of holes and electrons on the second host material do not transfer to the second luminescent compound having higher triplet energy. Triplet excitons generated by recombination on molecules of the second luminescent compound quickly energy-transfer to molecules of the second host material.

Triplet excitons in the second host material do not transfer to the second luminescent compound but efficiently collide with one another on the second host material to generate singlet excitons by the TTF phenomenon.

In the organic EL device according to the exemplary embodiment, a singlet energy of the second host material $S_1(H2)$ and the singlet energy of the second luminescent compound $S_1(D2)$ preferably satisfy a relationship of a numerical formula (Numerical Formula 4) below.

$$S_1(H2) > S_1(D2) \quad \text{(Numerical Formula 4)}$$

In the organic EL device according to the above exemplary embodiment, when the second emitting compound and the second host material satisfy the relationship of the numerical formula (Numerical formula 4), due to the singlet energy of the second emitting compound being smaller than the singlet energy of the second host material, singlet excitons generated by the TTF phenomenon energy-transfer from the second host material to the second emitting compound, thereby contributing to emission (preferably fluorescence) of the second emitting compound.

In the organic EL device according to the exemplary embodiment, the second luminescent compound is preferably a compound containing no azine ring structure in a molecule.

In the organic EL device of the exemplary embodiment, the second luminescent compound is preferably not a boron-containing complex, more preferably not a complex.

In the organic EL device according to the exemplary embodiment, the second emitting layer preferably does not contain a metal complex. In the organic EL device according to the exemplary embodiment, the second emitting layer also preferably does not contain a boron-containing complex.

In the organic EL device according to the exemplary embodiment, the second emitting layer preferably does not contain a phosphorescent material (dopant material).

Further, the second emitting layer preferably does not contain a heavy-metal complex and a phosphorescent rare earth metal complex. Examples of the heavy-metal complex herein include iridium complex, osmium complex, and platinum complex.

In the organic EL device according to the exemplary embodiment, the second luminescent compound is preferably contained at 1.0 mass % or more in the second emitting layer. That is, the second emitting layer contains the second luminescent compound preferably at 1.0 mass % or more, more preferably at more than 1.1 mass %, still more preferably at 1.2 mass % or more, and still further more preferably at 1.5 mass % or more with respect to the total mass of the second emitting layer.

The second emitting layer contains the second luminescent compound preferably at 10 mass % or less, more preferably at 7 mass % or less, and still more preferably at 5 mass % or less with respect to the total mass of the second emitting layer.

The second emitting layer contains a second compound as the second host material preferably at 60 mass % or more, more preferably at 70 mass % or more, still more preferably at 80 mass % or more, still further more preferably at 90 mass % or more, and yet still further more preferably at 95 mass % or more, with respect to the total mass of the second emitting layer.

The second emitting layer preferably contains the second host material at 99 mass % or less with respect to the total mass of the second emitting layer.

When the second emitting layer contains the second host material and the second luminescent compound, the upper limit of the total of the content ratios of the second host material and the second luminescent compound is 100 mass %.

In the exemplary embodiment, the second emitting layer may further contain any other material than the second host material and the second luminescent compound.

The second emitting layer may contain a single type of the second host material alone or may contain two or more types of the second host material. The second emitting layer may contain a single type of the second luminescent compound alone or may contain two or more types of the second luminescent compound.

In the organic EL device according to the exemplary embodiment, a film thickness of the second emitting layer is preferably 5 nm or more, more preferably 15 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portion in the first emitting layer.

In the organic EL device according to the exemplary embodiment, the film thickness of the second emitting layer is preferably 20 nm or less. With the film thickness of the second emitting layer of 20 nm or less, a density of triplet excitons in the second emitting layer is improvable to further facilitate occurrence of the TTF phenomenon.

In the organic EL device of the exemplary embodiment, the film thickness of the second emitting layer is preferably in a range from 5 nm to 20 nm.

In the organic EL device according to the exemplary embodiment, the triplet energy of the first host material T1(H1) preferably satisfies a relationship of a numerical formula (Numerical Formula 12) below.

$$T_1(H1) > 2.0 \text{ eV} \quad \text{(Numerical Formula 12)}$$

In the organic EL device according to the exemplary embodiment, the triplet energy of the first host material $T_1(H1)$ also preferably satisfies a relationship of a numerical formula (Numerical Formula 12AX) below, also preferably satisfies a relationship of a numerical formula (Numerical Formula 12A) below, or also preferably satisfies a relationship of a numerical formula (Numerical Formula 12B) below.

$$T_1(H1) > 2.09 \text{ eV} \quad \text{(Numerical Formula 12AX)}$$

$$T_1(H1) > 2.10 \text{ eV} \quad \text{(Numerical Formula 12A)}$$

$$T_1(H1) > 2.15 \text{ eV} \quad \text{(Numerical Formula 12B)}$$

In the organic EL device according to the exemplary embodiment, when the triplet energy of the first host material $T_1(H1)$ satisfies the relationship of the numerical formula (Numerical Formula 12AX), the numerical formula (Numerical Formula 12A) or the numerical formula (Numerical Formula 12B), triplet excitons generated in the first emitting layer easily transfer to the second emitting layer, and also are easily inhibited from back-transferring from the second emitting layer to the first emitting layer. Consequently, singlet excitons are efficiently generated in the second emitting layer, thereby improving luminous efficiency.

In the organic EL device according to the exemplary embodiment, the triplet energy of the first host material $T_1(H1)$ also preferably satisfies a relationship of a numerical formula (Numerical Formula 12C) below, or also preferably satisfies a relationship of a numerical formula (Numerical Formula 12D) below.

$$2.08 \text{ eV} > T_1(H1) > 1.87 \text{ eV} \quad \text{(Numerical Formula 12C)}$$

$$2.05 \text{ eV} > T_1(H1) > 1.90 \text{ eV} \quad \text{(Numerical Formula 12D)}$$

In the organic EL device according to the exemplary embodiment, when the triplet energy of the first host material $T_1(H1)$ satisfies the relationship of the numerical formula (Numerical Formula 12C) or the numerical formula (Numerical Formula 12D), energy of triplet excitons generated in the first emitting layer is decreased, so that the organic EL device is expected to have a long lifetime.

In the organic EL device according to the exemplary embodiment, the triplet energy of the first luminescent compound $T_1(D1)$ also preferably satisfies a relationship of a numerical formula (Numerical Formula 14A) below, or also preferably satisfies a relationship of a numerical formula (Numerical Formula 14B) below.

$$2.60\ \text{eV} > T_1(D1) \qquad \text{(Numerical Formula 14A)}$$

$$2.50\ \text{eV} > T_1(D1) \qquad \text{(Numerical Formula 14B)}$$

Since the first emitting layer contains the first luminescent compound satisfying the relationship of the numerical formula (Numerical Formula 14A) or (Numerical Formula 14B), the lifetime of the organic EL device is prolonged.

In the organic EL device according to the exemplary embodiment, the triplet energy of the second luminescent compound $T_1(D2)$ also preferably satisfies a relationship of a numerical formula (Numerical Formula 14C) below, or also preferably satisfies a relationship of a numerical formula (Numerical Formula 14D) below.

$$2.60\ \text{eV} > T_1(D2) \qquad \text{(Numerical Formula 14C)}$$

$$2.50\ \text{eV} > T_1(D2) \qquad \text{(Numerical Formula 14D)}$$

Since the second emitting layer contains the second luminescent compound satisfying the relationship of the numerical formula (Numerical Formula 14C) or (Numerical Formula 14D), the lifetime of the organic EL device is prolonged.

In the organic EL device according to the exemplary embodiment, the triplet energy of the second host material $T_1(H2)$ also preferably satisfies a relationship of a numerical formula (Numerical Formula 13X) below, or also preferably satisfies a relationship of a numerical formula (Numerical Formula 13) below.

$$T_1(H2) \geq 1.8\ \text{eV} \qquad \text{(Numerical Formula 13X)}$$

$$T_1(H2) \geq 1.9\ \text{eV} \qquad \text{(Numerical Formula 13)}$$

Additional Layers of Organic EL Device

In addition to the hole transporting zone, the first emitting layer and the second emitting layer, the organic EL device according to the exemplary embodiment may include one or more organic layers. Examples of the organic layer include at least one layer selected from the group consisting of an electron injecting layer, an electron transporting layer, a hole blocking layer, and an electron blocking layer.

The organic EL device according to the exemplary embodiment may consist of the hole transporting zone, the first emitting layer, and the second emitting layer. Alternatively, the organic EL device according to the exemplary embodiment may further include, for instance, at least one layer selected from the group consisting of an electron injecting layer, an electron transporting layer, and a hole blocking layer.

FIG. 1 schematically illustrates an exemplary arrangement of the organic EL device according to the exemplary embodiment.

An organic EL device 1 includes a substrate 2, an anode 3, a cathode 4, and organic layers 10 provided between the anode 3 and the cathode 4. The organic layers 10 include a hole transporting zone 6, a first emitting layer 51, a second emitting layer 52, an electron transporting layer 8, and an electron injecting layer 9 that are layered in this order from a side close to the anode 3. The emitting region 5 includes the first emitting layer 51 and the second emitting layer 52.

FIG. 2 schematically illustrates another exemplary arrangement of the organic EL device according to the exemplary embodiment.

An organic EL device 1B includes the substrate 2, the anode 3, the cathode 4, and organic layers 12 provided between the anode 3 and the cathode 4. The organic layers 12 include a second organic layer 62, a first organic layer 61, the first emitting layer 51, the second emitting layer 52, the electron transporting layer 8, and the electron injecting layer 9 that are layered in this order from the side close to the anode 3. In the organic EL device 1B, a hole transporting zone 6A includes the first organic layer 61 and the second organic layer 62.

FIG. 3 schematically illustrates another exemplary arrangement of the organic EL device according to the exemplary embodiment.

An organic EL device 1C includes the substrate 2, the anode 3, the cathode 4, and organic layers 13 provided between the anode 3 and the cathode 4. The organic layers 13 include a third organic layer 63, the second organic layer 62, the first organic layer 61, the first emitting layer 51, the second emitting layer 52, the electron transporting layer 8, and the electron injecting layer 9 that are layered in this order from a side close to the anode 3. In the organic EL device 1C, the hole transporting zone 6B includes the first organic layer 61, the second organic layer 62, and the third organic layer 63.

Also in the organic EL display devices illustrated in FIGS. 2 and 3, an energy barrier between the hole transporting zone material and the first luminescent compound is reducible by using the hole transporting zone material and the first luminescent compound that satisfy the relationship of the numerical formula (Numerical Formula 1X). As a result, even with the reduced number of organic layers (layer-saving structure) forming the hole transporting zone, hole injection into the emitting region can be promoted, easily leading to high efficiency of the organic EL device.

The invention is not limited to the exemplary arrangements of the organic EL devices illustrated in FIGS. 1 to 3.

In the organic EL device according to the exemplary embodiment, the first emitting layer and the second emitting layer may be in direct contact with each other.

Herein, a layer arrangement in which "the first emitting layer and the second emitting layer are in direct contact with each other" may include, for instance, one of embodiments (LS1), (LS2), and (LS3) below.

(LS1) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An embodiment in which in a case of containing an luminescent compound in the first emitting layer and the second emitting layer, a region containing the first host material, the second host material and the luminescent compound is generated in a process of vapor-depositing the compound of the first emitting layer and vapor-depositing the compound of the second emitting layer, and is present on the interface between the first emitting layer and the second emitting layer.

(LS3) An embodiment in which in a case of containing an luminescent compound in the first emitting layer and the second emitting layer, a region containing the luminescent compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

The arrangements of the organic EL devices will be further described below. It should be noted that the reference numerals are occasionally omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Further, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Electron Transporting Layer

In the organic EL device according to the exemplary embodiment, the electron transporting layer is preferably provided between the emitting layer and the cathode.

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl) stilbene (abbreviation: BzOs) is usable. In the exemplary embodiment, a benzimidazole compound is preferably usable. The above-described substances mostly have an electron mobility of $10^{-6}$ $cm^2/V{\cdot}s$ or more. It should be noted that any other substance than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

The film thickness of each of the organic layers of the organic EL device according to the exemplary embodiment is not limited unless otherwise specified in the above. In general, the thickness preferably ranges from several nanometers to 1 μm because an excessively small film thickness is likely to cause defects (e.g. pin holes) and an excessively large thickness leads to the necessity of applying high voltage and consequent reduction in efficiency.

First Host Material and Second Host Material

In the organic EL device according to the exemplary embodiment, the first host material and the second host material are exemplified by the first compound represented by formulae (1), (1X), (12X), (13X), (14X), (15X), and (16X) below and a second compound represented by a formula (2) below. Further, the first compound is also usable as the first host material and the second host material. In this case, the compound represented by the formula (1), (1X), (12X), (13X), (14X), (15X), or (16X) that is used as the second host material is occasionally referred to as the second compound for convenience.

First Compound

Compound Represented by Formula (1)

[Formula 162]

(1)

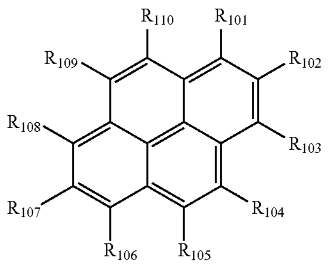

(11)

$$*-(L_{101})_{mx}-Ar_{101}$$

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1).

In the first compound according to the exemplary embodiment: $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, the group represented by the formula (11) is preferably a group represented by a formula (111) below.

[Formula 163]

(111)

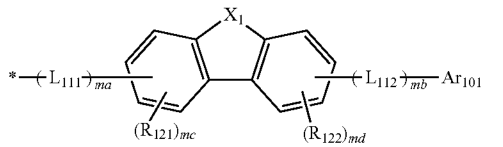

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$Ar_{101}$ represents the same as $Ar_{101}$ in the formula (11);

$R_{121}$, $R_{122}$, $R_{123}$, $R_{124}$, and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

Among positions *1 to *8 of carbon atoms in a cyclic structure represented by a formula (111a) below in the group represented by the formula (111), $L_{111}$ is bonded to one of the positions *1 to *4, $R_{121}$ is bonded to each of three positions of the rest of *1 to *4, $L_{112}$ is bonded to one of the positions *5 to *8, and $R_{122}$ is bonded to each of three positions of the rest of *5 to *8.

[Formula 164]

(111a)

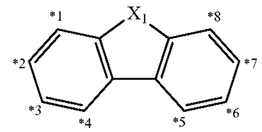

For instance, in the group represented by the formula (111), when $L_{111}$ is bonded to a carbon atom at a position *2 in the cyclic structure represented by the formula (111a) and $L_{112}$ is bonded to a carbon atom at a position *7 in the cyclic structure represented by the formula (111a), the group represented by the formula (111) is represented by a formula (111b) below.

[Formula 165]

(111b)

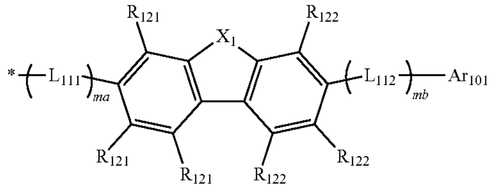

In the formula (111b):

$X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device according to the exemplary embodiment, the group represented by the formula (111) is preferably a group represented by the formula (111b).

In the organic EL device according to the exemplary embodiment, it is preferable that ma is 0, 1, or 2 and mb is 0, 1, or 2.

In the organic EL device according to the exemplary embodiment, it is preferable that ma is 0 or 1 and mb is 0 or 1.

In the organic EL device according to the exemplary embodiment, $Ar_{101}$ is preferably a substituted or unsubstituted aryl group having 6 to 50 ring carbon atoms.

In the organic EL device according to the exemplary embodiment, $Ar_{101}$ is preferably a substituted or unsubstitutedtuted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to the exemplary embodiment, $Ar_{101}$ is also preferably a group represented by a formula (12), a formula (13), or a formula (14) below.

[Formula 166]

(12)

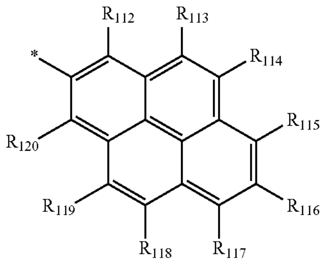

(13)

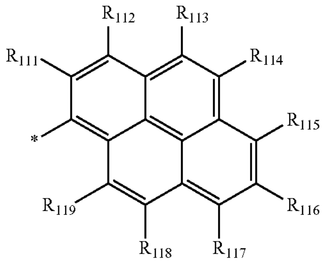

-continued (14)

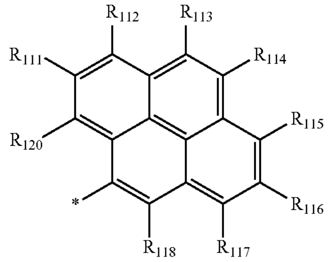

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(=O)R_{124}$, a group represented by $—COOR_{125}$, a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formulae (12), (13) and (14) represents a bonding position to $L_{101}$ in the formula (11), or a bonding position to $L_{112}$ in the formula (111) or (111b).

In the organic EL device according to the exemplary embodiment, the first compound is preferably represented by a formula (101) below.

[Formula 167]

(101)

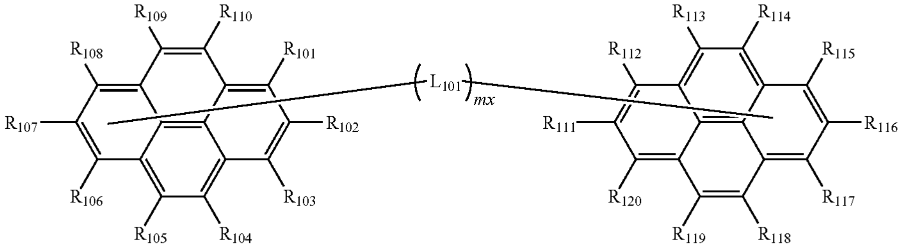

In the formula (101):

$R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by —C(=O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4, or 5; and when two or more $L_{101}$ are present, the two or more $L_{101}$ are mutually the same or different.

In the organic EL device according to the exemplary embodiment, $L_{101}$ is preferably a single bond or a substituted or unsubstituted arylene group having 6 to 50 ring carbon atoms.

In the organic EL device according to the exemplary embodiment, the first compound is also preferably a compound represented by a formula (102) below.

[Formula 168]

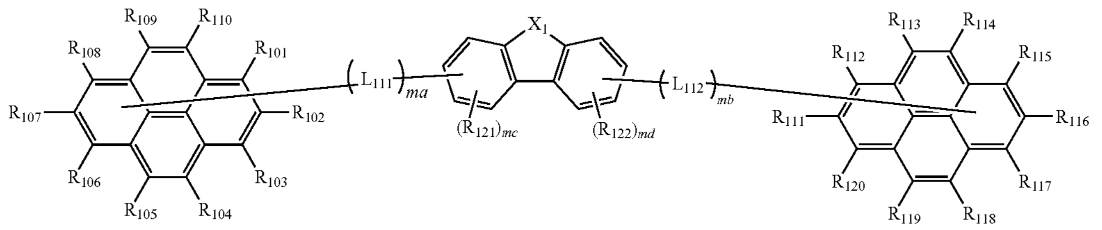

(102)

In the formula (102):

$R_{101}$ to $R_{120}$ each independently represent the same as $R_{101}$ to $R_{120}$ in the formula (101);

one of $R_{101}$ to $R_{110}$ represents a bonding position to $L_{111}$, and one of $R_{111}$ to $R_{120}$ represents a bonding position to $L_{112}$, $X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$R_{121}$, $R_{122}$, $R_{123}$, $R_{124}$, and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

In the compound represented by the formula (102), it is preferable that ma is 0, 1, or 2 and mb is 0, 1, or 2.

In the compound represented by the formula (102), it is preferable that ma is 0 or 1 and mb is 0 or 1.

In the organic EL device according to the exemplary embodiment, it is preferable that two or more of $R_{101}$ to $R_{110}$ are each a group represented by the formula (11).

In the organic EL device according to the exemplary embodiment, it is preferable that two or more of $R_{101}$ to $R_{110}$ are each a group represented by the formula (11) and $Ar_{101}$ is a substituted or unsubstituted aryl group having 6 to 50 ring carbon atoms.

In the organic EL device according to the exemplary embodiment, it is preferable that $Ar_{101}$ is not a substituted or unsubstituted pyrenyl group, $L_{101}$ is not a substituted or unsubstituted pyrenylene group, and the substituted or unsubstituted aryl group having 6 to 50 ring carbon atoms for $R_{101}$ to $R_{110}$ not being the group represented by the formula (11) is not a substituted or unsubstituted pyrenyl group.

In the organic EL device according to the exemplary embodiment, it is preferable that $R_{101}$ to $R_{110}$ not being the group represented by the formula (11) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that $R_{101}$ to $R_{110}$ not being the group represented by the formula (11) are each independently a hydrogen atom, a substituted or unsubstituted alkyl group having 1 to 50 carbon atoms, or a substituted or unsubstituted cycloalkyl group having 3 to 50 ring carbon atoms.

In the organic EL device according to the exemplary embodiment, $R_{101}$ to $R_{110}$ not being the group represented by the formula (11) are preferably each a hydrogen atom.

Compound Represented by Formula (1X)

In the organic EL device according to the exemplary embodiment, the first compound is also preferably a compound represented by a formula (1X) below.

[Formula 169]

(1X)

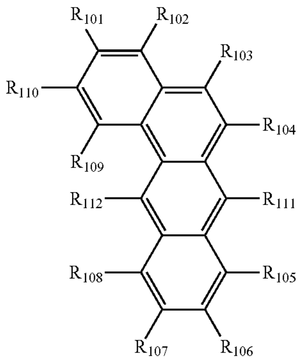

(11X)

$*-(L_{101})_{mx}-Ar_{101}$

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is a group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11X) represents a bonding position to a benz[a]anthracene ring in the formula (1X).

In the organic EL device according to the exemplary embodiment, the group represented by the formula (11X) is preferably a group represented by a formula (111X) below.

[Formula 170]

(111X)

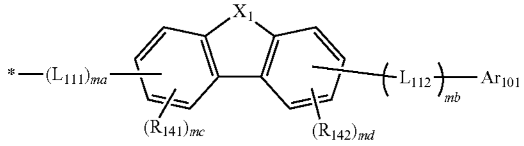

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

m is 1, 2, 3 or 4;

mb is 1, 2, 3 or 4;

ma+mb is 2, 3, or 4;

$Ar_{101}$ represents the same as $Ar_{101}$ in the formula (11X);

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

[Formula 171]

(111aX)

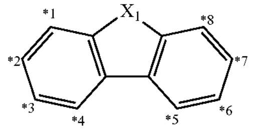

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111ax), the group represented by the formula (111X) is represented by a formula (111bX) below.

[Formula 172]

(111bX)

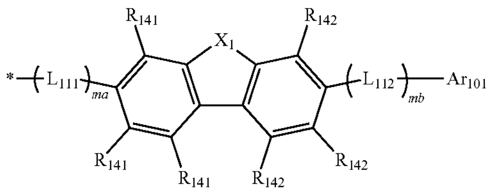

In the formula (111bX):

$X_1$, $L_{111}$, $L_{112}$, ma, mb, $Ar_{101}$, $R_{141}$, $R_{142}$, $R_{143}$, $R_{14}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device according to the exemplary embodiment, the group represented by the formula (111X) is preferably a group represented by the formula (111bX).

In the compound represented by the formula (1X), preferably, ma is 1 or 2 and mb is 1 or 2.

In the compound represented by the formula (1X), preferably, ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group; a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

In the formula (101X):

one of $R_{111}$ and $R_{112}$ represents a bonding position to $L_{101}$ and one of $R_{133}$ and $R_{134}$ represents a bonding position to $L_{101}$;

$R_{101}$ to $R_{110}$, $R_{121}$ to $R_{130}$, $R_{111}$ or $R_{112}$ not being the bonding position to $L_{101}$, and $R_{133}$ or $R_{134}$ not being the bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4, or 5; and when two or more $L_{101}$ are present, the two or more $L_{101}$ are mutually the same or different.

In the compound represented by the formula (1X), $L_{101}$ is preferably a single bond or a substituted or unsubstituted arylene group having 6 to 50 ring carbon atoms.

The compound represented by the formula (1X) is also preferably represented by a formula (102X) below.

[Formula 173]

(101X)

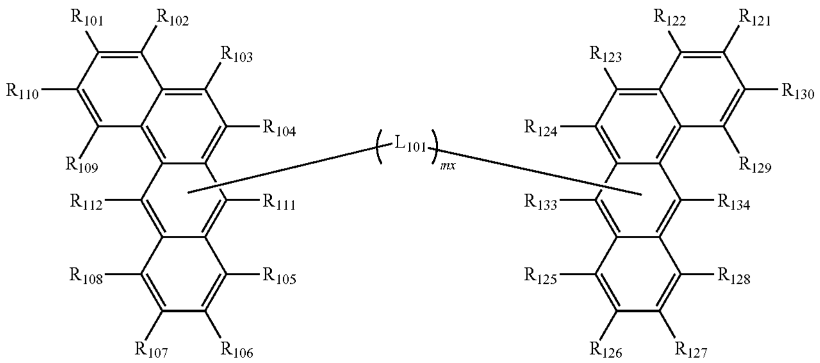

[Formula 174]

(102X)

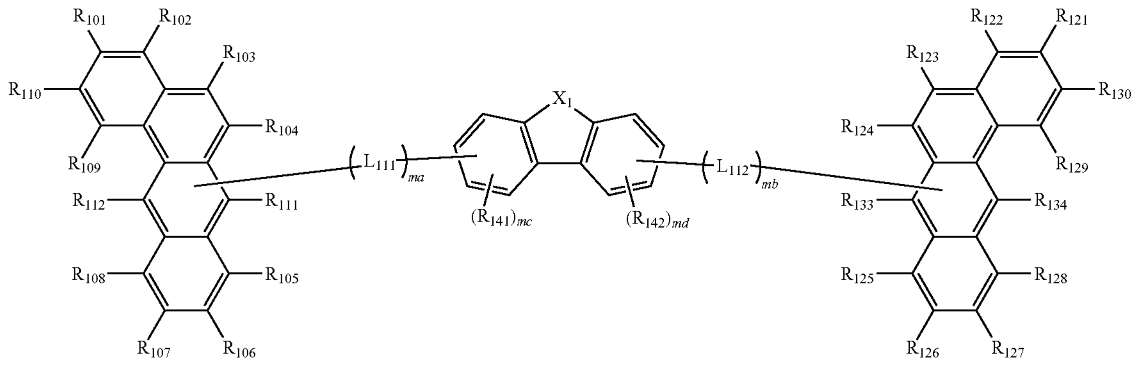

In the formula (102X):

one of $R_{111}$ and $R_{112}$ represents a bonding position to $L_{111}$ and one of $R_{133}$ and $R_{134}$ represents a bonding position to $L_{112}$;

$R_{101}$ to $R_{110}$, $R_{121}$ to $R_{130}$, $R_{111}$ or $R_{112}$ not being the bonding position to $L_{111}$, and $R_{133}$ or $R_{134}$ not being the bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

m is 1, 2, 3 or 4;

mb is 1, 2, 3 or 4;

ma+mb is 2, 3, 4, or 5;

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

In the compound represented by the formula (1X), preferably, ma is 1 or 2 and mb is 1 or 2 in the formula (102X).

In the compound represented by the formula (1X), preferably, ma is 1 and mb is 1 in the formula (102X).

In the compound represented by the formula (1X), the group represented by the formula (11X) is also preferably a group represented by a formula (11AX) or a group represented by a formula (11BX) below.

[Formula 175]

(11AX)

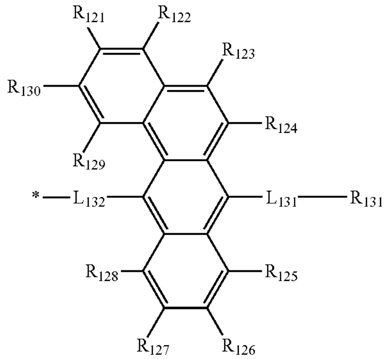

-continued (11BX)

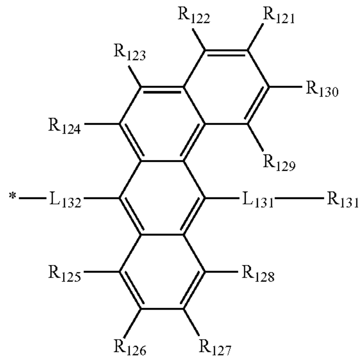

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11BX) are present, the plurality of groups represented by the formula (11BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and

* in each of the formulae (11AX) and (11BX) represents a bonding position to a benz[a]anthracene ring in the formula (1X).

The compound represented by the formula (1X) is also preferably represented by a formula (103X) below.

[Formula 176]

(103X)

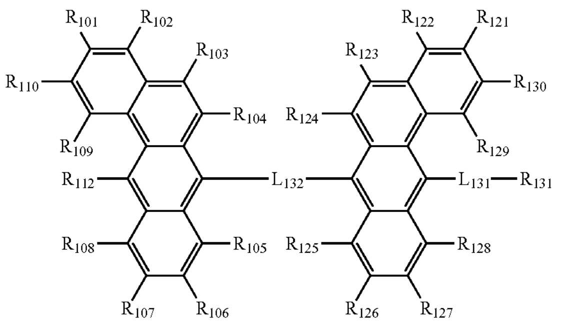

In the formula (103X):

$R_{101}$ to $R_{110}$ and $R_{112}$ respectively represent the same as $R_{101}$ to $R_{110}$ and $R_{112}$ in the formula (1X); and $R_{121}$ to $R_{131}$, $L_{131}$, and $L_{132}$ respectively represent the same as $R_{121}$ to $R_{131}$, $L_{131}$, and $L_{132}$ in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are each also preferably a group represented by the formula (11X).

In the compound represented by the formula (1X), it is preferable that two or more of $R_{101}$ to $R_{112}$ are each a group represented by the formula (11X) and $Ar_{101}$ in the formula (11X) is a substituted or unsubstituted aryl group having 6 to 50 ring carbon atoms.

In the compound represented by the formula (1X), it is preferable that $Ar_{101}$ is not a substituted or unsubstituted benz[a]anthryl group, $L_{101}$ is not a substituted or unsubstituted benz[a]anthrylene group, and, the substituted or unsubstituted aryl group having 6 to 50 ring carbon atoms for $R_{101}$ to $R_{110}$ not being the group represented by the formula (11X) is also preferably not a substituted or unsubstituted benz[a] anthryl group.

In the compound represented by the formula (1X), $R_{101}$ to $R_{112}$ not being the group represented by the formula (11X) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ not being the group represented by the formula (11X) are each preferably a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ not being the group represented by the formula (11X) are preferably each a hydrogen atom.

Compound Represented by Formula (12X)

In the organic EL device according to the exemplary embodiment, the first compound is also preferably a compound represented by a formula (12X) below.

[Formula 177]

(12X)

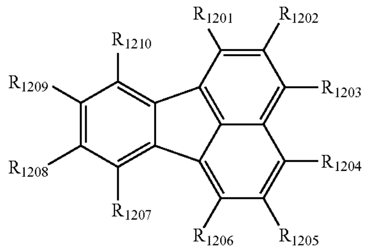

(121)

$*-(L_{1201})_{mx2}-Ar_{1201}$

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

at least one of a substituent, if present, for the substituted or unsubstituted monocyclic ring, a substituent, if present, for the substituted or unsubstituted fused ring, or $R_{1201}$ to $R_{1210}$ is a group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to the exemplary embodiment, the first compound is also preferably a compound represented by a formula (13X) below.

[Formula 178]

(13X)

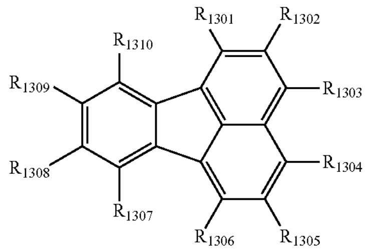

(131)

$*-(L_{1301})_{mx3}-Ar_{1301}$

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is a group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and

* in the formula (131) represents a bonding position to a fluoranthene ring represented by the formula (13X).

In the organic EL device according to the exemplary embodiment, none of combinations of adjacent two or more of $R_{1301}$ to $R_{1310}$ not being the group represented by the formula (131) are bonded to each other. Combinations of adjacent two of $R_{1301}$ to $R_{1310}$ in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device according to the exemplary embodiment, the first compound is also preferably a compound represented by a formula (14X) below.

[Formula 179]

(14X)

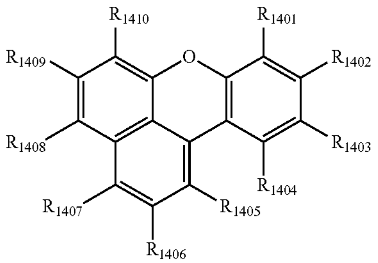

(141)

$*-(L_{1401})_{mx4}-Ar_{1401}$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is a group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device according to the exemplary embodiment, the first compound is also preferably a compound represented by a formula (15X) below.

[Formula 180]

(15X)

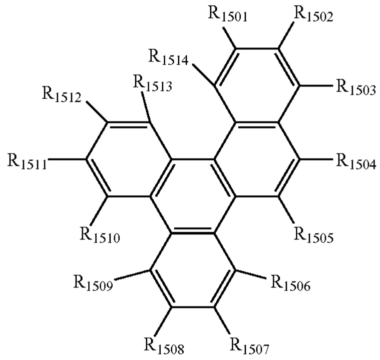

(151)

$*-(L_{1501})_{mx5}-Ar_{1501}$

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is a group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

Compound Represented by Formula (16X)

In the organic EL device according to the exemplary embodiment, the first compound is also preferably a compound represented by a formula (16X) below.

[Formula 181]

(16X)

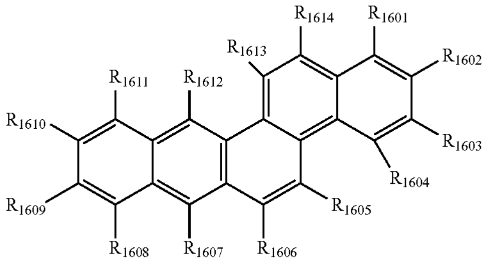

(161)

$*-(L_{1601})_{mx6}-Ar_{1601}$

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —$COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is a group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and

* in the formula (161) represents a bonding position to a ring represented by the formula (16X).

In the organic EL device according to the exemplary embodiment, also preferably, the first host material has, in a molecule, a linking structure including a benzene ring and a naphthalene ring linked to each other with a single bond, in which the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

When the first host material has the linking structure including such cross-linking, deterioration in the chromaticity of the organic EL device is expected to be inhibited.

The first host material in the above case is only required to have a linking structure as the minimum unit in a molecule, the linking structure including a benzene ring and a naphthalene ring linked to each other with a single bond (occasionally referred to as a benzene-naphthalene linking structure), the linking structure being as represented by a formula (X1) or a formula (X2) below. Further, the benzene ring may be fused with a monocyclic ring or fused ring, and the naphthalene ring may be fused with a monocyclic ring or fused ring. For instance, also in a case where the first host material has, in a molecule, a linking structure including a naphthalene ring and a naphthalene ring linked to each other with a single bond (occasionally referred to as a naphthalene-naphthalene linking structure) and being as represented by a formula (X3), a formula (X4), or a formula (X5) below, the naphthalene-naphthalene linking structure is regarded as including the benzene-naphthalene linking structure since one of the naphthalene rings includes a benzene ring.

[Formula 182]

(X1)

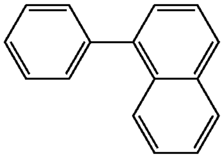

(X2)

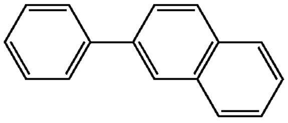

(X3)

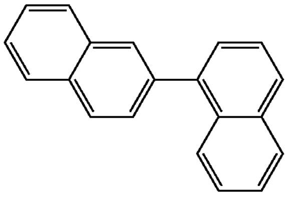

(X4)

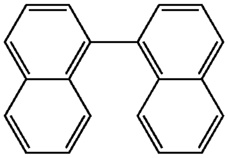

(X5)

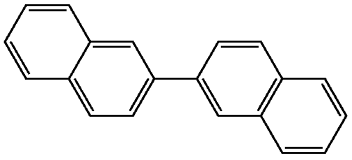

In the organic EL device according to the exemplary, the cross-linking also preferably includes a double.

Specifically, the first host material also preferably has a structure in which the benzene ring and the naphthalene ring are further linked to each other at any other site than the single bond by the cross-linking structure including a double bond.

Assuming that the benzene ring and the naphthalene ring in the benzene-naphthalene linking structure are further linked to each other at at least one site other than the single bond by cross-linking, for instance, a linking structure (fused ring) represented by a formula (X11) below is obtained in a case of the formula (X1), and a linking structure (fused ring) represented by a formula (X31) below is obtained in a case of the formula (X3).

Assuming that the benzene ring and the naphthalene ring in the benzene-naphthalene linking structure are further linked to each other at any other site than the single bond by cross-linking including a double bond, for instance, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at at least one site other than the single bond by cross-linking including a hetero atom (e.g., an oxygen atom), for instance, a linking structure (fused ring) represented by a formula (X13) below is obtained in a case of the formula (X1).

[Formula 183]

(X11)

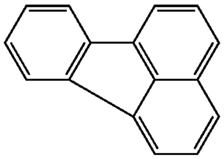

(X12)

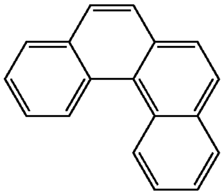

(X13)

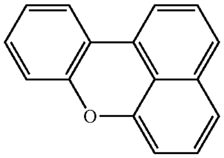

(X21)

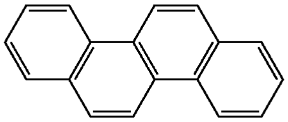

(X22)

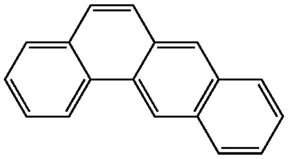

-continued (X31)

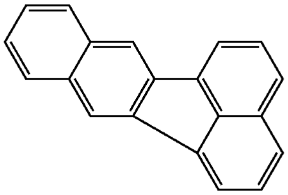

(X41)

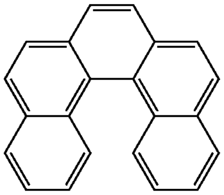

(X51)

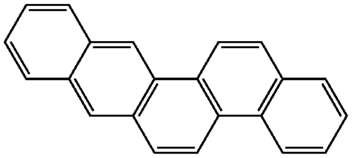

In the organic EL device according to the exemplary embodiment, also preferably, the first host material has, in a molecule, a biphenyl structure including a first benzene ring and a second benzene ring linked to each other with a single bond, and the first benzene ring and the second benzene ring in the biphenyl structure are further linked to each other by cross-linking at at least one site other than the single bond.

In the organic EL device according to the exemplary embodiment, also preferably, the first benzene ring and the second benzene ring in the biphenyl structure are further linked to each other by the cross-linking at one site other than the single bond. When the first host material has the biphenyl structure including such cross-linking, deterioration in the chromaticity of the organic EL device is expected to be inhibited.

In the organic EL device according to the exemplary, the cross-linking also preferably includes a double.

In the organic EL device according to the exemplary embodiment, the cross-linking also preferably includes no double bond.

Also preferably, the first benzene ring and the second benzene ring in the biphenyl structure are further linked to each other by the cross-linking at two sites other than the single bond.

In the organic EL device according to the exemplary embodiment, also preferably, the first benzene ring and the second benzene ring in the biphenyl structure are further linked to each other by the cross-linking at two sites other than the single bond, and the cross-linking includes no double bond. When the first host material has the biphenyl structure including such cross-linking, deterioration in the chromaticity of the organic EL device is expected to be inhibited.

For instance, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

[Formula 184]

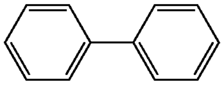

(BP1)

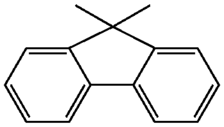

(BP11)

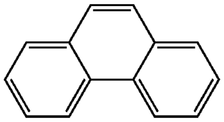

(BP12)

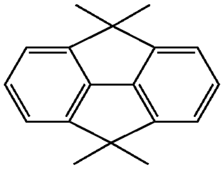

(BP13)

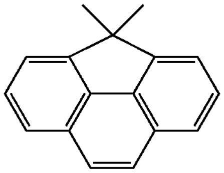

(BP14)

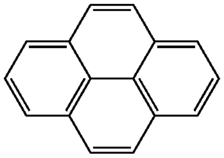

(BP15)

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other by cross-linking including no double bond at one of two sites other than the single bond, and the first benzene ring and the second benzene ring are linked to each other by cross-linking including a double bond at the other of the two sites other than the single bond.

The formula (BP15) represents a linking structure in which the first benzene ring and the second benzene ring are linked to each other at two sites other than the single bond by cross-linking including a double bond.

In the first compound and the second compound, the groups specified to be "substituted or unsubstituted" are each preferably an "unsubstituted" group.

Method of Producing First Compound

The first compound can be produced by a known method. The first compound can also be produced based on a known method through a known alternative reaction using a known material(s) tailored for the target compound.

Specific Examples of First Compound

Specific examples of the first compound include the following compounds. It should however be noted that the invention is not limited to the specific examples of the first compound.

In the specific examples of the compounds herein, D represents a deuterium atom, Me represents a methyl group, and tBu represents a tert-butyl group.

[Formula 185]

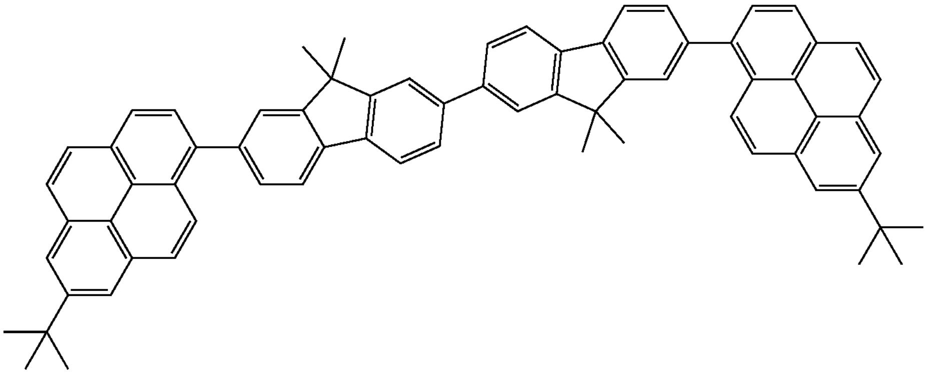

-continued
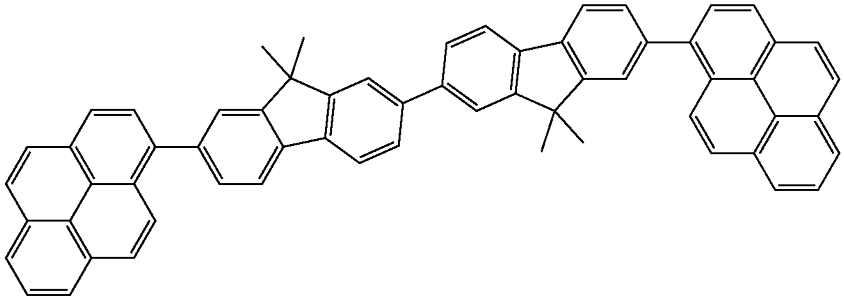
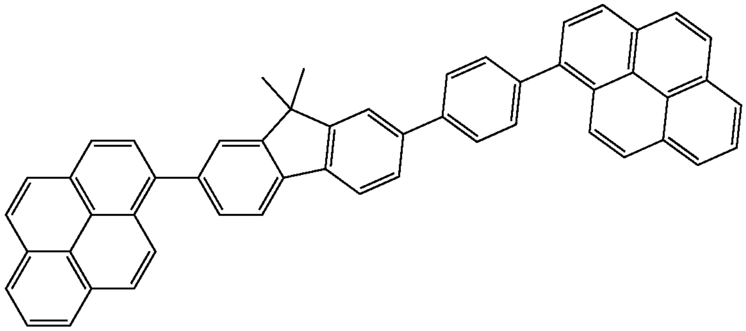
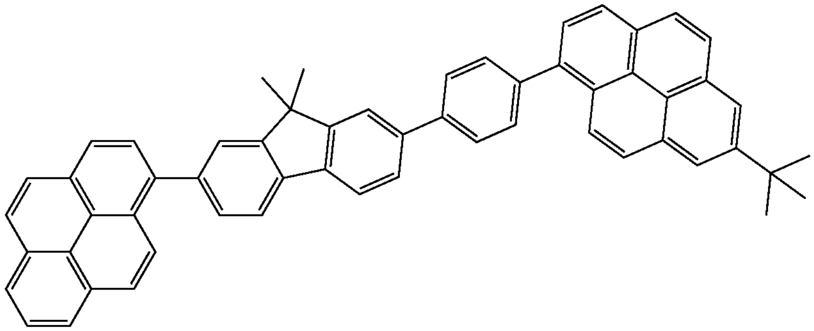
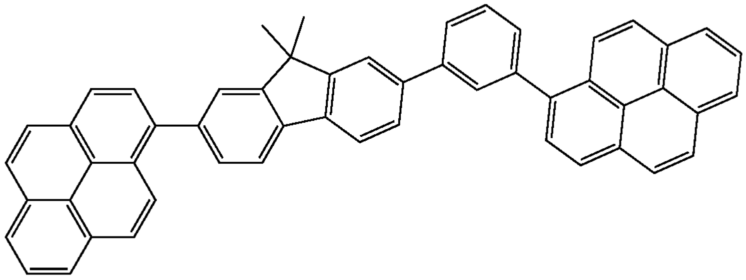
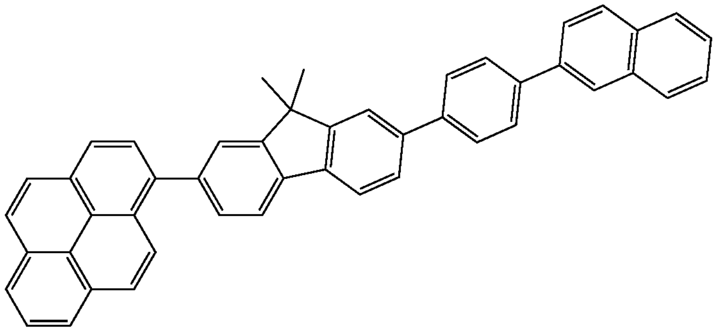

-continued
[Formula 186]
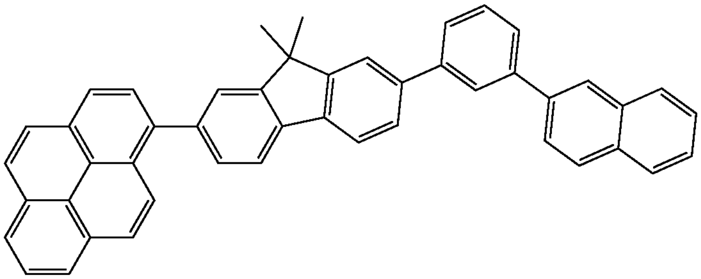
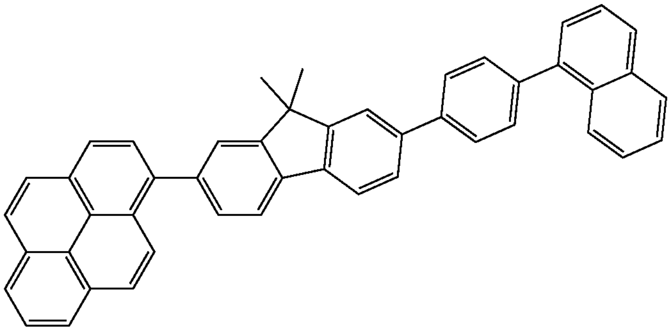
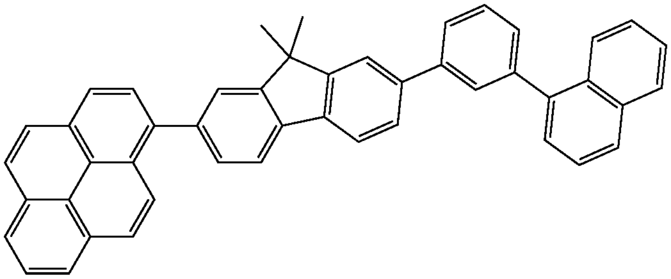
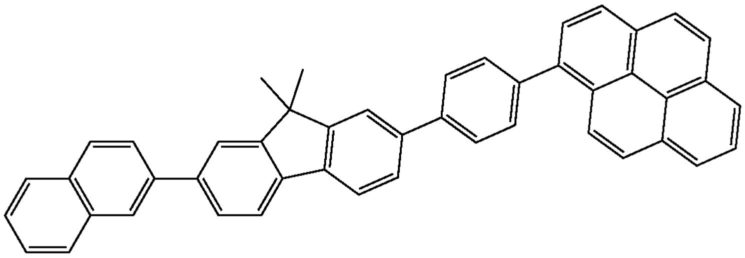
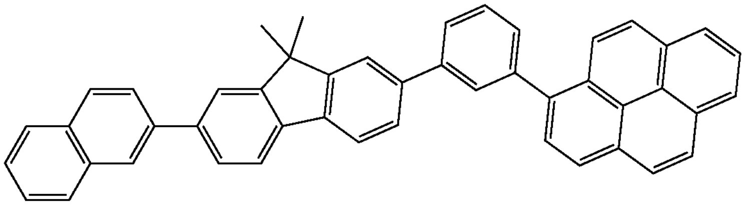
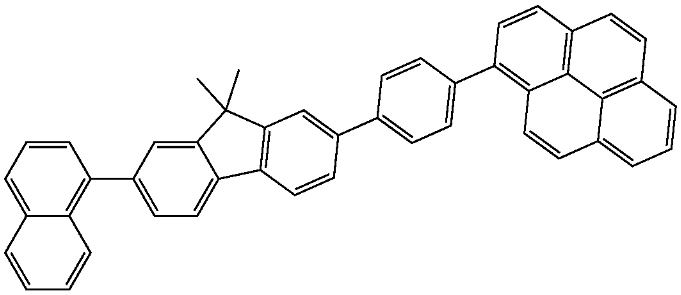

-continued
[Formula 187]
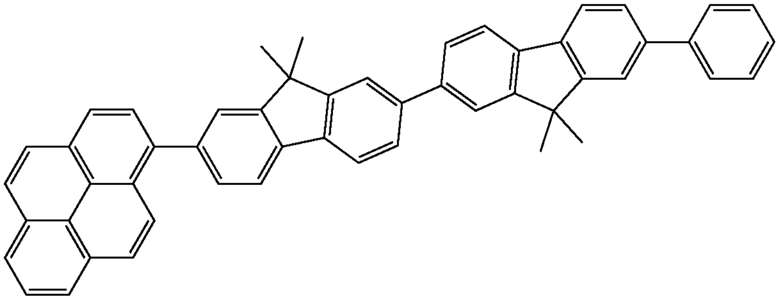
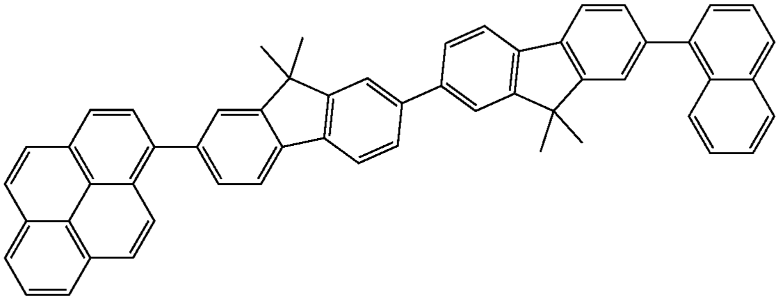
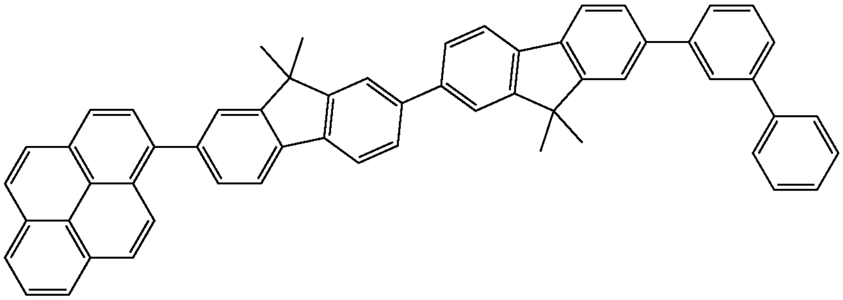
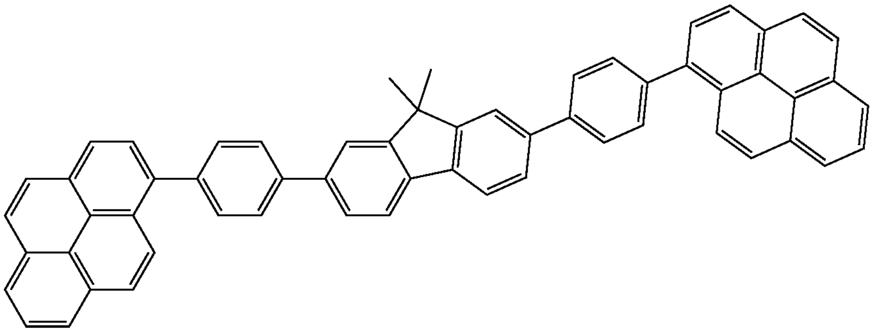
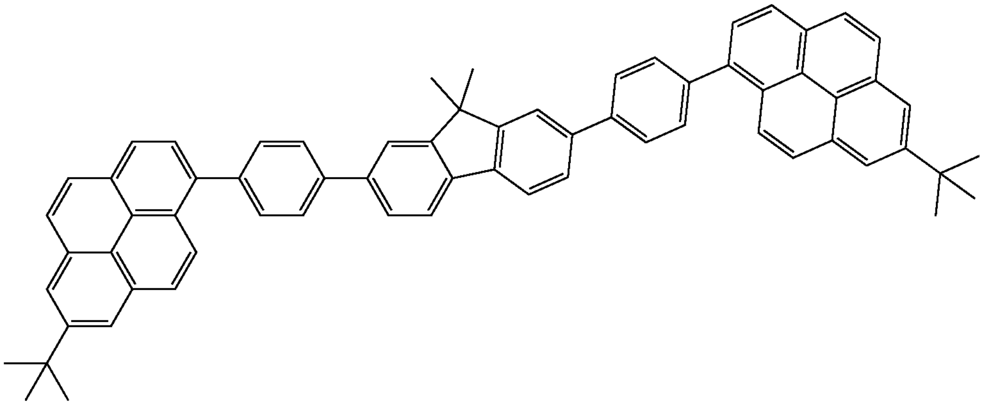

-continued
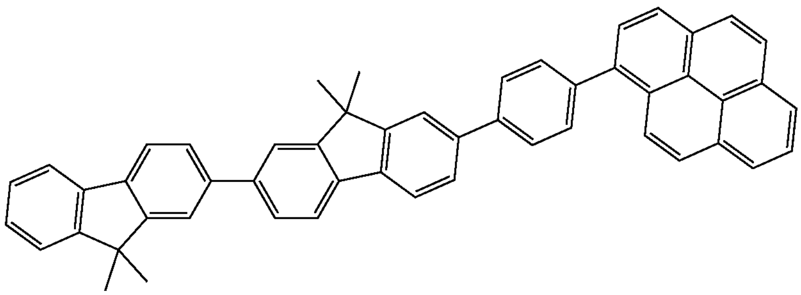
[Formula 188]
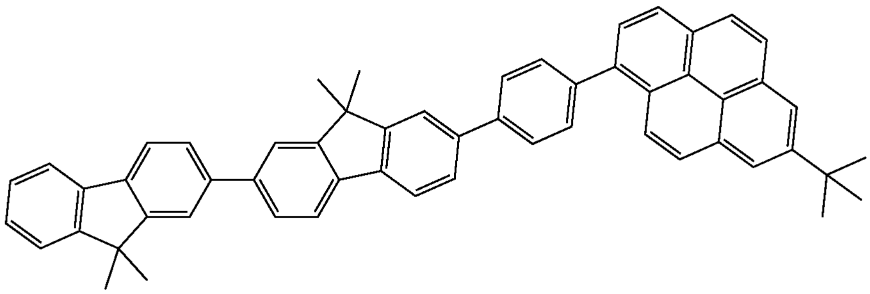
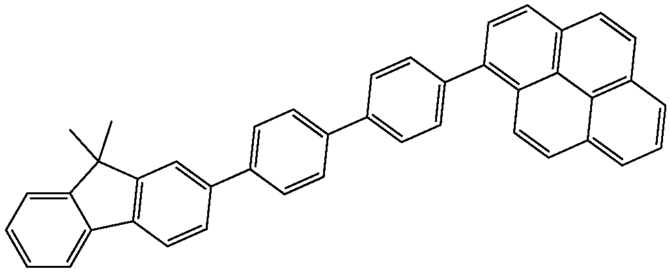
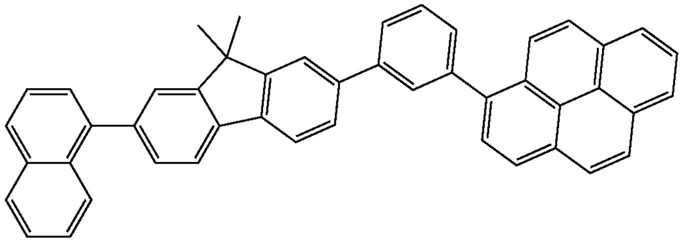
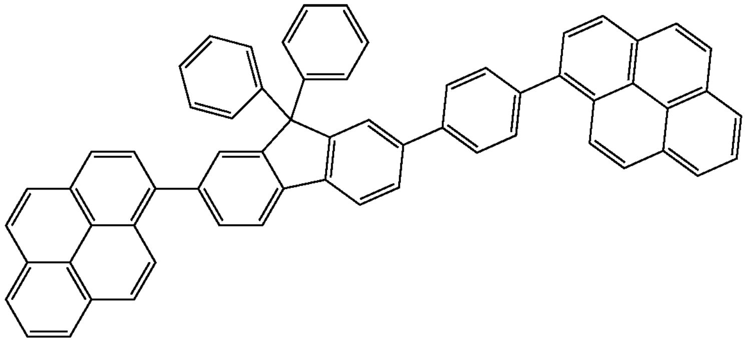

-continued
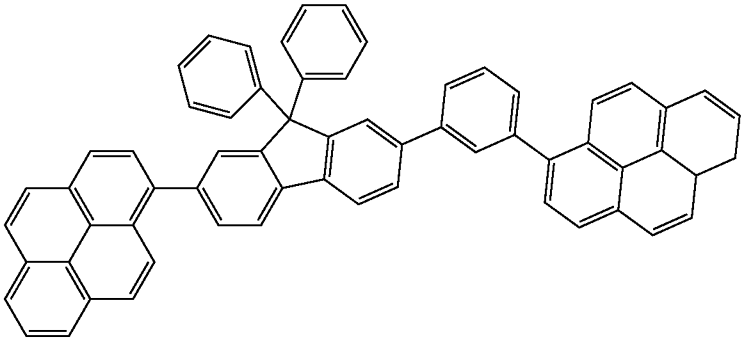
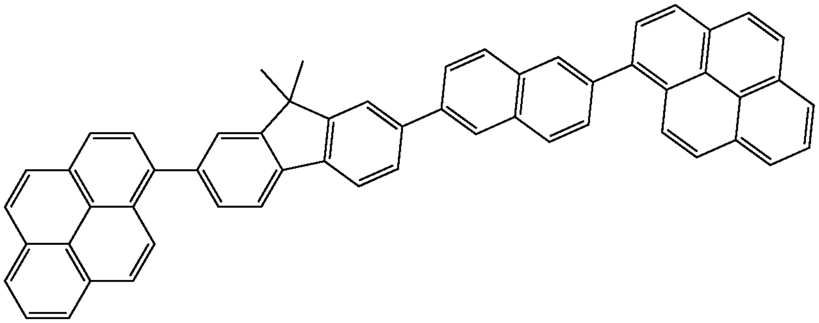
[Formula 189]
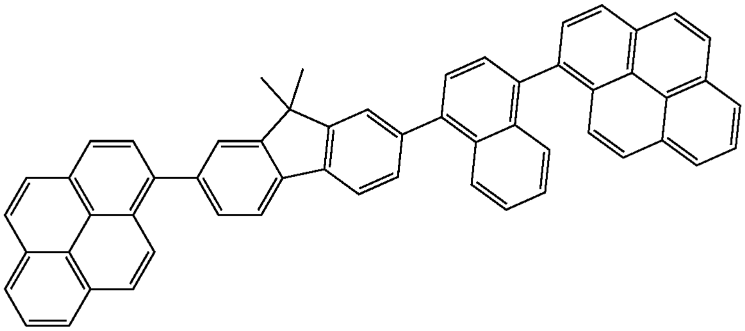
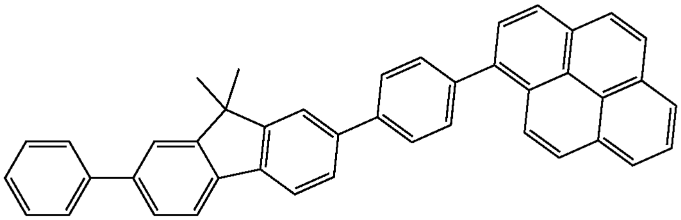
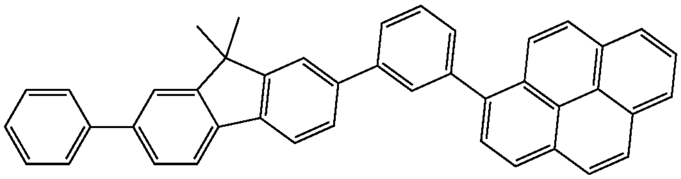
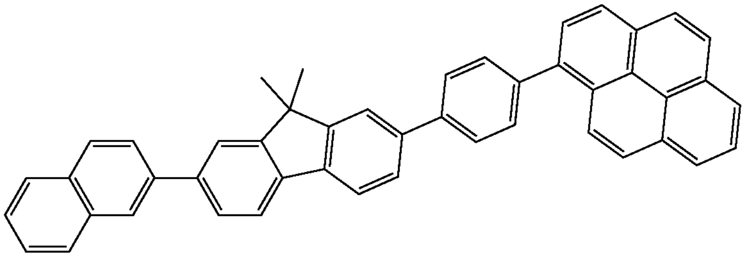

-continued
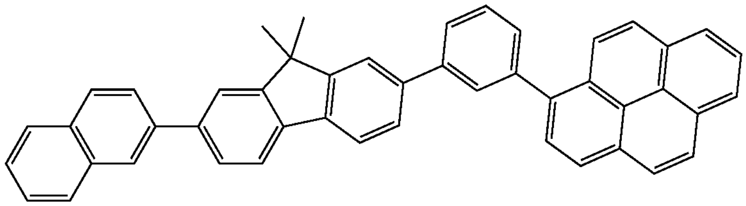
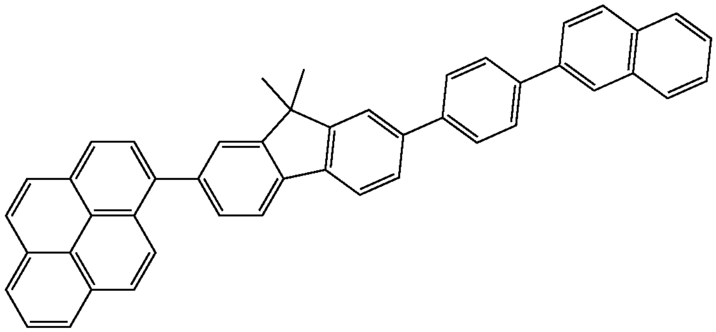
[Formula 190]
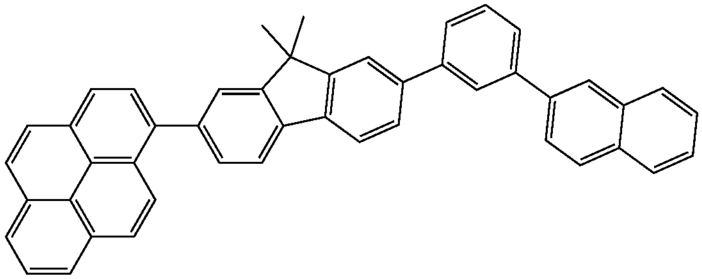
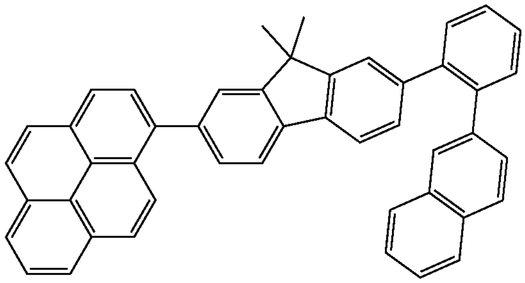
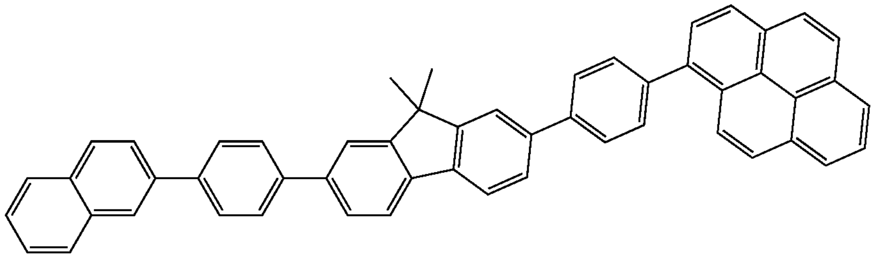
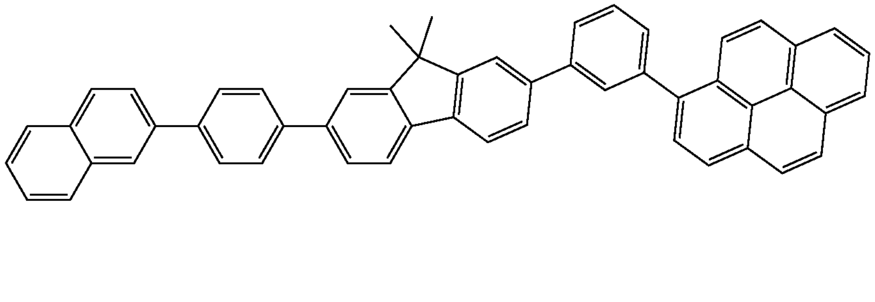

-continued
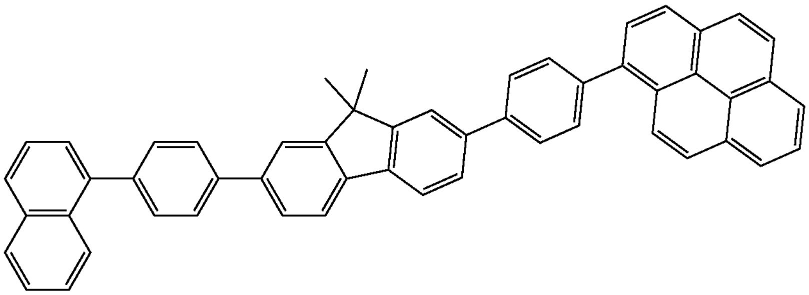
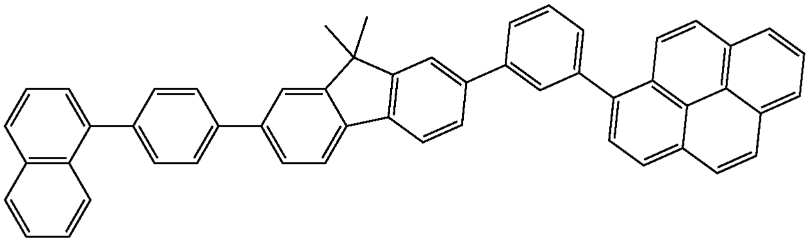
[Formula 191]
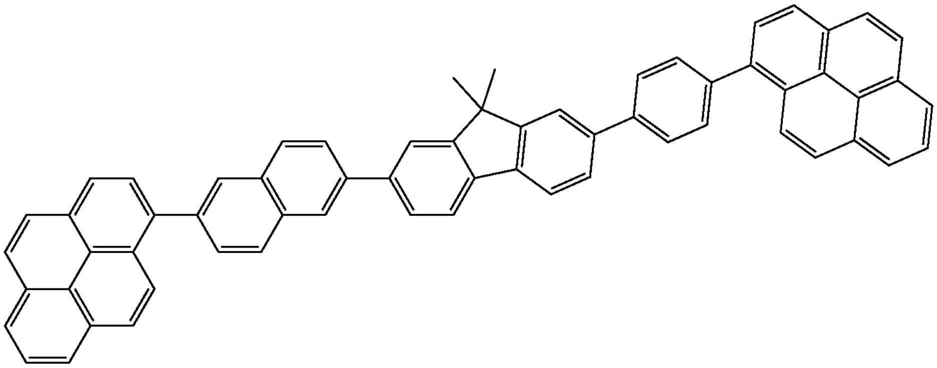
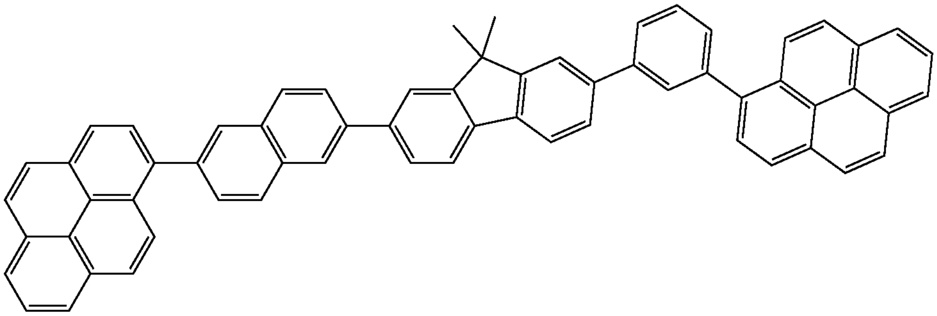
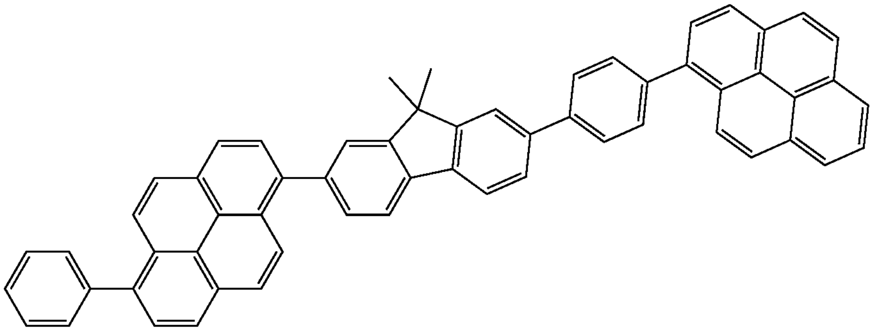

-continued
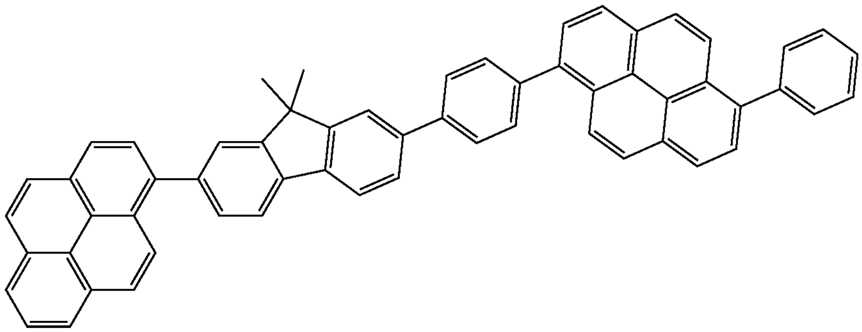
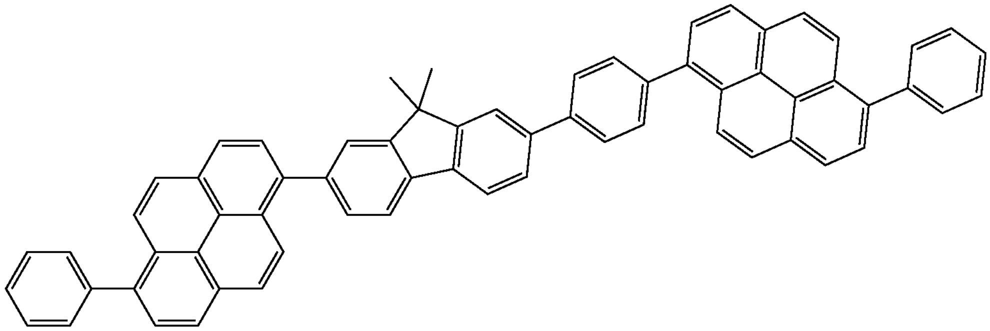
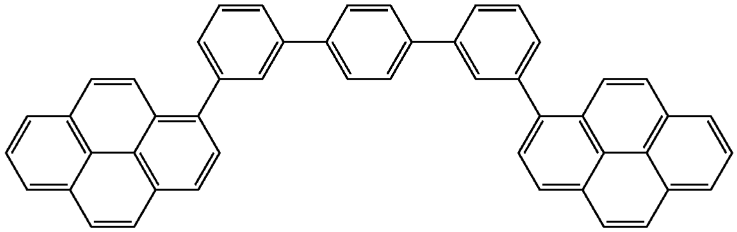
[Formula 192]
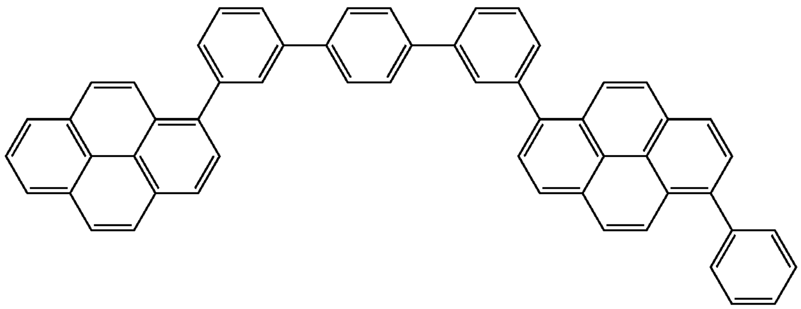
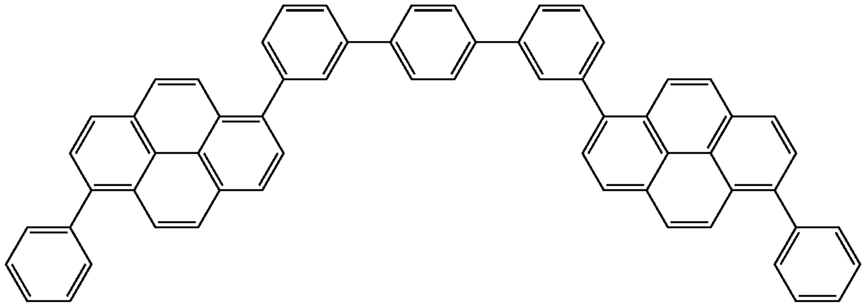

-continued
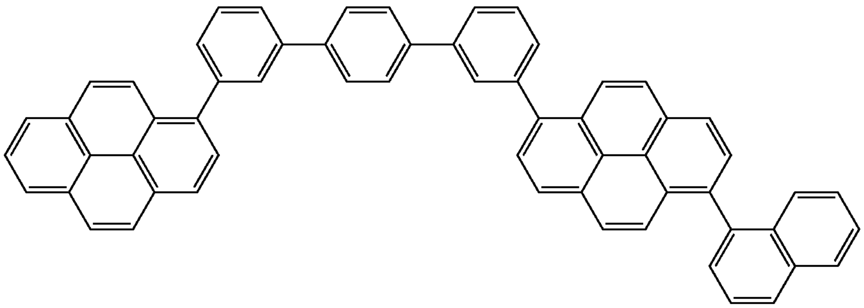
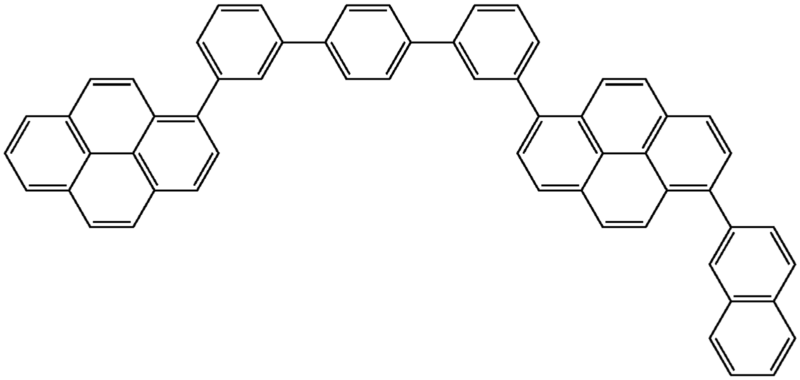
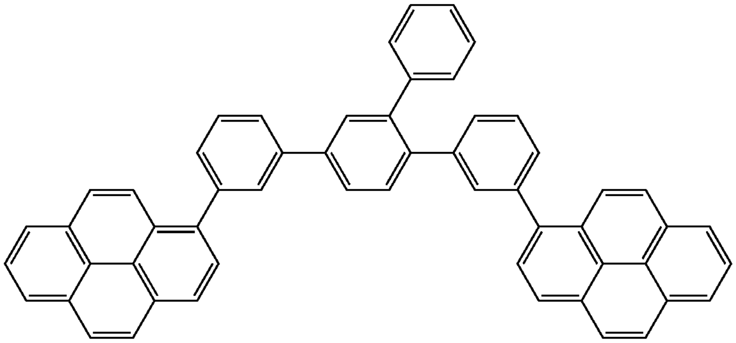
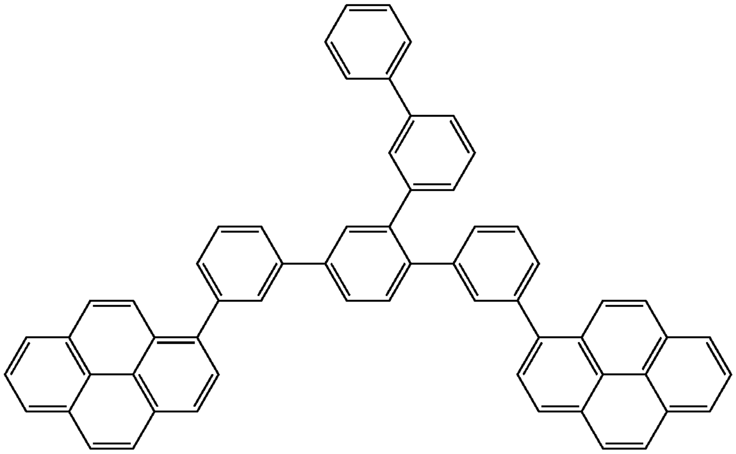

-continued
[Formula 193]
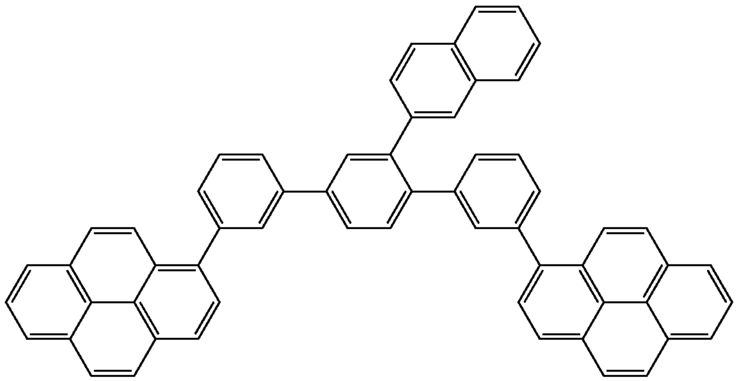
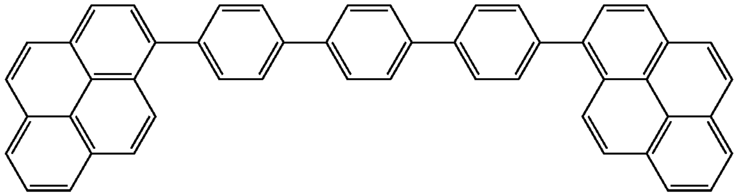
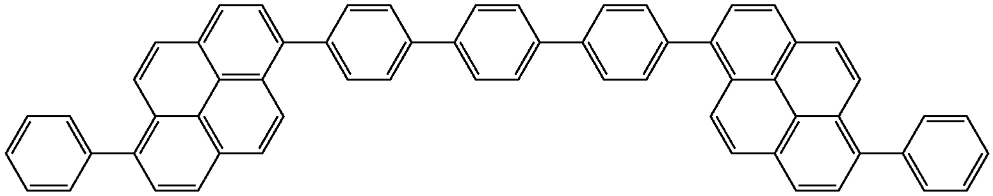
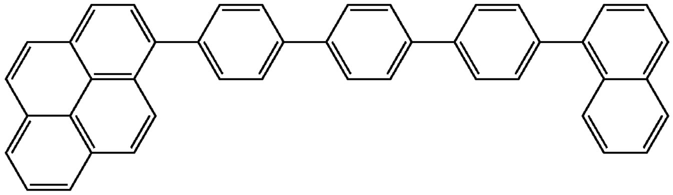
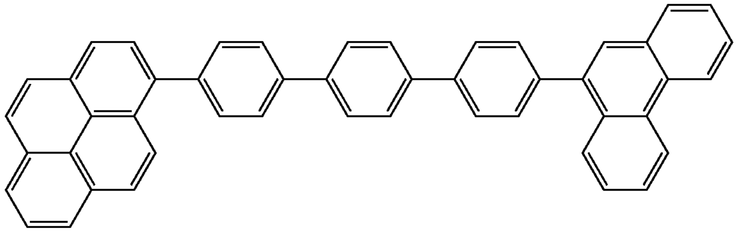
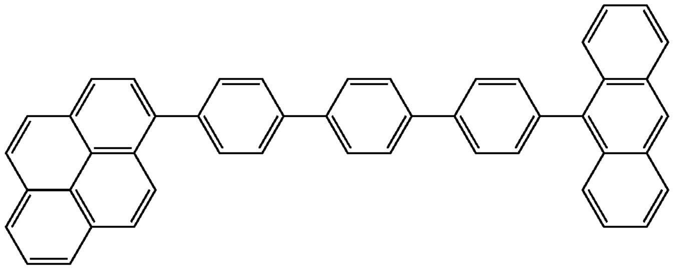

-continued
[Formula 194]
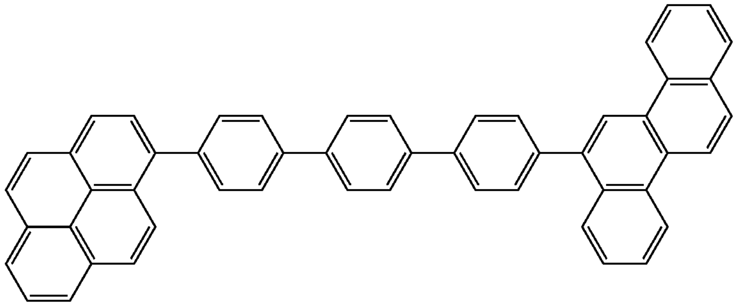
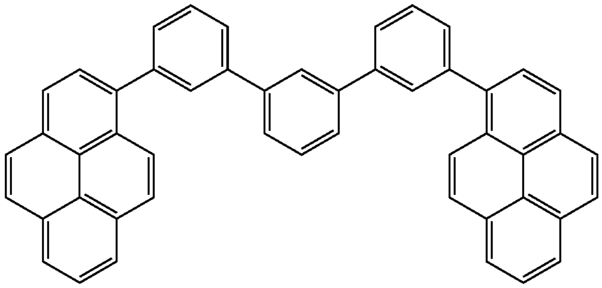
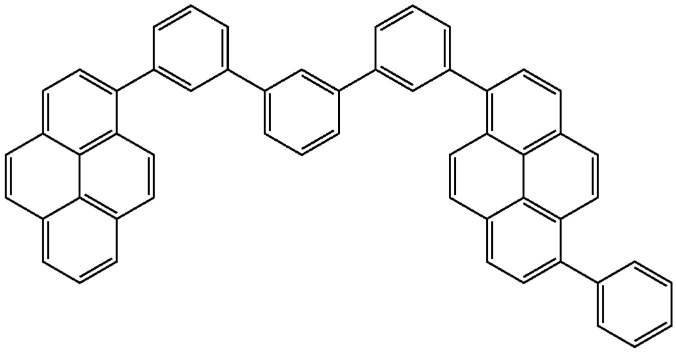
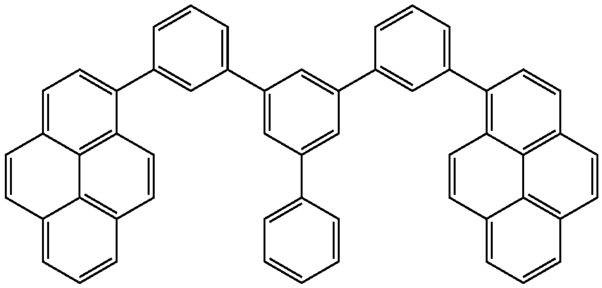
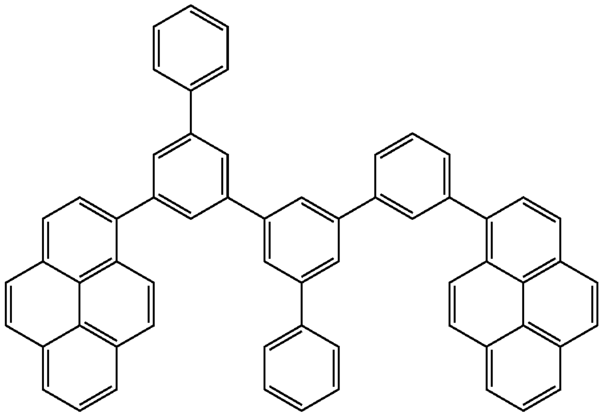

-continued
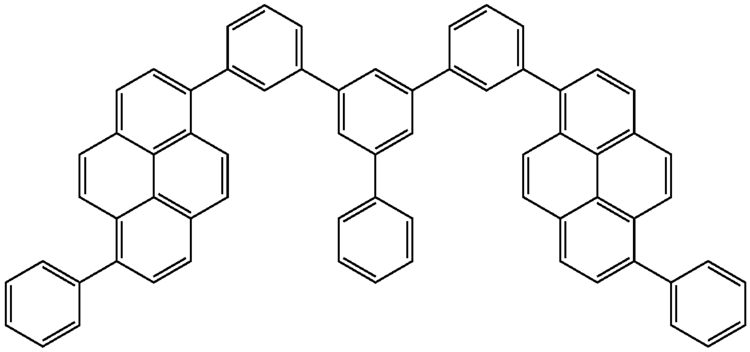
[Formula 195]
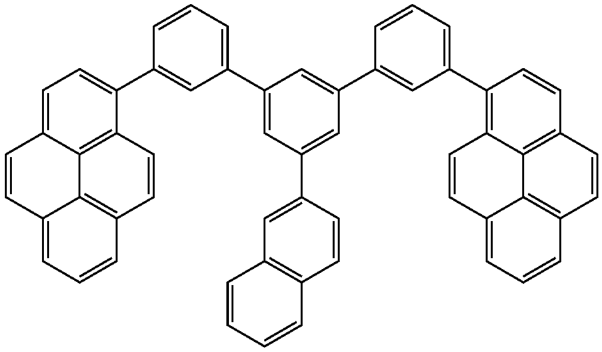
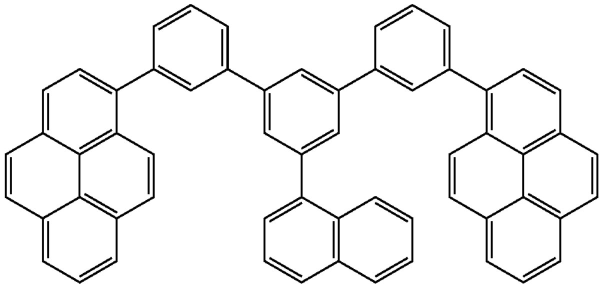
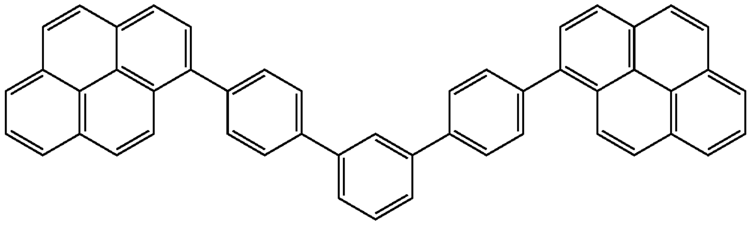
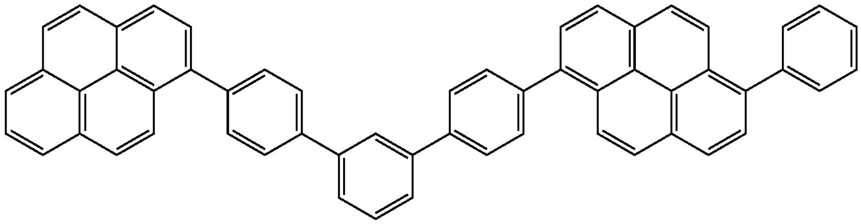
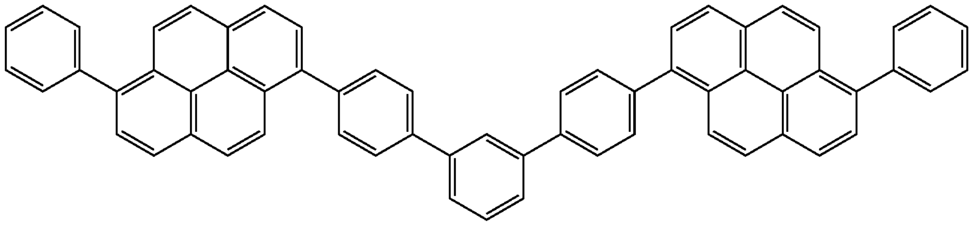

-continued
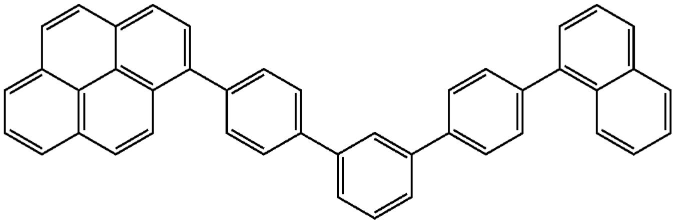
[Formula 196]
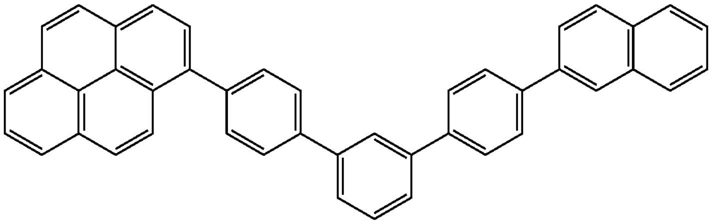
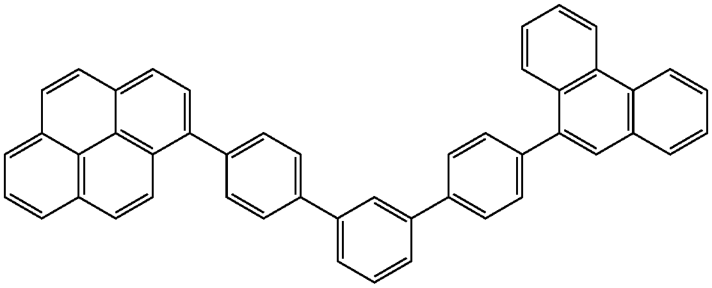
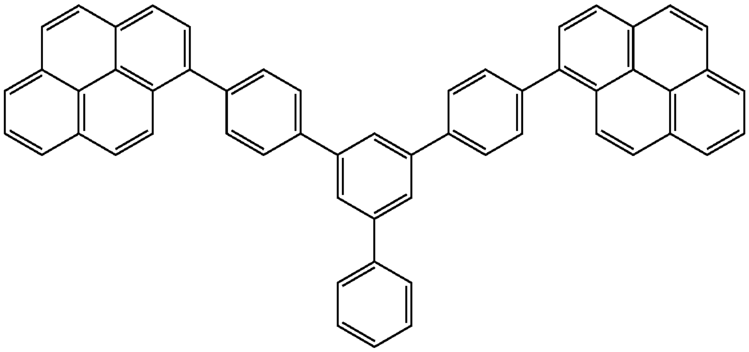
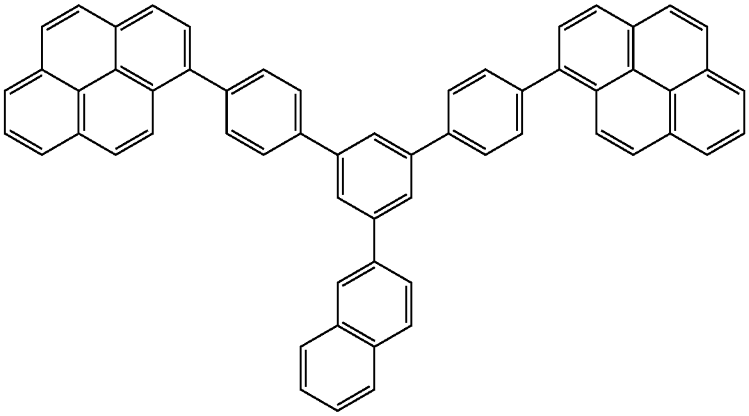

-continued
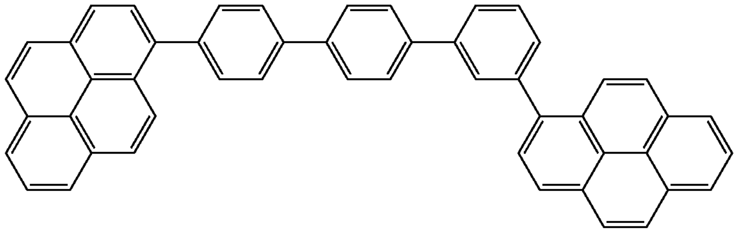
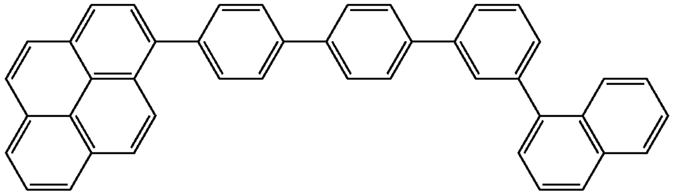
[Formula 197]
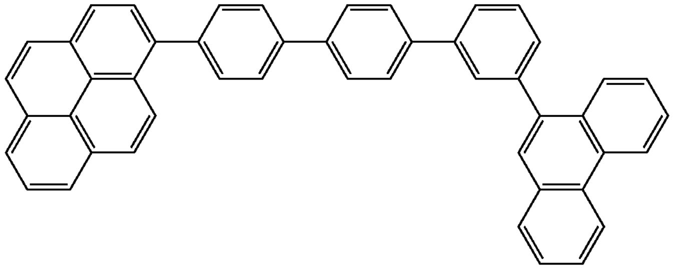
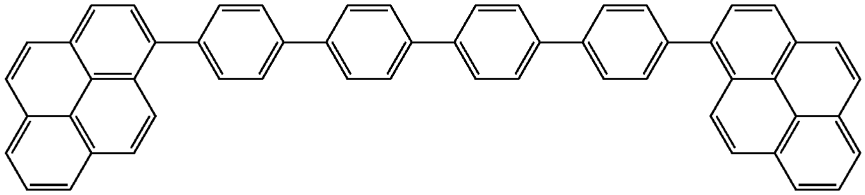
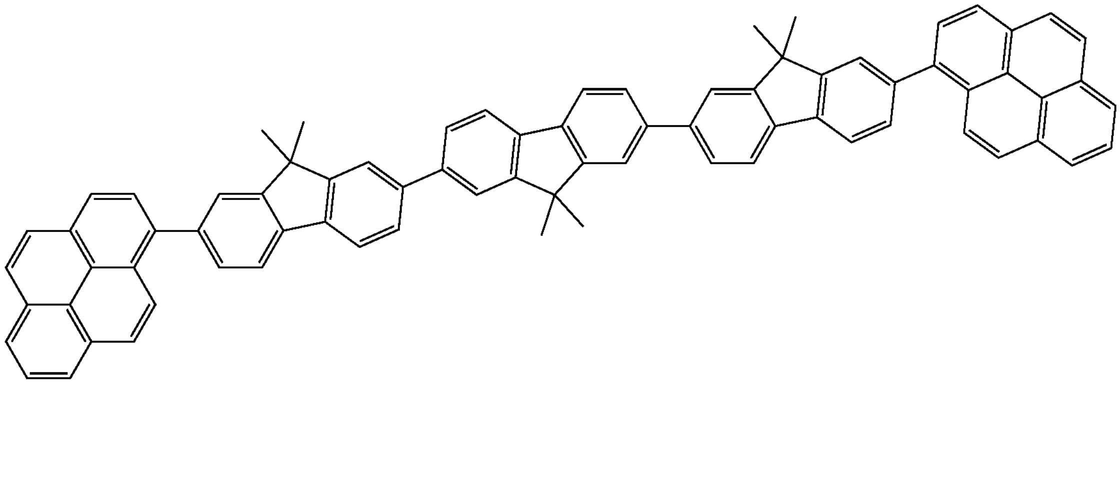

-continued
[Formula 198]
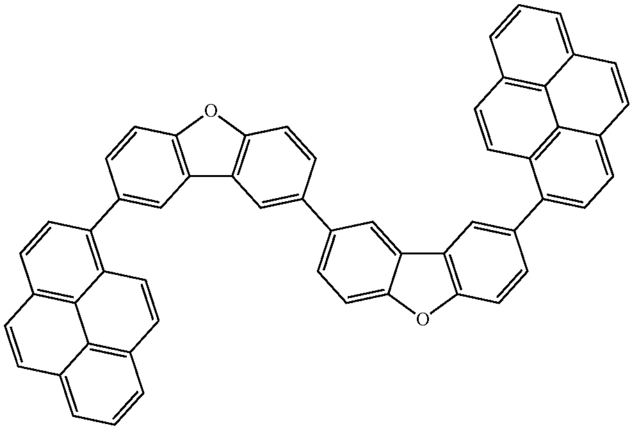
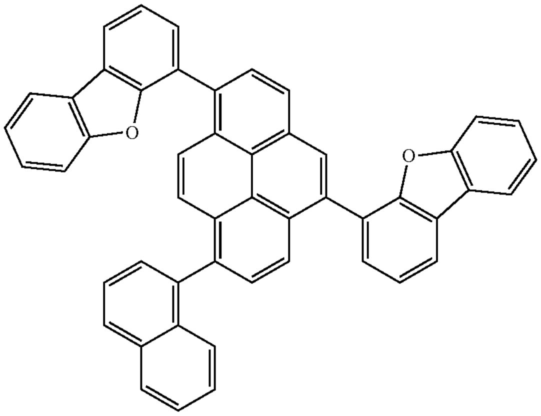
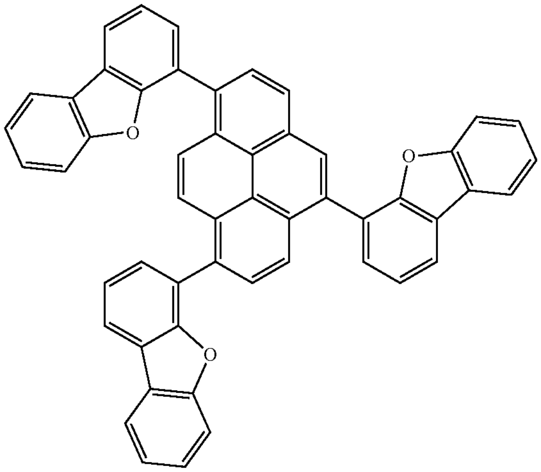
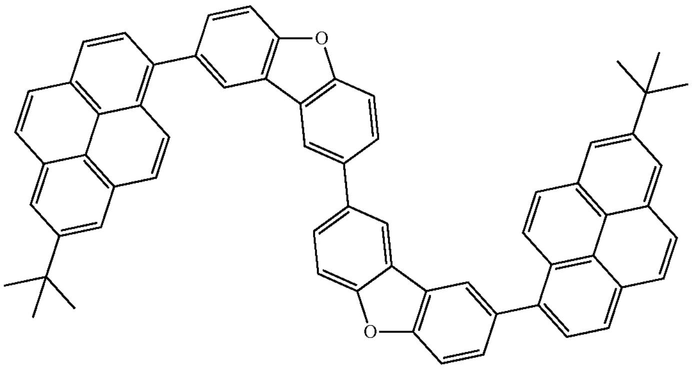
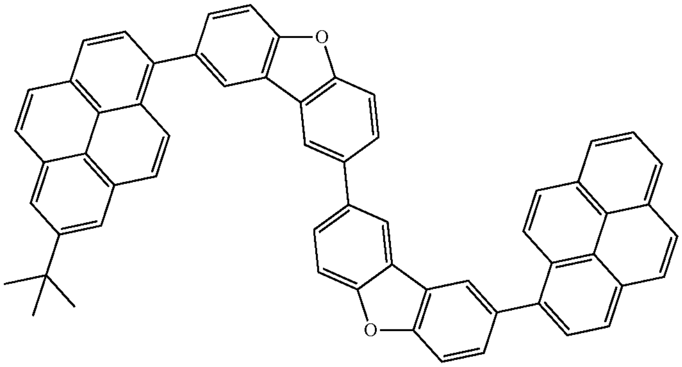

-continued
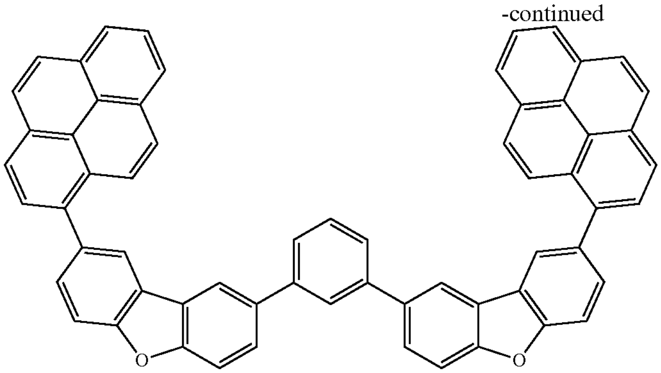
[Formula 199]
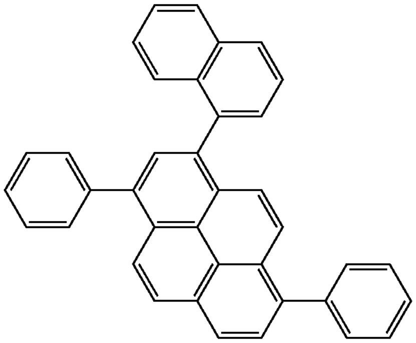
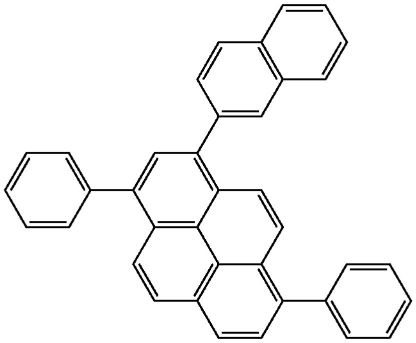
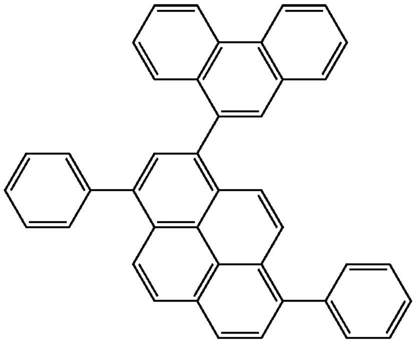
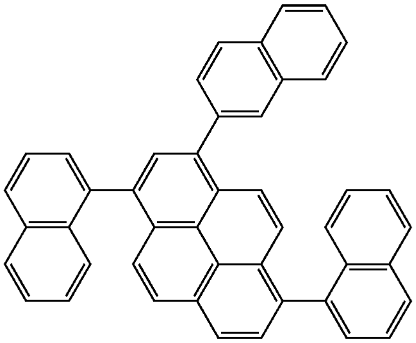
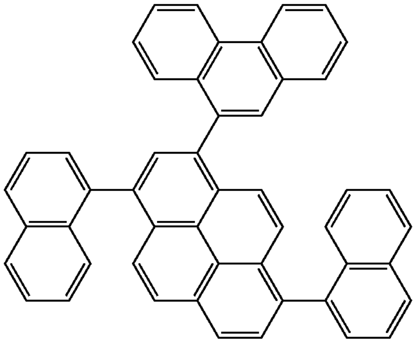
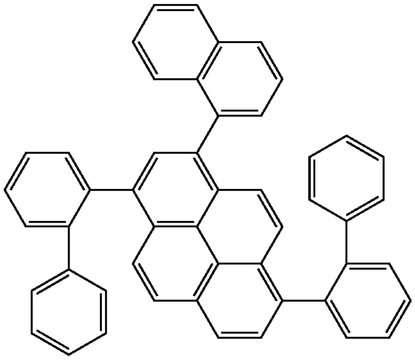

-continued
[Formula 200]
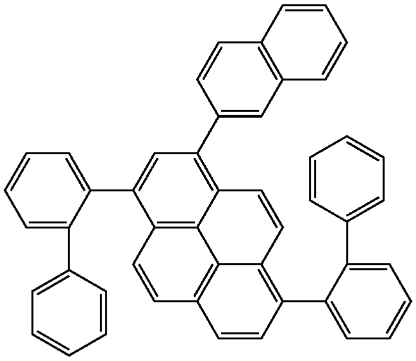
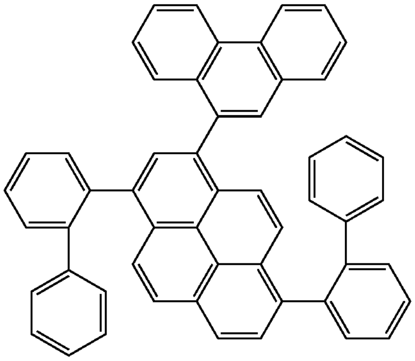
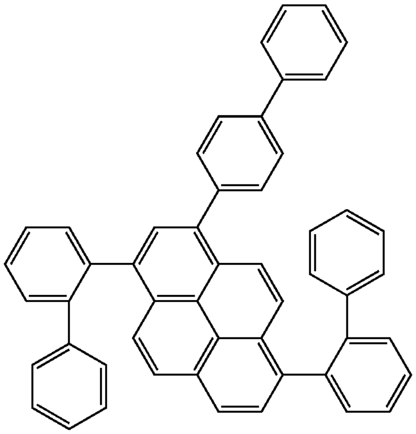
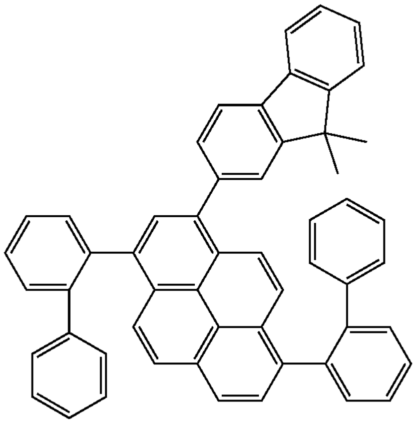
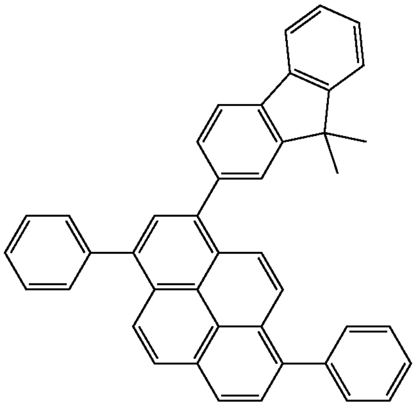
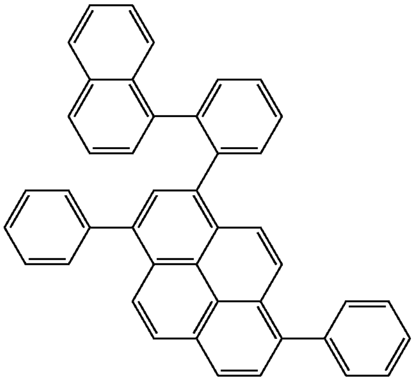
[Formula 201]
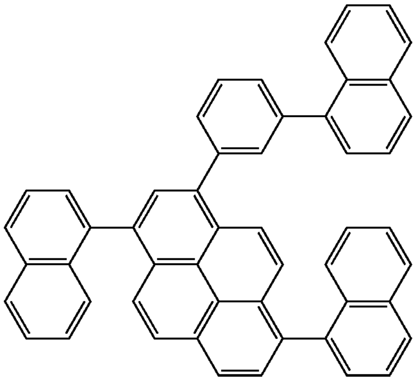
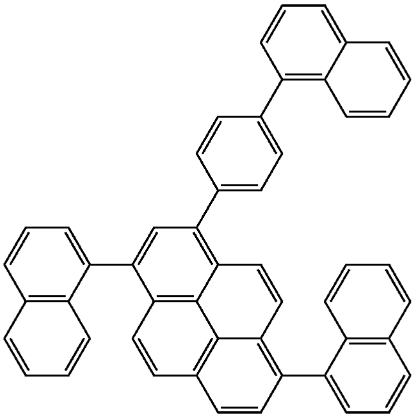

-continued
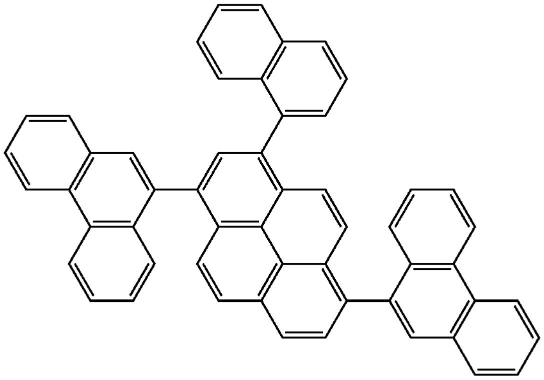 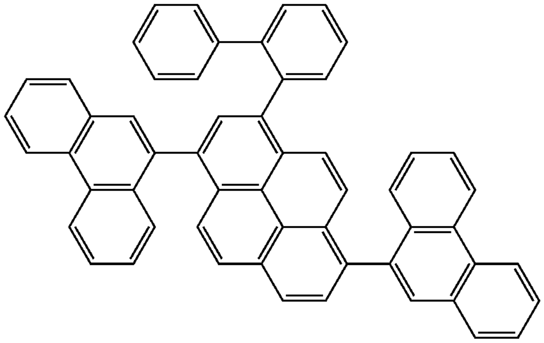
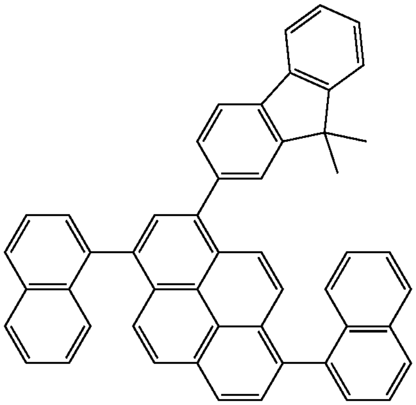 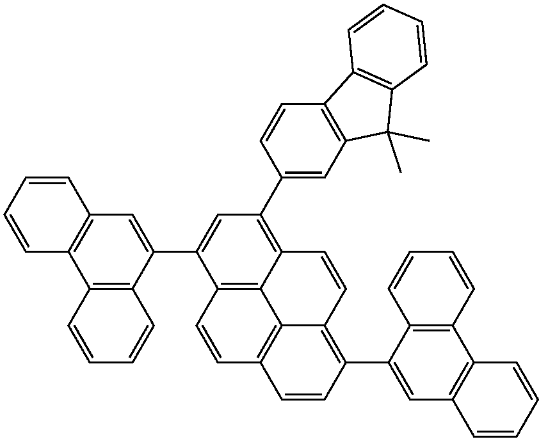
[Formula 202]
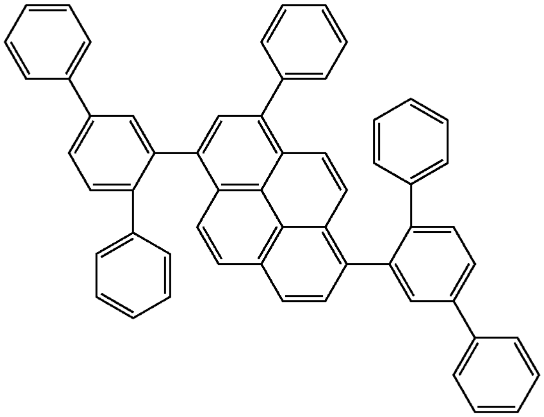 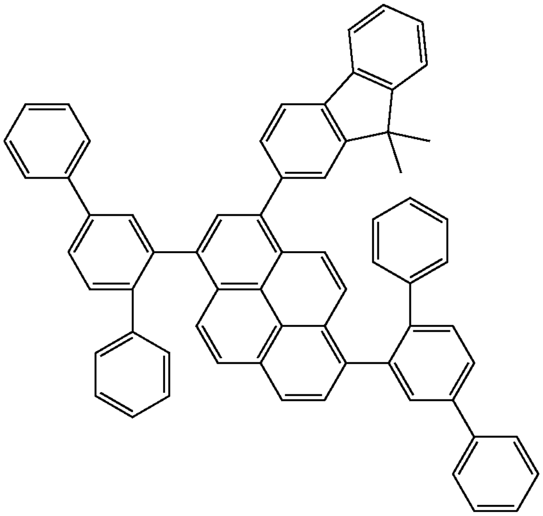

-continued
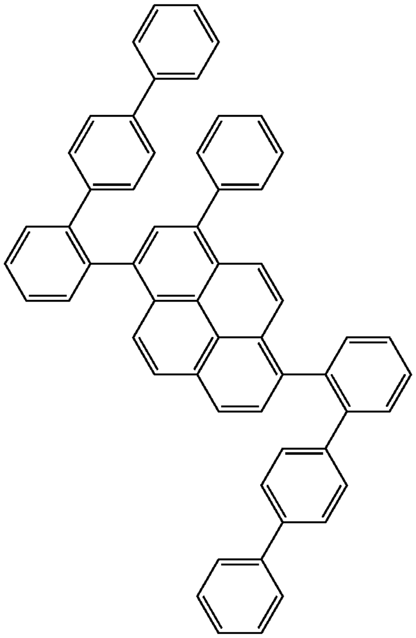
[Formula 203]
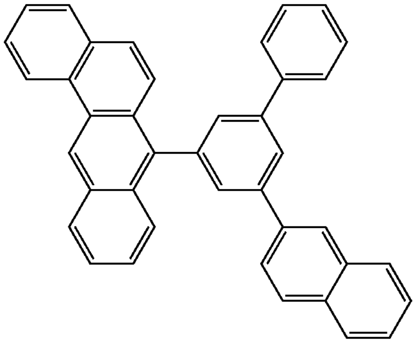
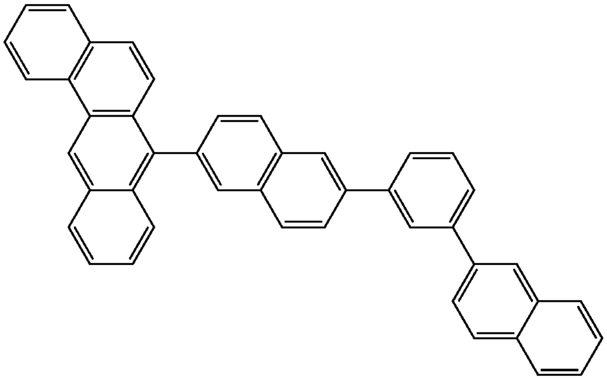
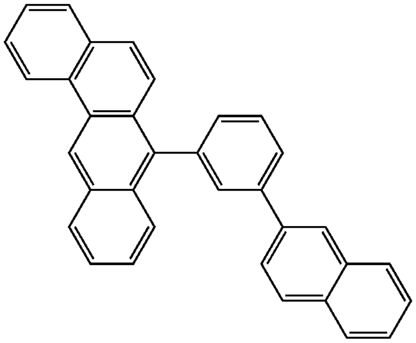
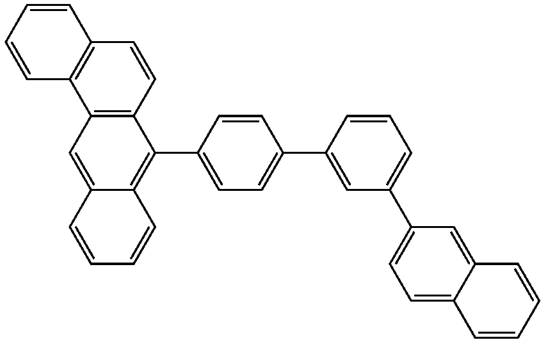

-continued
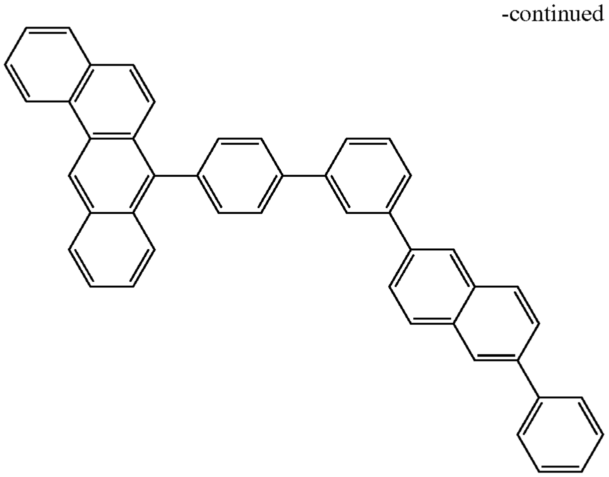
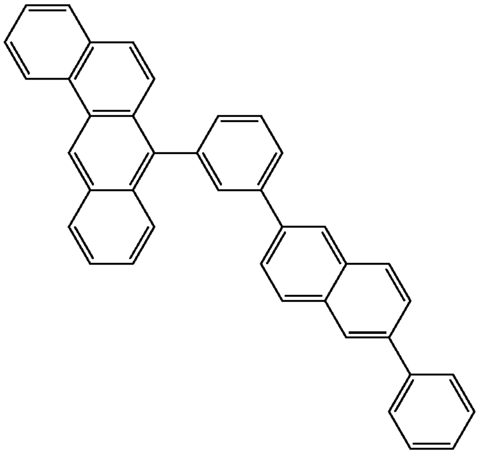
[Formula 204]
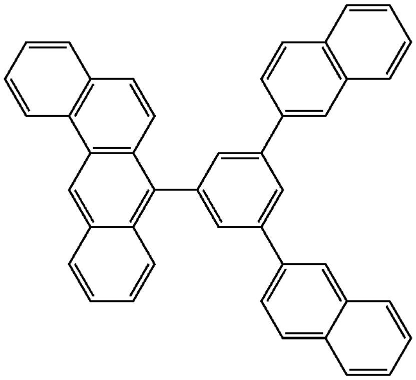
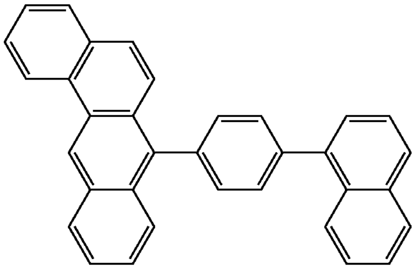
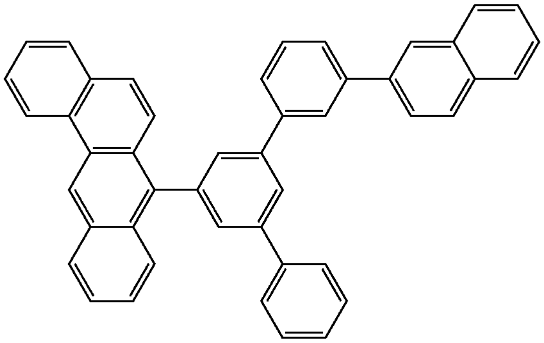
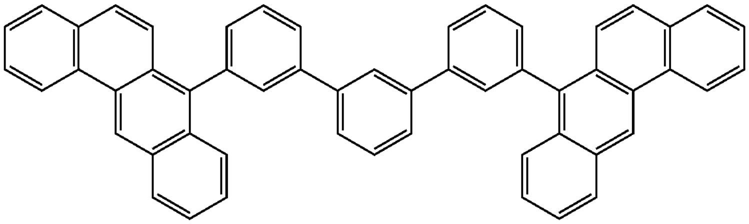
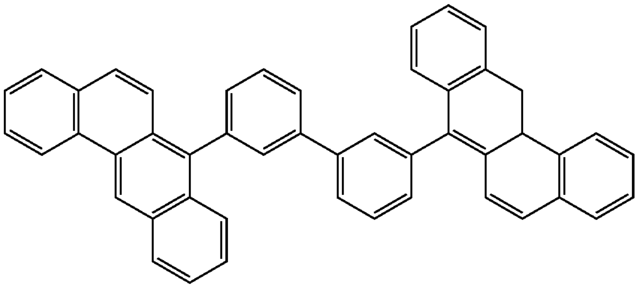

-continued
[Formula 205]
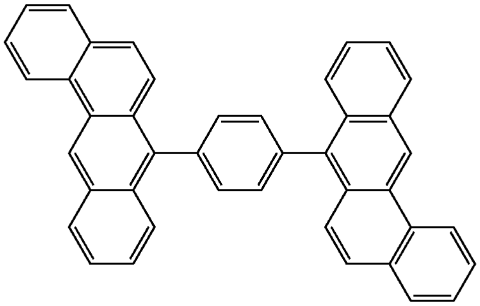
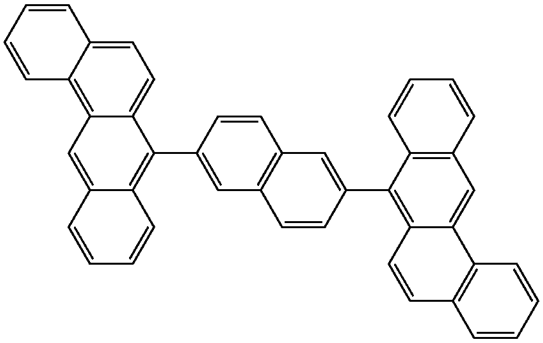
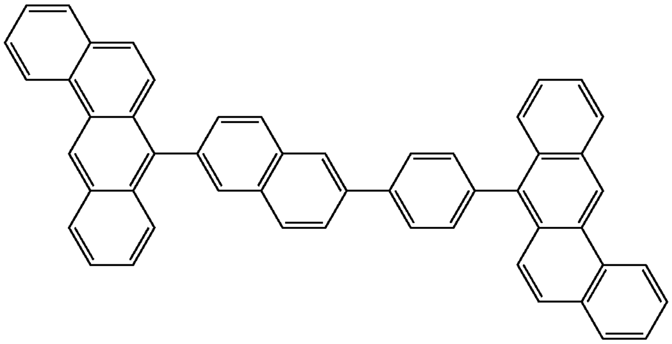
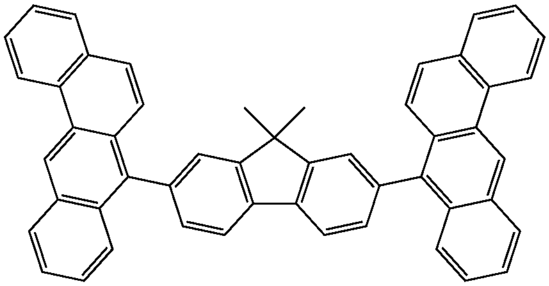
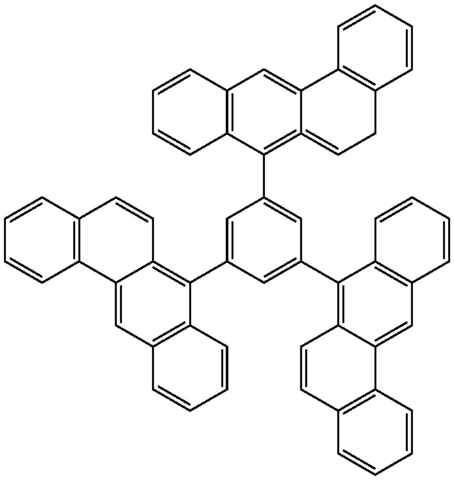
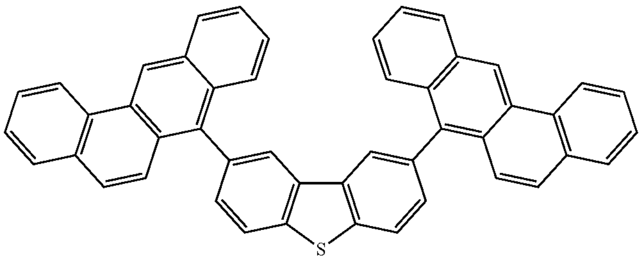

-continued
[Formula 206]
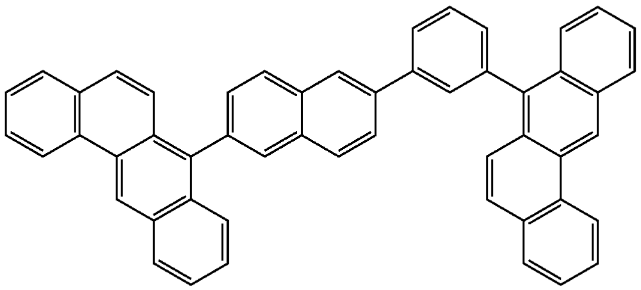
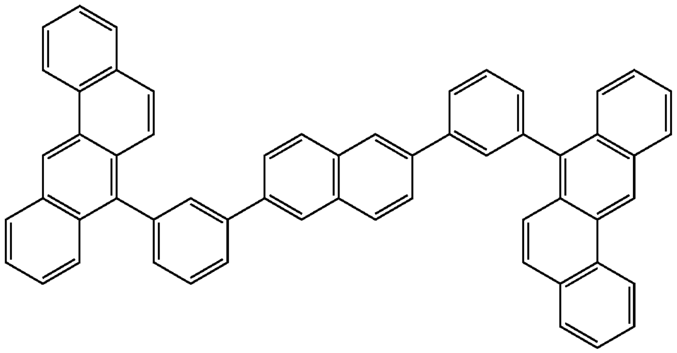
[Formula 207]
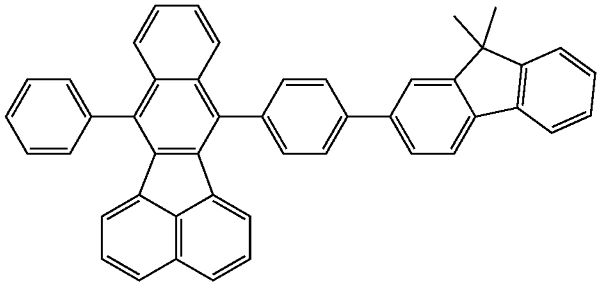
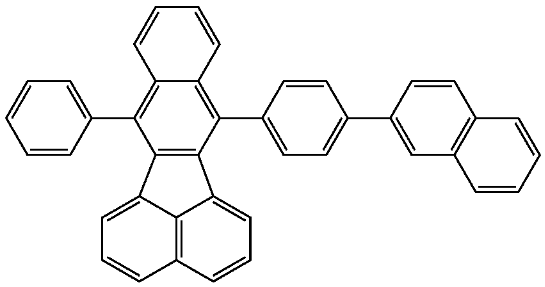

-continued
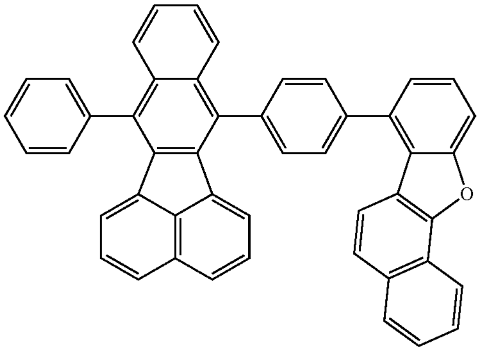
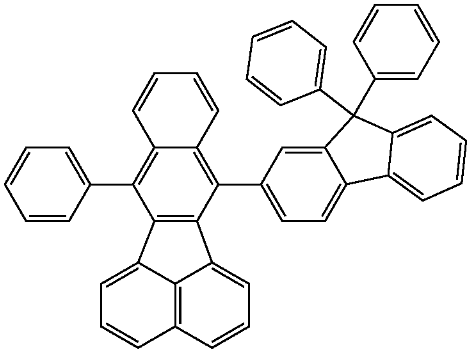
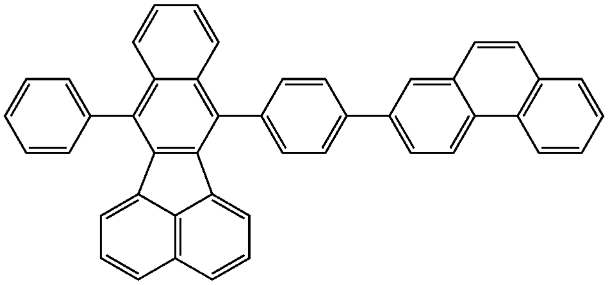
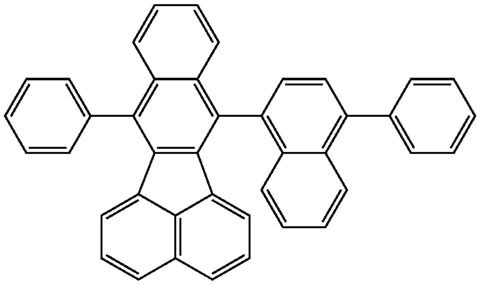
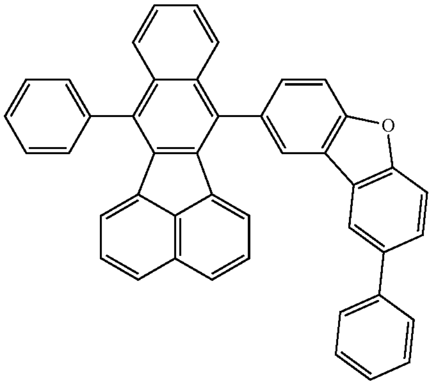
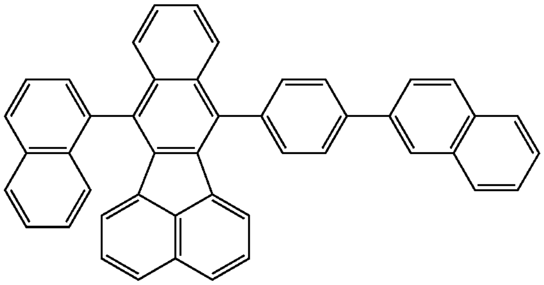
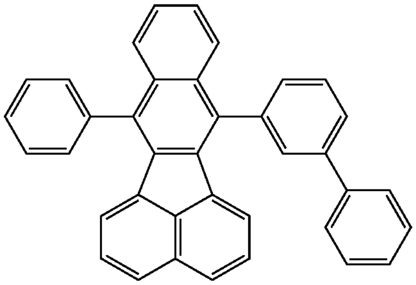
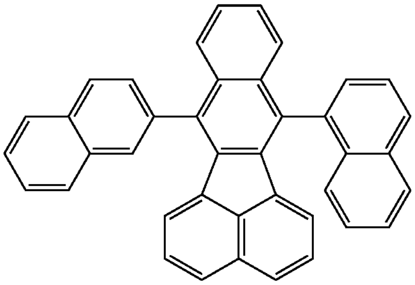
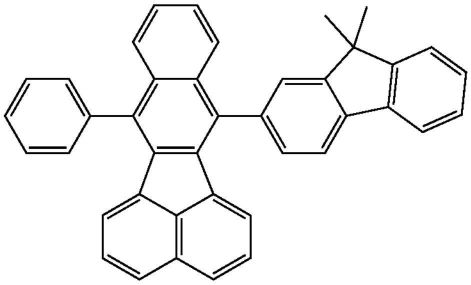
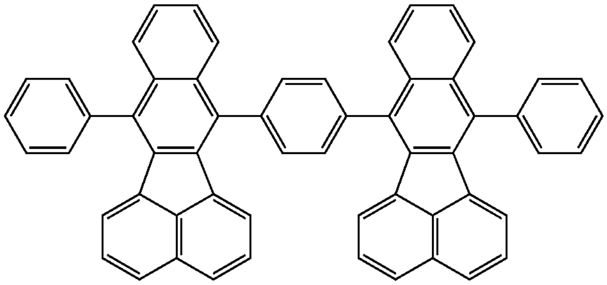

-continued
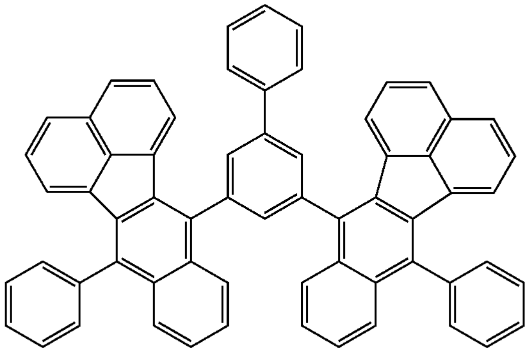
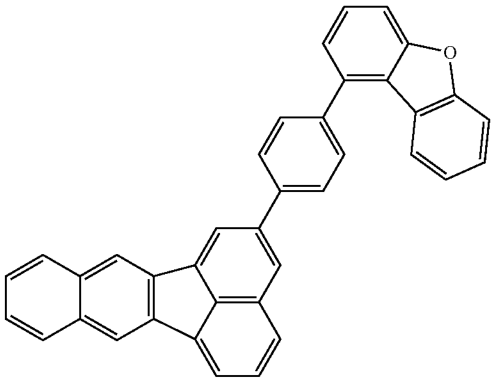
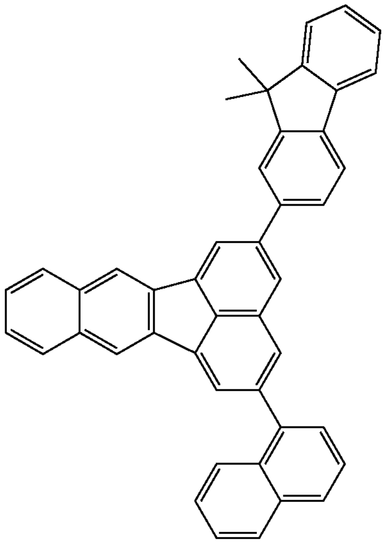
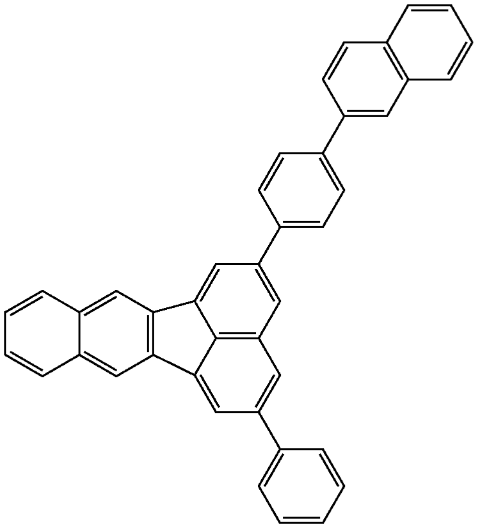
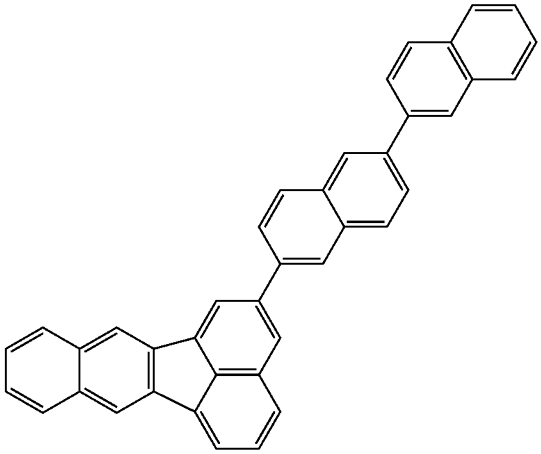
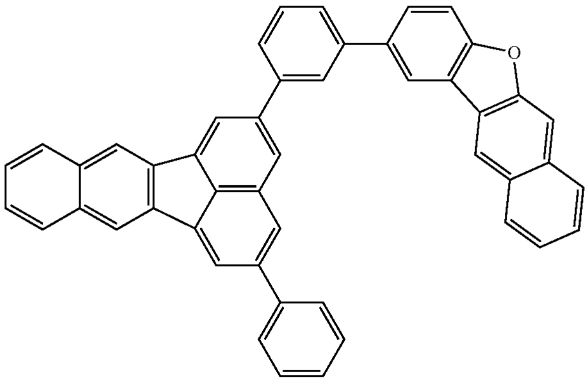

-continued
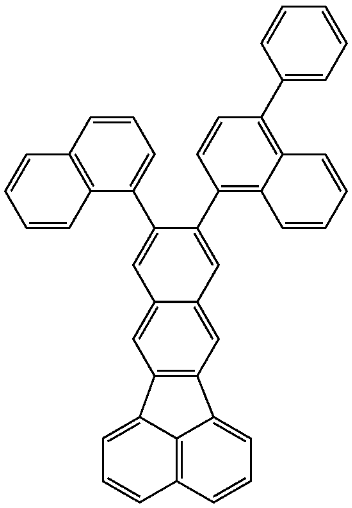
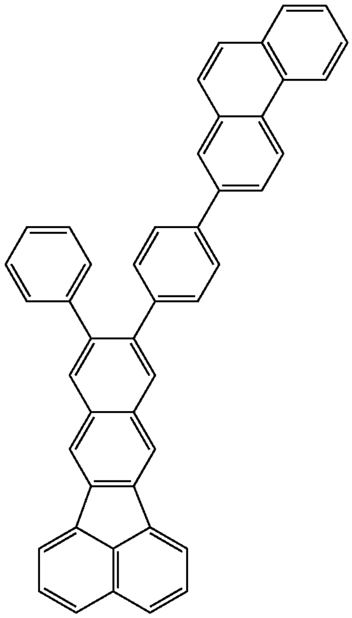
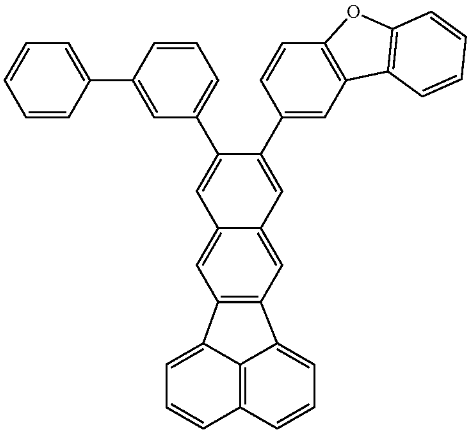
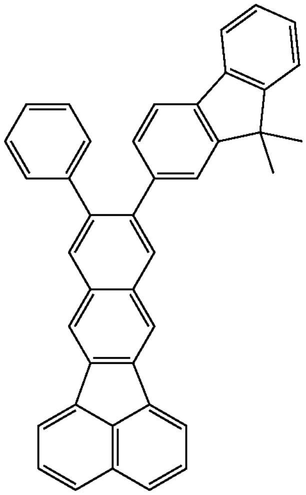
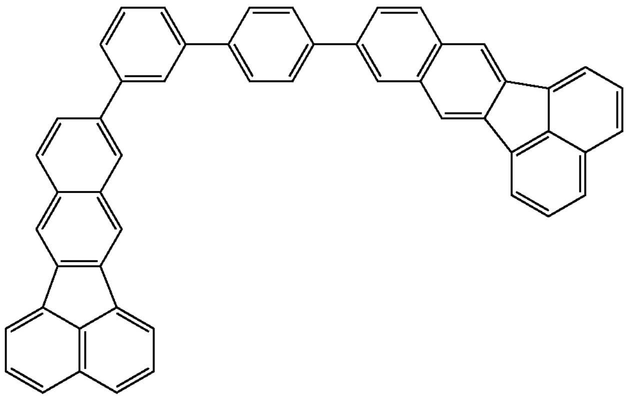

-continued
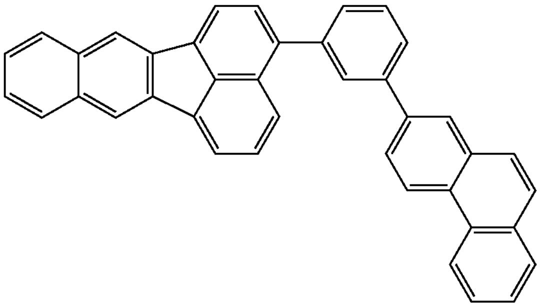
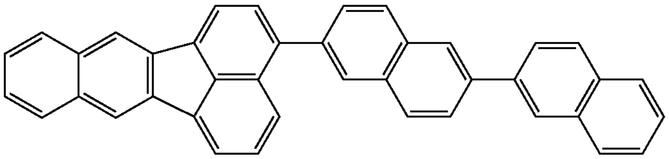
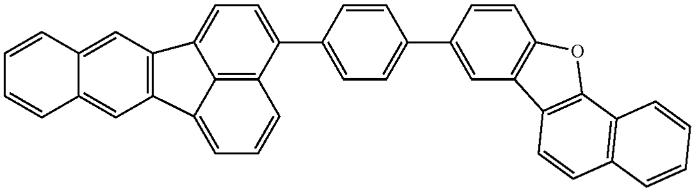
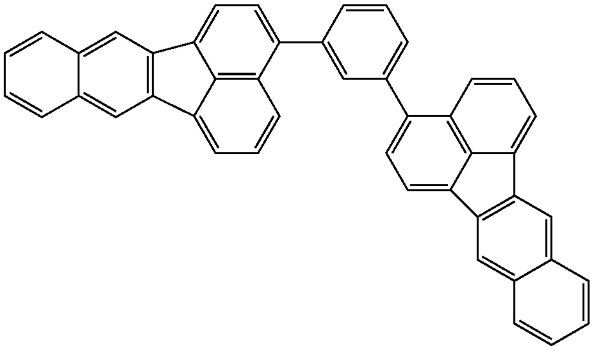
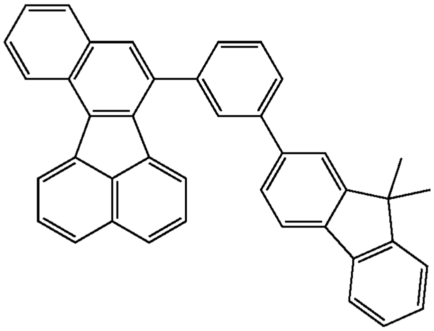
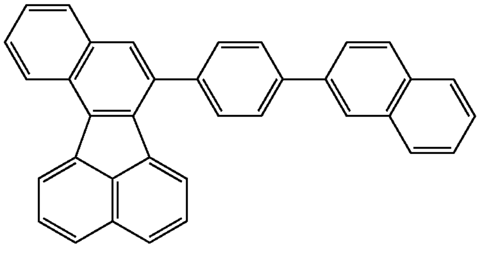
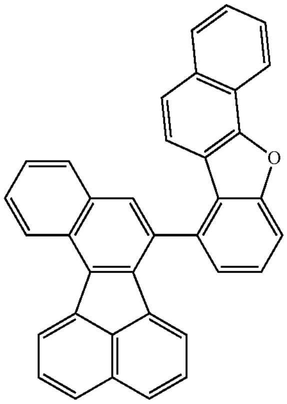

-continued
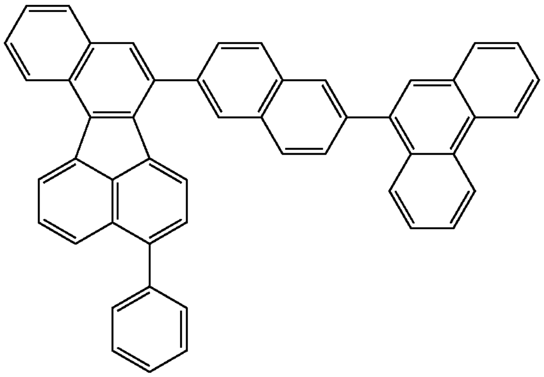
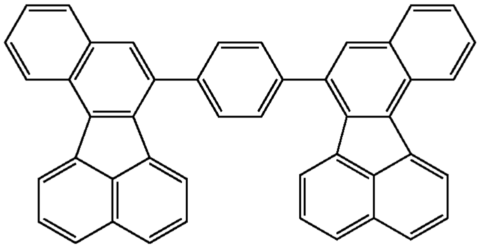
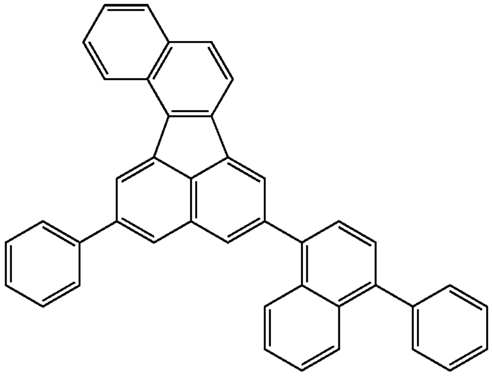
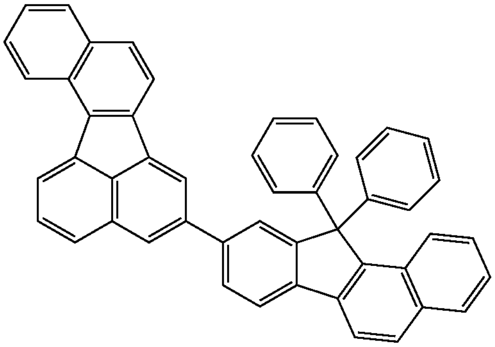
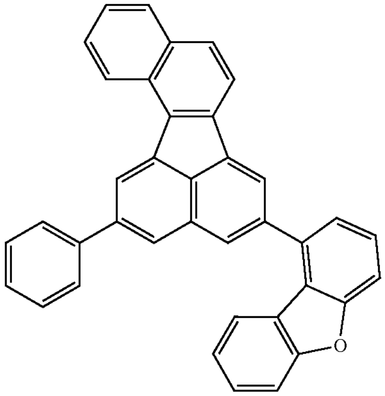
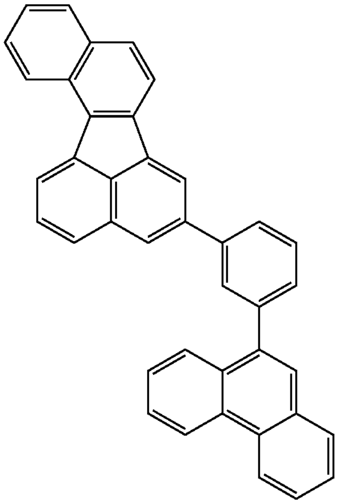
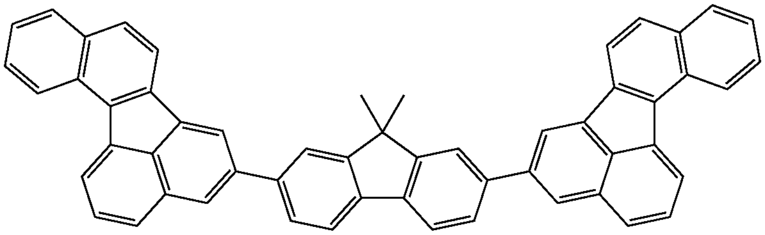

-continued
[Formula 208]
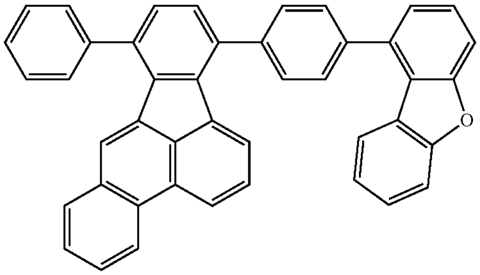
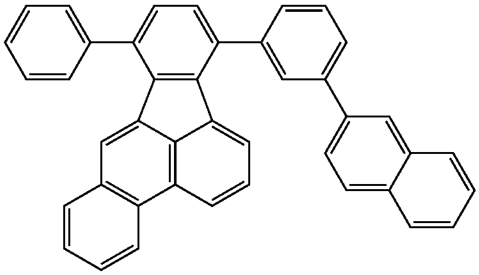
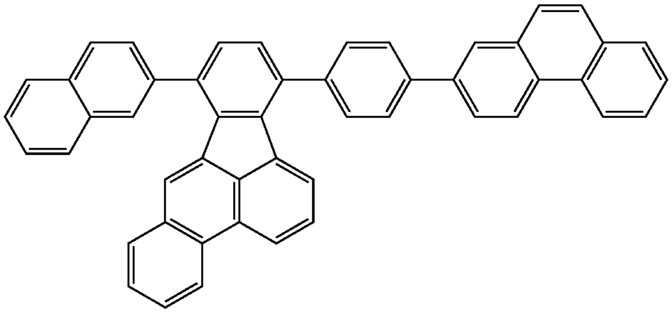
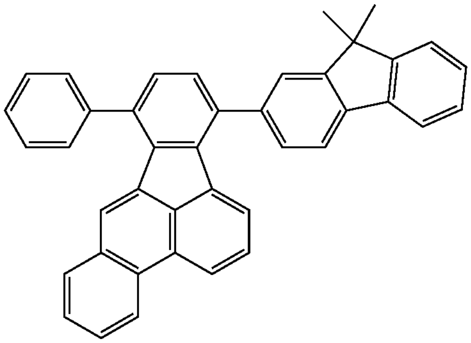
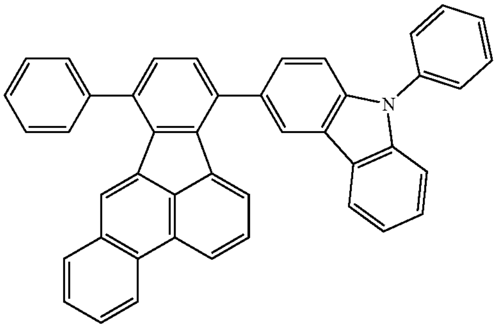
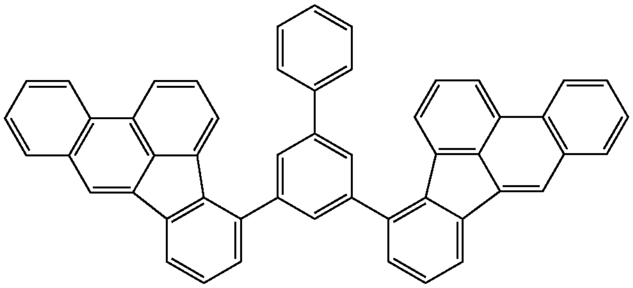
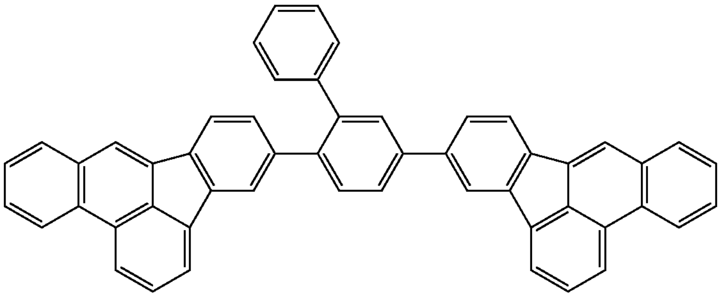

-continued
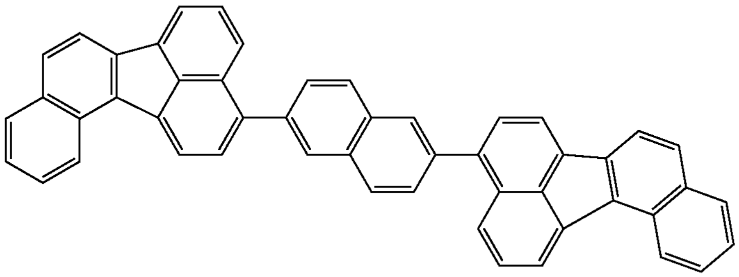
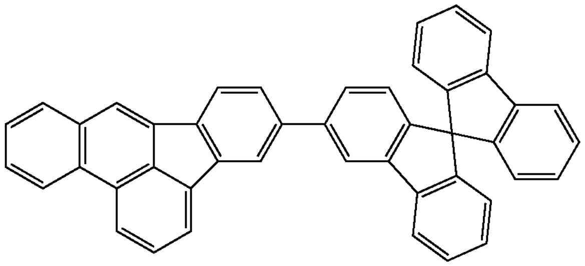
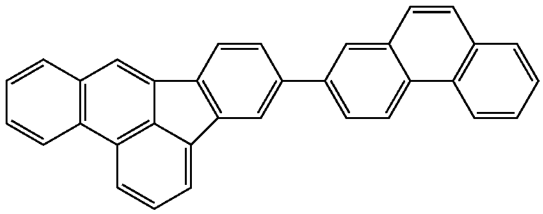
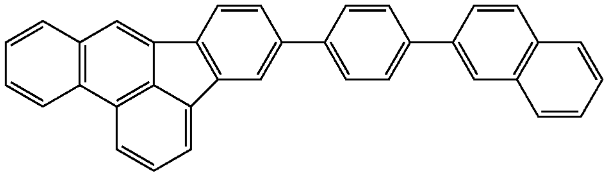
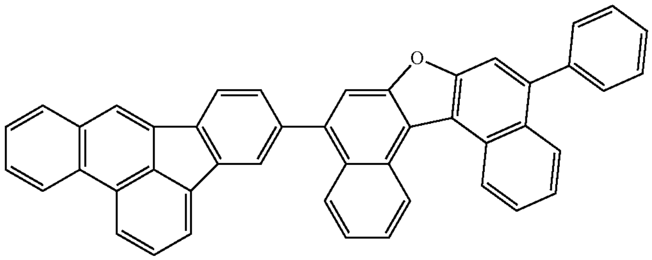
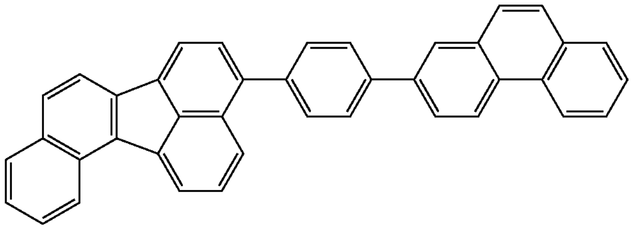
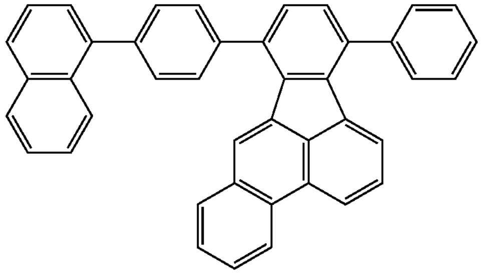
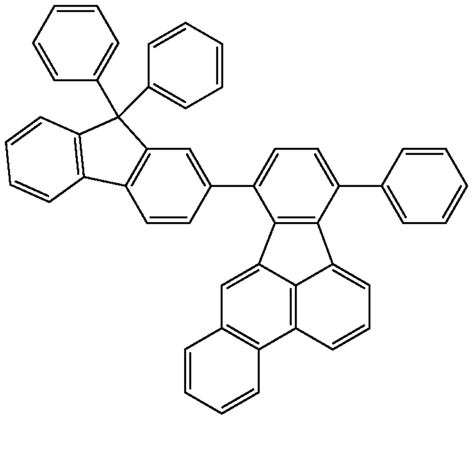
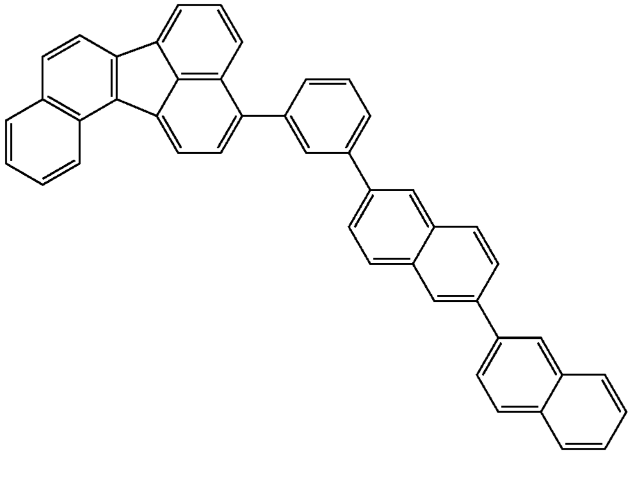

-continued
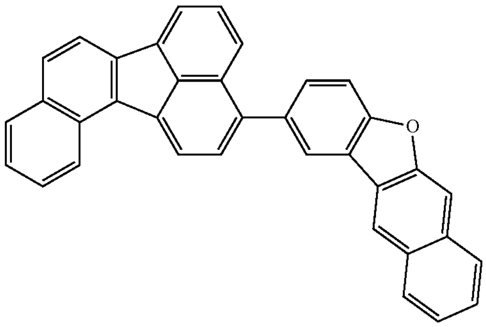
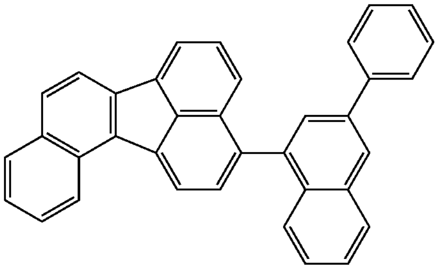
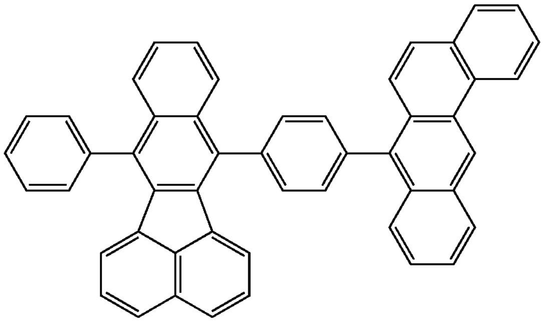
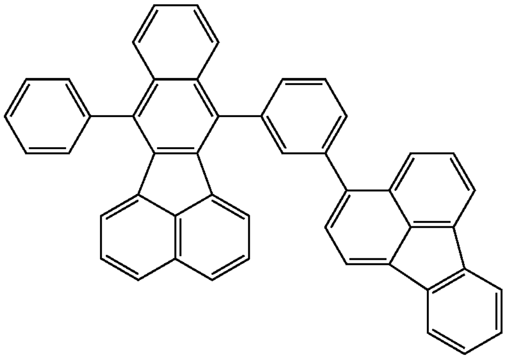
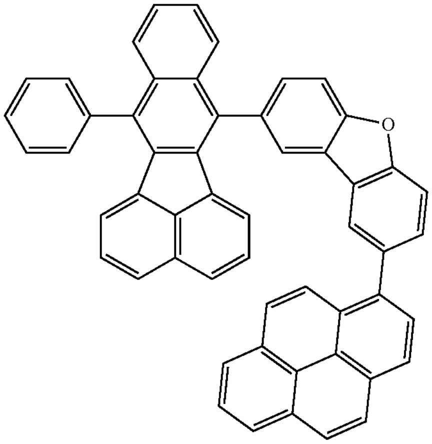
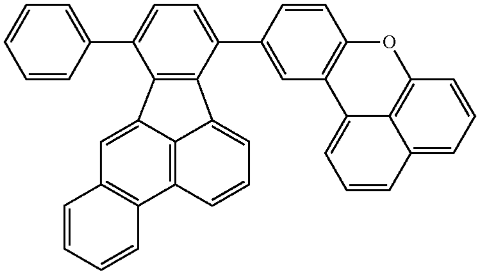
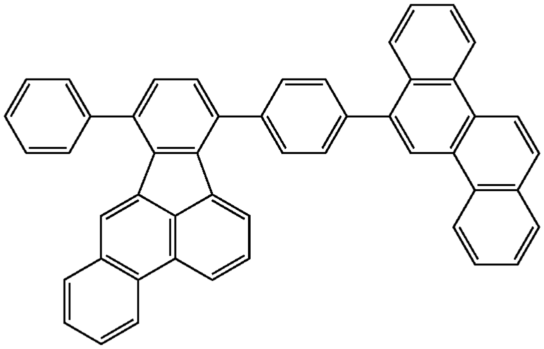

-continued
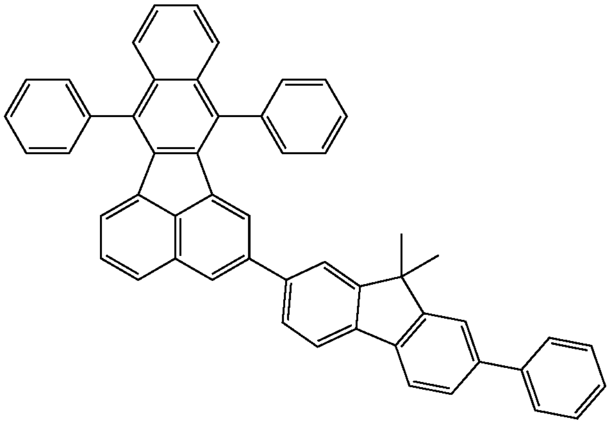
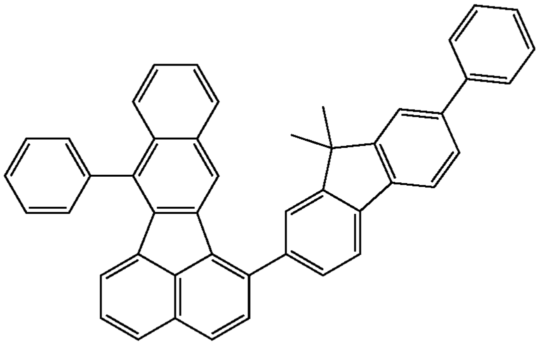
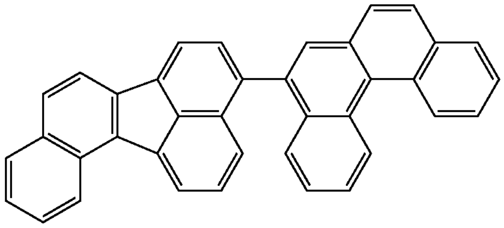
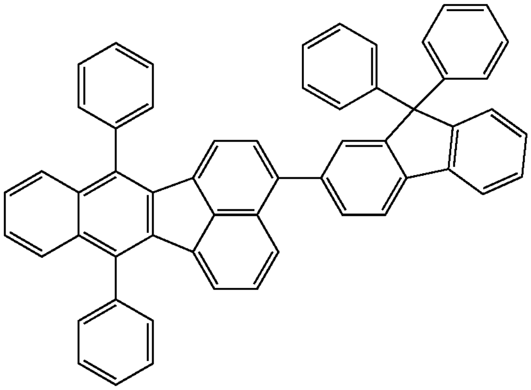
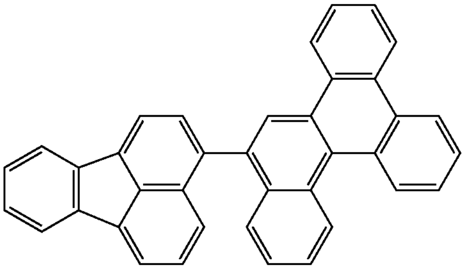
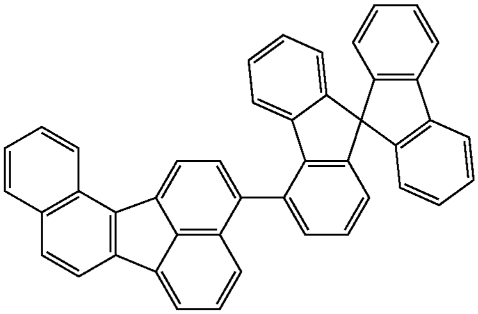

-continued
[Formula 209]
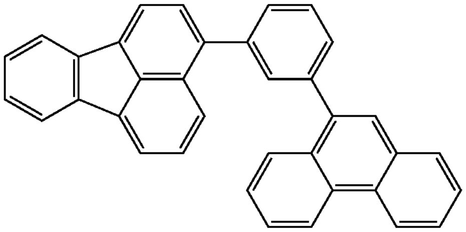
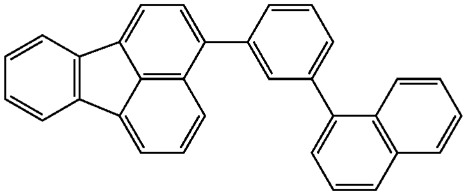
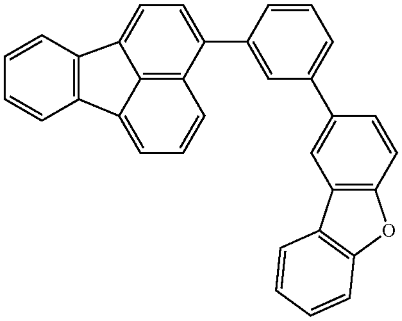
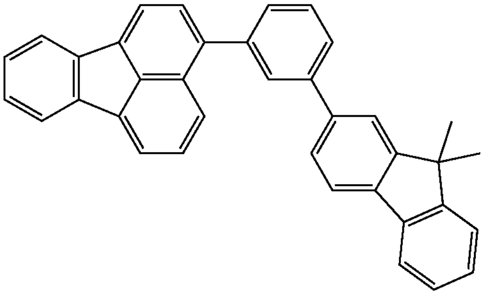
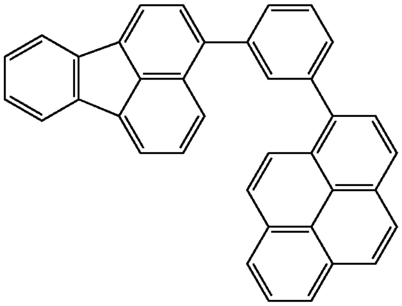
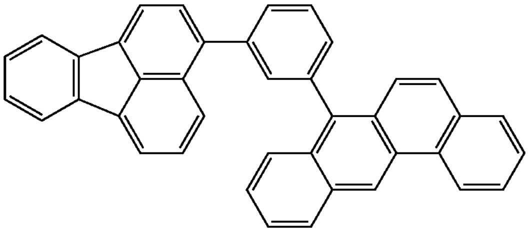
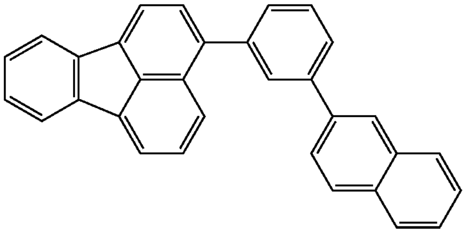
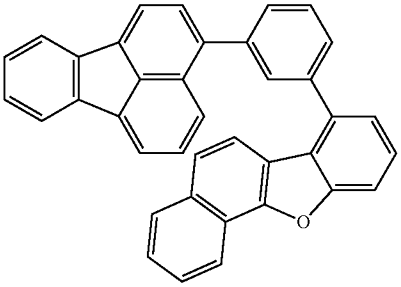
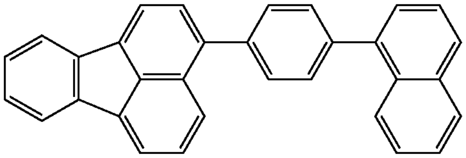
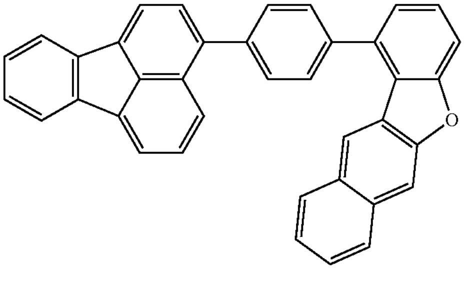
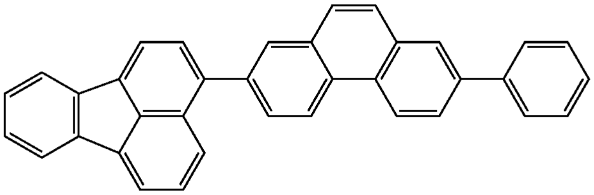
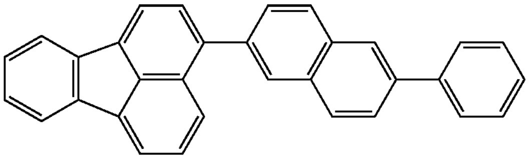

-continued
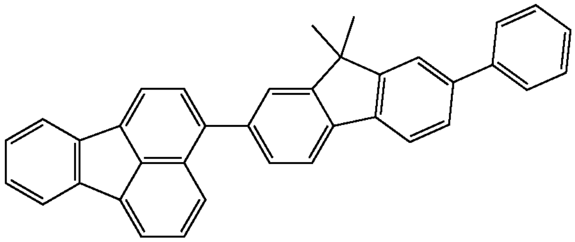
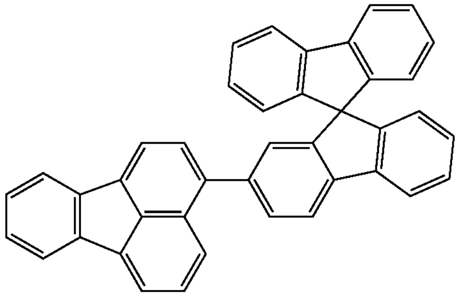
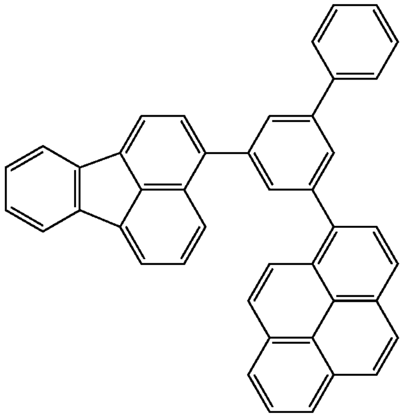
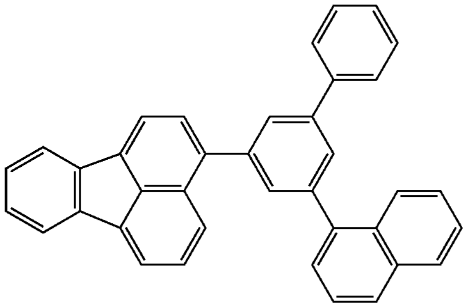
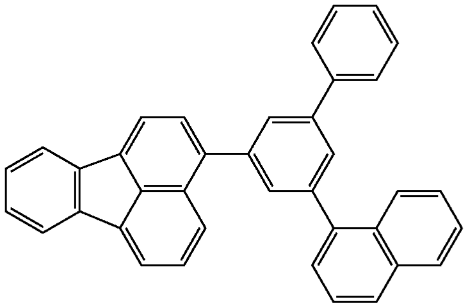
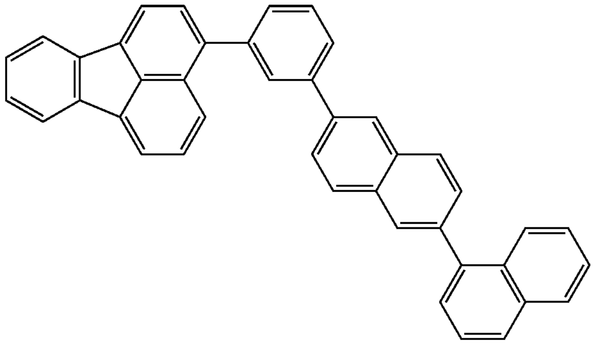
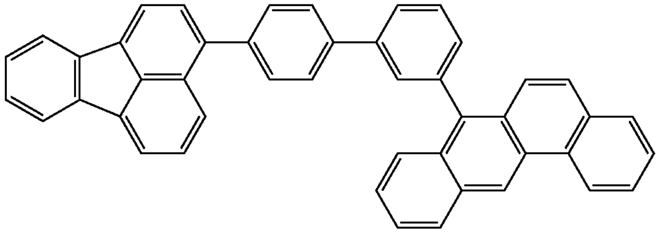
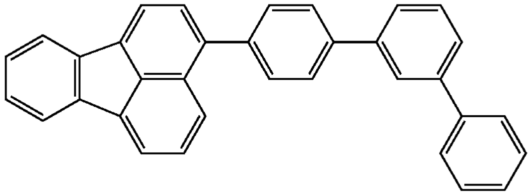
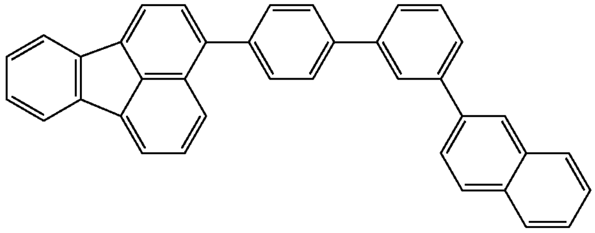

-continued
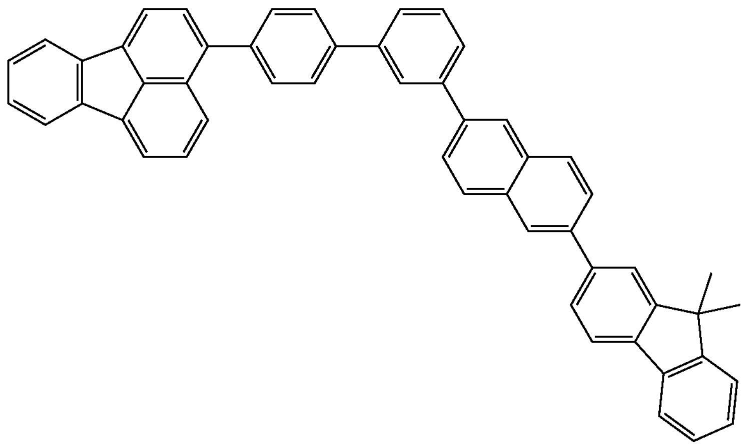
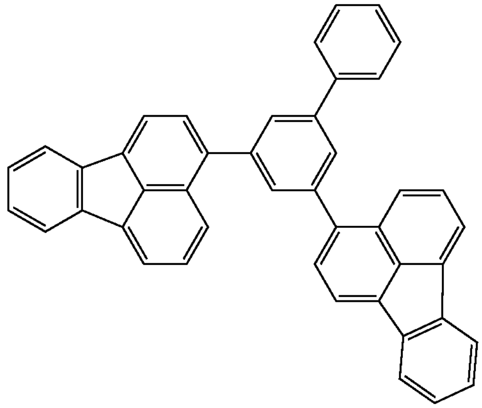
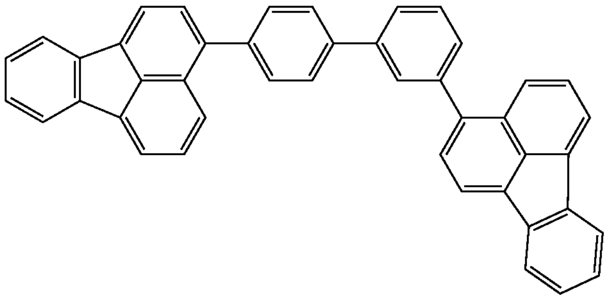
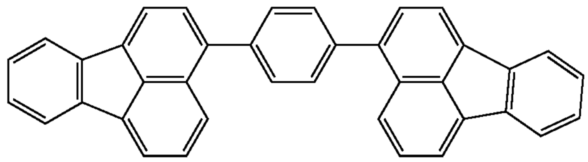
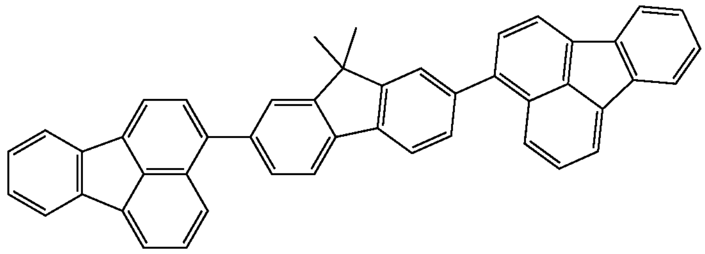
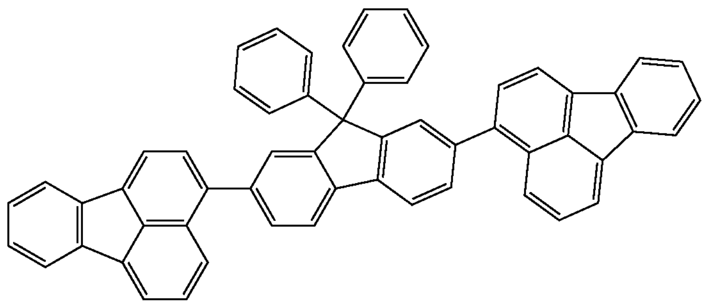
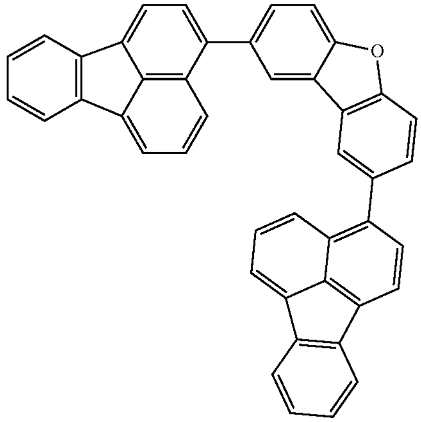

-continued
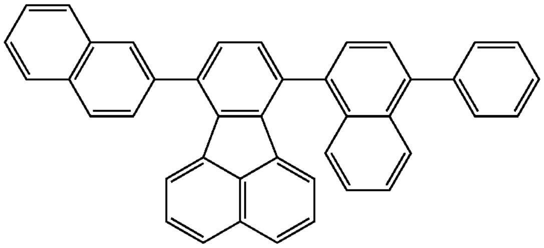
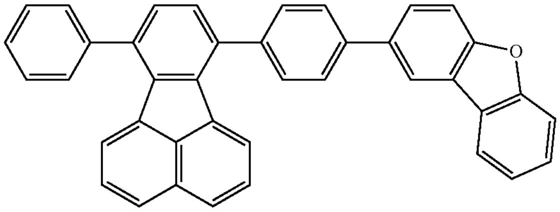
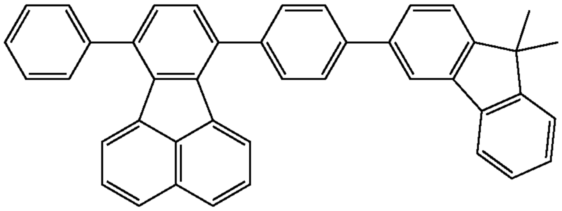
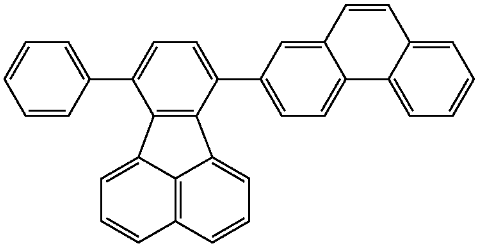
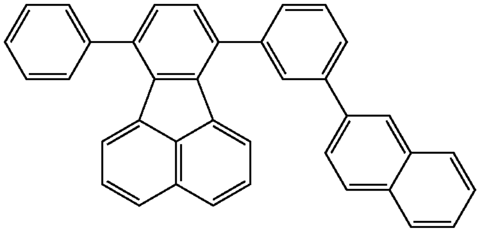
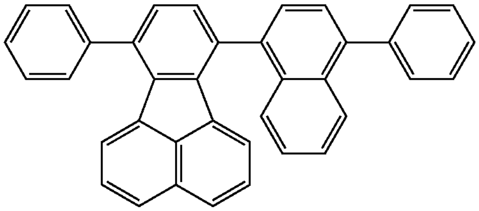
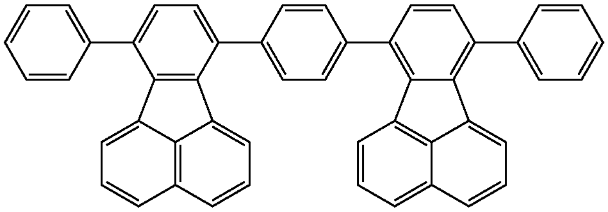
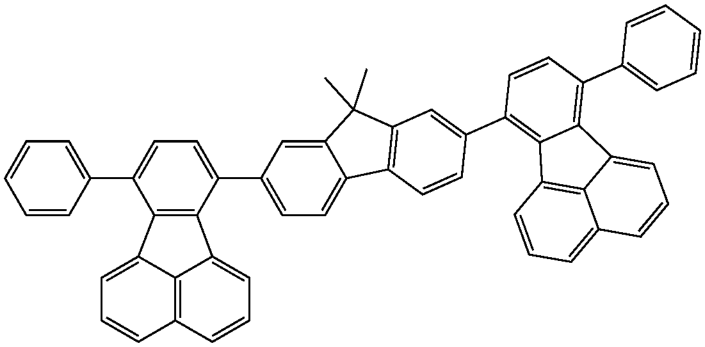
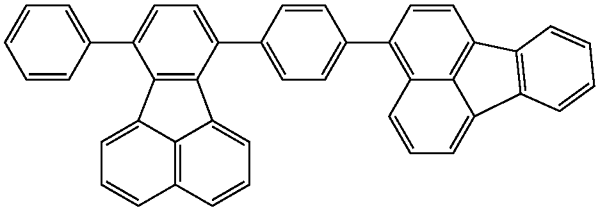

-continued
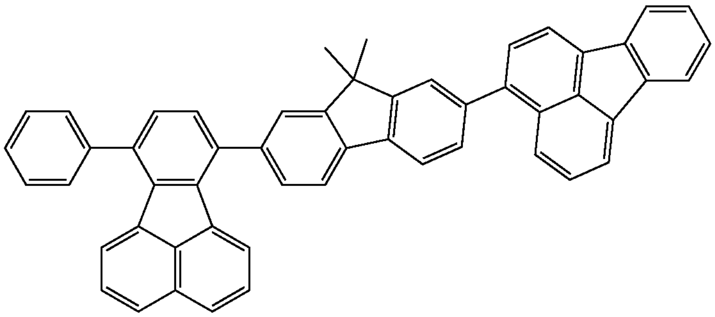
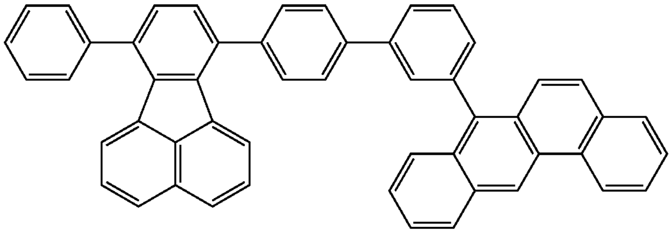
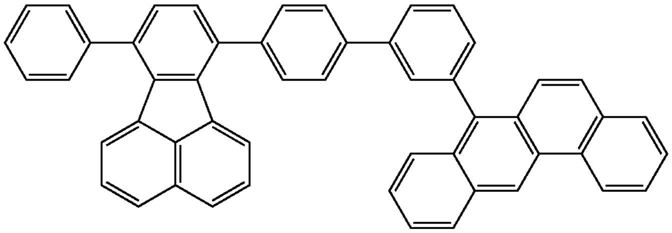
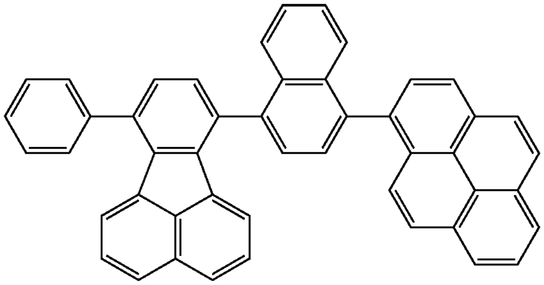
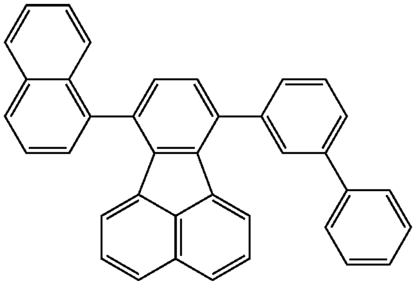
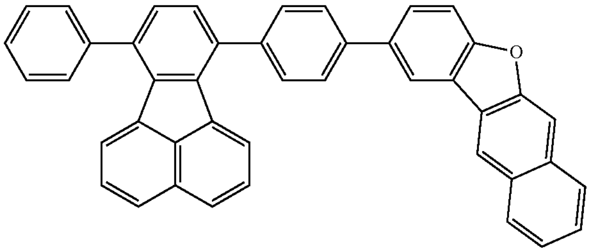
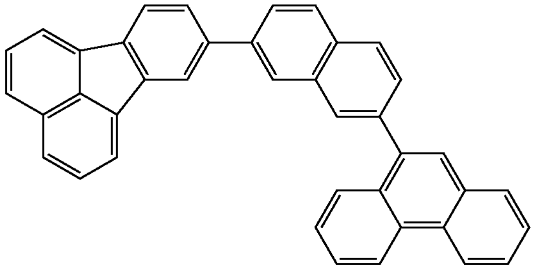
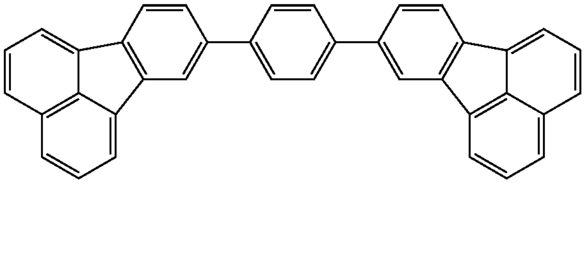

-continued
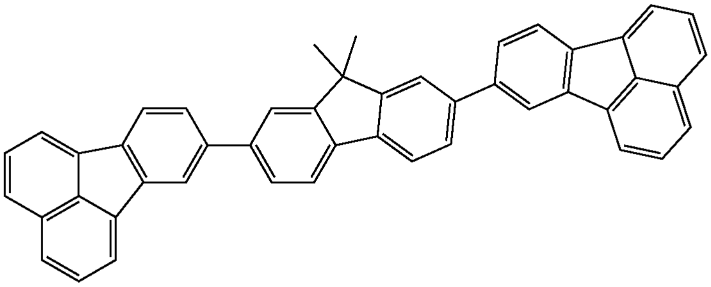
[Formula 210]
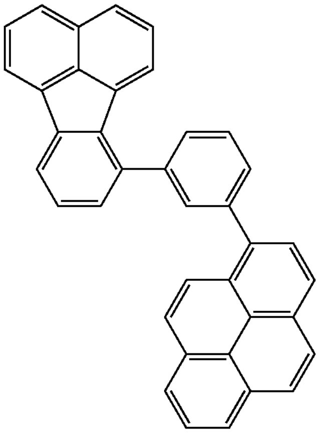
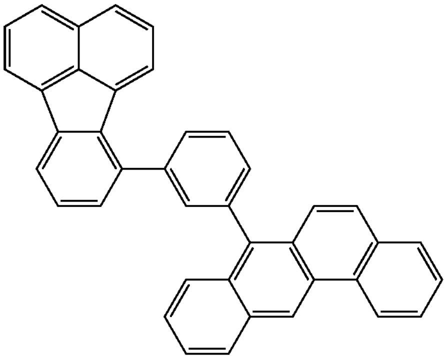
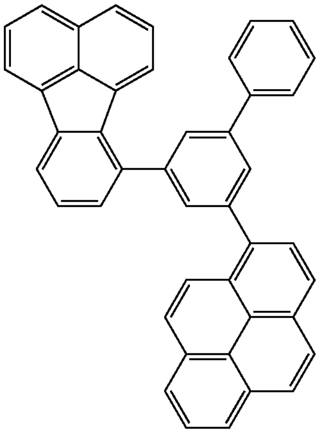
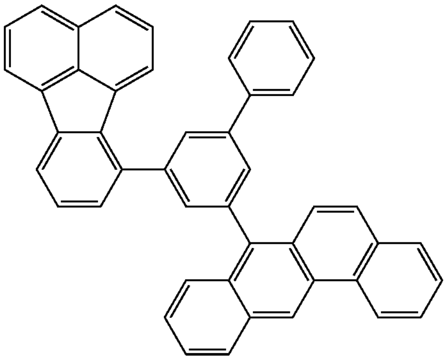
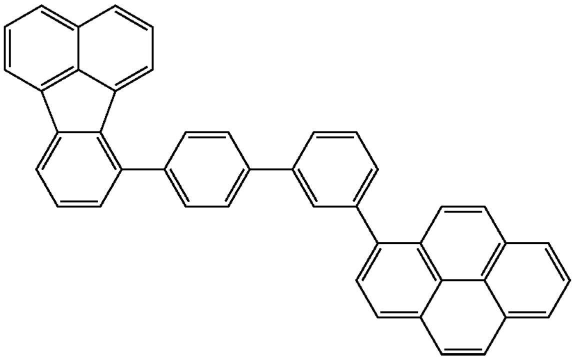
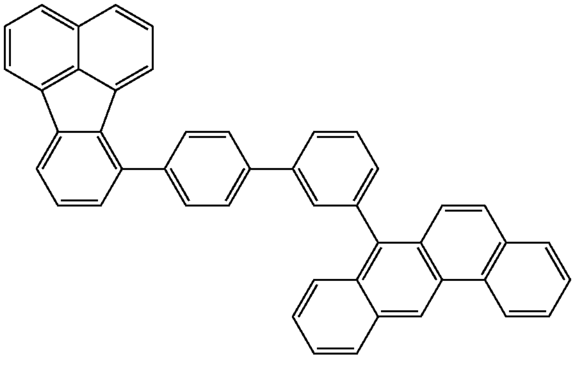
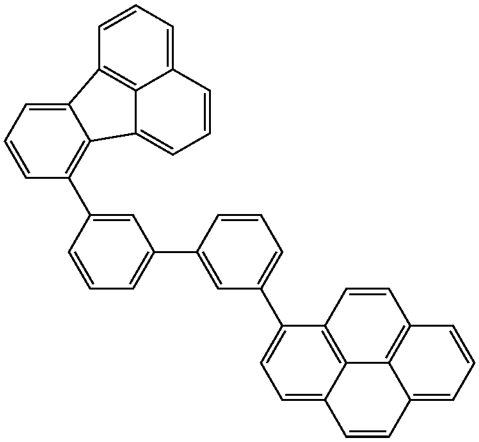

-continued
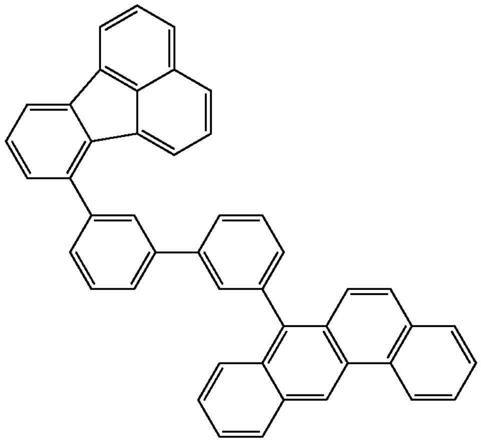
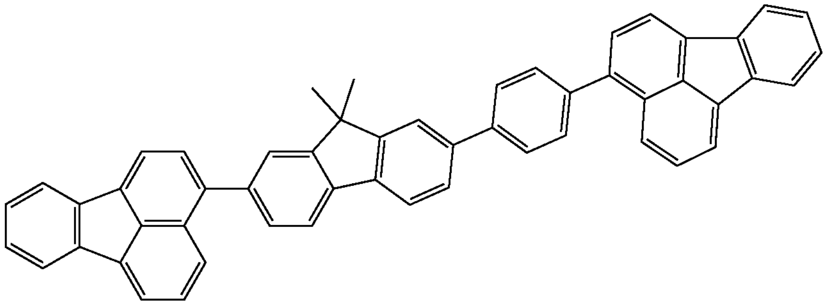
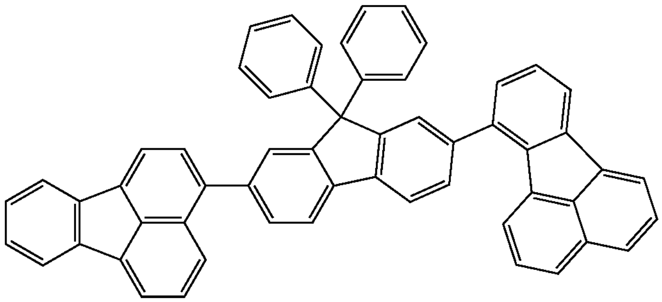
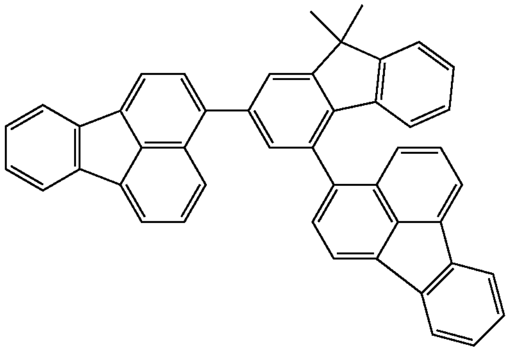

-continued
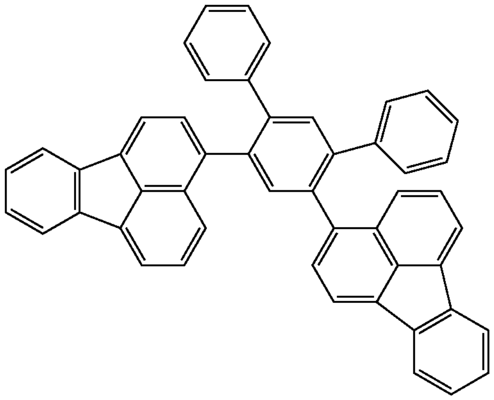
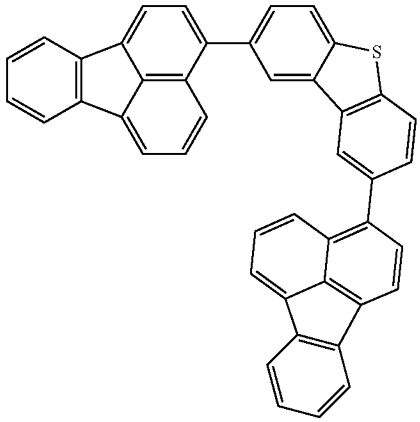
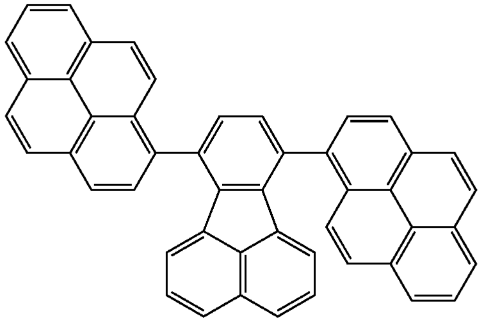
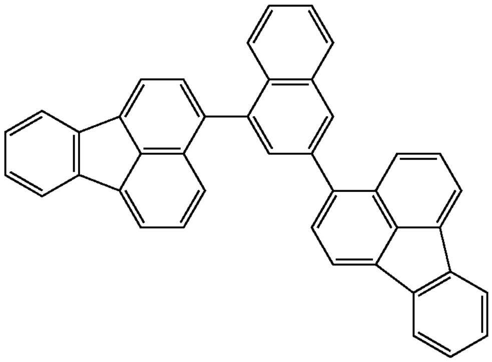
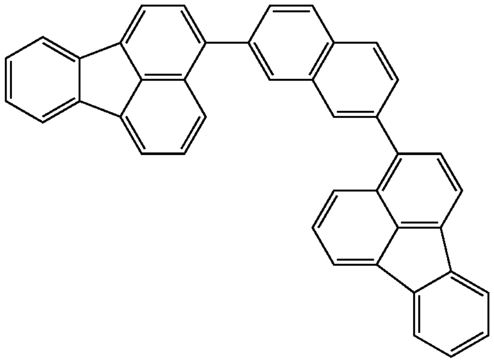
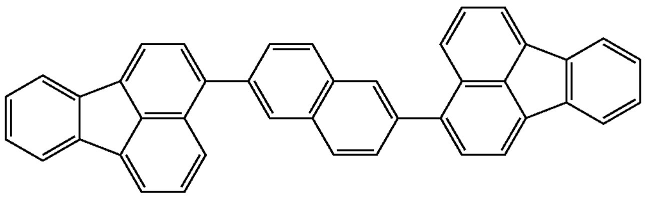
[Formula 211]
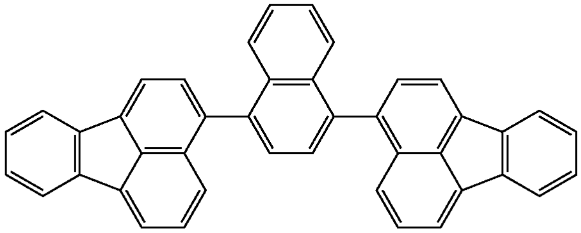
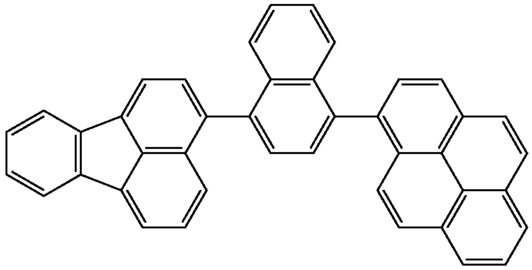

-continued
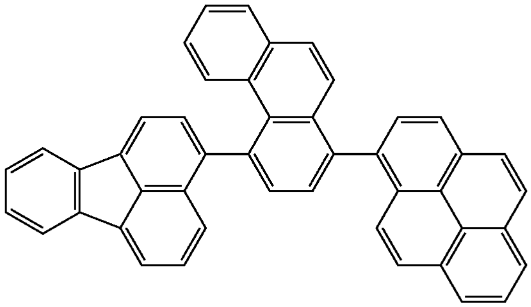
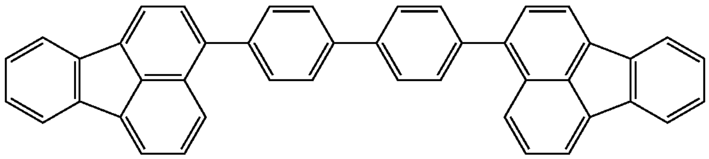
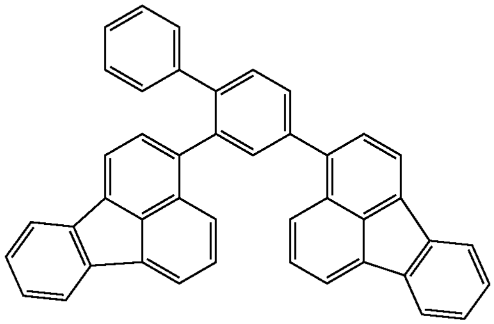
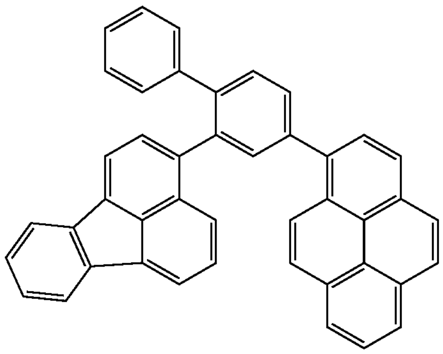
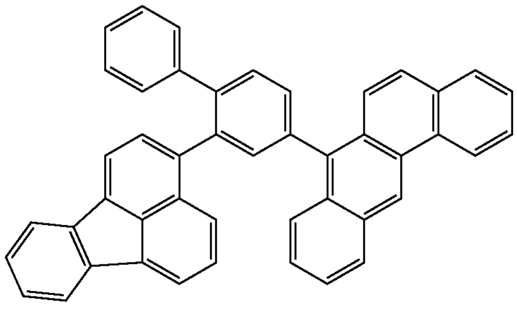
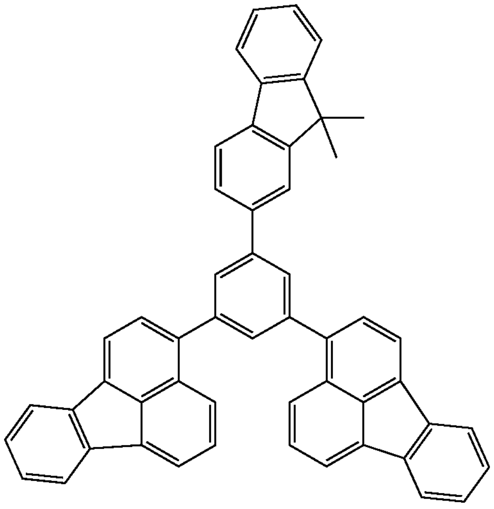

-continued
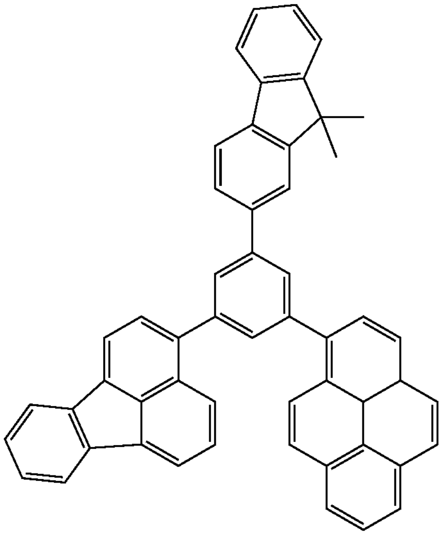
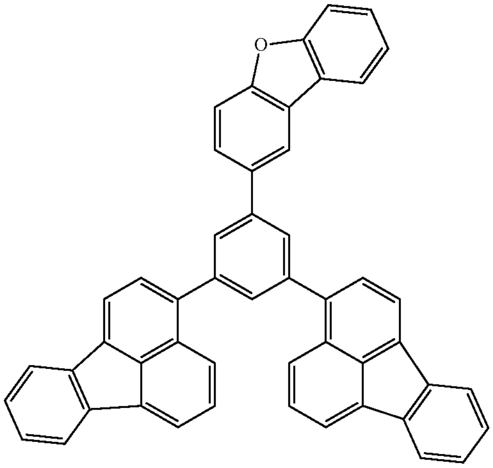
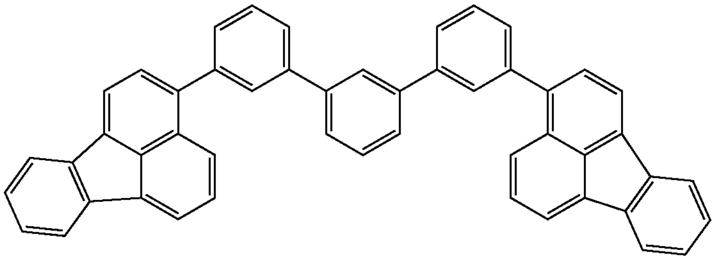
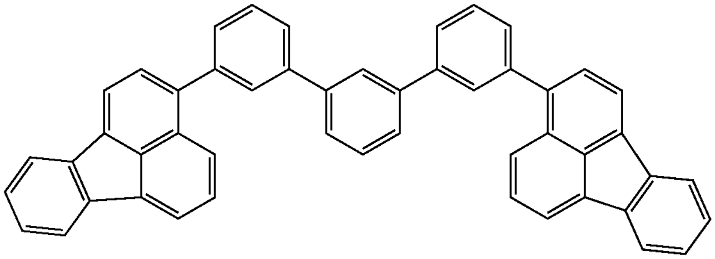
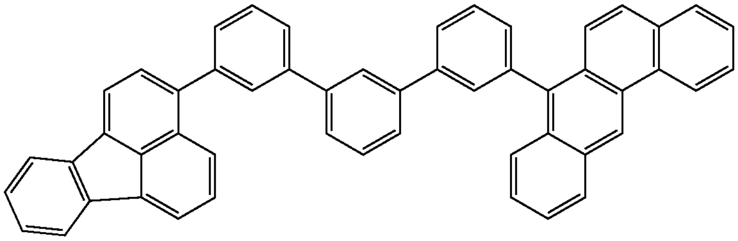
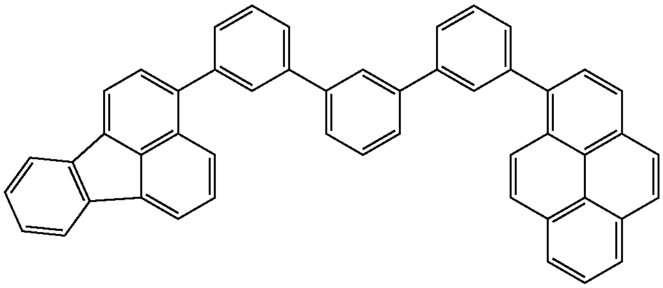

-continued
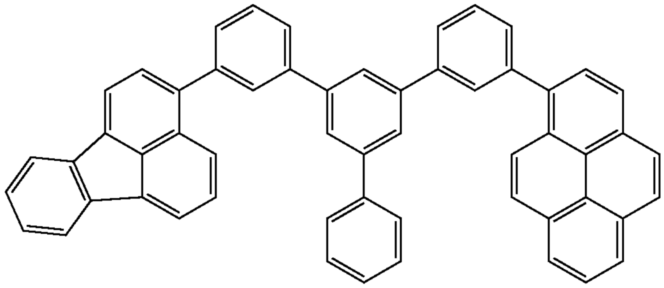
[Formula 212]
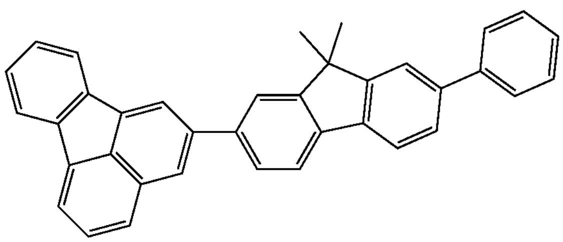
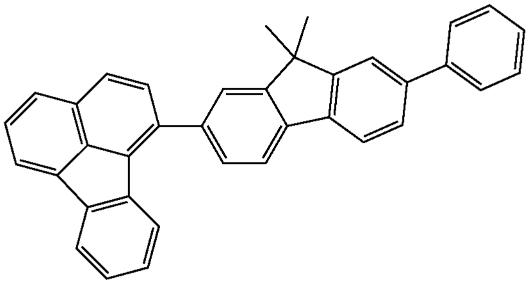
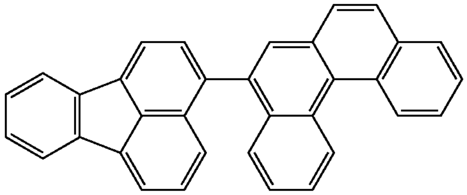
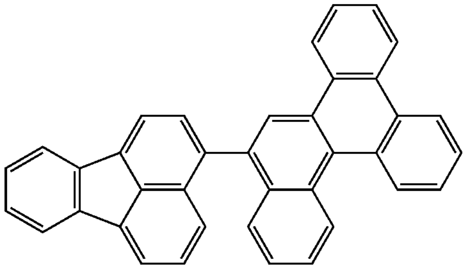
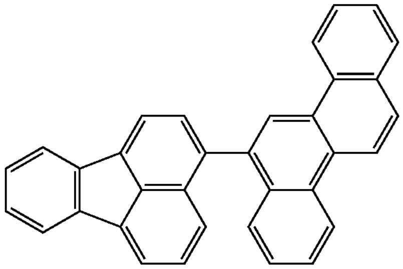
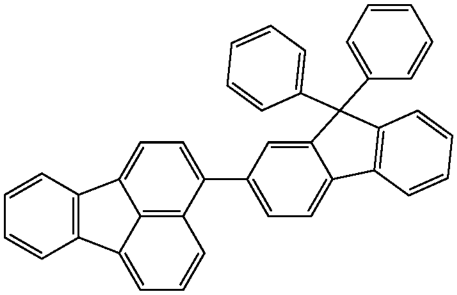
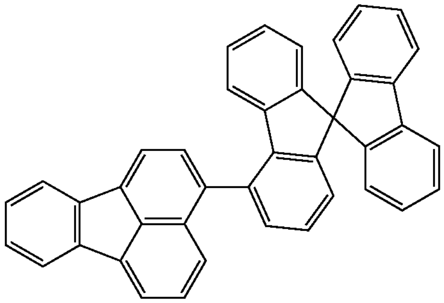
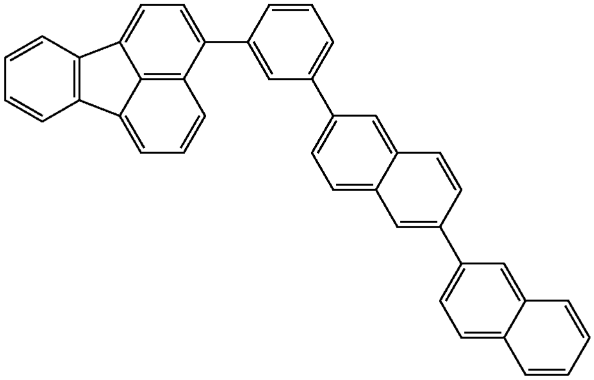

-continued
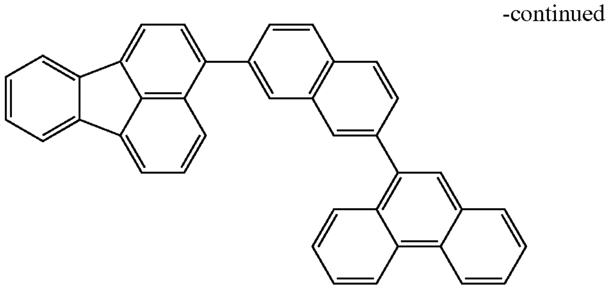
[Formula 213]
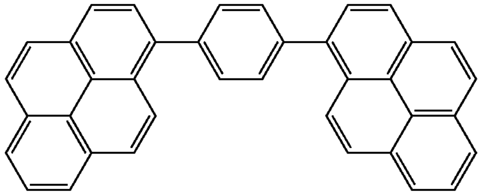
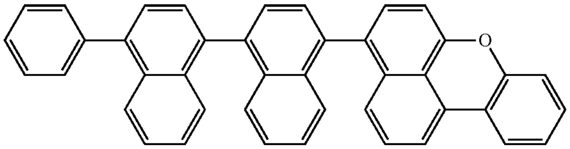
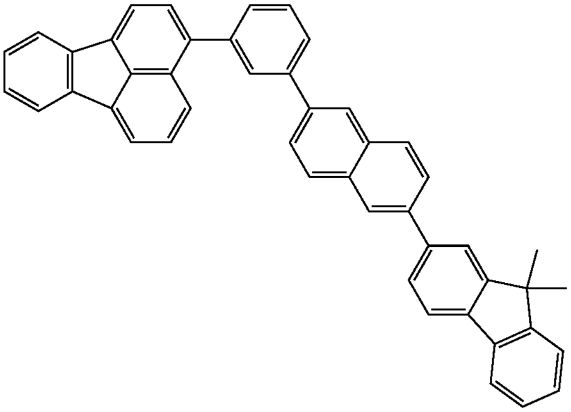
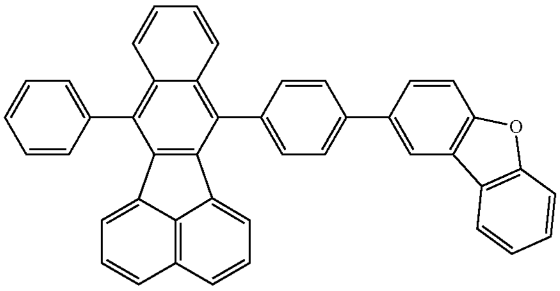
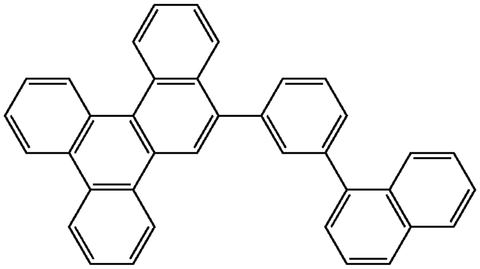
-continued
[Formula 214]
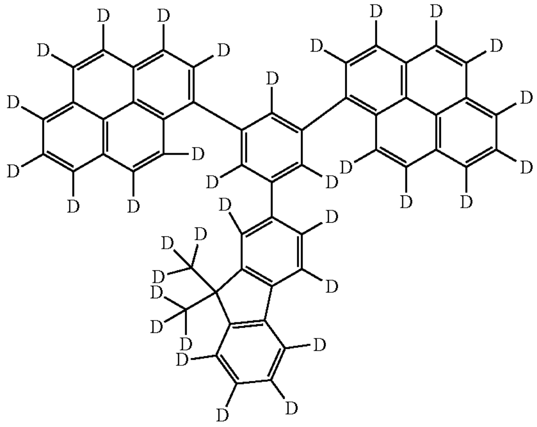
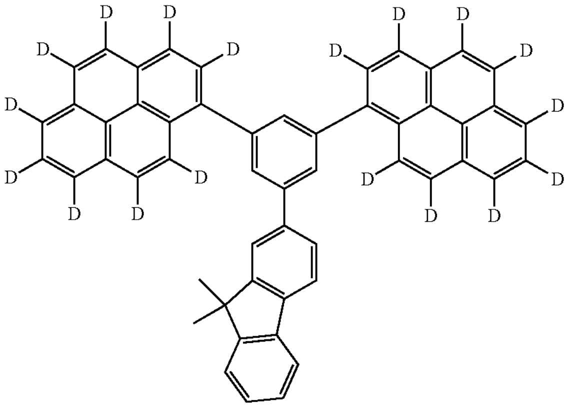
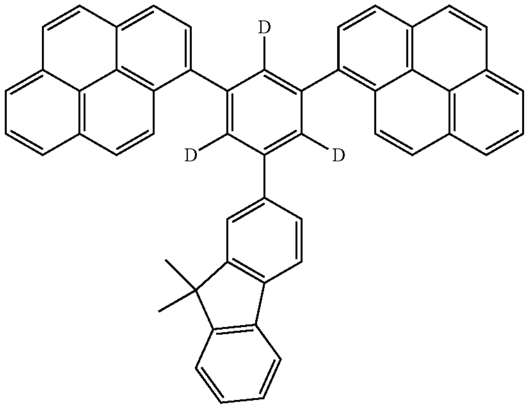

-continued
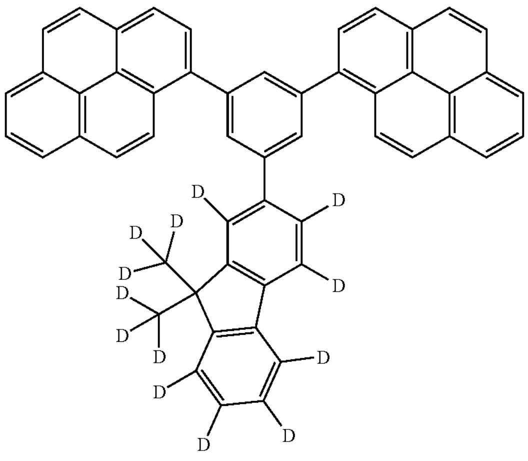
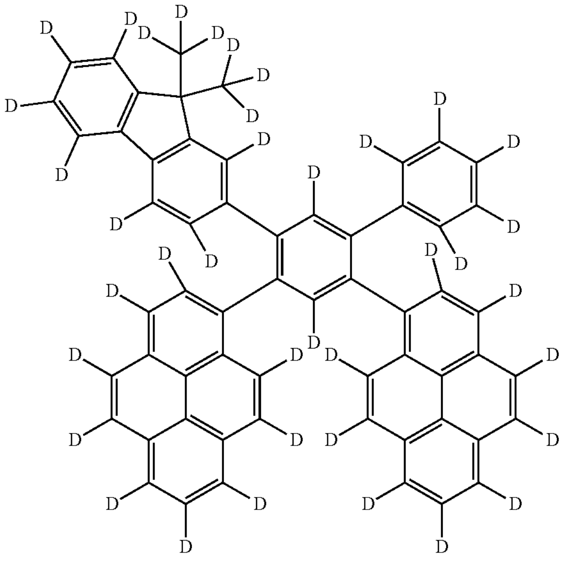
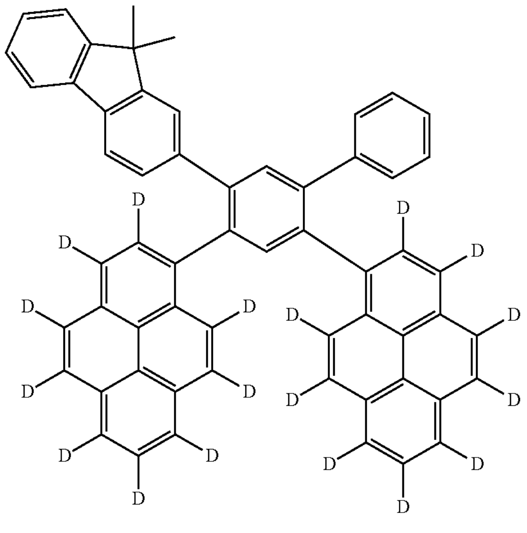
-continued
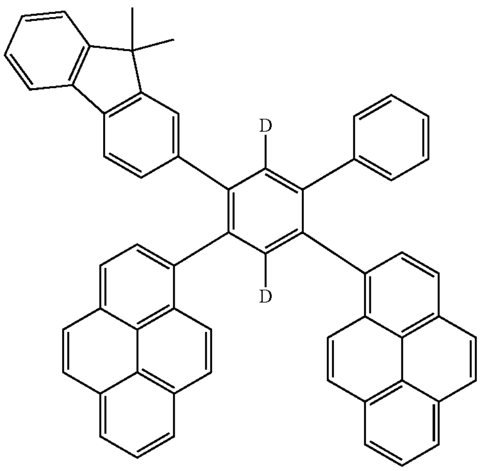
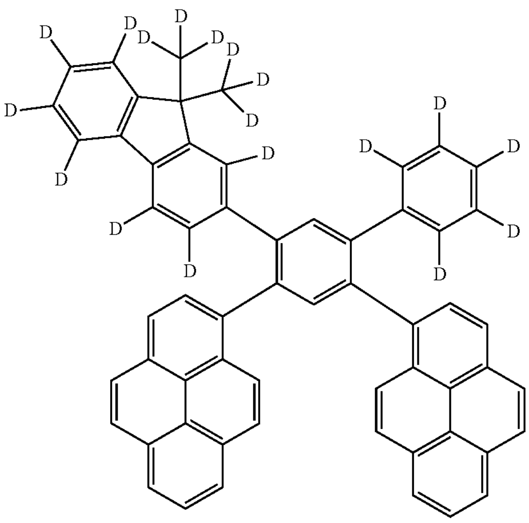
[Formula 215]
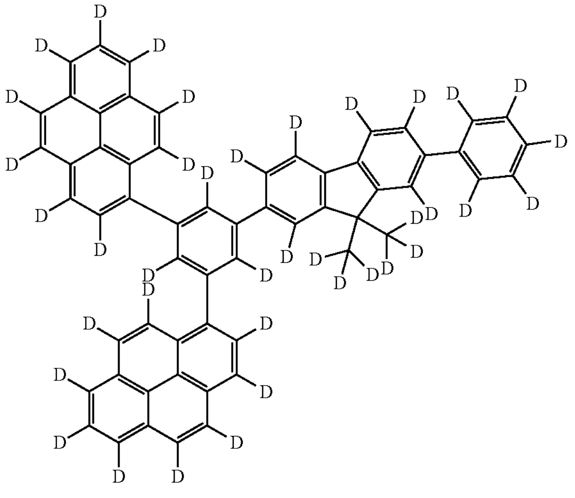

-continued
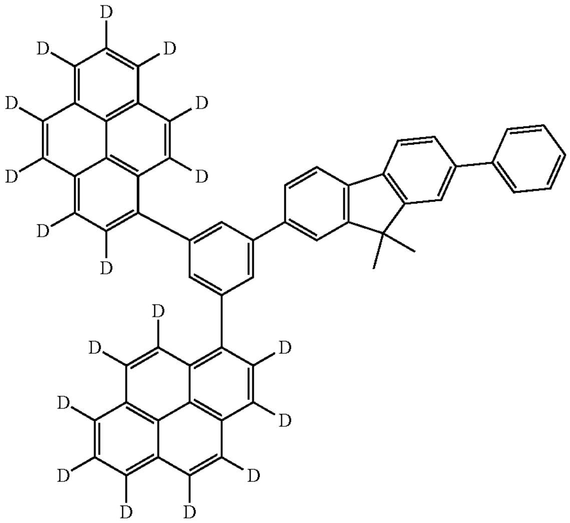
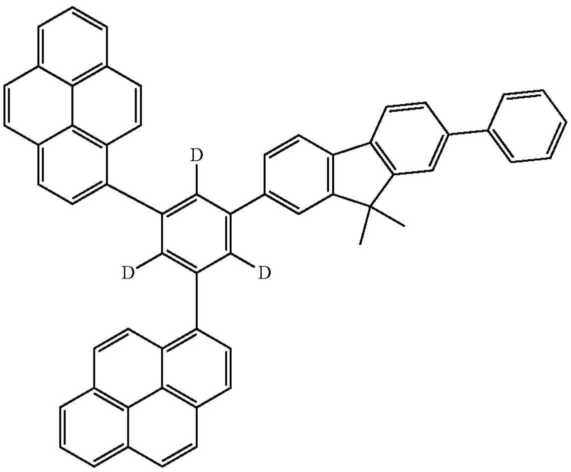
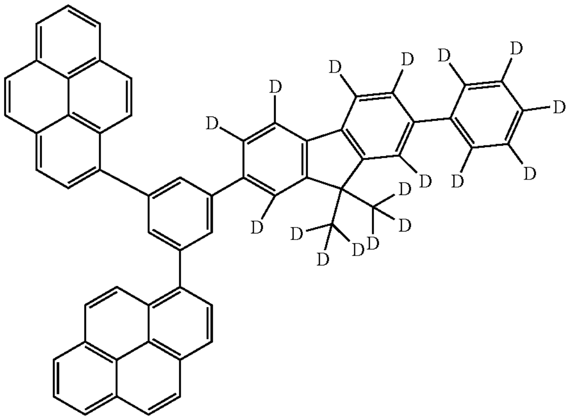
-continued
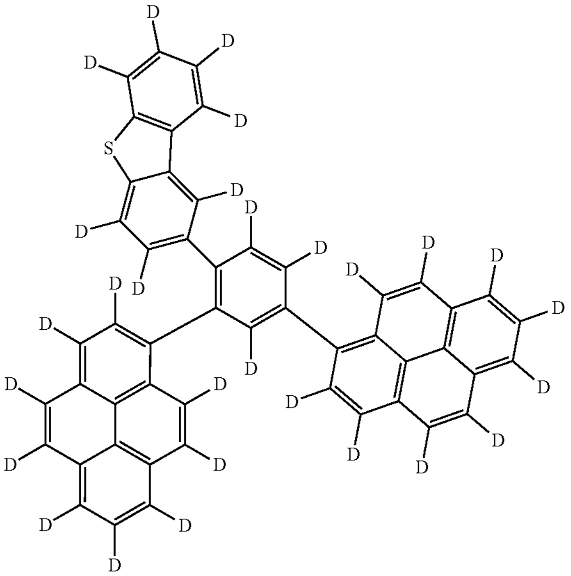
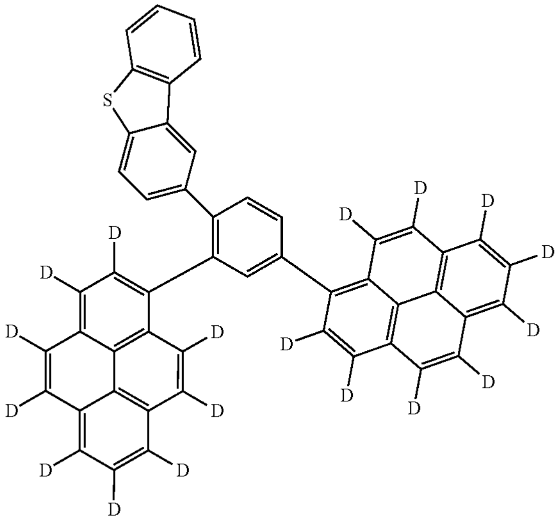
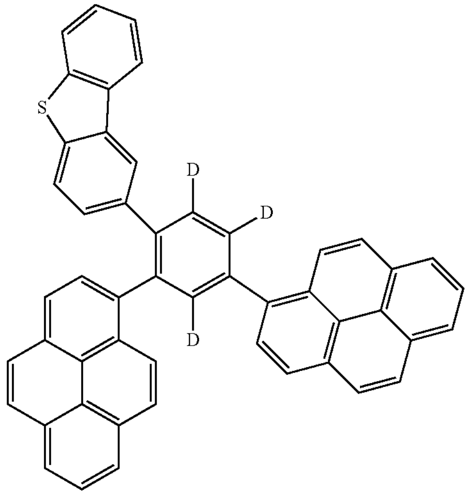

-continued
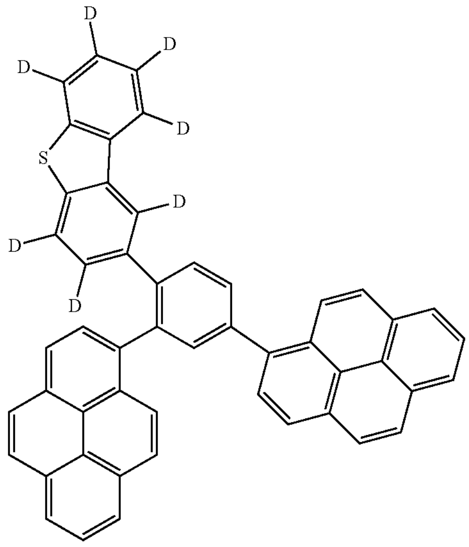
[Formula 216]
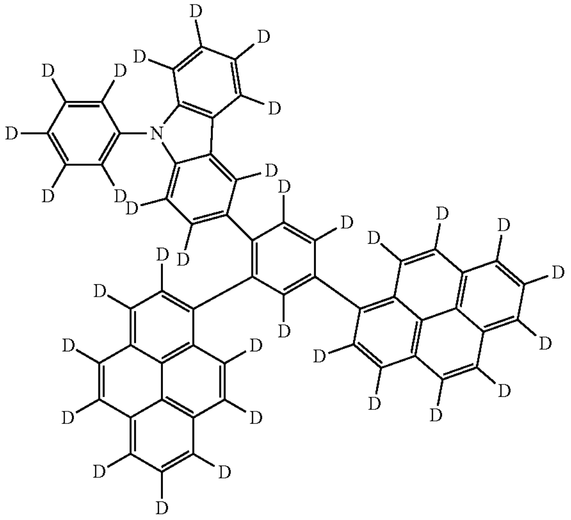
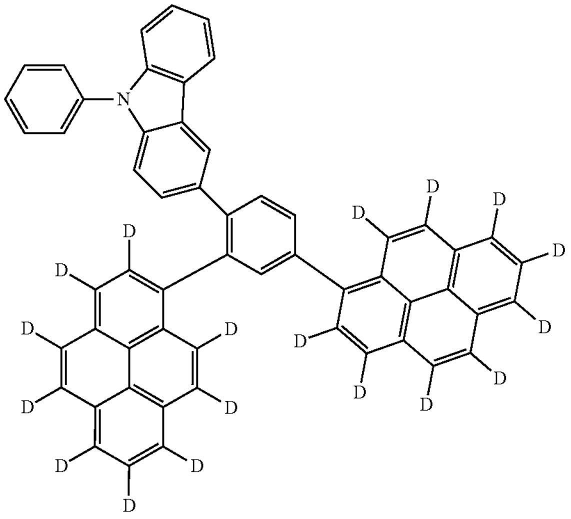
-continued
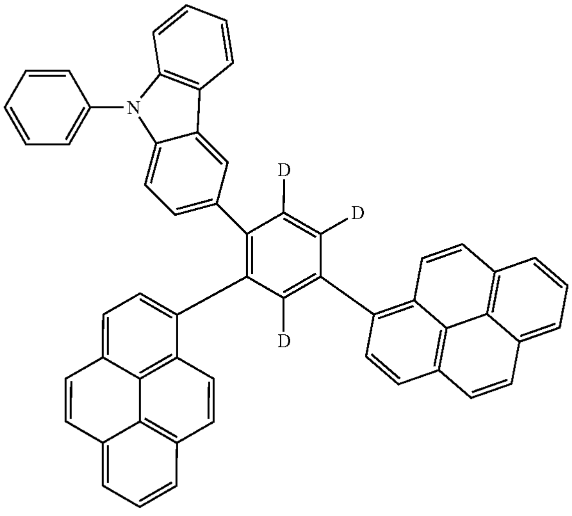
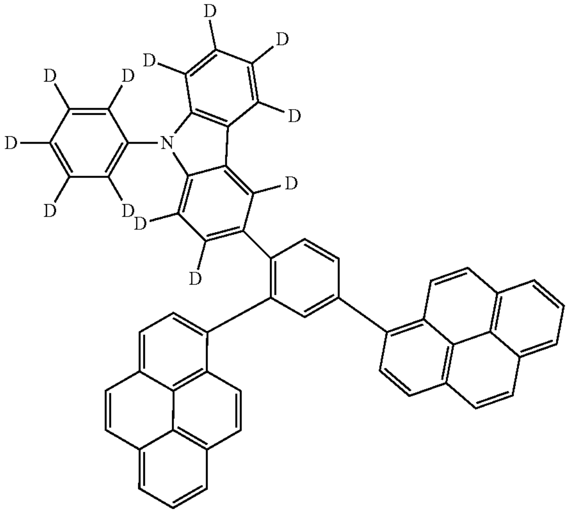
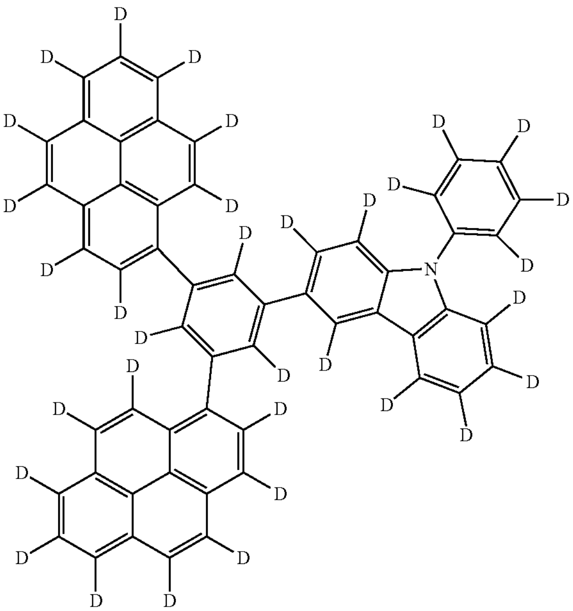

-continued
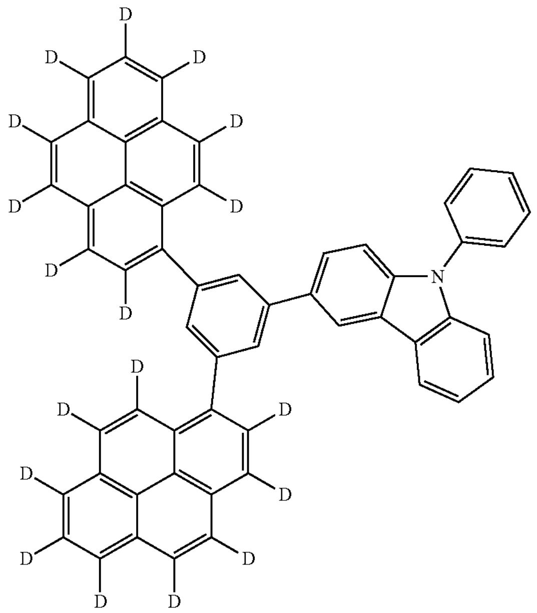
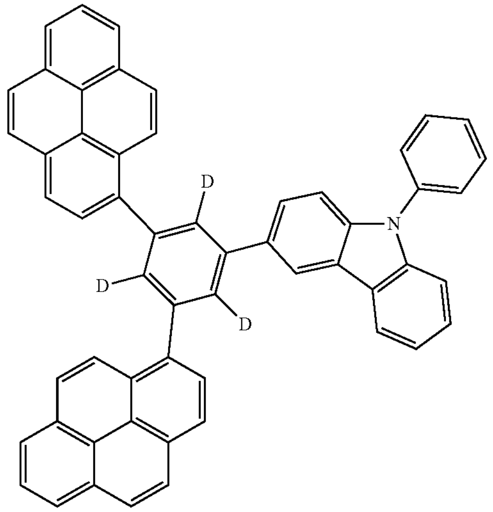
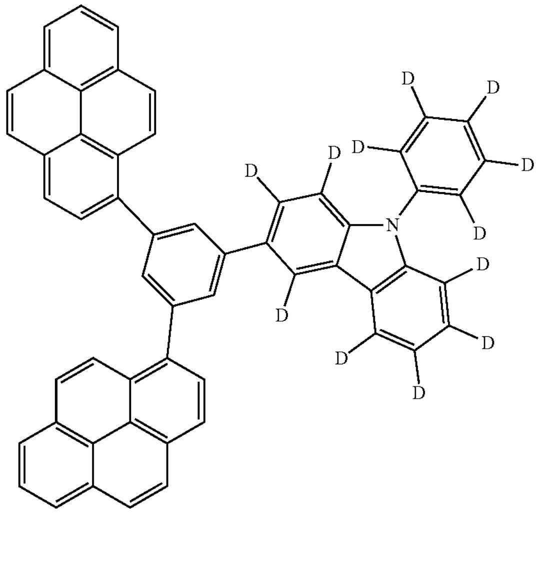
-continued
[Formula 217]
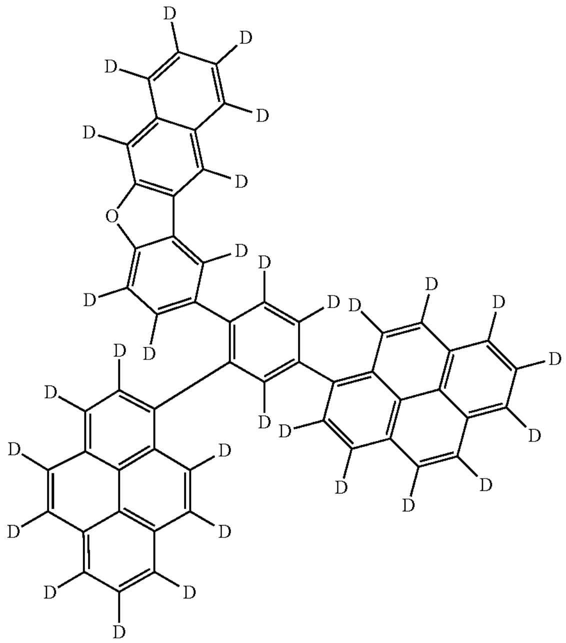
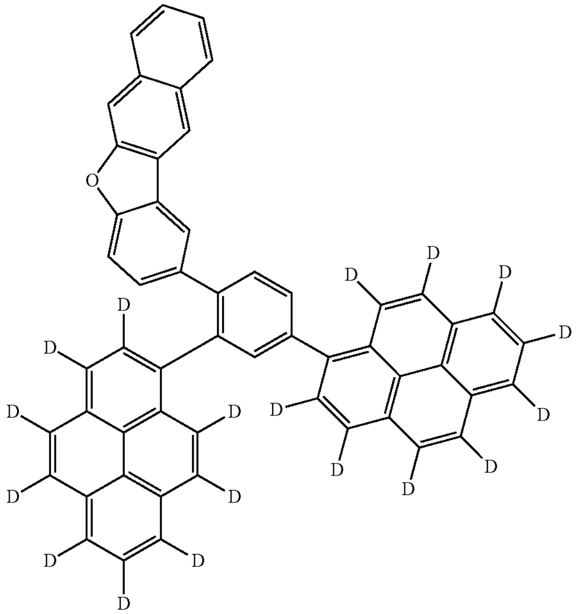

-continued
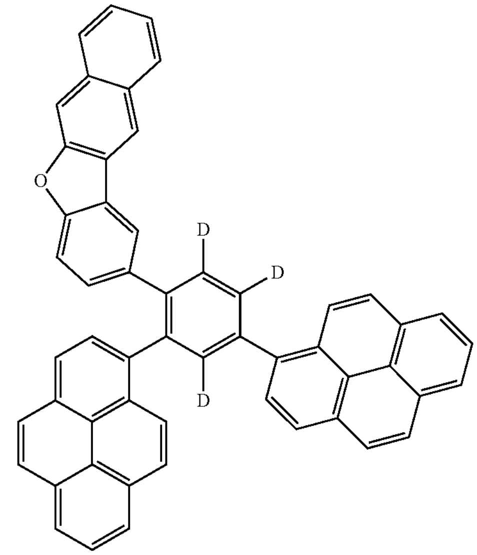
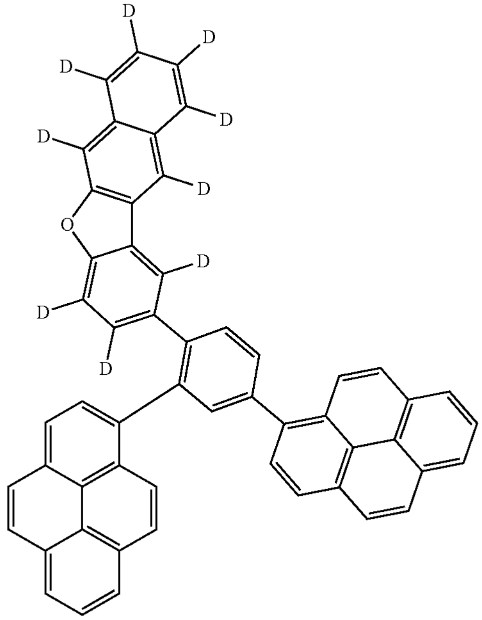
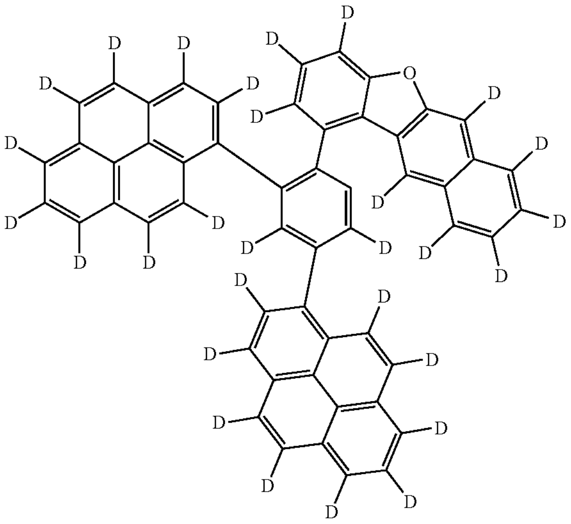
-continued
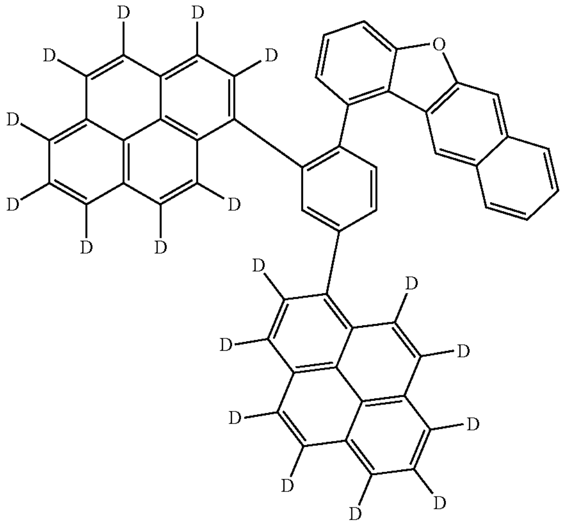
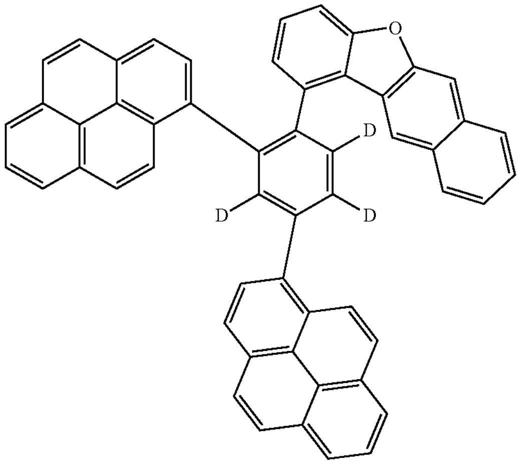
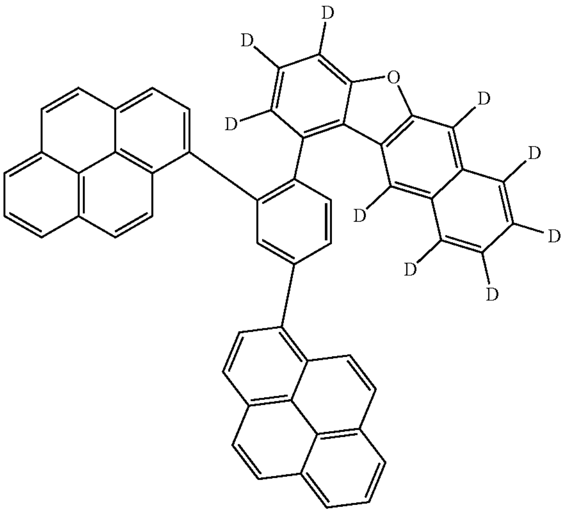

-continued
[Formula 218]
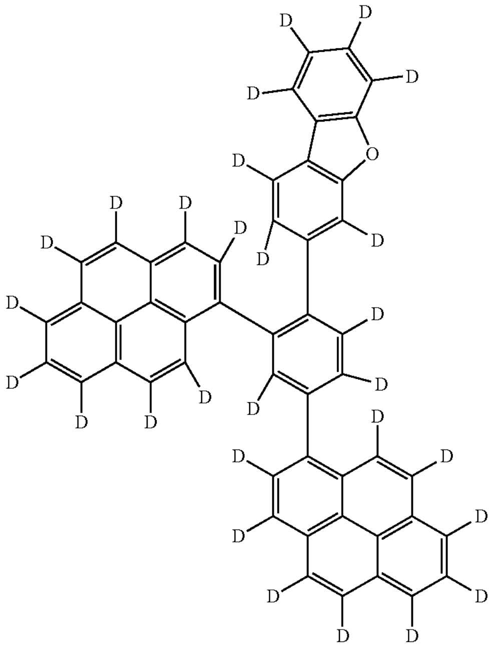
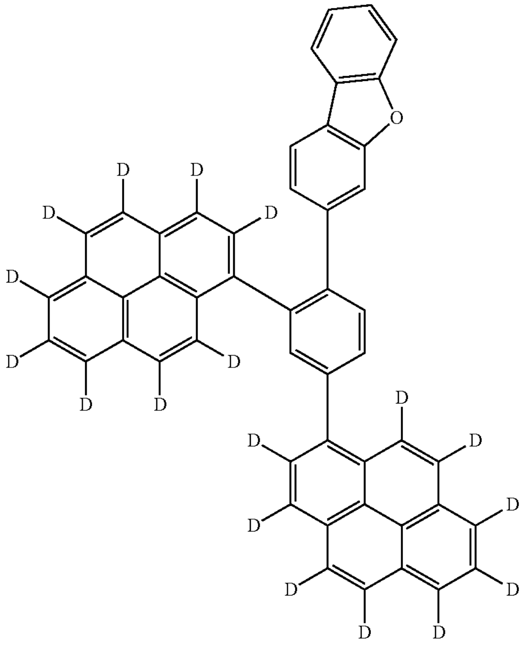
-continued
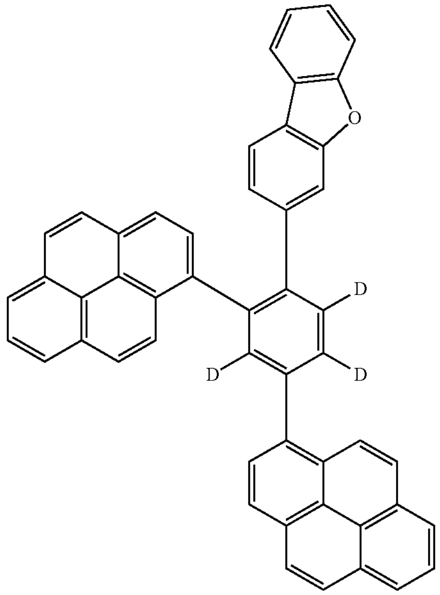
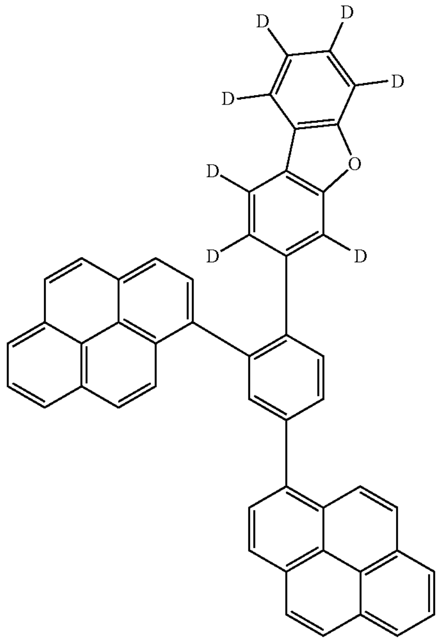

-continued
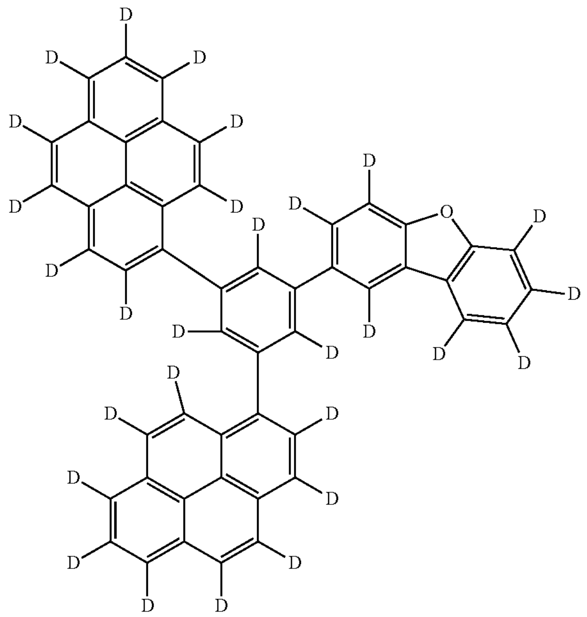
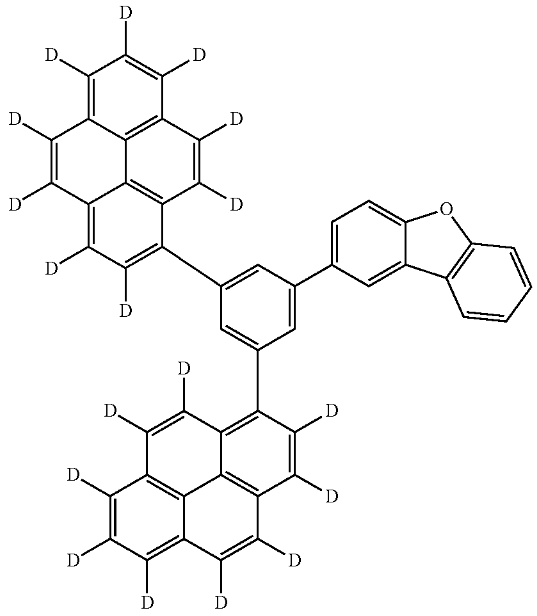
-continued
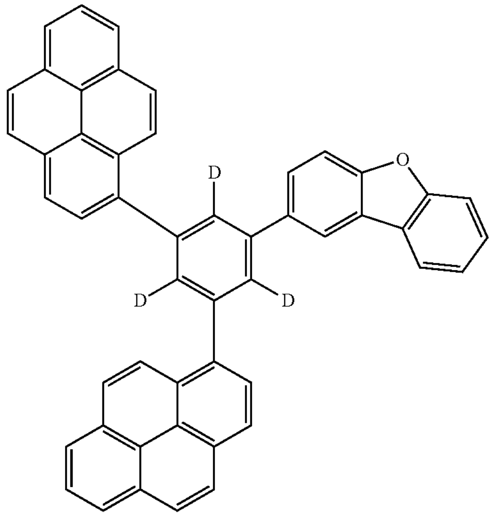
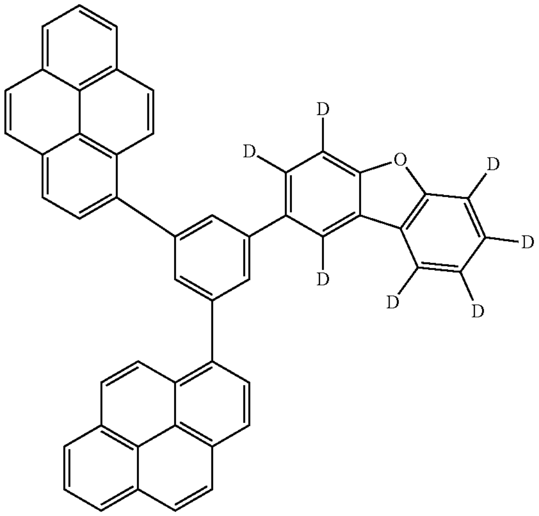
[Formula 219]
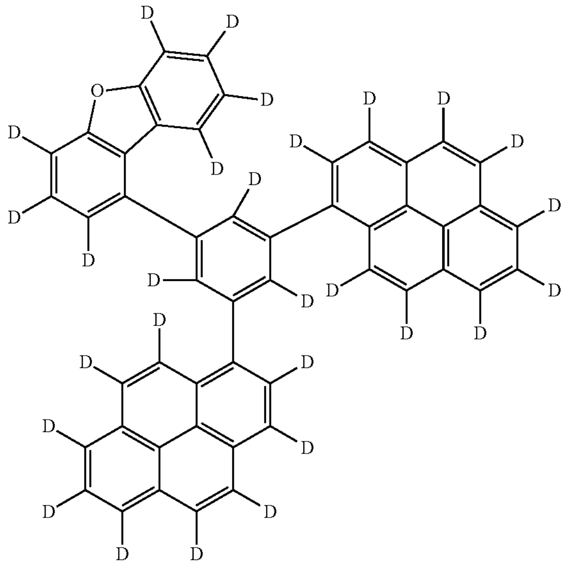

-continued
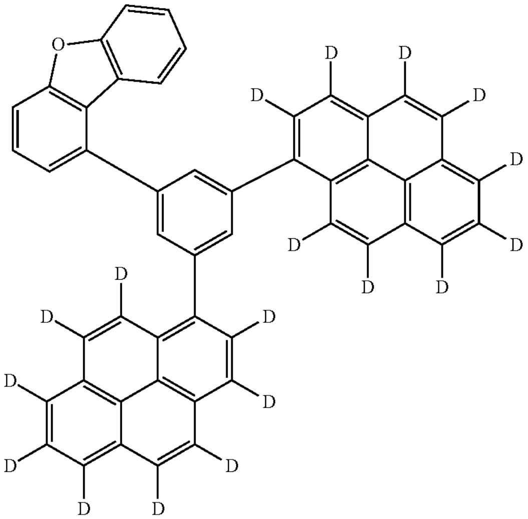
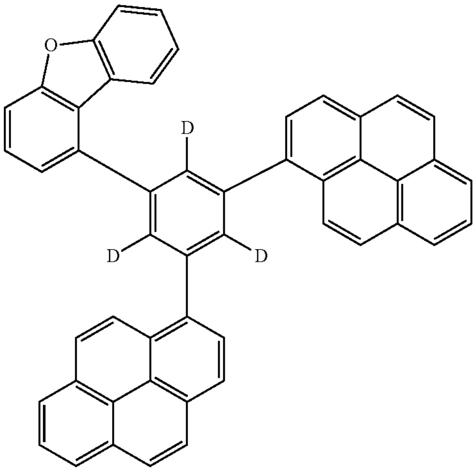
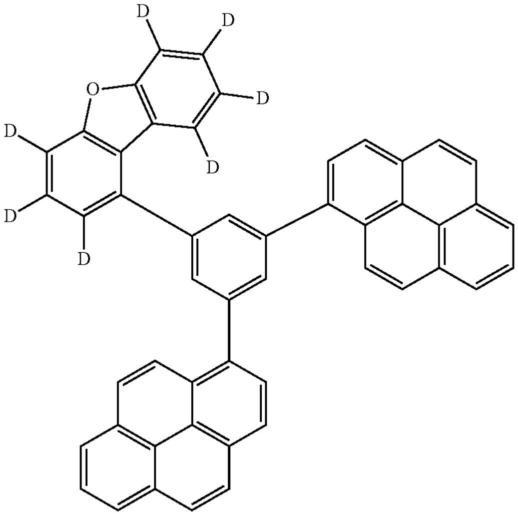
-continued
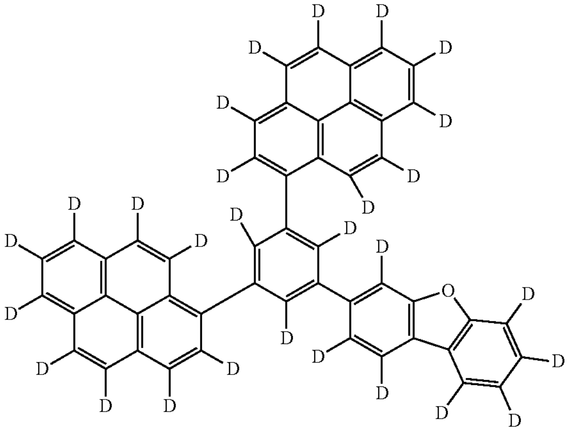
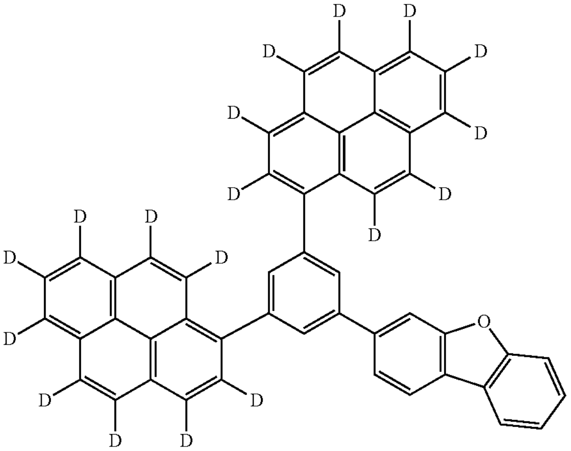
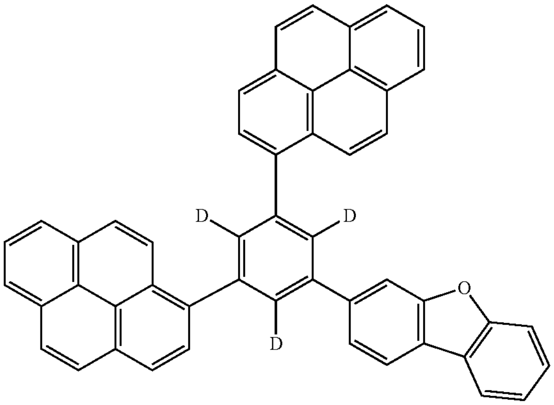
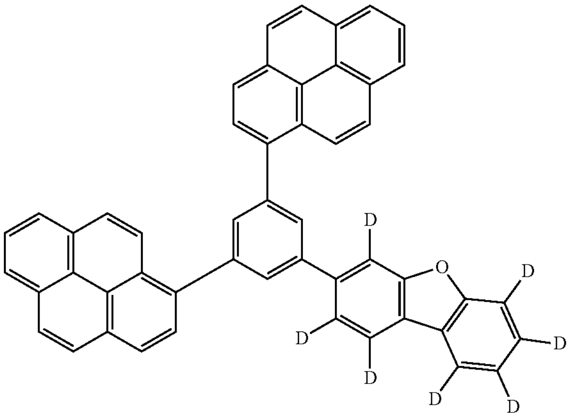

-continued
[Formula 220]
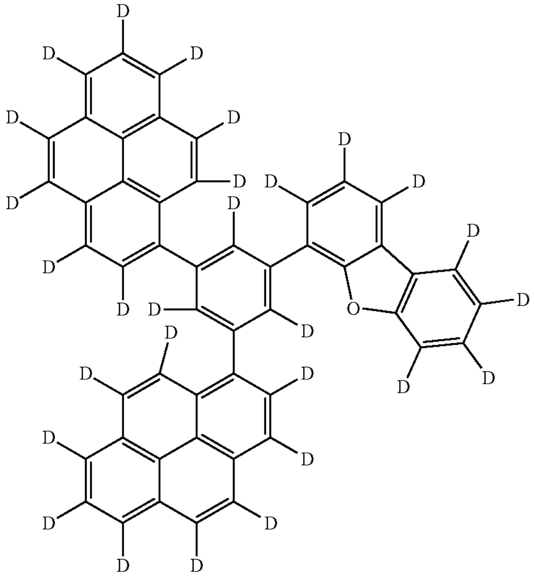
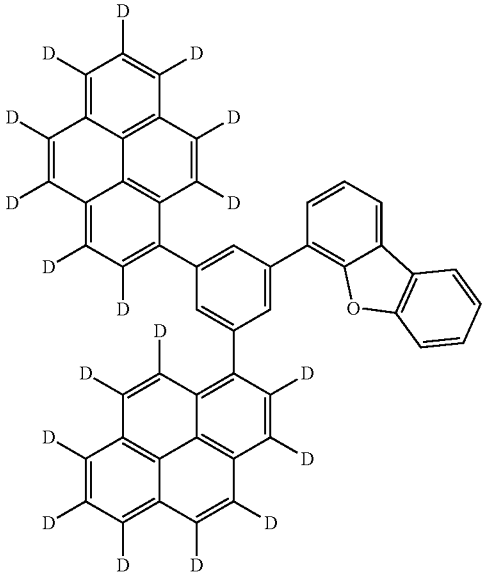
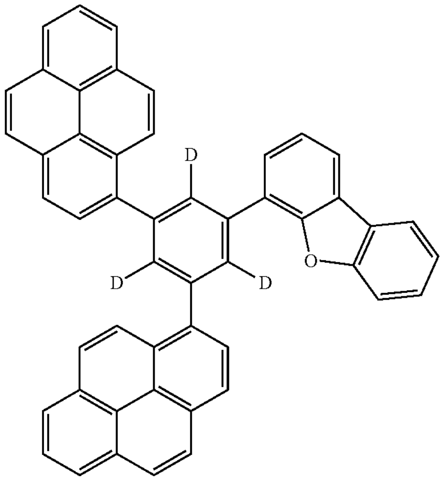
-continued
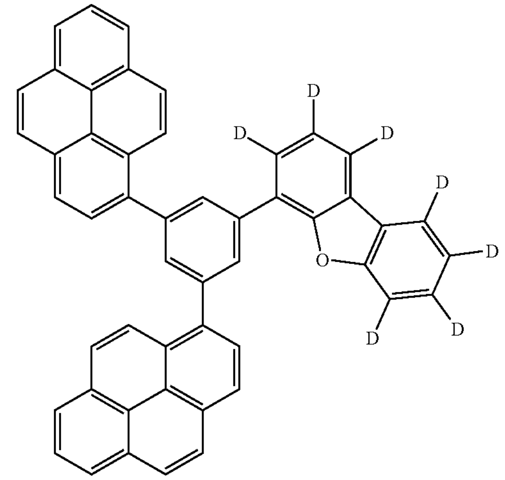
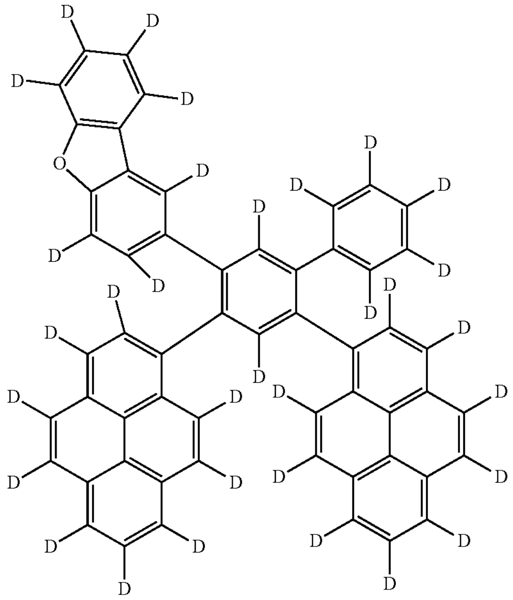
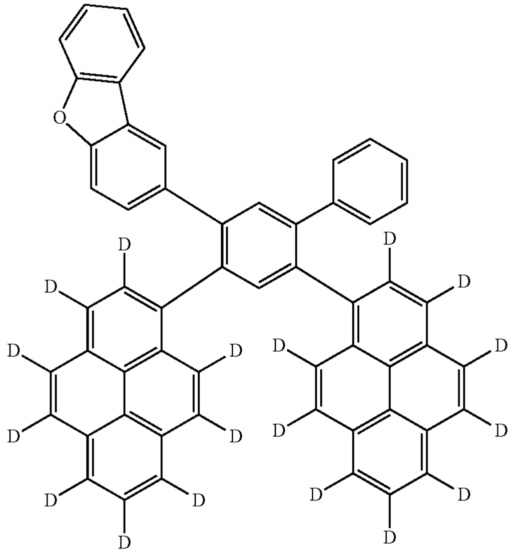

-continued
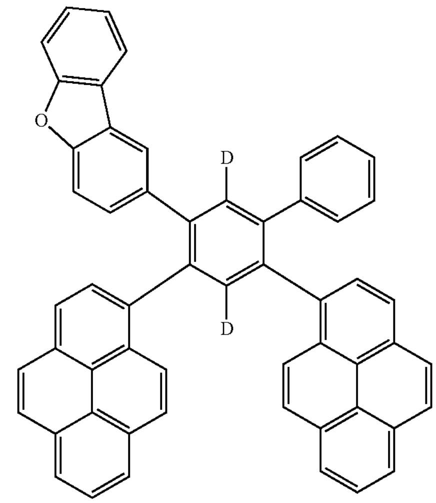
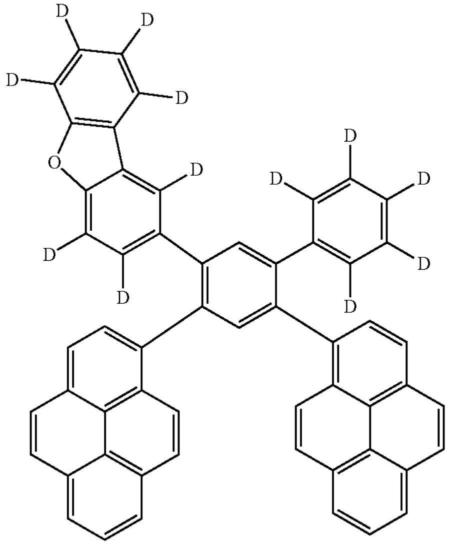
[Formula 221]
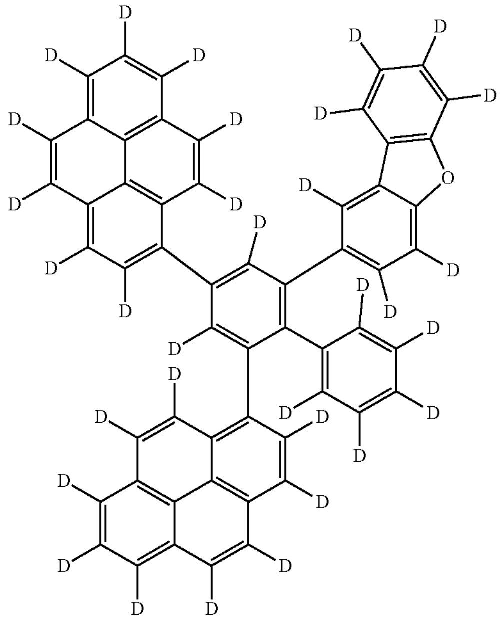
-continued
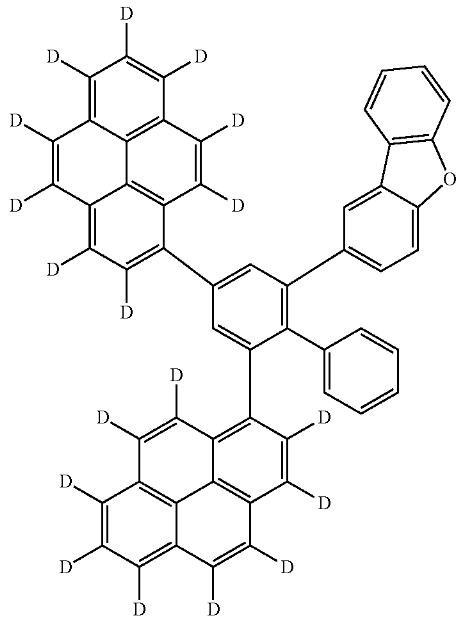
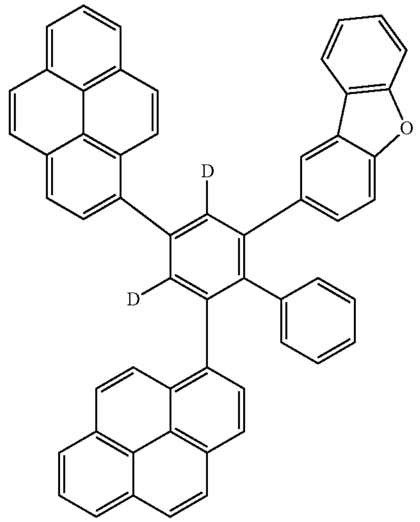
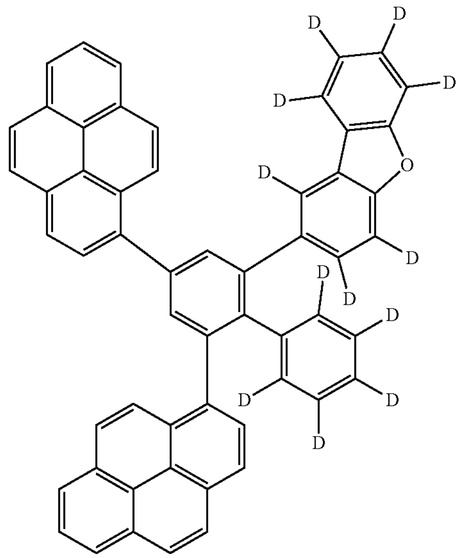

-continued
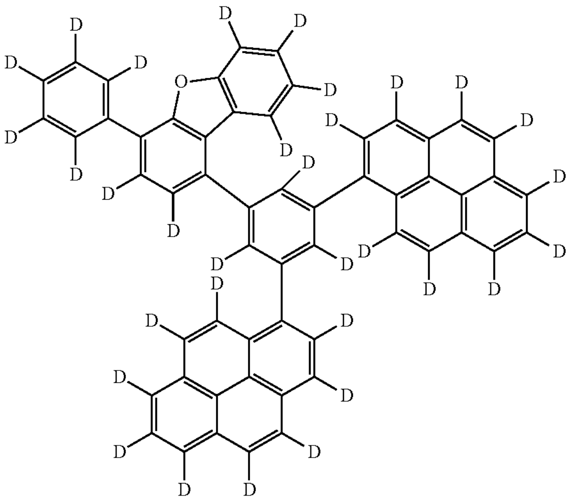
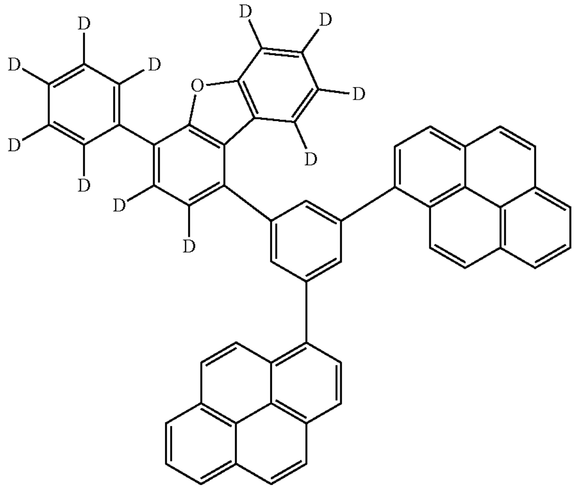
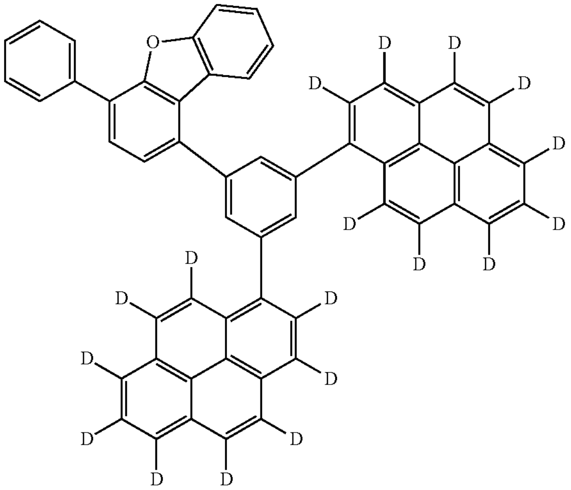
[Formula 222]
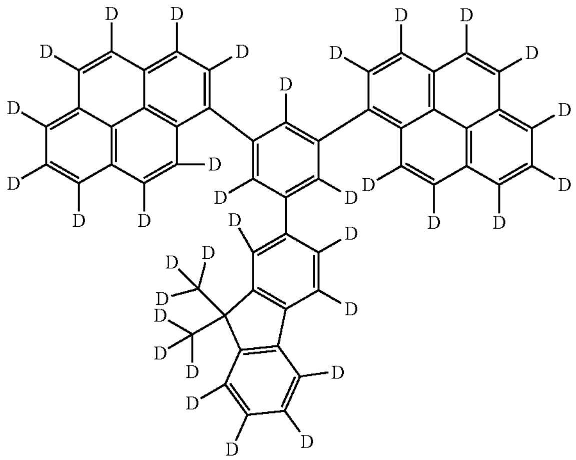
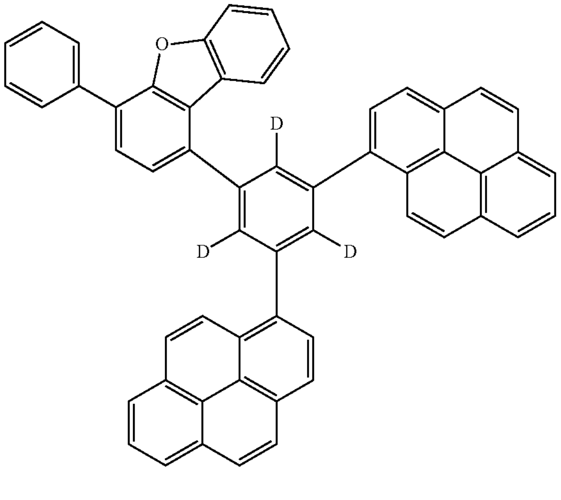
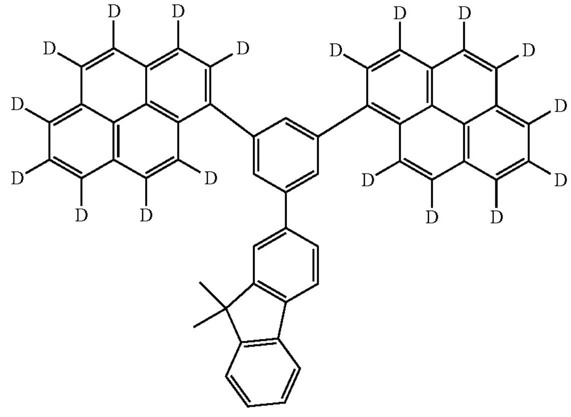

-continued
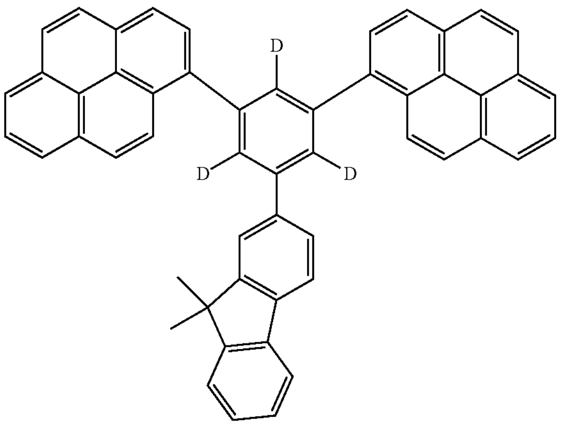
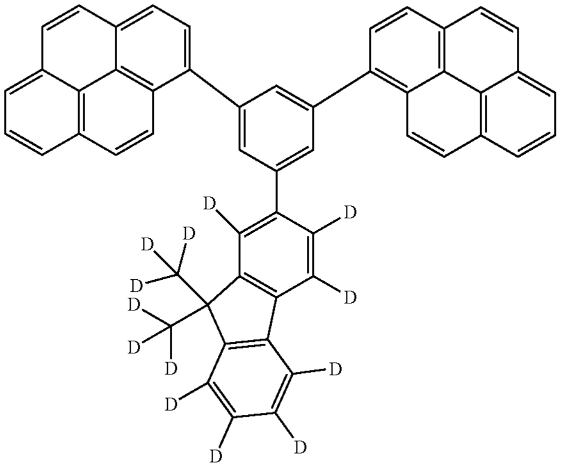
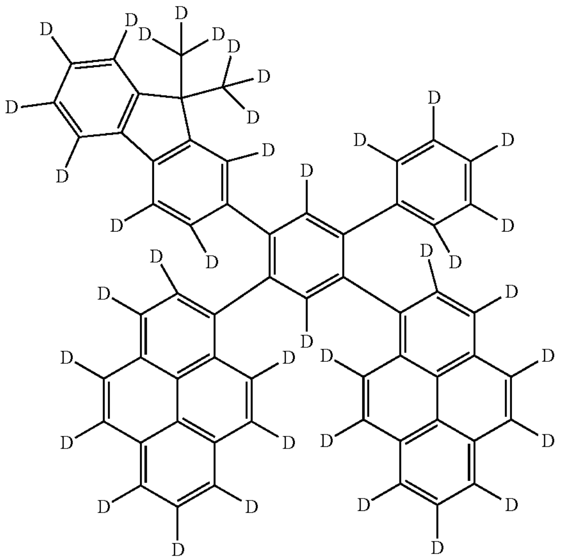
-continued
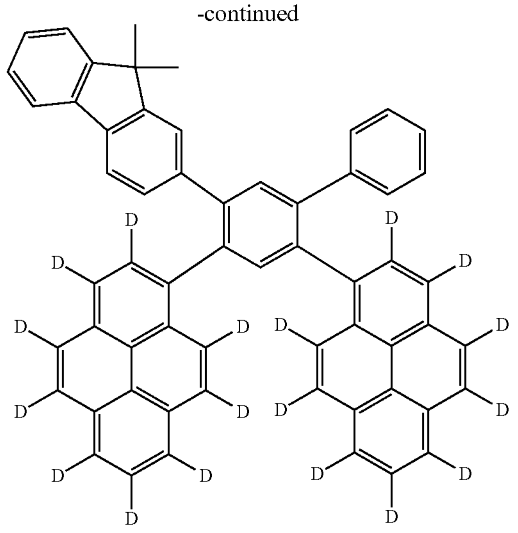
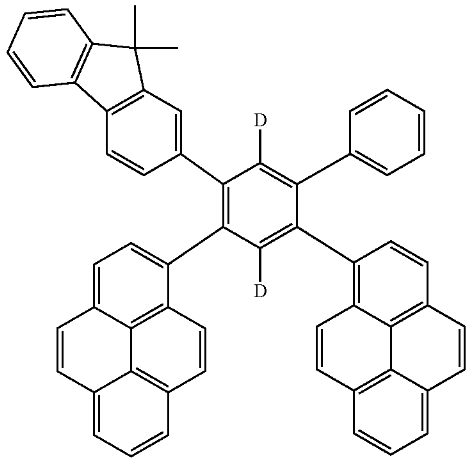
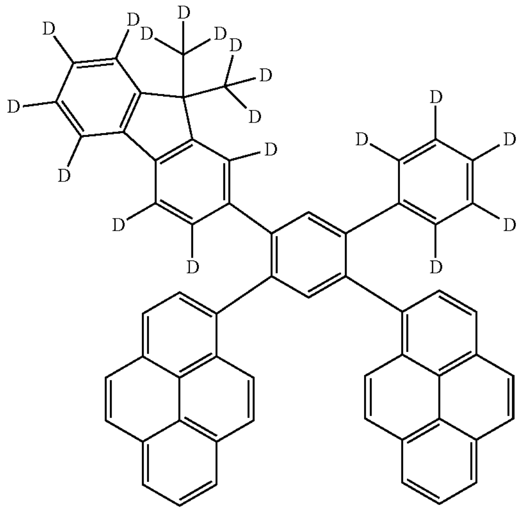

-continued
[Formula 223]
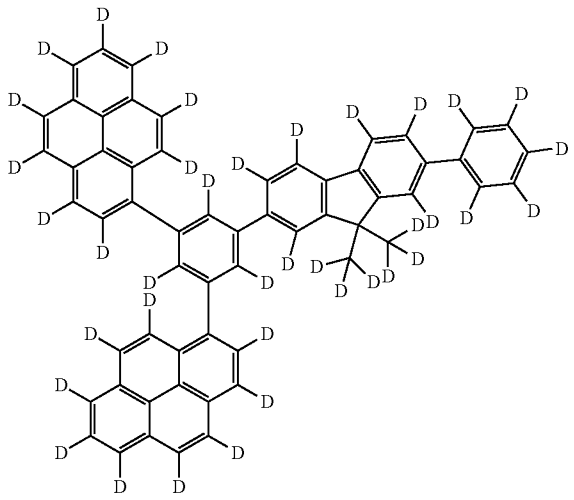
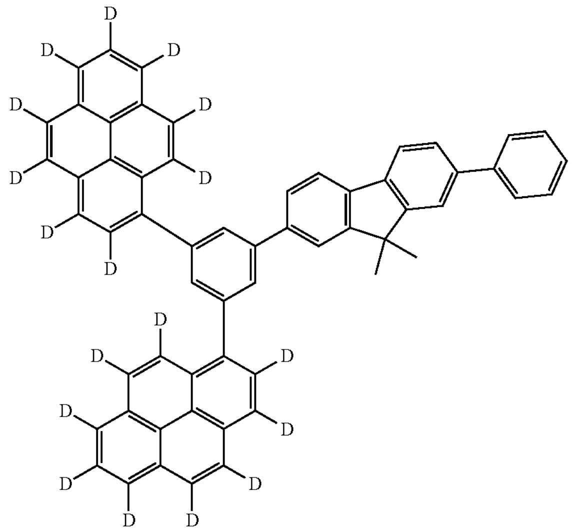
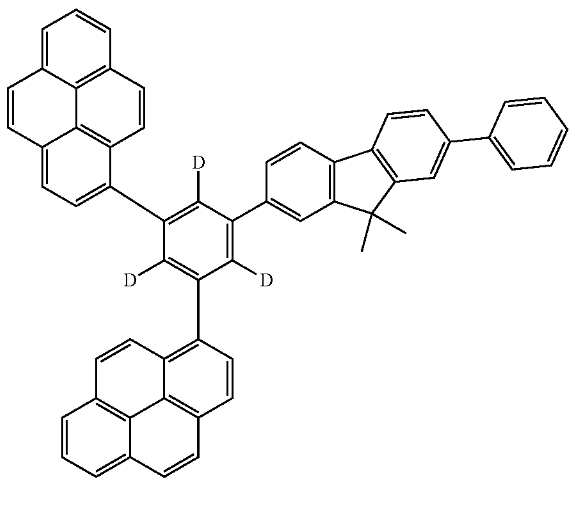
-continued
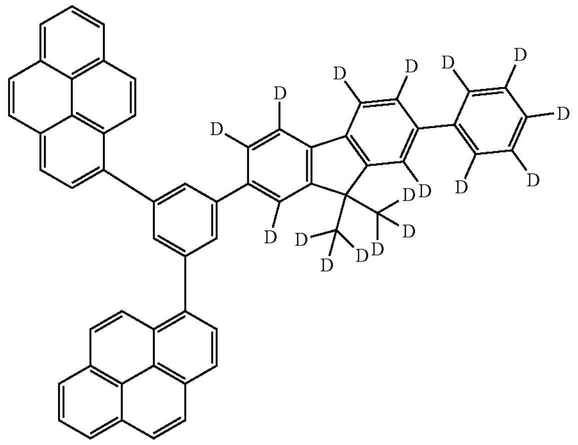
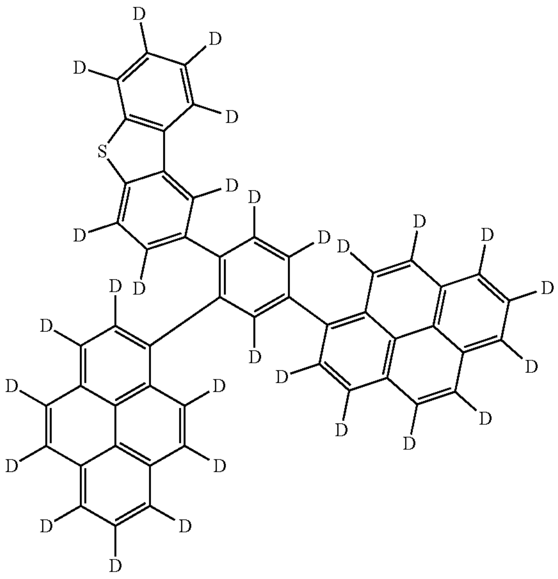
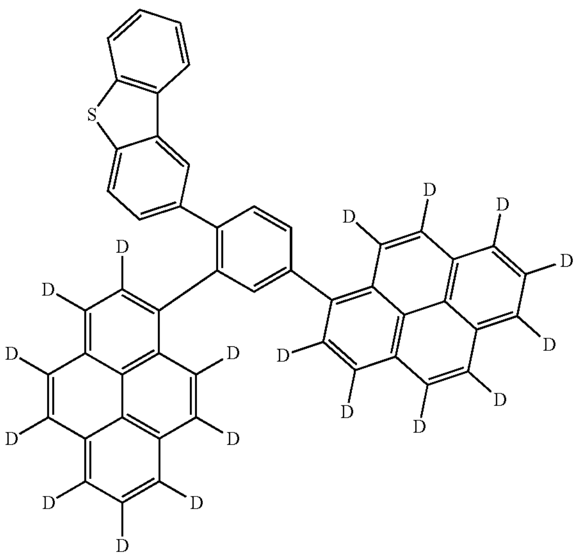

-continued
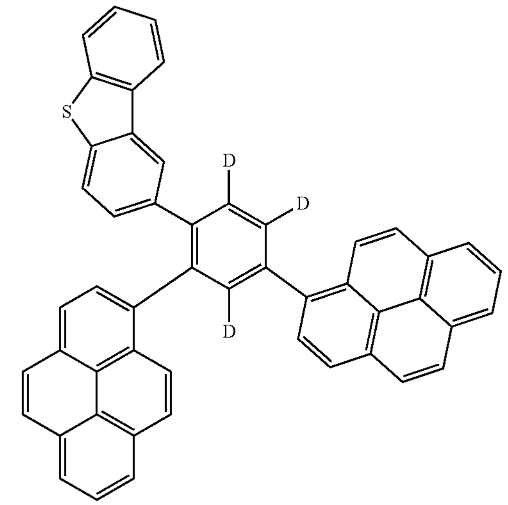
-continued
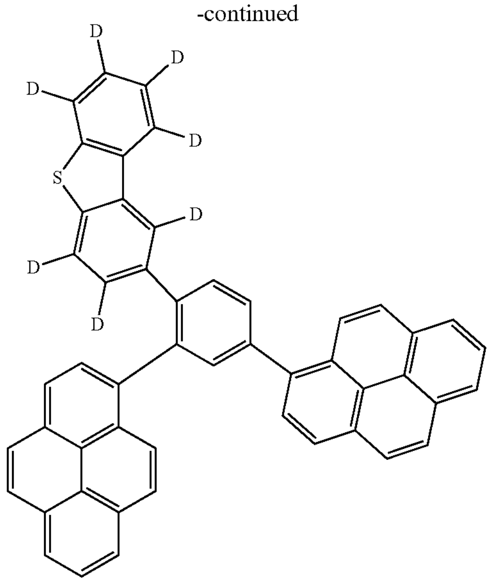
[Formula 224]
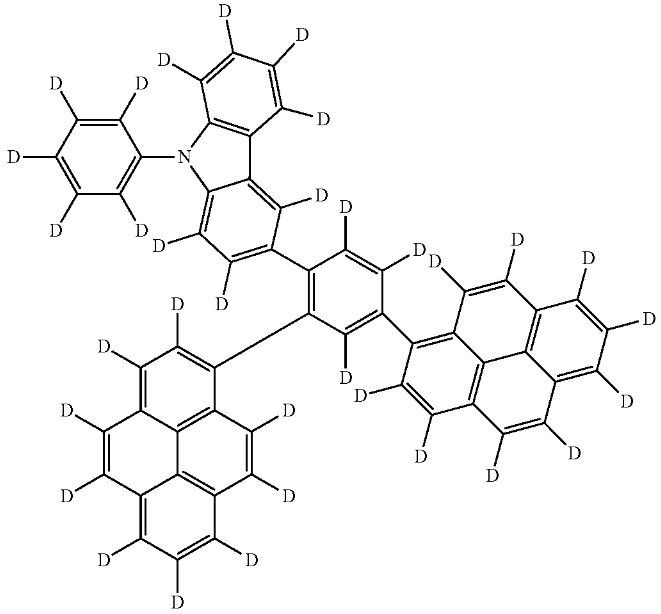

-continued
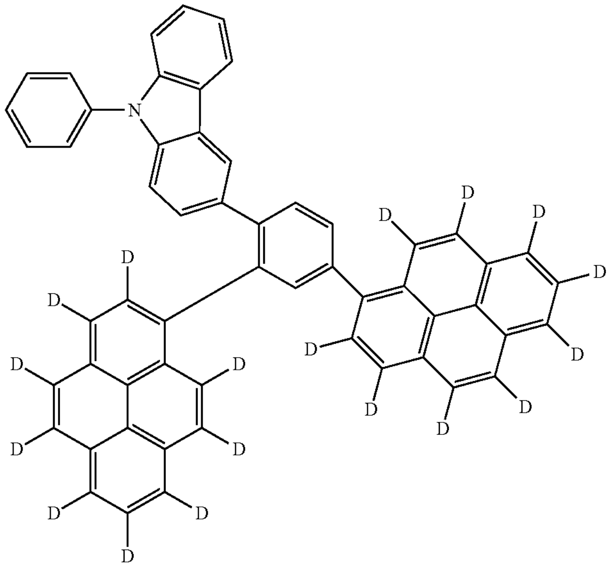
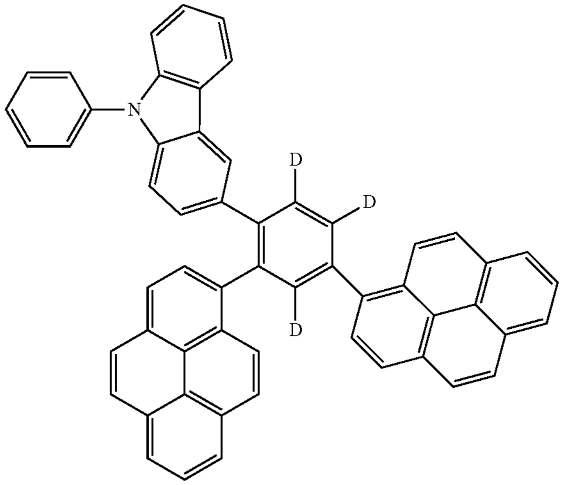
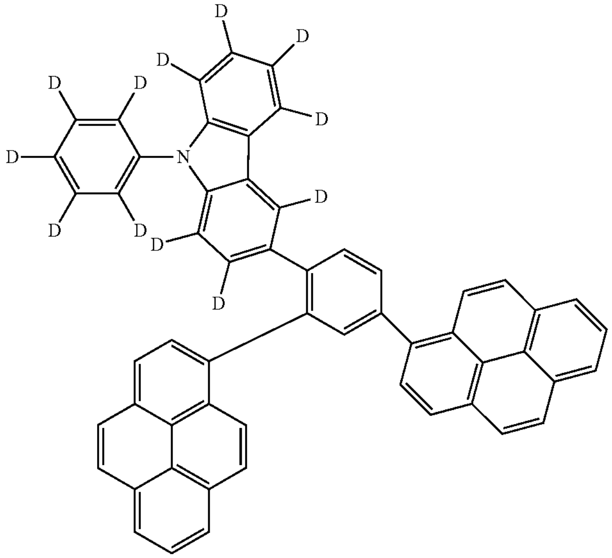

-continued
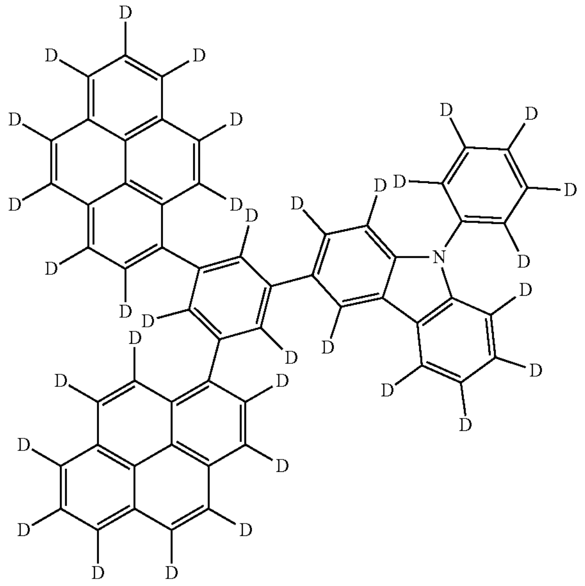
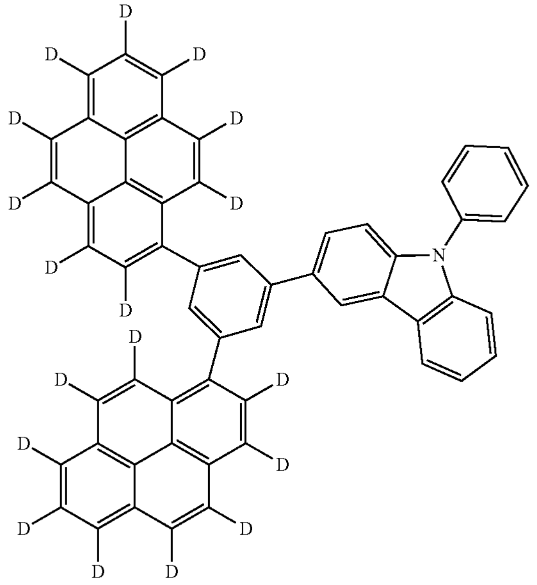
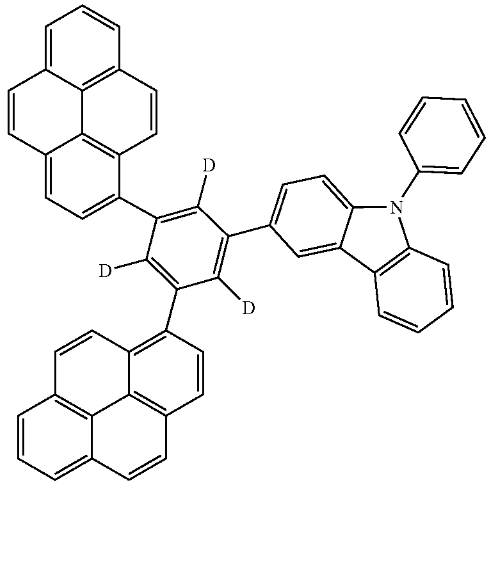
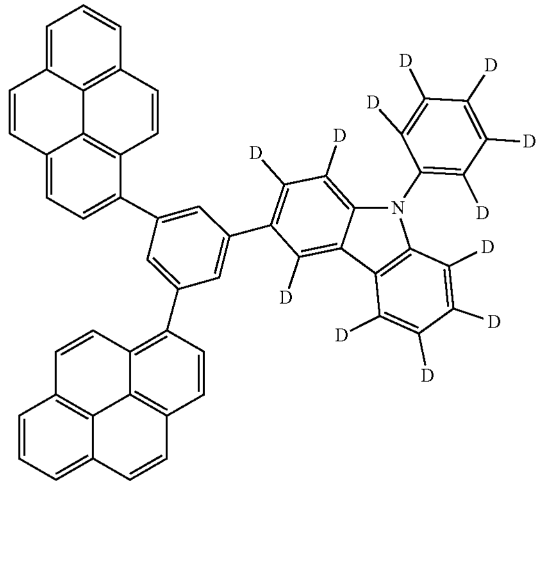

-continued
[Formula 225]
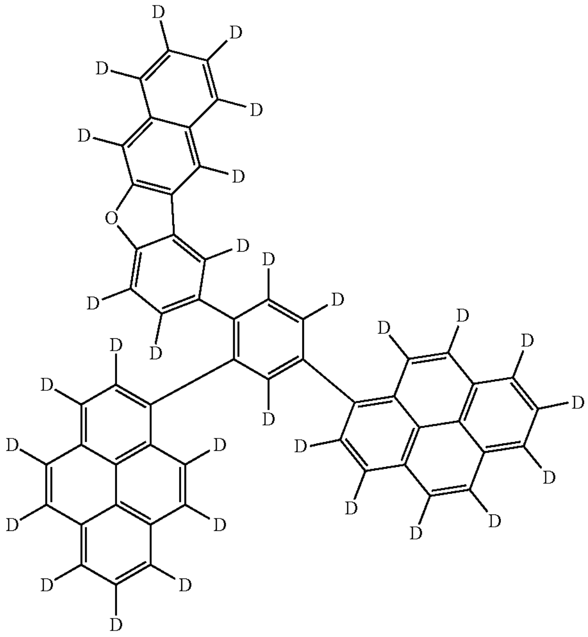
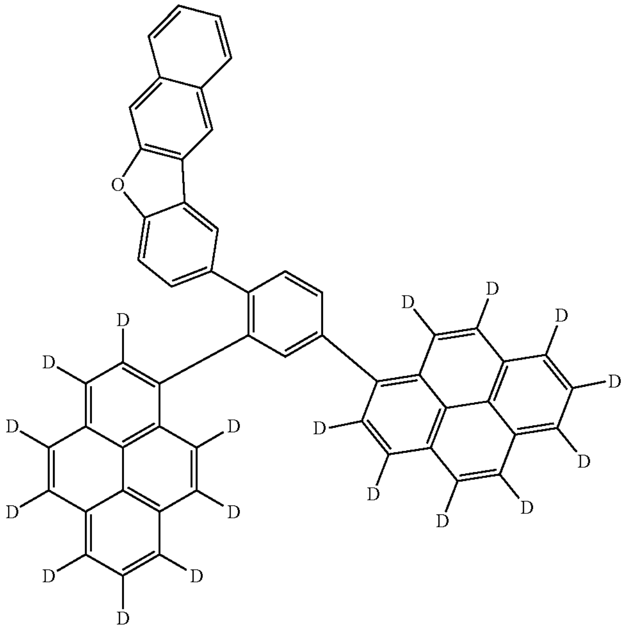

-continued
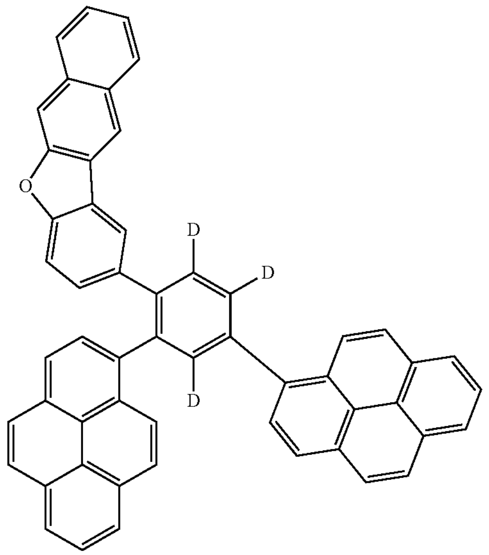
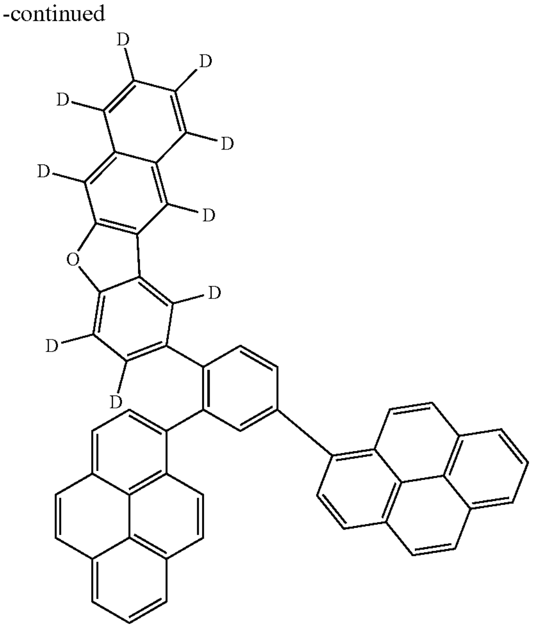
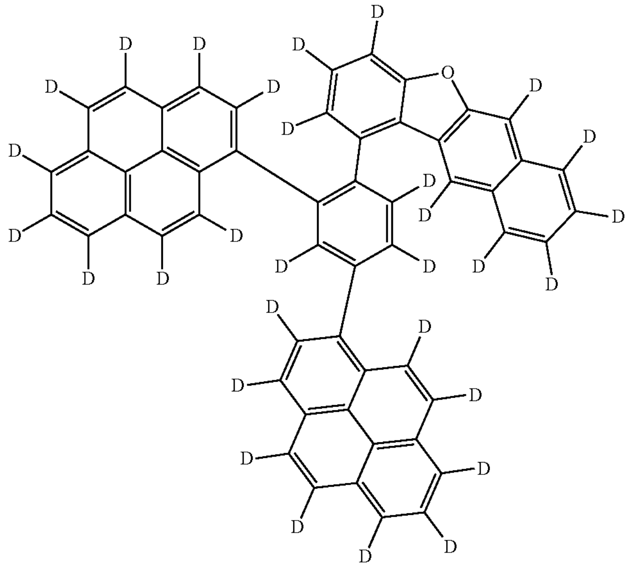
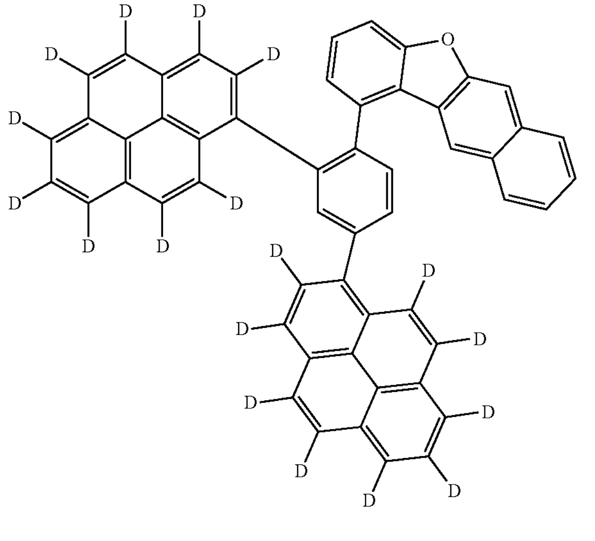

-continued
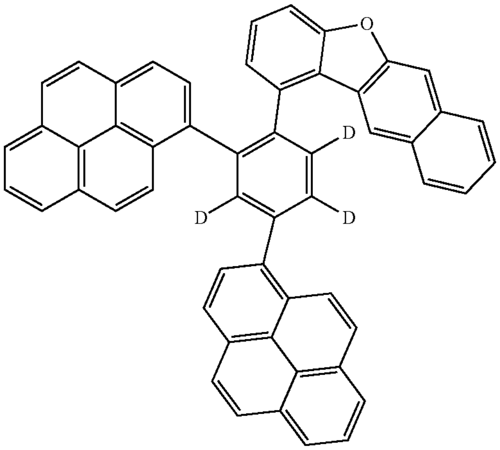
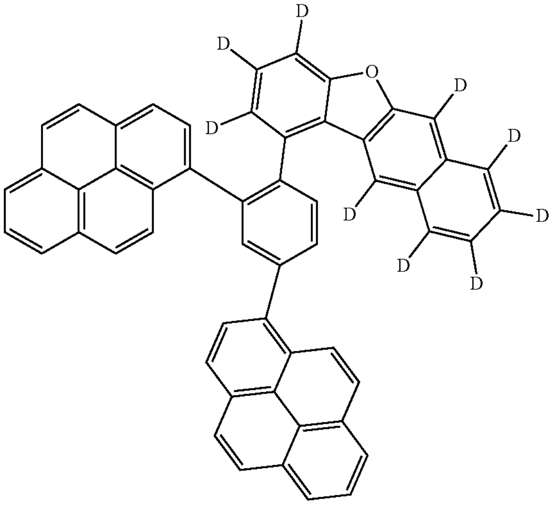
[Formula 226]
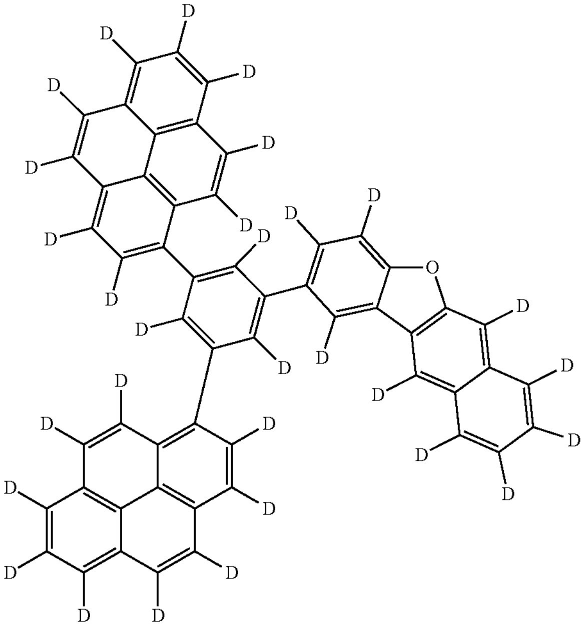

-continued
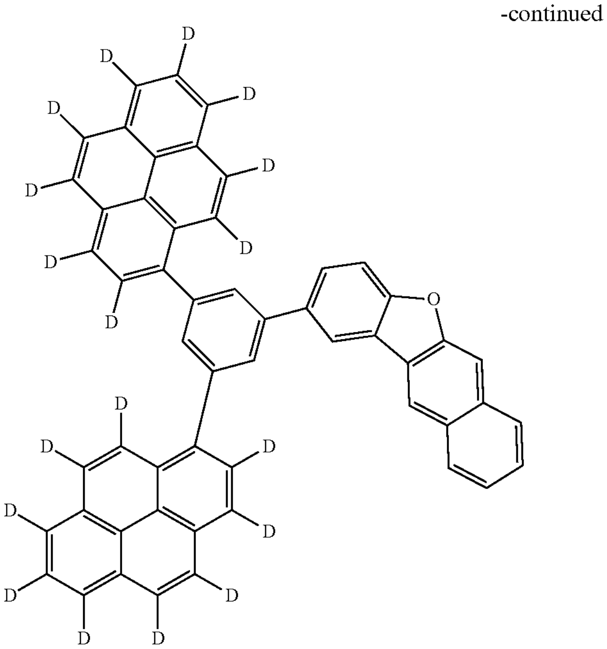
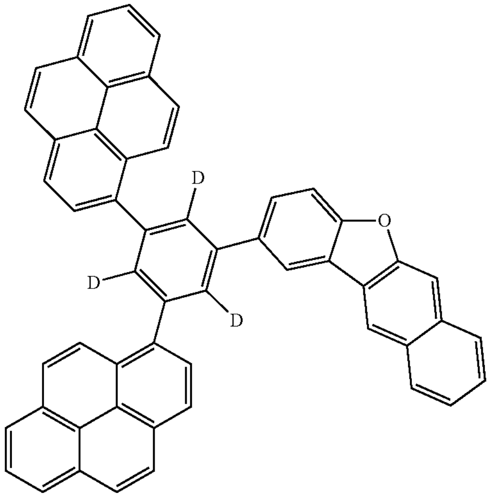
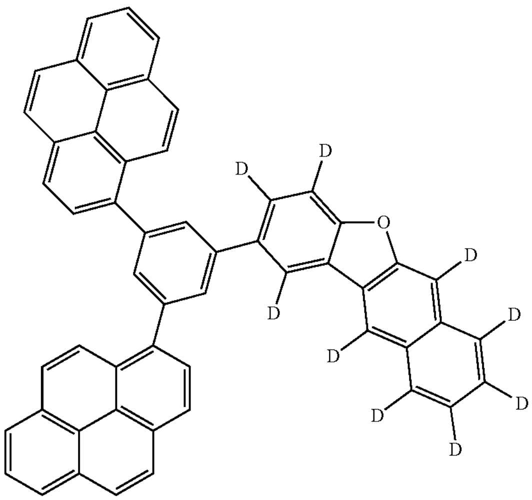
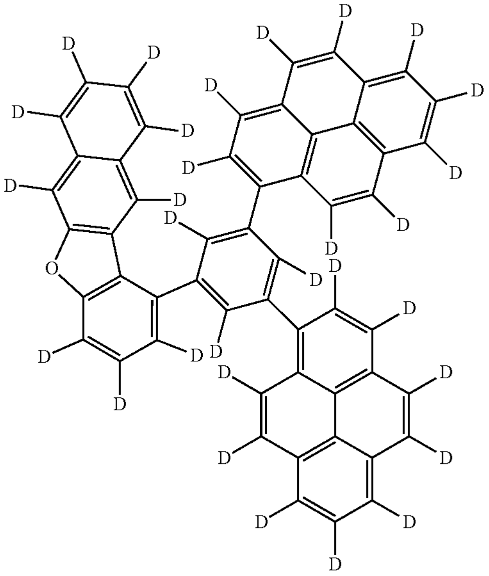
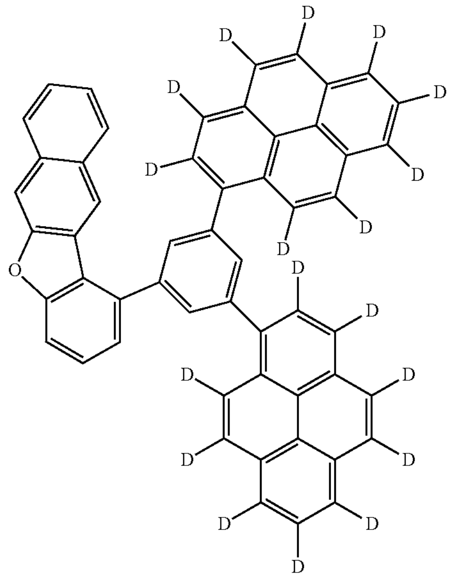

-continued
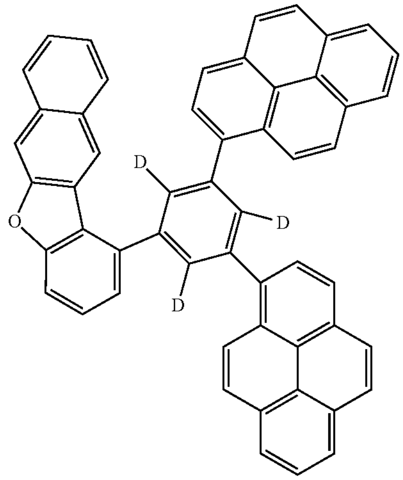
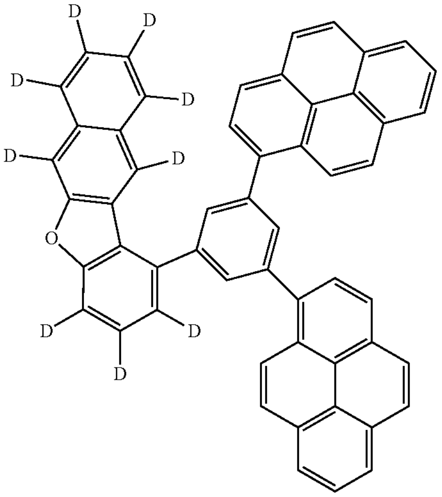
[Formula 227]
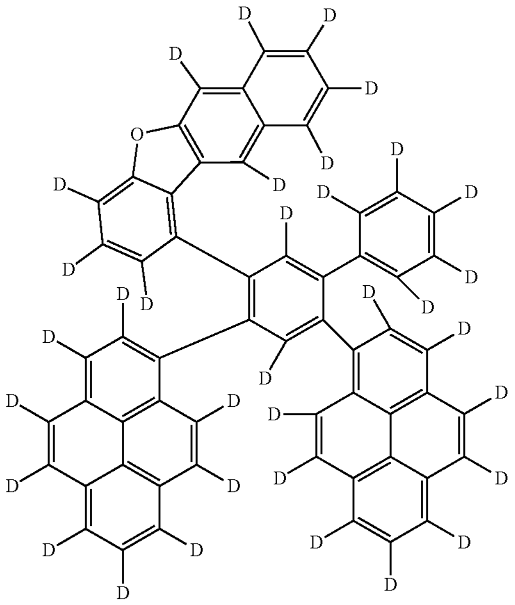
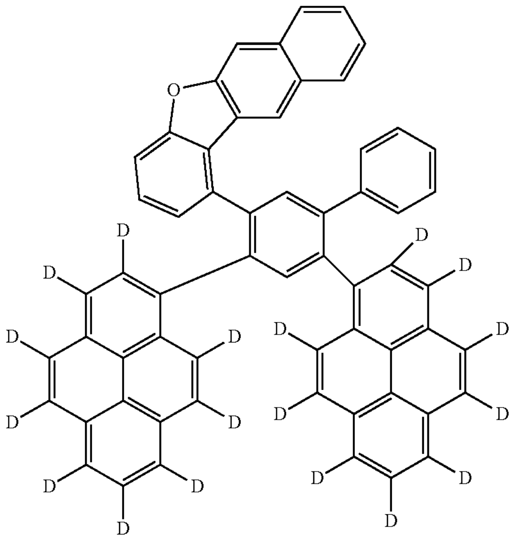
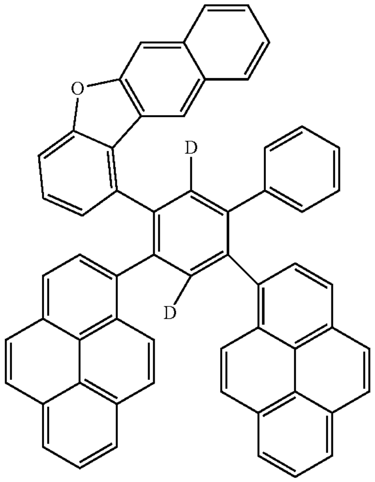
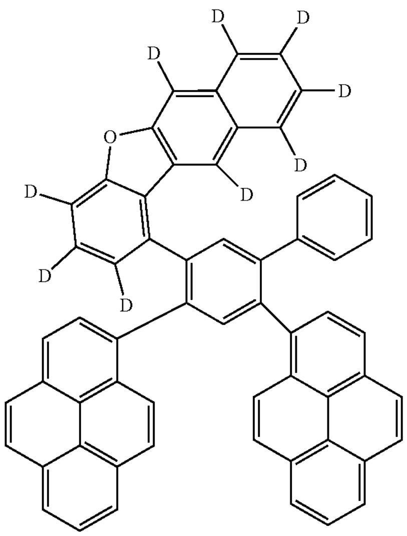

-continued
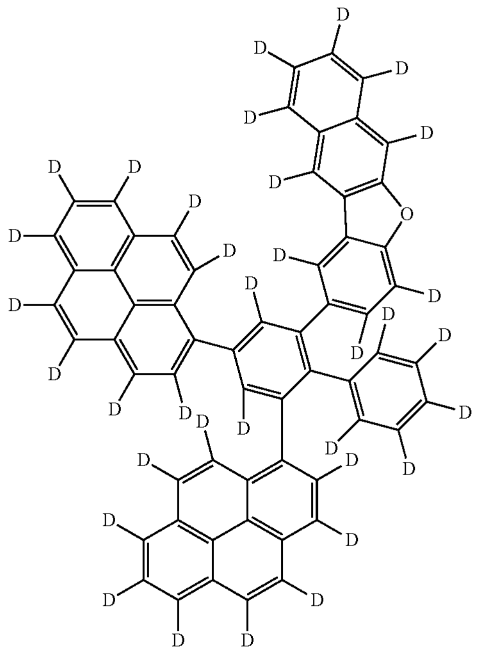
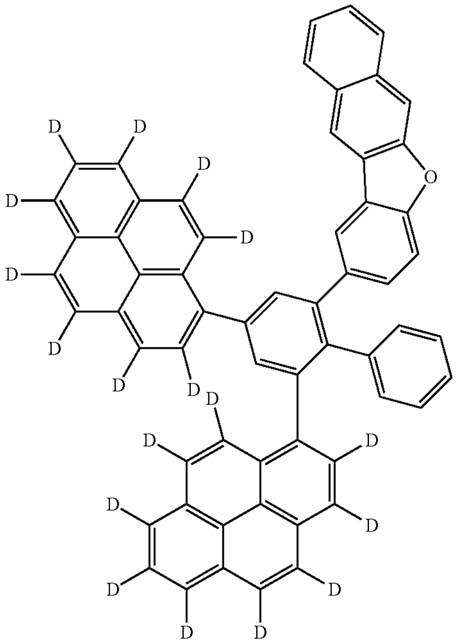
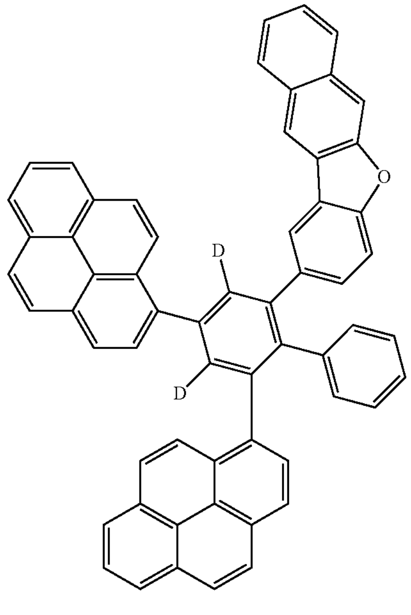
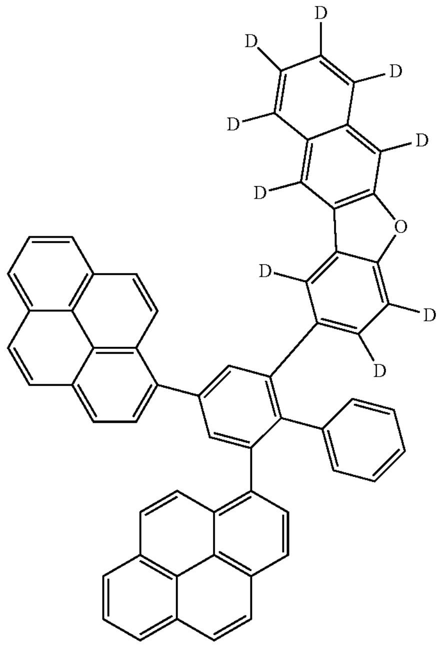

-continued
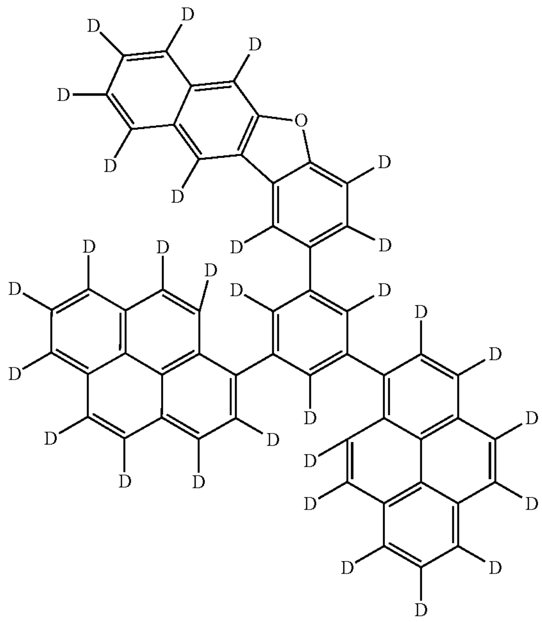
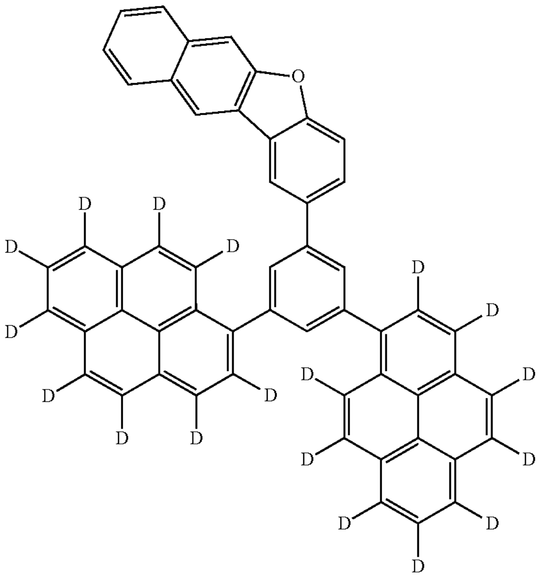
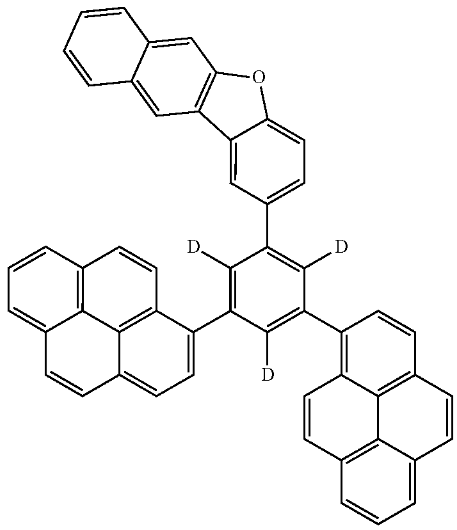
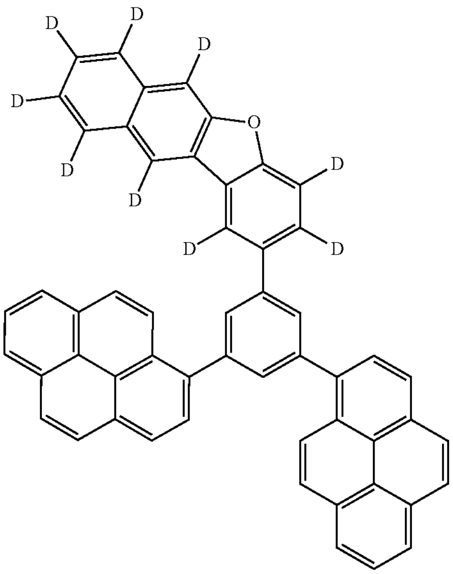

-continued
[Formula 228]
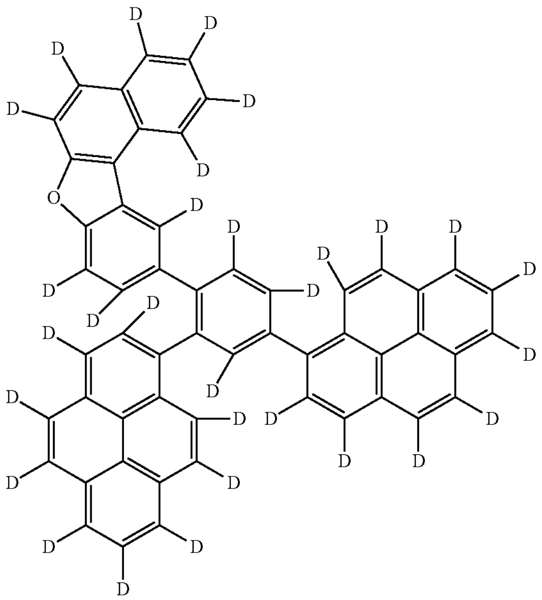
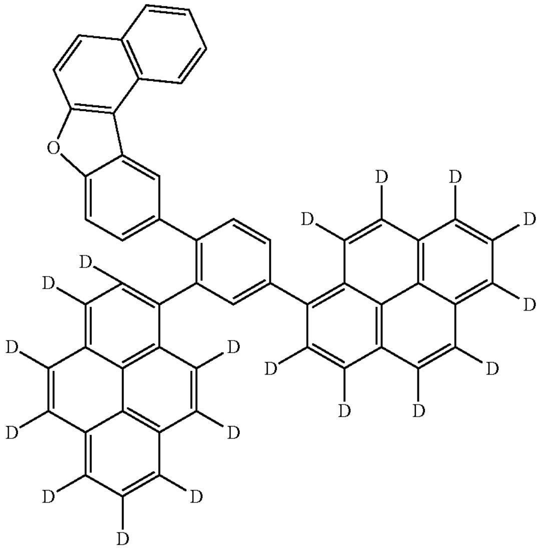
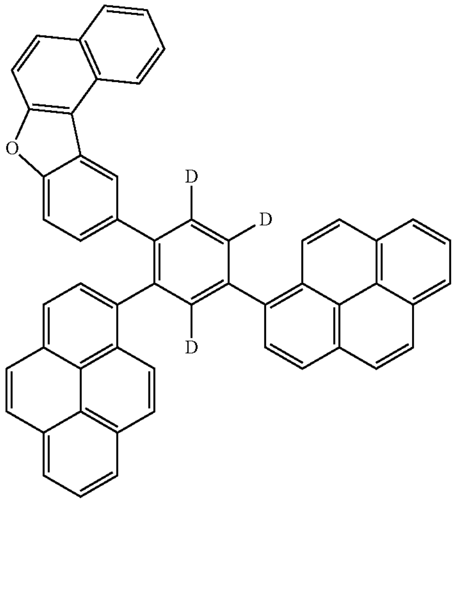
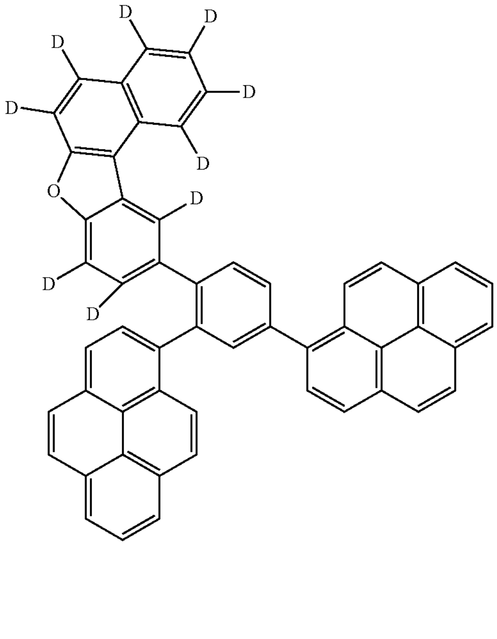

-continued
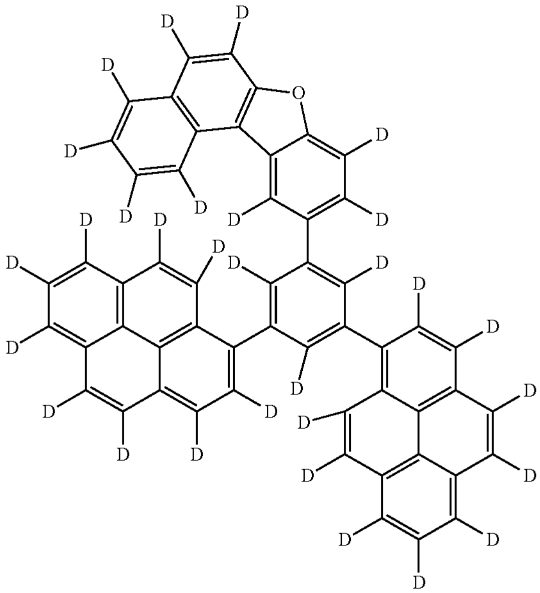
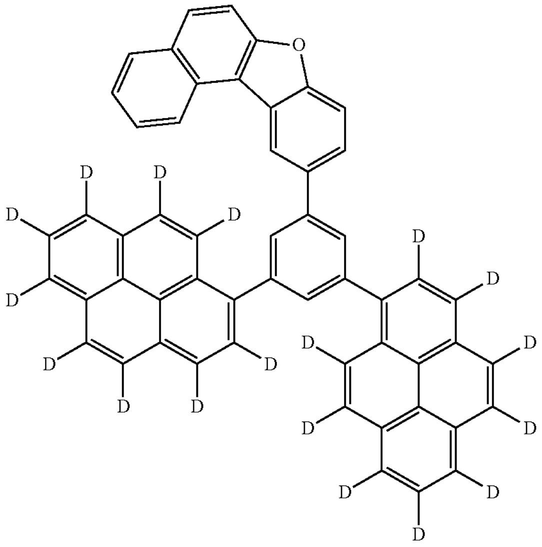
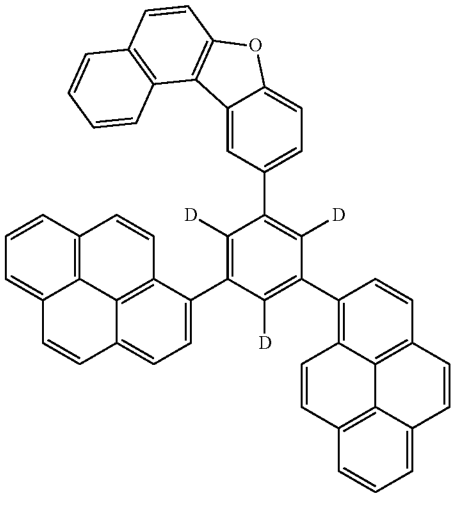
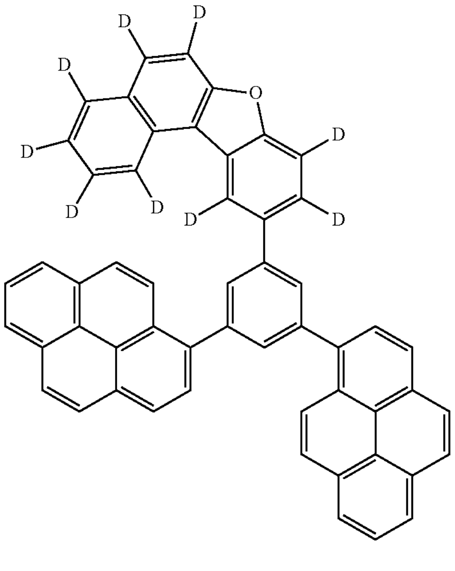

-continued
[Formula 229]
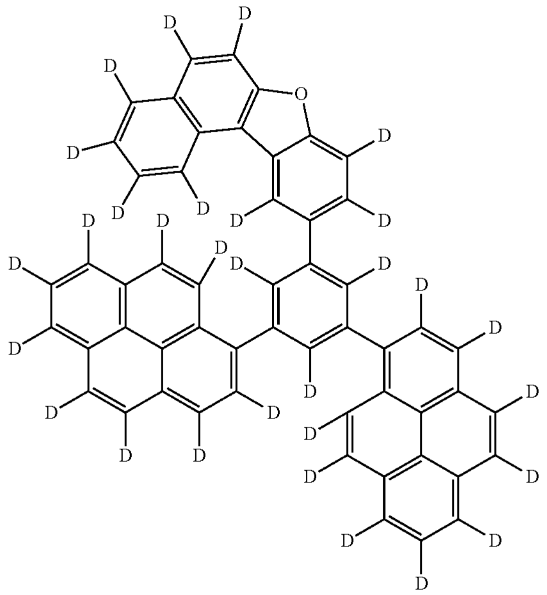
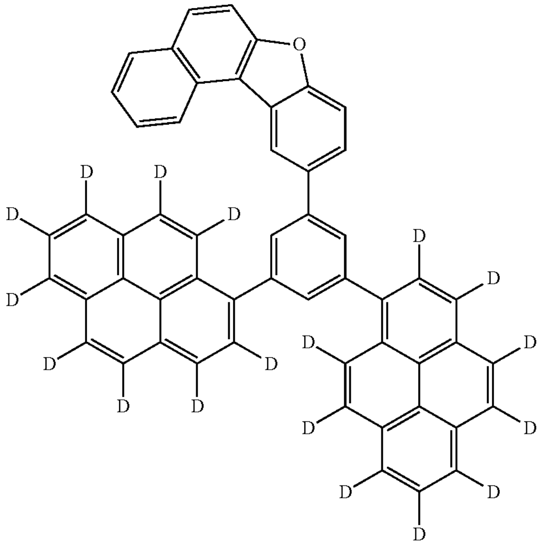
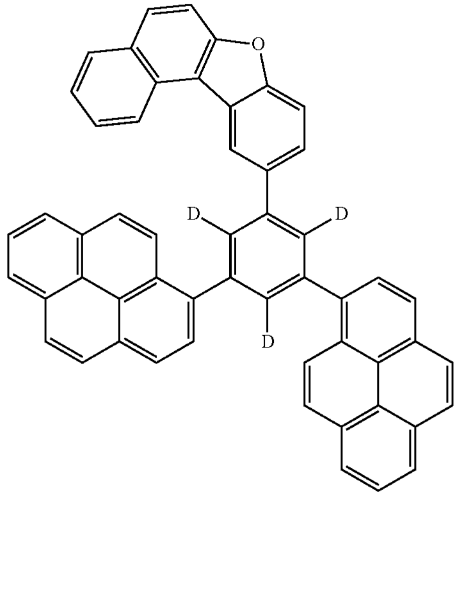
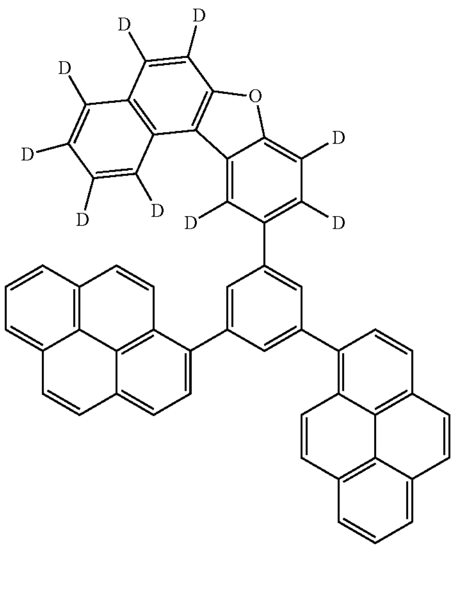

-continued
[Formula 230]
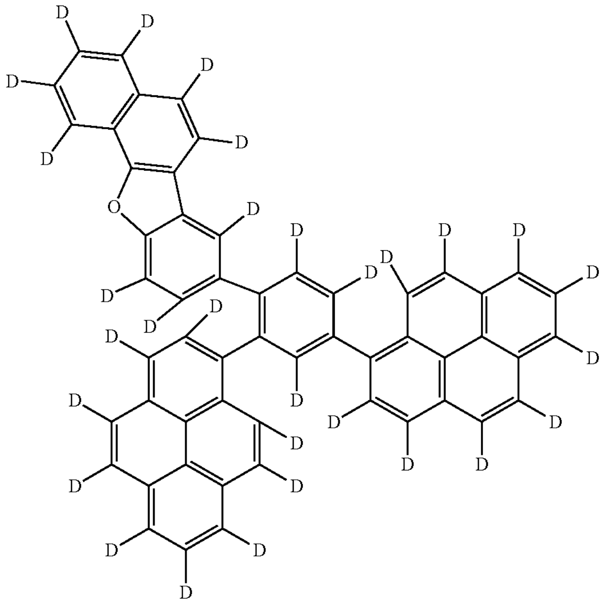
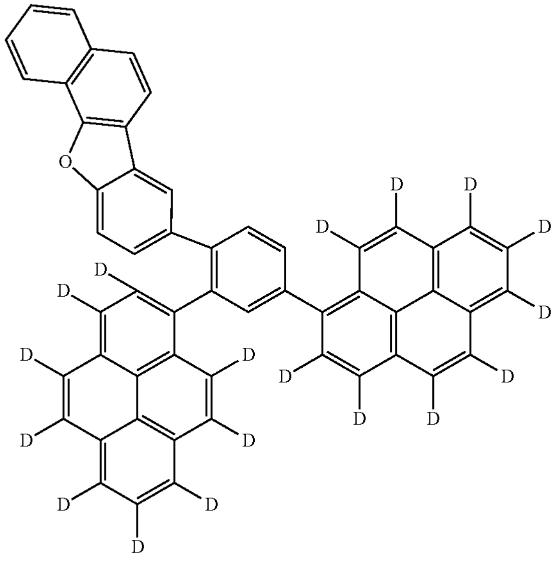
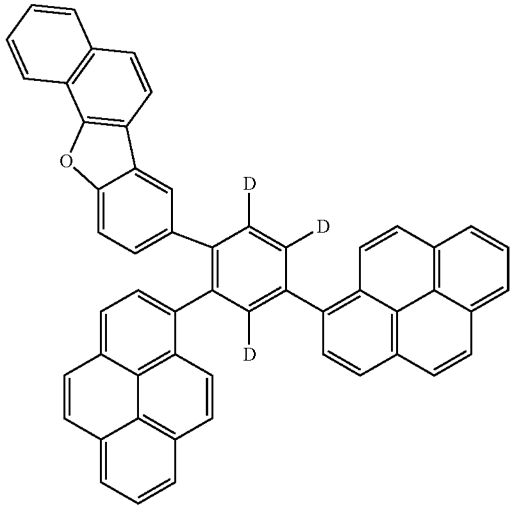

-continued
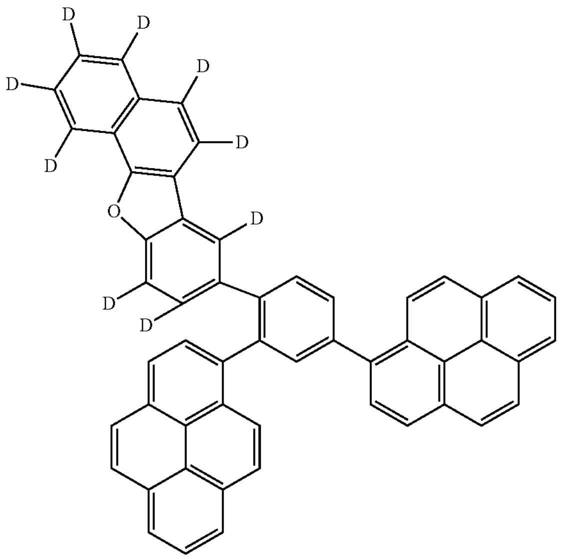
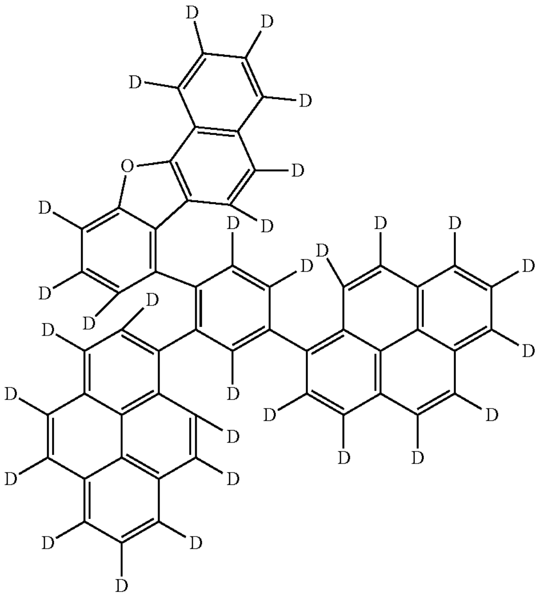
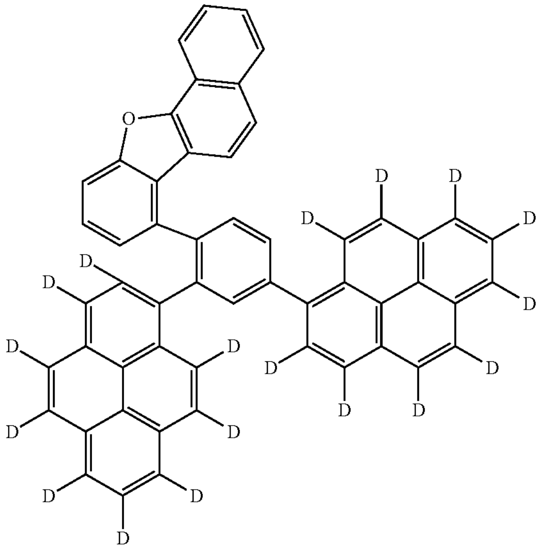
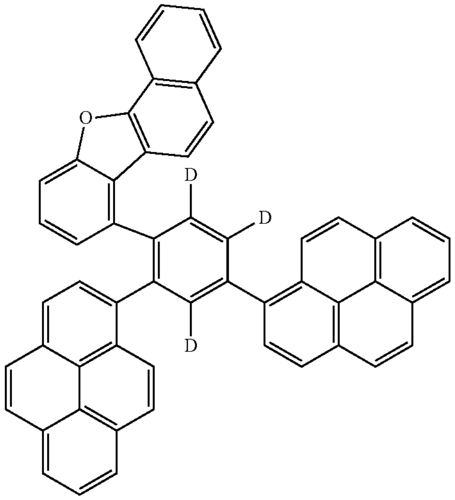
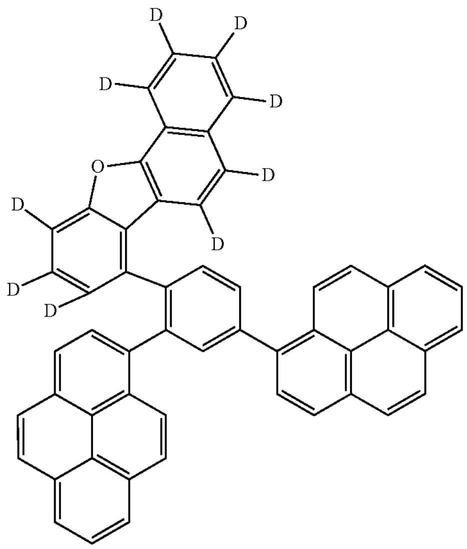

-continued
[Formula 231]
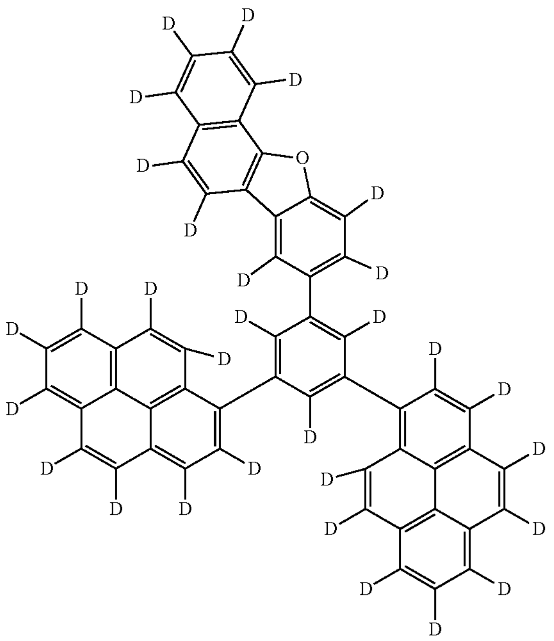
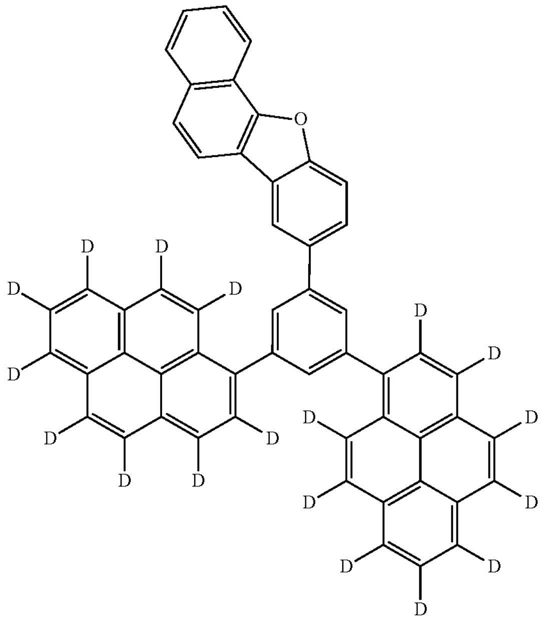
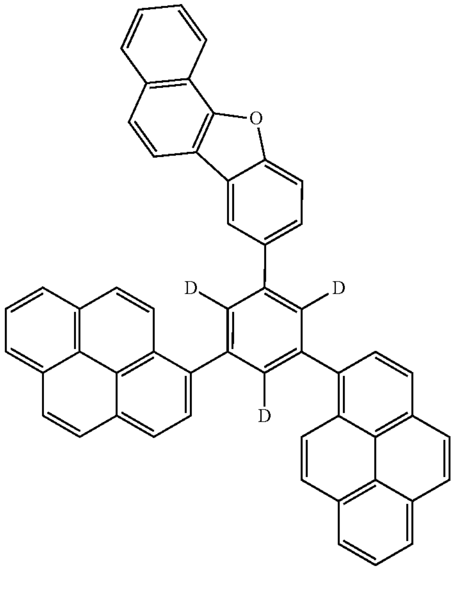
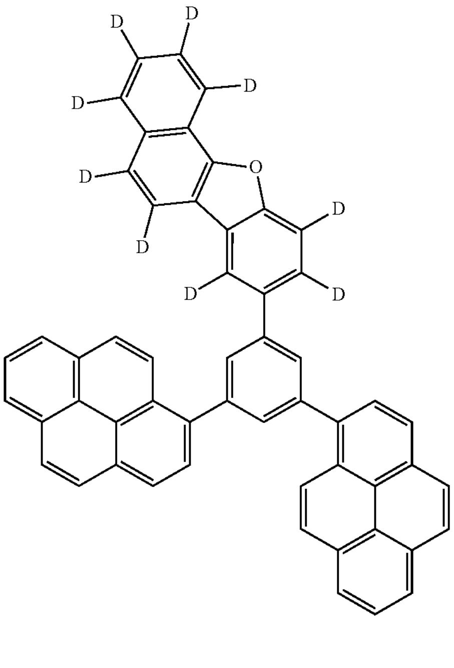

-continued
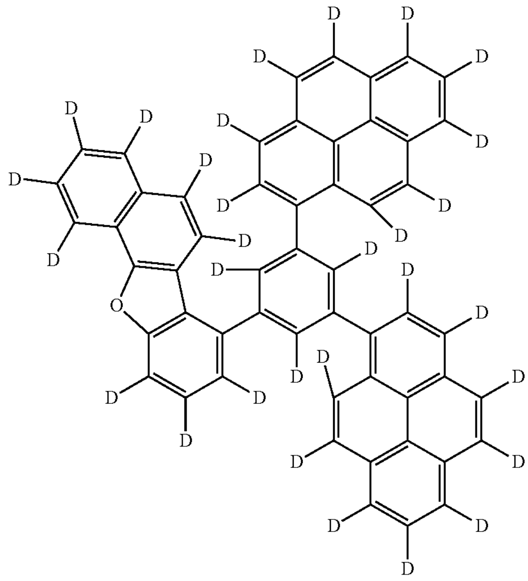
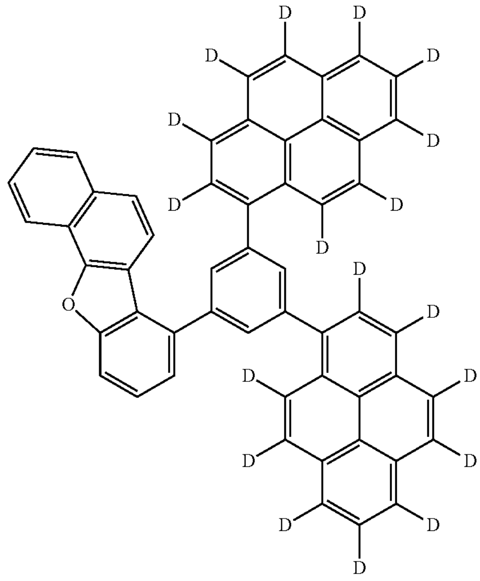
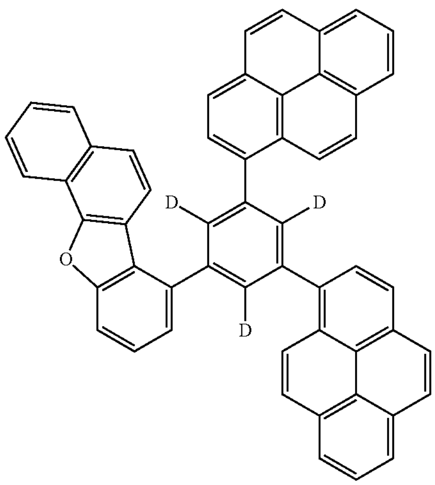
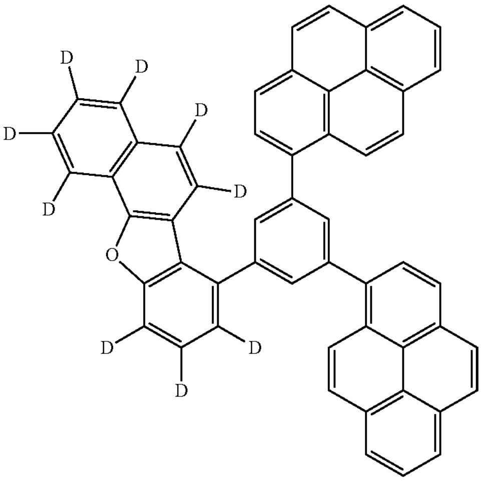
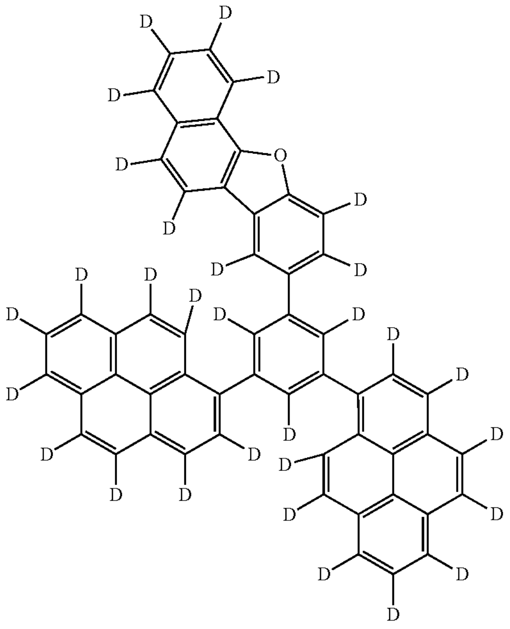
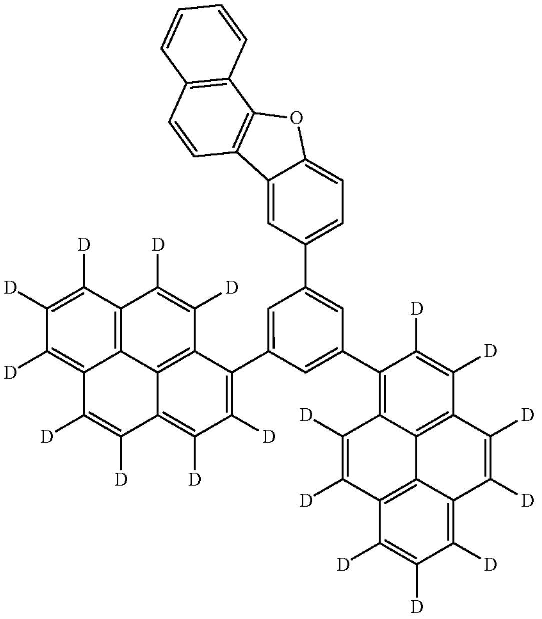

-continued
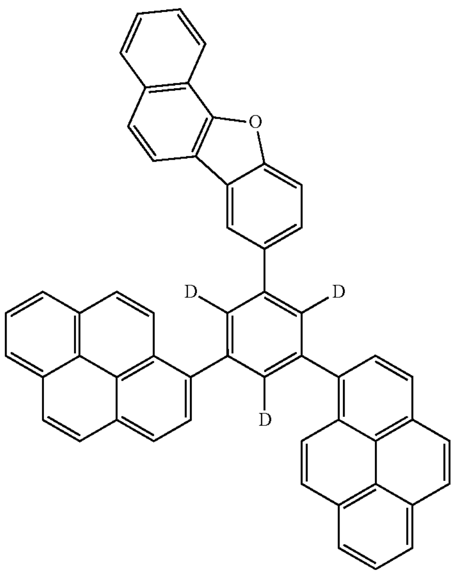
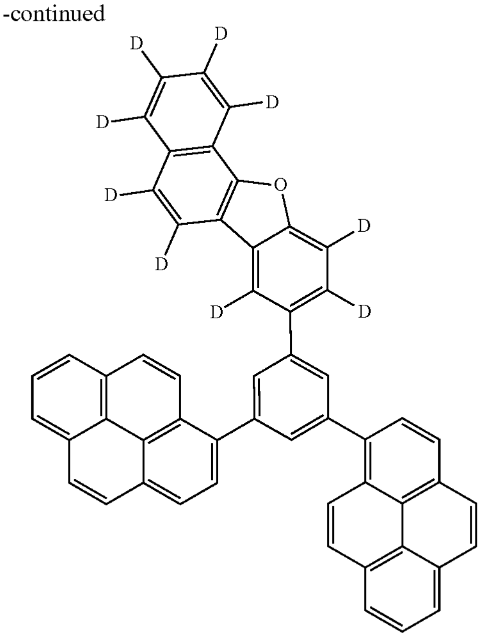
[Formula 232]
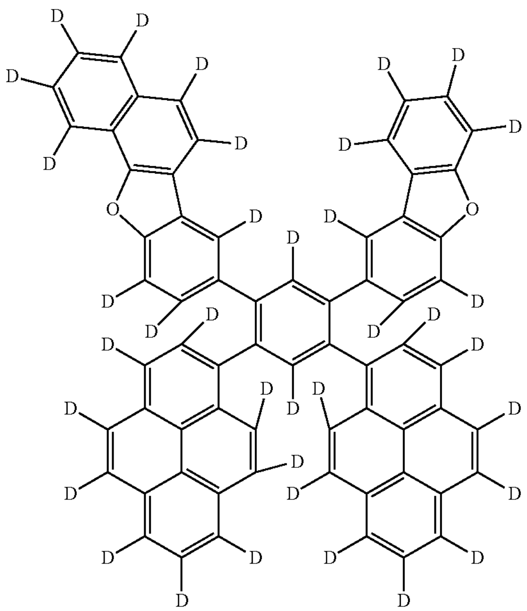
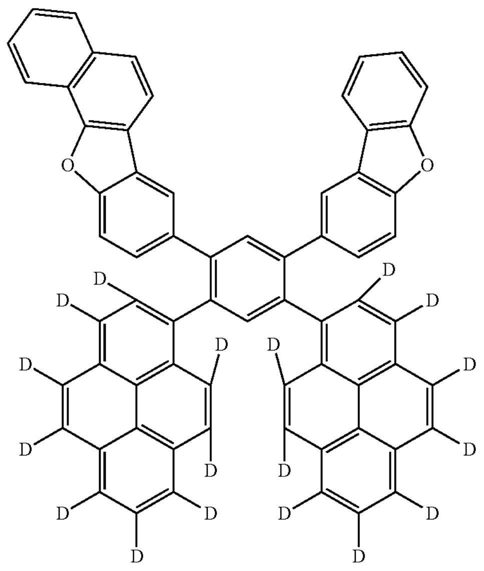

-continued
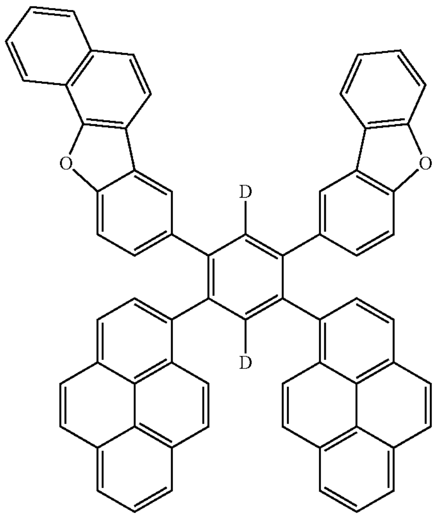
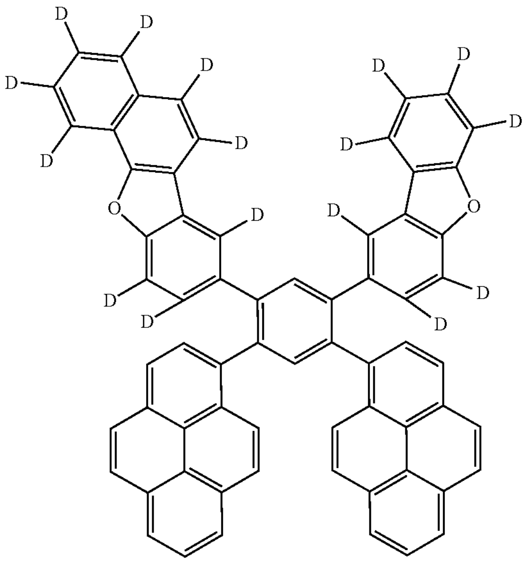
[Formula 233]
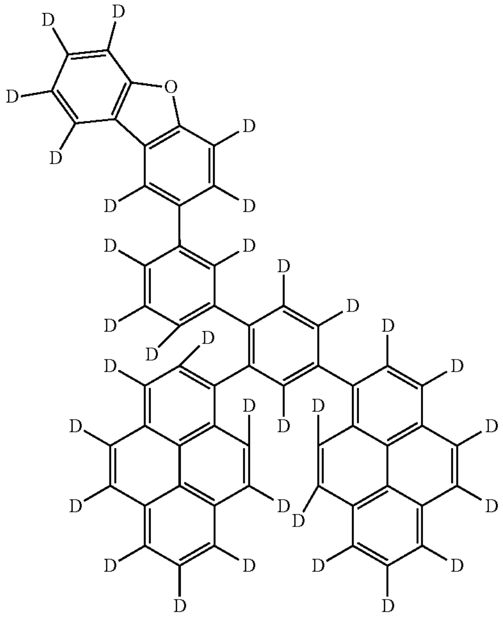
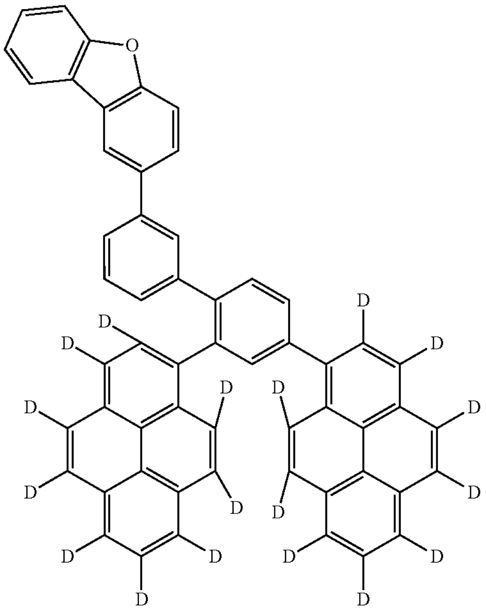

-continued
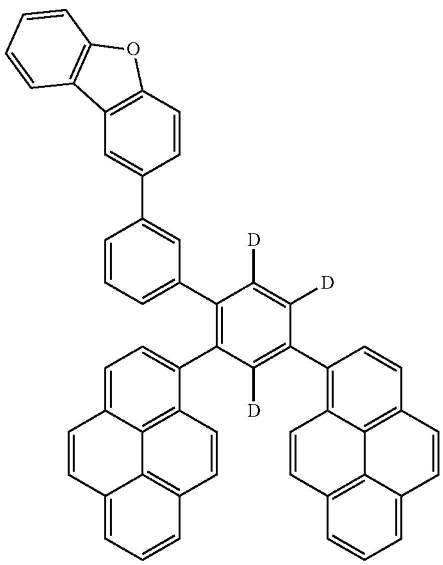
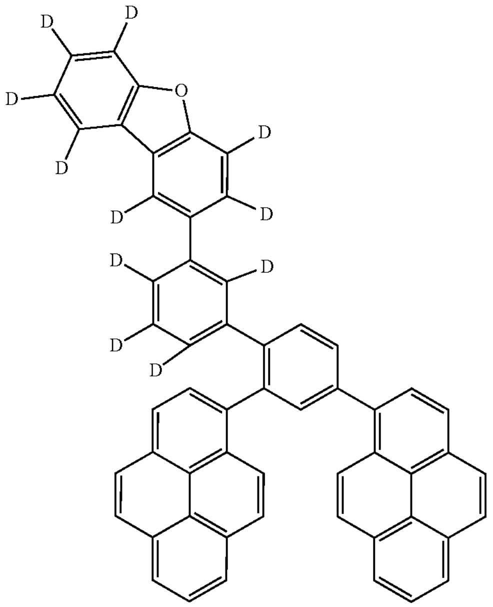
[Formula 234]
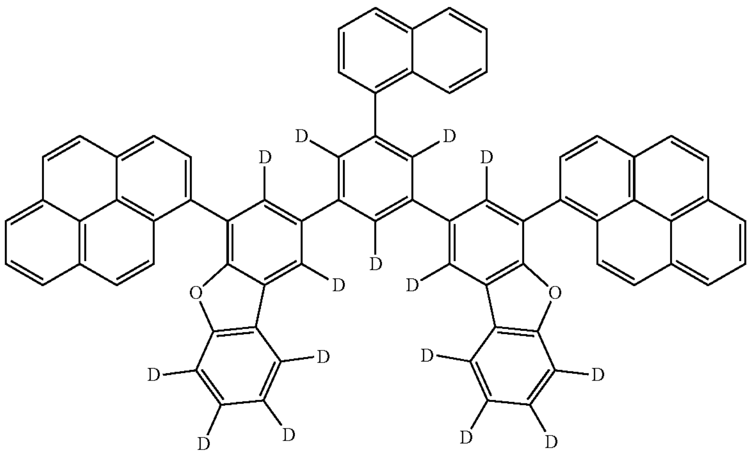
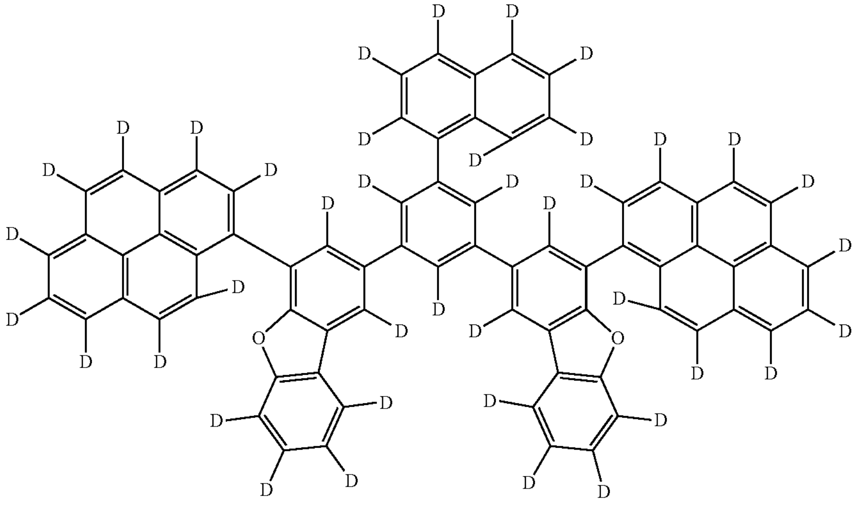

-continued
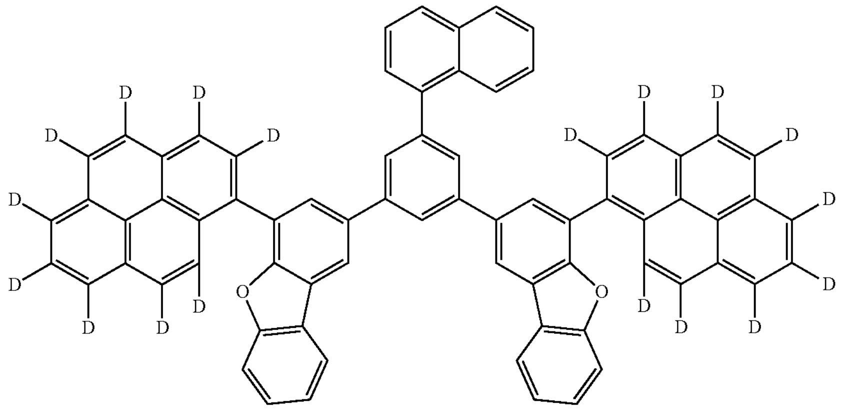
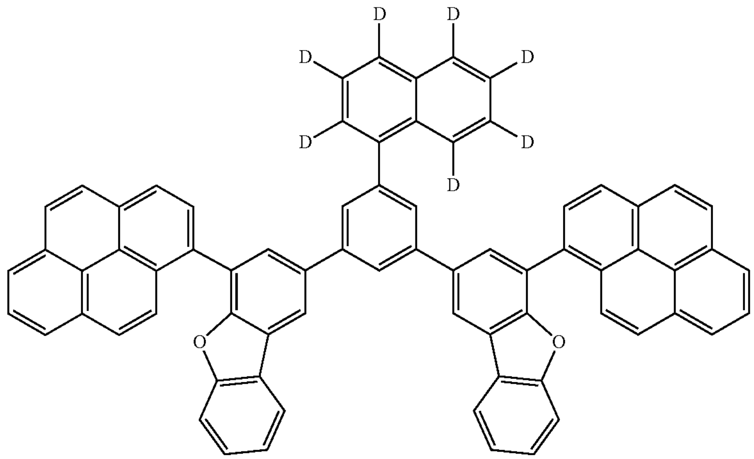
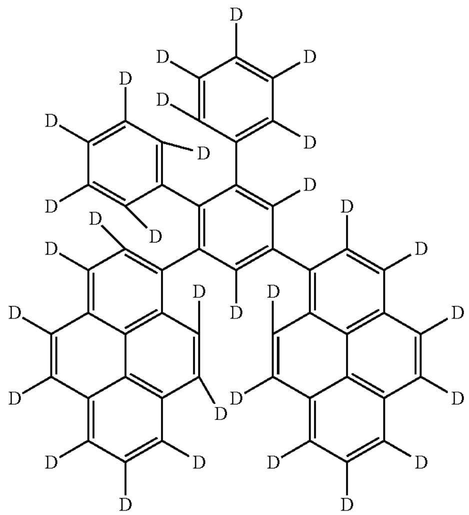
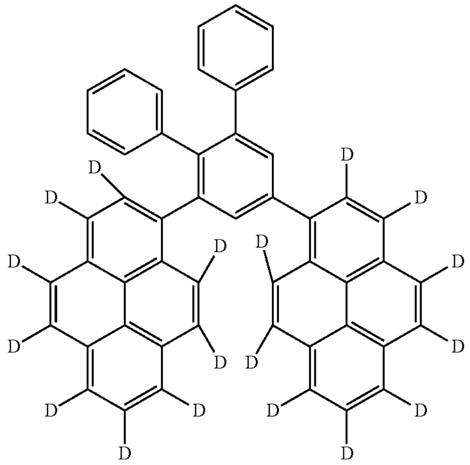

-continued
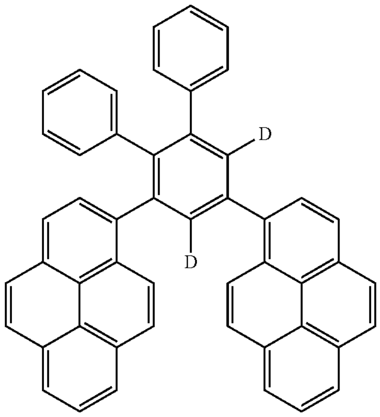
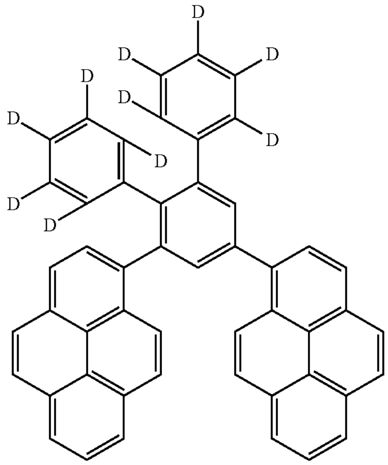
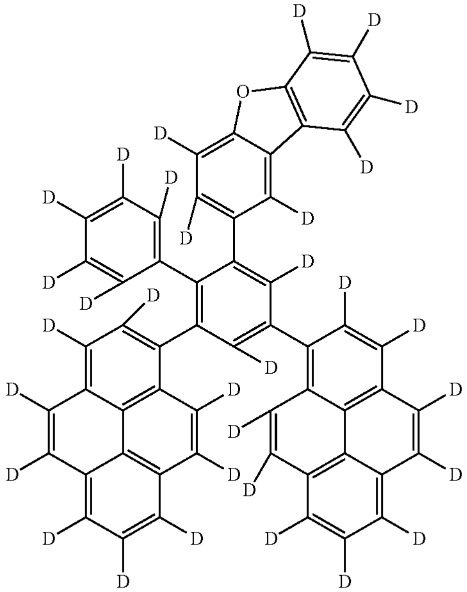
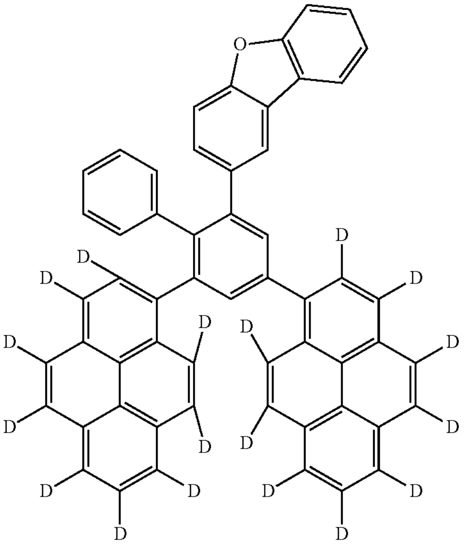
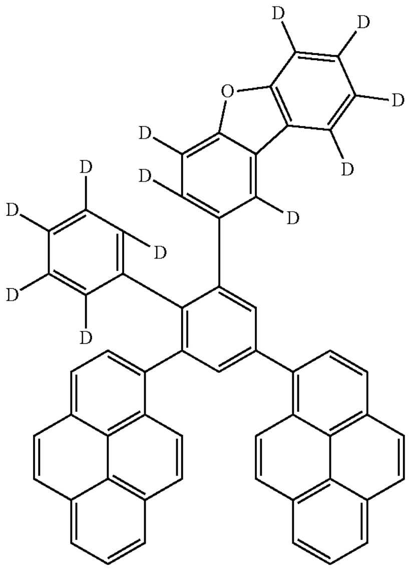

-continued
[Formula 235]
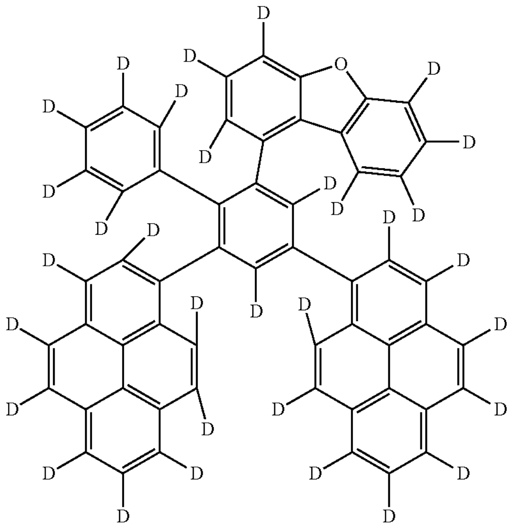
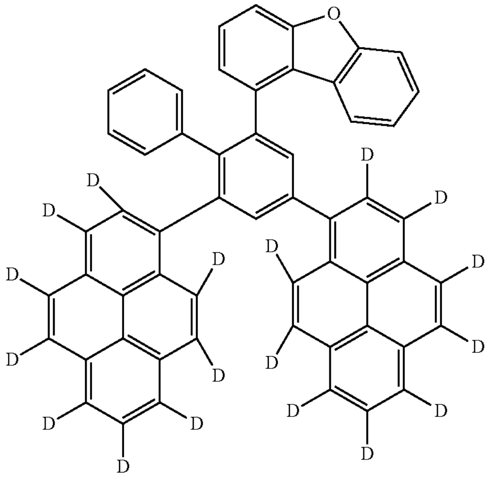
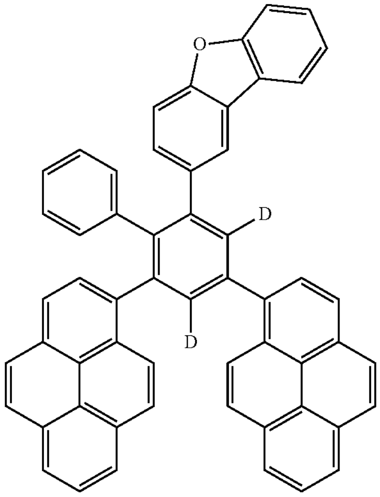
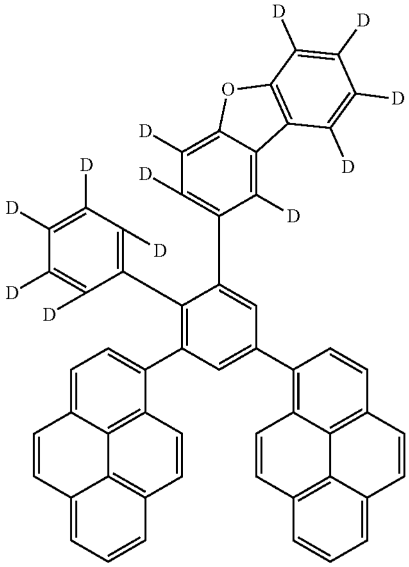
[Formula 236]
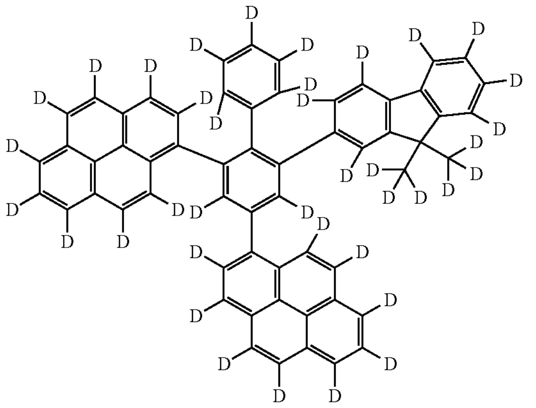
-continued
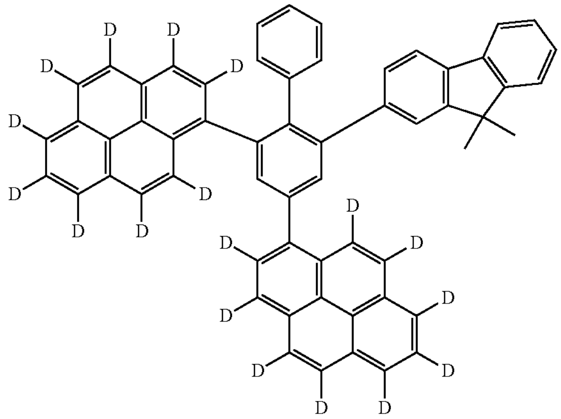

-continued
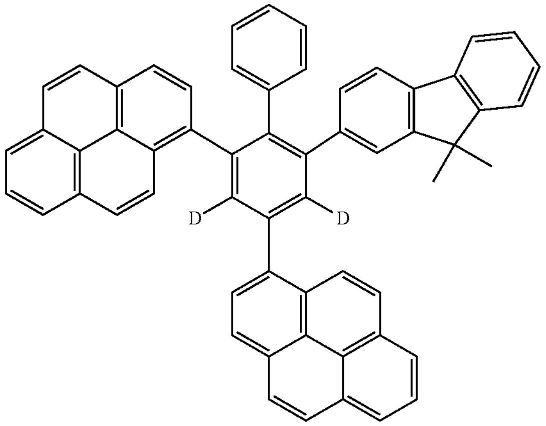
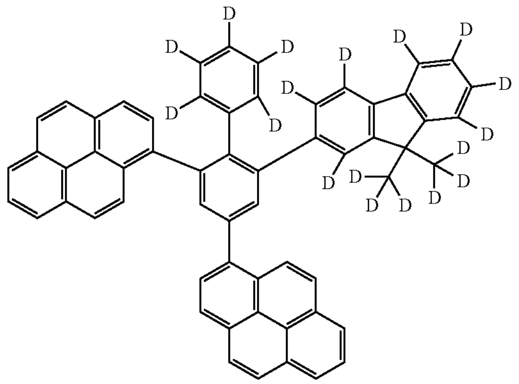
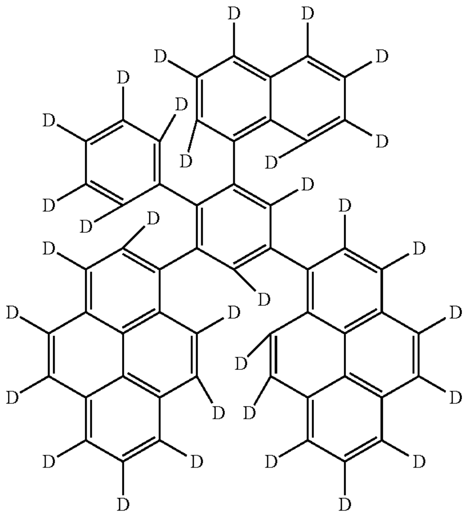
-continued
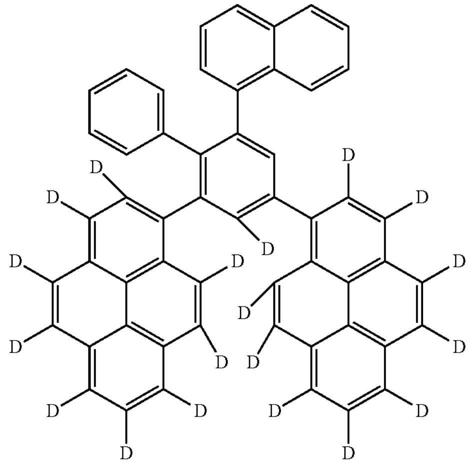
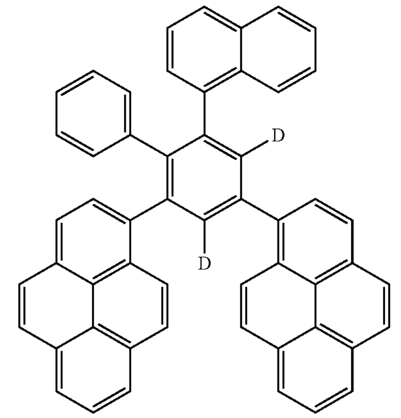
[Formula 237]
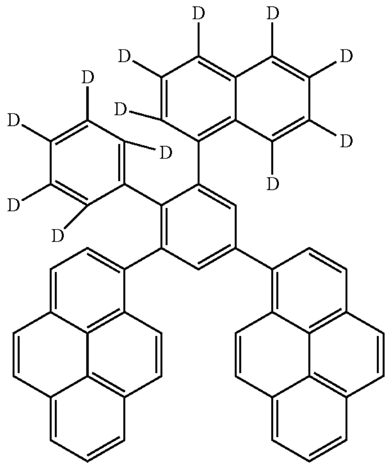

-continued
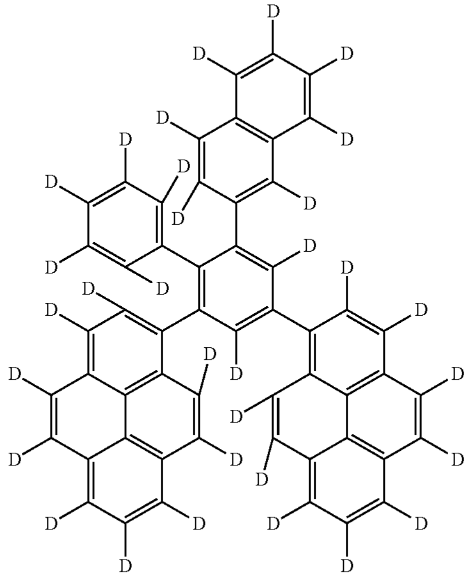
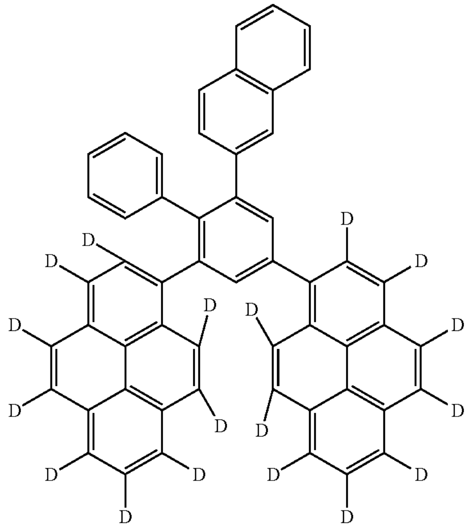
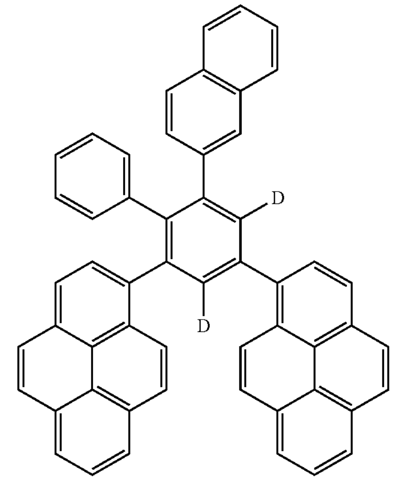
-continued
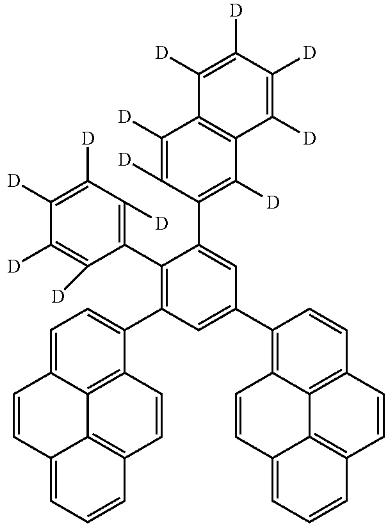
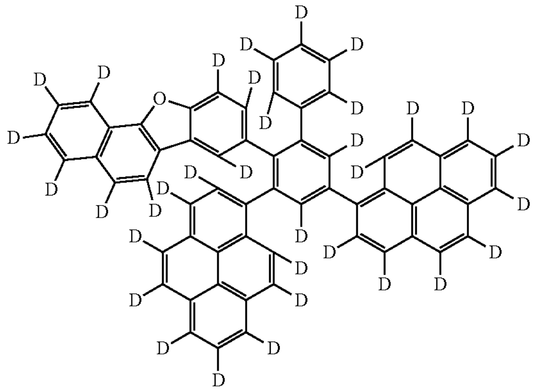
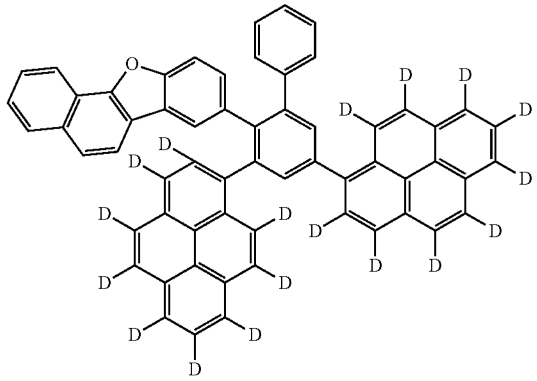
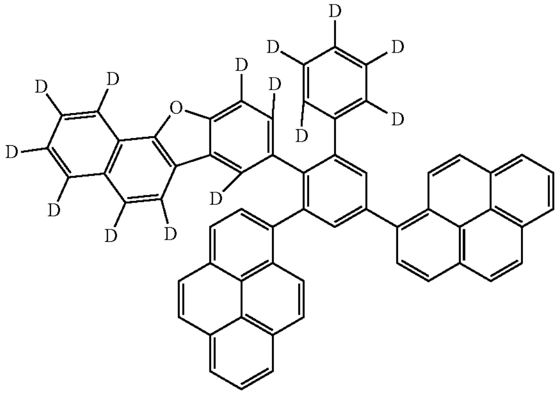

-continued
[Formula 238]
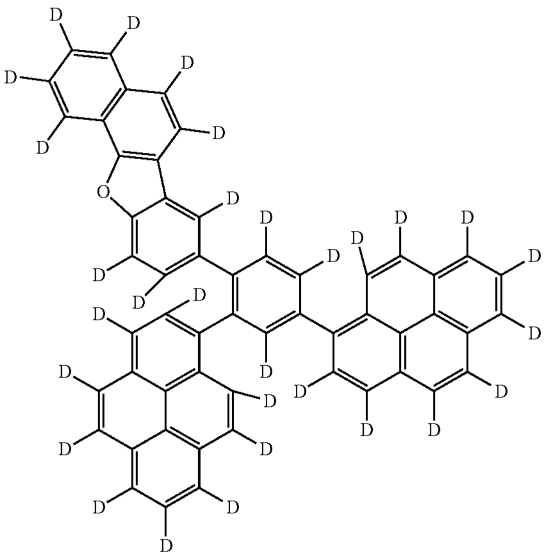
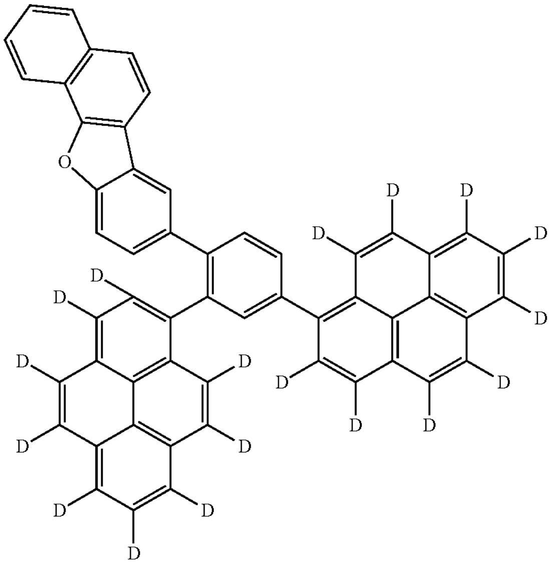
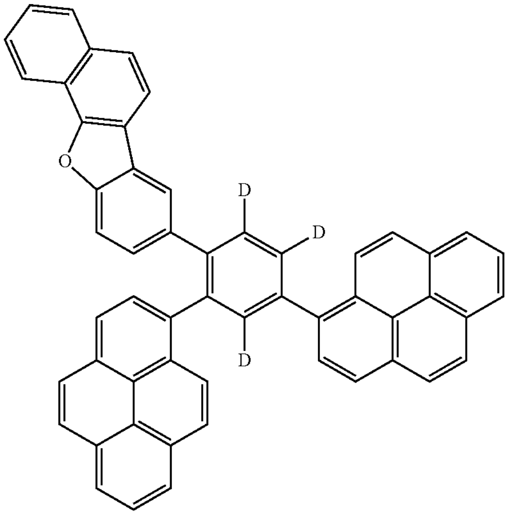
-continued
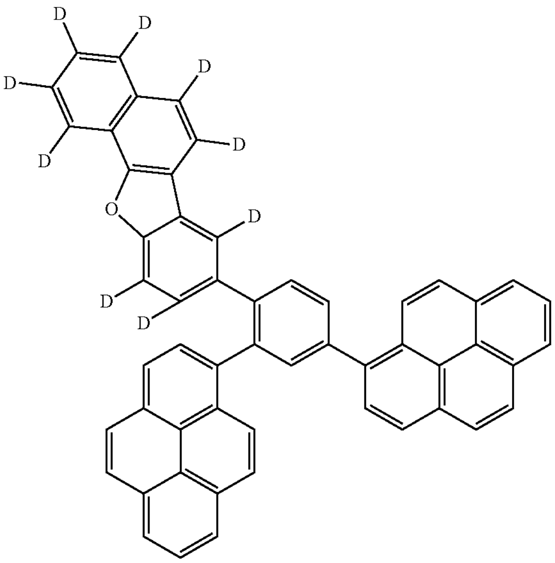
[Formula 239]
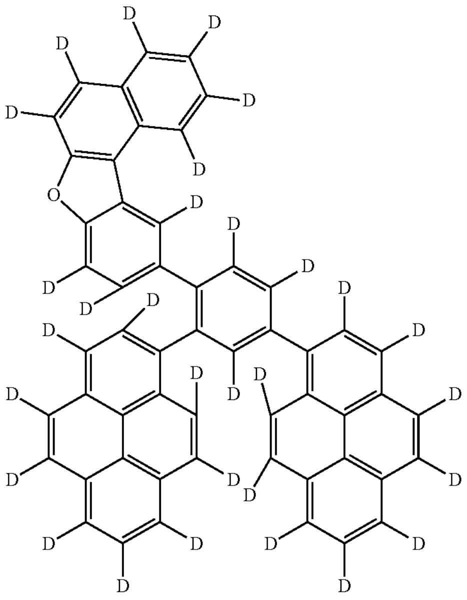

-continued
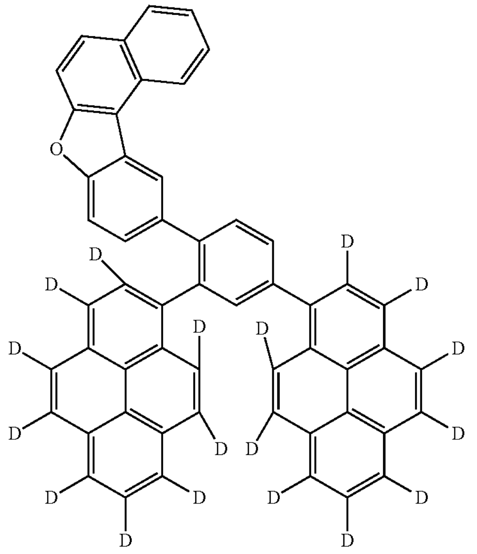
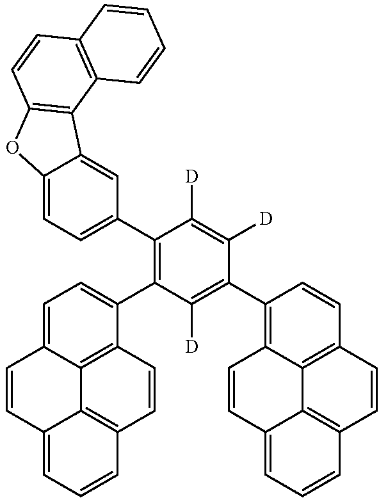
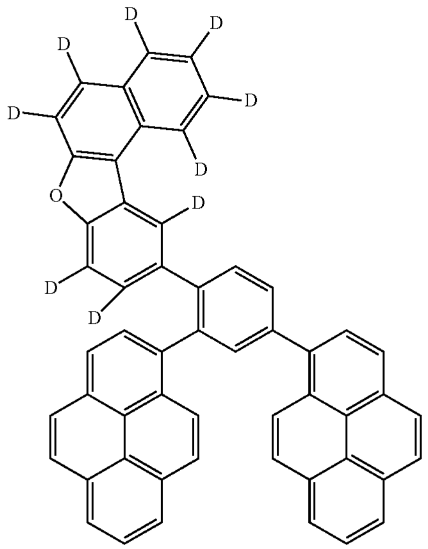
-continued
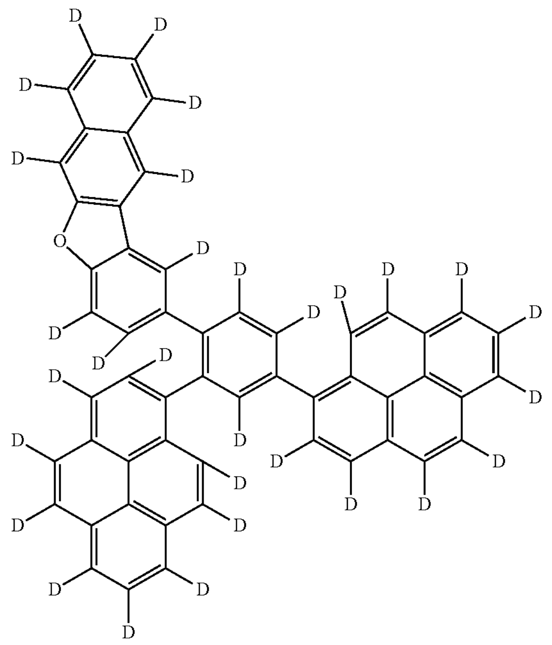
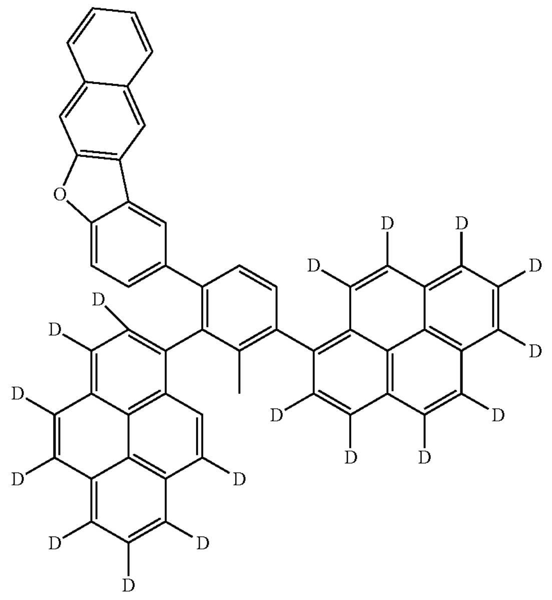

-continued
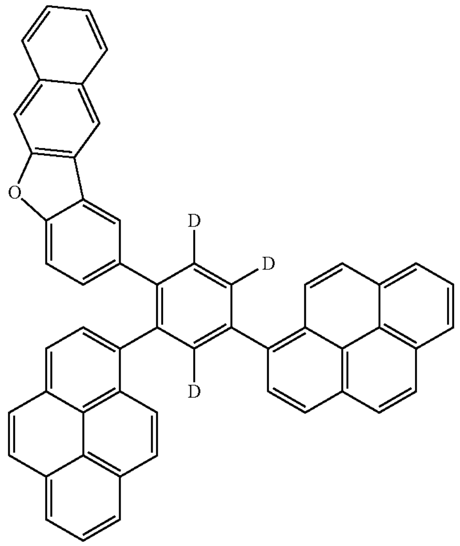
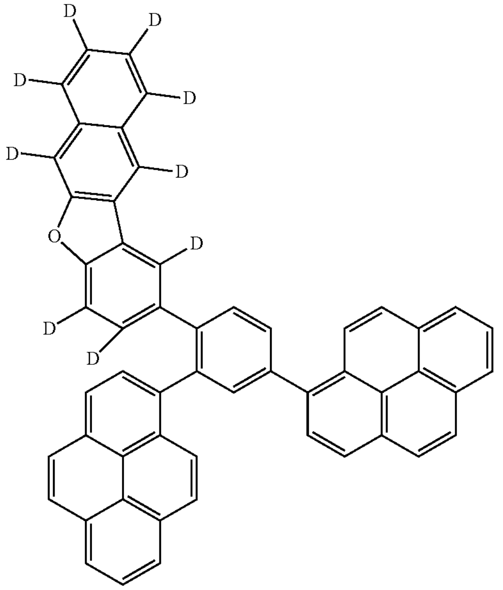
[Formula 240]
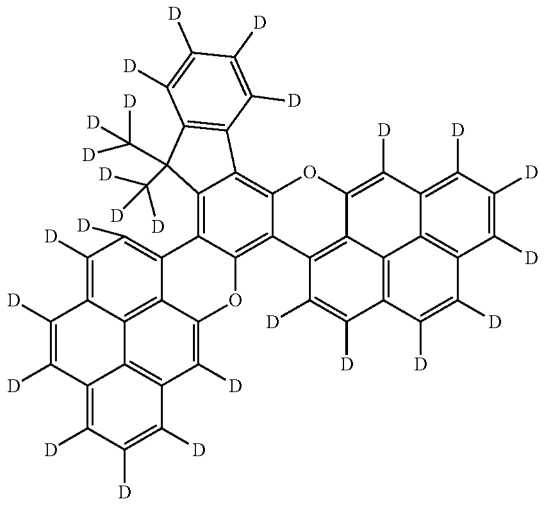
-continued
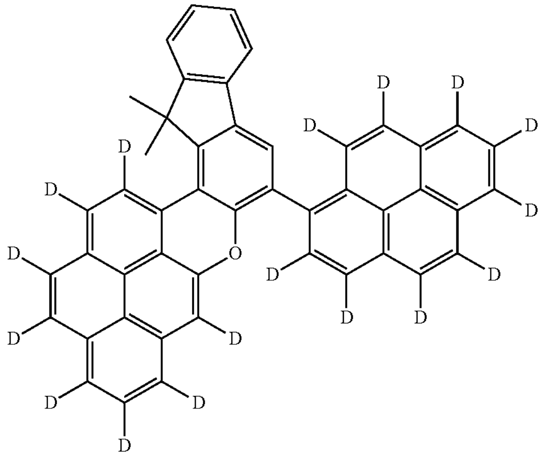
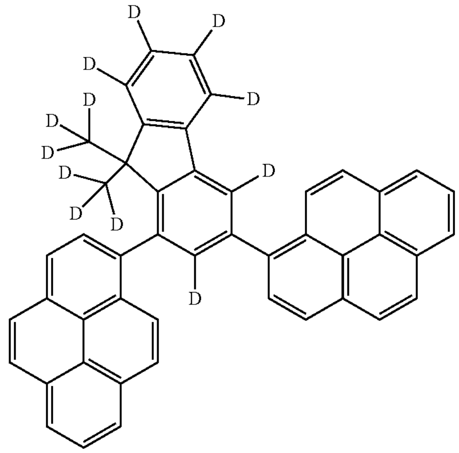
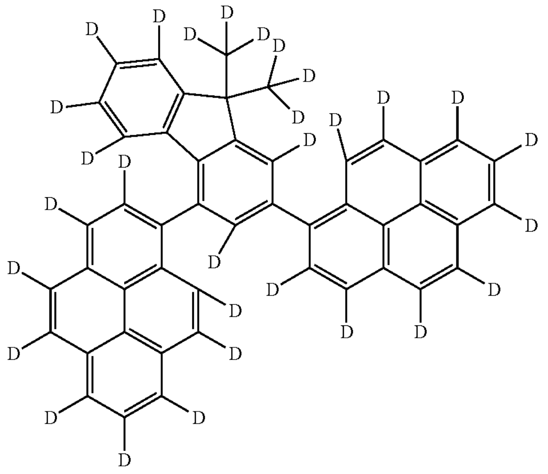

-continued
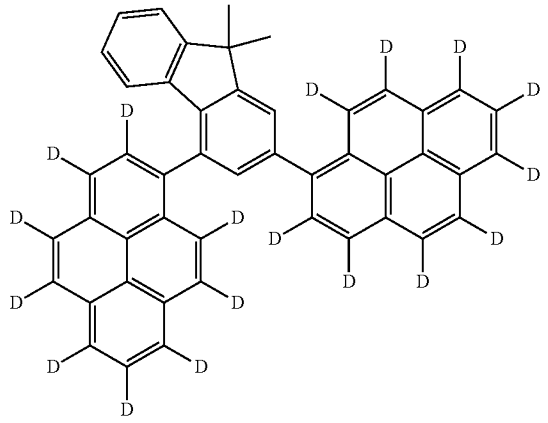
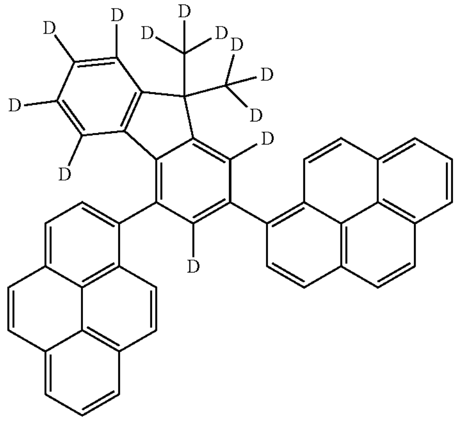
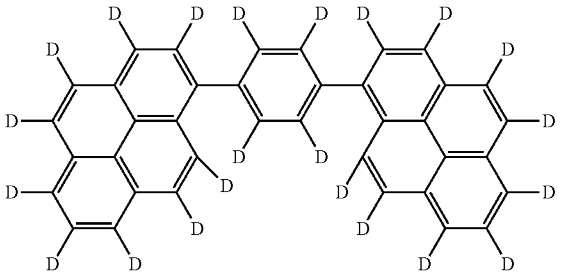
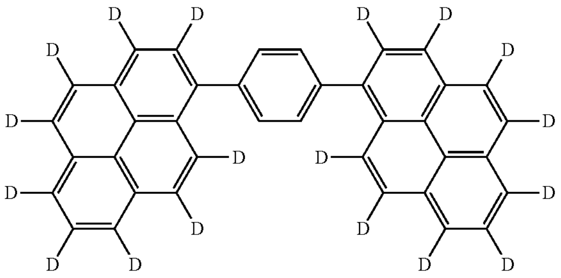
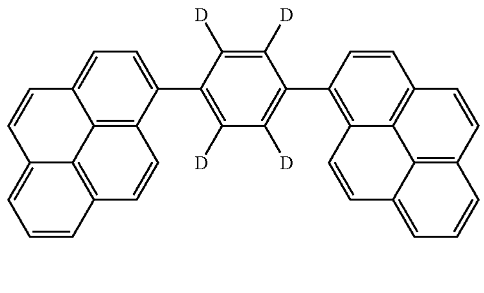
-continued
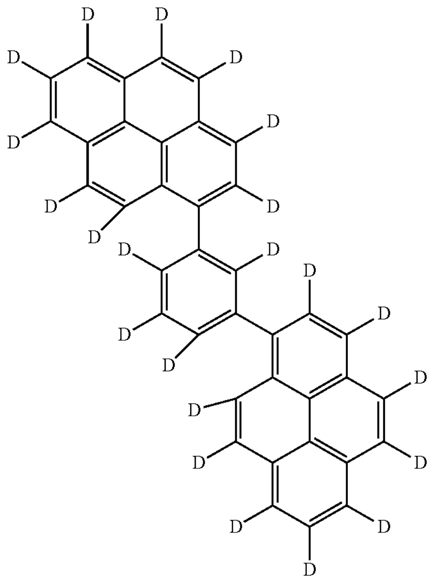
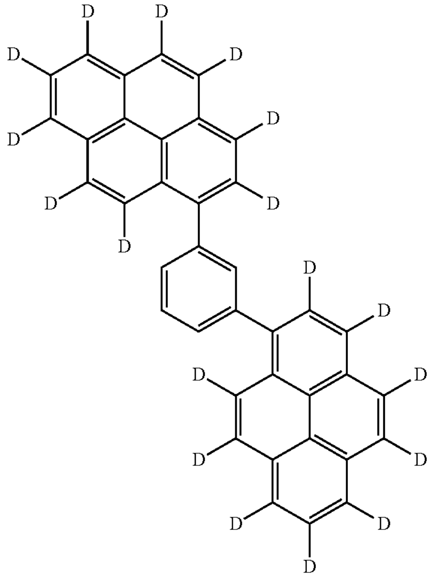
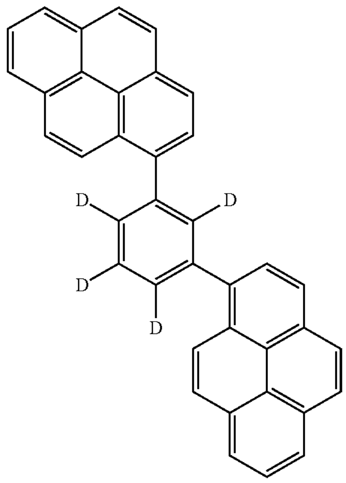

-continued
[Formula 241]
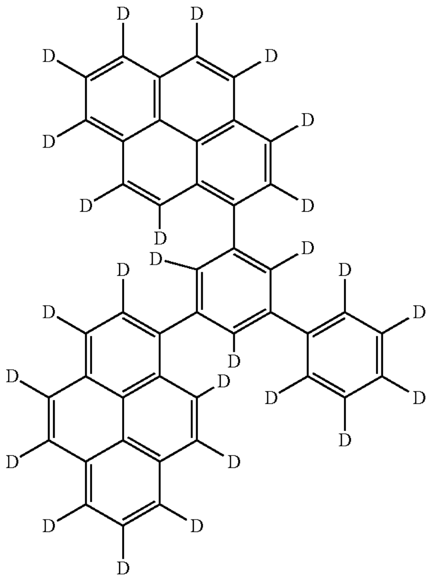
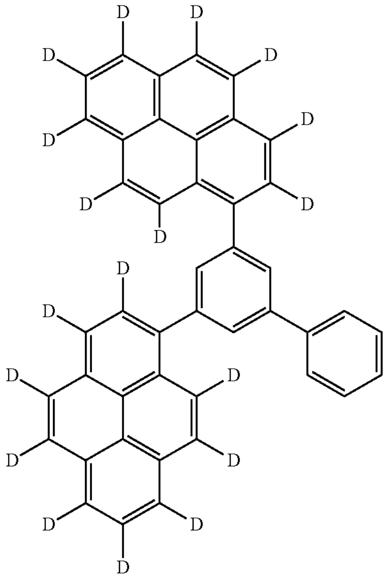
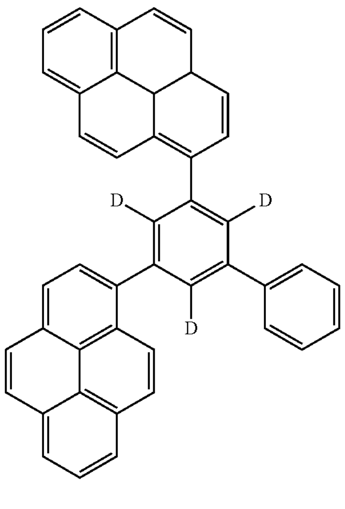
-continued
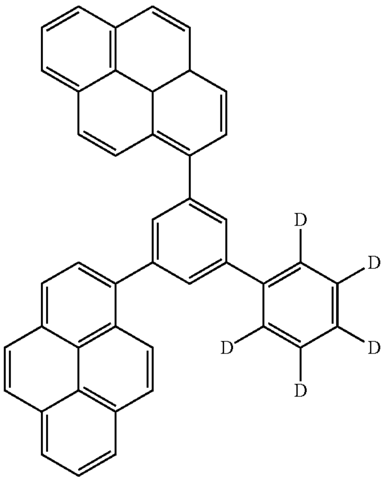
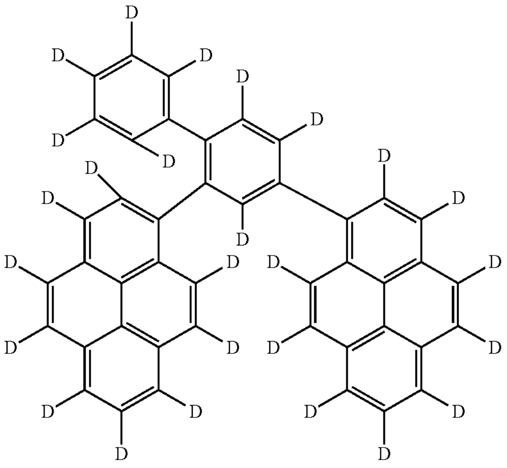
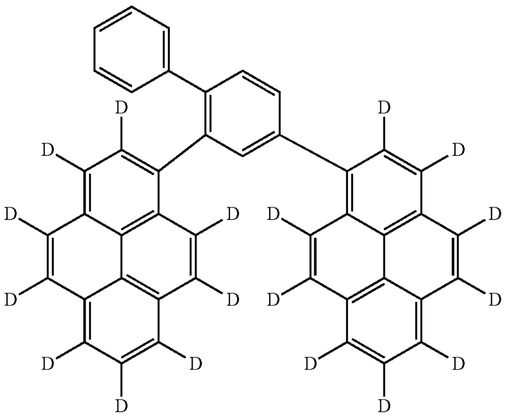
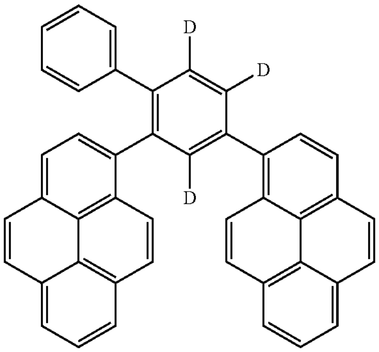

-continued
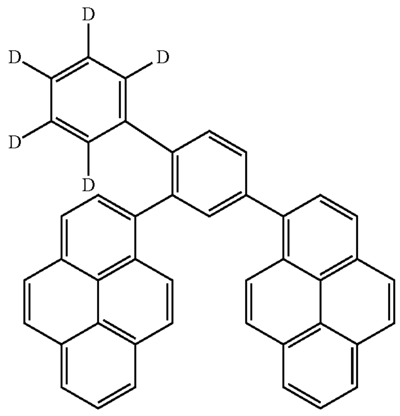
[Formula 242]
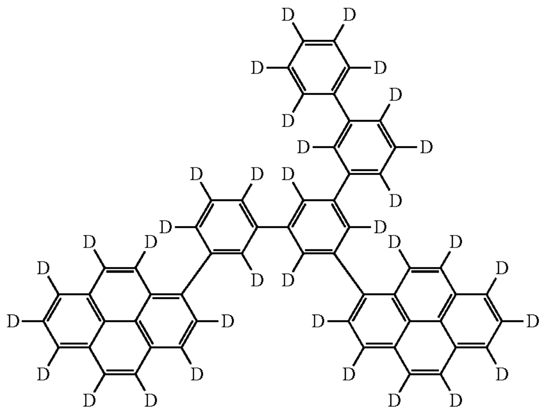
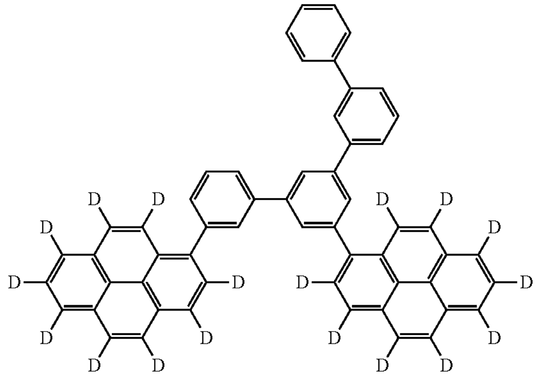
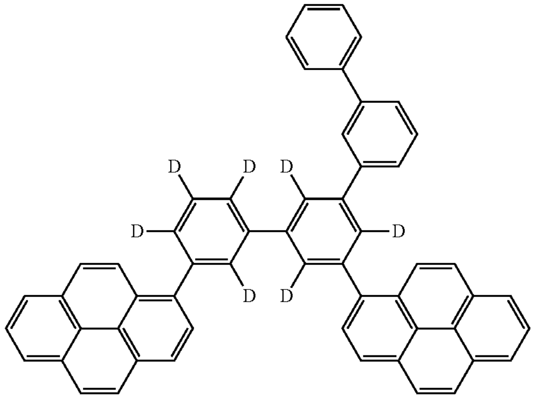
-continued
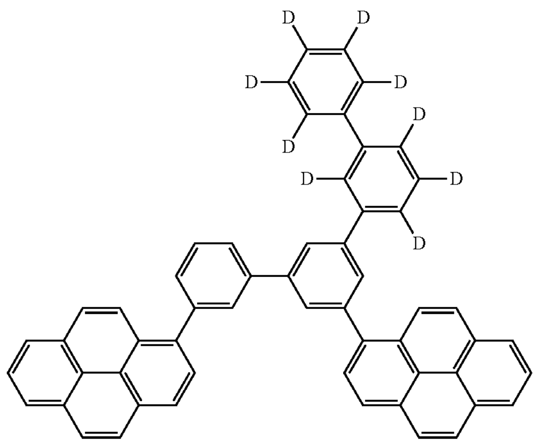
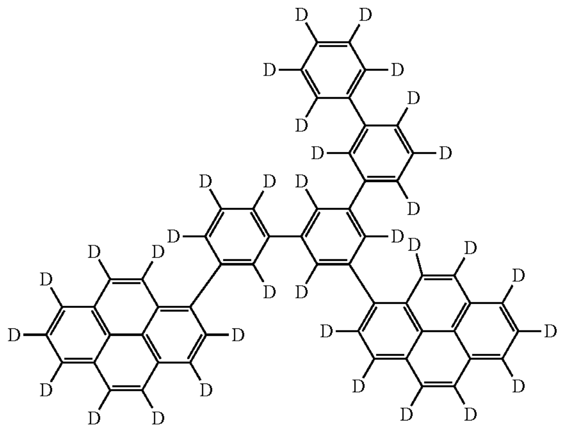
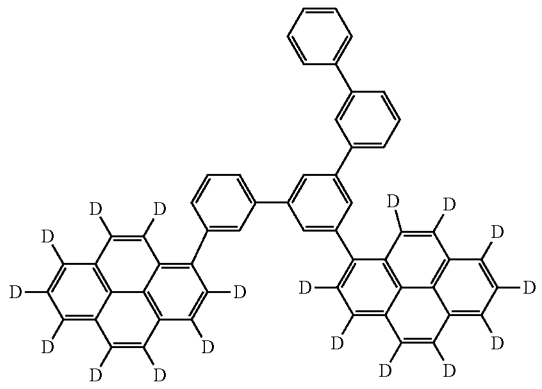
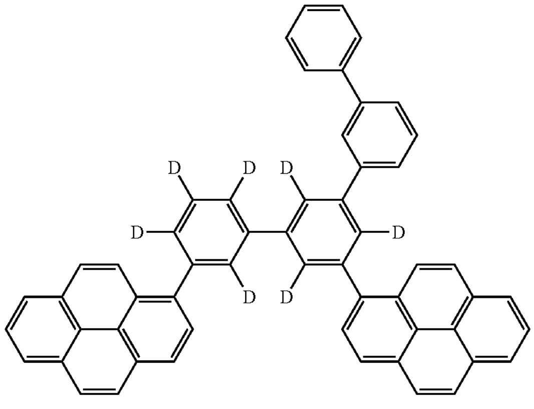

-continued
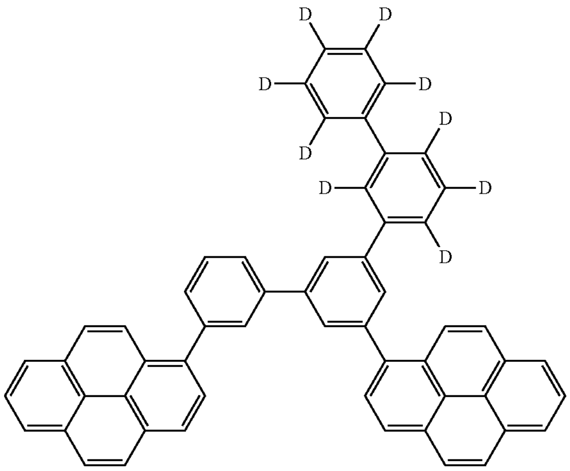
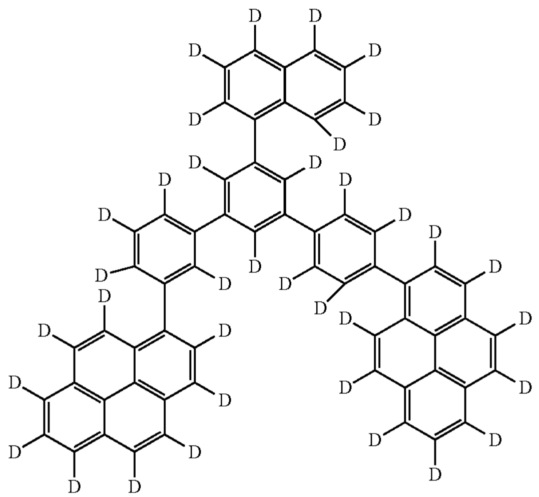
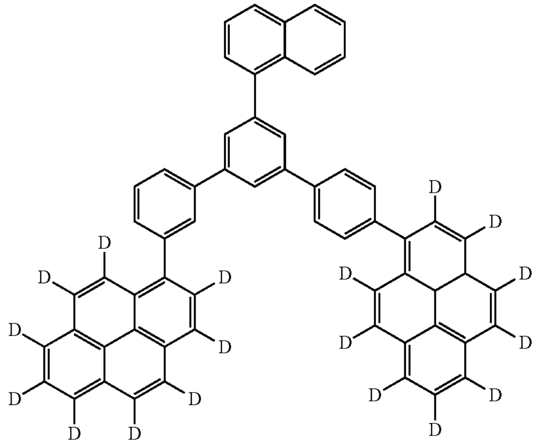
-continued
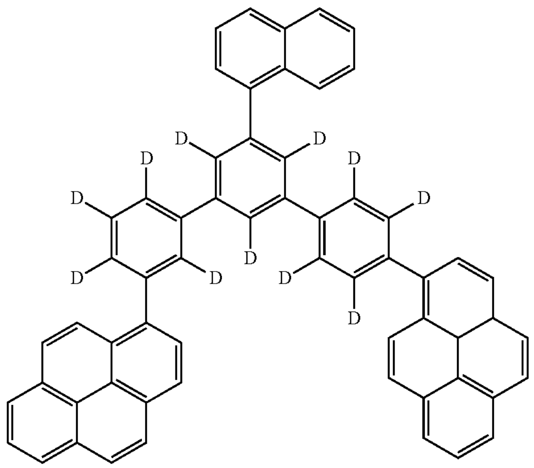
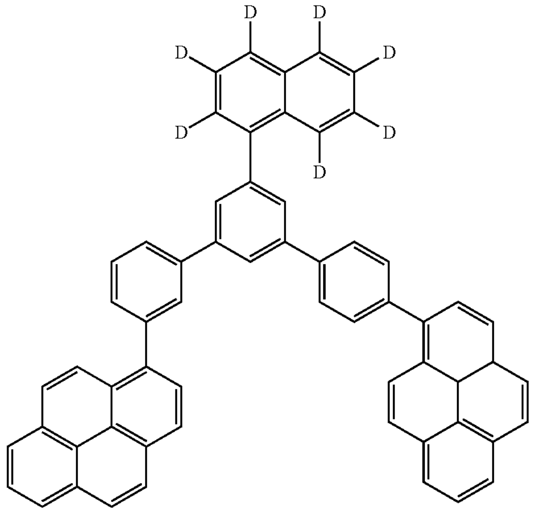
[Formula 243]
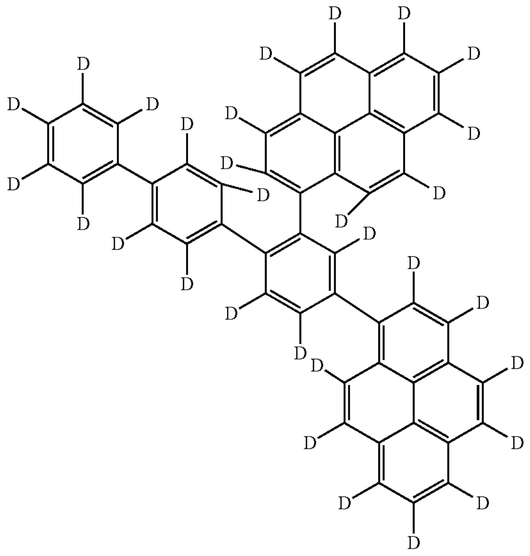

-continued
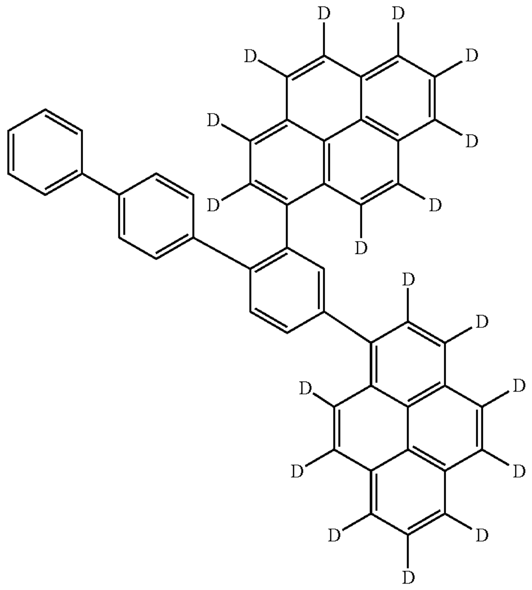
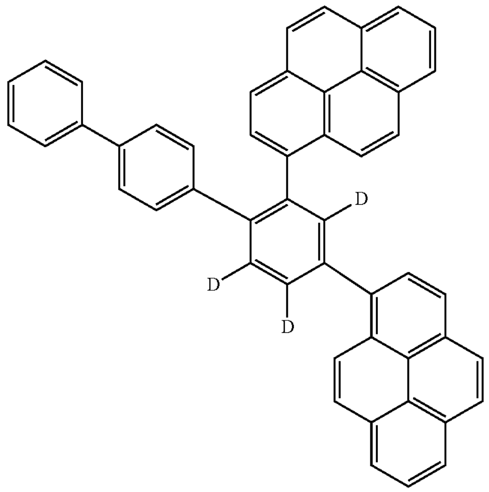
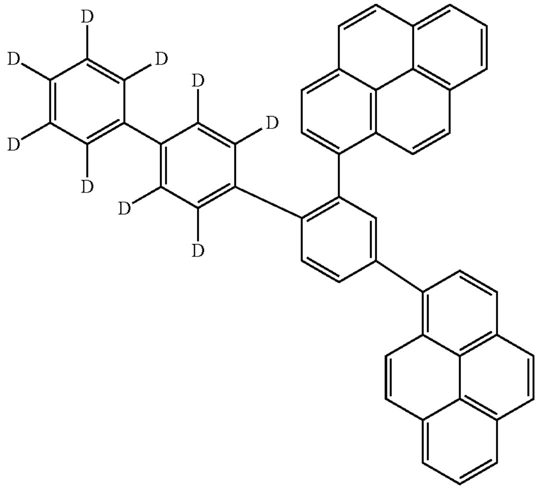
-continued
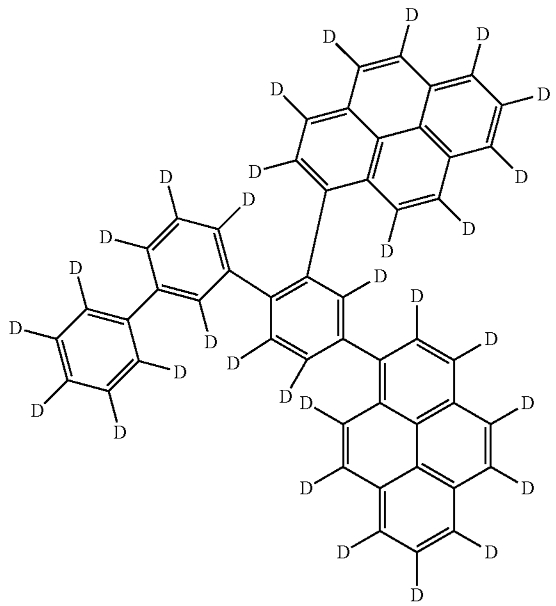
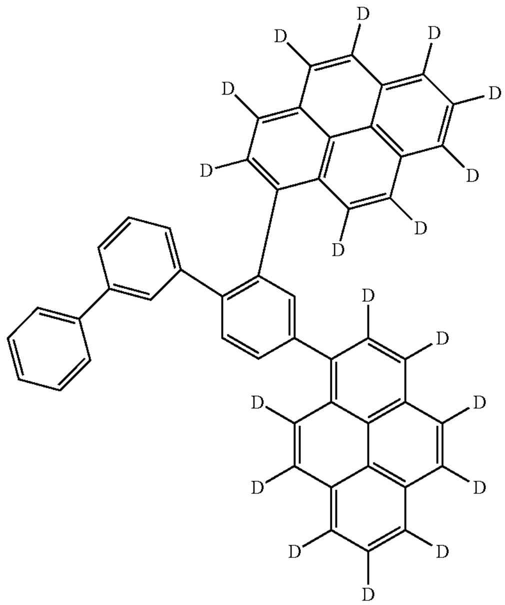
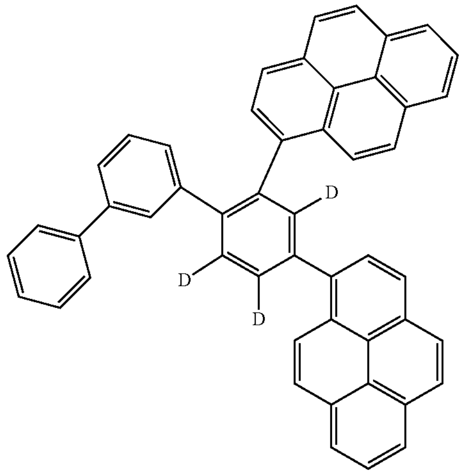

-continued
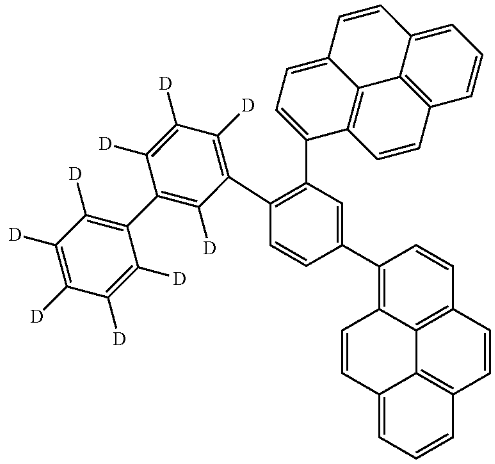
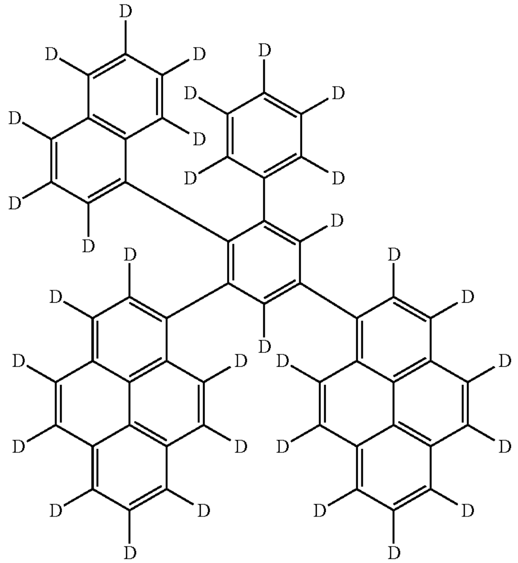
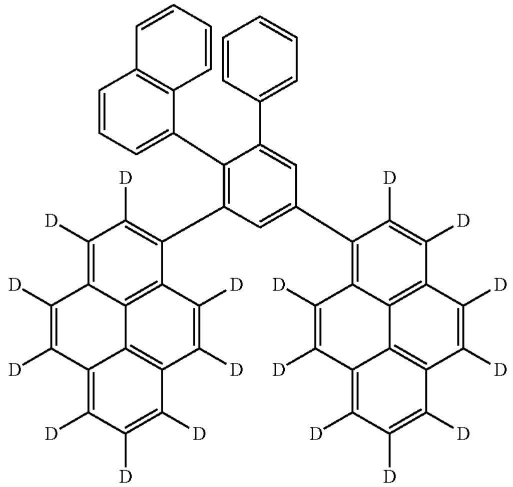
-continued
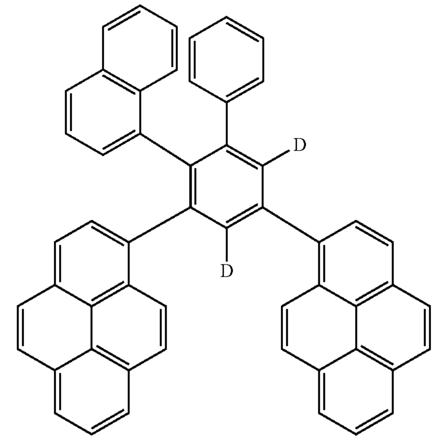
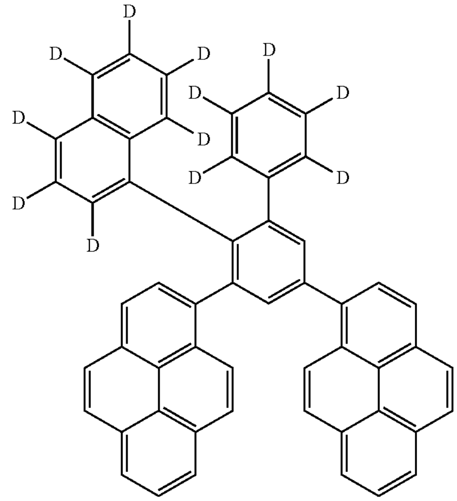
[Formula 244]
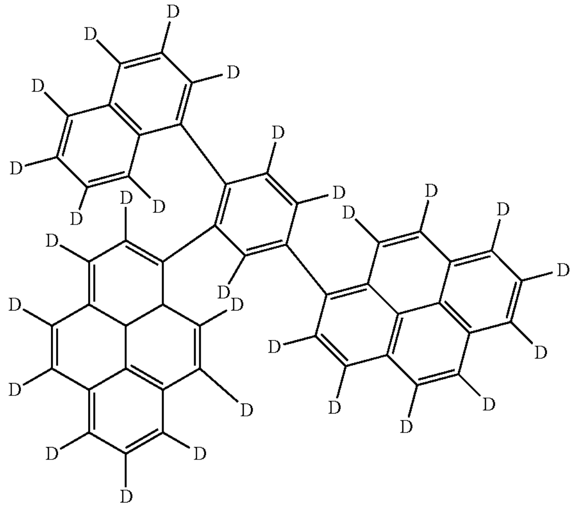

-continued
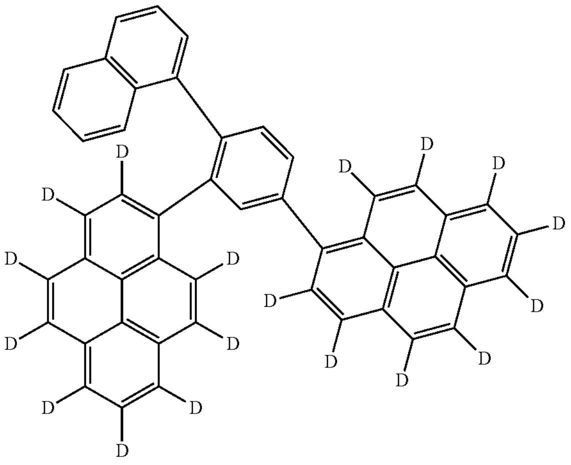
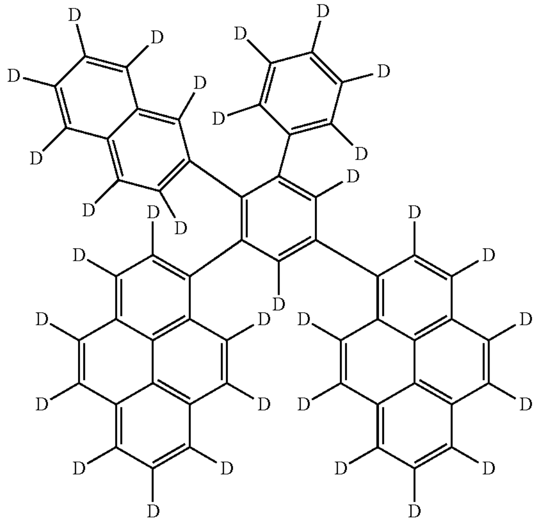
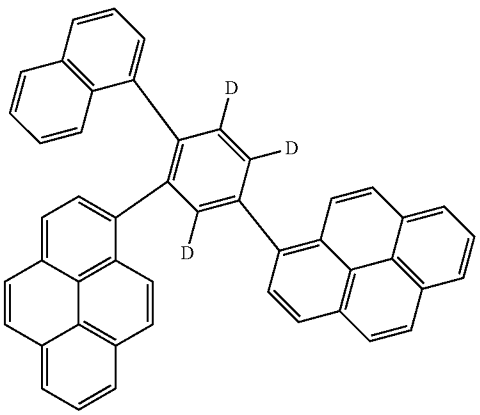
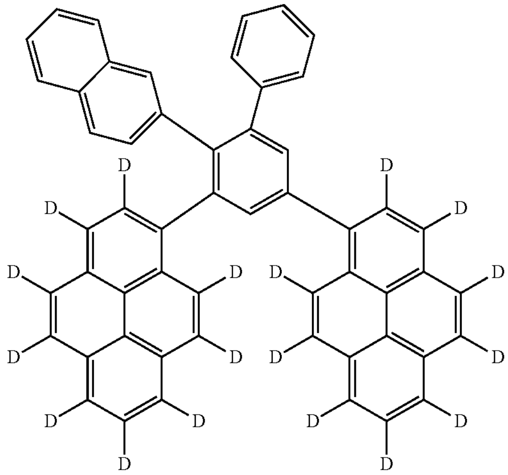
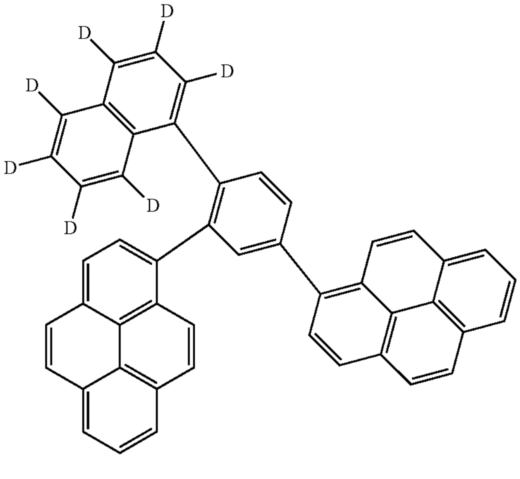
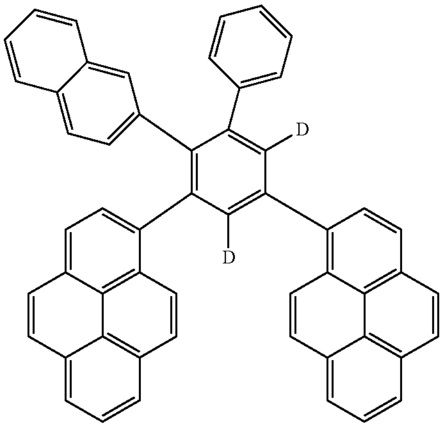

-continued
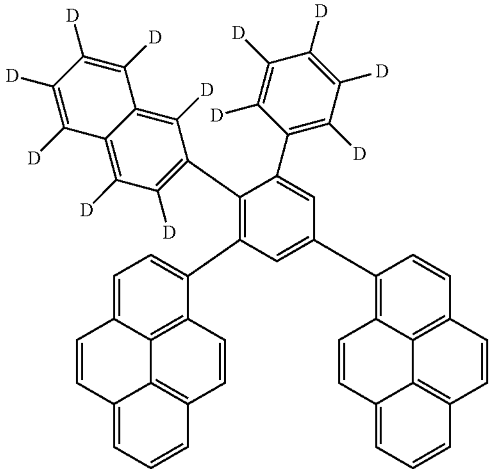
[Formula 245]
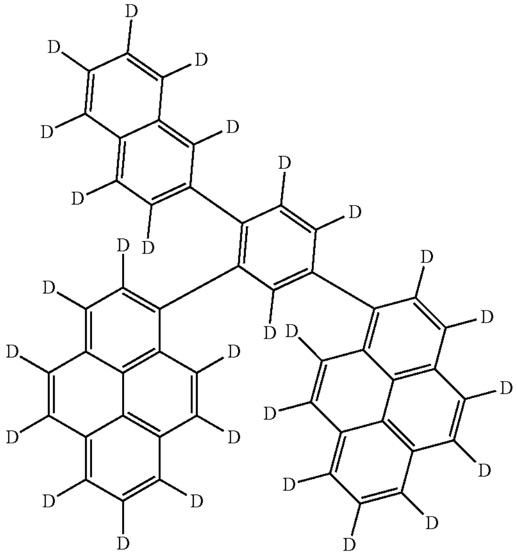
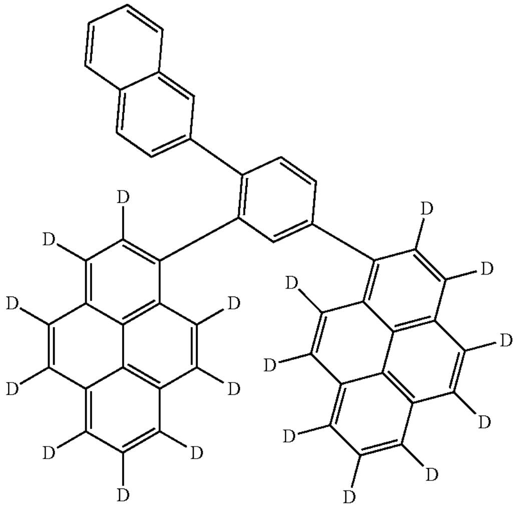
-continued
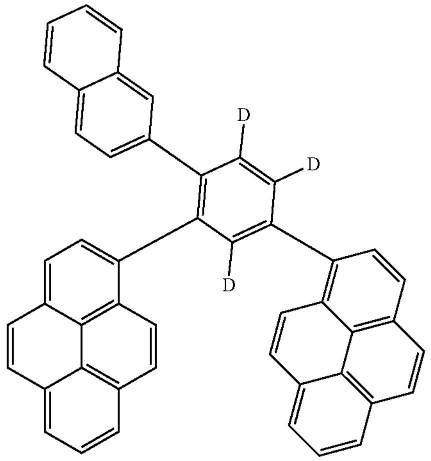
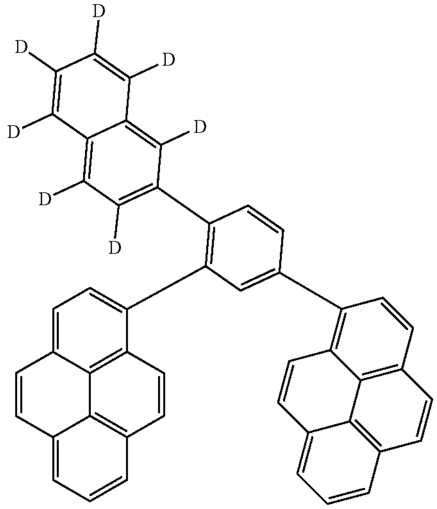
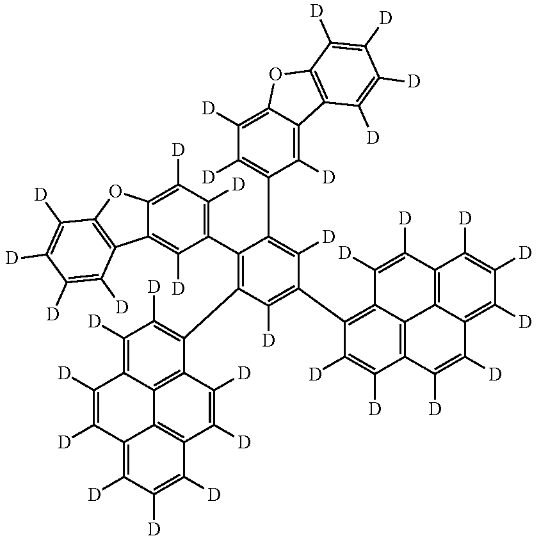

-continued
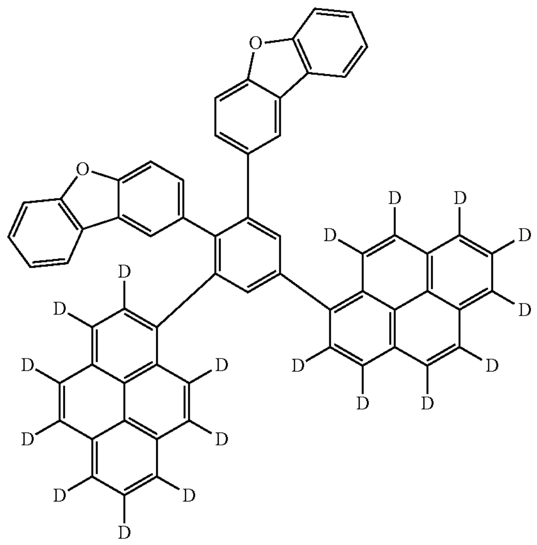
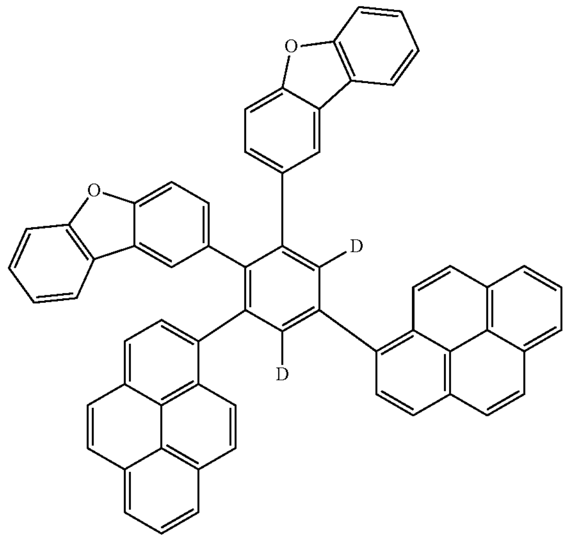
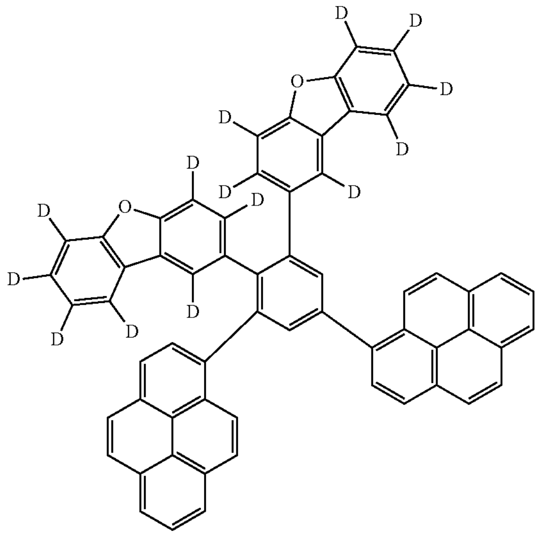
-continued
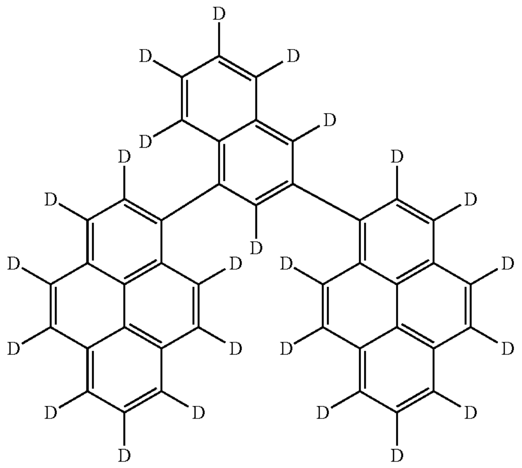
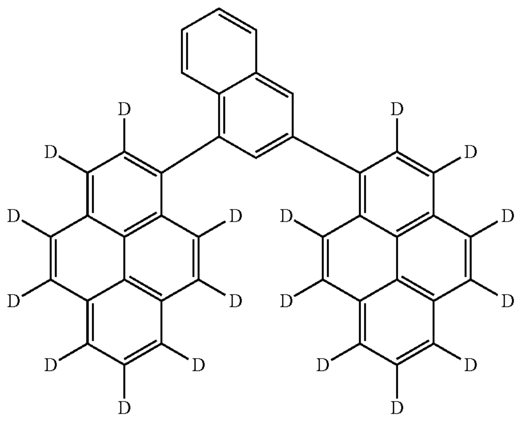
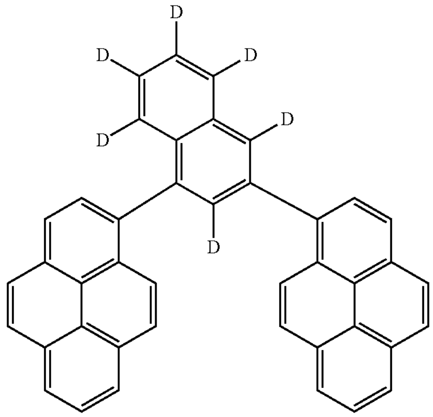

-continued
-continued
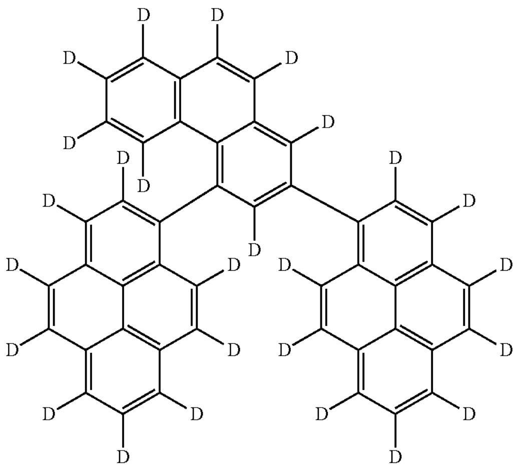
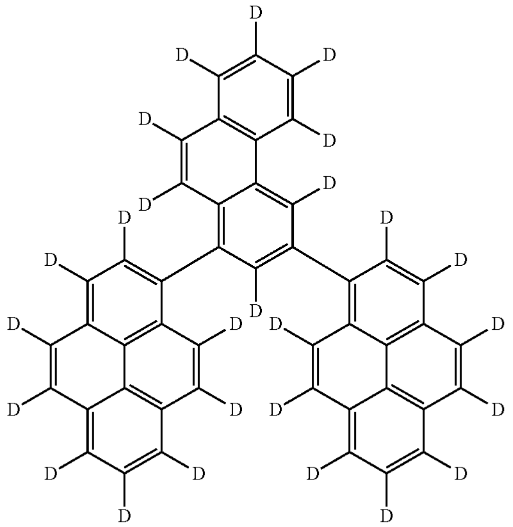
[Formula 246]
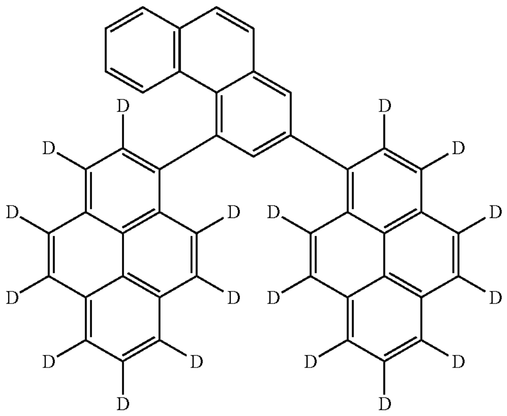
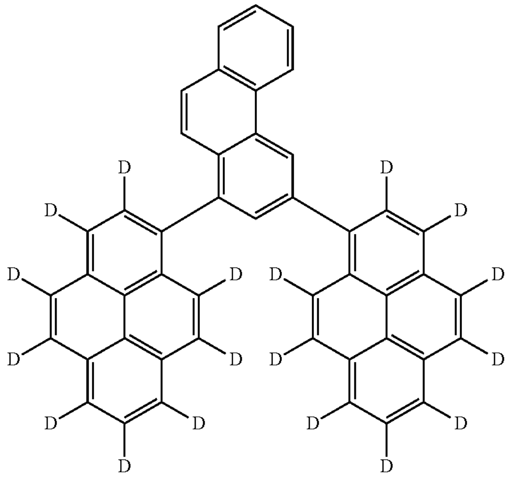
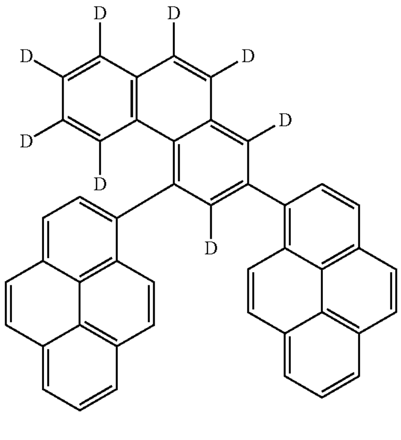
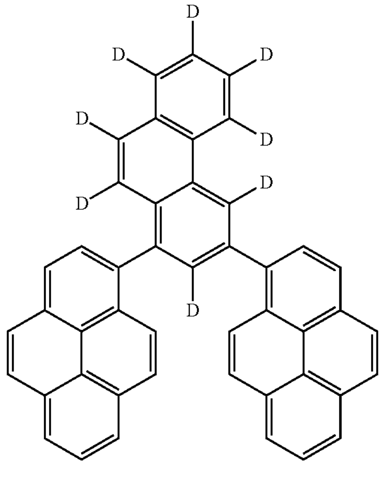

-continued
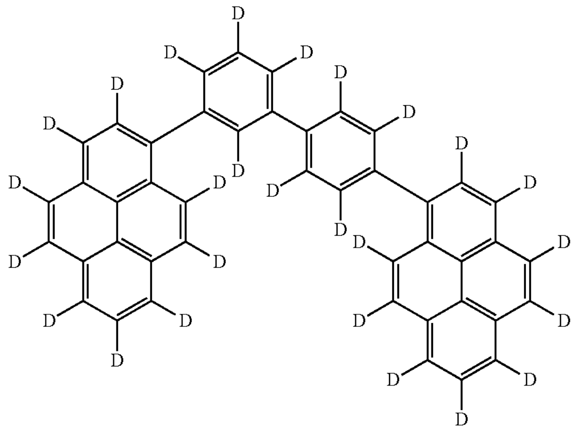
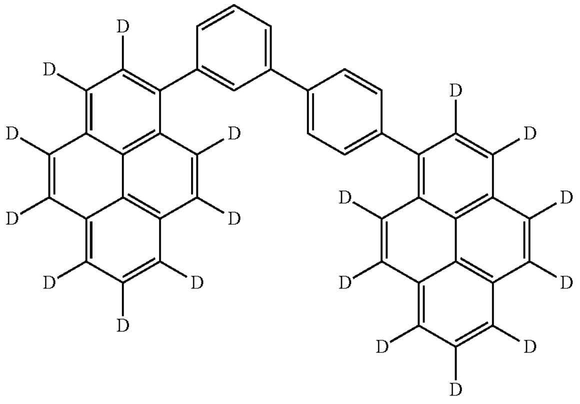
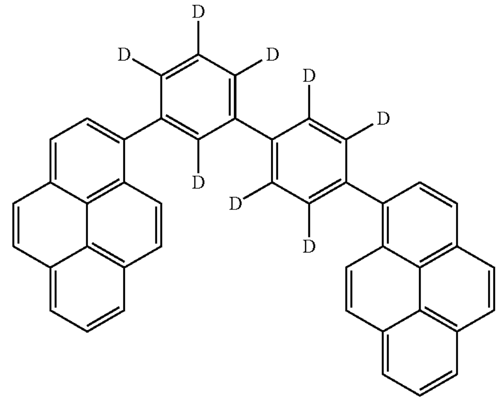
-continued
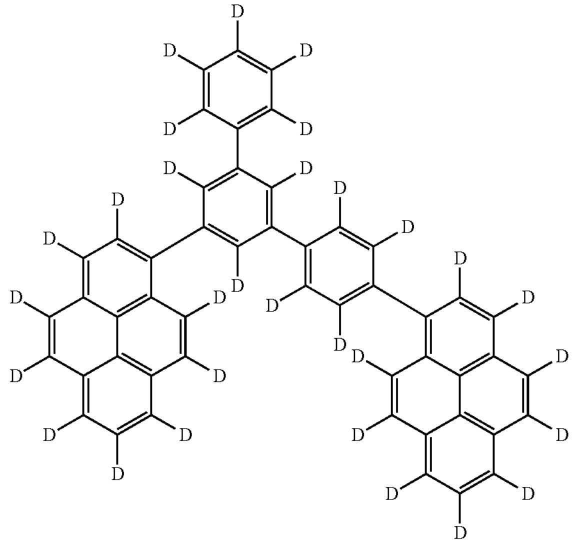
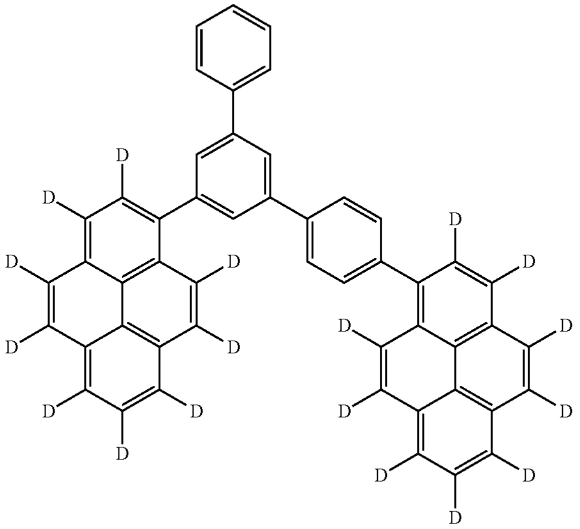
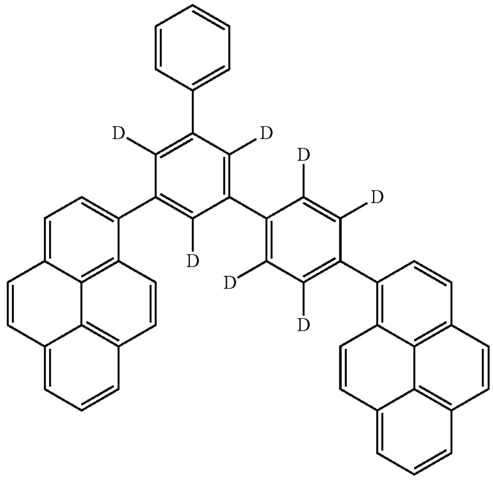

-continued
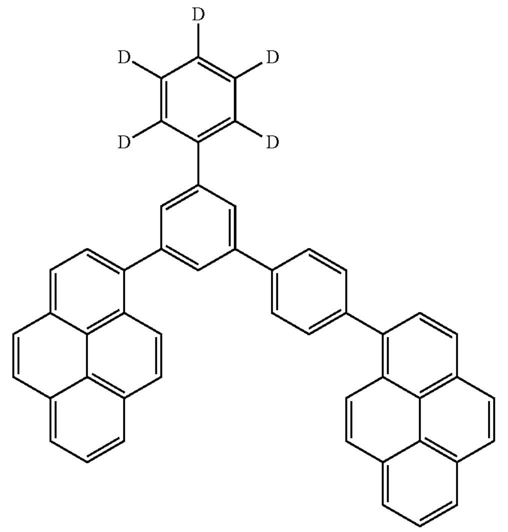
[Formula 247]
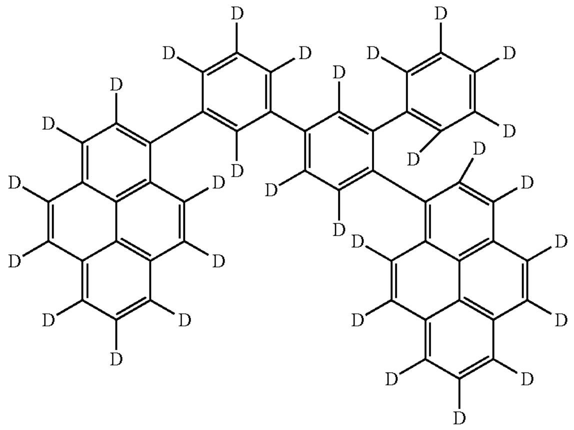
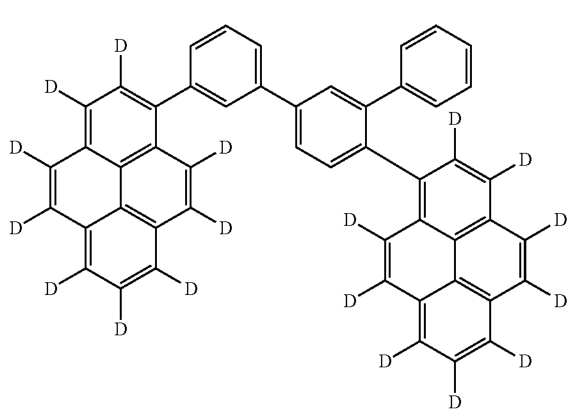
-continued
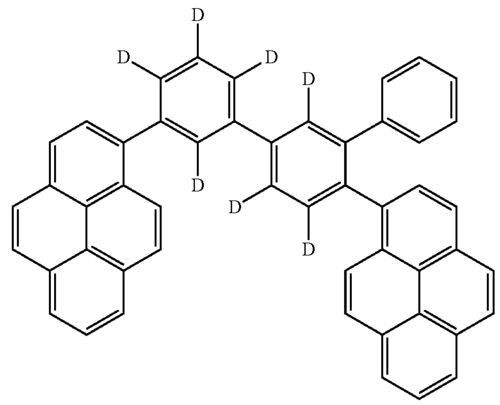
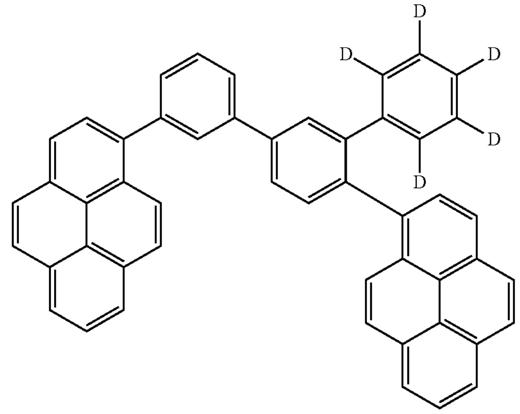
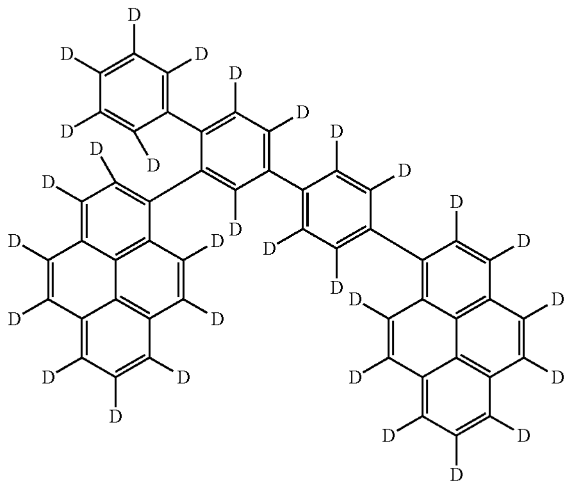

-continued
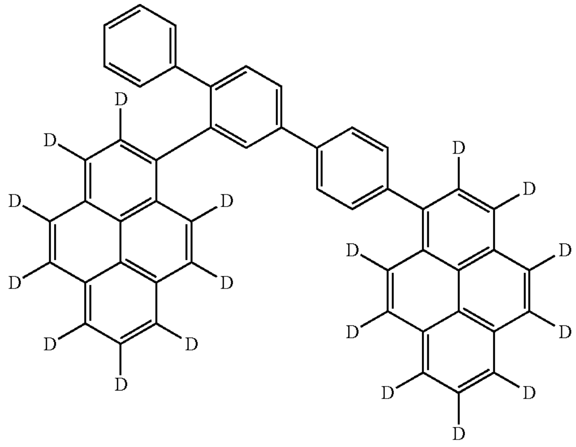
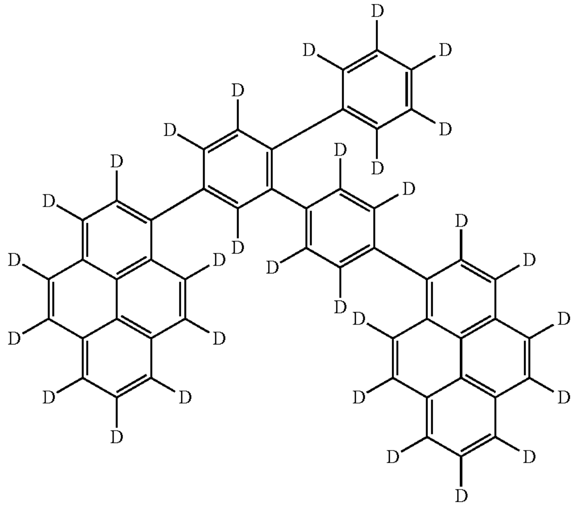
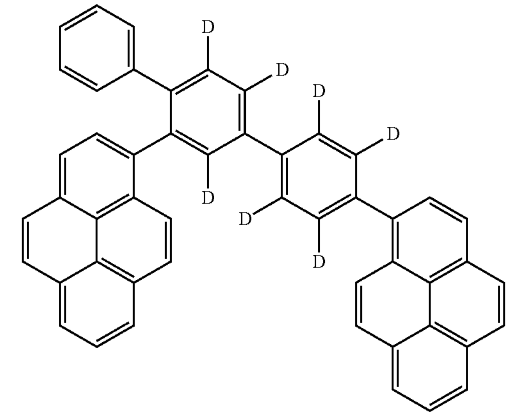
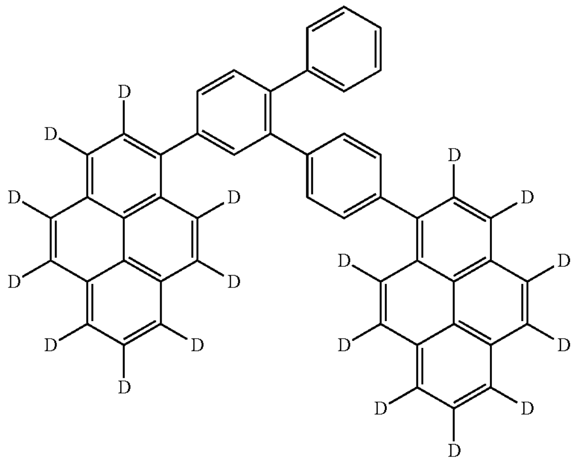
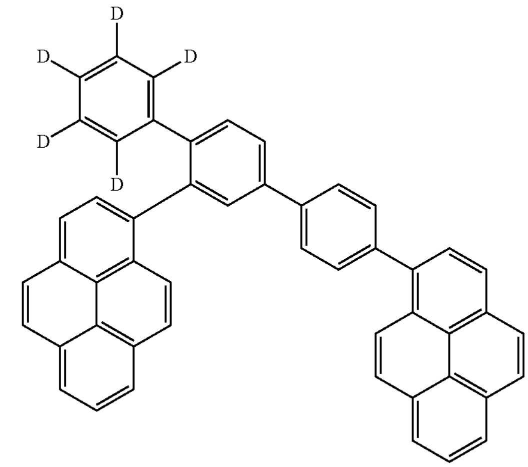
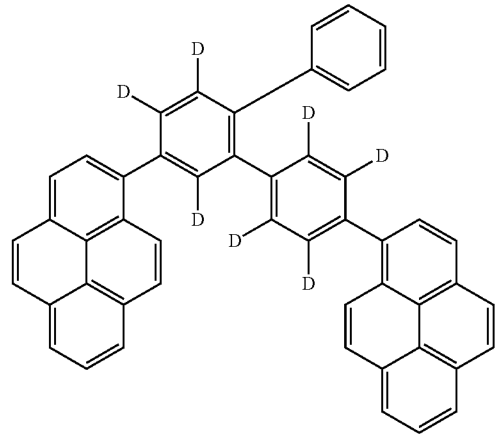

-continued
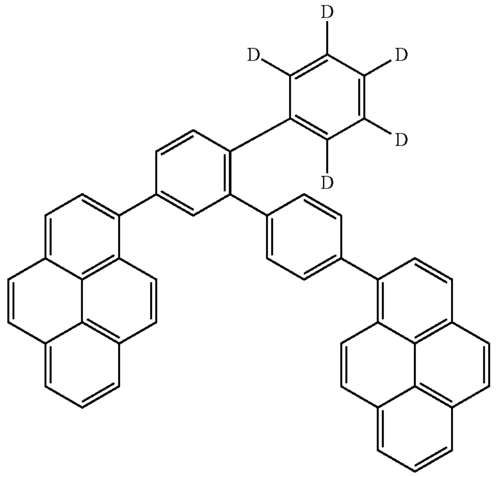
[Formula 248]
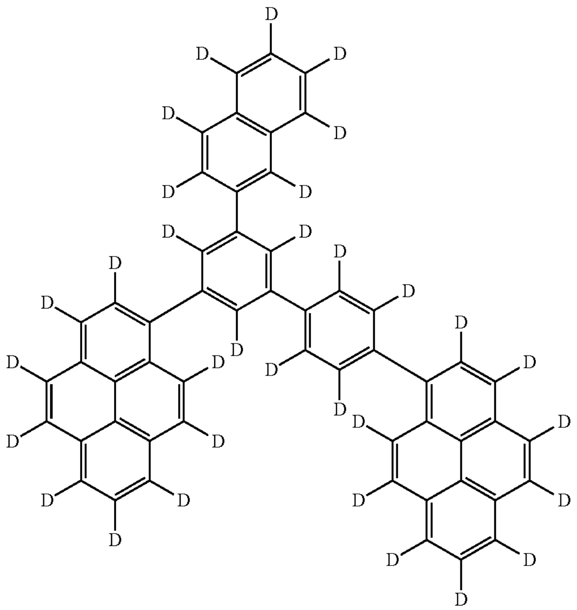
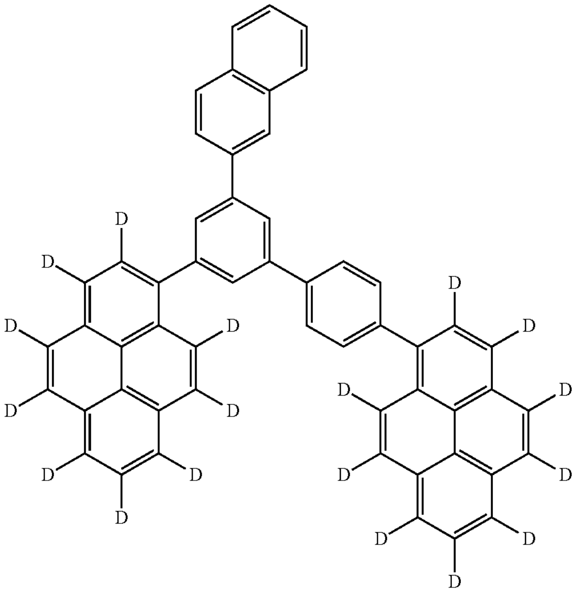
-continued
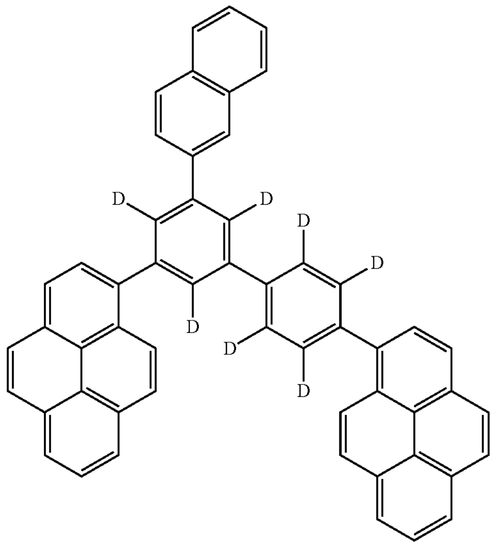
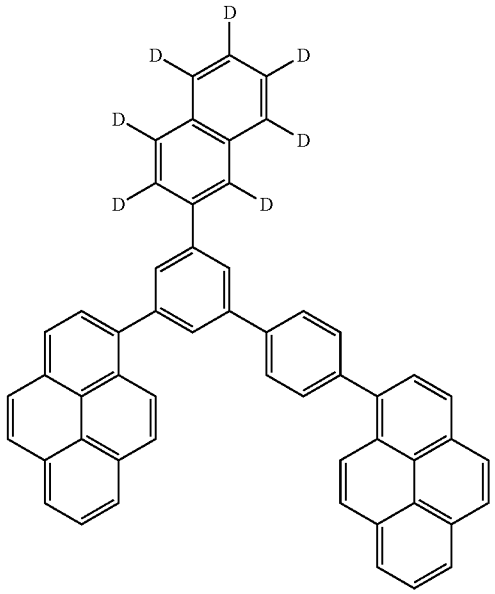
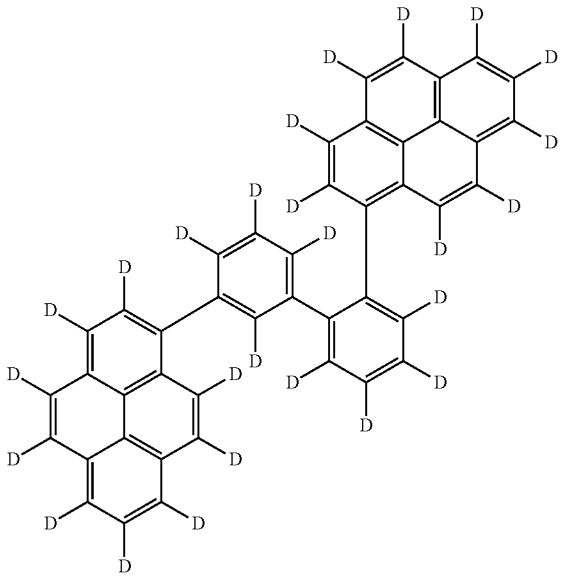

-continued
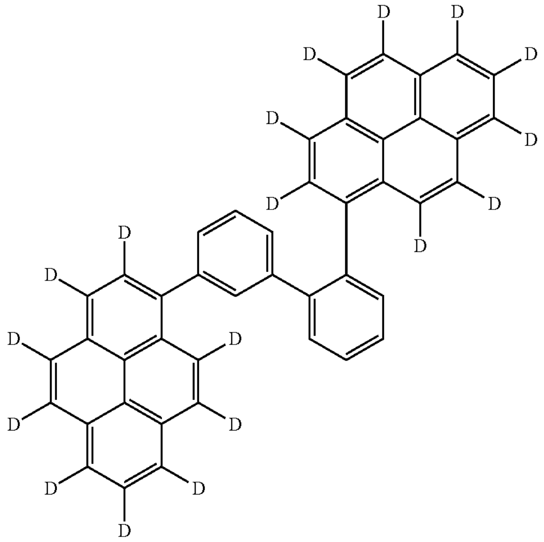
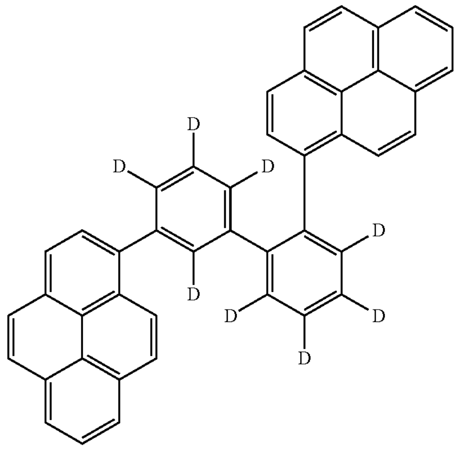
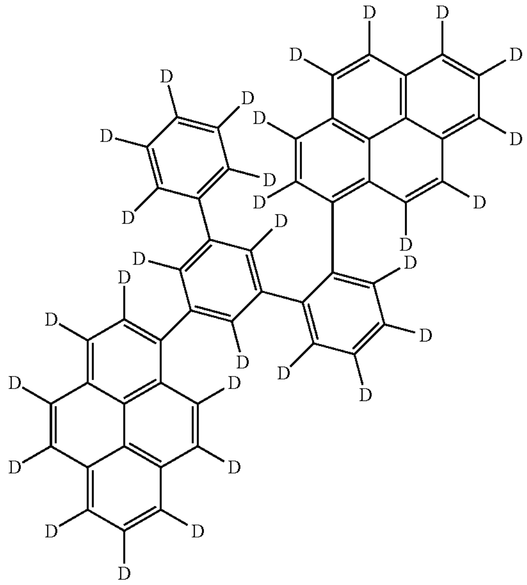
-continued
[Formula 249]
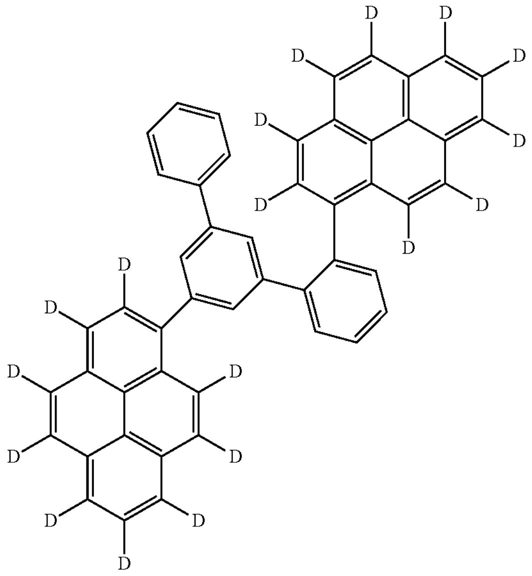
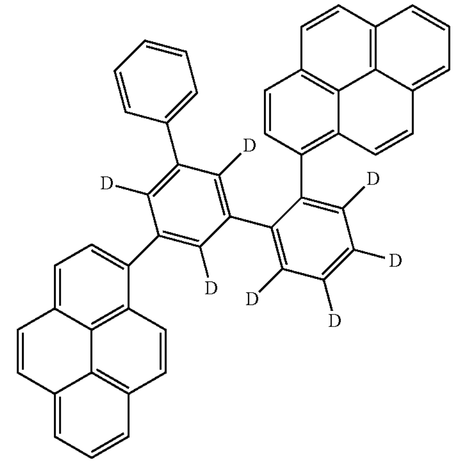
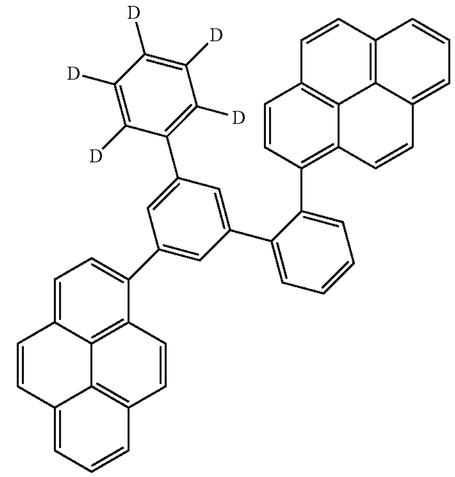

-continued
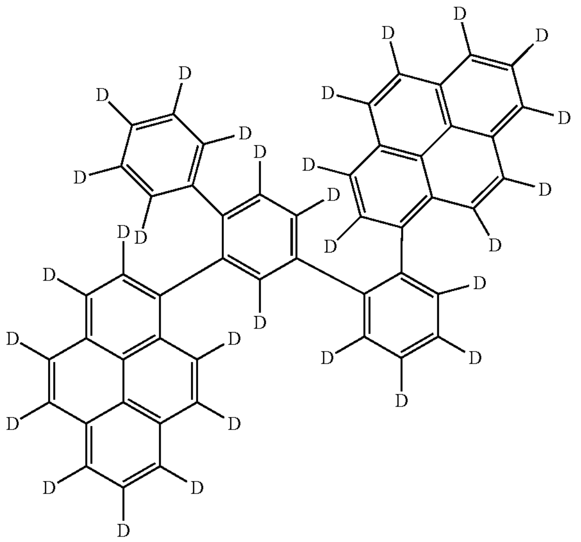
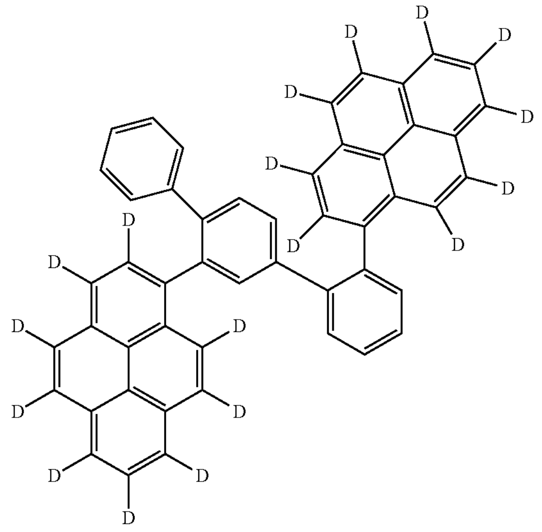
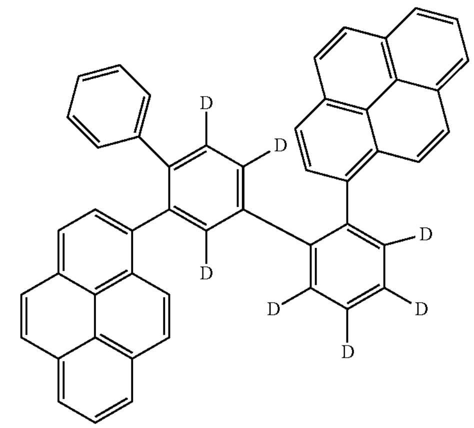
-continued
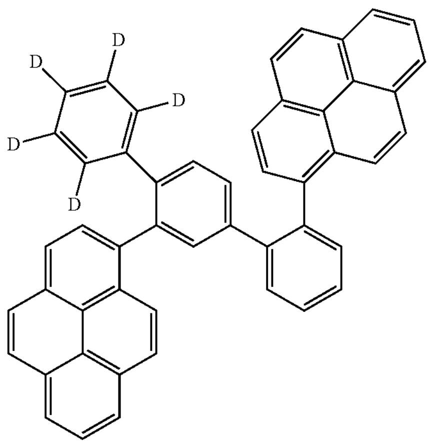
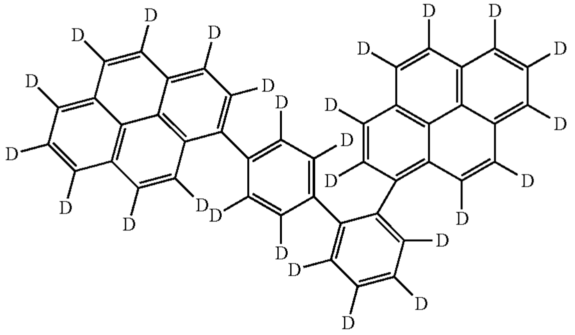
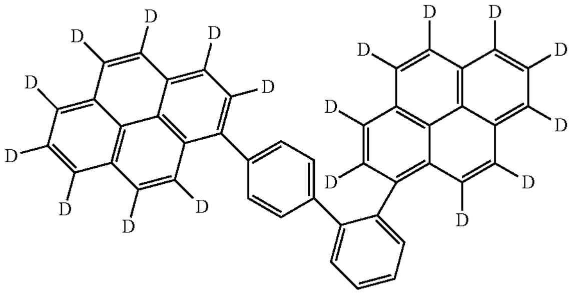
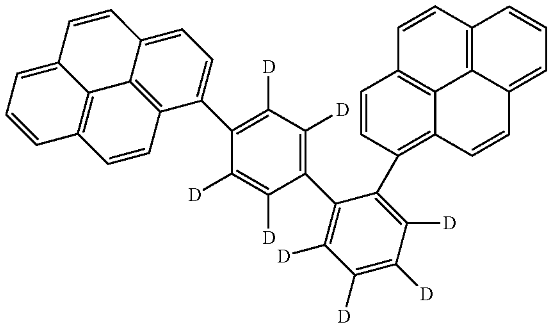

-continued
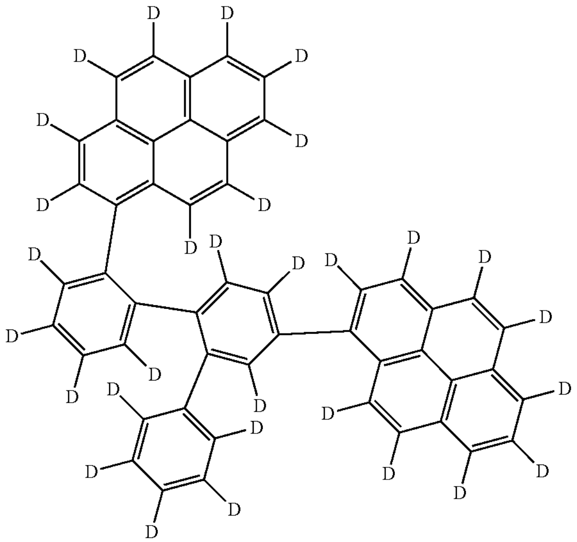
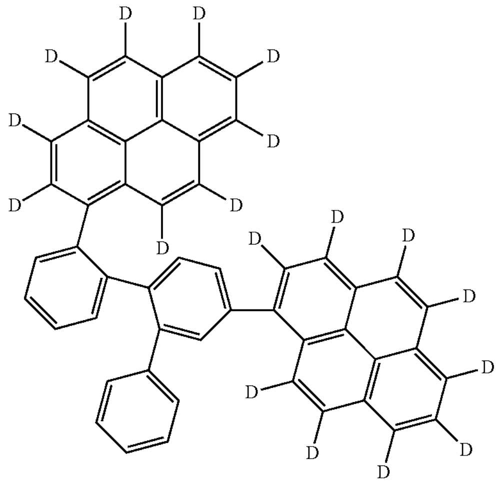
[Formula 250]
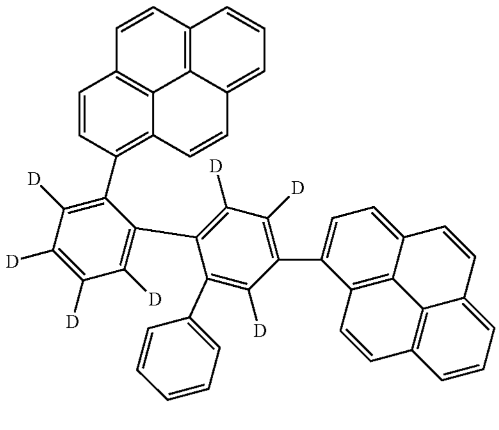
-continued
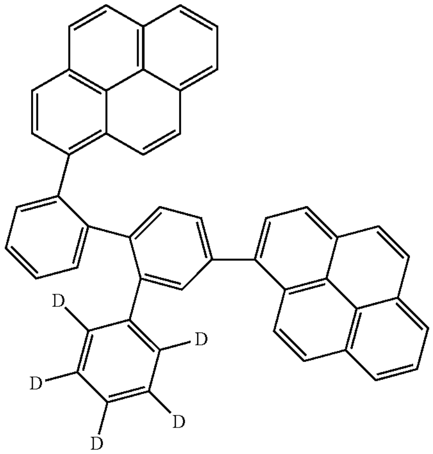
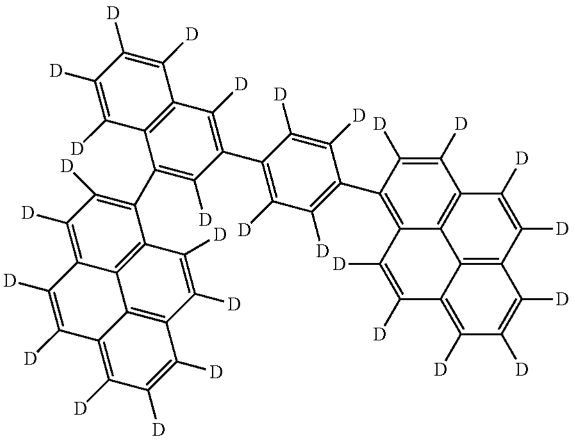
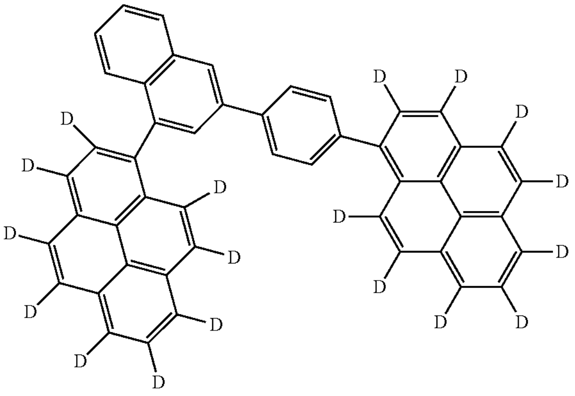
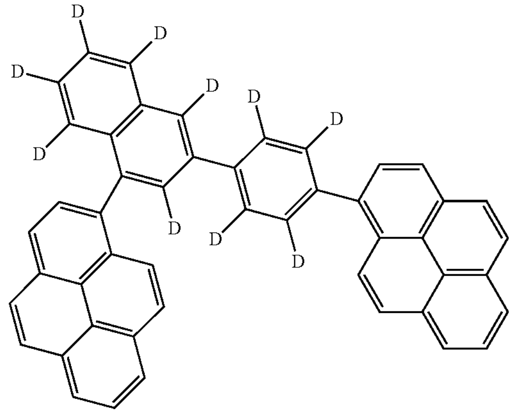

-continued
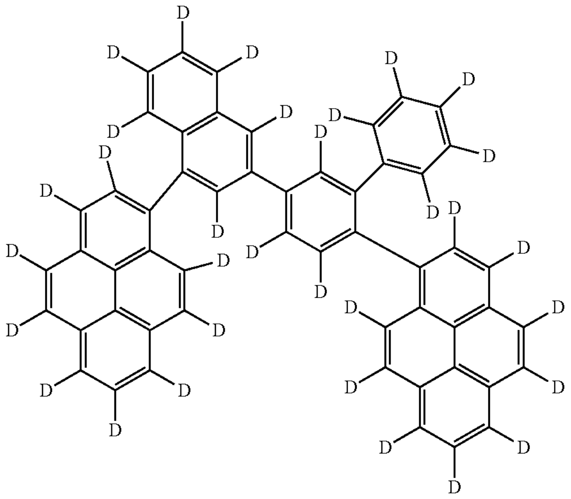
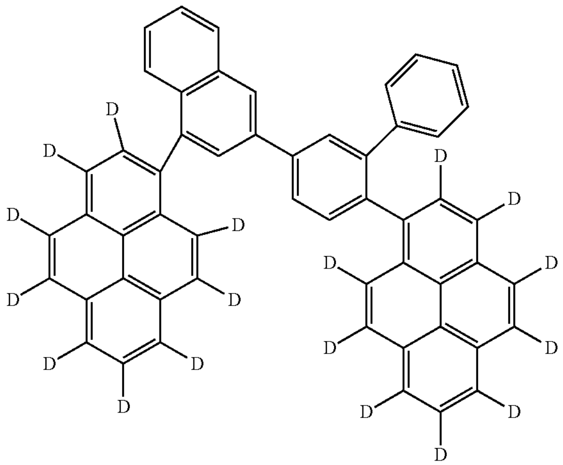
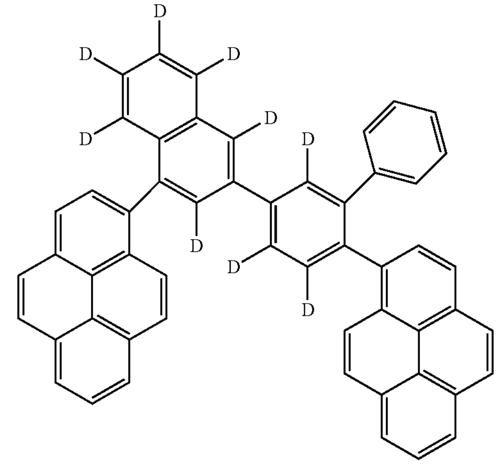
-continued
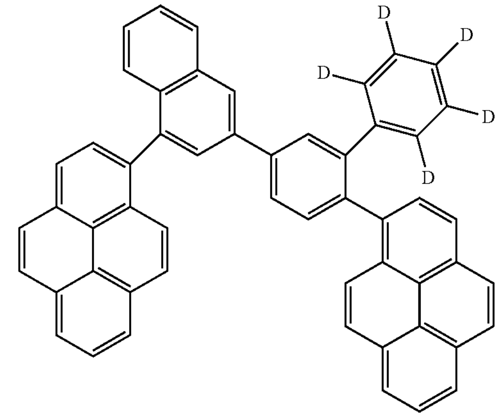
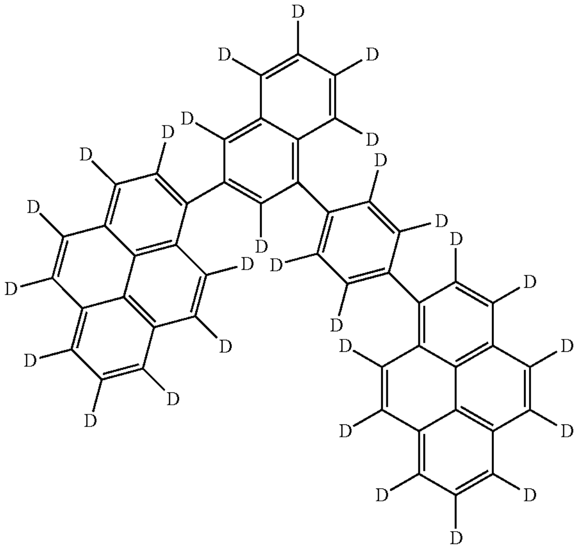
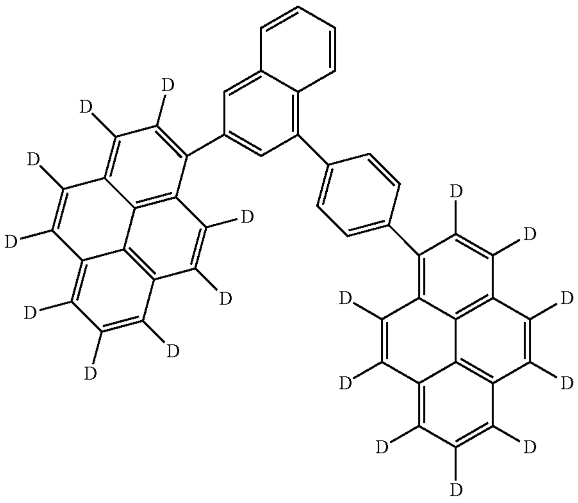

-continued
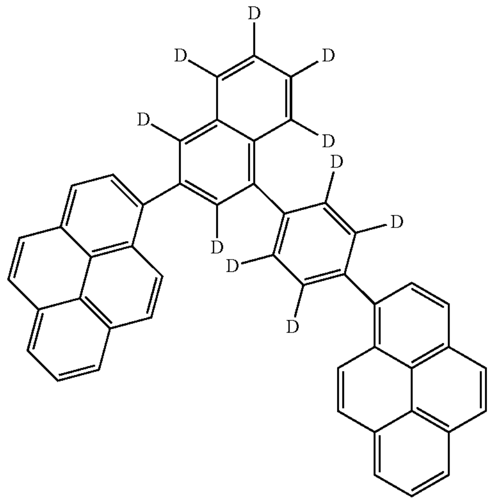
-continued
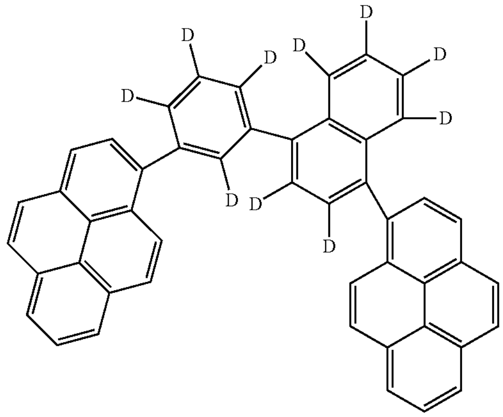
[Formula 251]
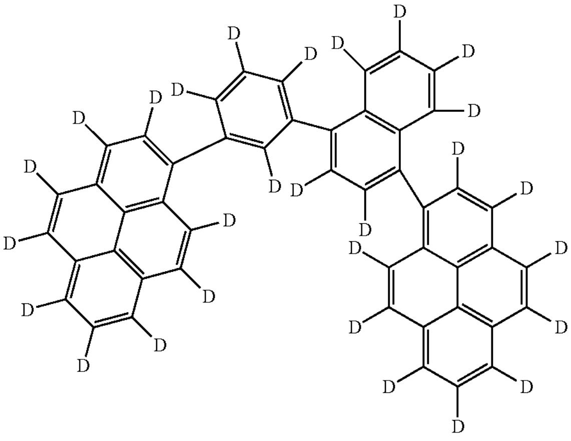
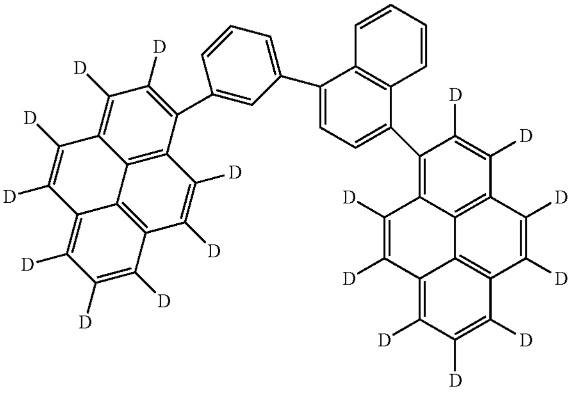
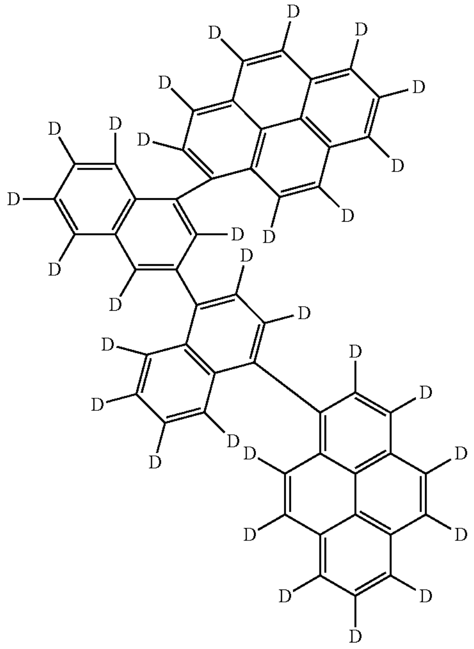

[Formula 252]
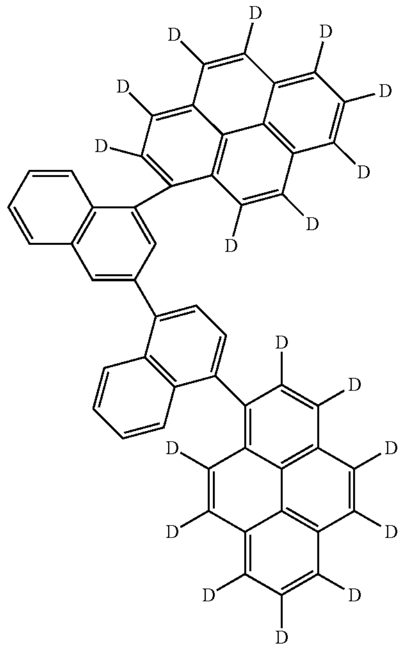
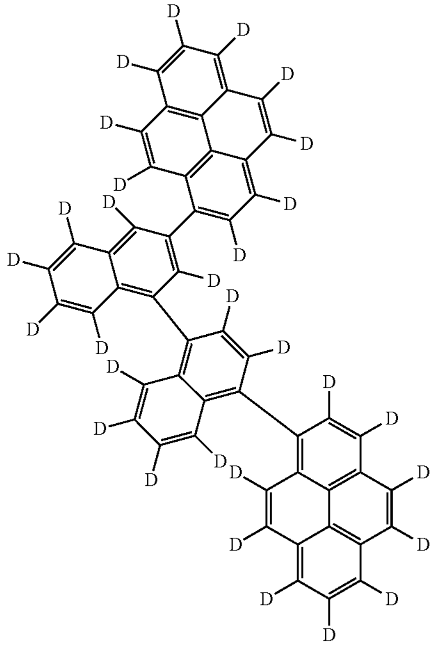
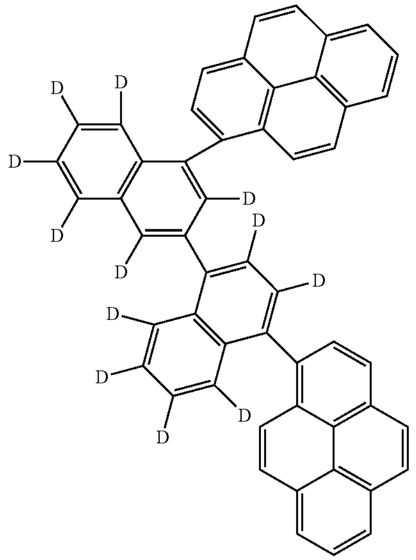
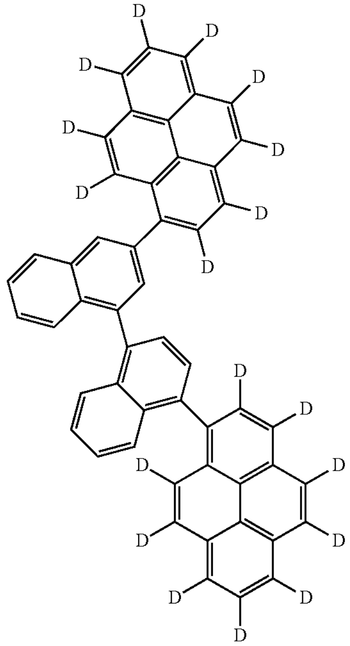

-continued
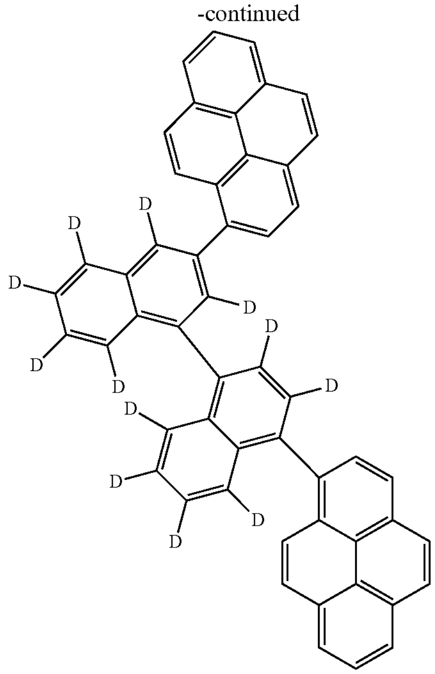
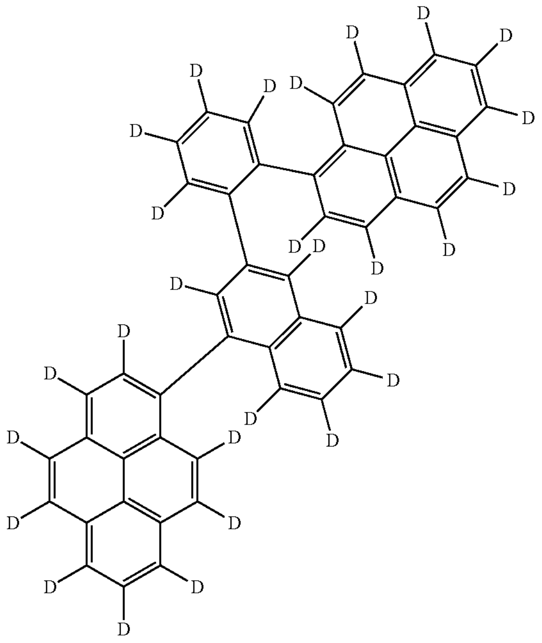
-continued
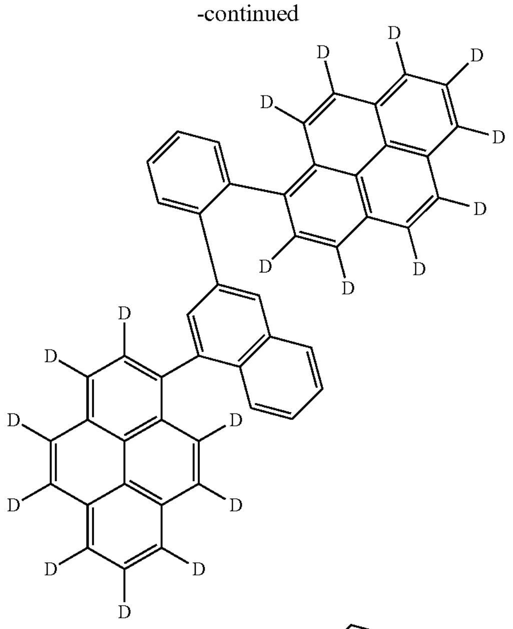
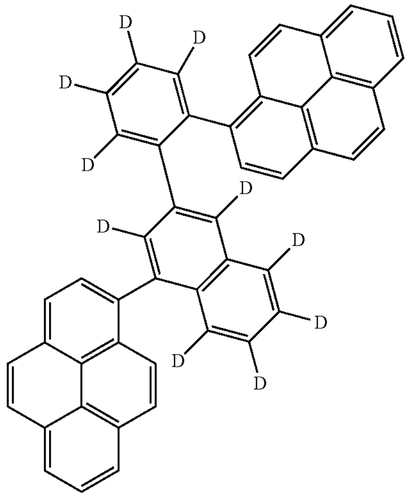
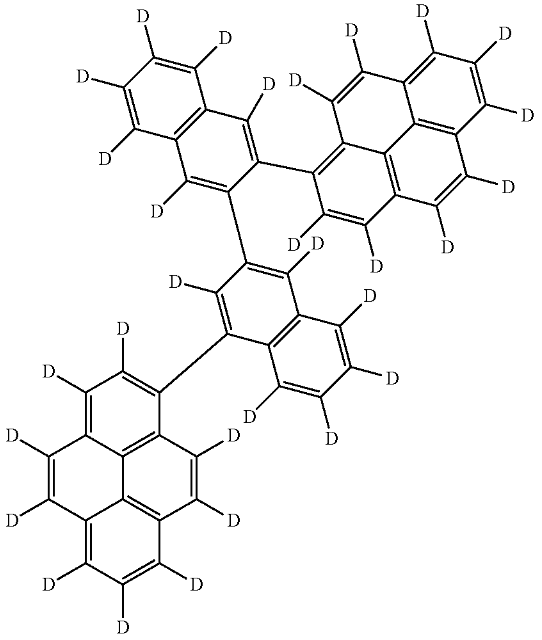

-continued
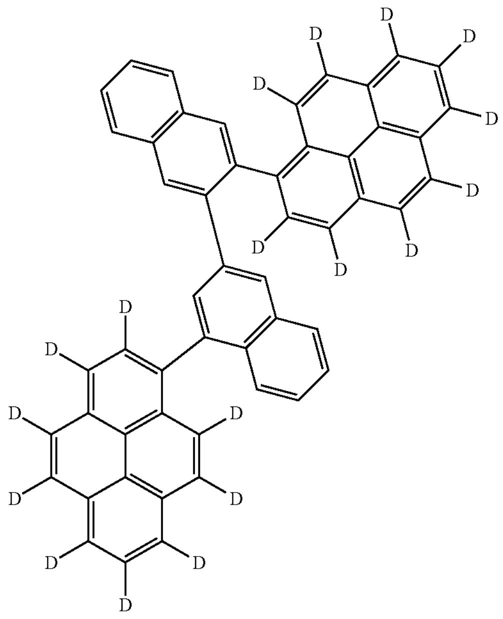
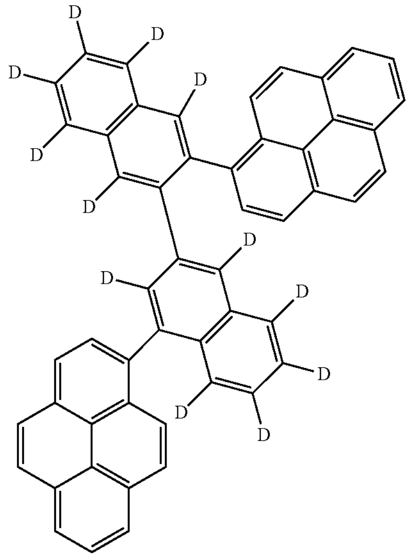
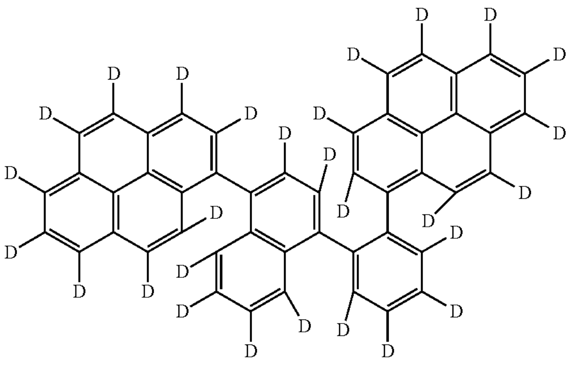
-continued
[Formula 253]
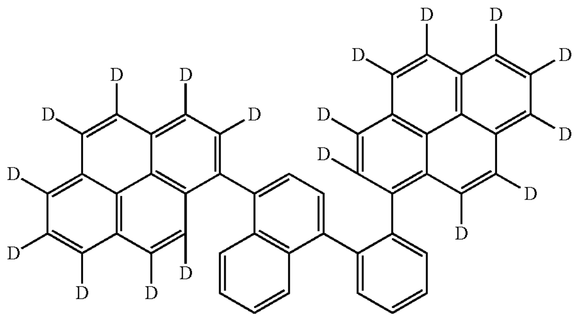
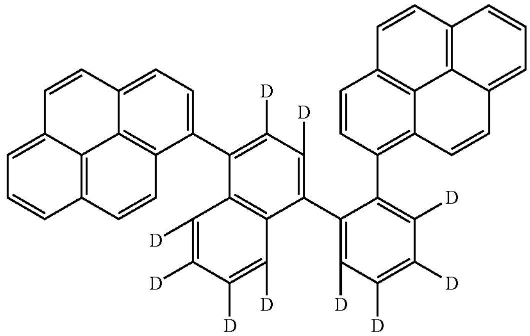
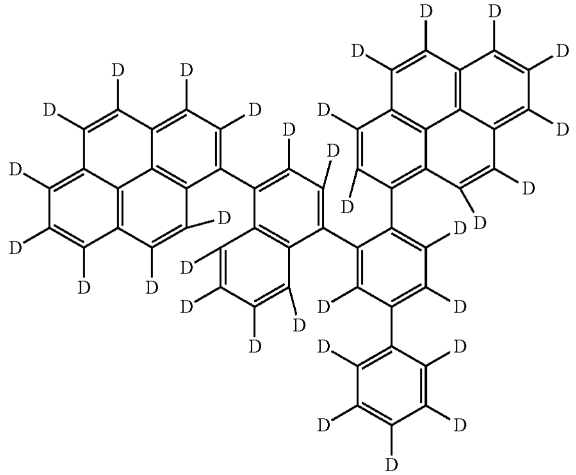
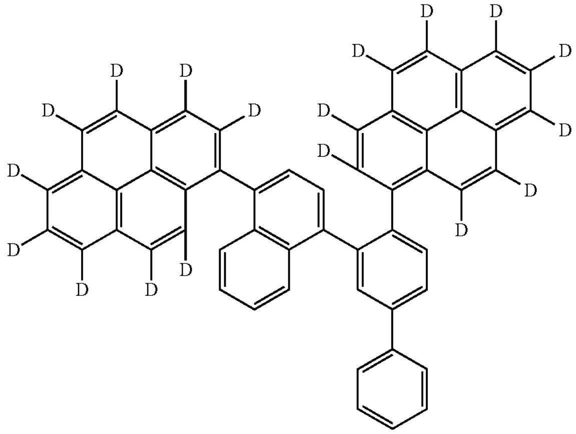

-continued
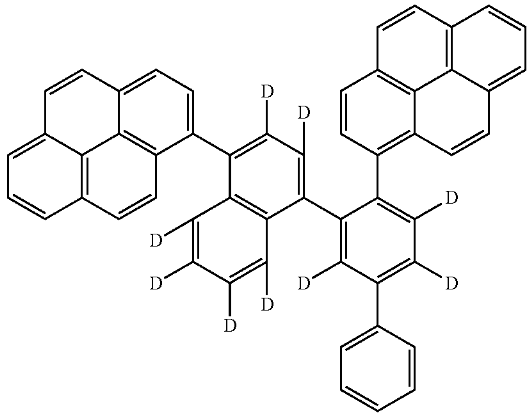
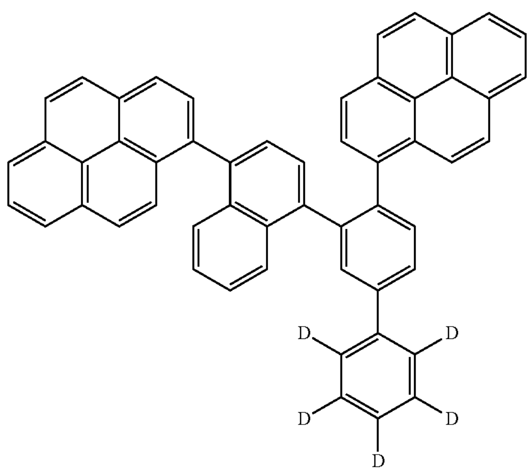
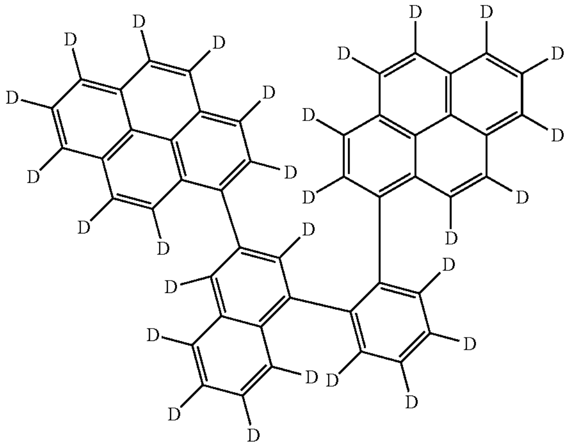
-continued
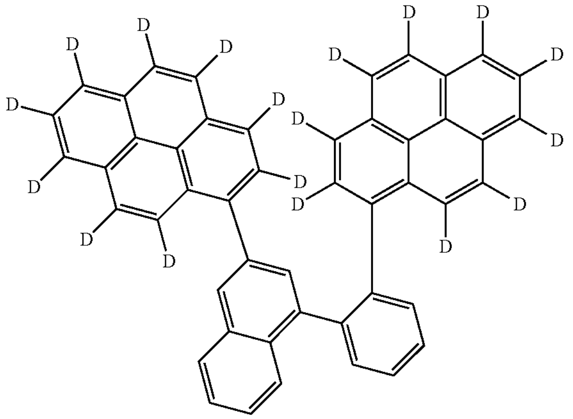
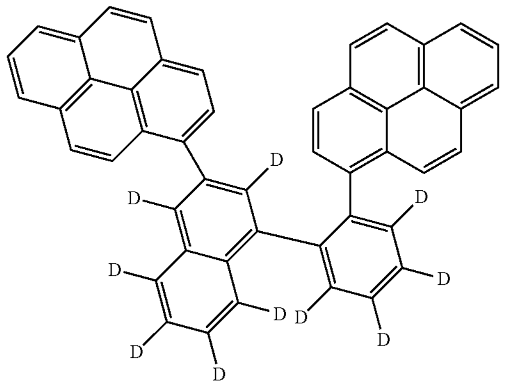
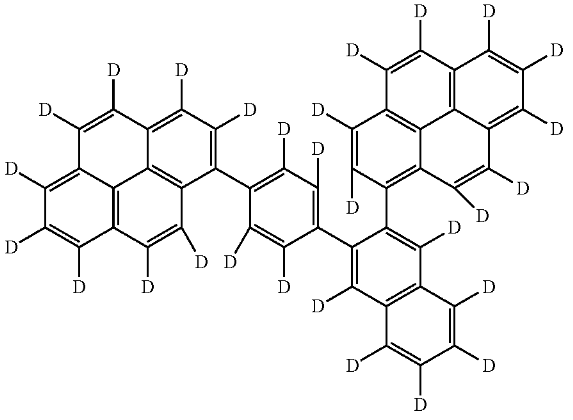
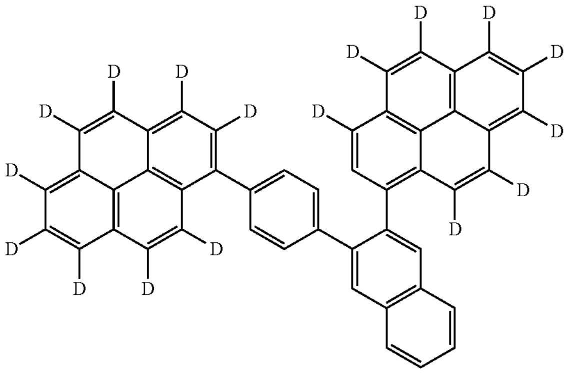

-continued
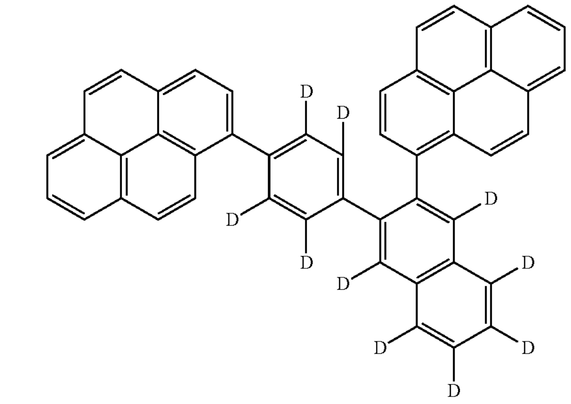
[Formula 254]
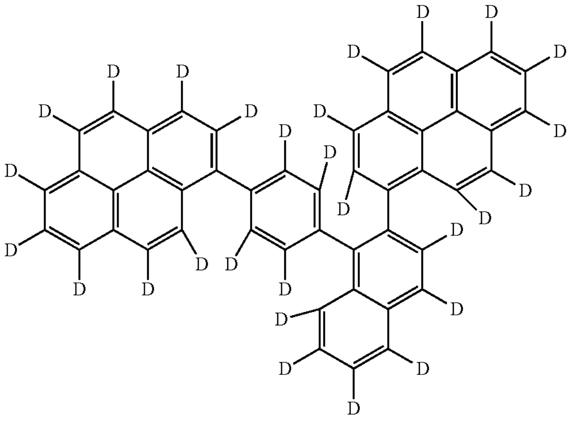
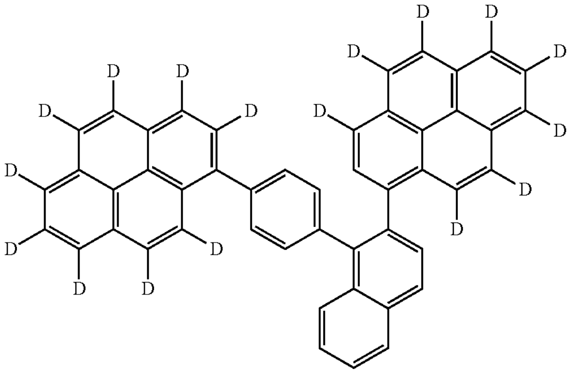
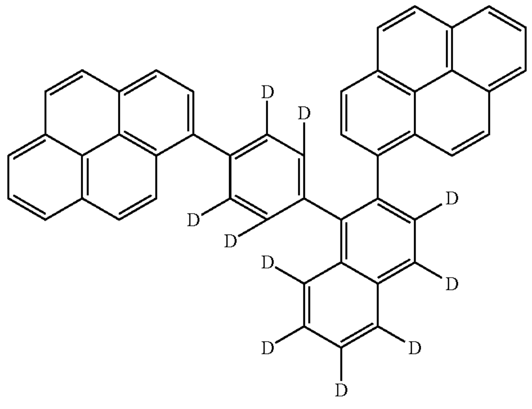
-continued
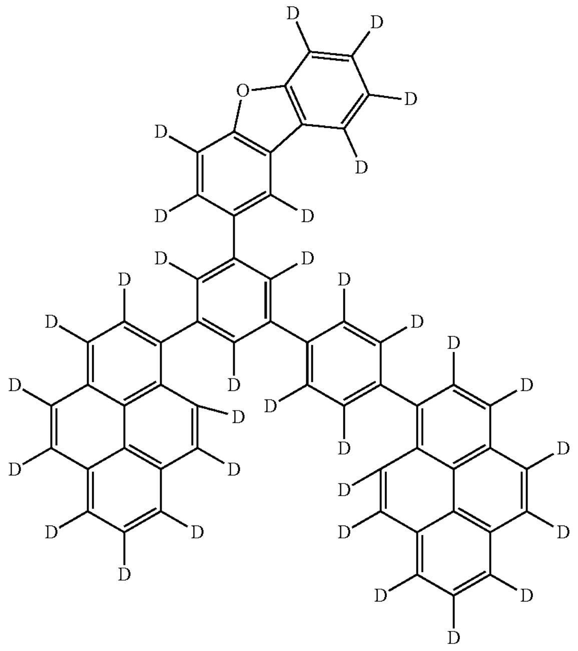
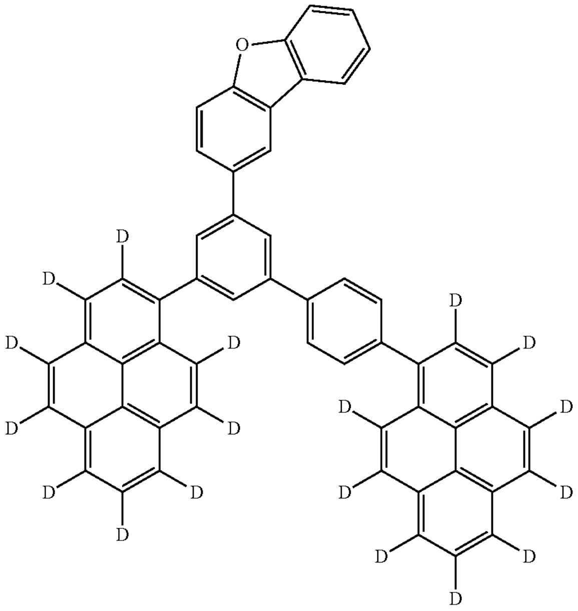

-continued
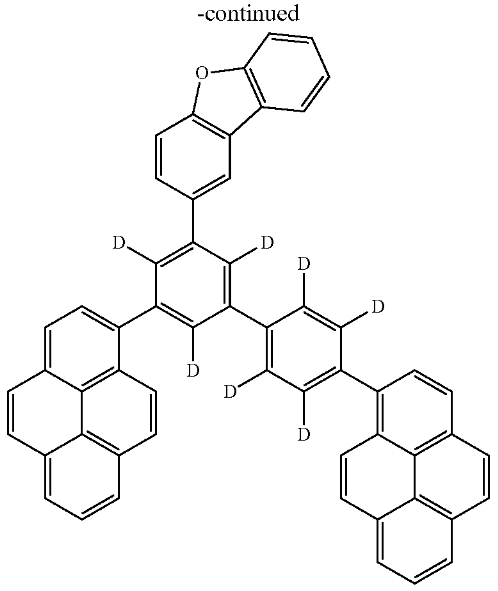
-continued
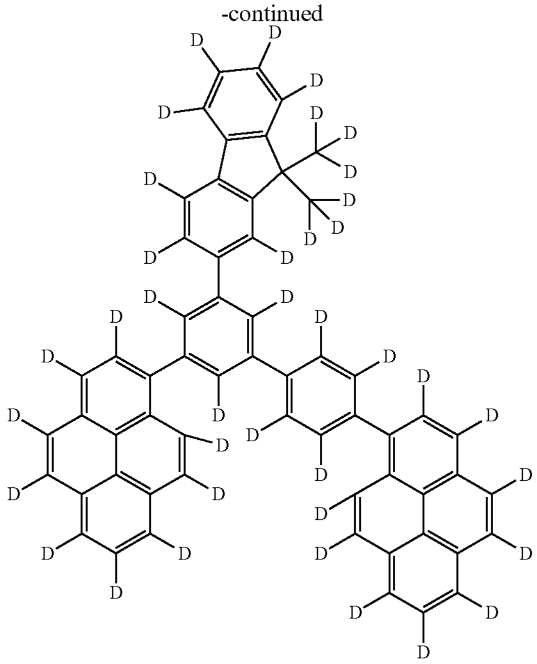
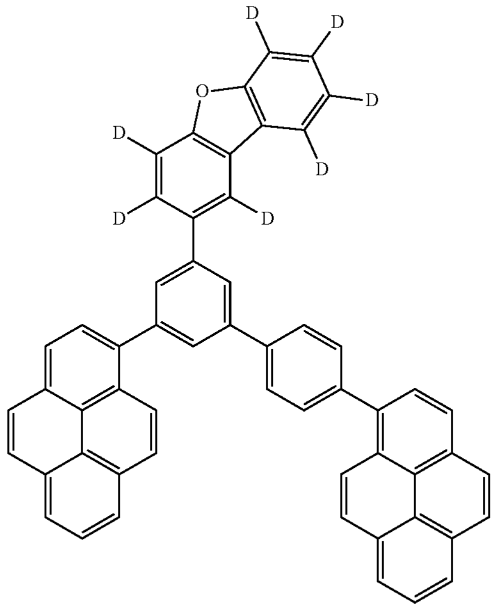
[Formula 255]
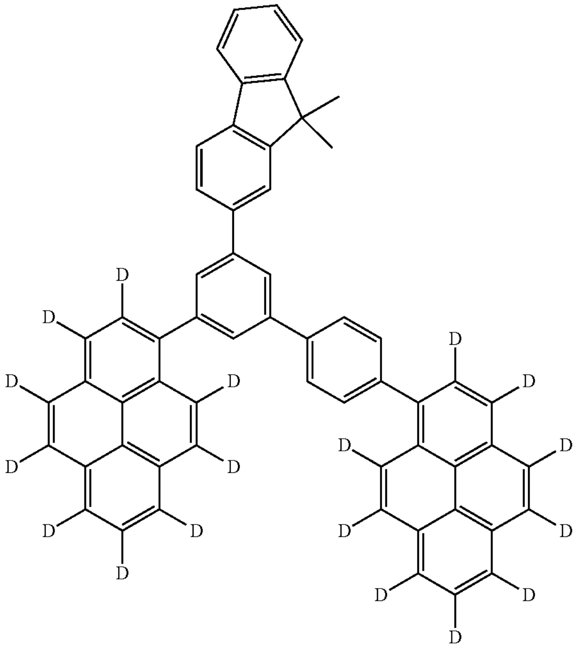

-continued
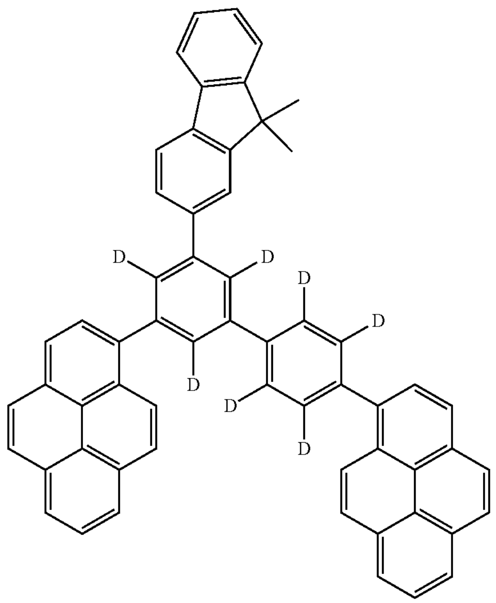
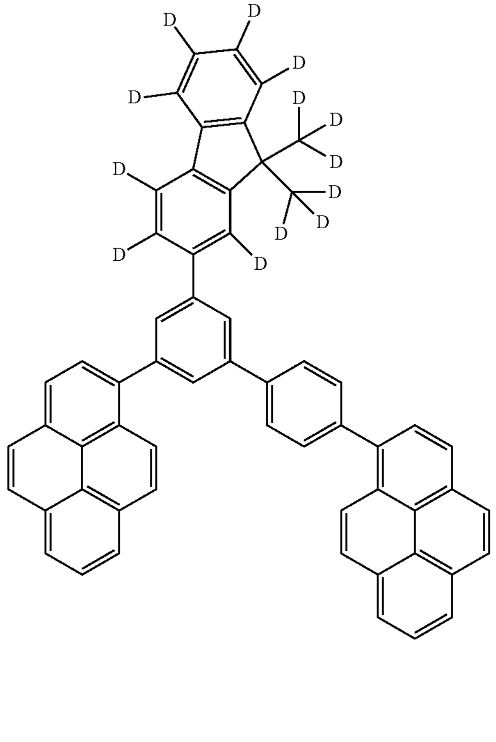
-continued
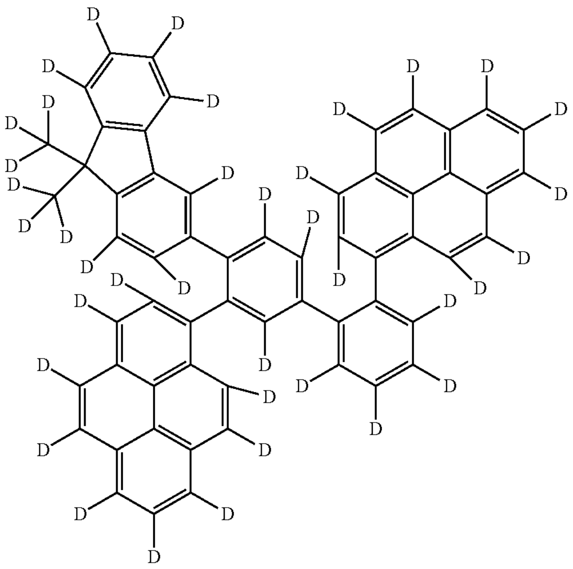
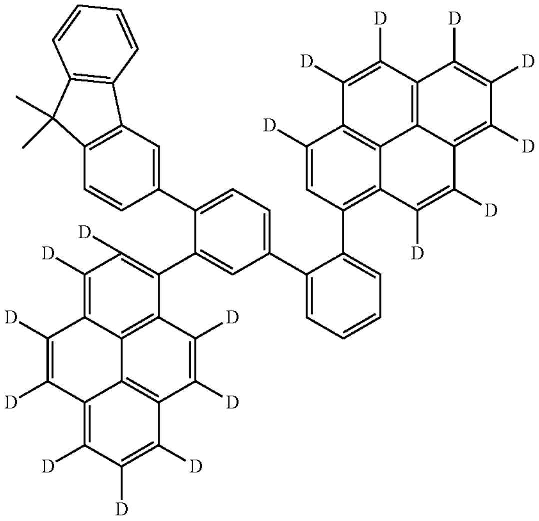
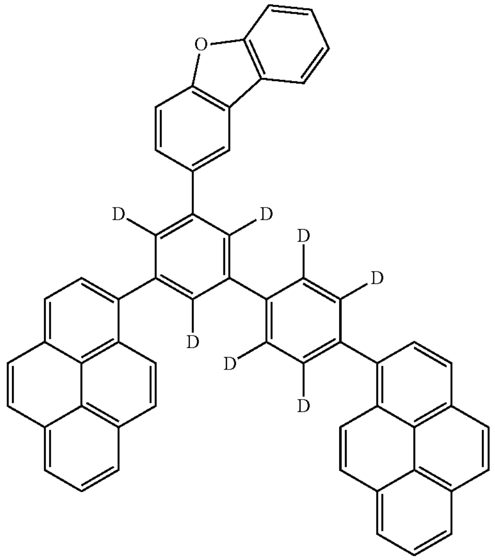

-continued
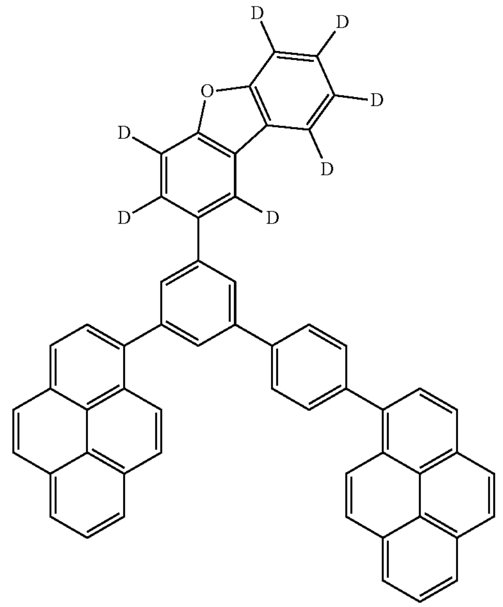
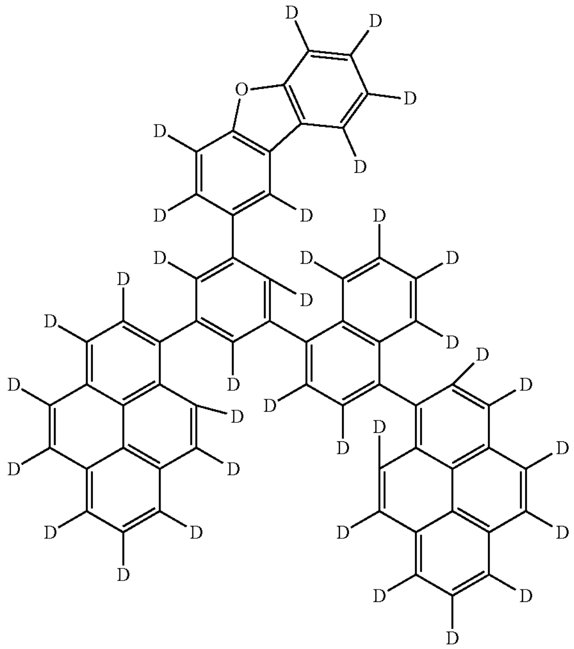
-continued
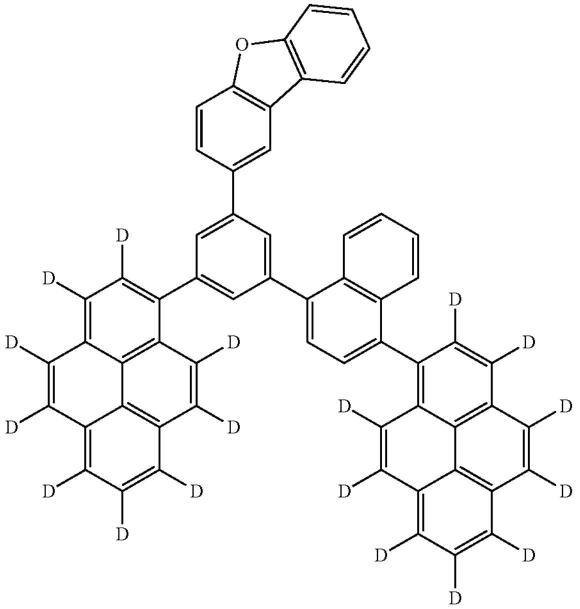
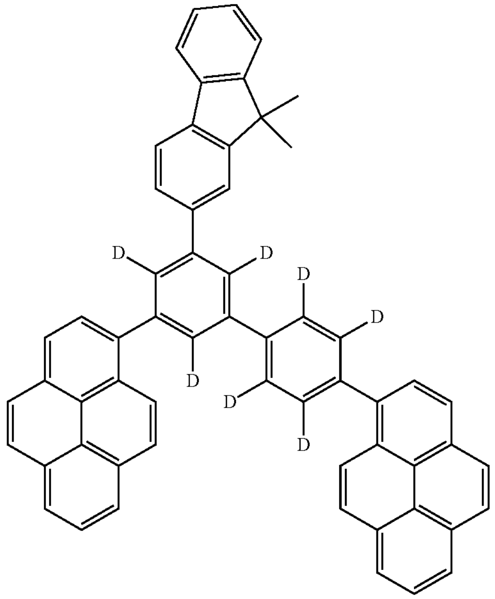

-continued
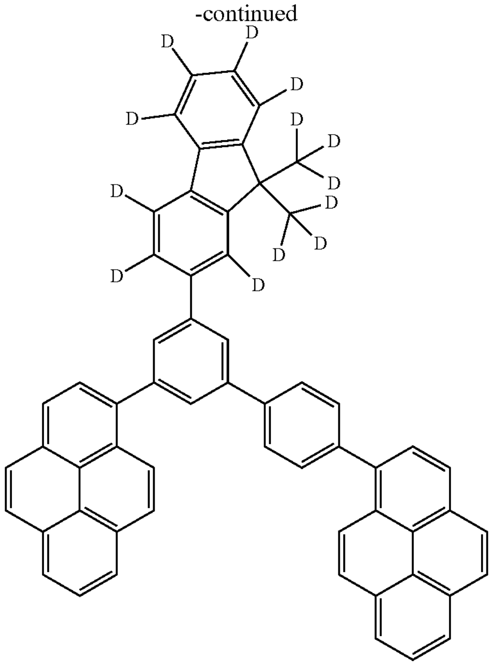
[Formula 256]
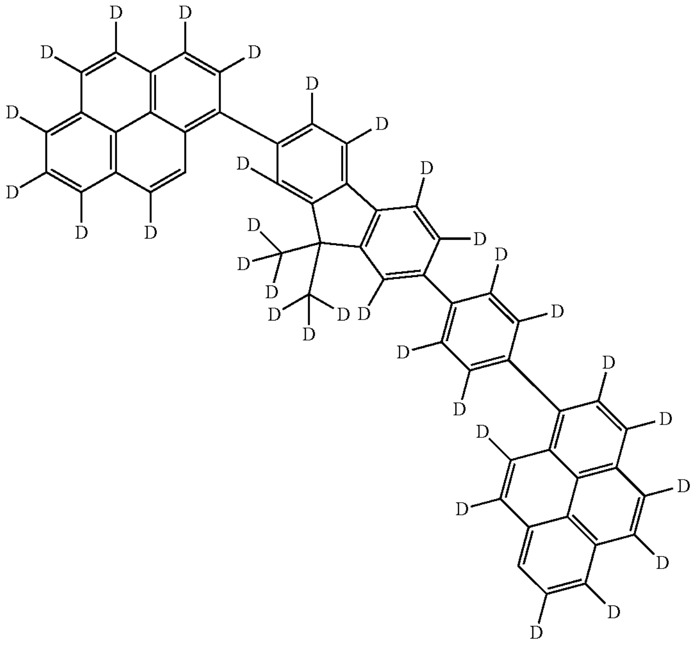

-continued
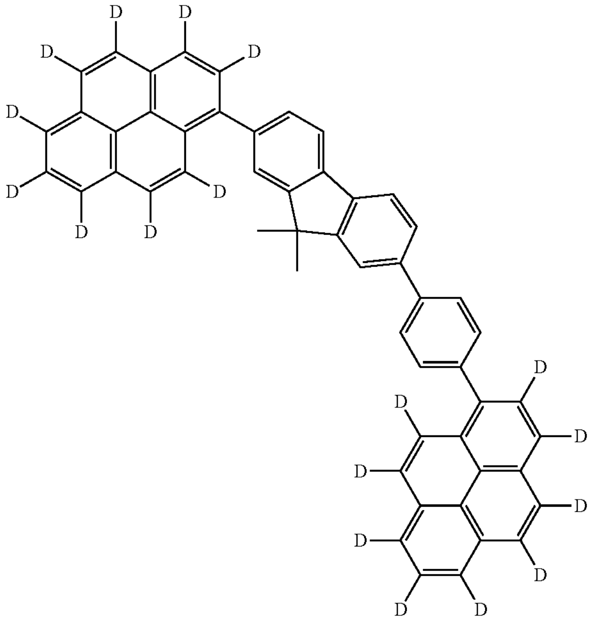
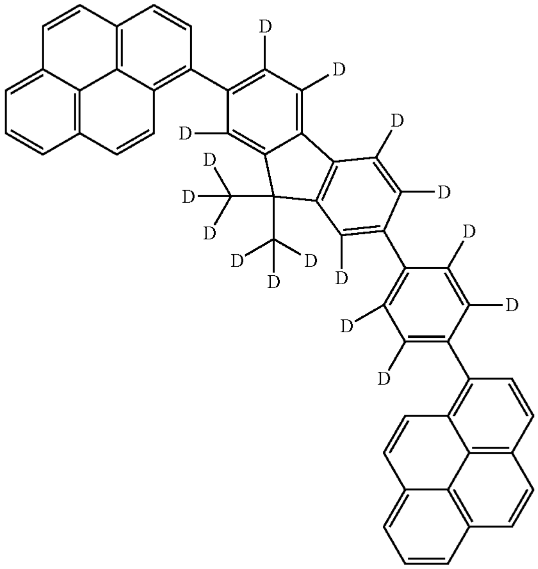
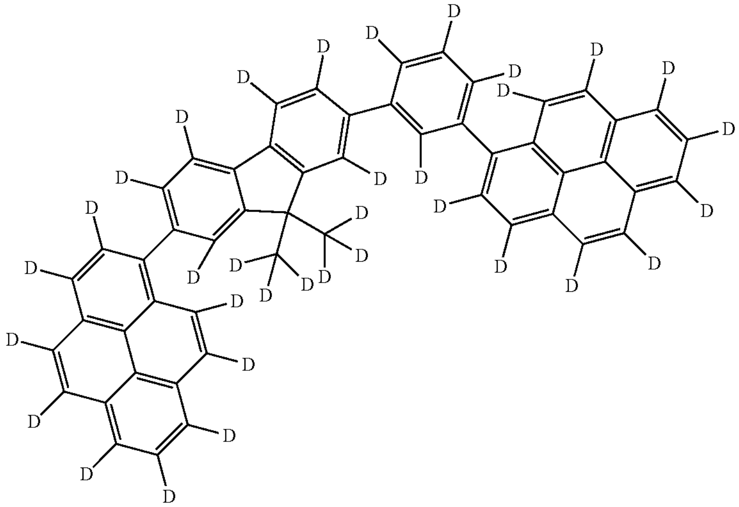

-continued
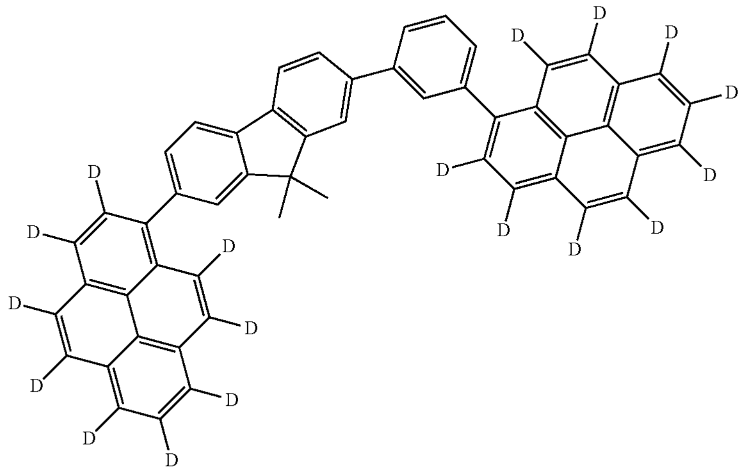
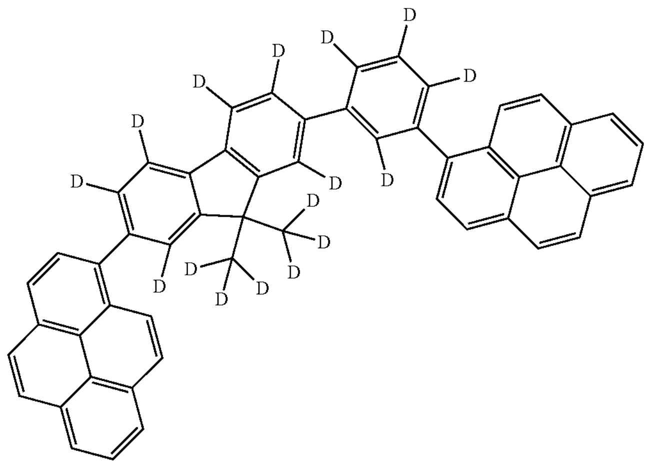 [SMILES: [2H]c1c([2H])c(-c2c([2H])c([2H])c3c(c2[2H])C(C([2H])([2H])[2H])(C([2H])([2H])[2H])c2c([2H])c(-c4ccc5ccc6cccc7ccc4c5c67)c([2H])c([2H])c2-3)c([2H])c(-c2ccc3ccc4cccc5ccc2c3c45)c1[2H]]
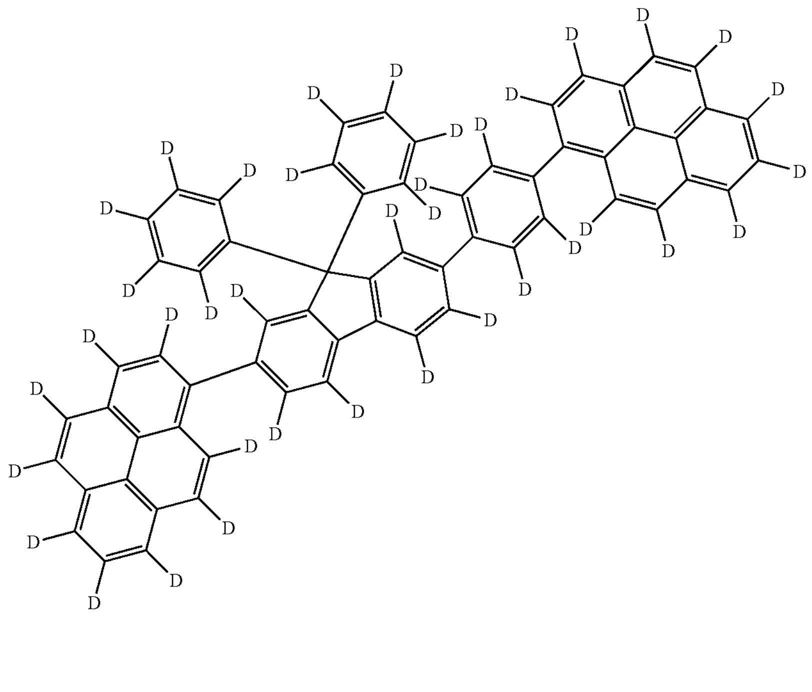

-continued
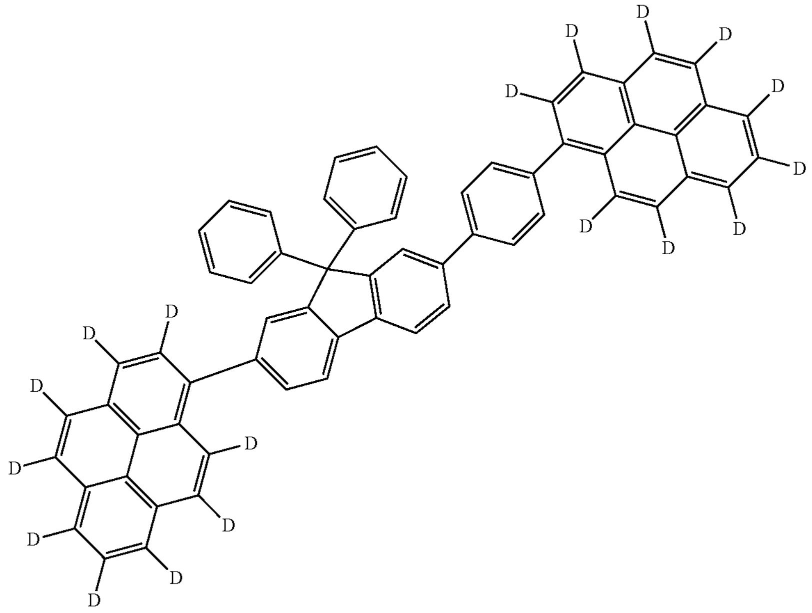
[Formula 257]
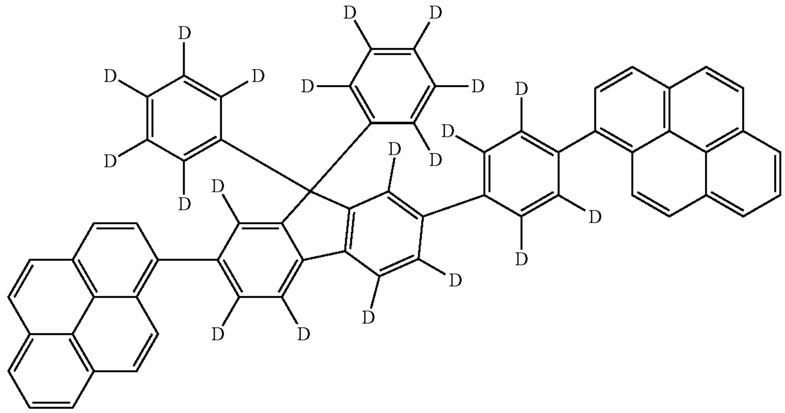
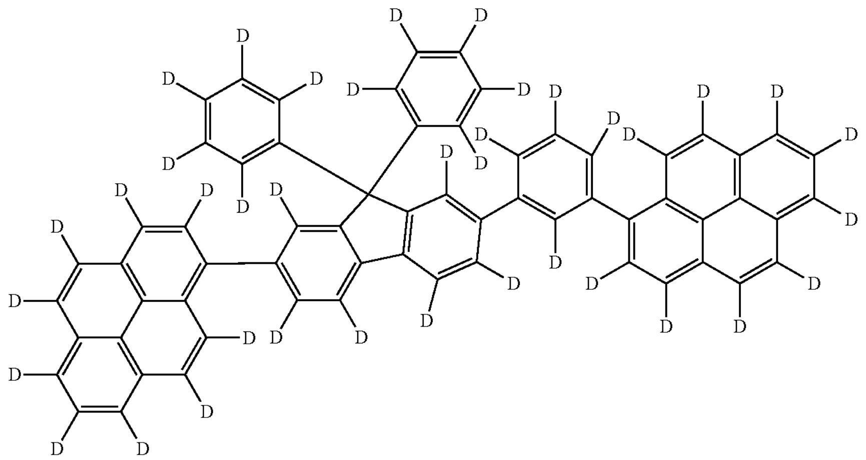

-continued
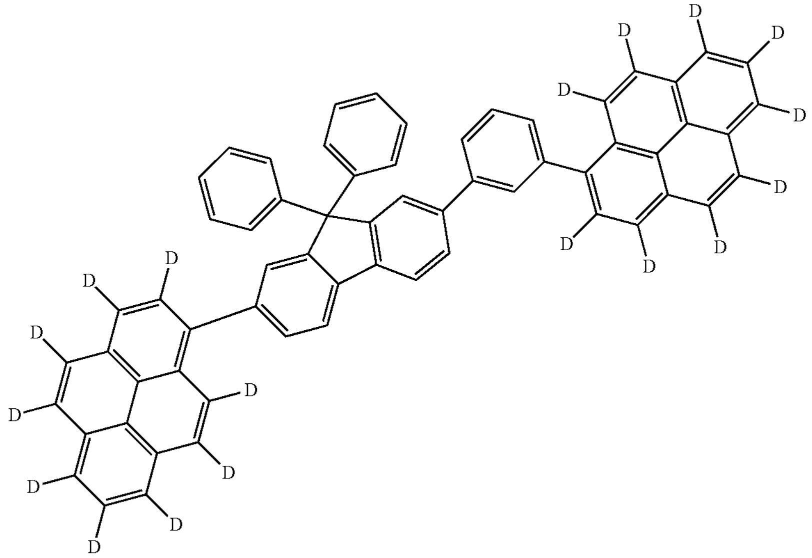
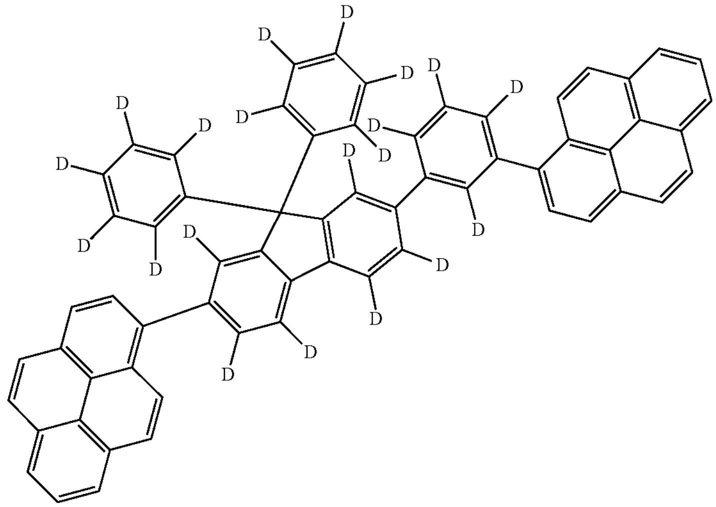
[Formula 258]
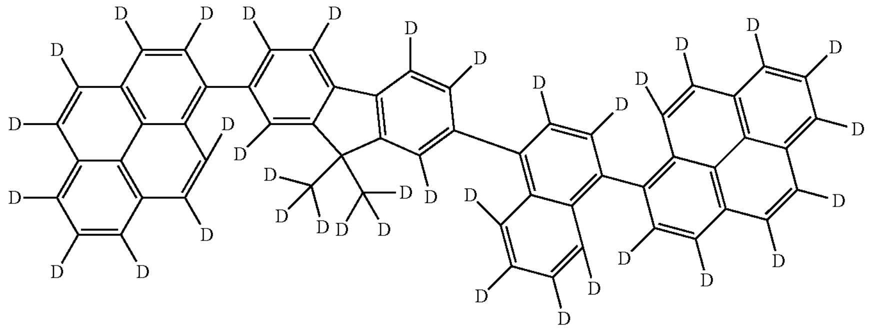
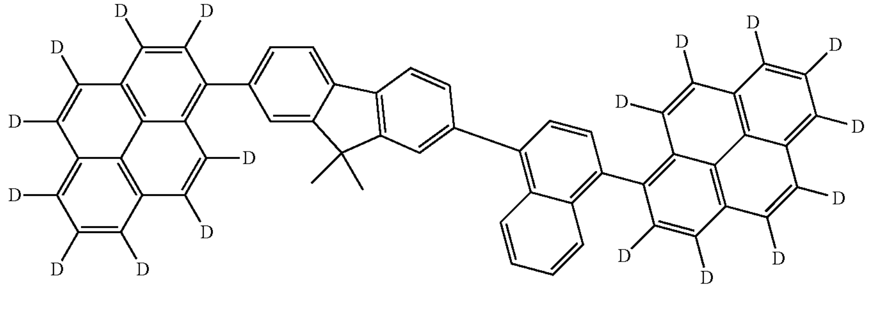

-continued
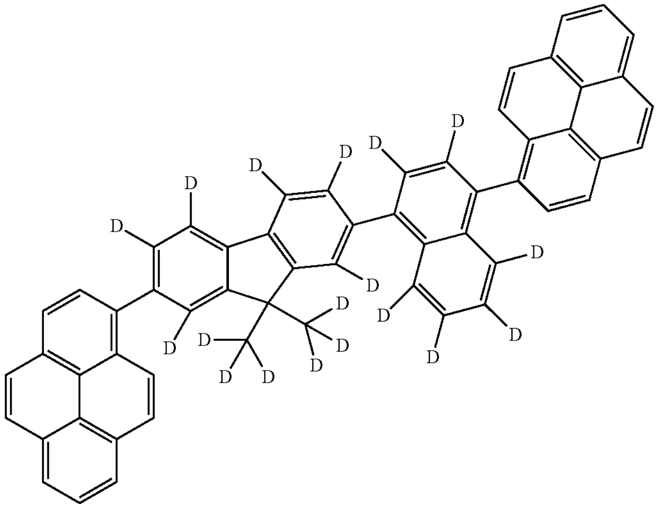
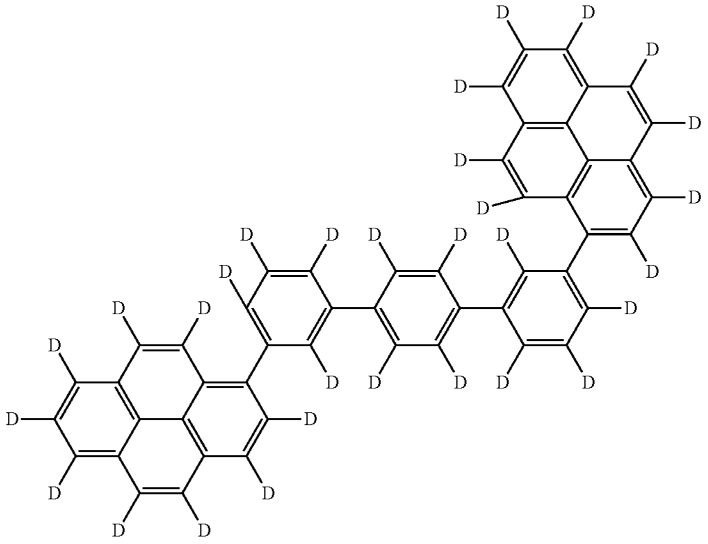
[Formula 259]
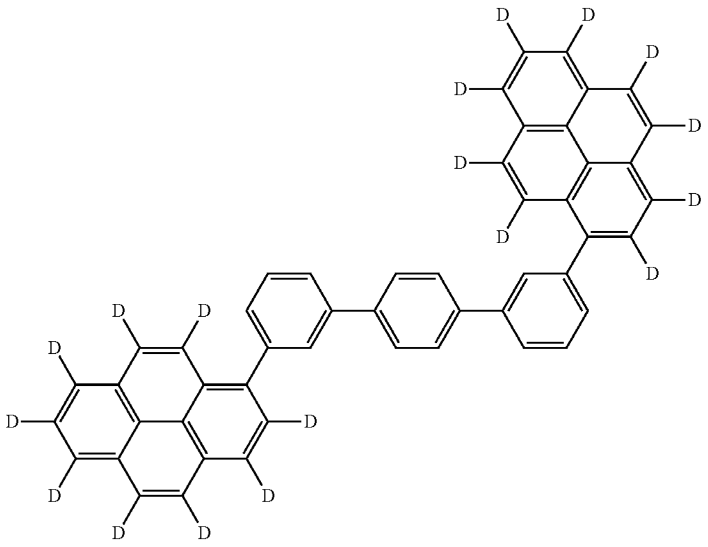

-continued
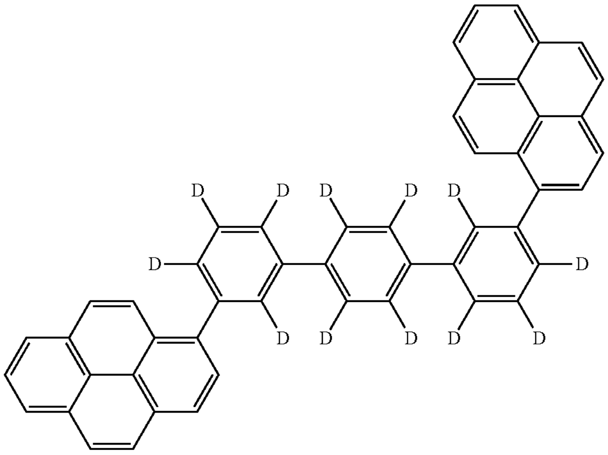
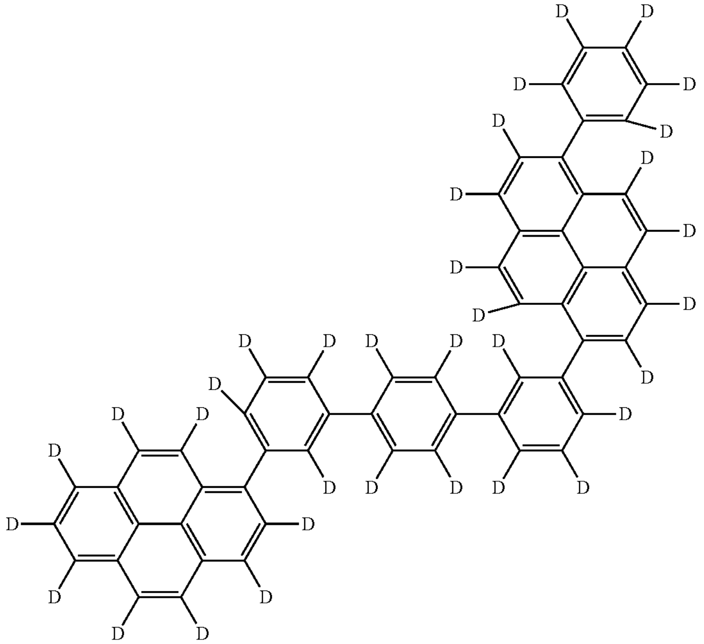
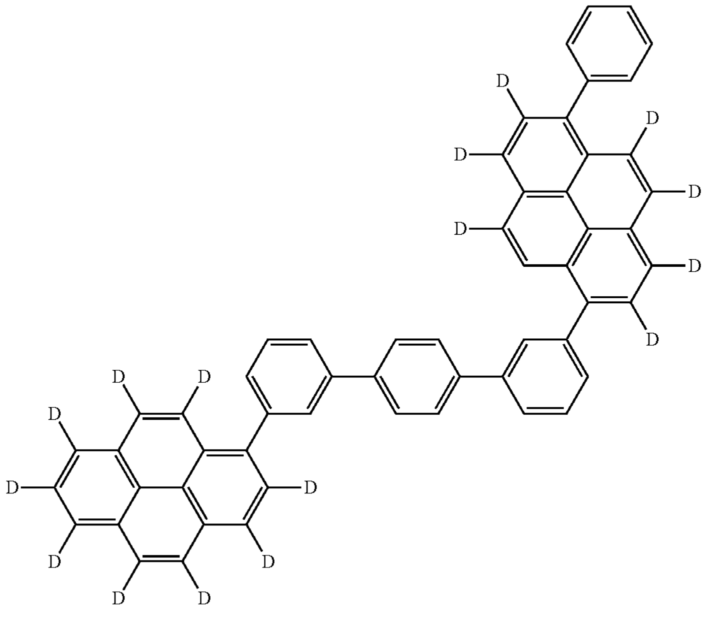

-continued
[Formula 260]
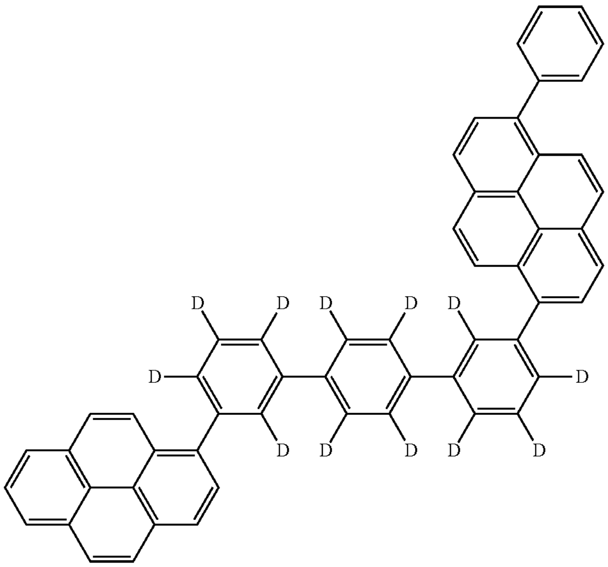
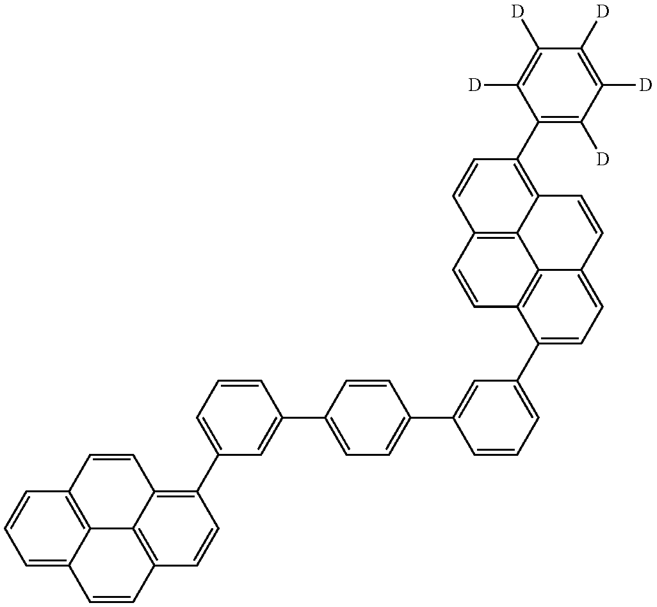
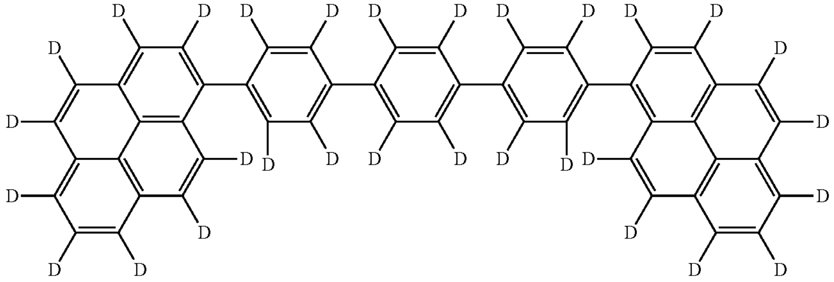

-continued
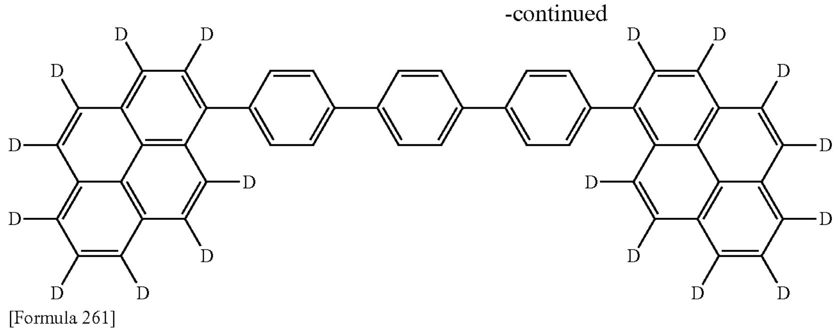
[Formula 261]
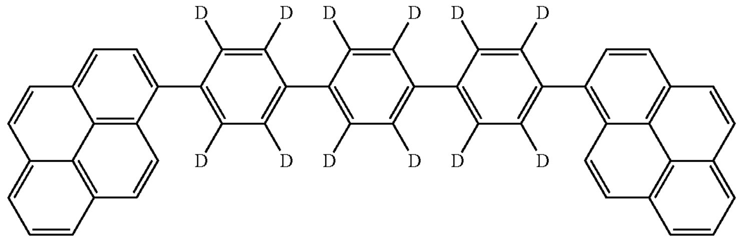
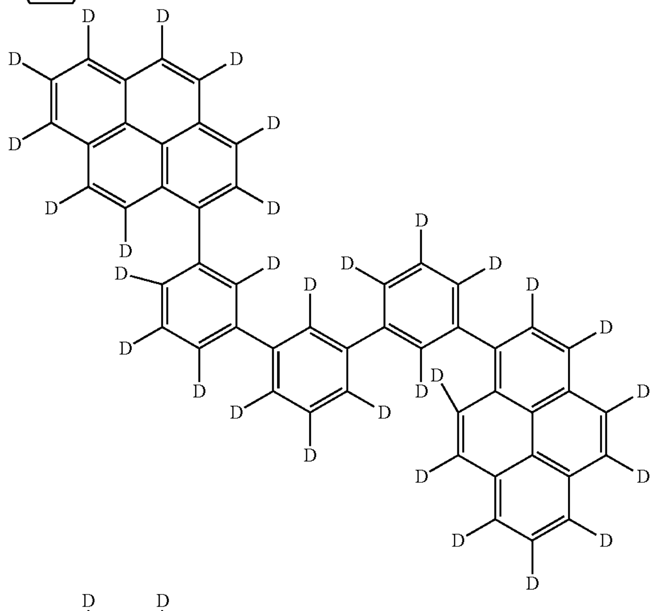
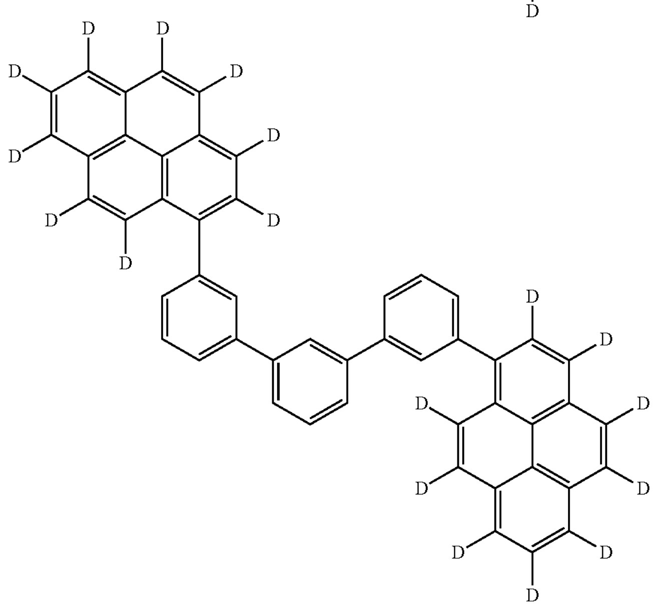

-continued
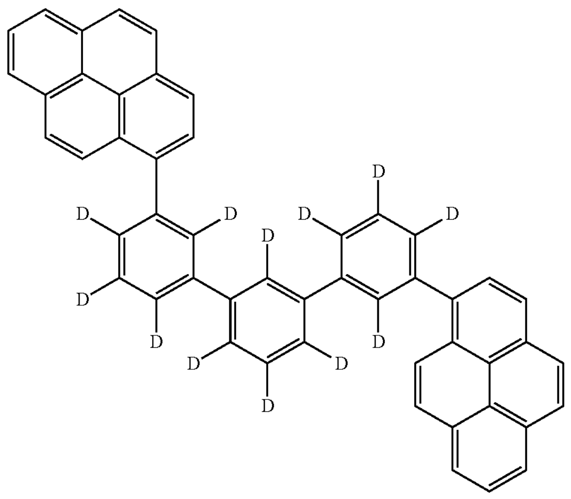
[Formula 262]
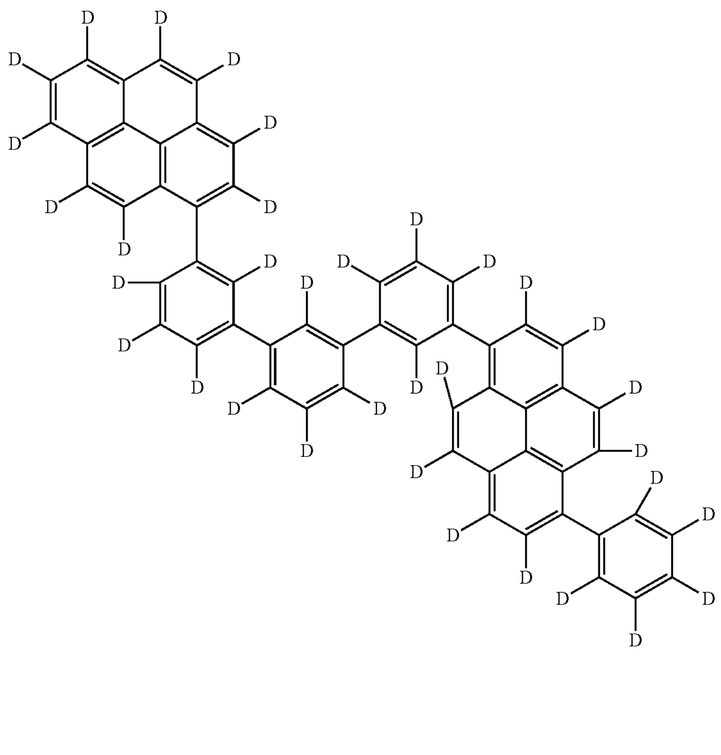

-continued
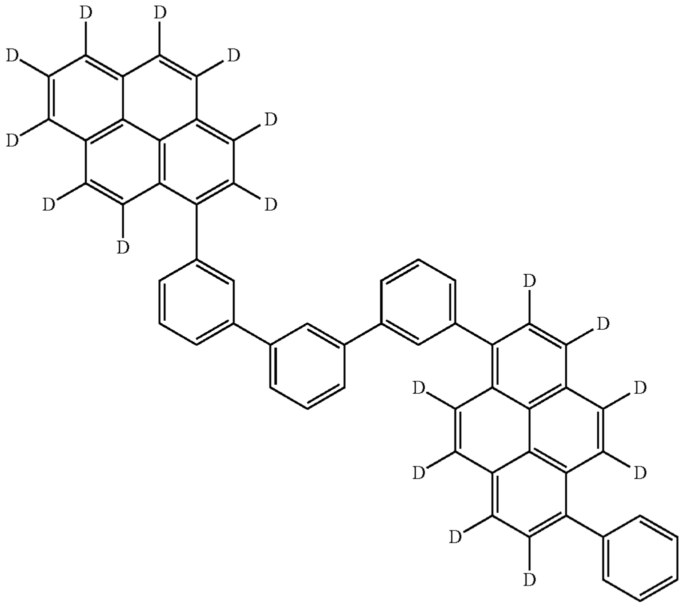
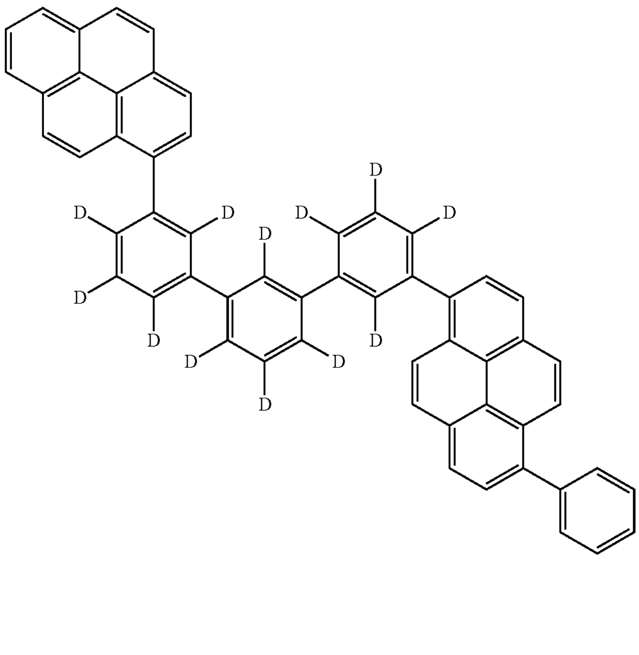

-continued
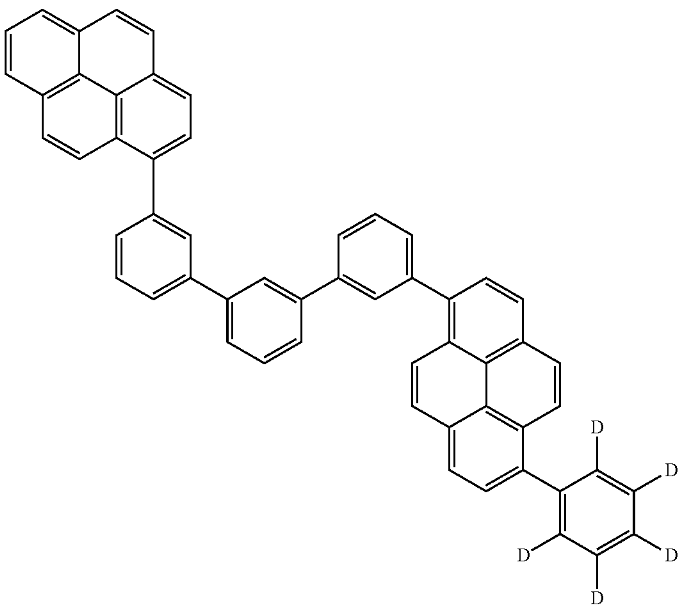
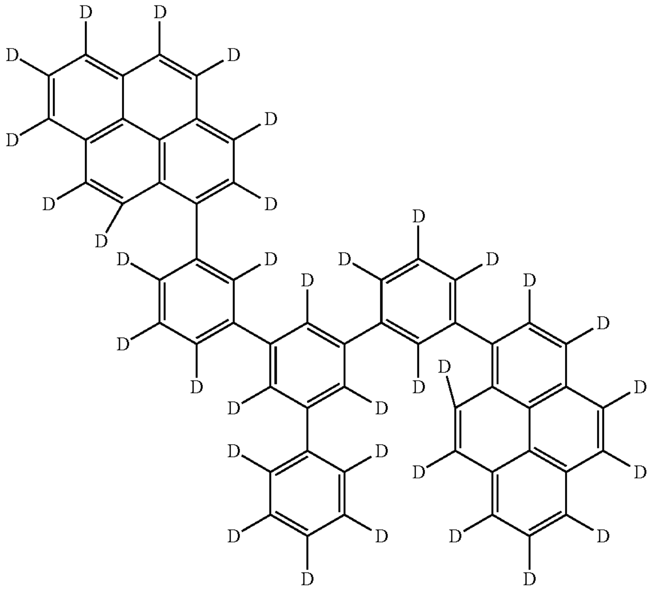

-continued
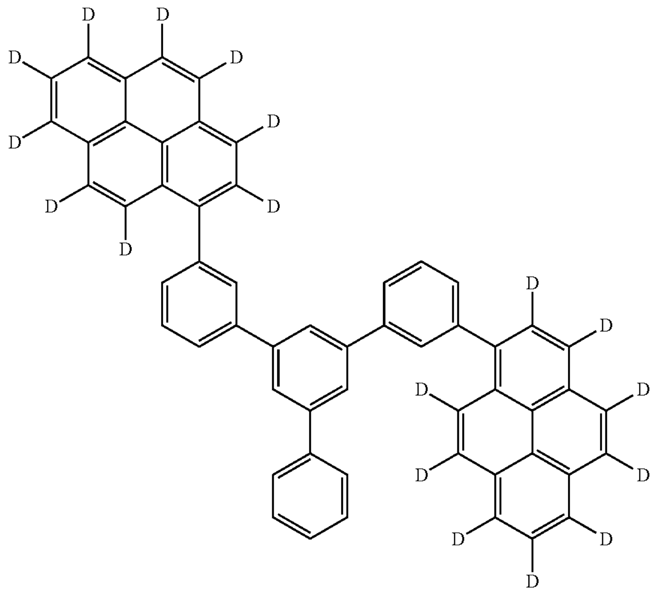
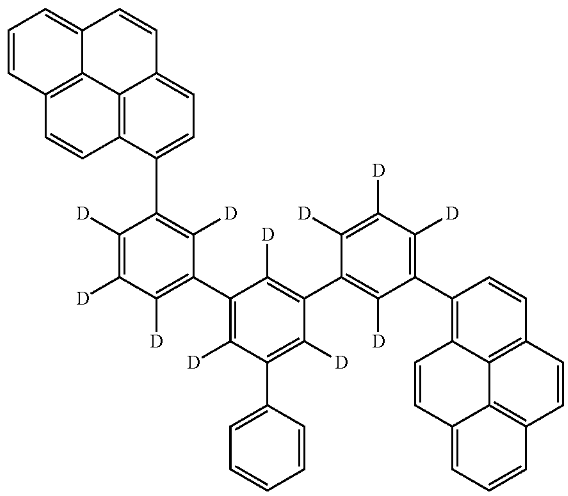
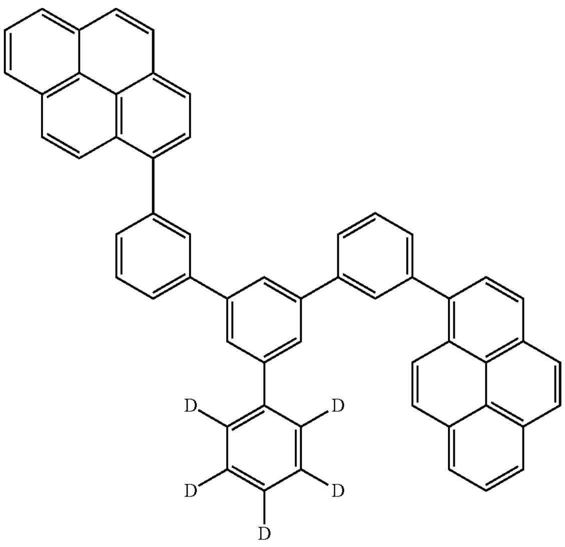

-continued
[Formula 263]
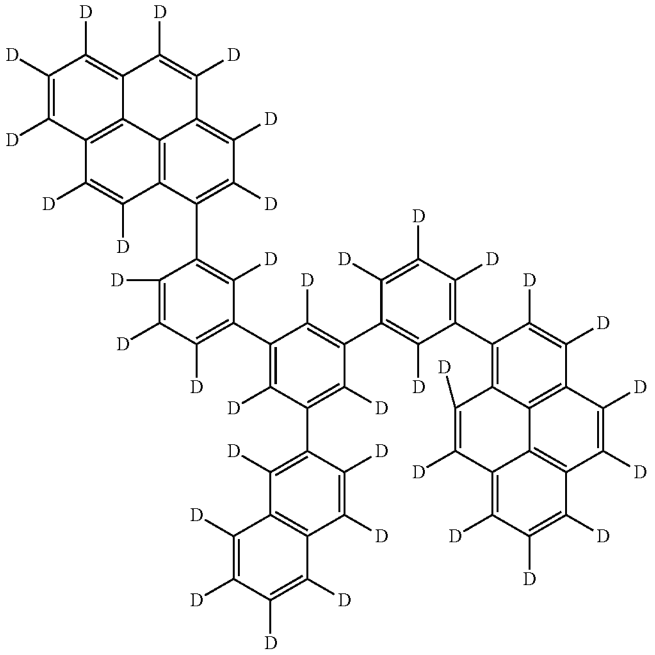
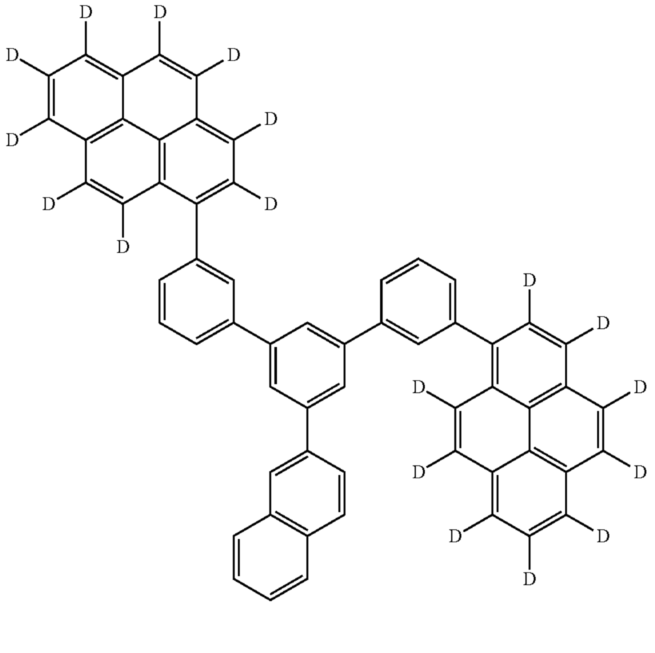

-continued
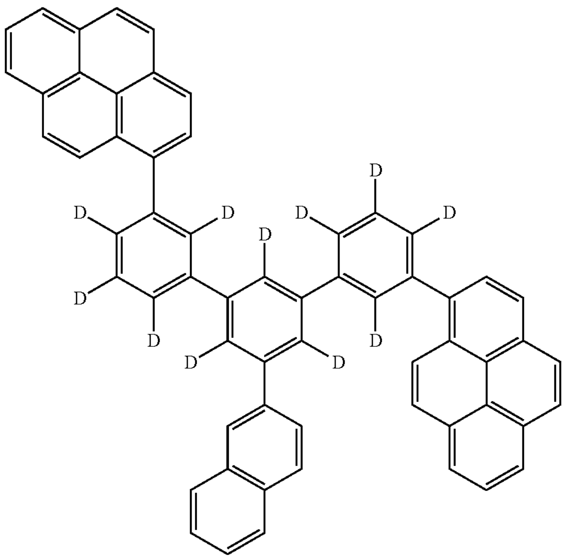
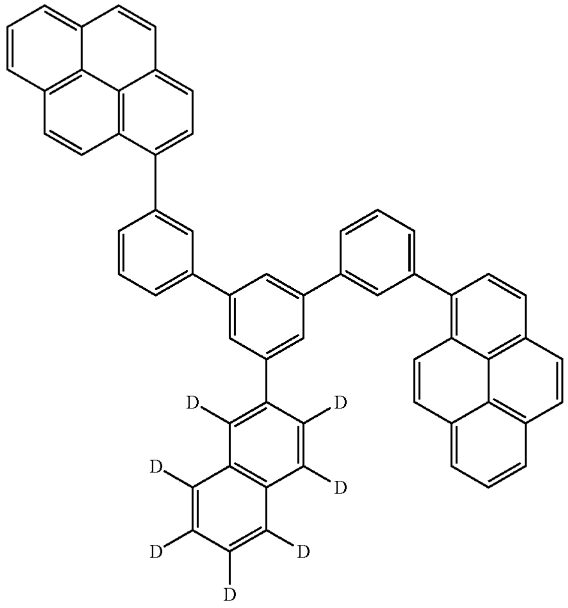
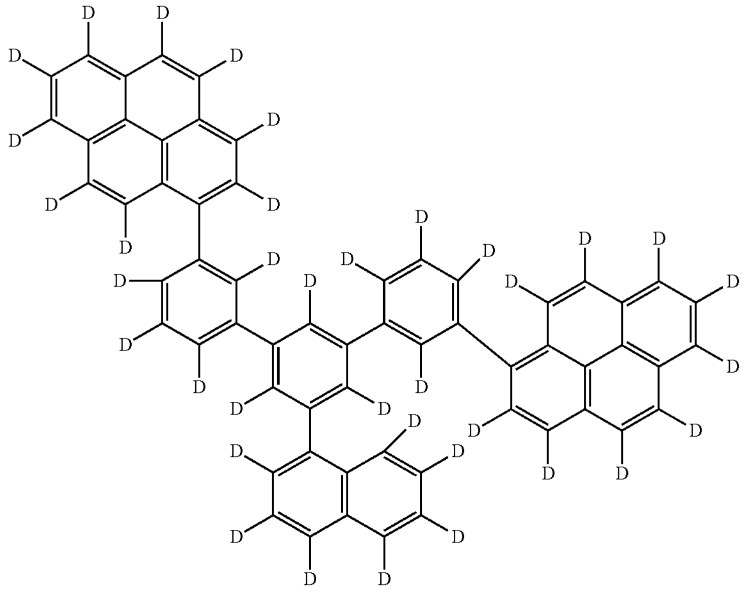

-continued
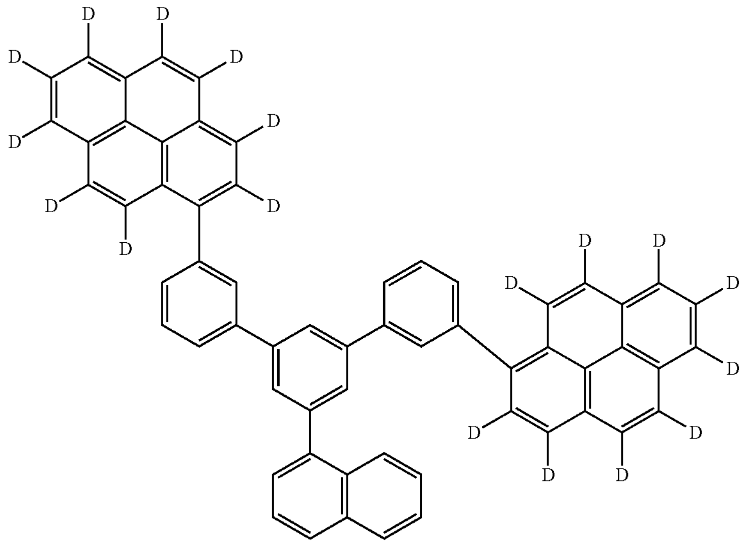
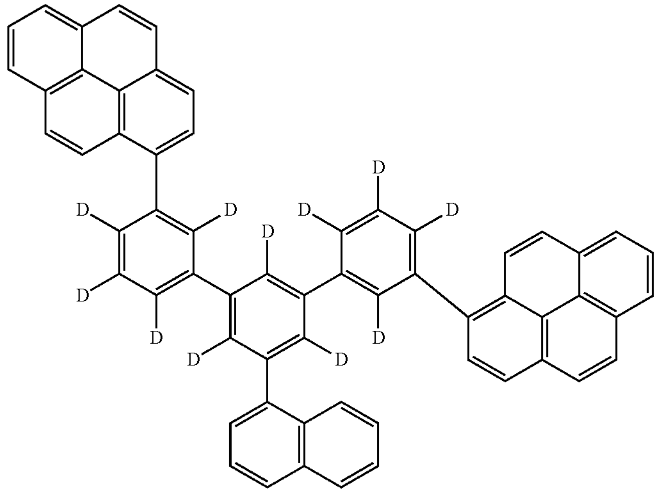
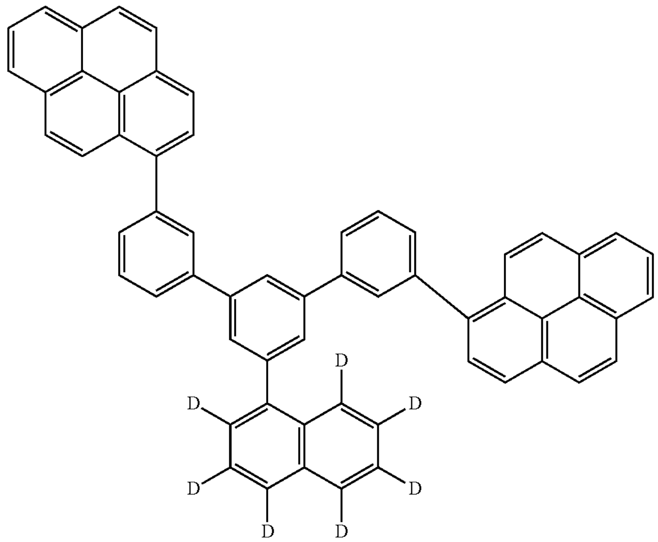

-continued
[Formula 264]
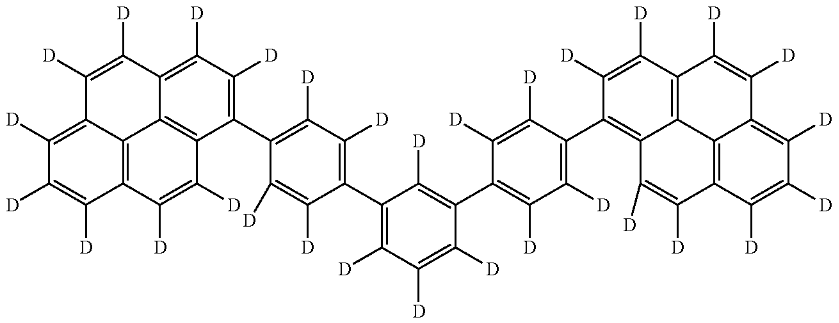
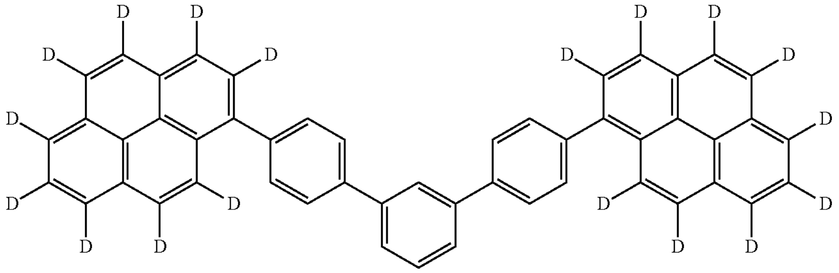
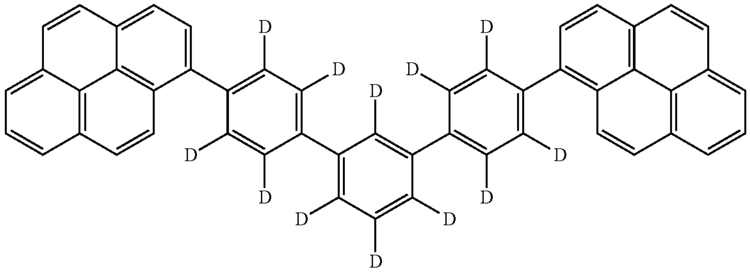
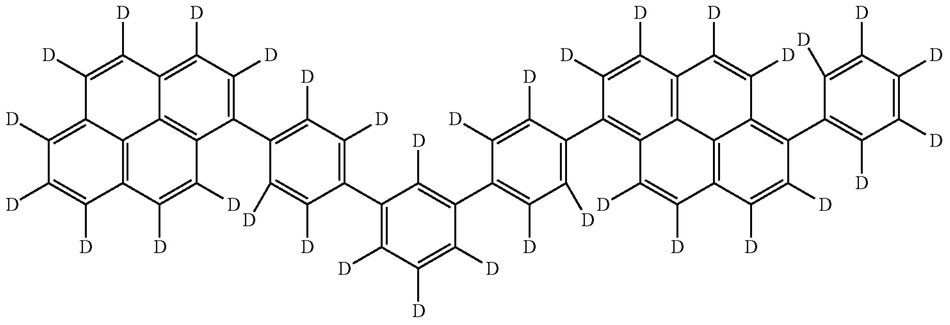
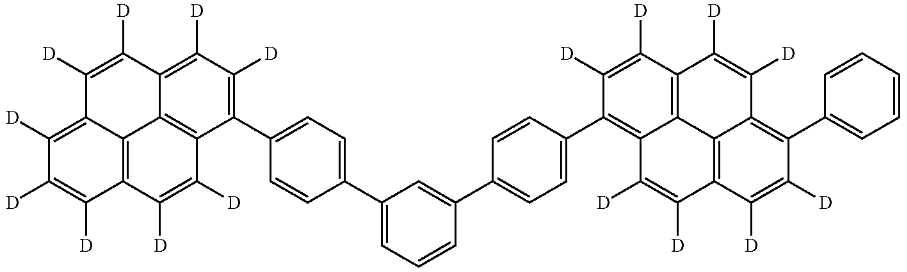

-continued
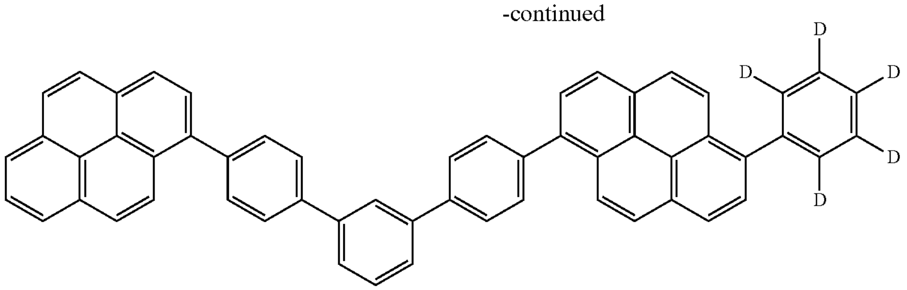
[Formula 265]
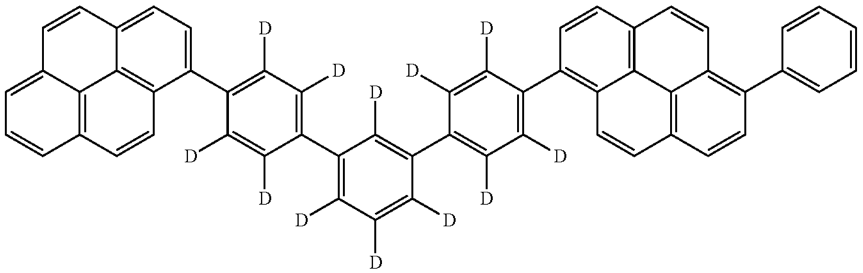
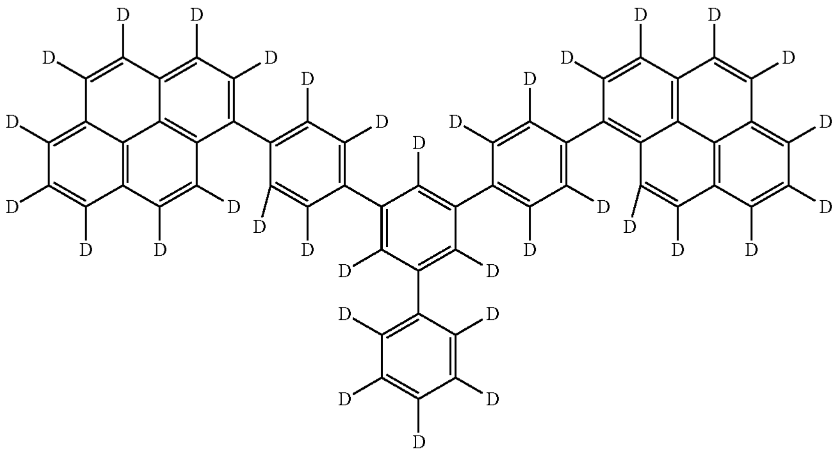
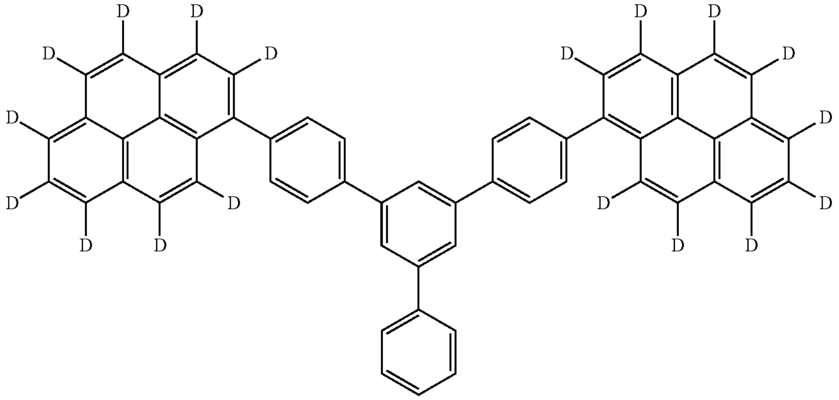

-continued
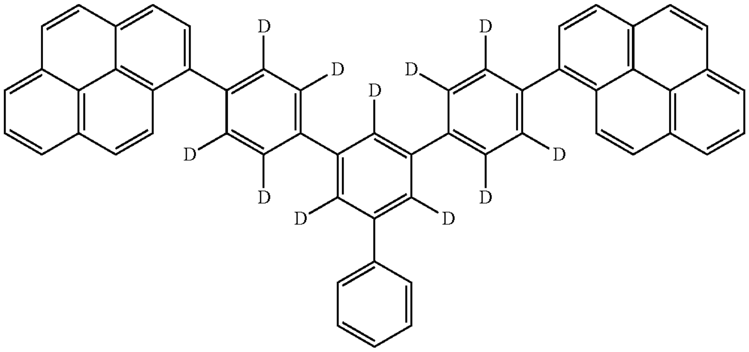
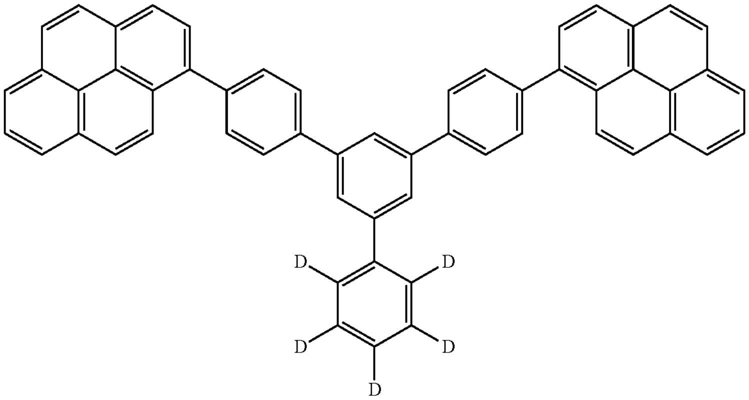
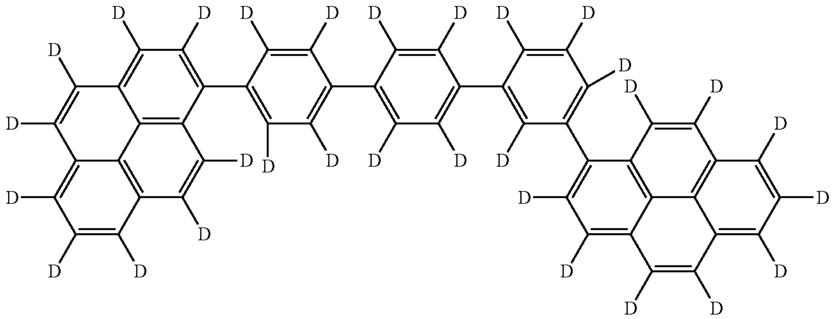
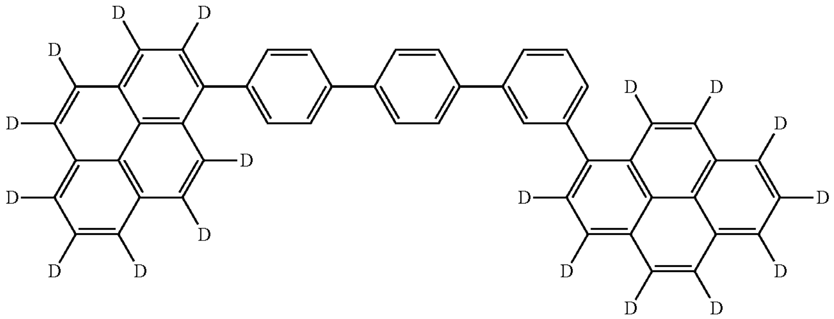
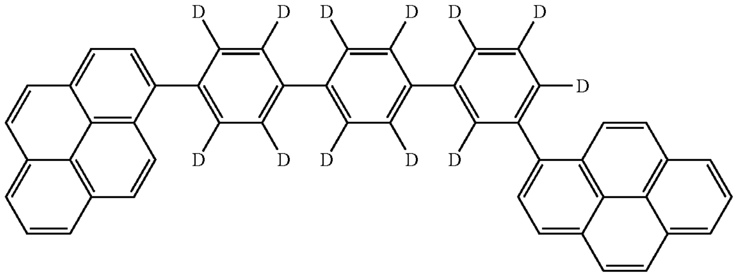

-continued
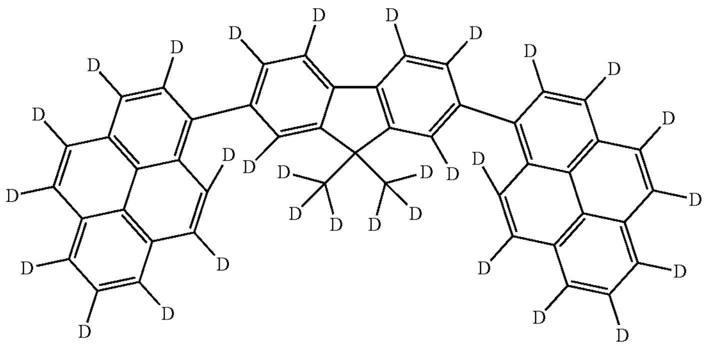
[Formula 266]
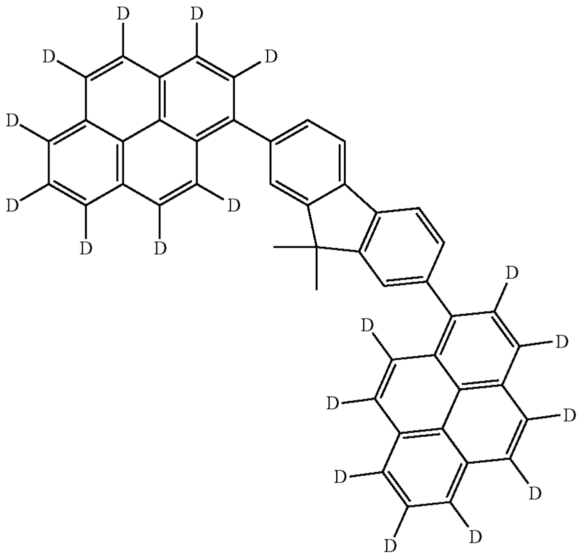
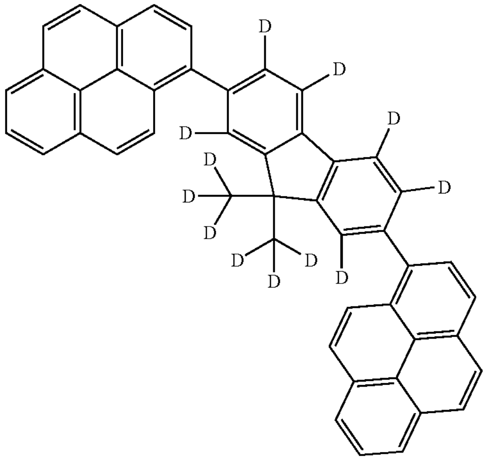
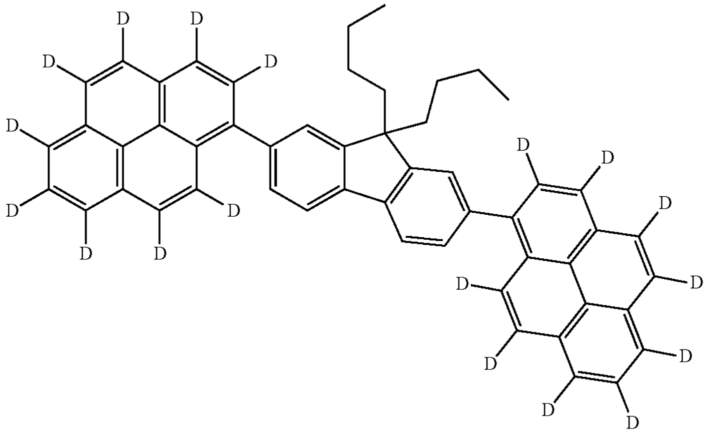

-continued
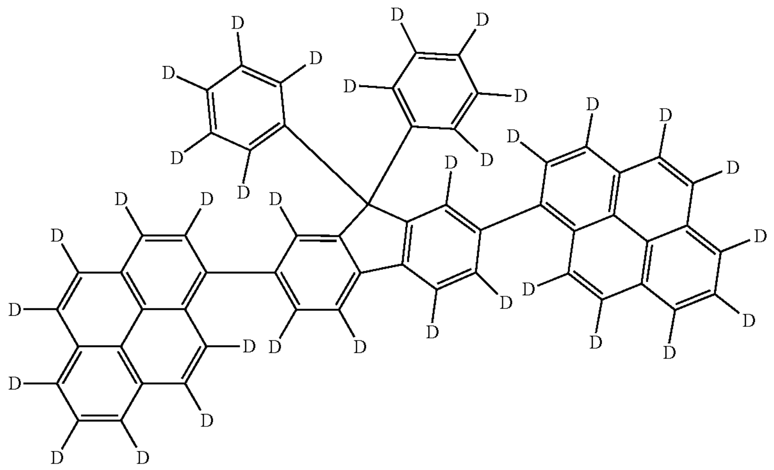
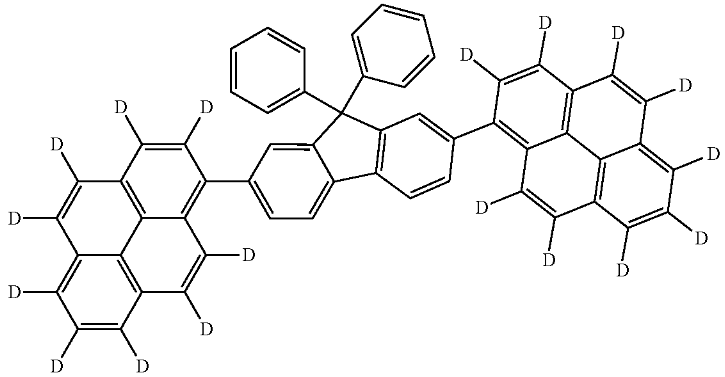
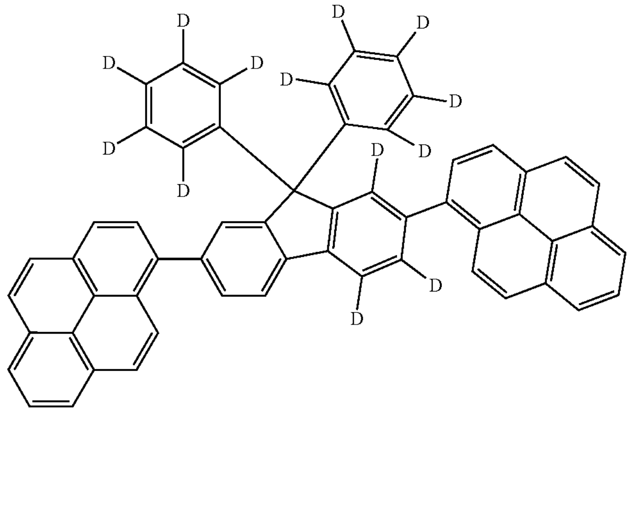

-continued
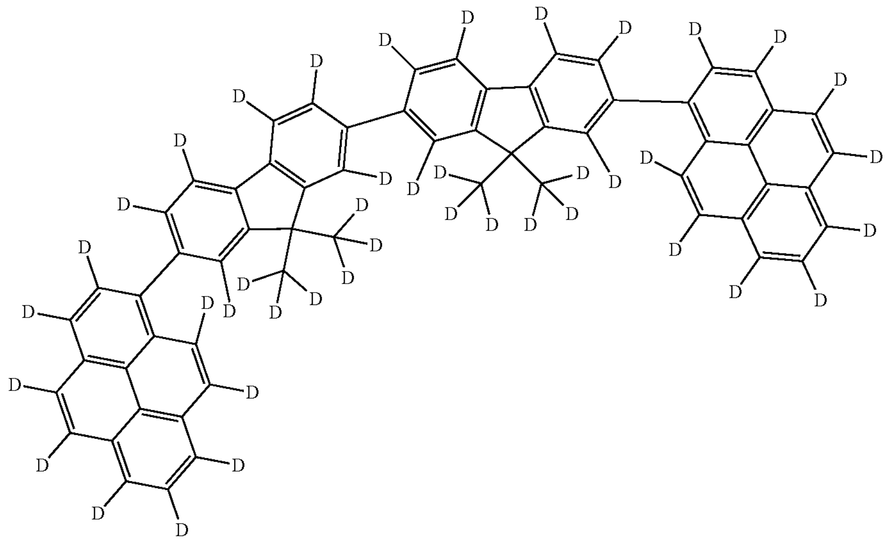
[Formula 267]
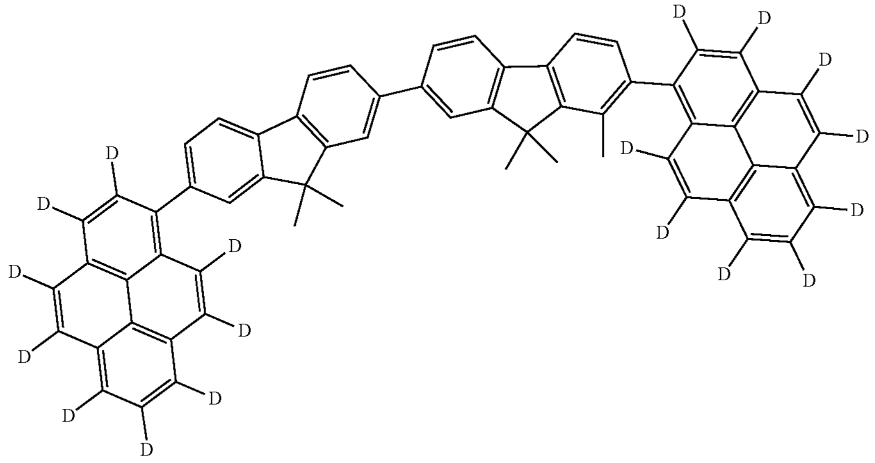
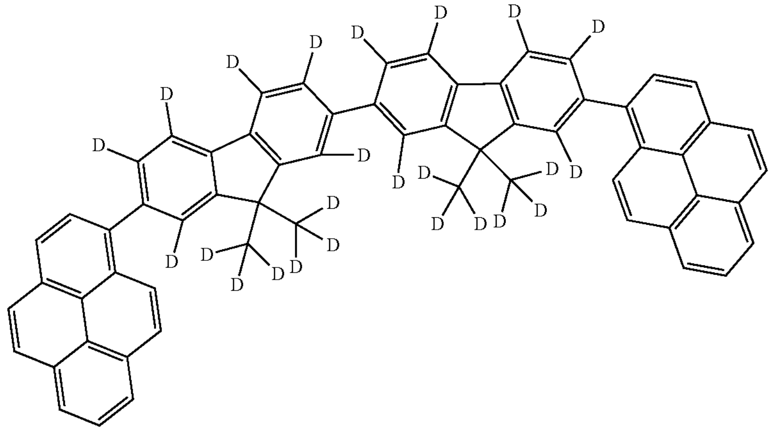

-continued
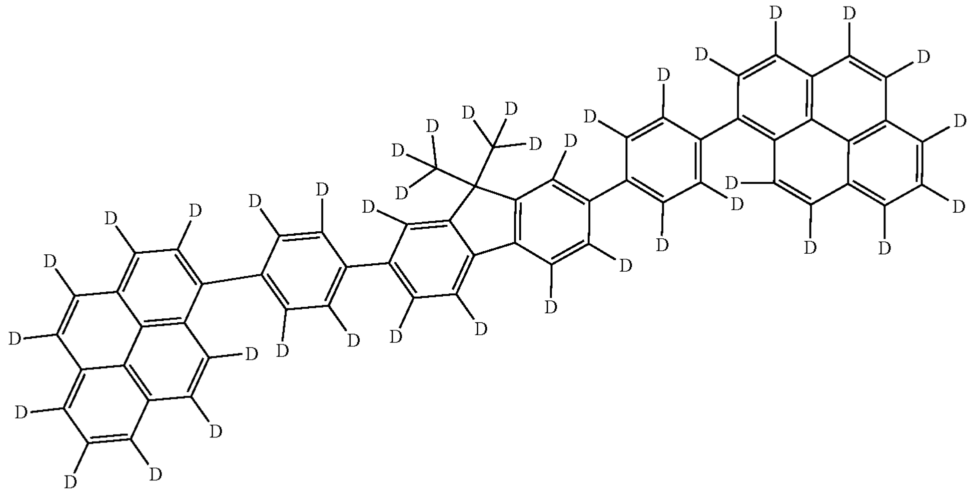
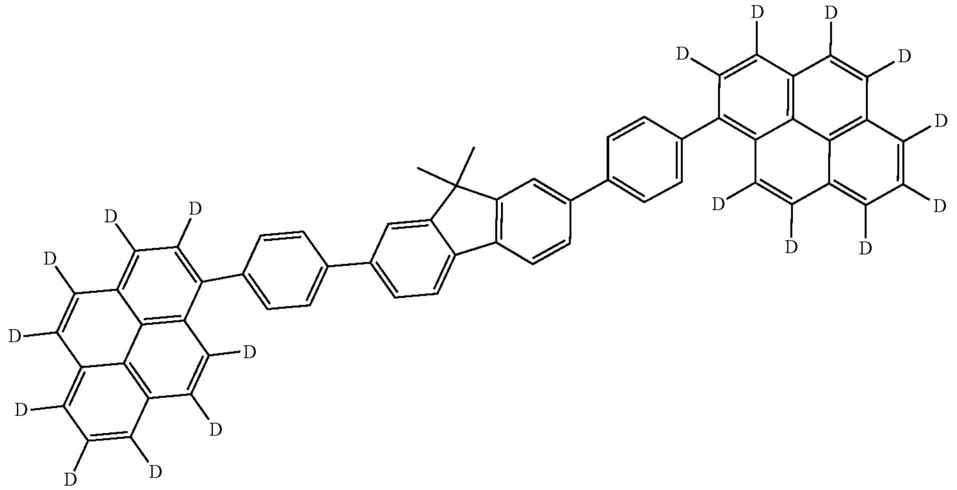
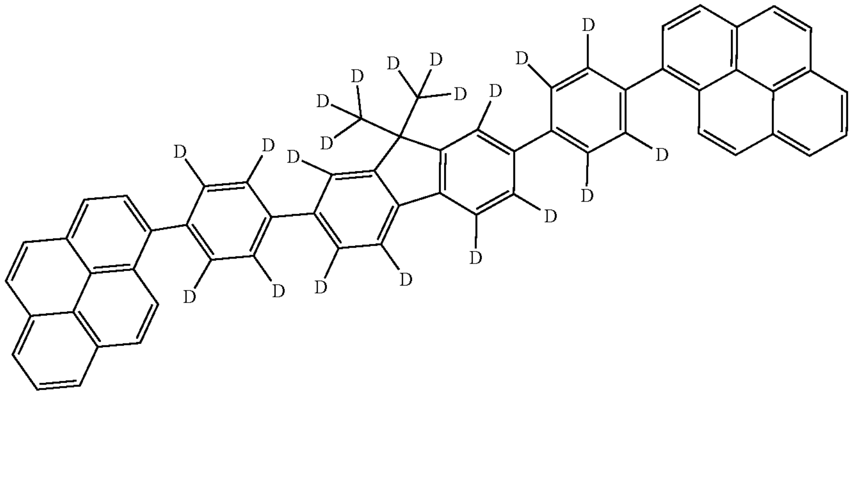

-continued
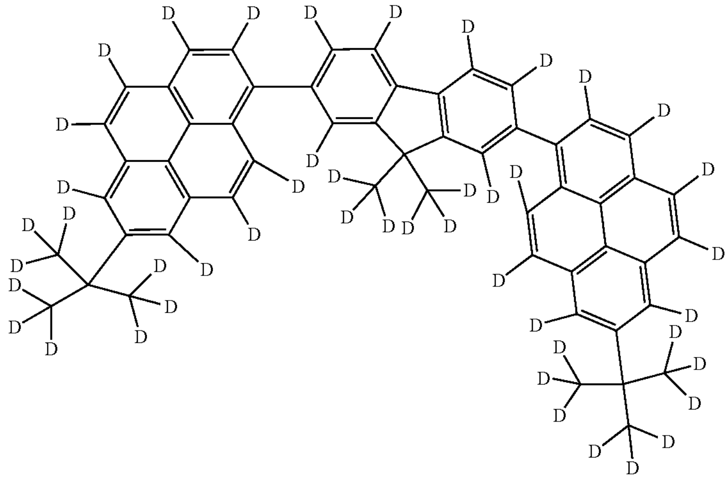
[Formula 268]
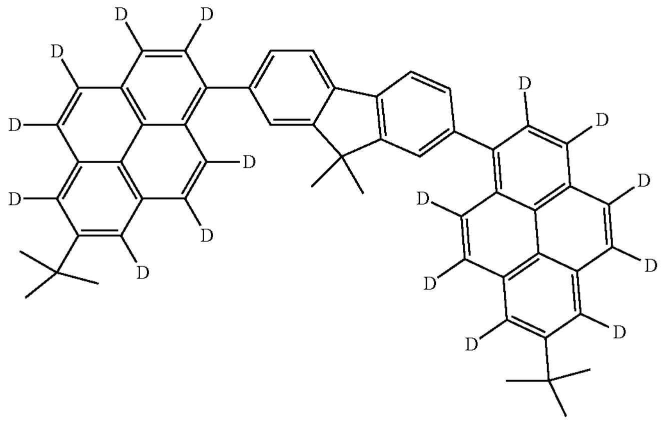
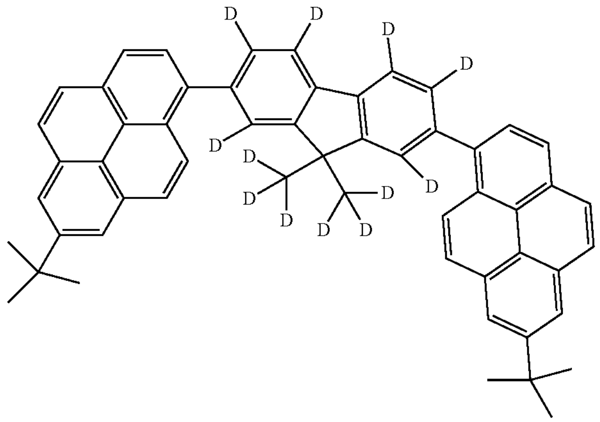

-continued
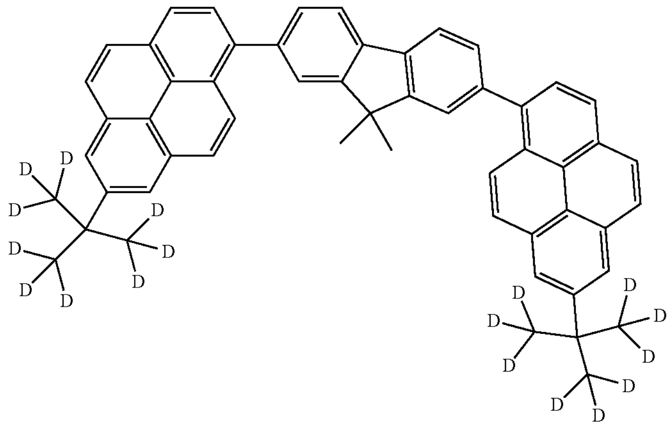
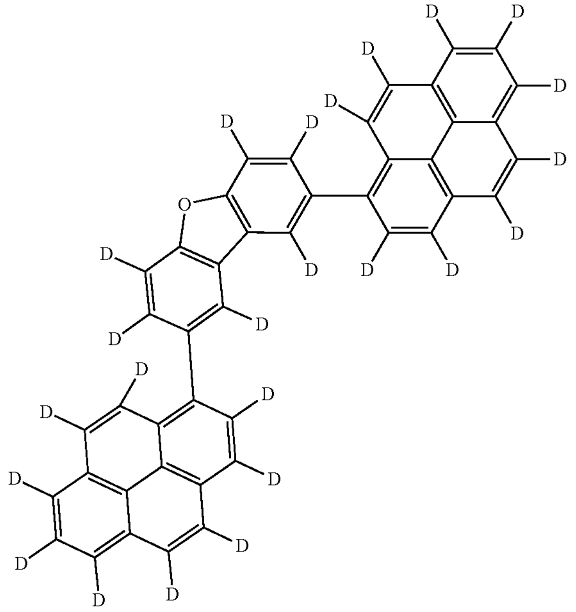
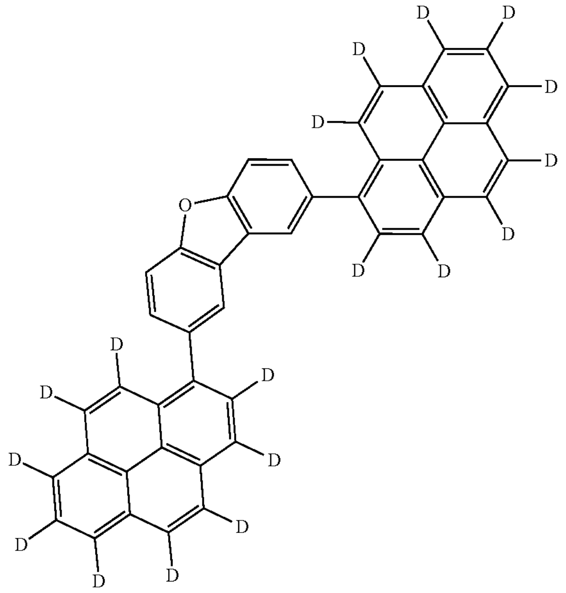

-continued
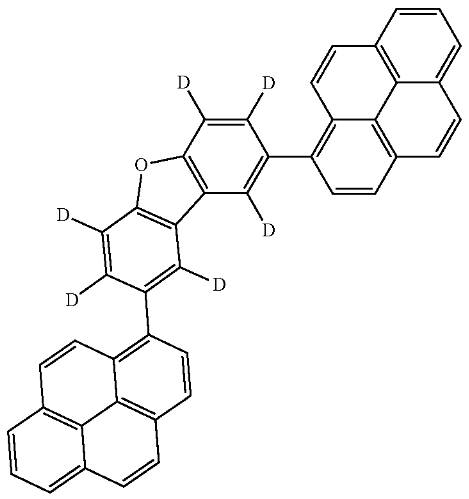
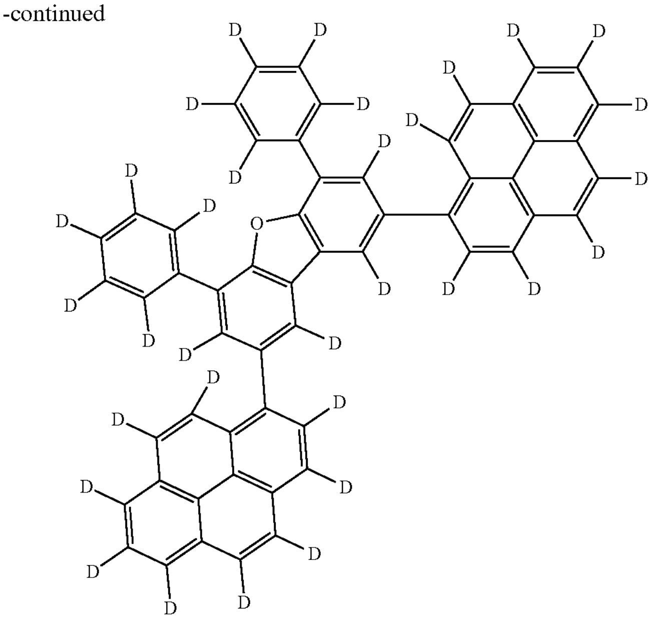
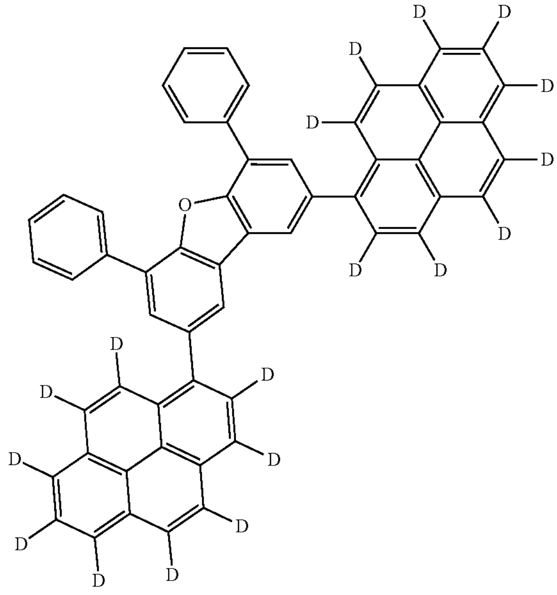

-continued
[Formula 269]
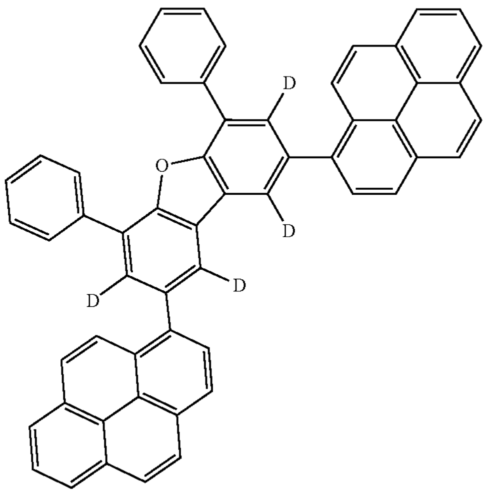
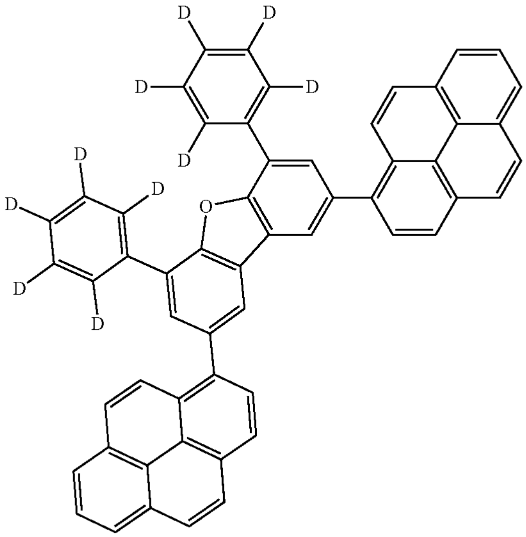
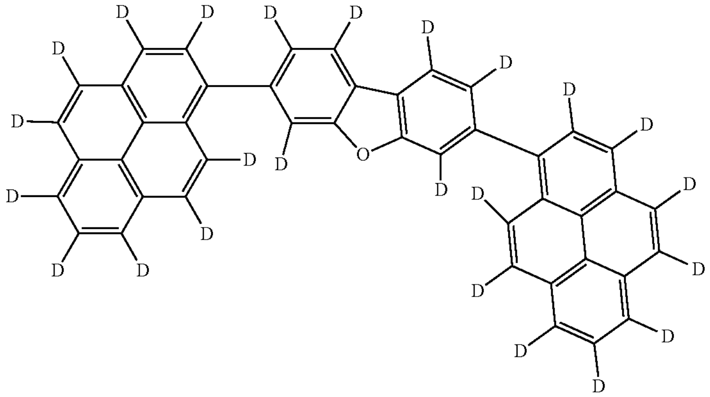
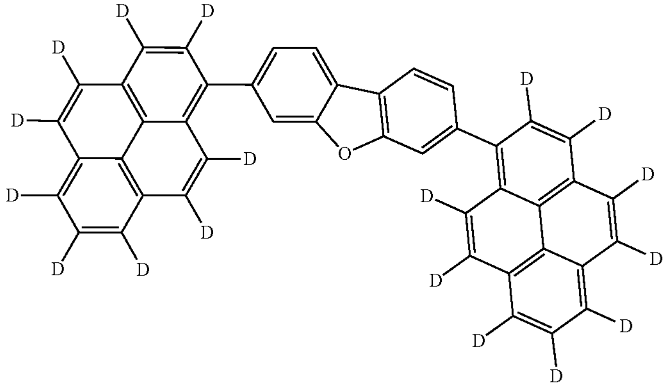
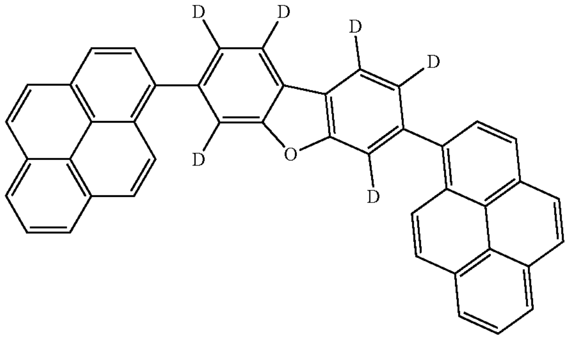

-continued
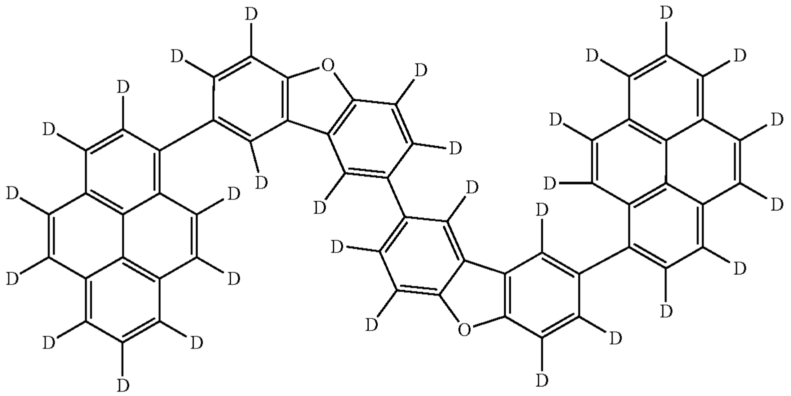
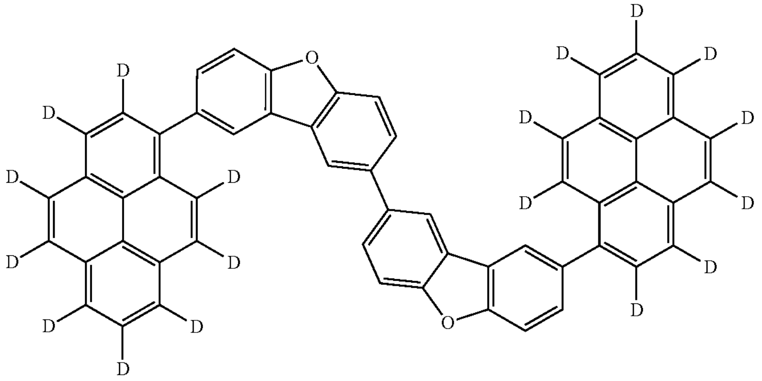
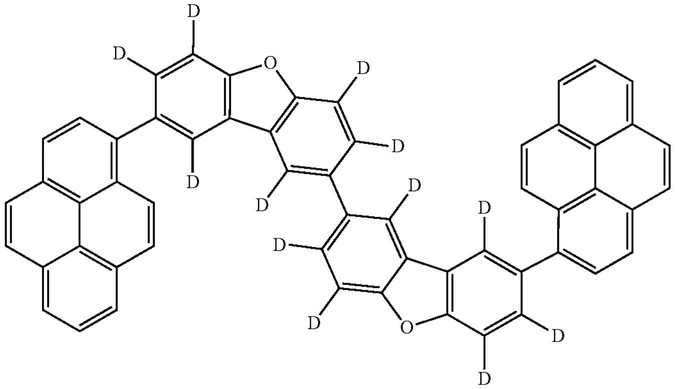
[Formula 270]
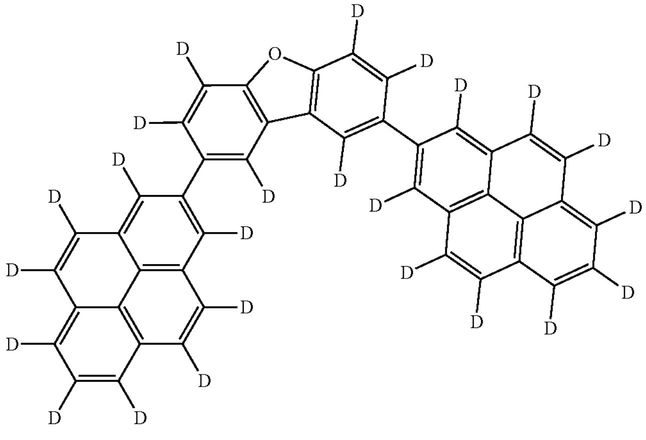

-continued
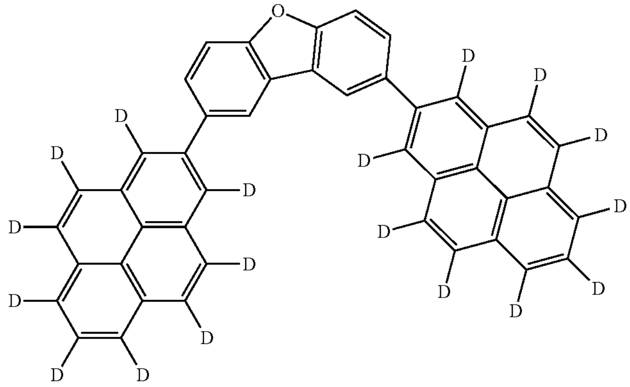
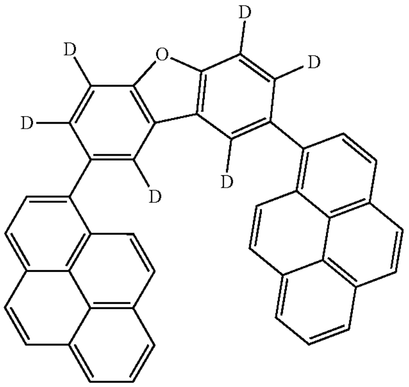
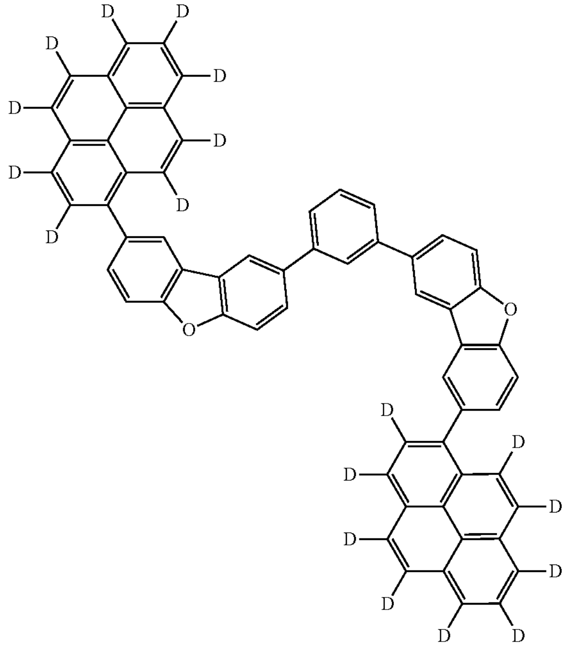
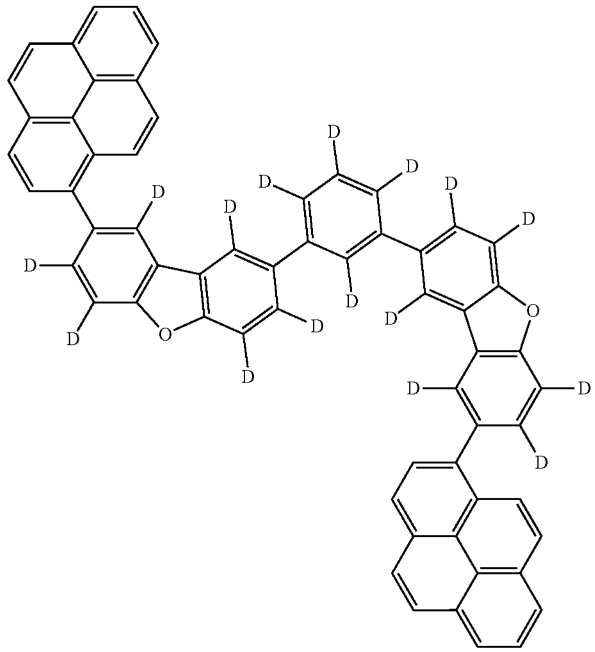

-continued
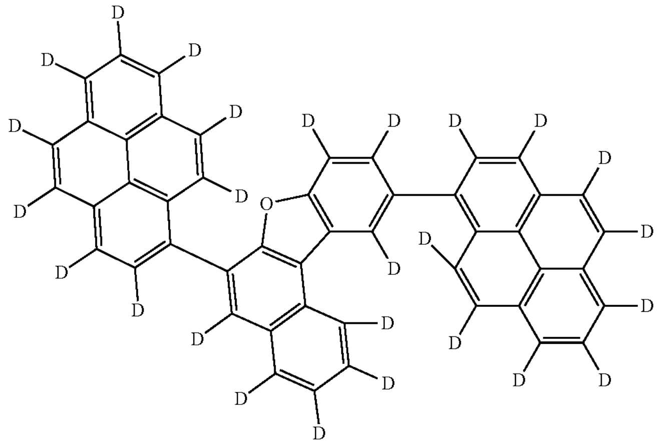
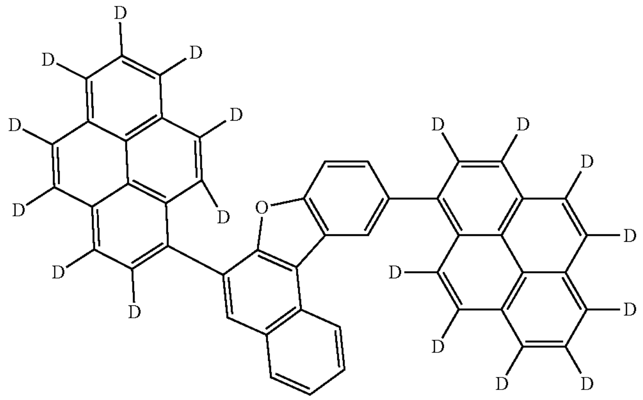
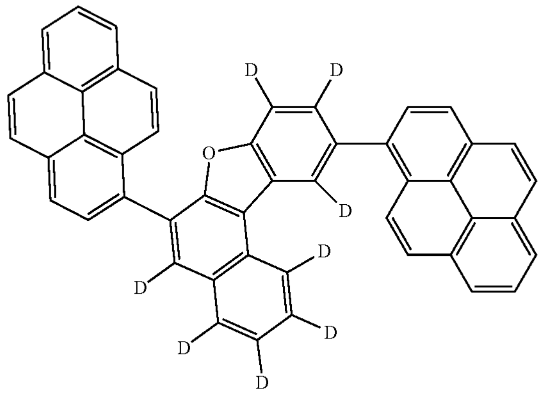

-continued
[Formula 271]
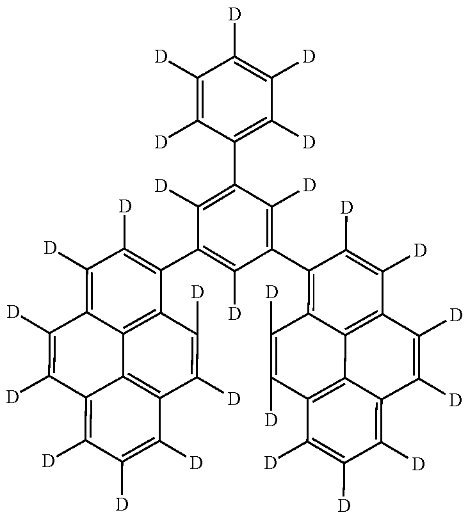
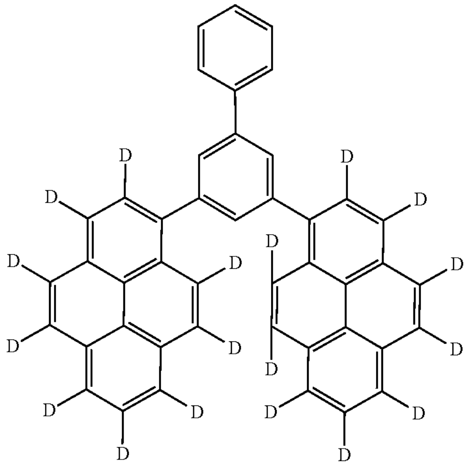
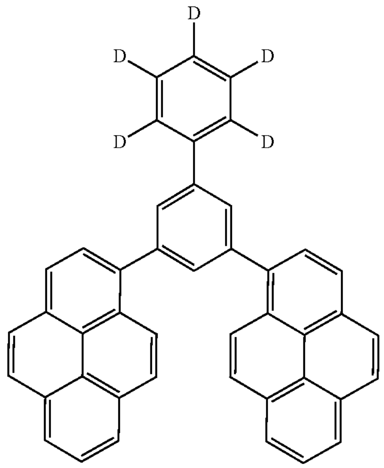
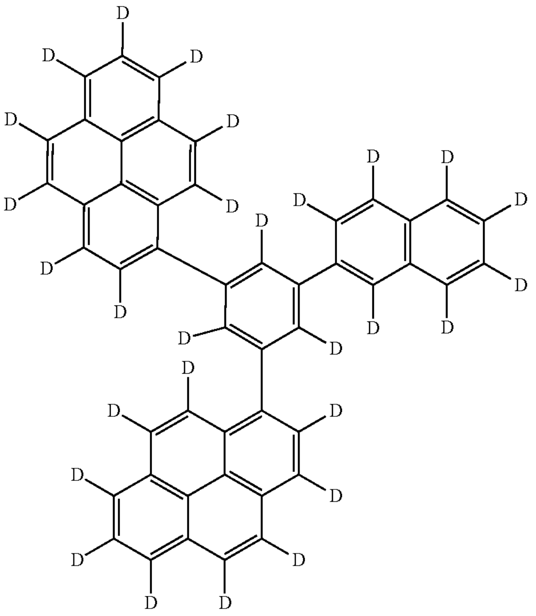
[Formula 272]
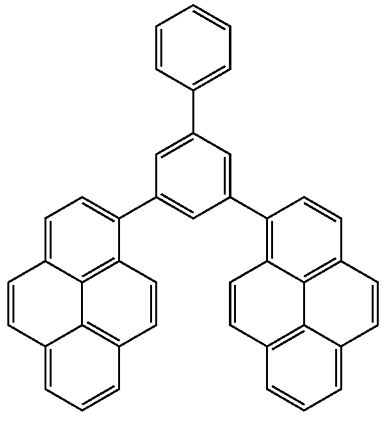
-continued
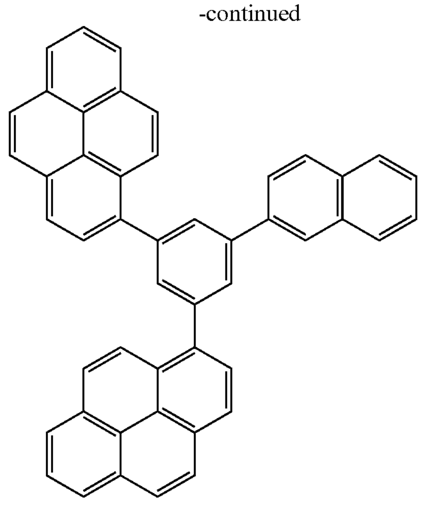

-continued

[Formula 273]

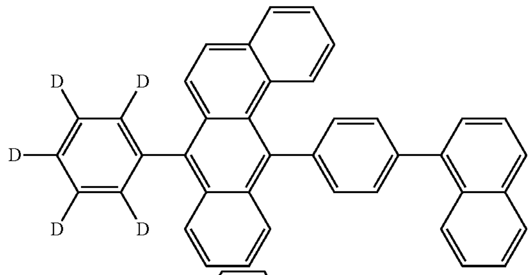

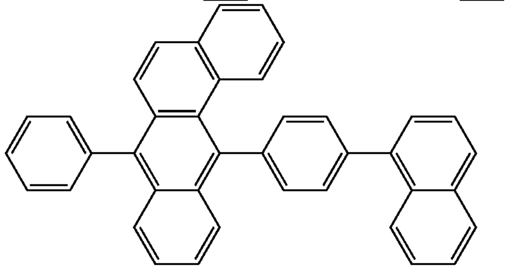

[Formula 274]

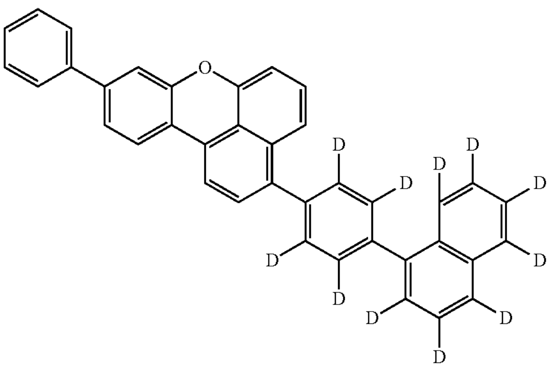

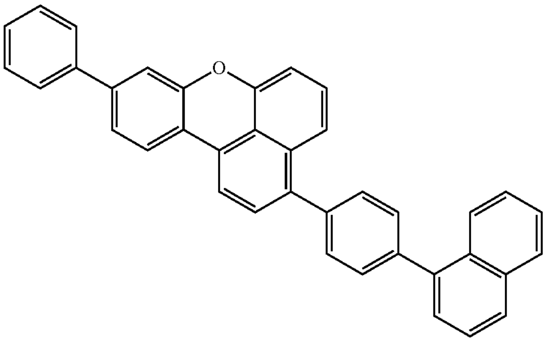

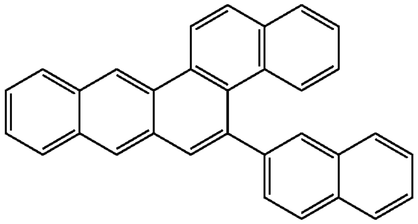

Second Compound

In the organic EL device according to the exemplary embodiment, the second compound is a compound represented by a formula (2) below.

[Formula 275]

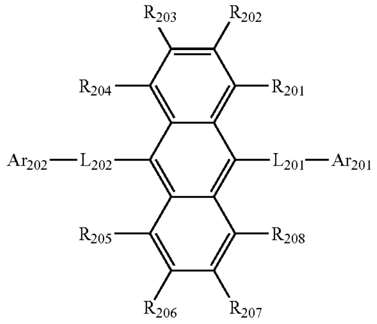

(2)

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the exemplary embodiment, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

- when a plurality of $R_{907}$ are present, the plurality of $R_{907}$ are mutually the same or different;
- when a plurality of $R_{801}$ are present, the plurality of $R_{801}$ are mutually the same or different; and
- when a plurality of $R_{802}$ are present, the plurality of $R_{802}$ are mutually the same or different.

In the organic EL device according to the exemplary embodiment, it is preferable that $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, or a nitro group; $L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and

- $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that $L_{201}$ and $L_{202}$ are each independently a single bond, or a substituted or unsubstituted arylene group having 6 to 50 ring carbon atoms; and $Ar_{201}$ and $Ar_{202}$ are each independently a substituted or unsubstituted aryl group having 6 to 50 ring carbon atoms.

In the organic EL device according to the exemplary embodiment, it is preferable that $Ar_{201}$ and $Ar_{202}$ are each independently a phenyl group, naphthyl group, phenanthryl group, biphenyl group, terphenyl group, diphenylfluorenyl group, dimethylfluorenyl group, benzodiphenylfluorenyl group, benzodimethylfluorenyl group, dibenzofuranyl group, dibenzothienyl group, naphthobenzofuranyl group, or naphthobenzothienyl group.

In the organic EL device according to the exemplary embodiment, the second compound represented by the formula (2) is preferably a compound represented by a formula (201), a formula (202), a formula (203), a formula (204), a formula (205), a formula (206), a formula (207), a formula (208), or a formula (209) below.

[Formula 276]

(201)

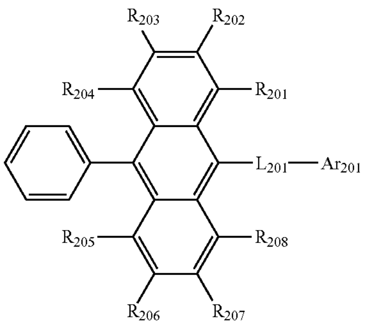

-continued

[Formula 277]

(202)

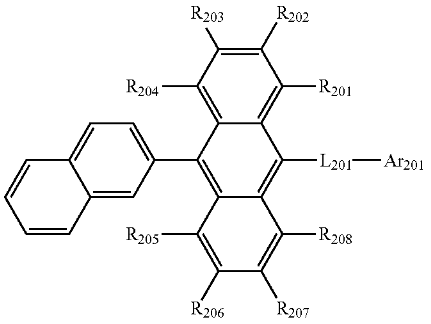

[Formula 278]

(203)

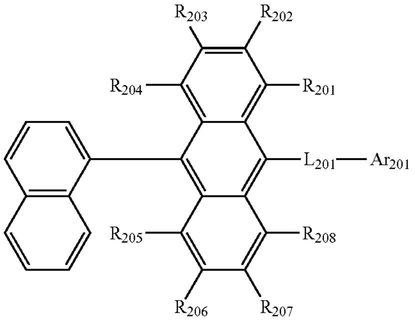

[Formula 279]

(204)

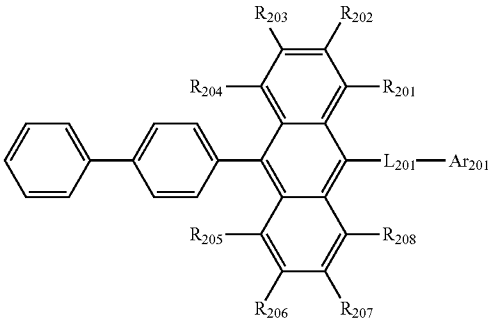

[Formula 280]

(205)

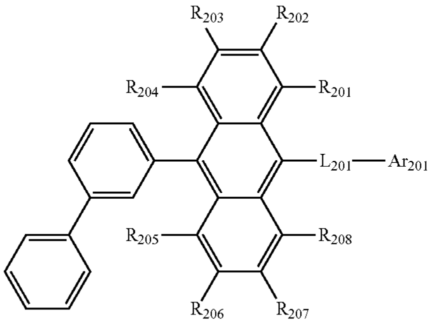

-continued

[Formula 281]

(206)

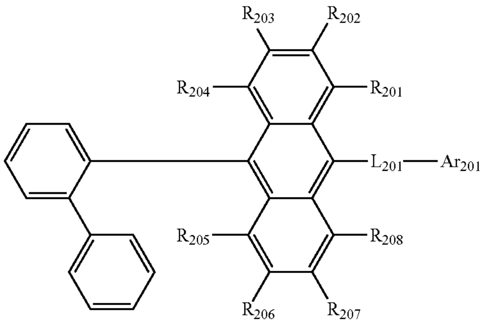

[Formula 282]

(207)

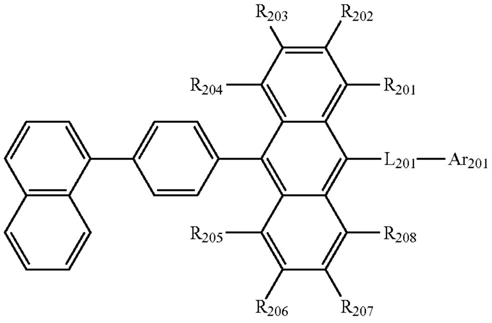

[Formula 283]

(208)

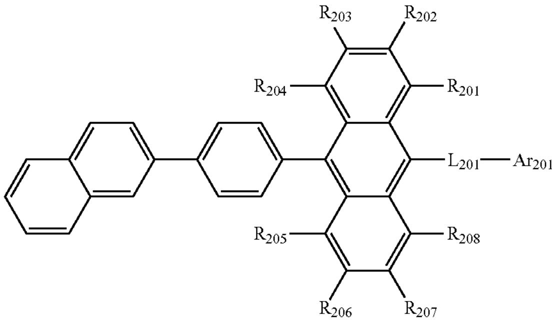

[Formula 284]

(209)

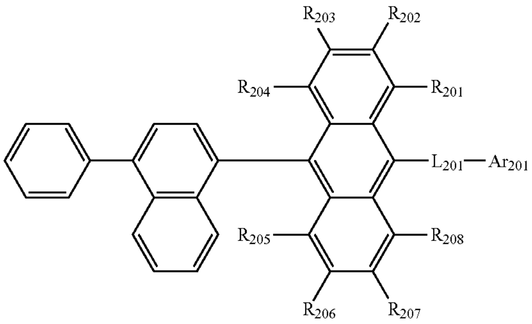

In the formulae (201) to (209):

$L_{201}$ and $Ar_{201}$ respectively represent the same as $L_{201}$ and $Ar_{201}$ in the formula (2); and $R_{201}$ to $R_{208}$ each independently represent the same as $R_{201}$ to $R_{208}$ in the formula (2).

The second compound represented by the formula (2) is also preferably a compound represented by a formula (221), a formula (222), a formula (223), a formula (224), a formula (225), a formula (226), a formula (227), a formula (228), or a formula (229) below.

[Formula 285]

(221)

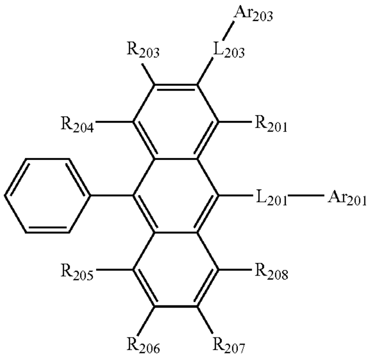

[Formula 286]

(222)

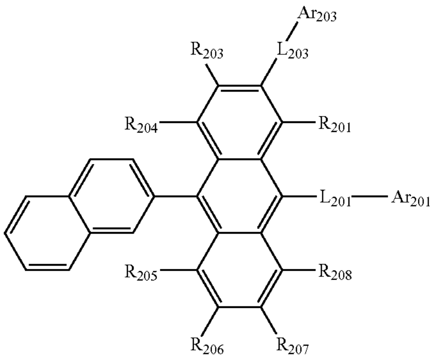

[Formula 287]

(223)

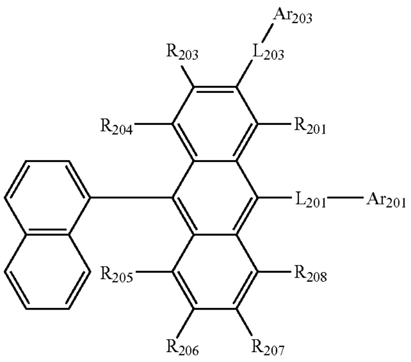

-continued

[Formula 288]

(224)

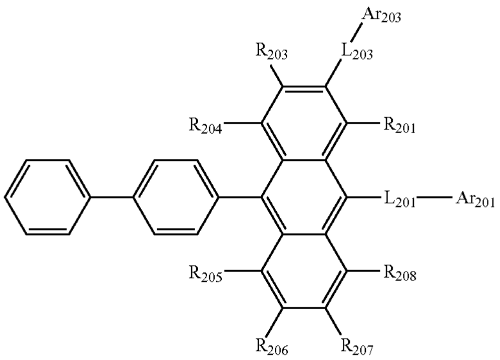

[Formula 289]

(225)

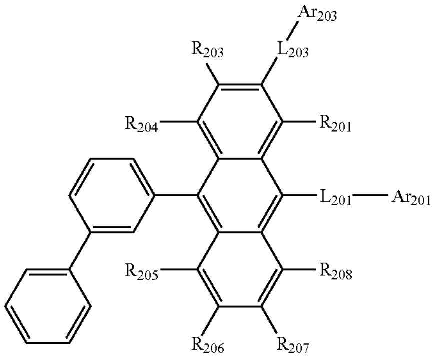

[Formula 290]

(226)

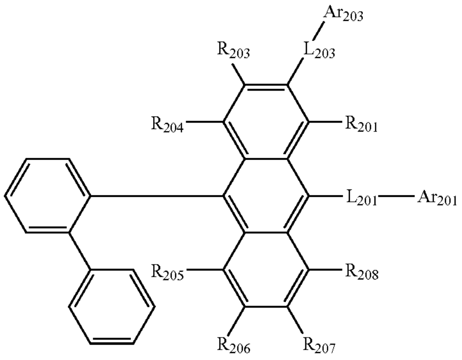

[Formula 291]

(227)

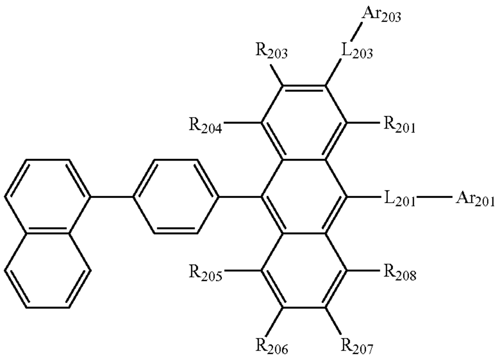

-continued

[Formula 292]

(228)

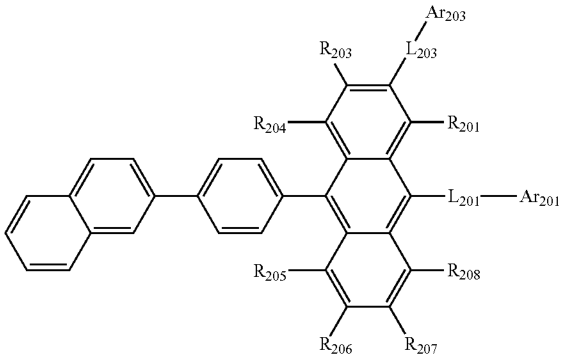

[Formula 293]

(229)

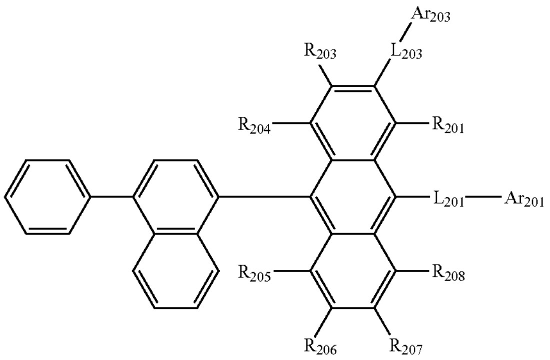

In the formulae (221), (222), (223), (224), (225), (226), (227), (228) and (229):

$R_{201}$ and $R_{203}$ to $R_{208}$ each independently represent the same as $R_{201}$ and $R_{203}$ to $R_{208}$ in the formula (2);

$L_{201}$ and $Ar_{201}$ respectively represent the same as $L_{201}$ and $Ar_{201}$ in the formula (2); $L_{203}$ represents the same as $L_{201}$ in the formula (2); $L_{203}$ and $L_{201}$ are mutually the same or different; $Ar_{203}$ represents the same as $Ar_{201}$ in the formula (2); and $Ar_{203}$ and $Ar_{201}$ are mutually the same or different.

The second compound represented by the formula (2) is also preferably a compound represented by a formula (241), a formula (242), a formula (243), a formula (244), a formula (245), a formula (246), a formula (247), a formula (248), or a formula (249) below.

[Formula 294]

(241)

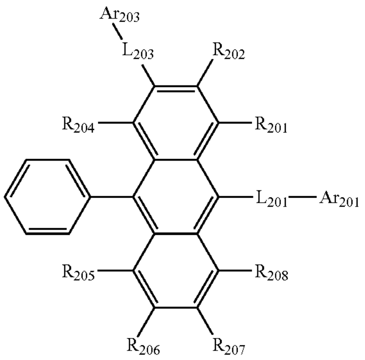

-continued
[Formula 295]
(242)
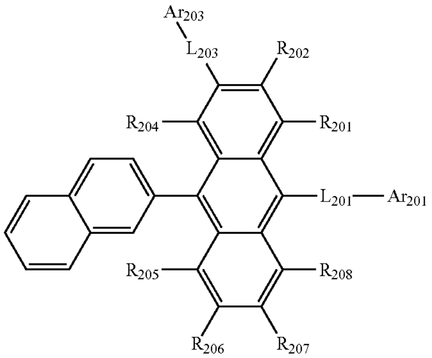
[Formula 296]
(243)
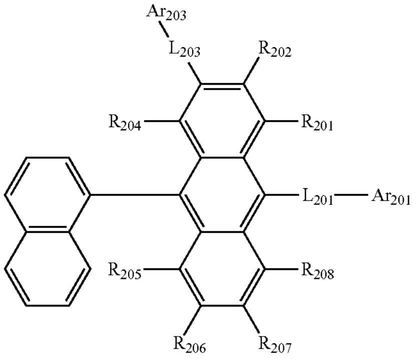
[Formula 297]
(244)
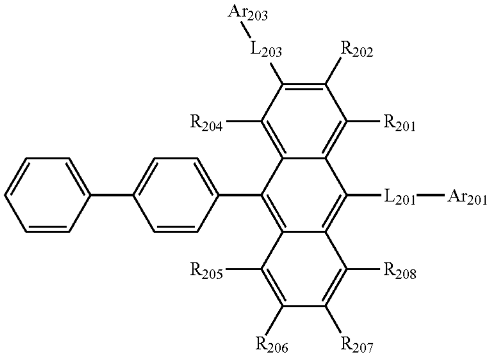
[Formula 298]
(245)
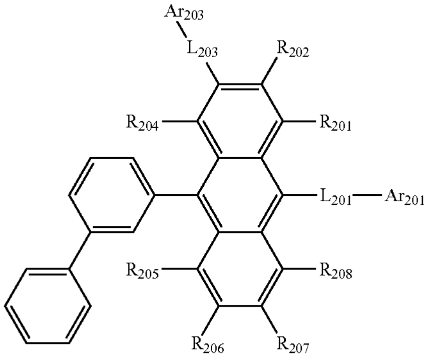
-continued
[Formula 299]
(246)
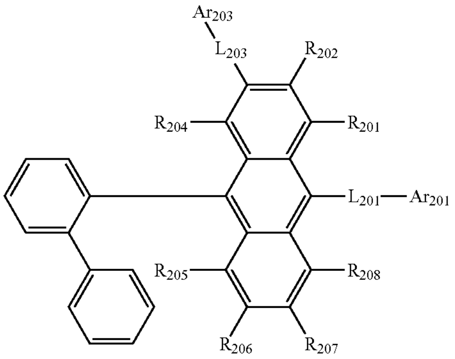
[Formula 300]
(247)
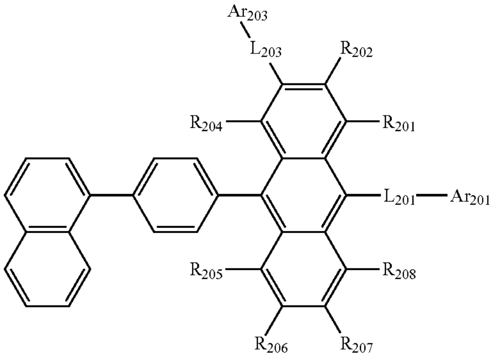
[Formula 301]
(248)
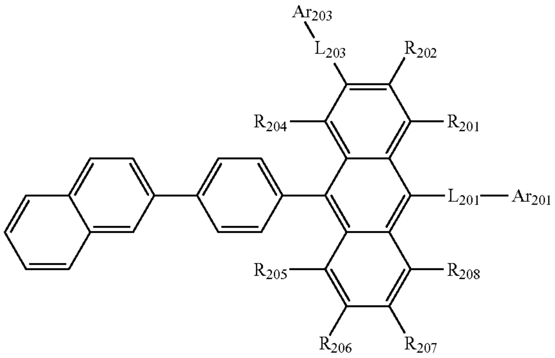

-continued

[Formula 302]

(249)

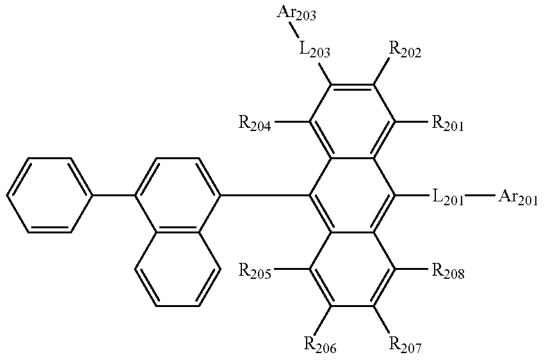

In the formulae (241), (242), (243), (244), (245), (246), (247), (248) and (249):

$R_{201}$, $R_{202}$ and $R_{204}$ to $R_{208}$ each independently represent the same as $R_{201}$, $R_{202}$ and $R_{204}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

$R_{201}$ to $R_{208}$ in the second compound represented by the formula (2) are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —$Si(R_{901})(R_{902})(R_{903})$.

$L_{201}$ is preferably a single bond, or an unsubstituted arylene group having 6 to 22 ring carbon atoms; and $Ar_{201}$ is preferably a substituted or unsubstituted aryl group having 6 to 22 ring carbon atoms.

In the organic EL device according to the exemplary embodiment, $R_{201}$ to $R_{208}$ that are substituents of an anthracene skeleton in the second compound represented by the formula (2) are preferably hydrogen atoms in terms of preventing inhibition of intermolecular interaction and inhibiting decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ are each a bulky substituent such as an alkyl group and a cycloalkyl group, intermolecular interaction may be inhibited. It should be noted that substituents, namely, a haloalkyl group, alkenyl group, alkynyl group, group represented by —$Si(R_{901})(R_{902})(R_{903})$, group represented by —O—$(R_{904})$, group represented by —S—$(R_{905})$, group represented by —$N(R_{906})(R_{907})$, aralkyl group, group represented by —C(=O)$R_{801}$, group represented by —$COOR_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably neither an alkyl group nor cycloalkyl group. More preferably, $R_{201}$ to $R_{208}$ are each not an alkyl group, cycloalkyl group, haloalkyl group, alkenyl group, alkynyl group, group represented by —$Si(R_{901})(R_{902})(R_{903})$, group represented by —O—$(R_{904})$, group represented by —S—$(R_{905})$, group represented by —$N(R_{906})(R_{907})$, aralkyl group, group represented by —C(=O)$R_{801}$, group represented by —$COOR_{802}$, halogen atom, cyano group, and nitro group.

In the organic EL device of the exemplary embodiment, it is also preferable that $R_{201}$ to $R_{208}$ in the second compound represented by the formula (2) are each independently a hydrogen atom, a substituted or unsubstituted alkyl group having 1 to 50 carbon atoms, a substituted or unsubstituted cycloalkyl group having 3 to 50 ring carbon atoms, or a group represented by —$Si(R_{901})(R_{902})(R_{903})$.

In the organic EL device according to the exemplary embodiment, $R_{201}$ to $R_{208}$ in the second compound represented by the formula (2) are preferably each a hydrogen atom.

In the second compound, examples of the substituent for the "substituted or unsubstituted" group on $R_{201}$ to $R_{208}$ also preferably do not include the above-described substituent that is likely to be bulky, especially a substituted or unsubstituted alkyl group and a substituted or unsubstituted cycloalkyl group. When examples of the substituent for the "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

Further preferably, $R_{201}$ to $R_{208}$ that are the substituents on the anthracene skeleton are not bulky substituents and $R_{201}$ to $R_{208}$ as substituents are unsubstituted. Assuming that $R_{201}$ to $R_{208}$ that are the substituents on the anthracene skeleton are not bulky substituents and substituents are bonded to $R_{201}$ to $R_{208}$ that are not bulky substituents, the substituents bonded to $R_{201}$ to $R_{208}$ are preferably not bulky substituents; and the substituents bonded to $R_{201}$ to $R_{208}$ serving as substituents are preferably not an alkyl group and cycloalkyl group, and more preferably not an alkyl group, cycloalkyl group, haloalkyl group, alkenyl group, alkynyl group, group represented by —$Si(R_{901})(R_{902})(R_{903})$, group represented by —O—$(R_{904})$, group represented by —S—$(R_{905})$, group represented by —$N(R_{906})(R_{907})$, aralkyl group, group represented by —C(=O)$R_{801}$, group represented by —$COOR_{802}$, halogen atom, cyano group, and nitro group.

In the second compound, the groups specified to be "substituted or unsubstituted" are each preferably an "unsubstituted" group.

Method of Producing Second Compound

The second compound can be produced by a known method. The second compound can also be produced based on a known method through a known alternative reaction using a known material(s) tailored for the target compound.

Specific Examples of Second Compound

Specific examples of the second compound include the following compounds. It should however be noted that the invention is not limited to the specific examples of the second compound.

[Formula 303]
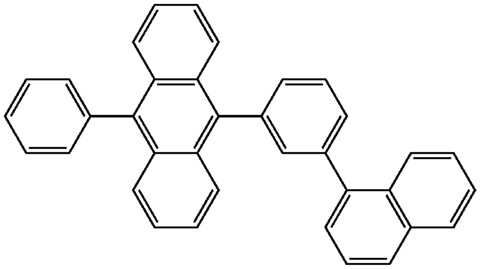
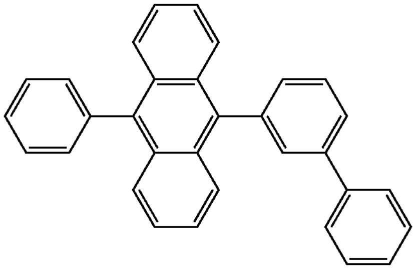
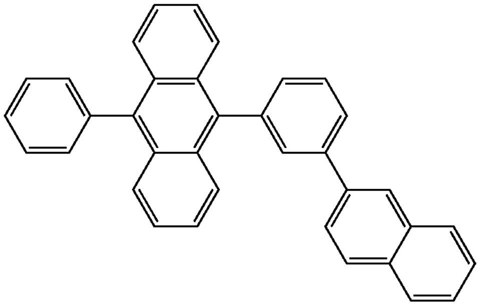
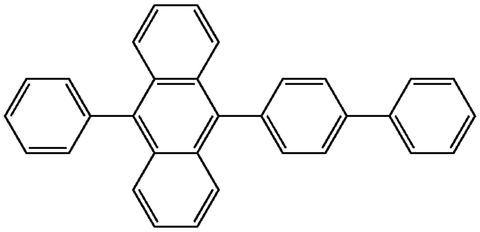
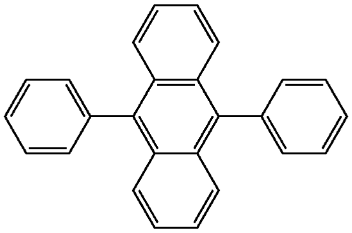
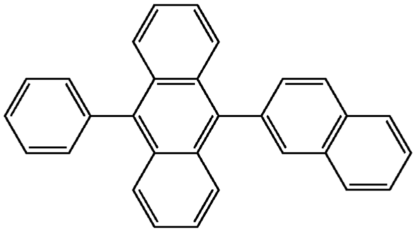
-continued
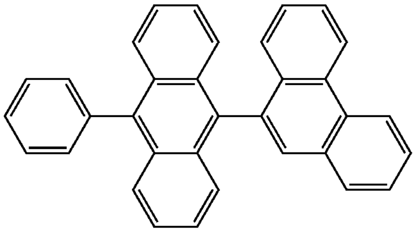
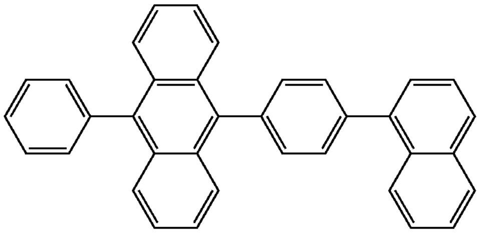
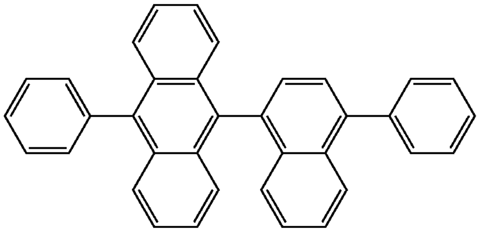
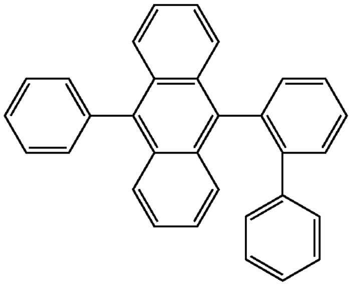
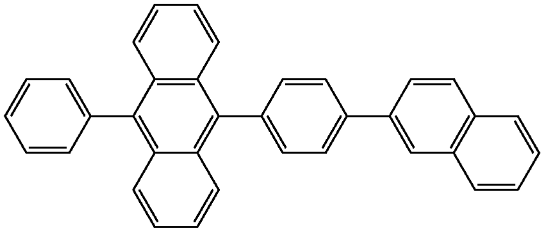
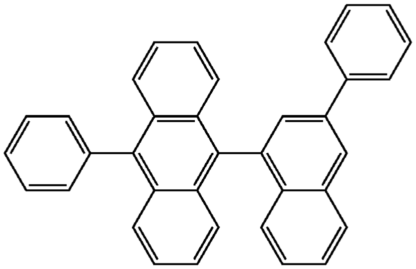

-continued
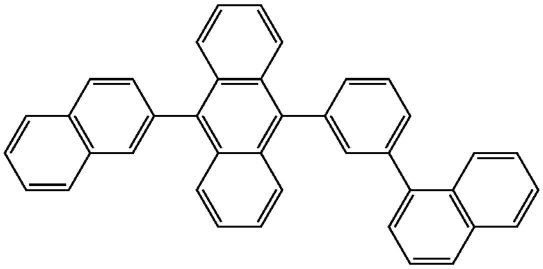
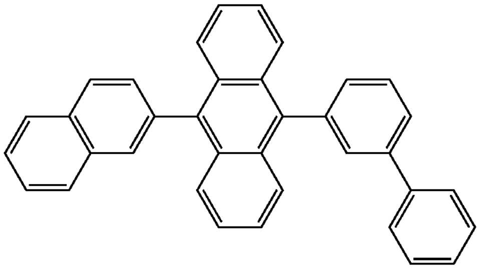
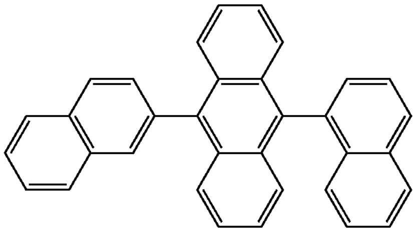
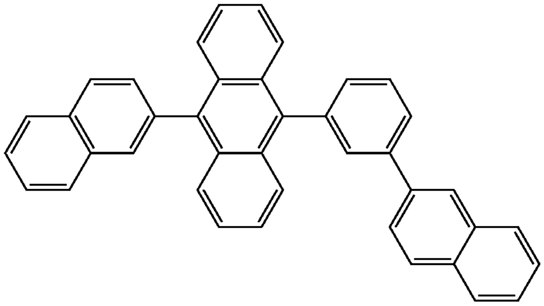
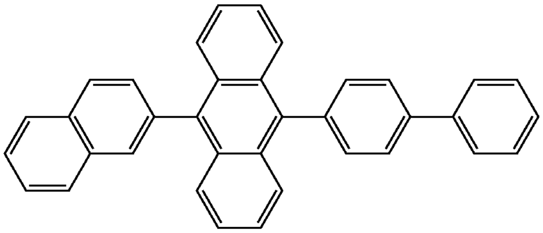
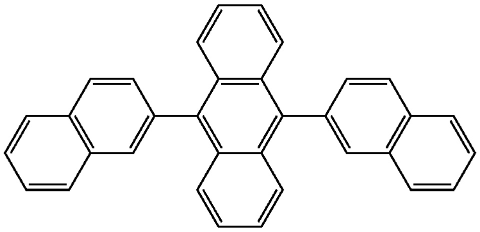
-continued
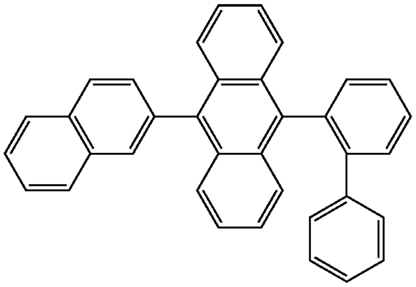
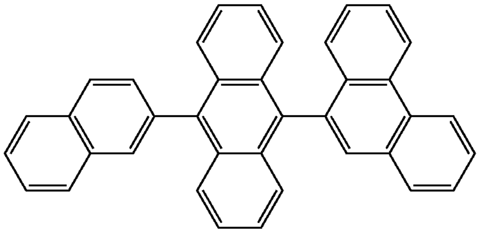
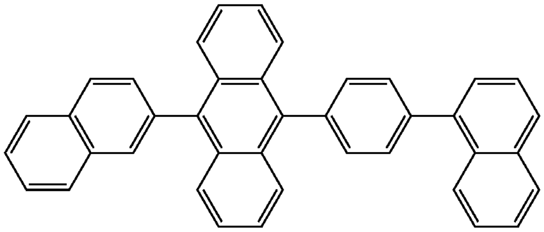
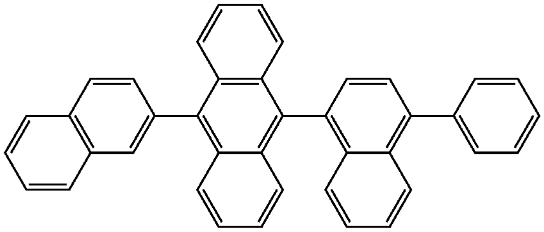
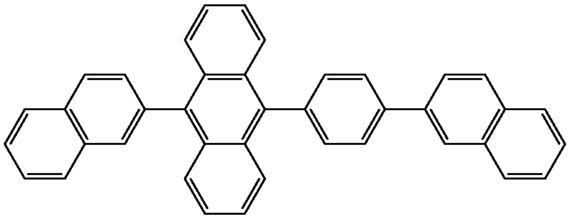
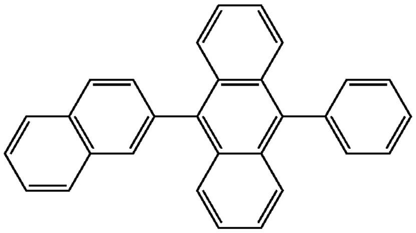
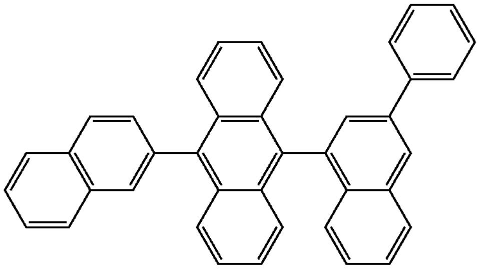

-continued
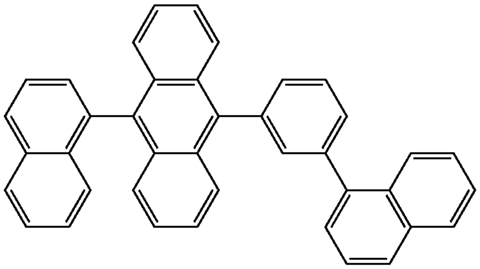
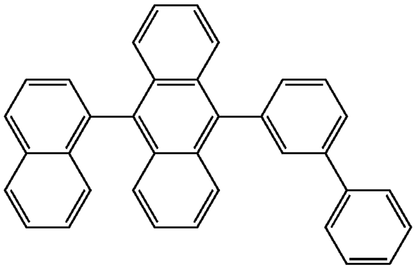
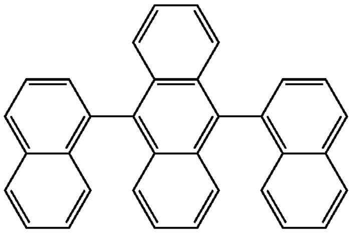
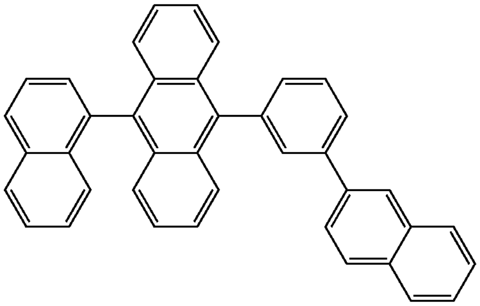
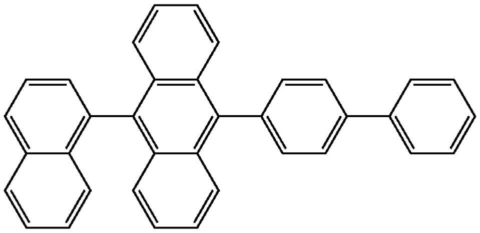
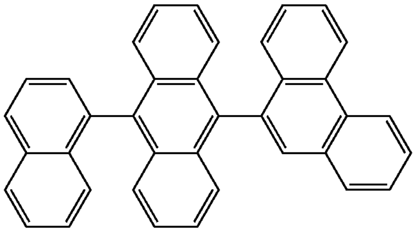
-continued
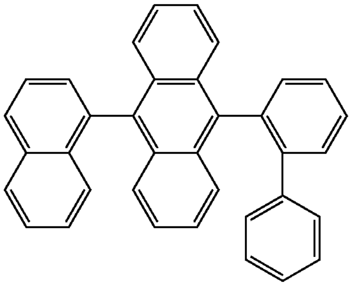
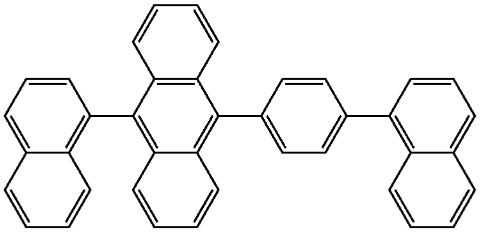
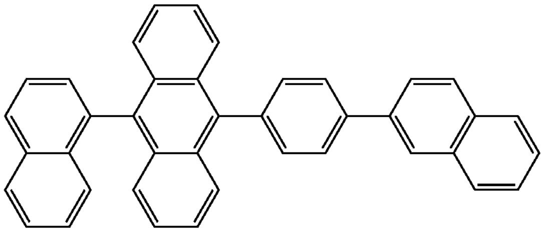
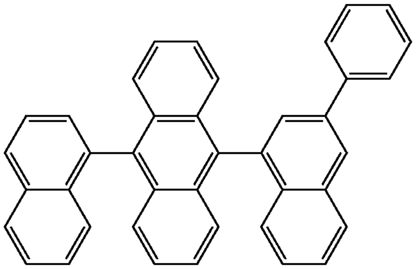
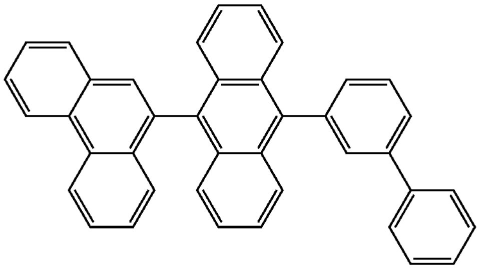
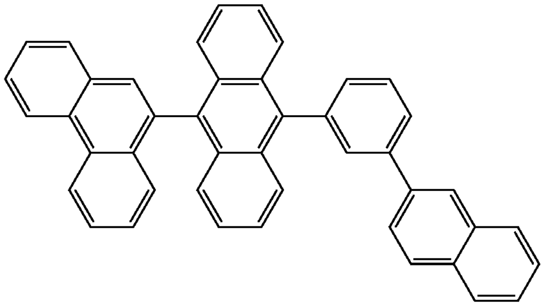

-continued
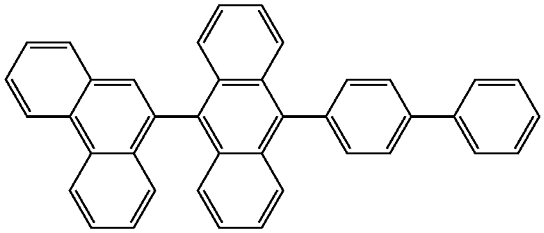
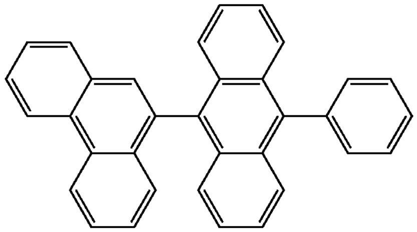
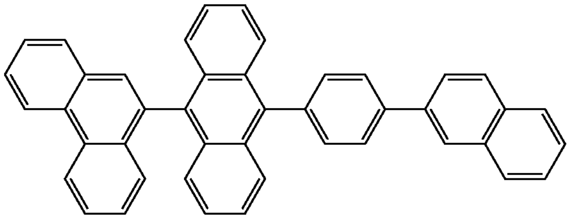
[Formula 304]
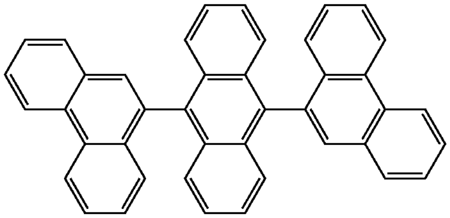
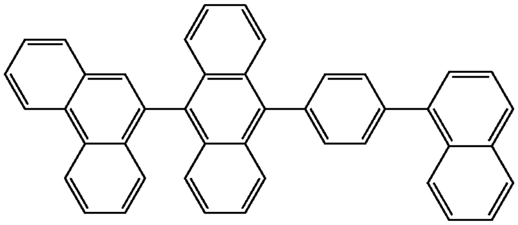
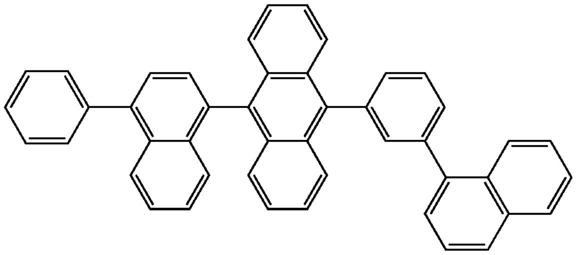
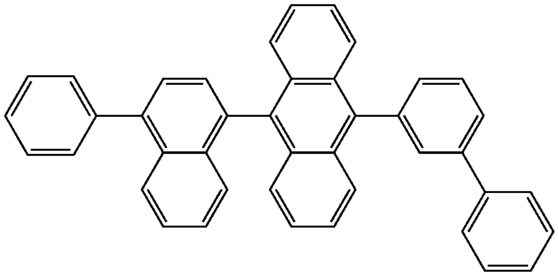
-continued
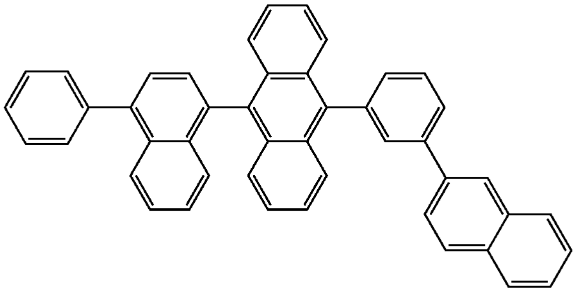
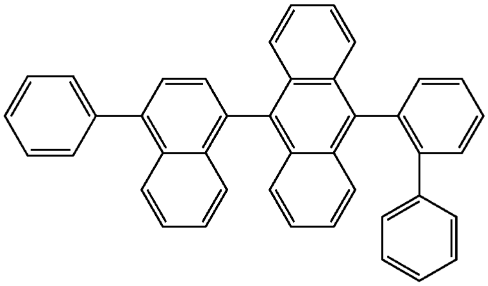
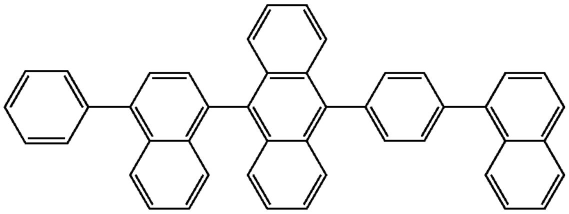
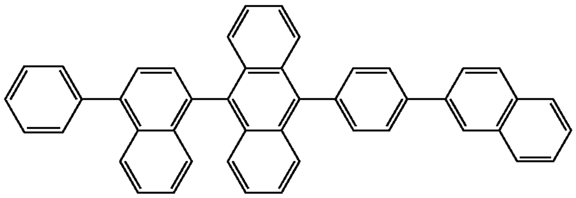
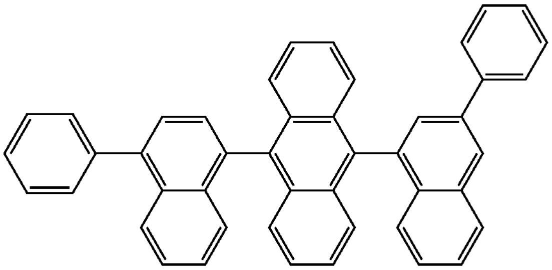
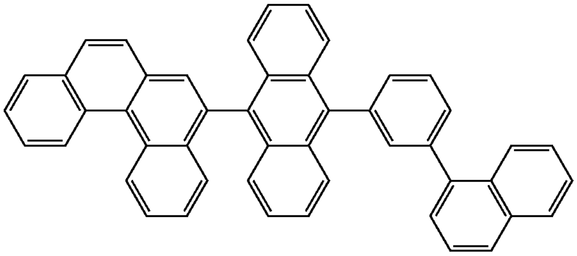

-continued
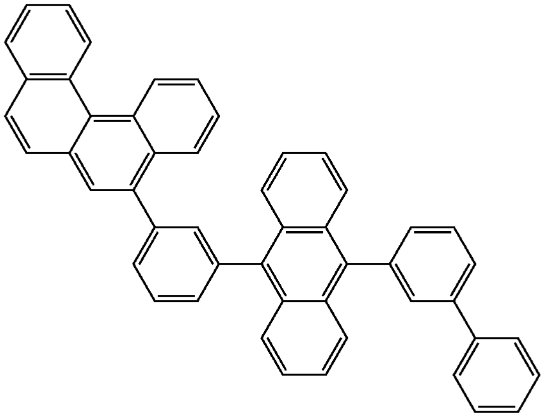
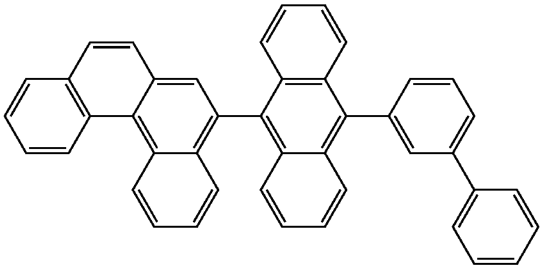
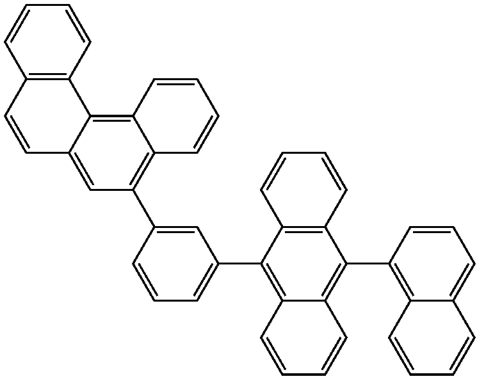
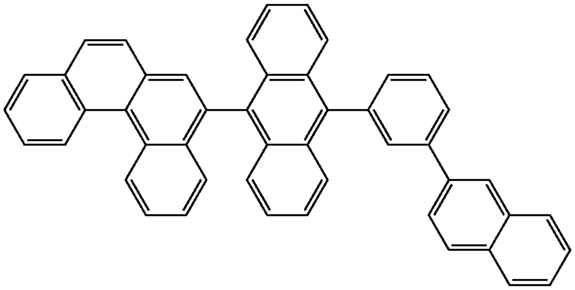
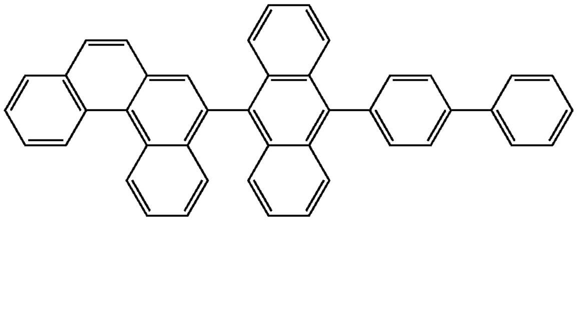
-continued
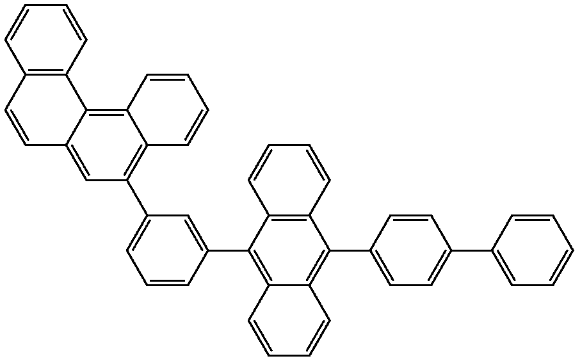
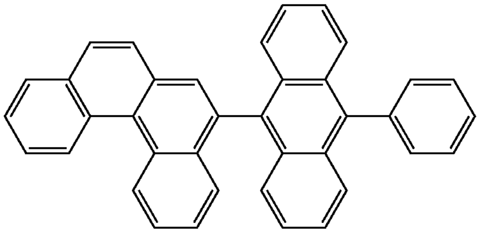
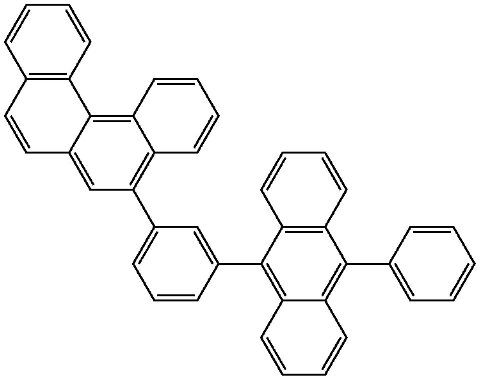
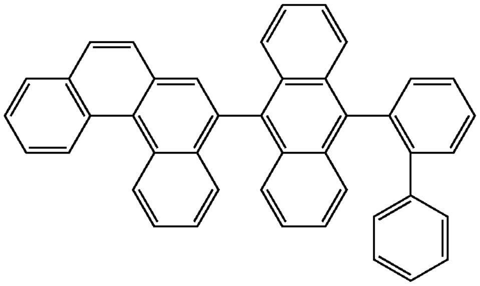
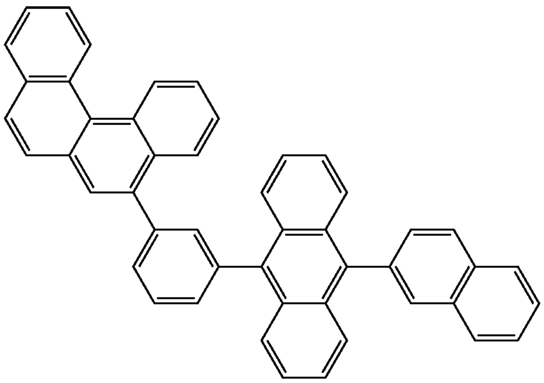

-continued
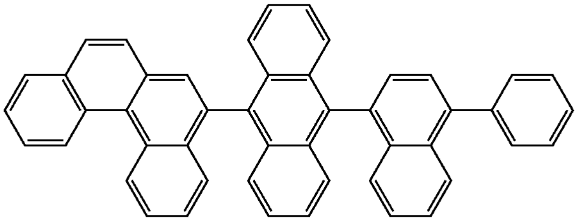
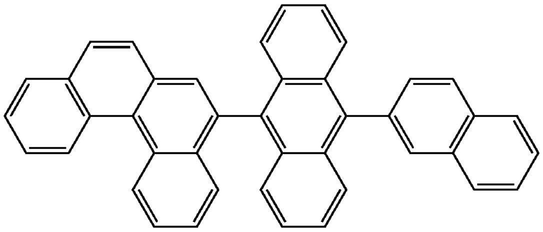
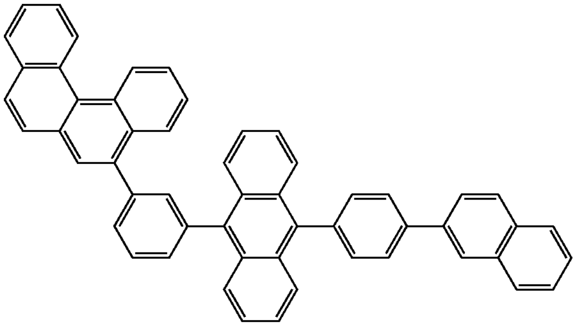
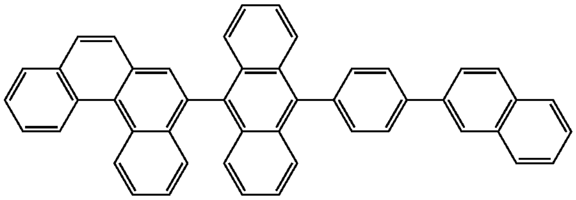
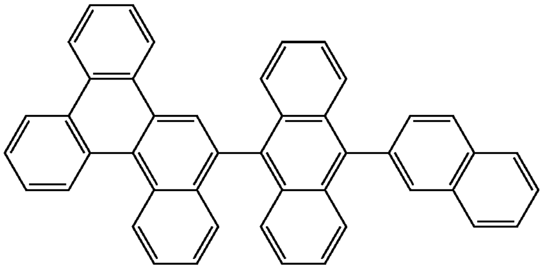
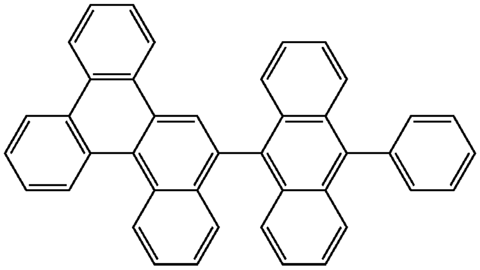
-continued
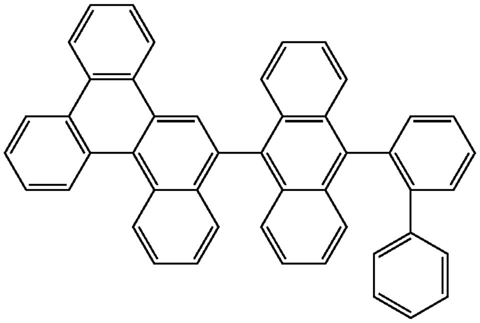
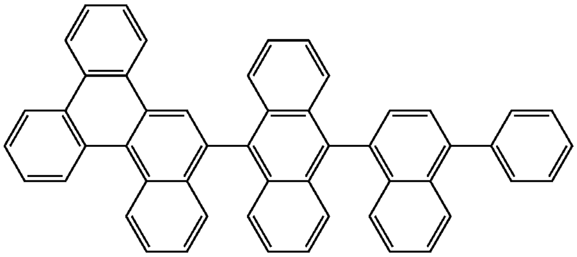
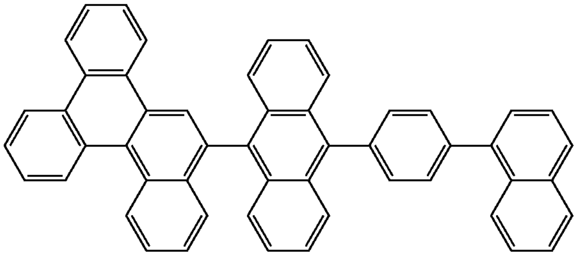
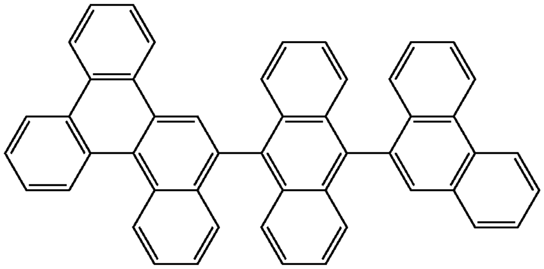
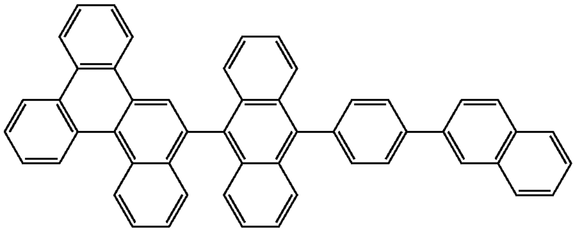
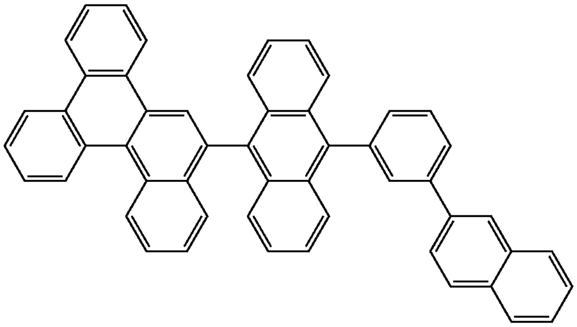

-continued
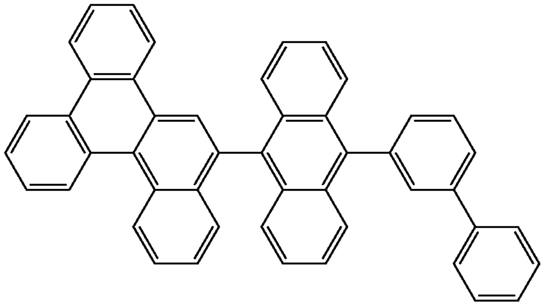
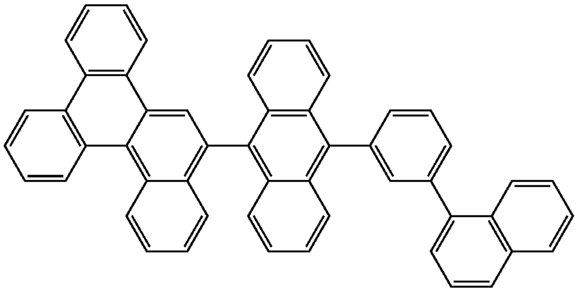
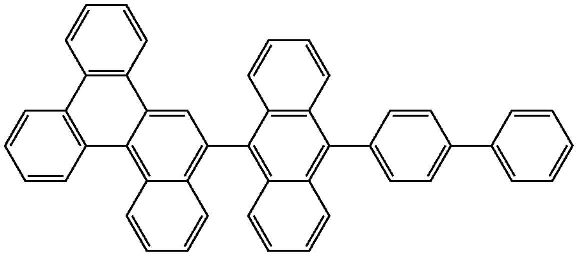
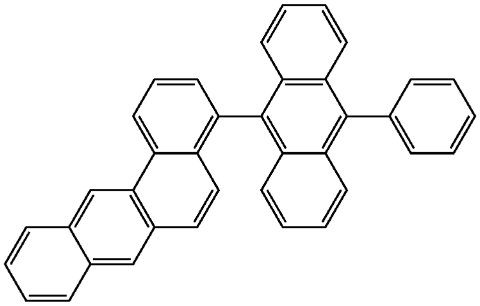
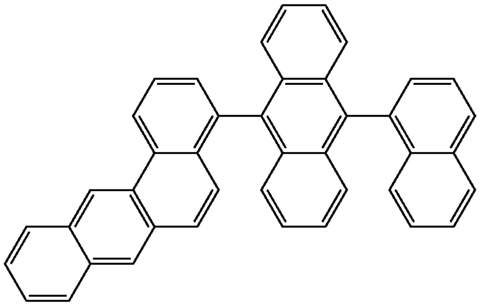
-continued
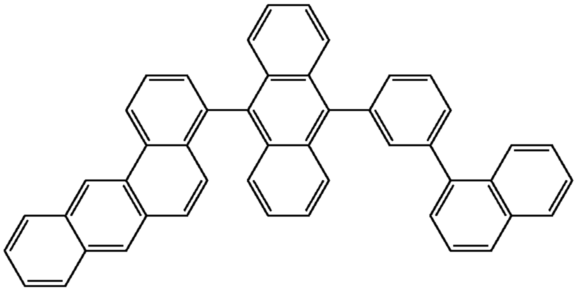
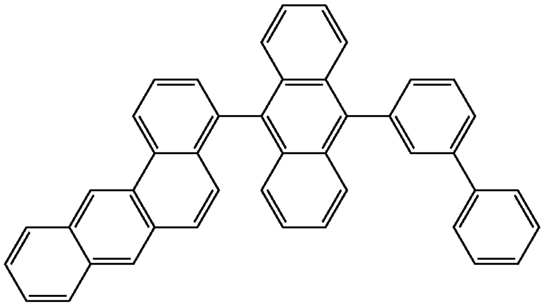
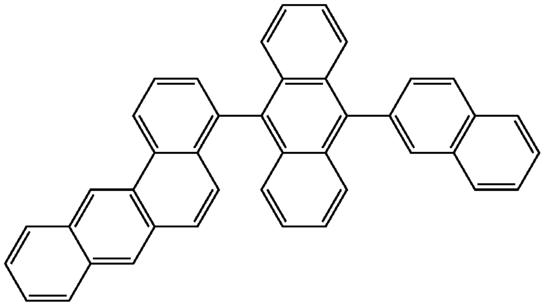
[Formula 305]
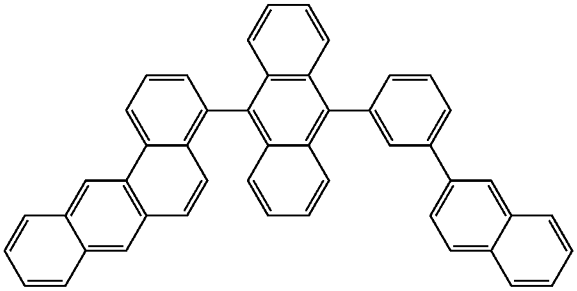
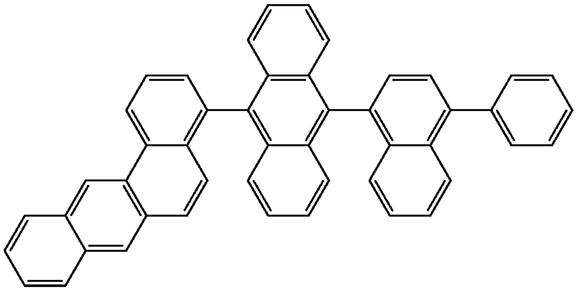

-continued
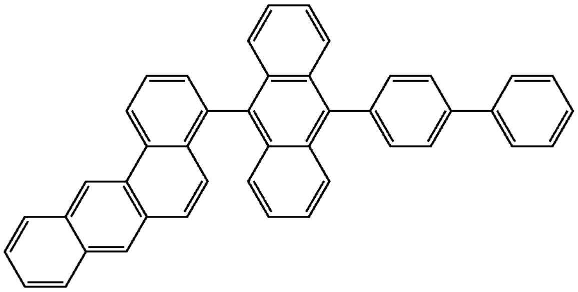
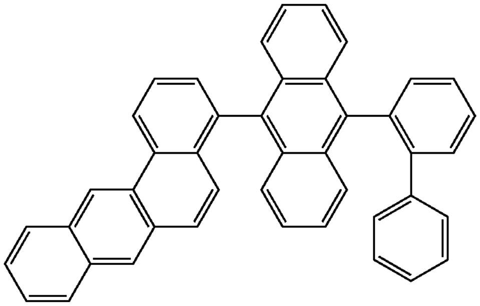
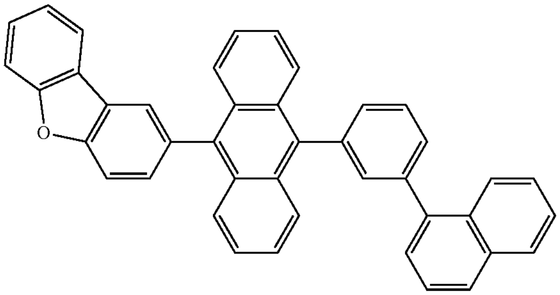
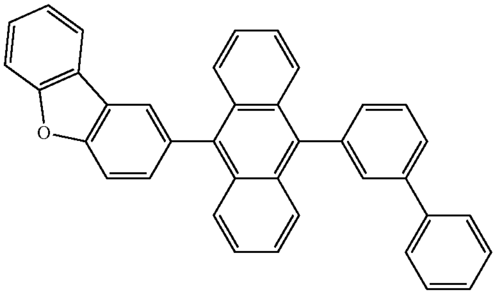
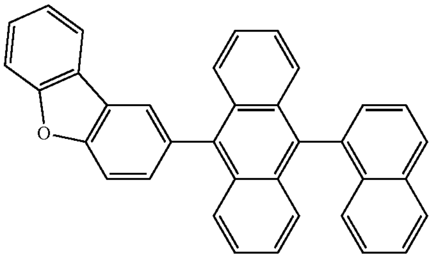
-continued
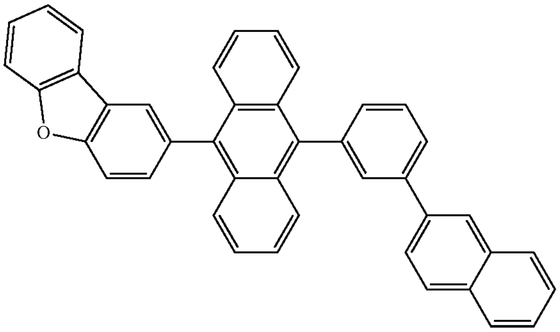
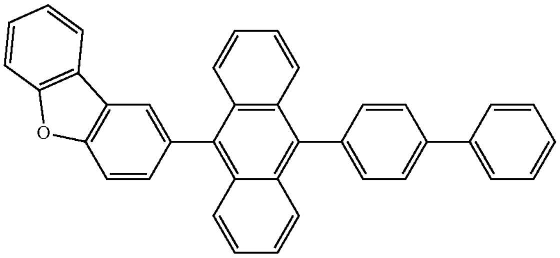
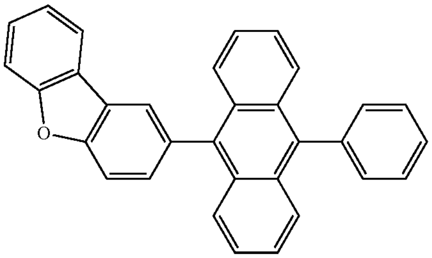
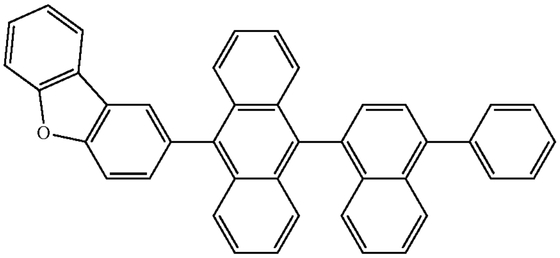
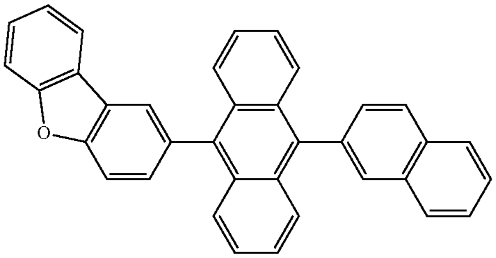
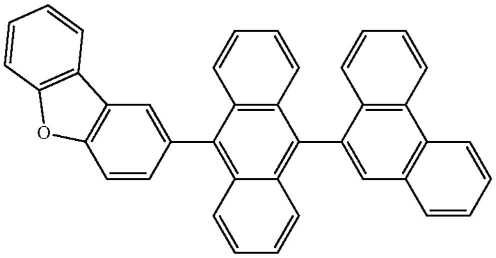

-continued
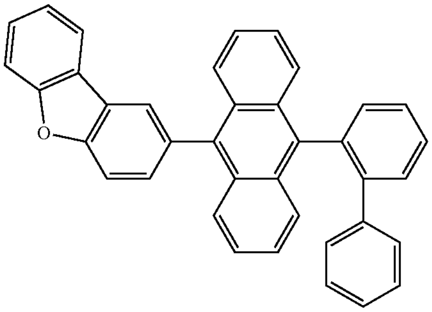
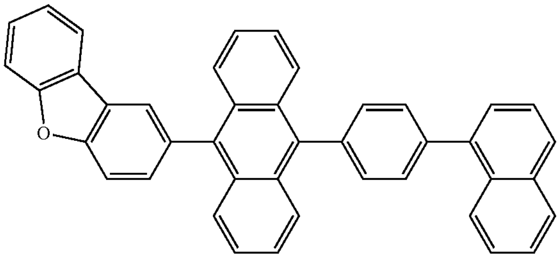
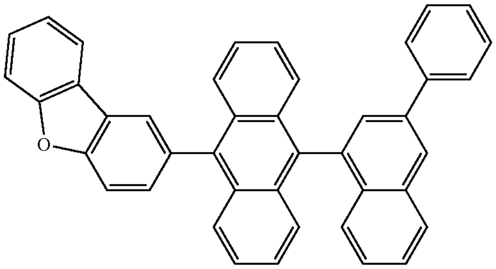
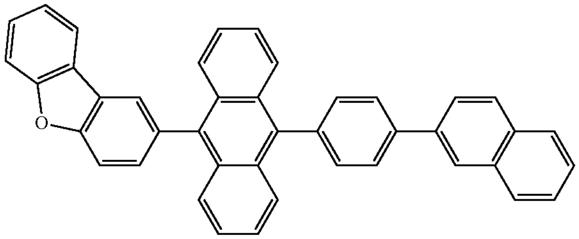
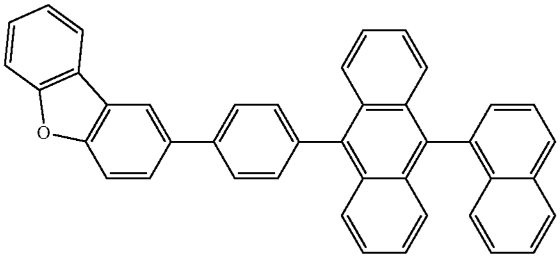
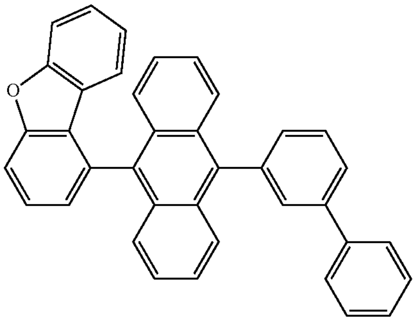
-continued
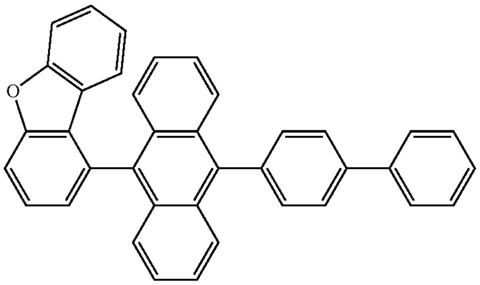
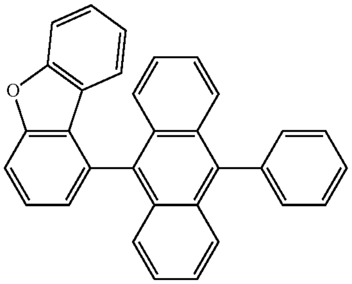
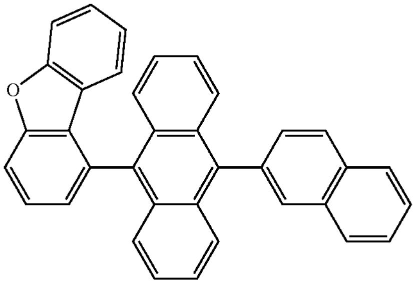
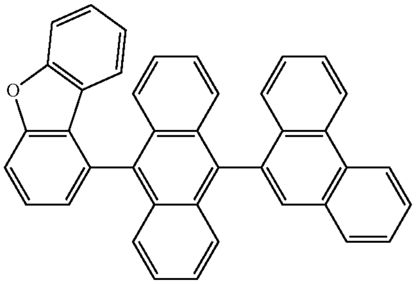
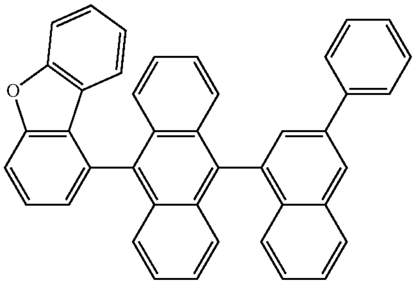

-continued
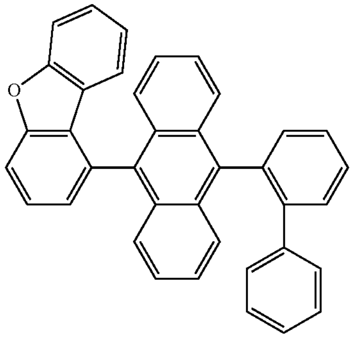
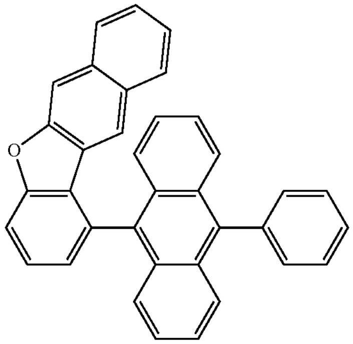
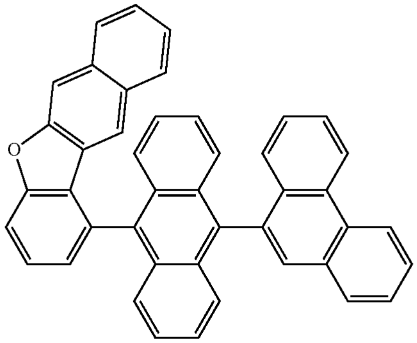
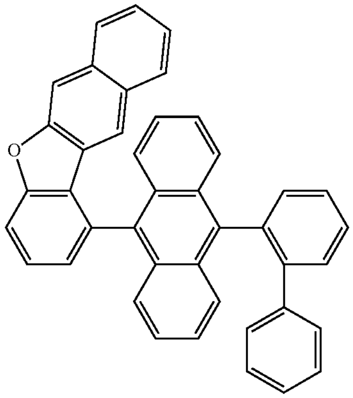
-continued
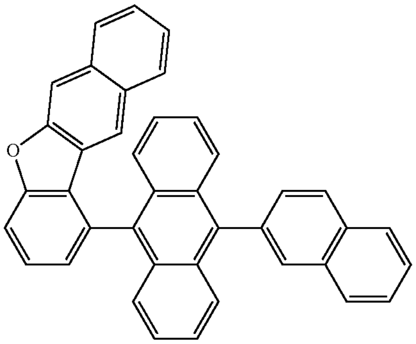
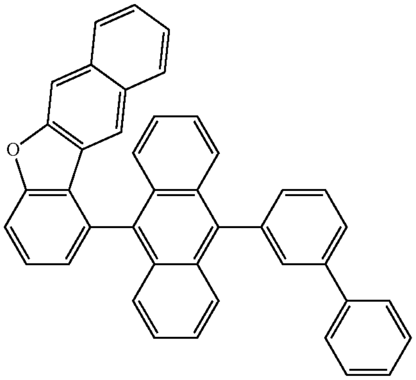
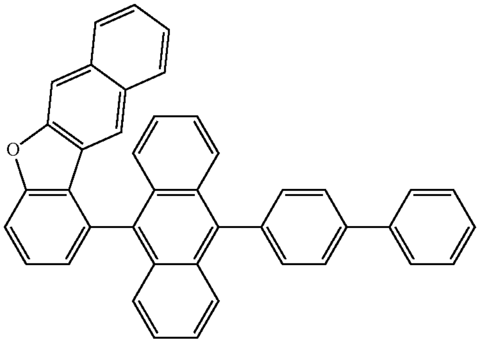
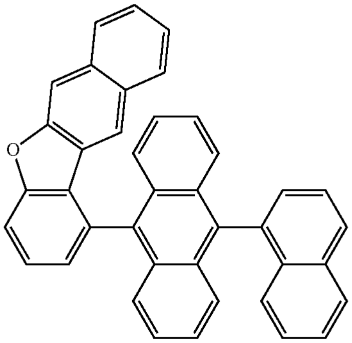

-continued
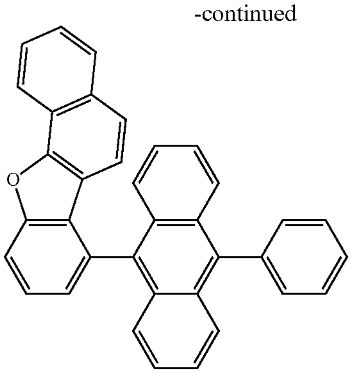
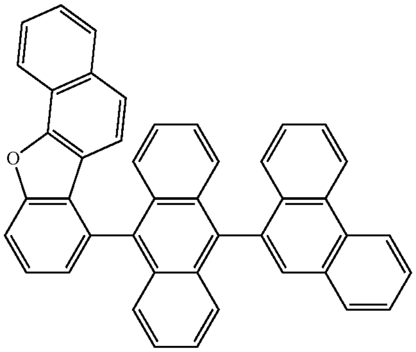
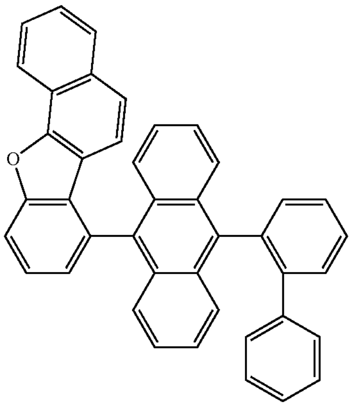
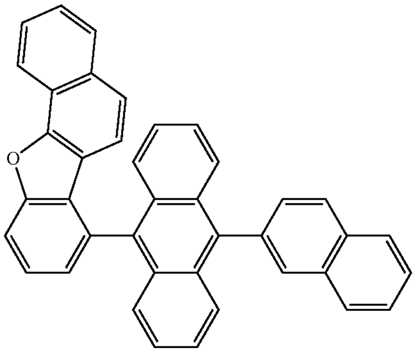
-continued
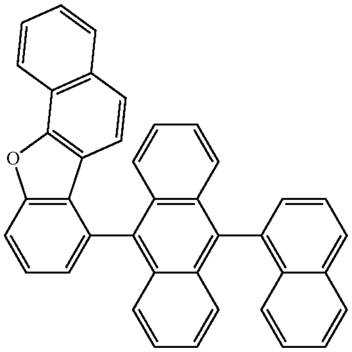
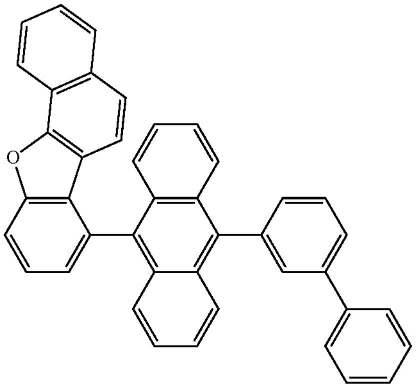
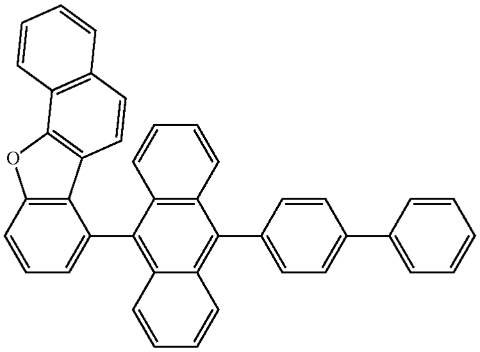
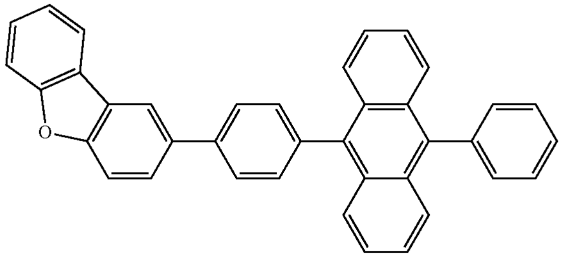
[Formula 306]
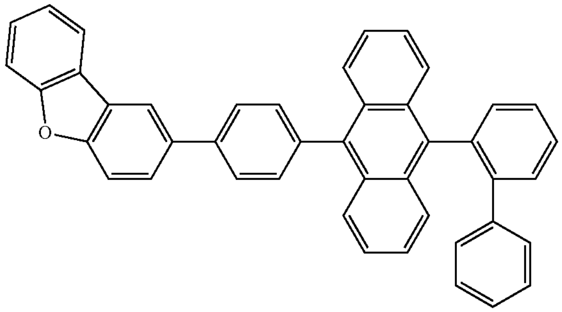

-continued
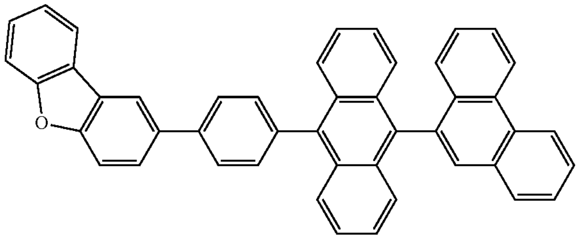
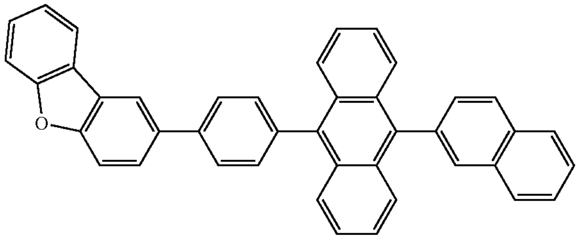
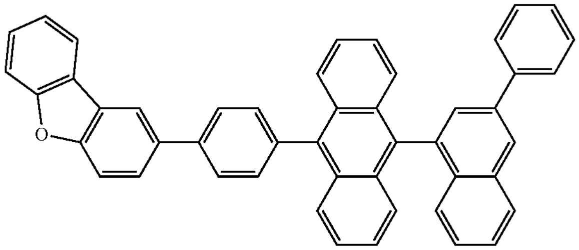
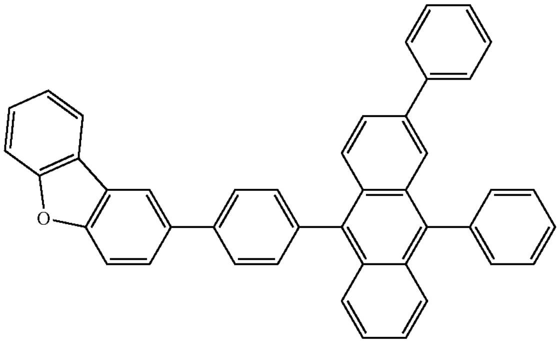
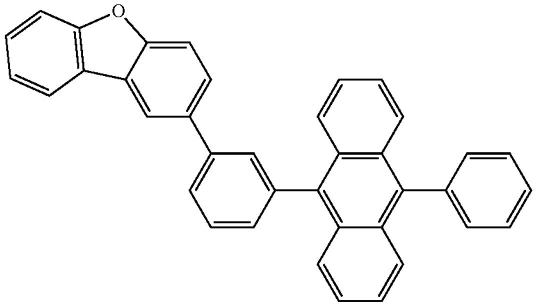
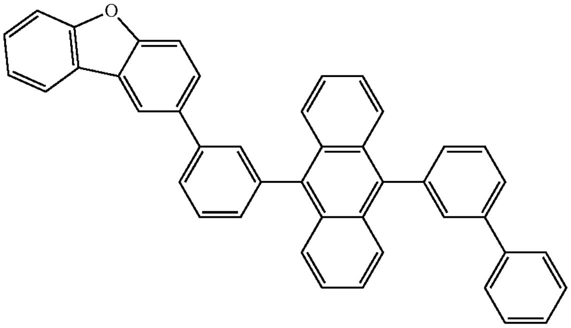
-continued
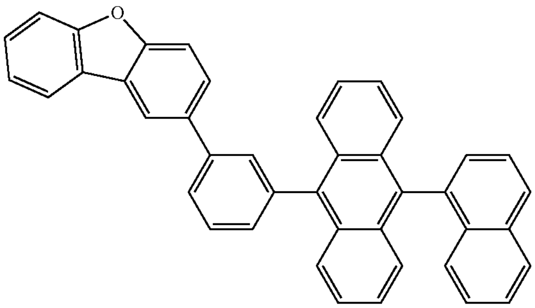
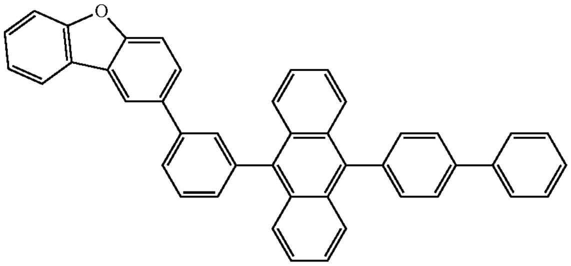
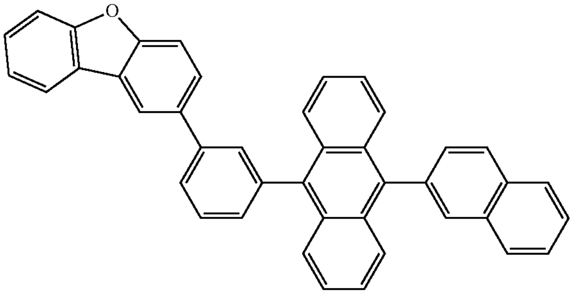
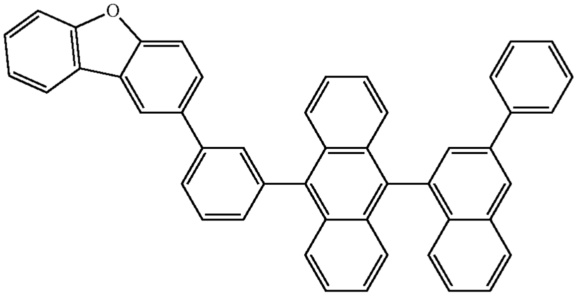
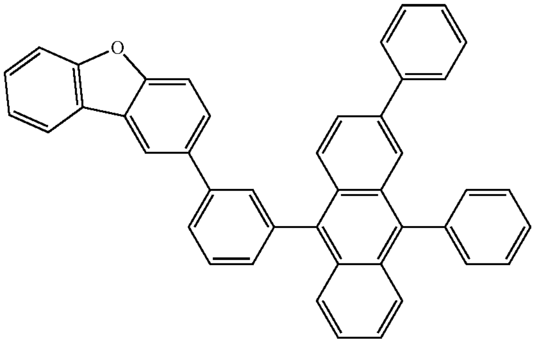

-continued
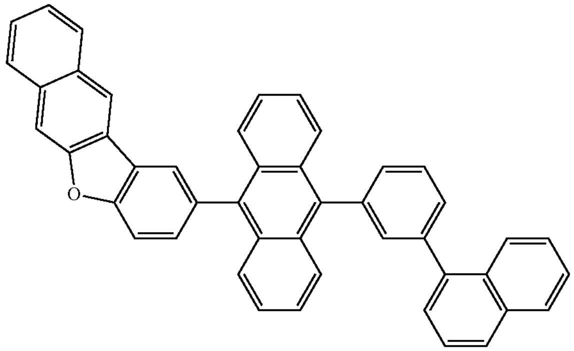
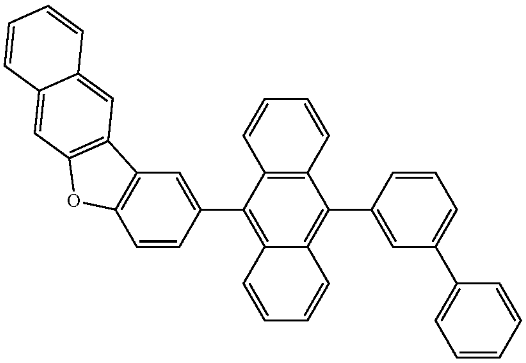
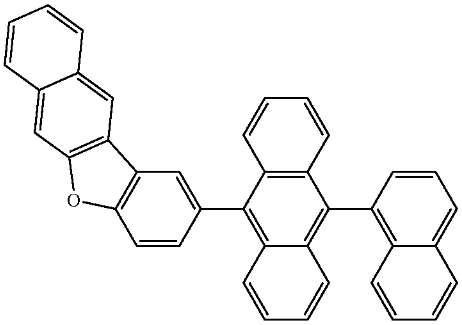
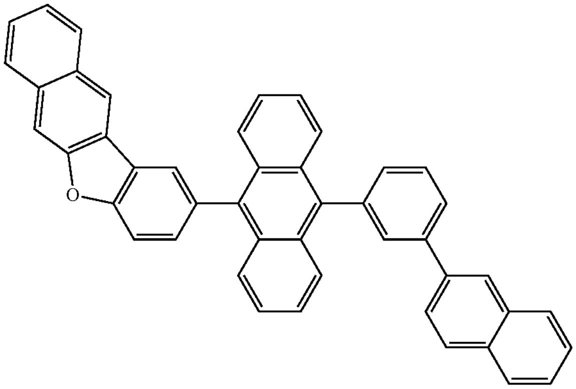
-continued
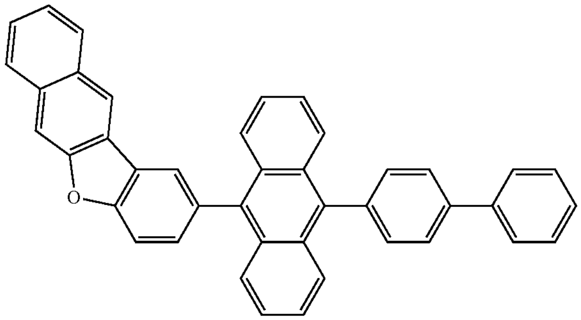
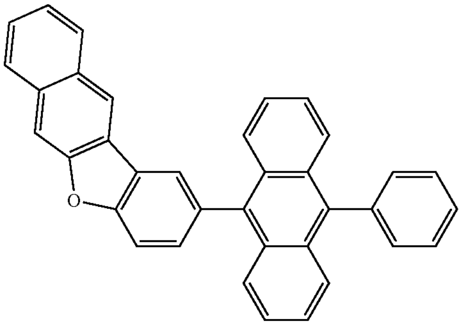
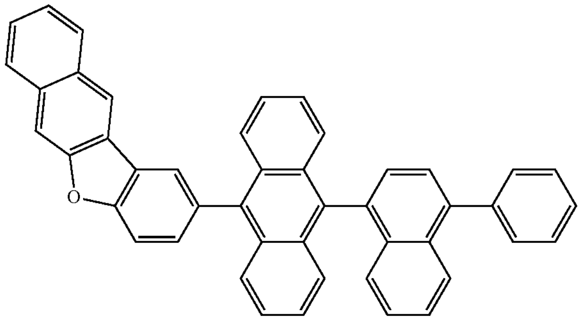
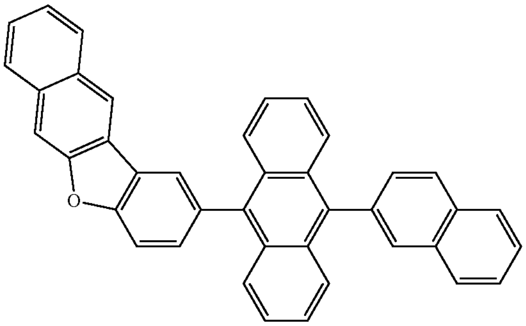
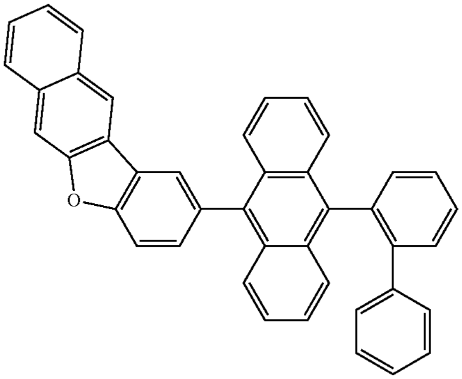

-continued
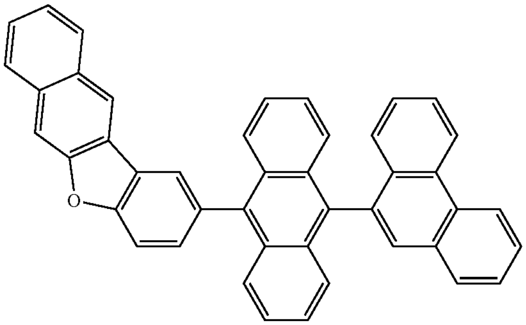
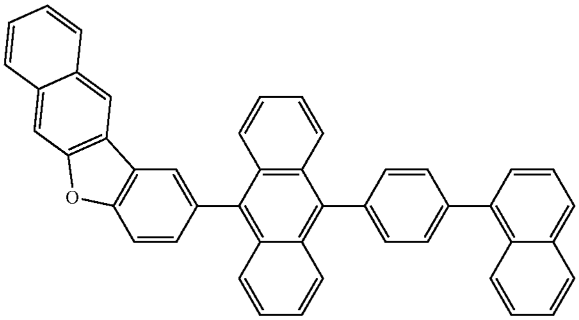
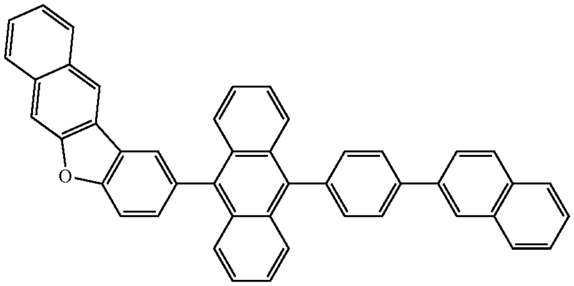
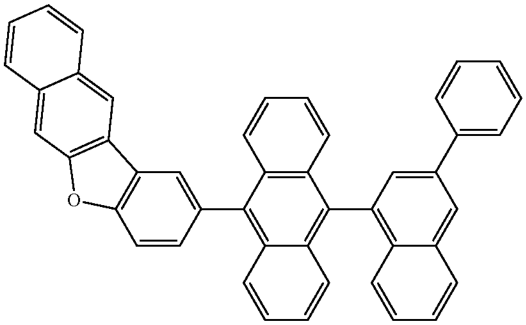
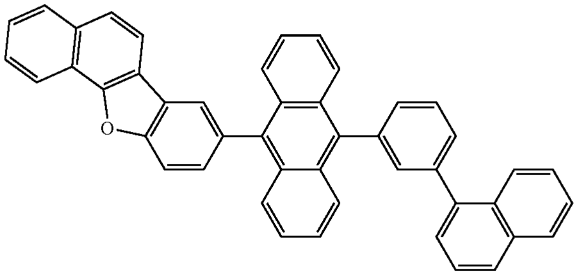
-continued
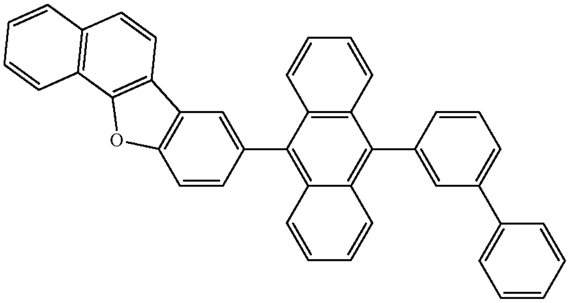
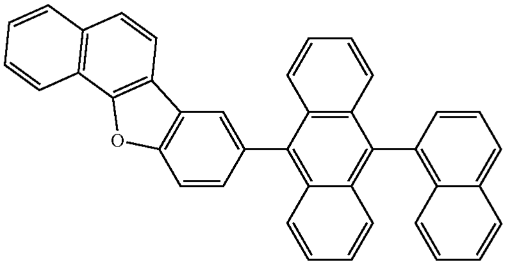
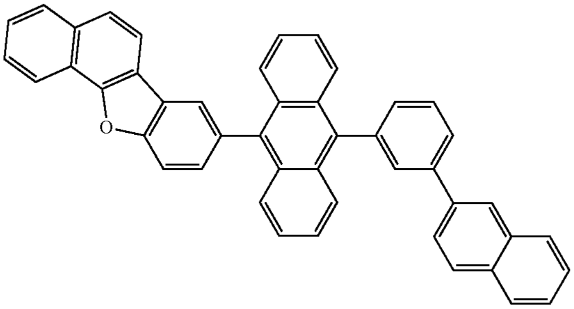
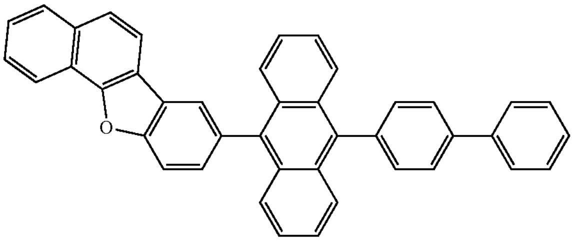
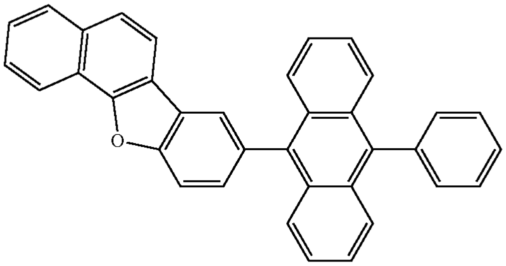
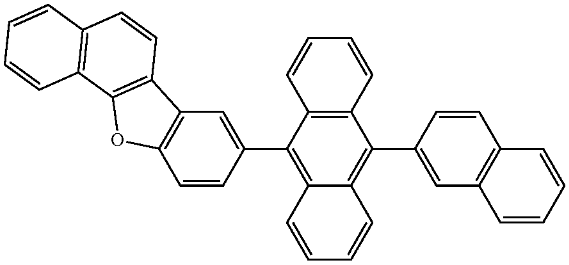

-continued
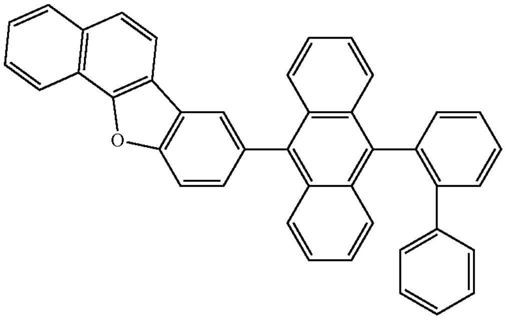
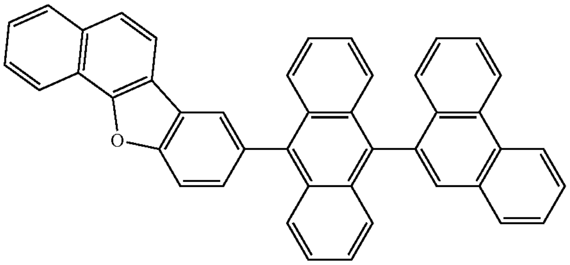
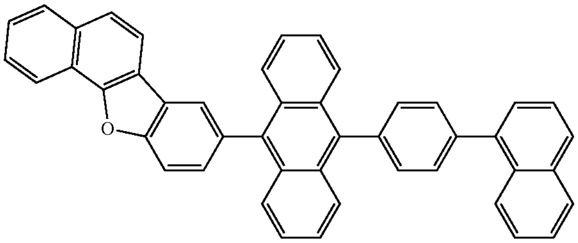
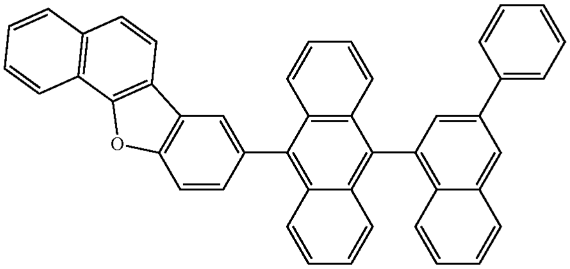
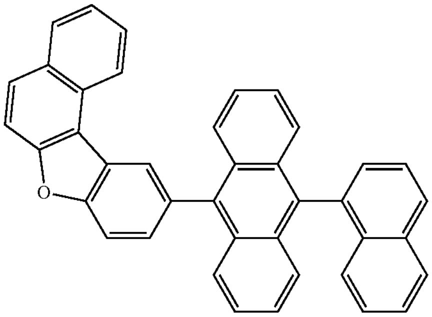
-continued
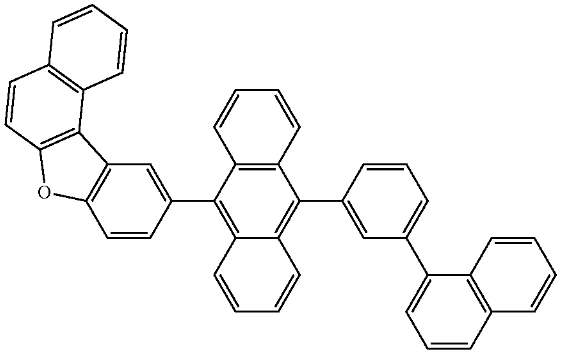
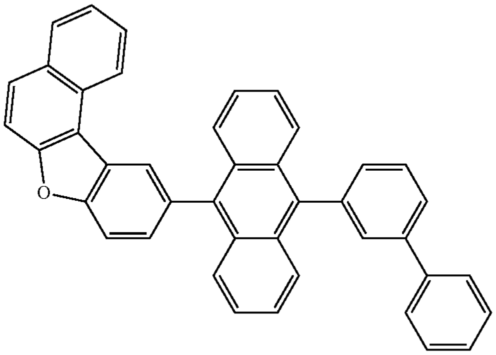
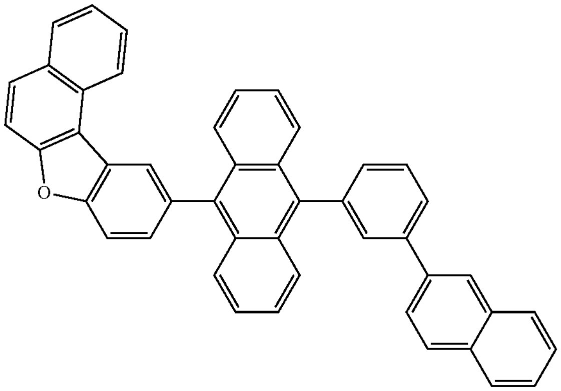
[Formula 307]
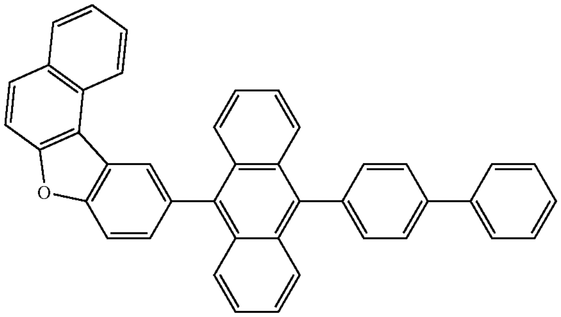

-continued
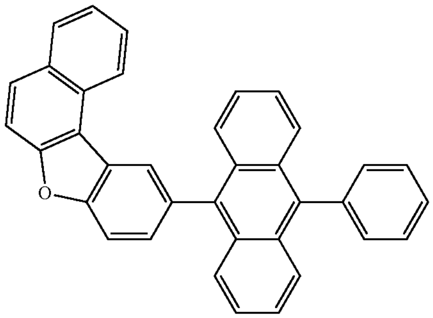
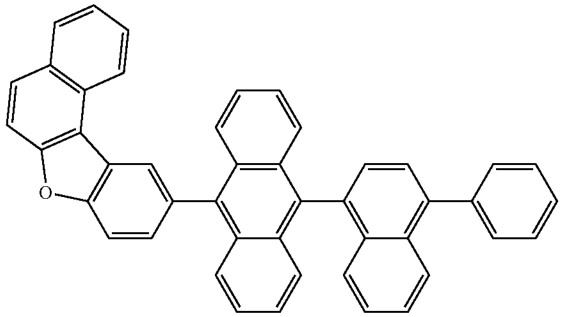
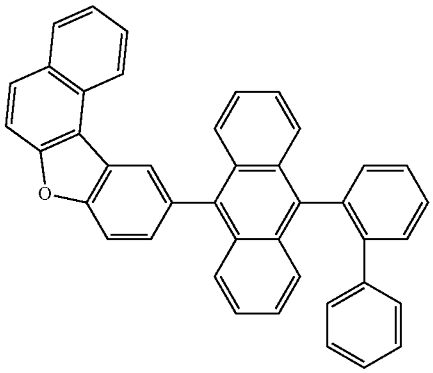
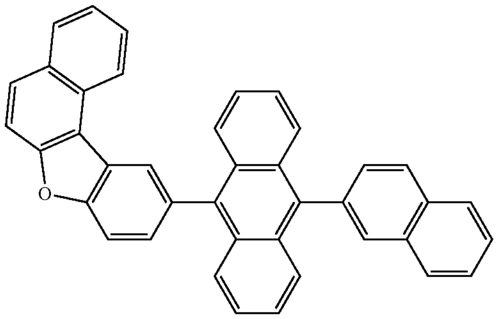
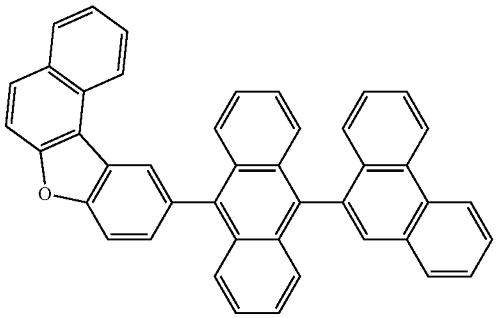
-continued
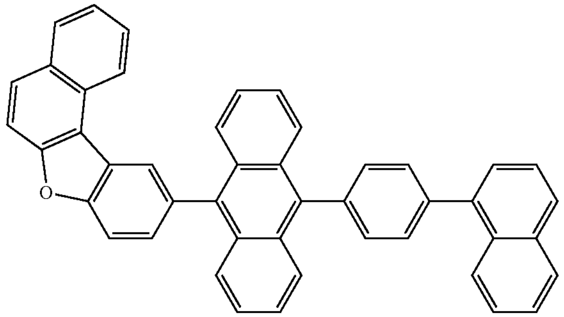
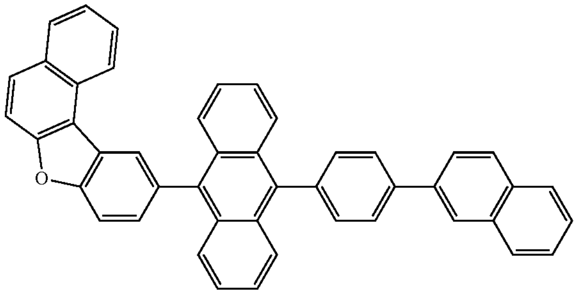
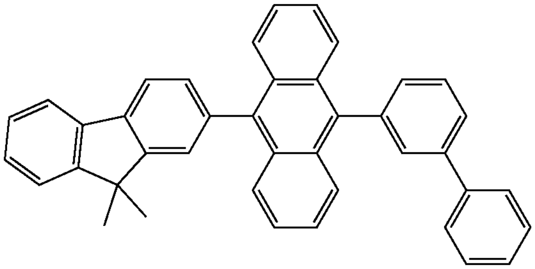
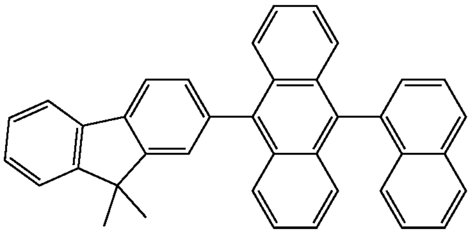
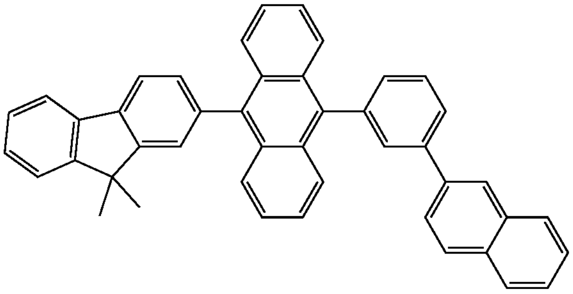
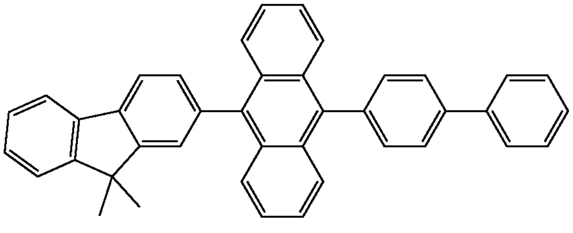

-continued
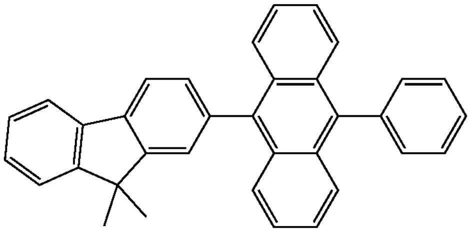
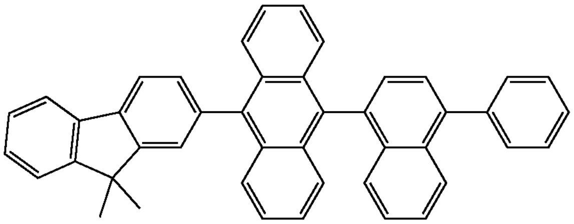
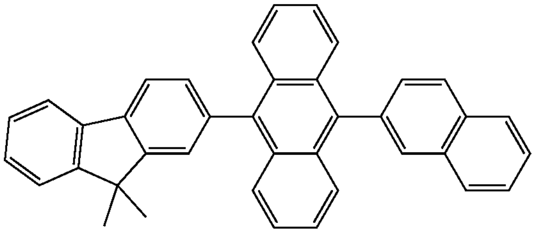
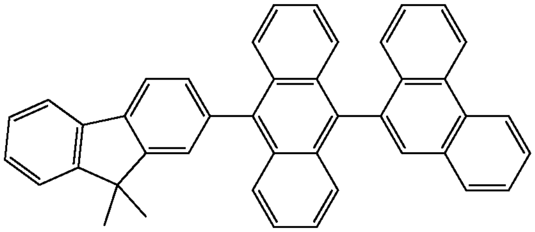
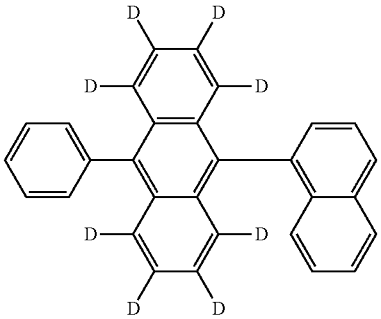
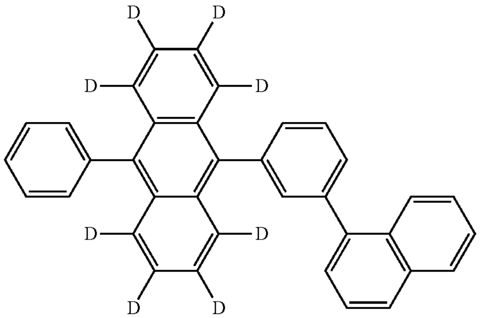
-continued
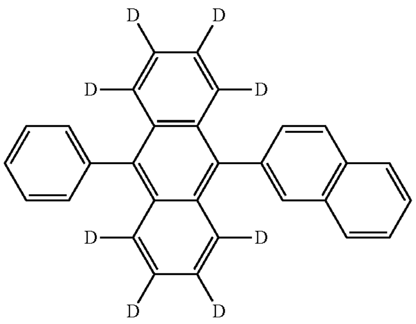
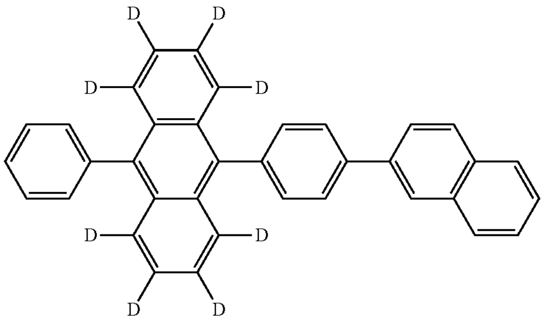
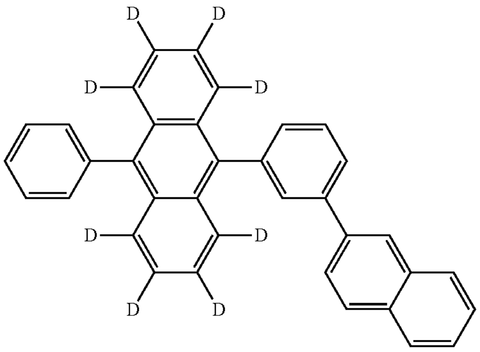
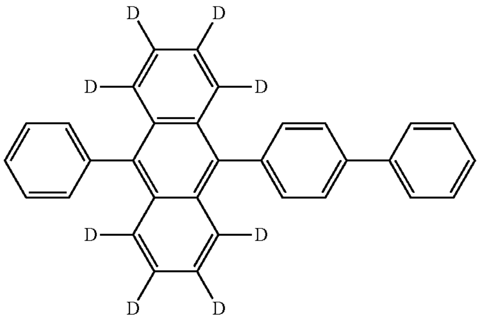
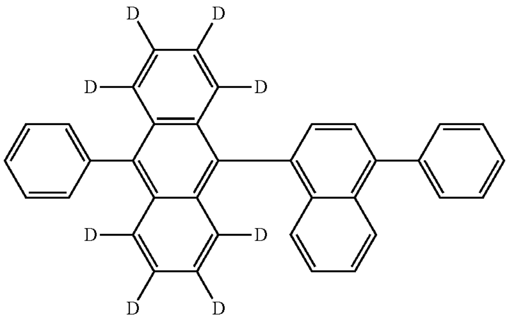

-continued
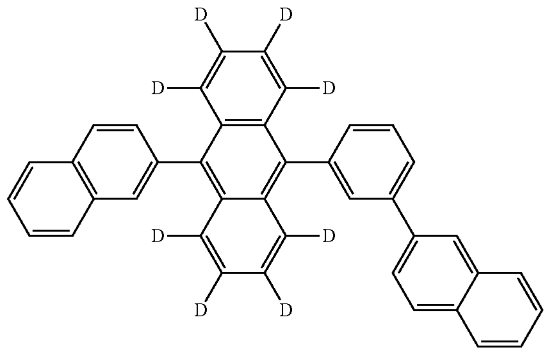
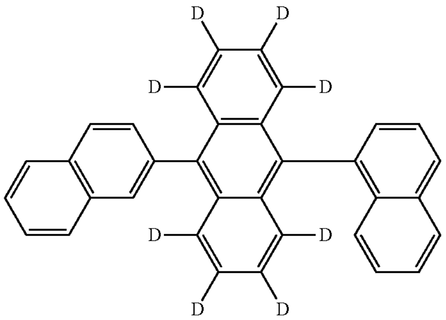
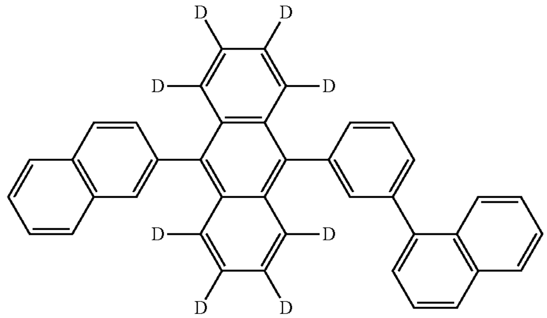
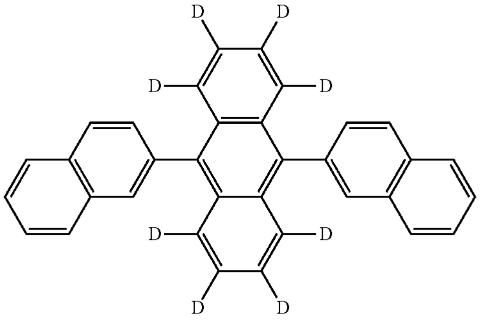
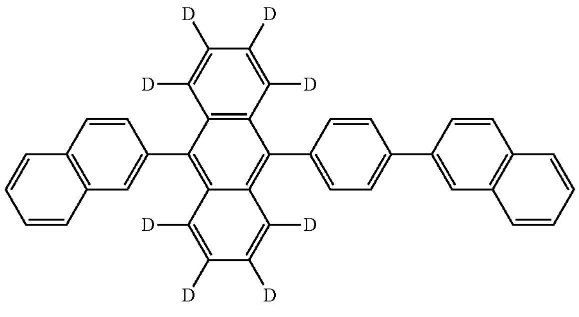
-continued
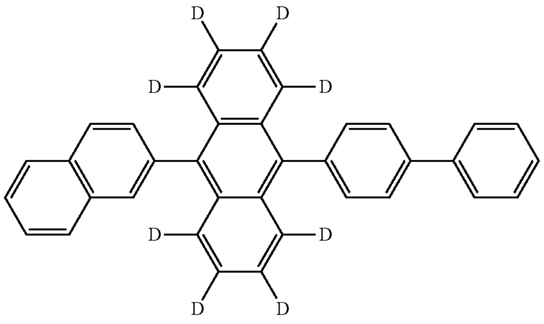
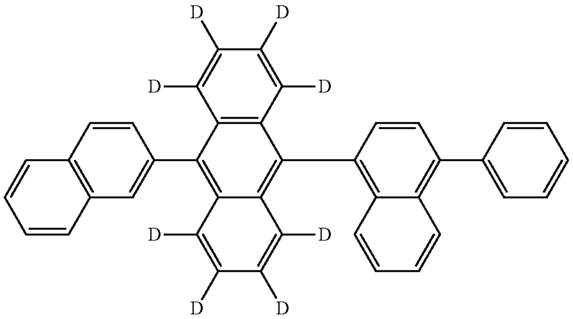
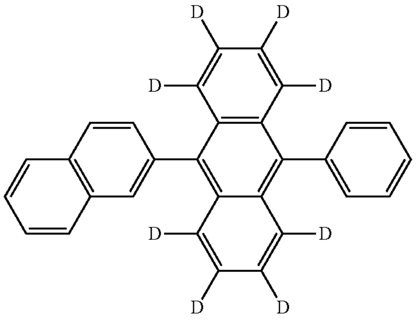
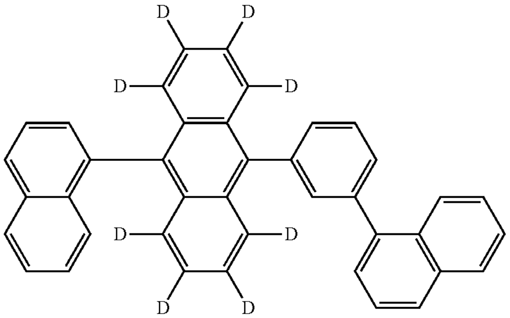
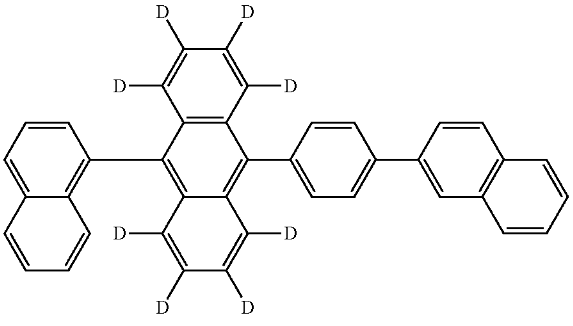

-continued
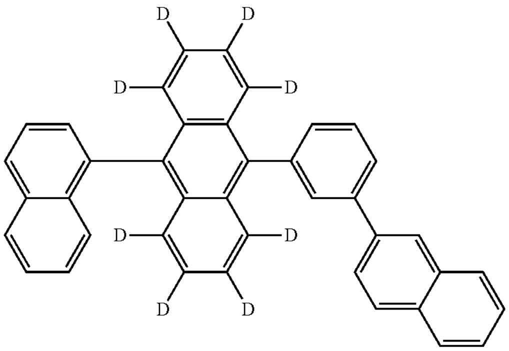
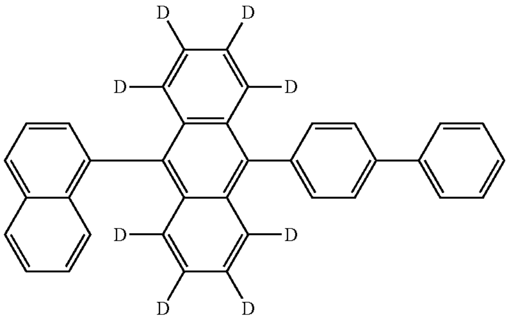
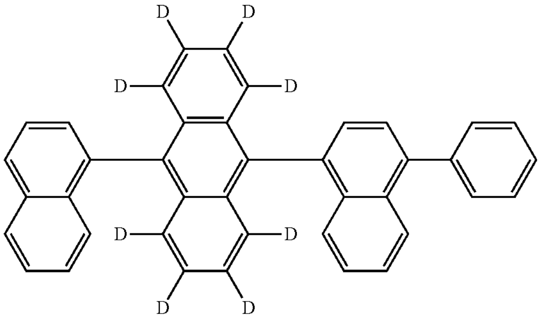
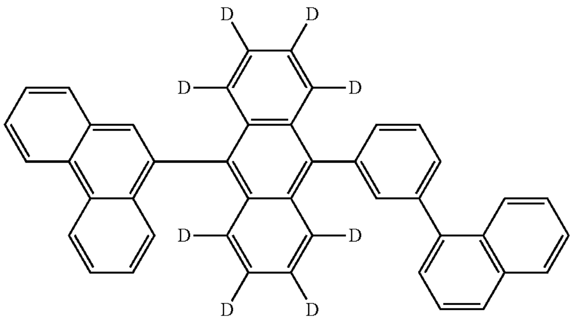
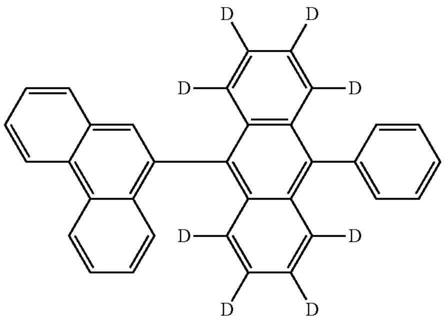
-continued
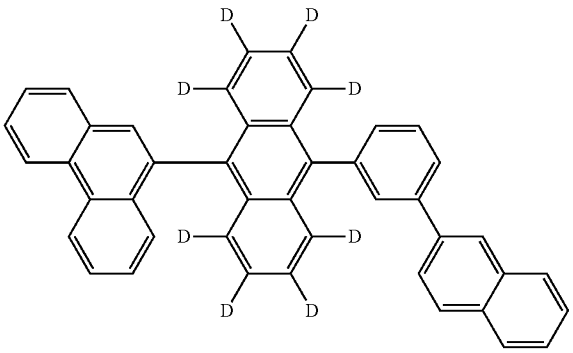
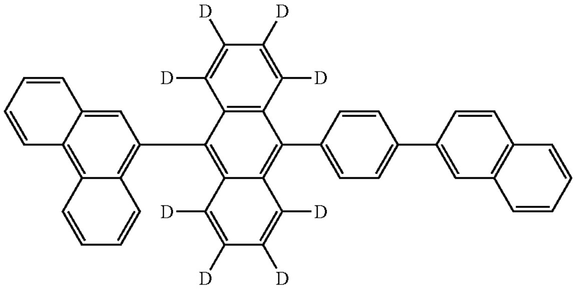
[Formula 308]
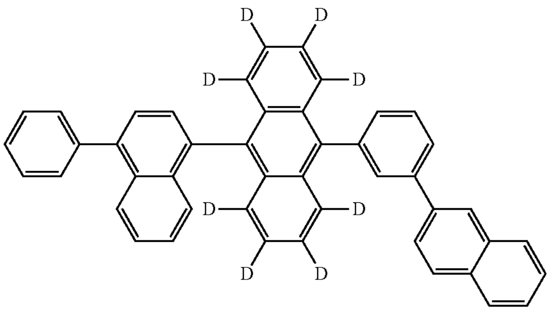
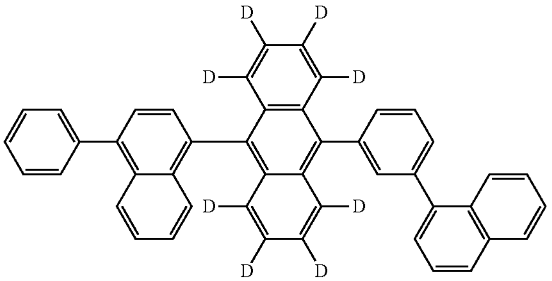
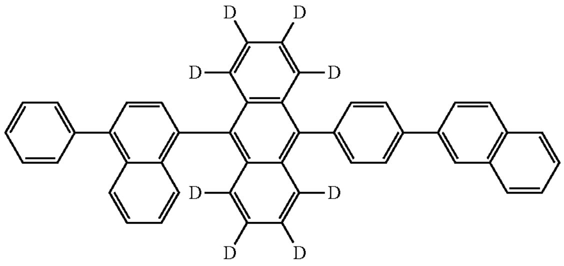

-continued
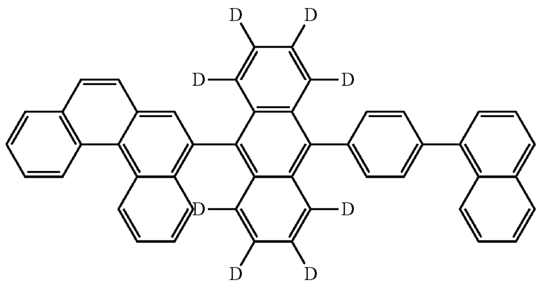
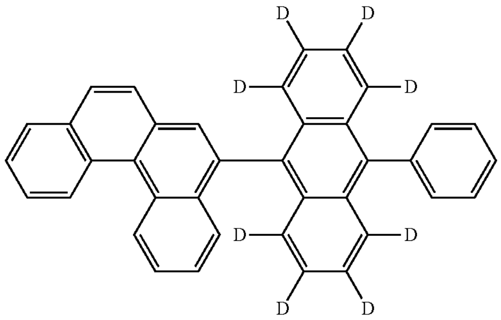
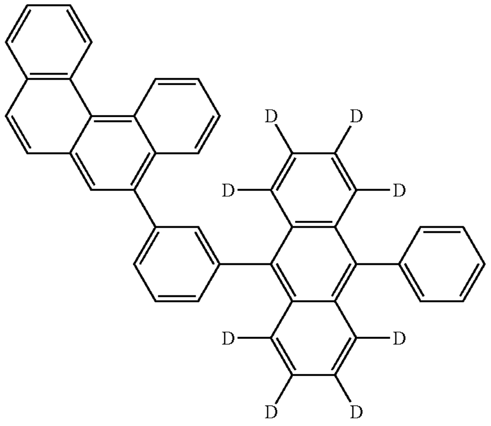
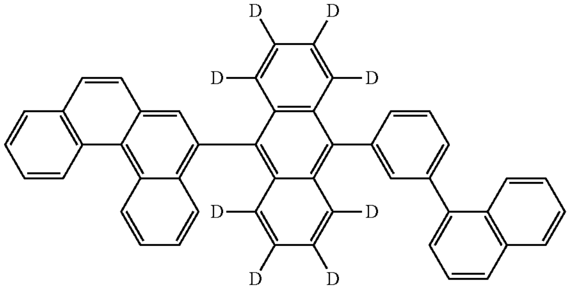
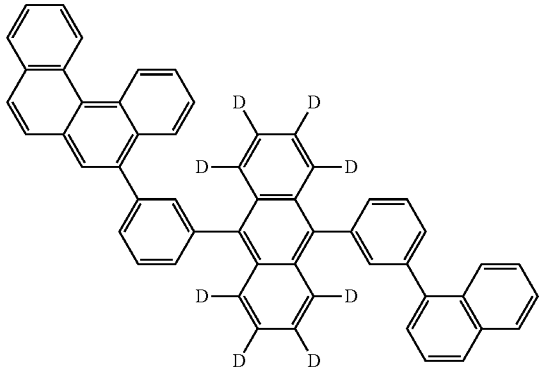
-continued
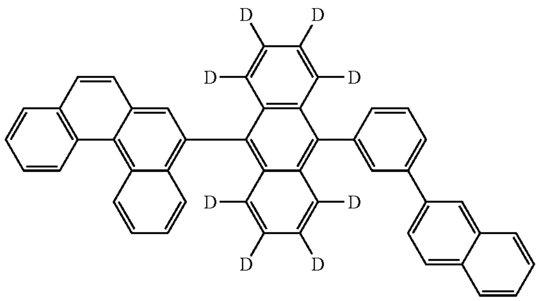
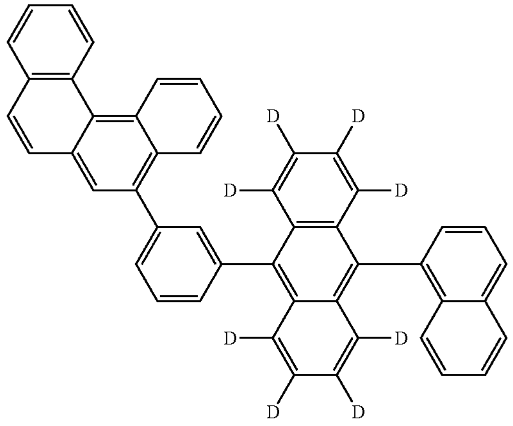
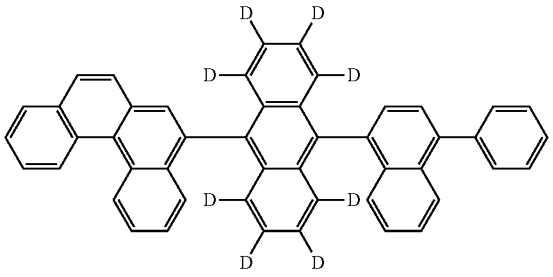
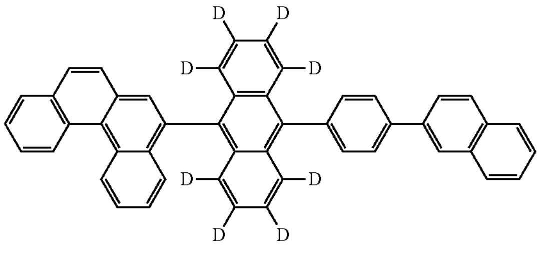
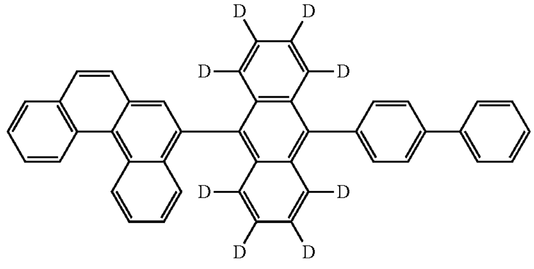

-continued
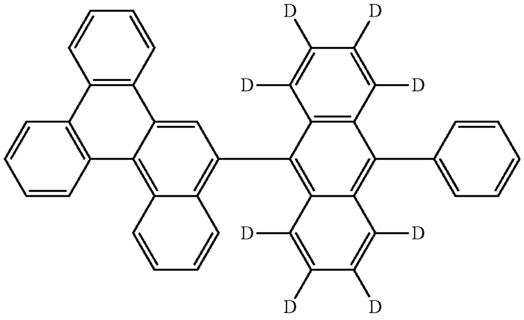
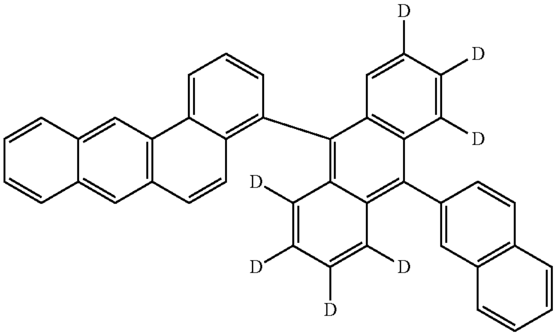
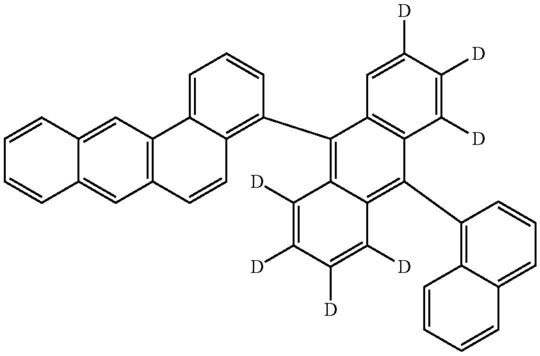
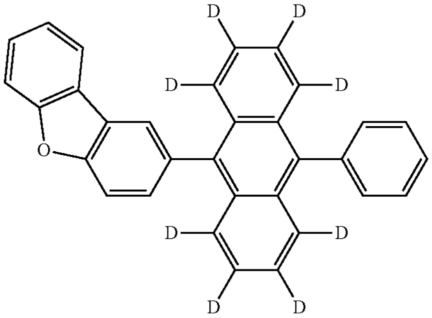
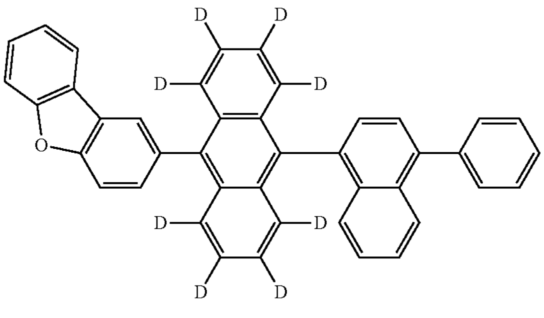
-continued
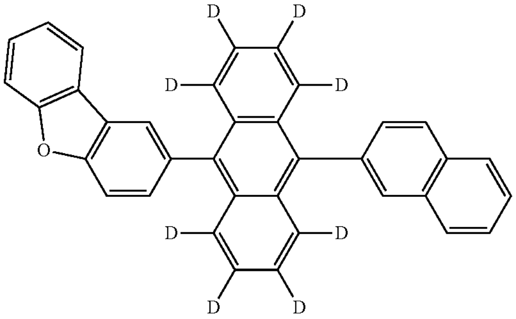
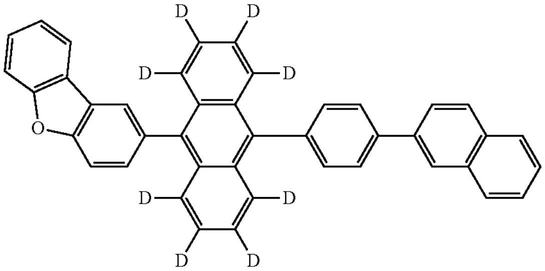
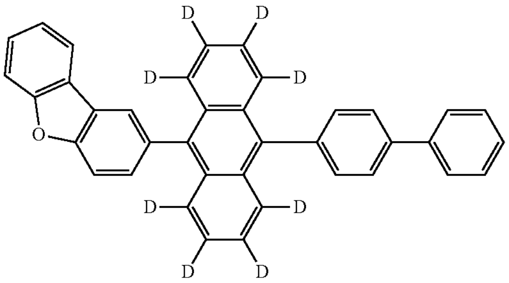
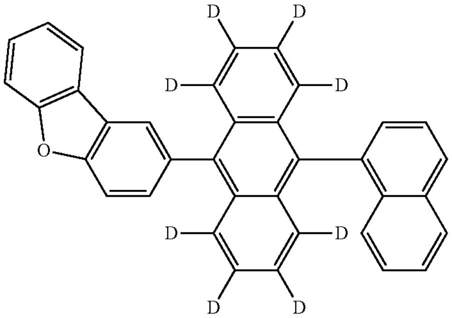
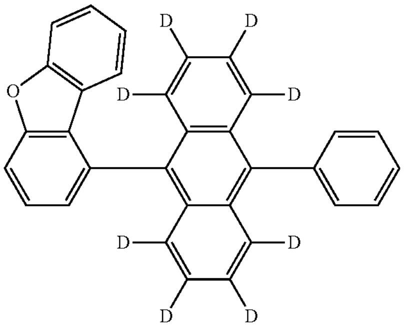

-continued
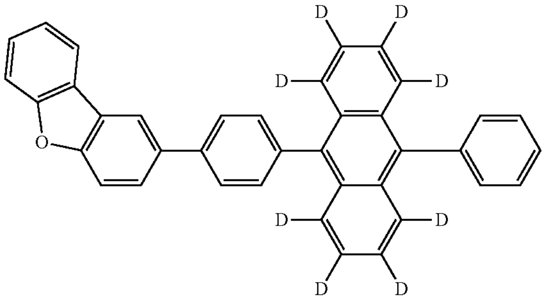
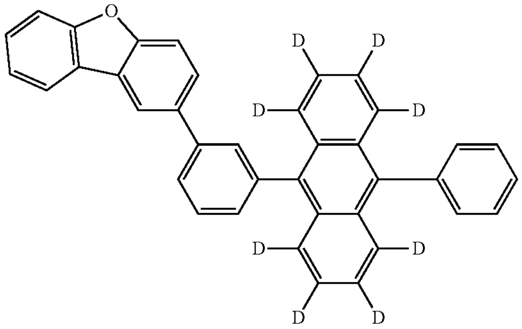
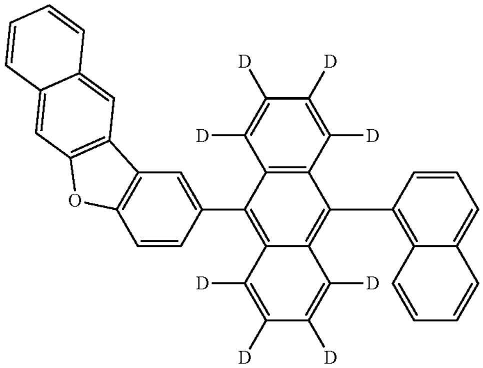
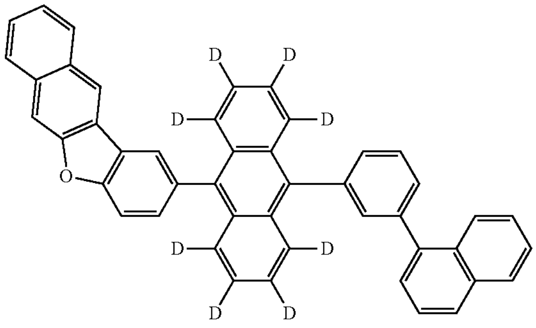
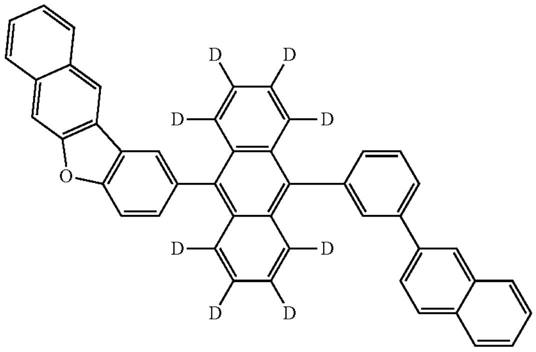
-continued
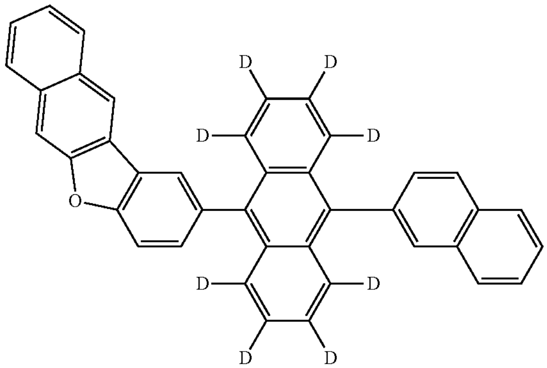
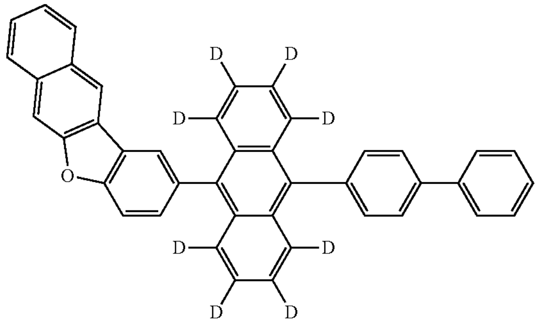
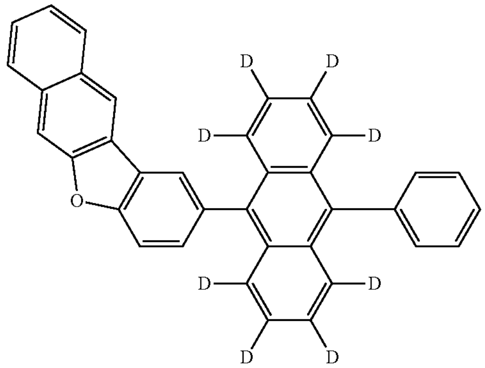
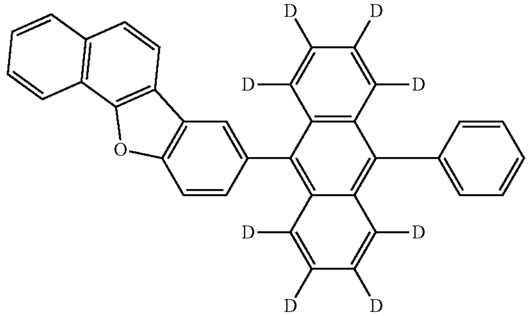
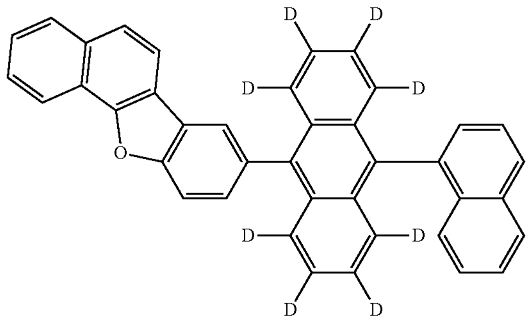

-continued
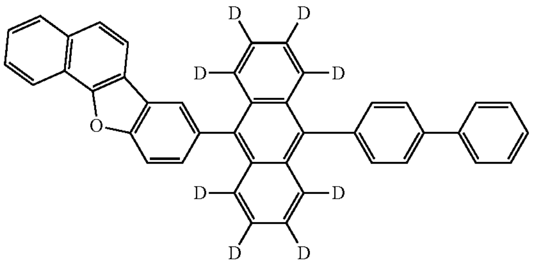
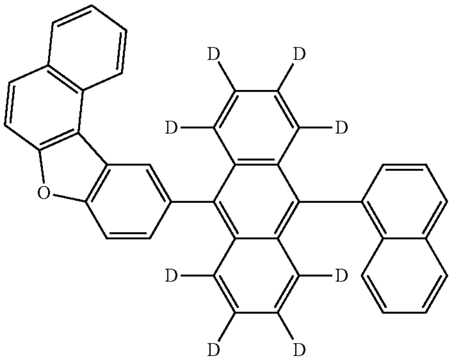
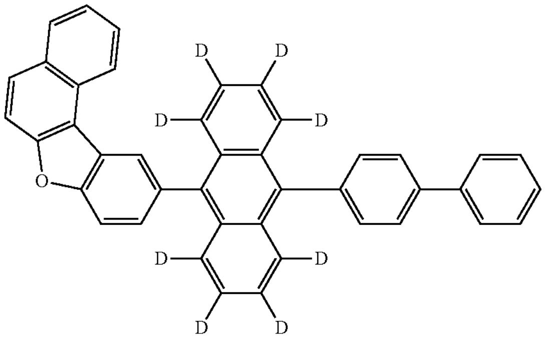
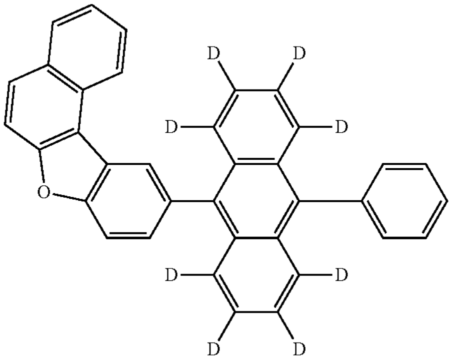
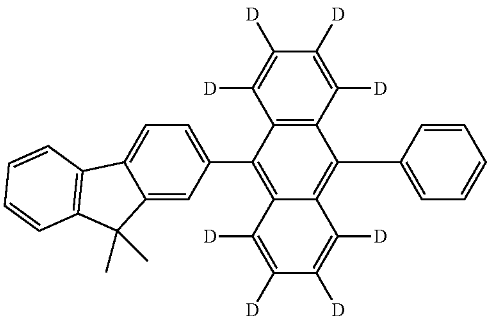
-continued
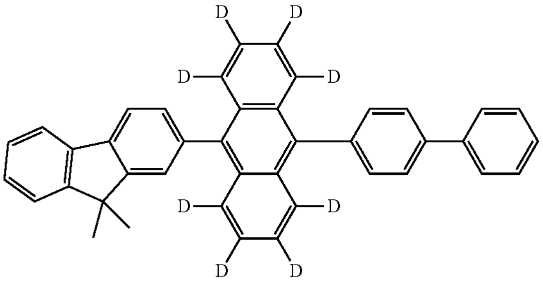
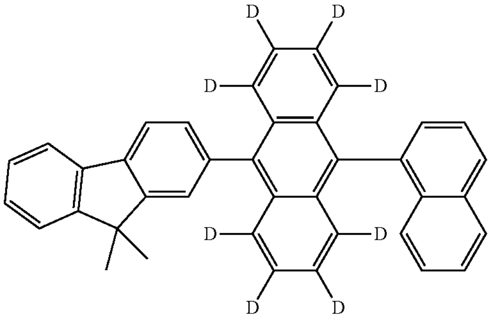
[Formula 309]
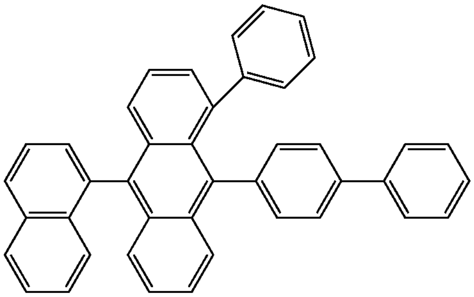
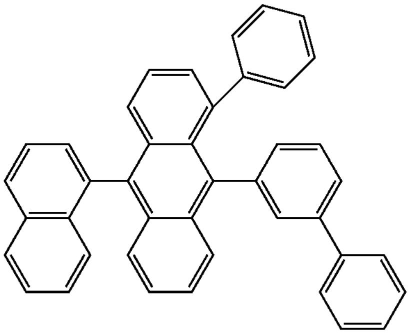
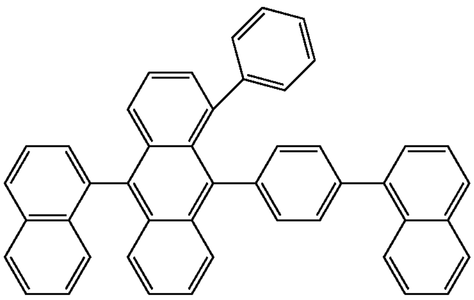

-continued
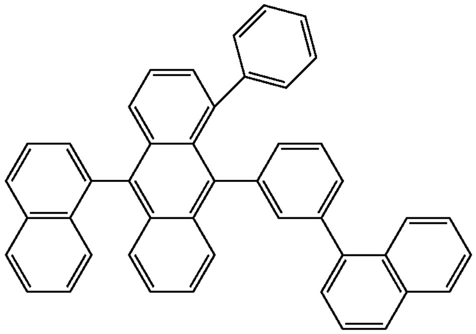
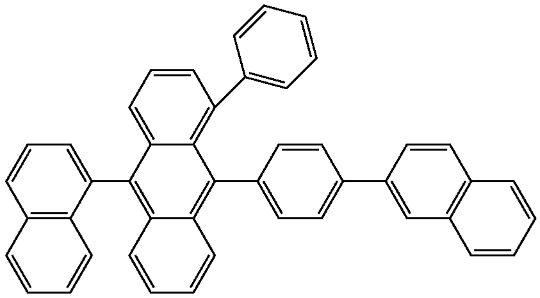
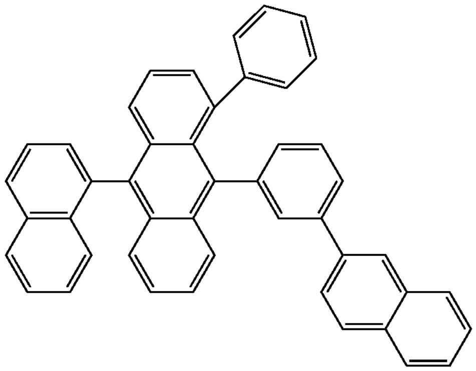
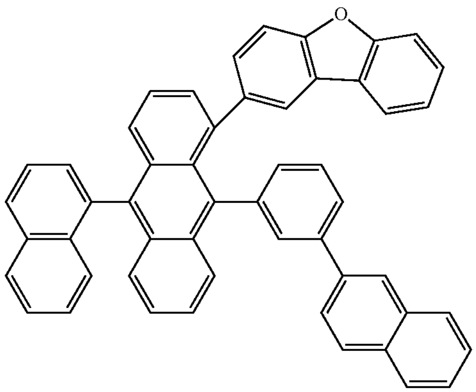
-continued
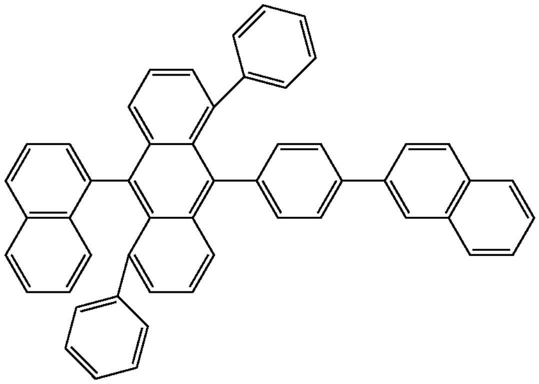
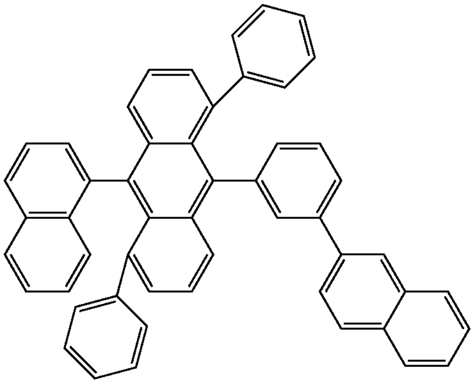
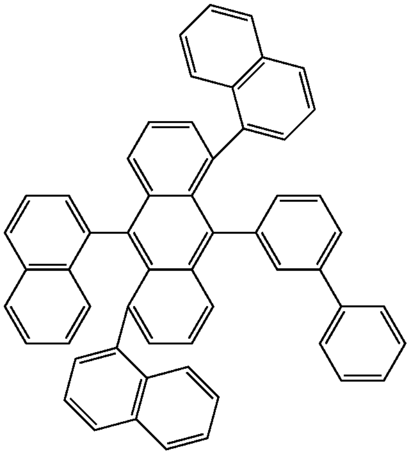
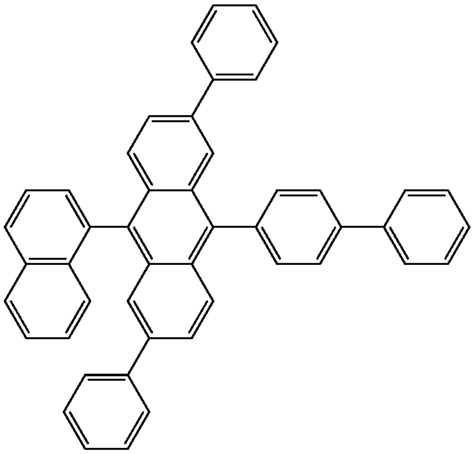

-continued
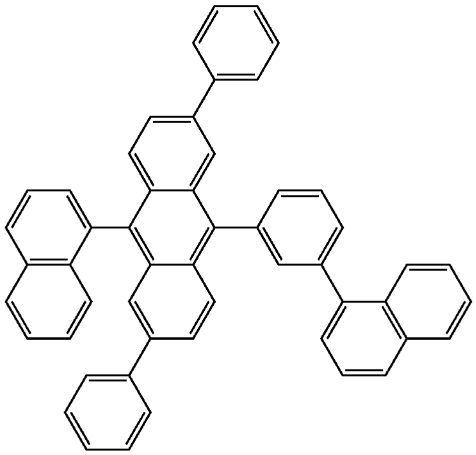
[Formula 310]
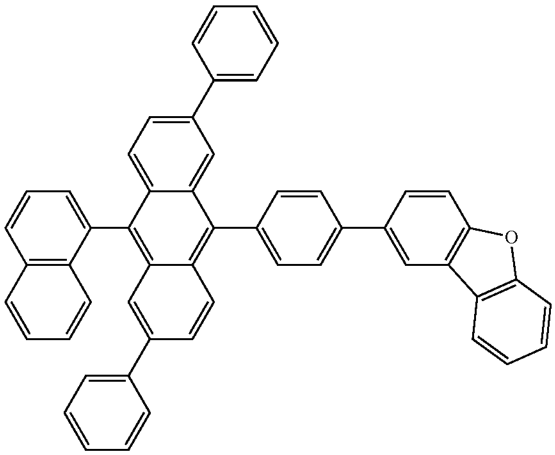
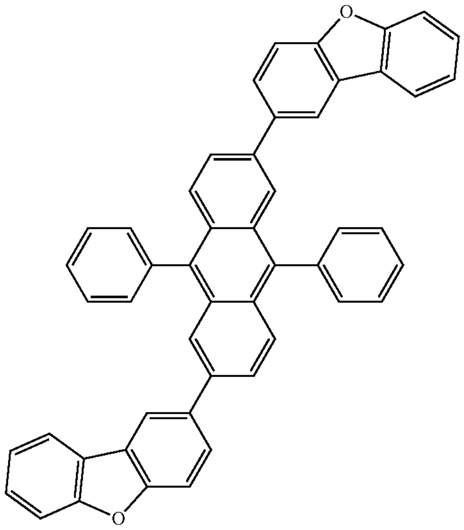
-continued
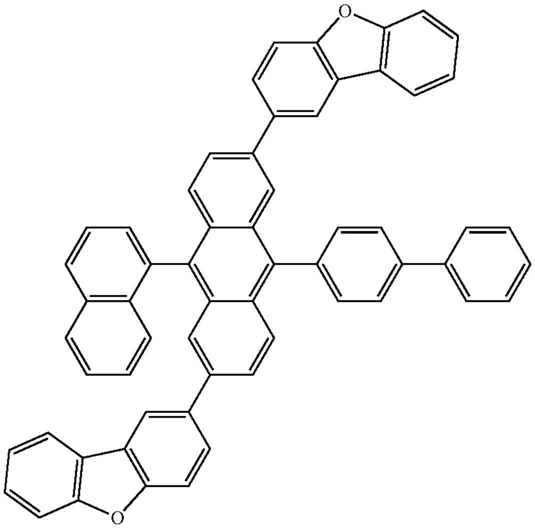
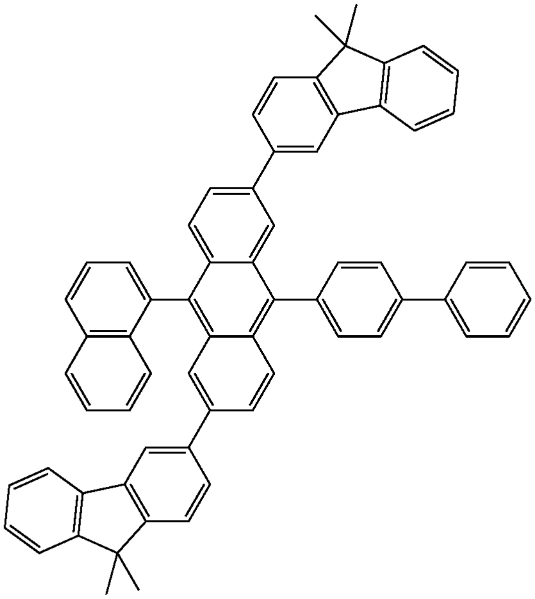
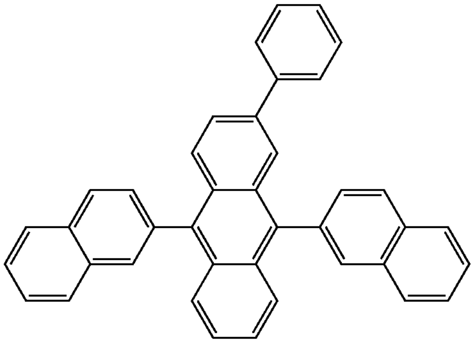

-continued
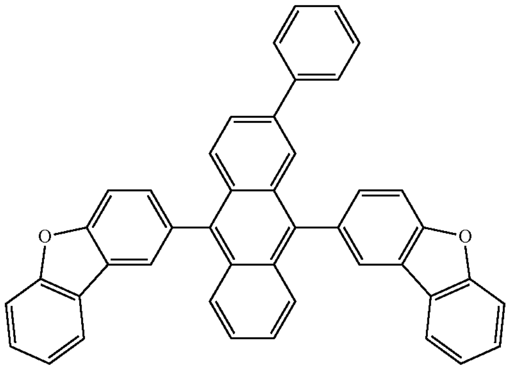
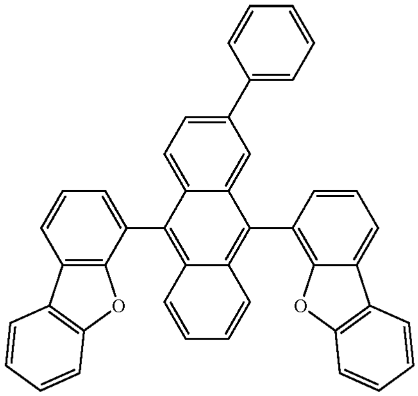
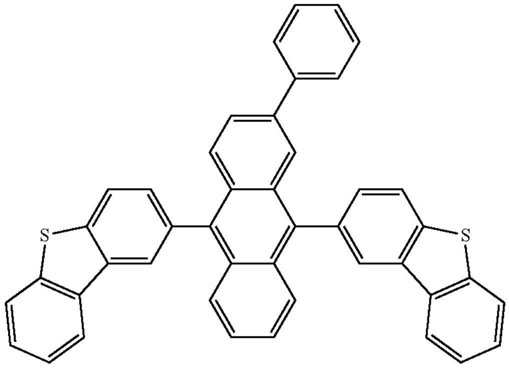
[Formula 311]
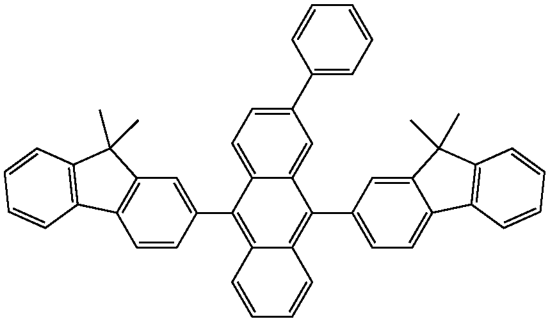
-continued
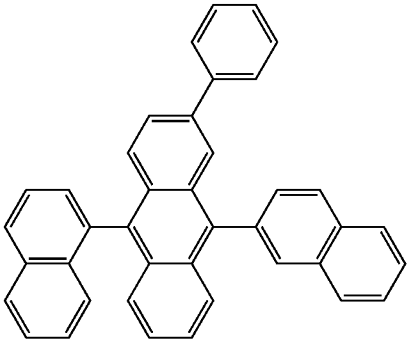
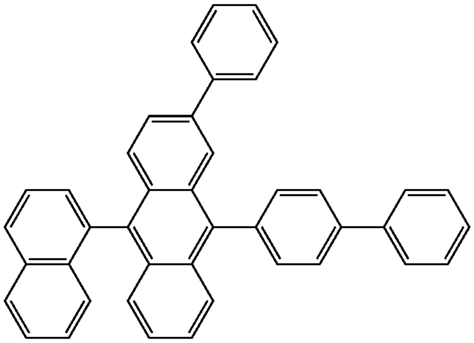
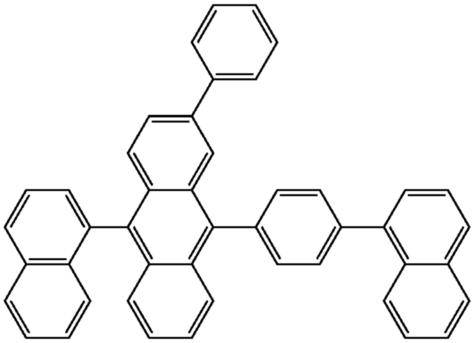
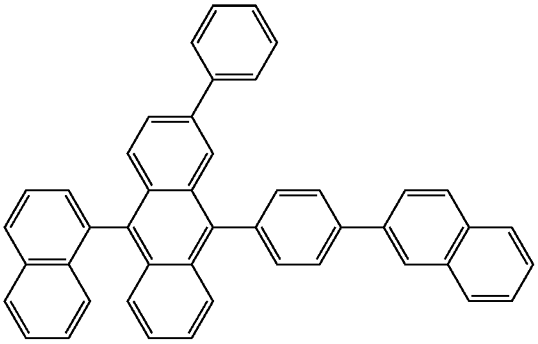
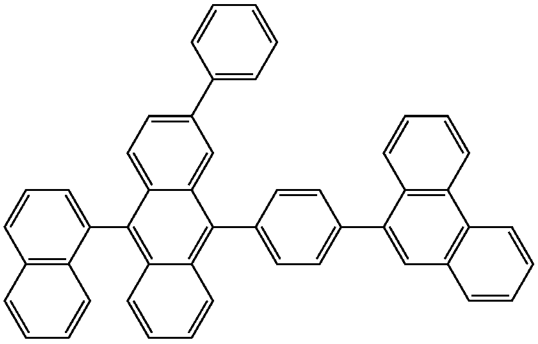

-continued
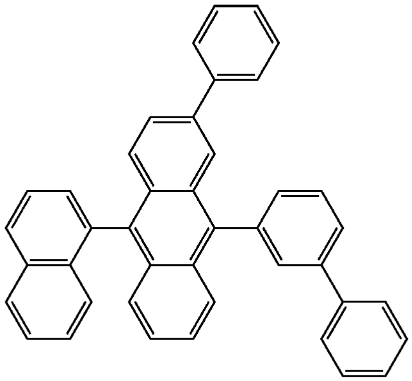
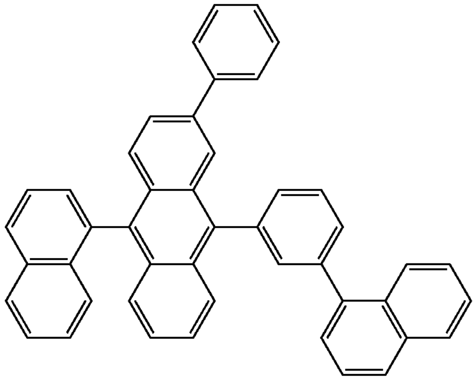
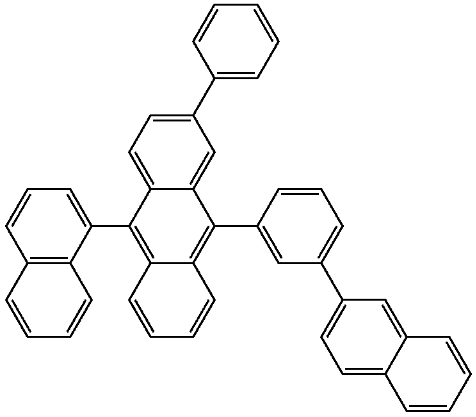
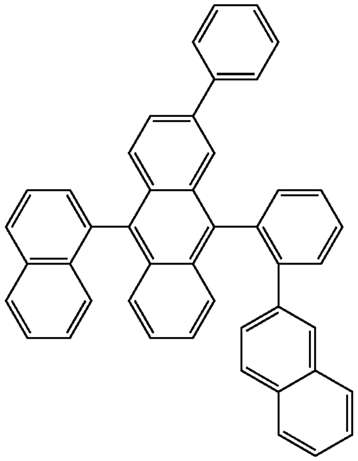
-continued
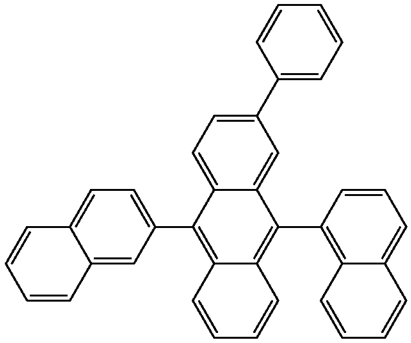
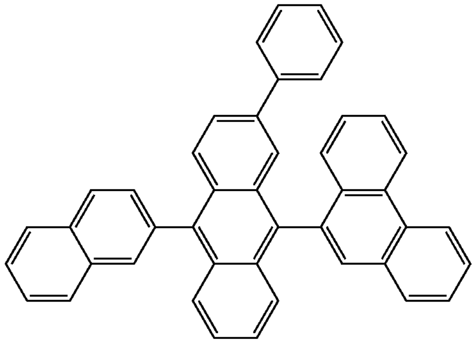
[Formula 312]
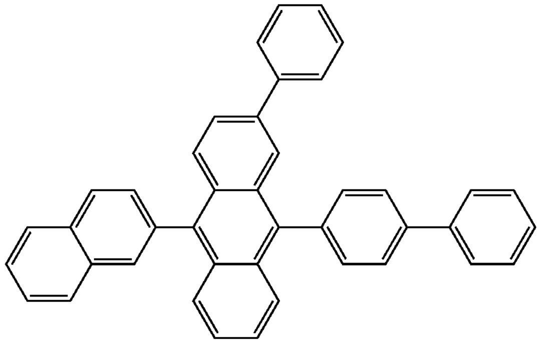
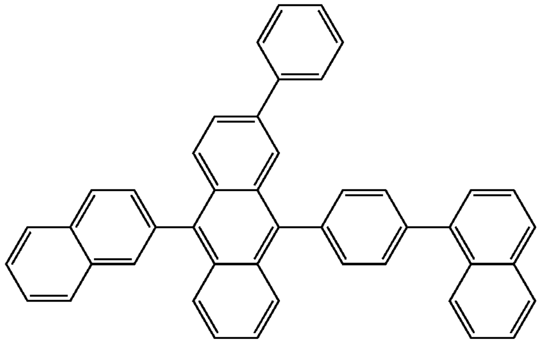
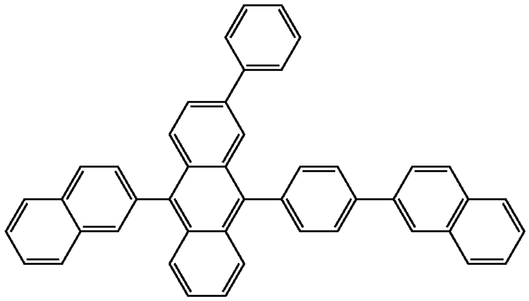

-continued
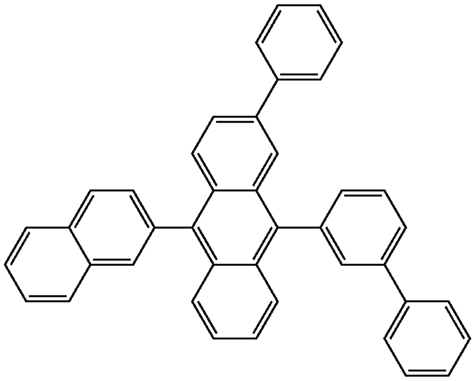
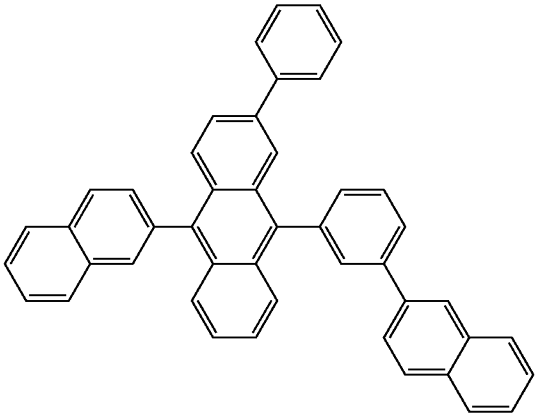
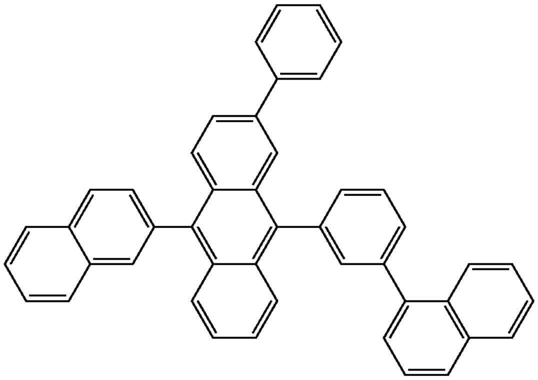
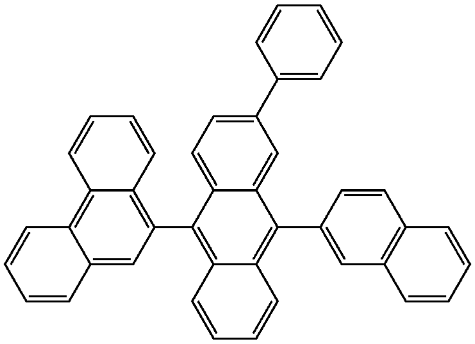
-continued
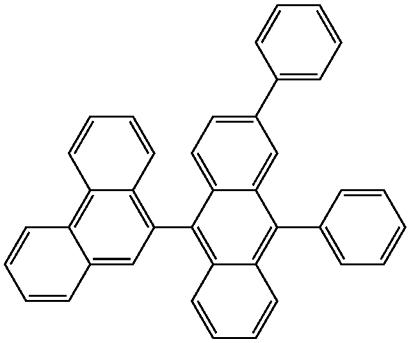
[Formula 313]
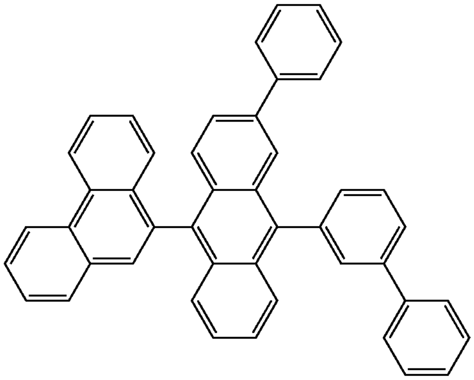
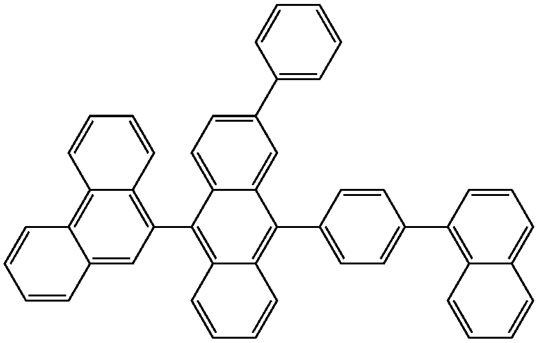
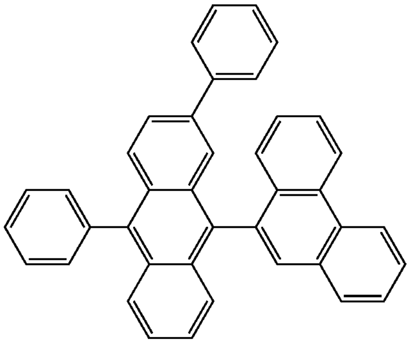

-continued
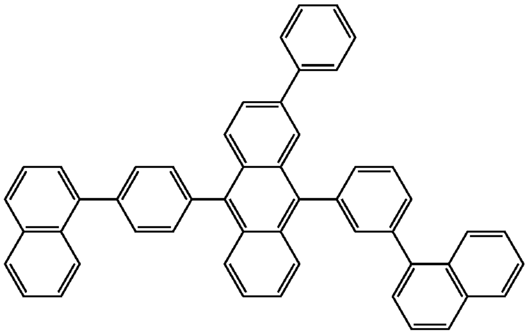
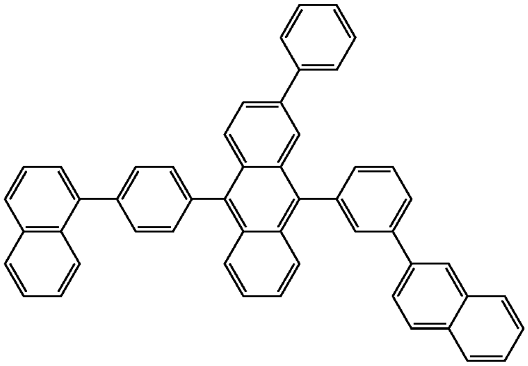
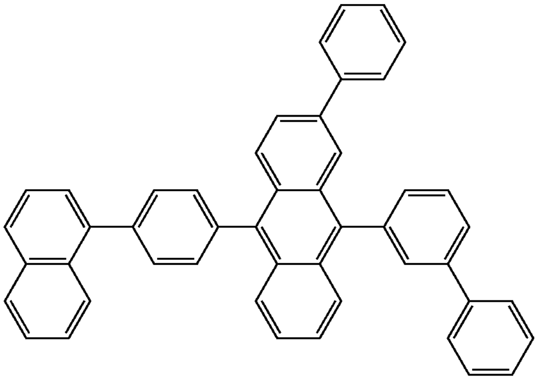
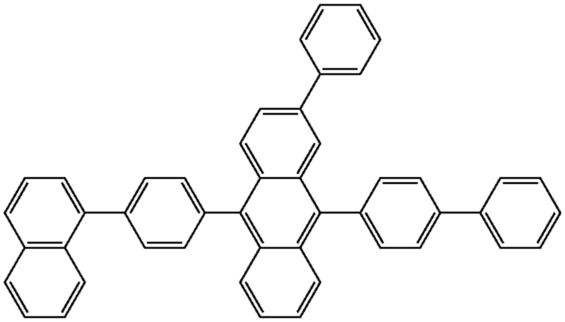
-continued
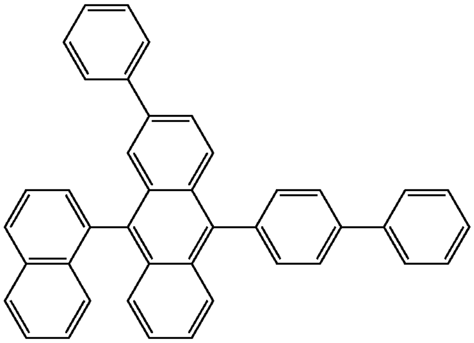
[Formula 314]
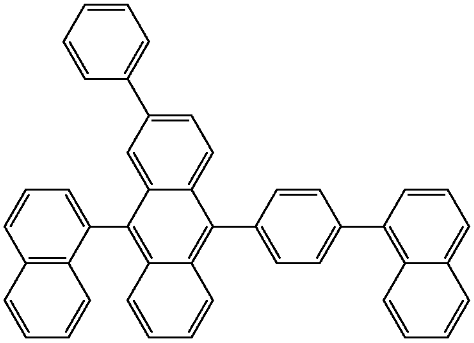
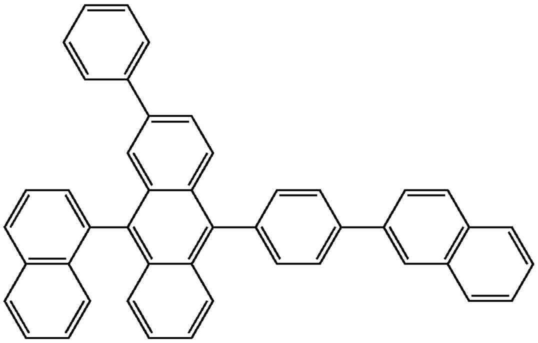
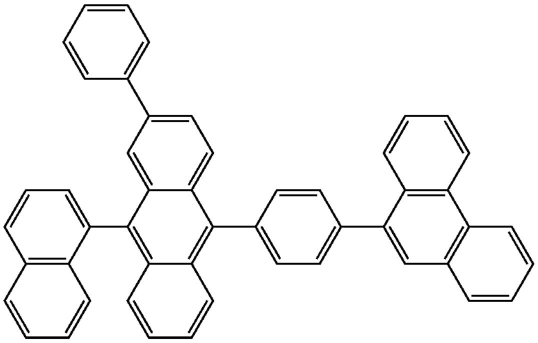

-continued
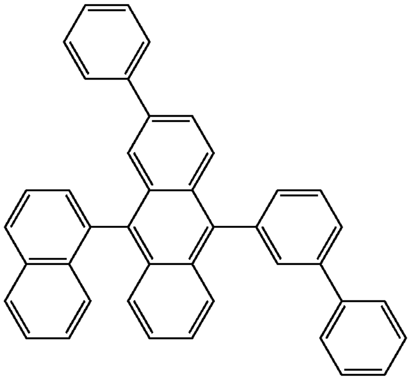
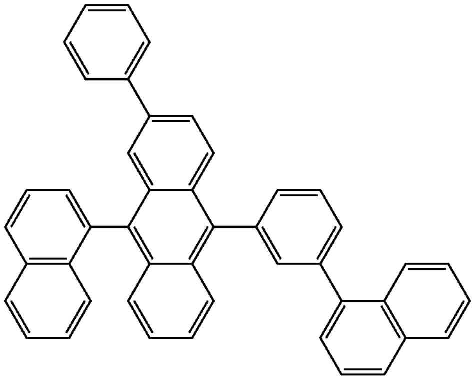
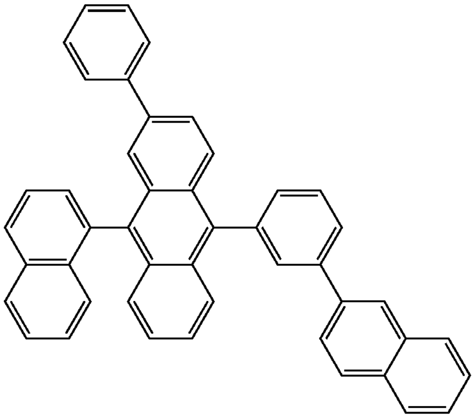
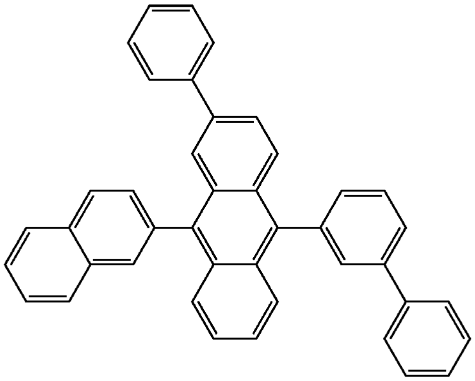
-continued
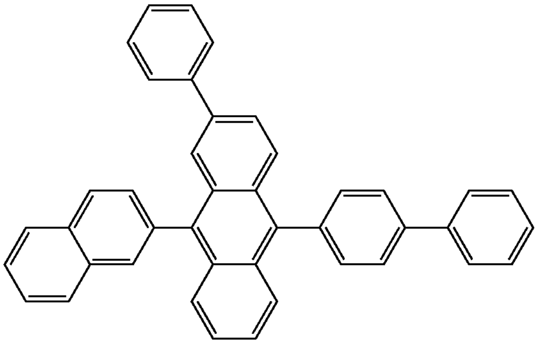
[Formula 315]
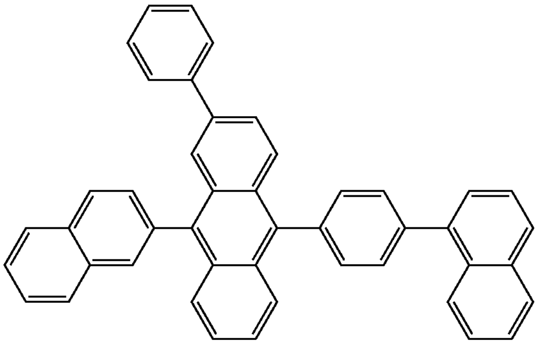
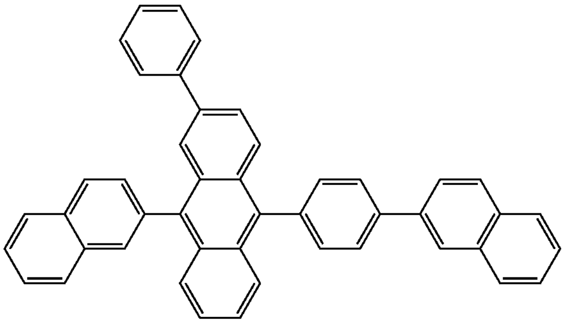
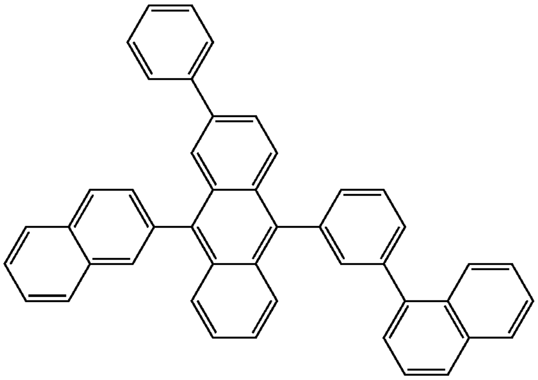

-continued
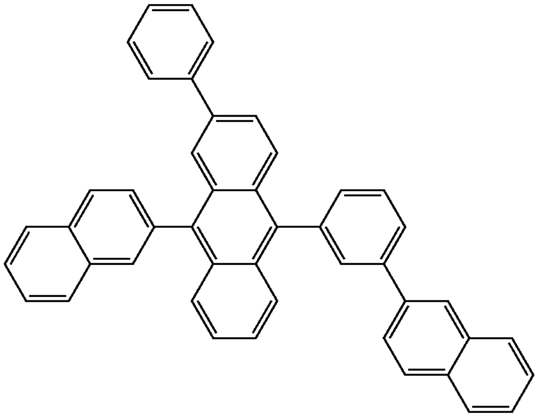
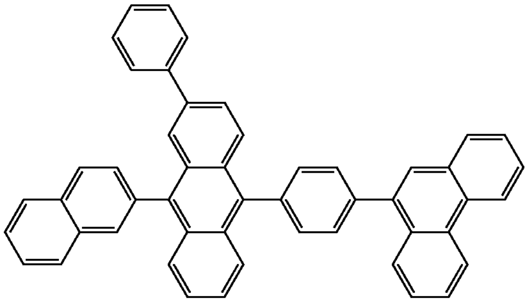
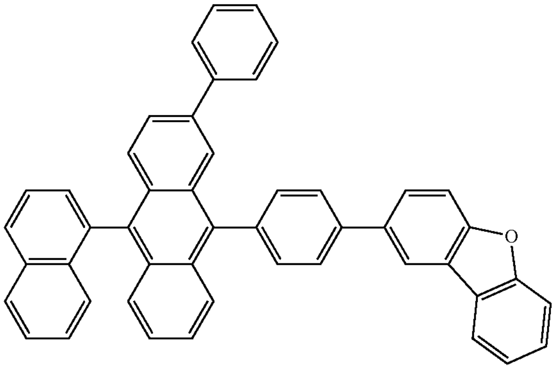
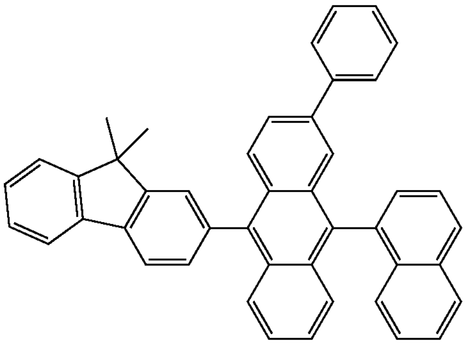
-continued
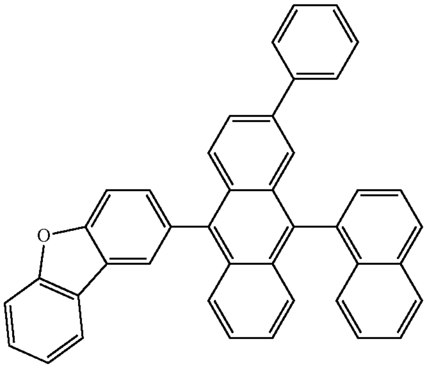
[Formula [316]
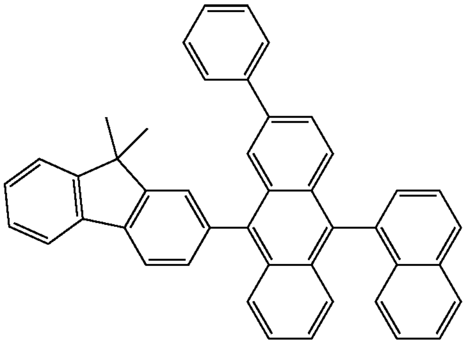
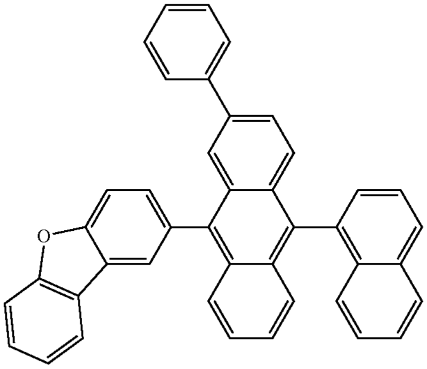
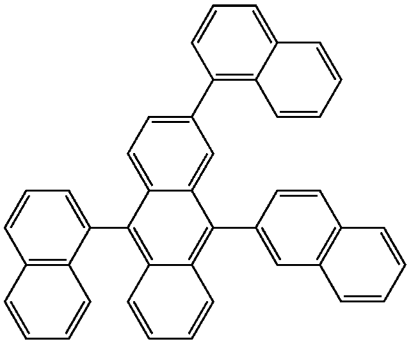

-continued
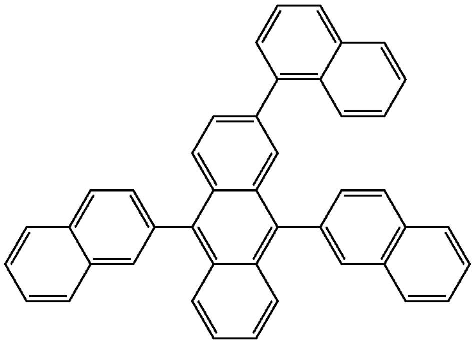
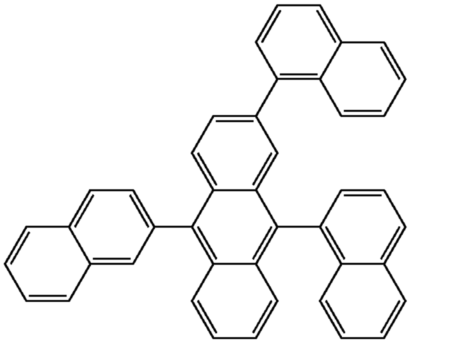
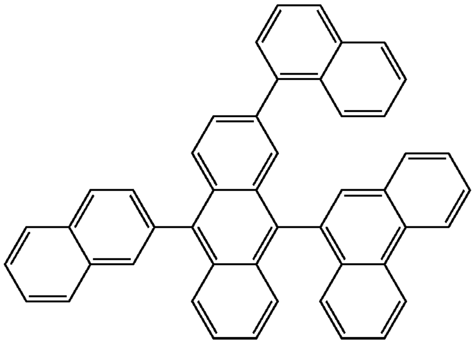
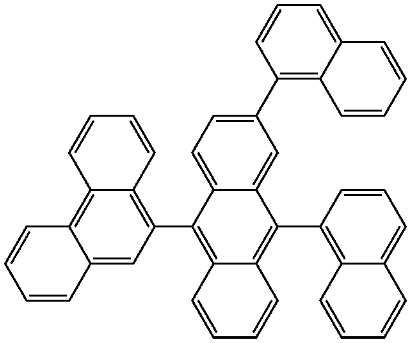
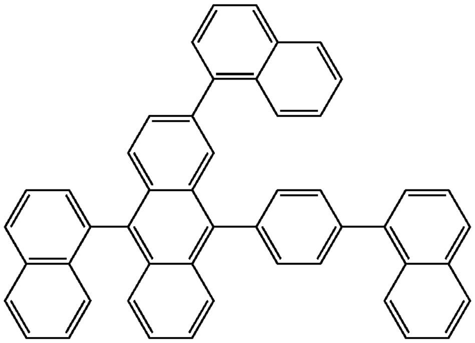
-continued
[Formula 317]
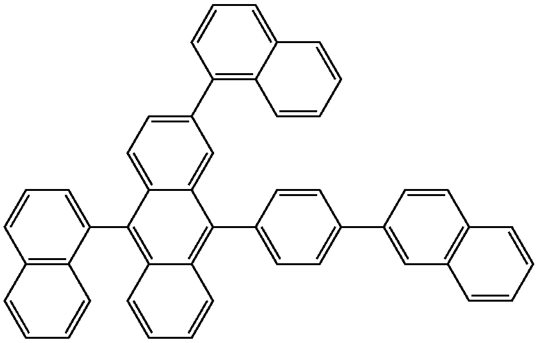
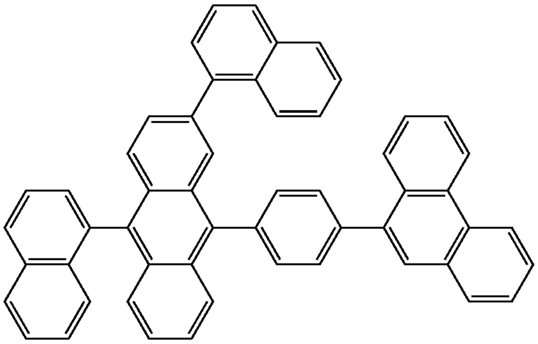
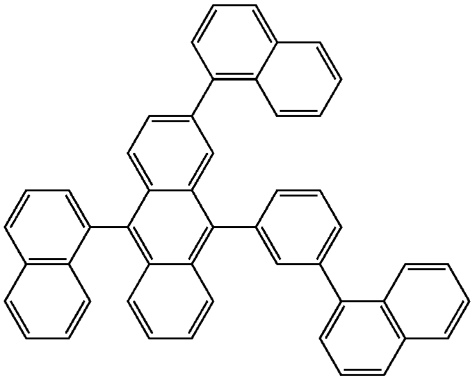
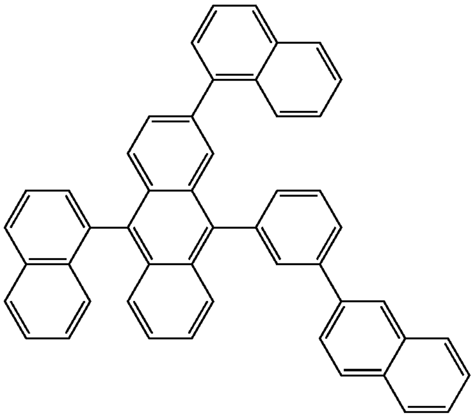

-continued
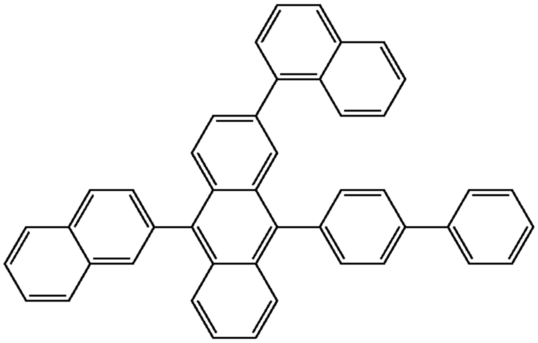
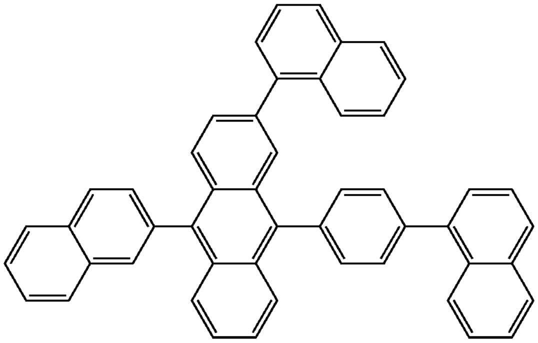
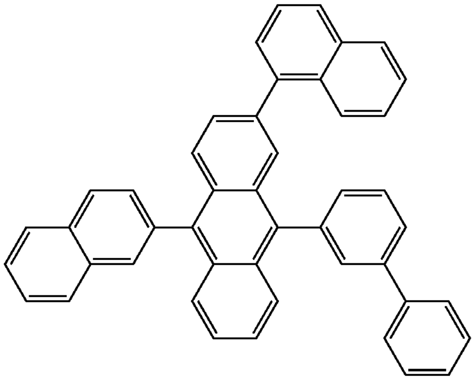
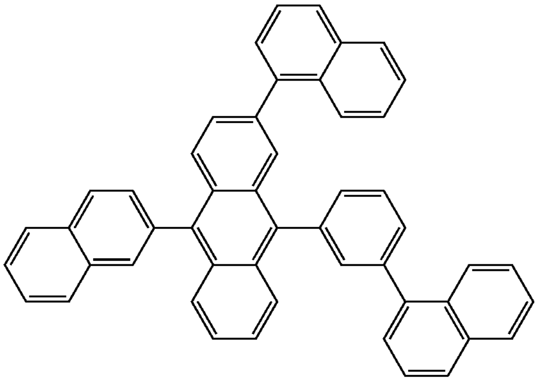
-continued
[Formula 318]
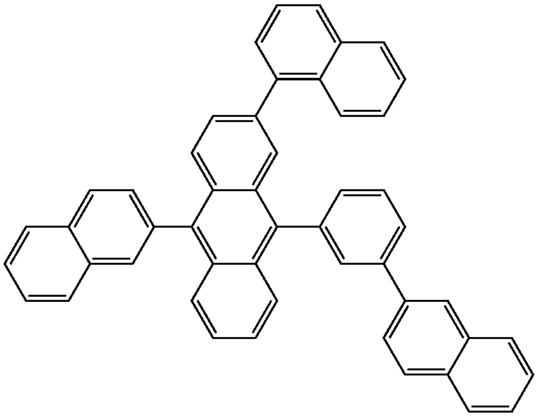
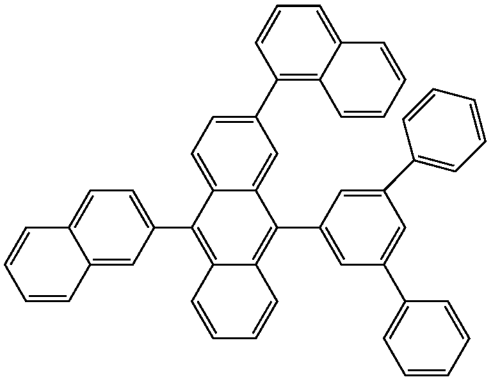
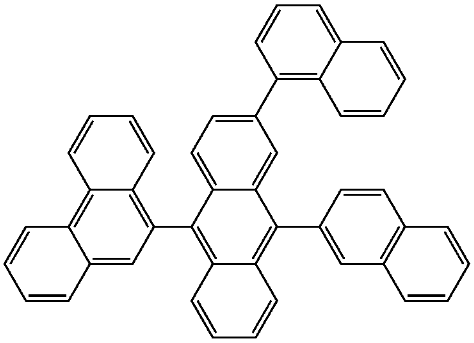
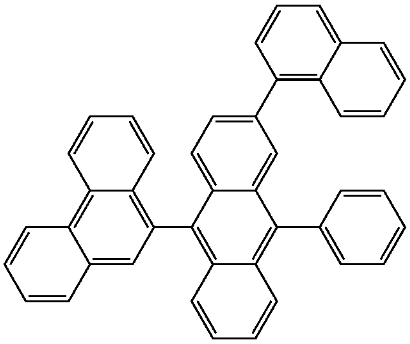

-continued
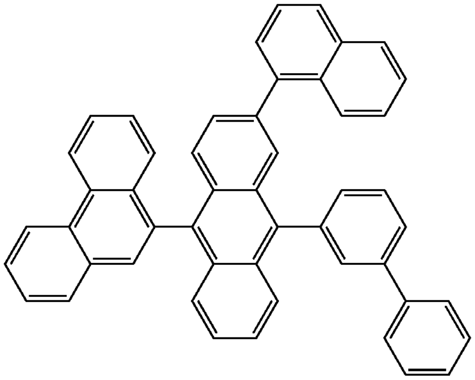
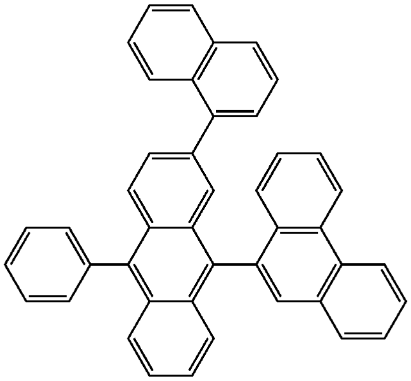
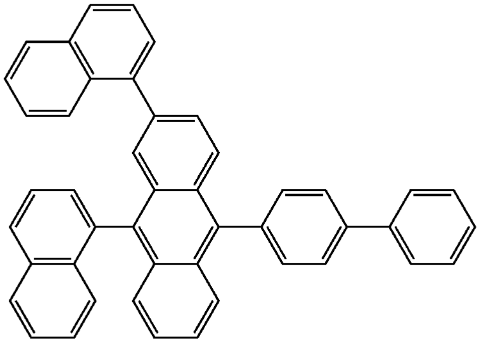
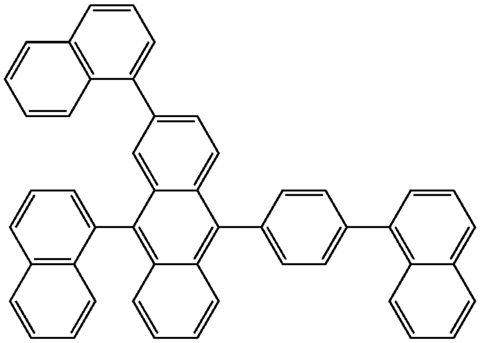
-continued
[Formula 319]
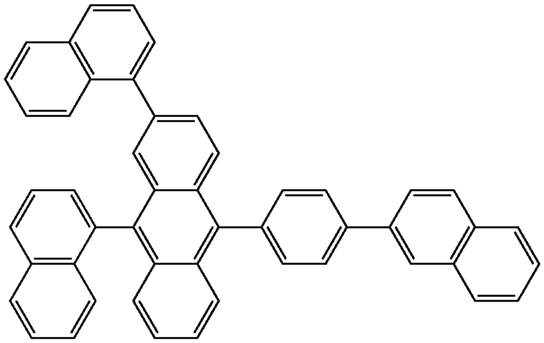
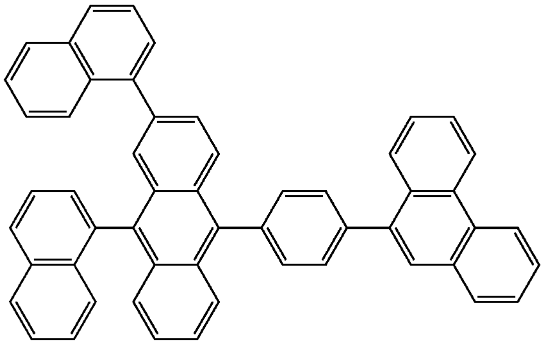
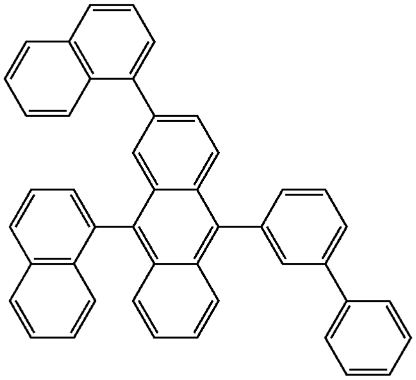
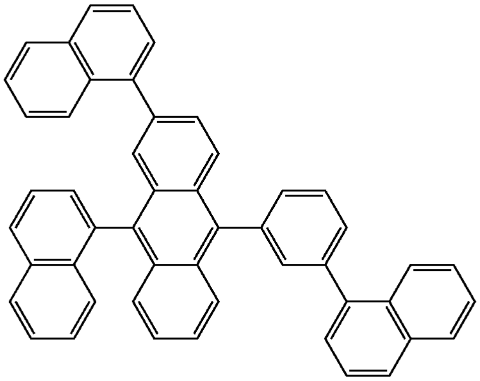

-continued
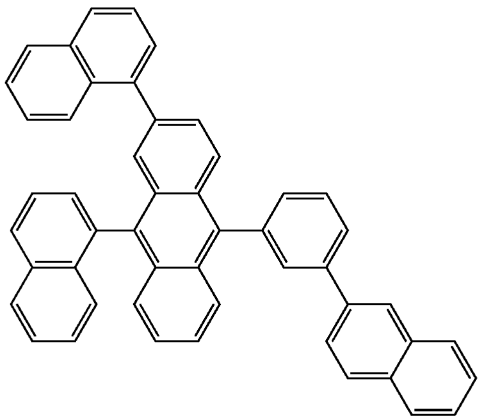
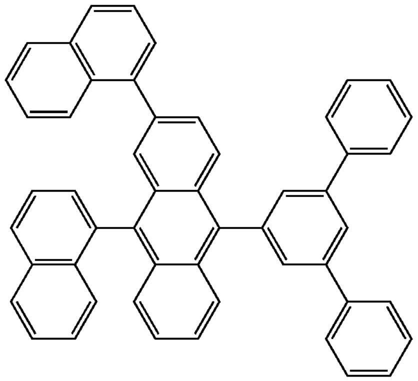
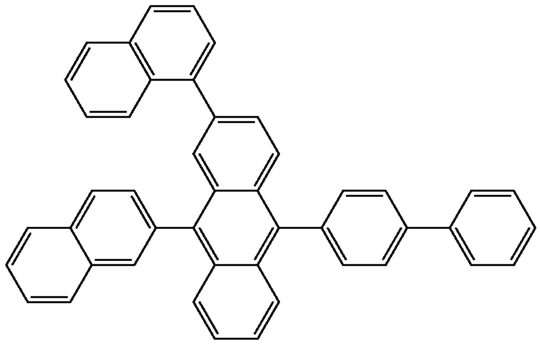
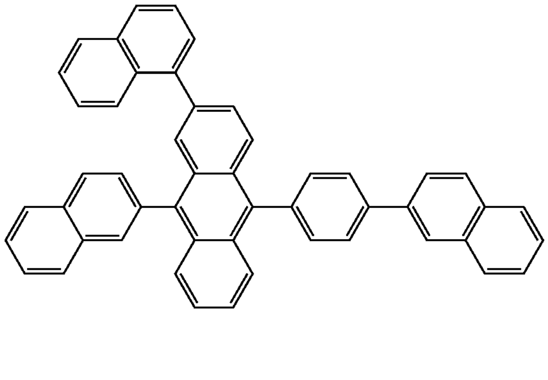
-continued
[Formula 320]
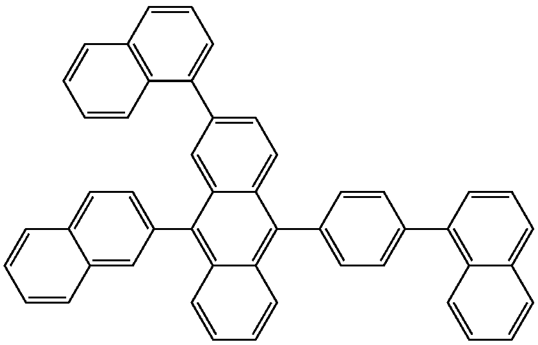
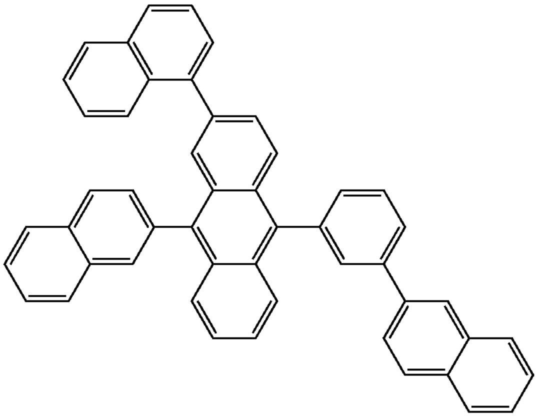
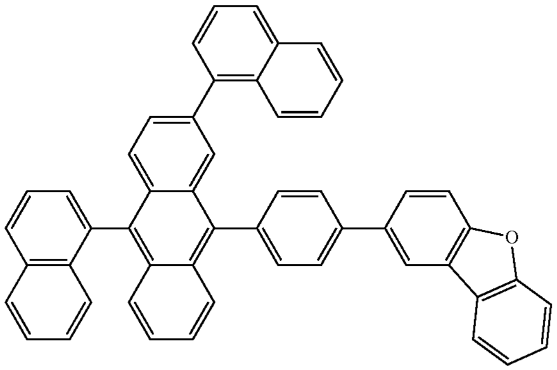
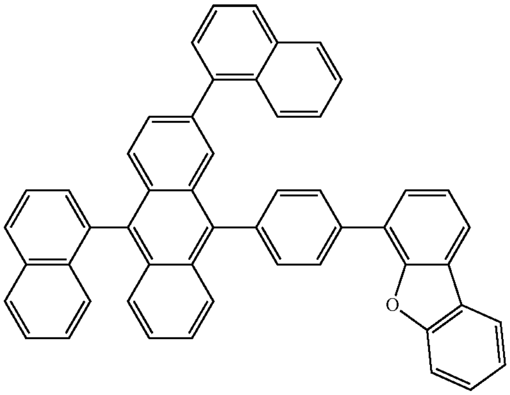

-continued
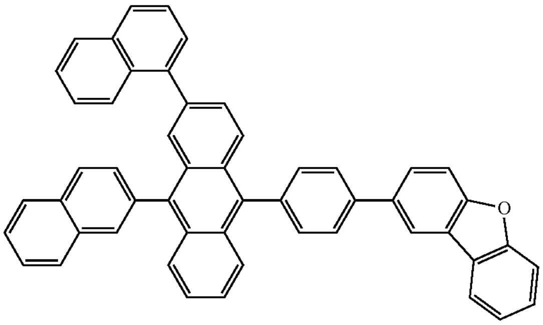
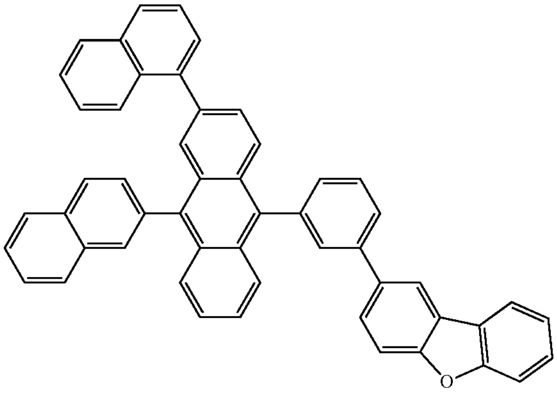
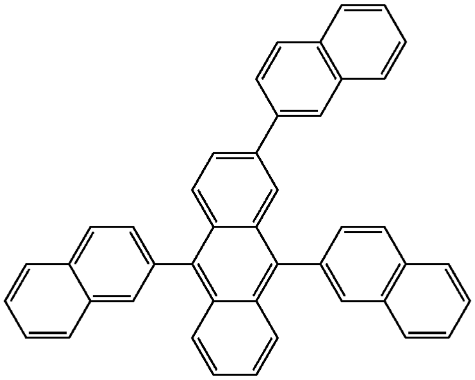
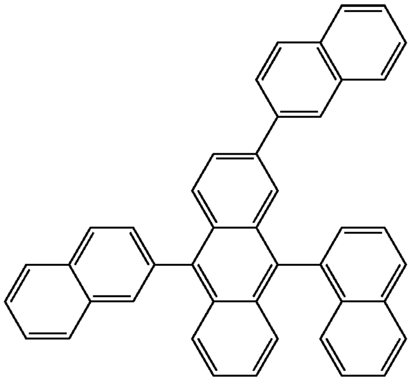
-continued
[Formula 321]
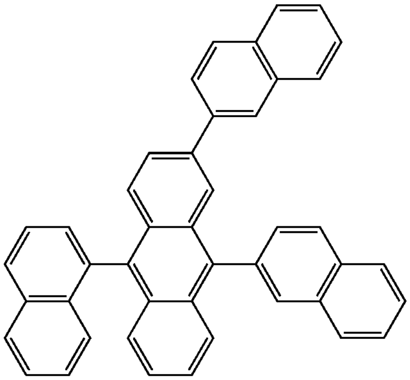
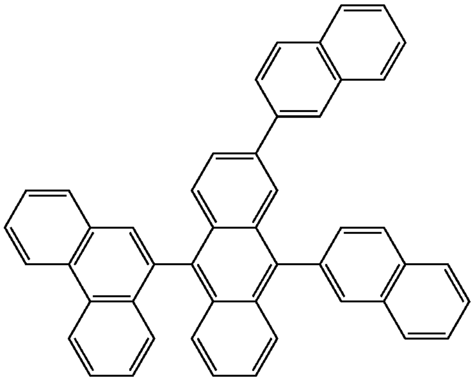
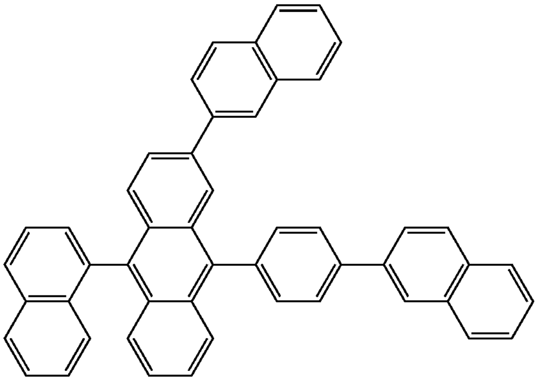
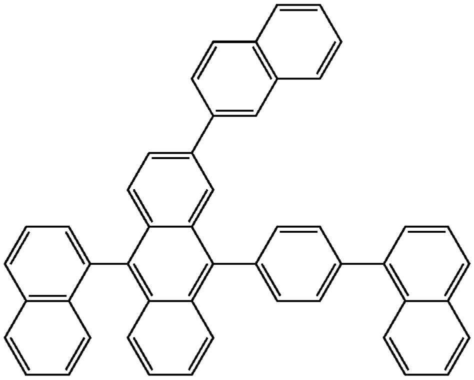

-continued
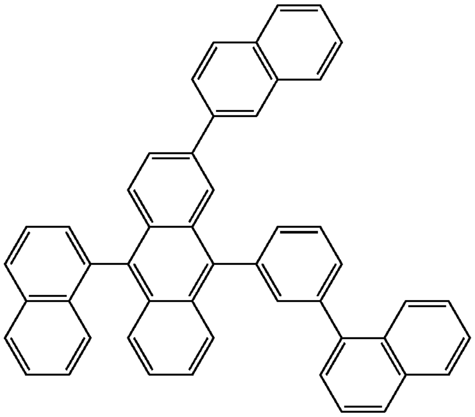
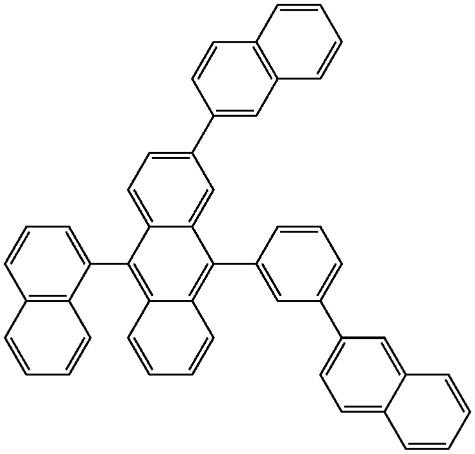
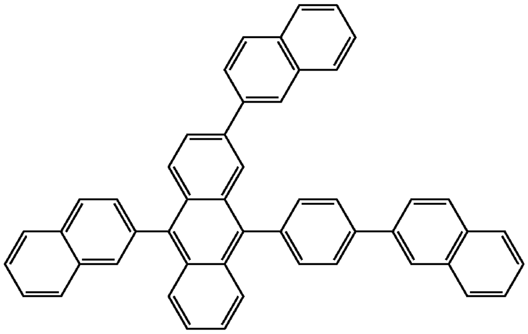
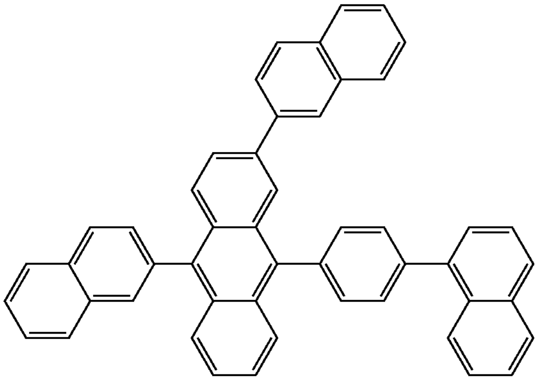
-continued
[Formula 322]
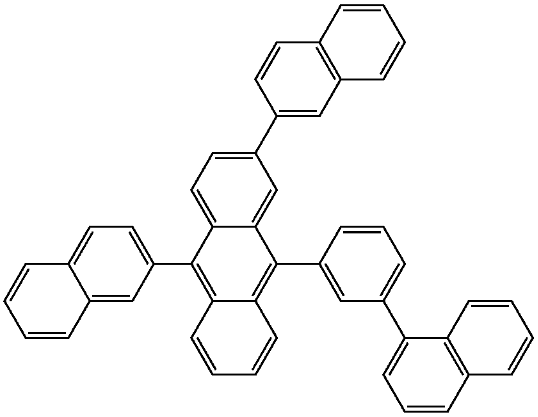
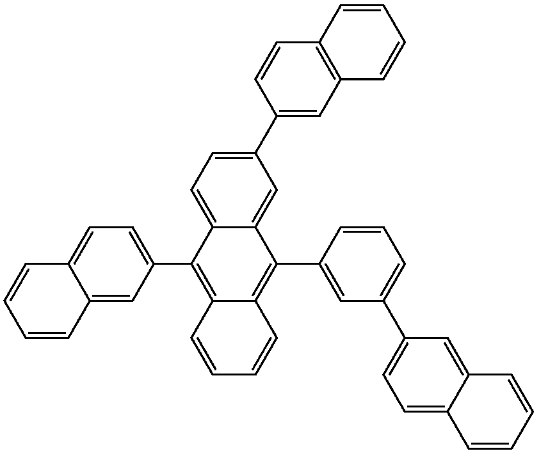
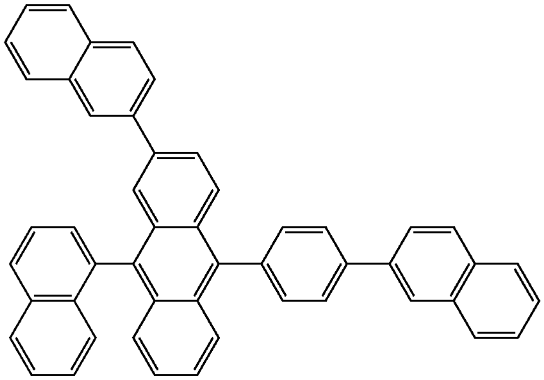
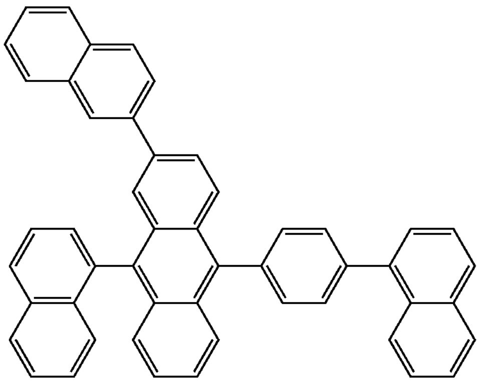

-continued
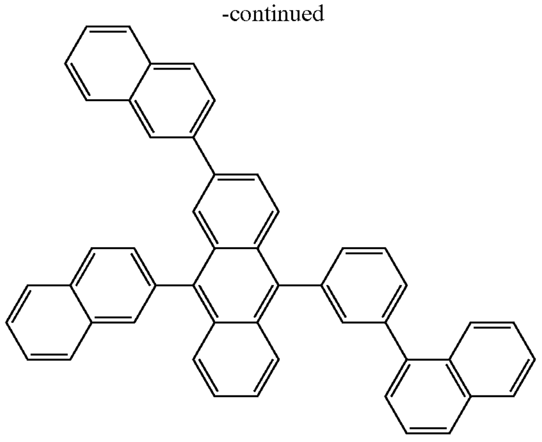
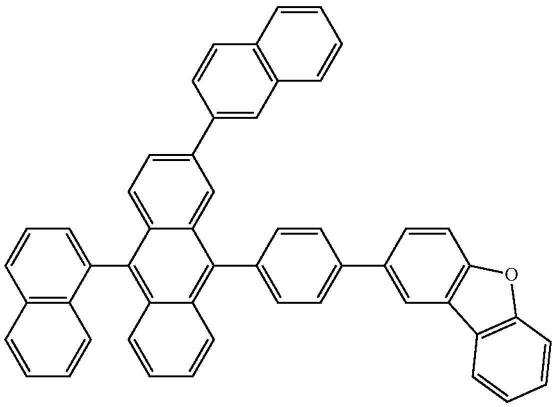
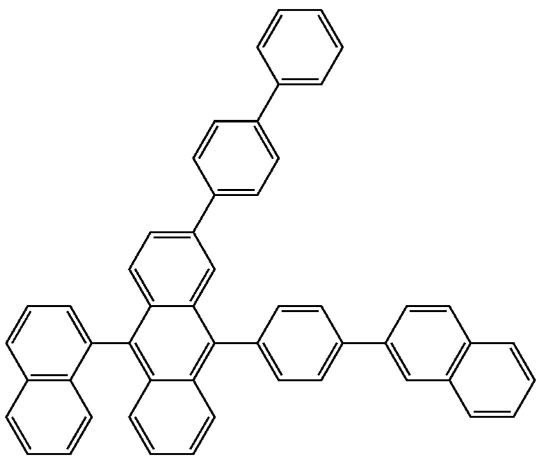
-continued
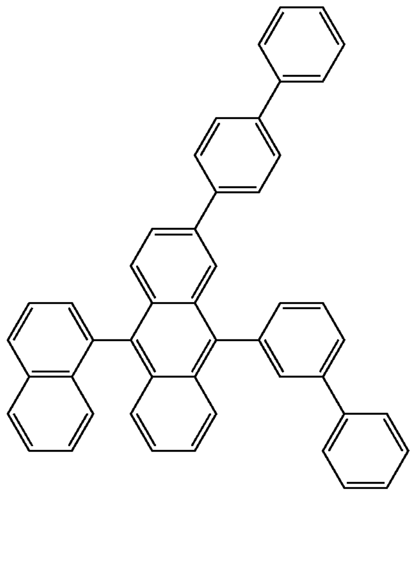
[Formula 323]
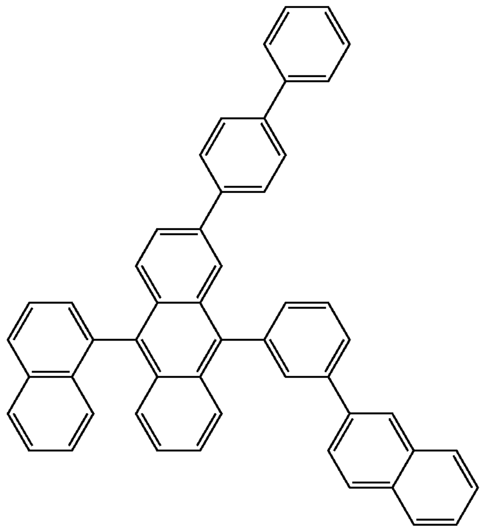
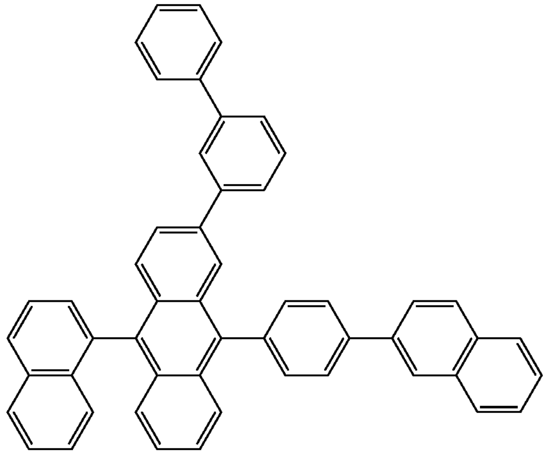

-continued
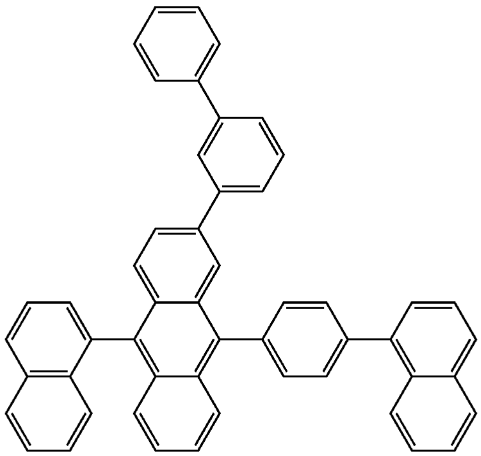
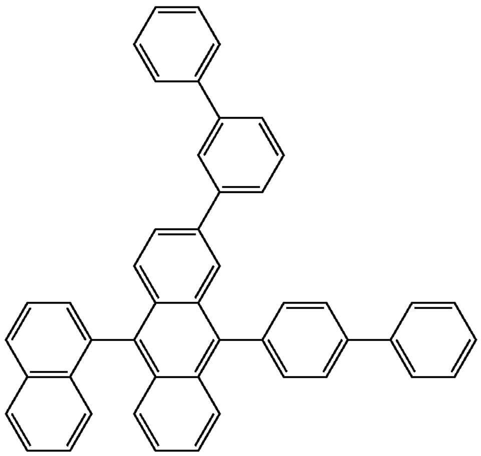
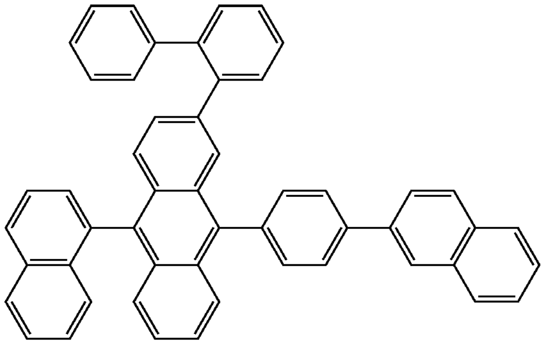
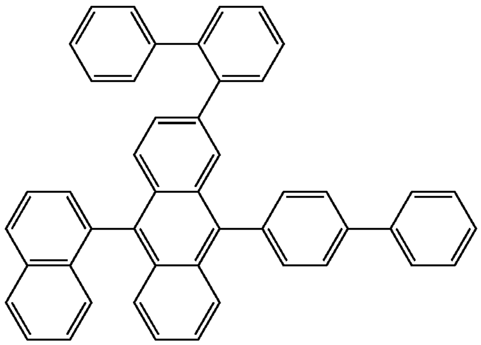
-continued
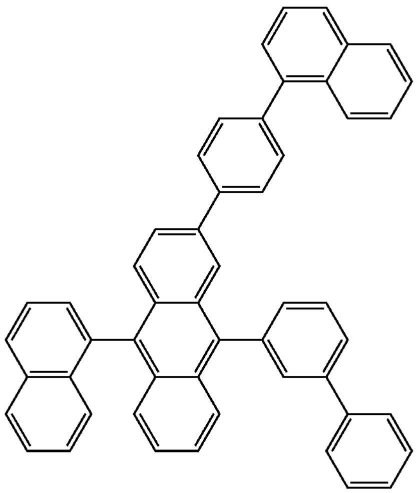
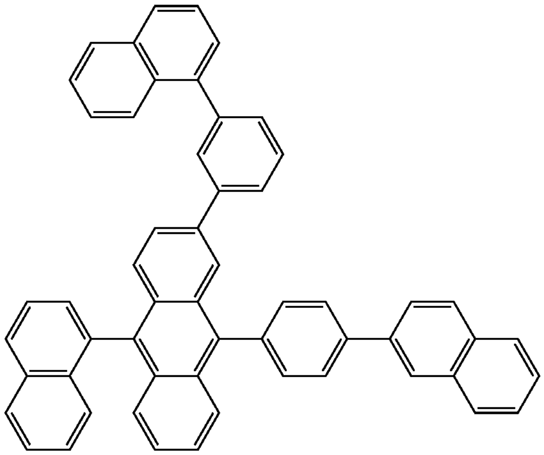
[Formula 324]
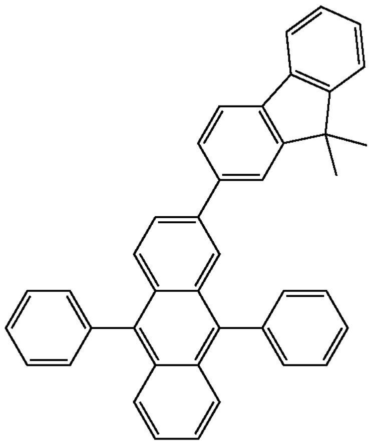

-continued
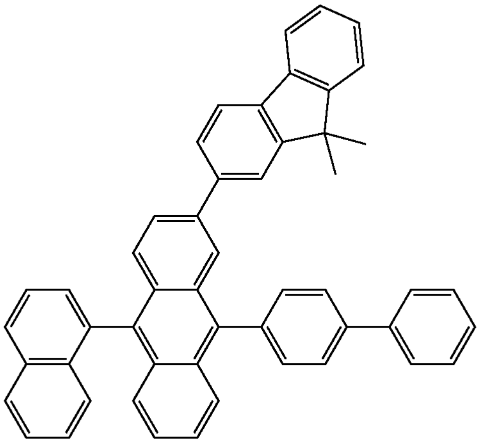
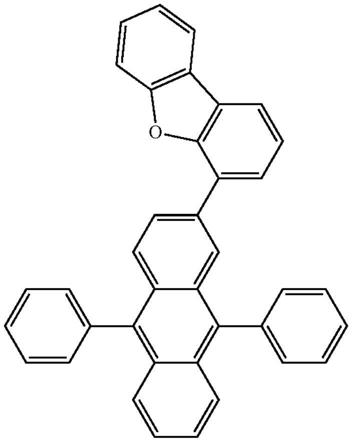
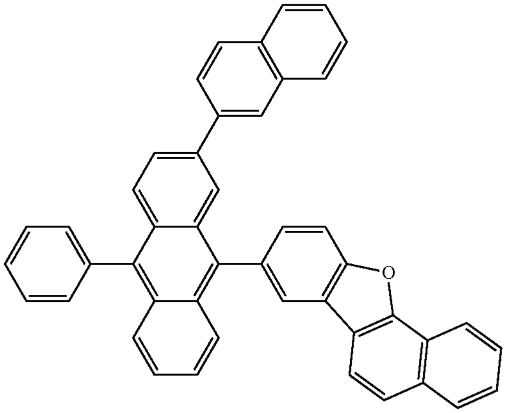
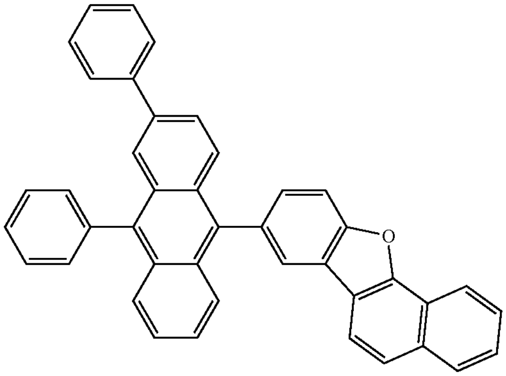
-continued
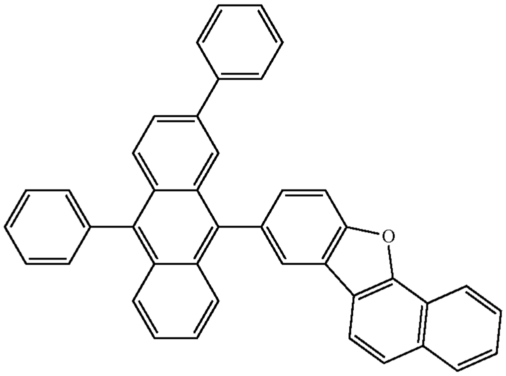
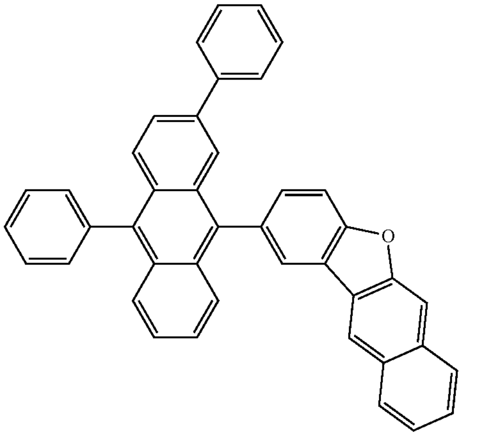
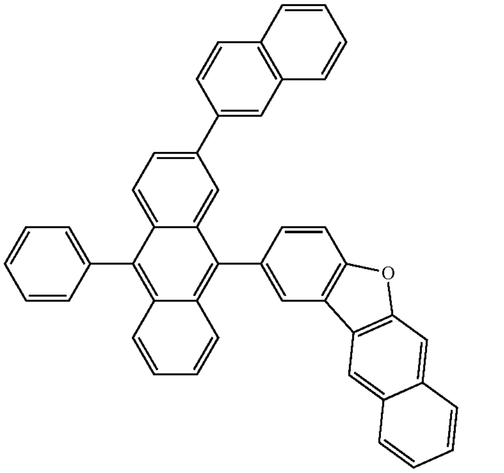

[Formula 325]
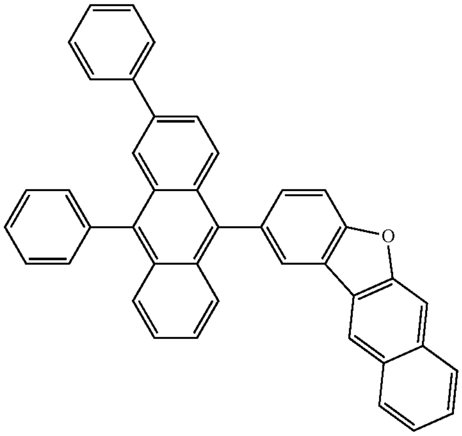
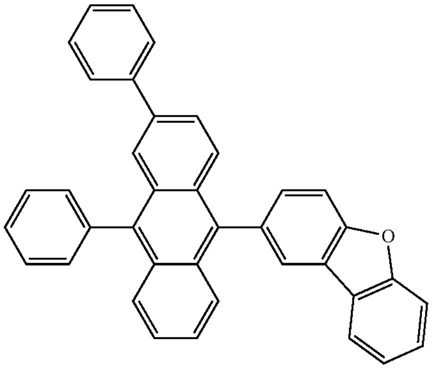
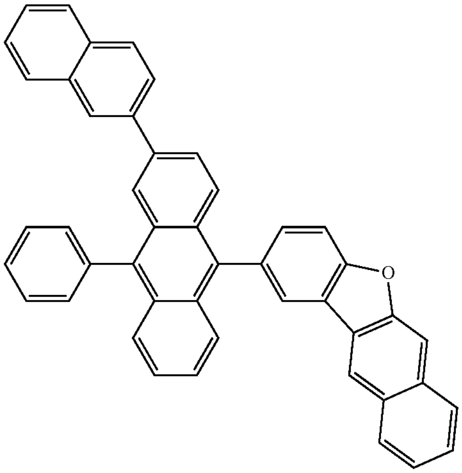
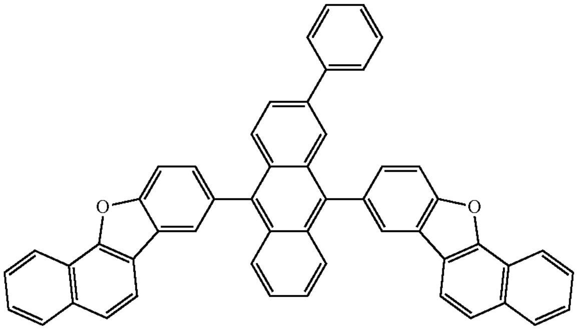
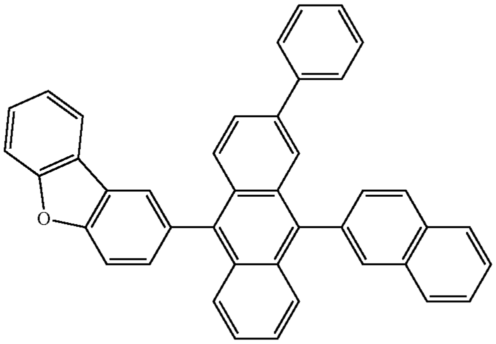
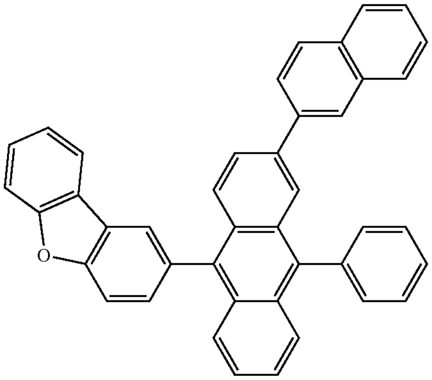
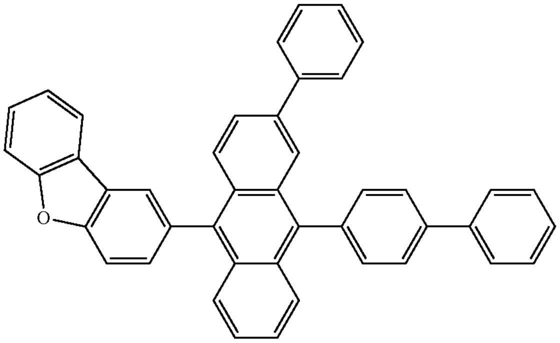
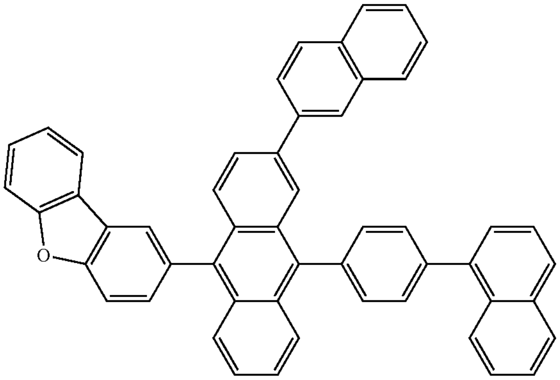

-continued
[Formula 326]
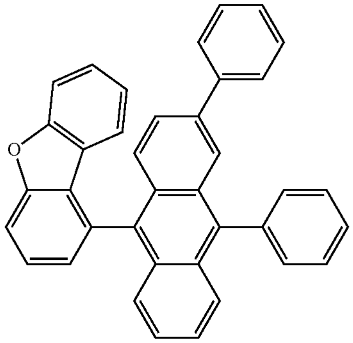
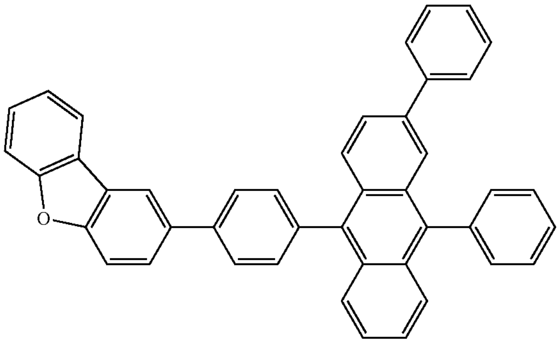
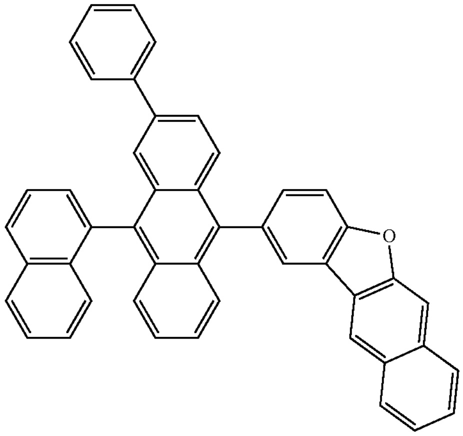
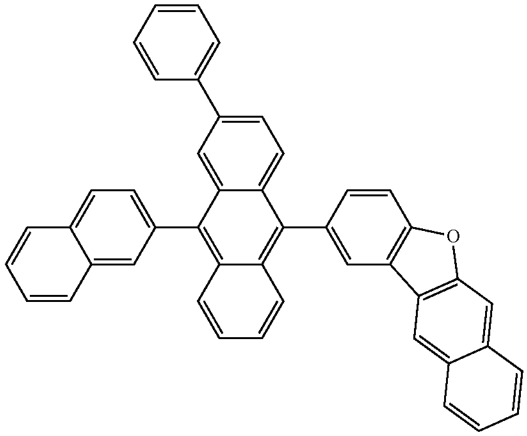
-continued
[Formula 327]
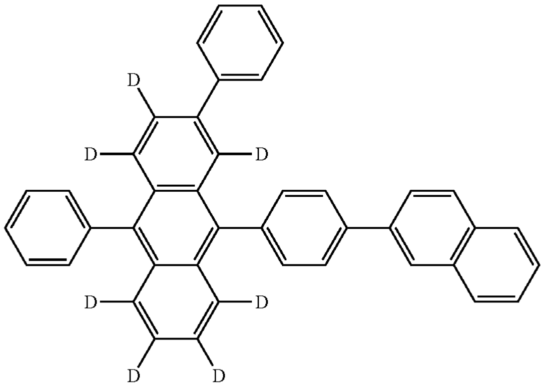
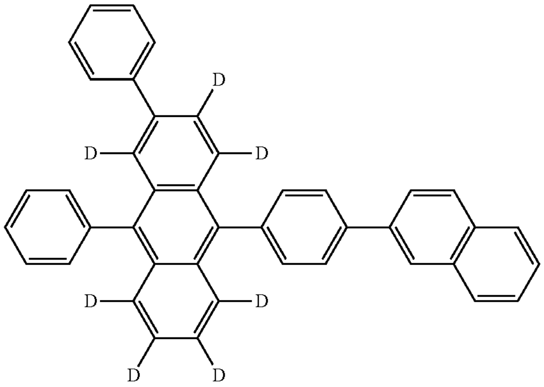
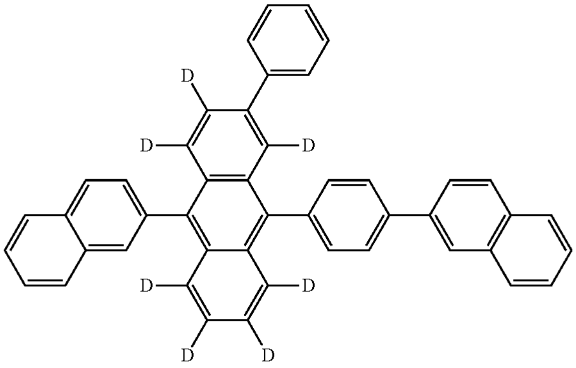
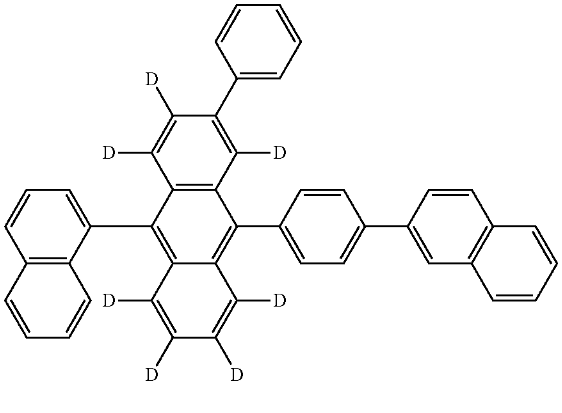

-continued

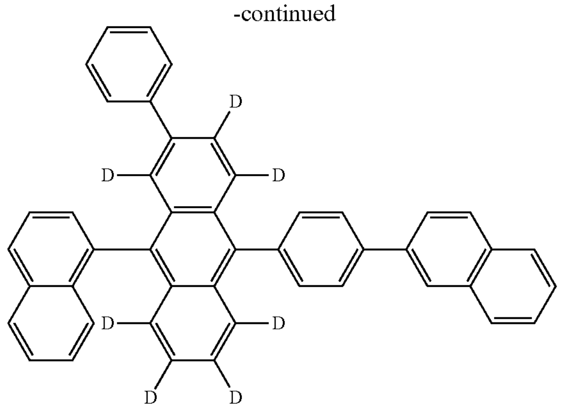

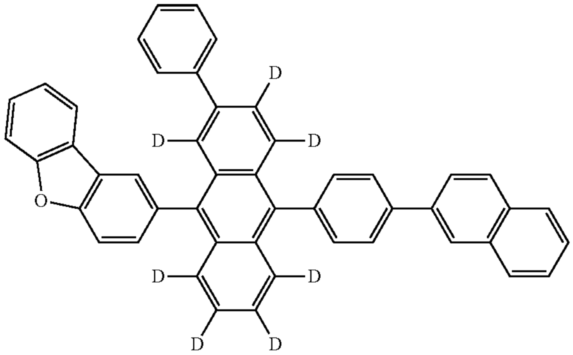

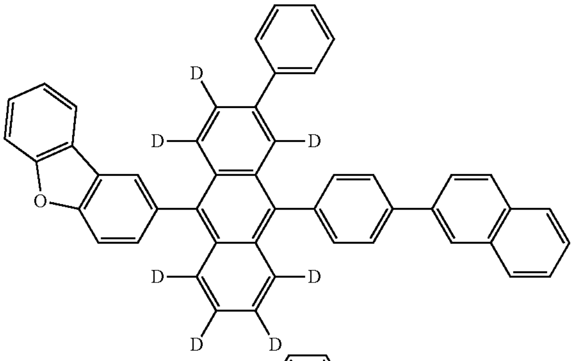

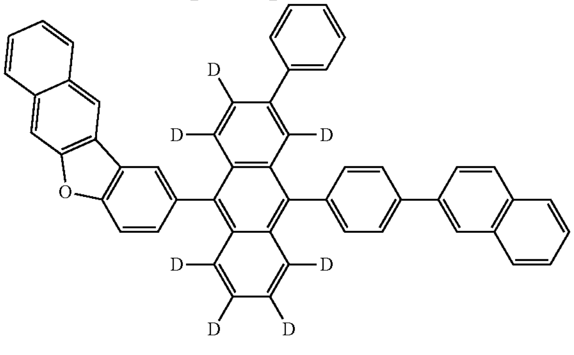

First Luminescent Compound and Second Luminescent Compound

In the organic EL device according to the exemplary embodiment, any compound having the ionization potential Ip(D1) satisfying the relationship of the numerical formula (Numerical Formula 1X) is usable as the first luminescent compound. For instance, any compound selected from a third compound below and a fourth compound below and having the ionization potential Ip(D1) satisfying the relationship of the numerical formula (Numerical Formula 1X) is usable as the first luminescent compound.

In the organic EL device according to the exemplary embodiment, the second luminescent compound is exemplified by the third compound below and the fourth compound below.

The third compound and the fourth compound are each independently at least one compound selected from the group consisting of a compound represented by a formula (4) below, a compound represented by a formula (5) below, and a compound represented by a formula (6) below.

Compound Represented by Formula (4)

The compound represented by the formula (4) will be described below.

[Formula 328]

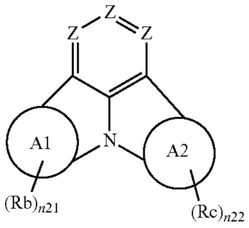

(4)

In the formula (4):

Z are each independently CRa or a nitrogen atom;

A1 ring and A2 ring are each independently a substituted or unsubstituted aromatic hydrocarbon ring having 6 to 50 ring carbon atoms, or a substituted or unsubstituted heterocyclic ring having 5 to 50 ring atoms;

when a plurality of Ra are present, at least one combination of adjacent two or more of the plurality of Ra are mutually bonded to form a substituted or unsubstituted monocyclic ring, mutually bonded to form a substituted or unsubstituted fused ring, or not mutually bonded;

n21 and n22 are each independently 0, 1, 2, 3 or 4;

when a plurality of Rb are present, at least one combination of adjacent two or more of the plurality of Rb are mutually bonded to form a substituted or unsubstituted monocyclic ring, mutually bonded to form a substituted or unsubstituted fused ring, or not mutually bonded;

when a plurality of Rc are present, at least one combination of adjacent two or more of the plurality of Rc are mutually bonded to form a substituted or unsubstituted monocyclic ring, mutually bonded to form a substituted or unsubstituted fused ring, or not mutually bonded;

Ra, Rb, and Rc forming neither the monocyclic ring nor the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

The "aromatic hydrocarbon ring" for the A1 ring and A2 ring has the same structure as a compound formed by introducing a hydrogen atom to the "aryl group" described above.

Ring atoms of the "aromatic hydrocarbon ring" for the A1 ring and A2 ring include two carbon atoms on a fused bicyclic structure at the center of the formula (4)

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the A1 ring and A2 ring has the same structure as a compound formed by introducing a hydrogen atom to the "heterocyclic group" described above.

Ring atoms of the "heterocycle" for the A1 ring and A2 ring include two carbon atoms on a fused bicyclic structure at the center of the formula (4).

Specific examples of the "substituted or unsubstituted heterocycle having 5 to 50 ring atoms" include a compound formed by introducing a hydrogen atom to the "heterocyclic group" described in the specific example group G2.

Rb is bonded to any one of carbon atoms forming the aromatic hydrocarbon ring as the A1 ring or any one of atoms forming the heterocycle as the A1 ring.

Rc is bonded to any one of carbon atoms forming the aromatic hydrocarbon ring as the A2 ring or any one of atoms forming the heterocycle as the A2 ring.

At least one of Ra, Rb, or Rc is preferably a group represented by a formula (4a) below. More preferably, at least two of Ra, Rb, or Rc are each a group represented by the formula (4a).

[Formula 329]

$$*\text{-}L_{401}\text{-}Ar_{401} \quad (4a)$$

In the formula (4a):

$L_{401}$ is a single bond, a substituted or unsubstituted arylene group having 6 to 30 ring carbon atoms, or a substituted or unsubstituted divalent heterocyclic group having 5 to 30 ring atoms; and $Ar_{401}$ is a substituted or unsubstituted aryl group having 6 to 50 ring carbon atoms, a substituted or unsubstituted heterocyclic group having 5 to 50 ring atoms, or a group represented by a formula (4b) below.

[Formula 330]

(4b)

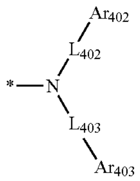

In the formula (4b):

$L_{402}$ and $L_{403}$ are each independently a single bond, a substituted or unsubstituted arylene group having 6 to 30 ring carbon atoms, or a substituted or unsubstituted divalent heterocyclic group having 5 to 30 ring atoms; and a combination of $Ar_{402}$ and $Ar_{403}$ are mutually bonded to form a substituted or unsubstituted monocyclic ring, mutually bonded to form a substituted or unsubstituted fused ring, or not mutually bonded;

$Ar_{402}$ and $Ar_{403}$ forming neither the monocyclic ring nor the fused ring are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is represented by a formula (42) below.

[Formula 331]

(42)

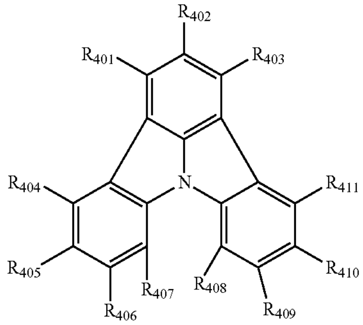

In the formula (42):

at least one combination of adjacent two or more of $R_{401}$ to $R_{411}$ are mutually bonded to form a substituted or unsubstituted monocyclic ring, mutually bonded to form a substituted or unsubstituted fused ring, or not mutually bonded;

$R_{401}$ to $R_{411}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $R_{401}$ to $R_{411}$ is preferably a group represented by the formula (4a). More preferably, at least two of $R_{401}$ to $R_{411}$ are each a group represented by the formula (4a).

$R_{404}$ and $R_{411}$ are preferably each a group represented by the formula (4a).

In an exemplary embodiment, the compound represented by the formula (4) is a compound formed by bonding a structure represented by a formula (4-1) or a formula (4-2) below to the A1 ring.

Further, in an exemplary embodiment, the compound represented by the formula (42) is a compound formed by bonding the structure represented by the formula (4-1) or the formula (4-2) to a ring bonded to $R_{404}$ to $R_{407}$.

[Formula 332]

(4-1)

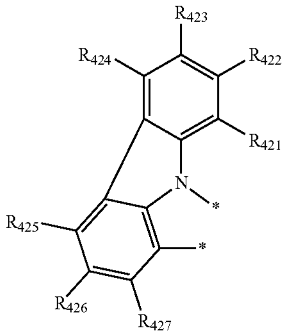

(4-2)

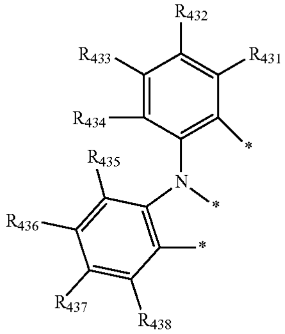

In the formula (4-1), two * are each independently bonded to a ring carbon atom of the aromatic hydrocarbon ring or a ring atom of the heterocycle as the A1 ring in the formula (4) or bonded to one of $R_{404}$ to $R_{407}$ in the formula (42);

in the formula (4-2), three * are each independently bonded to a ring carbon atom of the aromatic hydrocarbon ring or a ring atom of the heterocycle as the A1 ring in the formula (4) or bonded to one of $R_{404}$ to $R_{407}$ in the formula (42);

at least one combination of adjacent two or more of $R_{421}$ to $R_{427}$ are mutually bonded to form a substituted or unsubstituted monocyclic ring, mutually bonded to form a substituted or unsubstituted fused ring, or not mutually bonded;

at least one combination of adjacent two or more of $R_{431}$ to $R_{438}$ are mutually bonded to form a substituted or unsubstituted monocyclic ring, mutually bonded to form a substituted or unsubstituted fused ring, or not mutually bonded; and $R_{421}$ to $R_{427}$ and $R_{431}$ to $R_{438}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by a formula (41-3), a formula (41-4) or a formula (41-5) below.

[Formula 333]

(41-3)

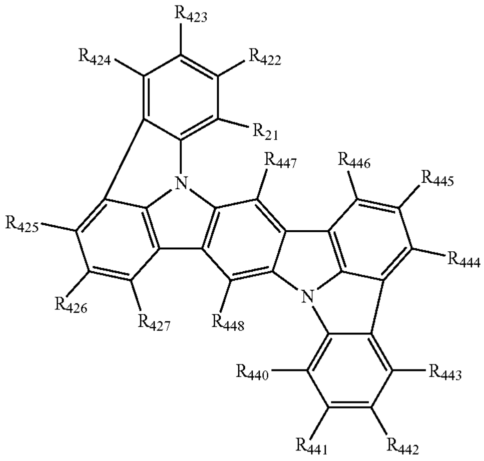

[Formula 334]

(41-4)

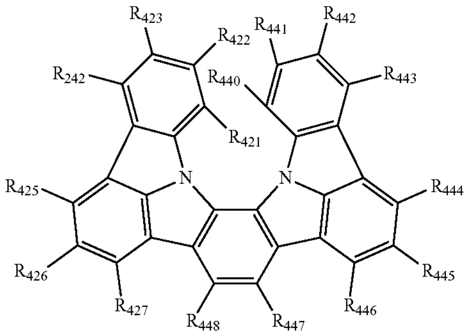

[Formula 335]

(41-5)

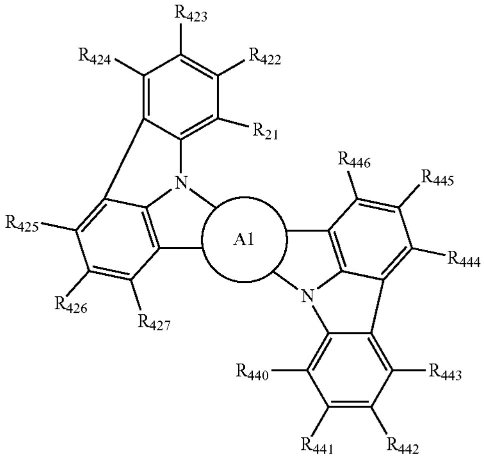

In the formulae (41-3), (41-4), and (41-5):

A1 ring is as defined in the formula (4);

$R_{421}$ to $R_{427}$ each independently represent the same as $R_{421}$ to $R_{427}$ in the formula (4-1); and $R_{440}$ to $R_{448}$ each independently represent the same as $R_{401}$ to $R_{411}$ in the formula (42).

In an exemplary embodiment, a substituted or unsubstituted aromatic hydrocarbon ring having 6 to 50 ring carbon atoms as the A1 ring in the formula (41-5) is a substituted or unsubstituted naphthalene ring or a substituted or unsubstituted fluorene ring.

In an exemplary embodiment, a substituted or unsubstituted heterocycle having 5 to 50 ring atoms as the A1 ring in the formula (41-5) is a substituted or unsubstituted dibenzofuran ring, a substituted or unsubstituted carbazole ring, or a substituted or unsubstituted dibenzothiophene ring.

In an exemplary embodiment, the compound represented by the formula (4) or the formula (42) is selected from the group consisting of compounds represented by formulae (461) to (467) below.

[Formula 336]

(461)

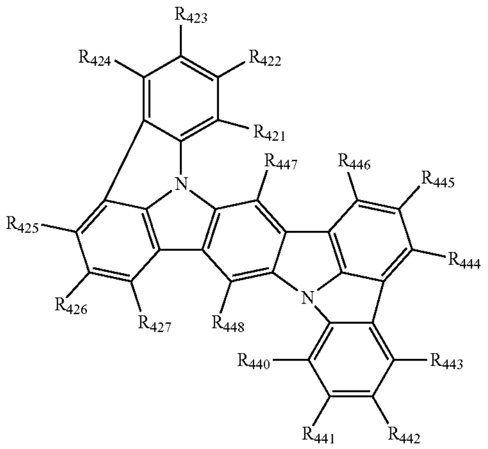

(462)

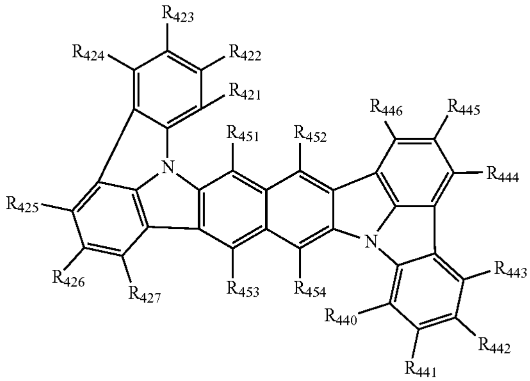

-continued

[Formula 337]

(463)

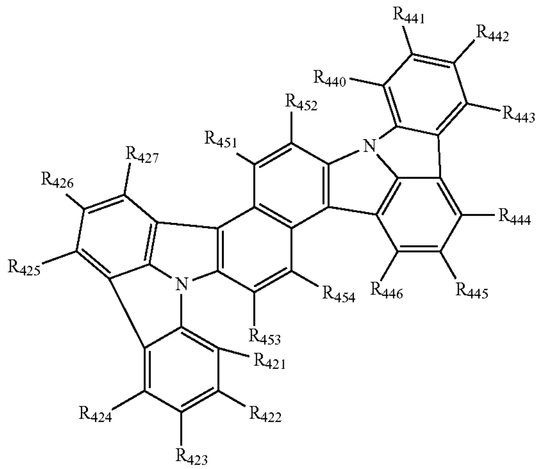

(464)

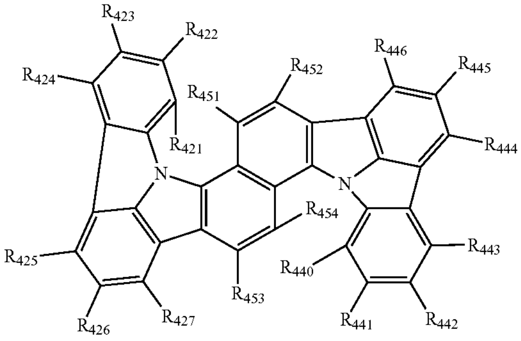

[Formula 338]

(465)

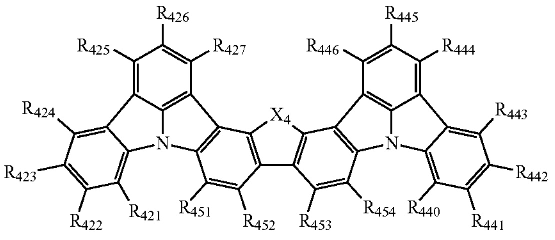

[Formula 339]

(466)

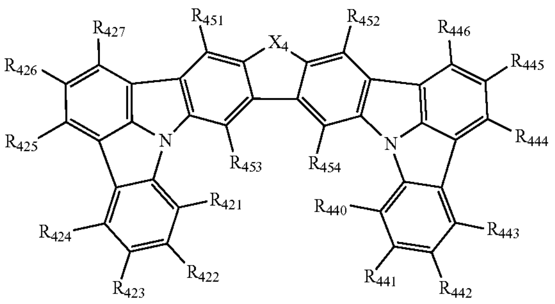

-continued

[Formula 340]

(467)

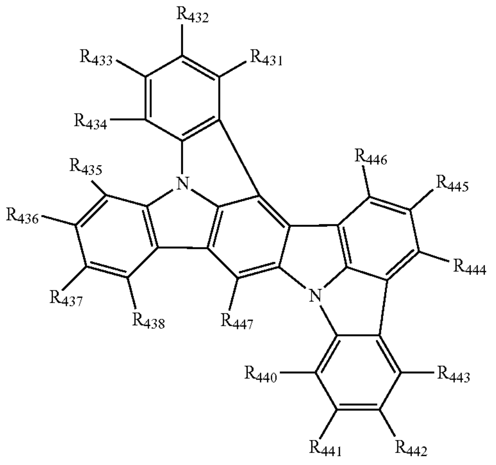

In the formulae (461), (462), (463), (464), (465), (466), and (467):

$R_{421}$ to $R_{427}$ each independently represent the same as $R_{421}$ to $R_{427}$ in the formula (4-1);

$R_{431}$ to $R_{438}$ each independently represent the same as $R_{431}$ to $R_{438}$ in the formula (4-2);

$R_{440}$ to $R_{448}$ and $R_{451}$ to $R_{454}$ each independently represent the same as $R_{401}$ to $R_{411}$ in the formula (42);

X4 is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, preferably a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, at least one combination of adjacent two or more of $R_{401}$ to $R_{411}$ in the compound represented by the formula (42) are mutually bonded to form a substituted or unsubstituted monocyclic ring, or mutually bonded to form a substituted or unsubstituted fused ring. In this exemplary embodiment, the compound represented by the formula (42) will be described in detail below as a compound represented by a formula (45) below.

Compound Represented by Formula (45)

The compound represented by the formula (45) will be described below.

[Formula 341]

(45)

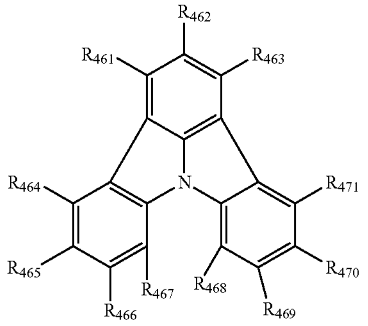

In the formula (45):

two or more of combinations selected from the group consisting of a combination of $R_{461}$ and $R_{462}$, a combination of $R_{462}$ and $R_{463}$, a combination of $R_{464}$ and $R_{465}$, a combination of $R_{465}$ and $R_{466}$, a combination of $R_{466}$ and $R_{467}$, a combination of $R_{468}$ and $R_{469}$, a combination of $R_{469}$ and $R_{470}$, and a combination of $R_{470}$ and $R_{471}$ are mutually bonded to form a substituted or unsubstituted monocyclic ring or a substituted or unsubstituted fused ring;

the combination of $R_{461}$ and $R_{462}$ and the combination of $R_{462}$ and $R_{463}$; the combination of $R_{464}$ and $R_{465}$ and the combination of $R_{465}$ and $R_{466}$; the combination of $R_{465}$ and $R_{466}$ and the combination of $R_{466}$ and $R_{467}$; the combination of $R_{468}$ and $R_{469}$ and the combination of $R_{469}$ and $R_{470}$, and the combination of $R_{469}$ and $R_{470}$ and the combination of $R_{470}$ and $R_{471}$ do not form a ring at the same time;

the two or more rings formed by $R_{461}$ to $R_{471}$ are mutually the same or different; and $R_{461}$ to $R_{471}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In the formula (45), $R_n$ and $R_{n+1}$ (n being an integer selected from 461, 462, 464 to 466, and 468 to 470) are mutually bonded to form a substituted or unsubstituted monocyclic ring or fused ring together with two ring carbon atoms bonded to $R_n$ and $R_{n+1}$. The ring is preferably formed of atoms selected from the group consisting of a carbon atom, an oxygen atom, a sulfur atom, and a nitrogen atom, and is made of preferably 3 to 7 atoms, and more preferably 5 or 6 atoms. 10

The number of the above cyclic structures in the compound represented by the formula (45) is, for instance, 2, 3, or 4. The two or more of the cyclic structures may be present on the same benzene ring or may be present on different benzene rings on the basic skeleton represented by the formula (45). For instance, when three cyclic structures are present, the three cyclic structures may be present on the respective three benzene rings of the formula (45).

Examples of the above cyclic structures in the compound represented by the formula (45) include structures represented by formulae (451) to (460) below.

[Formula 342]

(451)

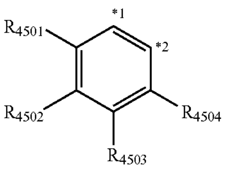

(452)

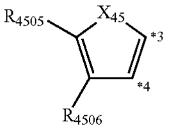

(453)

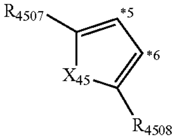

(454)

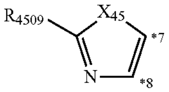

(455)

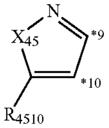

(456)

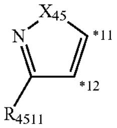

(457)

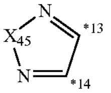

In the formulae (451) to (457):

each combination of *1 and *2, *3 and *4, *5 and *6, *7 and *8, *9 and *10, *11 and *12, and *13 and *14 represents the two ring carbon atoms bonded to $R_n$ and $R_{n+1}$;

the ring carbon atom bonded to $R_n$ may be any one of the two ring carbon atoms represented by *1 and *2, *3 and *4, *5 and *6, *7 and *8, *9 and *10, *11 and *12, and *13 and *14;

$X_{45}$ is $C(R_{4512})(R_{4513})$, $NR_{4514}$, an oxygen atom, or a sulfur atom;

at least one combination of adjacent two or more of $R_{4501}$ to $R_{4506}$ and $R_{4512}$ to $R_{4513}$ are mutually bonded to form a substituted or unsubstituted monocyclic ring, mutually bonded to form a substituted or unsubstituted fused ring, or not mutually bonded; and $R_{4501}$ to $R_{4514}$ forming neither the monocyclic ring nor the fused ring each independently represent the same as $R_{461}$ to $R_{471}$ in the formula (45).

[Formula 343]

(458)

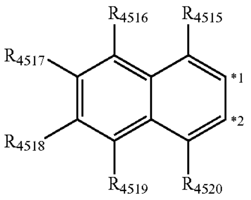

(459)

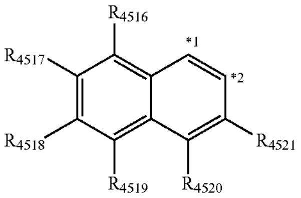

(460)

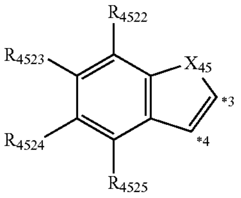

In the formulae (458) to (460):

each combination of *1 and *2, and *3 and *4 represents the two ring carbon atoms bonded to $R_n$ and $R_{n+1}$;

the ring carbon atom bonded to $R_n$ may be any one of the two ring carbon atoms represented by *1 and *2, or *3 and *4;

$X_{45}$ is $C(R_{4512})(R_{4513})$, $NR_{4514}$, an oxygen atom, or a sulfur atom;

at least one combination of adjacent two or more of $R_{4512}$ to $R_{4513}$ and $R_{4515}$ to $R_{4525}$ are mutually bonded to form a substituted or unsubstituted monocyclic ring, mutually bonded to form a substituted or unsubstituted fused ring, or not mutually bonded; and $R_{4512}$ to $R_{4513}$, $R_{4515}$ to $R_{4521}$ and $R_{4522}$ to $R_{4525}$ forming neither the monocyclic ring nor the fused ring, and $R_{4514}$ each independently represent the same as $R_{461}$ to $R_{471}$ in the formula (45).

In the formula (45), preferably, at least one of $R_{462}$, $R_{464}$, $R_{465}$, $R_{470}$ or $R_{471}$ (preferably, at least one of $R_{462}$, $R_{465}$ or $R_{470}$, and more preferably $R_{462}$) is a group forming no cyclic structure.

(i) A substituent, if present, for a cyclic structure formed by $R_n$ and $R_{n+1}$ in the formula (45), (ii) $R_{461}$ to $R_{471}$ forming no cyclic structure in the formula (45), and (iii) $R_{4501}$ to $R_{4514}$ and $R_{4515}$ to $R_{4525}$ in the formulae (451) to (460) are preferably each independently any one of groups selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-N(R_{906})(R_{907})$, a substituted or unsubstituted aryl group having 6 to 50 ring carbon atoms, a substituted or unsubstituted heterocyclic group having 5 to 50 ring atoms, or groups represented by formulae (461) to (464) below.

[Formula 344]

(461)

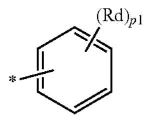

(462)

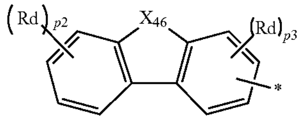

(463)

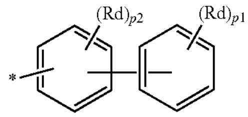

(464)

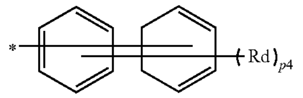

In the formulae (461) to (464):

$R_d$ is each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, preferably, a substituted or unsubstituted aryl group having 6 to 50 ring carbon atoms, or a substituted or unsubstituted heterocyclic group having 5 to 50 ring atoms;

$X_{46}$ is C($R_{801}$)($R_{802}$), $NR_{803}$, an oxygen atom, or a sulfur atom;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different;

when a plurality of $R_{803}$ are present, the plurality of $R_{803}$ are mutually the same or different;

p1 is 5;

p2 is 4;

p3 is 3;

p4 is 7; and

* in the formulae (461) to (464) each independently represent a bonding position to a cyclic structure.

$R_{901}$ to $R_{907}$ in the third compound and the fourth compound are as defined above.

In an exemplary embodiment, the compound represented by the formula (45) is represented by one of formulae (45-1) to (45-6) below.

[Formula 345]

(45-1)

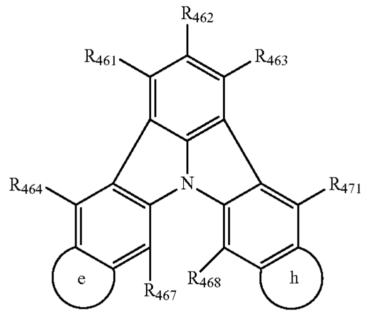

(45-2)

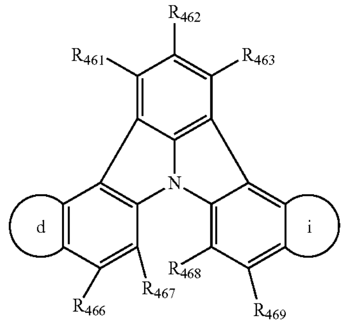

(45-3)

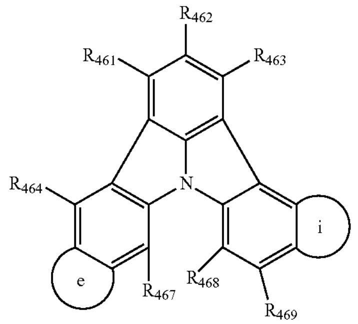

[Formula 346]

(45-4)

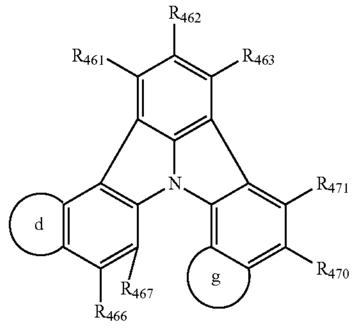

-continued (45-5)

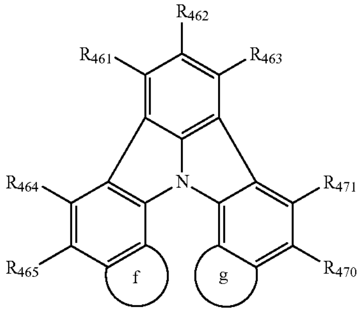

(45-6)

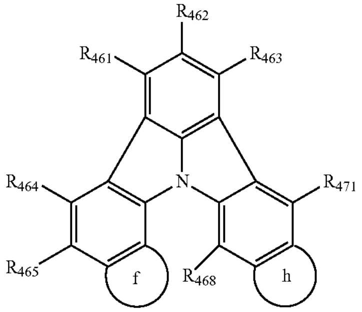

In the formulae (45-1) to (45-6):

rings d to i are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

In an exemplary embodiment, the compound represented by the formula (45) is represented by one of formulae (45-7) to (45-12) below.

[Formula 347]

(45-7)

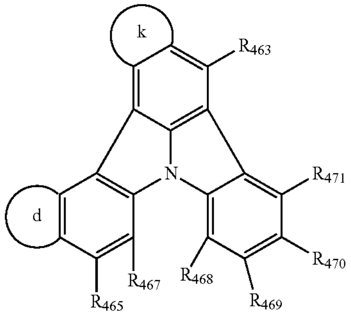

(45-8)

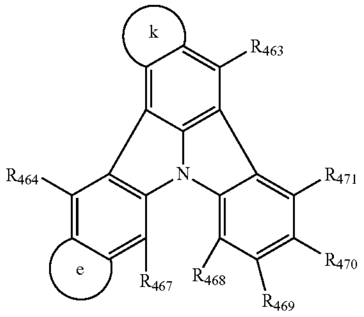

-continued (45-9)

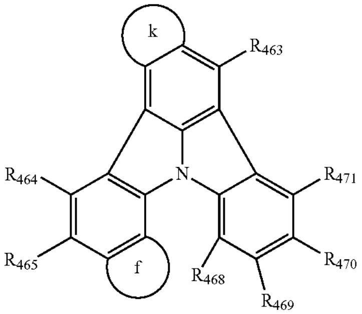

[Formula 348]

(45-10)

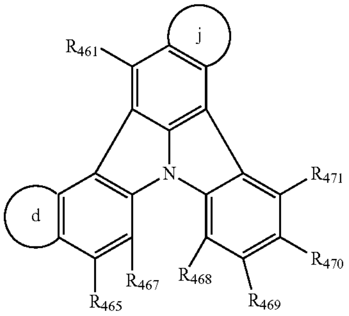

(45-11)

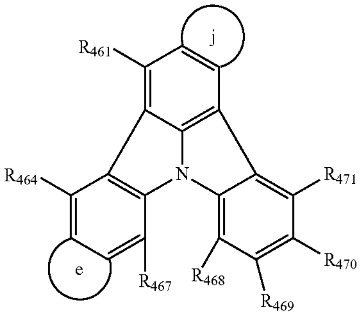

(45-12)

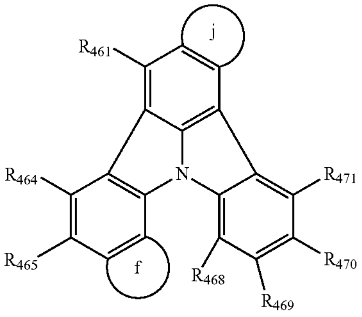

In the formulae (45-7) to (45-12):

rings d to f, k and j are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

Compound Represented by Formula (5)

The compound represented by the formula (5) will be described below. The compound represented by the formula (5) corresponds to a compound represented by the formula (41-3).

[Formula 349]

(5)

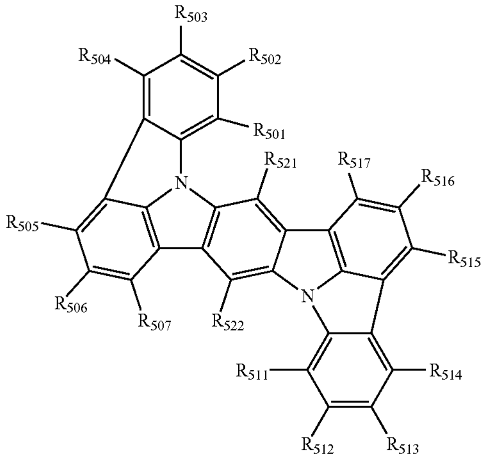

In the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded;

$R_{501}$ to $R_{507}$ and $R_{511}$ to $R_{517}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and $R_{521}$ and $R_{522}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

"A combination of adjacent two or more of $R_{501}$ to $R_{507}$ and $R_{511}$ to $R_{517}$" refers to, for instance, a combination of $R_{501}$ and $R_{502}$, a combination of $R_{502}$ and $R_{503}$, a combination of $R_{503}$ and $R_{504}$, a combination of $R_{505}$ and $R_{506}$, a combination of $R_{506}$ and $R_{507}$, and a combination of $R_{501}$, $R_{502}$, and $R_{503}$.

In an exemplary embodiment, at least one, preferably two of $R_{501}$ to $R_{507}$ or $R_{511}$ to $R_{517}$ are each a group represented by —$N(R_{906})(R_{907})$.

In an exemplary embodiment, $R_{501}$ to $R_{507}$ and $R_{511}$ to $R_{517}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (52) below.

[Formula 350]

(52)

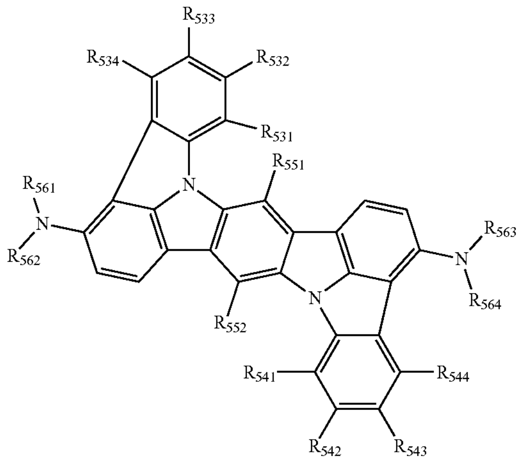

In the formula (52):

at least one combination of adjacent two or more of $R_{531}$ to $R_{534}$ and $R_{541}$ to $R_{544}$ are mutually bonded to form a substituted or unsubstituted monocyclic ring, mutually bonded to form a substituted or unsubstituted fused ring, or not mutually bonded;

$R_{531}$ to $R_{534}$ and $R_{541}$ to $R_{544}$ forming neither the monocyclic ring nor the fused ring, and $R_{551}$ and $R_{552}$ are each independently a hydrogen atom, a substituted or unsubstituted aryl group having 6 to 50 ring carbon atoms, or a substituted or unsubstituted heterocyclic group having 5 to 50 ring atoms; and $R_{561}$ to $R_{564}$ are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (53) below.

[Formula 351]

(53)

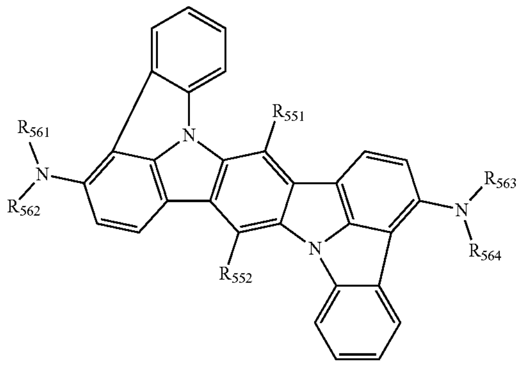

In the formula (53), $R_{551}$, $R_{552}$ and $R_{561}$ to $R_{564}$ each independently represent the same as $R_{551}$, $R_{552}$ and $R_{561}$ to $R_{564}$ in the formula (52).

In an exemplary embodiment, $R_{561}$ to $R_{564}$ in the formulae (52) and (53) are each independently a substituted or unsubstituted aryl group having 6 to 50 ring carbon atoms (preferably a phenyl group).

In an exemplary embodiment, $R_{521}$ and $R_{522}$ in the formula (5) and $R_{551}$ and $R_{552}$ in the formulae (52) and (53) are each a hydrogen atom.

In an exemplary embodiment, the substituent for the "substituted or unsubstituted" group in the formulae (5), (52) and (53) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Compound Represented by Formula (6)

The compound represented by the formula (6) will be described below.

[Formula 352]

(6)

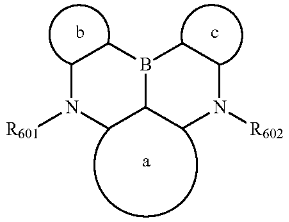

In the formula (6):

a ring a, a ring b and a ring c are each independently a substituted or unsubstituted aromatic hydrocarbon ring having 6 to 50 ring carbon atoms, or a substituted or unsubstituted heterocyclic ring having 5 to 50 ring atoms;

$R_{601}$ and $R_{602}$ are each independently bonded to the ring a, ring b or ring c to form a substituted or unsubstituted heterocycle, or not bonded thereto to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The ring a, ring b and ring c are each a ring fused with a fused bicyclic structure formed of a boron atom and two nitrogen atoms at the center of the formula (6) (a substituted or unsubstituted aromatic hydrocarbon ring having 6 to 50 ring carbon atoms, or a substituted or unsubstituted heterocycle having 5 to 50 ring atoms).

The "aromatic hydrocarbon ring" for the rings a, b, and c has the same structure as a compound formed by introducing a hydrogen atom to the "aryl group" described above.

Ring atoms of the "aromatic hydrocarbon ring" for the ring a include three carbon atoms on the fused bicyclic structure at the center of the formula (6).

Ring atoms of the "aromatic hydrocarbon ring" for the rings b and c include two carbon atoms on the fused bicyclic structure at the center of the formula (6).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the rings a, b, and c has the same structure as a compound formed by introducing a hydrogen atom to the "heterocyclic group" described above.

Ring atoms of the "heterocycle" for the ring a include three carbon atoms on the fused bicyclic structure at the center of the formula (6). Ring atoms of the "heterocycle" for the rings b and c include two carbon atoms on the fused bicyclic structure at the center of the formula (6). Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ may be each independently bonded with the ring a, ring b, or ring c to form a substituted or unsubstituted heterocycle. The "heterocycle" in this arrangement includes a nitrogen atom on the fused bicyclic structure at the center of the formula (6). The heterocycle in the above arrangement optionally includes a hetero atom other than the nitrogen atom. $R_{601}$ and $R_{602}$ being bonded with the ring a, ring b, or ring c specifically means that atoms forming $R_{601}$ and $R_{602}$ are bonded with atoms forming the ring a, ring b, or ring c. For instance, $R_{601}$ may be bonded with the ring a to form a bicyclic (or tri-or-more cyclic) fused nitrogen-containing heterocycle, in which the ring including $R_{601}$ and the ring a are fused. Specific examples of the nitrogen-containing heterocycle include a compound corresponding to the nitrogen-containing bi(or-more) cyclic fused heterocyclic group in the specific example group G2.

The same applies to $R_{601}$ bonded with the ring b, $R_{602}$ bonded with the ring a, and $R_{602}$ bonded with the ring c.

In an exemplary embodiment, the ring a, ring b and ring c in the formula (6) are each independently a substituted or unsubstituted aromatic hydrocarbon ring having 6 to 50 ring carbon atoms.

In an exemplary embodiment, the ring a, ring b and ring c in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms, preferably a substituted or unsubstituted aryl group having 6 to 50 ring carbon atoms.

In an exemplary embodiment, the compound represented by the formula (62) below.

[Formula 353]

(62)

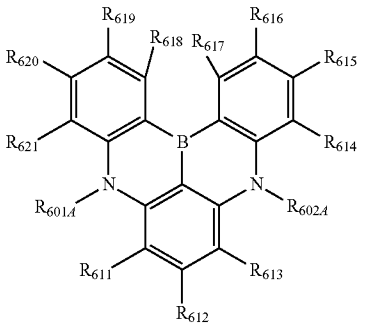

In the formula (62):

$R_{601A}$ is bonded with at least one of $R_{611}$ or $R_{621}$ to form a substituted or unsubstituted heterocycle, or not bonded therewith to form no substituted or unsubstituted heterocycle;

$R_{602A}$ is bonded with at least one of $R_{613}$ or $R_{614}$ to form a substituted or unsubstituted heterocycle, or not bonded therewith to form no substituted or unsubstituted heterocycle;

$R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded; and $R_{611}$ to $R_{621}$ not forming the substituted or unsubstituted heterocycle, not forming the monocyclic ring, and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

$R_{601A}$ and $R_{602A}$ in the formula (62) are groups corresponding to $R_{601}$ and $R_{602}$, respectively, in the formula (6).

For instance, $R_{601A}$ and $R_{611}$ are optionally bonded with each other to form a bicyclic (or tri-or-more cyclic) fused nitrogen-containing heterocycle, in which the ring including $R_{601A}$ and $R_{611}$ and a benzene ring corresponding to the ring a are fused. Specific examples of the nitrogen-containing heterocycle include a compound corresponding to the nitrogen-containing bi(or-more) cyclic fused heterocyclic group in the specific example group G2. The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ are mutually bonded to form a substituted or unsubstituted monocyclic ring, or mutually bonded to form a substituted or unsubstituted fused ring.

For instance, $R_{611}$ and $R_{612}$ are optionally mutually bonded to form a structure in which a benzene ring, indole ring, pyrrole ring, benzofuran ring, benzothiophene ring or the like is fused to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, or a substituted or unsubstituted alkyl group having 1 to 50 carbon atoms.

In an exemplary embodiment, $R_{611}$ to $R_{621}$ not contributing to ring formation are each independently a hydrogen atom, or a substituted or unsubstituted alkyl group having 1 to 50 carbon atoms; and at least one of $R_{611}$ to $R_{621}$ is a substituted or unsubstituted alkyl group having 1 to 50 carbon atoms.

In an exemplary embodiment, the compound represented by the formula (6) is a compound represented by a formula (42-2) below.

[Formula 354]

(42-2)

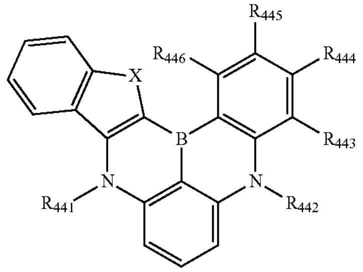

In the formula (42-2):

$R_{441}$ and $R_{442}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$R_{443}$ to $R_{446}$ are each independently a hydrogen atom or a substituent R;

the substituent R is each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

X is O or S;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different; when a plurality of $R_{902}$ are present, the plurality of $R_{902}$ are mutually the same or different; when a plurality of $R_{903}$ are present, the plurality of $R_{903}$ are mutually the same or different; when a plurality of $R_{904}$ are present, the plurality of $R_{904}$ are mutually the same or different; when a plurality of $R_{905}$ are present, the plurality of $R_{905}$ are mutually the same or different; when a plurality of $R_{906}$ are present, the plurality of $R_{906}$ are mutually the same or different; and when a plurality of $R_{907}$ are present, the plurality of $R_{907}$ are mutually the same or different.

In an exemplary embodiment, the substituent for the "substituted or unsubstituted" group in the formula (42-2) is selected from the group consisting of an unsubstituted alkyl group having 1 to 50 carbon atoms, an unsubstituted haloalkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, an unsubstituted alkoxy group having 1 to 50 carbon atoms, an unsubstituted alkylthio group having 1 to 50 carbon atoms, an unsubstituted aryloxy group having 6 to 50 ring carbon atoms, an unsubstituted arylthio group having 6 to 50 ring carbon atoms, an unsubstituted aralkyl group having 7 to 50 carbon atoms, —Si($R_{41}$)($R_{42}$)($R_{43}$), —C(═O)$R_{44}$, —COO$R_{45}$, —S(═O)$_2R_{46}$, —P(═O)($R_{47}$)($R_{48}$), —Ge($R_{49}$)($R_{50}$)($R_{51}$), —N($R_{52}$)($R_{53}$), (here, $R_{41}$ to $R_{53}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms, when two or more $R_{41}$ are present, the two or more $R_{41}$ are mutually the same or different, when two or more $R_{42}$ are present, the two or more $R_{42}$ are mutually the same or different, when two or more $R_{43}$ are present, the two or more $R_{43}$ are mutually the same or different, when two or more $R_{44}$ are present, the two or more $R_{44}$ are mutually the same or different, when two or more $R_{45}$ are present, the two or more $R_{45}$ are mutually the same or different, when two or more $R_{46}$ are present, the two or more $R_{46}$ are mutually the same or different, when two or more $R_{47}$ are present, the two or more $R_{47}$ are mutually the same or different, when two or more $R_{48}$ are present, the two or more $R_{48}$ are mutually the same or different, when two or more $R_{49}$ are present, the two or more $R_{49}$ are mutually the same or different, when two or more $R_{50}$ are present, the two or more $R_{50}$ are mutually the same or different, when two or more $R_{51}$ are present, the two or more $R_{51}$ are mutually the same or different, when two or more $R_{52}$ are present, the two or more $R_{52}$ are mutually the same or different, and when two or more $R_{53}$ are present, the two or more $R_{53}$ are mutually the same or different,) a hydroxy group, a halogen atom, a cyano group, a nitro group, an aryl group having 6 to 50 ring carbon atoms, and a heterocyclic group having 5 to 50 ring atoms.

In an exemplary embodiment, the compound represented by the formula (4) is a compound represented by the formula (41-3), the formula (41-4), or the formula (41-5), the A1 ring in the formula (41-5) being a substituted or unsubstituted fused aromatic hydrocarbon ring having 10 to 50 ring carbon atoms or a substituted or unsubstituted fused heterocycle having 8 to 50 ring atoms.

In an exemplary embodiment, the substituted or unsubstituted fused aromatic hydrocarbon ring having 10 to 50 ring carbon atoms in the formulae (41-3), (41-4) and (41-5) is a substituted or unsubstituted naphthalene ring, a substituted or unsubstituted anthracene ring, or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the substituted or unsubstituted fused aromatic hydrocarbon ring having 10 to 50 ring carbon atoms in the formula (41-3), (41-4) or (41-5) is a substituted or unsubstituted naphthalene ring or a substituted or unsubstituted fluorene ring; and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the compound represented by the formula (4) is selected from the group consisting of a compound represented by a formula (461) below, a compound represented by a formula (462) below, a compound represented by a formula (463) below, a compound represented by a formula (464) below, a compound represented by a formula (465) below, a compound represented by a formula (466) below, and a compound represented by a formula (467) below.

[Formula 355]

(461)

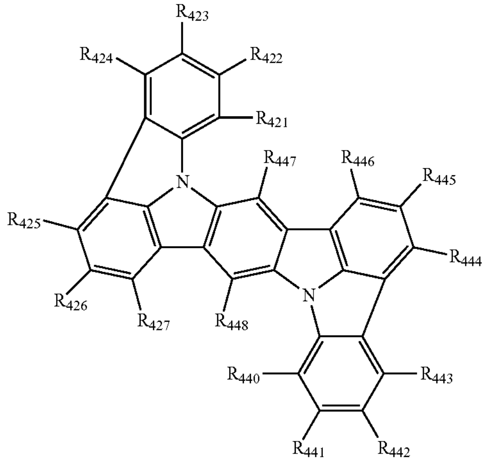

-continued (462)

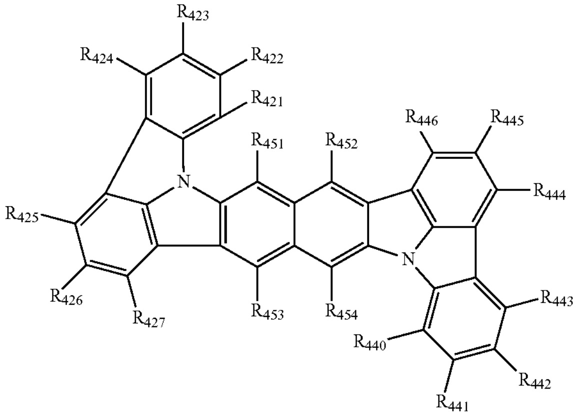

[Formula 356]

(463)

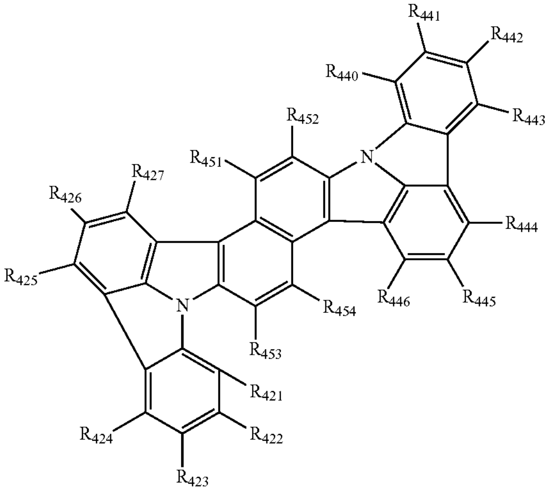

(464)

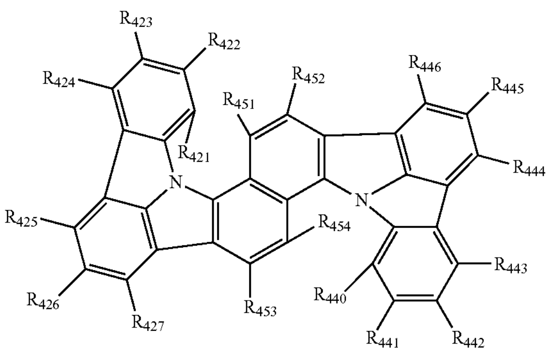

-continued

[Formula 357]

(465)

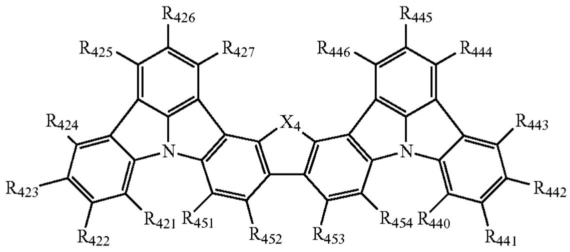

[Formula 358]

(466)

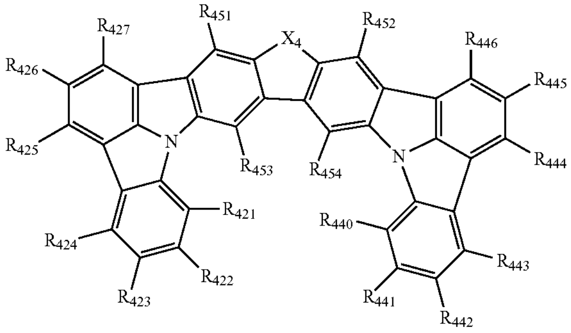

[Formula 359]

(467)

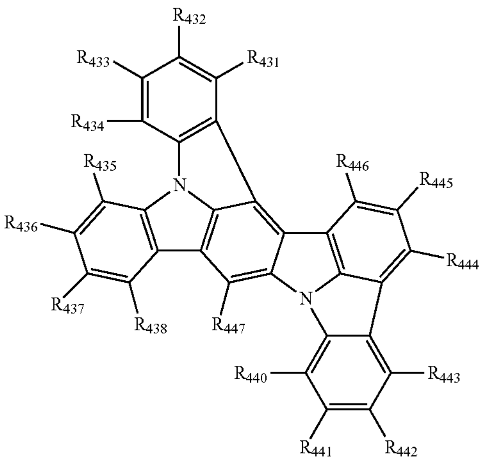

In the formulae (461) to (467):

at least one combination of adjacent two or more of $R_{421}$ to $R_{427}$, $R_{431}$ to $R_{436}$, $R_{440}$ to $R_{448}$, and $R_{451}$ to $R_{454}$ are mutually bonded to form a substituted or unsubstituted monocyclic ring, mutually bonded to form a substituted or unsubstituted fused ring, or not mutually bonded;

$R_{421}$ to $R_{427}$, $R_{431}$ to $R_{436}$, $R_{440}$ to $R_{448}$, and $R_{451}$ to $R_{454}$ forming neither the monocyclic ring nor the fused ring, $R_{437}$, and $R_{438}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, preferably, a substituted or unsubstituted aryl group having 6 to 50 ring carbon atoms, or a substituted or unsubstituted heterocyclic group having 5 to 50 ring atoms;

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, $R_{421}$ to $R_{427}$ and $R_{440}$ to $R_{448}$ are each independently selected from the group consisting of a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{421}$ to $R_{427}$ and $R_{440}$ to $R_{447}$ are each independently selected from the group consisting of a hydrogen atom, a substituted or unsubstituted aryl group having 6 to 18 ring carbon atoms, and a substituted or unsubstituted heterocyclic group having 5 to 18 ring atoms.

In an exemplary embodiment, the compound represented by the formula (41-3) is a compound represented by a formula (41-3-1) below.

[Formula 360]

(41-3-1)

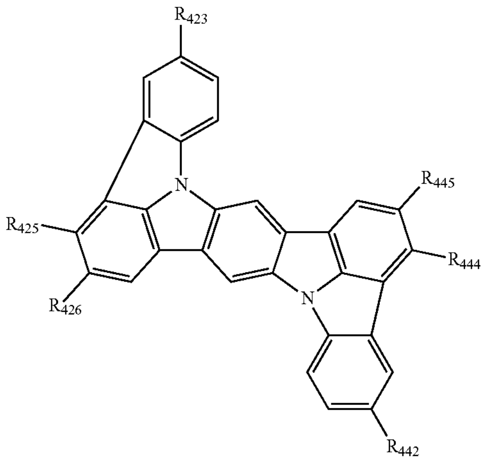

In the formula (41-3-1), $R_{423}$, $R_{425}$, $R_{426}$, $R_{442}$, $R_{444}$ and $R_{445}$ each independently represent the same as $R_{423}$, $R_{425}$, $R_{426}$, $R_{442}$, $R_{444}$ and $R_{445}$ in the formula (41-3).

In an exemplary embodiment, the compound represented by the formula (41-3) is a compound represented by a formula (41-3-2) below.

[Formula 361]

(41-3-2)

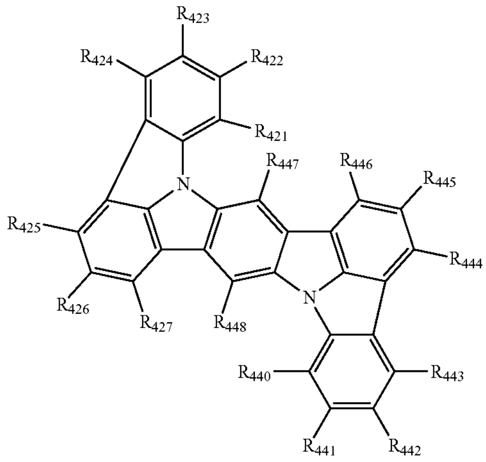

In the formula (41-3-2), $R_{421}$ to $R_{427}$ and $R_{440}$ to $R_{448}$ each independently represent the same as $R_{421}$ to $R_{427}$ and $R_{440}$ to $R_{448}$ in the formula (41-3); and at least one of $R_{421}$ to $R_{427}$ or $R_{440}$ to $R_{446}$ is a group represented by —N($R_{906}$)($R_{907}$).

In an exemplary embodiment, two of $R_{421}$ to $R_{427}$ and $R_{440}$ to $R_{446}$ in the formula (41-3-2) are each a group represented by —N($R_{906}$)($R_{907}$).

In an exemplary embodiment, the compound represented by the formula (41-3-2) is a compound represented by a formula (41-3-3) below.

[Formula 362]

(41-3-3)

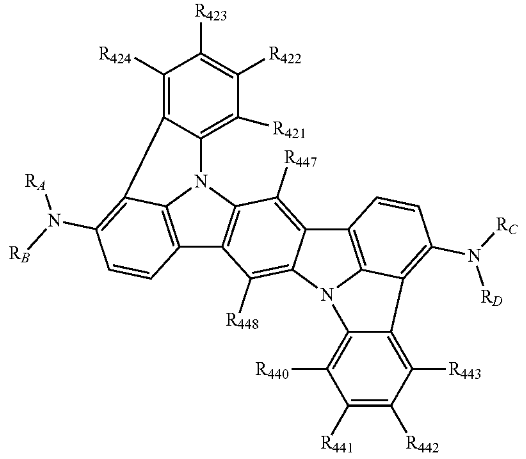

In the formula (41-3-3): $R_{421}$ to $R_{424}$, $R_{440}$ to $R_{443}$, $R_{447}$, and $R_{448}$ each independently represent the same as $R_{421}$ to $R_{424}$, $R_{440}$ to $R_{443}$, $R_{447}$, and $R_{448}$ in the formula (41-3); and $R_A$, $R_B$, $R_C$, and $R_D$ are each independently a substituted or unsubstituted aryl group having 6 to 18 ring carbon atoms, or a substituted or unsubstituted heterocyclic group having 5 to 18 ring atoms.

In an exemplary embodiment, the compound represented by the formula (41-3-3) is a compound represented by a formula (41-3-4) below.

[Formula 363]

(41-3-4)

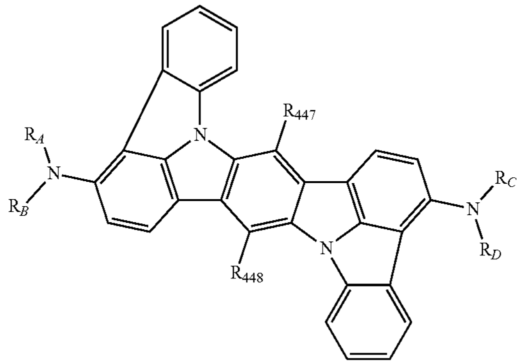

In the formula (41-3-4), $R_{447}$, $R_{448}$, $R_A$, $R_B$, $R_C$ and $R_D$ each independently represent the same as $R_{447}$, $R_{448}$, $R_A$, $R_B$, $R_C$ and $R_D$ in the formula (41-3-3).

In an exemplary embodiment, $R_A$, $R_B$, $R_C$, and $R_D$ are each independently a substituted or unsubstituted aryl group having 6 to 18 ring carbon atoms.

In an exemplary embodiment, $R_A$, $R_B$, $R_C$, and $R_D$ are each independently a substituted or unsubstituted phenyl group.

In an exemplary embodiment, $R_{447}$ and $R_{448}$ are each a hydrogen atom.

In an exemplary embodiment, the substituent for "the substituted or unsubstituted" group in each of the formulae is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), —O—($R_{904a}$), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more $R_{904a}$ are present, the two or more $R_{904a}$ are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In an exemplary embodiment, the substituent for "the substituted or unsubstituted" group in each of the formulae is an unsubstituted alkyl group having 1 to 50 carbon atoms, an unsubstituted aryl group having 6 to 50 ring carbon atoms, or an unsubstituted heterocyclic group having 5 to 50 ring atoms.

In an exemplary embodiment, the substituent for "the substituted or unsubstituted" group in each of the formulae is an unsubstituted alkyl group having 1 to 18 carbon atoms, an unsubstituted aryl group having 6 to 18 ring carbon atoms, or an unsubstituted heterocyclic group having 5 to 18 ring atoms.

Specific Examples of Third Compound and Fourth Compound

Specific examples of the third compound and the fourth compound include the following compounds. It should however be noted that the invention is not limited to the specific examples of the third compound and the fourth compound.

[Formula 364]

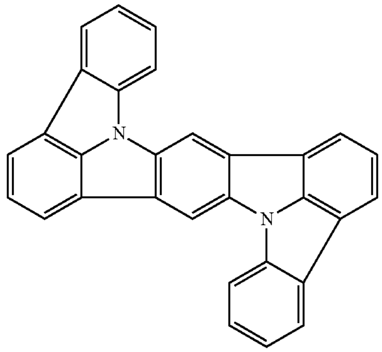

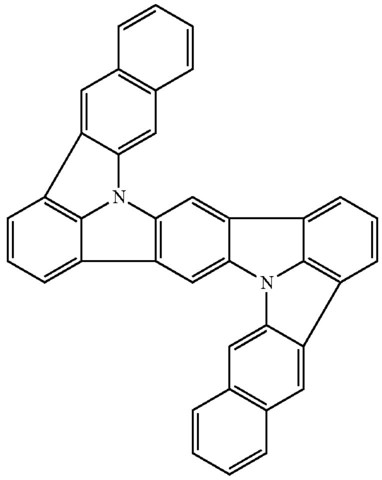

-continued
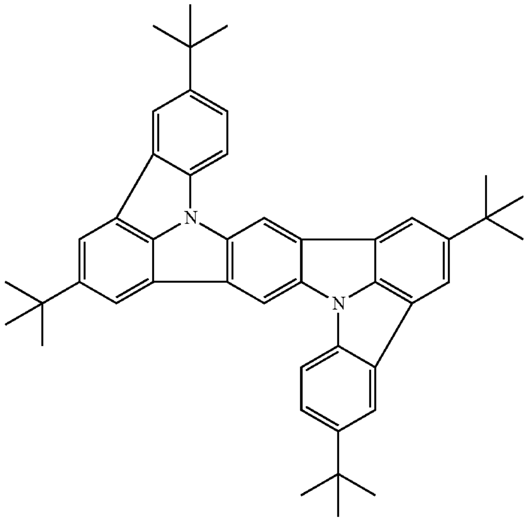
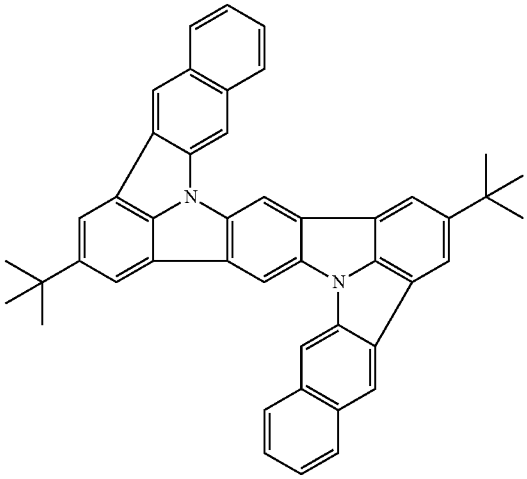
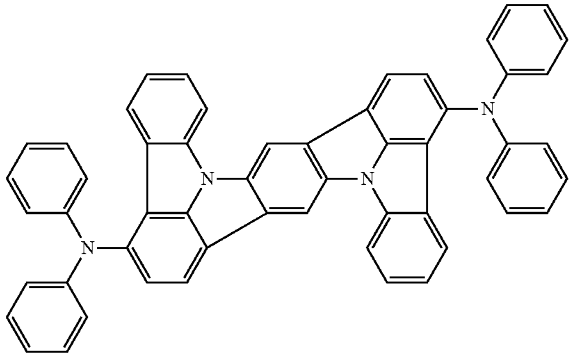
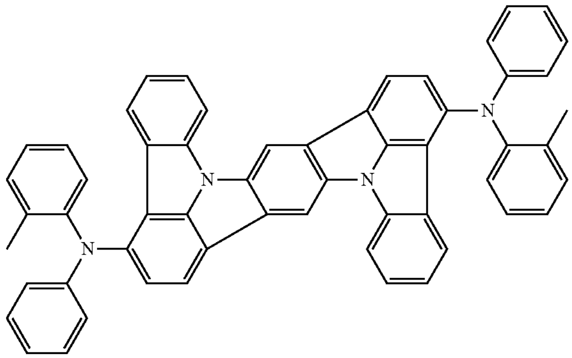
-continued
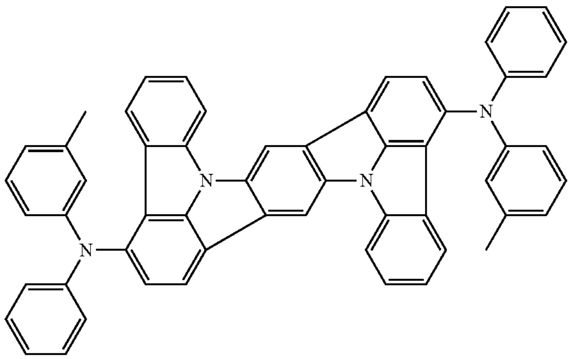
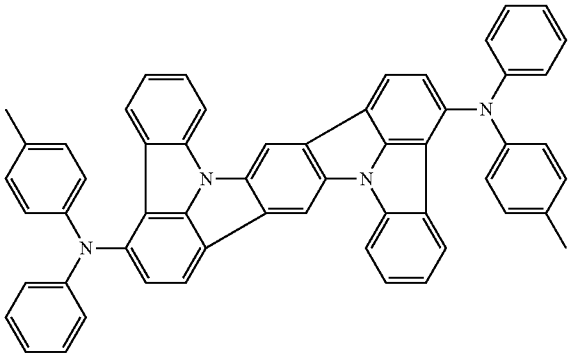
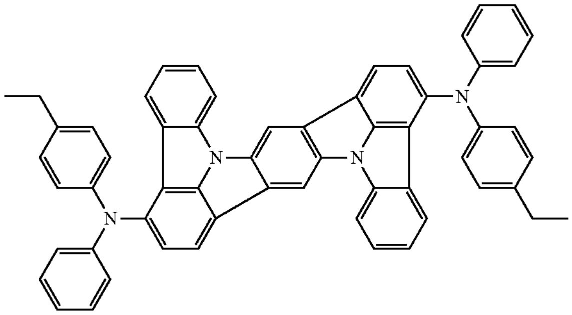
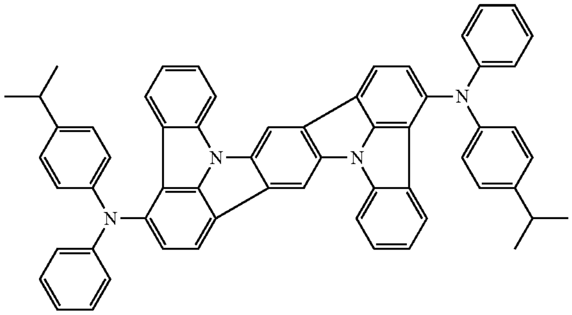
[Formula 365]
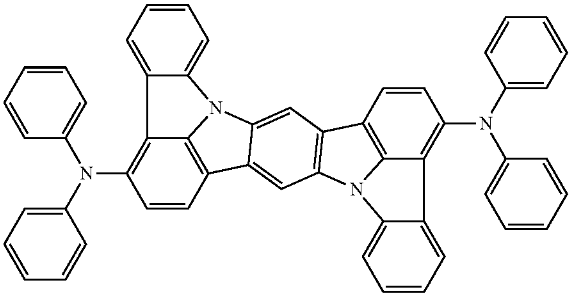

-continued
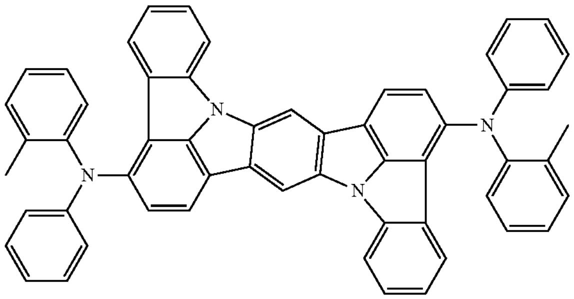
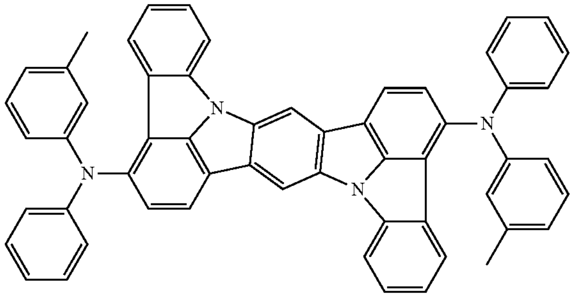
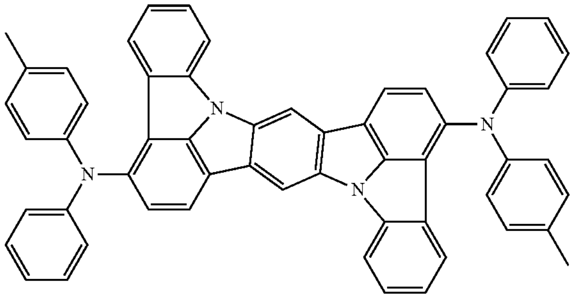
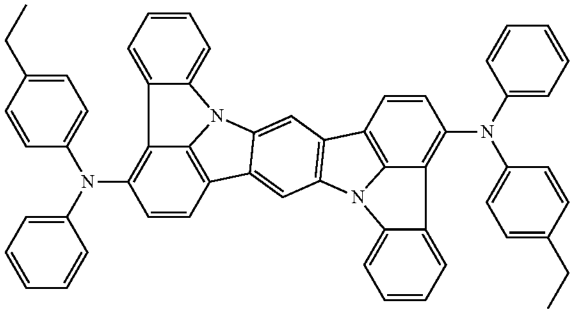
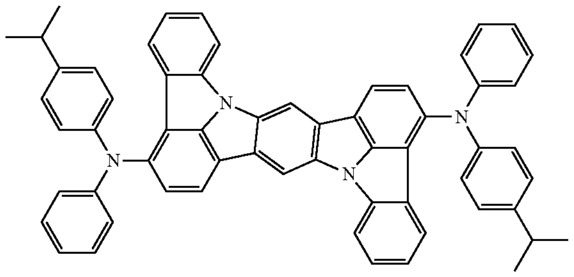
-continued
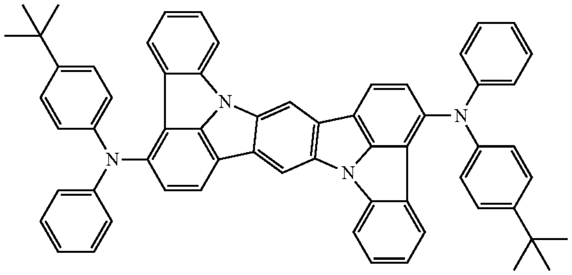
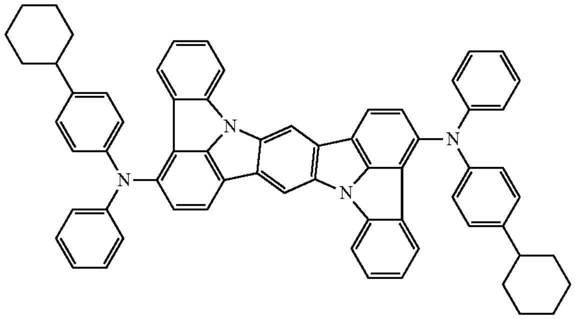
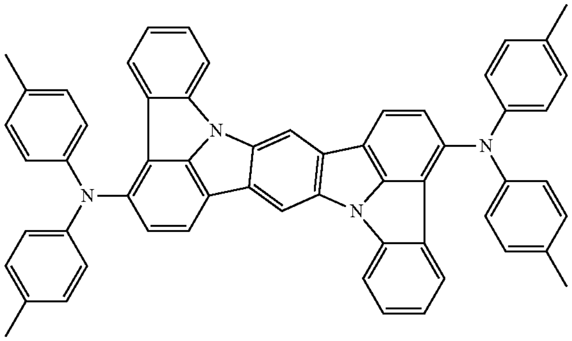
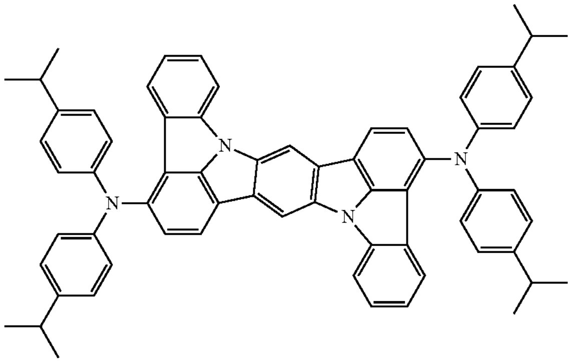
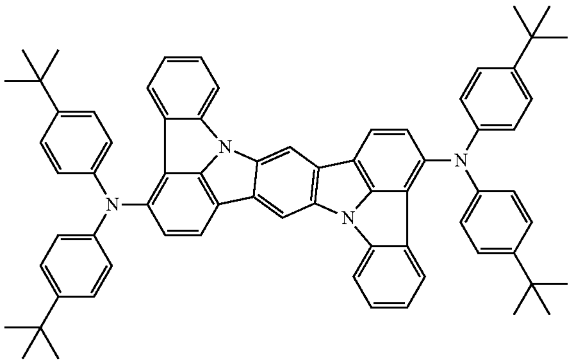

-continued
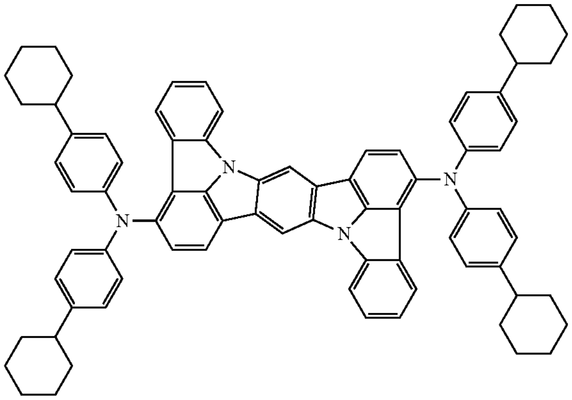
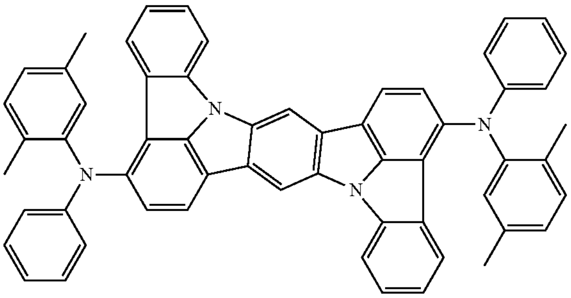
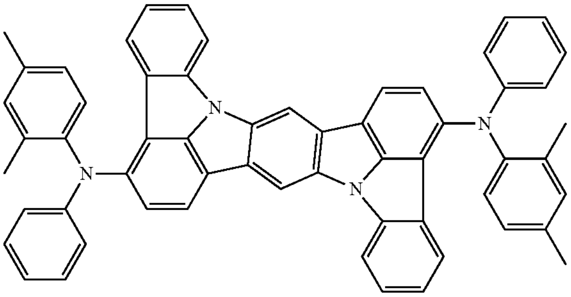
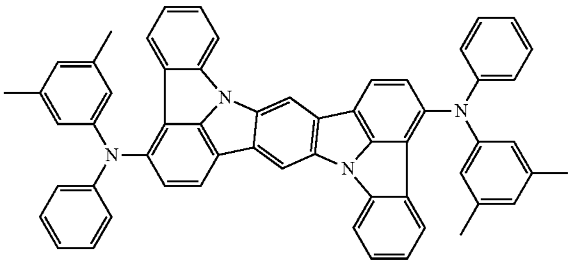
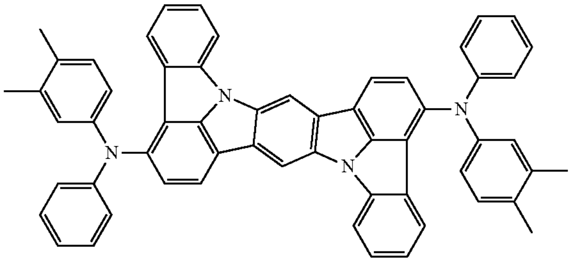
-continued
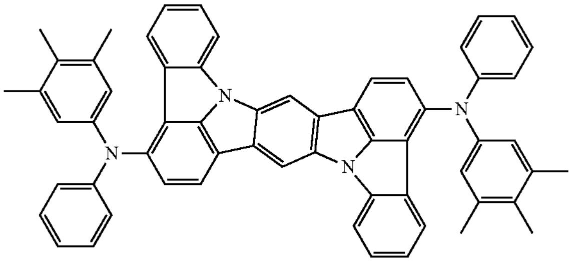
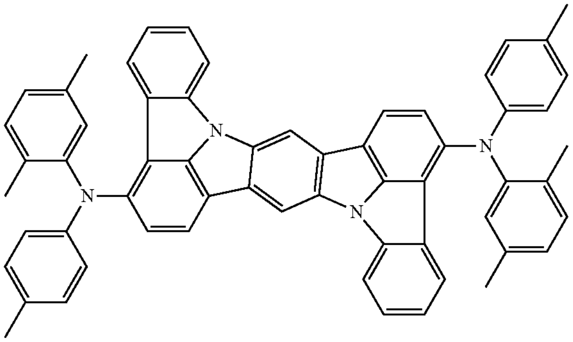
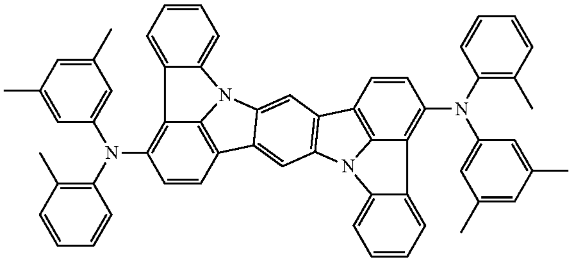
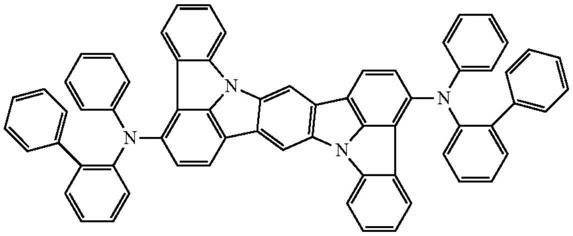
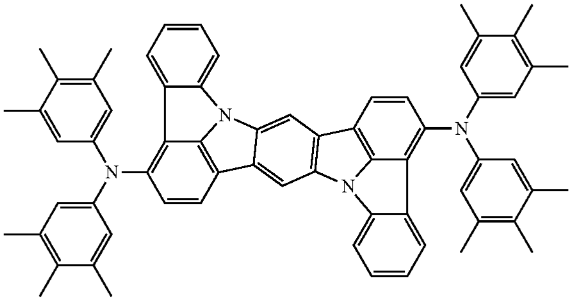
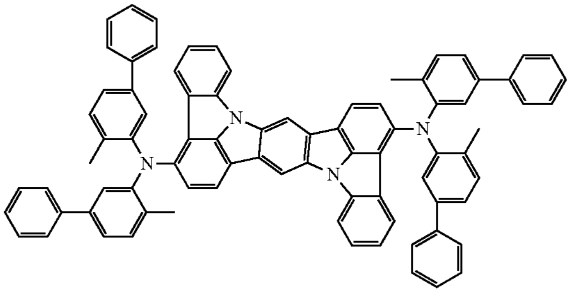

-continued
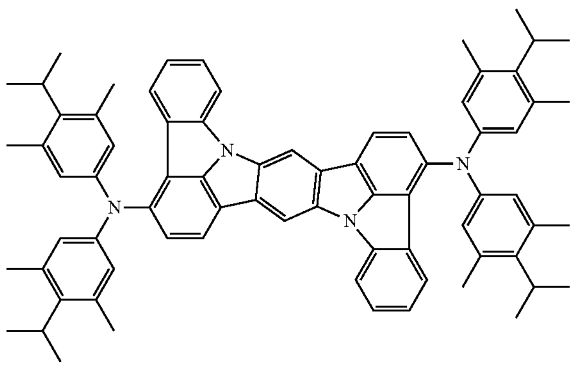
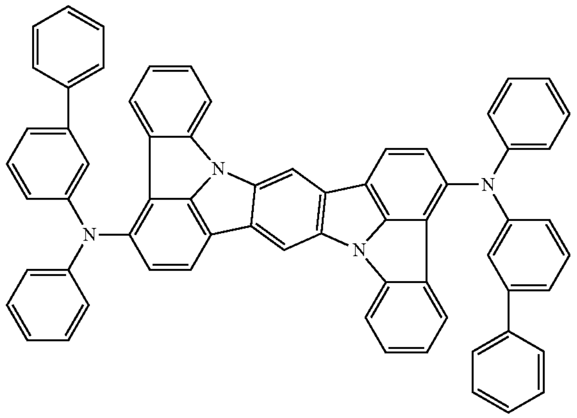
[Formula 366]
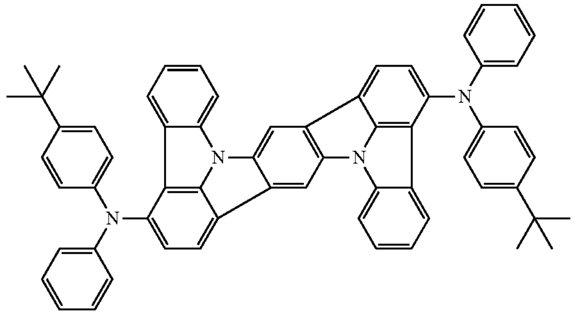
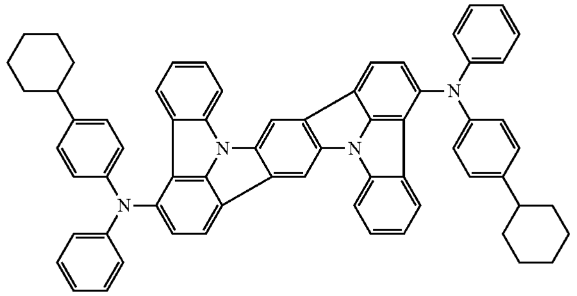
-continued
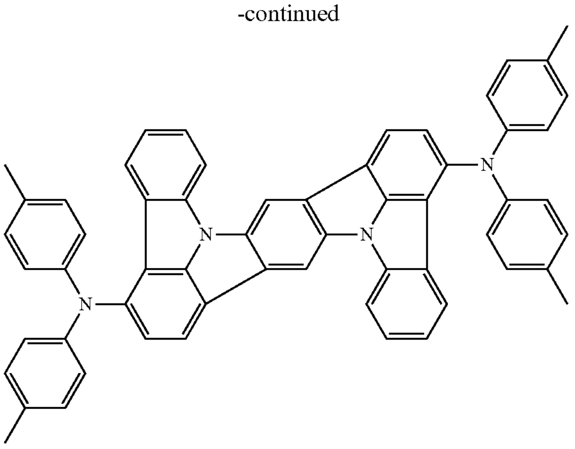
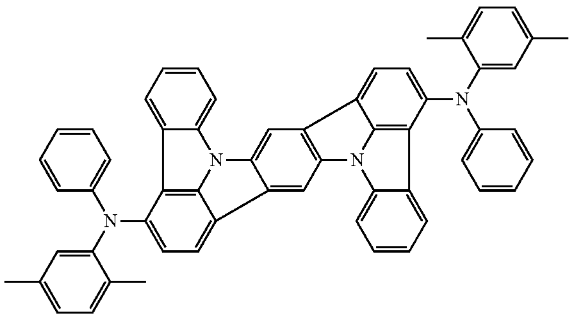
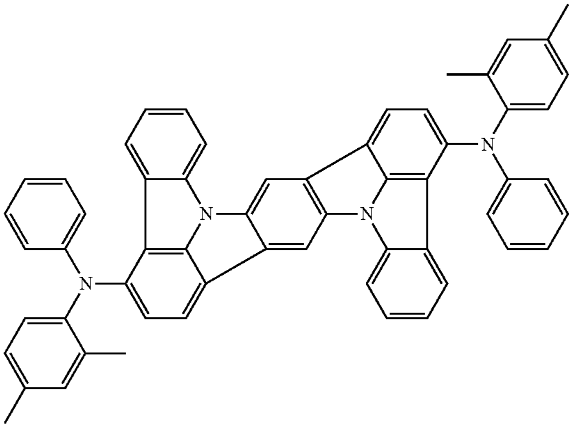
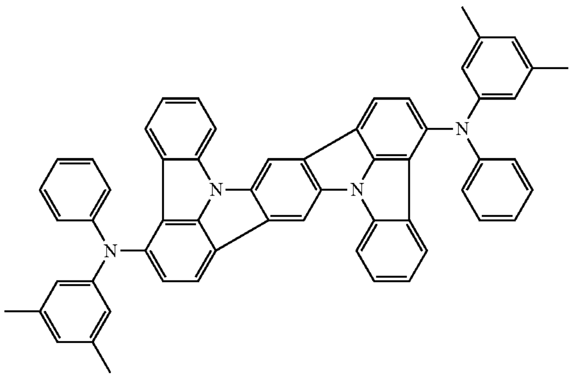

-continued
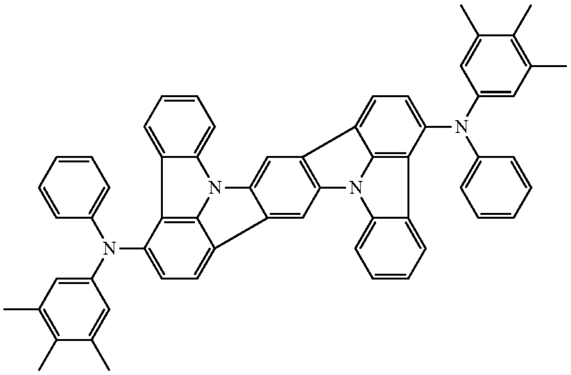
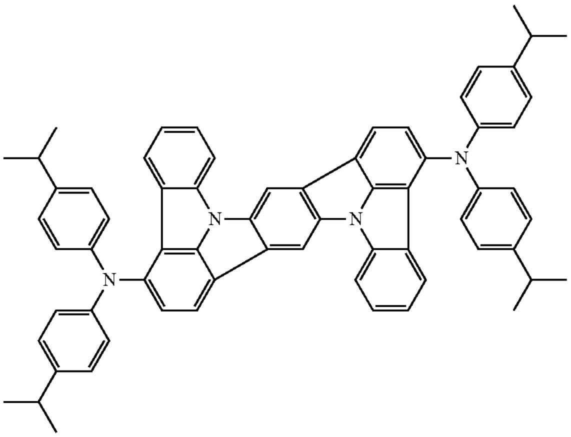
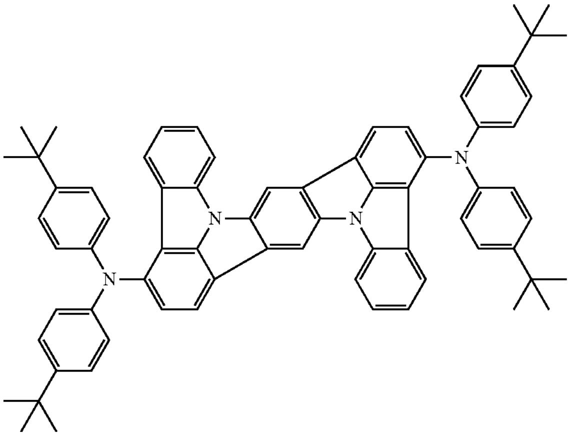
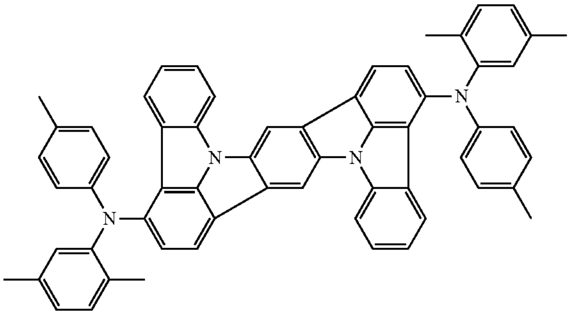
-continued
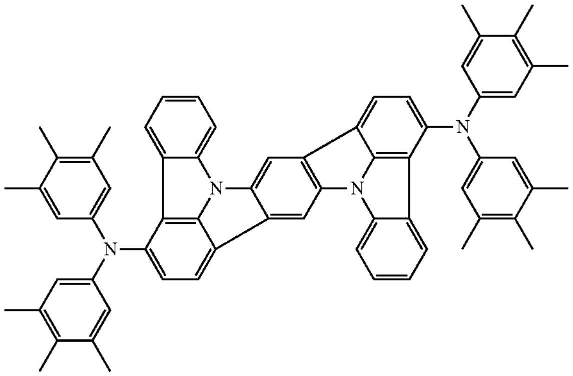
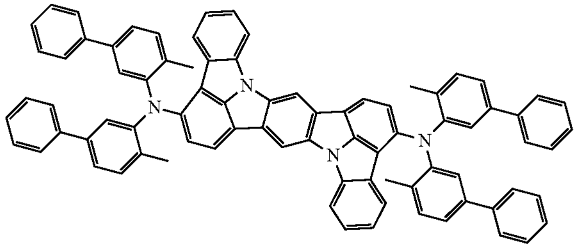
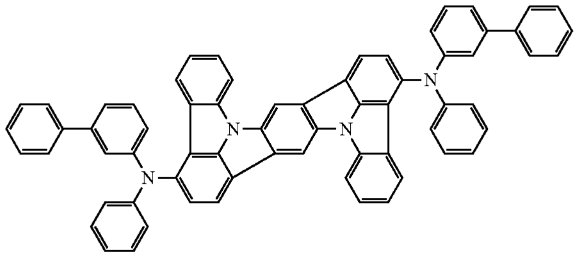
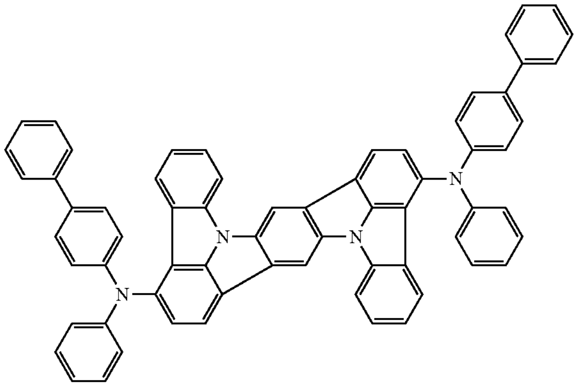
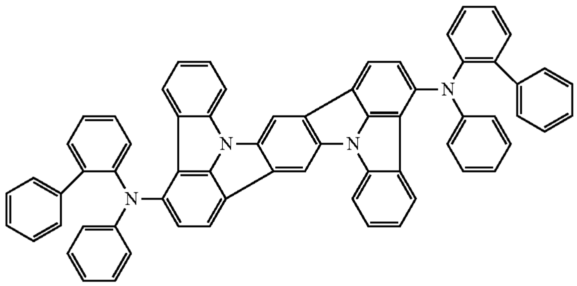

-continued
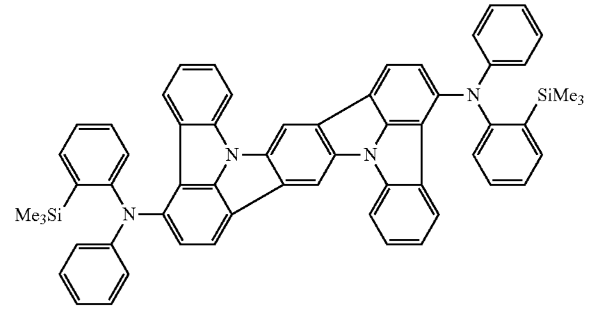
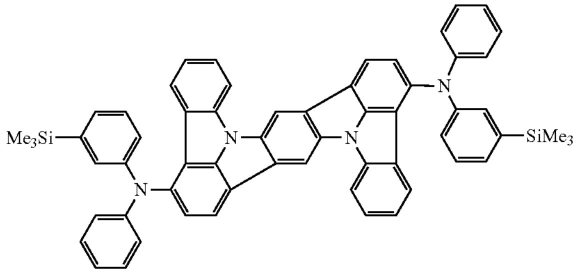
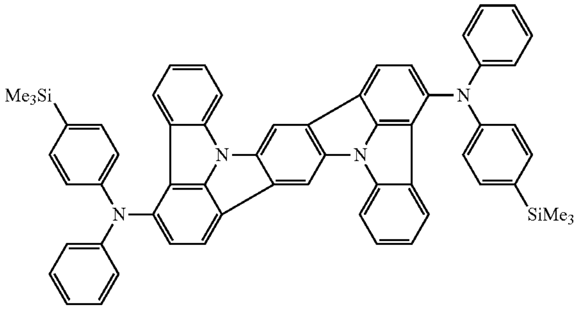
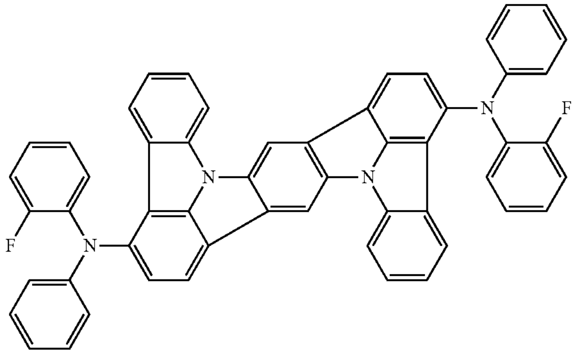
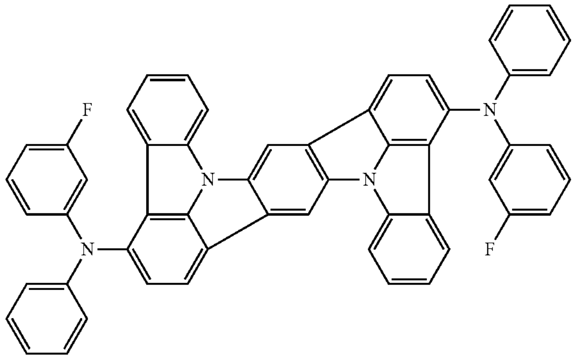
-continued
[Formula 367]
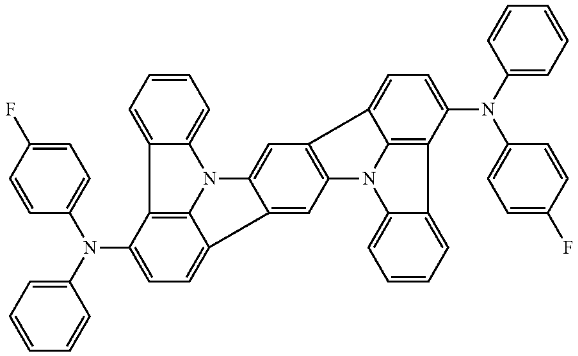
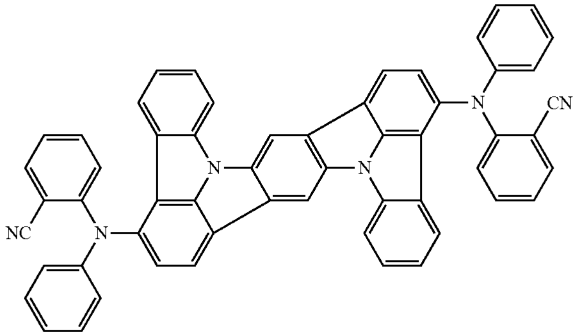
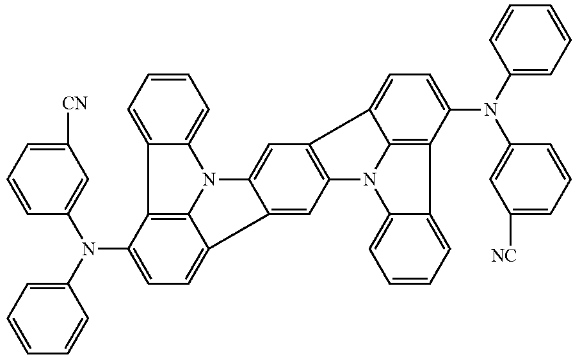
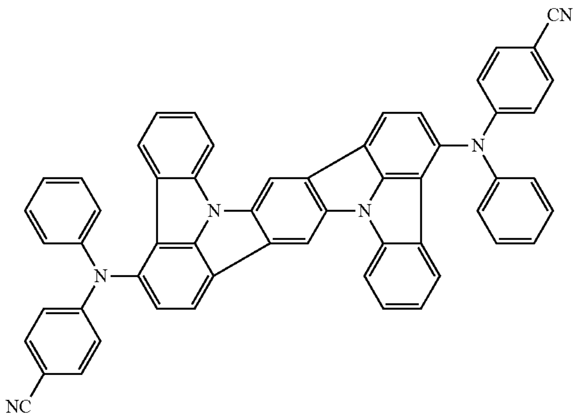

-continued
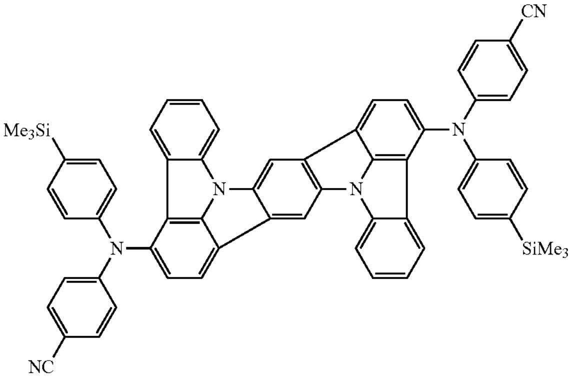
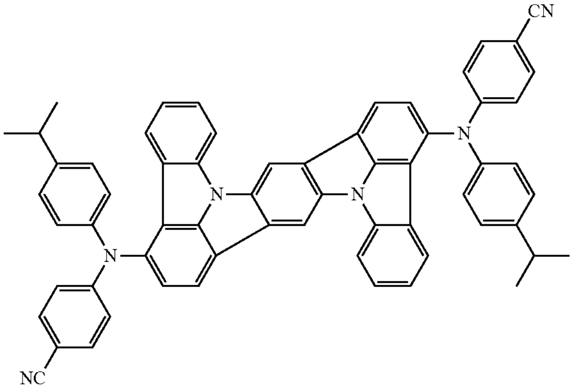
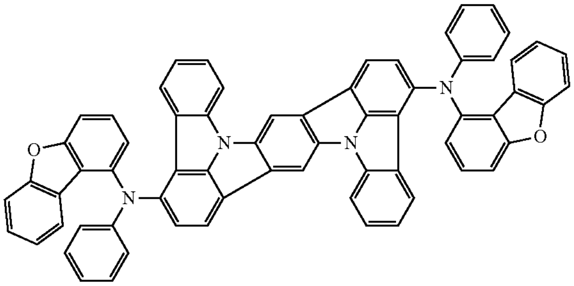
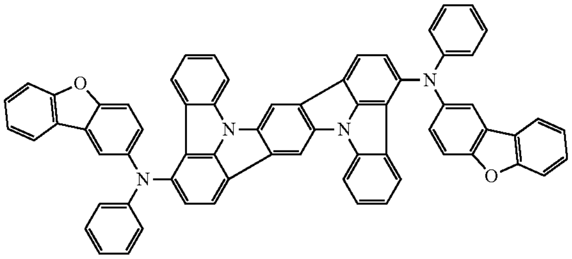
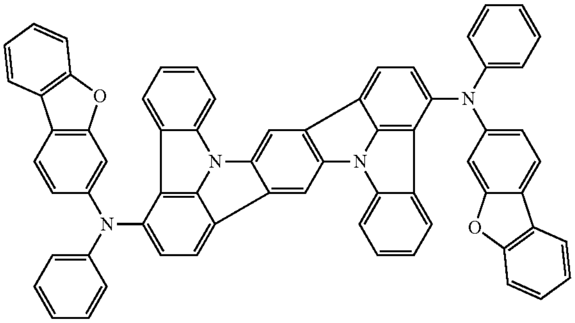
-continued
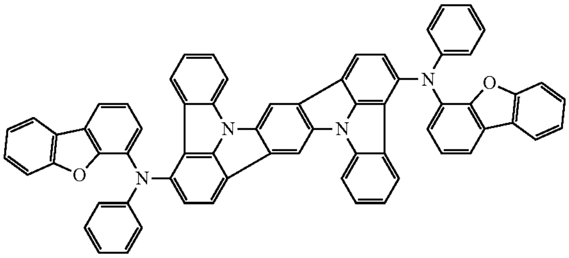
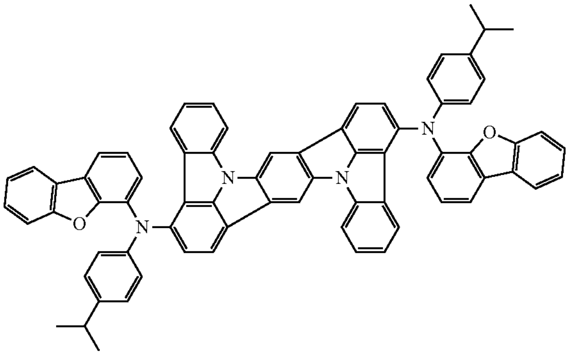
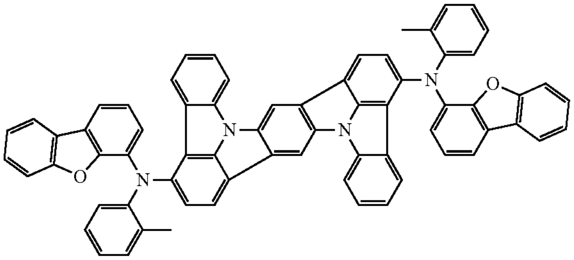
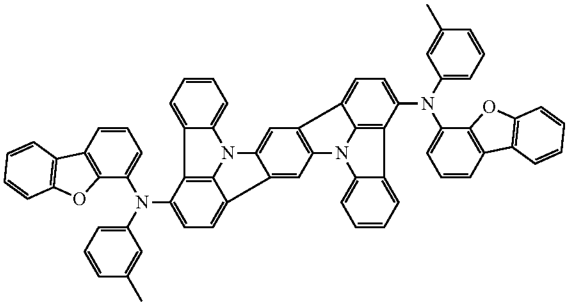
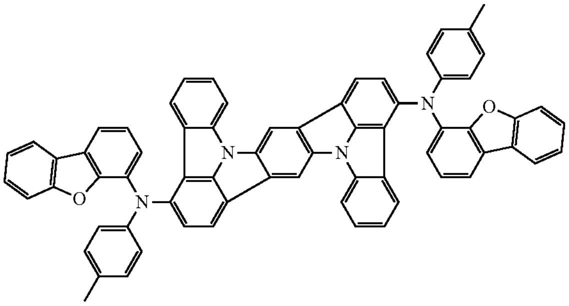

-continued
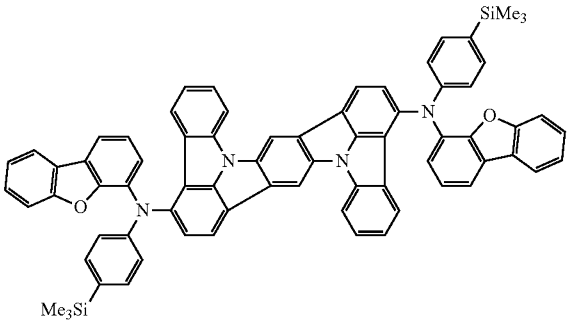
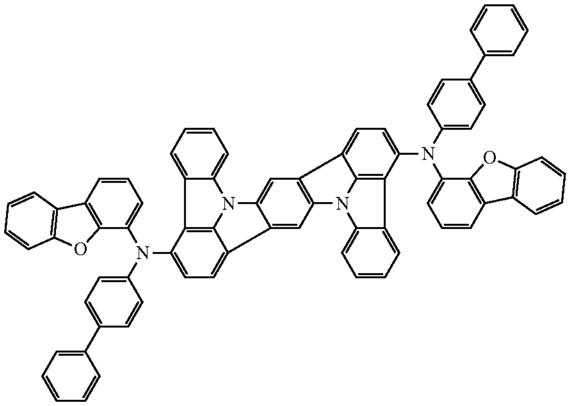
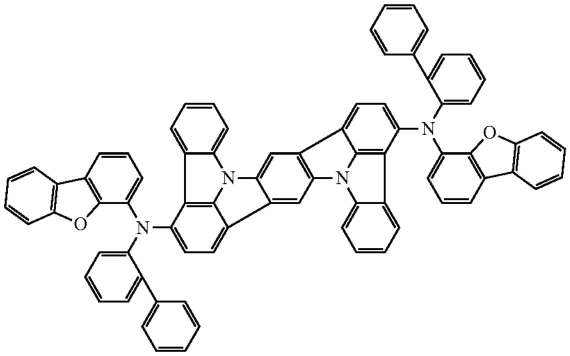
[Formula 368]
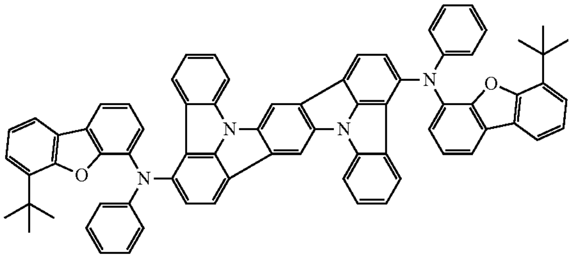
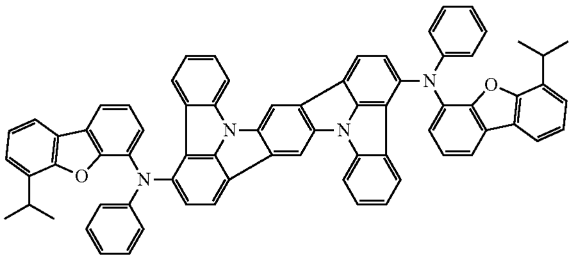
-continued
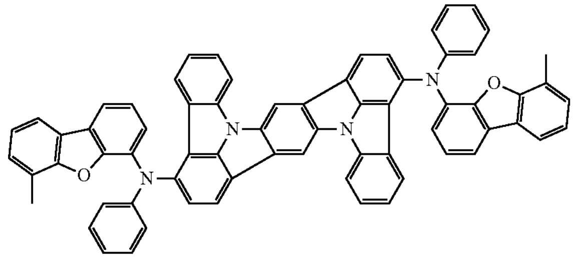
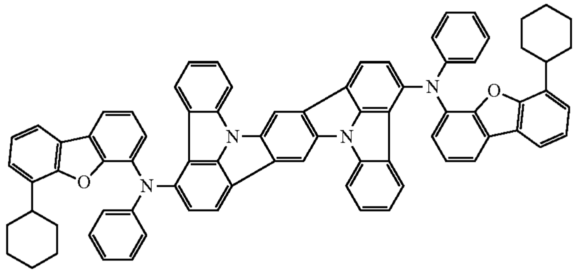
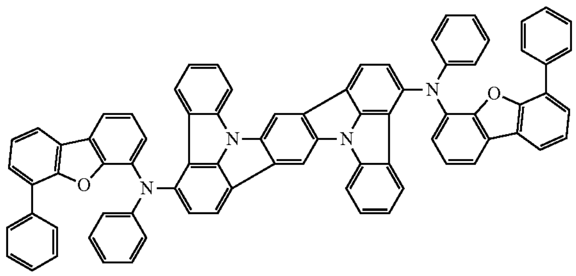
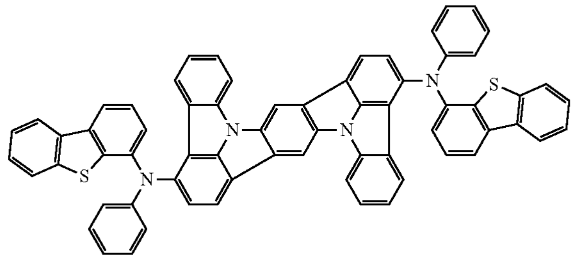
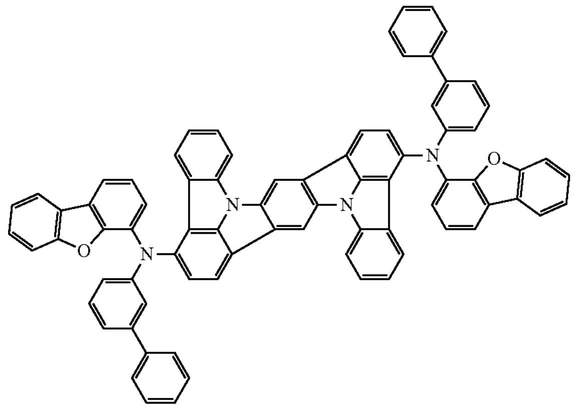
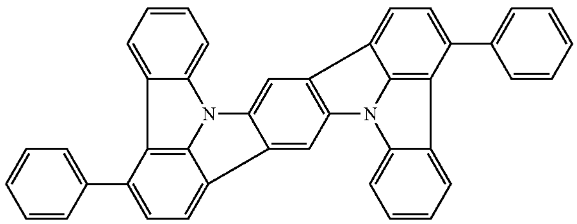

-continued
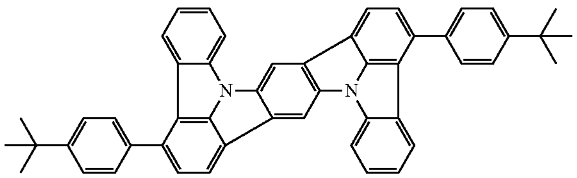
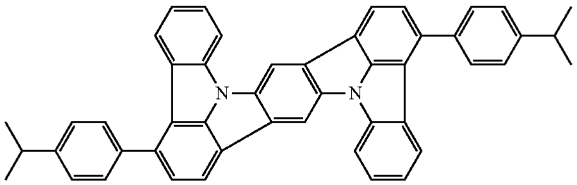
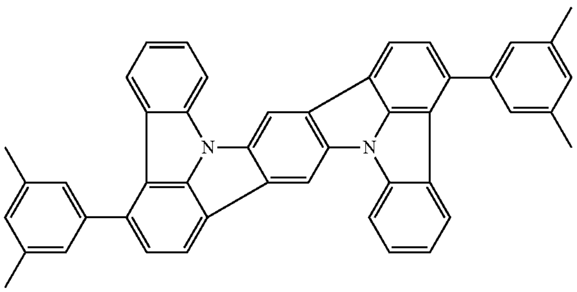
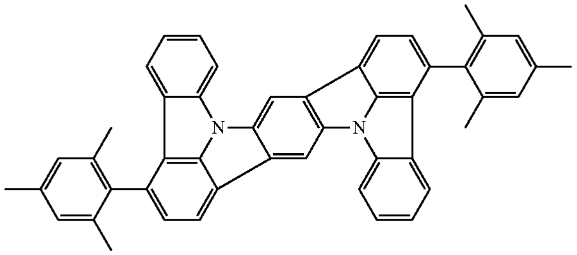
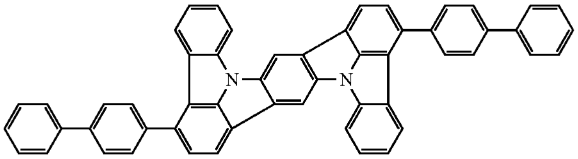
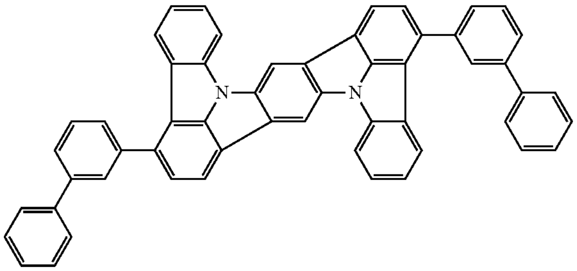
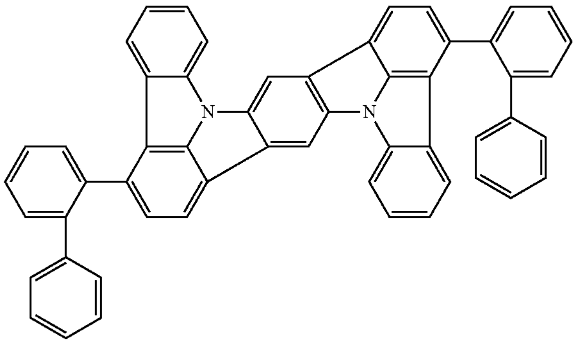
-continued
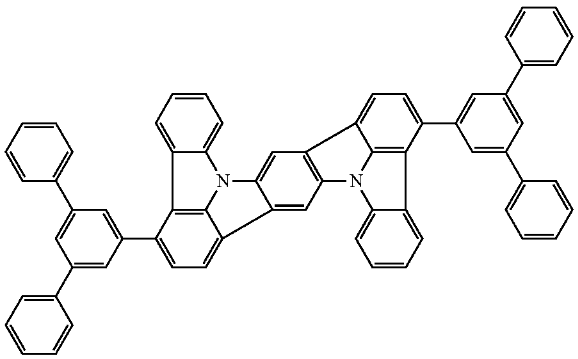
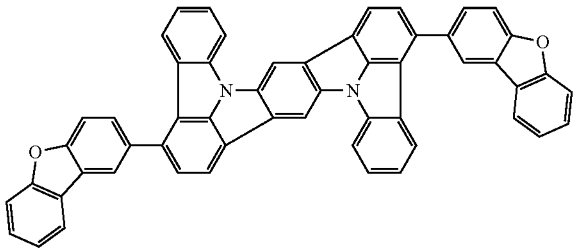
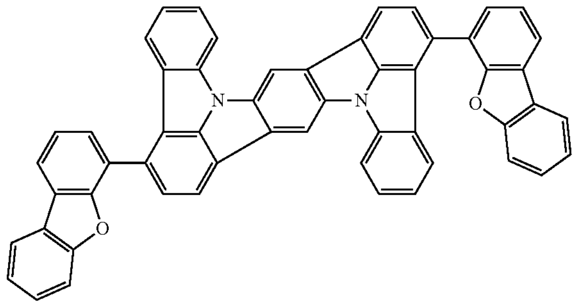
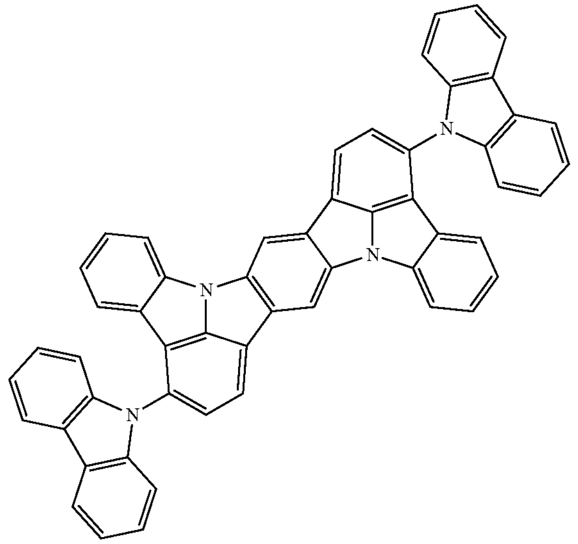
[Formula 369]
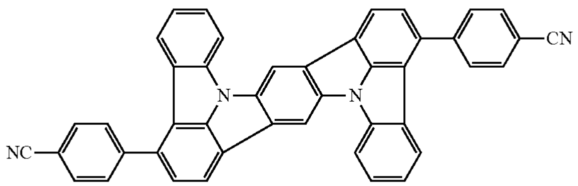

-continued
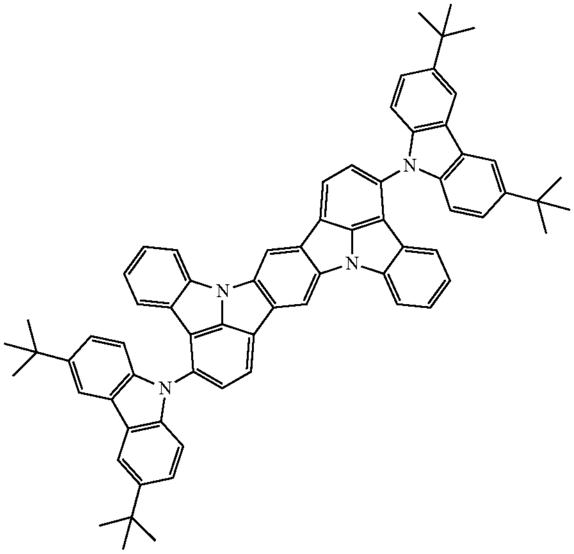
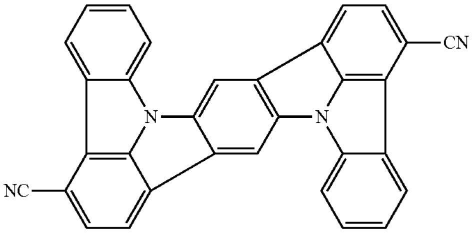
[Formula 370]
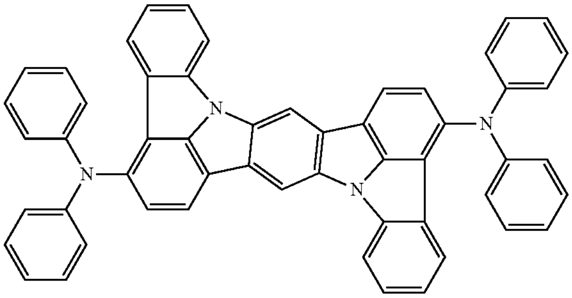
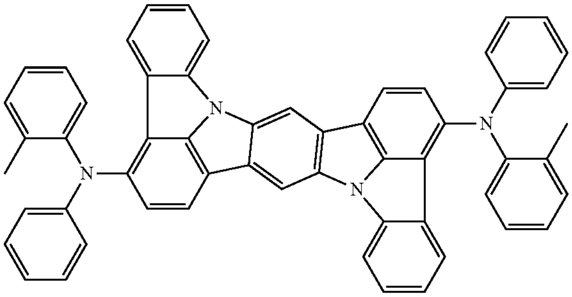
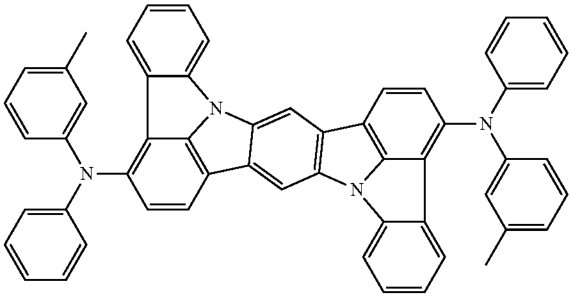
-continued
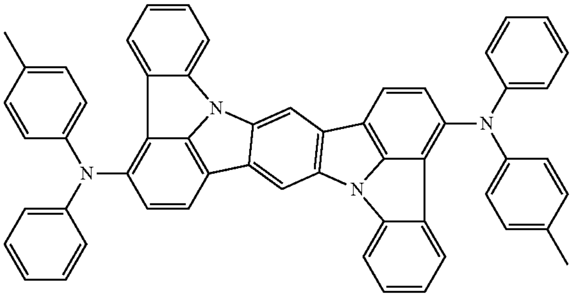
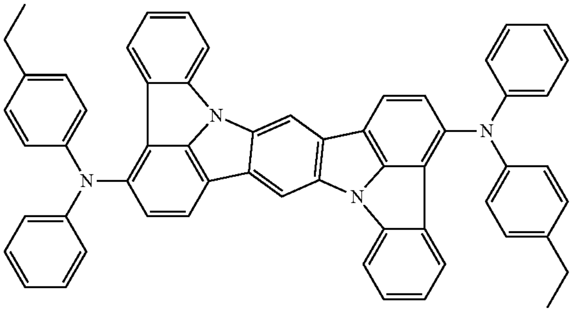
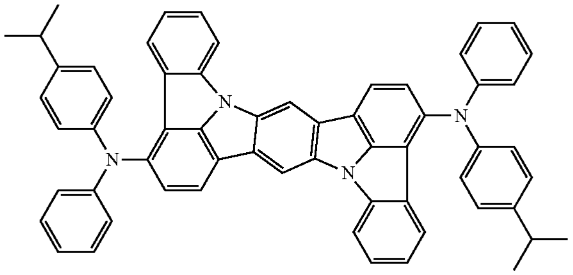
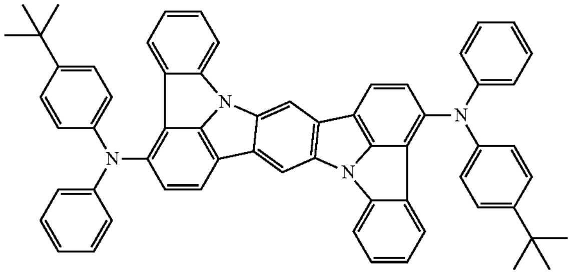
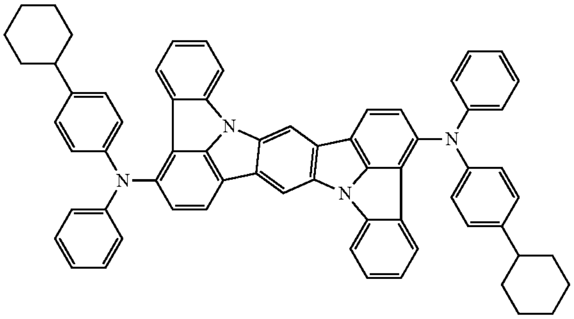

-continued
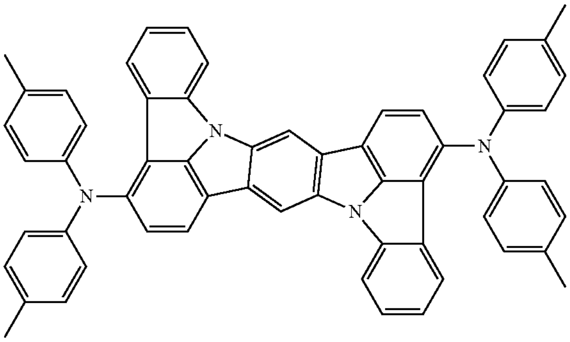
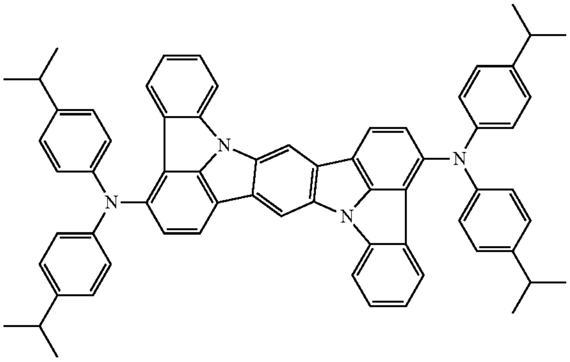
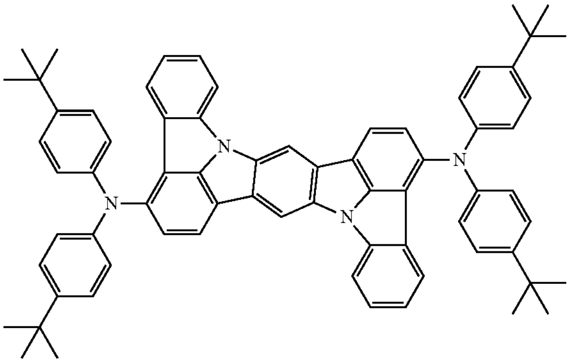
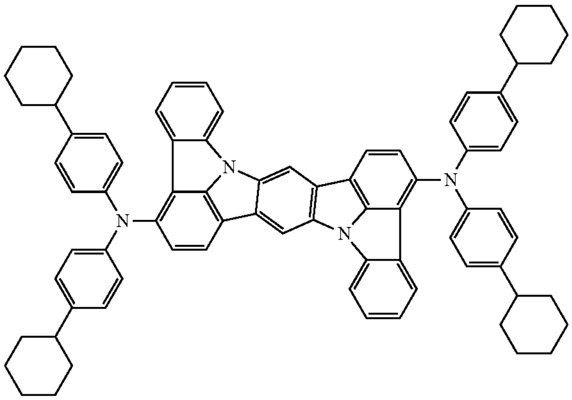
-continued
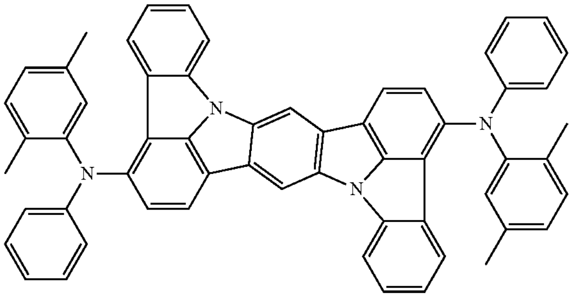
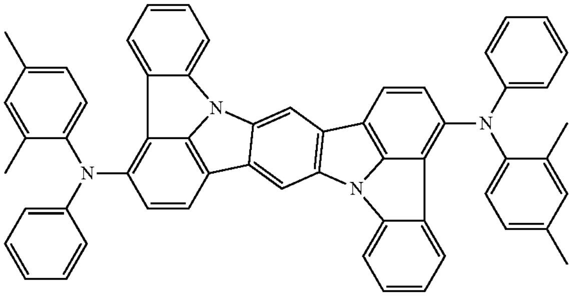
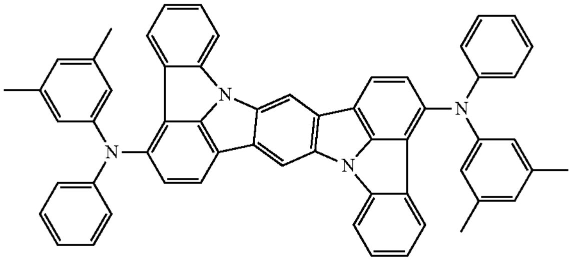
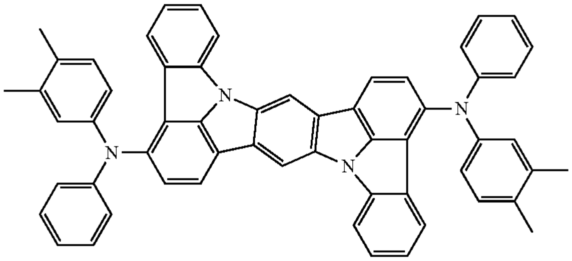
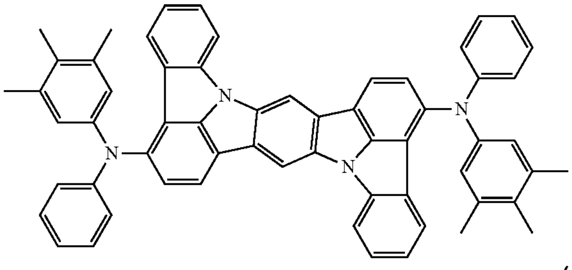
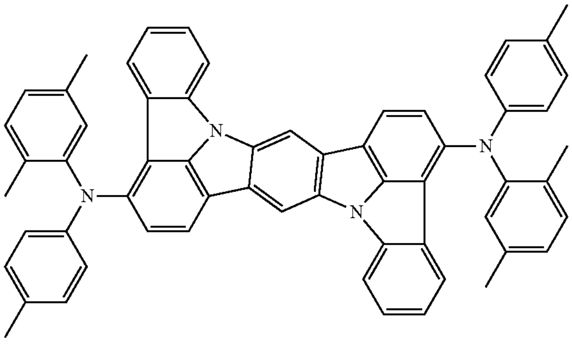

-continued
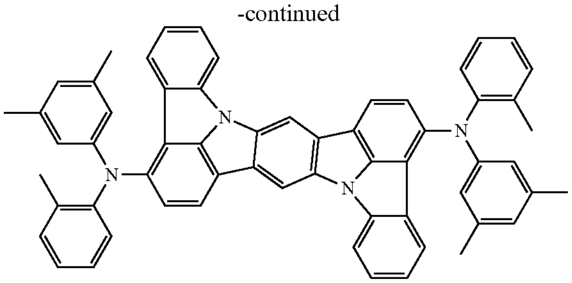
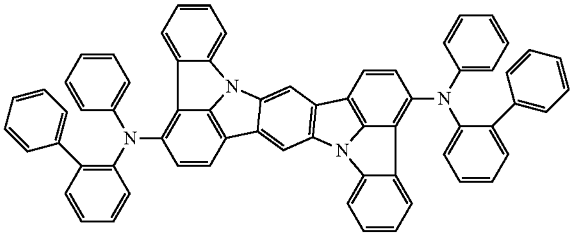
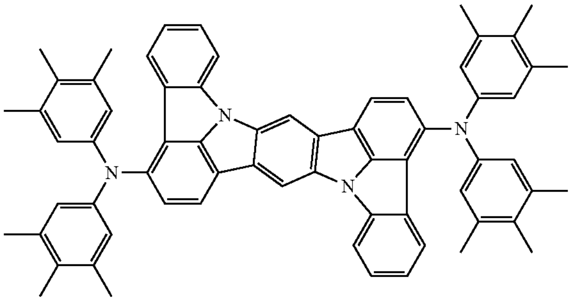
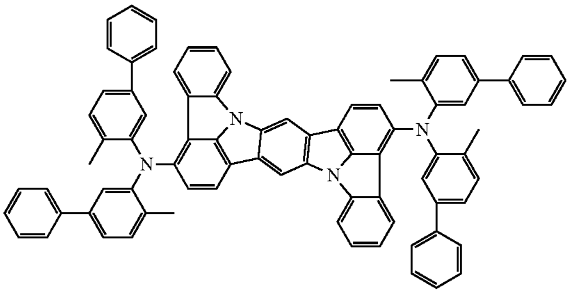
-continued
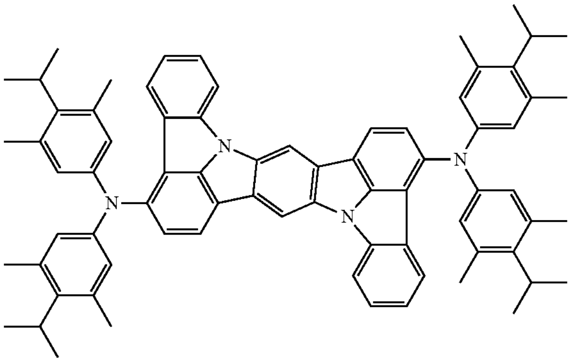
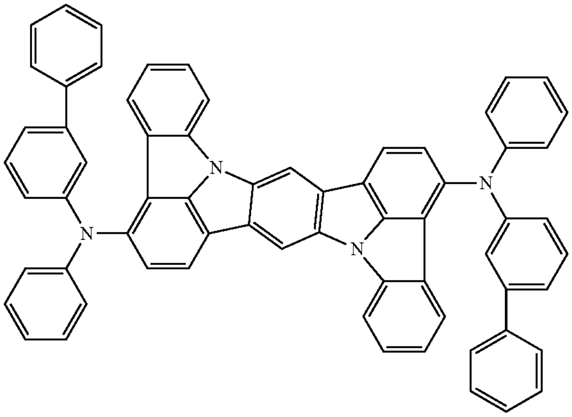
[Formula 371]
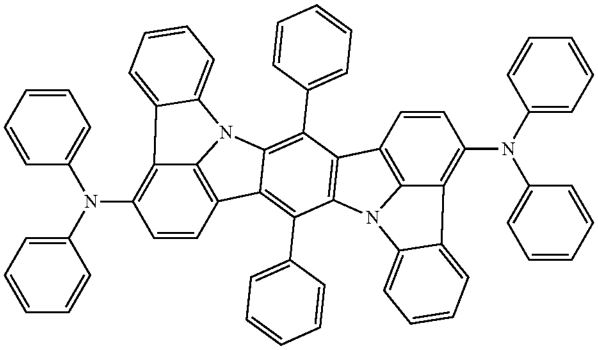

-continued
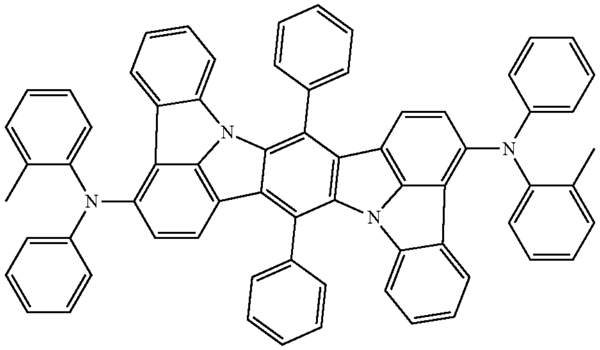
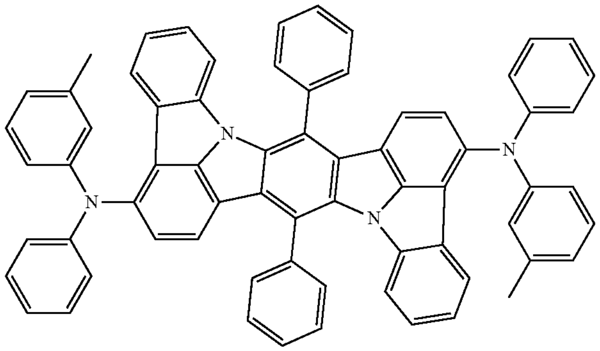
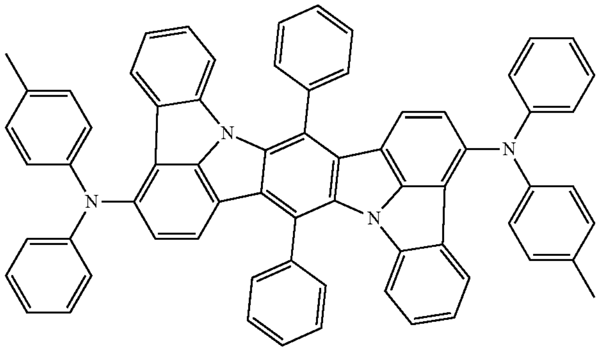
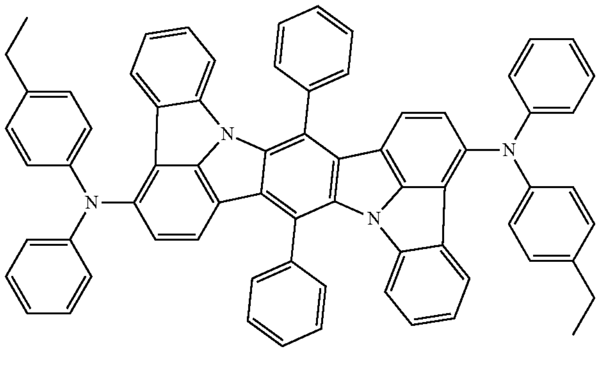

-continued
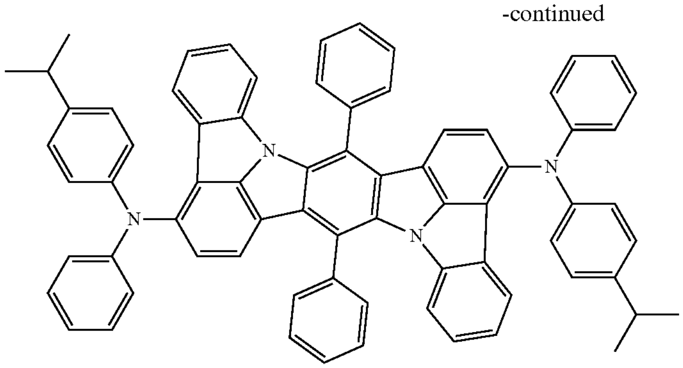
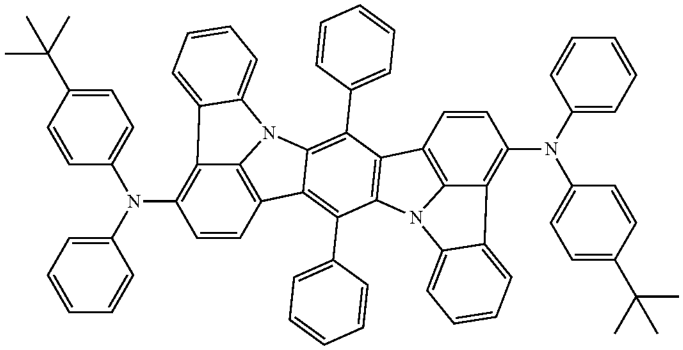
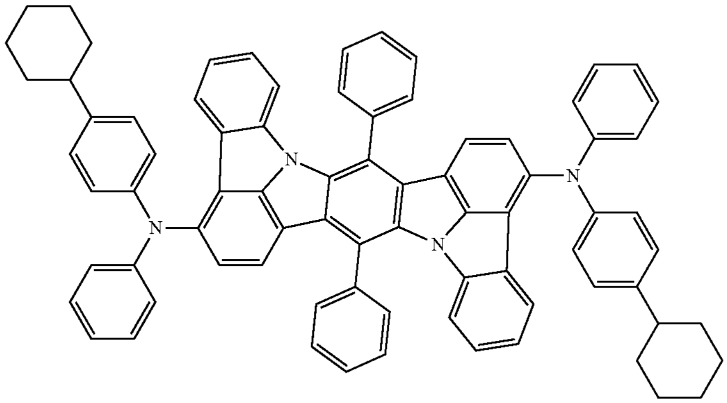
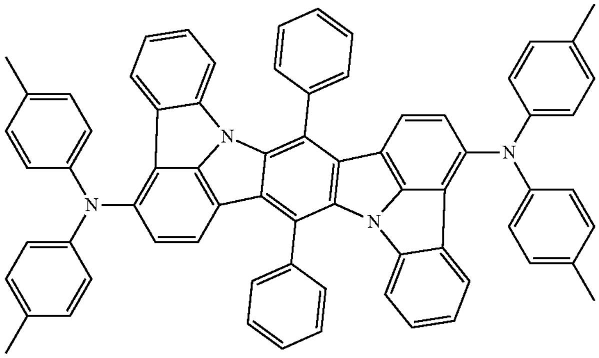

-continued
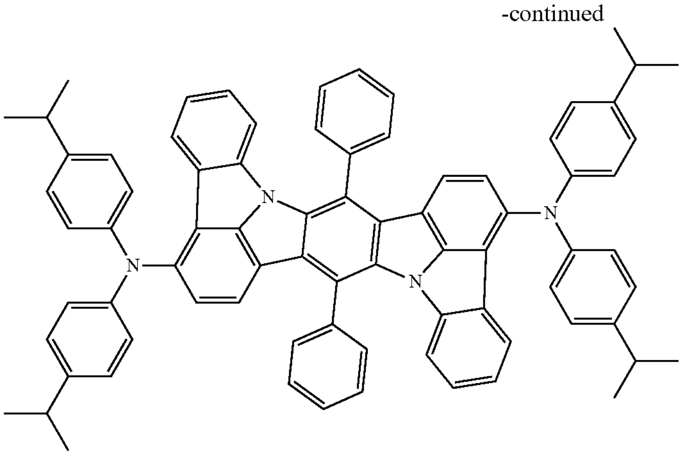
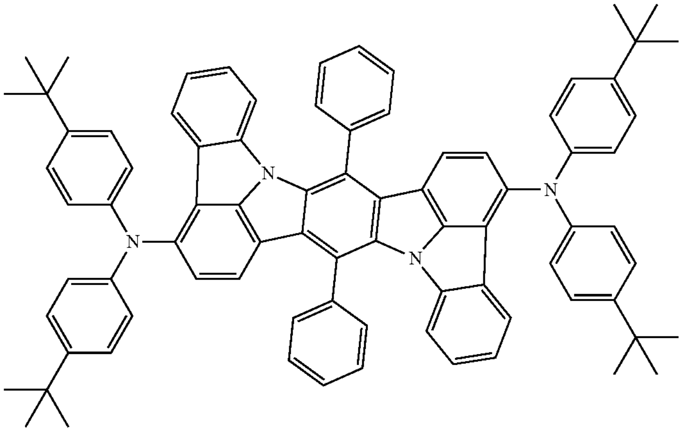
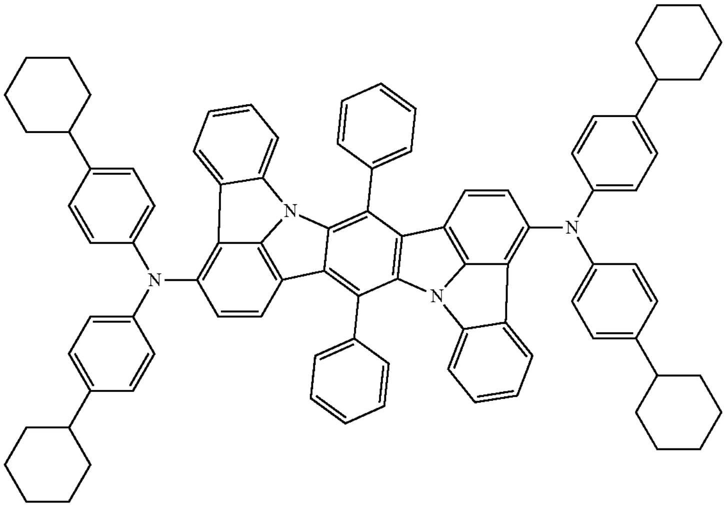
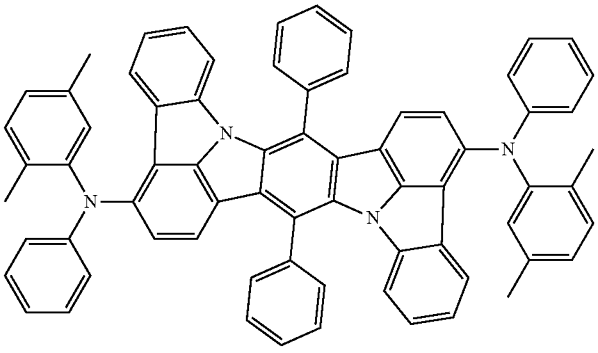

-continued
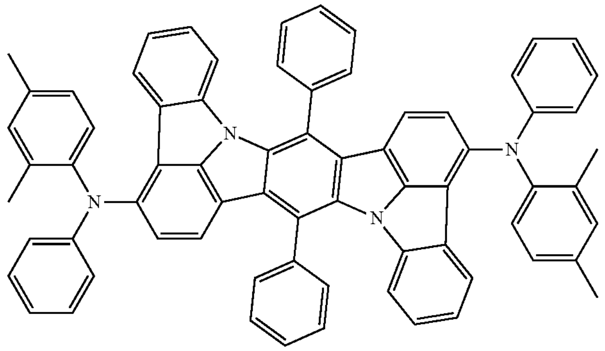
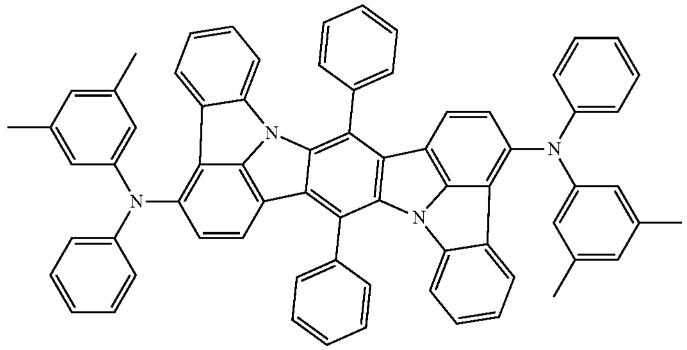
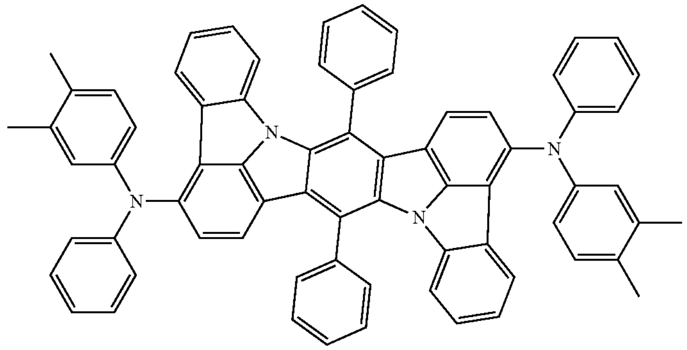
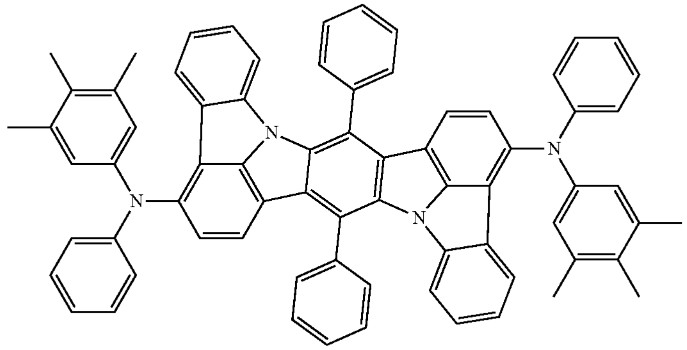

-continued
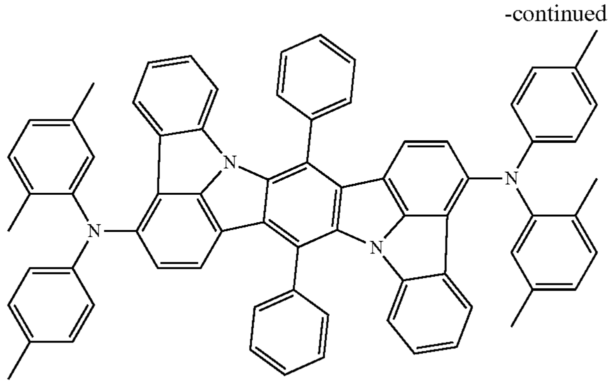
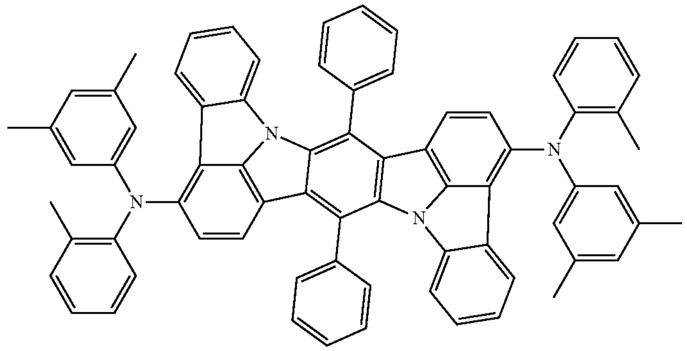
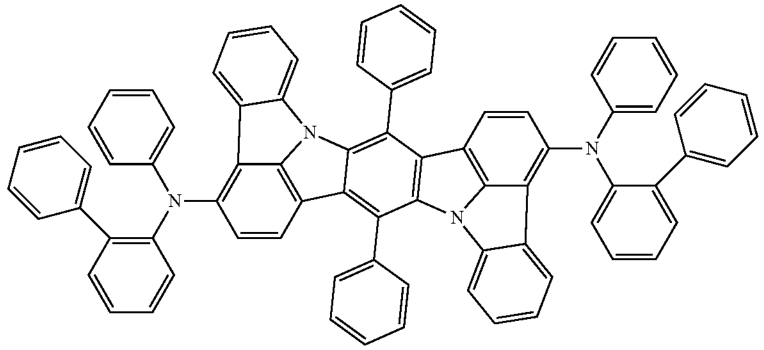
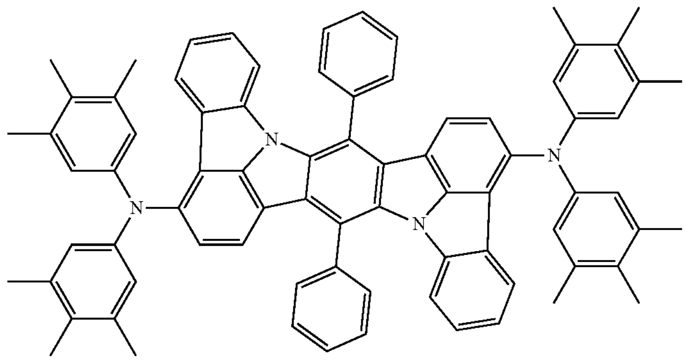

-continued
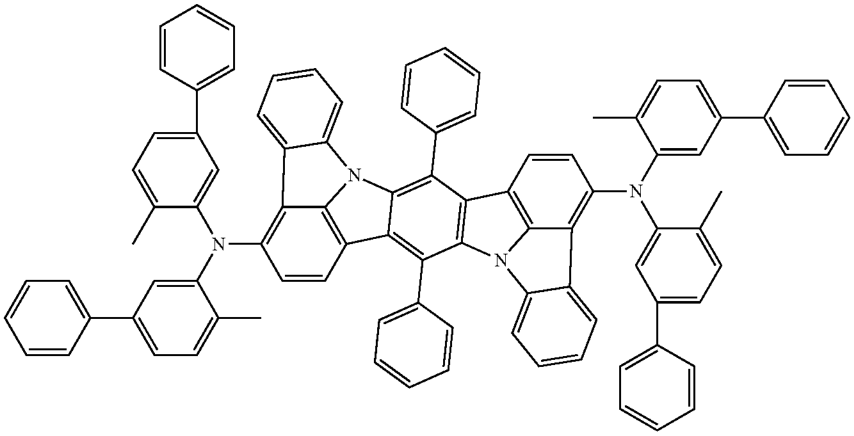
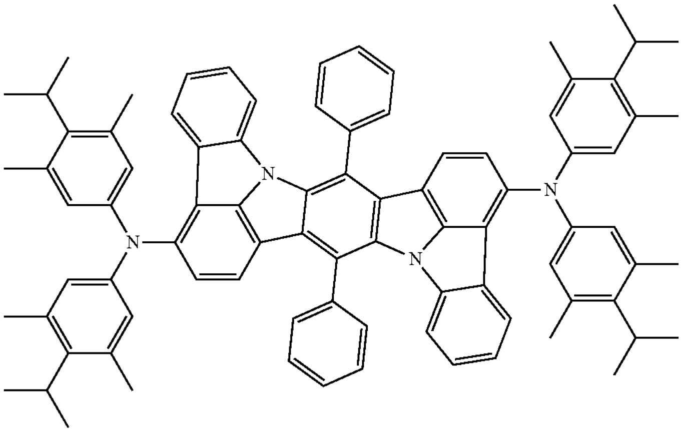
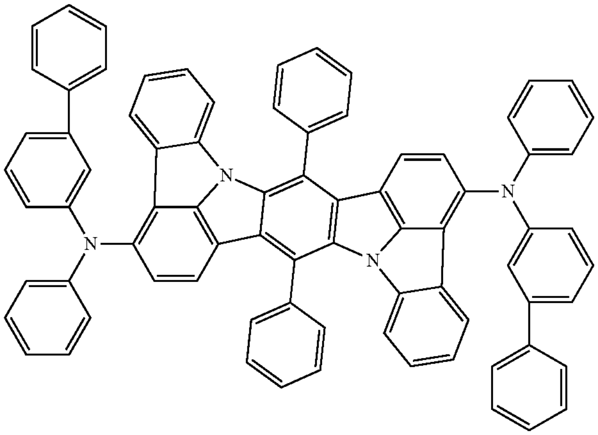
[Formula 372]
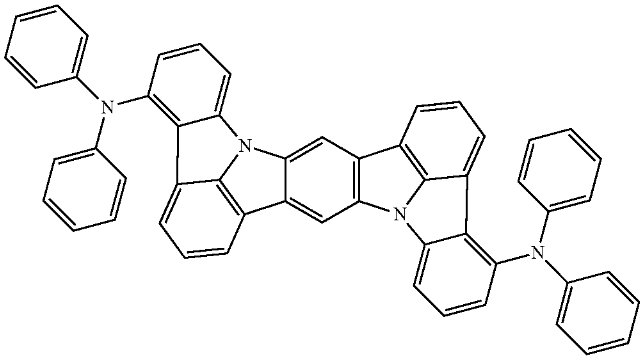

-continued
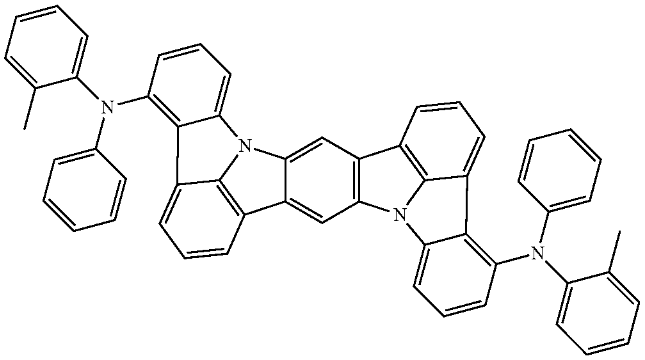
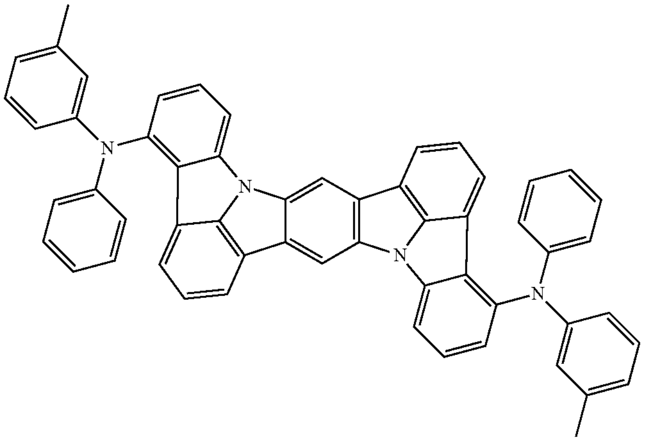
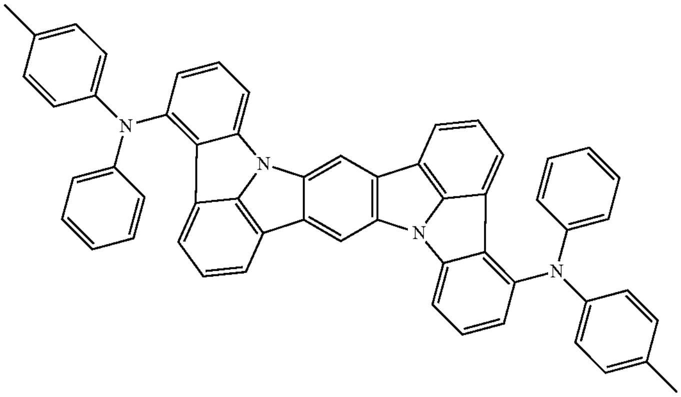
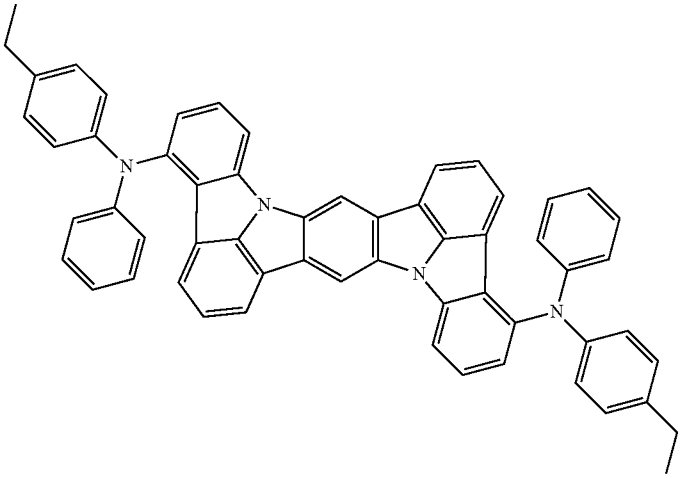

-continued
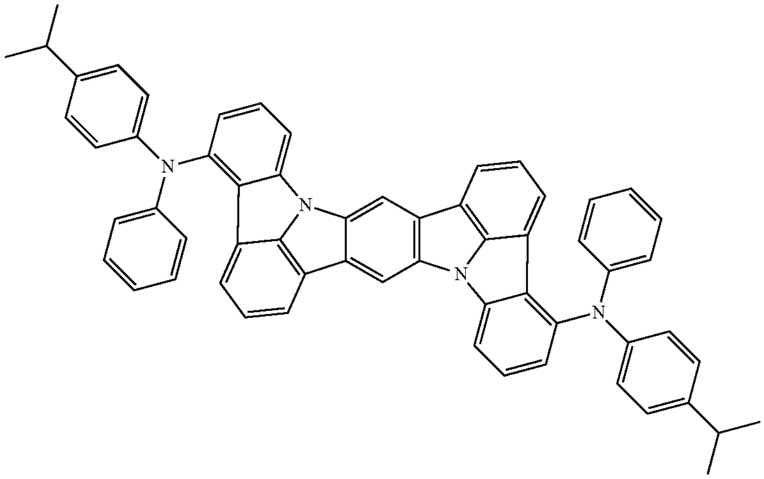
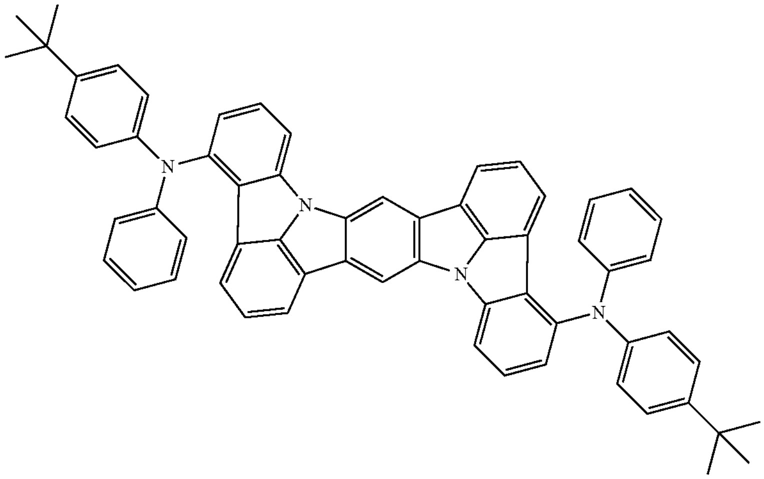
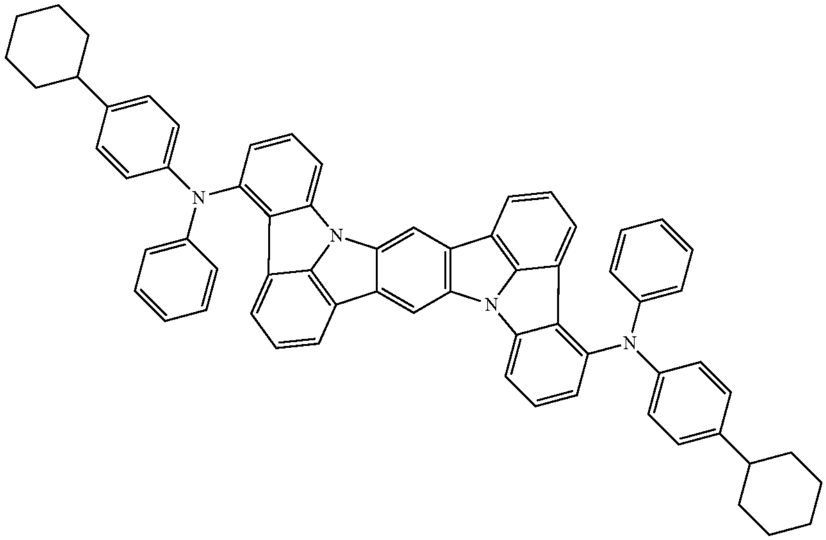

-continued
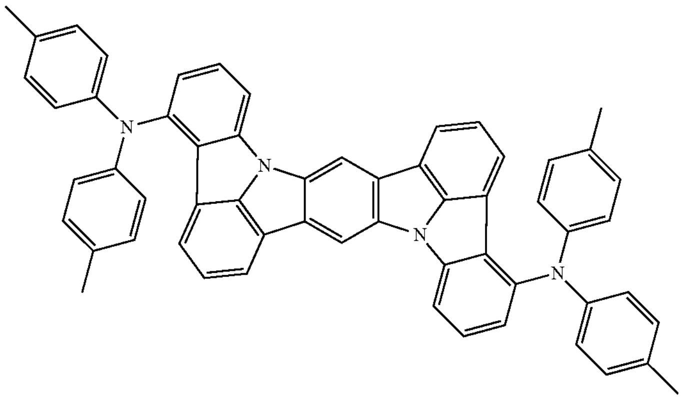
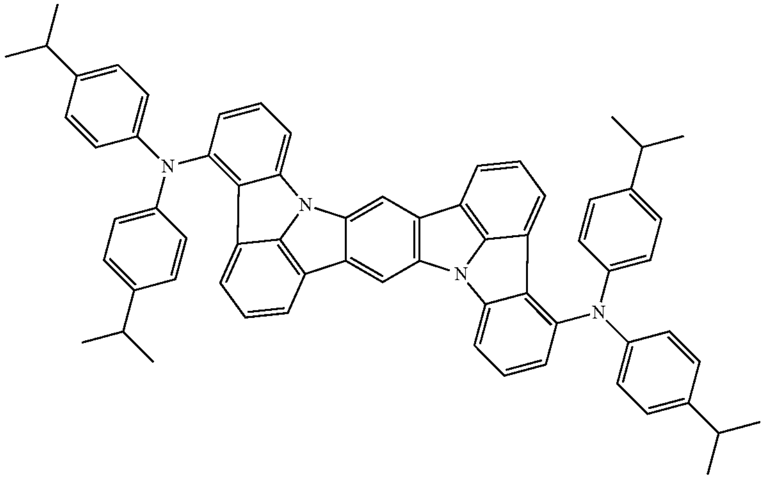
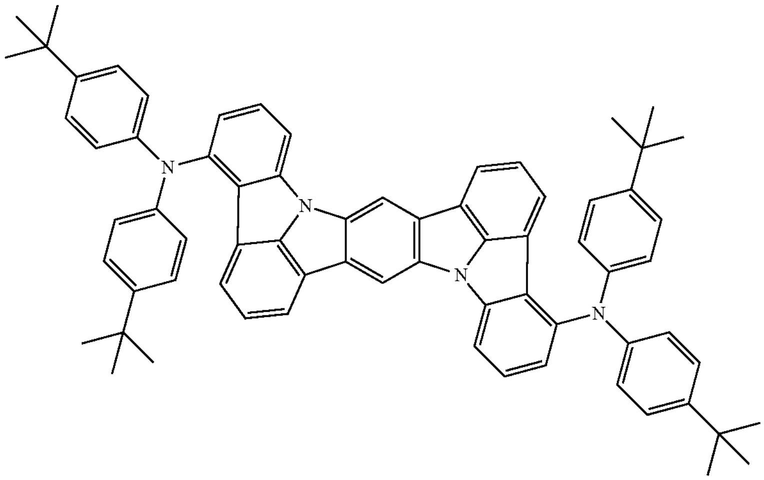

-continued
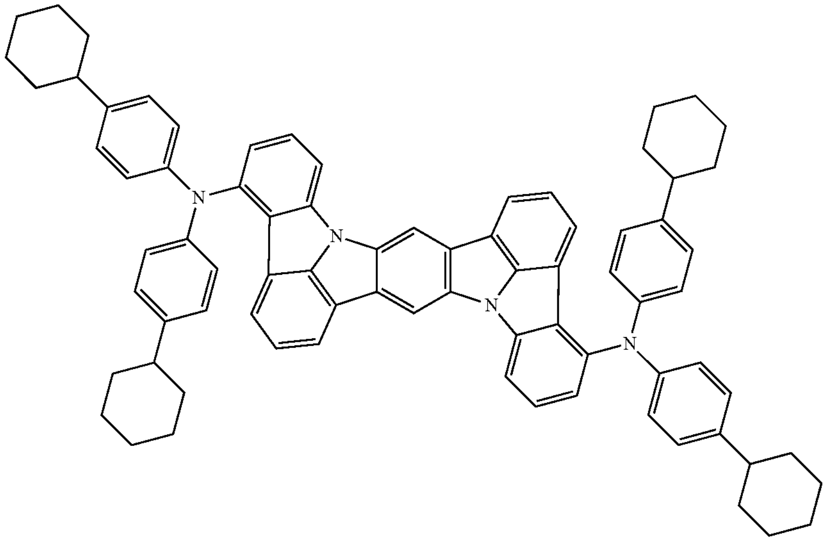
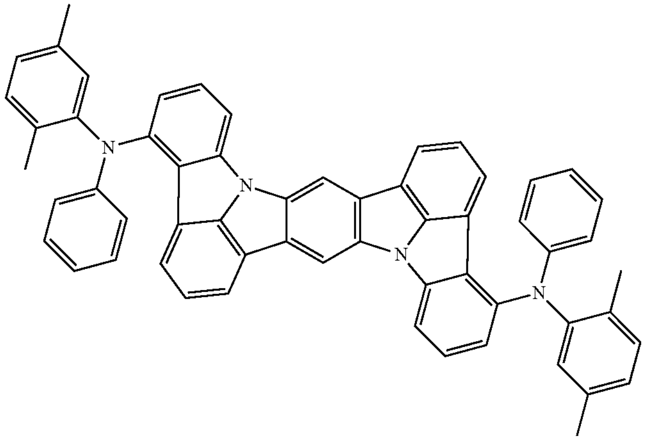
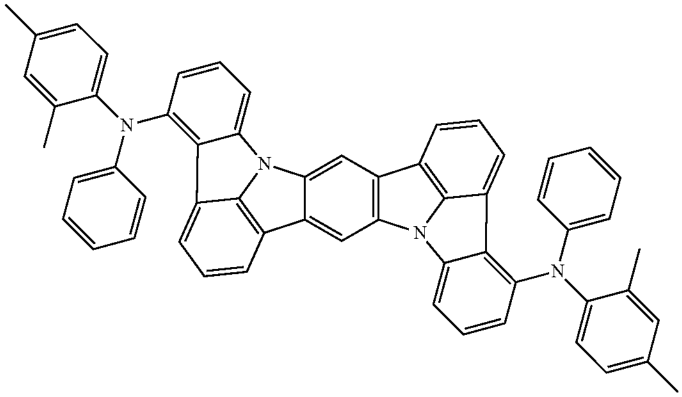

-continued
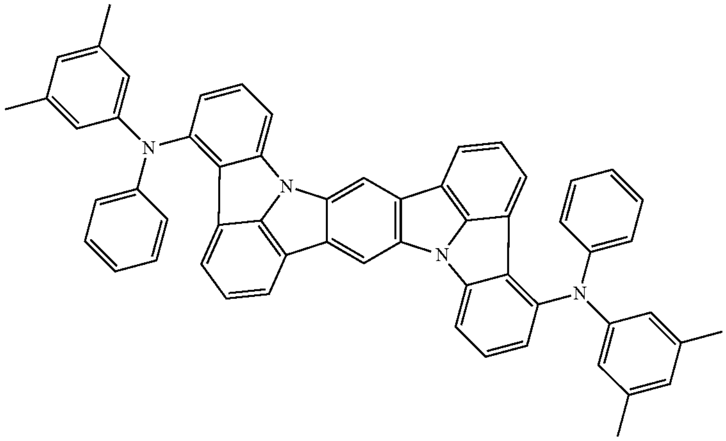
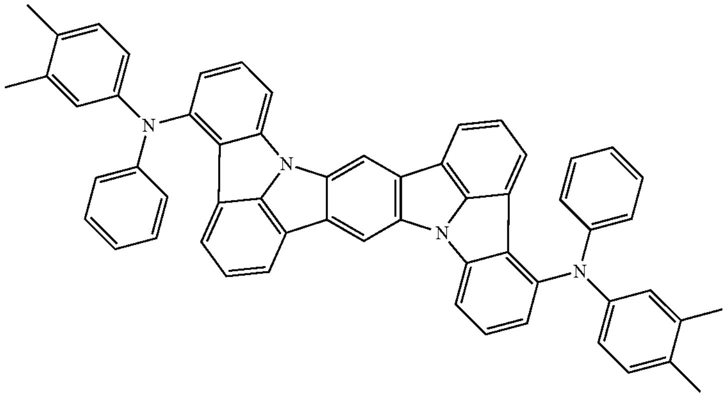
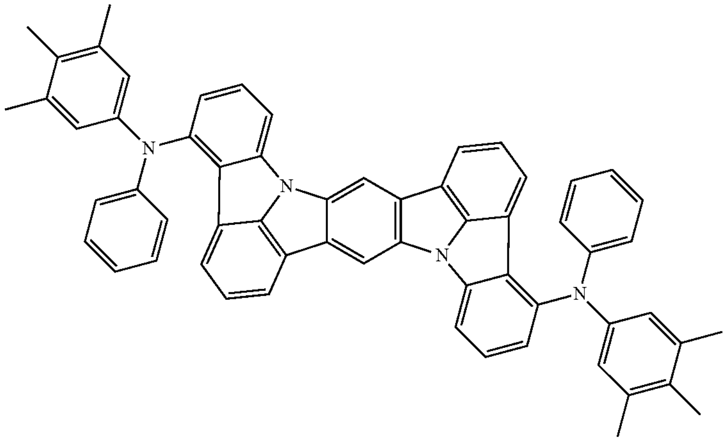
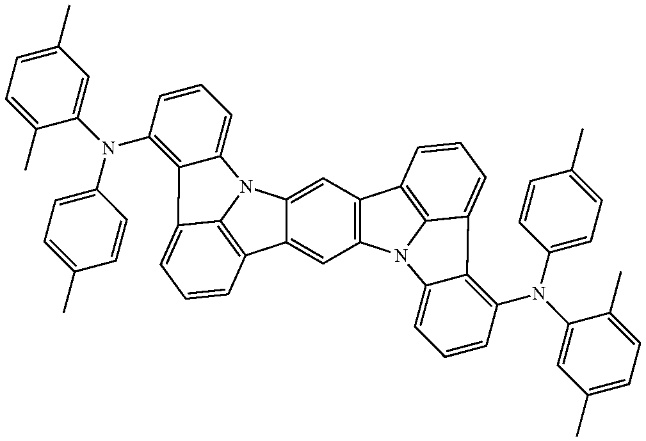

-continued
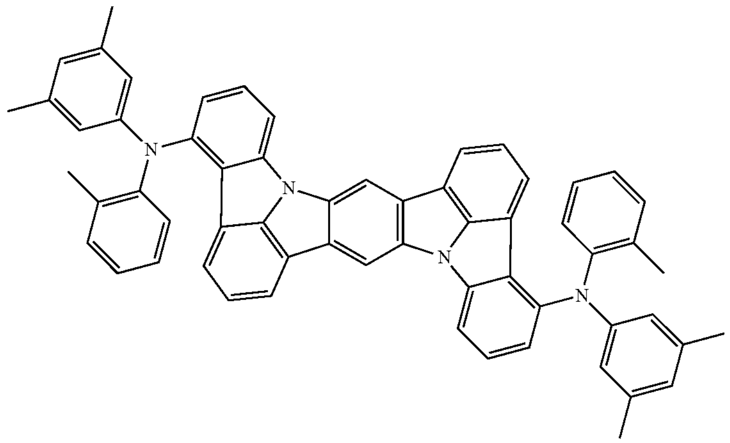
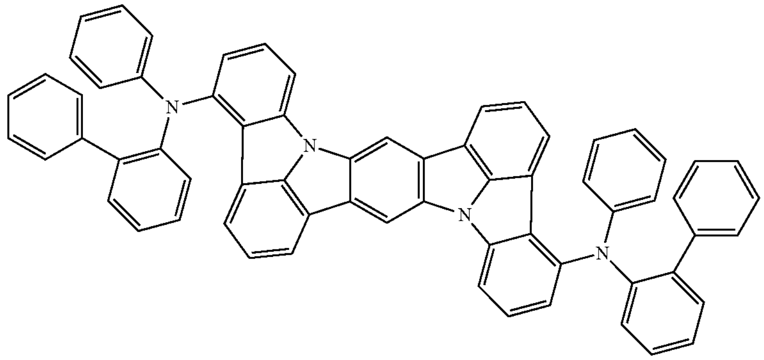
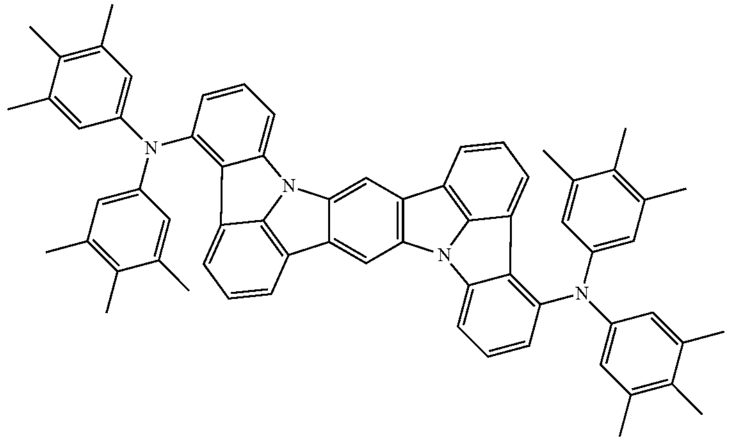

-continued
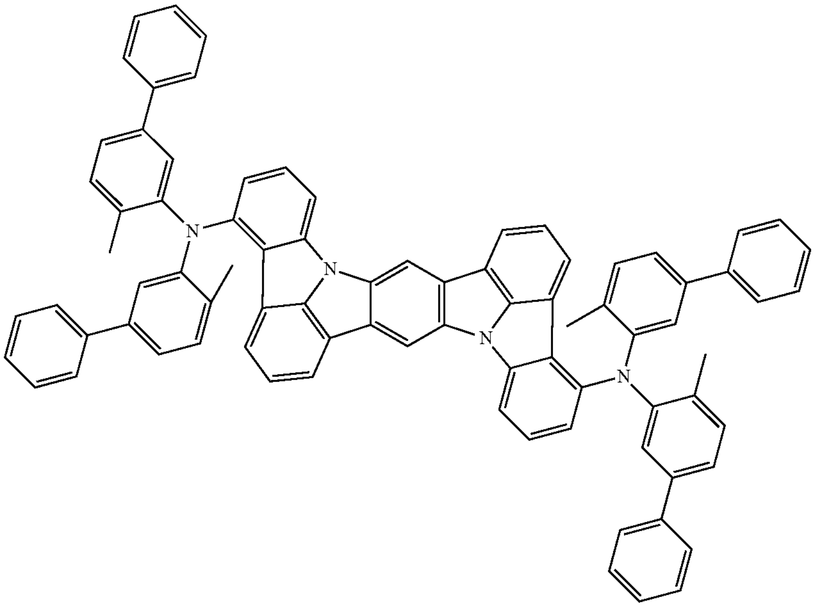
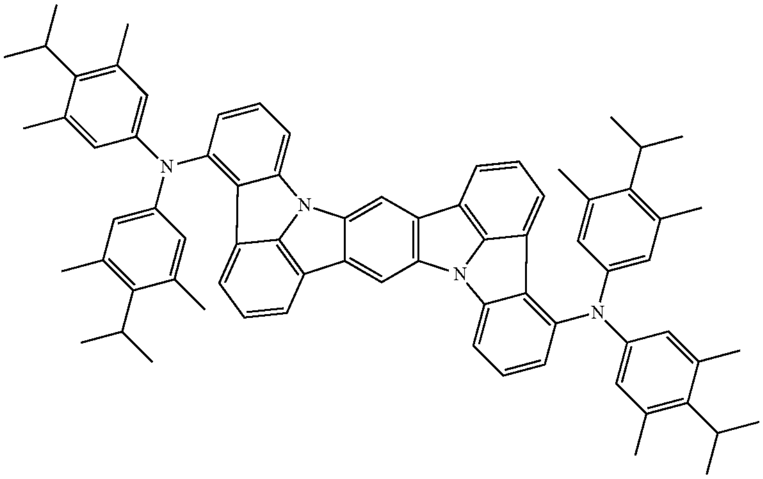
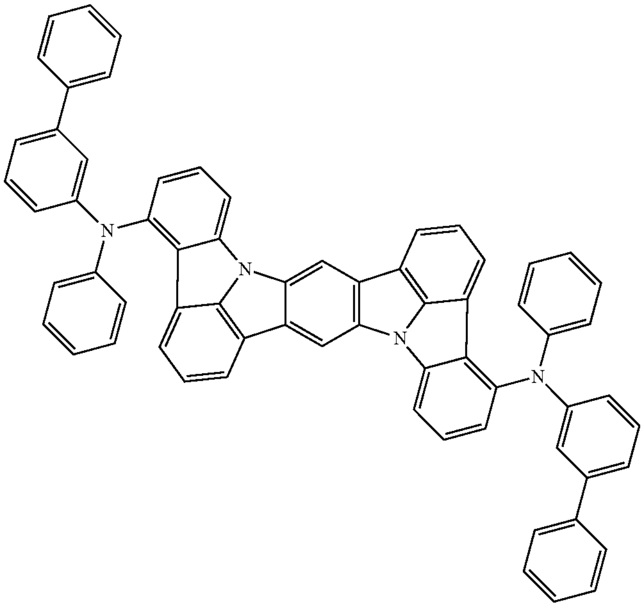

-continued
[Formula 373]
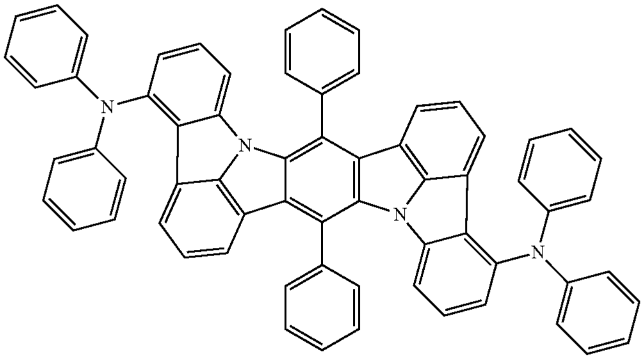
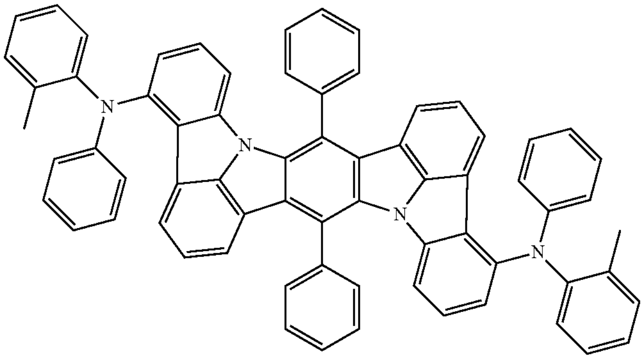
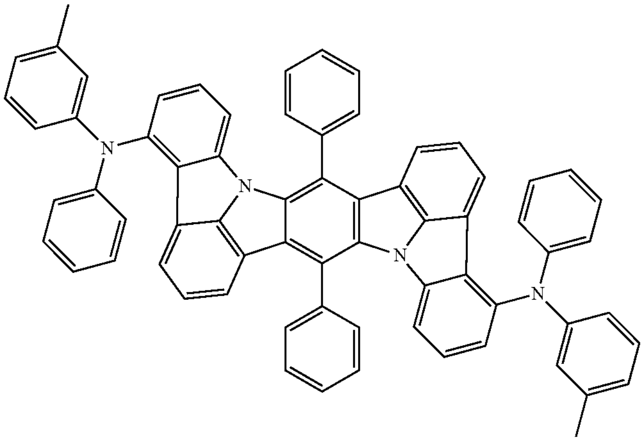
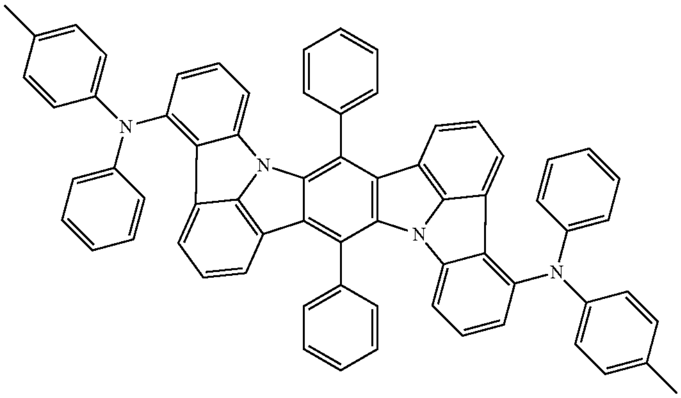

-continued
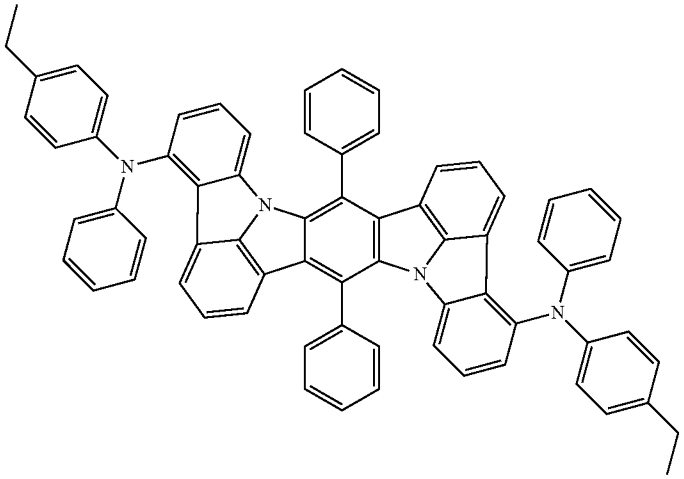
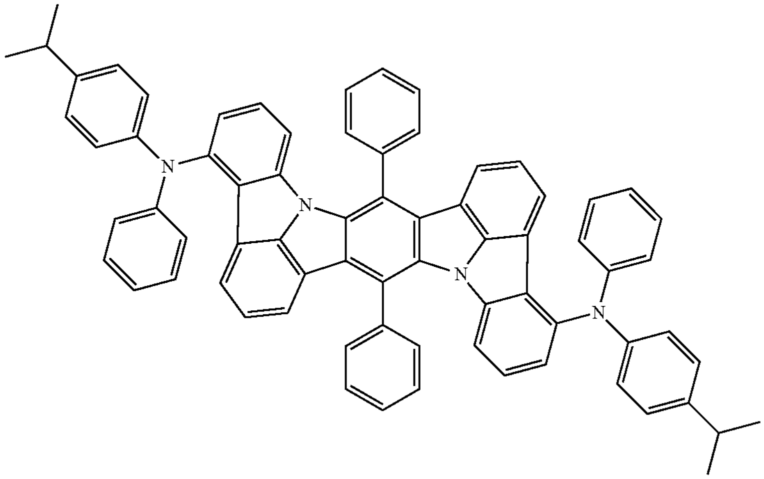
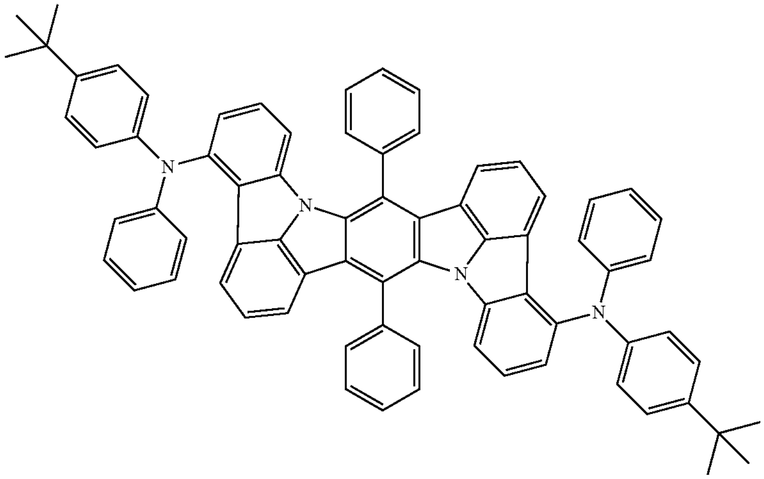

-continued
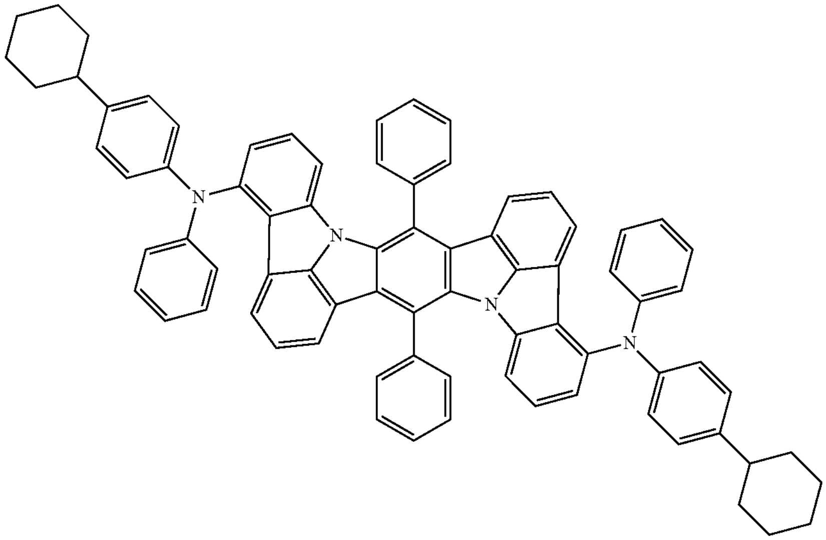
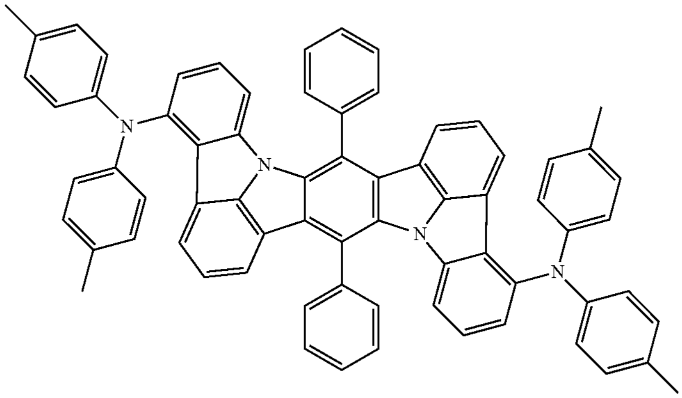
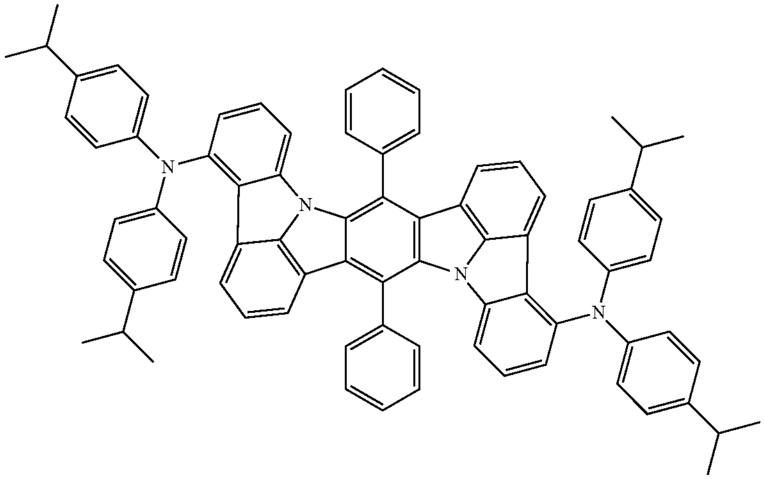

-continued
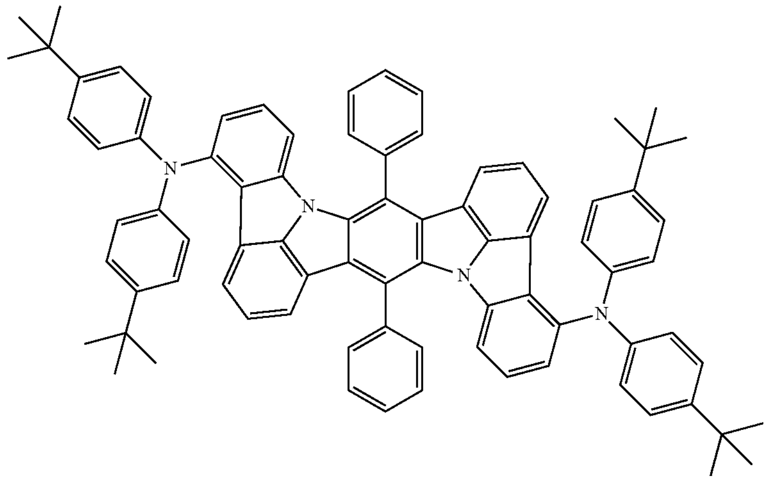
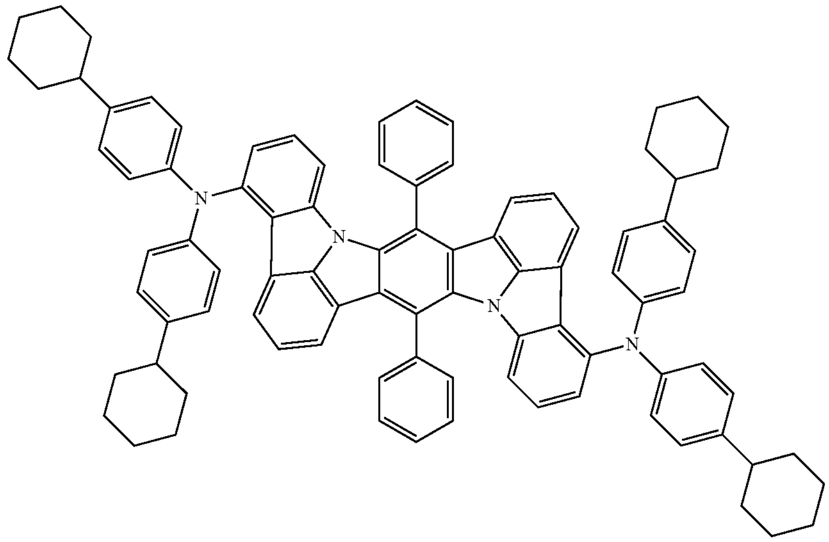
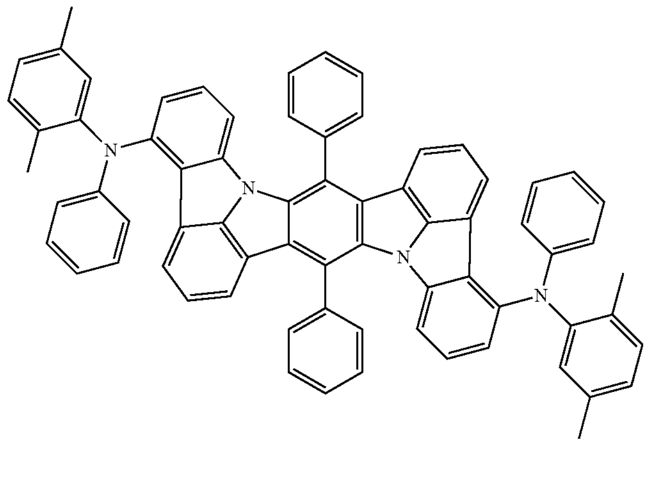

-continued
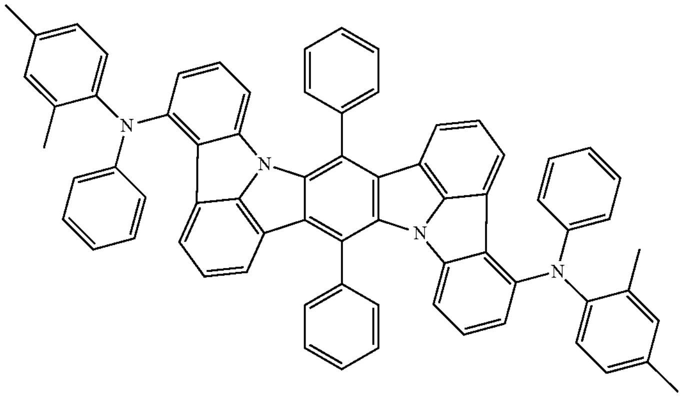
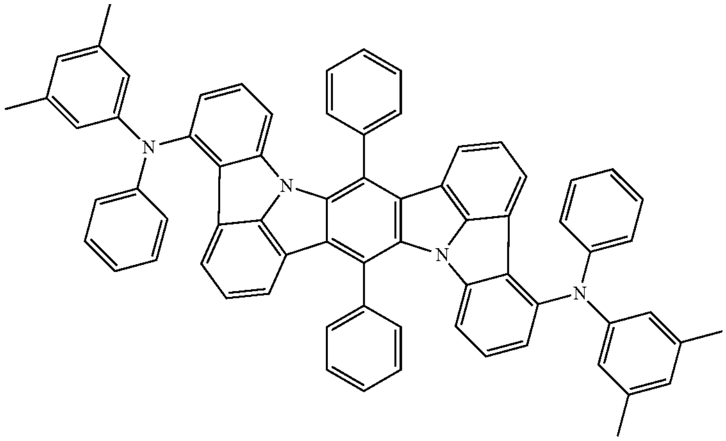
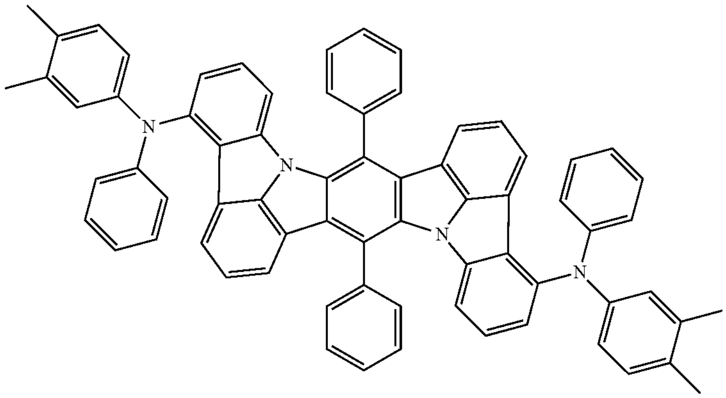
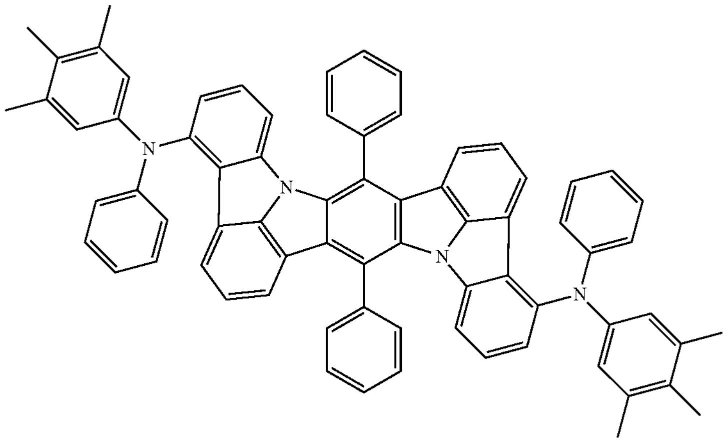

-continued
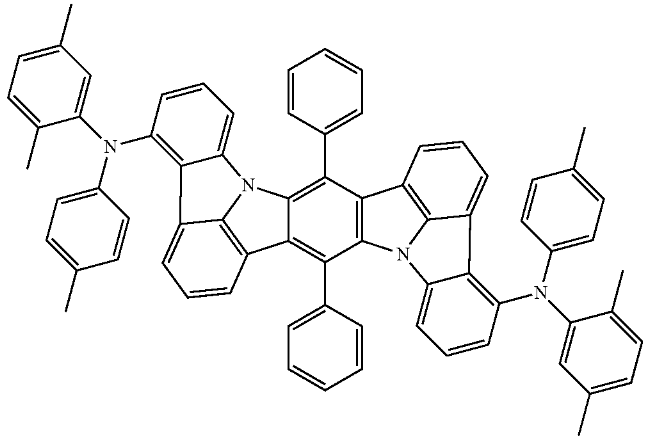
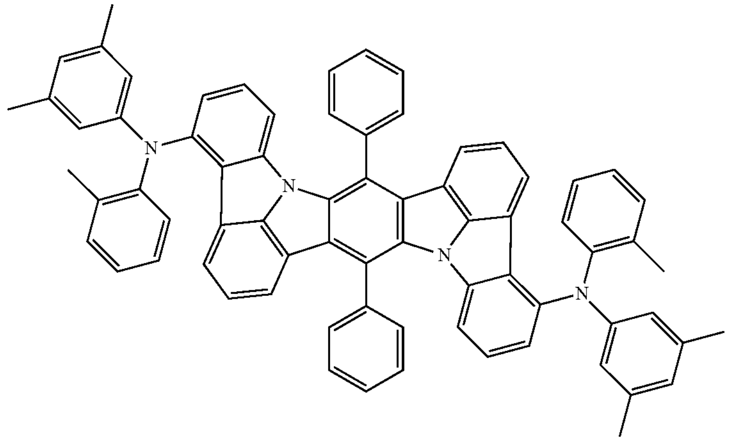
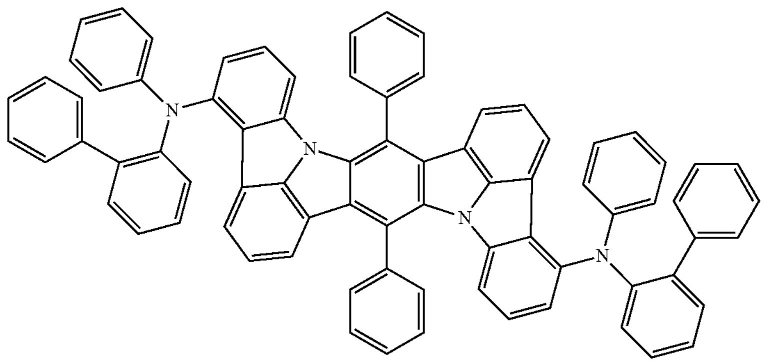
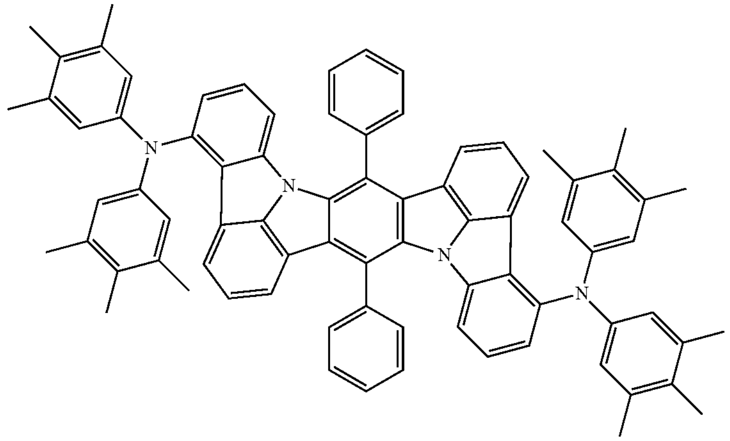

-continued
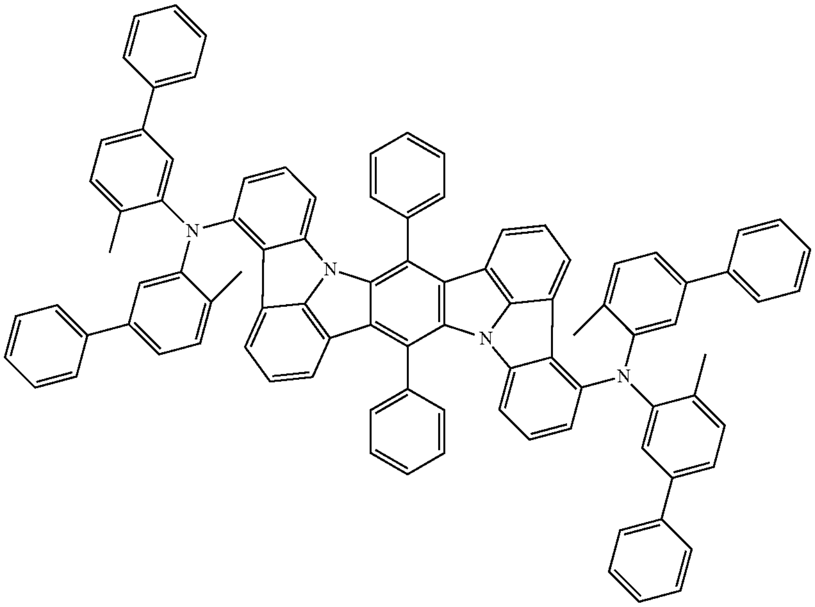
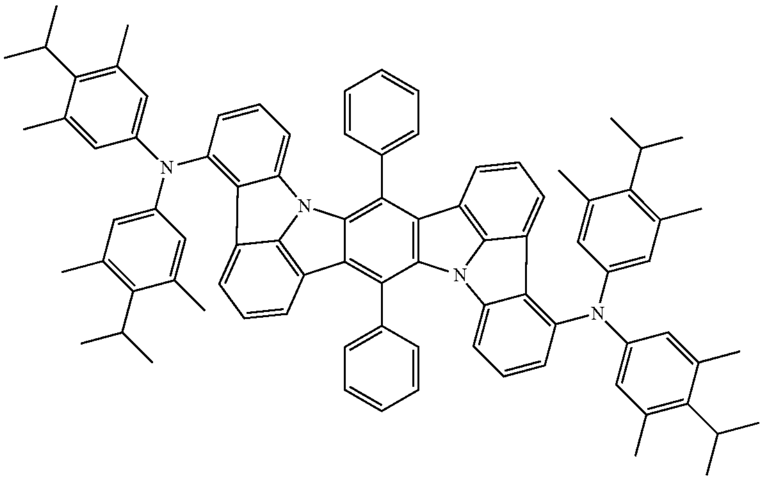
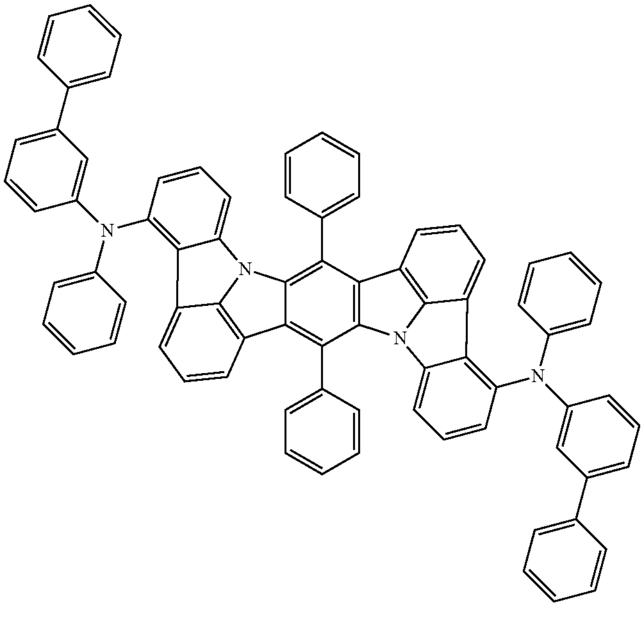

-continued
[Formula 374]
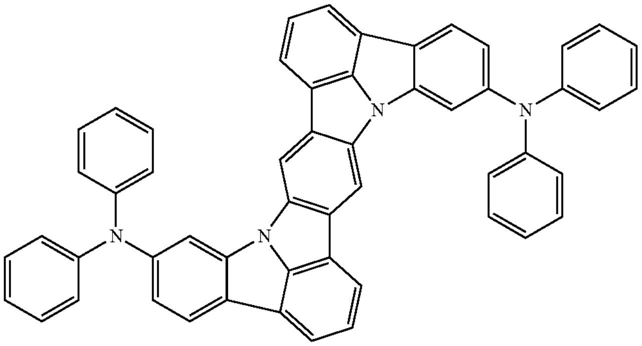
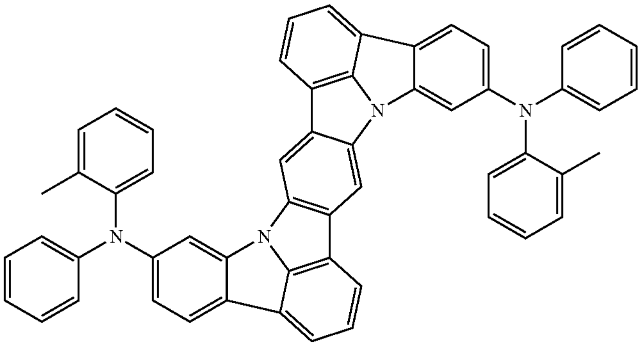
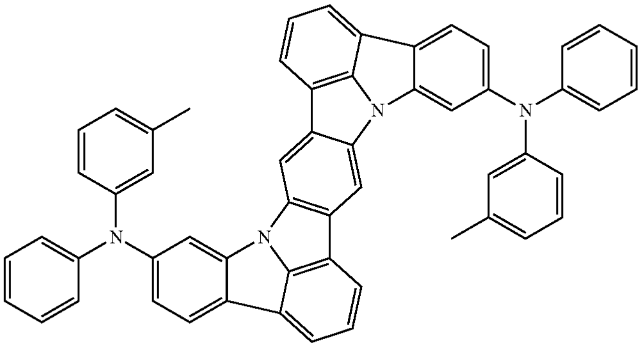
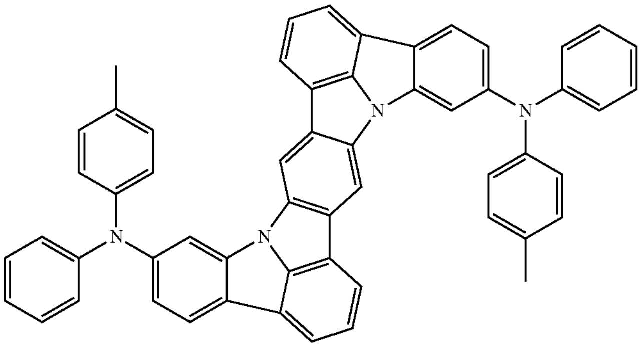

-continued
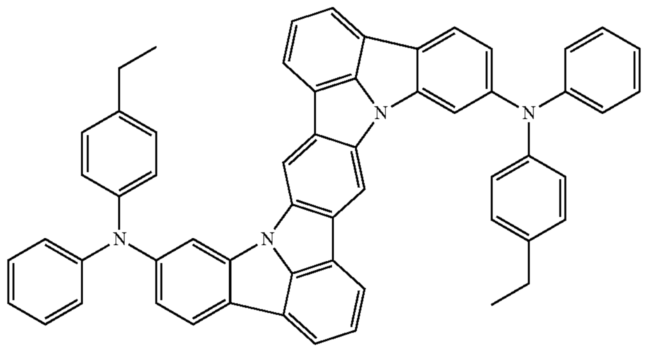
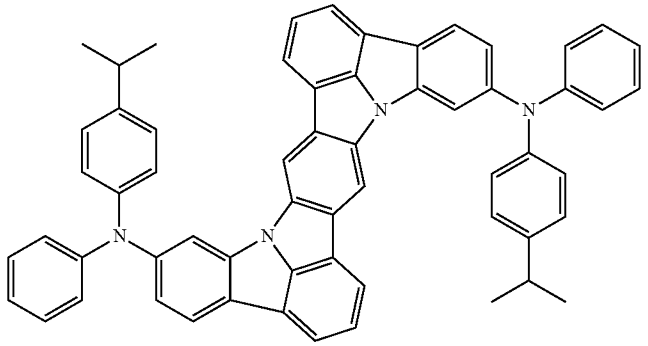
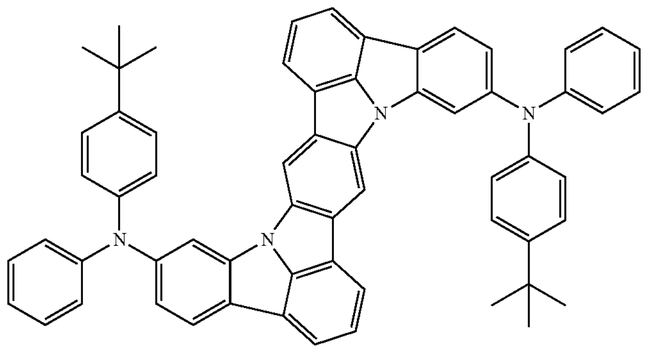
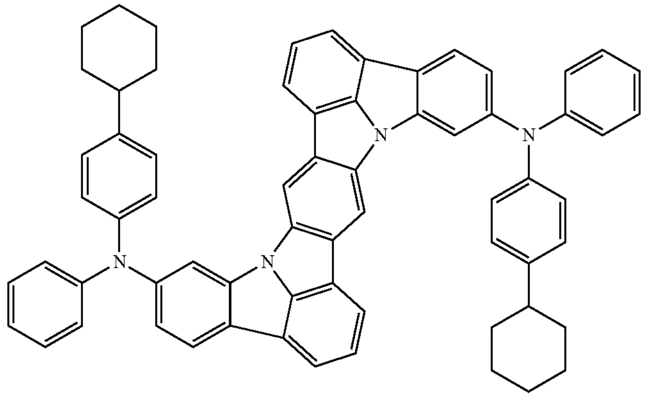

-continued
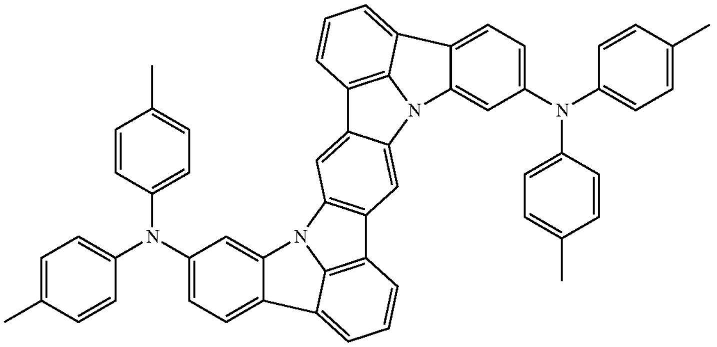
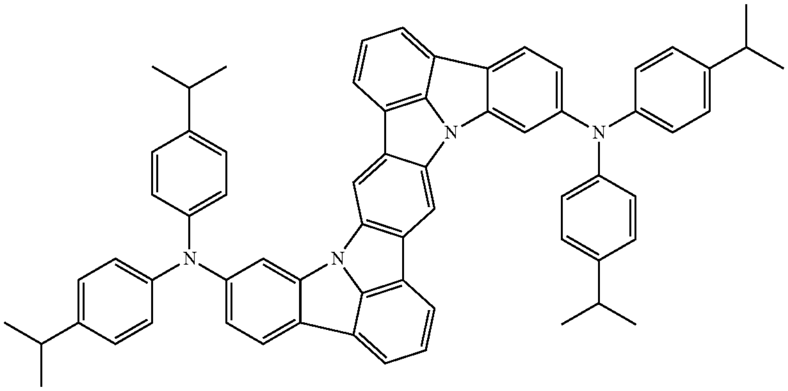
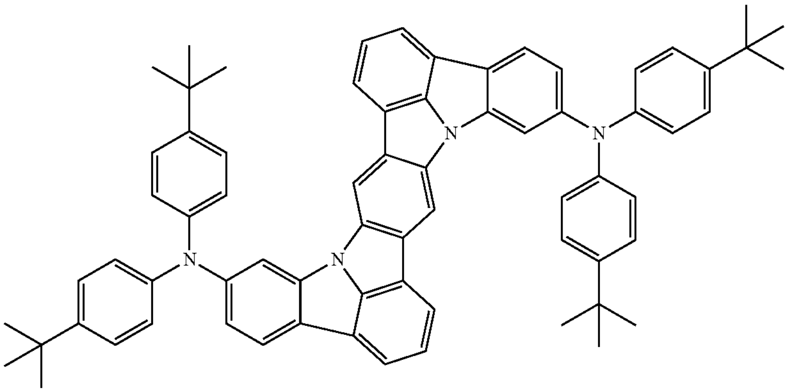
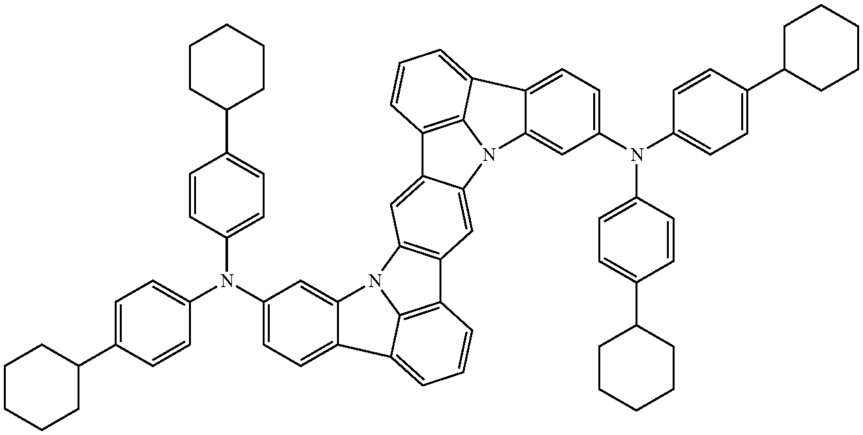

-continued
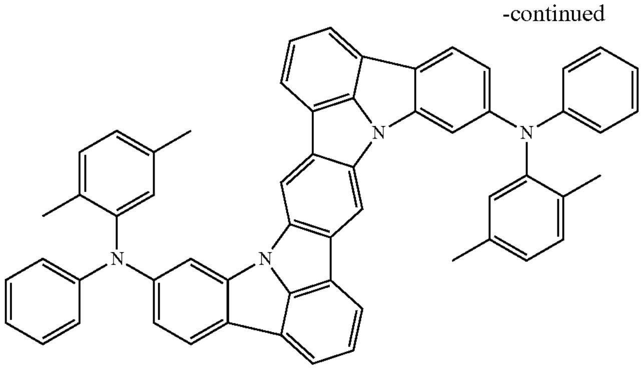
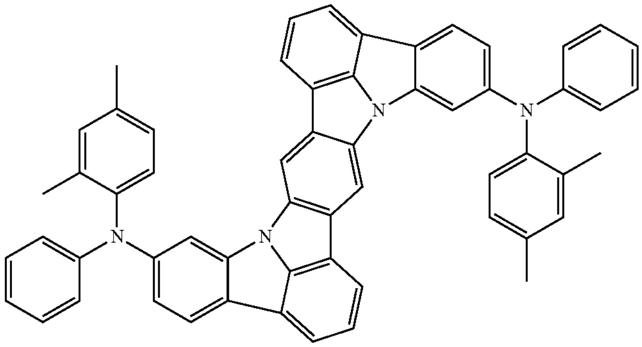
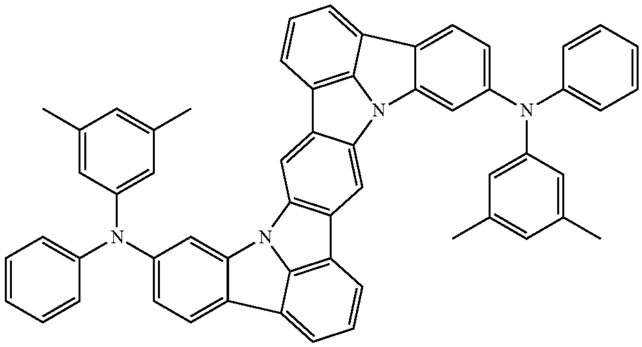
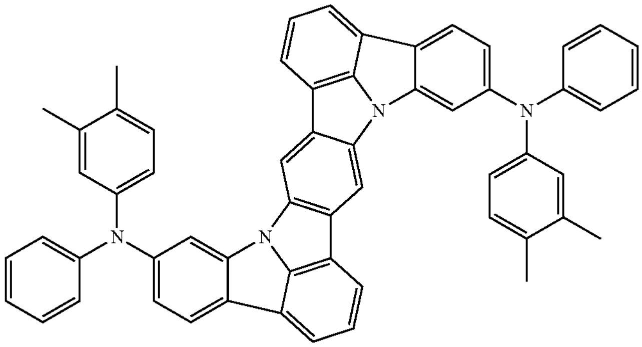
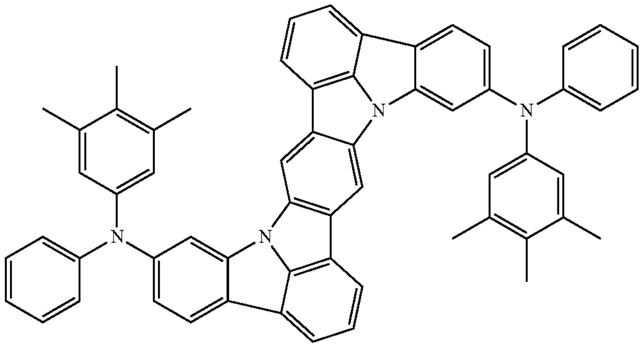

-continued
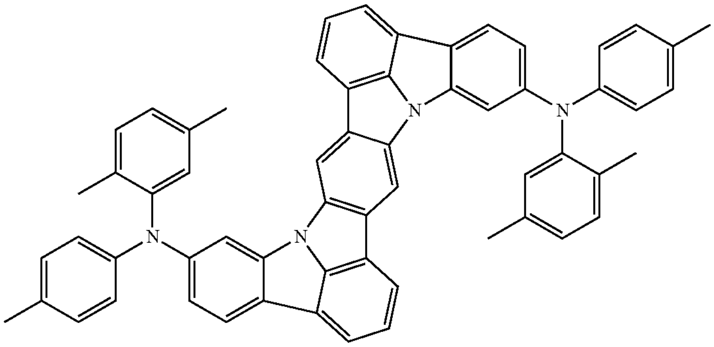
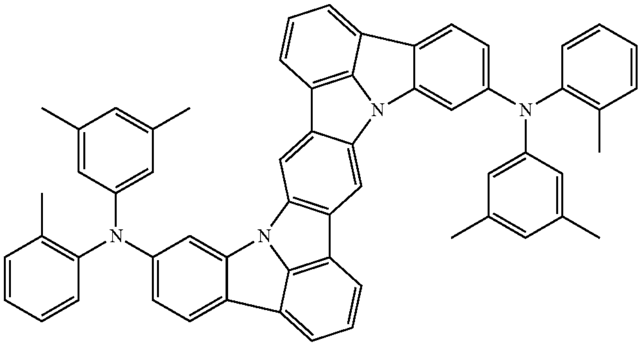
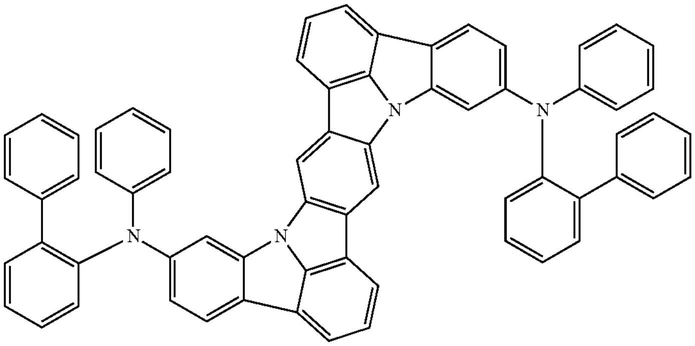
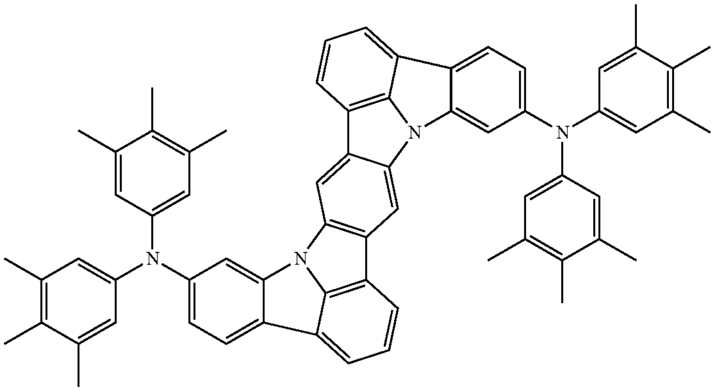

-continued
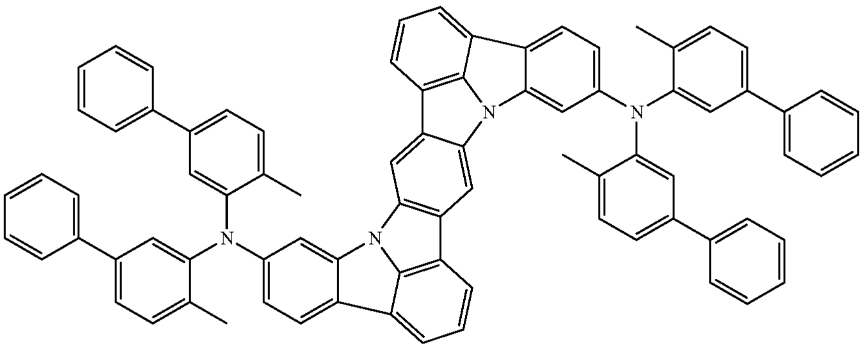
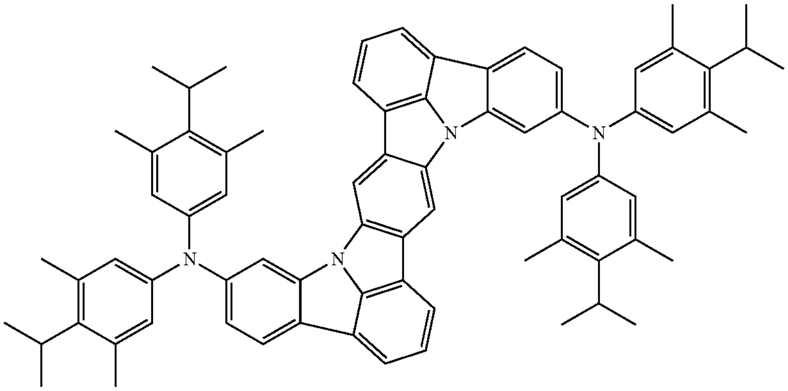
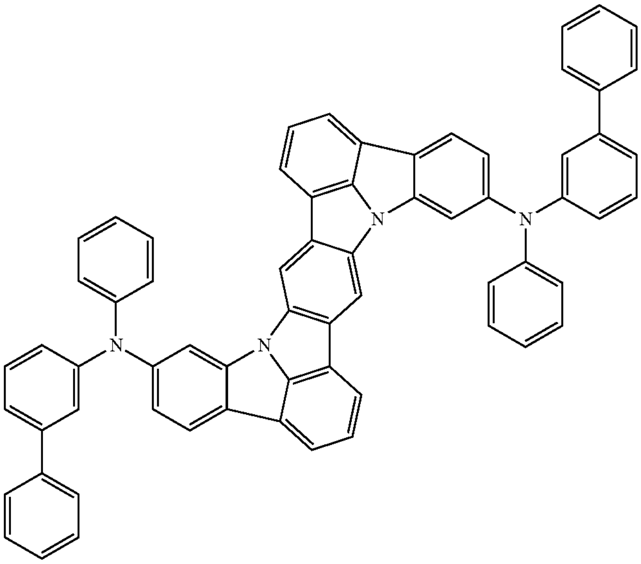

-continued
[Formula 375]
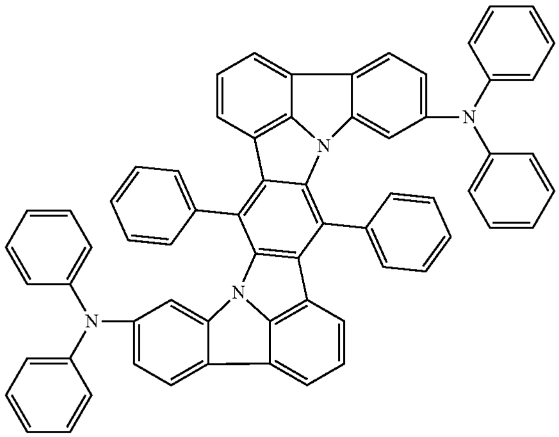
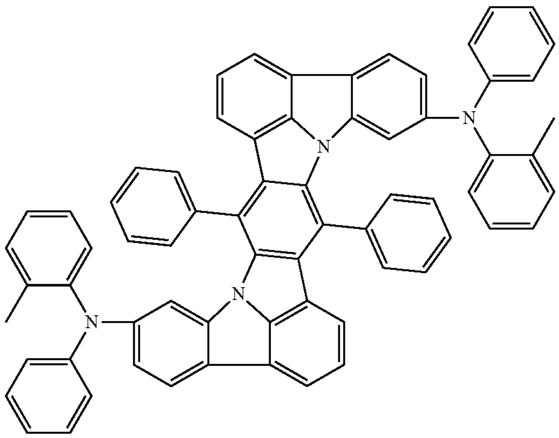
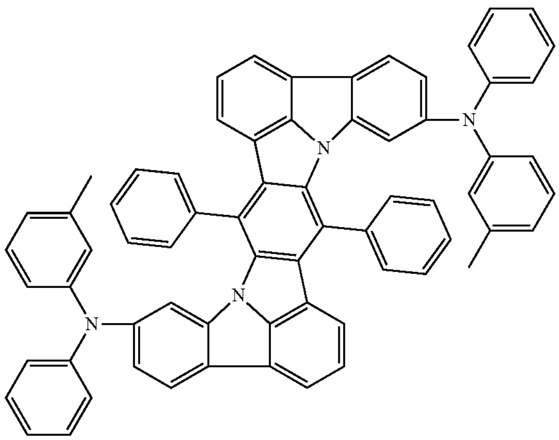

-continued
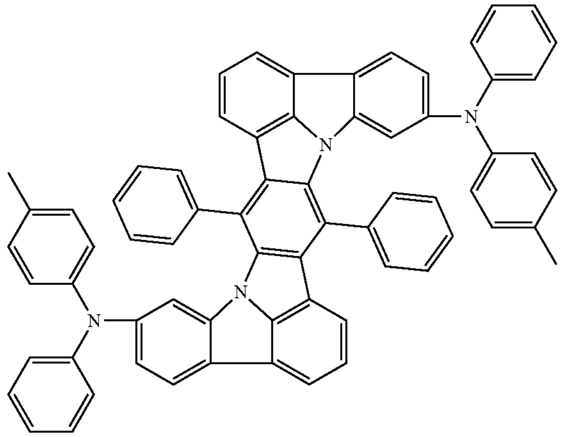
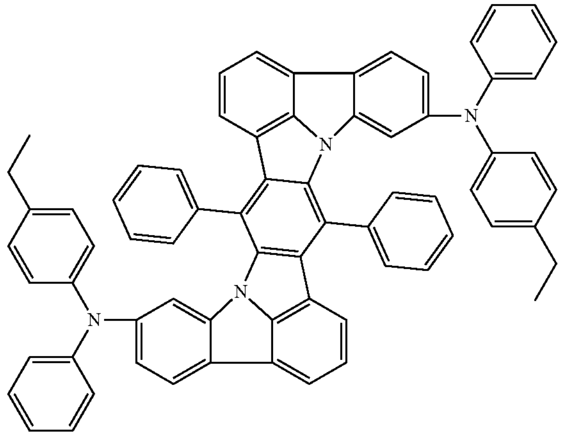
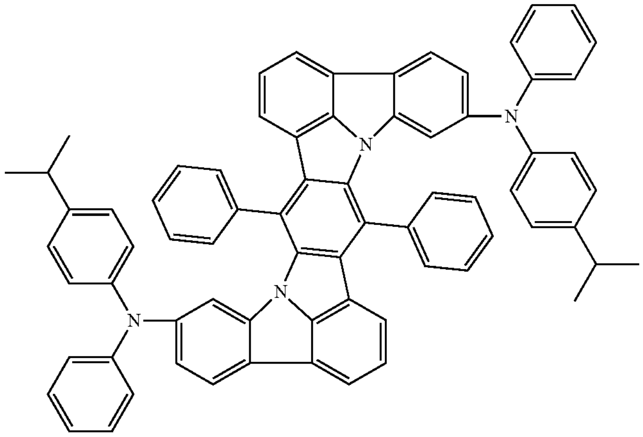

-continued
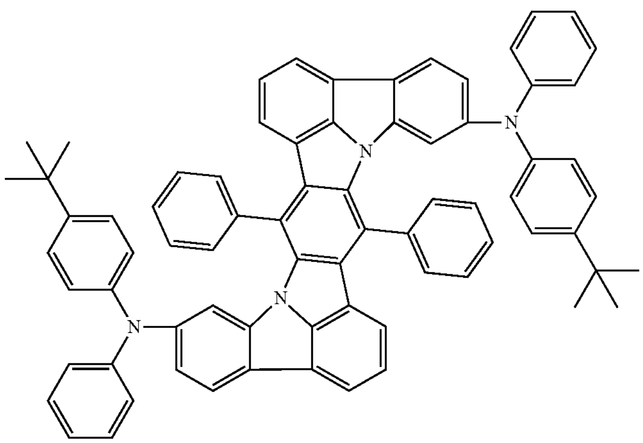
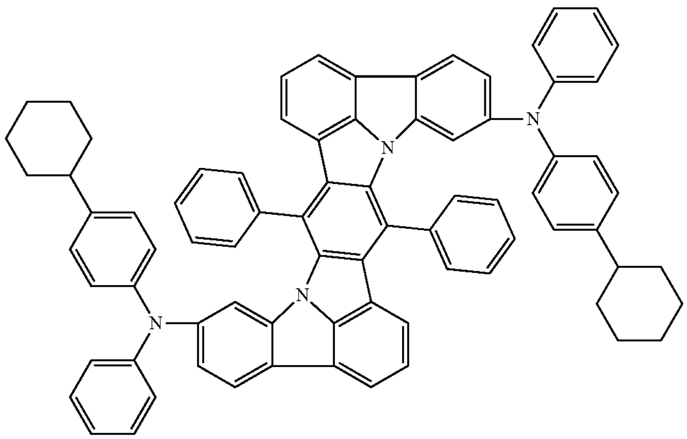
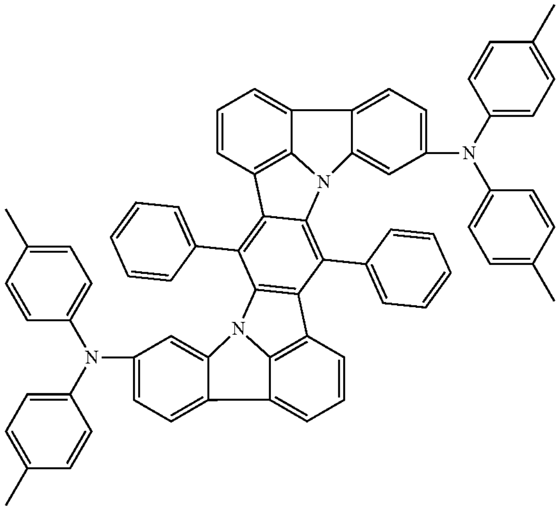

-continued
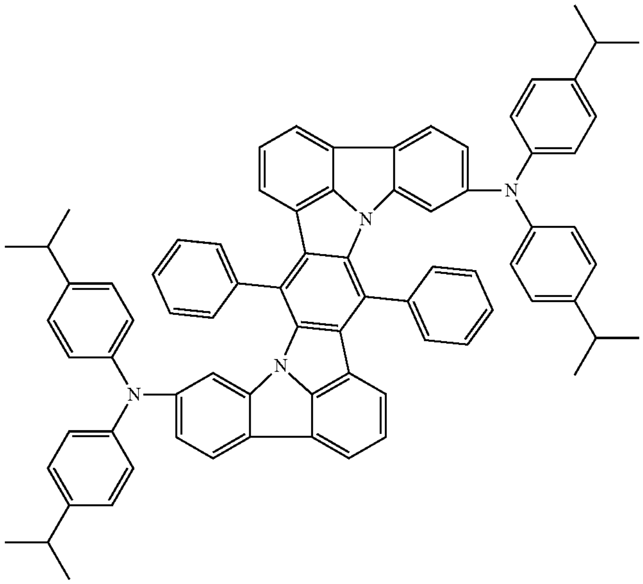
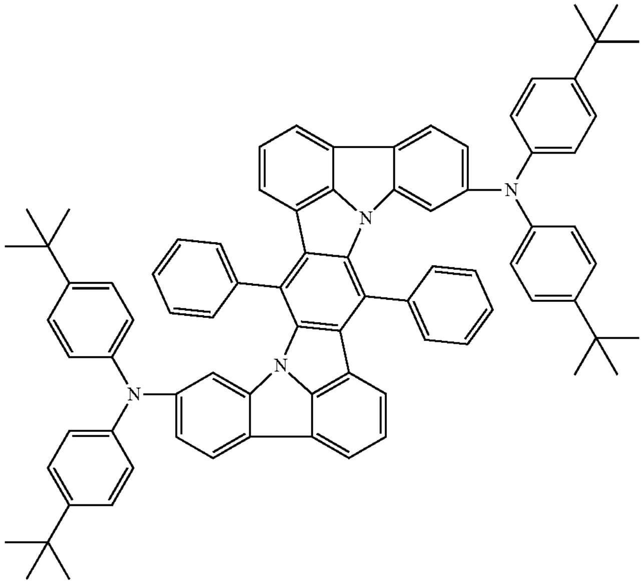

-continued
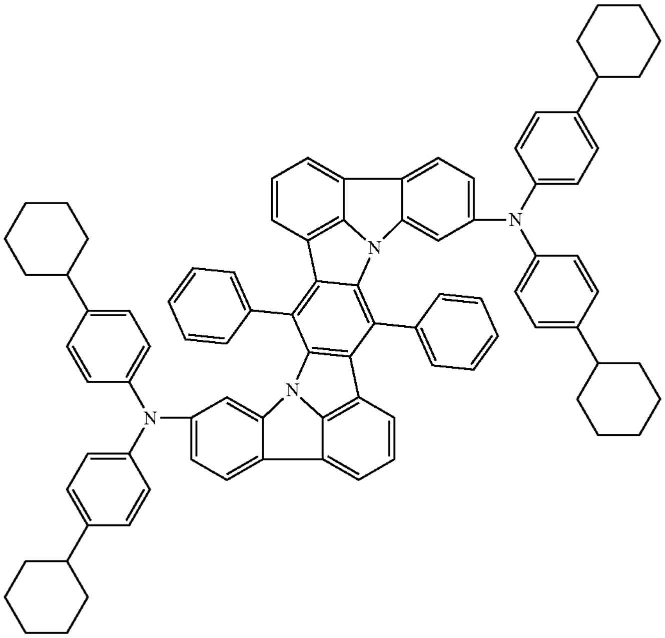
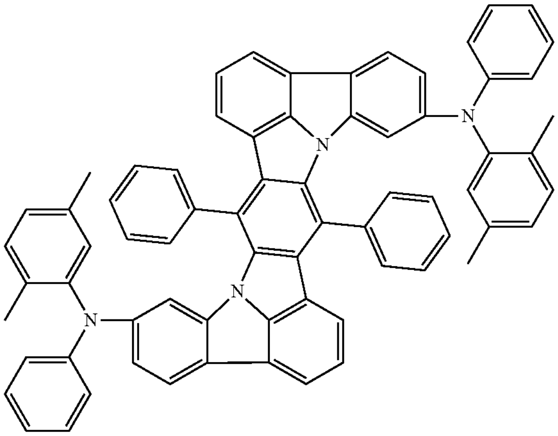
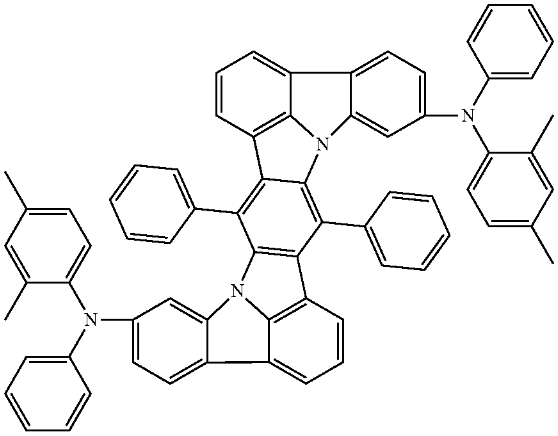

-continued
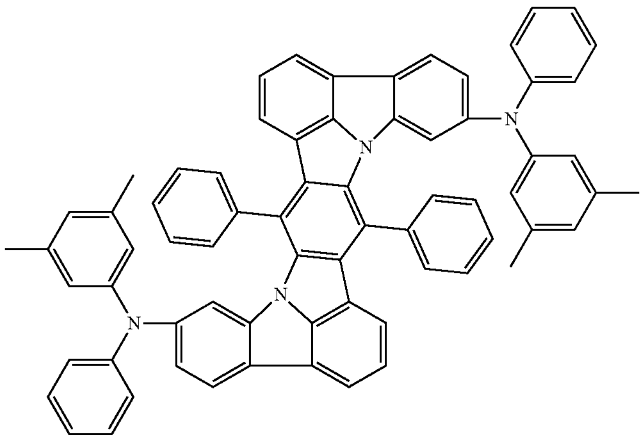
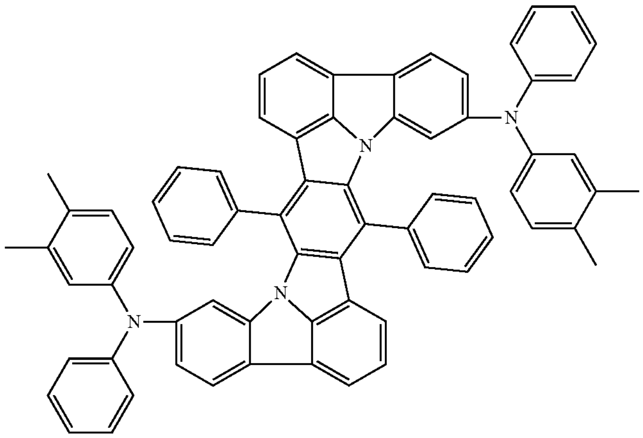
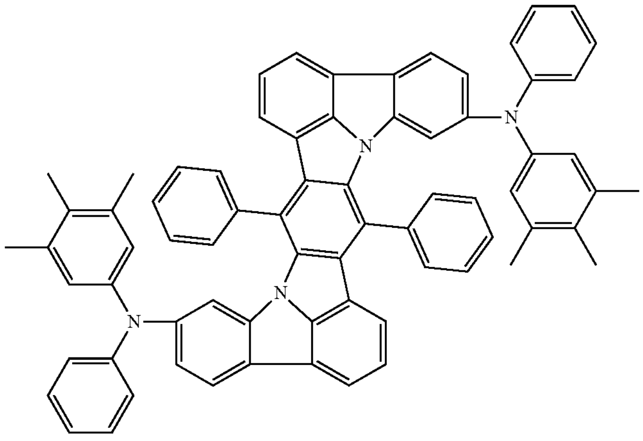

-continued
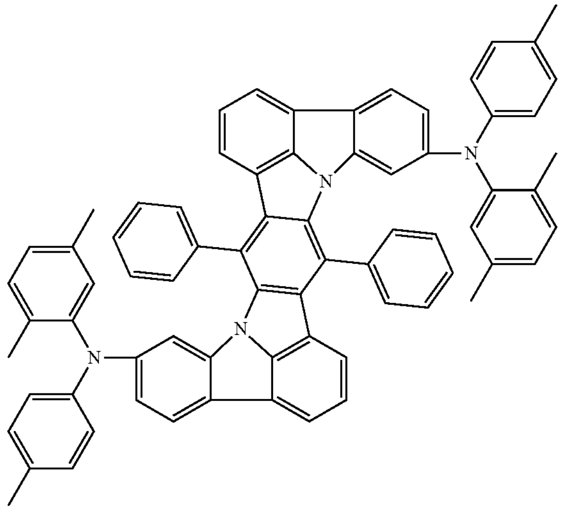
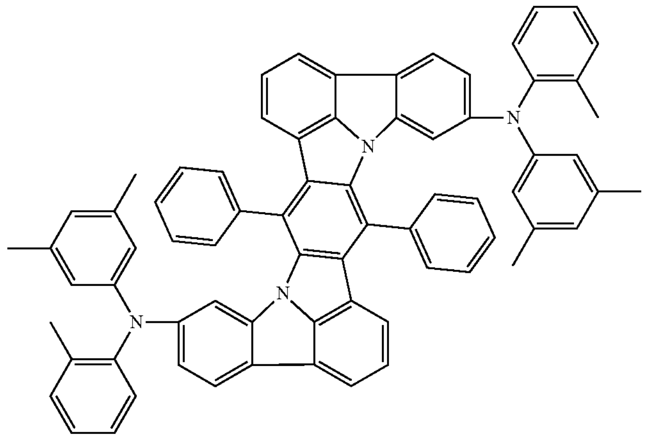
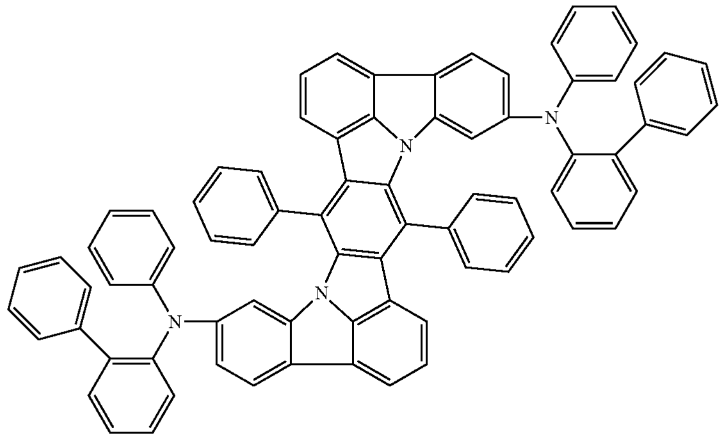

-continued
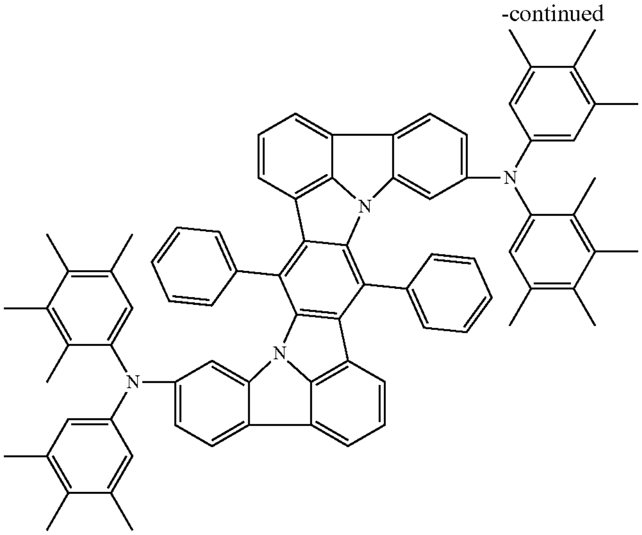
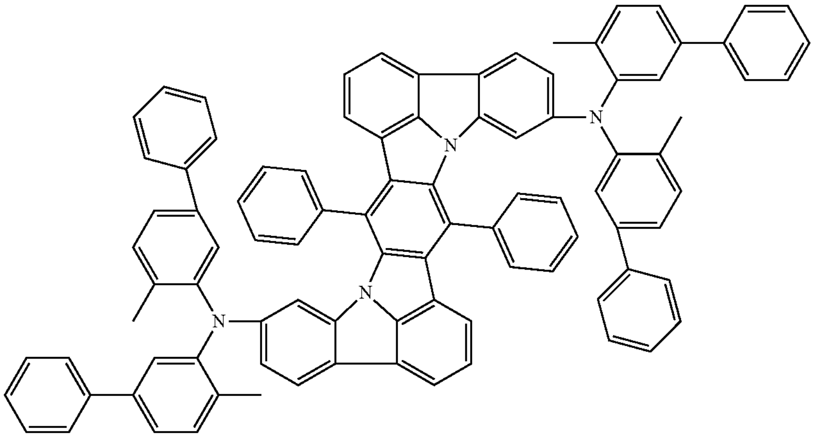
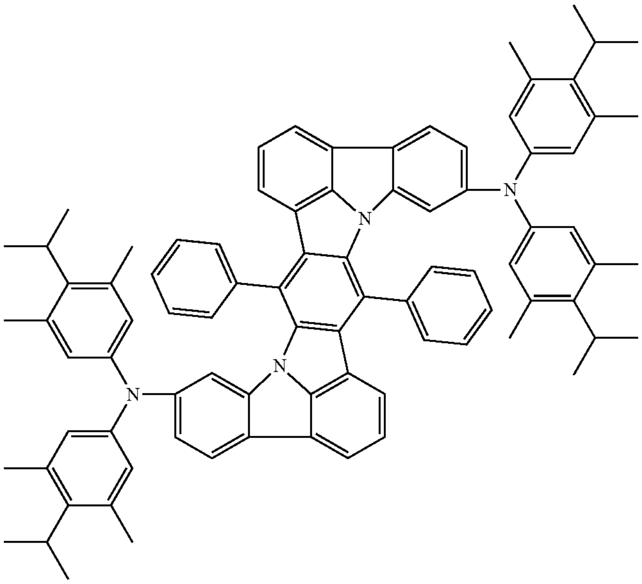

-continued
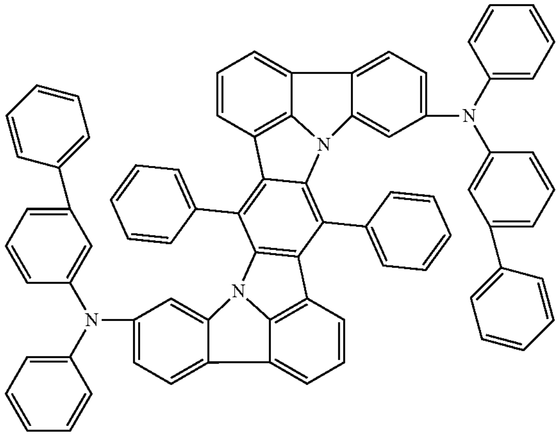
[Formula 376]
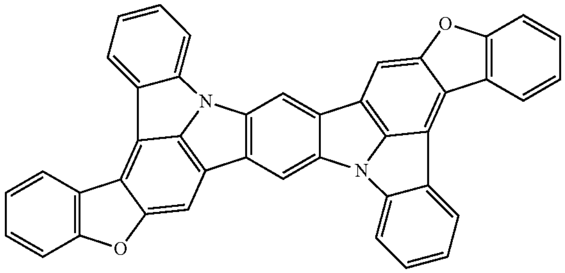
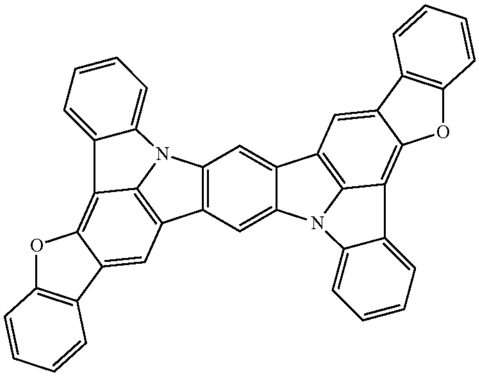
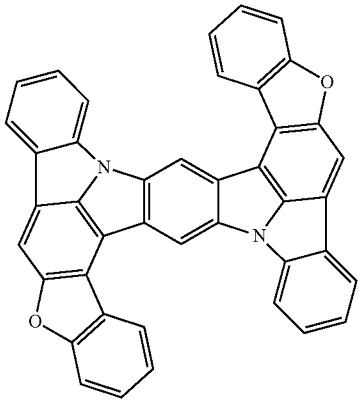
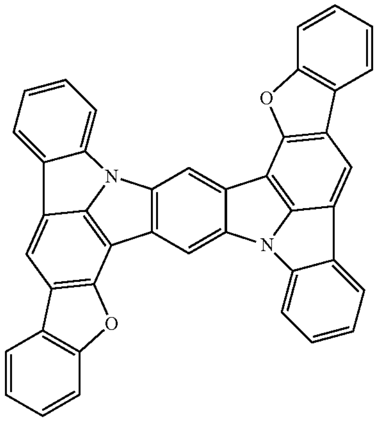
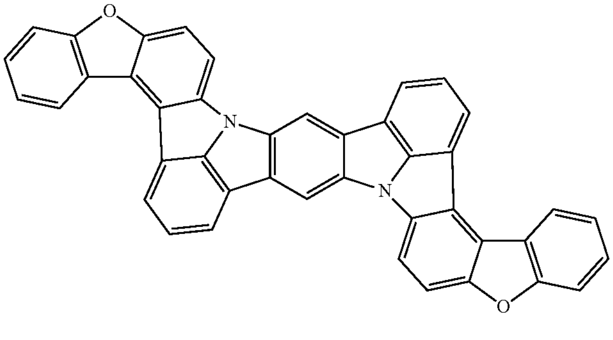
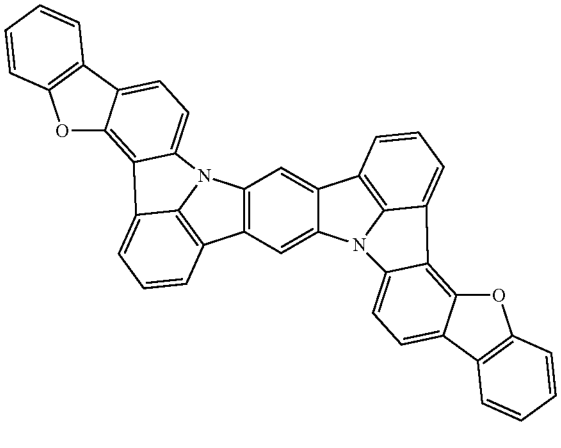

-continued
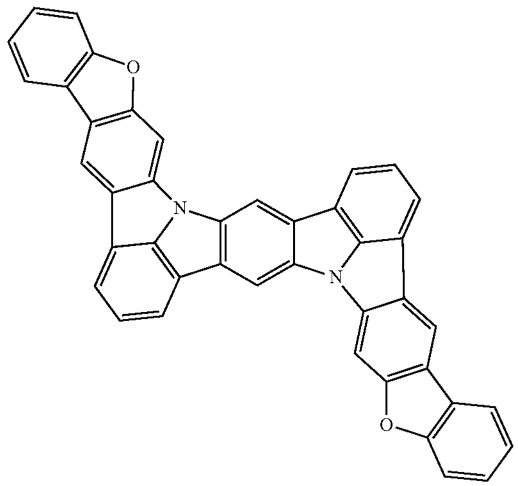
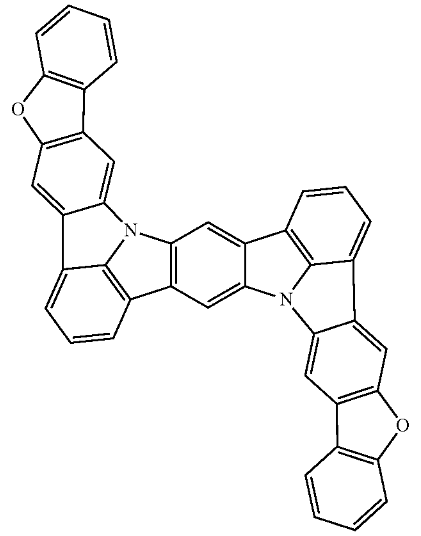
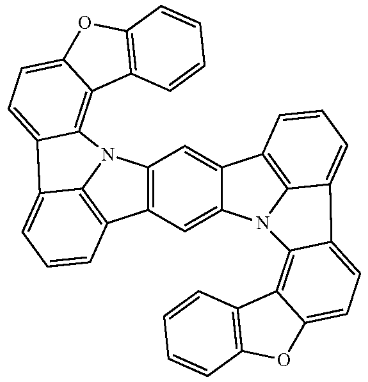
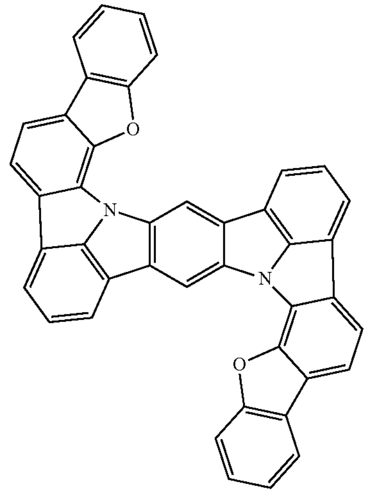
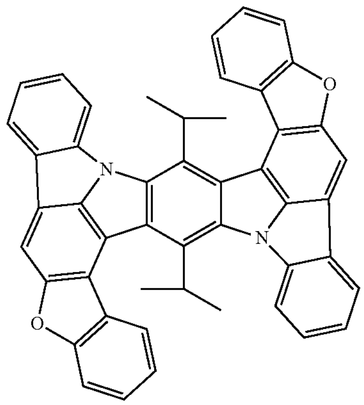
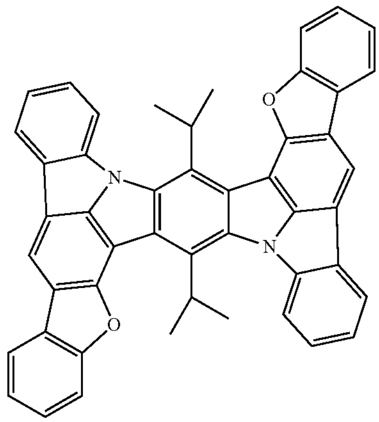
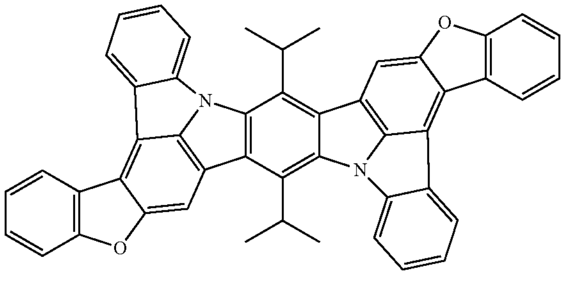

-continued
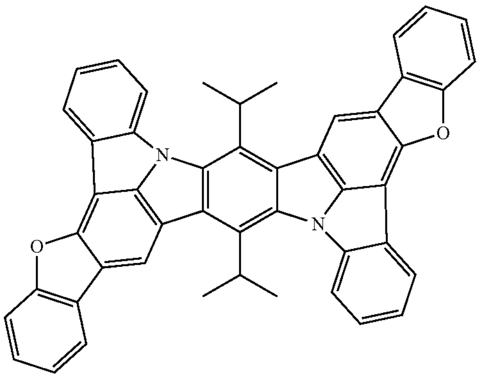
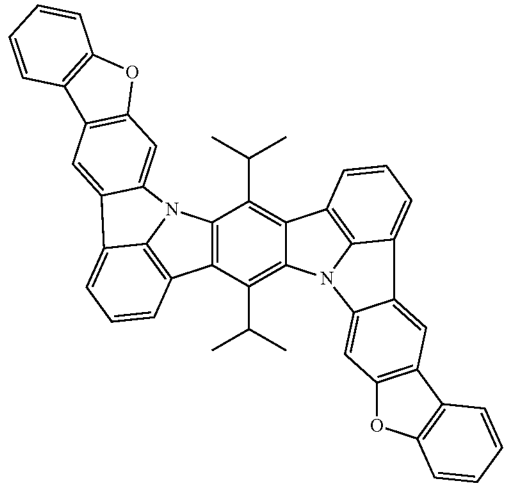
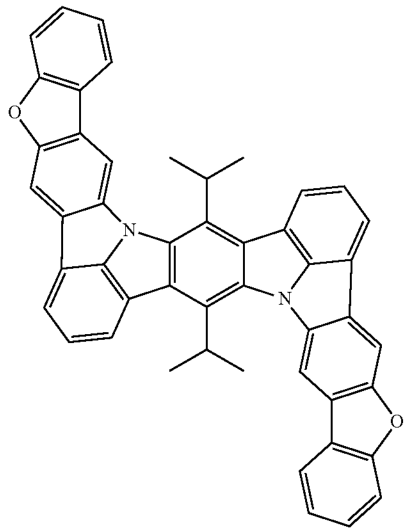
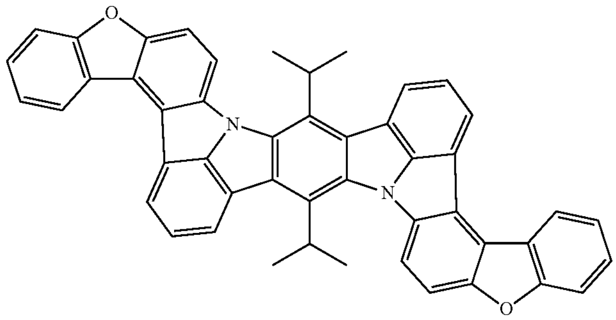
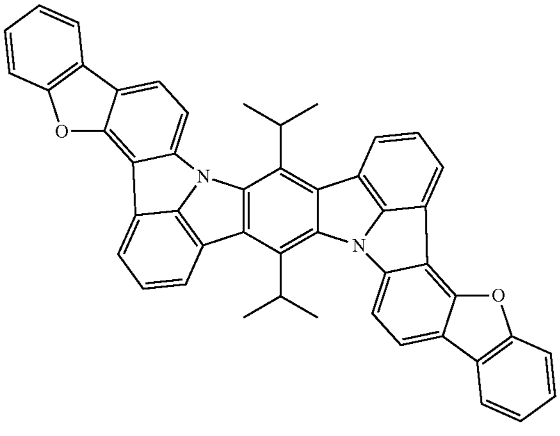
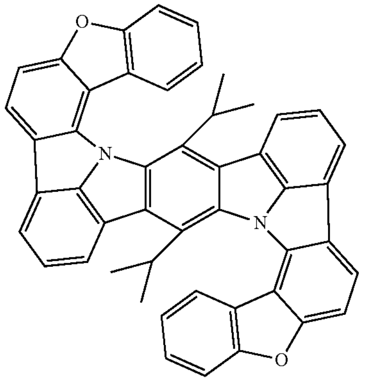

-continued
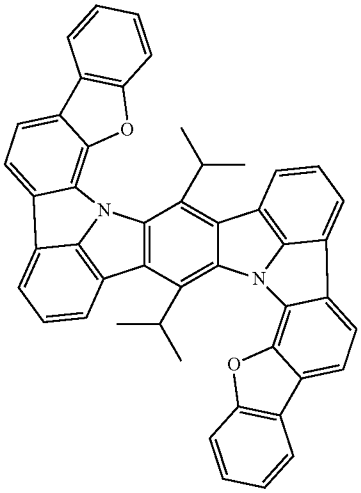
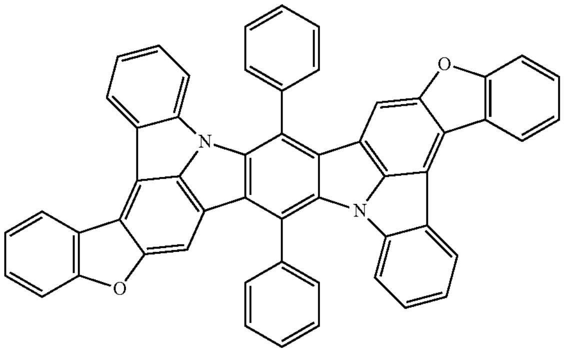
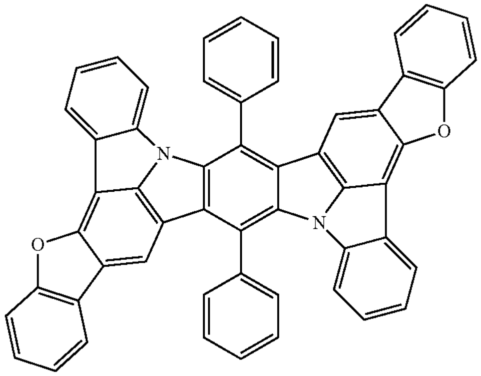
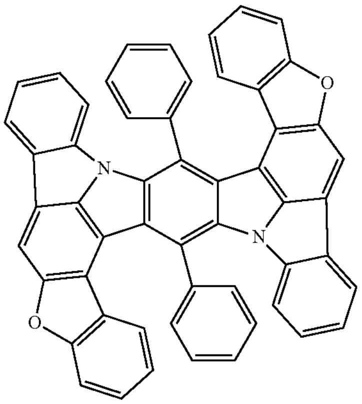
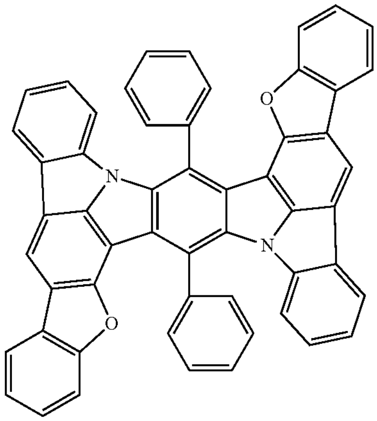
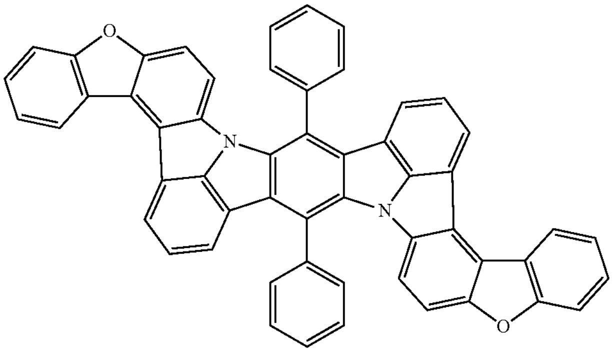

-continued
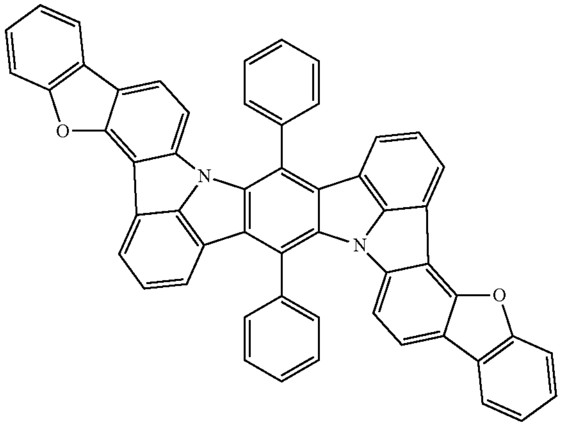
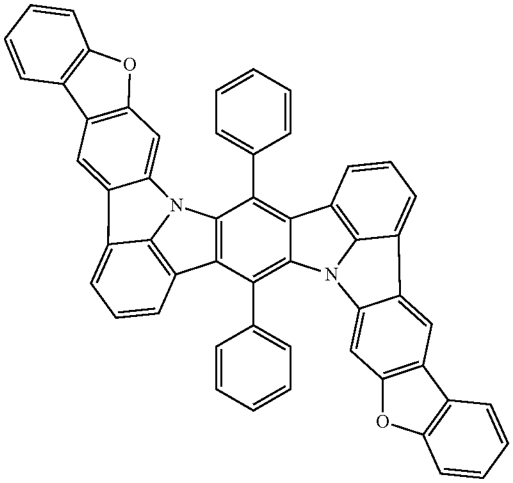
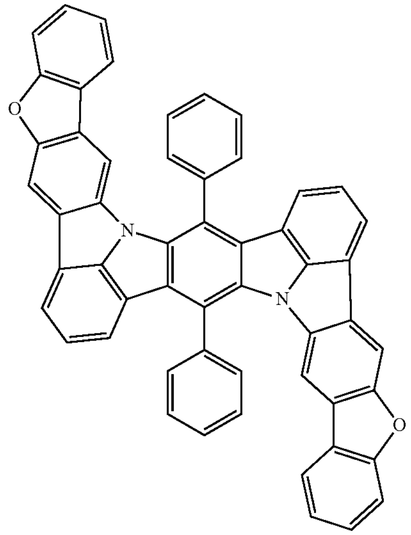
[Formula 377]
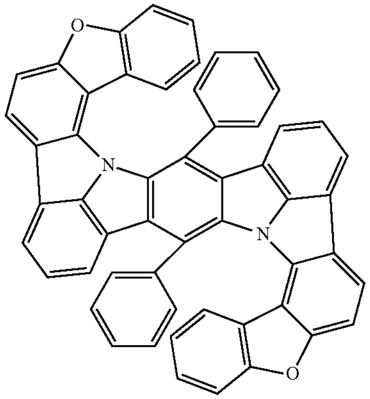
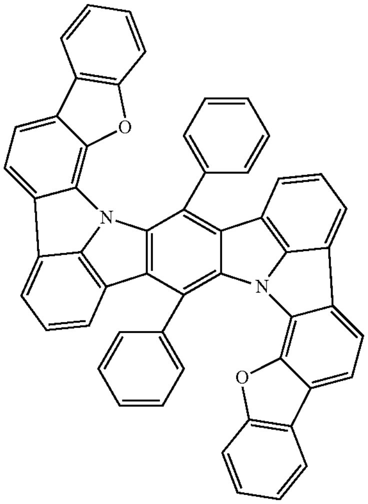

-continued
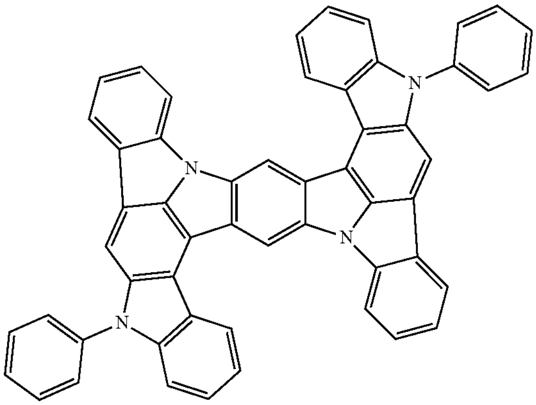
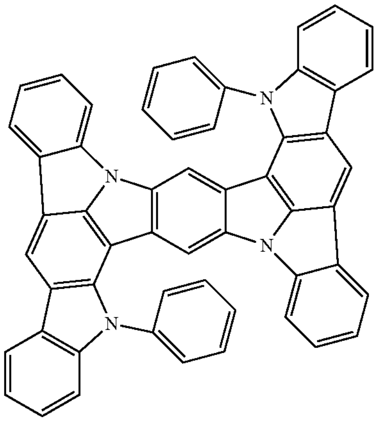
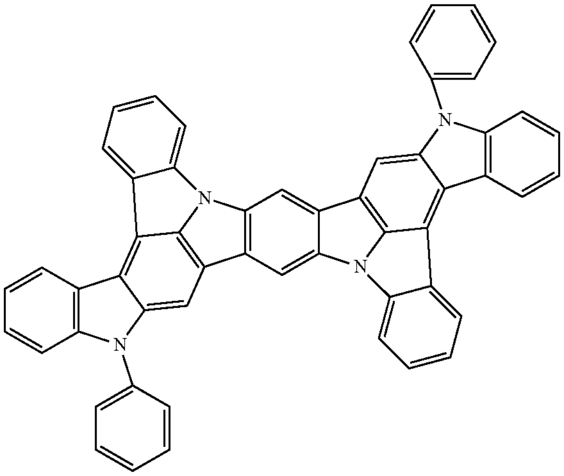
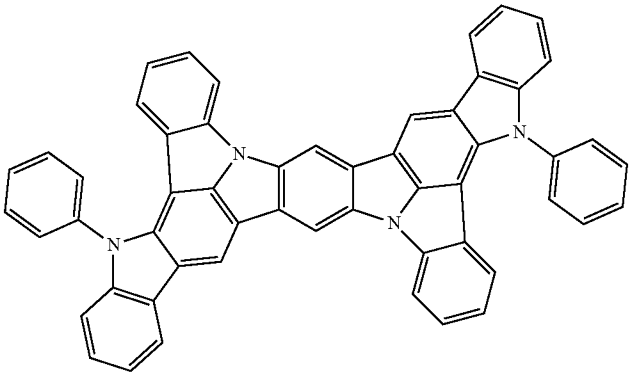

-continued
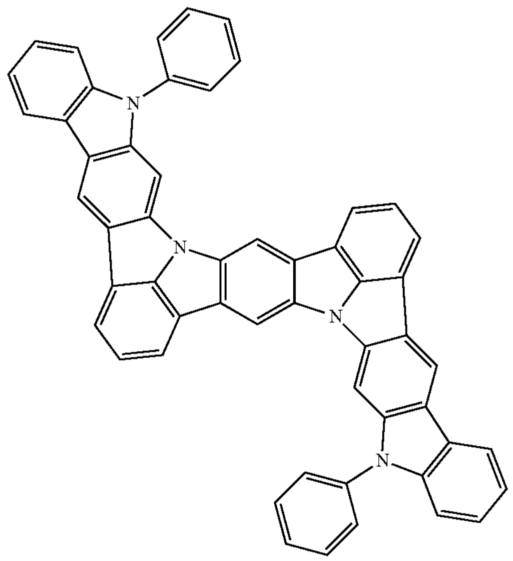
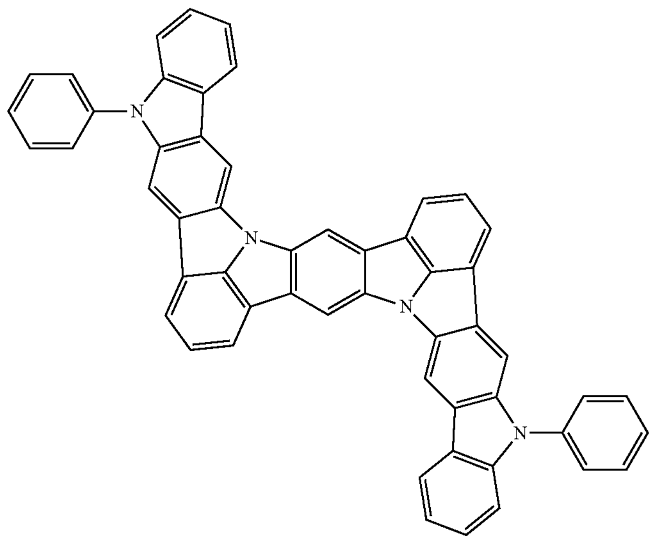
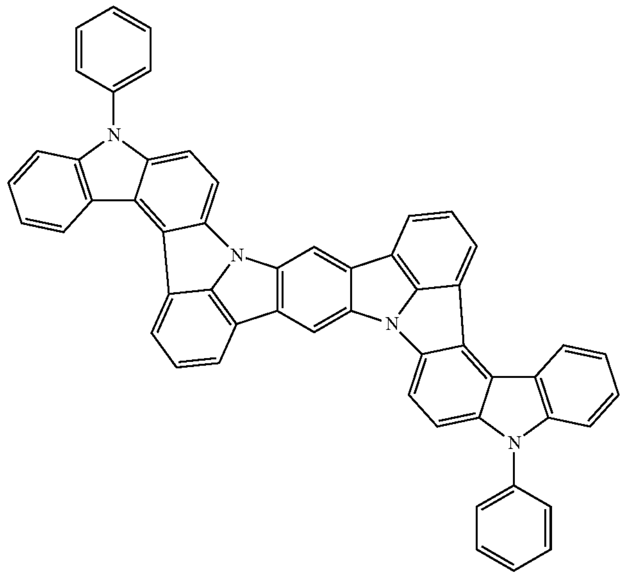

-continued
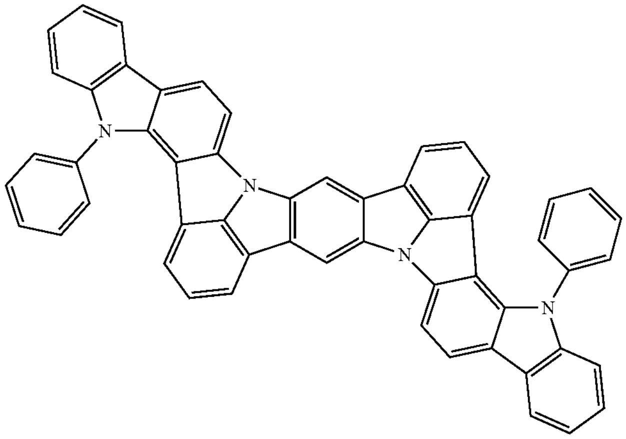
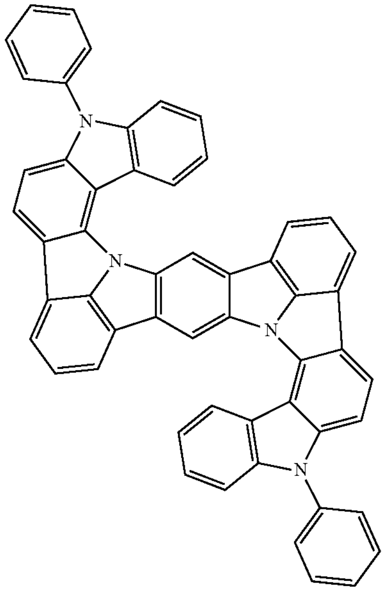
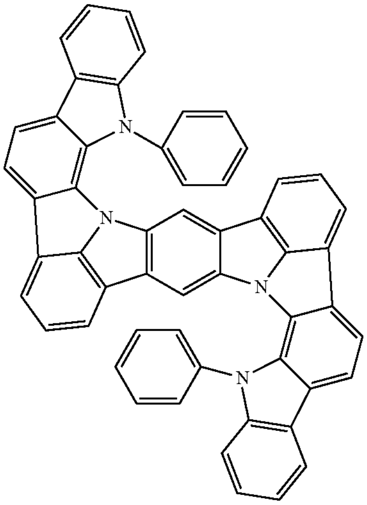
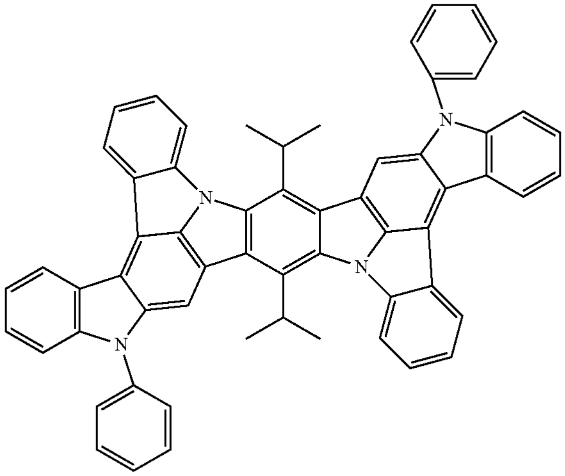

-continued
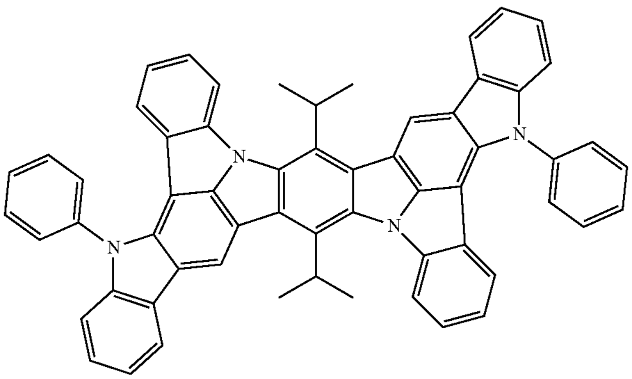
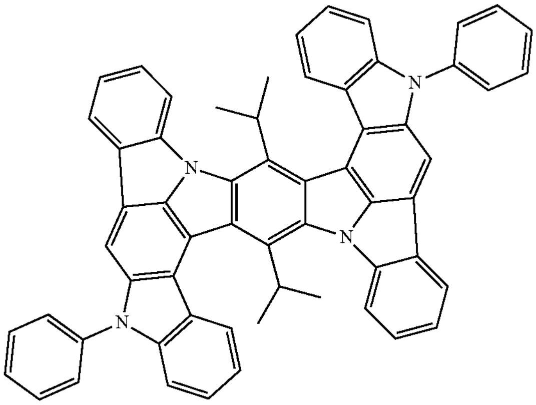
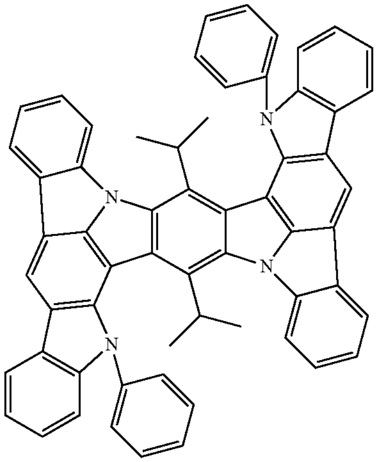
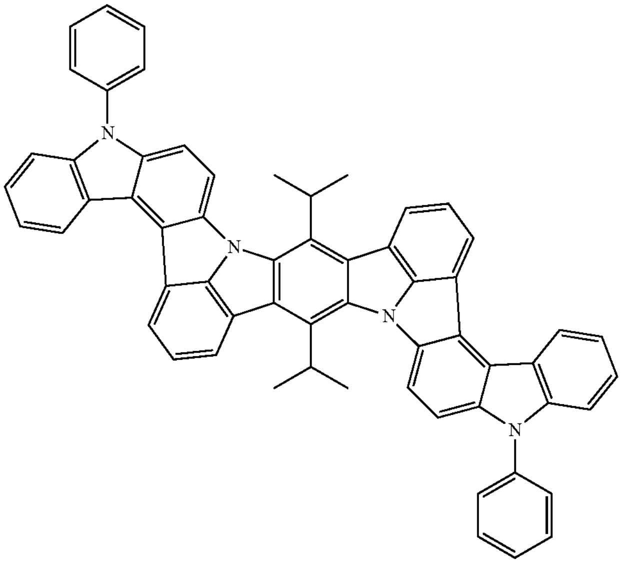

-continued
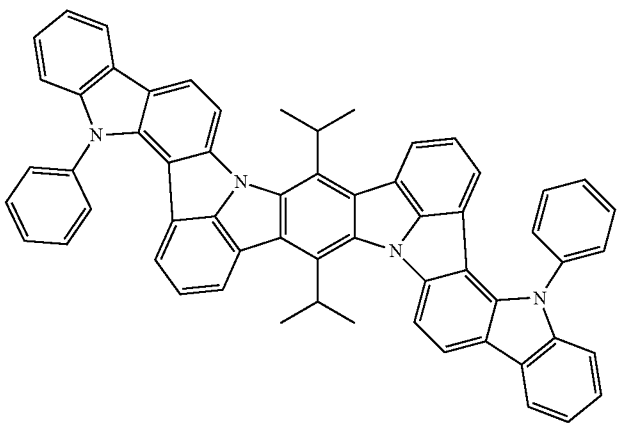
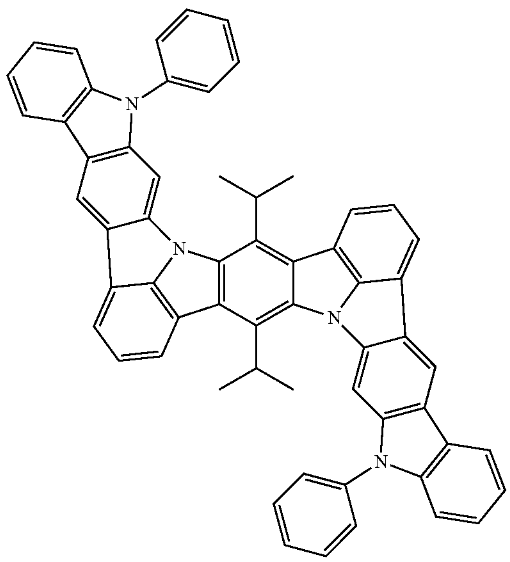
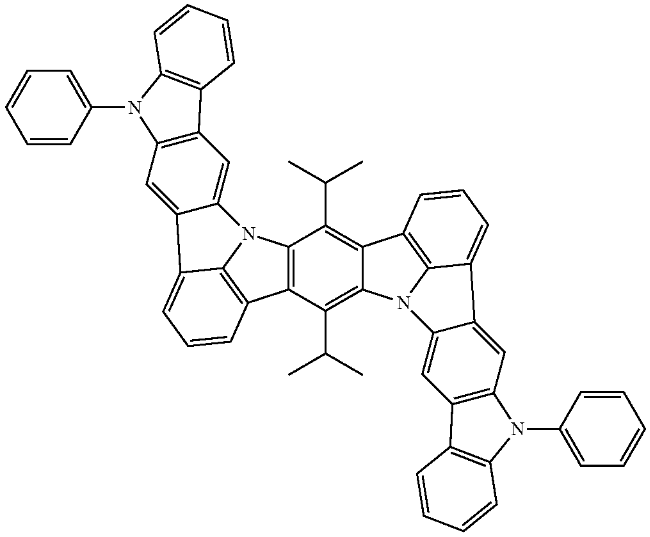
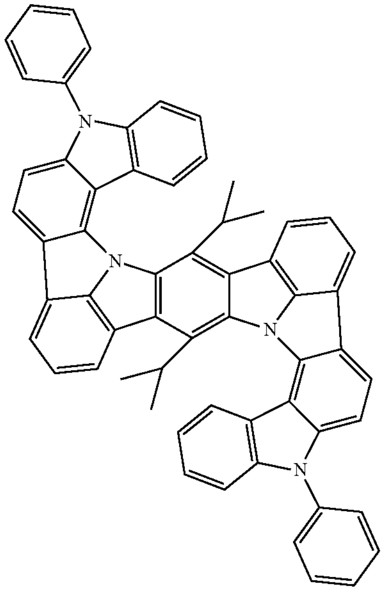

-continued
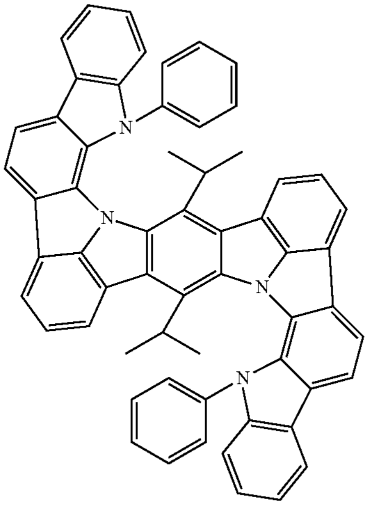
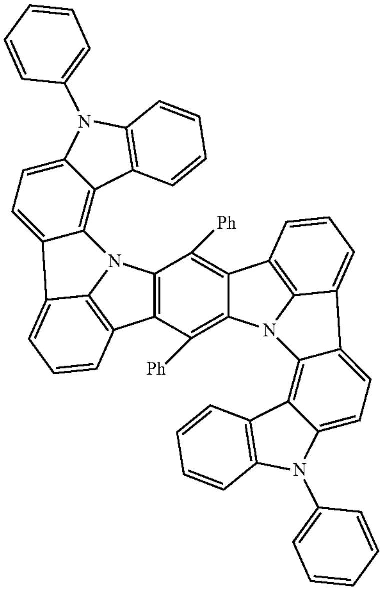
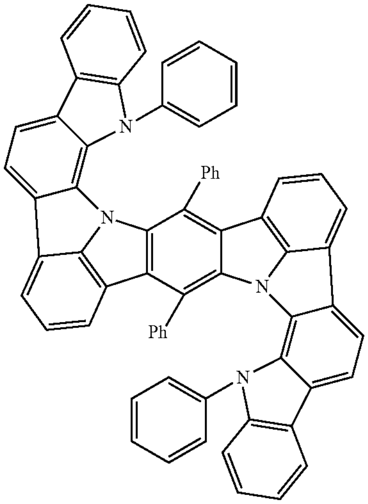
In the formulae, Ph represents a phenyl group.
[Formula 378]
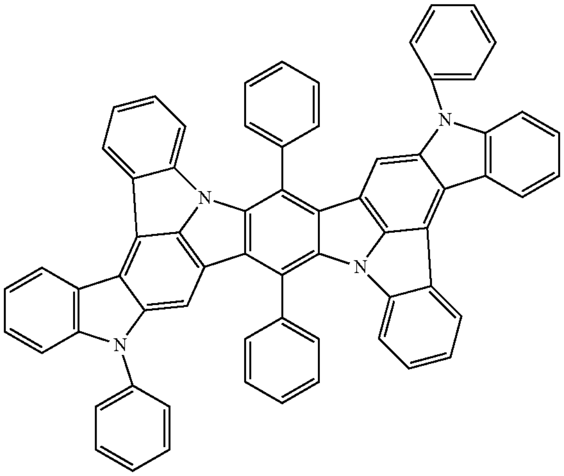

-continued
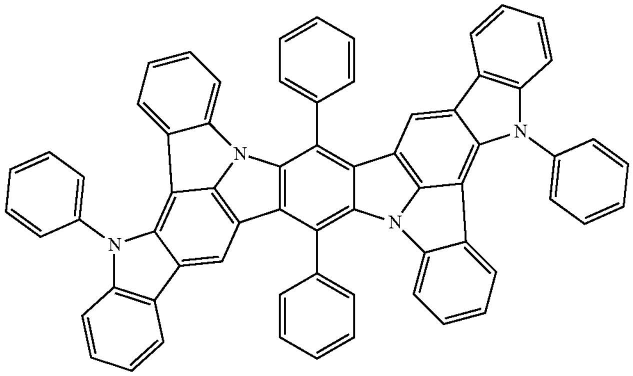
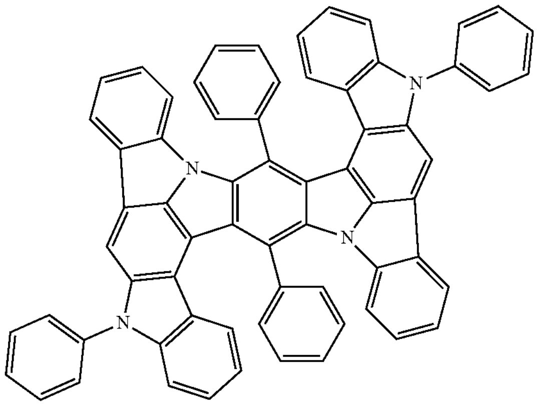
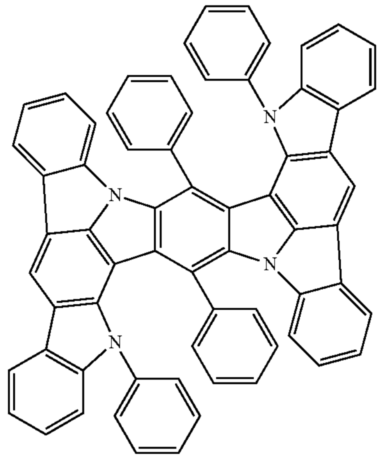
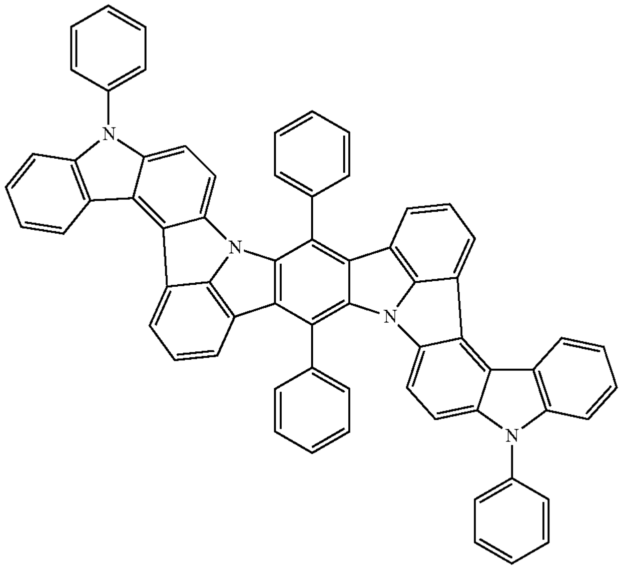

-continued
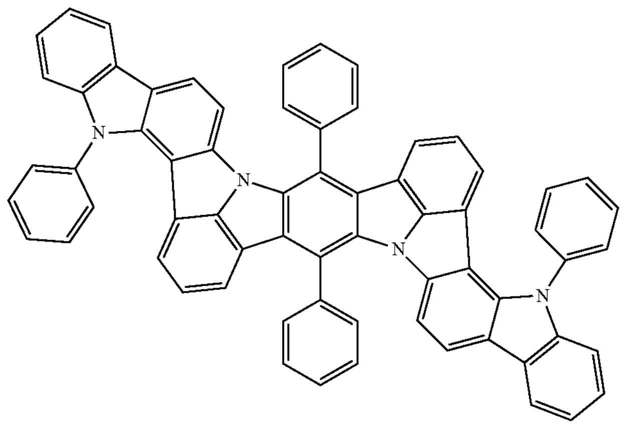
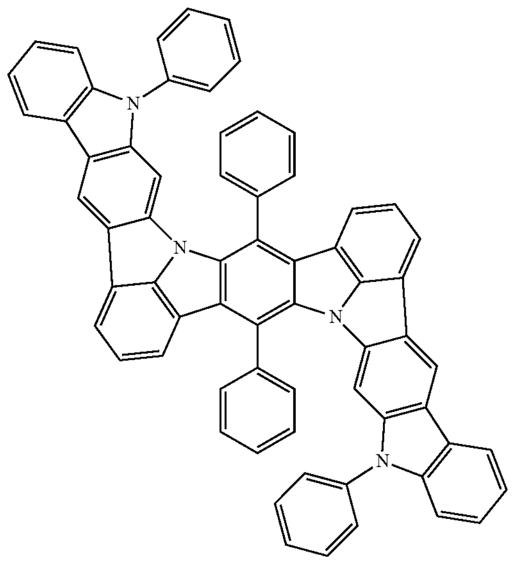
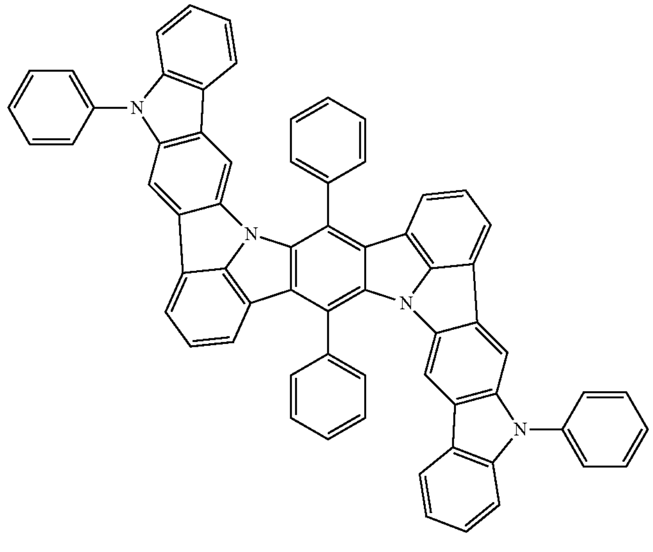

-continued
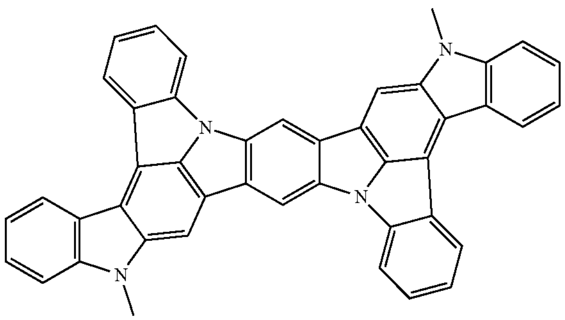
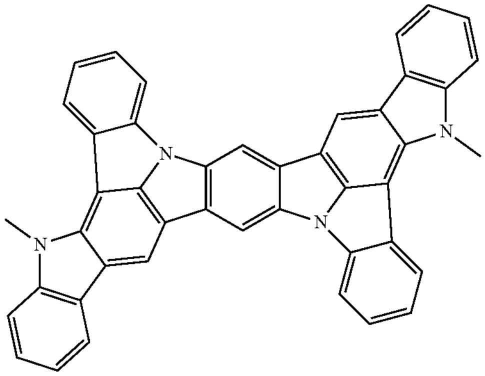
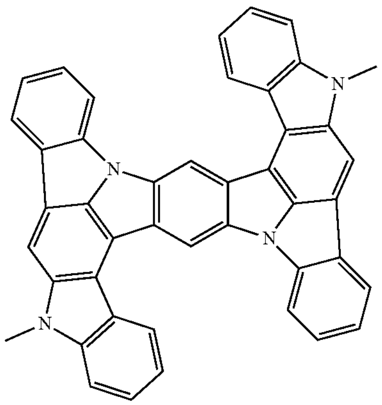
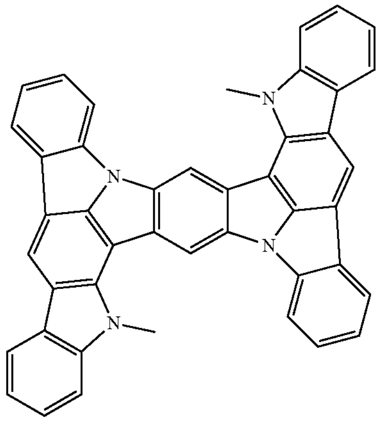
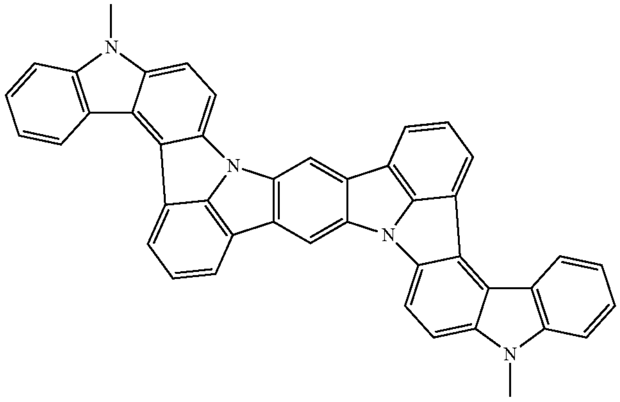
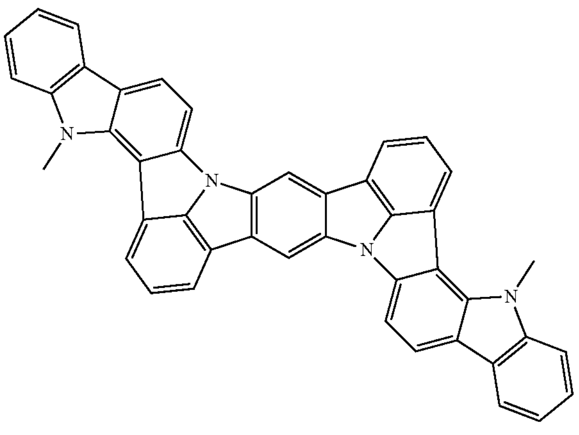
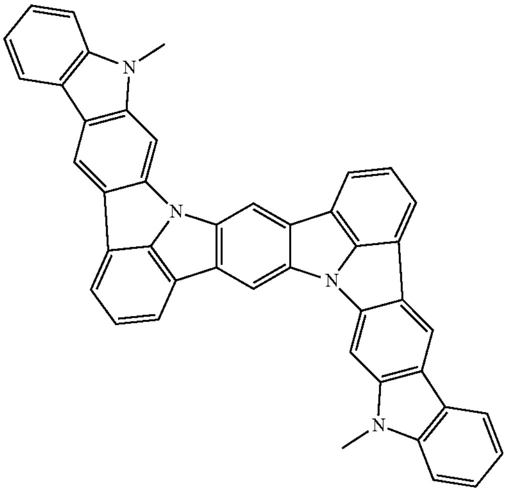

-continued
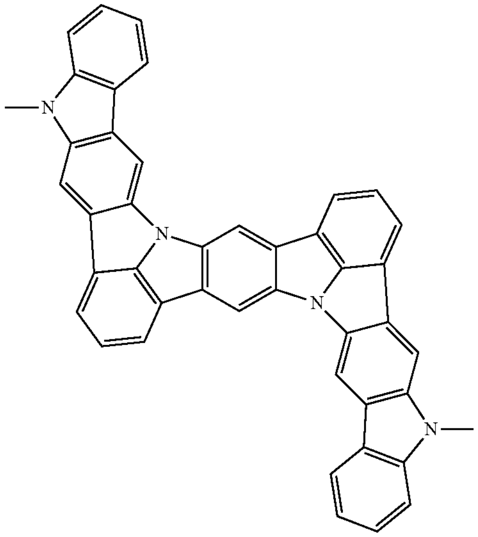
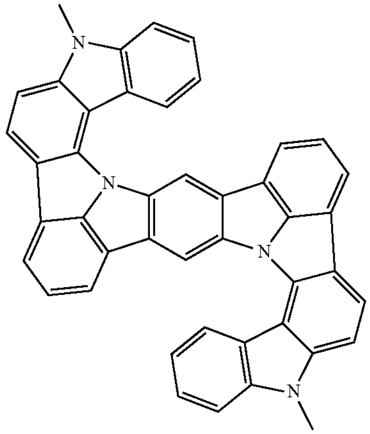
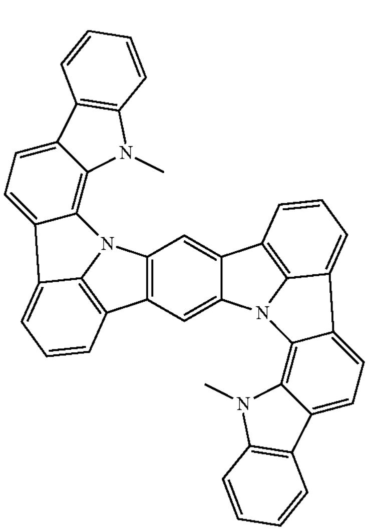
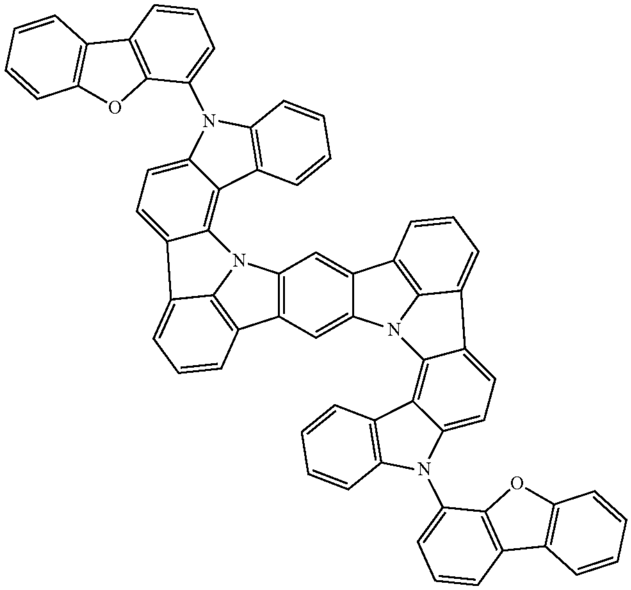
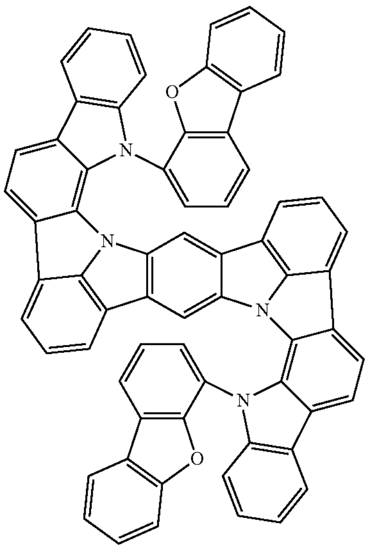
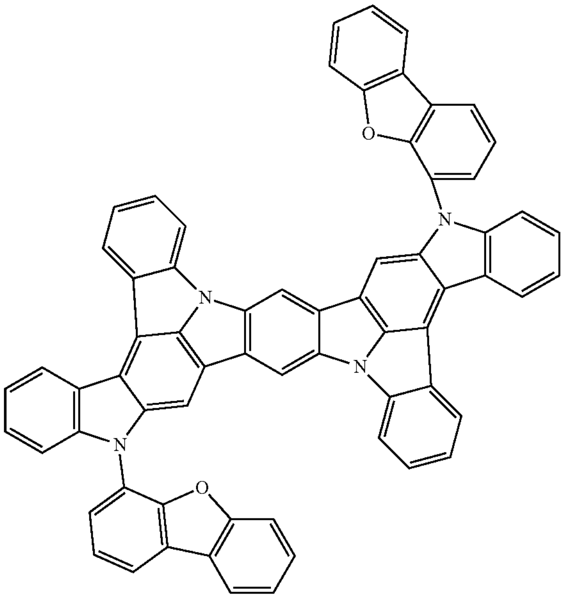

-continued
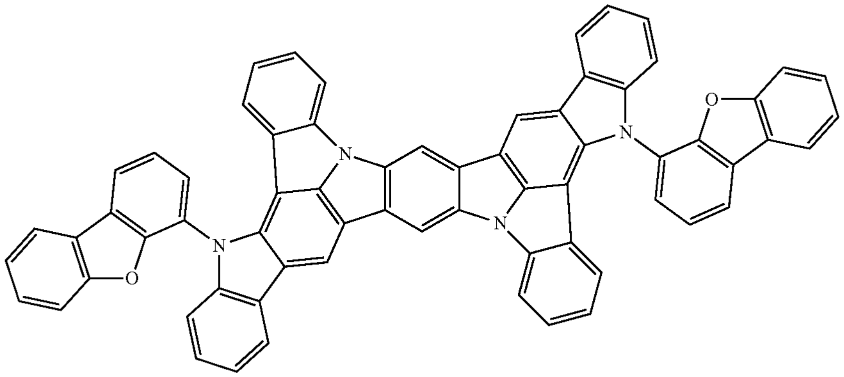
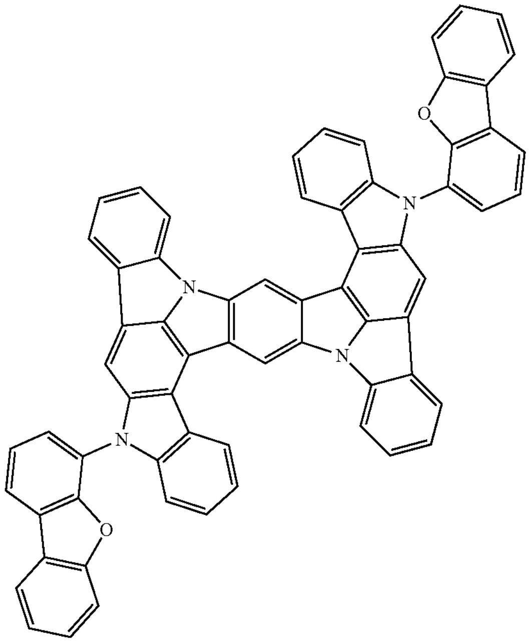
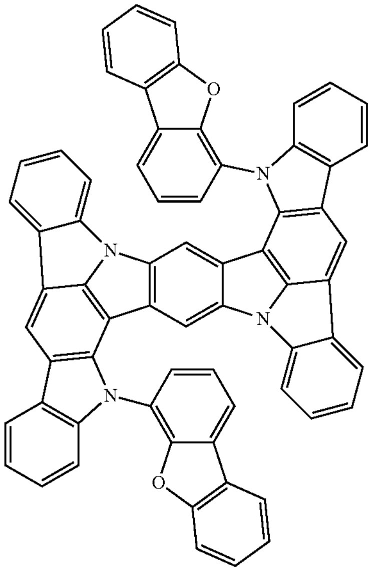
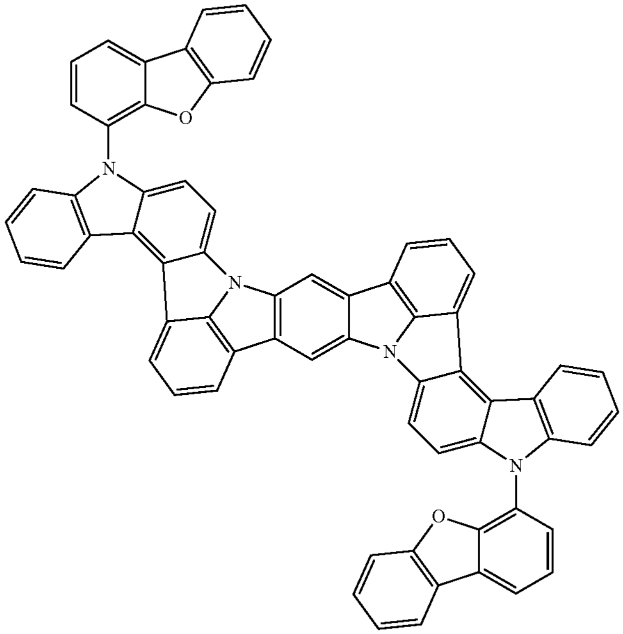

-continued
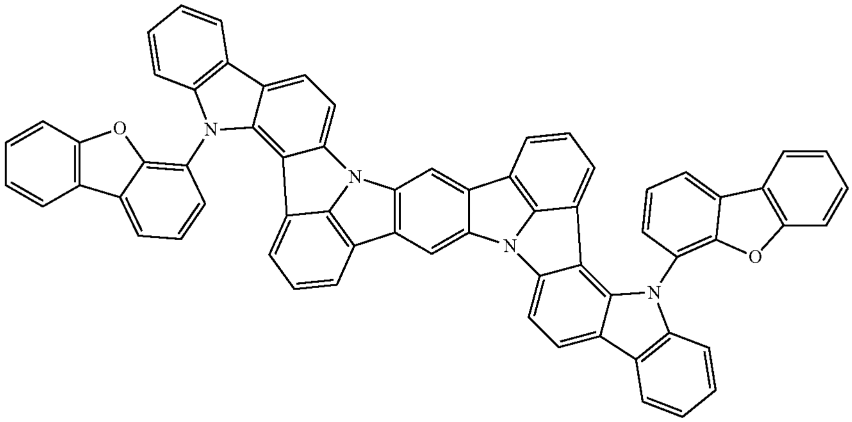
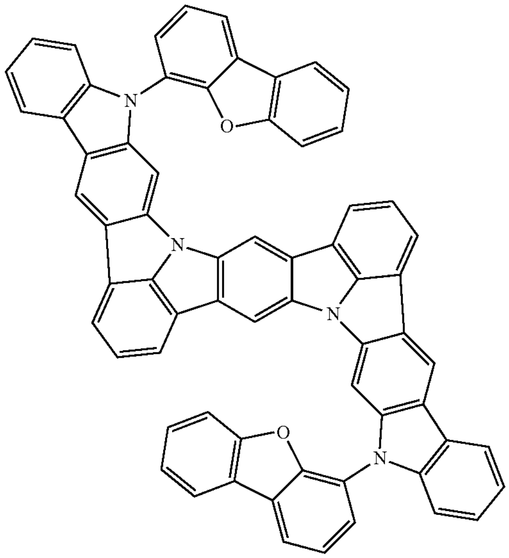
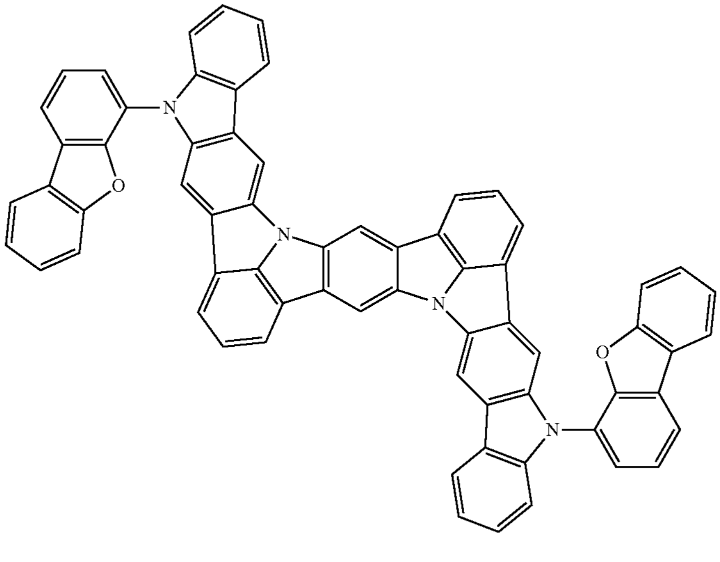

-continued
[Formula 379]
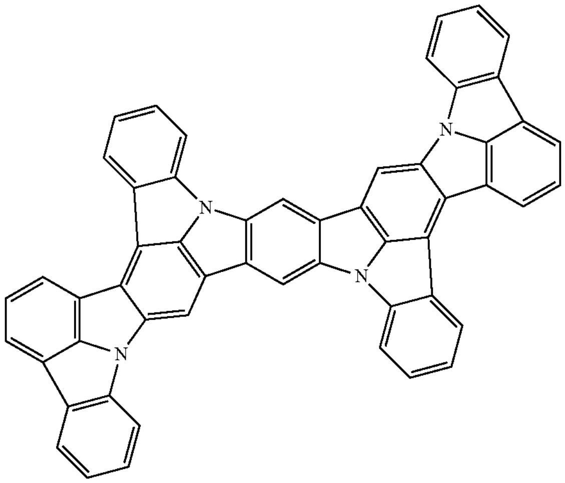
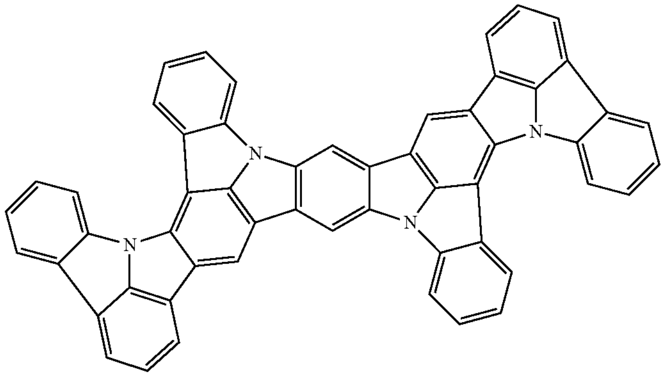
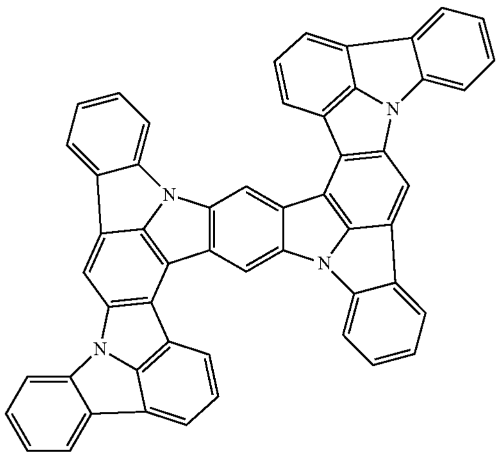

-continued
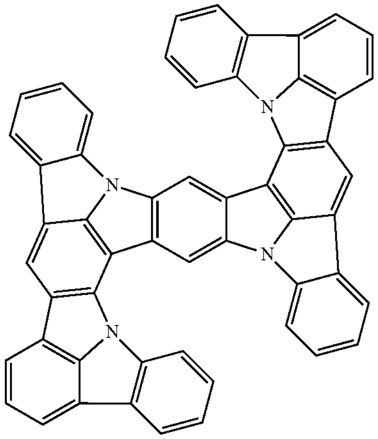
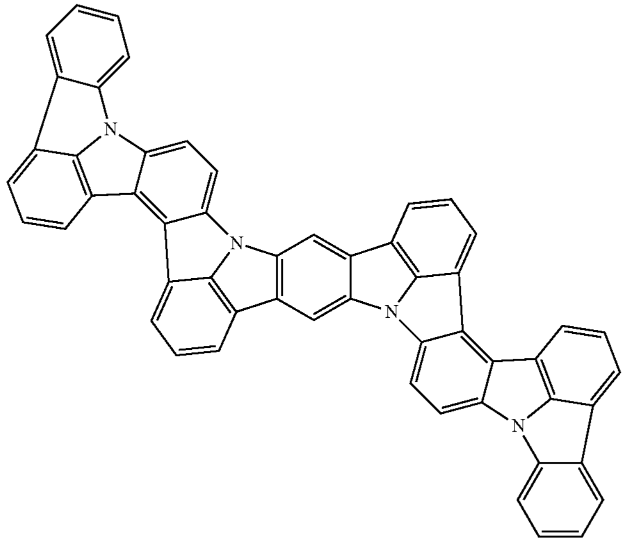
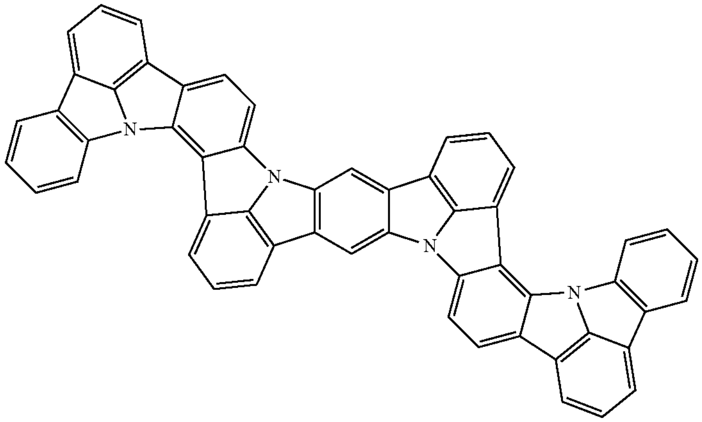
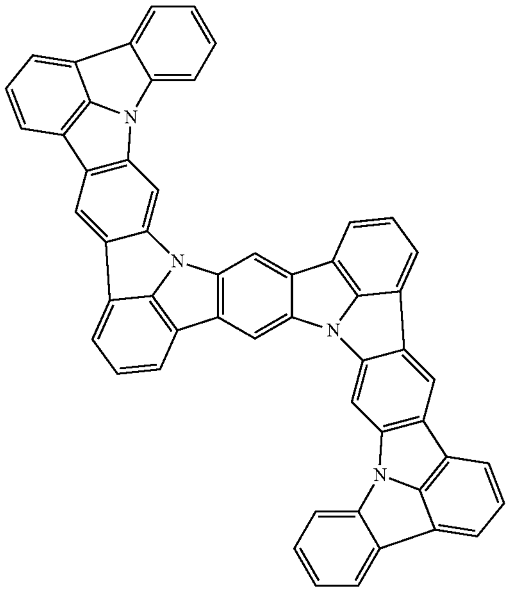
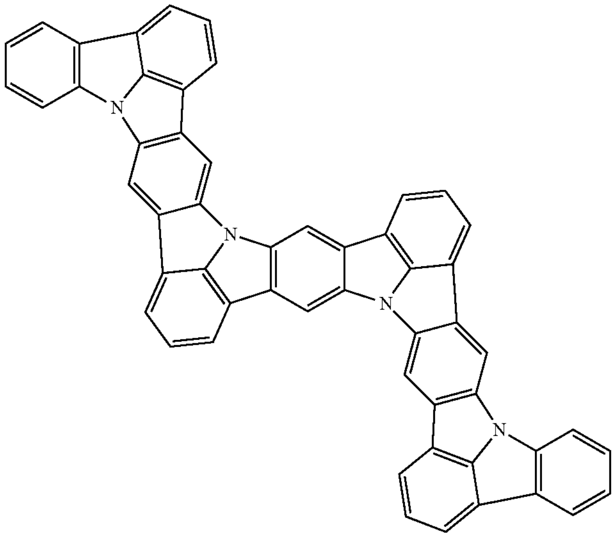

-continued
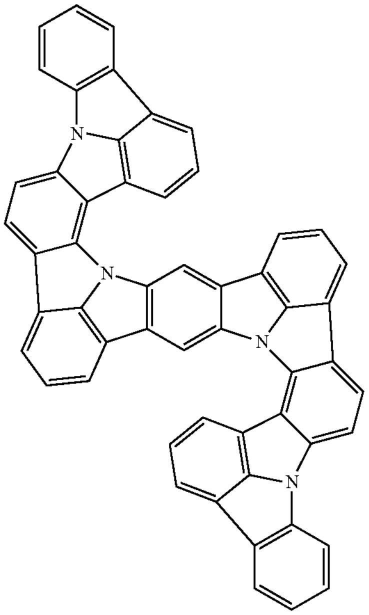
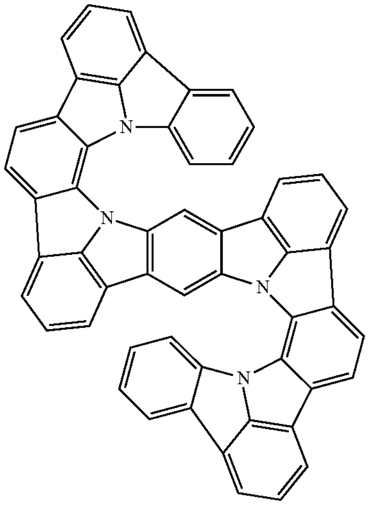
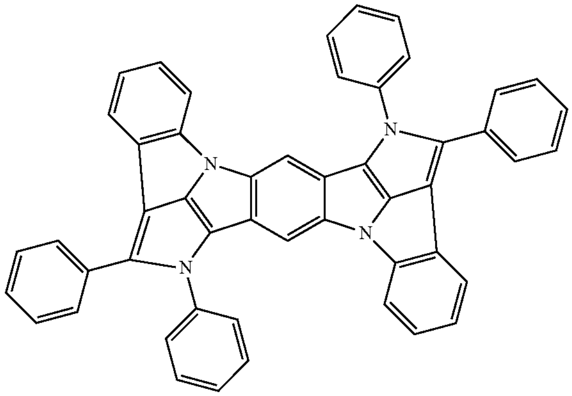
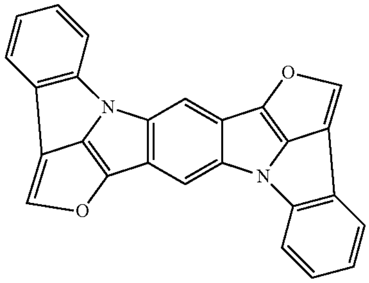
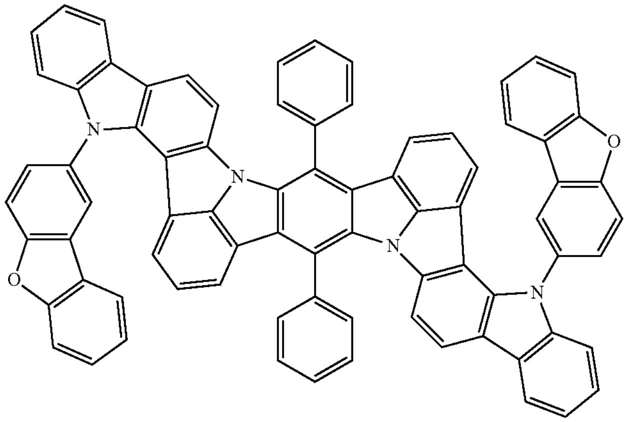

-continued
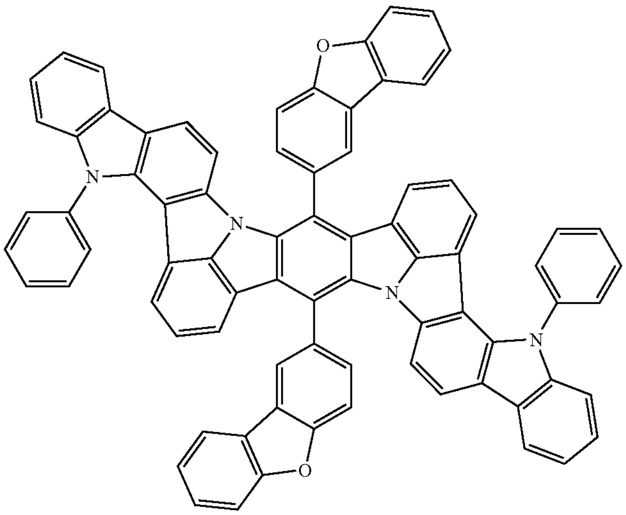
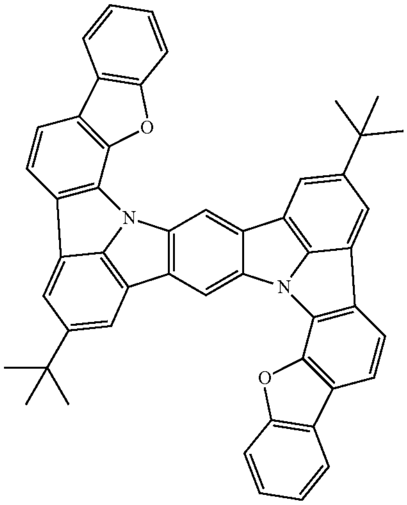
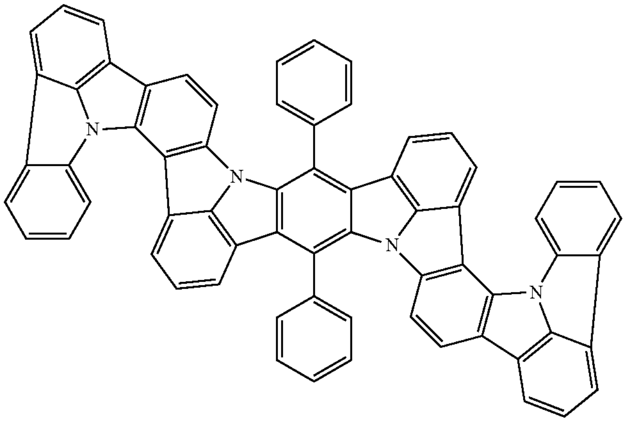
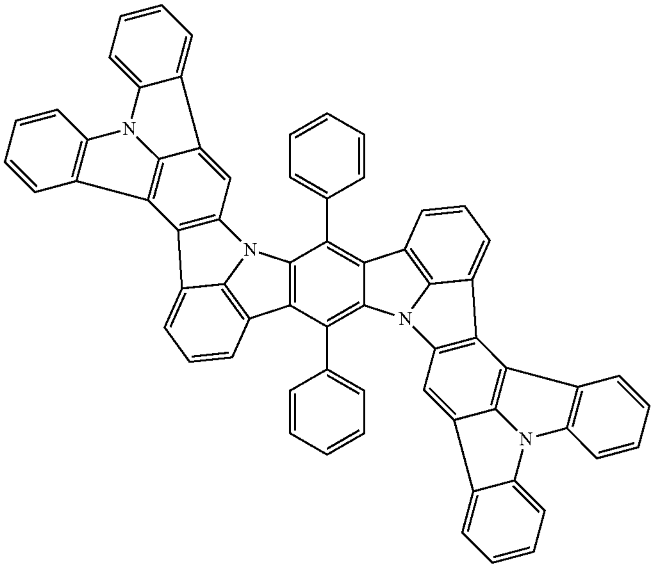

-continued
[Formula 380]
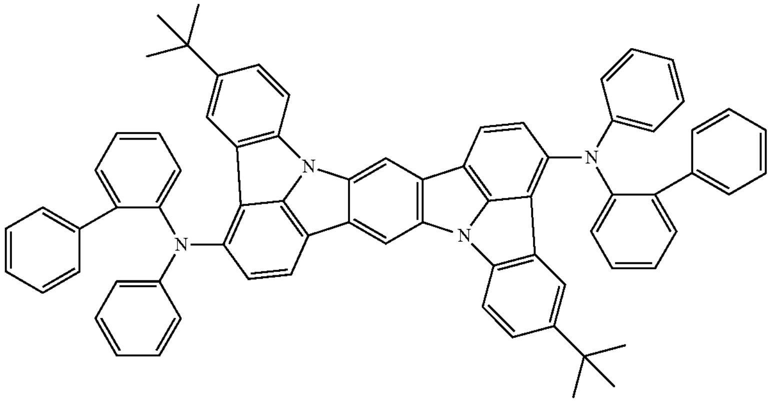
[Formula 381]
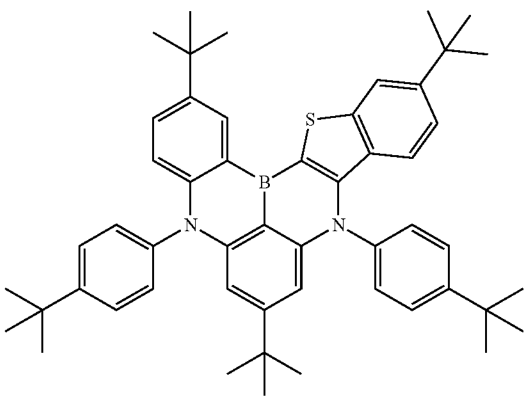
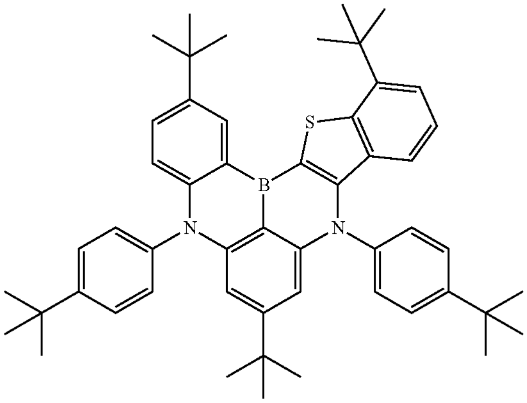
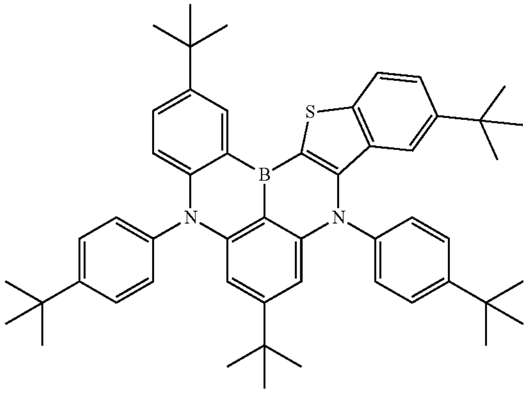
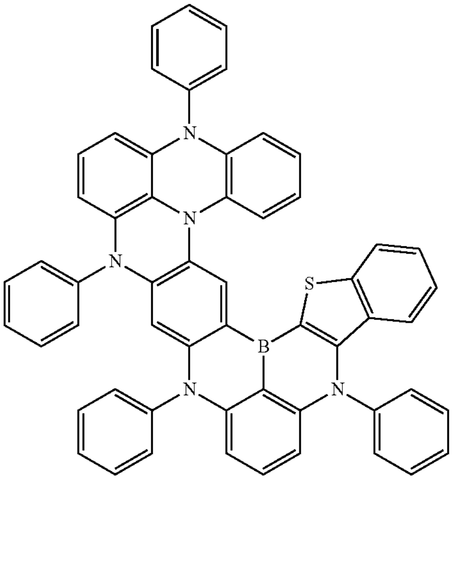

-continued

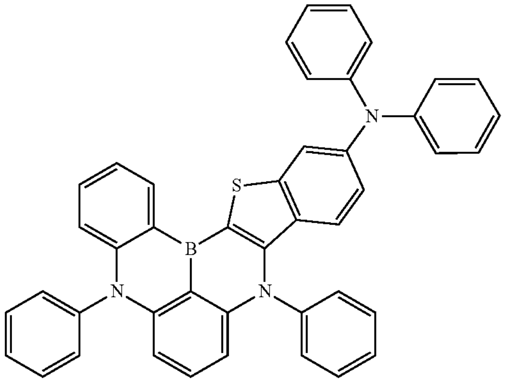

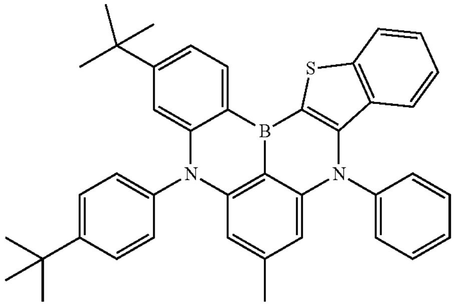

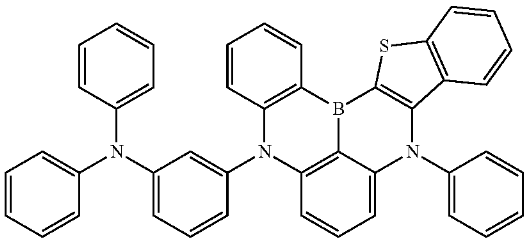

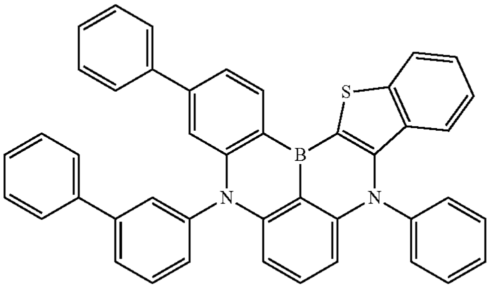

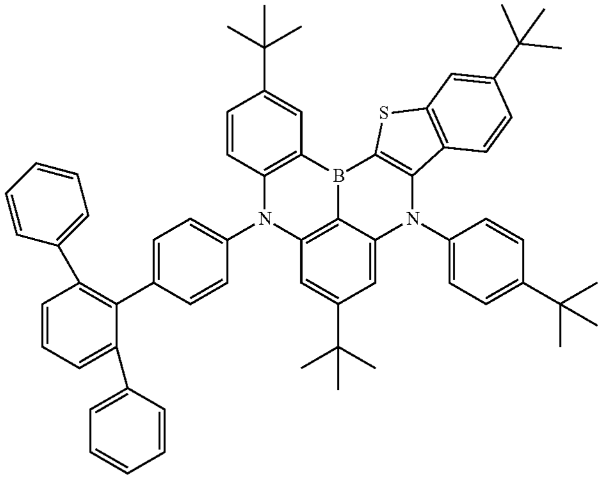

Second Exemplary Embodiment

An organic electroluminescence display device (hereinafter also referred to as an organic EL display device) according to the second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable, unless otherwise specified.

Organic Electroluminescence Display Device

The organic EL display device according to the exemplary embodiment includes an anode and a cathode disposed opposite each other, a blue-emitting organic EL device as a blue pixel, a green-emitting organic EL device as a green pixel, and a red-emitting organic EL device as a red pixel, in which the blue-emitting organic EL device includes a blue emitting region having a first emitting layer and a second emitting layer disposed between the anode and the cathode, and one of the first emitting layer and the second emitting layer is disposed in a side of the blue emitting region close to the anode, the green-emitting organic EL device includes a green emitting layer provided between the anode and the cathode, the red-emitting organic EL device includes a red emitting layer provided between the anode and the cathode, the blue-emitting organic EL device, the green-emitting organic EL device, and the red-emitting organic EL device include a hole transporting zone that is provided in a shared manner across the blue-emitting organic EL device, the green-emitting organic EL device, and the red-emitting organic EL device, between the anode and each of the blue emitting region of the blue-emitting organic EL device, the green emitting layer of the green-emitting organic EL device, and the red emitting layer of the red-emitting organic EL device, the hole transporting zone is in direct contact with the first emitting layer or the second emitting layer in the blue emitting region of the blue-emitting organic EL device, the hole transporting zone includes one or more organic layers, at least one organic layer of the organic layers in the hole transporting zone includes a hole transporting zone material, the first emitting layer contains a first host material and a first luminescent compound that emits light having a maximum peak wavelength of 500 nm or less, the second emitting layer includes a second host material and a second luminescent compound that emits light having a maximum peak wavelength of 500 nm or less, the first host material and the second host material are mutually different, the first luminescent compound and the second luminescent compound are mutually the same or different, a triplet energy of the first host material T1(H1) and a triplet energy of the second host material T1(H2) satisfy a relationship of a numerical formula (Numerical Formula 1) below, and in the blue emitting region of the blue-emitting organic EL device, an ionization potential of the hole transporting zone material Ip(HT) and an ionization potential of the first luminescent compound Ip(D1) included in the first emitting layer satisfy a relationship of a numerical formula (Numerical Formula 1X) below.

$$T_1(H1) > T_1(H2) \quad \text{(Numerical Formula 1)}$$

$$Ip(D1) - Ip(HT) < -0.05 \text{ eV} \quad \text{(Numerical Formula 1X)}$$

Herein, a layer provided in a shared manner across a plurality of devices is occasionally referred to as a common layer. Herein, a layer not provided in a shared manner across a plurality of devices is occasionally referred to as a non-common layer.

Herein, a zone provided in a shared manner across a plurality of devices is occasionally referred to as a common zone. The hole transporting zone, which is provided between the anode and each of the blue emitting region of the blue-emitting organic EL device, the green emitting layer of the green-emitting organic EL device, and the red emitting layer of the red-emitting organic EL device in a shared manner across the blue-emitting organic EL device, the green-emitting organic EL device, and the red-emitting organic EL device, is a common zone.

Herein, "blue", "green", or "red" used for each element, such as "pixel", "emitting layer", "organic layer", or "material", is used to distinguish one from another. Although "blue", "green", or "red" may represent a color of light emitted from "pixel", "emitting layer", "organic layer", or "material", "blue", "green", or "red" does not mean the color of appearance of each element.

The blue organic EL device of the organic EL display device according to the exemplary embodiment includes the first emitting layer and the second emitting layer satisfying the numerical formula (Numerical Formula 1). Therefore, luminous efficiency of the blue-emitting organic EL device is improvable because of the same reason as that in the first exemplary embodiment.

Further, the organic EL display device according to the exemplary embodiment has a layer structure in which the number of organic layers forming the hole transporting zone between the blue emitting region and the anode is reduced (i.e., layer-saving structure).

In a typical organic EL display device, a non-common layer (e.g., an electron blocking layer) that the blue-emitting organic EL device does not share with the green-emitting organic EL device and the red-emitting organic EL device is individually provided between the blue emitting region and the anode of the blue-emitting organic EL device.

In the organic EL display device according to the exemplary embodiment, the hole transporting zone (common zone) common to the blue-emitting organic EL device, the green-emitting organic EL device, and the red-emitting organic EL device is in direct contact with the first emitting layer or the second emitting layer in the blue emitting region. That is, the organic EL display device according to the exemplary embodiment does not have a non-common layer on a side of the emitting layer close to the anode in the blue-emitting organic EL device. Specifically, the number of layers for the hole transporting zone of the blue-emitting organic EL device is saved.

Meanwhile, since the organic EL display device with the layer-saving structure is likely to lack the amount of holes injected into the blue emitting region, the luminous efficiency may be decreased.

With the organic EL display device according to the exemplary embodiment, since the ionization potential Ip(HT) of the hole transporting zone material contained in at least one organic layer and the ionization potential Ip(D1) of the first luminescent compound contained in the first emitting layer satisfy the relationship of the numerical formula (Numerical Formula 1X), an energy barrier between the hole transporting zone material and the first luminescent compound is reducible. As a result, even with the reduced number of organic layers (layer-saving structure) forming the hole transporting zone, hole injection into the blue emitting region can be promoted, leading to high efficiency of the organic EL device.

Moreover, with the organic EL display device according to the exemplary embodiment, since high efficiency of the organic EL device can be ensured by selecting the hole transporting zone material and the first luminescent compound that satisfy the relationship of the numerical formula (Numerical Formula 1X), for instance, a range of choices of the first host material and the second host material is expandable.

In the organic EL display device according to the exemplary embodiment, preferably, at least one organic layer in the hole transporting zone (common zone) is the first organic layer in direct contact with the first emitting layer and the first organic layer contains the hole transporting zone material.

In the blue-emitting organic EL device according to the exemplary embodiment, each organic layer in the hole transporting zone (common zone) may or may not contain the common hole transporting zone material described in the first exemplary embodiment.

Therefore, the same components as those of the organic EL device in the first exemplary embodiment are applicable to the blue-emitting organic EL device of the exemplary embodiment.

The first emitting layer and the second emitting layer described in the first exemplary embodiment are usable as the first emitting layer and the second emitting layer included in the blue emitting region according to the exemplary embodiment.

The one or more organic layers included in the hole transporting zone of the first exemplary embodiment (e.g., the first organic layer, the second organic layer, and the third organic layer) are usable as one or more organic layers included in the hole transporting zone according to the exemplary embodiment.

Referring to FIG. 4, explanation is made about an exemplary arrangement of the organic EL display device according to the second exemplary embodiment.

FIG. 4 illustrates an organic EL display device 100A according to an exemplary embodiment.

The organic EL display device 100A includes electrodes and organic layers supported by a substrate 2A.

The organic EL display device 100A includes the anode 3 and the cathode 4 arranged opposite each other.

The organic EL display device 100A includes a blue emitting organic EL device 10B as a blue pixel, a green emitting organic EL device 10G as a green pixel, and a red emitting organic EL device 10R as a red pixel.

It should be noted that FIG. 4 schematically illustrates the organic EL display device 100A, and thus does not limit, for instance, a size of the organic EL display device 100A and a thickness of each layer thereof. For instance, in FIG. 4, the first emitting layer 51 and the second emitting layer 52 are depicted at the same thickness and the green emitting layer 53 and the red emitting layer 54 are depicted at the same thickness, but this does not necessarily mean that these layers in an actual organic EL display device have the same thickness.

The blue-emitting organic EL device 10B includes a hole transporting zone 7, a blue emitting region 5, the electron transporting layer 8, and the electron injecting layer 9 that are layered in this order from a side close to the anode 3 between the anode 3 and the cathode 4. The blue emitting region 5 includes the first emitting layer 51 and the second emitting layer 52. In an arrangement of FIG. 4, the first emitting layer 51 is in direct contact with the hole transporting zone 7.

The green-emitting organic EL device 10G includes the hole transporting zone 7, the green emitting layer 53, the electron transporting layer 8, and the electron injecting layer 9 that are layered in this order from the side close to the anode 3 between the anode 3 and the cathode 4.

The red-emitting organic EL device 10R includes the hole transporting zone 7, a red emitting region 54, the electron transporting layer 8, and the electron injecting layer 9 that are layered in this order from the side close to the anode 3 between the anode 3 and the cathode 4.

In the organic EL display device 100A, the hole transporting zone 7 is a common zone including organic layers having the number of n from an organic layer L1 to an organic layer Ln. n is 1, 2, or 3 or more. In the exemplary embodiment, the organic layer L1 is a layer in direct contact with the blue emitting region 5. The first organic layer corresponds to the organic layer L1.

For instance, in a case where the hole transporting zone consists of a single organic layer (the first organic layer), n is 1: the organic layer L1 is the first organic layer and is in direct contact with the first emitting layer of the blue-emitting organic EL device as well as the anode.

For instance, in a case where the hole transporting zone consists of two organic layers (the first organic layer and the second organic layer), n is 2: the organic layer L1 is the first organic layer, the second organic layer L2 is the second organic layer, the organic layer L1 is in direct contact with the first emitting layer of the blue-emitting organic EL device, and the organic layer L2 is in direct contact with the anode.

The anode 3 is independently provided in each of the blue emitting organic EL device 10B, the green-emitting organic EL device 10G, and the red emitting organic EL device 10R. Therefore, the blue-emitting organic EL device 10B, the green-emitting organic EL device 10G, and the red-emitting organic EL device 10R can be individually driven in the organic EL display device 100A. The respective anodes of the organic EL devices 10B, 10G, and 10R are insulated from each other by an insulation material (not depicted). The cathode 4 is provided in a shared manner across the blue emitting organic EL device 10B, the green-emitting organic EL device 10G, and the red emitting organic EL device 10R.

In an exemplary embodiment, the blue-emitting organic EL device 10B, the green-emitting organic EL device 10G, and the red-emitting organic EL device 10R as pixels are arranged in parallel with each other on the substrate 2A.

FIG. 5 schematically illustrates another exemplary arrangement of the organic EL display device according to the second exemplary embodiment.

An organic EL display device 200 has the same arrangement as that of the organic EL display device 100A depicted in FIG. 4 except for a green-emitting organic EL device 20G as a green pixel, and a red organic EL device 20R as a red pixel. Differences from the organic EL display device 100A will be described.

The green-emitting organic EL device 20G includes the hole transporting zone 7, a green organic layer 531, the green emitting layer 53, the electron transporting layer 8, and the electron injecting layer 9 that are layered in this order from the side close to the anode 3 between the anode 3 and the cathode 4. In an arrangement of FIG. 5, the green organic layer 531 is in direct contact with the hole transporting zone 7. The green organic layer 531 is preferably an electron blocking layer.

The red-emitting organic EL device 20R includes the hole transporting zone 7, a red organic layer 541, the red emitting layer 54, the electron transporting layer 8, and the electron injecting layer 9 that are layered in this order from the side close to the anode 3 between the anode 3 and the cathode 4. In the arrangement of FIG. 5, the red organic layer 541 is in direct contact with the hole transporting zone 7. The red organic layer 541 is preferably an electron blocking layer.

Also in the organic EL display device depicted in FIG. 5, an energy barrier between the hole transporting zone material and the first luminescent compound is reducible by using the hole transporting zone material and the first luminescent compound that satisfy the relationship of the numerical formula (Numerical Formula 1X). As a result, even with the reduced number of organic layers (layer-saving structure) forming the hole transporting zone, hole injection into the emitting region can be promoted, easily leading to high efficiency of the organic EL device.

The invention is not limited to the arrangements of the organic EL display device illustrated in FIGS. 4 and 5.

Moreover, in the organic EL display devices illustrated in FIGS. 4 and 5, the green-emitting organic EL device and the red-emitting organic EL device may be a device that fluoresces or a device that phosphoresces.

Further, in the organic EL display devices illustrated in FIGS. 4 and 5, as described later, the green emitting layer 53 may be an emitting layer containing a compound that emits delayed fluorescence or the red emitting layer 54 may be an emitting layer containing a delayed fluorescent compound.

Referring to FIG. 4, the organic EL display device according to the second exemplary embodiment is further explained.

Hole Transporting Zone

The hole transporting zone 7, which is provided between the anode 3 and each of the blue emitting region 5 of the blue-emitting organic EL device 10B, the green emitting layer 53 of the green-emitting organic EL device 10G, and the red emitting layer 54 of the red-emitting organic EL device 10R, is a common zone provided in a shared manner across the blue-emitting organic EL device 10B, the green-emitting organic EL device 10G, and the red-emitting organic EL device 10R.

In a case where the hole transporting zone 7 includes a plurality of layers, each layer is provided between the anode 3 and each of the blue emitting region 5 of the blue-emitting organic EL device 10B, the green emitting layer 53 of the green-emitting organic EL device 10G, and the red emitting layer 54 of the red-emitting organic EL device 10R, each layer being a common layer provided in a shared manner across the blue-emitting organic EL device 10B, the green-emitting organic EL device 10G, and the red-emitting organic EL device 10R.

In an exemplary embodiment, at least one organic layer of the organic layers (the organic layer L1 to the organic layer Ln) in the hole transporting zone 7 contains the hole transporting zone material, and the hole mobility of the hole transporting zone material is preferably $1.0\times10^{-5}$ $cm^2/Vs$ or more, more preferably $5.0\times10^{-5}$ $cm^2/Vs$ or more, and still more preferably $1.0\times10^{-4}$ $cm^2/Vs$ or more.

At $1.0\times10^{-5}$ $cm^2/Vs$ or more of the hole mobility of the hole transporting zone material contained in the hole transporting zone, transfer of holes from the hole transporting zone, which is a common zone, to the blue emitting region becomes easier. Therefore, even with the layer-saving structure of the hole transporting zone, where the supply amount of holes to the blue emitting region tends to be insufficient, high efficiency can be achieved more easily.

At least two organic layers of the organic layers in the hole transporting zone 7 also preferably contain the hole transporting zone material.

As the hole transporting zone material, for instance, the doped compound described in the first exemplary embodiment, a compound represented by the formula (21), a compound represented by the formula (22), and a compound usable for the hole transporting layer are usable.

As the organic layers having the number of n included in the hole transporting zone 7, for instance, one or more layers selected from the group consisting of the first organic layer, the second organic layer, the third organic layer, the hole injecting layer, and the hole transporting layer described in the first exemplary embodiment are usable in combination.

Hole mobility can be measured by measuring impedance using a device for mobility evaluation produced according to the following steps. The device for mobility evaluation is produced, for instance, according to the following steps.

A compound HA-2 below is vapor-deposited on a glass substrate having an ITO transparent electrode (anode) so as to cover the transparent electrode, thereby forming a hole injecting layer. A compound HT-A was vapor-deposited on the hole injecting layer to form a hole transporting layer. Subsequently, a compound Target, which is to be measured for the hole mobility, is vapor-deposited to form a measurement target layer. Metal aluminum (Al) is vapor-deposited on the measurement target layer to form a metal cathode.

An arrangement of the above device for mobility evaluation is roughly shown as follows.

$$ITO(130)/HA\text{-}2(5)/HT\text{-}A(10)/\text{Target}(200)/\text{Al}(80)$$

Numerals in parentheses represent a film thickness (nm).

[Formula 382]

HA-2

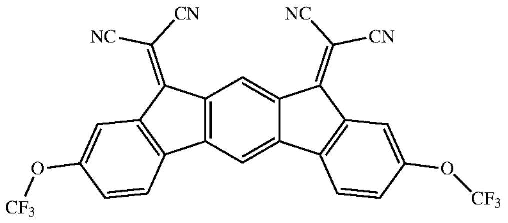

HT-A

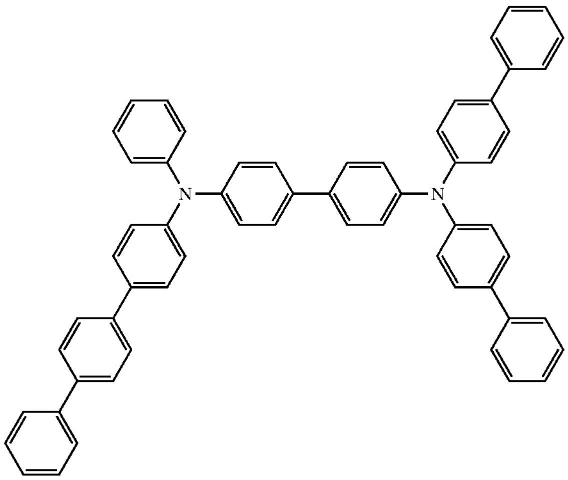

The device for evaluating hole mobility is set in an impedance measurement apparatus and an impedance measurement is performed. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using a relationship of a calculation formula (C1) below.

$$M = j\omega Z \quad \text{Calculation Formula (C1)}$$

In the calculation formula (C1), j is an imaginary unit whose square is −1 and ω is an angular frequency [rad/s].

In a bode plot in which an imaginary part of the modulus M is represented by an ordinate axis and the frequency [Hz] was represented by an abscissa axis, an electrical time constant τ of the device for mobility evaluation is obtained from a frequency fmax showing a peak using the above calculation formula (C2).

$$T = 1/(2\pi f\text{max}) \quad \text{Calculation Formula (C2)}$$

π in the calculation formula (C2) is a symbol representing a circumference ratio.

A hole mobility is calculated from a relationship of a calculation formula (C3) below using τ obtained according to the calculation formula (C2).

$$\mu h = d^2 / (V\tau) \quad \text{Calculation Formula (C3)}$$

d in the calculation formula (C3) is a total film thickness of organic thin film(s) forming the device. In a case of the device arrangement for hole mobility evaluation, d=215 [nm] is satisfied.

The hole mobility herein is a value obtained in a case where a square root of an electric field intensity meets $E^{1/2}=500$ [$V^{1/2}/cm^{1/2}$]. The square root of the electric field intensity, $E^{1/2}$, can be calculated from a relationship of a calculation formula (C4) below.

$$E^{1/2} = V^{1/2} / d^{1/2} \quad \text{Calculation Formula (C4)}$$

For the impedance measurement, a 1260 type by Solartron Analytical is used as the impedance measurement apparatus, and for a higher accuracy, a 1296 type dielectric constant measurement interface by Solartron Analytical can be used together therewith.

Blue-Emitting Organic EL Device

In an exemplary embodiment, the blue-emitting organic EL device 10B includes the anode 3, the hole transporting zone 7, the blue emitting region 5, the electron transporting layer 8, the electron injecting layer 9, and the cathode 4 in this order. It should be noted that the blue-emitting organic EL device 10B may include a layer different from the layers depicted in FIG. 4.

First Emitting Layer and Second Emitting Layer

The blue emitting region 5 includes the first emitting layer 51 and the second emitting layer 52. The blue emitting region 5 has the same arrangement as that of the emitting region of the first exemplary embodiment. A preferable range is also the same.

A triplet energy $T_1$(D1) of the first luminescent compound contained in the first emitting layer 51 is preferably 2.1 eV or more, more preferably 2.2 eV or more, for the same reasons as those in the first exemplary embodiment. The upper limit of the triplet energy $T_1$(D1) of the first luminescent compound is preferably 2.8 eV or less in terms of stability of the compounds.

Green-Emitting Organic EL Device

In an exemplary embodiment, the green-emitting organic EL device 10G includes the anode 3, the hole transporting zone 7, the green emitting region 53, the electron transporting layer 8, the electron injecting layer 9, and the cathode 4 in this order. It should be noted that the green-emitting organic EL device 10G may include a layer different from the layers depicted in FIG. 4.

Green Emitting Layer

In an exemplary embodiment, the green emitting layer 53 is provided between the hole transporting zone 7 and the electron transporting layer 8 and is in direct contact with the electron transporting layer 8.

In the organic EL display device of the exemplary embodiment, the green emitting layer preferably contains a host material. For instance, the green emitting layer contains 50 mass % or more of the host material with respect to the total mass of the green emitting layer.

In the organic EL display device of the exemplary embodiment, the green emitting layer of the green-emitting organic EL device preferably at least contains a green luminescent compound that emits light having a maximum peak wavelength in a range from 500 nm to 550 nm. The green luminescent compound is preferably a fluorescent compound that emits fluorescence having a maximum peak wavelength in a range from 500 nm to 550 nm. The green luminescent compound is also preferably a phosphorescent compound that emits phosphorescence having a maximum peak wavelength in a range from 500 nm to 550 nm. Herein, the green light emission refers to light emission in which a maximum peak wavelength of emission spectrum is in a range from 500 nm to 550 nm.

The fluorescent compound is a compound capable of emitting in a singlet state. The phosphorescent compound is a compound capable of emitting in a triplet state.

Examples of a green fluorescent compound usable for the green emitting layer include an aromatic amine derivative. Examples of a green phosphorescent compound usable for the green emitting layer include an iridium complex.

In the organic EL display device of the exemplary embodiment, the green emitting layer may contain a delayed fluorescent compound, as described later.

Maximum Phosphorescence Peak Wavelength (PH-Peak)

A maximum peak wavelength (maximum phosphorescence peak wavelength) of a phosphorescent compound is measurable by the following method.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescence spectrum (ordinate axis: phosphorescent luminous intensity, abscissa axis: wavelength) of the measurement sample is measured at a low temperature (77K). The local maximum value closest to the short-wavelength region among the local maximum values of the phosphorescence spectrum is defined as the maximum phosphorescence peak wavelength. A spectrophotofluorometer F-7000 produced by Hitachi High-Tech Science Corporation can be used to measure phosphorescence. The measurement apparatus is not limited to this arrangement. A combination of a cooling unit, a low temperature container, an excitation light source and a light-receiving unit may be used for measurement. Herein, the maximum peak wavelength of phosphorescence is occasionally referred to as the maximum phosphorescence peak wavelength (PH-peak).

Green Organic Layer

In the organic EL display device of the exemplary embodiment, the green-emitting organic EL device preferably includes the green organic layer between the green emitting layer and the hole transporting zone. The green organic layer may be in direct contact with the hole transporting zone. Moreover, the green organic layer may be in direct contact with the green emitting layer.

The green organic layer contains a green organic material. The hole transporting material according to the second exemplary embodiment or the hole transporting zone material according to the first exemplary embodiment is usable as the green organic material. Although the green organic material and the hole transporting zone material contained in the hole transporting zone may be the same compound or different compounds, the green organic material is preferably different from the hole transporting zone material. The hole mobility of the green organic material is preferably larger than the hole mobility of the hole transporting zone material contained in the hole transporting zone. The green organic material is a compound different from the host material and the green luminescent compound contained in the green emitting layer.

In the organic EL display device of the exemplary embodiment, an emission position in the green-emitting organic EL device is easily adjustable by providing the green organic layer in the green-emitting organic EL device.

Red-Emitting Organic EL Device

In an exemplary embodiment, the red-emitting organic EL device 10R includes the anode 3, the hole transporting zone 7, the red emitting layer 54, the electron transporting layer 8, the electron injecting layer 9, and the cathode 4 in this order. It should be noted that the red-emitting organic EL device 10R may include a layer different from the layers depicted in FIG. 4.

Red Emitting Layer

In an exemplary embodiment, the red emitting layer 54 is provided between the hole transporting zone 7 and the electron transporting layer 8 and is in direct contact with the electron transporting layer 8.

In the organic EL display device of the exemplary embodiment, the red emitting layer preferably contains a host material. For instance, the red emitting layer 54 contains 50 mass % or more of the host material with respect to the total mass of the red emitting layer 54.

In the organic EL display device of the exemplary embodiment, the red emitting layer of the red-emitting organic EL device preferably at least contains a red luminescent compound that emits light having a maximum peak wavelength in a range from 600 nm to 640 nm. The red luminescent compound is preferably a fluorescent compound that emits fluorescence having a maximum peak wavelength in a range from 600 nm to 640 nm. The red luminescent compound is also preferably a phosphorescent compound that emits phosphorescence having a maximum peak wavelength in a range from 600 nm to 640 nm. Herein, the red light emission refers to light emission in which a maximum peak wavelength of emission spectrum is in a range from 600 nm to 640 nm.

Examples of a red fluorescent compound usable for the red emitting layer include a tetracene derivative and a diamine derivative. Examples of a red phosphorescent compound usable for the red emitting layer include metal complexes such as an iridium complex, platinum complex, terbium complex, and europium complex.

In the organic EL display device of the exemplary embodiment, the red emitting layer may contain a delayed fluorescent compound, as described later.

Red Organic Layer

In the organic EL display device of the exemplary embodiment, the red-emitting organic EL device preferably includes the red organic layer between the red emitting layer and the hole transporting zone. The red organic layer may be in direct contact with the hole transporting zone. Moreover, the red organic layer may be in direct contact with the red emitting layer.

The red organic layer contains a red organic material. The hole transporting material according to the second exemplary embodiment or the hole transporting zone material according to the first exemplary embodiment is usable as the red organic material. Although the red organic material and the hole transporting zone material contained in the hole transporting zone may be the same compound or different compounds, the red organic material is preferably different from the hole transporting zone material. The hole mobility of the red organic material is preferably larger than the hole mobility of the hole transporting zone material contained in the hole transporting zone. The red organic material is a compound different from the host material and the red luminescent compound contained in the red emitting layer.

Although the red organic material contained in the red organic layer of the red-emitting organic EL device and the green organic material contained in the green emitting layer of the green-emitting organic EL device may be the same compound or different compounds, the red organic material is preferably different from the green organic material. The hole mobility of the red organic material is preferably larger than the hole mobility of the green organic material.

A film thickness of the red organic layer is preferably larger than a film thickness of the green organic layer.

In the organic EL display device of the exemplary embodiment, an emission position in the red-emitting organic EL device is easily adjustable by providing the red organic layer in the red-emitting organic EL device.

The host material contained in the green emitting layer and the host material contained in the red emitting layer are preferably, for instance, a compound for dispersing a highly emittable substance (dopant material) in the emitting layers. As the host material contained in the green emitting layer and the host material contained in the red emitting layer, it is preferable to use, for instance, a substance having a higher Lowest Unoccupied Molecular Orbital (LUMO) level and a lower Highest Occupied Molecular Orbital (HOMO) level than the highly emittable substance.

For instance, the following compounds (1) to (4) can be each independently used as the host material contained in the green emitting layer and the host material contained in the red emitting layer.

(1) a metal complex such as an aluminum complex, beryllium complex, and zinc complex
(2) a heterocyclic compound such as an oxadiazole derivative, benzimidazole derivative, or phenanthroline derivative
(3) a fused aromatic compound such as a carbazole derivative, anthracene derivative, phenanthrene derivative, pyrene derivative or chrysene derivative
(4) an aromatic amine compound such as a triarylamine derivative or a fused polycyclic aromatic amine derivative In the organic EL display device of the exemplary embodiment, at least one of the green-emitting organic EL device or the red-emitting organic EL device may contain a delayed fluorescent compound. The delayed fluorescent compound is preferably not a metal complex. The delayed fluorescent compound is preferably an organic compound having no metal atom.

In the organic EL display device of the exemplary embodiment, in a case where at least one of the green-emitting organic EL device or the red-emitting organic EL device contains a delayed fluorescent compound, at least one of the green emitting layer of the green-emitting organic EL device or the red emitting layer of the red-emitting organic EL device preferably contains the delayed fluorescent compound. An emitting layer containing the delayed fluorescent compound is occasionally referred to as a delayed fluorescent layer.

The delayed fluorescent layer preferably contains the delayed fluorescent compound as the host material. The delayed fluorescent layer preferably contains the delayed fluorescent compound as the host material and the fluorescent compound. A singlet energy of the delayed fluorescent compound as the host material is preferably larger than a singlet energy of the fluorescent compound.

The delayed fluorescent layer preferably does not contain a heavy-metal complex and a phosphorescent rare earth metal complex. Examples of the heavy-metal complex herein include iridium complex, osmium complex, and platinum complex. The delayed fluorescent layer also preferably does not contain a metal complex.

In the organic EL display device of the exemplary embodiment, the emitting layer containing the delayed fluorescent compound may contain a first organic material having an affinity smaller than an affinity of the delayed fluorescent compound. Specifically, it is preferable that the delayed fluorescent layer contains the delayed fluorescent compound and the first organic material, and an affinity of the delayed fluorescent compound Af(M2) and an affinity of the first organic material Af(M1) satisfy a relationship of a numerical formula (Numerical Formula 6A) below.

$$Af(M2)-Af(M1)>0\text{ eV} \quad \text{(Numerical Formula 6A)}$$

A value of the affinity Af of a measurement target (compound or material) is calculated according to a numerical formula (Numerical Formula 6) below. A unit of the affinity Af is eV.

$$Af=-1.19\times(Ere-Efc)-4.78\text{ eV} \quad \text{(Numerical Formula 6)}$$

In the numerical formula (Numerical Formula 6), Ere and Efc are as follows.

Ere: first reduction potential of the measurement compound (DPV, Negative scan)

Efc: first oxidation potential of ferrocene (DPV, Positive scan), (ca. +0.55V vs Ag/AgCl)

A redox potential is measured by a differential pulse voltammetry (DPV) method using an electrochemical analyzer (CHI630B manufactured by ALS).

A sample solution used for the measurement is prepared by containing: N,N-dimethylformamide (DMF) as a solvent; a measurement target dissolved at a concentration of 1.0 mmol/L in the solvent; and tetrabutylammonium hexafluorophosphate (TBHP), as a supporting electrolyte, dissolved at a concentration of 100 mmol/L in the solvent. A glassy carbon electrode is used as a working electrode. A platinum (Pt) electrode is used as an opposite electrode.

A singlet energy of the first organic material is preferably larger than a singlet energy of the delayed fluorescent compound.

In the organic EL display device of the exemplary embodiment, the delayed fluorescent layer also preferably contains the first organic material, the delayed fluorescent compound as the host material, and the fluorescent compound. In this case, it is preferable that the singlet energy of the first organic material is larger than the singlet energy of the delayed fluorescent compound, and the singlet energy of the delayed fluorescent compound is larger than the singlet energy of the fluorescent compound.

In the organic EL display device of the exemplary embodiment, of the green emitting layer and the red emitting layer, the emitting layer not containing the delayed fluorescent compound also preferably contains a phosphorescent compound. For instance, in a case where the green emitting layer contains the delayed fluorescent compound and the red emitting layer does not contain the delayed fluorescent compound, the red emitting layer contains the phosphorescent compound. In the organic EL display device of the exemplary embodiment, it is also preferable that the green emitting layer and the red emitting layer do not contain the delayed fluorescent compound and the phosphorescent compound at the same time.

Delayed Fluorescence

Delayed fluorescence is explained in "Yuki Hando-tai no Debaisu Bussei (Device Physics of Organic Semiconductors)" (edited by ADACHI, Chihaya, published by Kodansha, on pages 261-268). This document describes that, if an energy difference $\Delta E_{13}$ of a fluorescent material between a singlet state and a triplet state is reducible, a reverse energy transfer from the triplet state to the singlet state, which usually occurs at a low transition probability, would occur at a high efficiency to express thermally activated delayed fluorescence (TADF). Further, a generation mechanism of delayed fluorescence is explained in FIG. 10.38 in the document. The delayed fluorescent compound (delayed fluorescent material) of the exemplary embodiment is preferably a compound emitting thermally activated delayed fluorescence generated by such a mechanism.

In general, emission of delayed fluorescence can be confirmed by measuring the transient PL (Photo Luminescence).

The behavior of delayed fluorescence can also be analyzed based on the decay curve obtained from the transient PL measurement. The transient PL measurement is a method of irradiating a sample with a pulse laser to excite the sample, and measuring the decay behavior (transient characteristics) of PL emission after the irradiation is stopped. PL emission in TADF materials is classified into a light emission component from a singlet exciton generated by the first PL excitation and a light emission component from a singlet exciton generated via a triplet exciton. The lifetime of the singlet exciton generated by the first PL excitation is on the order of nanoseconds and is very short. Therefore, light emission from the singlet exciton rapidly attenuates after irradiation with the pulse laser.

On the other hand, the delayed fluorescence is gradually attenuated due to light emission from a singlet exciton generated via a triplet exciton having a long lifetime. As described above, there is a large temporal difference between the light emission from the singlet exciton generated by the first PL excitation and the light emission from the singlet exciton generated via the triplet exciton. Therefore, the luminous intensity derived from delayed fluorescence can be determined.

FIG. 6 is a schematic diagram of an exemplary apparatus for measuring the transient PL. An example of a method of measuring a transient PL as illustrated in FIG. 6 and an example of behavior analysis of delayed fluorescence will be described.

A transient PL measuring apparatus 100 in FIG. 6 includes: a pulse laser 101 capable of radiating a light having a predetermined wavelength; a sample chamber 102 configured to house a measurement sample; a spectrometer 103 configured to divide a light radiated from the measurement sample; a streak camera 104 configured to provide a two-dimensional image; and a personal computer 105 configured to import and analyze the two-dimensional image. An apparatus for measuring the transient PL is not limited to the apparatus illustrated in FIG. 6

The sample housed in the sample chamber 102 is obtained by forming a thin film, in which a matrix material is doped with a doping material at a concentration of 12 mass %, on the quartz substrate.

The thin film sample housed in the sample chamber 102 is irradiated with the pulse laser from the pulse laser 101 to excite the doping material. Emission is extracted in a direction of 90 degrees with respect to a radiation direction of the excited light. The extracted emission is divided by the spectrometer 103 to form a two-dimensional image in the streak camera 104. As a result, the two-dimensional image is obtainable in which the ordinate axis represents a time, the abscissa axis represents a wavelength, and a bright spot represents a luminous intensity. When this two-dimensional image is taken out at a predetermined time axis, an emission spectrum in which the ordinate axis represents the luminous intensity and the abscissa axis represents the wavelength is obtainable. Moreover, when this two-dimensional image is taken out at the wavelength axis, a decay curve (transient PL) in which the ordinate axis represents a logarithm of the luminous intensity and the abscissa axis represents the time is obtainable.

For instance, a thin film sample A was prepared as described above from a reference compound H1 as the matrix material and a reference compound D1 as the doping material and was measured in terms of the transient PL.

[Formula 383]

Reference Compound H1

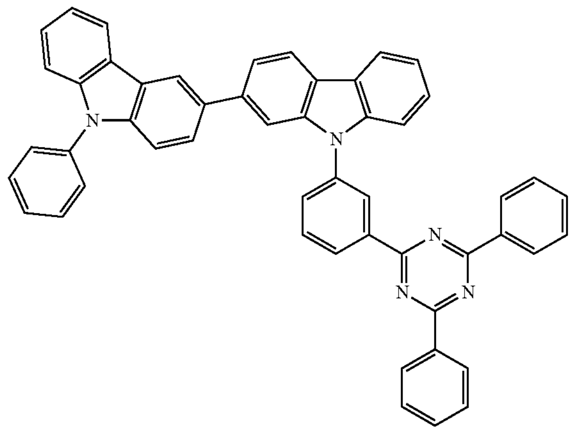

Reference Compound D1

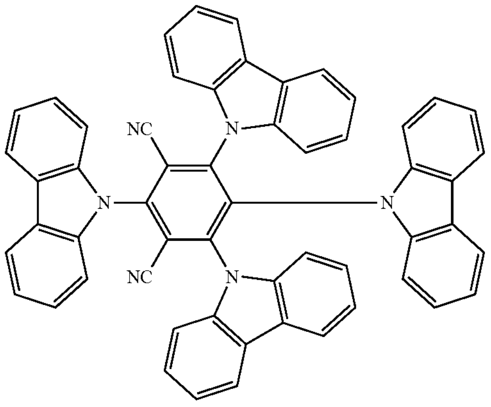

The decay curve was analyzed with respect to the above thin film sample A and a thin film sample B. The thin film sample B was produced in the same manner as described above from a reference compound H2 as the matrix material and the reference compound D1 as the doping material.

FIG. 7 illustrates decay curves obtained from transient PL obtained by measuring the thin film samples A and B.

[Formula 384]

Reference Compound H2

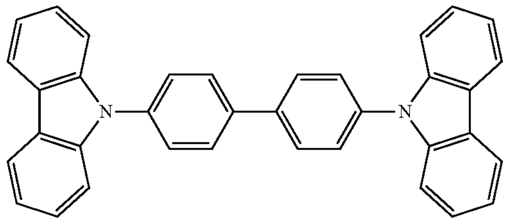

As described above, an emission decay curve in which the ordinate axis represents the luminous intensity and the abscissa axis represents the time can be obtained by the transient PL measurement. Based on the emission decay curve, a fluorescence intensity ratio between fluorescence emitted from a singlet state generated by photo-excitation and delayed fluorescence emitted from a singlet state generated by reverse energy transfer via a triplet state can be estimated. In a delayed fluorescent material, a ratio of the intensity of the slowly decaying delayed fluorescence to the intensity of the promptly decaying fluorescence is relatively large.

Specifically, Prompt emission and Delay emission are present as emission from the delayed fluorescent material. Prompt emission is observed promptly when the excited state is achieved by exciting the compound of the exemplary embodiment with a pulse beam (i.e., a beam emitted from a pulse laser) having a wavelength absorbable by the delayed fluorescent material. Delay emission is observed not promptly when the excited state is achieved but after the excited state is achieved.

Herein, a sample produced by the following method is used for measuring delayed fluorescence of the delayed fluorescent material. For instance, the delayed fluorescent material is dissolved in toluene to prepare a dilute solution with an absorbance of 0.05 or less at the excitation wavelength to eliminate the contribution of self-absorption. In order to prevent quenching due to oxygen, the sample solution is frozen and degassed and then sealed in a cell with a lid under an argon atmosphere to obtain an oxygen-free sample solution saturated with argon.

The fluorescence spectrum of the sample solution is measured with a spectrofluorometer FP-8600 (produced by JASCO Corporation), and the fluorescence spectrum of a 9,10-diphenylanthracene ethanol solution is measured under the same conditions. Using the fluorescence area intensities of both spectra, the total fluorescence quantum yield is calculated by an equation (1) in Morris et al. J. Phys. Chem. 80 (1976) 969.

An amount of Prompt emission, an amount of Delay emission and a ratio between the amounts thereof can be obtained according to the method as described in "Nature 492, 234-238, 2012" (Reference Document 1). The amount of Prompt emission and the amount of Delay emission may be calculated using an apparatus different from one described in Reference Document 1 or one shown in FIG. 6

In the exemplary embodiment, provided that an amount of Prompt emission of a measurement target compound (delayed fluorescent material) is denoted by $X_P$ and an amount of Delay emission is denoted by $X_D$, a value of $X_D/X_P$ is preferably 0.05 or more.

The amounts of Prompt emission and Delay emission and a ratio of the amounts thereof in compounds other than the delayed fluorescent material herein are measured in the same manner as those of the delayed fluorescent material.

Referring to FIG. 4, the organic EL display device according to the second exemplary embodiment is further explained. Descriptions on the same arrangements as those of the organic EL device according to the first exemplary embodiment are simplified or omitted.

Anode

In an exemplary embodiment, the anode 3 is arranged opposite to the cathode 4.

In an exemplary embodiment, the anode 3 is typically the non-common layer. In an exemplary embodiment, for instance, when the anode 3 is the non-common layer, the respective anodes in the blue-emitting organic EL device 10B, the green-emitting organic EL device 10G and the red-emitting organic EL device 10R are physically separated from each other, and specifically, may be insulated from each other by an insulation material (not illustrated in the drawings) or the like.

Cathode

In an exemplary embodiment, the cathode 4 is arranged opposite to the anode 3.

In an exemplary embodiment, the cathode 4 may be the common layer or the non-common layer.

In an exemplary embodiment, the cathode 4 is preferably the common layer provided in a shared manner across the blue-emitting organic EL device 10B, the green-emitting organic EL device 10G, and the red-emitting organic EL device 10R.

In an exemplary embodiment, the cathode 4 is in direct contact with the electron injecting layer 9.

In an exemplary embodiment, in a case where the cathode 4 is a common layer, the film thickness of the cathode 4 is constant over the blue-emitting organic EL device 10B, the green-emitting organic EL device 10G, and the red-emitting organic EL device 10R. When the cathode 4 is the common layer, the cathode 4 provided for the blue-emitting organic EL device 10B, the green-emitting organic EL device 10G, and the red-emitting organic EL device 10R can be produced without changing a mask or the like. The organic EL display device 100A thus has enhanced productivity.

Electron Transporting Layer

In an exemplary embodiment, the electron transporting layer 8 is the common layer provided in a shared manner across the blue-emitting organic EL device 10B, the green-emitting organic EL device 10G, and the red-emitting organic EL device 10R.

In an exemplary embodiment, the electron transporting layer 8 is provided between the electron injecting layer 9 and the emitting layers of the blue-emitting organic EL device 10B, the green-emitting organic EL device 10G, and the red-emitting organic EL device 10R.

In an exemplary embodiment, the side of the electron transporting layer 8 close to the anode 3 is in direct contact with the second emitting layer 52, the green emitting layer 53, and the red emitting layer 54.

The side of the electron transporting layer 8 close to the cathode 4 is in direct contact with the electron injecting layer 9.

In an exemplary embodiment, the electron transporting layer 8 is the common layer. In this case, the film thickness of the electron transporting layer 8 is constant over the blue-emitting organic EL device 10B, the green-emitting organic EL device 10G, and the red-emitting organic EL device 10R. When the electron transporting layer 8 is the common layer, the electron transporting layer 8 provided for the blue-emitting organic EL device 10B, the green-emitting organic EL device 10G, and the red-emitting organic EL device 10R can be produced without changing a mask or the like. The organic EL display device 100A thus has enhanced productivity.

Electron Injecting Layer

In an exemplary embodiment, the electron injecting layer 9 is the common layer provided in a shared manner across the blue-emitting organic EL device 10B, the green-emitting organic EL device 10G, and the red-emitting organic EL device 10R.

In an exemplary embodiment, the electron injecting layer 9 is disposed between the electron transporting layer 8 and the cathode 4.

In an exemplary embodiment, the electron injecting layer 9 is in direct contact with the electron transporting layer 8.

In an exemplary embodiment, the electron injecting layer 9 is the common layer. In this case, the film thickness of the electron injecting layer 9 is constant over the blue-emitting organic EL device 10B, the green-emitting organic EL device 10G, and the red-emitting organic EL device 10R. When the electron injecting layer 9 is the common layer, the electron injecting layer 9 provided for the blue-emitting organic EL device 10B, the green-emitting organic EL device 10G, and the red-emitting organic EL device 10R can be produced without changing a mask or the like. The organic EL display device 100A thus has enhanced productivity.

In an exemplary embodiment, any other layer than the first emitting layer 51, the second emitting layer 52, the green emitting layer 53, the red emitting layer 54, the green organic layer 531, and the red organic layer 541 is preferably provided in a shared manner across the blue-emitting organic EL device 10B, the green-emitting organic EL device 10G, and the red-emitting organic EL device 10R. Reducing the number of non-common layers in the organic EL display device 100A improves productivity of the device.

Method of Producing Organic EL Display Device

Explanation is made about a producing method of the organic EL display device 100A (FIG. 4) according to an exemplary embodiment.

First, the anode 3 is formed on the substrate 2A.

Subsequently, the organic layers (the organic layer L1 to the organic layer Ln) as the common layers are sequentially formed on the anode 3, forming the hole transporting zone 7 as the common zone. Respective organic layers in the hole transporting zone 7 of the blue-emitting organic EL device 10B, the green-emitting organic EL device 10G, and the red-emitting organic EL device 10R are formed of the same material at the same film thickness.

Subsequently, the first emitting layer 51 is formed on the hole transporting zone 7 in a region corresponding to the anode 3 of the blue-emitting organic EL device 10B using a predetermined film-forming mask (mask for the blue-emitting organic EL device). Subsequent to formation of the first emitting layer 51, the second emitting layer 52 is formed on the first emitting layer 51.

Subsequently, the green emitting layer 53 is formed at a predetermined thickness on the hole transporting zone 7 in a region corresponding to the anode 3 of the green-emitting organic EL device 10G using a predetermined film-forming mask (mask for the green-emitting organic EL device).

Subsequently, the red emitting layer 54 is formed at a predetermined thickness on the hole transporting zone 7 in a region corresponding to the anode 3 of the red-emitting organic EL device 10R using a predetermined film-forming mask (mask for the red-emitting organic EL device).

The first emitting layer 51, the second emitting layer 52, the green emitting layer 53, ad the red emitting layer 54 are formed of mutually different materials.

After the formation of the hole transporting zone 7, the order of forming the non-common layers of the blue-emitting organic EL device 10B, the green-emitting organic EL device 10G, and the red-emitting organic EL device 10R is not particularly limited.

For instance, as the order of the film formation after forming the hole transporting zone 7, the green emitting layer 53 of the green-emitting organic EL device 10G may be formed, then the red emitting layer 54 of the red-emitting organic EL device 10R may be formed, and then the first emitting layer 51 and the second emitting layer 52 of the blue-emitting organic EL device 10B may be formed.

Alternatively, for instance, as the order of the film formation after forming the hole transporting zone 7, the red emitting layer 54 of the red-emitting organic EL device 10R may be formed, then the green emitting layer 53 of the green-emitting organic EL device 10G may be formed, and then the first emitting layer 51 and the second emitting layer 52 of the blue-emitting organic EL device 10B may be formed.

Next, the electron transporting layer 8 as the common layer is formed in a shared manner across the second emitting layer 52, the green emitting layer 53, and the red emitting layer 54. The electron transporting layer 8 of the blue-emitting organic EL device 10B, the green-emitting organic EL device 10G, and the red-emitting organic EL device 10R is formed to have a constant film thickness using the same material.

Subsequently, the electron injecting layer 9 as the common layer is formed on the electron transporting layer 8. The electron injecting layer 9 of the blue-emitting organic EL device 10B, the green-emitting organic EL device 10G, and the red-emitting organic EL device 10R is formed to have a constant film thickness using the same material.

Subsequently, the cathode 4 as the common layer is formed on the electron injecting layer 9. The cathode 4 of the blue-emitting organic EL device 10B, the green-emitting organic EL device 10G, and the red-emitting organic EL device 10R is formed to have a constant film thickness using the same material.

The organic EL display device 100A illustrated in FIG. 5 is produced as described above.

Next, explanation is made about a producing method of an organic EL display device 200 (FIG. 5) according to an exemplary embodiment.

First, the anode 3 is formed on the substrate 2A.

Subsequently, the organic layers (the organic layer L1 to the organic layer Ln) as the common layers are sequentially formed on the anode 3, forming the hole transporting zone 7 as the common zone. Respective organic layers in the hole transporting zone 7 of the blue-emitting organic EL device 10B, the green-emitting organic EL device 20G, and the red-emitting organic EL device 20R are formed of the same material at the same film thickness.

Subsequently, the first emitting layer 51 is formed on the hole transporting zone 7 in a region corresponding to the anode 3 of the blue-emitting organic EL device 10B using a predetermined film-forming mask (mask for the blue-emitting organic EL device). Subsequent to formation of the first emitting layer 51, the second emitting layer 52 is formed on the first emitting layer 51.

Subsequently, the green emitting layer 531 is formed at a predetermined thickness on the hole transporting zone 7 in a region corresponding to the anode 3 of the green-emitting organic EL device 20G using a predetermined film-forming mask (mask for the green-emitting organic EL device). Subsequent to formation of the green organic layer 531, the green emitting layer 53 is formed on the green organic layer 531.

Subsequently, the red emitting layer 541 is formed at a predetermined thickness on the hole transporting zone 7 in a region corresponding to the anode 3 of the red-emitting organic EL device 20R using a predetermined film-forming mask (mask for the red-emitting organic EL device). Subsequent to formation of the red organic layer 541, the red emitting layer 54 is formed on the red organic layer 541.

The first emitting layer 51, the second emitting layer 52, the green emitting layer 53, ad the red emitting layer 54 are formed of mutually different materials.

After the formation of the hole transporting zone 7, the order of forming the non-common layers of the blue-emitting organic EL device 10B, the green-emitting organic EL device 20G, and the red-emitting organic EL device 20R is not particularly limited.

For instance, as the order of the film formation after forming the hole transporting zone 7, the green organic layer 531 and the green emitting layer 53 of the green-emitting organic EL device 20G may be formed, then the red organic layer 541 and the red emitting layer 54 of the red-emitting organic EL device 20R may be formed, and then the first emitting layer 51 and the second emitting layer 52 of the blue-emitting organic EL device 10B may be formed.

Alternatively, for instance, as the order of the film formation after forming the hole transporting zone 7, the red organic layer 541 and the red emitting layer 54 of the red-emitting organic EL device 20R may be formed, then the green organic layer 531 and the green emitting layer 53 of the green-emitting organic EL device 20G may be formed, and then the first emitting layer 51 and the second emitting layer 52 of the blue-emitting organic EL device 10B may be formed.

Next, the electron transporting layer 8 as the common layer, the electron injecting layer 9 as the common layer, and the cathode 4 as the common layer are formed by the same method as the above-described producing method of the organic EL display device 100A depicted in FIG. 4.

The organic EL display device 200 illustrated in FIG. 5 is produced as described above.

According to the second exemplary embodiment, there can be provided the organic EL display device that is producible with use of existing production lines and that includes, as a pixel, an organic EL device in which a plurality of emitting layers are layered.

Third Exemplary Embodiment

Electronic Device

An electronic device according to a sixth exemplary embodiment is installed with the organic EL device according to any of the above exemplary embodiments or the organic EL display device according to any of the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited by the above exemplary embodiments but includes any modification and improvement as long as such modification and improvement are compatible with the invention.

For instance, the number of emitting layers is not limited to two, and more than two emitting layers may be layered. In a case where the organic EL device includes more than two emitting layers, it is only necessary that at least two of the emitting layers should satisfy the requirements mentioned in the above exemplary embodiments. For instance, the rest of the emitting layers may be a fluorescent emitting layer or a phosphorescent emitting layer with use of emission caused by electron transfer from the triplet excited state directly to the ground state.

In a case where the organic EL device includes a plurality of emitting layers, these emitting layers may be mutually adjacently provided, or may form a so-called tandem organic EL device, in which a plurality of emitting units are layered via an intermediate layer.

Further, for instance, a blocking layer is optionally provided adjacent to a side of the emitting layer close to the cathode. The blocking layer provided in direct contact with the side of the emitting layer close to the cathode preferably blocks at least one of holes or excitons.

For instance, when the blocking layer is provided in contact with the side of the emitting layer close to the cathode, the blocking layer permits transport of electrons, and blocks holes from reaching a layer provided closer to the cathode (e.g., the electron transporting layer) beyond the blocking layer. When the organic EL device includes the electron transporting layer, the blocking layer is preferably interposed between the emitting layer and the electron transporting layer.

Alternatively, the blocking layer may be provided adjacent to the emitting layer so that the excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The invention will be described in more detail below with reference to Examples. The scope of the invention is by no means limited to Examples.

Compounds

The first luminescent compound used for producing organic EL devices in Examples are shown below.

[Formula 385]

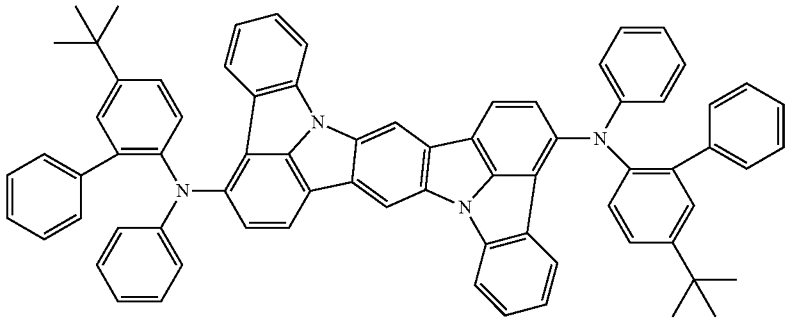

BD2

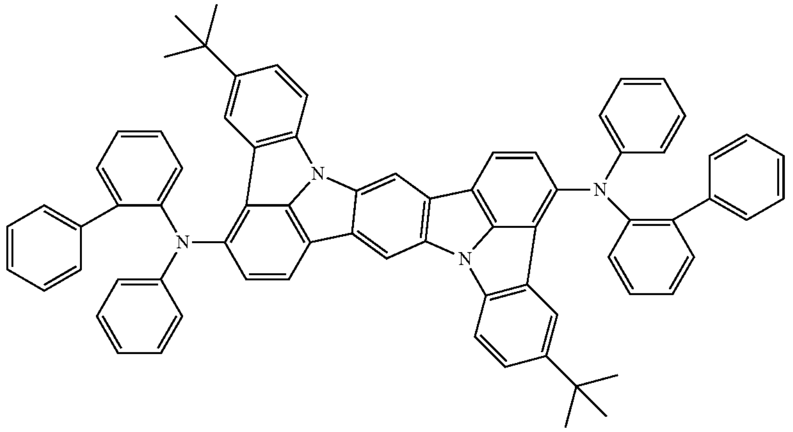

BD3

-continued
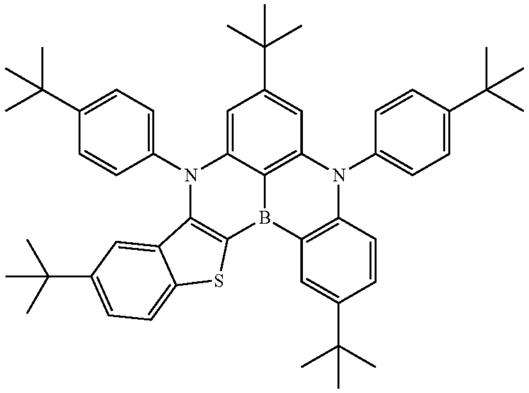
BD4
The first luminescent compound used for producing organic EL devices in Comparatives is shown below.
[Formula 386]
BD-ref
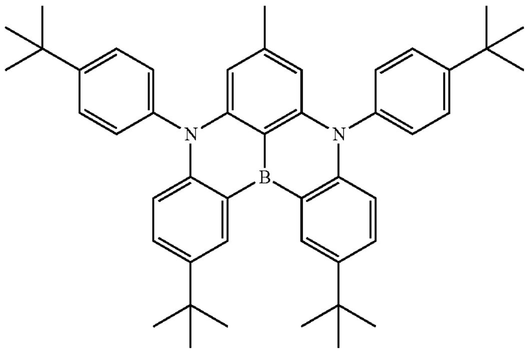
Other compounds used for producing organic EL devices in Examples and Comparative are shown below.
[Formula 387]
HA1
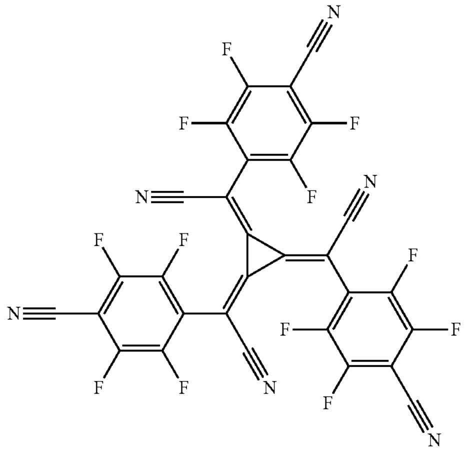
-continued
HT1
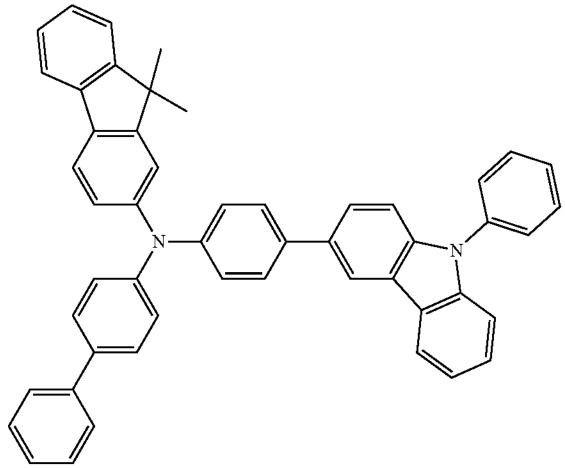
HT2
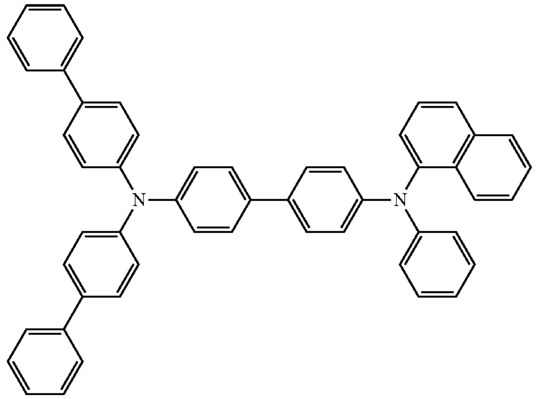

-continued

HT3

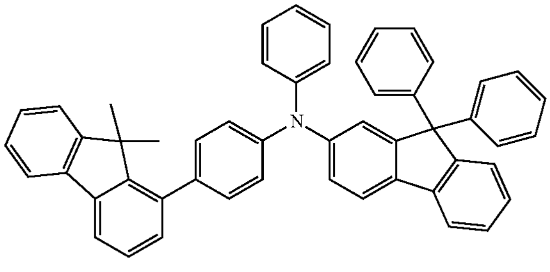

[Formula 388]

BH1-1

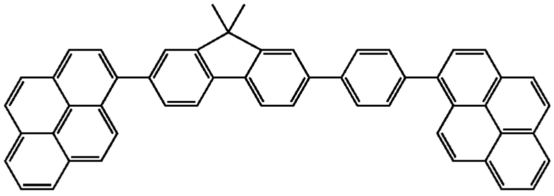

BH1-2

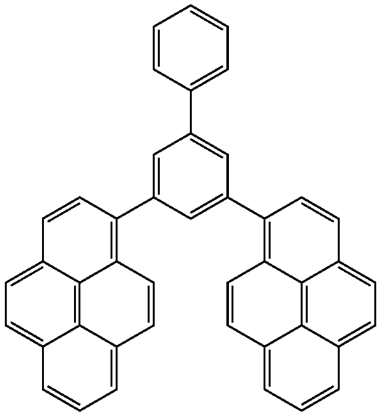

BH1-3

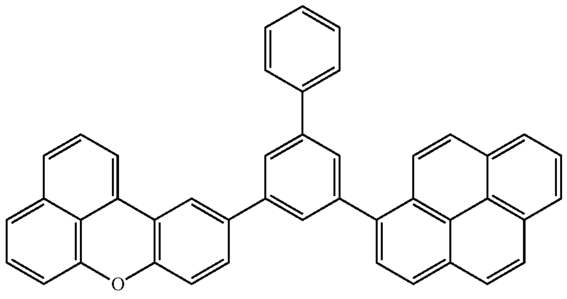

BH2-1

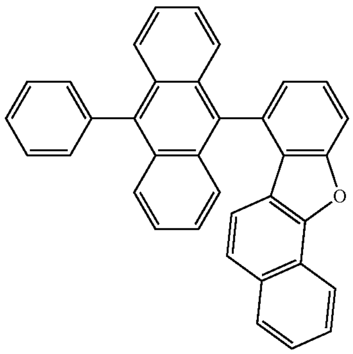

-continued

[Formula 389]

HB1

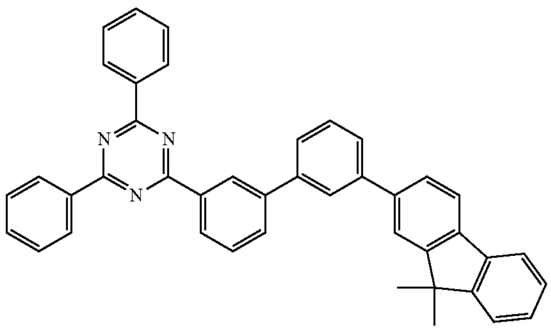

ET1

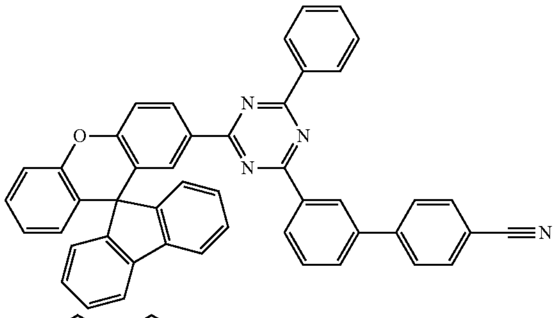

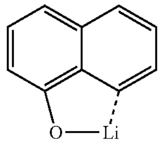

Liq

Production 1 of Organic EL Device

Example 1-1

A glass substrate (size: 25 mm×75 mm×1.1 mm thick, produced by Geomatec Co., Ltd.) having an ITO transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. Firstly, a compound HT1 and a compound HA1 were co-deposited on a surface of the glass substrate where the transparent electrode line was provided in a manner to cover the transparent electrode, thereby forming a 10-nm-thick second organic layer (sometimes referred to as a hole injecting layer (HI)). The ratios of the compound HT1 and the compound HA1 in the second organic layer were 97 mass % and 3 mass %, respectively.

Subsequent to the formation of the second organic layer, the compound HT1 was vapor-deposited on the second organic layer to form a 90-nm-thick first organic layer (sometimes referred to as a hole transporting layer (HT) or an electron blocking layer (EBL)).

The hole transporting zone was thus formed including the first organic layer and the second organic layer, each of which contained the compound HT1 as the common hole transporting zone material.

The compound BH1-1 (first host material (BH)) and the compound BD2 (first luminescent compound (BD)) were co-deposited on the first hole transporting layer such that the ratio of the compound BD2 accounted for 1 mass %, thereby forming a 5-nm-thick first emitting layer.

A compound BH2-1 (second host material (BH)) and the compound BD2 (second luminescent compound (BD2)) were co-deposited on the first emitting layer such that the ratio of the compound BD2 accounted for 1 mass %, thereby forming a 15-nm-thick second emitting layer.

A compound HB1 was vapor-deposited on the second emitting layer to form a 5-nm-thick first electron transporting layer (sometimes referred to as a hole blocking layer (HBL)).

A compound ET1 and a compound Liq were co-deposited on the first electron transporting layer to form a 25-nm-thick second electron transporting layer (ET). The ratios of the compound ET1 and the compound Liq in the second electron transporting layer (ET) were both 50 mass %.

The compound Liq was vapor-deposited on the second electron transporting layer to form a 1-nm-thick electron injecting layer.

Metal Al was vapor-deposited on the electron injecting layer to form an 80-nm-thick cathode.

A device arrangement of the organic EL device in Example 1-1 is roughly shown as follows.

ITO(130)/HT1:HA1(10.97%:3%)/HT1(90)/BH1-1:BD2(5.99%:1%)/BH2-1:BD2(15.99%:1%)/HB1(5)/ET1:Liq(25.50%:50%)/Liq(1)/Al(80)

Numerals in parentheses represent a film thickness (unit: nm).

The numerals (97%:3%) represented by percentage in the same parentheses indicate a ratio (mass %) between the compound HT1 and the compound HA1 in the second organic layer. The numerals (99%:1%) represented by percentage in the same parentheses indicate a ratio (mass %) between the host material (BH1-1 or BH2-1) and the luminescent compound (compound BD2) in the first emitting layer or the second emitting layer. The numerals (50%:50%) represented by percentage in the same parentheses indicate a ratio (mass %) between the compound ET1 and the compound Liq in the second electron transporting layer (ET). Similar notations apply to the description below.

Examples 1-2 to 1-7 and Comparative 1-1

Organic EL devices in Examples 1-2 to 1-7 and Comparative 1-1 were produced in the same manner as in Example 1-1 except that the first host material and the first luminescent compound in the first emitting layer were respectively replaced by the first host material and the first luminescent compound shown in Table 1 and the second luminescent compound in the second emitting layer was replaced by the second luminescent compound shown in Table 1.

Evaluation of Organic EL Devices

The organic EL devices produced were evaluated as follows. Table 1 shows the evaluation results.

External Quantum Efficiency EQE

Voltage was applied to the organic EL devices such that a current density was 10 mA/cm$^2$, where spectral radiance spectrum was measured with a spectroradiometer CS-2000 (produced by Konica Minolta, Inc.). The external quantum efficiency EQE (unit: %) was calculated based on the obtained spectral radiance spectra, assuming that the spectra was provided under a Lambertian radiation.

TABLE 1

| | Hole transporting zone | | | | Emitting layer | | | | | | | | | | | |
|---|---|---|---|---|---|---|---|---|---|---|---|---|---|---|---|---|
| | | | | | First emitting layer | | | | | | | Second emitting layer | | | | |
| | Second organic layer Compound Name | First organic layer Compound Name | Common hole transporting zone material Compound Name | Ip [eV] | First host material Name | $S_1$ [eV] | $T_1$ [eV] | First luminescent material Name | $S_1$ [eV] | $T_1$ [eV] | Ip [eV] | Second host material Name | $S_1$ [eV] | $T_1$ [eV] | Second luminescent material Name | Device evaluation EQE [%] |
| Comp. 1-1 | HT1 and HA1 | HT1 | HT1 | 5.48 | BH1-1 | 3.12 | 2.10 | BD-ref | 2.73 | 2.64 | 5.49 | BH2-1 | 3.01 | 1.82 | BD-ref | 8.6 |
| Ex. 1-1 | HT1 and HA1 | HT1 | HT1 | 5.48 | BH1-1 | 3.12 | 2.10 | BD2 | 2.74 | 2.30 | 5.34 | BH2-1 | 3.01 | 1.82 | BD2 | 10.2 |
| Ex. 1-2 | HT1 and HA1 | HT1 | HT1 | 5.48 | BH1-1 | 3.12 | 2.10 | BD3 | 2.78 | 2.32 | 5.34 | BH2-1 | 3.01 | 1.82 | BD3 | 9.9 |
| Ex. 1-3 | HT1 and HA1 | HT1 | HT1 | 5.48 | BH1-1 | 3.12 | 2.10 | BD4 | 2.70 | 2.45 | 5.40 | BH2-1 | 3.01 | 1.82 | BD4 | 9.6 |
| Ex. 1-4 | HT1 and HA1 | HT1 | HT1 | 5.48 | BH1-2 | 3.19 | 2.04 | BD2 | 2.74 | 2.30 | 5.34 | BH2-1 | 3.01 | 1.82 | BD2 | 10.2 |
| Ex. 1-5 | HT1 and HA1 | HT1 | HT1 | 5.48 | BH1-2 | 3.19 | 2.04 | BD3 | 2.78 | 2.32 | 5.34 | BH2-1 | 3.01 | 1.82 | BD3 | 10.0 |
| Ex. 1-6 | HT1 and HA1 | HT1 | HT1 | 5.48 | BH1-3 | 3.08 | 2.06 | BD2 | 2.74 | 2.30 | 5.34 | BH2-1 | 3.01 | 1.82 | BD2 | 10.7 |
| Ex. 1-7 | HT1 and HA1 | HT1 | HT1 | 5.48 | BH1-3 | 3.08 | 2.06 | BD4 | 2.70 | 2.45 | 5.40 | BH2-1 | 3.01 | 1.82 | BD4 | 10.4 |

The organic EL devices of Examples 1-1 to 1-7, in which the hole transporting zone material contained in the first emitting layer and the first luminescent compound contained in the first organic layer satisfied the relationship of the numerical formula (Numerical Formula 1X), emitted light at a luminous efficiency higher than that of the organic EL device of Comparative 1-1 not satisfying the relationship of the numerical formula (Numerical Formula 1X).

Production 2 of Organic EL Device

Example 2-1

An organic EL device of Example 2-1 was produced in the same manner as in Example 1-1 except that the second organic layer and the first organic layer were replaced as follows to form.

In Example 2-1, a compound HT2 and the compound HA1 were co-deposited in place of the compounds HT1 and HA1 in Example 1-1 to form a 10-nm thick second organic layer, in which the ratios of the compounds HT2 and HA1 were 97 mass % and 3 mass %, respectively.

In Example 2-1, the compound HT2 in place of the compound HT1 in Example 1-1 was vapor-deposited to form a 90-nm-thick first organic layer.

The hole transporting zone was thus formed including the first organic layer and the second organic layer, each of which contains the compound HT2 as the common hole transporting zone material.

Examples 2-2 to 2-3 and Comparative 2-1

Organic EL devices in Examples 2-2 to 2-3 and Comparative 1-1 were produced in the same manner as in Example 2-1 except that the first luminescent compound in the first emitting layer was replaced by the first luminescent compound shown in Table 2 and the second luminescent compound in the second emitting layer was replaced by the second luminescent compound shown in Table 2.

The organic EL devices produced were measured in terms of an external quantum efficiency EQE in the same manner as in Example 1-1. Table 2 shows the evaluation results.

The organic EL devices of Examples 2-1 to 2-3 in which the hole transporting zone material contained in the first organic layer and the first luminescent compound contained in the first organic layer satisfied the relationship of the numerical formula (Numerical Formula 1X) emitted light at a luminous efficiency higher than that of the organic EL device of Comparative 2-1 not satisfying the relationship of the numerical formula (Numerical Formula 1X).

Production 3 of Organic EL Device

Example 3-1

An organic EL device of Example 3-1 was produced in the same manner as in Example 1-1 except that the first organic layer in the organic EL device of Example 1-1 was replaced as follows to form.

In Example 3-1, the compound HT1 and a compound HT3 were co-deposited in place of the compound HA1 in Example 1-1 to form a 90-nm thick first organic layer, in which the ratios of the compounds HT1 and HT3 were 97 mass % and 3 mass %, respectively.

The hole transporting zone was thus formed including the first organic layer and the second organic layer, each of which contains the compound HT1 as the common hole transporting zone material.

Examples 3-2 to 3-5 and Comparative 3-1

Organic EL devices in Examples 3-2 to 3-5 and Comparative 3-1 were produced in the same manner as in Example 3-1 except that the first host material and the first luminescent compound in the first emitting layer were respectively replaced by the first host material and the first luminescent compound shown in Table 3 and the second luminescent compound in the second emitting layer was replaced by the second luminescent compound shown in Table 3.

TABLE 2

| | Hole transporting zone: Second organic layer Compound Name | Hole transporting zone: First organic layer Compound Name | Common hole transporting zone material Compound Name | Common hole transporting zone material Compound Ip [eV] | Emitting layer: First emitting layer: First host material Name | First host material $S_1$ [eV] | First host material $T_1$ [eV] | First luminescent material Name | First luminescent material $S_1$ [eV] | First luminescent material $T_1$ [eV] | First luminescent material Ip [eV] | Second emitting layer: Second host material Name | Second host material $S_1$ [eV] | Second host material $T_1$ [eV] | Second luminescent material Name | Device evaluation EQE [%] |
|---|---|---|---|---|---|---|---|---|---|---|---|---|---|---|---|---|
| Comp. 2-1 | HT2 and HA1 | HT2 | HT2 | 5.51 | BH1-1 | 3.12 | 2.10 | BD-ref | 2.73 | 2.64 | 5.49 | BH2-1 | 3.01 | 1.82 | BD-ref | 8.3 |
| Ex. 2-1 | HT2 and HA1 | HT2 | HT2 | 5.51 | BH1-1 | 3.12 | 2.10 | BD2 | 2.74 | 2.30 | 5.34 | BH2-1 | 3.01 | 1.82 | BD2 | 9.8 |
| Ex. 2-2 | HT2 and HA1 | HT2 | HT2 | 5.51 | BH1-1 | 3.12 | 2.10 | BD3 | 2.78 | 2.32 | 5.34 | BH2-1 | 3.01 | 1.82 | BD3 | 9.7 |
| Ex. 2-3 | HT2 and HA1 | HT2 | HT2 | 5.51 | BH1-1 | 3.12 | 2.10 | BD4 | 2.70 | 2.45 | 5.40 | BH2-1 | 3.01 | 1.82 | BD4 | 9.8 |

The organic EL devices produced were measured in terms of an external quantum efficiency EQE in the same manner as in Example 1-1. Table 3 shows the evaluation results.

TABLE 3

| | Hole transporting zone: Second organic layer Compound Name | Hole transporting zone: First organic layer Compound Name | Common hole transporting zone material Compound Name | Common hole transporting zone material Compound Ip [eV] | Emitting layer: First emitting layer: First host material Name | First host material $S_1$ [eV] | First host material $T_1$ [eV] | First luminescent material Name | First luminescent material $S_1$ [eV] | First luminescent material $T_1$ [eV] | First luminescent material Ip [eV] | Second emitting layer: Second host material Name | Second host material $S_1$ [eV] | Second host material $T_1$ [eV] | Second luminescent material Name | Device evaluation EQE [%] |
|---|---|---|---|---|---|---|---|---|---|---|---|---|---|---|---|---|
| Comp. 3-1 | HT1 and HA1 | HT1 and HT3 | HT1 | 5.48 | BH1-1 | 3.12 | 2.10 | BD-ref | 2.73 | 2.64 | 5.49 | BH2-1 | 3.01 | 1.82 | BD-ref | 9.3 |
| Ex. 3-1 | HT1 and HA1 | HT1 and HT3 | HT1 | 5.48 | BH1-1 | 3.12 | 2.10 | BD2 | 2.74 | 2.30 | 5.34 | BH2-1 | 3.01 | 1.82 | BD2 | 11.0 |
| Ex. 3-2 | HT1 and HA1 | HT1 and HT3 | HT1 | 5.48 | BH1-1 | 3.12 | 2.10 | BD3 | 2.78 | 2.32 | 5.34 | BH2-1 | 3.01 | 1.82 | BD3 | 10.8 |
| Ex. 3-3 | HT1 and HA1 | HT1 and HT3 | HT1 | 5.48 | BH1-1 | 3.12 | 2.10 | BD4 | 2.70 | 2.45 | 5.40 | BH2-1 | 3.01 | 1.82 | BD4 | 10.5 |
| Ex. 3-4 | HT1 and HA1 | HT1 and HT3 | HT1 | 5.48 | BH1-2 | 3.19 | 2.04 | BD2 | 2.74 | 2.30 | 5.34 | BH2-1 | 3.01 | 1.82 | BD2 | 10.9 |
| Ex. 3-5 | HT1 and HA1 | HT1 and HT3 | HT1 | 5.48 | BH1-2 | 3.19 | 2.04 | BD3 | 2.78 | 2.32 | 5.34 | BH2-1 | 3.01 | 1.82 | BD3 | 10.7 |

The organic EL devices of Examples 3-1 to 3-5 in which the hole transporting zone material contained in the first organic layer and the first luminescent compound contained in the first organic layer satisfied the relationship of the numerical formula (Numerical Formula 1X) emitted light at a luminous efficiency higher than that of the organic EL device of Comparative 3-1 not satisfying the relationship of the numerical formula (Numerical Formula 1X).

Evaluation Method of Compounds

Triplet Energy $T_1$

A measurement target compound was dissolved in EPA (diethylether:isopentane:ethanol=5:5:2 in volume ratio) at a concentration of 10 μmol/L, and the obtained solution was put in a quartz cell to provide a measurement sample. A phosphorescence spectrum (ordinate axis: phosphorescent luminous intensity, abscissa axis: wavelength) of the measurement sample was measured at a low temperature (77K). A tangent was drawn to the rise of the phosphorescence spectrum close to the short-wavelength region. An energy amount was calculated by a conversion equation (F1) below on a basis of a wavelength value $\lambda_{edge}$ [nm] at an intersection of the tangent and the abscissa axis. The calculated energy amount was defined as triplet energy $T_1$. It should be noted that the triplet energy $T_1$ may have an error of about plus or minus 0.02 eV depending on measurement conditions.

$$T_1[\text{eV}] = 1239.85/\lambda_{edge} \quad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 manufactured by Hitachi High-Technologies Corporation was used.

Singlet Energy $S_1$

A toluene solution of a measurement target compound at a concentration of 10 μmol/L was prepared and put in a quartz cell. An absorption spectrum (ordinate axis: absorption intensity, abscissa axis: wavelength) of the thus-obtained sample was measured at a normal temperature (300K). A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate singlet energy.

$$S_1[\text{eV}] = 1239.85/\lambda_{edge} \quad \text{Conversion Equation (F2)}$$

A spectrophotometer (U3310 manufactured by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Ionization Potential Ip

Ionization potential of each compound was measured under atmosphere using a photoelectron spectroscope ("AC-3" manufactured by RIKEN KEIKI Co., Ltd.). Specifically, the material was irradiated with light and an amount of electrons generated by charge separation was measured to determine the ionization potential of the compound. The ionization potential is occasionally denoted by Ip.

Measurement of Maximum Fluorescence Peak Wavelength (FL-peak)

A measurement target compound was dissolved in toluene at a concentration of $4.9\times10^{-6}$ mol/L to prepare a toluene solution of the measurement target compound. Using a fluorescence spectrometer (spectrophotofluorometer F-7000 manufactured by Hitachi High-Tech Science Corporation), the toluene solution of the measurement target compound was excited at 390 nm, where a maximum peak wavelength was measured.

A fluorescence maximum peak wavelength of a compound BD-ref was 455 nm.

A maximum fluorescence peak wavelength of the compound BD2 was 450 nm.

A maximum fluorescence peak wavelength of a compound BD3 was 445 nm.

A maximum fluorescence peak wavelength of a compound BD4 was 457 nm.

The invention claimed is:

1. An organic electroluminescence device comprising:

an anode;

a cathode;

an emitting region provided between the anode and the cathode; and a hole transporting zone provided between the anode and the emitting region, wherein the emitting region comprises a first emitting layer and a second emitting layer, one of the first emitting layer and the second emitting layer is provided in a side of the emitting region close to the anode, the hole transporting zone is in direct contact with the anode and the emitting region, the hole transporting zone comprises one or more organic layers, at least one of the organic layers in the hole transporting zone is a first organic layer in direct contact with the emitting region, the first organic layer comprises a hole transporting zone material, the first emitting layer comprises a first host material and a first luminescent compound that emits light having a maximum peak wavelength of 500 nm or less, the second emitting layer comprises a second host material and a second luminescent compound that emits light having a maximum peak wavelength of 500 nm or less, the first host material and the second host material are mutually different, the first luminescent compound and the second luminescent compound are mutually the same or different, a triplet energy of the first host material $T_1(H1)$ and a triplet energy of the second host material $T_1(H2)$ satisfy a relationship of a numerical formula (Numerical Formula 1) below, and an ionization potential of the hole transporting zone material Ip(HT) comprised in the first organic layer and an ionization potential of the first luminescent compound Ip(D1) comprised in the first emitting layer satisfy a relationship of a numerical formula (Numerical Formula 1X) below, $$T_1(H1) > T_1(H2) \quad \text{(Numerical Formula 1)}$$

$$Ip(D1) - Ip(HT) < -0.05\text{eV}. \quad \text{(Numerical Formula 1X)}$$

2. The organic electroluminescence device according to claim 1, wherein the ionization potential of the hole transporting zone material Ip(HT) comprised in the first organic layer and the ionization potential of the first luminescent compound Ip(D1) comprised in the first emitting layer satisfy a relationship of a numerical formula (Numerical Formula 1Y) below, $$Ip(D1) - Ip(HT) < -0.07\text{ eV}. \quad \text{(Numerical Formula 1Y)}$$

3. The organic electroluminescence device according to claim 1, wherein each of the organic layers in the hole transporting zone comprises the hole transporting zone material as a common hole transporting zone material.

4. The organic electroluminescence device according to claim 3, wherein an ionization potential of the common hole transporting zone material Ip(HTX) and the ionization potential of the first luminescent compound Ip(D1) comprised in the first emitting layer satisfy a relationship of a numerical formula (Numerical Formula 2X) below, $$Ip(D1) - Ip(HTX) < -0.05\text{ eV}. \quad \text{(Numerical Formula 2X)}$$

5. The organic electroluminescence device according to claim 1, wherein the hole transporting zone comprises the first organic layer and a second organic layer that is provided between the first organic layer and the anode, and the second organic layer further comprises a second hole transporting zone material different from the hole transporting zone material.

6. The organic electroluminescence device according to claim 5, wherein the second organic layer is in direct contact with the anode.

7. The organic electroluminescence device according to claim 5, wherein the hole transporting zone comprises the first organic layer, the second organic layer, and a third organic layer that is provided between the second organic layer and the anode, and the third organic layer further comprises a third hole transporting zone material different from the hole transporting zone material.

8. The organic electroluminescence device according to claim 1, wherein the first organic layer comprises the hole transporting zone material and a first hole transporting zone material different from the hole transporting zone material.

9. The organic electroluminescence device according to claim 1, wherein the hole transporting zone comprises no material different from the hole transporting zone material.

10. The organic electroluminescence device according to claim 1, wherein the first luminescent compound comprised in the first emitting layer comprises a triplet energy $T_1(D1)$ of 2.1 eV or more.

11. The organic electroluminescence device according to claim 1, wherein the first luminescent compound comprised in the first emitting layer comprises a triplet energy $T_1$ (D1) of 2.2 eV or more.

12. The organic electroluminescence device according to claim 1, wherein a singlet energy of the first host material $S_1(H1)$ and a singlet energy of the first luminescent compound $S_1(D1)$ satisfy a relationship of a numerical formula (Numerical Formula 20) below, $$S_1(H1) > S_1(D1). \quad \text{(Numerical Formula 20)}$$

13. The organic electroluminescence device according to claim 1, wherein the triplet energy of the first host material $T_1(H1)$ and a triplet energy of the first luminescent compound $T_1(D1)$ satisfy a relationship of a numerical formula (Numerical Formula 20A) below, $$T_1(D1) > T_1(H1). \quad \text{(Numerical Formula 20A)}$$

14. The organic electroluminescence device according to claim 1, wherein the first emitting layer and the second emitting layer are in direct contact with each other.

15. The organic electroluminescence device according to claim 1, wherein the first emitting layer is provided between the hole transporting zone and the cathode, and the second emitting layer is provided between the first emitting layer and the cathode.

16. An organic electroluminescence display device, comprising:

an anode and a cathode arranged opposite each other; and a blue-emitting organic EL device as a blue pixel; a green-emitting organic EL device as a green pixel; and a red-emitting organic EL device as a red pixel, wherein the blue-emitting organic EL device comprises a blue emitting region comprising a first emitting layer and a second emitting layer provided between the anode and the cathode, one of the first emitting layer and the second emitting layer is provided in a side of the blue emitting region close to the anode, the green-emitting organic EL device comprises a green emitting layer provided between the anode and the cathode, the red-emitting organic EL device comprises a red emitting layer provided between the anode and the cathode, the blue-emitting organic EL device, the green-emitting organic EL device, and the red-emitting organic EL device comprise a hole transporting zone that is provided in a shared manner across the blue-emitting organic EL device, the green-emitting organic EL device, and the red-emitting organic EL device, between the anode and each of the blue emitting region of the blue-emitting organic EL device, the green emitting layer of the green-emitting organic EL device, and the red emitting layer of the red-emitting organic EL device, the hole transporting zone is in direct contact with the first emitting layer or the second emitting layer in the blue emitting region of the blue-emitting organic EL device, the hole transporting zone comprises one or more organic layers, at least one organic layer of the organic layers in the hole transporting zone comprises a hole transporting zone material, the first emitting layer comprises a first host material and a first luminescent compound that emits light having a maximum peak wavelength of 500 nm or less, the second emitting layer comprises a second host material and a second luminescent compound that emits light having a maximum peak wavelength of 500 nm or less, the first host material and the second host material are mutually different, the first luminescent compound and the second luminescent compound are mutually the same or different, a triplet energy of the first host material $T_1(H1)$ and a triplet energy of the second host material $T_1(H2)$ satisfy a relationship of a numerical formula (Numerical Formula 1) below, and in the blue emitting region of the blue-emitting organic EL device, an ionization potential of the hole transporting zone material Ip(HT) and an ionization potential of the first luminescent compound Ip(D1) comprised in the first emitting layer satisfy a relationship of a numerical formula (Numerical Formula 1X) below, $$T_1(H1) > T_1(H2) \quad \text{(Numerical Formula 1)}$$

$$Ip(D1) - Ip(HT) < -0.05 \text{ eV}. \quad \text{(Numerical Formula 1X)}$$

17. The organic electroluminescence display device according to claim 16, wherein the first luminescent compound comprised in the first emitting layer comprises a triplet energy $T_1(D1)$ of 2.1 eV or more.

18. The organic electroluminescence display device according to claim 16, wherein the first luminescent compound comprised in the first emitting layer comprises a triplet energy $T_1(D1)$ of 2.2 eV or more.

19. The organic electroluminescence display device according to claim 16, wherein the hole transporting zone material comprises a hole mobility of $1.0 \times 10^{-5}$ $cm^2/Vs$ or more.

20. The organic electroluminescence display device according to claim 16, further comprising: a green organic layer between the green emitting layer and the hole transporting zone.

21. The organic electroluminescence display device according to claim 16, further comprising: a red organic layer between the red emitting layer and the hole transporting zone.

22. The organic electroluminescence display device according to claim 16, wherein at least one of the green-emitting organic EL device or the red-emitting organic EL device comprises a delayed fluorescent compound.

23. The organic electroluminescence display device according to claim 16, wherein at least one of the green emitting layer of the green-emitting organic EL device or the red emitting layer of the red-emitting organic EL device comprises a delayed fluorescent compound.

24. The organic electroluminescence display device according to claim 23, wherein the emitting layer comprising the delayed fluorescent compound comprises a first organic material having an affinity smaller than an affinity of the delayed fluorescent compound.

25. The organic electroluminescence display device according to claim 23, wherein of the green emitting layer and the red emitting layer, the emitting layer not comprising the delayed fluorescent compound comprises a phosphorescent compound.

26. An electronic device comprising the organic electroluminescence device according to claim 1.

27. An electronic device comprising the organic electroluminescence display device according to claim 16.

* * * * *